US005635408A

United States Patent [19]

Sano et al.

[11] Patent Number: 5,635,408

[45] Date of Patent: Jun. 3, 1997

[54] METHOD OF PRODUCING A SEMICONDUCTOR DEVICE

[75] Inventors: Masafumi Sano, Souraku-gun; Keishi Saitoh, Nara, both of Japan

[73] Assignee: Canon Kabushiki Kaisha, Tokyo, Japan

[21] Appl. No.: 429,721

[22] Filed: Apr. 27, 1995

[30] Foreign Application Priority Data

| | | | |
|---|---|---|---|
| Apr. 28, 1994 | [JP] | Japan | 6-90996 |
| Apr. 28, 1994 | [JP] | Japan | 6-90997 |
| Apr. 28, 1994 | [JP] | Japan | 6-90998 |
| Apr. 28, 1994 | [JP] | Japan | 6-90999 |
| Apr. 28, 1994 | [JP] | Japan | 6-91511 |
| Apr. 28, 1994 | [JP] | Japan | 6-91512 |
| Apr. 28, 1994 | [JP] | Japan | 6-91897 |
| Apr. 28, 1994 | [JP] | Japan | 6-92359 |
| Apr. 28, 1994 | [JP] | Japan | 6-92360 |
| Apr. 28, 1994 | [JP] | Japan | 6-92690 |

[51] Int. Cl.$^{6}$ .......... H01L 31/18

[52] U.S. Cl. .......... 437/4; 437/937

[58] Field of Search .......... 437/16, 24, 20, 437/108, 933, 934, 937, 959, 967, 4, 2, 3; 118/719, 724, 725; 427/578; 257/53, 55; 136/258 PC, 258 AM

[56] References Cited

U.S. PATENT DOCUMENTS

| | | | |
|---|---|---|---|
| 4,113,514 | 9/1978 | Pankove et al. | 148/1.5 |
| 4,957,772 | 9/1990 | Saitoh et al. | 437/937 |
| 5,126,169 | 6/1992 | Ishihara et al. | 427/255.1 |
| 5,194,398 | 3/1993 | Miyachi et al. | 437/108 |
| 5,248,348 | 9/1993 | Miyachi et al. | 437/4 |
| 5,250,444 | 10/1993 | Khan et al. | 437/24 |
| 5,252,499 | 10/1993 | Rothchild et al. | 437/937 |
| 5,282,899 | 2/1994 | Balmashnov et al. | 437/723 R |
| 5,336,623 | 8/1994 | Sichanugrist et al. | 437/4 |
| 5,403,756 | 4/1995 | Yoshinouchi et al. | 437/24 |
| 5,424,244 | 6/1995 | Zhang et al. | 437/173 |
| 5,504,020 | 4/1996 | Aomori et al. | 437/937 |
| 5,518,935 | 5/1996 | Cunningham et al. | 437/24 |

FOREIGN PATENT DOCUMENTS

| | | | |
|---|---|---|---|
| 63-19426 | 8/1988 | Japan | 437/937 |
| 1-53462 | 3/1989 | Japan | 437/937 |
| 4-34414 | 11/1992 | Japan | 437/937 |

OTHER PUBLICATIONS

Y.S. Tsuo, et al., "Hydrogen–Plasma Reactive Flushing For a–Si:H P–I–N Solar Cell Fabrication," *Mat. Res. Soc. Symp. Proc.*, vol. 149 (1989), pp. 471–476.

F. Demichelis, et al., "Effect of Plasma Treatment of the TCO on a–Si Solar Cell Performance," *Mat. Res. Soc. Symp. Proc.*, vol. 258 (1992), pp. 905–910.

*Primary Examiner*—John Niebling

*Assistant Examiner*—S. Mulpuri

*Attorney, Agent, or Firm*—Fitzpatrick, Cella, Harper & Scinto

[57] ABSTRACT

A method of producing a semiconductor device including a substrate and a semiconductor region, the semiconductor region including at least one pin structure in the form of a multi-layer structure consisting of a non-single crystal n-type (or p-type) layer containing silicon, a non-single crystal i-type layer containing silicon, and a non-single crystal p-type (or n-type) layer containing silicon, the method being characterized in that it includes a step of performing plasma treatment on the surface of the substrate or the surface of one semiconductor layer, wherein the plasma treatment is performed in an atmosphere including a hydrogen gas and another gas containing silicon atoms without or with very thin deposition of a film onto the surface.

In this method, the hydrogen gas ambient is excited into a stable plasma state, and impurities adsorbed on the surface of the chamber wall or contained in the chamber wall are prevented from being incorporated into the semiconductor layers thereby achieving a high performance photovoltaic semiconductor device.

36 Claims, 6 Drawing Sheets

FIG. 7A
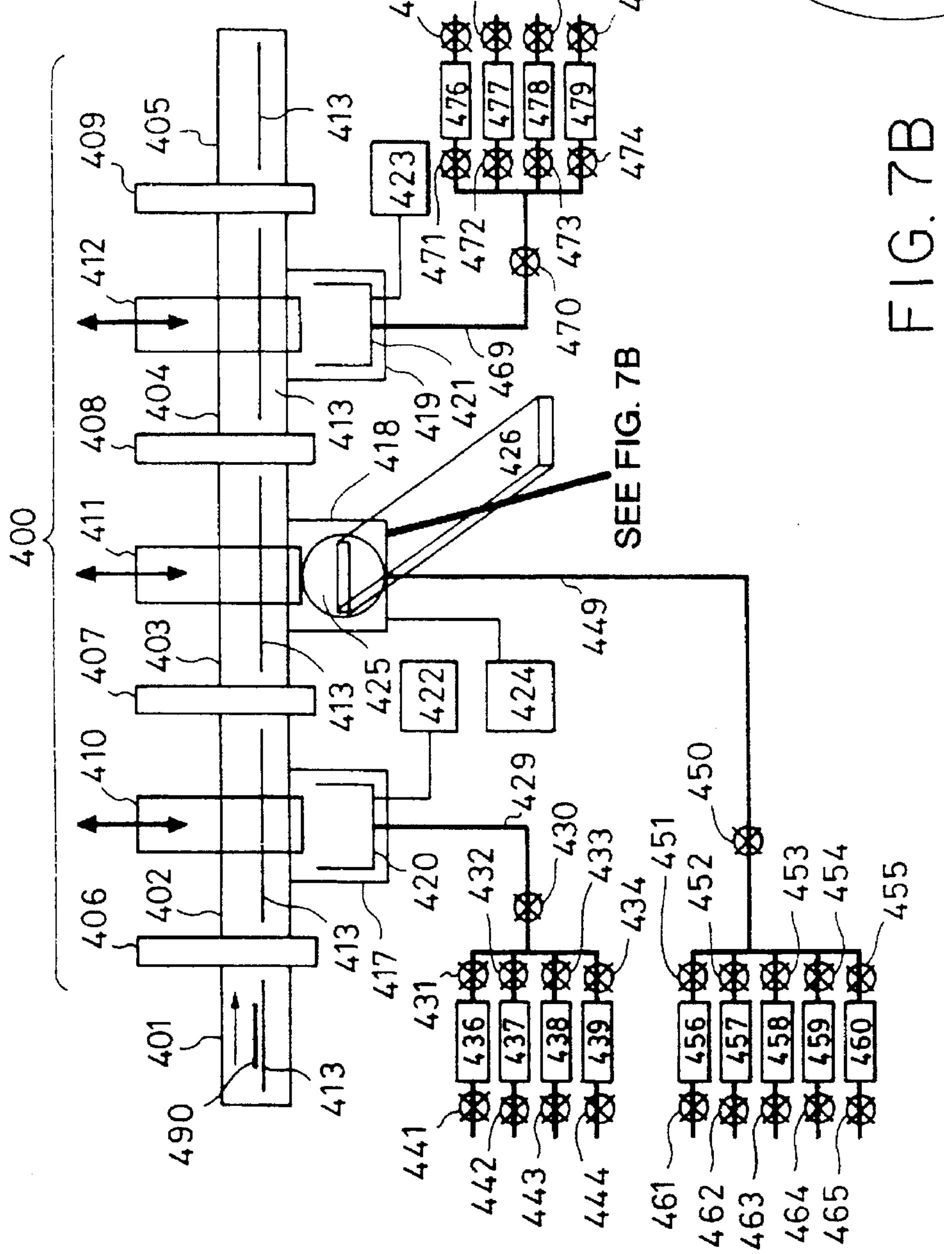
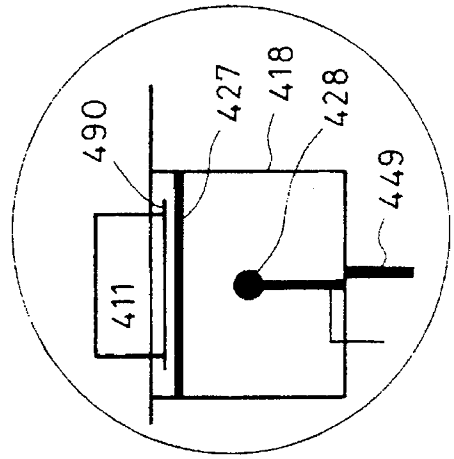
FIG. 7B

METHOD OF PRODUCING A SEMICONDUCTOR DEVICE

BACKGROUND OF THE INVENTION

1. Field of the Invention

The present invention relates to a method of producing a semiconductor device comprising semiconductor layers containing silicon atoms, and more specifically, to a method of producing a semiconductor device comprising at least a p-type (or n-type) non-single crystal semiconductor layer containing silicon atoms, an i-type non-single crystal semiconductor layer containing silicon atoms, and an n-type (or p-type) non-single crystal semiconductor layer containing silicon atoms, wherein those semiconductor layers are arranged in the above-described order so as to form a pin structure, thereby forming a semiconductor device having photoelectric conversion capability such as a photovoltaic device, solar cell, photo detector, etc.

2. Description of the Related Art

It is well known that defects in semiconductor materials play important roles in generation and recombination of charges and strongly affect the mobility of carriers in the semiconductor materials. These defects cause degradation in the characteristics and performance of semiconductor devices.

One known compensation technique for defect levels arising from these defects is to perform hydrogen plasma treatment.

For example, U.S. Pat. No. 4,113,514 (J. I. Pankove et al.) discloses a technique in which a fabricated semiconductor device is subjected to hydrogen plasma treatment.

In the paper entitled "EFFECT OF PLASMA TREATMENT OF THE TCO ON a-Si SOLAR CELL PERFORMANCE" (F. Demichelis et. al., Mat. Res. Soc. Symp. Proc. Vol. 258, p. 905, 1992), there is disclosed a technique in which a pin-structure solar cell is formed on a transparent electrode deposited on a substrate wherein the transparent electrode on the substrate is subjected to hydrogen treatment before the formation of the pin-structure solar cell.

In a technique of fabricating a pin-structure solar cell, disclosed in the paper entitled "HYDROGEN-PLASMA REACTION FLUSHING FOR a-Si;H P-I-N SOLAR CELL FABRICATION" (Y. S. Tsuo et. al., Mat. Res. Soc. Symp. Proc. Vol. 149, p. 471, 1989), hydrogen treatment is performed on a p-type layer before the deposition of an i-type layer.

In the above hydrogen treatment techniques, hydrogen gas without any additional gas is introduced into a chamber evacuated to a low pressure, and the hydrogen gas is excited by discharging energy supplied for example by an RF (radio frequency) power source thereby exciting the hydrogen gas into a plasma state. Thus, a semiconductor device to be processed is exposed to the hydrogen gas plasma thereby performing hydrogen plasma treatment.

However, the hydrogen plasma not only acts to a portion to be processed such as a substrate or semiconductor layers on it but also expands to a wider region and attacks the inner wall of the chamber and a stage on which the semiconductor device to be processed is placed. Since the hydrogen plasma is in a very active state, it causes scattering of some atoms adsorbed on the surface of, or even residing in, the chamber wall or the stage. These atoms include unwanted impurities such as oxygen, nitrogen, carbon, iron, chromium, nickel, aluminum, etc., which may generate defect levels when incorporated into the semiconductor layer.

The surface of the semiconductor layer may be contaminated with these unwanted impurities, which results in degradation in characteristics of the semiconductor layer and thus the semiconductor device.

Compared with other gases used in film deposition processes, hydrogen is difficult to excite into a discharged state. In particular, in the case where a pure hydrogen gas is used, even if the hydrogen gas is successfully excited into a plasma state, it is difficult to maintain it. This means that it is difficult to perform stable hydrogen treatment.

SUMMARY OF THE INVENTION

In view of the above, it is an object of the present invention to provide a method of hydrogen treatment and a method of producing a semiconductor device employing this method that can substantially prevent a semiconductor layer or semiconductor device from being contaminated with unwanted impurities coming from the surface or the inside of the chamber wall or other portions.

It is another object of the present invention to provide a method of performing a stable hydrogen treatment as well as a method of producing a semiconductor device using such hydrogen treatment.

It is still another object of the present invention to provide a method of producing a semiconductor device such as a photovoltaic device having high reliability so that no separation of a semiconductor layer occurs even if the semiconductor device is placed in a high-temperature and high-humidity environment.

It is a further object of the present invention to provide a method of producing a semiconductor device having a multi-layer structure, such as a pin structure of a photovoltaic semiconductor device, formed on a flexible substrate, which shows no separation of semiconductor layers even when the substrate is bent.

It is another object of the present invention to provide a method of producing an a high-reliability semiconductor device which shows no increase in the defect level density in a region near the interface between a substrate and a semiconductor layer or between an n-type or p-type semiconductor layer and an i-type semiconductor layer even when exposed to light illumination for a long time.

The above objects are achieved by the present invention having various aspects described below.

According to an aspect of the invention, there is provided a method of producing a semiconductor device including a substrate and a semiconductor region, the semiconductor region including at least one pin structure in the form of a multi-layer structure consisting of a non-single crystal n-type layer containing silicon, a non-single crystal i-type layer containing silicon, and a non-single crystal p-type layer containing silicon, the above-described method being characterized in that it includes a step of performing plasma treatment on at least one surface selected from the group consisting of the surface of the substrate and surfaces of the semiconductor region, wherein the plasma treatment is performed in an atmosphere including a hydrogen gas and another gas containing silicon atoms without or with very thin deposition of a film onto the surface.

According to another aspect of the invention, there is provided a method of producing a semiconductor device including a substrate and a semiconductor region in the form of a multi-layer structure comprising non-single semiconductor layers at least one of which has a different conduction type from that of the other layers, the method being characterized in that it includes a step of performing plasma treatment on at least one surface selected from the group consisting of the surface of the substrate and surfaces of the semiconductor region, wherein the plasma treatment is performed in atmosphere including a hydrogen gas and another gas containing silicon atoms without or with very thin deposition of a film onto the surface.

According to further aspect of the invention, there is provided a method of producing a semiconductor device including a substrate and a semiconductor region, the semiconductor region including at least one pin structure in the form of a multi-layer structure consisting of a non-single crystal n-type layer containing silicon, a non-single crystal i-type layer containing silicon, and a non-single crystal p-type layer containing silicon, the i-type layer including an n/i buffer layer adjacent to the n-type layer and a p/i buffer layer adjacent to the p-type layer, the method being characterized in that it includes a step of performing plasma treatment on at least one surface selected from the group consisting of the surface of the substrate and surfaces of the semiconductor region, wherein said plasma treatment is performed in a hydrogen gas ambient including a gas containing silicon atoms whose concentration is selected so that no essential deposition of a film containing silicon atoms occurs.

BRIEF DESCRIPTION OF THE DRAWINGS

FIG. 7 is a schematic diagram illustrating a preferable example of equipment for producing a semiconductor device according to the present invention.

DESCRIPTION OF THE PREFERRED EMBODIMENTS

Figure 1:
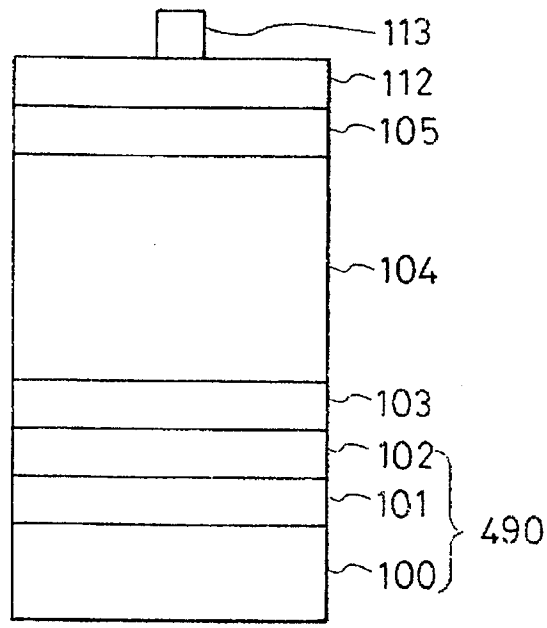
FIGS. 1 through 6 are schematic diagrams illustrating examples of semiconductor layer structures that can be preferably formed according to a method of the invention.

The present invention is based on the fact that the above-described problems can be avoided if the interfaces between semiconductor layers and/or the interface between a semiconductor layer and a substrate are subjected to a plasma treatment in an ambient including at least hydrogen gas and a gas containing silicon or a silicon compound gas.

Preferably, the concentration of the gas containing silicon or the silicon compound gas is selected in such a range in which no substantial film deposition occurs during the plasma treatment.

The above-described objects can be achieved by the present invention in which a substrate or an underlying layer is subjected to a plasma treatment in a hydrogen ambient including a gas containing silicon atoms whose concentration is selected such that no film deposition occurs during the plasma treatment, and then a semiconductor layer is deposited on it thereby forming a semiconductor device such as a photovoltaic semiconductor device. Whereas the detailed part of the mechanism is not clear at present, the invention has the following effects and functions.

If hydrogen treatment is performed in a hydrogen ambient including a gas containing silicon atoms whose concentration is in the range that has no essential contribution to film deposition, the gas containing silicon atoms in an active state reacts with oxygen or water adsorbed on the inner surface of the chamber wall and thus the oxygen or water is altered into a silicon oxide which is more stable than oxygen or water present on the surface of the chamber wall. This leads to a great reduction in the concentration of impurities such as oxygen or water incorporated into a semiconductor layer or a semiconductor device.

Furthermore, the plasma treatment in the hydrogen ambient containing a small amount of the gas containing silicon atoms prevents hydrogen gas from diffusing deeply into the chamber wall, and thus suppresses reactions that would eject impurities, that would generate defect levels when incorporated into a semiconductor layer, from the inside of the chamber wall.

The ionization of hydrogen gas requires high energy, and therefore it is difficult to maintain a stable plasma state for a long time. However, the addition of a small amount of silicon compound gas to hydrogen gas makes it easier to maintain a stable plasma. Such a very stable hydrogen gas plasma allows a great improvement in uniformity or reproducibility of the plasma treatment on a substrate or semiconductor layer. The good uniformity or reproducibility of the hydrogen gas plasma treatment allows production of high-reliability semiconductor devices that show neither local separation of semiconductor layers even if the devices are exposed to light illumination in a high-temperature and high humidity environment for a long time and nor increase in series resistance.

In the present invention, since the ambient gas of the hydrogen plasma treatment contains silicon compound gas, if the surface of a substrate to be processed has a textured structure, a local area having a sharp textured structure is relieved by the presence of the silicon compound gas. Therefore, if a substrate having such a textured structure is subjected to the hydrogen plasma treatment according to the invention, a semiconductor layer can be deposited on the substrate without any anomalous crystal growth. This means that when photovoltaic semiconductor devices having a pin structure are produced according to the present invention, it is possible to obtain very small variations in the characteristics from device to device. Furthermore, such photovoltaic semiconductor devices show excellent adhesion between a substrate and a semiconductor layer and thus exhibit excellent durability under a high temperature and high humidity condition.

If the hydrogen plasma treatment of the invention is performed for the vicinity of the interface between a p-type layer and an n-type layer or the interface adjacent to an i-type layer such as that between a p-type layer and a p/i buffer layer, then relocation of silicon atoms is enhanced and thus bonding states of hydrogen atoms residing in the vicinity of the above-described interface are improved, whereby most of dangling bonds are compensated by hydrogen atoms. This means that the hydrogen plasma treatment of the invention allows a reduction in the defect density in the vicinity of the above-described interface, and thus leads to an improvement in mobility of carriers generated by excitation of light illumination. In particular, active species containing silicon atoms, arising from the plasma including silicon compound gas whose concentration is selected such that no significant film deposition occurs, collide with silicon atoms of the layer surface and some silicon atoms of the layer surface are replaced with the active species. As a result, structural relaxation occurs and the surface state is improved. In particular, in the case where light enters a semiconductor device from its p-layer side, a great amount of carriers are generated by excitation of light in the p-layer region, which may result in generation of defects in the p-layer region. However, if the hydrogen plasma treatment of the invention is performed for the interface between the above-described two layers, the generation of the defects is reduced. In the case where boron atoms having a rather small atomic radius are employed as a dopant for forming a p-type semiconductor layer, the increase in the free carrier density generated by light illumination causes enhancement in diffusion of boron atoms and thus causes degradation in characteristics of a photovoltaic semiconductor device. This problem can also be avoided by performing hydrogen plasma treatment according to the invention for the interface between the p-layer and the adjacent layer. Thus, photovoltaic semiconductor devices subjected to the hydrogen plasma treatment of the invention have such high reliability that the devices are not broken easily under reverse biased conditions. Furthermore, if the hydrogen plasma treatment of the invention is performed for the interface between a p-type layer and an n-type layer, it is possible to prevent the interdiffusion between Group III and V elements, thereby preventing the formation of a high-resistance layer at the interface between the p-type layer and the n-type layer. As a result, it is possible to obtain a small series resistance.

Furthermore, if the hydrogen plasma treatment is performed in an ambient including an additional gas containing a Group III element, it is possible to form a region doped with a very high concentration of Group III element which is activated at a high activation efficiency level in the vicinity of the interface between an i-type layer and the adjacent layer such as that between a p-type layer and a p/i buffer layer. As a result, it becomes possible to employ a thinner p-type layer and thus it becomes possible to improve the conversion efficiency of a photovoltaic semiconductor device. Furthermore, minority carriers become able to move greater distances and thus it is possible to obtain a photovoltaic device having improved characteristics.

Furthermore, if the hydrogen plasma treatment of the invention is performed for the interface between an i-type layer and the adjacent layer such as the interface between a p-type layer and a p/i buffer layer, it is possible to prevent impurities from diffusing from the p-type layer into the i-type layer. Whereas the detailed part of the mechanism for this effect is not clear, a possible mechanism is as follows. During the hydrogen plasma treatment of the invention in which the surface of a p-type or i-type layer is exposed to a hydrogen gas plasma containing a small amount of silicon compound, active species in the hydrogen plasma diffuse into the p-type or i-type layer and silicon atoms contained in the plasma gas also diffuse to vacancies in the layer whereby defects or structural strains on the surface of the p-type or i-type layer are reduced.

Furthermore, if the hydrogen plasma treatment of the invention is performed for the interface between an i-type layer and an n/i buffer layer it is possible to reduce the strain near the interface between the i-type layer and the n/i buffer layer. This suppresses the increase in localized levels which would otherwise increase during long-term light illumination. The reduction in the strain also allows carriers generated by light illumination to move more easily toward the n-type or p-type layer.

In the case where the hydrogen plasma treatment of the invention is performed for the interface between an i-type layer and the adjacent layer such as the interface between an n-type layer and an n/i buffer layer, diffusion of impurities from the n-type layer into the i-type layer is prevented. In this case, active species in the hydrogen plasma diffuse into the n-type or i-type layer and silicon atoms contained in the plasma gas also diffuse to vacancies in the layers during the hydrogen plasma treatment of the invention in which the surface of the n-type or i-type layer is exposed to hydrogen gas plasma containing a small amount of a gas containing silicon atoms. As a result, defects or structural strains on the surface of the n-type or i-type layer are reduced.

Thus, also in this case, the hydrogen plasma treatment of the invention allows a reduction in the defect density in the vicinity of the above-described interface, and thus leads to an improvement in mobility of carriers generated by excitation of light illumination. In particular, active species containing silicon atoms, arising from the plasma including a gas containing silicon atoms whose concentration is selected such that no significant film deposition occurs, collide with silicon atoms of the layer surface and some silicon atoms of the layer surface are replaced with the active species. As a result, structural relaxation occurs and the surface state is improved. In the case where light enters a semiconductor device from its n-layer side, a great amount of carriers are generated by excitation of light in the n-layer region, which may cause generation of defects in the p-layer region. However, if the hydrogen plasma treatment of the invention is performed for the interface between the n-layer and the n/i buffer layer (i-type layer), the generation of the defects is reduced. Thus, also in this case, photovoltaic semiconductor devices subjected to the hydrogen plasma treatment of the invention have exhibit high reliability and the devices are not broken easily even under reverse biased conditions.

Furthermore, if the hydrogen plasma treatment is performed in an ambient including an additional gas containing a Group V element, it is possible to form a region doped with a very high concentration of Group V element in a highly activated state in the vicinity of the interface between the n-type layer and the n/i buffer layer. As a result, it becomes possible to employ a thinner n-type layer and thus it becomes possible to improve the efficiency of light incident on a photovoltaic semiconductor device. Furthermore, minority carriers become able to move greater distances and thus the characteristics of the photovoltaic device are improved.

If the hydrogen plasma treatment of the invention is applied to the interface between an i-type layer and an n/i buffer layer, it is possible to reduce the defect density in the vicinity of the above-described interface. This results in an improvement in mobility of carriers generated by excitation of light illumination. In particular, active species containing silicon atoms, arising from the plasma including a gas containing silicon atoms whose concentration is selected such that no significant film deposition occurs, collide with silicon atoms of the layer surface exposed to the hydrogen plasma and some silicon atoms of the layer surface are replaced with the active species. As a result, structural relaxation occurs and the surface state is improved.

Referring to the accompanying drawings, preferred embodiments of the invention will be described in detail below.

First, a photovoltaic semiconductor device is taken as an example of a semiconductor device, and production methods and equipment therefor will be described in detail referring to the drawings.

FIGS. 1 through 6 are schematic diagrams illustrating examples of preferable semiconductor layer structures of photovoltaic semiconductor devices to be subjected to a hydrogen plasma treatment in a hydrogen ambient including a small amount of gas containing silicon atoms or silicon compound gas according to the present invention.

In the example shown in FIG. 1, a photovoltaic semiconductor device comprises a supporting element 100, a reflection layer 101, a reflection enhancing layer 102, a first n-type (or p-type) layer 103, a first i-type layer 104, a first p-type (or n-type) layer 105, a transparent electrode 112, and a current collection electrode 113. Hereafter, terms "n-type layer", "p-type layer", "i-type layer", and similar expressions are also referred to simply as "n-layer", "p-layer", "i-layer", and so on.

As shown in FIG. 1, a reflection layer 101 and a reflection enhancing layer 102 are formed successively on a supporting element or base 100 thereby forming a substrate 490. Furthermore, a first n-type (or p-type) layer 103, a first i-type layer 104, a first p-type (or n-type) layer 105, and a transparent electrode 112 are successively deposited on the substrate 490 in the above-described order. As required, a current collection electrode 113 is further formed on the transparent electrode 112 to increase the current collection efficiency.

In this example shown in Figure, the photovoltaic semiconductor device has a single pin structure (single cell structure).

Figure 2:
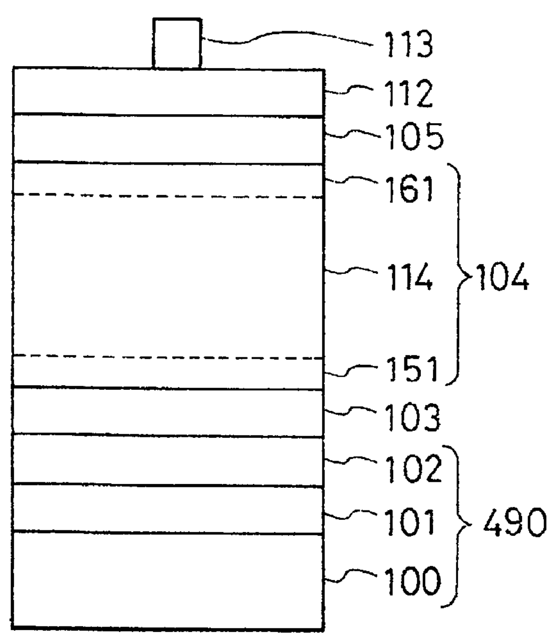

FIG. 2 illustrates another single pin structure that can be preferably employed to form a photovoltaic semiconductor device. In FIG. 2, elements similar to those in FIG. 1 are designated by the same reference numerals as those in FIG. 1, which are not explained here again.

In the example shown in FIG. 2, a first i-type layer 104 comprises an n/i (or p/i) buffer layer 151, a p/i (or n/i) buffer layer 161, and a first i-type main layer 114 (also referred to simply as i-layer 114) disposed between the n/i (or p/i) buffer layer 151 and the p/i (or n/i) buffer layer 161, wherein the n/i (or p/i) buffer layer 151 is disposed adjacent to a first n-type (or p-type) layer 103, and the p/i (or n/i) buffer layer 161 is disposed adjacent to a first p-type (or n-type) layer 105.

Figure 3:
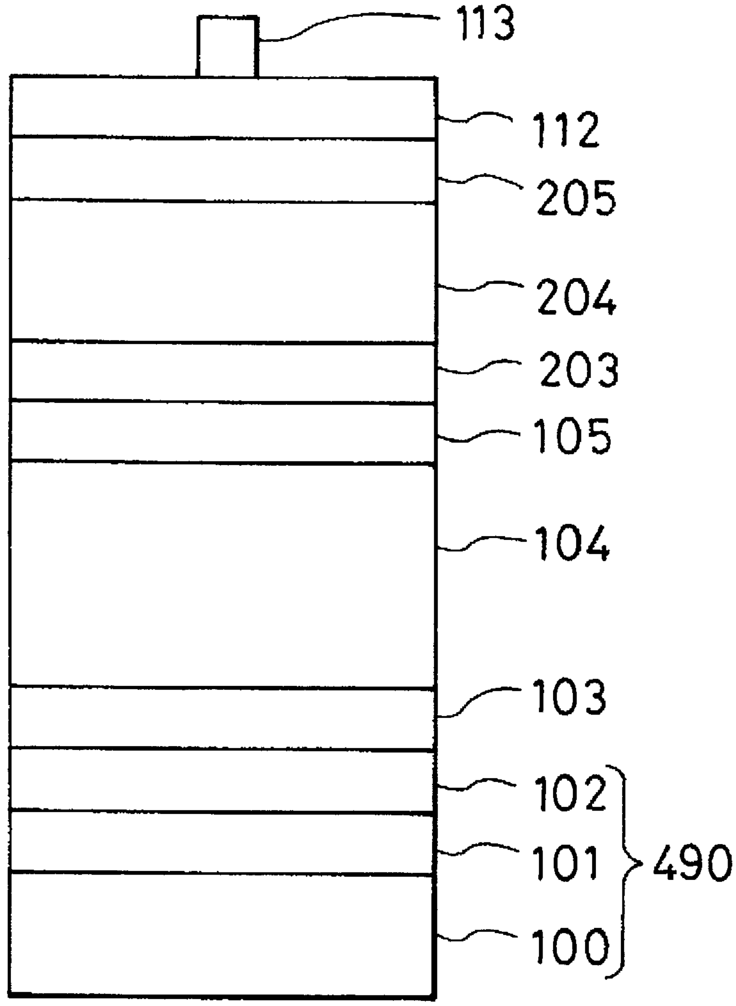

FIG. 3 illustrates another structure called a tandem or double cell structure that can also be preferably employed to form a photovoltaic semiconductor device. In FIG. 3, elements similar to those in FIG. 1 are designated by the same reference numerals as those in FIG. 1.

As shown in FIG. 3, the structure also includes a second n-type (or p-type) layer 203, a second i-type layer 204 and a second p-type (or n-type) layer 205. The structure shown in FIG. 3 is formed as follows. First, a reflection layer 101 and a reflection enhancing layer 102 are deposited successively on a supporting element 100 thereby forming a substrate 490. Then, a first n-type (or p-type) layer 103, a first i-type layer 104, a first p-type (or n-type) layer 105, a second n-type (or p-type) layer 203, a second i-type layer 204, a second p-type (or n-type) layer 205, a transparent electrode 112, and a current collection electrode 113 are deposited on the substrate 490 in the above-described order.

Figure 4:
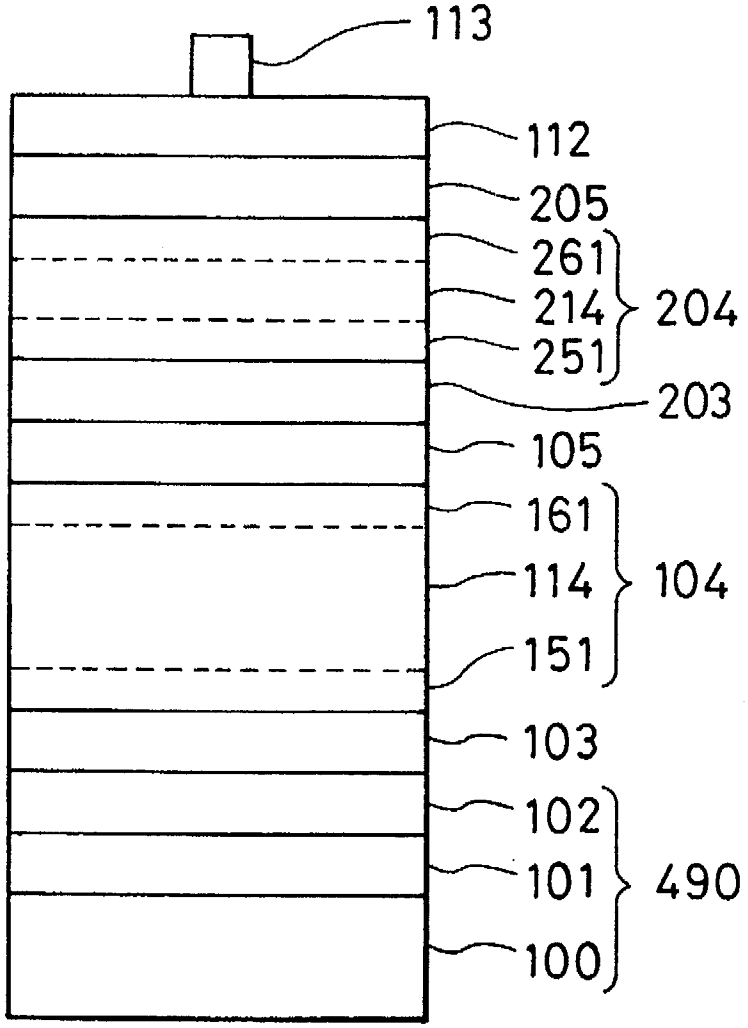

FIG. 4 illustrates another preferable structure of a photovoltaic semiconductor device comprising two pin structures. In FIG. 4, elements similar to those in FIGS. 2 and 3 are designated by the same reference numerals as those in FIG. 2 or 3, and they are not explained here again.

The example shown in Figure comprises two pin structures wherein the i-type layers are provided with buffer layers. One of the pin structures disposed adjacent to the substrate has the same pin structure as that shown in FIG. 2. The other pin structure near the transparent electrode comprises a second n-type (or p-type) layer 203, a second n/i (or p/i) buffer layer 252, a second i-type main layer 214 (also referred to simply as a second i-layer 214), a second p/i (or n/i) buffer layer 261, and a second p-type (or n-type) layer 205 wherein these layers are disposed in the above-described order. The second n/i (or p/i) buffer layer 251, the second i-type main layer 214, and the second p/i (or n/i) buffer layer 261 form a second i-type layer 204.

Figure 5:
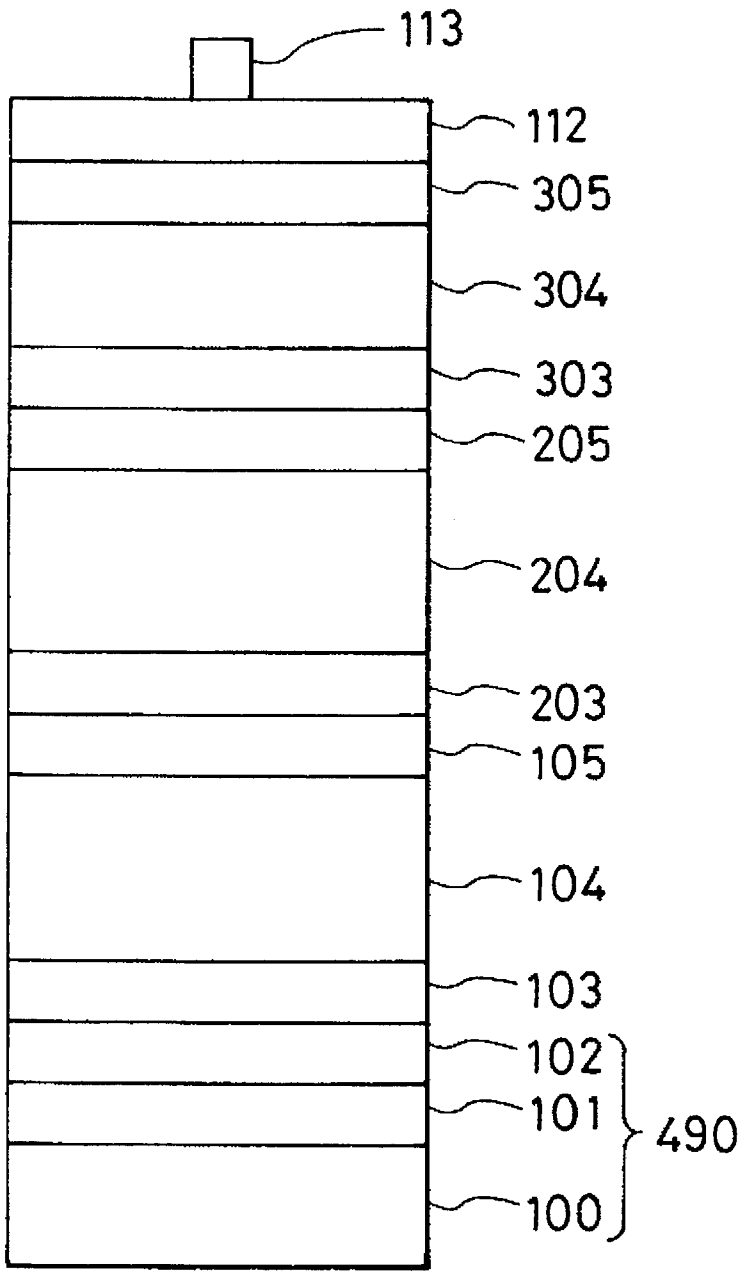

FIG. 5 illustrates still another preferable structure of a photovoltaic semiconductor device comprising three pin structures called a triple cell structure. In FIG. 5, elements similar to those in FIG. 3 are designated by the same reference numerals as those in FIG. 3.

As shown in FIG. 5, the structure includes a third n-type (or p-type) layer 303, a third i-type layer 304, and a third p-type (n-type) layer 305. The structure shown in FIG. 5 is the same as that in FIG. 3 except that another pin structure comprising the third n-type (or p-type) layer 303, the third i-type layer 304, and the third p-type (or n-type) layer 305 arranged in the above order is added between the second p-type (or n-type) layer 205 and the transparent electrode 212.

Figure 6:
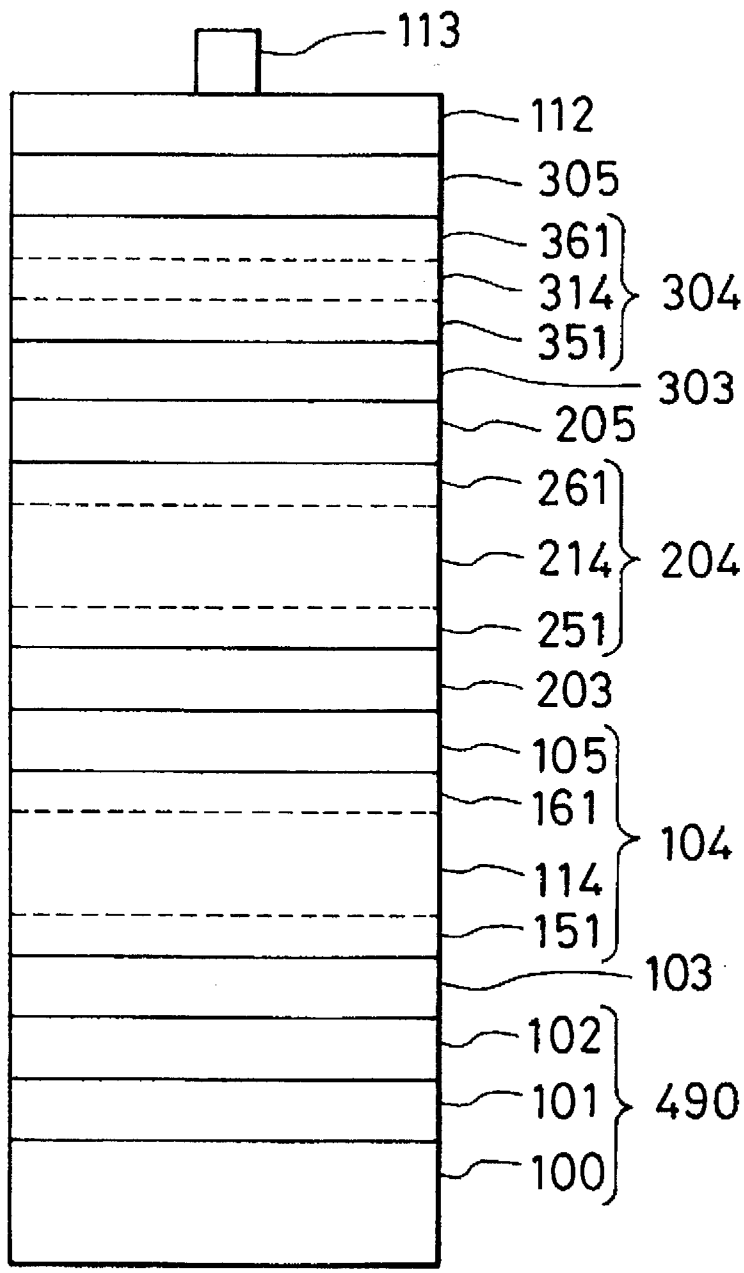

FIG. 6 illustrates another example of a photovoltaic semiconductor device comprising three pin structures. In FIG. 6, elements similar to those in FIG. 4 or 5 are designated by the same reference numerals as those in FIG. 4 or 5.

In the example shown in FIG. 6, the first, second, and third i-type layers, 104, 204, 304 are all provided with their own i-type main layer and buffer layers. The third i-type layer 304 comprises a third n/i (or p/i) buffer layer 351, a third i-type main layer 314, and a third p/i (or n/i) buffer layer 361.

The present invention is also applicable to other various photovoltaic semiconductor devices having different structures. For example, an arbitrary combination of pin structures having buffer layers and pin structures having no buffer layer may also be employed to form a photovoltaic semiconductor device.

Furthermore, a photovoltaic semiconductor device may include four or greater number of pin structures as required, whereas three or less pin structures are more preferable in common practical use from the view points of production ease and the efficiency of electrical power generation.

In the method of producing a semiconductor device having a layer structure, such as a photovoltaic semiconductor device, according to the present invention, at least one interface of the interface between a semiconductor layer and a substrate and the interface(s) between a semiconductor layer and an adjacent semiconductor layer is subjected to a plasma treatment in an atmosphere including a hydrogen gas and another gas containing silicon atoms or silicon compound gas without or with very thin deposition of a film onto the interface. The concentration is defined here in the present invention as a concentration that has no substantial contribution to film deposition during a processing time of the hydrogen plasma treatment. However, it is more preferable that the concentration is selected such that no substantial film deposition occurs even if an interface (or a surface) to be processed is exposed to the above-described hydrogen gas plasma for a longer time duration, such as ten times the normal treatment time.

Each constituent element of a photovoltaic semiconductor device will be described in greater detail below.

Substrate

A preferable material for use as a supporting element in this invention should have a sufficient strength so that little deformation or strain occurs at a film deposition temperature. As for a supporting material for use in a photoelectric semiconductor device, it is preferable that the material be conductive at least at its surface region. A reflection layer and reflection enhancing layer are formed on a supporting material as required. In this case, it is preferable that the supporting material maintain good adhesion to the reflection layer or the reflection enhancing layer during and after the hydrogen plasma treatment.

More specifically, examples of preferable supporting materials include: a plate or a thin film made up of a metallic material such as opaque stainless steel, aluminum, aluminum alloys, iron, iron alloys, copper, copper alloys, etc.; a composite consisting of an arbitrary combination of the above metallic materials; and any one of the above-described materials coated with a different thin metal film and/or an insulating thin film such as $SiO_2$, $Si_3N_4$, $Al_2O_3$, and AlN wherein the coating may be performed by means of sputtering, evaporation, or plating. In the case where the material should be transparent, preferable examples include: a sheet of heat-resisting resin such as polyimide, polyamide, polyethylene terephthalate, and epoxy resin; and a composite consisting of any one of the above sheet of heat-resisting resin and a fiber material such as glass fiber, carbon fiber, boron fiber, and metal fiber; wherein the surface of the material is coated with a conductive thin film such as metal elements, metal alloys, and transparent and conductive oxides by means of sputtering, evaporation, or plating.

The thickness of the supporting element is preferably as thin as possible in the range that can provides a sufficient mechanical strength such that it is not easily bent during a film deposition process or during a transferring process of the supporting element. More specifically, the thickness of the supporting element is preferably in the range from 0.01 mm to 5 mm, more preferably, from 0.02 mm to 2 mm, and most preferably, from 0.05 mm to 1 mm. In particular, a thin metallic film is preferable because a very thin film can be obtained while maintaining a sufficient mechanical strength.

There is no special limitation regarding the width of the supporting element, and the width may be properly selected depending on the size of the vacuum chamber or other factors.

There is also no limitation regarding the length of the supporting element. A long supporting element in a rolled form or a plurality of long supporting elements connected by means of welding into a longer form may be employed. Conversely, a supporting element cut into a short length as required may also be employed.

In particular, when film deposition is performed on a long substrate, it is preferable that a supporting material be heated and cooled for a short time. In such a deposition process, it is undesirable that temperature distribution expands in the longitudinal direction. That is, it is preferable that the heat conduction along the direction of the movement of a supporting element be as small as possible. On the other hand, it is desirable that great heat conduction occur in the direction of the thickness of a supporting element so that the surface of the supporting element can be quickly heated and cooled.

One simple way to have great heat conduction in the thickness direction and small heat conduction in the movement direction is to employ a thin supporting element. If it is assumed that the supporting element has a uniform thickness, it is preferable that the product of the thermal conductivity (W/m.K) and the thickness (m) be less than $1\times10^{-1}$W/K, and more preferably less than $0.5\times10^{-1}$W/K.

Reflection Layer

A reflection layer is used to reflect the light coming through semiconductor layers back to the semiconductor layers. For this sake, the reflectance of the reflection layer should be large enough.

However, if a supporting element having a large enough reflectance is employed, a reflectance layer is not required. In a structure in which semiconductor layers are illuminated with incident light through a supporting element, no reflection layer is required at the interface between the supporting element and the semiconductor layer, whereas a reflection layer may be disposed on the surface opposite to the supporting element.

Examples of materials suitable for the reflection layer include metals such as Ag, Au, Pt, Ni, Cr, Cu, Al, Ti, Zn, Mo, and W, and alloys of these metals, wherein the reflection layer may be formed of any of these materials into a thin film shape by means of evaporation, electron beam evaporation, or sputtering. The thin metal film should be formed such that the film does not act as a significant series resistance of a photovoltaic semiconductor device. To this end, the sheet resistance of the reflection layer should preferably be less than 50 Ω, and more preferably, less than 10 Ω.

In the case where the structure of a photovoltaic semiconductor device is designed such that the active layer is illuminated with light through a transparent supporting element, the above-described reflection layer is preferably replaced with a transparent conductive layer. For this purpose, tin oxide, indium oxide, or alloys of these may be preferably employed to form a transparent conductive layer. The thickness of the above transparent conductive layer is preferably selected such that the thickness satisfies the anti-reflection condition. The sheet resistance of the transparent conductive layer is preferably less than 50 Ω, and more preferably, less than 10 Ω.

Reflection Enhancing Layer

As in the reflection layer, a reflection enhancing layer is not always necessary. However, if a reflection enhancing layer is formed such that the absorption of light by the reflection enhancing layer is small enough, it is possible that the reflection enhancing layer, functioning in conjunction with a reflection layer, returns irregular reflection components back to semiconductor layers thereby further improving conversion efficiency. The existence of a reflection enhancing layer is also desirable from the following view point. That is, the reflection enhancing layer also acts as a bonding layer between a reflection layer and a semiconductor layer and provides better matching between these layers.

The reflectance of the reflection enhancing layer is preferably greater than 85% so that the light reflected from the substrate can be efficiently absorbed by semiconductor layers. The reflection enhancing layer should be formed such that it does not act as a significant series resistance of a photovoltaic semiconductor device. To this end, the sheet resistance of the reflection enhancing layer is preferably less than 100 Ω. For this purpose, a metal oxide such as $SnO_2$, $In_2O_3$, ZnO, CdO, $Cd_2SnO_4$, ITO ($In_2O_3$+$SnO_2$) may be preferably employed as a material for the reflection enhancing layer. In a photovoltaic semiconductor device, the reflection enhancing layer is disposed adjacent to a p-type or n-type layer. Therefore, the reflection enhancing layer should have good adhesion not only to a supporting element but also to a semiconductor layer. The reflection enhancing layer is formed such that its thickness satisfies the reflection enhancing condition. The reflection enhancing layer may be formed by means of resistive heating evaporation, electron beam evaporation, sputtering, spraying, etc.

In the case where the light enters a photovoltaic semiconductor device through a substrate, neither a reflection enhancing layer nor a reflection layer is required between a supporting element and a semiconductor layer. In this case, a reflection enhancing layer is preferably formed between a semiconductor layer and a reflection layer disposed on the surface opposite to the supporting element.

I-Type Layer

In photovoltaic devices composed of an amorphous semiconductor material of Group IV element such as silicon or alloys including a Group IV element, an i-type layer in a pin structure plays an important role in carrier generation in response to light illumination and transportation of generated carriers. The term "i-type layer" used here also includes a slightly p-type layer and a slightly n-type layer. Amorphous semiconductor materials include hydrogen (H) atoms or halogen (X) atoms which play an important role in their behavior, wherein the term "hydrogen" used here includes heavy hydrogen.

Dangling bonds in an i-type layer are compensated by hydrogen (H) atoms or halogen (X) atoms included in the i-type layer. As a result, the product of the carrier mobility and the life time in the i-type layer is increased. Furthermore, the interface states present at the interface between a p-type layer and an i-type layer, or between an n-type layer and an i-type layer are also compensated by hydrogen or halogen atoms, and thus the photoelectromotive force and photocurrent of a photovoltaic device are increased and the optical response characteristics are improved. The concentration of hydrogen atoms and/or halogen atoms included in an i-type layer is preferably in the range from 1 to 40 at %. In particular, the hydrogen atoms and/or halogen atoms are preferably distributed such that their concentration is greater near the interface between a p-type layer and an i-type layer or the interface between an n-type layer and an i-type layer than in the bulk region. More specifically, the above concentration is preferably in the range from 1.1 to 2 times the concentration in the bulk region. The concentration of hydrogen atoms and/or halogen atoms preferably changes in correspondence with the concentration of silicon atoms.

In a photovoltaic semiconductor device having a plurality of pin structures according to the present invention, the pin structure are preferably formed such that the i-type layer nearest to the light incidence side has the greatest bandgap and the bandgap of the i-type layers decreases as the position of the i-type layer becomes farther apart so that the pin structures may efficiently absorb light. An i-type layer having a wider bandgap can be formed of amorphous silicon or amorphous silicon carbide. A narrower bandgap can be obtained by employing amorphous silicon germanium. Examples of amorphous silicon and amorphous silicon germanium are a-Si:H, a-Si:F, a-Si:H:F, a-SiGe:H, a-SiGe:F, a-SiGe:H:F wherein H and F are compensation elements for dangling bonds.

When amorphous silicon germanium is used to form an i-type layer, the concentration of germanium is preferably changed in the thickness direction of the i-type layer. In particular, it is preferable that the concentration of germanium decrease continuously in the n-type or/and p-type layer. The profile of the germanium concentration in the layers can be varied by varying the ratio of the flow rate of a gas containing germanium to that of the total flow rate of source gases. When an MW plasma CVD method is employed to form an i-type layer, the germanium concentration in the i-type layer can also be varied by varying the flow rate of hydrogen gas acting as a dilution gas for source gases, in addition to the above-described method in which the flow rate of a gas containing germanium is varied. For example, if the flow rate of hydrogen gas acting as a dilution gas is increased, then the concentration of germanium in a deposited layer (i-type layer) will be increased.

More particularly, in a photovoltaic semiconductor device according to the present invention, an i-type layer of a pin structure is preferably formed of hydrogenated amorphous silicon (a-Si:H) having an optical bandgap (Eg) in the range from 1.60 eV to 1.85 eV, hydrogen concentration in the range from 1.0% to 25.0%, photoconductivity (σp) greater than $1.0\times10^{-5}$ S/cm under the quasi-solar illumination condition of AM1.5 (100 mW/cm$^2$), dark conductivity (σd) less than $1.0\times10^{-9}$ S/cm, a gradient of the back tail less than 55 meV as measured by the constant photo current (CPM) method, and a localized level density less than $1\times10^{17}$/cm$^3$.

Furthermore, in a photovoltaic semiconductor device according to the present invention, when amorphous silicon germanium is employed to form an i-type layer having a rather narrow bandgap, it is preferable that its optical bandgap be in the range from 1.20 eV to 1.60 eV, the hydrogen concentration be in the range from 1.0% to 25.0%, the gradient of the back tail be less than 55 meV as measured by the constant photo current (CPM) method, and the localized level density be less than $1\times10^{17}$/cm$^3$.

An i-type layer suitable for use in the present invention can be deposited as follows. An amorphous semiconductor layers are deposited by means of RF (radio frequency) plasma CVD, VHF (very high frequency) plasma CVD, or MW (microwave) plasma CVD. When the RF plasma CVD method is employed, the substrate temperature is preferably in the range from 100° C. to 350° C., the pressure in the deposition chamber is preferably in the range from 0.05 Torr to 10 Torr, and the frequency of RF power is preferably in the range from 1 MHz to 50 MHz. As for the frequency of RF power, 13.56 MHz is more preferable. The magnitude of RF power input to the inside of the deposition chamber is preferably in the range from 0.01 to 5 W/cm$^3$. As a result of the application of the RF power, the substrate is preferably self-biased at a voltage in the range from 0 to 300 V.

When the VHF plasma CVD method is employed to deposit an i-type layer, the substrate temperature is preferably in the range from 100° C. to 450° C., the pressure in the deposition chamber is preferably in the range from 0.0001 Torr to 1 Torr, and the frequency of VHF power is preferably in the range from 60 MHz to 500 MHz. In particular, 100 MHz is more preferable as the frequency of VHF power. The magnitude of VHF power input to the inside of the deposition chamber is preferably in the range from 0.01 to 1 W/cm$^3$. As a result of the application of the VHF power, the substrate is preferably self-biased at a voltage in the range from 10 to 1000 V. If additional DC or RF power is introduced into the deposition chamber by superimposing it on the VHF power or otherwise via a separate bias bar, it is possible to improve the quality of a deposited amorphous layer. When the additional DC bias is introduced via the bias bar, the DC bias is preferably applied to the bias bar such that the potential at the bias bar becomes positive. If the DC bias is directly applied to a substrate, the DC bias is preferably applied to the substrate in such a manner that the potential at the substrate becomes negative. In the case of the RF bias, the RF electrode preferably has a smaller area than a substrate.

When the MW plasma CVD method is employed to deposit an i-type layer, the substrate temperature is preferably in the range from 100° C. to 450° C., the pressure in the deposition chamber is preferably in the range from 0.0001 Torr to 0.05 Torr, and the frequency of MW power is preferably in the range from 501 MHz to 10 GHz, whereas 2.45 GHz is more preferable as the frequency of MW power. The magnitude of MW power input to the inside of the deposition chamber is preferably in the range from 0.01 to 1 W/cm$^3$. Preferably, the MW power is introduced into the deposition chamber via a wave guide. If additional DC or RF power is introduced into the deposition chamber by superimposing it on the MW power or otherwise via a separate bias bar, it is possible to improve the quality of a deposited amorphous layer. When the additional DC bias is introduced via the bias bar, the DC bias is preferably applied such that the potential at the bias bar becomes positive. If the DC bias is directly applied to a substrate, the DC bias is preferably applied to the substrate in such a manner that the potential at the substrate becomes negative. In the case of the RF bias, the RF electrode preferably has a smaller area than a substrate.

An i-type layer suitable for the application of the plasma treatment according to the present invention is preferably formed using a silane-based source gas such as $SiH_4$, $Si_2H_6$, $SiF_4$, and $SiF_2H_2$. To obtain a wider bandgap in the i-type layer, a proper amount of carbon, nitrogen, or oxygen gas is preferably added to the above-described silane-based source gas. In this case, rather than introducing a constant amount of carbon, nitrogen, or oxygen into the i-type layer, it is more preferable that the concentration is greater near a p-type layer and/or an n-type layer thereby increasing the open-circuit voltage without degrading the mobility of carriers in the i-type layer. As for a gas containing carbon, a hydrocarbon gas such as $C_nH_{2n+2}$, $C_nH_{2n}$, or $C_2H_2$ is preferable. As for a gas containing nitrogen, $N_2$, NO, $N_2O$, $NO_2$, or $NH_3$ is preferable. $O_2$, $CO_2$, or $O_3$ is preferable as a gas containing oxygen. When NO, $N_2O$, or $NO_2$ is employed, these gases can introduce nitrogen and oxygen at the same time. Similarly, when $CO_2$ is used, carbon and oxygen are introduced at the same time. Any combination of these gases can also be employed. The concentration of the gas added to the source gas to obtain a wider bandgap is preferably in the range from 0.1% to 50% relative to the amount of the gas containing silicon.

The i-layer may contain additional elements of Group III and/or V so as to further improve the electric characteristics such as photoconductivity. Examples of the Group III elements suitable for this purpose include B, Al, Ga, etc. When B is employed, $B_2H_6$, or $BF_3$ is preferable. Examples of suitable Group V elements include N, P, As, etc. When P is employed, $PH_3$ is preferable. The concentration of the gas containing Group III and/or V elements added to the source gas during an i-type layer deposition process can be selected properly as required, whereas the preferable concentration is in the range from 0.1 ppm to 1000 ppm of the gas containing silicon. As described above, if an i-type layer is formed such that it comprises an i-type main layer, an n/i buffer layer, and a p/i buffer layer, it is possible to obtain a photovoltaic semiconductor having improved characteristics. The i-type main layer and the buffer layers can be formed in similar manner to the i-type layer described above. However, it is more preferable that the buffer layers are deposited at a lower deposition rate than the i-type main layer. Furthermore, the buffer layers are preferably formed of semiconductor layers having a wider bandgap than that of the i-type main layer. Preferably, the bandgap is varied continuously and smoothly from the i-type main layer to each buffer layer. The bandgap of the buffer layers can be reduced continuously by increasing the concentration of germanium in a silicon-based amorphous semiconductor layer. On the other hand, if the concentration of atoms including at least one element selected from the group consisting of carbon, oxygen, and nitrogen is increasingly added into a silicon-based amorphous semiconductor layer, the bandgap is continuously increased. Preferably, the ratio of the widest bandgap and to the narrowest bandgap is in the range from 1.01 to 1.5 whereas the ratio should be determined properly so as to meet the required characteristics.

When Group III and/or V elements are incorporated in the buffer layers, a Group III element is preferable as an element incorporated in the n/i buffer layer, and a Group V is preferable as an element incorporated in the p/i buffer layer since the above selections can prevent the degradation due to the diffusion of impurities into the i-type main layer from the n-type layer and/or the p-type layer.

N-Type Layer and P-Type Layer

Both p-type layer and n-type layer are important to obtain good characteristics in a photovoltaic semiconductor device of the invention. Examples of preferable p-type or n-type amorphous materials (the term "amorphous materials" used here includes micro-crystal materials, and amorphous materials are denoted by a prefix "a-" followed by a material name, and micro-crystal materials are denoted by a prefix "μc-" followed by a material name) include a-Si:H, a-Si:HX, a-SiC:H, a-SiC:HX, a-SiGe:H, a-SiGeC:H, a-SiO:H, a-SiN:H, a-SiON:HX, a-SiOCN:HX, μc-Si:H, μc-SiC:H, μc-Si:HX, μc-SiC:HX, μc-SiGe:H, μc-SiO:H, μc-SiGeC:H, μc-SiN:H, μc-SiON:HX, μc-SiOCN:HX wherein these materials are heavily doped with p-type impurities (Group III elements such as B, Al, Ga, In, Tl) or heavily doped with n-type impurities (Group V elements such as P, As, Sb, Bi). Examples of polycrystalline materials (denoted by a material name with a prefix "poly-") include poly-Si:H, poly-Si:HX, poly-SiC:H, poly-SiC:HX, poly-SiGe:H, poly-Si, poly-SiC, poly-SiGe wherein these materials are heavily doped with p-type impurities (Group III elements such as B, Al, Ga, In, Tl) or heavily doped with n-type impurities (Group V elements such as P, As, Sb, Bi).

In particular, a crystalline semiconductor layer which absorbs a rather small amount of light or an amorphous semiconductor layer having a wide bandgap is suitable for a p-type or n-type layer disposed near the surface on which light is incident.

The concentration of the gas containing a Group III element for p-type layer and the concentration of the gas containing a Group V element for n-type layers are preferably in the range from 0.1 to 50 atomic % relative to the gas containing silicon.

Hydrogen (H) or halogen atoms are incorporated into p-type or n-type layers so that dangling bonds in the p-type or n-type layers are compensated by the hydrogen or halogen atoms thereby increasing the doping efficiency of the p-type or n-type layers. Preferably, the concentration of the hydrogen or halogen atoms incorporated in the p-type or n-type layers is in the range from 0.1 to 40 atomic %. In particular, for p-type or n-type layers formed of a crystalline or polycrystalline material, it is preferable that a concentration of hydrogen or halogen atoms be in the range from 0.1 to 8 atomic %. Furthermore, hydrogen or halogen atoms are preferably incorporated in p-type or n-type layers such that the region near the interface between a p-type layer and an i-type layer or the interface between an n-type layer and an i-type layer has a greater concentration. More specifically, the concentration of the hydrogen or halogen atoms near such an interface is preferably in the range from 1.1 to 2 times the concentration in the bulk region. The greater concentration of the hydrogen or halogen atoms at the p/i interface or n/i interface allows a reduction in defect level density or mechanical strain near the interface and thus an increase in the photoelectromotive force and photocurrent of a photovoltaic semiconductor device.

Preferably, the p-type and n-type layers of the photovoltaic semiconductor device are formed of a material having activation energy less than 0.2 eV, and more preferably less than 0.1 eV. The specific resistance of the material is preferably less than 100 Ωcm, and more preferably less than 1 Ωcm. The thickness of the p-type and n-type layers are preferably in the range from 1 to 50 nm, and more preferably from 3 to 10 nm.

The microwave plasma CVD (MWPCVD) method is the most suitable for forming Group IV element amorphous semiconductor layers or Group IV element-based amorphous semiconductor layers for use as semiconductor layers of a photovoltaic semiconductor device according to the present invention, whereas the VHF plasma CVD (VHFPCVD) and RF plasma CVD (RFPCVD) methods may also be employed.

In the microwave plasma CVD method, source gas and dilution gas are introduced into a deposition chamber which is evacuated by a vacuum pump to a constant pressure. Microwave power generated by a microwave power source is transmitted along a wave guide and introduced into the deposition chamber via a dielectric window (formed of a material such as alumina ceramic) so that the gas is excited into a plasma state thereby depositing a desired film on a substrate. In this method, a wide range of deposition conditions are possible and thus it is possible to deposit a variety of films required in photovoltaic semiconductor devices.

Examples of source gases suitable for deposition of Group IV element amorphous semiconductor layers or Group IV element-based amorphous semiconductor layers are compounds containing silicon that can be in a gas phase, compounds containing germanium that can be in a gas phase, compounds containing carbon that can be in a gas phase, compounds containing nitrogen that can be in a gas phase, compounds containing oxygen that can be in a gas phase, and mixture gases of these compounds.

Examples of compounds containing silicon that can be in a gas phase are silane compounds having a ring or chain structure such as $SiH_4$, $Si_2H_6$, $SiF_4$, $SiFH_3$, $SiF_2H_2$, $SiF_3H$, $Si_3H_8$, $SiD_4$, $SiHD_3$, $SiH_2D_2$, $SiH_3D$, $SiFD_3$, $SiF_2D_2$, $SiD_3H$, $Si_2D_3H_3$, $(SiF_2)_5$, $(SiF_2)_6$, $(SiF_2)_4$, $Si_2F_6$, $Si_3F_8$, $Si_2H_2F_4$, $Si_2H_3F_3$, $SiCl_4$, $(SiCl_2)_5$, $SiBr_4$, $(SiBr_2)_5$, $Si_2Cl_6$, $SiHCl_3$, $SiH_2Br_2$, $SiH_2Cl_2$, $Si_2Cl_3F3$, etc., wherein these are in a gas phase under normal conditions or they can be easily vaporized. The above examples include some compounds having heavy hydrogen denoted by "D". However, hydrogen atoms may also be replaced with heavy hydrogen atoms in different manners. This will also be the case in the examples described below.

Specific examples of compounds containing germanium that can be in a gas phase are $GeH_4$, $GeD_4$, $GeF_4$, $GeFH_3$, $GeF_2H_2$, $GeF_3H$, $GeHD_3$, $GeH_2D_2$, $GeH_3D$, $Ge_2H_6$, $Ge_2D_6$, etc.

Specific examples of compounds containing carbon that can be in a gas phase are $CH_4$, $CD_4$, $C_nH_{2n+2}$ (n is an integer), $C_nH_{2n}$ (n is an integer), $C_2H_2$, $C_6H_6$, $CO_2$, CO, etc.

Specific examples of compounds containing nitrogen that can be in a gas phase are $N_2$, $NH_3$, $ND_3$, NO, $NO_2$, $N_2O$, etc. Specific examples of compounds containing oxygen that can be in a gas phase are $O_2$, CO, $CO_2$, NO, $NO_2$, $N_2O$, $CH_3CH_2OH$, $CH_3OH$, etc.

To control the valence electrons, elements in Group III and V of the periodic table are preferably introduced into the p-type or n-type layers.

Boron which is one of the elements in Group III can be derived and introduced into the layers from boron hydrides such as $B_2H_6$, $B_4H_{10}$, $B_5H_9$, $B_5H_{11}$, $B_6H_{10}$, $B_6H_{12}$, $B_6H_{14}$, etc., or from boron halides such as $BF_3$, $BCl_3$, etc. Furthermore, compound gases such as $AlCl_3$, $GaCl_3$, $InCl_3$, $TlCl_3$, etc., can also be employed for the same purpose. Of the above, $B_2H_6$ and $BF_3$ are more preferable.

Phosphorus which is one of the Group V elements can be derived and introduced into the layers from phosphorus hydrides such as $PH_3$, $P_2H_4$, etc., or from phosphorus halides such as $PH_4I$, $PF_3$, $PF_5$, $PCl_3$, $PCl_5$, $PBr_3$, $PBr_5$, $PI_3$, etc. Furthermore, $AsH_3$, $AsF_3$, $AsCl_3$, $AsBr_3$, $AsF_5$, $SbH_3$, $SbF_3$, $SbF_5$, $SbCl_5$, $SbCl_3$, $BiH_3$, $BiCl_3$, $BiBr_3$, etc., can also be employed for the same purpose. Of the above, $PH_3$, and $PF_3$ are more preferable.

In a practical deposition process, the above-described compound gases may be diluted in other gas such as $H_2$, He, Ne, Ar, Xe, Kr, etc., as required. In particular, when microcrystal semiconductor or a-SiX:H is employed to deposit a layer which absorbs a rather small amount of light or which has a wide bandgap, the source gas is preferably diluted 2 to 100 in hydrogen gas and rather high microwave or RF power is preferably introduced into the deposition chamber.

Transparent Electrode

It is desirable that the transmittance of the transparent electrode be greater than 85% so that a great amount of incident light such as solar radiation or radiation of a daylight fluorescent lamp can reach the semiconductor layers. Furthermore, it is desirable that the sheet resistance of the transparent electrode be less than 100 Ω so that it does not act as a significant series resistance of a photovoltaic semiconductor device. Examples of materials suitable for this purpose are metal oxides such as $SnO_2$, $In_2O_3$, ZnO, CdO, $Cd_2SnO_4$, ITO($In_2O_33+SnO_2$), etc., and metals such as Au, Al, Cu, etc., deposited into the form of a very thin film such that they are semitransparent.

In a photovoltaic semiconductor device, a transparent electrode is deposited on a p-type or n-type layer. In the case where a photovoltaic semiconductor device is illuminated with light through a transparent supporting element, a transparent electrode is disposed on the transparent supporting element and semiconductor layers are formed on it. Therefore, the material of the transparent electrode should have good adhesion to the semiconductor layer and the supporting element. It is desirable that the thickness of the transparent electrode be selected such that the anti-reflection condition is satisfied so that a greater amount of incident light can reach the semiconductor layers. The transparent electrode can be formed by means of resistive heating evaporation, electron beam evaporation, sputtering, spraying, etc.

Current Collection Electrode

The photovoltaic semiconductor device that has been subjected to the hydrogen plasma treatment according to the present invention may be further improved in the conversion efficiency by providing a current collection electrode made of a silver-filled epoxy adhesive coated by means of a screen printed technology or made of metal such as Cr, Ag, Au, Cu, Ni, Mo, Al, etc., evaporated via a mask. The current collection electrode may also be formed by attaching metal wires such as Cu, Au, Ag, Al may also be to the surface of the photovoltaic device via a carbon-filled or silver-filled epoxy adhesive.

A plurality of photovoltaic semiconductor devices may be connected to each other in series or in parallel so as to achieve a desired output voltage or output current. In this case, a protective layer is formed on the back surface of each photovoltaic semiconductor device, and an output electrode is formed as required. When a plurality of photovoltaic semiconductor devices are connected in series, reverse-current protection diodes may be incorporated in the circuit.

Production Method and Equipment

As an example of a semiconductor device of the invention, a photovoltaic semiconductor device is taken and a method and equipment for producing it will be described in detail below. FIG. 7 is a schematic diagram illustrating an example of film deposition equipment.

In this example shown in FIG. 7, the deposition equipment 400 comprises: a load chamber 401; transfer chambers 402, 403, 404; an unload chamber 405; gate valves 406, 407, 408, 409; substrate heaters 410, 411, 412; substrate transfer rail 413; an n-layer (or p-layer) deposition chamber 417; an i-layer deposition chamber 418; a p-layer (or n-layer) deposition chamber 419; a plasma excitation cups 420, 421; power supplies 422, 423, 424; a microwave entrance window 425; a wave guide 426; gas inlets 429, 449, 469; valves 430, 431, 432, 433, 434, 441, 442, 443, 444, 450, 451, 452, 453, 454, 455, 461, 462, 463, 464, 465, 470, 471, 472, 473, 474, 481, 482, 483, 484; and mass flow controllers 436, 437, 438, 439, 456, 457, 458, 459, 460, 476, 477, 478, 479.

The i-layer deposition chamber includes a shutter 427, a bias bar 428, and a substrate holder 490. The deposition equipment 400 also includes an evacuation system, a microwave power supply, a vacuum gauge, and a controller, whereas these are not shown in FIG. 7.

Referring to FIG. 7, a substrate (not shown) is placed on a substrate holder 490 in the load chamber 401, and then moved into the deposition equipment 400 along the substrate transfer rail 413. The entrance gate valve (not shown) of the load chamber 401 is closed and air inside the load chamber 401 is evacuated by evacuation means such as a vacuum pump (not shown). The gate valve 406 is then opened and the substrate holder 490 is transferred into the transfer chamber 402 along the substrate transfer rail 413.

When the substrate holder 490 has reached proper position in the transfer chamber 402, the gate valve 406 is closed. The substrate placed on the substrate holder 490 is heated by the substrate heater 410 and then, or while being heated by the heater, the substrate holder 490 is carried into the n-layer (or p-layer) deposition chamber 417, in which an n-type layer (or p-type layer) is deposited on the substrate by decomposing the supplied source gas by means of glow discharging.

The gate valve 407 is opened and the substrate holder 490 is moved into the transfer chamber 403 along the substrate transfer rail 413. The gate valve 407 is then closed.

The substrate is heated by the substrate heater 411, and then, or while being heated by the heater, the substrate placed on the substrate holder 490 is transferred into the i-layer deposition chamber 418 connected to the transfer chamber 403. Microwave power is then applied thereby decomposing the source gas so that an i-type layer is deposited on the n-type layer (or p-type layer) formed on the substrate.

The substrate holder 490 is then moved back into the transfer chamber 403. The gate valve 408 is opened, and the substrate holder 490 is moved into the transfer chamber 404 along the transfer rail 413.

The gate valve 408 is then closed. The substrate placed on the substrate holder 490 is heated by the substrate heater 412, and then, or while being heated by the heater, the substrate together with the substrate holder 490 is moved into the p-layer (or n-layer) deposition chamber 419 connected to the transfer chamber 404. A proper source gas is introduced into the deposition chamber 419 and the source gas is excited into a plasma state thereby depositing a p-type layer (or n-type layer) on the i-type layer by means of glow discharge decomposition.

The substrate holder 490 is then moved back into the transfer chamber 404. The gate valve 409 is opened, and the substrate holder 490 is moved along the transfer rail 413 into the unload chamber 405. The gate valve 409 is then closed. A gate valve (not shown) is opened and the substrate is taken out through it.

A transparent electrode and current collection electrode are further formed as required. Thus, a complete semiconductor device (photovoltaic device) having a pin structure is obtained.

If it is desired to form a plurality of pin structures, the deposition equipment 400 may be connected to a required number of similar deposition equipment for performing similar processes, or otherwise, the above unload chamber 405 may be replaced with a deposition chamber similar to the deposition chamber 402 for depositing an n-layer (or p-layer), and this deposition chamber may be connected to an additional part so that the resultant configuration may be similar to that of the deposition equipment 400.

If the gate valves 406, 407, 408, 409 are realized by gas gates, it becomes possible to deposit a desired film on a long continuous substrate. In this case, the deposition chambers should be disposed at proper positions nearer to a substrate to be processed.

The hydrogen plasma treatment of the invention is performed on the surface of the substrate or on the surfaces which will finally become the interfaces between semiconductor layers. When a single substrate is handled as in the case shown in FIG. 7, the plasma treatment can be performed before or after a normal deposition process of a semiconductor layer in a proper deposition chamber by controlling the amount of source gas so that a plasma suitable for the plasma treatment is generated. In the case where films are deposited onto a long substrate, the deposition chamber is modified such that it has a longer shape along the longitudinal direction of the substrate and a hydrogen plasma treatment region is provided in addition to a deposition region in the chamber. Alternatively, in both cases, an additional chamber similar to the deposition chamber may be provided for use dedicated to the hydrogen plasma treatment. Furthermore, another deposition chamber may be provided for depositing an n/i buffer layer or a p/i buffer layer.

More specific examples of hydrogen plasma treatment using the above-described deposition equipment 400 will be explained below. In the examples described below, the surface of the substrate and interfaces between adjacent semiconductor layers are all subjected to hydrogen plasma treatment. However, the present invention is not limited only to that case. In general, at least one surface or interface selected from the group consisting of a surface or interfaces is subjected to hydrogen plasma treatment, whereas if a plurality of surfaces or interfaces are subjected to hydrogen plasma treatment, the resultant effects will be enhanced.

First, all chambers of the deposition equipment 400 are evacuated by turbo-molecular pumps (not shown) connected to the respective chambers down to a pressure less than $10^{-6}$ Torr.

Then, hydrogen plasma treatment of the invention is performed as described below. A substrate is placed on the substrate holder 490 wherein a reflection layer of silver or the like has been evaporated beforehand on a stainless-steel supporting element and a reflection enhancing layer of zinc oxide has been further evaporated on it. The substrate holder 490 is then placed in the load chamber 401. The door of the load chamber 401 is closed, and the load chamber 401 is evacuated by a mechanical booster pump/rotary pump (MP/RP) down to a proper pressure. When the pressure inside the load chamber has reached the proper value, the evacuating system is switched from the MP/RP to the turbo-molecular pump and the load chamber is further evacuated down to a pressure less than $10^{-6}$ Torr.

When the pressure inside the load chamber has become less than $10^{-6}$ Torr, the gate valve 406 is opened, and the substrate holder 490 is moved along the substrate transfer rail 413 into the transfer chamber 402. The gate valve 406 is then closed.

The substrate heater 410 in the transfer chamber 402 has been raised beforehand so that the substrate holder 490 does not collide with the substrate heater 410 during the above movement. The substrate holder 490 is positioned so that the substrate comes to a location just below the heater 410.

The substrate heater 410 is then lowered and the substrate is moved into the n-layer (or n-layer) deposition chamber. The substrate is heated by the substrate heater 410 up to a proper temperature. The turbo-molecular pump is switched to the MP/RP, and hydrogen gas and a gas containing silicon to be used for the hydrogen plasma treatment of the present invention are introduced into the deposition chamber 417 via the valves 441, 442, the mass flow controllers 436, 437, the valves 431, 432, and the valve 429. The opening ratio of a vent valve (not shown) is adjusted so as to obtain a desired pressure inside the deposition chamber 417. When the pressure of the chamber 417 has become stable, RF power is introduced from the RF power supply 422 into the plasma excitation cup 420 thereby generating a plasma. In this way, hydrogen plasma treatment is performed for a proper time duration according to the present invention.

During the hydrogen plasma treatment, the process parameters such as the flow rates of the hydrogen gas and the gas containing silicon, the RF power, and the substrate temperature are preferably varied depending on the state of the substrate surface or the state of the surface of the inner wall of the chamber. For example, the hydrogen gas is preferably supplied at a rather large flow rate at the initial stage, and the flow rate is then reduced with time. The flow rate of the gas containing silicon is preferably set to a low value at the beginning, and increased with time. The RF power is preferably set to a high value at the beginning and reduced with time.

When the hydrogen plasma treatment has been performed for the proper time duration, the RF power supply 422 is turned off, and the substrate temperature is changed to a value suitable for depositing an n-type layer or a p-type layer. The gas containing silicon is shut off. (The n-type layer or the p-type layer may be deposited using the same gas containing silicon. In this case, the gas containing silicon may be increased.) To deposit the n-type layer or the p-type layer, a gas containing silicon such as $SiH_4$, $Si_2H_6$, etc., and a gas containing a Group V element or a Group III element to be incorporated into the n-type layer or the p-type layer are introduced via the valve 443, the mass flow controller 438, and the valve 433. The flow rate of the hydrogen gas is also adjusted depending on the n-type or p-type layer to be deposited.

In this way, the source gases for use in depositing the n-type or p-type layer are introduced into the deposition chamber 417 and the vent valve (not shown) is adjusted so that the pressure inside the deposition chamber 417 has a proper value in the range from 0.1 Torr to 10 Torr. The RF power is then applied by the RF power supply 422 to the plasma excitation cup 420 thereby generating plasma discharging, which is maintained for a proper time duration until the n-type or p-type layer having a desired thickness has been deposited. In the above processing, the n-type or p-type layer may be preferably deposited continuously after the completion of the hydrogen plasma treatment of the invention without stopping the plasma discharging, simply by continuously or abruptly changing the flow rates of the source gases, the RF power, and the pressure. By way of example, the hydrogen plasma treatment for the n-type layer will be described in detail below.

Hydrogen gas and a gas containing silicon to be used for the hydrogen plasma treatment of the present invention are introduced into the deposition chamber 417 via the valves 441, 442, the mass flow controllers 436, 437, the valves 431, 432, and the valve 429. The vent valve (not shown) is adjusted so that the pressure inside the deposition chamber 417 has a proper value. When the pressure of the chamber 417 has become stable, RF power is introduced from the RF power supply 422 into the plasma excitation cup 420 thereby generating a plasma. Thus, hydrogen plasma treatment is performed for a proper time duration according to the present invention.

During the hydrogen plasma treatment, the process parameters such as the flow rates of the hydrogen gas and the gas containing silicon, the RF power, and the substrate temperature are preferably varied depending on the state of the substrate surface or the state of the surface of the inner wall of the chamber. For example, the hydrogen gas is preferably supplied at a rather large flow rate at the initial stage, and the flow rate is then reduced with time. The flow rate of the gas containing silicon is preferably set to a low value at the beginning, and increased with time. The RF power is preferably set to a high value at the beginning and reduced with time.

Alternatively, after the completion of the n-type layer deposition, the substrate temperature is changed to a value suitable for the hydrogen plasma treatment of the invention, and then a gas containing silicon such as $SiH_4$, $Si_2H_6$, etc., a gas containing a Group V element or a Group III element, and hydrogen gas, to be used for the hydrogen plasma treatment of the present invention, are introduced into the deposition chamber 417 via the valves 441, 442, 443, the mass flow controllers 436, 437, 438, and the valves 431, 432, 433. In this way, the source gases for use in performing the hydrogen plasma treatment of the invention are introduced into the deposition chamber 417 and the vent valve (not shown) is adjusted so that the pressure inside the deposition chamber 417 has a proper value in the range from 0.1 Torr to 10 Torr. The RF power is then applied by the RF power supply 422 to the plasma excitation cup 420 thereby generating plasma discharging, which is maintained for a proper time duration so that the hydrogen plasma treatment is performed on the n-type layer formed on the substrate.

In the above hydrogen plasma treatment for the n-type layer, it is preferable that a rather great amount of gas containing Group V element is included in the hydrogen gas at the beginning, and the amount of the gas containing Group V element is then reduced with time. During the above hydrogen plasma treatment, the process parameters such as the flow rates of the hydrogen gas and the gas containing silicon, the RF power, and the substrate temperature are preferably varied depending on the state of the substrate surface or the state of the surface of the inner wall of the chamber. That is, the hydrogen gas is preferably supplied at a rather large flow rate at the initial stage, and the flow rate is then reduced with time. The flow rate of the gas containing silicon is preferably set to a low value at the beginning, and increased with time. The RF power is preferably set to a high value at the beginning and reduced with time.

After the completion of the hydrogen plasma treatment on the n-type layer, the supply of the source gases into the deposition chamber 417 is stopped, and the inside of the deposition chamber 417 is purged with hydrogen gas or helium gas. When the deposition chamber 417 has been purged enough, the hydrogen or helium gas is stopped, and the deposition chamber 417 is evacuated down to $10^{-6}$ Torr using the turbo-molecular pump. The gate valve 407 is opened, and the substrate holder 490 is moved into the transfer chamber 403. The gate valve 407 is then closed. In the situation in which the transfer chamber 402 is directly coupled to the transfer chamber 403 via the opened gate valve 407, it is preferable that the pressure of the transfer chamber 403 be equal to that of the transfer chamber 402 or otherwise the pressure of the transfer chamber 402 be less than that of the transfer chamber 403 so that the i-type layer deposition chamber will not be contaminated with unwanted impurities. When the load chamber 401 or 405 is directly coupled with the adjacent transfer chamber 402 or 404 via an open gate valve, the transfer chamber 402 or 404 is preferably maintained at a higher pressure than the load chamber 401 or 405 so as to prevent atmospheric air from penetrating into the transfer chamber 402 or 404 thereby allowing deposition of high quality films.

The position of the substrate holder 490 is then adjusted so that the substrate can be heated by the substrate heater 411. The substrate heater 411 is moved such that it comes into contact with the substrate and the substrate is heated up to a proper temperature. Hydrogen gas or an inert gas such as helium is introduced into the deposition chamber 418. The deposition chamber 418 is preferable maintained at a pressure equal to that at which an n/i buffer layer is deposited.

When the substrate temperature has reached the proper value, the gas for use during the heating of the substrate is shut off, and source gases to be used to deposit of an n/i buffer layer are supplied into the deposition chamber 418 from a source gas supplying system. For example, hydrogen gas, silane gas, and germane gas are introduced into the deposition chamber 418 via the valves 462, 463, 464, the mass flow controllers 457, 458, 459, the valves 452, 453, 454, 450 and the gas inlet 449, wherein the flow rates of these gases are controlled by the mass flow controllers 457, 458, and 459, respectively.

When the pressure inside the deposition chamber 418 has reached a desired stable value, RF power is applied to a bias bar by an RF power supply (not shown) and an n/i buffer layer is deposited by means of RF plasma CVD. Preferably, the n/i buffer layer is deposited at a smaller deposition rate than an i-type layer which will be deposited on it.

Hydrogen plasma treatment for the n/i buffer layer may be performed for example acceding to the steps described below.

Hydrogen gas and a gas containing silicon to be used for the hydrogen plasma treatment of the present invention are introduced into the deposition chamber 418 via the valves 461, 462, the mass flow controllers 456, 457, the valves 451, 452, and the valve 450, wherein the flow rates of the gases are controlled by the mass flow controllers 456 and 457. A vent valve (not shown) is adjusted so that the inside of the deposition chamber 418 is maintained at a proper pressure. When the pressure of the chamber 418 has become stable, RF power is applied to the bias bar 428 by the RF power supply 424 thereby generating a plasma. Thus, hydrogen plasma treatment is performed for a proper time duration according to the present invention.

During the hydrogen plasma treatment, the process parameters such as the flow rates of the hydrogen gas and the gas containing silicon, the RF power, and the substrate temperature are preferably varied depending on the state of the substrate surface or the state of the surface of the inner wall of the chamber. For example, the hydrogen gas is preferably supplied at a rather large flow rate at the initial stage, and the flow rate is then reduced with time. The flow rate of the gas containing silicon is preferably set to a low value at the beginning, and increased with time. The RF power is preferably set to a high value at the beginning and reduced with time.

The substrate is then heated to a temperature suitable for depositing an i-type layer. During the heating of the substrate, hydrogen gas or an inert gas such as helium is preferably introduced into the deposition chamber 418 via the valves 461, 451, and 450 wherein the flow rate of the gas is controlled by a mass flow controller. Furthermore, the deposition chamber 418 is preferable maintained at a pressure equal to that at which an i-type layer will be deposited.

When the substrate temperature has reached the proper value, the gas for use during the heating of the substrate is shut off, and source gases to be used to deposit an i-type layer are supplied into the deposition chamber 418 from the source gas supplying system. For example, hydrogen gas, silane gas, and germane gas are introduced into the deposition chamber 418 via the valves 462, 463, 464, the mass flow controllers 457, 458, 459, the valves 452, 453, 454, 450 and the gas inlet 449, wherein the flow rates of these gases are controlled by the mass flow controllers 457, 458, and 459, respectively. These source gases are pumped by a diffusion pump (not shown) so that the inside of the deposition chamber is maintained at a proper pressure. When the pressure inside the deposition chamber 418 has become stable at the proper value, microwave power is introduced via the wave guide 426 and the microwave entrance window 425 into the deposition chamber 418. As shown in an enlarged fashion in FIG. 7, DC bias power, in addition to the above microwave power, may also be introduced into the deposition chamber 418 via the bias bar from an external DC power supply, RF power supply, or VHF power supply 424. Thus, an i-type layer having a desired thickness is deposited. When the thickness of the i-type layer has reached the desired value, the microwave power and the bias power are turned off.

Hydrogen plasma treatment for the i-type layer may be performed for example according to the steps described below.

Hydrogen gas and a gas containing silicon to be used for the hydrogen plasma treatment of the present invention are introduced into the deposition chamber 418 via the valves 461, 462, the mass flow controllers 456, 457, the valves 451, 452, and the valve 450, wherein the flow rates of the gases are controlled by the mass flow controllers 456 and 457. The vent valve (not shown) is adjusted so that the inside of the deposition chamber 418 is maintained at a proper pressure. When the pressure of the chamber 418 has become stable, RF power is applied to the bias bar 428 by the RF power supply 424 thereby generating a plasma. Thus, hydrogen plasma treatment is performed for a proper time duration according to the present invention.

During the hydrogen plasma treatment, the process parameters such as the flow rates of the hydrogen gas and the gas containing silicon, the RF power, and the substrate temperature are preferably varied depending on the state of the substrate surface or the state of the surface of the inner wall of the chamber. For example, the hydrogen gas is preferably supplied at a rather large flow rate at the initial stage, and the flow rate is then reduced with time. The flow rate of the gas containing silicon is preferably set to a low value at the beginning, and increased with time. The RF power is preferably set to a high value at the beginning and reduced with time.

After the completion of the hydrogen plasma treatment, the supply of the gas for the hydrogen plasma treatment is stopped, and the inside of the deposition chamber 418 is purged with hydrogen gas or an inert gas such as helium gas as required.

Then, a p/i buffer layer having a desired thickness is deposited in a similar manner to that in the n/i buffer layer. After the completion of the deposition of the p/i buffer layer, the inside of the deposition chamber 418 is purged with hydrogen gas or an inert gas such as helium gas as required.

Hydrogen plasma treatment for the p/i layer may be performed for example according to the steps descried below.

Hydrogen gas and a gas containing silicon to be used for the hydrogen plasma treatment of the present invention are introduced into the deposition chamber 418 via the valves 461, 462, the mass flow controllers 456, 457, the valves 451, 452, and the valve 450, wherein the flow rates of the gases are controlled by the mass flow controllers 456 and 457. The vent valve (not shown) is adjusted so that the inside of the deposition chamber 418 is maintained at a proper pressure. When the pressure of the chamber 418 has become stable, RF power is applied to the bias bar 428 by the RF power supply 424 thereby generating a plasma. Thus, hydrogen plasma treatment is performed for a proper time duration according to the present invention.

During the hydrogen plasma treatment, the process parameters such as the flow rates of the hydrogen gas and the gas containing silicon, the RF power, and the substrate temperature are preferably varied depending on the state of the substrate surface or the state of the surface of the inner wall of the chamber. For example, the hydrogen gas is preferably supplied at a rather large flow rate at the initial stage, and the flow rate is then reduced with time. The flow rate of the gas containing silicon is preferably set to a low value at the beginning, and increased with time. The RF power is preferably set to a high value at the beginning and reduced with time. An alternative method of hydrogen plasma treatment for a p/i buffer layer is as follows. After the completion of the deposition of a p/i buffer layer, hydrogen gas, a gas containing silicon, and a gas containing Group III element to be used for the hydrogen plasma treatment of the present invention are introduced into the deposition chamber 418 via the valves 461, 462, 463, the mass flow controllers 456, 457, 458, the valves 451, 452, 453, 450, wherein the flow rates of the gases are controlled by the mass flow controllers 456, 457, and 458. The vent valve (not shown) is adjusted so that the inside of the deposition chamber 418 is maintained at a proper pressure. When the pressure of the chamber 418 has become stable, RF power is applied to the bias bar 428 by the RF power supply 424 thereby generating a plasma. Thus, hydrogen plasma treatment is performed for a proper time duration according to the present invention.

During the hydrogen plasma treatment, the process parameters such as the flow rates of the hydrogen gas and the gas containing silicon, the RF power, and the substrate temperature are preferably varied depending on the state of the substrate surface or the state of the surface of the inner wall of the chamber. For example, the hydrogen gas is preferably supplied at a rather large flow rate at the initial stage, and the flow rate is then reduced with time. The flow rate of the gas containing silicon is preferably set to a low value at the beginning, and increased with time. The RF power is preferably set to a high value at the beginning and reduced with time.

After the completion of the hydrogen plasma treatment according to the invention, the inside of the deposition chamber is purged. The evacuating system is switched from the diffusion pump to the turbo-molecular pump, and the deposition chamber is pumped down to a pressure less than $10^{-6}$ Torr. In the meantime, the substrate heater is raised so that the substrate holder may move without collision with the heater. The gate valve 408 is opened, and the substrate holder is moved to the transfer chamber 404 via the transfer chamber 403. The gate valve 408 is then closed.

The substrate holder is moved to a position just below the substrate heater 412, and the substrate is heated by the substrate heater 412. During the heating process, it is more preferable that the evacuating systems be switched from the turbo-molecular pump to the MP/RP and hydrogen gas or an inert gas such as helium be supplied into the deposition chamber maintaining the pressure inside the deposition chamber at a value equal to that at which a p-type layer will be deposited.

When the substrate temperature has reached a desired value, the hydrogen gas or inert gas for use during the heating of the substrate is shut off, and source gases such as $H_2$, $SiH_4$, and a gas containing Group III element for example $BF_3$ for used in depositing a p-type layer are supplied into the deposition chamber 419 via the valves 482, 483, 484, the mass flow controllers 477, 478, 479, the valves 472, 473, 474, and the gas inlet 469. A vent valve is adjusted so that the pressure inside the deposition chamber 419 is maintained at a proper value. When the pressure inside the deposition chamber 419 has become stable at the proper value, RF power is supplied to the plasma excitation cup from the RF power supply 423. Thus, deposition is performed for a proper time duration thereby forming a p-type layer.

In the case of a photovoltaic semiconductor device having only one pin structure, the RF power and the source gases are stopped after the completion of the p-type layer deposition, and the inside of the deposition chamber is purged with hydrogen gas or an inert gas such as helium gas. After the purging, the evacuating system is switched from the MP/RP to the turbo-molecular pump and the deposition chamber is pumped down to a pressure less than $10^{-6}$ Torr. Meanwhile, the substrate heater is raised. Furthermore, the gate valve 409 is opened and the substrate holder 490 is moved to the unload chamber 405. The gate valve 409 is then closed. Then substrate holder has been cooled down to a temperature less than 100° C., the door of the unload chamber is opened and the substrate is taken out to the outside. In this way, semiconductor layers in the form of a pin structure have been formed on the substrate which has been subjected to the hydrogen plasma treatment according to the present invention. The substrate having the pin structure on it is then placed in a vacuum evaporation chamber and a transparent electrode is evaporated onto the top of the semiconductor layers. Furthermore, the photovoltaic semiconductor device having the above transparent electrode on its top is placed in another vacuum evaporation chamber and a current collection electrode is evaporated onto it. Thus, a complete photovoltaic semiconductor device has been obtained.

In the case of photovoltaic device having a plurality pin structures, an n-type layer, i-type layer (n/i buffer layer, i-type main layer, p/i buffer layer), p-type layer, and so on, are deposited successively on the above-described p-type layer as described below.

After the completion of the p-type layer deposition, the RF power and the source gases are shut off, and the inside of the deposition chamber is purged with hydrogen gas or an inert gas such as helium. After the purging, the evacuating system is switched from the MP/RP to the turbo-molecular pump, and the deposition chamber is pumped down to a pressure less than $10^{-6}$ Torr. Meanwhile, the substrate heater is raised. Furthermore, the gate valve 408 is opened and the substrate holder 490 is moved to the transfer chamber 403. The gate valve 408 is then closed, and the substrate heater 411 is moved until it comes into contact with the top of the substrate thereby heating the substrate up to a desired temperature.

Hydrogen gas and a gas containing silicon to be used for the hydrogen plasma treatment of the present invention are introduced into the deposition chamber 418 via the valves 461, 462, the mass flow controllers 456, 457, the valves 451, 452, and the valve 450, wherein the flow rates of the gases are controlled by the mass flow controllers 456 and 457. The vent valve (not shown) is adjusted so that the inside of the deposition chamber 418 is maintained at a proper pressure. When the pressure of the chamber 418 has become stable, RF power is applied to the bias bar 428 by the RF power supply 424 thereby generating a plasma. Thus, hydrogen plasma treatment is performed for a proper time duration according to the present invention.

During the hydrogen plasma treatment, the process parameters such as the flow rates of the hydrogen gas and the gas containing silicon, the RF power, and the substrate temperature are preferably varied depending on the state of the substrate surface or the state of the surface of the inner wall of the chamber. For example, the hydrogen gas is preferably supplied at a rather large flow rate at the initial stage, and the flow rate is then reduced with time. The flow rate of the gas containing silicon is preferably set to a low value at the beginning, and increased with time. The RF power is preferably set to a high value at the beginning and reduced with time.

Alternatively, the substrate, on which semiconductor layers whose top layer is a p-type layer have been already formed, is placed on a substrate holder and moved into the transfer chamber 402 via the gate valve 408. The gate valve 408 is then closed, and hydrogen gas, a gas containing silicon, and a gas containing Group V element to be used for the hydrogen plasma treatment of the present invention are introduced into the deposition chamber 417 via the valves 441, 442, 443, the mass flow controllers 4376, 437, 438, the valves 441, 442, 443, 430 wherein the flow rates of the gases are controlled by the mass flow controllers 4376, 437, and 438. The vent valve (not shown) is adjusted so that the pressure inside the deposition chamber 417 has a proper value. When the pressure of the chamber 417 has become stable, RF power is introduced from the RF power supply 422 into the plasma excitation cup 420 thereby generating a plasma. Thus, hydrogen plasma treatment is performed for a proper time duration according to the present invention.

During the hydrogen plasma treatment, also in this case, the process parameters such as the flow rates of the hydrogen gas and the gas containing silicon, the RF power, and the substrate temperature are preferably varied depending on the state of the substrate surface or the state of the surface of the inner wall of the chamber. For example, the hydrogen gas is preferably supplied at a rather large flow rate at the initial stage, and the flow rate is then reduced with time. The flow rate of the gas containing silicon is preferably set to a low value at the beginning, and increased with time. The RF power is preferably set to a high value at the beginning and reduced with time.

Alternatively, hydrogen plasma treatment of the p-type layer may also be performed as follows.

Hydrogen gas, a gas containing silicon, and a gas containing Group III element to be used for the hydrogen plasma treatment of the present invention are introduced into the deposition chamber 419 via the valves 471, 472, 473, the mass flow controllers 476, 477, 478, the valves 481, 482, 483, 470 wherein the flow rates of the gases are controlled by the mass flow controllers 476, 477, and 478. The vent valve (not shown) is adjusted so that the pressure inside the deposition chamber 419 has a proper value. When the pressure of the chamber 419 has become stable, RF power is introduced from the RF power supply 423 into the plasma excitation cup 421 thereby generating a plasma. Thus, hydrogen plasma treatment is performed for a proper time duration according to the present invention.

Also in this case, the process parameters such as the flow rates of the hydrogen gas and the gas containing silicon, the RF power, and the substrate temperature are preferably varied during the hydrogen plasma treatment depending on the state of the substrate surface or the state of the surface of the inner wall of the chamber. As in the previous cases, the hydrogen gas is preferably supplied at a rather large flow rate at the initial stage, and the flow rate is then reduced with time. The flow rate of the gas containing silicon is preferably set to a low value at the beginning, and increased with time. The RF power is preferably set to a high value at the beginning and reduced with time.

After the completion of the hydrogen plasma treatment of the invention, the substrate heater is separated from the substrate, and both transfer chamber and deposition chamber are pumped down by the turbo-molecular pump switched from the MP/RP down to a pressure less than $10^{-6}$ Torr. The gate valve 407 is then opened, and the substrate together with the substrate holder is moved into the transfer chamber 402. Then, an n-type layer, i-type layer, and p-type layer are deposited successively.

In this way, two pin structures have been formed on the substrate, and the substrate is carried into the unload chamber 405. When the substrate holder has been cooled down to a temperature less than 100° C., the door of the unload chamber is opened and the substrate is taken out to the outside.

The substrate having two pin structures on it is then placed in a vacuum evaporation chamber and a transparent electrode is evaporated onto the top of the semiconductor layers. Furthermore, the photovoltaic semiconductor device having the above transparent electrode on its top is placed in another vacuum evaporation chamber and a current collection electrode is evaporated onto it. Thus, a complete photovoltaic semiconductor device has been obtained. Hydrogen plasma treatment for the surface of a substrate can also be performed by using microwave power as described below. First, a substrate is placed on the substrate holder 490 wherein a reflection layer of silver or the like has been evaporated beforehand on a stainless-steel supporting element and a reflection enhancing layer of zinc oxide has been further evaporated on it. The substrate holder 490 is then placed in the load chamber 401. The door of the load chamber 401 is closed, and the load chamber 401 is evacuated by a mechanical booster pump and rotary pump (MP/RP) down to a proper pressure. When the pressure inside the load chamber has reached the proper value, the evacuating system is switched from the MP/RP to the turbo-molecular pump and the load chamber is further evacuated down to a pressure less than $10^{-6}$ Torr. When the pressure inside the load chamber has become less than $10^{-6}$ Torr, the gate valve 406 is opened, and the substrate holder 490 is moved along the substrate transfer rail 413 into the transfer chamber 402. The gate valve 406 is then closed. The substrate heater 410 in the transfer chamber 402 has been raised beforehand so that the substrate holder 490 does not collide with the substrate heater 410 during the above movement.

The gate valve 407 is opened, and the substrate holder 490 is moved into the transfer chamber 403. The gate valve 407 is then closed. The substrate holder 490 is positioned so that the substrate comes to a location just below the heater 411. The substrate heater 411 is then lowered and the substrate is moved into the i-layer deposition chamber. The substrate is heated by the substrate heater 411 up to a proper temperature. The turbo-molecular pump is switched to the MP/RP, and hydrogen gas and a gas containing silicon to be used for the hydrogen plasma treatment of the present invention are introduced into the deposition chamber 418 via the valves 461, 462, the mass flow controllers 456, 457, and the valves 451, 452, 450 wherein the flow rates of the gases are controlled by the mass flow controllers 456 and 457. The vent valve (not shown) is adjusted so that the inside of the deposition chamber 418 is maintained at a proper pressure. When the pressure inside the deposition chamber 418 has become stable, microwave power supplied from an MW power source (not shown) is introduced via the microwave entrance window 425 into the deposition chamber 418 thereby generating a plasma. Thus, hydrogen plasma treatment is performed for a proper time duration according to the present invention.

When MW power is employed, hydrogen plasma treatment for the n-type layer is performed as follows. After an n-type layer has been deposited on a substrate, the gate valve 407 is opened and the substrate holder 490 is moved into the transfer chamber 403. The gate valve 407 is then closed. The substrate holder 490 is positioned so that the substrate comes to a location just below the heater 411. The substrate heater 411 is then lowered and the substrate is moved into the i-layer deposition chamber. The substrate is heated by the substrate heater 411 up to a desired temperature. The evacuating system is switched from the turbo-molecular pump to the MP/RP, and hydrogen gas and a gas containing silicon to be used for the hydrogen plasma treatment of the present invention are introduced into the deposition chamber 418 via the valves 461, 462, the mass flow controllers 456, 457, and the valves 451, 452, 450 wherein the flow rates of the gases are controlled by the mass flow controllers 456 and 457. The vent valve (not shown) is adjusted so that the inside of the deposition chamber 418 is maintained at a proper pressure. When the pressure inside the deposition chamber 418 has become stable, microwave power supplied from the MW power source (not shown) is introduced via the microwave entrance window 425 into the deposition chamber 418 thereby generating a plasma. Thus, hydrogen plasma treatment is performed for a proper time duration according to the present invention.

Alternatively, the evacuating system is switched from the turbo-molecular pump to the MP/RP, and hydrogen gas, a gas containing silicon, and a gas containing Group V element to be used for the hydrogen plasma treatment of the present invention are introduced into the deposition chamber 418 via the valves 461, 462, 463, the mass flow controllers 456, 457, 458, and the valves 451, 452, 453, 450 wherein the flow rates of the gases are controlled by the mass flow controllers 456, 457, and 458. The vent valve (not shown) is adjusted so that the inside of the deposition chamber 418 is maintained at a proper pressure. When the pressure inside the deposition chamber 418 has become stable, microwave power supplied from the MW power source (not shown) is introduced via the microwave entrance window 425 into the deposition chamber 418 thereby generating a plasma. Thus, hydrogen plasma treatment is performed for a proper time duration according to the present invention.

In the case where MW power is employed, hydrogen plasma treatment for an n/i buffer layer is performed as follows. The gate valve 407 is opened and the substrate holder 490 is moved into the transfer chamber 403. The gate valve 407 is then closed. The substrate holder 490 is positioned so that the substrate comes to a location just below the heater 411. The substrate heater 411 is then lowered and the substrate is moved into the i-layer deposition chamber. The substrate is heated by the substrate heater 411 up to a desired temperature. The evacuating system is switched from the turbo-molecular pump to the MP/RP, and hydrogen gas and a gas containing silicon to be used for the hydrogen plasma treatment of the present invention are introduced into the deposition chamber 418 via the valves 461, 462, the mass flow controllers 456, 457, and the valves 451, 452, 450 wherein the flow rates of the gases are controlled by the mass flow controllers 456 and 457. The vent valve (not shown) is adjusted so that the inside of the deposition chamber 418 is maintained at a proper pressure. When the pressure inside the deposition chamber 418 has become stable, microwave power supplied from the MW power source (not shown) is introduced via the microwave entrance window 425 into the deposition chamber 418 thereby generating a plasma. Thus, hydrogen plasma treatment is performed for a proper time duration according to the present invention.

As for an i-type layer, hydrogen plasma treatment is performed using MW power as follows. The gate valve 407 is opened and the substrate holder 490 is moved into the transfer chamber 403. The gate valve 407 is then closed. The substrate holder 490 is positioned so that the substrate comes to a location just below the heater 411. The substrate heater 411 is then lowered and the substrate is moved into the i-layer deposition chamber. The substrate is heated by the substrate heater 411 up to a desired temperature. The evacuating system is switched from the turbo-molecular pump to the MP/RP, and hydrogen gas and a gas containing silicon to be used for the hydrogen plasma treatment of the present invention are introduced into the deposition chamber 418 via the valves 461, 462, the mass flow controllers 456, 457, and the valves 451, 452, 450 wherein the flow rates of the gases are controlled by the mass flow controllers 456 and 457. The vent valve (not shown) is adjusted so that the inside of the deposition chamber 418 is maintained at a proper pressure. When the pressure inside the deposition chamber 418 has become stable, microwave power supplied from the MW power source (not shown) is introduced via the microwave entrance window 425 into the deposition chamber 418 thereby generating a plasma. Thus, hydrogen plasma treatment is performed for a proper time duration according to the present invention.

As for a p/i buffer layer, hydrogen plasma treatment is performed using MW power as follows. After the completion of n-type layer deposition, the gate valve 407 is opened and the substrate holder 490 is moved into the transfer chamber 403. The gate valve 407 is then closed. The substrate holder 490 is positioned so that the substrate comes to a location just below the heater 411. The substrate heater 411 is then lowered and the substrate is moved into the i-layer deposition chamber. The evacuating system is switched from the turbo-molecular pump to the MP/RP, Required source gases are supplied to the deposition chamber, and an n/i buffer layer, an i-type main layer, and a p/i buffer layer are successively deposited at a proper temperature. Hydrogen gas and a gas containing silicon to be used for the hydrogen plasma treatment of the present invention are introduced into the deposition chamber 418 via the valves 461, 462, the mass flow controllers 456, 457, and the valves 451, 452, 450 wherein the flow rates of the gases are controlled by the mass flow controllers 456 and 457. The vent valve (not shown) is adjusted so that the inside of the deposition chamber 418 is maintained at a proper pressure. When the pressure inside the deposition chamber 418 has become stable, microwave power supplied from the MW power source (not shown) is introduced via the microwave entrance window 425 into the deposition chamber 418 thereby generating a plasma. Thus, hydrogen plasma treatment is performed for a proper time duration according to the present invention.

Alternatively, a gate valve is opened, and the substrate holder 490 is moved into the transfer chamber 403. Then the gate valve is closed. The substrate holder 490 is positioned so that the substrate comes to a location just below the heater 411. The substrate heater 411 is then lowered and the substrate is moved into the i-layer deposition chamber. The substrate is heated by the substrate heater 411 up to a desired temperature. The evacuating system is switched from the turbo-molecular pump to the MP/RP, and hydrogen gas, a gas containing silicon, and a gas containing Group III element to be used for the hydrogen plasma treatment of the present invention are introduced into the deposition chamber 418 via the valves 461, 462, 463, the mass flow controllers 456, 457, 458, and the valves 451, 452, 453, 450 wherein the flow rates of the gases are controlled by the mass flow controllers 456, 457, and 458. The vent valve (not shown) is adjusted so that the inside of the deposition chamber 418 is maintained at a proper pressure. When the pressure inside the deposition chamber 418 has become stable, microwave power supplied from the MW power source (not shown) is introduced via the microwave entrance window 425 into the deposition chamber 418 thereby generating a plasma. Thus, hydrogen plasma treatment is performed for a proper time duration according to the present invention.

For a p-type layer, hydrogen plasma treatment is performed using MW power as follows. After the completion of p-type layer deposition, the substrate holder 490 is transferred into the transfer chamber 403 via a gate valve, and the gate valve is closed. The substrate holder 490 is positioned so that the substrate comes to a location just below the heater 411. The substrate heater 411 is then lowered and the substrate is moved into the i-layer deposition chamber. The substrate is heated by the substrate heater 411 up to a desired temperature. The evacuating system is switched from the turbo-molecular pump to the MP/RP, and hydrogen gas and a gas containing silicon to be used for the hydrogen plasma treatment of the present invention are introduced into the deposition chamber 418 via the valves 461, 462, the mass flow controllers 456, 457, and the valves 451, 452, 450 wherein the flow rates of the gases are controlled by the mass flow controllers 456 and 457. The vent valve (not shown) is adjusted so that the inside of the deposition chamber 418 is maintained at a proper pressure. When the pressure inside the deposition chamber 418 has become stable, microwave power supplied from the MW power source (not shown) is introduced via the microwave entrance window 425 into the deposition chamber 418 thereby generating a plasma. Thus, hydrogen plasma treatment is performed for a proper time duration according to the present invention.

Alternatively, hydrogen plasma treatment for a p-type layer may also be performed using MW power according to the steps described below. After the completion of p-type layer deposition, the gate valve 408 is opened and the substrate holder 490 is moved into the transfer chamber. The gate valve 408 is then closed. The substrate holder 490 is positioned so that the substrate comes to a location just below the heater 411. The substrate heater 411 is then lowered and the substrate is moved into the i-layer deposition chamber. The substrate is heated by the substrate heater 411 up to a desired temperature. The evacuating system is switched from the turbo-molecular pump to the MP/RP, and hydrogen gas, a gas containing silicon, and a gas containing Group V element to be used for the hydrogen plasma treatment of the present invention are introduced into the deposition chamber 418 via the valves 461, 462, 463, the mass flow controllers 456, 457, 458, and the valves 451, 452, 453, 450 wherein the flow rates of the gases are controlled by the mass flow controllers 456, 457, and 458. The vent valve (not shown) is adjusted so that the inside of the deposition chamber 418 is maintained at a proper pressure. When the pressure inside the deposition chamber 418 has become stable, microwave power supplied from the MW power source (not shown) is introduced via the microwave entrance window 425 into the deposition chamber 418 thereby generating a plasma. Thus, hydrogen plasma treatment is performed for a proper time duration according to the present invention.

Alternatively, after the completion of p-type layer deposition, the gate valve 408 is opened and the substrate holder 490 is moved into the transfer chamber. The gate valve 408 is then closed. The substrate holder 490 is positioned so that the substrate comes to a location just below the heater 411. The substrate heater 411 is then lowered and the substrate is moved into the i-layer deposition chamber. The substrate is heated by the substrate heater 411 up to a desired temperature. The evacuating system is switched from the turbo-molecular pump to the MP/RP, and hydrogen gas, a gas containing silicon, and a gas containing Group III element to be used for the hydrogen plasma treatment of the present invention are introduced into the deposition chamber 418 via the valves 461, 462, 463, the mass flow controllers 456, 457, 458, and the valves 451, 452, 453, 450 wherein the flow rates of the gases are controlled by the mass flow controllers 456, 457, and 458. The vent valve (not shown) is adjusted so that the inside of the deposition chamber 418 is maintained at a proper pressure. When the pressure inside the deposition chamber 418 has become stable, microwave power supplied from the MW power source (not shown) is introduced via the microwave entrance window 425 into the deposition chamber 418 thereby generating a plasma. Thus, hydrogen plasma treatment is performed for a proper time duration according to the present invention.

In any case, as in the RF plasma treatment, the process parameters such as the flow rates of the hydrogen gas and the gas containing silicon, the MW power, and the substrate temperature are preferably varied during the hydrogen plasma treatment, depending on the state of the substrate surface or the state of the surface of the inner wall of the chamber. More specifically, the hydrogen gas is preferably supplied at a rather large flow rate at the initial stage, and the flow rate is then reduced with time. The flow rate of the gas containing silicon is preferably set to a low value at the beginning, and increased with time. The MW power is preferably set to a high value at the beginning and reduced with time.

VHF power is also employed to perform hydrogen plasma treatment according to the present invention. In this case, it is also preferable that the process parameters be controlled in a similar manner to that as in the RF and MW power.

In the above examples, it has been assumed that an n-type layer is first deposited on a substrate. However, a p-type may be deposited first on a substrate. In this case, the p-type layers and the p/i buffer layers in the previous examples are replaced with n-type layers and n/i buffer layers, respectively. For such a structure, the hydrogen plasma treatment can also be performed in basically the same manner as in the above examples. This means that hydrogen plasma treatment for this structure can be performed according to the steps that are the same as in the above examples except that "p-" and "n-" are replaced with each other and "Group III" and "Group V" are also replaced with each other, As described above, the n/i and p/i buffer layers are not necessarily required.

Now, hydrogen plasma treatment conditions will be discussed in greater detail below.

In the hydrogen plasma treatment according to the present invention, hydrogen gas including a gas containing silicon atoms or silicon compound gas whose concentration is selected such that no substantial film deposition occurs is preferably supplied into a process chamber at a flow rate in the range from 1 to 2000 sccm, more preferably from 50 to 2000 sccm, and most preferably from 200 to 2000 sccm, whereas the optimum flow rate depends on the size of the process chamber used. If the flow rate of hydrogen gas is less than 1 sccm, great power is required to maintain a plasma discharge and thus a substrate is damaged severely. Furthermore, the above great power often causes the substrate to be contaminated with impurities from the chamber wall. On the other hand, if the flow rate of hydrogen gas is greater than 2000 sccm, the residence time of active silicon-based species or active hydrogen species in a chamber becomes significantly short, which eliminates the effects of the hydrogen plasma treatment in a hydrogen ambient including a gas containing silicon whose concentration is selected so that no substantial film deposition occurs.

In the hydrogen plasma treatment according to the present invention, it is preferable that the concentration of the gas containing silicon added in the hydrogen gas be in the range from 0.001% to 0.1%. If the concentration of the gas containing silicon is less than 0.001% relative to the amount of hydrogen gas, the hydrogen plasma treatment will not show advantageous effects. If the concentration is greater than 0.1%, a significant amount of deposition of silicon atoms will occur, which may make the invention useless.

In the hydrogen plasma treatment according to the present invention, when a gas containing Group V element is added to the hydrogen gas, it is preferable that the concentration of the Group V element gas be in the range from 0.05% to 3%. If the concentration of the Group V element gas is in the above range and if the ambient gas also includes a gas containing silicon atoms at a low concentration level which does not make an essential contribution to film deposition, then the hydrogen plasma treatment for the interface between an n-type layer and an n/i buffer layer or the interface between a p-type layer and an n-type layer makes it possible to abruptly change the distribution of the Group V element near the interface. Furthermore, the hydrogen plasma treatment under such a condition leads to an improved activation efficiency of the Group V element near the interface. In particular, the interface between an n-type layer and an n/i buffer layer or between a p-type layer and an n-type layer is important to obtain good characteristics in a pin-structure photovoltaic semiconductor device. The invention makes it possible to achieve a high concentration and a high activation efficiency of the Group V element near the above interface. As a result, it is possible to obtain a high performance photovoltaic semiconductor device in which minority carriers can move longer distance. It is also possible to obtain a high performance photovoltaic semiconductor device having a lower series resistance. If the hydrogen plasma treatment of the invention is carried out at a rather low temperature (lower than 280° C.) for an n/i buffer layer or a p-type layer, no essential diffusion of the Group V element into the n/i buffer layer or the n-type layer occurs. This allows formation of a region containing a high concentration of highly activated Group V element atoms just adjacent to the n/i buffer layer or the p-type layer. In this way, the hydrogen plasma treatment according to the present invention allows a great amount of Group V elements to be incorporated, in a highly activated state, in a region close to the interface between an n-type layer and an n/i buffer layer or between a p-type layer and an n-type layer. Thus, if the invention is applied for example to the interface between an n-type layer and an n/i buffer layer, it becomes possible to employ a thinner n-type layer, which results in a higher photoelectric conversion efficiency.

When the hydrogen plasma treatment of the invention is carried out at a rather low temperature (lower than 280° C.) for an n-type layer, no essential diffusion of Group V element atoms into a p-type layer occurs. This allows formation of a region containing a high concentration of highly-activated Group V element atoms just adjacent to the surface of the n-type layer. This means that the hydrogen plasma treatment according to the present invention allows a great amount of Group V elements to be incorporated, in a highly activated state, in a region close to the interface between an n-type layer and a p-type layer. Thus it becomes possible to employ a thinner n-type layer, which results in a higher photoelectric conversion efficiency.

In the hydrogen plasma treatment according to the present invention, when a gas containing Group III element is added to the hydrogen gas, it is preferable that the concentration of the Group III element gas be in the range from 0.05% to 3%. If the concentration of the Group III element gas is in the above range and if the ambient gas also includes a gas containing silicon atoms at a low concentration level which does not make an essential contribution to film deposition, then the hydrogen plasma treatment for the interface between a p-type layer and a p/i buffer layer or the interface between a p-type layer and an n-type layer allows an abrupt change in the distribution of the Group III element near the interface. Furthermore, the hydrogen plasma treatment under the above-described condition leads to an improved activation efficiency of the Group III element near the interface. In particular, this is significantly advantageous because the interface between a p-type layer and a p/i buffer layer or between a p-type layer and an n-type layer is important to obtain good characteristics in a pin-structure photovoltaic semiconductor device. The invention makes it possible to achieve a high concentration and a high activation efficiency of the Group V element near the above interface. As a result, it is possible to obtain a high performance photovoltaic semiconductor device in which minority carriers can move longer distance. It is also possible to obtain a high performance photovoltaic semiconductor device having a lower series resistance. The hydrogen plasma treatment of the invention can also be performed advantageously at a rather low temperature (lower than 280° C.) for a p/i buffer layer or a p-type layer, so that no essential diffusion of the Group V element into the n/i buffer layer or the n-type layer occurs. This allows formation of a region containing a high concentration of highly activated Group III element atoms just adjacent to the p/i buffer layer or the p-type layer. This means that the hydrogen plasma treatment according to the present invention allows a great amount of Group III elements to be incorporated, in a highly activated state, in a region close to the interface between a p-type layer and a p/i buffer layer or between a p-type layer and an n-type layer. Thus it becomes possible to employ a thinner p-type layer, which results in a higher photoelectric conversion efficiency.

Energy suitable for use in generating a hydrogen plasma is electromagnetic wave energy. In particular, RF (radio frequency), VHF(very high frequency), and MW (microwave) energy are preferable. In the hydrogen plasma treatment of the invention, it is preferable that RF power be used in the frequency range from 1 MHz to 50 MHz. The frequency range from 51 MHz to 500 MHz is preferable for the case of VHF power. When MW power is employed, the frequency range from 0.51 GHz to 10 GHz is preferable.

In the hydrogen plasma treatment according to the present invention, the pressure inside a processing chamber is an important factor. The optimum pressure greatly depends on the type of energy used to excite hydrogen gas including a gas containing silicon into a plasma state. When the hydrogen plasma treatment of the invention is performed in the frequency range of RF, it is preferable that the pressure be in the range from 0.05 Torr to 10 Torr. If the VHF frequency range is employed, it is preferable that the pressure be in the range from 0.0001 Torr to 1 Torr. In the case of the MW frequency range, it is preferable that the pressure be in the range from 0.0001 Torr to 0.01 Torr.

In the hydrogen plasma treatment according to the invention, the power density applied to the inside of a chamber is also an important factor to take full advantages of the invention. The optimum power density depends on the frequency of electromagnetic wave used. When the range of RF is employed, it is preferable that the power density be in the range from 0.01 to 1 W/cm$^3$. The power density range from 0.01 to 1 W/cm$^3$ is preferable for the frequency range of VHF. In particular, the VHF power has an advantage that a plasma discharge can be maintained over a wide range of pressure. When the hydrogen plasma treatment is performed in the VHF range at a rather high gas pressure, it is preferable to employ a rather lower power density. Contrarily, a rather high power density is preferable for a rather low pressure. In the case of the MW frequency range, it is preferable that the power density be in the range from 0.1 to 10 W/cm$^3$. In the hydrogen plasma treatment according to the present invention, there is a close relation between the power density and the hydrogen plasma treatment time. When the power density is high, a rather short treatment time is preferable.

Furthermore, in the hydrogen plasma treatment according to the present invention, the substrate temperate is another very important factor to achieve good results. When the hydrogen plasma treatment is performed in the RF range, it is preferable to employ a rather high substrate temperature in the range from 100° to 400° C. When the hydrogen plasma treatment is performed in the VHF or MW range, it is preferable to employ a low substrate temperature in the range from 50° to 300° C. In the hydrogen plasma treatment according to the present invention, the optimum substrate temperature also greatly depends on the power density applied into the inside of a process chamber. When the power density is rather high, it is preferable to employ a rather low substrate temperature.

In the hydrogen plasma treatment according to the present invention, the above process parameters such as the power density, the gas flow rate, the substrate temperature, the pressure may be preferably changed with time. In general, the surface region of a substrate includes a large amount of defects and impurities. If this fact is taken into consideration, it is preferable that the hydrogen heat treatment be formed at a high power density and at a high pressure at the initial stage.

In the hydrogen plasma treatment according to the present invention, examples of preferable gases containing silicon atoms to be added to the hydrogen gas include silicon hydride compounds and silicon halide compounds such as $SiH_4$, $Si_2H_6$, $SiF_4$, $SiF_3H$, $SiF_2H_2$, $SiF_3H$, $Si_2FH_5$, $SiCl_4$, $SiClH_3$, $SiCl_2H_2$, $SICH_3$, etc., Any one of or any combination of these gases may be employed. Of these gases, when a gas containing halogen atoms is employed as the silicon compound gas, it is preferable that a rather greater amount of gas is added to the hydrogen gas than in the case where a gas containing no halogen atoms is employed.

As for the gases containing Group III or V element atoms for use in the hydrogen plasma treatment, the previously-described gases for use in incorporating Group III or V element atoms into a deposited film can be preferably employed.

EXAMPLES

As specific examples of the method of fabricating a photovoltaic device according to the present invention, solar cells made up of silicon-based non-single semiconductor materials will be described below in detail. It should be understood, however, that the invention is not limited only to these examples. To provide a better understanding of the present invention, examples not according to the present invention will also be described, and comparison will be made among these examples.

Example A1 According to the Invention

A solar cell having a structure such as that shown in FIG. 1 was made using the deposition equipment shown in FIG. 7. First, a substrate was prepared. A stainless-steel base 100 having dimensions of 0.5 mm in thickness and 50×50 mm$^2$ in area was cleaned with acetone and isopropanol by means of ultrasonic cleaning, and then dried with hot air.

An Ag optical reflection layer 101 having a thickness of 0.3 μm was deposited on a surface of the stainless-steel base 100 using a sputtering technique at room temperature, and a 1.0-μm-thick ZnO layer acting as a reflection enhancing layer 102 was further deposited on it at 350° C. Thus, the complete substrate was prepared.

Using the deposition equipment 400 having the capabilities of both MWPCVD and RFPCVD, semiconductor layers were then deposited on the reflection enhancing layer 102.

The deposition equipment 400 was used in a state in which source gas cylinders (not shown) were connected to the deposition equipment 400 via gas inlets. The source gas cylinders used here were all of ultra high purity type, including $SiH_4$, $SiF_4$, $CH_4$, $GeH_4$, $GeF_4$, $Si_2H_6$, $PH_3/H_2$ (diluted to 1000 ppm), $B_2H_6/H_2$ (diluted to 2000 ppm), $H_2$, He, $SiCl_2H_2$, and $SiH_4/H_2$ (diluted to 1000 ppm) gas cylinders.

The substrate 490 on which the optical reflection layer 101 and the reflection enhancing layer 102 had been formed was placed on the substrate transfer rail 413 in the load chamber 401, and the load chamber 401 was evacuated with a vacuum pump (not shown) down to a pressure of about $1\times10^{-5}$ Torr. Then, the gate valve 406 was opened, and the substrate 490 was transferred to the deposition chamber 417 via the transfer chamber 402 wherein both deposition chamber 417 and transfer chamber 402 had already been evacuated with a vacuum pump (not shown). The substrate 490 was placed such that the back surface of the substrate 490 came into contact with the heater 410 so that the substrate 490 was heated. The inside of the deposition chamber 417 was evacuated with the vacuum pump (not shown) down to a pressure of about $1\times10^{-5}$ Torr.

In this way, the preparation for semiconductor film deposition was complete, and thus the substrate was subjected to plasma treatment with hydrogen gas containing a small amount of silane-based gas under the conditions shown in Table A1(1), according to the present invention.

In this plasma treatment with hydrogen gas containing the small amount of silane-based gas according to the present invention, $SiH_4/H_2$ (diluted to 1000 ppm) serving as silicon compound gas and $H_2$ were introduced into the deposition chamber 417 via the gas inlet 429 wherein the $H_2$ gas was supplied by opening the valves 441, 431, 430 and its flow rate was adjusted to 500 sccm by means of the mass flow controller 436, and wherein the gas containing $SiH_4$ was supplied by opening the valves 442 and 432 and its flow rate was controlled by the mass flow controller 437 such that the flow rate of the $SiH_4$ gas was maintained at 0.05% of the total gas flow rate of $H_2$. Furthermore, the pressure inside the deposition chamber 417 was adjusted to 1.0 Torr by means of a conductance valve (not shown). The substrate 490 was heated by the substrate heater 410 up to 350° C. When the temperature of the substrate had become stable, RF power of 0.03 $W/cm^3$ was applied by the RF power supply 422 so that a glow discharge occurs in the plasma excitation cup 420. Under the above-described conditions, the substrate was exposed for 3 min to the hydrogen gas plasma containing the small amount of silane-based gas according to the present invention. The RF power was then shut off thereby eliminating the glow discharge. The supply of the $SiH_4/H_2$ gas (diluted to 1000 ppm) into the deposition chamber 417 was stopped, whereas the $H_2$ gas was fed further for 5 min into the deposition chamber 417. Then, the $H_2$ gas was also shut off, and the inside of the deposition chamber 417 as well as the inside of the gas lines was evacuated down to $1\times10^{-5}$ Torr.

An RF n-layer 103 of μc-Si, an MW i-layer 104 of a-SiGe, and an RF p-layer 105 of a-SiC were then deposited successively, as described below.

To deposit the RF n-layer of μc-Si, $H_2$ gas was introduced into the deposition chamber 417 via the gas inlet 429, wherein the $H_2$ gas was supplied by opening the valves 441, 431, 430 and its flow rate was adjusted to 200 sccm by means of the mass flow controller 436. Furthermore, the pressure inside the deposition chamber 417 was adjusted to 1.0 Torr by means of the conductance valve (not shown). The substrate 490 was heated by the substrate heater 410 up to 350° C. When the substrate had become stable, the valves 443, 433, 444, and 434 were opened whereby $SiH_4$ gas and $PH_3/H_2$ gas were introduced into the deposition chamber 417 via the gas inlet 429. The flow rates of $SiH_4$, $H_2$, and $PH_3/H_2$ were adjusted to 2 sccm, 100 sccm, and 200 sccm, respectively, by the mass flow controllers 438, 436, and 439. The pressure inside the deposition chamber 417 was adjusted to 1.0 Torr. RF power of 0.04 $W/cm^3$ was applied by the RF power supply 422 so that a glow discharge occurs in the plasma excitation cup 420, and thus deposition of the RF n-layer was started. When the thickness of the deposited RF n-layer had reached 20 nm, the RF power was shut off thereby eliminating the glow discharge. Thus, the deposition of the RF n-layer 103 was complete. The supply of $SiH_4$ and $PH_3/H_2$ into the deposition chamber 417 was stopped, whereas $H_2$ was fed further for 5 min into the deposition chamber 417. Then, $H_2$ was also shut off, and the inside of the deposition chamber 417 as well as the inside of the gas lines was evacuated down to $1\times10^{-5}$ Torr.

The i-layer 104 of a-SiGe was then deposited by means of MWPCVD as described below. The gate valve 407 was opened, and the substrate 490 was transferred to the i-layer deposition chamber 418 via the transfer chamber 403 wherein both deposition chamber 418 and transfer chamber 403 had already been evacuated with a vacuum pump (not shown). The substrate 490 was placed such that the back surface of the substrate 490 came into contact with the heater 411 so that the substrate 490 was heated. The inside of the i-layer deposition chamber 418 was evacuated with the vacuum pump (not shown) down to a pressure of about $1\times10^{-5}$ Torr.

To deposit the i-layer, the substrate 490 was heated by the substrate heater 411 up to 350° C. When the substrate had been heated enough, the valves 461, 451, 450, 462, 452, 463, and 453 were opened gradually whereby $SiH_4$, $GeH_4$, and $H_2$ were introduced into the i-layer deposition chamber 418 via the gas inlet 449.

The flow rates of $SiH_4$, $GeH_4$, and $H_2$ were adjusted to 50 sccm, 45 sccm, and 100 sccm, respectively, by the mass flow controllers 456, 457, and 458. The pressure inside the i-layer deposition chamber 418 was adjusted to 5 mTorr by adjusting the opening ratio of a conductance valve (not shown). Then, high-frequency (RF) power of 0.50 $W/cm^3$ was applied to the bias bar 428 by the RF power supply 424. Furthermore, MW power of 0.20 $W/cm^3$ was introduced from an MW power supply (not shown) into the i-layer deposition chamber 418 via the wave guide 426 and the microwave entrance window 425, thereby exciting a glow discharge. The shutter 427 was then opened, and thus depositing the i-layer onto the n-layer was started. When the thickness of the deposited i-layer had reached 0.16 μm, the MW glow discharge was stopped, and the bias power supply 424 was shut off. Thus, the deposition of the i-layer 204 was complete. The valves 451 and 452 were closed so as to stop the supply of $SiH_4$ and $GeH_4$ to the i-layer deposition chamber 418, whereas $H_2$ was fed further for 2 min into the i-layer deposition chamber 418. Then, the valves 453 and 450 were closed, and the inside of the i-layer deposition chamber 418 as well as the inside of the gas lines was evacuated down to $1\times10^{-5}$ Torr.

To deposit the RF p-layer 105 of a-SiC, the gate valve 408 was opened, and the substrate 490 was transferred to the p-layer deposition chamber 419 via the transfer chamber 404, wherein both deposition chamber 419 and transfer chamber 404 had already been evacuated with a vacuum pump (not shown). The substrate 490 was placed such that the back surface of the substrate 490 came into contact with the heater 412 so that the substrate 490 was heated. The inside of the p-layer deposition chamber 419 was evacuated with the vacuum pump (not shown) down to a pressure of about $1\times10^{-5}$ Torr.

The substrate 490 was heated by the substrate heater 412 up to 230° C. When the temperature of the substrate had become stable, the valves 481, 471, 470, 482, 472, 483, 473, 484, and 474 were opened whereby $H_2$ gas, $SiH_4/H_2$ gas, $B_2H_6/H_2$ gas, and $CH_4$ gas were introduced into the deposition chamber 419 via the gas inlet 469. The flow rates of the $H_2$, $SiH_4/H_2$, $B_2H_6/H_2$, and $CH_4$, were adjusted to 50 sccm, 2 sccm, 10 sccm, and 0.3 sccm, respectively, by the mass flow controllers 476, 477, 478, and 479. The pressure inside the chamber 419 was adjusted to 2.0 Torr by adjusting the opening ratio of a conductance valve (not shown). RF power of 0.07 W/$cm^3$ was applied by the RF power supply 423 so that a glow discharge occurs in the plasma excitation cup 421, and thus deposition of the RF p-layer was started. When the thickness of the deposited RF p-layer had reached 10 nm, the RF power was shut off thereby eliminating the glow discharge. Thus, the deposition of the RF p-layer 105 was complete. The valves 472, 482, 473, 483, 474, and 484 were closed so as to stop the supply of $SiH_4/H_2$, $B_2H_6/H_2$, and $CH_4$ to the p-layer deposition chamber 419, whereas $H_2$ was fed further for 3 min into the p-layer deposition chamber 419. Then, the valves 471, 481, and 470 were closed, and the inside of the p-layer deposition chamber 419 as well as the inside of the gas lines was evacuated down to $1\times10^{-5}$ Torr.

The gate valve 409 was then opened, and the substrate 490 was transferred to the unload chamber 405 which had already been evacuated with a vacuum pump (not shown). Then, a leak valve (not shown) was opened so that the inside of the unload chamber 405 was exposed to the ambient atmosphere.

ITO was then evaporated onto the RF p-layer 105 so as to form a transparent conductive layer 112 having a thickness of 70 nm.

A mask having a comb-shaped window was placed on the transparent conductive layer 112, and metal evaporation was performed via the mask thereby forming a comb-shaped collection electrode 113 having a multi-layer structure consisting of Cr(40 nm)/Ag(1000 nm)/Cr(40 nm).

In this way, a complete solar cell according to the invention was obtained. Hereafter, the solar cell of this type will be referred to as SC-EMB-A1. Tables A1(1) and A1(2) summarize the conditions used here in the invention, regarding the plasma treatment in an ambient of hydrogen containing a small amount of silane-based gas as well as the process conditions for the RF n-layer, MW i-layer, and RF p-layer.

Comparative Example A1

For the sake of comparison, a solar cell (SC-CMP-A1) was also fabricated in the same manner as in the above-described example A1 except that the plasma treatment with hydrogen gas containing a small amount of silane-based gas according to the invention was not performed.

Eight samples were prepared for each type solar cell (SC-EMB-A1 and SC-CMP-A1) for the purpose of evaluation regarding the initial photoelectric conversion efficiency (the ratio of the electric output power to the optical input power), durability under vibration, and durability under vibration with an applied bias at a high temperature and high humidity.

The measurement of the initial photoelectric conversion efficiency was performed by measuring the V-I characteristics of the samples under the illumination condition of AM1.5 (100 mW/$cm^2$). The measurement revealed that the SC-EMB-A1 samples had a smaller variation (that is, more preferable) in the initial photoelectric conversion efficiencies than the SC-CMP-A1 samples as shown below:

| [Variation in initial photoelectric conversion efficiency] | |
|---|---|
| SC-EMB-A1 | 0.84 |
| (relative to that of SC-CMP-A1) | |

The durability test under vibration (vibration test) was performed as follows: After the measurement of the initial photoelectric conversion efficiency, some samples were placed in a dark place kept at 25° C. and 50% relative humidity. Vibration having an amplitude of 0.1 mm and a frequency of 60 Hz was applied to the samples for 500 hr. After that, the photoelectric conversion efficiencies of the samples were measured under the illumination condition of AM1.5 (100 mW/$cm^2$) and the reduction relative to the initial value (the ratio of the photoelectric conversion efficiency after the vibration test to the initial value) was evaluated for each sample. The SC-CMP-A1 samples showed a greater reduction in the photoelectric conversion efficiency compared with the SC-EMB-A1 samples as shown below.

| [Reduction ratio of the photoelectric conversion efficiency after the vibration test] | |
|---|---|
| SC-CMP-A1 | 0.87 |
| (relative to that of SC-EMB-A1) | |

The evaluation of the vibration durability under the biased condition at the high temperature and high humidity was performed as follows: After the measurement of the initial photoelectric conversion efficiency, some samples were placed in a dark place kept at 80° C. and 90% relative humidity, and a forward bias voltage of 0.7 V was applied to the samples. Vibration was applied to the samples under the same conditions as those in the above-described non-biased vibration test. The SC-CMP-A1 samples also showed a greater reduction in the photoelectric conversion efficiency compared with the SC-EMB-A1 samples as shown below.

| [Reduction ratio of the photoelectric conversion efficiency after the biased vibration test] | |
|---|---|
| SC-CMP-A1 | 0.84 |
| (relative to that of SC-EMB-A1) | |

The surfaces of the above-described samples were observed via an optical microscope to evaluate film separation. No film separation was observed in the SC-EMB-A1 samples, whereas slight film separation was observed in the SC-CMP-A1 samples.

From the above results, it can be concluded that the solar cells (SC-EMB-A1) according to the present invention are better in uniformity or reproducibility of characteristics, adhesion, and durability than the conventional solar cells (SC-CMP-A1).

Example A2 According to the Invention

A solar cell, having a tandem structure comprising a lower layer structure similar to the lower pin structure shown in FIG. 4 and an upper layer structure similar to the upper pin structure shown in FIG. 3, was made using the deposition equipment shown in FIG. 7.

A substrate 490 was prepared according to a similar process to that in the example A1 such that a reflection layer 101 and a reflection enhancing layer 102 were formed on a base. The substrate 490 was placed on the substrate transfer rail 413 in the load chamber 401, and the load chamber 401 was evacuated with the vacuum pump (not shown) down to a pressure of about $1\times10^{-5}$ Torr.

The gate valve 406 was opened, and the substrate 490 was transferred to the deposition chamber 417 via the transfer chamber 402 wherein both deposition chamber 417 and transfer chamber 402 had already been evacuated with the vacuum pump (not shown). The substrate 490 was placed such that the back surface of the substrate 490 came into contact with the heater 410 so that the substrate 490 was heated. The inside of the deposition chamber 417 was evacuated with the vacuum pump (not shown) down to a pressure of about $1\times10^{-5}$ Torr.

Thus, the preparation for semiconductor film deposition was complete, and the substrate was subjected to plasma treatment with hydrogen gas containing a small amount of $Si_2H_6/H_2$ gas under the conditions shown in Table A2(1), according to the present invention.

In this plasma treatment with hydrogen gas containing the small amount of silane-based gas according to the present invention, $Si_2H_6/H_2$ (diluted to 1000 ppm) serving as silicon compound gas and $H_2$ were introduced into the deposition chamber 417 via the gas inlet 429 wherein the $H_2$ gas was supplied by opening the valves 441, 431, 430 and its flow rate was adjusted to 800 sccm by means of the mass flow controller 436, and wherein the gas containing $Si_2H_6$ was supplied via opening the valves 444 and 434 and its flow rate was controlled by the mass flow controller 439 such that the flow rate of the $Si_2H_6$ gas was maintained at 0.01% of the total gas flow rate of $H_2$. Furthermore, the pressure inside the deposition chamber 417 was adjusted to 0.009 Torr by means of a conductance valve (not shown). The substrate 490 was heated by the substrate heater 410 up to 285° C. When the temperature of the substrate had become stable, VHF power of 0.05 $W/cm^3$ was applied by the VHF power supply 422 so that a glow discharge occurs in the plasma excitation cup 420. Under the above-described conditions, the substrate was exposed for 4 min to the hydrogen gas plasma containing the small amount of $Si_2H_6$ gas according to the present invention. The VHF power was then shut off thereby eliminating the glow discharge. The supply of the $Si_2H_6/H_2$ gas (diluted to 1000 ppm) into the deposition chamber 417 was stopped, whereas the $H_2$ gas was fed further for 4 min into the deposition chamber 417. Then, the $H_2$ gas was also shut off, and the inside of the deposition chamber 417 as well as the inside of the gas lines was evacuated down to $1\times10^{-5}$ Torr.

An RF n-layer 103 of μc-Si, an RF i-layer 151 of a-Si, an MW i-layer 114 of a-SiGe, an RF i-layer 161 of a-Si, an RF p-layer 105 of a-SiC, an RF n-layer 203 of μc-Si, an RF i-layer 204 of a-Si, and an RF p-layer 205 of a-SiC were then deposited successively, as described below.

To deposit the RF n-layer of μc-Si, $H_2$ gas was introduced into the deposition chamber 417 via the gas inlet 429, wherein the $H_2$ gas was supplied by opening the valves 441, 431, 430 and its flow rate was adjusted to 200 sccm by means of the mass flow controller 436. Furthermore, the pressure inside the deposition chamber 417 was adjusted to 1.1 Torr by means of the conductance valve (not shown). The substrate 490 was heated by the substrate heater 410 up to 380° C. When the temperature of the substrate had become stable, the valves 443, 433, 444, and 434 were opened whereby $SiH_4$ gas and $PH_3/H_2$ gas were introduced into the deposition chamber 417 via the gas inlet 429. The flow rates of $SiH_4$, $H_2$, and $PH_3/H_2$ were adjusted to 2 sccm, 100 sccm, and 200 sccm, respectively, by the mass flow controllers 438, 436, and 439. The pressure inside the deposition chamber 417 was adjusted to 1.1 Torr. RF power of 0.04 $W/cm^3$ was applied by the RF power supply 422 so that a glow discharge occurs in the plasma excitation cup 420, and thus deposition of the RF n-layer was started. When the thickness of the deposited RF n-layer had reached 20 nm, the RF power was shut off thereby eliminating the glow discharge. Thus, the deposition of the RF n-layer 103 was complete. The supply of $SiH_4$ and $PH_3/H_2$ into the deposition chamber 417 was stopped, whereas $H_2$ was fed further for 5 min into the deposition chamber 417. Then, $H_2$ was also shut off, and the inside of the deposition chamber 417 as well as the inside of the gas lines was evacuated down to $1\times10^{-5}$ Torr.

The RF i-layer 151 of a-Si, the MW i-layer 114 of a-SiGe, and the RF i-layer 161 of a-Si were then deposited successively, by means of RFPCVD, MWPCVD, and RFPCVD, respectively, as described below, thereby forming the i-layer 104.

The gate valve 407 was opened, and the substrate 490 was transferred to the i-layer deposition chamber 418 via the transfer chamber 403 wherein both deposition chamber 418 and transfer chamber 403 had already been evacuated with the vacuum pump (not shown). The substrate 490 was placed such that the back surface of the substrate 490 came into contact with the heater 411 so that the substrate 490 was heated. The inside of the i-layer deposition chamber 418 was evacuated with the vacuum pump (not shown) down to a pressure of about $1\times10^{-5}$ Torr.

To deposit the RF i-layer, the substrate 490 was heated by the substrate heater 411 up to 350° C. When the substrate had been heated enough, the valves 464, 454, 450, 463, and 453 were opened gradually whereby $Si_2H_6$ and $H_2$ were introduced into the i-layer deposition chamber 418 via the gas inlet 449. The flow rates of $Si_2H_6$ and $H_2$ were adjusted to 4 sccm and 100 sccm, respectively, by the mass flow controllers 459, and 458. The pressure inside the i-layer deposition chamber 418 was adjusted to 0.8 Torr by adjusting the opening ratio of a conductance valve (not shown). Then, RF power of 0.08 $W/cm^3$ was applied to the bias bar 428 by the RF power supply 424, thereby exciting a glow discharge. The shutter 427 was then opened, and thus depositing the i-layer onto the RF n-layer was started. When the thickness of the deposited i-layer had reached 10 nm, the glow discharge was stopped, and the power supply 424 was shut off. Thus, the deposition of the RF i-layer 151 was complete.

The valves 464 and 454 were closed so as to stop the supply of $Si_2H_6$ to the i-layer deposition chamber 418, whereas $H_2$ was fed further for 2 min into the i-layer deposition chamber 418. Then, the valves 453 and 450 were closed, and the inside of the i-layer deposition chamber 418 as well as the inside of the gas lines was evacuated down to $1\times10^{-2}$ Torr.

The MW i-layer was then deposited as follows: the substrate 490 was heated by the substrate heater 411 up to 350° C. When the substrate had been heated enough, the valves 461, 451, 450, 462, 452, 463, and 453 were opened gradually whereby $SiH_4$, $GeH_4$, and $H_2$ were introduced into the i-layer deposition chamber 418 via the gas inlet 449. The flow rates of $SiH_4$, $GeH_4$, and $H_2$ were adjusted to 50 sccm, 35 sccm, and 120 sccm, respectively, by the mass flow controllers 456, 457, and 458. The pressure inside the i-layer deposition chamber 418 was adjusted to 6 mTorr by adjusting the opening ratio of the conductance valve (not shown). Then, RF power of 0.60 $W/cm^3$ was applied to the bias bar 428 by the RF power supply 424. Furthermore, MW power of 0.25 $W/cm^3$ was introduced from an MW power supply (not shown) into the i-layer deposition chamber 418 via the wave guide 426 and the microwave entrance window 425, thereby exciting a glow discharge. The shutter 427 was then opened, and thus depositing the MW i-layer onto the RF i-layer was started. When the thickness of the deposited MW i-layer had reached 0.18 μm, the MW glow discharge was stopped, and the bias power supply 424 was shut off. Thus, the deposition of the MW i-layer 114 was complete. The valves 451 and 452 were closed so as to stop the supply of $SiH_4$ and $GeH_4$ to the i-layer deposition chamber 418, whereas $H_2$ was fed further for 2 min into the i-layer deposition chamber 418. Then, the valves 453 and 450 were closed, and the inside of the i-layer deposition chamber 418 as well as the inside of the gas lines was evacuated down to $1\times10^{-5}$ Torr.

To deposit the RF i-layer, the substrate 490 was heated by the substrate heater 411 up to 250° C. When the substrate had been heated enough, the valves 464, 454, 450, 463, and 453 were opened gradually whereby $Si_2H_6$ and $H_2$ were introduced into the i-layer deposition chamber 418 via the gas inlet 449. The flow rates of $Si_2H_6$ and $H_2$ were adjusted to 2 sccm and 80 sccm, respectively, by the mass flow controllers 459, and 458. The pressure inside the i-layer deposition chamber 418 was adjusted to 0.7 Torr by adjusting the opening ratio of a conductance valve (not shown). Then, RF power of 0.07 $W/cm^3$ was applied to the bias bar 428 by the RF power supply 424, thereby exciting a glow discharge. The shutter 427 was then opened, and thus depositing the RF i-layer onto the MW i-layer was started. When the thickness of the deposited RF i-layer had reached 20 nm, the glow discharge was stopped, and the power supply 424 was shut off. Thus, the deposition of the RF i-layer 161 was complete. The valves 464 and 454 were closed so as to stop the supply of $Si_2H_6$ to the i-layer deposition chamber 418, whereas $H_2$ was fed further for 2 min into the i-layer deposition chamber 418. Then, the valves 453 and 450 were closed, and the inside of the i-layer deposition chamber 418 as well as the inside of the gas lines was evacuated down to $1\times10^{-5}$ Torr.

To deposit the RF p-layer 105 of a-SiC, the gate valve 408 was opened, and the substrate 490 was transferred to the p-layer deposition chamber 419 via the transfer chamber 404, wherein both deposition chamber 419 and transfer chamber 404 had already been evacuated with the vacuum pump (not shown). The substrate 490 was placed such that the back surface of the substrate 490 came into contact with the heater 412 so that the substrate 490 was heated. The inside of the p-layer deposition chamber 419 was evacuated with the vacuum pump (not shown) down to a pressure of about $1\times10^{-5}$ Torr.

The substrate 490 was heated by the substrate heater 412 up to 230° C. When the temperature of the substrate had become stable, the valves 481, 471, 470, 482, 472, 483, 473, 484, and 474 were opened whereby $H_2$ gas, $SiH_4/H_2$ gas, $B_2H_6/H_2$ gas, and $CH_4$ gas were introduced into the deposition chamber 419 via the gas inlet 469. The flow rates of the $H_2$, $SiH_4/H_2$, $B_2H_6/H_2$, and $CH_4$, were adjusted to 60 sccm, 2 sccm, 10 sccm, and 0.3 sccm, respectively, by the mass flow controllers 476, 477, 478, and 479. The pressure inside the chamber 419 was adjusted to 2.0 Torr by adjusting the opening ratio of a conductance valve (not shown). RF power of 0.07 $W/cm^3$ was applied by the RF power supply 423 so that a glow discharge occurs in the plasma excitation cup 421, and thus deposition of the RF p-layer onto the i-layer was started. When the thickness of the deposited RF p-layer had reached 10 nm, the RF power was shut off thereby eliminating the glow discharge. Thus, the deposition of the RF p-layer 105 was complete. The valves 472, 482, 473, 483, 474, and 484 were closed so as to stop the supply of $SiH_4/H_2$, $B_2H_6/H_2$, and $CH_4$ to the p-layer deposition chamber 419, whereas $H_2$ was fed further for 3 min into the p-layer deposition chamber 419. Then, the valves 471, 481, and 470 were closed, and the inside of the p-layer deposition chamber 419 as well as the inside of the gas lines was evacuated down to $1\times10^{-2}$ Torr.

To further deposit the RF n-layer 203 of μc-Si, the gate valves 408 and 407 were opened, and the substrate 490 was transferred to the deposition chamber 417 via the transfer chambers 403 and 402 wherein the deposition chamber 417 and the transfer chambers 403 and 402 had already been evacuated with the vacuum pump (not shown). The substrate 490 was placed such that the back surface of the substrate 490 came into contact with the heater 410 so that the substrate 490 was heated. The inside of the deposition chamber 417 was evacuated with the vacuum pump (not shown) down to a pressure of about $1\times10^{-5}$ Torr.

To deposit the RF n-layer of μc-Si, $H_2$ gas was introduced into the deposition chamber 417 via the gas inlet 429, wherein the $H_2$ gas was supplied by opening the valves 441, 431, 430 and its flow rate was adjusted to 200 sccm by means of the mass flow controller 436. Furthermore, the pressure inside the deposition chamber 417 was adjusted to 1.0 Torr by means of the conductance valve (not shown). The substrate 490 was heated by the substrate heater 410 up to 225° C. When the temperature of the substrate had become stable, the valves 443, 433, 444, and 434 were opened whereby $SiH_4$ gas and $PH_3/H_2$ gas were introduced into the deposition chamber 417 via the gas inlet 429. The flow rates of $SiH_4$, $H_2$, and $PH_3/H_2$ were adjusted to 2 sccm, 50 sccm, and 250 sccm, respectively, by the mass flow controllers 438, 436, and 439. The pressure inside the deposition chamber 417 was adjusted to 1.0 Torr. RF power of 0.04 $W/cm^3$ was applied by the RF power supply 422 so that a glow discharge occurs in the plasma excitation cup 420, and thus deposition of the RF n-layer onto the RF p-layer was started. When the thickness of the deposited RF n-layer had reached 10 nm, the RF power was shut off thereby eliminating the glow discharge. Thus, the deposition of the RF n-layer 203 was complete. The supply of $SiH_4$ and $PH_3/H_2$ into the deposition chamber 417 was stopped, whereas $H_2$ was fed further for 2 min into the deposition chamber 417. Then, $H_2$ was also shut off, and the inside of the deposition chamber 417 as well as the inside of the gas lines was evacuated down to $1\times10^{-5}$ Torr.

Furthermore, the RF i-layer 204 of a-Si was deposited as follows: The gate valve 407 was opened, and the substrate 490 was transferred to the i-layer deposition chamber 418 via the transfer chamber 403 wherein both deposition chamber 418 and transfer chamber 403 had already been evacuated with the vacuum pump (not shown). The substrate 490 was placed such that the back surface of the substrate 490 came into contact with the heater 411 so that the substrate 490 was heated. The inside of the i-layer deposition chamber 418 was evacuated with the vacuum pump (not shown) down to a pressure of about $1\times10^{-5}$ Torr.

To deposit the RF i-layer, the substrate 490 was heated by the substrate heater 411 up to 200° C. When the substrate had been heated enough, the valves 464, 454, 450, 463, and 453 were opened gradually whereby $Si_2H_6$ and $H_2$ were introduced into the i-layer deposition chamber 418 via the gas inlet 449. The flow rates of $Si_2H_6$ and $H_2$ were adjusted to 2 sccm and 80 sccm, respectively, by the mass flow controllers 459, and 458. The pressure inside the i-layer deposition chamber 418 was adjusted to 0.6 Torr by adjusting the opening ratio of the conductance valve (not shown). Then, RF power of 0.07 $W/cm^3$ was applied to the bias bar 428 by the RF power supply 424, thereby exciting a glow discharge. The shutter 427 was then opened, and thus depositing the RF i-layer onto the RF n-layer was started. When the thickness of the deposited RF i-layer had reached 120 nm, the glow discharge was stopped, and the power supply 424 was shut off. Thus, the deposition of the RF i-layer 204 was complete. The valves 464 and 454 were closed so as to stop the supply of $Si_2H_6$ to the i-layer deposition chamber 418, whereas $H_2$ was fed further for 2 min into the i-layer deposition chamber 418. Then, the valves 453 and 450 were closed, and the inside of the i-layer deposition chamber 418 as well as the inside of the gas lines was evacuated down to $1\times10^{-5}$ Torr.

To deposit the RF p-layer 205 of a-SiC, the gate valve 408 was opened, and the substrate 490 was transferred to the p-layer deposition chamber 419 via the transfer chamber 404, wherein both deposition chamber 419 and transfer chamber 404 had already been evacuated with the vacuum pump (not shown). The substrate 490 was placed such that the back surface of the substrate 490 came into contact with the heater 412 so that the substrate 490 was heated. The inside of the p-layer deposition chamber 419 was evacuated with the vacuum pump (not shown) down to a pressure of about $1\times10^{-5}$ Torr.

The substrate 490 was heated by the substrate heater 412 up to 170° C. When the temperature of the substrate had become stable, the valves 481, 471, 470, 482, 472, 483, 473, 484, and 474 were opened whereby $H_2$ gas, $SiH_4/H_2$ gas, $B_2H_6/H_2$ gas, and $CH_4$ gas were introduced into the deposition chamber 419 via the gas inlet 469. The flow rates of the $H_2$, $SiH_4/H_2$, $B_2H_6/H_2$, and $CH_4$, were adjusted to 60 sccm, 2 sccm, 10 sccm, and 0.3 sccm, respectively, by the mass flow controllers 476, 477, 478, and 479. The pressure inside the chamber 419 was adjusted to 2.0 Torr by adjusting the opening ratio of a conductance valve (not shown). RF power of 0.07 $W/cm^3$ was applied by the RF power supply 423 so that a glow discharge occurs in the plasma excitation cup 421, and thus deposition of the RF p-layer onto the RF i-layer 204 was started. When the thickness of the deposited RF p-layer had reached 10 nm, the RF power was shut off thereby eliminating the glow discharge. Thus, the deposition of the RF p-layer 205 was complete. The valves 472, 482, 473, 483, 474, and 484 were closed so as to stop the supply of $SiH_4/H_2$, $B_2H_6/H_2$, and $CH_4$ to the p-layer deposition chamber 419, whereas $H_2$ was fed further for 2 min into the p-layer deposition chamber 419. Then, the valves 471, 481, and 470 were closed, and the inside of the p-layer deposition chamber 419 as well as the inside of the gas lines was evacuated down to $1\times10^{-5}$ Torr.

The gate valve 409 was then opened, and the substrate 490 was transferred to the unload chamber 405 which had already been evacuated with the vacuum pump (not shown). Then, a leak valve (not shown) was opened so that the inside of the unload chamber 405 was exposed to the ambient atmosphere.

ITO was then evaporated onto the RF p-layer 205 so as to form a transparent conductive layer 112 having a thickness of 70 nm.

A mask having a comb-shaped window was placed on the transparent conductive layer 112, and metal evaporation was performed via the mask thereby forming a comb-shaped collection electrode 113 having a multi-layer structure consisting of Cr(40 nm)/Ag(1000 nm)/Cr(40 nm).

In this way, a complete solar cell according to the invention was obtained. Hereafter, the solar cell of this type will be referred to as SC-EMB-A2. Tables A2(1) and A2(2) summarize the conditions used here in the invention, regarding the plasma treatment in the ambient of hydrogen containing the small amount of silane-based gas as well as the process conditions for the RF n-layer, MW i-layer, and RF p-layer.

COMPARATIVE EXAMPLE A2

For the sake of comparison, a solar cell (SC-CMP-A2) was also fabricated in the same manner as in the above-described example A2 except that the plasma treatment with hydrogen gas containing a small amount of silane-based gas according to the invention was not performed.

Ten samples were prepared for each type solar cell (SC-EMB-A2 and SC-CMP-A2) for the purpose of evaluation regarding the initial photoelectric conversion efficiency (the ratio of the electric output power to the optical input power), durability under vibration, and durability under vibration with an applied bias voltage at a high temperature and high humidity.

The measurement of the initial photoelectric conversion efficiency was performed by measuring the V-I characteristics of the samples under the illumination condition of AM1.5 (100 $mW/cm^2$). The measurement revealed that the SC-EMB-A2 samples had a smaller variation (that is, more preferable) in the initial photoelectric conversion efficiencies than the SC-CMP-A2 samples as shown below:

| [Variation in initial photoelectric conversion efficiency] | |
|---|---|
| SC-EMB-A2 | 0.85 |
| (relative to that of SC-CMP-A2) | |

The vibration durability test was performed as follows: After the measurement of the initial photoelectric conversion efficiency, some samples were placed in a dark place kept at 25° C. and 50% relative humidity. Vibration having an amplitude of 0.1 mm and a frequency of 60 Hz was applied to the samples for 500 hr. After that, the photoelectric conversion efficiencies of the samples were measured under the illumination condition of AM1.5 (100 $mW/cm^2$) and the reduction relative to the initial value (the ratio of the photoelectric conversion efficiency after the vibration test to the initial value) was evaluated for each sample. The SC-CMP-A2 samples showed a greater reduction in the photoelectric conversion efficiency compared with the SC-EMB-A2 samples as shown below.

| [Reduction ratio of the photoelectric conversion efficiency after the vibration test] | |
|---|---|
| SC-CMP-A2 | 0.86 |
| (relative to that of SC-EMB-A2) | |

The evaluation of the vibration durability under the biased condition at the high temperature and high humidity was performed as follows: After the measurement of the initial photoelectric conversion efficiency, some samples were placed in a dark place kept at 80° C. and 90% relative humidity, and a forward bias voltage of 0.7 V was applied to the samples. Vibration was applied to the samples under the same conditions as those in the non-biased vibration test.

The SC-CMP-A2 samples also showed a greater reduction in the photoelectric conversion efficiency compared with the SC-EMB-A2 samples as shown below.

| [Reduction ratio of the photoelectric conversion efficiency after the biased vibration test] | |
|---|---|
| SC-CMP-A2 | 0.83 |
| (relative to that of SC-EMB-A2) | |

The surfaces of the above-described samples were observed via an optical microscope to evaluate film separation. No film separation was observed in the SC-EMB-A2 samples, whereas slight film separation was observed in the SC-CMP-A2 samples.

From the above results, it can be concluded that the solar cells (SC-EMB-A2) according to the present invention are better in uniformity or reproducibility of characteristics, adhesion, and durability than the conventional solar cells (SC-CMP-A2).

EXAMPLE A3 ACCORDING TO THE INVENTION

A solar cell, having a triple structure comprising a lower part including two pin structures similar to the lower two pin structures shown in FIG. 4 and an upper part including a pin structure similar to the top pin structure shown in FIG. 3, was made using the deposition equipment shown in FIG. 7.

A substrate 490 was prepared according to a similar process to that in the example A1 such that a reflection layer 101 and a reflection enhancing layer 102 were formed on a base. The substrate 490 was placed on the substrate transfer rail 413 in the load chamber 401, and the load chamber 401 was evacuated with the vacuum pump (not shown) down to a pressure of about $1\times10^{-5}$ Torr.

The gate valves 406 and 407 were opened, and the substrate 490 was transferred to the deposition chamber 418 via the transfer chambers 402 and 403 wherein the deposition chamber 418 and the transfer chambers 402 and 403 had already been evacuated with the vacuum pump (not shown). The substrate 490 was placed such that the back surface of the substrate 490 came into contact with the heater 411 so that the substrate 490 was heated. The inside of the deposition chamber 418 was evacuated with the vacuum pump (not shown) down to a pressure of about $1\times10^{-5}$ Torr.

Thus, the preparation for semiconductor film deposition was complete, and the substrate was subjected to plasma treatment with hydrogen gas containing a small amount of silane-based gas under the conditions shown in Table A3(1), according to the present invention.

In this plasma treatment with hydrogen gas containing the small amount of silane-based gas according to the present invention, $SiCl_2H_2$/He (diluted to 1000 ppm) serving as silicon compound gas and $H_2$ were introduced into the deposition chamber 418 via the gas inlet 449 wherein the $H_2$ gas was supplied by opening the valves 463, 453, 450 and its flow rate was adjusted to 300 sccm by means of the mass flow controller 458, and wherein the gas containing $SiCl_2H_2$ was supplied by opening the valves 465 and 455 and its flow rate was controlled by the mass flow controller 460 such that the flow rate of the $SiCl_2H_2$ gas was maintained at 0.05% of the total gas flow rate of $H_2$. Furthermore, the pressure inside the deposition chamber 418 was adjusted to 0.010 Torr by means of the conductance valve (not shown). The substrate 490 was heated by the substrate heater 411 up to 150° C. When the temperature of the substrate had become stable, MW power of 0.25 W/cm$^3$ was introduced from the MW power supply (not shown) into the i-layer deposition chamber 418 via the wave guide 426 and the microwave entrance window 425, thereby exciting a glow discharge. The shutter 427 was then opened, and the substrate was exposed for 4 min to the hydrogen gas plasma containing the small amount of silane-based gas according to the present invention. The MW power was then shut off thereby eliminating the glow discharge. The supply of the $SiCl_2H_2$/He gas (diluted to 1000 ppm) into the deposition chamber 418 was stopped, whereas the $H_2$ gas was fed further for 4 min into the deposition chamber 418. Then, the $H_2$ gas was also shut off, and the inside of the deposition chamber 418 as well as the inside of the gas lines was evacuated down to $1\times10^{-5}$ Torr.

The gate valve 407 was opened, and the substrate 490 was transferred to the deposition chamber 417 via the transfer chamber 402 wherein both deposition chamber 417 and transfer chamber 402 had already been evacuated with the vacuum pump (not shown). The substrate 490 was placed such that the back surface of the substrate 490 came into contact with the heater 410 so that the substrate 490 was heated. The inside of the deposition chamber 417 was evacuated with the vacuum pump (not shown) down to a pressure of about $1\times10^{-5}$ Torr.

An RF n-layer 103 of μc-Si, an RF i-layer 151 of a-Si, an MW i-layer 114 of a-SiGe, an RF i-layer 161 of a-Si, an RF p-layer 105 of a-SiC, an RF n-layer 203 of μc-Si, an RF i-layer 251 of a-Si, an MW i-layer 214 of a-SiGe, an RF i-layer 261 of a-Si, an RF p-layer 205 of a-SiC, an RF n-layer 303 of μc-Si, an RF i-layer 304 of a-Si, and an RF p-layer 305 of a-SiC, were deposited successively according to a similar process to that in the example A2.

ITO was then evaporated onto the RF p-layer 305 so as to form a transparent conductive layer 112 having a thickness of 70 nm.

A mask having a comb-shaped window was placed on the transparent conductive layer 112, and metal evaporation was performed via the mask thereby forming a comb-shaped collection electrode 113 having a multi-layer structure consisting of Cr(40 nm)/Ag(1000 nm)/Cr(40 nm).

In this way, a complete solar cell according to the invention was obtained. Hereafter, the solar cell of this type will be referred to as SC-EMB-A3. Tables A3(1) and A3(2) summarize the conditions used here in the invention, regarding the plasma treatment in the ambient of hydrogen containing the small amount of silane-based gas as well as the process conditions for the RF n-layer, RF i-layer, MW i-layer, and RF p-layer.

COMPARATIVE EXAMPLE A3

For the sake of comparison, a solar cell (SC-CMP-A3) was also fabricated in the same manner as in the above-described example A3 except that the plasma treatment with hydrogen gas containing a small amount of silane-based gas according to the invention was not performed.

Nine samples were prepared for each type solar cell (SC-EMB-A3 and SC-CMP-A3) for the purpose of evaluation regarding the initial photoelectric conversion efficiency (the ratio of the electric output power to the optical input power), durability under vibration, and durability under vibration with an applied bias voltage at a high temperature and high humidity.

The measurement of the initial photoelectric conversion efficiency was performed by measuring the V-I characteristics of the samples under the illumination condition of AM1.5 (100 mW/cm$^2$). The measurement revealed that the SC-EMB-A3 samples had a smaller variation in the initial photoelectric conversion efficiencies than the SC-CMP-A3 samples as shown below:

| [Variation in initial photoelectric conversion efficiency] | |
|---|---|
| SC-EMB-A3 | 0.86 |
| (relative to that of SC-CMP-A3) | |

The vibration durability test was performed as follows: After the measurement of the initial photoelectric conversion efficiency, some samples were placed in a dark place kept at 25° C. and 50% relative humidity. Vibration having an amplitude of 0.1 mm and a frequency of 60 Hz was applied to the samples for 500 hr. After that, the photoelectric conversion efficiencies of the samples were measured under the illumination condition of AM1.5 (100 mW/cm$^2$) and the reduction relative to the initial value (the ratio of the photoelectric conversion efficiency after the vibration test to the initial value) was evaluated for each sample. The SC-CMP-A3 samples showed a greater reduction in the photoelectric conversion efficiency compared with the SC-EMB-A3 samples as shown below.

| [Reduction ratio of the photoelectric conversion efficiency after the vibration test] | |
|---|---|
| SC-CMP-A3 | 0.87 |
| (relative to that of SC-EMB-A3) | |

The evaluation of the vibration durability under the biased condition at the high temperature and high humidity was performed as follows: After the measurement of the initial photoelectric conversion efficiency, some samples were placed in a dark place kept at 80° C. and 90% relative humidity, and a forward bias voltage of 0.7 V was applied to the samples. Vibration was applied to the samples under the same conditions as those in the non-biased vibration test. The SC-CMP-A3 samples also showed a greater reduction in the photoelectric conversion efficiency compared with the SC-EMB-A3 samples as shown below.

| [Reduction ratio of the photoelectric conversion efficiency after the biased vibration test] | |
|---|---|
| SC-CMP-A3 | 0.84 |
| (relative to that of SC-EMB-A3) | |

The surfaces of the above-described samples were observed via an optical microscope to evaluate film separation. No film separation was observed in the SC-EMB-A3 samples, whereas slight film separation was observed in the SC-CMP-A3 samples.

From the above results, it can also be concluded that the solar cells (SC-EMB-A3) according to the present invention are better in uniformity or reproducibility of characteristics, adhesion, and durability than the conventional solar cells (SC-CMP-A3).

EXAMPLE A4

A solar cell, having a triple structure similar to that in the above-described example A3 was made using the deposition equipment shown in FIG. 7, wherein plasma treatment with hydrogen gas plasma containing a small amount of silane-based gas was performed under the conditions shown in Table A4(1), and other fabrication conditions employed are shown in Table A4(2).

The fabricated samples are evaluated in a similar manner to that in the example A3, and the results are shown in Table A4(3).

As can be seen from Table A4(3), it is preferable that the flow rate of hydrogen gas containing a small amount of silane-based gas in the plasma treatment be in the range of 1 to 2000 sccm to obtain excellent uniformity or reproducibility of characteristics, adhesion, and durability.

EXAMPLE A5

A solar cell, having a triple structure similar to that in the above-described example A3 was made using the deposition equipment shown in FIG. 7, wherein plasma treatment with hydrogen gas plasma containing a small amount of silane-based gas was performed under the conditions shown in Table A5(1), and other fabrication conditions employed are shown in Table A5(2).

Fabricated samples are evaluated in a similar manner to that in the example A3, and the results are shown in Table A5(3).

In this example, VHF power was used to excite the plasma for the plasma treatment whereas RF power was used in the above example A4. As can be seen from Table A5(3), it is also preferable that the flow rate of hydrogen gas containing the small amount of silane-based gas in the plasma treatment be in the range from 1 to 2000 sccm to obtain good uniformity or reproducibility of characteristics, adhesion, and durability.

EXAMPLE A6

A solar cell, having a triple structure similar to that in the above-described example A3 was made using the deposition equipment shown in FIG. 7, wherein plasma treatment with hydrogen gas plasma containing a small amount of silane-based gas was performed under the conditions shown in Table A6(1), and other fabrication conditions employed are shown in Table A6(2).

Fabricated samples are evaluated in a similar manner to that in the example A3, and the results are shown in Table A6(3).

As can be seen from Table A6(3), it is preferable that the content of the silicon compound gas added to the hydrogen gas be in the range from 0.001% to 0.1%. to obtain good uniformity or reproducibility of characteristics, adhesion, and durability.

EXAMPLE A7

A solar cell, having a triple structure similar to that in the above-described example A3 was made using the deposition equipment shown in FIG. 7, wherein plasma treatment with hydrogen gas plasma containing a small amount of silane-based gas was performed under the conditions shown in Table A7(1), and other fabrication conditions employed are shown in Table A7(2).

Fabricated samples are evaluated in a similar manner to that in the example A3, and the results are shown in Table A7(3).

In this example, VHF power was used to excite the plasma for the plasma treatment, whereas RF power was used in the above example A6. As can be seen from Table A7(3), it is also preferable that the content of the silicon compound gas added to the hydrogen gas be in the range from 0.001% to 0.1%. to obtain good uniformity or reproducibility of characteristics, adhesion, and durability.

EXAMPLE A8

A solar cell, having a triple structure similar to that in the above-described example A3 was made using the deposition equipment shown in FIG. 7, wherein plasma treatment with hydrogen gas plasma containing a small amount of silane-based gas was performed under the conditions shown in Table A8(1), and other fabrication conditions employed are shown in Table A8(2).

Fabricated samples are evaluated in a similar manner to that in the example A3, and the results are shown in Table A8(3).

In this example, MW power was used to excite the plasma for the plasma treatment, whereas RF power was used in the above example A6. As can be seen from Table A8(3), it is also preferable that the content of the silicon compound gas added to the hydrogen gas be in the range from 0.001% to 0.1%. to obtain good uniformity or reproducibility of characteristics, adhesion, and durability.

EXAMPLE A9

A solar cell, having a triple structure similar to that in the above-described example A3 was made using the deposition equipment shown in FIG. 7, wherein plasma treatment with hydrogen gas plasma containing a small amount of silane-based gas was performed under the conditions shown in Table A9(1), and other fabrication conditions employed are shown in Table A9(2).

Fabricated samples are evaluated in a similar manner to that in the example A3, and the results are shown in Table A9(3).

As can be seen from Table A9(3), it is preferable that the pressure in the plasma treatment with the hydrogen gas containing a small amount of silane-based gas be in the range from 0.05 Torr to 10 Torr to obtain good uniformity or reproducibility of characteristics, adhesion, and durability.

EXAMPLE A10

A solar cell, having a triple structure similar to that in the above-described example A3 was made using the deposition equipment shown in FIG. 7, wherein plasma treatment with hydrogen gas plasma containing a small amount of silane-based gas was performed under the conditions shown in Table A10(1), and other fabrication conditions employed are shown in Table A10(2).

Fabricated samples are evaluated in a similar manner to that in the example A3, and the results are shown in Table A10(3).

As can be seen from Table A10(3), it is preferable that when VHF power is used to excite the plasma, the pressure in the plasma treatment with the hydrogen gas containing a small amount of silane-based gas be in the range from 0.0001 Torr to 1 Torr to obtain good uniformity or reproducibility of characteristics, adhesion, and durability.

EXAMPLE A11

A solar cell, having a triple structure similar to that in the above-described example A3 was made using the deposition equipment shown in FIG. 7, wherein plasma treatment with hydrogen gas plasma containing a small amount of silane-based gas was performed under the conditions shown in Table A11(1), and other fabrication conditions employed are shown in Table A11(2).

Fabricated samples are evaluated in a similar manner to that in the example A3, and the results are shown in Table A11(3).

As can be seen from Table A11(3), it is preferable that when MW power is used to excite the plasma, the pressure in the plasma treatment with the hydrogen gas containing a small amount of silane-based gas be in the range from 0.0001 Torr to 0.01 Torr to obtain good uniformity or reproducibility of characteristics, adhesion, and durability.

EXAMPLE A12

A solar cell, having a triple structure similar to that in the above-described example A3 was made using the deposition equipment shown in FIG. 7, wherein plasma treatment with hydrogen gas plasma containing a small amount of silane-based gas was performed under the conditions shown in Table A12(1), and other fabrication conditions employed are shown in Table A12(2).

Fabricated samples are evaluated in a similar manner to that in the example A3, and the results are shown in Table A12(3).

As can be seen from Table A12(3), it is preferable that when RF power is used to excite the plasma, the applied power density (electric power) in the plasma treatment with the hydrogen gas containing a small amount of silane-based gas be in the range from 0.01 W/cm$^3$ to 1.0 W/cm$^3$ to obtain good uniformity or reproducibility of characteristics, adhesion, and durability.

EXAMPLE A13

A solar cell, having a triple structure similar to that in the above-described example A3 was made using the deposition equipment shown in FIG. 7, wherein plasma treatment with hydrogen gas plasma containing a small amount of silane-based gas was performed under the conditions shown in Table A13(1), and other fabrication conditions employed are shown in Table A13(2).

Fabricated samples are evaluated in a similar manner to that in the example A3, and the results are shown in Table A13(3).

As can be seen from Table A13(3), it is preferable that when VHF power is used to excite the plasma, the applied power density (electric power) in the plasma treatment with the hydrogen gas containing a small amount of silane-based gas be in the range from 0.01 W/cm$^3$ to 1.0 W/cm$^3$ to obtain good uniformity or reproducibility of characteristics, adhesion, and durability.

EXAMPLE A14

A solar cell, having a triple structure similar to that in the above-described example A3 was made using the deposition equipment shown in FIG. 7, wherein plasma treatment with hydrogen gas plasma containing a small amount of silane-based gas was performed under the conditions shown in Table A14(1), and other fabrication conditions employed are shown in Table A14(2).

Fabricated samples are evaluated in a similar manner to that in the example A3, and the results are shown in Table A14(3).

As can be seen from Table A14(3), it is preferable that when MW power is used to excite the plasma, the applied power density (electric power) in the plasma treatment with the hydrogen gas containing a small amount of silane-based gas be in the range from 0.1 W/cm$^3$ to 10 W/cm$^3$ to obtain good uniformity or reproducibility of characteristics, adhesion, and durability.

EXAMPLE A15

A solar cell, having a triple structure similar to that in the above-described example A3 was made using the deposition equipment shown in FIG. 7, wherein plasma treatment with hydrogen gas plasma containing a small amount of silane-based gas was performed under the conditions shown in Table A15(1), and other fabrication conditions employed are shown in Table A15(2).

Fabricated samples are evaluated in a similar manner to that in the example A3, and the results are shown in Table A15(3).

As can be seen from Table A15(3), it is preferable that when RF power is used to excite the plasma, the substrate temperature in the plasma treatment with the hydrogen gas containing a small amount of silane-based gas be in the range from 100° C. to 400° C. to obtain good uniformity or reproducibility of characteristics, adhesion, and durability.

EXAMPLE A16

A solar cell, having a triple structure similar to that in the above-described example A3 was made using the deposition equipment shown in FIG. 7, wherein plasma treatment with hydrogen gas plasma containing a small amount of silane-based gas was performed under the conditions shown in Table A16(1), and other fabrication conditions employed are shown in Table A16(2).

Fabricated samples are evaluated in a similar manner to that in the example A3, and the results are shown in Table A16(3).

As can be seen from Table A16(3), it is preferable that when VHF power is used to excite the plasma, the substrate temperature in the plasma treatment with the hydrogen gas containing a small amount of silane-based gas be in the range from 50° C. to 300° C. to obtain good uniformity or reproducibility of characteristics, adhesion, and durability.

EXAMPLE A17

A solar cell, having a triple structure similar to that in the above-described example A3 was made using the deposition equipment shown in FIG. 7, wherein plasma treatment with hydrogen gas plasma containing a small amount of silane-based gas was performed under the conditions shown in Table A17(1), and other fabrication conditions employed are shown in Table A17(2).

Fabricated samples are evaluated in a similar manner to that in the example A3, and the results are shown in Table A17(3).

As can be seen from Table A17(3), it is preferable that when MW power is used to excite the plasma, the substrate temperature in the plasma treatment with the hydrogen gas containing a small amount of silane-based gas be in the range from 50° C. to 300° C. to obtain good uniformity or reproducibility of characteristics, adhesion, and durability.

In the above examples of solar cells according to the present invention, semiconductor layers were deposited on a substrate in the order of n-layer, i-layer, and p-layer. Similar experiments were performed for the structure in which semiconductor layers were deposited in the opposite order. Also in this case, the fabrication method of photovoltaic devices according to the present invention provides great improvement in uniformity or reproducibility of characteristics, adhesion, and durability.

EXAMPLE B1 ACCORDING TO THE INVENTION

A solar cell having a structure such as that shown in FIG. 2 was made using the deposition equipment shown in FIG. 7. First, a substrate was prepared. A stainless-steel base 100 having dimensions of 0.5 mm in thickness and 50×50 $mm^2$ in area was cleaned with acetone and isopropanol by means of ultrasonic cleaning, and then dried with hot air.

An Ag optical reflection layer 101 having a thickness of 0.3 μm was deposited on a surface of the stainless-steel base 100 using a sputtering technique at room temperature, and a 1.0-μm-thick ZnO layer acting as a reflection enhancing layer 102 was further deposited on it at 350° C. Thus, the complete substrate was prepared.

Using the deposition equipment 400 having the capabilities of both MWPCVD and RFPCVD, semiconductor layers were then deposited on the reflection enhancing layer 102.

The deposition equipment 400 was used in a state in which source gas cylinders (not shown) were connected to the deposition equipment 400 via gas inlets. The source gas cylinders used here were all of ultra high purity type, including $SiH_4$, $SiF_4$, $CH_4$, $GeH_4$, $GeF_4$, $Si_2H_6$, $PH_3/H_2$ (diluted to 1000 ppm), $B_2H_6/H_2$ (diluted to 2000 ppm), $H_2$, He, $SiCl_2H_2$, and $SiH_4/H_2$ (diluted to 1000 ppm) gas cylinders.

The substrate 490 on which the optical reflection layer 101 and the reflection enhancing layer 102 had been formed was placed on the substrate transfer rail 413 in the load chamber 401, and the load chamber 401 was evacuated with the vacuum pump (not shown) down to a pressure of about $1\times10^{-5}$ Torr. Then, the gate valve 406 was opened, and the substrate 490 was transferred to the deposition chamber 417 via the transfer chamber 402 wherein both deposition chamber 417 and transfer chamber 402 had already been evacuated with the vacuum pump (not shown). The substrate 490 was placed such that the back surface of the substrate 490 came into contact with the heater 410 so that the substrate 490 was heated. The inside of the deposition chamber 417 was evacuated with the vacuum pump (not shown) down to a pressure of about $1\times10^{-5}$ Torr.

In this way, the preparation for semiconductor film deposition was complete, and thus an RF n-layer 103 of μc-Si was deposited as follows.

To deposit the RF n-layer of μc-Si, $H_2$ gas was introduced into the deposition chamber 417 via the gas inlet 429, wherein the $H_2$ gas was supplied by opening the valves 441, 431, 430 and its flow rate was adjusted to 200 sccm by means of the mass flow controller 436. Furthermore, the pressure inside the deposition chamber 417 was adjusted to 1.2 Torr by means of the conductance valve (not shown). The substrate 490 was heated by the substrate heater 410 up to 360° C. When the temperature of the substrate had become stable, the valves 443, 433, 444, and 434 were opened whereby $SiH_4$ gas and $PH_3/H_2$ gas were introduced into the deposition chamber 417 via the gas inlet 429. The flow rates of $SiH_4$, $H_2$, and $PH_3/H_2$ were adjusted to 2 sccm, 100 sccm, and 200 sccm, respectively, by the mass flow controllers 438, 436, and 439. The pressure inside the deposition chamber 417 was adjusted to 1.2 Torr. RF power of 0.05 $W/cm^3$ was applied by the RF power supply 422 so that a glow discharge occurs in the plasma excitation cup 420, and thus deposition of the RF n-layer was started. When the thickness of the deposited RF n-layer had reached 20 nm, the RF power was shut off thereby eliminating the glow discharge. Thus, the deposition of the RF n-layer 103 was complete. The supply of $SiH_4$ and $PH_3/H_2$ into the deposition chamber 417 was stopped, whereas $H_2$ was fed further for 5 min into the deposition chamber 417. Then, $H_2$ was also shut off, and the inside of the deposition chamber 417 as well as the inside of the gas lines was evacuated down to $1\times10^{-5}$ Torr.

The substrate was then subjected to plasma treatment with hydrogen gas containing a small amount of silane-based gas under the conditions shown in Table B1(1), according to the present invention.

In this plasma treatment with hydrogen gas containing the small amount of silane-based gas according to the present invention, $SiH_4/H_2$ (diluted to 1000 ppm) serving as silicon compound gas and $H_2$ were introduced into the deposition chamber 417 via the gas inlet 429 wherein the $H_2$ gas was supplied by opening the valves 441, 431, 430 and its flow rate was adjusted to 750 sccm by means of the mass flow controller 436, and wherein the gas containing $SiH_4$ was supplied by opening the valves 442 and 432 and its flow rate was controlled by the mass flow controller 437 such that the flow rate of the $SiH_4$ gas was maintained at 0.04% of the total gas flow rate of $H_2$. Furthermore, the pressure inside the deposition chamber 417 was adjusted to 1.1 Torr by means of the conductance valve (not shown). The substrate 490 was heated by the substrate heater 410 up to 360° C. When the temperature of the substrate had become stable, RF power of 0.04 W/cm$^3$ was applied by the RF power supply 422 so that a glow discharge occurs in the plasma excitation cup 420. Under the above-described conditions, the substrate was exposed for 3 min to the hydrogen gas plasma containing the small amount of silane-based gas according to the present invention. The RF power was then shut off thereby eliminating the glow discharge. The supply of the $SiH_4/H_2$ gas (diluted to 1000 ppm) into the deposition chamber 417 was stopped, whereas the $H_2$ gas was fed further for 5 min into the deposition chamber 417. Then, the $H_2$ gas was also shut off, and the inside of the deposition chamber 417 as well as the inside of the gas lines was evacuated down to $1\times10^{-5}$ Torr.

An n/i buffer layer 151 of a-Si, an MW i-layer 114 of a-SiGe, and a p/i buffer layer 161 of a-Si were then deposited successively by means of RFPCD, MWPCVD, and RFPCVD, respectively, as described below.

The gate valve 407 was opened, and the substrate 490 was transferred to the i-layer deposition chamber 418 via the transfer chamber 403 wherein both deposition chamber 418 and transfer chamber 403 had already been evacuated with the vacuum pump (not shown). The substrate 490 was placed such that the back surface of the substrate 490 came into contact with the heater 411 so that the substrate 490 was heated. The inside of the i-layer deposition chamber 418 was evacuated with the vacuum pump (not shown) down to a pressure of about $1\times10^{-5}$ Torr.

To deposit the n/i buffer layer 151, the substrate 490 was heated by the substrate heater 411 up to 360° C. When the substrate had been heated enough, the valves 464, 454, 450, 463, and 453 were opened gradually whereby $Si_2H_6$ and $H_2$ were introduced into the i-layer deposition chamber 418 via the gas inlet 449. The flow rates of $Si_2H_6$ and $H_2$ were adjusted to 4 sccm and 100 sccm, respectively, by the mass flow controllers 459, and 458. The pressure inside the i-layer deposition chamber 418 was adjusted to 0.8 Torr by adjusting the opening ratio of the conductance valve (not shown). Then, RF power of 0.07 W/cm$^3$ was applied to the bias bar 428 by the RF power supply 424, thereby exciting a glow discharge. The shutter 427 was then opened, and thus deposition of the n/i buffer layer onto the RF n-layer was started. When the thickness of the deposited n/i buffer layer had reached 10 nm, the glow discharge was stopped, and the power supply 424 was shut off. Thus, the deposition of the n/i buffer layer 151 was complete. The valves 464 and 454 were closed so as to stop the supply of $Si_2H_6$ to the i-layer deposition chamber 418, whereas $H_2$ was fed further for 2 min into the i-layer deposition chamber 418. Then, the valves 453 and 450 were closed, and the inside of the i-layer deposition chamber 418 as well as the inside of the gas lines was evacuated down to $1\times10^{-5}$ Torr.

The MW i-layer was then deposited as follows: the substrate 490 was heated by the substrate heater 411 up to 360° C. When the substrate had been heated enough, the valves 461, 451, 450, 462, 452, 463, and 453 were opened gradually whereby $SiH_4$, $GeH_4$, and $H_2$ were introduced into the i-layer deposition chamber 418 via the gas inlet 449. The flow rates of $SiH_4$, $GeH_4$, and $H_2$ were adjusted to 38 sccm, 35 sccm, and 120 sccm, respectively, by the mass flow controllers 456, 457, and 458. The pressure inside the i-layer deposition chamber 418 was adjusted to 6 mTorr by adjusting the opening ratio of the conductance valve (not shown). Then, RF power of 0.60 W/cm$^3$ was applied to the bias bar 428 by the RF power supply 424. Furthermore, MW power of 0.25 W/cm$^3$ was introduced from an MW power supply (not shown) into the i-layer deposition chamber 418 via the wave guide 426 and the microwave entrance window 425, thereby exciting a glow discharge. The shutter 427 was then opened, and thus deposition of the MW i-layer onto the n/i buffer layer was started. When the thickness of the deposited MW i-layer had reached 0.15 μm, the MW glow discharge was stopped, and the bias power supply 424 was shut off. Thus, the deposition of the MW i-layer 204 was complete. The valves 451 and 452 were closed so as to stop the supply of $SiH_4$ and $GeH_4$ to the i-layer deposition chamber 418, whereas $H_2$ was fed further for 2 min into the i-layer deposition chamber 418. Then, the valves 453 and 450 were closed, and the inside of the i-layer deposition chamber 418 as well as the inside of the gas lines was evacuated down to $1\times10^{-5}$ Torr.

To deposit the p/i buffer layer 161, the substrate 490 was heated by the substrate heater 411 up to 250° C. When the substrate had been heated enough, the valves 464, 454, 450, 463, and 453 were opened gradually whereby $Si_2H_6$ and $H_2$ were introduced into the i-layer deposition chamber 418 via the gas inlet 449. The flow rates of $Si_2H_6$ and $H_2$ were adjusted to 2 sccm and 80 sccm, respectively, by the mass flow controllers 459, and 458. The pressure inside the i-layer deposition chamber 418 was adjusted to 0.7 Torr by adjusting the opening ratio of the conductance valve (not shown). Then, RF power of 0.07 W/cm$^3$ was applied to the bias bar 428 by the RF power supply 424, thereby exciting a glow discharge. The shutter 427 was then opened, and thus deposition of the p/i buffer layer onto the MW i-layer was started. When the thickness of the deposited p/i buffer layer had reached 20 nm, the glow discharge was stopped, and the power supply 424 was shut off. Thus, the deposition of the p/i buffer layer 161 was complete. The valves 464 and 454 were closed so as to stop the supply of $Si_2H_6$ to the i-layer deposition chamber 418, whereas $H_2$ was fed further for 2 min into the i-layer deposition chamber 418. Then, the valves 453 and 450 were closed, and the inside of the i-layer deposition chamber 418 as well as the inside of the gas lines was evacuated down to $1\times10^{-5}$ Torr.

To deposit the RF p-layer 105 of a-SiC, the gate valve 408 was opened, and the substrate 490 was transferred to the p-layer deposition chamber 419 via the transfer chamber 404, wherein both deposition chamber 419 and transfer chamber 404 had already been evacuated with the vacuum pump (not shown). The substrate 490 was placed such that the back surface of the substrate 490 came into contact with the heater 412 so that the substrate 490 was heated. The inside of the p-layer deposition chamber 419 was evacuated with the vacuum pump (not shown) down to a pressure of about $1\times10^{-5}$ Torr.

The substrate 490 was heated by the substrate heater 412 up to 200° C. When the temperature of the substrate had become stable, the valves 481, 471, 470, 482, 472, 483, 473, 484, and 474 were opened whereby $H_2$ gas, $SiH_4/H_2$ gas, $B_2H_6/H_2$ gas, and $CH_4$ gas were introduced into the deposition chamber 419 via the gas inlet 469. The flow rates of the $H_2$, $SiH_4/H_2$, $B_2H_6/H_2$, and $CH_4$, were adjusted to 50 sccm, 2 sccm, 10 sccm, and 0.3 sccm, respectively, by the mass flow controllers 476, 477, 478, and 479. The pressure inside the chamber 419 was adjusted to 1.8 Torr by adjusting the opening ratio of the conductance valve (not shown). RF power of 0.07 $W/cm^3$ was applied by the RF power supply 423 so that a glow discharge occurs in the plasma excitation cup 421, and thus deposition of the RF p-layer onto the p/i buffer layer was started. When the thickness of the deposited RF p-layer had reached 10 nm, the RF power was shut off thereby eliminating the glow discharge. Thus, the deposition of the RF p-layer 105 was complete. The valves 472, 482, 473, 483, 474, and 484 were closed so as to stop the supply of $SiH_4/H_2$, $B_2H_6/H_2$, and $CH_4$ to the p-layer deposition chamber 419, whereas $H_2$ was fed further for 3 min into the p-layer deposition chamber 419. Then, the valves 471, 481, and 470 were closed, and the inside of the p-layer deposition chamber 419 as well as the inside of the gas lines was evacuated down to $1\times10^{-5}$ Torr.

The gate valve 409 was then opened, and the substrate 490 was transferred to the unload chamber 405 which had already been evacuated with the vacuum pump (not shown). Then, a leak valve (not shown) was opened so that the inside of the unload chamber 405 was exposed to the ambient atmosphere.

ITO was then evaporated onto the RF p-layer 105 so as to form a transparent conductive layer 112 having a thickness of 70 nm.

A mask having a comb-shaped window was placed on the transparent conductive layer 112, and metal evaporation was performed via the mask thereby forming a comb-shaped collection electrode 113 having a multi-layer structure consisting of Cr(40 nm)/Ag(1000 nm)/Cr(40 nm).

In this way, a complete solar cell according to the invention was obtained. Hereafter, the solar cell of this type will be referred to as SC-EMB-B1. Tables B1(1) and B1(2) summarize the conditions used here in the invention, regarding the plasma treatment in an ambient of hydrogen containing a small amount of silane-based gas as well as the process conditions for the RF n-layer, RF n/i buffer layer, MW i-layer, RF p/i buffer layer, and RF p-layer.

COMPARATIVE EXAMPLE B1

For the sake of comparison, a solar cell (SC-CMP-B1) was also fabricated in the same manner as in the above-described example B1 except that the plasma treatment with hydrogen gas containing a small amount of silane-based gas according to the invention was not performed.

Ten samples were prepared for each type solar cell (SC-EMB-B1 and SC-CMP-B1) for the purpose of evaluation regarding the initial photoelectric conversion efficiency (the ratio of the electric output power to the optical input power), durability under vibration, durability under illumination, and durability under vibration and illumination with an applied bias voltage at a high temperature and high humidity.

The measurement of the initial photoelectric conversion efficiency was performed by measuring the V-I characteristics of the samples under the illumination condition of AM1.5 (100 $mW/cm^2$). Regarding the fill factors (F.F.'s) in the initial photoelectric conversion efficiency and the variations in the characteristics, the measurement results of the SC-CMP-B1 samples relative to those of the SC-EMB-B1 samples are shown below.

[Characteristics associated with the photoelectric conversion efficiency]

| | FF | Variation |
|---|---|---|
| SC-CMP-B1 | 0.92 | 1.15 |

(relative to the values of SC-EMB-B1)

The durability under vibration was evaluated as follows: After the measurement of the initial photoelectric conversion efficiency, some samples were placed in a dark place kept at 25° C. and 50% relative humidity. Vibration having an amplitude of 0.1 mm and a frequency of 60 Hz was applied to the samples for 500 hr. After that, the photoelectric conversion efficiencies of the samples were measured under the illumination condition of AM1.5 (100 $mW/cm^2$) and the reduction relative to the initial value (the ratio of the photoelectric conversion efficiency after the vibration test to the initial value) was evaluated for each sample. The durability under illumination was evaluated as follows: After the measurement of the initial photoelectric conversion efficiency, some samples were placed in a place kept at 25° C. and 50% relative humidity, and illuminated with light of AM1.5 (100 $mW/cm^2$) for 500 hr. After that, the photoelectric conversion efficiencies of the samples were measured under the illumination condition of AM1.5 (100 $mW/cm^2$) and the reduction relative to the initial value (the ratio of the photoelectric conversion efficiency after the illumination test to the initial value) was evaluated for each sample. The results are shown below regarding the reduction ratios of the photoelectric conversion efficiency after the illumination and vibration tests for the SC-CMP-B1 samples relative to the results of the SC-EMB-B1 samples.

[Reduction ratio of the photoelectric conversion efficiency]

| | Reduction due to vibration | Reduction due to illumination |
|---|---|---|
| SC-CMP-B1 | 0.86 | 0.84 |

(relative to the results of SC-EMB-B1)

Vibration and illumination durability tests were also performed under a biased condition at a high temperature and high humidity as described below: After the measurement of the initial photoelectric conversion efficiency, two samples were placed in a dark place kept at 80° C. and 90% relative humidity, and a forward bias voltage of 0.7 V was applied to both samples. Vibration was applied to one sample under the same conditions as those in the above-described non-biased vibration test, and degradation was evaluated. The other sample was illuminated with light of AM1.5, and degradation was evaluated. The results are shown below regarding the reduction ratios of the photoelectric conversion efficiency after the vibration and illumination tests for the SC-CMP-B1 samples relative to the results of the SC-EMB-B1 samples.

[Reduction ratio of the photoelectric conversion efficiency]

| | Reduction due to vibration | Reduction due to illumination |
|---|---|---|
| SC-CMP-B1 | 0.85 | 0.84 |

(relative to the results of SC-EMB-B1)

The surfaces of the above-described samples were observed via an optical microscope to evaluate film separation. No film separation was observed in the SC-EMB-B1 samples, whereas slight film separation was observed in the SC-CMP-B1 samples.

From the above results, it can be concluded that the solar cells (SC-EMB-B1) according to the present invention are better in the fill factor of photoelectric conversion efficiency characteristics, uniformity or reproducibility of characteristics, optical durability, adhesion, and durability than the conventional solar cells (SC-CMP-B1).

EXAMPLE B2 ACCORDING TO THE INVENTION

A solar cell, having a tandem structure such as that shown in FIG. 3 was fabricated using the deposition equipment shown in FIG. 7.

A substrate 490 was prepared according to a similar process to that in the example B1 such that a reflection layer 101 and a reflection enhancing layer 102 were formed on a base. The substrate 490 was placed on the substrate transfer rail 413 in the load chamber 401, and the load chamber 401 was evacuated with the vacuum pump (not shown) down to a pressure of about $1\times10^{-5}$ Torr. Then, the gate valve 406 was opened, and the substrate 490 was transferred to the deposition chamber 417 via the transfer chamber 402 wherein both deposition chamber 417 and transfer chamber 402 had already been evacuated with the vacuum pump (not shown). The substrate 490 was placed such that the back surface of the substrate 490 came into contact with the heater 410 so that the substrate 490 was heated. The inside of the deposition chamber 417 was evacuated with the vacuum pump (not shown) down to a pressure of about $1\times10^{-5}$ Torr.

Thus, the preparation for semiconductor film deposition was complete, and an RF n-layer 203 of μc-Si was deposited as follows.

To deposit the RF n-layer of μc-Si, $H_2$ gas was introduced into the deposition chamber 417 via the gas inlet 429, wherein the $H_2$ gas was supplied by opening the valves 441, 431, 430 and its flow rate was adjusted to 200 sccm by means of the mass flow controller 436. Furthermore, the pressure inside the deposition chamber 417 was adjusted to 1.2 Torr by means of the conductance valve (not shown). The substrate 490 was heated by the substrate heater 410 up to 380° C. When the temperature of the substrate had become stable, the valves 443, 433, 444, and 434 were opened whereby $SiH_4$ gas and $PH_3/H_2$ gas were introduced into the deposition chamber 417 via the gas inlet 429. The flow rates of $SiH_4$, $H_2$, and $PH_3/H_2$ were adjusted to 2 sccm, 100 sccm, and 200 sccm, respectively, by the mass flow controllers 438, 436, and 439. The pressure inside the deposition chamber 417 was adjusted to 1.2 Torr. RF power of 0.05 W/cm$^3$ was applied by the RF power supply 422 so that a glow discharge occurs in the plasma excitation cup 420, and thus deposition of the RF n-layer was started. When the thickness of the deposited RF n-layer had reached 20 nm, the RF power was shut off thereby eliminating the glow discharge. Thus, the deposition of the RF n-layer 103 was complete. The supply of $SiH_4$ and $PH_3/H_2$ into the deposition chamber 417 was stopped, whereas $H_2$ was fed further for 4 min into the deposition chamber 417. Then, $H_2$ was also shut off, and the inside of the deposition chamber 417 as well as the inside of the gas lines was evacuated down to $1\times10^{-5}$ Torr.

The substrate 490 was then subjected to plasma treatment with hydrogen gas containing a small amount of silane-based gas according to the conditions shown in Table B2(1). $Si_2H_6/H_2$ (diluted to 1000 ppm) serving as silicon compound gas and $H_2$ were introduced into the deposition chamber 417 via the gas inlet 429 wherein the $H_2$ gas was supplied by opening the valves 441, 431, 430 and its flow rate was adjusted to 700 sccm by means of the mass flow controller 436, and wherein the gas containing $Si_2H_6$ was supplied via opening the valves 444 and 434 and its flow rate was controlled by the mass flow controller 439 such that the flow rate of the $Si_2H_6$ gas was maintained at 0.02% of the total gas flow rate of $H_2$. Furthermore, the pressure inside the deposition chamber 417 was adjusted to 0.010 Torr by means of the conductance valve (not shown). The substrate 490 was heated by the substrate heater 410 up to 285° C. When the temperature of the substrate had become stable, VHF power of 0.08 W/cm$^3$ was applied by the VHF power supply 422 so that a glow discharge occurs in the plasma excitation cup 420. Under the above-described conditions, the substrate was exposed for 4 min to the hydrogen gas plasma containing the small amount of $Si_2H_6$ gas according to the present invention. The VHF power was then shut off thereby eliminating the glow discharge. The supply of the $Si_2H_6/H_2$ gas (diluted to 1000 ppm) into the deposition chamber 417 was stopped, whereas the $H_2$ gas was fed further for 4 min into the deposition chamber 417. Then, the $H_2$ gas was also shut off, and the inside of the deposition chamber 417 as well as the inside of the gas lines was evacuated down to $1\times10^{-5}$ Torr.

An n/i buffer layer 151 of a-Si, an MW i-layer 114 of a-SiGe, and a p/i buffer layer 161 of a-Si were then deposited successively by means of RFPCD, MWPCVD, and RFPCVD, respectively, as described below.

The gate valve 407 was opened, and the substrate 490 was transferred to the i-layer deposition chamber 418 via the transfer chamber 403 wherein both deposition chamber 418 and transfer chamber 403 had already been evacuated with the vacuum pump (not shown). The substrate 490 was placed such that the back surface of the substrate 490 came into contact with the heater 411 so that the substrate 490 was heated. The inside of the i-layer deposition chamber 418 was evacuated with the vacuum pump (not shown) down to a pressure of about $1\times10^{-5}$ Torr.

To deposit the n/i buffer layer 151, the substrate 490 was heated by the substrate heater 411 up to 360° C. When the substrate had been heated enough, the valves 464, 454, 450, 463, and 453 were opened gradually whereby $Si_2H_6$ and $H_2$ were introduced into the i-layer deposition chamber 418 via the gas inlet 449. The flow rates of $Si_2H_6$ and $H_2$ were adjusted to 4 sccm and 100 sccm, respectively, by the mass flow controllers 459, and 458. The pressure inside the i-layer deposition chamber 418 was adjusted to 0.8 Torr by adjusting the opening ratio of the conductance valve (not shown). Then, RF power of 0.08 W/cm$^3$ was applied to the bias bar 428 by the RF power supply 424, thereby exciting a glow discharge. The shutter 427 was then opened, and thus deposition of the n/i buffer layer onto the RF n-layer was started. When the thickness of the deposited n/i buffer layer had reached 10 nm, the glow discharge was stopped, and the power supply 424 was shut off. Thus, the deposition of the n/i buffer layer 151 was complete. The valves 464 and 454 were closed so as to stop the supply of $Si_2H_6$ to the i-layer deposition chamber 418, whereas $H_2$ was fed further for 2 min into the i-layer deposition chamber 418. Then, the valves 453 and 450 were closed, and the inside of the i-layer deposition chamber 418 as well as the inside of the gas lines was evacuated down to $1\times10^{-5}$ Torr.

The MW i-layer was then deposited as follows: the substrate 490 was heated by the substrate heater 411 up to 380° C. When the substrate had been heated enough, the valves 461, 451, 450, 462, 452, 463, and 453 were opened gradually whereby $SiH_4$, $GeH_4$, and $H_2$ were introduced into the i-layer deposition chamber 418 via the gas inlet 449. The flow rates of $SiH_4$, $GeH_4$, and $H_2$ were adjusted to 45 sccm, 35 sccm, and 130 sccm, respectively, by the mass flow controllers 456, 457, and 458. The pressure inside the i-layer deposition chamber 418 was adjusted to 5 mTorr by adjusting the opening ratio of the conductance valve (not shown). Then, RF power of 0.60 $W/cm^3$ was applied to the bias bar 428 by the RF power supply 424. Furthermore, MW power of 0.25 $W/cm^3$ was introduced from an MW power supply (not shown) into the i-layer deposition chamber 418 via the wave guide 426 and the microwave entrance window 425, thereby exciting a glow discharge. The shutter 427 was then opened, and thus deposition of the MW i-layer onto the n/i buffer layer was started. When the thickness of the deposited MW i-layer had reached 0.15 μm, the MW glow discharge was stopped, and the bias power supply 424 was shut off. Thus, the deposition of the MW i-layer 114 was complete. The valves 451 and 452 were closed so as to stop the supply of $SiH_4$ and $GeH_4$ to the i-layer deposition chamber 418, whereas $H_2$ was fed further for 2 min into the i-layer deposition chamber 418. Then, the valves 453 and 450 were closed, and the inside of the i-layer deposition chamber 418 as well as the inside of the gas lines was evacuated down to $1\times10^{-5}$ Torr.

To deposit the p/i buffer layer 161, the substrate 490 was heated by the substrate heater 411 up to 250° C. When the substrate had been heated enough, the valves 464, 454, 450, 463, and 453 were opened gradually whereby $Si_2H_6$ and $H_2$ were introduced into the i-layer deposition chamber 418 via the gas inlet 449. The flow rates of $Si_2H_6$ and $H_2$ were adjusted to 2 sccm and 80 sccm, respectively, by the mass flow controllers 459, and 458. The pressure inside the i-layer deposition chamber 418 was adjusted to 0.7 Torr by adjusting the opening ratio of the conductance valve (not shown). Then, RF power of 0.07 $W/cm^3$ was applied to the bias bar 428 by the RF power supply 424, thereby exciting a glow discharge. The shutter 427 was then opened, and thus deposition of the p/i buffer layer 161 onto the MW i-layer was started. When the thickness of the deposited p/i buffer layer had reached 20 nm, the glow discharge was stopped, and the power supply 424 was shut off. Thus, the deposition of the p/i buffer layer 161 was complete. The valves 464 and 454 were closed so as to stop the supply of $Si_2H_6$ to the i-layer deposition chamber 418, whereas $H_2$ was fed further for 2 min into the i-layer deposition chamber 418. Then, the valves 453 and 450 were closed, and the inside of the i-layer deposition chamber 418 as well as the inside of the gas lines was evacuated down to $1\times10^{-5}$ Torr.

To deposit the RF p-layer 105 of a-SiC, the gate valve 408 was opened, and the substrate 490 was transferred to the p-layer deposition chamber 419 via the transfer chamber 404, wherein both deposition chamber 419 and transfer chamber 404 had already been evacuated with the vacuum pump (not shown). The substrate 490 was placed such that the back surface of the substrate 490 came into contact with the heater 412 so that the substrate 490 was heated. The inside of the p-layer deposition chamber 419 was evacuated with the vacuum pump (not shown) down to a pressure of about $1\times10^{-5}$ Torr.

The substrate 490 was heated by the substrate heater 412 up to 250° C. When the temperature of the substrate had become stable, the valves 481, 471, 470, 482, 472, 483, 473, 484, and 474 were opened whereby $H_2$ gas, $SiH_4/H_2$ gas, $B_2H_6/H_2$ gas, and $CH_4$ gas were introduced into the deposition chamber 419 via the gas inlet 469. The flow rates of the $H_2$, $SiH_4/H_2$, $B_2H_6/H_2$, and $CH_4$, were adjusted to 60 sccm, 2 sccm, 10 sccm, and 0.3 sccm, respectively, by the mass flow controllers 476, 477, 478, and 479. The pressure inside the chamber 419 was adjusted to 2.0 Torr by adjusting the opening ratio of the conductance valve (not shown). RF power of 0.07 $W/cm^3$ was applied by the RF power supply 423 so that a glow discharge occurs in the plasma excitation cup 421, and thus deposition of the RF p-layer onto the p/i buffer layer was started. When the thickness of the deposited RF p-layer had reached 10 nm, the RF power was shut off thereby eliminating the glow discharge. Thus, the deposition of the RF p-layer 105 was complete. The valves 472, 482, 473, 483, 474, and 484 were closed so as to stop the supply of $SiH_4/H_2$, $B_2H_6/H_2$, and $CH_4$ to the p-layer deposition chamber 419, whereas $H_2$ was fed further for 3 min into the p-layer deposition chamber 419. Then, the valves 471, 481, and 470 were closed, and the inside of the p-layer deposition chamber 419 as well as the inside of the gas lines was evacuated down to $1\times10^{-5}$ Torr.

To deposit the RF n-layer of μc-Si, $H_2$ gas was introduced into the deposition chamber 417 via the gas inlet 429, wherein the $H_2$ gas was supplied by opening the valves 441, 431, 430 and its flow rate was adjusted to 200 sccm by means of the mass flow controller 436. Furthermore, the pressure inside the deposition chamber 417 was adjusted to 1.1 Torr by means of the conductance valve (not shown). The substrate 490 was heated by the substrate heater 410 up to 250° C. When the temperature of the substrate had become stable, the valves 443, 433, 444, and 434 were opened whereby $SiH_4$ gas and $PH_3/H_2$ gas were introduced into the deposition chamber 417 via the gas inlet 429. The flow rates of $SiH_4$, $H_2$, and $PH_3/H_2$ were adjusted to 2 sccm, 50 sccm, and 250 sccm, respectively, by the mass flow controllers 438, 436, and 439. The pressure inside the deposition chamber 417 was adjusted to 1.1 Torr. RF power of 0.04 $W/cm^3$ was applied by the RF power supply 422 so that a glow discharge occurs in the plasma excitation cup 420, and thus deposition of the RF n-layer onto the RF p-layer was started. When the thickness of the deposited RF n-layer had reached 10 nm, the RF power was shut off thereby eliminating the glow discharge. Thus, the deposition of the RF n-layer 203 was complete. The supply of $SiH_4$ and $PH_3/H_2$ into the deposition chamber 417 was stopped, whereas $H_2$ was fed further for 2 min into the deposition chamber 417. Then, $H_2$ was also shut off, and the inside of the deposition chamber 417 as well as the inside of the gas lines was evacuated down to $1\times10^{-5}$ Torr.

The substrate was then subjected to plasma treatment with hydrogen gas containing a small amount of silane-based gas under the conditions shown in Table B2(2), according to the present invention. In this plasma treatment with hydrogen gas containing the small amount of silane-based gas according to the present invention, $SiH_4/H_2$ (diluted to 1000 ppm) serving as silicon compound gas and $H_2$ were introduced into the deposition chamber 417 via the gas inlet 429 wherein the $H_2$ gas was supplied by opening the valves 441, 431, 430 and its flow rate was adjusted to 600 sccm by means of the mass flow controller 436, and wherein the gas containing $SiH_4$ was supplied by opening the valves 442 and 432 and its flow rate was controlled by the mass flow controller 437 such that the flow rate of the $SiH_4$ gas was maintained at 0.06% of the total gas flow rate of $H_2$. Furthermore, the pressure inside the deposition chamber 417 was adjusted to 1.0 Torr by means of the conductance valve (not shown). The substrate 490 was heated by the substrate heater 410 up to 200° C. When the temperature of the substrate had become stable, RF power of 0.02 W/cm$^3$ was applied by the RF power supply 422 so that a glow discharge occurs in the plasma excitation cup 420. Under the above-described conditions, the substrate was exposed for 3 min to the hydrogen gas plasma containing the small amount of silane-based gas according to the present invention. The RF power was then shut off thereby eliminating the glow discharge. The supply of the $SiH_4/H_2$ gas (diluted to 1000 ppm) into the deposition chamber 417 was stopped, whereas the $H_2$ gas was fed further for 3 min into the deposition chamber 417. Then, the $H_2$ gas was also shut off, and the inside of the deposition chamber 417 as well as the inside of the gas lines was evacuated down to 1×10$^{-5}$ Torr.

An n/i buffer layer 251 of a-Si, an RF i-layer 214 of a-Si, and a p/i buffer layer 261 of a-SiC were then deposited successively by means of RFPCD as described below.

The gate valve 407 was opened, and the substrate 490 was transferred to the i-layer deposition chamber 418 via the transfer chamber 403 wherein both deposition chamber 418 and transfer chamber 403 had already been evacuated with the vacuum pump (not shown). The substrate 490 was placed such that the back surface of the substrate 490 came into contact with the heater 411 so that the substrate 490 was heated. The inside of the i-layer deposition chamber 418 was evacuated with the vacuum pump (not shown) down to a pressure of about 1×10$^{-5}$ Torr.

To deposit the n/i buffer layer 251, the substrate 490 was heated by the substrate heater 411 up to 250° C. When the substrate had been heated enough, the valves 464, 454, 450, 463, 453, 465, and 455 were opened gradually whereby $Si_2H_6$, $H_2$, and $CH_4$ were introduced into the i-layer deposition chamber 418 via the gas inlet 449. The flow rates of $Si_2H_6$, $H_2$, and $CH_4$ were adjusted to 0.5 sccm, 50 sccm, and 0.2 sccm, respectively, by the mass flow controllers 459, 458, and 460.

The pressure inside the i-layer deposition chamber 418 was adjusted to 1.5 Torr by adjusting the opening ratio of the conductance valve (not shown). Then, RF power of 0.06 W/cm$^3$ was applied to the bias bar 428 by the RF power supply 424, thereby exciting a glow discharge. The shutter 427 was then opened, and thus deposition of the n/i buffer layer onto the RF n-layer was started. When the thickness of the deposited n/i buffer layer had reached 10 nm, the glow discharge was stopped, and the power supply 424 was shut off. Thus, the deposition of the n/i buffer layer 251 was complete. The valves 464, 454, 465 and 455 were closed so as to stop the supply of $Si_2H_6$ and $CH_4$ to the i-layer deposition chamber 418, whereas $H_2$ was fed further for 2 min into the i-layer deposition chamber 418. Then, the valves 453 and 450 were closed, and the inside of the i-layer deposition chamber 418 as well as the inside of the gas lines was evacuated down to 1×10$^{-5}$ Torr.

To deposit the RF i-layer, the substrate 490 was heated by the substrate heater 411 up to 200° C. When the substrate had been heated enough, the valves 464, 454, 450, 463, and 453 were opened gradually whereby $Si_2H_6$ and $H_2$ were introduced into the i-layer deposition chamber 418 via the gas inlet 449. The flow rates of $Si_2H_6$ and $H_2$ were adjusted to 2 sccm and 60 sccm, respectively, by the mass flow controllers 459, and 458. The pressure inside the i-layer deposition chamber 418 was adjusted to 0.6 Torr by adjusting the opening ratio of the conductance valve (not shown). Then, RF power of 0.07 W/cm$^3$ was applied to the bias bar 428 by the RF power supply 424, thereby exciting a glow discharge. The shutter 427 was then opened, and thus depositing the RF i-layer onto the n/i buffer layer 251 was started. When the thickness of the deposited i-layer had reached 110 nm, the glow discharge was stopped, and the power supply 424 was shut off. Thus, the deposition of the RF i-layer 207 was complete. The valves 464 and 454 were closed so as to stop the supply of $Si_2H_6$ to the i-layer deposition chamber 418, whereas $H_2$ was fed further for 2 min into the i-layer deposition chamber 418. Then, the valves 453 and 450 were closed, and the inside of the i-layer deposition chamber 418 as well as the inside of the gas lines was evacuated down to 1×10$^{-5}$ Torr.

To deposit the p/i buffer layer 261, the substrate 490 was heated by the substrate heater 411 up to 200° C. When the substrate had been heated enough, the valves 464, 454, 450, 463, 453, 465, and 455 were opened gradually whereby $Si_2H_6$, $H_2$, and $CH_4$ were introduced into the i-layer deposition chamber 418 via the gas inlet 449. The flow rates of $Si_2H_6$, $H_2$, and $CH_4$ were adjusted to 0.5 sccm, 50 sccm, and 0.3 sccm, respectively, by the mass flow controllers 459, 458, and 460. The pressure inside the i-layer deposition chamber 418 was adjusted to 1.3 Torr by adjusting the opening ratio of the conductance valve (not shown). Then, RF power of 0.06 W/cm$^3$ was applied to the bias bar 428 by the RF power supply 424, thereby exciting a glow discharge. The shutter 427 was then opened, and thus deposition of the p/i buffer layer onto the RF i-layer was started. When the thickness of the deposited p/i buffer layer had reached 15 nm, the glow discharge was stopped, and the power supply 424 was shut off. Thus, the deposition of the p/i buffer layer 261 was complete. The valves 464, 454, 465, and 455 were closed so as to stop the supply of $Si_2H_6$ and $CH_4$ to the i-layer deposition chamber 418, whereas $H_2$ was fed further for 2 min into the i-layer deposition chamber 418. Then, the valves 453 and 450 were closed, and the inside of the i-layer deposition chamber 418 as well as the inside of the gas lines was evacuated down to 1×10$^{-5}$ Torr.

To deposit the RF p-layer 205 of a-SiC, the gate valve 408 was opened, and the substrate 490 was transferred to the p-layer deposition chamber 419 via the transfer chamber 404, wherein both deposition chamber 419 and transfer chamber 404 had already been evacuated with the vacuum pump (not shown). The substrate 490 was placed such that the back surface of the substrate 490 came into contact with the heater 412 so that the substrate 490 was heated. The inside of the p-layer deposition chamber 419 was evacuated with the vacuum pump (not shown) down to a pressure of about 1×10$^{-5}$ Torr.

The substrate 490 was heated by the substrate heater 412 up to 170° C. When the temperature of the substrate had become stable, the valves 481, 471, 470, 482, 472, 483, 473, 484, and 474 were opened whereby $H_2$ gas, $SiH_4/H_2$ gas, $B_2H_6/H_2$ gas, and $CH_4$ gas were introduced into the deposition chamber 419 via the gas inlet 469. The flow rates of the $H_2$, $SiH_4/H_2$, $B_2H_6/H_2$, and $CH_4$, were adjusted to 60 sccm, 2 sccm, 10 sccm, and 0.3 sccm, respectively, by the mass flow controllers 476, 477, 478, and 479. The pressure inside the chamber 419 was adjusted to 2.0 Torr by adjusting the opening ratio of the conductance valve (not shown). RF power of 0.07 W/cm$^3$ was applied by the RF power supply 423 so that a glow discharge occurs in the plasma excitation cup 421, and thus deposition of the RF p-layer onto the p/i buffer layer 261 was started. When the thickness of the deposited RF p-layer had reached 10 nm, the RF power was shut off thereby eliminating the glow discharge. Thus, the deposition of the RF p-layer 205 was complete. The valves 472, 482, 473, 483, 474, and 484 were closed so as to stop the supply of $SiH_4/H_2$, $B_2H_6/H_2$, and $CH_4$ to the p-layer deposition chamber 419, whereas $H_2$ was fed further for 2 min into the p-layer deposition chamber 419. Then, the valves 471, 481, and 470 were closed, and the inside of the p-layer deposition chamber 419 as well as the inside of the gas lines was evacuated down to $1\times10^{-5}$ Torr.

The gate valve 409 was then opened, and the substrate 490 was transferred to the unload chamber 405 which had already been evacuated with the vacuum pump (not shown). Then, a leak valve (not shown) was opened so that the inside of the unload chamber 405 was exposed to the ambient atmosphere.

ITO was then evaporated onto the RF p-layer 205 so as to form a transparent conductive layer 112 having a thickness of 70 nm.

A mask having a comb-shaped window was placed on the transparent conductive layer 112, and metal evaporation was performed via the mask thereby forming a comb-shaped collection electrode 113 having a multi-layer structure consisting of Cr(40 nm)/Ag(1000 nm)/Cr(40 nm).

In this way, a complete solar cell according to the invention was obtained. Hereafter, the solar cell of this type will be referred to as SC-EMB-B2. Tables B2(1) through B2(3) summarize the conditions used here in the invention, regarding the plasma treatment in an ambient of hydrogen containing a small amount of silane-based gas as well as the process conditions for the RF n-layer, n/i buffer layer, MW i-layer, p/i buffer layer, RF p-layer, RF n-layer, n/i buffer layer, RF i-layer, p/i buffer layer, and RF p-layer.

COMPARATIVE EXAMPLE B2

For the sake of comparison, a solar cell (SC-CMP-B2) was also fabricated in the same manner as in the above-described example B2 except that the plasma treatment with hydrogen gas containing a small amount of silane-based gas according to the invention was not performed.

Eight samples were prepared for each type solar cell (SC-EMB-B2 and SC-CMP-B2) for the purpose of evaluation regarding the initial photoelectric conversion efficiency (the ratio of the electric output power to the optical input power), durability under vibration, durability under illumination, and durability under vibration and illumination with an applied bias voltage at a high temperature and high humidity.

The measurement of the initial photoelectric conversion efficiency was performed by measuring the V-I characteristics of the samples under the illumination condition of AM1.5 (100 mW/cm$^2$). Regarding the fill factors (F.F.'s) in the initial photoelectric conversion efficiency and the variations in the characteristics, the measurement results of the SC-EMB-B2 samples relative to those of the SC-CMP-B2 samples are shown below.

[Characteristics associated with the photoelectric conversion efficiency]

| | FF | Variation |
|---|---|---|
| SC-EMB-B2 | 1.10 | 0.86 |

(relative to the values of SC-CMP-B2)

The vibration durability test was performed as follows: After the measurement of the initial photoelectric conversion efficiency, some samples were placed in a dark place kept at 25° C. and 50% relative humidity. Vibration having an amplitude of 0.1 mm and a frequency of 60 Hz was applied to the samples for 500 hr. After that, the photoelectric conversion efficiencies of the samples were measured under the illumination condition of AM1.5 (100 mW/cm$^2$) and the reduction relative to the initial value (the ratio of the photoelectric conversion efficiency after the vibration test to the initial value) was evaluated for each sample. The durability under illumination was evaluated as follows: After the measurement of the initial photoelectric conversion efficiency, some samples were placed in a place kept at 25° C. and 50% relative humidity, and illuminated with light of AM1.5 (100 mW/cm$^2$) for 500 hr. After that, the photoelectric conversion efficiencies of the samples were measured under the illumination condition of AM1.5 (100 mW/cm$^2$) and the reduction relative to the initial value (the ratio of the photoelectric conversion efficiency after the illumination test to the initial value) was evaluated for each sample. The results are shown below regarding the reduction ratios of the photoelectric conversion efficiency after the illumination and vibration tests for the SC-CMP-B2 samples relative to the results of the SC-EMB-B2 samples.

[Reduction ratio of the photoelectric conversion efficiency]

| | Reduction due to vibration | Reduction due to illumination |
|---|---|---|
| SC-CMP-B2 | 0.86 | 0.85 |

(relative to the results of SC-EMB-B2)

Vibration and illumination durability tests were also performed under a biased condition at a high temperature and high humidity as described below: After the measurement of the initial photoelectric conversion efficiency, two samples were placed in a dark place kept at 80° C. and 90% relative humidity, and a forward bias voltage of 0.7 V was applied to both samples. Vibration was applied to one sample under the same conditions as those in the above-described non-biased vibration test, and degradation was evaluated. The other sample was illuminated with light of AM1.5, and degradation was evaluated. The results are shown below regarding the reduction ratios of the photoelectric conversion efficiency after the vibration and illumination tests for the SC-CMP-B2 samples relative to the results of the SC-EMB-B2 samples.

[Reduction ratio of the photoelectric conversion efficiency]

| | Reduction due to vibration | Reduction due to illumination |
|---|---|---|
| SC-CMP-B2 | 0.84 | 0.83 |

(relative to the results of SC-EMB-B2)

The surfaces of the above-described samples were observed via an optical microscope to evaluate film separation. No film separation was observed in the SC-EMB-B2 samples, whereas slight film separation was observed in the SC-CMP-B2 samples.

From the above results, it can be concluded that the solar cells (SC-EMB-B2) according to the present invention are better in the fill factor of photoelectric conversion efficiency characteristics, uniformity or reproducibility of characteristics, adhesion, and durability than the conventional solar cells (SC-CMP-B2).

EXAMPLE B3 ACCORDING TO THE INVENTION

A solar cell, having a triple structure such as that shown in FIG. 6 was fabricated using the deposition equipment shown in FIG. 7. A substrate 490 was prepared according to a similar process to that in the example B1 such that a reflection layer 101 and a reflection enhancing layer 102 were formed on a base. The substrate 490 was placed on the substrate transfer rail 413 in the load chamber 401, and the load chamber 401 was evacuated with the vacuum pump (not shown) down to a pressure of about $1\times10^{-5}$ Torr. Then, the gate valve 406 was opened, and the substrate 490 was transferred to the deposition chamber 417 via the transfer chamber 402 wherein both deposition chamber 417 and transfer chamber 402 had already been evacuated with the vacuum pump (not shown). The substrate 490 was placed such that the back surface of the substrate 490 came into contact with the heater 410 so that the substrate 490 was heated. The inside of the deposition chamber 417 was evacuated with the vacuum pump (not shown) down to a pressure of about $1\times10^{-5}$ Torr.

Thus, the preparation for semiconductor film deposition was complete, and an RF n-layer 103 of μc-Si was deposited in a similar manner to that in the example B2.

The gate valve 406 was opened, and the substrate 490 was transferred to the deposition chamber 418 via the transfer chamber 403 wherein the deposition chamber 418 and the transfer chamber 403 had already been evacuated with the vacuum pump (not shown). The substrate 490 was placed such that the back surface of the substrate 490 came into contact with the heater 411 so that the substrate 490 was heated. The inside of the deposition chamber 418 was evacuated with the vacuum pump (not shown) down to a pressure of about $1\times10^{-5}$ Torr.

The substrate was then subjected to plasma treatment with hydrogen gas containing a small amount of silane-based gas under the conditions shown in Table B3(1), according to the present invention. In this plasma treatment with hydrogen gas containing the small amount of silane-based gas according to the present invention, $SiCl_2H_2$/He (diluted to 1000 ppm) serving as silicon compound gas and $H_2$ were introduced into the deposition chamber 418 via the gas inlet 449 wherein the $H_2$ gas was supplied by opening the valves 463, 453, 450 and its flow rate was adjusted to 400 sccm by means of the mass flow controller 458, and wherein the gas containing $SiCl_2H_2$ was supplied by opening the valves 465 and 455 and its flow rate was controlled by the mass flow controller 460 such that the flow rate of the $SiCl_2H_2$ gas was maintained at 0.08% of the total gas flow rate of $H_2$. Furthermore, the pressure inside the deposition chamber 418 was adjusted to 0.010 Torr by means of the conductance valve (not shown). The substrate 490 was heated by the substrate heater 411 up to 350° C. When the temperature of the substrate had become stable, MW power of 0.1 W/cm$^3$ was introduced from the MW power supply (not shown) into the i-layer deposition chamber 418 via the wave guide 426 and the microwave entrance window 425, thereby exciting a glow discharge. The shutter 427 was then opened, and the substrate was exposed for 4 min to the hydrogen gas plasma containing the small amount of silane-based gas according to the present invention. The MW power was then shut off thereby eliminating the glow discharge. The supply of the $SiCl_2H_2$/He gas (diluted to 1000 ppm) into the deposition chamber 418 was stopped, whereas the $H_2$ gas was fed further for 4 min into the deposition chamber 418. Then, the $H_2$ gas was also shut off, and the inside of the deposition chamber 418 as well as the inside of the gas lines was evacuated down to $1\times10^{-5}$ Torr.

An n/i buffer layer 151 of a-Si, an MW i-layer 114 of a-SiGe, a p/i buffer layer 161 of a-Si, RF p-layer 105 of a-SiC, and RF n-layer 203 of μc-Si were then deposited successively in a similar manner to that in the example B2.

The substrate was then subjected to plasma treatment with hydrogen gas containing a small amount of silane-based gas under the conditions shown in Table B3(2), according to the present invention. In this plasma treatment with hydrogen gas containing the small amount of silane-based gas according to the present invention, $SiH_4/H_2$ (diluted to 1000 ppm) serving as silicon compound gas and $H_2$ were introduced into the deposition chamber 417 via the gas inlet 429 wherein the $H_2$ gas was supplied by opening the valves 441, 431, 430 and its flow rate was adjusted to 500 sccm by means of the mass flow controller 436, and wherein the gas containing $SiH_4$ was supplied by opening the valves 442 and 432 and its flow rate was controlled by the mass flow controller 437 such that the flow rate of the $SiH_4$ gas was maintained at 0.07% of the total gas flow rate of $H_2$. Furthermore, the pressure inside the deposition chamber 417 was adjusted to 1.1 Torr by means of the conductance valve (not shown). The substrate 490 was heated by the substrate heater 410 up to 300° C. When the temperature of the substrate had become stable, RF power of 0.04 W/cm$^3$ was applied by the RF power supply 422 so that a glow discharge occurs in the plasma excitation cup 420. Under the above-described conditions, the substrate was exposed for 3 min to the hydrogen gas plasma containing the small amount of silane-based gas according to the present invention. The RF power was then shut off thereby eliminating the glow discharge. The supply of the $SiH_4/H_2$ gas (diluted to 1000 ppm) into the deposition chamber 417 was stopped, whereas the $H_2$ gas was fed further for 3 min into the deposition chamber 417. Then, the $H_2$ gas was also shut off, and the inside of the deposition chamber 417 as well as the inside of the gas lines was evacuated down to $1\times10^{-5}$ Torr.

Furthermore, an n/i buffer layer 251 of a-Si, an MW i-layer 214 of a-SiGe, a p/i buffer layer 261 of a-Si, RF p-layer 205 of a-SiC, and RF n-layer 206 of μc-Si were deposited successively in a similar manner to that in the example B2.

The substrate was then subjected to plasma treatment with hydrogen gas containing a small amount of silane-based gas under the conditions shown in Table B3(3), according to the present invention. In this plasma treatment with hydrogen gas containing the small amount of silane-based gas according to the present invention, $SiH_4/H_2$ (diluted to 1000 ppm) serving as silicon compound gas and $H_2$ were introduced into the deposition chamber 417 via the gas inlet 429 wherein the $H_2$ gas was supplied by opening the valves 441, 431, 430 and its flow rate was adjusted to 700 sccm by means of the mass flow controller 436, and wherein the gas containing $SiH_4$ was supplied by opening the valves 442 and 432 and its flow rate was controlled by the mass flow controller 437 such that the flow rate of the $SiH_4$ gas was maintained at 0.04% of the total gas flow rate of $H_2$. Furthermore, the pressure inside the deposition chamber 417 was adjusted to 1.0 Torr by means of the conductance valve (not shown). The substrate 490 was heated by the substrate heater 410 up to 230° C. When the temperature of the substrate had become stable, RF power of 0.03 W/cm$^3$ was applied by the RF power supply 422 so that a glow discharge occurs in the plasma excitation cup 420. Under the above-described conditions, the substrate was exposed for 2 min to the hydrogen gas plasma containing the small amount of silane-based gas according to the present invention. The RF power was then shut off thereby eliminating the glow discharge. The supply of the $SiH_4/H_2$ gas (diluted to 1000 ppm) into the deposition chamber 417 was stopped, whereas the $H_2$ gas was fed further for 3 min into the deposition chamber 417. Then, the $H_2$ gas was also shut off, and the inside of the deposition chamber 417 as well as the inside of the gas lines was evacuated down to $1\times10^{-5}$ Torr.

Furthermore, an n/i buffer layer 351 of a-SiC, an RF i-layer 314 of a-Si, a p/i buffer layer 361 of a-Si, and an RF p-layer 305 of a-Si were deposited successively in a similar manner to that in the example B2.

ITO was then evaporated onto the RF p-layer 305 so as to form a transparent conductive layer 112 having a thickness of 70 nm.

A mask having a comb-shaped window was placed on the transparent conductive layer 112, and metal evaporation was performed via the mask thereby forming a comb-shaped collection electrode 113 having a multi-layer structure consisting of Cr(40 nm)/Ag(1000 nm)/Cr(40 nm).

In this way, a complete solar cell according to the invention was obtained. Hereafter, the solar cell of this type will be referred to as SC-EMB-B3. Tables B3(1) through B3(4) summarize the conditions used here in the invention, regarding the plasma treatment in an ambient of hydrogen containing a small amount of silane-based gas as well as the process conditions for the RF n-layer, n/i buffer layer, MW i-layer, p/i buffer layer, RF p-layer, RF n-layer, n/i buffer layer, MW i-layer, p/i buffer layer, RF p-layer, RF n-layer, n/i buffer layer, RF i-layer, p/i buffer layer, and RF p-layer.

COMPARATIVE EXAMPLE B3

For the sake of comparison, a solar cell (SC-CMP-B3) was also fabricated in the same manner as in the above-described example B3 except that the plasma treatment with hydrogen gas containing a small amount of silane-based gas according to the invention was not performed. Eight samples were prepared for each type solar cell (SC-EMB-B3 and SC-CMP-B3) for the purpose of evaluation regarding the initial photoelectric conversion efficiency (the ratio of the electric output power to the optical input power), durability under vibration, durability under illumination, and durability under vibration and illumination with an applied bias voltage at a high temperature and high humidity.

The measurement of the initial photoelectric conversion efficiency was performed by measuring the V-I characteristics of the samples under the illumination condition of AM1.5 (100 mW/$cm^2$). Regarding the fill factor (F.F.) in the initial photoelectric conversion efficiency and the variation in the characteristics, the measurement results of the SC-EMB-B3 samples relative to those of the SC-CMP-B3 samples are shown below.

[Characteristics associated with the photoelectric conversion efficiency]

| | FF | Variation |
|---|---|---|
| C-EMB-B3 | 1.11 | 0.85 |
| (relative to the values of SC-CMP-B3) | | |

The vibration durability test was performed as follows: After the measurement of the initial photoelectric conversion efficiency, some samples were placed in a dark place kept at 25° C. and 50% relative humidity. Vibration having an amplitude of 0.1 mm and a frequency of 60 Hz was applied to the samples for 500 hr. After that, the photoelectric conversion efficiencies of the samples were measured under the illumination condition of AM1.5 (100 mW/$cm^2$) and the reduction relative to the initial value (the ratio of the photoelectric conversion efficiency after the vibration test to the initial value) was evaluated for each sample.

The durability under illumination was evaluated as follows: After the measurement of the initial photoelectric conversion efficiency, some samples were placed in a place kept at 25° C. and 50% relative humidity, and illuminated with light of AM1.5 (100 mW/$cm^2$ for 500 hr. After that, the photoelectric conversion efficiencies of the samples were measured under the illumination condition of AM1.5 (100 mW/$cm^2$) and the reduction relative to the initial value (the ratio of the photoelectric conversion efficiency after the illumination test to the initial value) was evaluated for each sample. The results are shown below regarding the reduction ratios of the photoelectric conversion efficiency after the illumination and vibration tests for the SC-CMP-B3 samples relative to the results of the SC-EMB-B3 samples.

[Reduction ratio of the photoelectric conversion efficiency]

| | Reduction due to vibration | Reduction due to illumination |
|---|---|---|
| SC-CMP-B3 | 0.86 | 0.85 |
| (relative to the results of SC-EMB-B3) | | |

Vibration and illumination durability tests were also performed under a biased condition at a high temperature and high humidity as described below: After the measurement of the initial photoelectric conversion efficiency, two samples were placed in a dark place kept at 80° C. and 90% relative humidity, and a forward bias voltage of 0.7 V was applied to both samples. Vibration was applied to one sample under the same conditions as those in the above-described non-biased vibration test, and degradation was evaluated. The other sample was illuminated with light of AM1.5, and degradation was evaluated. The results are shown below regarding the reduction ratios of the photoelectric conversion efficiency after the vibration and illumination tests for the SC-CMP-B3 samples relative to the 20 results of the SC-EMB-B3 samples.

[Reduction ratio of the photoelectric conversion efficiency]

| | Reduction due to vibration | Reduction due to illumination |
|---|---|---|
| SC-CMP-B3 | 0.85 | 0.84 |
| (relative to the results of SC-EMB-B3) | | |

The surfaces of the above-described samples were observed via an optical microscope to evaluate film separation. No film separation was observed in the SC-EMB-B3 samples, whereas slight film separation was observed in the SC-CMP-B3 samples.

From the above results, it can be concluded that the solar cells (SC-EMB-B3) according to the present invention are better in the fill factor of photoelectric conversion efficiency characteristics, uniformity or reproducibility of characteristics, adhesion, and durability than the conventional solar cells (SC-CMP-B3).

EXAMPLE B4

A solar cell, having a triple structure such as that shown in FIG. 6, that is the same structure as that employed in the above-described example B3, was fabricated using the deposition equipment shown in FIG. 7, wherein plasma treatment with hydrogen gas plasma containing a small amount of silane-based gas was performed three times under the conditions shown in Table B4(1). Other fabrication conditions employed are shown in Table B4(2).

The fabricated samples are evaluated in a similar manner to that in the example B3, and the results are shown in Table B4(3).

As can be seen from Table B4(3), it is preferable that the flow rate of hydrogen gas containing a small amount of silane-based gas in the plasma treatment be in the range of 1 to 2000 sccm to obtain good results in the fill factor associated with the photoelectric conversion efficiency, uniformity or reproducibility of characteristics, durability under illumination, adhesion, and overall durability.

EXAMPLE B5

A solar cell, having a triple structure such as that shown in FIG. 6, that is the same structure as that employed in the above-described example B3, was also fabricated using the deposition equipment shown in FIG. 7, wherein plasma treatment with hydrogen gas plasma containing a small amount of silane-based gas was performed three times under the conditions shown in Table B5(1). Other fabrication conditions employed are shown in Table B5(2).

The fabricated samples are evaluated in a similar manner to that in the example B3, and the results are shown in Table B5(3).

In the above example B4, RF power was used to excite hydrogen gas containing a small amount of silane-based gas into a plasma state for use in the plasma treatment according to the invention. In contrast, VHF power was used in this example B5. As can be seen from Table B5(3), also in this case, it is preferable that the flow rate of hydrogen gas be in the range of 1 to 2000 sccm to obtain good results in the fill factor associated with the photoelectric conversion efficiency, uniformity or reproducibility of characteristics, durability under illumination, adhesion, and overall durability.

EXAMPLE B6

A solar cell, having a triple structure such as that shown in FIG. 6, that is the same structure as that employed in the above-described example B3, was also fabricated using the deposition equipment shown in FIG. 7, wherein plasma treatment with hydrogen gas plasma containing a small amount of silane-based gas was performed three times under the conditions shown in Table B6(1). Other fabrication conditions employed are shown in Table B6(2).

The fabricated samples are evaluated in a similar manner to that in the example B3, and the results are shown in Table B6(3).

As can be seen from Table B6(3), it is preferable that the concentration of the silane-based gas added to the hydrogen gas in the plasma treatment of the invention be in the range of 0.001% to 0.1% to obtain good results in the fill factor associated with the photoelectric conversion efficiency, uniformity or reproducibility of characteristics, durability under illumination, adhesion, and overall durability.

EXAMPLE B7

A solar cell, having a triple structure such as that shown in FIG. 6, that is the same structure as that employed in the above-described example B3, was also fabricated using the deposition equipment shown in FIG. 7, wherein plasma treatment with hydrogen gas plasma containing a small amount of silane-based gas was performed three times under the conditions shown in Table B7(1). Other fabrication conditions employed are shown in Table B7(2).

The fabricated samples are evaluated in a similar manner to that in the example B3, and the results are shown in Table B7(3).

In this example B7, VHF power was used to excite hydrogen gas containing a small amount of silane-based gas into a plasma state for use in the plasma treatment according to the invention, whereas RF power was used in the above example B6. As can be seen from Table B7(3), also in this case, it is preferable that the concentration of the silane-based gas added to the hydrogen gas in the plasma treatment of the invention be in the range of 0.001% to 0.1% to obtain good results in the fill factor associated with the photoelectric conversion efficiency, uniformity or reproducibility of characteristics, durability under illumination, adhesion, and overall durability.

EXAMPLE B8

A solar cell, having a triple structure such as that shown in FIG. 6, that is the same structure as that employed in the above-described example B3, was also fabricated using the deposition equipment shown in FIG. 7, wherein plasma treatment with hydrogen gas plasma containing a small amount of silane-based gas was performed three times under the conditions shown in Table B8(1). Other fabrication conditions employed are shown in Table B8(2).

The fabricated samples are evaluated in a similar manner to that in the example B3, and the results are shown in Table B8(3).

In this example B8, MW power was employed to excite hydrogen gas containing a small amount of silane-based gas into a plasma state for use in the plasma treatment according to the invention, whereas RF power was used in the above example B6. As can be seen from Table B8(3), still in this case, it is preferable that the concentration of the silane-based gas added to the hydrogen gas in the plasma treatment of the invention be in the range of 0.001% to 0.1% to obtain good results in the fill factor associated with the photoelectric conversion efficiency, uniformity or reproducibility of characteristics, durability under illumination, adhesion, and overall durability.

EXAMPLE B9

A solar cell, having a triple structure such as that shown in FIG. 6, that is the same structure as that employed in the above-described example B3, was also fabricated using the deposition equipment shown in FIG. 7, wherein plasma treatment with hydrogen gas plasma containing a small amount of silane-based gas was performed three times under the conditions shown in Table B9(1). Other fabrication conditions employed are shown in Table B9(2).

The fabricated samples are evaluated in a similar manner to that in the example B3, and the results are shown in Table B9(3).

In this example B9, RF power was used to excite hydrogen gas containing a small amount of silane-based gas into a plasma state for use in the plasma treatment according to the invention. In this case, as can be seen from Table B9(3), it is preferable that the pressure the hydrogen gas containing a small amount of silane-based gas in the plasma treatment of the invention be in the range of 0.05 Torr to 10 Torr to obtain good results in the fill factor associated with the photoelectric conversion efficiency, uniformity or reproducibility of characteristics, durability under illumination, adhesion, and overall durability.

EXAMPLE B10

A solar cell, having a triple structure such as that shown in FIG. 6, that is the same structure as that employed in the above-described example B3, was also fabricated using the deposition equipment shown in FIG. 7, wherein plasma treatment with hydrogen gas plasma containing a small amount of silane-based gas was performed three times under the conditions shown in Table B10(1). Other fabrication conditions employed are shown in Table B10(2).

The fabricated samples are evaluated in a similar manner to that in the example B3, and the results are shown in Table B10(3).

In this example B10, VHF power was used to excite hydrogen gas containing a small amount of silane-based gas into a plasma state for use in the plasma treatment according to the invention. In this case, as can be seen from Table B10(3), it is preferable that the pressure the hydrogen gas containing a small amount of silane-based gas in the plasma treatment of the invention be in the range of 0.0001 Torr to 1 Torr to obtain good results in the fill factor associated with the photoelectric conversion efficiency, uniformity or reproducibility of characteristics, durability under illumination, adhesion, and overall durability.

EXAMPLE B11

A solar cell, having a triple structure such as that shown in FIG. 6, that is the same structure as that employed in the above-described example B3, was also fabricated using the deposition equipment shown in FIG. 7, wherein plasma treatment with hydrogen gas plasma containing a small amount of silane-based gas was performed three times under the conditions shown in Table B11(1). Other fabrication conditions employed are shown in Table B11(2).

The fabricated samples are evaluated in a similar manner to that in the example B3, and the results are shown in Table B11(3).

In this example B11, MW power was used to excite hydrogen gas containing a small amount of silane-based gas into a plasma state for use in the plasma treatment according to the invention. In this case, as can be seen from Table B11(3), it is preferable that the pressure the hydrogen gas containing a small amount of silane-based gas in the plasma treatment of the invention be in the range of 0.0001 Torr to 0.01 Torr to obtain good results in the fill factor associated with the photoelectric conversion efficiency, uniformity or reproducibility of characteristics, durability under illumination, adhesion, and overall durability.

EXAMPLE B12

A solar cell, having a triple structure such as that shown in FIG. 6, that is the same structure as that employed in the above-described example B3, was also fabricated using the deposition equipment shown in FIG. 7, wherein plasma treatment with hydrogen gas plasma containing a small amount of silane-based gas was performed three times under the conditions shown in Table B12(1). Other fabrication conditions employed are shown in Table B12(2).

The fabricated samples are evaluated in a similar manner to that in the example B3, and the results are shown in Table B12(3).

In this example B12, RF power was used to excite hydrogen gas containing a small amount of silane-based gas into a plasma state for use in the plasma treatment according to the invention. In this case, as can be seen from Table B12(3), it is preferable that the power density (electric power density) in the plasma treatment with hydrogen gas containing a small amount of silane-based gas be in the range of 0.01 W/cm$^3$ to 1.0 W/cm$^3$ to obtain good results in the fill factor associated with the photoelectric conversion efficiency, uniformity or reproducibility of characteristics, durability under illumination, adhesion, and overall durability.

EXAMPLE B13

A solar cell, having a triple structure such as that shown in FIG. 6, that is the same structure as that employed in the above-described example B3, was also fabricated using the deposition equipment shown in FIG. 7, wherein plasma treatment with hydrogen gas plasma containing a small amount of silane-based gas was performed three times under the conditions shown in Table B13(1). Other fabrication conditions employed are shown in Table B13(2).

The fabricated samples are evaluated in a similar manner to that in the example B3, and the results are shown in Table B13(3).

In this example B13, VHF power was used to excite hydrogen gas containing a small amount of silane-based gas into a plasma state for use in the plasma treatment according to the invention. In this case, as can be seen from Table B13(3), it is preferable that the power density (electric power density) in the plasma treatment with hydrogen gas containing a small amount of silane-based gas be in the range of 0.01 W/cm$^3$ to 1.0 W/cm$^3$ to obtain good results in the fill factor associated with the photoelectric conversion efficiency, uniformity or reproducibility of characteristics, durability under illumination, adhesion, and overall durability.

EXAMPLE B14

A solar cell, having a triple structure such as that shown in FIG. 6, that is the same structure as that employed in the above-described example B3, was also fabricated using the deposition equipment shown in FIG. 7, wherein plasma treatment with hydrogen gas plasma containing a small amount of silane-based gas was performed three times under the conditions shown in Table B14(1). Other fabrication conditions employed are shown in Table B14(2).

The fabricated samples are evaluated in a similar manner to that in the example B3, and the results are shown in Table B14(3).

In this example B14, MW power was used to excite hydrogen gas containing a small amount of silane-based gas into a plasma state for use in the plasma treatment according to the invention. In this case, as can be seen from Table B13(3), it is preferable that the power density (electric power density) in the plasma treatment with hydrogen gas containing a small amount of silane-based gas be in the range of 0.1 W/cm$^3$ to 10 W/cm$^3$ to obtain good results in the fill factor associated with the photoelectric conversion efficiency, uniformity or reproducibility of characteristics, durability under illumination, adhesion, and overall durability.

EXAMPLE B15

A solar cell, having a triple structure such as that shown in FIG. 6, that is the same structure as that employed in the above-described example B3, was also fabricated using the deposition equipment shown in FIG. 7, wherein plasma treatment with hydrogen gas plasma containing a small amount of silane-based gas was performed three times under the conditions shown in Table B15(1). Other fabrication conditions employed are shown in Table B15(2).

The fabricated samples are evaluated in a similar manner to that in the example B3, and the results are shown in Table B15(3).

In this example B15, RF power was used to excite hydrogen gas containing a small amount of silane-based gas into a plasma state for use in the plasma treatment according to the invention. In this case, as can be seen from Table B15(3), it is preferable that the substrate temperature in the plasma treatment with hydrogen gas containing a small amount of silane-based gas be in the range of 100° C. to 400° C. to obtain good results in the fill factor associated with the photoelectric conversion efficiency, uniformity or reproducibility of characteristics, durability under illumination, adhesion, and overall durability.

EXAMPLE B16

A solar cell, having a triple structure such as that shown in FIG. 6, that is the same structure as that employed in the above-described example B3, was also fabricated using the deposition equipment shown in FIG. 7, wherein plasma treatment with hydrogen gas plasma containing a small amount of silane-based gas was performed three times under the conditions shown in Table B16(1). Other fabrication conditions employed are shown in Table B16(2).

The fabricated samples are evaluated in a similar manner to that in the example B3, and the results are shown in Table B16(3).

In this example B16, VHF power was used to excite hydrogen gas containing a small amount of silane-based gas into a plasma state for use in the plasma treatment according to the invention. In this case, as can be seen from Table B16(3), it is preferable that the substrate temperature in the plasma treatment with hydrogen gas containing a small amount of silane-based gas be in the range of 50° C. to 300° C. to obtain good results in the fill factor associated with the photoelectric conversion efficiency, uniformity or reproducibility of characteristics, durability under illumination, adhesion, and overall durability.

EXAMPLE B17

A solar cell, having a triple structure such as that shown in FIG. 6, that is the same structure as that employed in the above-described example B3, was also fabricated using the deposition equipment shown in FIG. 7, wherein plasma treatment with hydrogen gas plasma containing a small amount of silane-based gas was performed three times under the conditions shown in Table B17(1). Other fabrication conditions employed are shown in Table B17(2).

The fabricated samples are evaluated in a similar manner to that in the example B3, and the results are shown in Table B17(3).

In this example B17, MW power was used to excite hydrogen gas containing a small amount of silane-based gas into a plasma state for use in the plasma treatment according to the invention. In this case, as can be seen from Table B17(3), it is preferable that the substrate temperature in the plasma treatment with hydrogen gas containing a small amount of silane-based gas be in the range of 50° C. to 300° C. to obtain good results in the fill factor associated with the photoelectric conversion efficiency, uniformity or reproducibility of characteristics, durability under illumination, series resistance, and overall durability.

EXAMPLE B18 ACCORDING TO THE INVENTION

A solar cell, having a triple structure such as that shown in FIG. 6 was fabricated using the deposition equipment shown in FIG. 7. A substrate 490 was prepared according to a similar process to that in the example B1 such that a reflection layer 101 and a reflection enhancing layer 102 were formed on a base. The substrate 490 was placed on the substrate transfer rail 413 in the load chamber 401, and the load chamber 401 was evacuated with the vacuum pump (not shown) down to a pressure of about $1\times10^{-5}$ Torr. Then, the gate valve 406 was opened, and the substrate 490 was transferred to the deposition chamber 417 via the transfer chamber 402 wherein both deposition chamber 417 and transfer chamber 402 had already been evacuated with the vacuum pump (not shown). The substrate 490 was placed such that the back surface of the substrate 490 came into contact with the heater 410 so that the substrate 490 was heated. The inside of the deposition chamber 417 was evacuated with the vacuum pump (not shown) down to a pressure of about $1\times10^{-5}$ Torr.

The substrate was then subjected to plasma treatment with hydrogen gas containing a small amount of silane-based gas under the conditions shown in Table B18(1), according to the present invention. In this plasma treatment with hydrogen gas containing the small amount of silane-based gas according to the present invention, $SiH_4/H_2$ (diluted to 1000 ppm) serving as silicon compound gas and $H_2$ were introduced into the deposition chamber 417 via the gas inlet 429 wherein the $H_2$ gas was supplied by opening the valves 441, 431, 430 and its flow rate was adjusted to 800 sccm by means of the mass flow controller 436, and wherein the gas containing $SiH_4$ was supplied by opening the valves 442 and 432 and its flow rate was controlled by the mass flow controller 437 such that the flow rate of the $SiH_4$ gas was maintained at 0.05% of the total gas flow rate of $H_2$. Furthermore, the pressure inside the deposition chamber 417 was adjusted to 1.0 Torr by means of the conductance valve (not shown). The substrate 490 was heated by the substrate heater 410 up to 360° C. When the temperature of the substrate had become stable, RF power of 0.03 W/cm$^3$ was applied by the RF power supply 422 so that a glow discharge occurs in the plasma excitation cup 420. Under the above-described conditions, the substrate was exposed for 3 min to the hydrogen gas plasma containing the small amount of silane-based gas according to the present invention. The RF power was then shut off thereby eliminating the glow discharge. The supply of the $SiH_4/H_2$ gas (diluted to 1000 ppm) into the deposition chamber 417 was stopped, whereas the $H_2$ gas was fed further for 5 min into the deposition chamber 417. Then, the $H_2$ gas was also shut off, and the inside of the deposition chamber 417 as well as the inside of the gas lines was evacuated down to $1\times10^{-5}$ Torr. Thus, the preparation for semiconductor film deposition was complete, and an RF n-layer was 103 of μc-Si was deposited on the substrate in a similar manner to that in the example B2.

The substrate was then subjected to plasma treatment with hydrogen gas containing a small amount of silane-based gas under the conditions shown in Table B18(2), according to the present invention. In this plasma treatment with hydrogen gas containing the small amount of silane-based gas according to the present invention, $SiH_4/H_2$ (diluted to 1000 ppm) serving as silicon compound gas and $H_2$ were introduced into the deposition chamber 417 via the gas inlet 429 wherein the $H_2$ gas was supplied by opening the valves 441, 431, 430 and its flow rate was adjusted to 700 sccm by means of the mass flow controller 436, and wherein the gas containing $SiH_4$ was supplied by opening the valves 442 and 432 and its flow rate was controlled by the mass flow controller 437 such that the flow rate of the $SiH_4$ gas was maintained at 0.04% of the total gas flow rate of $H_2$. Furthermore, the pressure inside the deposition chamber 417 was adjusted to 0.9 Torr by means of the conductance valve (not shown). The substrate 490 was heated by the substrate heater 410 up to 350° C. When the temperature of the substrate had become stable, RF power of 0.03 W/$cm^3$ was applied by the RF power supply 422 so that a glow discharge occurs in the plasma excitation cup 420. Under the above-described conditions, the substrate was exposed for 3 min to the hydrogen gas plasma containing the small amount of silane-based gas according to the present invention. The RF power was then shut off thereby eliminating the glow discharge. The supply of the $SiH_4/H_2$ gas (diluted to 1000 ppm) into the deposition chamber 417 was stopped, whereas the $H_2$ gas was fed further for 5 min into the deposition chamber 417. Then, the $H_2$ gas was also shut off, and the inside of the deposition chamber 417 as well as the inside of the gas lines was evacuated down to $1\times10^{-5}$ Torr.

The gate valve 407 was opened, and the substrate 490 was transferred to the deposition chamber 418 via the transfer chamber 403 wherein the deposition chamber 418 and the transfer chamber 403 had already been evacuated with the vacuum pump (not shown). The substrate 490 was placed such that the back surface of the substrate 490 came into contact with the heater 411 so that the substrate 490 was heated. The inside of the deposition chamber 418 was evacuated with the vacuum pump (not shown) down to a pressure of about $1\times10^{-5}$ Torr. Furthermore, an n/i buffer layer 151 of a-Si, an MW i-layer 114 of a-SiGe, a p/i buffer layer 161 of a-Si, RF p-layer 105 of a-SiC, and RF n-layer 106 of μc-Si were deposited successively in a similar manner to that in the example B2.

The substrate was then subjected to plasma treatment with hydrogen gas containing a small amount of silane-based gas under the conditions shown in Table B18(3), according to the present invention. In this plasma treatment with hydrogen gas containing the small amount of silane-based gas according to the present invention, $SiH_4/H_2$ (diluted to 1000 ppm) serving as silicon compound gas and $H_2$ were introduced into the deposition chamber 417 via the gas inlet 429 wherein the $H_2$ gas was supplied by opening the valves 441, 431, 430 and its flow rate was adjusted to 600 sccm by means of the mass flow controller 436, and wherein the gas containing $SiH_4$ was supplied by opening the valves 442 and 432 and its flow rate was controlled by the mass flow controller 437 such that the flow rate of the $SiH_4$ gas was maintained at 0.04% of the total gas flow rate of $H_2$. Furthermore, the pressure inside the deposition chamber 417 was adjusted to 0.9 Torr by means of the conductance valve (not shown). The substrate 490 was heated by the substrate heater 410 up to 300° C. When the temperature of the substrate had become stable, RF power of 0.03 W/$cm^3$ was applied by the RF power supply 422 so that a glow discharge occurs in the plasma excitation cup 420. Under the above-described conditions, the substrate was exposed for 3 min to the hydrogen gas plasma containing the small amount of silane-based gas according to the present invention. The RF power was then shut off thereby eliminating the glow discharge. The supply of the $SiH_4/H_2$ gas (diluted to 1000 ppm) into the deposition chamber 417 was stopped, whereas the $H_2$ gas was fed further for 3 min into the deposition chamber 417. Then, the $H_2$ gas was also shut off, and the inside of the deposition chamber 417 as well as the inside of the gas lines was evacuated down to $1\times10^{-5}$ Torr. Furthermore, an n/i buffer layer 251 of a-Si, an MW i-layer 214 of a-SiGe, a p/i buffer layer 261 of a-Si, RF p-layer 205 of a-SiC, and RF n-layer 303 of μc-Si were deposited successively in a similar manner to that in the example B2.

The substrate was then subjected to plasma treatment with hydrogen gas containing a small amount of silane-based gas under the conditions shown in Table B18(4), according to the present invention. In this plasma treatment with hydrogen gas containing the small amount of silane-based gas according to the present invention, $SiH_4/H_2$ (diluted to 1000 ppm) serving as silicon compound gas and $H_2$ were introduced into the deposition chamber 417 via the gas inlet 429 wherein the $H_2$ gas was supplied by opening the valves 441, 431, 430 and its flow rate was adjusted to 500 sccm by means of the mass flow controller 436, and wherein the gas containing $SiH_4$ was supplied by opening the valves 442 and 432 and its flow rate was controlled by the mass flow controller 437 such that the flow rate of the $SiH_4$ gas was maintained at 0.03% of the total gas flow rate of $H_2$. Furthermore, the pressure inside the deposition chamber 417 was adjusted to 0.8 Torr by means of the conductance valve (not shown). The substrate 490 was heated by the substrate heater 410 up to 230° C. When the temperature of the substrate had become stable, RF power of 0.03 W/$cm^3$ was applied by the RF power supply 422 so that a glow discharge occurs in the plasma excitation cup 420. Under the above-described conditions, the substrate was exposed for 2 min to the hydrogen gas plasma containing the small amount of silane-based gas according to the present invention. The RF power was then shut off thereby eliminating the glow discharge. The supply of the $SiH_4/H_2$ gas (diluted to 1000 ppm) into the deposition chamber 417 was stopped, whereas the $H_2$ gas was fed further for 3 min into the deposition chamber 417. Then, the $H_2$ gas was also shut off, and the inside of the deposition chamber 417 as well as the inside of the gas lines was evacuated down to $1\times10^{-5}$ Torr. Furthermore, an n/i buffer layer 351 of a-SiC, an RF i-layer 314 of a-Si, a p/i buffer layer 361 of a-Si, and an RF p-layer 305 of a-Si were deposited successively by means of RFPCVD in a similar manner to that in the example B2.

ITO was then evaporated onto the RF p-layer 305 so as to form a transparent conductive layer 112 having a thickness of 70 nm.

A mask having a comb-shaped window was placed on the transparent conductive layer 112, and metal evaporation was performed via the mask thereby forming a comb-shaped collection electrode 113 having a multi-layer structure consisting of Cr(40 nm)/Ag(1000 nm)/Cr(40 nm). In this way, a complete solar cell according to the invention was obtained. Hereafter, the solar cell of this type will be referred to as SC-EMB-B18. Tables B18(1) through B18(5) summarize the conditions used here in the invention, regarding the plasma treatment in an ambient of hydrogen containing a small amount of silane-based gas as well as the process conditions for the RF n-layer, n/i buffer layer, MW i-layer, p/i buffer layer, RF p-layer, RF n-layer, n/i buffer layer, MW i-layer, p/i buffer layer, RF p-layer, RF n-layer, n/i buffer layer, RF i-layer, p/i buffer layer, and RF p-layer.

COMPARATIVE EXAMPLE B18

For the sake of comparison, a solar cell (SC-CMP-B18) was also fabricated in the same manner as in the above-described example B18 except that the plasma treatment with hydrogen gas containing a small amount of silane-based gas according to the invention was not performed.

Seven samples were prepared for each type solar cell (SC-EMB-B18 and SC-CMP-B18) for the purpose of evaluation regarding the initial photoelectric conversion efficiency (the ratio of the electric output power to the optical input power), overall durability, durability under illumination, and overall durability and illumination with an applied bias voltage at a high temperature and high humidity.

The measurement of the initial photoelectric conversion efficiency was performed by measuring the V-I characteristics of the samples under the illumination condition of AM1.5 (100 $mW/cm^2$). Regarding the fill factor (F.F.) in the initial photoelectric conversion efficiency and the variation in the characteristics, the measurement results of the SC-EMB-B18 samples relative to those of the SC-CMP-B18 samples are shown below.

| [Characteristics associated with the photoelectric conversion efficiency] | FF | Variation |
|---|---|---|
| SC-EMB-B18 | 1.12 | 0.84 |
| (relative to the values of SC-CMP-B18) | | |

The vibration durability test was performed as follows: After the measurement of the initial photoelectric conversion efficiency, some samples were placed in a dark place kept at 25° C. and 50% relative humidity. Vibration having an amplitude of 0.1 mm and a frequency of 60 Hz was applied to the samples for 500 hr. After that, the photoelectric conversion efficiencies of the samples were measured under the illumination condition of AM1.5 (100 $mW/cm^2$) and the reduction relative to the initial value (the ratio of the photoelectric conversion efficiency after the vibration test to the initial value) was evaluated for each sample.

The durability under illumination was evaluated as follows: After the measurement of the initial photoelectric conversion efficiency, some samples were placed in a place kept at 25° C. and 50% relative humidity, and illuminated with light of AM1.5 (100 $mW/cm^2$ for 500 hr. After that, the photoelectric conversion efficiencies of the samples were measured under the illumination condition of AM1.5 (100 $mW/cm^2$) and the reduction relative to the initial value (the ratio of the photoelectric conversion efficiency after the illumination test to the initial value) was evaluated for each sample. The results are shown below regarding the reduction ratios of the photoelectric conversion efficiency after the illumination and vibration tests for the SC-CMP-B18 samples relative to the results of the SC-EMB-B18 samples.

| [Reduction ratio of the photoelectric conversion efficiency] | Reduction due to vibration | Reduction due to illumination |
|---|---|---|
| SC-CMP-B18 | 0.85 | 0.84 |
| (relative to the results of SC-EMB-B18) | | |

Vibration and illumination durability tests were also performed under a biased condition at a high temperature and high humidity as described below: After the measurement of the initial photoelectric conversion efficiency, two samples were placed in a dark place kept at 80° C. and 90% relative humidity, and a forward bias voltage of 0.7 V was applied to both samples. Vibration was applied to one sample under the same conditions as those in the above-described non-biased vibration test, and degradation was evaluated. The other sample was illuminated with light of AM1.5, and degradation was evaluated. The results are shown below regarding the reduction ratios of the photoelectric conversion efficiency after the vibration and illumination tests for the SC-CMP-B18 samples relative to the results of the SC-EMB-B18 samples.

| [Reduction ratio of the photoelectric conversion efficiency] | Reduction due to vibration | Reduction due to illumination |
|---|---|---|
| SC-CMP-B18 | 0.84 | 0.83 |
| (relative to the results of SC-EMB-B18) | | |

The surfaces of the above-described samples were observed via an optical microscope to evaluate film separation. No film separation was observed in the SC-EMB-B18 samples, whereas slight film separation was observed in the SC-CMP-B18 samples.

From the above results, it can be concluded that the solar cells (SC-EMB-B18) according to the present invention are better in the fill factor of photoelectric conversion efficiency characteristics, uniformity or reproducibility of characteristics, optical durability, adhesion, and overall durability than the conventional solar cells (SC-CMP-B18). In the above-described examples of solar cells according to the present invention, semiconductor layers were deposited on a substrate in the order n-layer, n/i buffer layer, i-layer, p/i buffer layer, and p-layer. Similar experiments were also performed for the structure in which semiconductor layers were deposited in the opposite order, that is, p-layer, p/i buffer layer, i-layer, n/i buffer layer, and n-layer wherein plasma treatment according to the present invention was performed between the n-layer and the n/i buffer layer. Also in this case, the fabricated solar cells showed excellent performance similar to the above-described examples.

EXAMPLE C1 ACCORDING TO THE INVENTION

A solar cell having a structure such as that shown in FIG. 2 was made using the deposition equipment shown in FIG. 7. First, a substrate was prepared. A stainless-steel base 100 having dimensions of 0.5 mm in thickness and 50×50 $mm^2$ in area was cleaned with acetone and isopropanol by means of ultrasonic cleaning, and then dried with hot air.

An Ag optical reflection layer 101 having a thickness of 0.3 μm was deposited on a surface of the stainless-steel base 100 using a sputtering technique at room temperature, and a 1.0-μm-thick ZnO layer acting as a reflection enhancing layer 102 was further deposited on it at 350° C. Thus, the complete substrate was prepared.

Using the deposition equipment 400 having the capabilities of both MWPCVD and RFPCVD, semiconductor layers were then deposited on the reflection enhancing layer 102.

The deposition equipment 400 was used in a state in which source gas cylinders (not shown) were connected to the deposition equipment 400 via gas inlets. The source gas cylinders used here were all of ultra high purity type, including $SiH_4$, $SiF_4$, $CH_4$, $GeH_4$, $GeF_4$, $Si_2H_6$, $PH_3/H_2$ (diluted to 2000 ppm, 1%, 10%), $PF_3/H_2$ (diluted to 2000 ppm, 1%, 10%), $B_2H_6/H_2$ (diluted to 2000 ppm), $H_2$, He, $SiCl_2H_2$, and $SiH_4/H_2$ (diluted to 1000 ppm) gas cylinders.

The substrate 490 on which the optical reflection layer 101 and the reflection enhancing layer 102 had been formed was placed on the substrate transfer rail 413 in the load chamber 401, and the load chamber 401 was evacuated with the vacuum pump (not shown) down to a pressure of about $1\times10^{-5}$ Torr. Then, the gate valve 406 was opened, and the substrate 490 was transferred to the deposition chamber 417 via the transfer chamber 402 wherein both deposition chamber 417 and transfer chamber 402 had already been evacuated with the vacuum pump (not shown). The substrate 490 was placed such that the back surface of the substrate 490 came into contact with the heater 410 so that the substrate 490 was heated. The inside of the deposition chamber 417 was evacuated with the vacuum pump (not shown) down to a pressure of about $1\times10^{-5}$ Torr.

In this way, the preparation for semiconductor film deposition was complete, and thus an RF n-layer 103 of μc-Si was deposited as follows. To deposit the RF n-layer of μc-Si, $H_2$ gas was introduced into the deposition chamber 417 via the gas inlet 429, wherein the $H_2$ gas was supplied by opening the valves 441, 431, 430 and its flow rate was adjusted to 200 sccm by means of the mass flow controller 436. Furthermore, the pressure inside the deposition chamber 417 was adjusted to 1.2 Torr by means of the conductance valve (not shown). The substrate 490 was heated by the substrate heater 410 up to 360° C. When the temperature of the substrate had become stable, the valves 443, 433, 444, and 434 were opened whereby $SiH_4$ gas and $PH_3/H_2$ gas (diluted to 1%) were introduced into the deposition chamber 417 via the gas inlet 429. The flow rates of $SiH_4$, $H_2$, and $PH_3/H_2$ (diluted to 1%) were adjusted to 1.5 sccm, 250 sccm, and 15 sccm, respectively, by the mass flow controllers 438, 436, and 439. The pressure inside the deposition chamber 417 was adjusted to 1.1 Torr. RF power of 0.06 W/cm$^3$ was applied by the RF power supply 422 so that a glow discharge occurs in the plasma excitation cup 420, and thus deposition of the RF n-layer was started. When the thickness of the deposited RF n-layer had reached 20 nm, the RF power was shut off thereby eliminating the glow discharge. Thus, the deposition of the RF n-layer 103 was complete. The supply of $SiH_4$ and $PH_3/H_2$ into the deposition chamber 417 was stopped, whereas $H_2$ was fed further for 5 min into the deposition chamber 417. Then, $H_2$ was also shut off, and the inside of the deposition chamber 417 as well as the inside of the gas lines was evacuated down to $1\times10^{-5}$ Torr.

The substrate was then subjected to plasma treatment with hydrogen gas containing a small amount of Group V element according to the present invention. In this plasma treatment with hydrogen gas containing the small amount of Group V element according to the present invention, $PH_3/H_2$ (diluted to 1%) serving as Group V element, $SiH_4$ serving as silicon compound gas, and $H_2$ gas were introduced into the deposition chamber 417 via the gas inlet 429. The $H_2$ gas was supplied by opening the valves 441, 431, 430 and its flow rate was adjusted to 1000 sccm by means of the mass flow controller 436. The Group-V-element compound gas $PH_3$ was supplied by opening the valves 444 and 434 and its flow rate was controlled by the mass flow controller 439 such that the flow rate of the $PH_3$ gas was maintained at 0.4% of the total gas flow rate of $H_2$. The silicon compound gas or $SiH_4$ was supplied by opening the valves 443 and 433 and its flow rate was controlled by the mass flow controller 438 such that the flow rate of the $SiH_4$ gas was maintained at 0.04% of the total gas flow rate of $H_2$. Furthermore, the pressure inside the deposition chamber 417 was adjusted to 0.9 Torr by means of a conductance valve (not shown). The substrate 490 was heated by the substrate heater 410 up to 360° C. When the temperature of the substrate had become stable, RF power of 0.05 W/cm$^3$ was applied by the RF power supply 422 so that a glow discharge occurs in the plasma excitation cup 420. Under the above-described conditions, the substrate was exposed for 4 min to the hydrogen gas plasma containing the small amount of Group V element according to the present invention. The RF power was then shut off thereby eliminating the glow discharge. The supply of the $PH_3/H_2$ gas and $SiH_4/H_2$ gas into the deposition chamber 417 was stopped, whereas the $H_2$ gas was fed further for 5 min into the deposition chamber 417. Then, the $H_2$ gas was also shut off, and the inside of the deposition chamber 417 as well as the inside of the gas lines was evacuated down to $1\times10^{-5}$ Torr.

An n/i buffer layer 151 of a-Si, an MW i-layer 114 of a-SiGe, and a p/i buffer layer 161 of a-Si were then deposited successively by means of RFPCD, MWPCVD, and RFPCVD, respectively, as described below.

The gate valve 407 was opened, and the substrate 490 was transferred to the i-layer deposition chamber 418 via the transfer chamber 403 wherein both deposition chamber 418 and transfer chamber 403 had already been evacuated with the vacuum pump (not shown). The substrate 490 was placed such that the back surface of the substrate 490 came into contact with the heater 411 so that the substrate 490 was heated. The inside of the i-layer deposition chamber 418 was evacuated with the vacuum pump (not shown) down to a pressure of about $1\times10^{-5}$ Torr.

To deposit the n/i buffer layer 151, the substrate 490 was heated by the substrate heater 411 up to 360° C. When the substrate had been heated enough, the valves 464, 454, 450, 463, and 453 were opened gradually whereby $Si_2H_6$ and $H_2$ were introduced into the i-layer deposition chamber 418 via the gas inlet 449. The flow rates of $Si_2H_6$ and $H_2$ were adjusted to 3.5 sccm and 90 sccm, respectively, by the mass flow controllers 459, and 458. The pressure inside the i-layer deposition chamber 418 was adjusted to 0.8 Torr by adjusting the opening ratio of the conductance valve (not shown). Then, RF power of 0.05 W/cm$^3$ was applied to the bias bar 428 by the RF power supply 424, thereby exciting a glow discharge. The shutter 427 was then opened, and thus deposition of the n/i buffer layer onto the RF n-layer was started. When the thickness of the deposited n/i buffer layer had reached 10 nm, the glow discharge was stopped, and the power supply 424 was shut off. Thus, the deposition of the n/i buffer layer 151 was complete. The valves 464 and 454 were closed so as to stop the supply of $Si_2H_6$ to the i-layer deposition chamber 418, whereas $H_2$ was fed further for 2 min into the i-layer deposition chamber 418. Then, the valves 453 and 450 were closed, and the inside of the i-layer deposition chamber 418 as well as the inside of the gas lines was evacuated down to $1\times10^{-5}$ Torr.

The MW i-layer 114 was then deposited as follows: the substrate 490 was heated by the substrate heater 411 up to 360° C. When the substrate had been heated enough, the valves 461, 451, 450, 462, 452, 463, and 453 were opened gradually whereby $SiH_4$, $GeH_4$, and $H_2$ were introduced into the i-layer deposition chamber 418 via the gas inlet 449.

The flow rates of $SiH_4$, $GeH_4$, and $H_2$ were adjusted to 38 sccm, 37 sccm, and 120 sccm, respectively, by the mass flow controllers 456, 457, and 458. The pressure inside the i-layer deposition chamber 418 was adjusted to 5 mTorr by adjusting the opening ratio of the conductance valve (not shown). Then, RF power of 0.60 W/cm$^3$ was applied to the bias bar 428 by the RF power supply 424. Furthermore, MW power of 0.25 W/cm$^3$ was introduced from the MW power supply (not shown) into the i-layer deposition chamber 418 via the wave guide 426 and the microwave entrance window 425, thereby exciting a glow discharge. The shutter 427 was then opened, and thus deposition of the MW i-layer 114 onto the n/i buffer layer was started. When the thickness of the deposited MW i-layer 114 had reached 0.15 μm, the MW glow discharge was stopped, and the bias power supply 424 was shut off. Thus, the deposition of the MW i-layer 114 was complete. The valves 451 and 452 were closed so as to stop the supply of $SiH_4$ and $GeH_4$ to the i-layer deposition chamber 418, whereas $H_2$ was fed further for 2 min into the i-layer deposition chamber 418. Then, the valves 453 and 450 were closed, and the inside of the i-layer deposition chamber 418 as well as the inside of the gas lines was evacuated down to $1\times10^{-5}$ Torr.

To deposit the p/i buffer layer 161, the substrate 490 was heated by the substrate heater 411 up to 250° C. When the substrate had been heated enough, the valves 464, 454, 450, 463, and 453 were opened gradually whereby $Si_2H_6$ and $H_2$ were introduced into the i-layer deposition chamber 418 via the gas inlet 449. The flow rates of $Si_2H_6$ and $H_2$ were adjusted to 2 sccm and 80 sccm, respectively, by the mass flow controllers 459, and 458. The pressure inside the i-layer deposition chamber 418 was adjusted to 0.7 Torr by adjusting the opening ratio of the conductance valve (not shown). Then, RF power of 0.04 W/cm$^3$ was applied to the bias bar 428 by the RF power supply 424, thereby exciting a glow discharge. The shutter 427 was then opened, and thus deposition of the p/i buffer layer onto the MW i-layer was started. When the thickness of the deposited p/i buffer layer had reached 20 nm, the glow discharge was stopped, and the power supply 424 was shut off. Thus, the deposition of the p/i buffer layer 161 was complete. The valves 464 and 454 were closed so as to stop the supply of $Si_2H_6$ to the i-layer deposition chamber 418, whereas $H_2$ was fed further for 2 min into the i-layer deposition chamber 418. Then, the valves 453 and 450 were closed, and the inside of the i-layer deposition chamber 418 as well as the inside of the gas lines was evacuated down to $1\times10^{-5}$ Torr.

To deposit the RF p-layer 105 of a-SiC, the gate valve 408 was opened, and the substrate 490 was transferred to the p-layer deposition chamber 419 via the transfer chamber 404, wherein both deposition chamber 419 and transfer chamber 404 had already been evacuated with the vacuum pump (not shown). The substrate 490 was placed such that the back surface of the substrate 490 came into contact with the heater 412 so that the substrate 490 was heated. The inside of the p-layer deposition chamber 419 was evacuated with the vacuum pump (not shown) down to a pressure of about $1\times10^{-5}$ Torr.

The substrate 490 was heated by the substrate heater 412 up to 200° C. When the temperature of the substrate had become stable, the valves 481, 471, 470, 482, 472, 483, 473, 484, and 474 were opened whereby $H_2$ gas, $SiH_4/H_2$ gas, $B_2H_6/H_2$ gas, and $CH_4$ gas were introduced into the deposition chamber 419 via the gas inlet 469. The flow rates of the $H_2$, $SiH_4/H_2$, $B_2H_6/H_2$, and $CH_4$, were adjusted to 70 sccm, 2 sccm, 8 sccm, and 0.3 sccm, respectively, by the mass flow controllers 476, 477, 478, and 479. The pressure inside the chamber 419 was adjusted to 1.8 Torr by adjusting the opening ratio of the conductance valve (not shown). RF power of 0.07 W/cm$^3$ was applied by the RF power supply 423 so that a glow discharge occurs in the plasma excitation cup 421, and thus deposition of the RF p-layer onto the p/i buffer layer was started. When the thickness of the deposited RF p-layer had reached 10 nm, the RF power was shut off thereby eliminating the glow discharge. Thus, the deposition of the RF p-layer 105 was complete. The valves 472, 482, 473, 483, 474, and 484 were closed so as to stop the supply of $SiH_4/H_2$, $B_2H_6/H_2$, and $CH_4$ to the p-layer deposition chamber 419, whereas $H_2$ was fed further for 3 min into the p-layer deposition chamber 419. Then, the valves 471, 481, and 470 were closed, and the inside of the p-layer deposition chamber 419 as well as the inside of the gas lines was evacuated down to $1\times10^{-5}$ Torr.

The gate valve 409 was then opened, and the substrate 490 was transferred to the unload chamber 405 which had already been evacuated with the vacuum pump (not shown). Then, a leak valve (not shown) was opened so that the inside of the unload chamber 405 was exposed to the ambient atmosphere.

ITO was then evaporated onto the RF p-layer 105 so as to form a transparent conductive layer 112 having a thickness of 70 nm.

A mask having a comb-shaped window was placed on the transparent conductive layer 112, and metal evaporation was performed via the mask thereby forming a comb-shaped collection electrode 113 having a multi-layer structure consisting of Cr(40 nm)/Ag(1000 nm)/Cr(40 nm).

In this way, a complete solar cell according to the invention was obtained. Hereafter, the solar cell of this type will be referred to as SC-EMB-C1. Tables C1(1) and C1(2) summarize the conditions used here in the invention, regarding the plasma treatment in an ambient of hydrogen containing a small amount of Group V element as well as the process conditions for the RF n-layer, RF n/i buffer layer, MW i-layer, RF p/i buffer layer, and RF p-layer.

COMPARATIVE EXAMPLE C1

For the sake of comparison, a solar cell (SC-CMP-C1) was also fabricated in the same manner as in the above-described example C1 except that the plasma treatment with hydrogen gas containing a small amount of Group V element according to the invention was not performed.

Nine samples were prepared for each type solar cell (SC-EMB-C1 and SC-CMP-C1) for the purpose of evaluation regarding the initial photoelectric conversion efficiency (the ratio of the electric output power to the optical input power), overall durability, durability under illumination, and overall durability and illumination with an applied bias voltage at a high temperature and high humidity.

The measurement of the initial photoelectric conversion efficiency was performed by measuring the V-I characteristics of the samples under the illumination condition of AM1.5 (100 mW/cm$^2$). Regarding the fill factors (F.F.'s) in the initial photoelectric conversion efficiency, variations in the characteristics, and series resistance, the measurement results of the SC-EMB-C1 samples relative to those of the SC-CMP-C1 samples are shown below.

| | [Initial characteristics] FF | Series resistance | Variation |
|---|---|---|---|
| SC-EMB-C1 | 1.10 | 0.90 | 0.85 |
| | (relative to the values of SC-CMP-C1) | | |

The overall durability was evaluated as follows: After the measurementoftheinitialphotoelectricconversionefficiency, some examples were placed in a dark place kept at 25° C. and 55% relative humidity. Vibration having an amplitude of 0.1 mm and a frequency of 60 Hz was applied to the samples for 550 hr. After that, the photoelectric conversion efficiencies of the samples were measured under the illumination condition of AM1.5 (100 mW/cm$^2$) and the reduction relative to the initial value (the ratio of the photoelectric conversion efficiency after the vibration test to the initial value) was evaluated for each sample. The durability under illumination was evaluated as follows: After the measurement of the initial photoelectric conversion efficiency, some examples were placed in a place kept at 25° C. and 55% relative humidity, and illuminated with light of AM1.5 (100 mW/cm$^2$ for 550 hr. After that, the photoelectric conversion efficiencies of the samples were measured under the illumination condition of AM1.5 (100 $mW/cm^2$) and the reduction relative to the initial value (the ratio of the photoelectric conversion efficiency after the illumination test to the initial value) was evaluated for each sample. The results are shown below regarding the reduction ratios of the photoelectric conversion efficiency after the illumination and vibration tests for the SC-CMP-C1 samples relative to the results of the SC-EMB-C1 samples.

[Reduction ratio of the photoelectric conversion efficiency]

| | Reduction due to vibration | Reduction due to illumination |
|---|---|---|
| SC-CMP-C1 | 0.84 | 0.83 |
| (relative to the results of SC-EMB-C1) | | |

Vibration and illumination durability tests were also performed under a biased condition at a high temperature and high humidity as described below: After the measurement of the initial photoelectric conversion efficiency, two samples were placed in a dark place kept at 81° C. and 93% relative humidity, and a forward bias voltage of 0.7 V was applied to both samples. Vibration was applied to one sample under the same conditions as those in the above-described non-biased vibration test, and degradation was evaluated. The other sample was illuminated with light of AM1.5, and degradation was evaluated. The results are shown below regarding the reduction ratios of the photoelectric conversion efficiency after the vibration and illumination tests for the SC-CMP-C1 samples relative to the results of the SC-EMB-C1 samples.

[Reduction ratio of the photoelectric conversion efficiency]

| | Reduction due to vibration | Reduction due to illumination |
|---|---|---|
| SC-CMP-C1 | 0.84 | 0.82 |
| (relative to the results of SC-EMB-C1) | | |

The surfaces of the above-described samples were observed via an optical microscope to evaluate film separation. No film separation was observed in the SC-EMB-C1 samples, whereas slight film separation was observed in the SC-CMP-C1 samples.

From the above results, it can be concluded that the solar cells (SC-EMB-C1) according to the present invention are better in the fill factor of photoelectric conversion efficiency characteristics, series resistance, uniformity or reproducibility of characteristics, adhesion, and durability than the conventional solar cells (SC-CMP-C1).

EXAMPLE C2 ACCORDING TO THE INVENTION

A solar cell, having a tandem structure such as that shown in FIG. 4 was fabricated using the deposition equipment shown in FIG. 7.

A substrate 490 was prepared according to a similar process to that in the example C1 such that a reflection layer 101 and a reflection enhancing layer 102 were formed on a base. The substrate 490 was placed on the substrate transfer rail 413 in the load chamber 401, and the load chamber 401 was evacuated with the vacuum pump (not shown) down to a pressure of about $1\times10^{-5}$ Torr.

Then, the gate valve 406 was opened, and the substrate 490 was transferred to the deposition chamber 417 via the transfer chamber 402 wherein both deposition chamber 417 and transfer chamber 402 had already been evacuated with the vacuum pump (not shown). The substrate 490 was placed such that the back surface of the substrate 490 came into contact with the heater 410 so that the substrate 490 was heated. The inside of the deposition chamber 417 was evacuated with the vacuum pump (not shown) down to a pressure of about $1\times10^{-5}$ Torr.

Thus, the preparation for semiconductor film deposition was complete, and an RF n-layer 103 of μc-Si was deposited as follows.

To deposit the RF n-layer of μc-Si, $H_2$ gas was introduced into the deposition chamber 417 via the gas inlet 429, wherein the $H_2$ gas was supplied by opening the valves 441, 431, 430 and its flow rate was adjusted to 200 sccm by means of the mass flow controller 436. Furthermore, the pressure inside the deposition chamber 417 was adjusted to 1.2 Torr by means of the conductance valve (not shown). The substrate 490 was heated by the substrate heater 410 up to 380° C. When the temperature of the substrate had become stable, the valves 443, 433, 444, and 434 were opened whereby $SiH_4$ gas and $PF_3/H_2$ gas (diluted to 1%) were introduced into the deposition chamber 417 via the gas inlet 429. The flow rates of $SiH_4$, $H_2$, and $PF_3/H_2$ (diluted to 1%) were adjusted to 2 sccm, 250 sccm, and 15 sccm, respectively, by the mass flow controllers 438, 436, and 439. The pressure inside the deposition chamber 417 was adjusted to 1.0 Torr. RF power of 0.05 $W/cm^3$ was applied by the RF power supply 422 so that a glow discharge occurs in the plasma excitation cup 420, and thus deposition of the RF n-layer 103 was started. When the thickness of the deposited RF n-layer had reached 20 nm, the RF power was shut off thereby eliminating the glow discharge. Thus, the deposition of the RF n-layer 103 was complete. The supply of $SiH_4$ and $PF_3/H_2$ into the deposition chamber 417 was stopped, whereas $H_2$ was fed further for 5 min into the deposition chamber 417. Then, $H_2$ was also shut off, and the inside of the deposition chamber 417 as well as the inside of the gas lines was evacuated down to $1\times10^{-5}$ Torr.

The substrate was then subjected to plasma treatment with hydrogen gas containing a small amount of Group V element under the conditions shown in Table C2(1). In this plasma treatment with hydrogen gas containing the small amount of Group V element according to the present invention, $PF_3/H_2$ (diluted to 1%) serving as Group V element, $SiH_4$ serving as silicon compound gas, and $H_2$ gas were introduced into the deposition chamber 417 via the gas inlet 429. The $H_2$ gas was supplied by opening the valves 441, 431, 430 and its flow rate was adjusted to 800 sccm by means of the mass flow controller 436. Group-V element compound gas $PF_3$ was supplied by opening the valves 444 and 434 and its flow rate was controlled by the mass flow controller 439 such that the flow rate of the $PH_3$ gas was maintained at 0.5% of the total gas flow rate of $H_2$. The silicon compound gas or $SiH_4$ was supplied by opening the valves 443 and 433 and its flow rate was controlled by the mass flow controller 438 such that the flow rate of the $SiH_4$ gas was maintained at 0.05% of the total gas flow rate of $H_2$. Furthermore, the pressure inside the deposition chamber 417 was adjusted to 0.01 Torr by means of the conductance valve (not shown). The substrate 490 was heated by the substrate heater 410 up to 300° C. When the temperature of the substrate had become stable, VHF power of 0.08 $W/cm^3$ was applied by the VHF power supply (not shown) so that a glow discharge occurs in the plasma excitation cup 420. Under the above-described conditions, the substrate was exposed for 4 min to the hydrogen gas plasma containing the small amount of Group V element according to the present invention. The VHF power was then shut off thereby eliminating the glow discharge. The supply of the $PF_3/H_2$ gas and $SiH_4$ gas into the deposition chamber 417 was stopped, whereas the $H_2$ gas was fed further for 4 min into the deposition chamber 417. Then, the $H_2$ gas was also shut off, and the inside of the deposition chamber 417 as well as the inside of the gas lines was evacuated down to $1\times10^{-5}$ Torr.

An n/i buffer layer 151 of a-Si, an MW i-layer 114 of a-SiGe, and a p/i buffer layer 161 of a-Si were then deposited successively by means of RFPCD, MWPCVD, and RFPCVD, respectively, as described below.

The gate valve 407 was opened, and the substrate 490 was transferred to the i-layer deposition chamber 418 via the transfer chamber 403 wherein both deposition chamber 418 and transfer chamber 403 had already been evacuated with the vacuum pump (not shown). The substrate 490 was placed such that the back surface of the substrate 490 came into contact with the heater 411 so that the substrate 490 was heated. The inside of the i-layer deposition chamber 418 was evacuated with the vacuum pump (not shown) down to a pressure of about $1\times10^{-5}$ Torr.

To deposit the n/i buffer layer 151, the substrate 490 was heated by the substrate heater 411 up to 360° C. When the substrate had been heated enough, the valves 464, 454, 450, 463, and 453 were opened gradually whereby $Si_2H_6$ and $H_2$ were introduced into the i-layer deposition chamber 418 via the gas inlet 449. The flow rates of $Si_2H_6$ and $H_2$ were adjusted to 3 sccm and 90 sccm, respectively, by the mass flow controllers 459, and 458. The pressure inside the i-layer deposition chamber 418 was adjusted to 0.8 Torr by adjusting the opening ratio of the conductance valve (not shown). Then, RF power of 0.08 $W/cm^3$ was applied to the bias bar 428 by the RF power supply 424, thereby exciting a glow discharge. The shutter 427 was then opened, and thus deposition of the n/i buffer layer onto the RF n-layer was started. When the thickness of the deposited n/i buffer layer had reached 10 nm, the glow discharge was stopped, and the power supply 424 was shut off. Thus, the deposition of the n/i buffer layer 151 was complete. The valves 464 and 454 were closed so as to stop the supply of $Si_2H_6$ to the i-layer deposition chamber 418, whereas $H_2$ was fed further for 2 min into the i-layer deposition chamber 418. Then, the valves 453 and 450 were closed, and the inside of the i-layer deposition chamber 418 as well as the inside of the gas lines was evacuated down to $1\times10^{-5}$ Torr.

The MW i-layer was then deposited as follows: the substrate 490 was heated by the substrate heater 411 up to 380° C. When the substrate had been heated enough, the valves 461, 451, 450, 462, 452, 463, and 453 were opened gradually whereby $SiH_4$, $GeH_4$, and $H_2$ were introduced into the i-layer deposition chamber 418 via the gas inlet 449.

The flow rates of $SiH_4$, $GeH_4$, and $H_2$ were adjusted to 40 sccm, 37 sccm, and 130 sccm, respectively, by the mass flow controllers 456, 457, and 458. The pressure inside the i-layer deposition chamber 418 was adjusted to 5 mTorr by adjusting the opening ratio of the conductance valve (not shown). Then, RF power of 0.60 $W/cm^3$ was applied to the bias bar 428 by the RF power supply 424. Furthermore, MW power of 0.25 $W/cm^3$ was introduced from an MW power supply (not shown) into the i-layer deposition chamber 418 via the wave guide 426 and the microwave entrance window 425, thereby exciting a glow discharge. The shutter 427 was then opened, and thus deposition of the MW i-layer 114 onto the n/i buffer layer was started. When the thickness of the deposited MW i-layer 114 had reached 0.15 μm, the MW glow discharge was stopped, and the bias power supply 424 was shut off. Thus, the deposition of the MW i-layer 114 was complete. The valves 451 and 452 were closed so as to stop the supply of $SiH_4$ and $GeH_4$ to the i-layer deposition chamber 418, whereas $H_2$ was fed further for 2 min into the i-layer deposition chamber 418. Then, the valves 453 and 450 were closed, and the inside of the i-layer deposition chamber 418 as well as the inside of the gas lines was evacuated down to $1\times10^{-5}$ Torr.

To deposit the p/i buffer layer 161, the substrate 490 was heated by the substrate heater 411 up to 250° C. When the substrate had been heated enough, the valves 464, 454, 450, 463, and 453 were opened gradually whereby $Si_2H_6$ and $H_2$ were introduced into the i-layer deposition chamber 418 via the gas inlet 449. The flow rates of $Si_2H_6$ and $H_2$ were adjusted to 2 sccm and 80 sccm, respectively, by the mass flow controllers 459, and 458. The pressure inside the i-layer deposition chamber 418 was adjusted to 0.7 Torr by adjusting the opening ratio of the conductance valve (not shown). Then, RF power of 0.07 $W/cm^3$ was applied to the bias bar 428 by the RF power supply 424, thereby exciting a glow discharge. The shutter 427 was then opened, and thus deposition of the p/i buffer layer 161 onto the MW i-layer was started. When the thickness of the deposited p/i buffer layer 161 had reached 20 nm, the glow discharge was stopped, and the power supply 424 was shut off. Thus, the deposition of the p/i buffer layer 161 was complete. The valves 464 and 454 were closed so as to stop the supply of $Si_2H_6$ to the i-layer deposition chamber 418, whereas $H_2$ was fed further for 2 min into the i-layer deposition chamber 418. Then, the valves 453 and 450 were closed, and the inside of the i-layer deposition chamber 418 as well as the inside of the gas lines was evacuated down to $1\times10^{-5}$ Torr.

To deposit the RF p-layer 105 of a-SiC, the gate valve 408 was opened, and the substrate 490 was transferred to the p-layer deposition chamber 419 via the transfer chamber 404, wherein both deposition chamber 419 and transfer chamber 404 had already been evacuated with the vacuum pump (not shown). The substrate 490 was placed such that the back surface of the substrate 490 came into contact with the heater 412 so that the substrate 490 was heated. The inside of the p-layer deposition chamber 419 was evacuated with the vacuum pump (not shown) down to a pressure of about $1\times10^{-5}$ Torr.

The substrate 490 was heated by the substrate heater 412 up to 250° C. When the temperature of the substrate had become stable, the valves 481, 471, 470, 482, 472, 483, 473, 484, and 474 were opened whereby $H_2$ gas, $SiH_4/H_2$ gas, $B_2H_6/H_2$ gas, and $CH_4$ gas were introduced into the deposition chamber 419 via the gas inlet 469. The flow rates of the $H_2$, $SiH_4/H_2$, $B_2H_6/H_2$, and $CH_4$, were adjusted to 60 sccm, 2 sccm, 8 sccm, and 0.3 sccm, respectively, by the mass flow controllers 476, 477, 478, and 479. The pressure inside the chamber 419 was adjusted to 2.0 Torr by adjusting the opening ratio of a conductance valve (not shown). RF power of 0.07 $W/cm^3$ was applied by the RF power supply 423 so that a glow discharge occurs in the plasma excitation cup 421, and thus deposition of the RF p-layer 105 onto the p/i buffer layer 161 was started. When the thickness of the deposited RF p-layer 105 had reached 10 nm, the RF power was shut off thereby eliminating the glow discharge. Thus, the deposition of the RF p-layer 105 was complete. The valves 472, 482, 473, 483, 474, and 484 were closed so as to stop the supply of $SiH_4/H_2$, $B_2H_6/H_2$, and $CH_4$ to the p-layer deposition chamber 419, whereas $H_2$ was fed further for 3 min into the p-layer deposition chamber 419. Then, the valves 471, 481, and 470 were closed, and the inside of the p-layer deposition chamber 419 as well as the inside of the gas lines was evacuated down to $1\times10^{-5}$ Torr.

To deposit the RF n-layer 203 of μc-Si, the gate valves 408 and 407 were opened, and the substrate 490 was transferred to the deposition chamber 417 via the transfer chambers 403 and 402 wherein the deposition chamber 417 and transfer chambers 403 and 402 had already been evacuated with the vacuum pump (not shown). The substrate 490 was placed such that the back surface of the substrate 490 came into contact with the heater 410 so that the substrate 490 was heated. The inside of the deposition chamber 417 was evacuated with the vacuum pump (not shown) down to a pressure of about $1\times10^{-5}$ Torr.

Then the RF n-layer 203 of μc-Si was deposited as follows: $H_2$ gas was introduced into the deposition chamber 417 via the gas inlet 429, wherein the $H_2$ gas was supplied by opening the valves 441, 431, 430 and its flow rate was adjusted to 200 sccm by means of the mass flow controller 436. Furthermore, the pressure inside the deposition chamber 417 was adjusted to 1.1 Torr by means of the conductance valve (not shown). The substrate 490 was heated by the substrate heater 410 up to 250° C. When the temperature of the substrate had become stable, the valves 443, 433, 444, and 434 were opened whereby $SiH_4$ gas and $PF_3/H_2$ gas (diluted to 1%) were introduced into the deposition chamber 417 via the gas inlet 429. The flow rates of $SiH_4$, $H_2$, and $PH_3/H_2$ (diluted to 1%) were adjusted to 2 sccm, 250 sccm, and 20 sccm, respectively, by the mass flow controllers 438, 436, and 439. The pressure inside the deposition chamber 417 was adjusted to 1.1 Torr. RF power of 0.04 W/cm$^3$ was applied by the RF power supply 422 so that a glow discharge occurs in the plasma excitation cup 420, and thus deposition of the RF n-layer onto the RF p-layer was started. When the thickness of the deposited RF n-layer had reached 10 nm, the RF power was shut off thereby eliminating the glow discharge. Thus, the deposition of the RF n-layer 203 was complete. The supply of $SiH_4$ and $PF_3/H_2$ into the deposition chamber 417 was stopped, whereas $H_2$ was fed further for 2 min into the deposition chamber 417. Then, $H_2$ was also shut off, and the inside of the deposition chamber 417 as well as the inside of the gas lines was evacuated down to $1\times10^{-5}$ Torr.

The substrate was then subjected to plasma treatment with hydrogen gas containing a small amount of Group V element under the conditions shown in Table C2(2), according to the present invention. In this plasma treatment with hydrogen gas containing the small amount of Group V element according to the present invention, $PF_3/H_2$ (diluted to 1%) serving as Group V element, $SiH_4/H_2$ serving as silicon compound gas, and $H_2$ were introduced into the deposition chamber 417 via the gas inlet 429 wherein the $H_2$ gas was supplied by opening the valves 441, 431, 430 and its flow rate was adjusted to 1300 sccm by means of the mass flow controller 436, the Group V element or $PF_3$ was supplied by opening the valves 444 and 434 and its flow rate was controlled by the mass flow controller 439 such that the flow rate of the $SiH_4$ gas was maintained at 0.03% of the total gas flow rate of $H_2$, and the silicon compound gas or $SiH_4$ was supplied by opening the valves 443 and 433 and its flow rate was controlled by the mass flow controller 438 such that the flow rate of the $SiH_4$ gas was maintained at 0.06% of the total gas flow rate of $H_2$. Furthermore, the pressure inside the deposition chamber 417 was adjusted to 0.8 Torr by means of the conductance valve (not shown). The substrate 490 was heated by the substrate heater 410 up to 250° C. When the temperature of the substrate had become stable, RF power of 0.05 W/cm$^3$ was applied by the RF power supply 422 so that a glow discharge occurs in the plasma excitation cup 420. Under the above-described conditions, the substrate was exposed for 3 min to the hydrogen gas plasma containing the small amount of Group V element according to the present invention. The RF power was then shut off thereby eliminating the glow discharge. The supply of $PH_3/H_2$ and $SiH_4/H_2$ into the deposition chamber 417 was stopped, whereas the $H_2$ gas was fed further for 3 min into the deposition chamber 417. Then, the $H_2$ gas was also shut off, and the inside of the deposition chamber 417 as well as the inside of the gas lines was evacuated down to $1\times10^{-5}$ Torr.

An n/i buffer layer 251 of a-Si, an RF i-layer 214 of a-Si, and a p/i buffer layer 261 of a-SiC were then deposited successively by means of RFPCD as described below.

The gate valve 407 was opened, and the substrate 490 was transferred to the i-layer deposition chamber 418 via the transfer chamber 403 wherein both deposition chamber 418 and transfer chamber 403 had already been evacuated with the vacuum pump (not shown). The substrate 490 was placed such that the back surface of the substrate 490 came into contact with the heater 411 so that the substrate 490 was heated. The inside of the i-layer deposition chamber 418 was evacuated with the vacuum pump (not shown) down to a pressure of about $1\times10^{-5}$ Torr.

To deposit the n/i buffer layer 251, the substrate 490 was heated by the substrate heater 411 up to 250° C. When the substrate had been heated enough, the valves 464, 454, 450, 463, 453, 465, and 455 were opened gradually whereby $Si_2H_6$, $H_2$, and $CH_4$ were introduced into the i-layer deposition chamber 418 via the gas inlet 449. The flow rates of $Si_2H_6$, $H_2$, and $CH_4$ were adjusted to 0.5 sccm, 70 sccm, and 0.2 sccm, respectively, by the mass flow controllers 459, 458, and 460.

The pressure inside the i-layer deposition chamber 418 was adjusted to 1.5 Torr by adjusting the opening ratio of the conductance valve (not shown). Then, RF power of 0.06 W/cm$^3$ was applied to the bias bar 428 by the RF power supply 424, thereby exciting a glow discharge. The shutter 427 was then opened, and thus deposition of the n/i buffer layer onto the RF n-layer was started. When the thickness of the deposited n/i buffer layer had reached 10 nm, the glow discharge was stopped, and the power supply 424 was shut off. Thus, the deposition of the n/i buffer layer 251 was complete. The valves 464, 454, 465 and 455 were closed so as to stop the supply of $Si_2H_6$ and $CH_4$ to the i-layer deposition chamber 418, whereas $H_2$ was fed further for 2 min into the i-layer deposition chamber 418. Then, the valves 453 and 450 were closed, and the inside of the i-layer deposition chamber 418 as well as the inside of the gas lines was evacuated down to $1\times10^{-5}$ Torr.

To deposit the RF i-layer 214, the substrate 490 was heated by the substrate heater 411 up to 200° C. When the substrate had been heated enough, the valves 464, 454, 450, 463, and 453 were opened gradually whereby $Si_2H_6$ and $H_2$ were introduced into the i-layer deposition chamber 418 via the gas inlet 449. The flow rates of $Si_2H_6$ and $H_2$ were adjusted to 2.5 sccm and 60 sccm, respectively, by the mass flow controllers 459, and 458. The pressure inside the i-layer deposition chamber 418 was adjusted to 0.6 Torr by adjusting the opening ratio of the conductance valve (not shown). Then, RF power of 0.07 W/cm$^3$ was applied to the bias bar 428 by the RF power supply 424, thereby exciting a glow discharge. The shutter 427 was then opened, and thus depositing the RF i-layer 214 onto the n/i buffer layer 251 was started. When the thickness of the deposited i-layer had reached 110 nm, the glow discharge was stopped, and the power supply 424 was shut off. Thus, the deposition of the RF i-layer 214 was complete. The valves 464 and 454 were closed so as to stop the supply of $Si_2H_6$ to the i-layer deposition chamber 418, whereas $H_2$ was fed further for 2 min into the i-layer deposition chamber 418. Then, the valves 453 and 450 were closed, and the inside of the i-layer deposition chamber 418 as well as the inside of the gas lines was evacuated down to $1\times10^{-5}$ Torr.

To deposit the p/i buffer layer 261, the substrate 490 was heated by the substrate heater 411 up to 200° C. When the substrate had been heated enough, the valves 464, 454, 450, 463, 453, 465, and 455 were opened gradually whereby $Si_2H_6$, $H_2$, and $CH_4$ were introduced into the i-layer deposition chamber 418 via the gas inlet 449. The flow rates of $Si_2H_6$, $H_2$, and $CH_4$ were adjusted to 0.5 sccm, 50 sccm, and 0.3 sccm, respectively, by the mass flow controllers 459, 458, and 460. The pressure inside the i-layer deposition chamber 418 was adjusted to 1.3 Torr by adjusting the opening ratio of the conductance valve (not shown). Then, RF power of 0.06 W/$cm^3$ was applied to the bias bar 428 by the RF power supply 424, thereby exciting a glow discharge. The shutter 427 was then opened, and thus deposition of the p/i buffer layer 261 onto the RF i-layer 214 was started. When the thickness of the deposited p/i buffer layer 261 had reached 15 nm, the glow discharge was stopped, and the power supply 424 was shut off. Thus, the deposition of the p/i buffer layer 261 was complete. The valves 464, 454, 465, and 455 were closed so as to stop the supply of $Si_2H_6$ and $CH_4$ to the i-layer deposition chamber 418, whereas $H_2$ was fed further for 2 min into the i-layer deposition chamber 418. Then, the valves 453 and 450 were closed, and the inside of the i-layer deposition chamber 418 as well as the inside of the gas lines was evacuated down to $1\times10^{-5}$ Torr.

To deposit the RF p-layer 205 of a-SiC, the gate valve 408 was opened, and the substrate 490 was transferred to the p-layer deposition chamber 419 via the transfer chamber 404, wherein both deposition chamber 419 and transfer chamber 404 had already been evacuated with the vacuum pump (not shown). The substrate 490 was placed such that the back surface of the substrate 490 came into contact with the heater 412 so that the substrate 490 was heated. The inside of the p-layer deposition chamber 419 was evacuated with the vacuum pump (not shown) down to a pressure of about $1\times10^{-5}$ Torr.

The substrate 490 was heated by the substrate heater 412 up to 170° C. When the temperature of the substrate had become stable, the valves 481, 471, 470, 482, 472, 483, 473, 484, and 474 were opened whereby $H_2$ gas, $SiH_4/H_2$ gas, $B_2H_6/H_2$ gas, and $CH_4$ gas were introduced into the deposition chamber 419 via the gas inlet 469. The flow rates of the $H_2$, $SiH_4/H_2$, $B_2H_6/H_2$, and $CH_4$, were adjusted to 60 sccm, 2 sccm, 7 sccm, and 0.3 sccm, respectively, by the mass flow controllers 476, 477, 478, and 479. The pressure inside the chamber 419 was adjusted to 2.0 Torr by adjusting the opening ratio of the conductance valve (not shown). RF power of 0.07 W/$cm^3$ was applied by the RF power supply 423 so that a glow discharge occurs in the plasma excitation cup 421, and thus deposition of the RF p-layer 205 onto the p/i buffer layer 261 was started. When the thickness of the deposited RF p-layer 205 had reached 10 nm, the RF power was shut off thereby eliminating the glow discharge. Thus, the deposition of the RF p-layer 205 was complete. The valves 472, 482, 473, 483, 474, and 484 were closed so as to stop the supply of $SiH_4/H_2$, $B_2H_6/H_2$, and $CH_4$ to the p-layer deposition chamber 419, whereas $H_2$ was fed further for 2 min into the p-layer deposition chamber 419. Then, the valves 471, 481, and 470 were closed, and the inside of the p-layer deposition chamber 419 as well as the inside of the gas lines was evacuated down to $1\times10^{-5}$ Torr.

The gate valve 409 was then opened, and the substrate 490 was transferred to the unload chamber 405 which had already been evacuated with the vacuum pump (not shown). Then, a leak valve (not shown) was opened so that the inside of the unload chamber 405 was exposed to the ambient atmosphere.

ITO was then evaporated onto the RF p-layer 205 so as to form a transparent conductive layer 112 having a thickness of 70 nm.

A mask having a comb-shaped window was placed on the transparent conductive layer 112, and metal evaporation was performed via the mask thereby forming a comb-shaped collection electrode 113 having a multi-layer structure consisting of Cr(40 nm)/Ag(1000 nm)/Cr(40 nm).

In this way, a complete solar cell according to the invention was obtained.

Hereafter, the solar cell of this type will be referred to as SC-EMB-C2. Tables C2(1) through C2(3) summarize the conditions used here in the invention, regarding the plasma treatment in an ambient of hydrogen containing a small amount of Group V element as well as the process conditions for the RF n-layer, n/i buffer layer, MW i-layer, p/i buffer layer, RF i-layer, and RF p-layer.

COMPARATIVE EXAMPLE C2

For the sake of comparison, a solar cell (SC-CMP-C2) was also fabricated in the same manner as in the above-described example C2 except that the plasma treatment with hydrogen gas containing a small amount of Group V element according to the invention was not performed.

Seven samples were prepared for each type solar cell (SC-EMB-C2 and SC-CMP-C2) for the purpose of evaluation regarding the initial photoelectric conversion efficiency (the ratio of the electric output power to the optical input power), overall durability, durability under illumination, and overall durability and illumination with an applied bias voltage at a high temperature and high humidity.

The measurement of the initial photoelectric conversion efficiency was performed by measuring the V-I characteristics of the samples under the illumination condition of AM1.5 (100 mW/$cm^2$). Regarding the fill factors (F.F.'s) in the initial photoelectric conversion efficiency, series resistance, and the variations in the characteristics, the measurement results of the SC-EMB-C2 samples relative to those of the SC-CMP-C2 samples are shown below.

| | [Initial characteristics] | | |
|---|---|---|---|
| | FF | Series Resistance | Variation |
| SC-EMB-C2 | 1.11 | 0.90 | 0.85 |
| | (relative to the values of SC-CMP-C2) | | |

The vibration durability test was performed as follows: After the measurement of the initial photoelectric conversion efficiency, some examples were placed in a dark place kept at 25° C. and 55% relative humidity. Vibration having an amplitude of 0.1 mm and a frequency of 60 Hz was applied to the samples for 550 hr. After that, the photoelectric conversion efficiencies of the samples were measured under the illumination condition of AM1.5 (100 mW/$cm^2$) and the reduction relative to the initial value (the ratio of the photoelectric conversion efficiency after the vibration test to the initial value) was evaluated for each sample.

The durability under illumination was evaluated as follows: After the measurement of the initial photoelectric conversion efficiency, some examples were placed in a place kept at 25° C. and 55% relative humidity, and illuminated with light of AM1.5 (100 mW/$cm^2$ for 550 hr. After that, the photoelectric conversion efficiencies of the samples were measured under the illumination condition of AM1.5 (100 mW/$cm^2$) and the reduction relative to the initial value (the ratio of the photoelectric conversion efficiency after the illumination test to the initial value) was evaluated for each sample. The results are shown below regarding the reduction ratios of the photoelectric conversion efficiency after the illumination and vibration tests for the SC-CMP-C2 samples relative to the results of the SC-EMB-C2 samples.

[Reduction ratio of the photoelectric conversion efficiency]

| | Reduction due to vibration | Reduction due to illumination |
|---|---|---|
| SC-CMP-C2 | 0.85 | 0.84 |
| (relative to the results of SC-EMB-C2) | | |

Vibration and illumination durability tests were also performed under a biased condition at a high temperature and high humidity as described below: After the measurement of the initial photoelectric conversion efficiency, two samples were placed in a dark place kept at 81° C. and 92% relative humidity, and a forward bias voltage of 0.7 V was applied to both samples. Vibration was applied to one sample under the same conditions as those in the above-described non-biased vibration test, and degradation was evaluated. The other sample was illuminated with light of AM1.5, and degradation was evaluated. The results are shown below regarding the reduction ratios of the photoelectric conversion efficiency after the vibration and illumination tests for the SC-CMP-C2 samples relative to the results of the SC-EMB-C2 samples.

[Reduction ratio of the photoelectric conversion efficiency]

| | Reduction due to vibration | Reduction due to illumination |
|---|---|---|
| SC-CMP-C2 | 0.83 | 0.82 |
| (relative to the results of SC-EMB-C2) | | |

The surfaces of the above-described samples were observed via an optical microscope to evaluate film separation. No film separation was observed in the SC-EMB-C2 samples, whereas slight film separation was observed in the SC-CMP-C2 samples.

From the above results, it can be concluded that the solar cells (SC-EMB-C2) according to the present invention are better in the fill factor of photoelectric conversion efficiency characteristics, series resistance, uniformity or reproducibility of characteristics, optical durability, adhesion, and overall durability than the conventional solar cells (SC-CMP-C2).

EXAMPLE C3 ACCORDING TO THE INVENTION

A solar cell, having a triple structure such as that shown in FIG. 6 was fabricated using the deposition equipment shown in FIG. 7. A substrate 490 was prepared according to a similar process to that in the example C1 such that a reflection layer 101 and a reflection enhancing layer 102 were formed on a base. The substrate 490 was placed on the substrate transfer rail 413 in the load chamber 401, and the load chamber 401 was evacuated with the vacuum pump (not shown) down to a pressure of about $1\times10^{-5}$ Torr. Then, the gate valve 406 was opened, and the substrate 490 was transferred to the deposition chamber 417 via the transfer chamber 402 wherein both deposition chamber 417 and transfer chamber 402 had already been evacuated with the vacuum pump (not shown). The substrate 490 was placed such that the back surface of the substrate 490 came into contact with the heater 410 so that the substrate 490 was heated. The inside of the deposition chamber 417 was evacuated with the vacuum pump (not shown) down to a pressure of about $1\times10^{-5}$ Torr.

Thus, the preparation for semiconductor film deposition was complete, and an RF n-layer 103 of μc-Si was deposited in a similar manner to that in the example C2.

The gate valve 407 was opened, and the substrate 490 was transferred to the deposition chamber 418 via the transfer chamber 403 wherein the deposition chamber 418 and the transfer chamber 403 had already been evacuated with the vacuum pump (not shown). The substrate 490 was placed such that the back surface of the substrate 490 came into contact with the heater 411 so that the substrate 490 was heated. The inside of the deposition chamber 418 was evacuated with the vacuum pump (not shown) down to a pressure of about $1\times10^{-5}$ Torr.

The substrate was then subjected to plasma treatment with hydrogen gas containing a small amount of Group V element under the conditions shown in Table C3(1). In this plasma treatment with hydrogen gas containing the small amount of Group V element according to the present invention, $PF_3/H_2$ (diluted to 10%) serving as Group V element, $SiCl_2H_2$/H2 (diluted to 1%) serving as silicon compound gas, and $H_2$ gas were introduced into the deposition chamber 418 via the gas inlet 429. The $H_2$ gas was supplied by opening the valves 463, 453, 450 and its flow rate was adjusted to 1500 sccm by means of the mass flow controller 458. Group-V element compound gas $PF_3$ was supplied by opening the valves 468 and 466 and its flow rate was controlled by the mass flow controller 467 such that the flow rate of the $PF_3$ gas was maintained at 1.8% of the total gas flow rate of $H_2$. The silicon compound gas or $SiCl_2H_2$/He (diluted to 1%) was supplied by opening valves (not shown) and its flow rate was controlled by a mass flow controller (not shown) such that the flow rate of $SiCl_2H_2$/He was maintained at 0.03% of the total gas flow rate of $H_2$. Furthermore, the pressure inside the deposition chamber 418 was adjusted to 0.007 Torr by means of the conductance valve (not shown). The substrate 490 was heated by the substrate heater 411 up to 300° C. When the temperature of the substrate had become stable, MW power of 0.1 W/$cm^3$ was introduced from the VHF power supply (not shown) into the i-layer deposition chamber 418 via the wave guide 426 and the microwave entrance window 425 thereby exciting a glow discharge. The shutter 427 was then opened and the substrate was exposed for 4 min to the hydrogen gas plasma containing the small amount of Group V element according to the present invention. The MW power was then shut off thereby eliminating the glow discharge. The supply of $PF_3/H_2$ and $SiCl_2$/He into the deposition chamber 418 was stopped, whereas the $H_2$ gas was fed further for 4 min into the deposition chamber 418. Then, the $H_2$ gas was also shut off, and the inside of the deposition chamber 418 as well as the inside of the gas lines was evacuated down to $1\times10^{-5}$ Torr.

An n/i buffer layer 151 of a-Si, an MW i-layer 114 of a-SiGe, a p/i buffer layer 161 of a-Si, RF p-layer 105 of a-SiC, and RF n-layer 203 of μc-Si were then deposited successively in a similar manner to that in the example C2.

The substrate was then subjected to plasma treatment with hydrogen gas containing a small amount of Group V element under the conditions shown in Table C3(2). In this plasma treatment with hydrogen gas containing the small amount of Group V element according to the present invention, $PF_3/H_2$ (diluted to 10%) serving as Group V element, $SiH_4$ serving as silicon compound gas, and $H_2$ gas were introduced into the deposition chamber 417 via the gas inlet 429. The $H_2$ gas was supplied by opening the valves 441, 431, 430 and its flow rate was adjusted to 1300 sccm by means of the mass flow controller 436. Group-V element compound gas $PF_3$ was supplied by opening the valves 444 and 434 and its flow rate was controlled by the mass flow controller 439 in such a manner that the flow rate of Group-V element gas varies with time from 2.6% to 0.1% of the total gas flow rate of $H_2$. The silicon compound gas or $SiH_4$ was supplied by opening the valves 443 and 433 and its flow rate was controlled by the mass flow controller 438 such that the flow rate of the $SiH_4$ gas was maintained at 0.07% of the total gas flow rate of $H_2$. Furthermore, the pressure inside the deposition chamber 417 was adjusted to 0.8 Torr by means of the conductance valve (not shown). The substrate 490 was heated by the substrate heater 410 up to 300° C. When the temperature of the substrate had become stable, RF power of 0.05 W/cm$^3$ was applied by the RF power supply 422 so that a glow discharge occurs in the plasma excitation cup 420. Under the above-described conditions, the substrate was exposed for 3 min to the hydrogen gas plasma containing the small amount of Group V element according to the present invention. The RF power was then shut off thereby eliminating the glow discharge. The supply of the $PF_3/H_2$ gas and $SiH_4$ gas into the deposition chamber 417 was stopped, whereas the $H_2$ gas was fed further for 3 min into the deposition chamber 417. Then, the $H_2$ gas was also shut off, and the inside of the deposition chamber 417 as well as the inside of the gas lines was evacuated down to $1\times10^{-5}$ Torr.

Furthermore, an n/i buffer layer 251 of a-Si, an MW i-layer 214 of a-SiGe, a p/i buffer layer 261 of a-Si, RF p-layer 205 of a-SiC, and RF n-layer 303 of μc-Si were deposited successively in a similar manner to that in the example C2.

The substrate was then subjected to plasma treatment with hydrogen gas containing a small amount of Group V element under the conditions shown in Table C3(3). In this plasma treatment with hydrogen gas containing the small amount of Group V element according to the present invention, $PF_3/H_2$ (diluted to 10%) serving as Group V element, $SiH_4$ serving as silicon compound gas, and $H_2$ gas were introduced into the deposition chamber 417 via the gas inlet 429. The $H_2$ gas was supplied by opening the valves 441, 431, 430 and its flow rate was adjusted to 1400 sccm by means of the mass flow controller 436. Group-V element compound gas $PF_3$ was supplied by opening the valves 444 and 434 and its flow rate was controlled by the mass flow controller 439 such that the flow rate of the $PH_3$ gas was maintained at 0.2% of the total gas flow rate of $H_2$. The silicon compound gas or $SiH_4$ was supplied by opening the valves 443 and 433 and its flow rate was controlled by the mass flow controller 438 such that the flow rate of the $SiH_4$ gas was maintained at 0.04% of the total gas flow rate of $H_2$. Furthermore, the pressure inside the deposition chamber 417 was adjusted to 0.7 Torr by means of the conductance valve (not shown). The substrate 490 was heated by the substrate heater 410 up to 230° C. When the temperature of the substrate had become stable, RF power of 0.04 W/cm$^3$ was applied by the RF power supply 422 so that a glow discharge occurs in the plasma excitation cup 420. Under the above-described conditions, the substrate was exposed for 3 min to the hydrogen gas plasma containing the small amount of Group V element according to the present invention. The RF power was then shut off thereby eliminating the glow discharge. The supply of the $PF_3/H_2$ gas and $SiH_4$ gas into the deposition chamber 417 was stopped, whereas the $H_2$ gas was fed further for 3 min into the deposition chamber 417. Then, the $H_2$ gas was also shut off, and the inside of the deposition chamber 417 as well as the inside of the gas lines was evacuated down to $1\times10^{-5}$ Torr.

Furthermore, an n/i buffer layer 351 of a-SiC, an RF i-layer 314 of a-Si, a p/i buffer layer 361 of a-Si, and an RF p-layer 305 of a-Si were deposited successively by means of RFPCVD in a similar manner to that in the example C2.

ITO was then evaporated onto the RF p-layer 305 so as to form a transparent conductive layer 112 having a thickness of 70 nm.

A mask having a comb-shaped window was placed on the transparent conductive layer 112, and metal evaporation was performed via the mask thereby forming a comb-shaped collection electrode 113 having a multi-layer structure consisting of Cr(40 nm)/Ag(1000 nm)/Cr(40 nm).

In this way, a complete solar cell according to the invention was obtained. Hereafter, the solar cell of this type will be referred to as SC-EMB-C3. Tables C3(1) through C3(4) summarize the conditions used here in the invention, regarding the plasma treatment in an ambient of hydrogen containing a small amount of Group V element as well as the process conditions for the RF n-layer, n/i buffer layer, MW i-layer, p/i buffer layer, RF p-layer, RF n-layer, n/i buffer layer, MW i-layer, p/i buffer layer, RF p-layer, RF n-layer, n/i buffer layer, RF i-layer, p/i buffer layer, and RF p-layer.

COMPARATIVE EXAMPLE C3

For the sake of comparison, a solar cell (SC-CMP-C3) was also fabricated in the same manner as in the above-described example C3 except that the plasma treatment with hydrogen gas containing a small amount of Group V element according to the invention was not performed.

Seven samples were prepared for each type solar cell (SC-EMB-C3 and SC-CMP-C3) for the purpose of evaluation regarding the initial photoelectric conversion efficiency (the ratio of the electric output power to the optical input power), overall durability, durability under illumination, and overall durability and illumination with an applied bias voltage at a high temperature and high humidity.

The measurement of the initial photoelectric conversion efficiency was performed by measuring the V-I characteristics of the samples under the illumination condition of AM1.5 (100 mW/cm$^2$). Regarding the fill factor (FF) in the initial photoelectric conversion efficiency, series resistance, and the variation in the characteristics, the measurement results of the SC-EMB-C3 samples relative to those of the SC-CMP-C3 samples are shown below.

| | [Characteristics associated with the photoelectric conversion efficiency] FF | Series Resistance | Variation |
|---|---|---|---|
| SC-EMB-C3 | 1.14 | 0.88 | 0.84 |
| | (relative to the values of SC-CMP-C3) | | |

The vibration durability test was performed as follows: After the measurement of the initial photoelectric conversion efficiency, some examples were placed in a dark place kept at 25° C. and 55% relative humidity. Vibration having an amplitude of 0.1 mm and a frequency of 60 Hz was applied to the samples for 550 hr. After that, the photoelectric conversion efficiencies of the samples were measured under the illumination condition of AM1.5 (100 mW/$cm^2$) and the reduction relative to the initial value (the ratio of the photoelectric conversion efficiency after the vibration test to the initial value) was evaluated for each sample.

The durability under illumination was evaluated as follows: After the measurement of the initial photoelectric conversion efficiency, some examples were placed in a place kept at 25° C. and 55% relative humidity, and illuminated with light of AM1.5 (100 mW/$cm^2$ for 550 hr. After that, the photoelectric conversion efficiencies of the samples were measured under the illumination condition of AM1.5 (100 mW/$cm^2$) and the reduction relative to the initial value (the ratio of the photoelectric conversion efficiency after the illumination test to the initial value) was evaluated for each sample. The results are shown below regarding the reduction ratios of the photoelectric conversion efficiency after the illumination and vibration tests for the SC-CMP-C3 samples relative to the results of the SC-EMB-C3 samples.

[Reduction ratio of the photoelectric conversion efficiency]

| | Reduction due to vibration | Reduction due to illumination |
|---|---|---|
| SC-CMP-C3 | 0.84 | 0.83 |
| (relative to the results of SC-EMB-C3) | | |

Vibration and illumination durability tests were also performed under a biased condition at a high temperature and high humidity as described below: After the measurement of the initial photoelectric conversion efficiency, two samples were placed in a dark place kept at 82° C. and 93% relative humidity, and a forward bias voltage of 0.7 V was applied to both samples. Vibration was applied to one sample under the same conditions as those in the above-described non-biased vibration test, and degradation was evaluated. The other sample was illuminated with light of AM1.5, and degradation was evaluated. The results are shown below regarding the reduction ratios of the photoelectric conversion efficiency after the vibration and illumination tests for the SC-CMP-C3 samples relative to the results of the SC-EMB-C3 samples.

[Reduction ratio of the photoelectric conversion efficiency]

| | Reduction due to vibration | Reduction due to illumination |
|---|---|---|
| SC-CMP-C3 | 0.83 | 0.82 |
| (relative to the results of SC-EMB-C3) | | |

Furthermore, reliability test under a reverse bias condition was performed as described below: After the measurement of the initial photoelectric conversion efficiency, samples were placed in a dark place kept at 80° C. and 53% relative humidity, and a reverse bias voltage of 5.0 V was applied to the samples for 100 hr. After that, the photoelectric conversion efficiencies of the samples were measured under the illumination condition of AM1.5 (100 mW/$cm^2$) and the reduction relative to the initial value (the ratio of the photoelectric conversion efficiency after the reverse bias test to the initial value) was evaluated for each sample. The results are shown below for the SC-CMP-C3 samples relative to the results of the SC-EMB-C3 samples.

[Reduction ratio of the photoelectric conversion efficiency (after the reverse bias test)]

| | |
|---|---|
| SC-CMP-C3 | 0.85 |
| (relative to the result of SC-EMB-C3) | |

The surfaces of the above-described samples were observed via an optical microscope to evaluate film separation. No film separation was observed in the SC-EMB-C3 samples, whereas slight film separation was observed in the SC-CMP-C3 samples.

From the above results, it can be concluded that the solar cells (SC-EMB-C3) according to the present invention are better than the conventional solar cells (SC-CMP-C3) in the fill factor associated with the photoelectric conversion efficiency, series resistance, uniformity or reproducibility of characteristics, adhesion, and durability under various environmental conditions such as vibration, illumination, and application of a reverse bias voltage.

EXAMPLE C4

A solar cell, having a triple structure such as that shown in FIG. 6 that is the same structure as that employed in the above-described example C3, was fabricated using the deposition equipment shown in FIG. 7, wherein plasma treatment with hydrogen gas plasma containing a small amount of Group V element was performed three times under the conditions shown in Table C4(1). Other fabrication conditions employed are shown in Table C4(2).

The fabricated samples are evaluated in a similar manner to that in the example C3, and the results are shown in Table C4(3).

As can be seen from Table C4(3), it is preferable that the flow rate of hydrogen gas containing a small amount of Group V element in the plasma treatment be in the range of 1 to 2000 sccm to obtain good results in the fill factor associated with the photoelectric conversion efficiency, series resistance, uniformity or reproducibility of characteristics, adhesion, and durability under various environmental conditions such as vibration, illumination, and application of a reverse bias voltage.

EXAMPLE C5

A solar cell, having a triple structure such as that shown in FIG. 6, that is the same structure as that employed in the above-described example C3, was also fabricated using the deposition equipment shown in FIG. 7, wherein plasma treatment with hydrogen gas plasma containing a small amount of Group V element was performed three times under the conditions shown in Table C5(1). Other fabrication conditions employed are shown in Table C5(2).

The fabricated samples are evaluated in a similar manner to that in the example C3, and the results are shown in Table C5(3), In the above example C4, RF power was used to excite hydrogen gas containing a small amount of Group V element into a plasma state for use in the plasma treatment according to the invention. In contrast, VHF power was used in this example C5. As can be seen from Table C5(3), also in this case, it is preferable that the flow rate of hydrogen gas be in the range of 1 to 2000 sccm to obtain good results in the fill factor associated with the photoelectric conversion efficiency, series resistance, uniformity or reproducibility of characteristics, adhesion, and durability under various environmental conditions such as vibration, illumination, and application of a reverse bias voltage.

EXAMPLE C6

A solar cell, having a triple structure such as that shown in FIG. 6, that is the same structure as that employed in the above-described example C3, was also fabricated using the deposition equipment shown in FIG. 7, wherein plasma treatment with hydrogen gas plasma containing a small amount of Group V element was performed three times under the conditions shown in Table C6(1). Other fabrication conditions employed are shown in Table C6(2).

The fabricated samples are evaluated in a similar manner to that in the example C3, and the results are shown in Table C6(3).

As can be seen from Table C6(3), it is preferable that the concentration of the Group V element added to the hydrogen gas in the plasma treatment of the invention be in the range of 0.05% to 3% to obtain good results in the fill factor associated with the photoelectric conversion efficiency, series resistance, uniformity or reproducibility of characteristics, adhesion, and durability under various environmental conditions such as vibration, illumination, and application of a reverse bias voltage.

EXAMPLE C7

A solar cell, having a triple structure such as that shown in FIG. 6, that is the same structure as that employed in the above-described example C3, was also fabricated using the deposition equipment shown in FIG. 7, wherein plasma treatment with hydrogen gas plasma containing a small amount of Group V element was performed three times under the conditions shown in Table C7(1). Other fabrication conditions employed are shown in Table C7(2).

The fabricated samples are evaluated in a similar manner to that in the example C3, and the results are shown in Table C7(3).

In this example C7, VHF power was used to excite hydrogen gas containing a small amount of Group V element into a plasma state for use in the plasma treatment according to the invention, whereas RF power was used in the above example C6. As can be seen from Table C7(3), also in this case, it is preferable that the concentration of the Group V element added to the hydrogen gas in the plasma treatment of the invention be in the range of 0.05% to 3% to obtain good results in the fill factor associated with the photoelectric conversion efficiency, series resistance, uniformity or reproducibility of characteristics, adhesion, and durability under various environmental conditions such as vibration, illumination, and application of a reverse bias voltage.

EXAMPLE C8

A solar cell, having a triple structure such as that shown in FIG. 6, that is the same structure as that employed in the above-described example C3, was also fabricated using the deposition equipment shown in FIG. 7, wherein plasma treatment with hydrogen gas plasma containing a small amount of Group V element was performed three times under the conditions shown in Table C8(1). Other fabrication conditions employed are shown in Table C8(2).

The fabricated samples are evaluated in a similar manner to that in the example C3, and the results are shown in Table C8(3).

In this example C8, MW power was employed to excite hydrogen gas containing a small amount of Group V element into a plasma state for use in the plasma treatment according to the invention, whereas RF power was used in the above example C6. As can be seen from Table C8(3), still in this case, it is preferable that the concentration of the Group V element added to the hydrogen gas in the plasma treatment of the invention be in the range of 0.05% to 3% to obtain good results in the fill factor associated with the photoelectric conversion efficiency, series resistance, uniformity or reproducibility of characteristics, adhesion, and durability under various environmental conditions such as vibration, illumination, and application of a reverse bias voltage.

EXAMPLE C9

A solar cell, having a triple structure such as that shown in FIG. 6, that is the same structure as that employed in the above-described example C3, was also fabricated using the deposition equipment shown in FIG. 7, wherein plasma treatment with hydrogen gas plasma containing a small amount of Group V element was performed three times under the conditions shown in Table C9(1). Other fabrication conditions employed are shown in Table C9(2).

The fabricated samples are evaluated in a similar manner to that in the example C3, and the results are shown in Table C9(3).

As can be seen from Table C9(3), it is preferable that the concentration of the silicon compound gas added together with the Group V element to the hydrogen gas in the plasma treatment of the invention be in the range of 0.001% to 0.1% to obtain good results in the fill factor associated with the photoelectric conversion efficiency, series resistance, uniformity or reproducibility of characteristics, adhesion, and durability under various environmental conditions such as vibration, illumination, and application of a reverse bias voltage.

EXAMPLE C10

A solar cell, having a triple structure such as that shown in FIG. 6, that is the same structure as that employed in the above-described example C3, was also fabricated using the deposition equipment shown in FIG. 7, wherein plasma treatment with hydrogen gas plasma containing a small amount of Group V element was performed three times under the conditions shown in Table C10(1). Other fabrication conditions employed are shown in Table C10(2).

The fabricated samples are evaluated in a similar manner to that in the example C3, and the results are shown in Table C10(S).

In this example C10, VHF power was used to excite hydrogen gas containing a small amount of Group V element into a plasma state for use in the plasma treatment according to the invention, whereas RF power was used in the above example C9. As can be seen from Table C10(3), also in this case, it is preferable that the concentration of the silicon compound gas added together with the Group V element to the hydrogen gas in the plasma treatment of the invention be in the range of 0.001% to 0.1% to obtain good results in the fill factor associated with the photoelectric conversion efficiency, series resistance, uniformity or reproducibility of characteristics, adhesion, and durability under various environmental conditions such as vibration, illumination, and application of a reverse bias voltage.

EXAMPLE C11

A solar cell, having a triple structure such as that shown in FIG. 6, that is the same structure as that employed in the above-described example C3, was also fabricated using the deposition equipment shown in FIG. 7, wherein plasma treatment with hydrogen gas plasma containing a small amount of Group V element was performed three times under the conditions shown in Table C11(1). Other fabrication conditions employed are shown in Table C11(2).

The fabricated samples are evaluated in a similar manner to that in the example C3, and the results are shown in Table C11(S).

In this example C11, MN power was employed to excite hydrogen gas containing a small amount of Group V element into a plasma state for use in the plasma treatment according to the invention, whereas RF power was used in the above example C9. As can be seen from Table C11(3), still in this case, it is preferable that the concentration of the silicon compound gas added together with the Group V element to the hydrogen gas in the plasma treatment of the invention be in the range of 0.001% to 0.1% to obtain good results in the fill factor associated with the photoelectric conversion efficiency, series resistance, uniformity or reproducibility of characteristics, adhesion, and durability under various environmental conditions such as vibration, illumination, and application of a reverse bias voltage.

EXAMPLE C12

A solar cell, having a triple structure such as that shown in FIG. 6, that is the same structure as that employed in the above-described example C3, was also fabricated using the deposition equipment shown in FIG. 7, wherein plasma treatment with hydrogen gas plasma containing a small amount of Group V element was performed three times under the conditions shown in Table C12(1). Other fabrication conditions employed are shown in Table C12(2).

The fabricated samples are evaluated in a similar manner to that in the example C3, and the results are shown in Table C12(3).

In this example C12, RF power was used to excite hydrogen gas containing a small amount of Group V element into a plasma state for use in the plasma treatment according to the invention. In this case, as can be seen from Table C12(3), it is preferable that the pressure the hydrogen gas containing a small amount of Group V element in the plasma treatment of the invention be in the range of 0.05 Torr to 10 Torr to obtain good results in the fill factor associated with the photoelectric conversion efficiency, series resistance, uniformity or reproducibility of characteristics, adhesion, and durability under various environmental conditions such as vibration, illumination, and application of a reverse bias voltage.

EXAMPLE C13

A solar cell, having a triple structure such as that shown in FIG. 6, that is the same structure as that employed in the above-described example C3, was also fabricated using the deposition equipment shown in FIG. 7, wherein plasma treatment with hydrogen gas plasma containing a small amount of Group V element was performed three times under the conditions shown in Table C13(1). Other fabrication conditions employed are shown in Table C13(2).

The fabricated samples are evaluated in a similar manner to that in the example C3, and the results are shown in Table C13(3).

In this example C13, VHF power was used to excite hydrogen gas containing a small amount of Group V element into a plasma state for use in the plasma treatment according to the invention. In this case, as can be seen from Table C13(3), it is preferable that the pressure the hydrogen gas containing a small amount of Group V element in the plasma treatment of the invention be in the range of 0.0001 Torr to 1 Torr to obtain good results in the fill factor associated with the photoelectric conversion efficiency, series resistance, uniformity or reproducibility of characteristics, adhesion, and durability under various environmental conditions such as vibration, illumination, and application of a reverse bias voltage.

EXAMPLE C14

A solar cell, having a triple structure such as that shown in FIG. 6, that is the same structure as that employed in the above-described example C3, was also fabricated using the deposition equipment shown in FIG. 7, wherein plasma treatment with hydrogen gas plasma containing a small amount of Group V element was performed three times under the conditions shown in Table C14(1). Other fabrication conditions employed are shown in Table C14(2).

The fabricated samples are evaluated in a similar manner to that in the example C3, and the results are shown in Table C14(3).

In this example C14, MW power was used to excite hydrogen gas containing a small amount of Group V element into a plasma state for use in the plasma treatment according to the invention. In this case, as can be seen from Table C14(3), it is preferable that the pressure the hydrogen gas containing a small amount of Group V element in the plasma treatment of the invention be in the range of 0.0001 Torr to 0.01 Torr to obtain good results in the fill factor associated with the photoelectric conversion efficiency, series resistance, uniformity or reproducibility of characteristics, adhesion, and durability under various environmental conditions such as vibration, illumination, and application of a reverse bias voltage.

EXAMPLE C15

A solar cell, having a triple structure such as that shown in FIG. 6, that is the same structure as that employed in the above-described example C3, was also fabricated using the deposition equipment shown in FIG. 7, wherein plasma treatment with hydrogen gas plasma containing a small amount of Group V element was performed three times under the conditions shown in Table C15(1). Other fabrication conditions employed are shown in Table C15(2).

The fabricated samples are evaluated in a similar manner to that in the example C3, and the results are shown in Table C15(3).

In this example C15, RF power was used to excite hydrogen gas containing a small amount of Group V element into a plasma state for use in the plasma treatment according to the invention. In this case, as can be seen from Table C15(3), it is preferable that the power density (electric power density) in the plasma treatment with hydrogen gas containing a small amount of Group V element be in the range of 0.01 $W/cm^3$ to 1.0 $W/cm^3$ to obtain good results in the fill factor associated with the photoelectric conversion efficiency, series resistance, uniformity or reproducibility of characteristics, adhesion, and durability under various environmental conditions such as vibration, illumination, and application of a reverse bias voltage.

EXAMPLE C16

A solar cell, having a triple structure such as that shown in FIG. 6, that is the same structure as that employed in the above-described example C3, was also fabricated using the deposition equipment shown in FIG. 7, wherein plasma treatment with hydrogen gas plasma containing a small amount of Group V element was performed three times under the conditions shown in Table C16(1). Other fabrication conditions employed are shown in Table C16(2).

The fabricated samples are evaluated in a similar manner to that in the example C3, and the results are shown in Table C16(3).

In this example C16, VHF power was used to excite hydrogen gas containing a small amount of Group V element into a plasma state for use in the plasma treatment according to the invention. In this case, as can be seen from Table C16(3), it is preferable that the power density (electric power density) in the plasma treatment with hydrogen gas containing a small amount of Group V element be in the range of 0.01 W/cm$^3$ to 1.0 W/cm$^3$ to obtain good results in the fill factor associated with the photoelectric conversion efficiency, series resistance, uniformity or reproducibility of characteristics, adhesion, and durability under various environmental conditions such as vibration, illumination, and application of a reverse bias voltage.

EXAMPLE C17

A solar cell, having a triple structure such as that shown in FIG. 6, that is the same structure as that employed in the above-described example C3, was also fabricated using the deposition equipment shown in FIG. 7, wherein plasma treatment with hydrogen gas plasma containing a small amount of Group V element was performed three times under the conditions shown in Table C17(1). Other fabrication conditions employed are shown in Table C17(2).

The fabricated samples are evaluated in a similar manner to that in the example C3, and the results are shown in Table C17(3).

In this example C17, MW power was used to excite hydrogen gas containing a small amount of Group V element into a plasma state for use in the plasma treatment according to the invention. In this case, as can be seen from Table C17(3), it is preferable that the power density (electric power density) in the plasma treatment with hydrogen gas containing a small amount of Group V element be in the range of 0.1 W/cm$^3$ to 10 W/cm$^3$ to obtain good results in the fill factor associated with the photoelectric conversion efficiency, series resistance, uniformity or reproducibility of characteristics, adhesion, and durability under various environmental conditions such as vibration, illumination, and application of a reverse bias voltage.

EXAMPLE C18

A solar cell, having a triple structure such as that shown in FIG. 6, that is the same structure as that employed in the above-described example C3, was also fabricated using the deposition equipment shown in FIG. 7, wherein plasma treatment with hydrogen gas plasma containing a small amount of Group V element was performed three times under the conditions shown in Table C18(1). Other fabrication conditions employed are shown in Table C18(2).

The fabricated samples are evaluated in a similar manner to that in the example C3, and the results are shown in Table C18(3).

In this example C18, RF power was used to excite hydrogen gas containing a small amount of Group V element into a plasma state for use in the plasma treatment according to the invention. In this case, as can be seen from Table C18(3), it is preferable that the substrate temperature in the plasma treatment with hydrogen gas containing a small amount of Group V element be in the range of 100° C. to 400° C. to obtain good results in the fill factor associated with the photoelectric conversion efficiency, series resistance, uniformity or reproducibility of characteristics, adhesion, and durability under various environmental conditions such as vibration, illumination, and application of a reverse bias voltage.

EXAMPLE C19

A solar cell, having a triple structure such as that shown in FIG. 6, that is the same structure as that employed in the above-described example C3, was also fabricated using the deposition equipment shown in FIG. 7, wherein plasma treatment with hydrogen gas plasma containing a small amount of Group V element was performed three times under the conditions shown in Table C19(1). Other fabrication conditions employed are shown in Table C19(2).

The fabricated samples are evaluated in a similar manner to that in the example C3, and the results are shown in Table C19(3).

In this example C19, VHF power was used to excite hydrogen gas containing a small amount of Group V element into a plasma state for use in the plasma treatment according to the invention. In this case, as can be seen from Table C19(3), it is preferable that the substrate temperature in the plasma treatment with hydrogen gas containing a small amount of Group V element be in the range of 50° C. to 300° C. to obtain good results in the fill factor associated with the photoelectric conversion efficiency, series resistance, uniformity or reproducibility of characteristics, adhesion, and durability under various environmental conditions such as vibration, illumination, and application of a reverse bias voltage.

EXAMPLE C20

A solar cell, having a triple structure such as that shown in FIG. 6, that is the same structure as that employed in the above-described example C3, was also fabricated using the deposition equipment shown in FIG. 7, wherein plasma treatment with hydrogen gas plasma containing a small amount of Group V element was performed three times under the conditions shown in Table C20(1). Other fabrication conditions employed are shown in Table C20(2).

The fabricated samples are evaluated in a similar manner to that in the example C3, and the results are shown in Table C20(3).

In this example C20, MW power was used to excite hydrogen gas containing a small amount of Group V element into a plasma state for use in the plasma treatment according to the invention. In this case, as can be seen from Table C20(3), it is preferable that the substrate temperature in the plasma treatment with hydrogen gas containing a small amount of Group V element be in the range of 50° C. to 300° C. to obtain good results in the fill factor associated with the photoelectric conversion efficiency, series resistance, uniformity or reproducibility of characteristics, adhesion, and durability under various environmental conditions such as vibration, illumination, and application of a reverse bias voltage.

EXAMPLE C21 ACCORDING TO THE INVENTION

A solar cell, having a triple structure such as that shown in FIG. 6 was fabricated using the deposition equipment shown in FIG. 7. A substrate 490 was prepared according to a similar process to that in the example C1 such that a reflection layer 101 and a reflection enhancing layer 102 were formed on a base. The substrate 490 was placed on the substrate transfer rail 413 in the load chamber 401, and the load chamber 401 was evacuated with the vacuum pump (not shown) down to a pressure of about $1\times10^{-5}$ Torr. Then, the gate valve 406 was opened, and the substrate 490 was transferred to the deposition chamber 417 via the transfer chamber 402 wherein both deposition chamber 417 and transfer chamber 402 had already been evacuated with the vacuum pump (not shown). The substrate 490 was placed such that the back surface of the substrate 490 came into contact with the heater 410 so that the substrate 490 was heated. The inside of the deposition chamber 417 was evacuated with the vacuum pump (not shown) down to a pressure of about $1\times10^{-5}$ Torr.

The substrate was then subjected to plasma treatment with hydrogen gas containing a small amount of silane-based gas under the conditions shown in Table C21(1), according to the present invention. In this plasma treatment with hydrogen gas containing the small amount of silane-based gas according to the present invention, $SiH_4/H_2$ (diluted to 1000 ppm) serving as silicon compound gas and $H_2$ were introduced into the deposition chamber 417 via the gas inlet 429 wherein the $H_2$ gas was supplied by opening the valves 441, 431, 430 and its flow rate was adjusted to 1150 sccm by means of the mass flow controller 436, and wherein the gas containing $SiH_4$ was supplied by opening the valves 442 and 432 and its flow rate was controlled by the mass flow controller 437 such that the flow rate of the $SiH_4$ gas was maintained at 0.03% of the total gas flow rate of $H_2$. Furthermore, the pressure inside the deposition chamber 417 was adjusted to 0.8 Torr by means of the conductance valve (not shown). The substrate 490 was heated by the substrate heater 410 up to 360° C. When the temperature of the substrate had become stable, RF power of 0.05 W/cm$^3$ was applied by the RF power supply 422 so that a glow discharge occurs in the plasma excitation cup 420. Under the above-described conditions, the substrate was exposed for 3 min to the hydrogen gas plasma containing the small amount of silane-based gas according to the present invention. The RF power was then shut off thereby eliminating the glow discharge. The supply of the $SiH_4/H_2$ gas (diluted to 1000 ppm) into the deposition chamber 417 was stopped, whereas the $H_2$ gas was fed further for 5 min into the deposition chamber 417. Then, the $H_2$ gas was also shut off, and the inside of the deposition chamber 417 as well as the inside of the gas lines was evacuated down to $1\times10^{-5}$ Torr. Thus, the preparation for semiconductor film deposition was complete, and an RF n-layer was 103 of μc-Si was deposited on the substrate in a similar manner to that in the example C2.

The substrate 490 was then subjected to plasma treatment in hydrogen gas plasma containing a small amount of Group V element of the invention under the conditions shown in Table C21(2).

An n/i buffer layer 151 of a-SiC was then deposited by means of RFPCVD in a similar manner to that in the example C2.

The substrate 490 was then subjected to plasma treatment in hydrogen gas plasma containing a small amount of silane-based gas of the invention under the conditions shown in Table C21(3).

An MW i-layer 114 of a-SiGe was then deposited by means of MWPCVD in a similar manner to that in the example C2.

The substrate 490 was then subjected to plasma treatment in hydrogen gas plasma containing a small amount of silane-based gas of the invention under the conditions shown in Table C21(4).

A p/i buffer layer 161 of a-SiC was then deposited by means of RFPCVD in a similar manner to that in the example C2.

The substrate 490 was then subjected to plasma treatment in hydrogen gas plasma containing a small amount of silane-based gas of the invention under the conditions shown in Table C21(5).

An RF p-layer 105 of a-SiC was then deposited by means of RFPCVD in a similar manner to that in the example C2.

The substrate 490 was then subjected to plasma treatment in hydrogen gas plasma containing a small amount of silane-based gas of the invention under the conditions shown in Table C21(6).

An RF n-layer 208 of μc-Si was then deposited by means of RFPCVD in a similar manner to that in the example C2.

The substrate 490 was then subjected to plasma treatment in hydrogen gas plasma containing a small amount of silane-based gas of the invention under the conditions shown in Table C21(7).

An n/i buffer layer 251 of a-SiC was then deposited by means of RFPCVD in a similar manner to that in the example C2.

The substrate 490 was then subjected to plasma treatment in hydrogen gas plasma containing a small amount of silane-based gas of the invention under the conditions shown in Table C21(8).

An MW i-layer 214 of a-SiGe was then deposited by means of MWPCVD in a similar manner to that in the example C2.

The substrate 490 was then subjected to plasma treatment in hydrogen gas plasma containing a small amount of silane-based gas of the invention under the conditions shown in Table C21(9).

A p/i buffer layer 261 of a-SiC was then deposited by means of RFPCVD in a similar manner to that in the example C2.

The substrate 490 was then subjected to plasma treatment in hydrogen gas plasma containing a small amount of silane-based gas of the invention under the conditions shown in Table C21(10).

An RF p-layer 205 of a-SiC was then deposited in a similar manner to that in the example C2.

The substrate 490 was then subjected to plasma treatment in hydrogen gas plasma containing a small amount of silane-based gas of the invention under the conditions shown in Table C21(11).

An RF n-layer 303 of μc-Si was then deposited in a similar manner to that in the example C2.

The substrate 490 was then subjected to plasma treatment in hydrogen gas plasma containing a small amount of Group V element of the invention under the conditions shown in Table C21(12).

An n/i buffer layer 351 of a-SiC was then deposited by means of RFPCVD in a similar manner to that in the example C2.

The substrate 490 was then subjected to plasma treatment in hydrogen gas plasma containing a small amount of silane-based gas of the invention under the conditions shown in Table C21(13).

An RF i-layer 314 of a-Si was then deposited by means of RFPCVD in a similar manner to that in the example C2.

The substrate 490 was then subjected to plasma treatment in hydrogen gas plasma containing a small amount of silane-based gas of the invention under the conditions shown in Table C21(14).

A p/i buffer layer 361 of a-SiC was then deposited by means of RFPCVD in a similar manner to that in the example C2.

The substrate 490 was then subjected to plasma treatment in hydrogen gas plasma containing a small amount of silane-based gas of the invention under the conditions shown in Table C21(15).

An RF p-layer 305 of a-SiC was then deposited by means of RFPCVD in a similar manner to that in the example C2.

ITO was then evaporated onto the RF p-layer 305 so as to form a transparent conductive layer 112 having a thickness of 70 nm.

A mask having a comb-shaped window was placed on the transparent conductive layer 112, and metal evaporation was performed via the mask thereby forming a comb-shaped collection electrode 113 having a multi-layer structure consisting of Cr(40 nm)/Ag(1000 nm)/Cr(40 nm).

In this way, a complete solar cell according to the invention was obtained. Hereafter, the solar cell of this type will be referred to as SC-EMB-C21. Tables C21(1) through C21(16) summarize the conditions used here in the invention, regarding the plasma treatment in an ambient of hydrogen containing a small amount of Group V element, the plasma treatment in an ambient of hydrogen containing a small amount of silane-based gas, and the process conditions for the RF n-layer, n/i buffer layer, MW i-layer, p/i buffer layer, RF p-layer, RF n-layer, n/i buffer layer, MW i-layer, p/i buffer layer, RF p-layer, RF n-layer, n/i buffer layer, RF i-layer, p/i buffer layer, and RF p-layer.

COMPARATIVE EXAMPLE C21

For the sake of comparison, a solar cell (SC-CMP-C21) was also fabricated in the same manner as in the above-described example C21 except that the plasma treatment with hydrogen gas containing a small amount of Group V element and silane-based gas according to the invention was not performed.

Seven samples were prepared for each type solar cell (SC-EMB-C21 and SC-CMP-C21) for the purpose of evaluation regarding the initial photoelectric conversion efficiency (the ratio of the electric output power to the optical input power), overall durability, durability under illumination, and overall durability and illumination with an applied bias voltage at a high temperature and high humidity.

The measurement of the initial photoelectric conversion efficiency was performed by measuring the V-I characteristics of the samples under the illumination condition of AM1.5 (100 mW/cm$^2$). Regarding the fill factor (FF) in the initial photoelectric conversion efficiency, series resistance, and the variation in the characteristics, the measurement results of the SC-EMB-C21 samples relative to those of the SC-CMP-C21 samples are shown below.

| [Characteristics associated with the photoelectric conversion efficiency] | FF | Series Resistance | Variation |
|---|---|---|---|
| SC-EMB-C21 | 1.20 | 0.85 | 0.80 |
| (relative to the values of SC-CMP-C21) | | | |

The vibration durability test was performed as follows: After the measurement of the initial photoelectric conversion efficiency, some examples were placed in a dark place kept at 26° C. and 58% relative humidity. Vibration having an amplitude of 0.1 mm and a frequency of 60 Hz was applied to the samples for 560 hr. After that, the photoelectric conversion efficiencies of the samples were measured under the illumination condition of AM1.5 (100 mW/cm2) and the reduction relative to the initial value (the ratio of the photoelectric conversion efficiency after the vibration test to the initial value) was evaluated for each sample.

The durability under illumination was evaluated as follows: After the measurement of the initial photoelectric conversion efficiency, some examples were placed in a place kept at 26° C. and 58% relative humidity, and illuminated with light of AM1.5 (100 mW/cm$^2$ for 560 hr. After that, the photoelectric conversion efficiencies of the samples were measured under the illumination condition of AM1.5 (100 mW/cm$^2$) and the reduction relative to the initial value (the ratio of the photoelectric conversion efficiency after the illumination test to the initial value) was evaluated for each sample. The results are shown below regarding the reduction ratios of the photoelectric conversion efficiency after the illumination and vibration tests for the SC-CMP-C21 samples relative to the results of the SC-EMB-C21 samples.

| [Reduction ratio of the photoelectric conversion efficiency] | Reduction due to vibration | Reduction due to illumination |
|---|---|---|
| SC-CMP-C21 | 0.82 | 0.80 |
| (relative to the results of SC-EMB-C21) | | |

Vibration and illumination durability tests were also performed under a biased condition at a high temperature and high humidity as described below: After the measurement of the initial photoelectric conversion efficiency, two samples were placed in a dark place kept at 83° C. and 95% relative humidity, and a forward bias voltage of 0.71 V was applied to both samples. Vibration was applied to one sample under the same conditions as those in the above-described non-biased vibration test, and degradation was evaluated. The other sample was illuminated with light of AM1.5, and degradation was evaluated. The results are shown below regarding the reduction ratios of the photoelectric conversion efficiency after the vibration and illumination tests for the SC-CMP-C21 samples relative to the results of the SC-EMB-C21 samples.

[Reduction Ratio of the Photoelectric Conversion Efficiency]

| [Reduction ratio of the photoelectric conversion efficiency] | Reduction due to vibration | Reduction due to illumination |
|---|---|---|
| SC-CMP-C21 | 0.80 | 0.80 |
| (relative to the results of SC-EMB-C21) | | |

Furthermore, reliability test under a reverse bias condition was performed as described below: After the measurement of the initial photoelectric conversion efficiency, samples were placed in a dark place kept at 80° C. and 54% relative humidity, and a reverse bias voltage of 5.0 V was applied to the samples for 100 hr. After that, the photoelectric conversion efficiencies of the samples were measured under the illumination condition of AM1.5 (100 mW/cm$^2$) and the reduction relative to the initial value (the ratio of the photoelectric conversion efficiency after the reverse bias test to the initial value) was evaluated for each sample. The results are shown below for the SC-CMP-C21 samples relative to the results of the SC-EMB-C21 samples.

| | |
|---|---|
| [Reduction ratio of the photoelectric conversion efficiency (after the reverse bias test)] | |
| SC-CMP-C21 | 0.82 |
| (relative to the result of SC-EMB-C21) | |

The surfaces of the above-described samples were observed via an optical microscope to evaluate film separation. No film separation was observed in the SC-EMB-C21 samples, whereas slight film separation was observed in the SC-CMP-C21 samples.

From the above results, it can be concluded that the solar cells (SC-EMB-C21) according to the present invention are better than the conventional solar cells (SC-CMP-C21) in the fill factor associated with the photoelectric conversion efficiency, series resistance, uniformity or reproducibility of characteristics, adhesion, and durability under various environmental conditions such as vibration, illumination, and application of a reverse bias voltage.

In the above-described examples of solar cells according to the present invention, semiconductor layers were deposited on a substrate in the order of n-layer, n/i buffer layer, i-layer, p/i buffer layer, and p-layer. Similar experiments were also performed for the structure in which semiconductor layers were deposited in the opposite order, that is, p-layer, p/i buffer layer, i-layer, n/i buffer layer, and n-layer wherein plasma treatment according to the present invention was performed in a similar manner. The samples of this type solar cell were evaluated in a similar manner in those in the previous examples. It was found out that these samples were also excellent in the fill factor associated with the photoelectric conversion efficiency, series resistance, uniformity or reproducibility of characteristics, and durability under various environmental conditions such as vibration, illumination, and application of a reverse bias voltage. Furthermore, it has also been found out that further improvement can be achieved by performing plasma treatment on the interface between a substrate and a p-layer, and/or the between a p/i buffer layer and a p-layer, and/or the interface between a p/i buffer layer and an i-layer, and/or the interface between an n/i buffer layer and an i-layer wherein the plasma treatment is performed using hydrogen gas plasma containing silicon compound gas whose concentration is so small that no substantial deposition occurs.

EXAMPLE D1 ACCORDING TO THE INVENTION

A solar cell having a structure illustrated in FIG. 2 was made using the deposition equipment shown in FIG. 7. First, a substrate was prepared. A stainless-steel base 100 having dimensions of 0.5 mm in thickness and 50×50 $mm^2$ in area was cleaned with acetone and isopropanol by means of ultrasonic cleaning, and then dried with hot air.

An Ag optical reflection layer 101 having a thickness of 0.3 μm was deposited on a surface of the stainless-steel base 100 in sputtering at room temperature, and a 1.0-μm-thick ZnO layer acting as a reflection enhancing layer 102 was further deposited on it at 350° C. Thus, the complete substrate was prepared.

Using the deposition equipment 400 having the capabilities of both MWPCVD and RFPCVD, semiconductor layers were then deposited on the reflection enhancing layer 102.

The deposition equipment was connected to source gas cylinders (not shown) via gas inlets. The source gas cylinders used here contained gas refined with ultra high purity, $SiH_4$, $SiF_4$, $CH_4$, $GeH_4$, $GeF_4$, $Si_2H_6$, $PH_3/H_2$ (diluted to 1000 ppm), $B_2H_6/H_2$ (diluted to 2000 ppm), $H_2$, He, $SiCl_2H_2$, and $SiH_4/H_2$ (diluted to 1000 ppm) gas.

The substrate 490 on which the optical reflection layer 101 and the reflection enhancing layer 102 had been formed was placed on the substrate transfer rail 413 in the load chamber 401, and the load chamber 401 was evacuated with a vacuum pump (not shown) down to a pressure of about $1\times10^{-5}$ Torr. Then, the gate valve 406 was opened, and the substrate 490 was transferred to the deposition chamber 417 via the transfer chamber 402, both deposition chamber 417 and transfer chamber 402 having been evacuated with a vacuum pump (not shown). The substrate 490 was placed so as to contact with the heater 410 at its rear surface, and heated. The inside of the deposition chamber 417 was evacuated with the vacuum pump (not show) down to a pressure of about $1\times10^{-5}$ Torr.

In this way, semiconductor film deposition was prepared, and an RF n-layer 103 of μc-Si was then deposited, as described below.

To deposit the RF n-layer of μc-Si, $H_2$ gas was introduced into the deposition chamber 417 via the gas inlet 429. The $H_2$ gas was supplied by opening the valves 441, 431, 430 and its flow rate was adjusted to 180 sccm by means of the mass flow controller 436. Furthermore, the pressure inside the deposition chamber 417 was adjusted to 1.15 Torr by means of the conductance valve (not shown). The substrate 490 was heated by the substrate heater 410 up to 370° C. When the temperature of the substrate had become stable, the valves 443, 433, 444, and 434 were opened to introduce $SiH_4$ gas and $PH_3/H_2$ gas into the deposition chamber 417 via the gas inlet 429. The flow rates of $SiH_4$, $H_2$, and $PH_3/H_2$ were adjusted to 1.5 sccm, 120 sccm, and 200 sccm, respectively, by the mass flow controllers 438, 436, and 439. The pressure inside the deposition chamber 417 was adjusted to 1.15 Torr. An RF power of the RF power supply 422 was set to 0.04 $W/cm^3$ and applied to the plasma excitation cup 420 to activate a glow discharge. The deposition of the RF n-layer was started. When the thickness of the deposited RF n-layer reached 20 nm, the RF power was shut off to stop the glow discharge. The deposition of the RF n-layer 103 was finished. The supply of $SiH_4$ and $PH_3/H_2$ into the deposition chamber 417 was stopped, whereas $H_2$ was fed further for five minutes into the deposition chamber 417. Then, $H_2$ was also shut off, and the inside of the deposition chamber 417 as well as the inside of the gas lines was evacuated down to $1\times10^{-5}$ Torr.

An n/i buffer layer 151 of a-Si was then deposited by means of RFPCVD as described below.

The gate valve 407 was opened, and the substrate 490 was transferred to the i-layer deposition chamber 418 via the transfer chamber 403, both deposition chamber 418 and transfer chamber 403 having been evacuated with a vacuum pump (not shown). The substrate 490 was placed so as to contact with the heater 411 at its rear surface, and heated. The inside of the i-layer deposition chamber 418 was evacuated with the vacuum pump (not show) down to a pressure of about $1\times10^{-5}$ Torr.

To deposit the n/i buffer layer 151, the substrate 490 was heated by the substrate heater 411 up to 360° C. When the substrate had been heated enough, the valves 464, 454, 450, 463, and 453 were opened gradually to supply $Si_2H_6$ and $H_2$ to the i-layer deposition chamber 418 via the gas inlet 449.

The flow rates of $Si_2H_6$ and $H_2$ were adjusted to 3.5 sccm and 90 sccm, respectively, by the mass flow controllers 459 and 458. The pressure inside the i-layer deposition chamber 418 was set to 0.8 Torr by adjusting the opening ratio of a conductance valve (not shown). Then, a high-frequency (RF) power of 0.06 W/cm$^3$ was applied to the bias bar 428 by the RF power supply 424 to excite a glow discharge. The shutter 427 was then opened, and depositing the n/i buffer layer on the RF n-layer was started. When the thickness of the deposited n/i buffer layer reached 10 nm, the RF glow discharge was stopped, and the RF power supply 424 was shut off. The deposition of the n/i buffer layer 151 was finished. The valves 464 and 454 were closed to stop the supply of $Si_2H_6$ to the i-layer deposition chamber 418, whereas $H_2$ was fed further for two minutes into the i-layer deposition chamber 418. Then, the valves 453 and 450 were closed, and the inside of the i-layer deposition chamber 418 as well as the inside of the gas lines was evacuated down to $1\times10^{-5}$ Torr.

The substrate was then subjected to plasma treatment with hydrogen gas containing a small amount of silane-based gas under the conditions shown in Table D1(1), according to the present invention.

In this plasma treatment with hydrogen gas containing the small amount of silane-based gas according to the present invention, $SiH_4$ serving as silicon compound gas and $H_2$ were introduced into the deposition chamber 418 via the gas inlet 449. The $H_2$ gas was supplied by opening the valves 463, 453, 450 and its flow rate was adjusted to 800 sccm by means of the mass flow controller 458. The silicon compound gas was supplied by opening the valves 461 and 451 and its flow rate was controlled by the mass flow controller 456 such that the flow rate of the $SiH_4$ gas was maintained at 0.01% of the total gas flow rate of $H_2$. Furthermore, the pressure inside the deposition chamber 418 was adjusted to 0.9 Torr by means of a conductance valve (not shown). The substrate 490 was heated by the substrate heater 411 up to 360° C. When the temperature of the substrate had become stable, an RF power of 0.05 W/cm$^3$ was applied to the bias bar 428 by the RF power supply 424 so that a glow discharge occurs in the deposition chamber 418. Under the above-described conditions, the substrate was exposed for 3 minutes to the hydrogen gas plasma containing the small amount of silane-based gas according to the present invention. The RF power was then shut off to stop the glow discharge. The supply of the $SiH_4$ gas into the deposition chamber 418 was stopped, whereas the $H_2$ gas was fed further for 3 minutes into the deposition chamber 418. Then, the $H_2$ gas was also shut off, and the inside of the deposition chamber 418 as well as the inside of the gas lines was evacuated down to $1\times10^{-5}$ Torr.

An MW i-layer 114 of a-SiGe and a p/i buffer layer 161 of a-Si were then deposited by means of MWPCVD and RFPCVD as described below.

To deposit the MW i-layer, the substrate 490 was heated by the substrate heater 411 up to 360° C. When the substrate had been heated enough, the valves 461, 451, 450, 462, 452, 463, and 453 were opened gradually to supply $SiH_4$, $GeH_4$, and $H_2$ to the i-layer deposition chamber 418 via the gas inlet 449. The flow rates of $SiH_4$, $GeH_4$, and $H_2$ were adjusted to 38, 37, and 150 sccm, respectively, by the mass flow controllers 456, 457, and 458. The pressure inside the i-layer deposition chamber 418 was set to 5 mTorr by adjusting the opening ratio of a conductance valve (not shown). Then, a high-frequency (RF) power of 0.60 W/cm$^3$ was applied to the bias bar 428 by the RF power supply 424. The power of the MW power supply (not shown) was set to 0.30 W/cm$^3$ and introduced into the i-layer deposition chamber 418 through the wave guide 426 and the microwave entrance window 425 to excite a glow discharge. The shutter 427 was then opened, and depositing the MW i-layer 114 onto the n/i buffer layer 151 was started. When the thickness of the deposited MW i-layer 114 reached 0.15 μm, the MW glow discharge was stopped, and the RF power supply 424 was shut off. The deposition of the MW i-layer 114 was finished. The valves 451 and 452 were closed to stop the supply of $SiH_4$ and $GeH_4$ to the i-layer deposition chamber 418, whereas $H_2$ was fed further for two minutes into the i-layer deposition chamber 418. Then, the valves 453 and 450 were closed, and the inside of the i-layer deposition chamber 418 as well as the inside of the gas lines was evacuated down to $1\times10^{-5}$ Torr.

To deposit the p/i buffer layer 161, the substrate 490 was heated by the substrate heater 411 up to 250° C. When the substrate had been heated enough, the valves 464, 454, 450, 463, and 453 were opened gradually to supply $Si_2H_6$ and $H_2$ to the i-layer deposition chamber 418 via the gas inlet 449. The flow rates of $Si_2H_6$ and $H_2$ were adjusted to 3 sccm and 80 sccm, respectively, by the mass flow controllers 459 and 458. The pressure inside the i-layer deposition chamber 418 was set to 0.7 Torr by adjusting the opening ratio of a conductance valve (not shown). Then, an RF power of 0.06 W/cm$^3$ was applied to the bias bar 428 by the RF power supply 424 to excite a glow discharge. The shutter 427 was then opened, and depositing the p/i buffer layer on the MW i-layer was started. When the thickness of the deposited p/i buffer layer reached 20 nm, the RF glow discharge was stopped, and the RF power supply 424 was shut off. The deposition of the p/i buffer layer 161 was finished. The valves 464 and 454 were closed to stop the supply of $Si_2H_6$ to the i-layer deposition chamber 418, whereas $H_2$ was fed further for two minutes into the i-layer deposition chamber 418. Then, the valves 453 and 450 were closed, and the inside of the i-layer deposition chamber 418 as well as the inside of the gas lines was evacuated down to $1\times10^{-5}$ Torr.

An RF p-layer 105 of a-SiC was deposited. To deposit the RF p-layer 105 of a-SiC, the gate valve 408 was opened, and the substrate 490 was transferred to the p-layer deposition chamber 419 via the transfer chamber 404, both deposition chamber 419 and transfer chamber 404 having been evacuated with a vacuum pump (not shown). The substrate 490 was placed so as to contact with the heater 412 at its rear surface, and heated. The inside of the p-layer deposition chamber 419 was evacuated with the vacuum pump (not show) down to a pressure of about $1\times10^{-5}$ Torr.

The substrate 490 was heated by the substrate heater 412 up to 200° C. When the temperature of the substrate had become stable, the valves 481, 471, 470, 482, 472, 483, 473, 484, and 474 were opened to supply $H_2$ gas, $SiH_4/H_2$ gas, $B_2H_6/H_2$ gas, and $CH_4$ gas to the deposition chamber 419 via the gas inlet 469. The flow rates of the $H_2$, $SiH_4/H_2$, $B_2H_6/H_2$, and $CH_4$, were adjusted to 60 sccm, 1 sccm, 10 sccm, and 0.3 sccm, respectively, by the mass flow controllers 476, 477, 478, and 479. The pressure inside the chamber 419 was set to 1.3 Torr by adjusting the opening ratio of a conductance valve (not shown). An RF power of 0.09 W/cm$^3$ was applied by the RF power supply 423 to the plasma excitation cup 421 to activate a glow discharge, and deposition of the RF p-layer 105 on the p/i buffer layer 161 was started. When the thickness of the deposited RF p-layer 105 reached 10 nm, the RF power was shut off to stop the glow discharge. The deposition of the RF p-layer 105 was finished. The valves 472, 482, 473, 483, 474, and 484 were closed to stop the supply of $SiH_4/H_2$, $B_2H_6/H_2$, and $CH_4$ to the p-layer deposition chamber 419, whereas $H_2$ was fed further for three minutes into the p-layer deposition chamber 419. Then, the valves 471, 481, and 470 were closed, and the inside of the p-layer deposition chamber 419 as well as the inside of the gas lines was evacuated down to $1\times10^{-5}$ Torr.

The gate valve 409 was then opened, and the substrate 490 was transferred to the unload chamber 405 which had already been evacuated with a vacuum pump (not shown). Then, a leak valve (not shown) was opened so that the inside of the unload chamber 405 was exposed to the ambient atmosphere.

ITO was then evaporated onto the RF p-layer 105 so as to form a transparent conductive layer 112 having a thickness of 70 nm.

A mask having a comb-shaped window was placed on the transparent conductive layer 112, and metal evaporation was performed via the mask to form a comb-shaped collection electrode 113 having a multi-layer structure consisting of Cr (40 nm), Ag (1000 nm), and Cr (40 nm).

In this way, the complete solar cell according to the invention was obtained. Hereinafter, the solar cell of this type will be referred to as SC-EMB-D1. Tables D1(1) and D1(2) indicate the conditions used here in the invention, regarding the plasma treatment with hydrogen containing a small amount of silane-based gas as well as the process conditions for the RF n-layer, RF n/i buffer layer, MW i-layer, RF p/i buffer layer, and RF p-layer.

COMPARATIVE EXAMPLE D1

For the sake of comparison, a solar cell (SC-CMP-D1) was also fabricated in the same manner as in the above-described example D1 except that the plasma treatment with hydrogen gas containing a small amount of silane-based gas according to the invention was not performed.

Eight samples of solar cells were prepared for each type (SC-EMB-D1 and SC-CMP-D1) for the purpose of evaluation regarding the initial photoelectric conversion efficiency (the ratio of the electric output power to the optical input power), vibration durability and optical durability under a biased condition at high temperature with high humidity, and vibration durability and optical durability under a non-biased condition.

The measurement of the initial photoelectric conversion efficiency was performed by measuring the V-I characteristics of the samples under the illumination condition of AM 1.5 (100 mW/cm$^2$). The measurement revealed that the SC-EMB-D1 samples had a smaller variation (that is, more preferable) in the initial photoelectric conversion efficiencies than the SC-CMP-D1 samples and had a larger fill factor (F.F.) as shown below:

| | [Fill factor (F.F.)] | [Variation] |
|---|---|---|
| SC-EMB-D1 | 1.10<br>(relative to that of SC-CMP-D1) | 0.84 |

The vibration durability test under the non-biased condition was performed as follows: After the measurement of the initial photoelectric conversion efficiency, some samples were placed in a dark place kept at 25° C. with a relative humidity of 55%. Vibration having an amplitude of 0.1 mm and a frequency of 60 Hz was applied to the samples for 500 hr. Then, the photoelectric conversion efficiencies of the samples were measured under the illumination condition of AM 1.5 (100 mW/cm$^2$) and the reduction relative to the initial value (the ratio of the photoelectric conversion efficiency after the vibration test to the initial value) was evaluated for each sample. The SC-CMP-D1 samples showed a greater reduction in the photoelectric conversion efficiency compared with the SC-EMB-D1 samples as shown below.

The optical durability test under the non-biased condition was performed as follows: After the measurement of the initial photoelectric conversion efficiency, some samples were placed in a dark place kept at 25° C. with a relative humidity of 55% . Light having a power of AM 1.5 (100 mW/cm$^2$) was applied to the samples for 500 hours, and then the photoelectric conversion efficiencies of the samples were measured under the illumination condition of AM 1.5 (100 mW/cm$^2$). The reduction relative to the initial value (the ratio of the photoelectric conversion efficiency after the optical durability test to the initial value) was evaluated for each sample. The SC-CMP-D1 samples showed a greater reduction in the photoelectric conversion efficiency compared with the SC-EMB-D1 samples as shown below.

| | [Vibration durability] | [Optical durability] |
|---|---|---|
| SC-CMP-D1 | 0.85<br>(relative to those of SC-EMB-D1) | 0.83 |

The evaluation of the vibration durability and optical durability under the biased condition at high temperature with high humidity was performed as follows: After the measurement of the initial photoelectric conversion efficiency, some samples were placed in a dark place kept at 85° C. with a relative humidity of 90%, and a forward bias voltage of 0.7 V was applied to the samples. The vibration described above was applied to some of the samples and light having a power of AM 1.5 was applied to the other samples under the same conditions as those in the non-biased vibration test. The photoelectric conversion efficiencies of the samples were measured under the illumination condition of AM 1.5 (100 mW/cm$^2$). The SC-CMP-D1 samples also showed a greater reduction in the photoelectric conversion efficiency compared with the SC-EMB-D1 samples after the vibration and optical durability tests as shown below. Under the biased condition:

| | [Vibration durability] | [Optical durability] |
|---|---|---|
| SC-CMP-D1 | 0.84<br>(relative to those of SC-EMB-D1) | 0.83 |

The surfaces of the samples were observed using an optical microscope to evaluate film separation. No film separation was observed in the SC-EMB-D1 samples, whereas slight film separation was observed in the SC-CMP-D1 samples.

From the above results, it can be concluded that the solar cells (SC-EMB-D1) according to the present invention are better than the conventional solar cells (SC-CMP-D1) in optical durability, adhesion, overall durability, fill factor (F.F.) and uniformity of the photoelectric conversion efficiency.

EXAMPLE D2 ACCORDING TO THE INVENTION

A solar cell having a structure illustrated in FIG. 4 was made using the deposition equipment shown in FIG. 7.

A substrate 490 on which the optical reflection layer 101 and the reflection enhancing layer 102 had been formed in the same way as for example D1 was placed on the substrate transfer rail 413 in the load chamber 401, and the load chamber 401 was evacuated with a vacuum pump (not shown) down to a pressure of about $1\times10^{-5}$ Torr. Then, the gate valve 406 was opened, and the substrate 490 was transferred to the deposition chamber 417 via the transfer chamber 402, both deposition chamber 417 and transfer chamber 402 having been evacuated with a vacuum pump (not shown). The substrate 490 was placed so as to contact with the heater 410 at its rear surface, and heated. The inside of the deposition chamber 417 was evacuated with the vacuum pump (not shown) down to a pressure of about $1\times10^{-5}$ Torr.

In this way, semiconductor film deposition was prepared, and an RF n-layer 103 of μc-Si was then deposited, as described below.

To deposit the RF n-layer of μc-Si, $H_2$ gas was introduced into the deposition chamber 417 via the gas inlet 429. The $H_2$ gas was supplied by opening the valves 441, 431, 430 and its flow rate was adjusted to 300 sccm by means of the mass flow controller 436. Furthermore, the pressure inside the deposition chamber 417 was adjusted to 1.2 Torr by means of the conductance valve (not shown). The substrate 490 was heated by the substrate heater 410 up to 380° C. When the temperature of the substrate had become stable, the valves 443, 433, 444, and 434 were opened to introduce $SiH_4$ gas and $PH_3/H_2$ gas into the deposition chamber 417 via the gas inlet 429. The flow rates of $SiH_4$, $H_2$, and $PH_3/H_2$ were adjusted to 1.8 sccm, 80 sccm, and 200 sccm, respectively, by the mass flow controllers 438, 436, and 439. The pressure inside the deposition chamber 417 was adjusted to 1.2 Torr. An RF power of the RF power supply 422 was set to 0.05 W/cm$^3$ and applied to the plasma excitation cup 420 to activate a glow discharge. Deposition of the RF n-layer 103 on the substrate was started. When the thickness of the deposited RF n-layer 103 reached 20 nm, the RF power was shut off to stop the glow discharge. The deposition of the RF n-layer 103 was finished. The supply of $SiH_4$ and $PH_3/H_2$ into the deposition chamber 417 was stopped, whereas $H_2$ was fed further for four minutes into the deposition chamber 417. Then, $H_2$ was also shut off, and the inside of the deposition chamber 417 as well as the inside of the gas lines was evacuated down to $1\times10^{-5}$ Torr.

An n/i buffer layer 151 of a-Si was then deposited by means of RFPCVD as described below.

The gate valve 407 was opened, and the substrate 490 was transferred to the i-layer deposition chamber 418 via the transfer chamber 403, both deposition chamber 418 and transfer chamber 403 having been evacuated with a vacuum pump (not shown). The substrate 490 was placed so as to contact with the heater 411 at its rear surface, and heated. The inside of the i-layer deposition chamber 418 was evacuated with the vacuum pump (not shown) down to a pressure of about $1\times10^{-5}$ Torr.

To deposit the n/i buffer layer 151, the substrate 490 was heated by the substrate heater 411 up to 360° C. When the substrate had been heated enough, the valves 464, 454, 450, 463, and 453 were opened gradually to supply $Si_2H_6$ and $H_2$ to the i-layer deposition chamber 418 via the gas inlet 449. The flow rates of $Si_2H_6$ and $H_2$ were adjusted to 3.5 sccm and 80 sccm, respectively, by the mass flow controllers 459 and 458. The pressure inside the i-layer deposition chamber 418 was set to 0.8 Torr by adjusting the opening ratio of a conductance valve (not shown). Then, a RF power of 0.08 W/cm$^3$ was applied to the bias bar 428 by the RF power supply 424 to excite a glow discharge. The shutter 427 was then opened, and depositing the n/i buffer layer on the RF n-layer was started. When the thickness of the deposited n/i buffer layer reached 10 nm, the RF glow discharge was stopped, and the RF power supply 424 was shut off. The deposition of the n/i buffer layer 151 was finished. The valves 464 and 454 were closed to stop the supply of $Si_2H_6$ to the i-layer deposition chamber 418, whereas $H_2$ was fed further for two minutes into the i-layer deposition chamber 418. Then, the valves 453 and 450 were closed, and the inside of the i-layer deposition chamber 418 as well as the inside of the gas lines was evacuated down to $1\times10^{-5}$ Torr.

The substrate was then subjected to plasma treatment with hydrogen gas containing a small amount of silane-based gas under the conditions shown in Table D2(1), according to the present invention.

In this plasma treatment with hydrogen gas containing the small amount of silane-based gas according to the present invention, $Si_2H_6$ serving as silicon compound gas and $H_2$ were introduced into the deposition chamber 418 via the gas inlet 449. The $H_2$ gas was supplied by opening the valves 463, 453, 450 and its flow rate was adjusted to 750 sccm by means of the mass flow controller 458. The silicon compound gas was supplied by opening the valves 464 and 454 and its flow rate was controlled by the mass flow controller 459 such that the flow rate of the $Si_2H_6$ gas was maintained at 0.005% of the total gas flow rate of $H_2$. Furthermore, the pressure inside the deposition chamber 418 was adjusted to 0.015 Torr by means of a conductance valve (not shown). The substrate 490 was heated by the substrate heater 411 up to 285° C. When the temperature of the substrate had become stable, a VHF power of 0.05 W/cm$^3$ was applied to the bias bar 428 by the VHF power supply (not shown) so that a glow discharge occurs in the deposition chamber 418. Under the above-described conditions, the substrate was exposed for four minutes to the hydrogen gas plasma containing the small amount of silane-based gas according to the present invention. The VHF power was then shut off to stop the glow discharge. The supply of the $Si_2H_6$ gas into the deposition chamber 418 was stopped, whereas the $H_2$ gas was fed further for four minutes into the deposition chamber 418. Then, the $H_2$ gas was also shut off, and the inside of the deposition chamber 418 as well as the inside of the gas lines was evacuated down to $1\times10^{-5}$ Torr.

An MW i-layer 114 of a-SiGe and a p/i buffer layer 161 of a-Si were then deposited by means of MWPCVD and RFPCVD as described below.

To deposit the MW i-layer, the substrate 490 was heated by the substrate heater 411 up to 380° C. When the substrate had been heated enough, the valves 461, 451, 450, 462, 452, 463, and 453 were opened gradually to supply $SiH_4$, $GeH_4$, and $H_2$ to the i-layer deposition chamber 418 via the gas inlet 449. The flow rates of $SiH_4$, $GeH_4$, and $H_2$ were adjusted to 45, 40, and 130 sccm, respectively, by the mass flow controllers 456, 457, and 458. The pressure inside the i-layer deposition chamber 418 was set to 5 mTorr by adjusting the opening ratio of a conductance valve (not shown). Then, an RF power of 0.60 W/cm$^3$ was applied to the bias bar 428 by the RF power supply 424. The power of the MW power supply (not shown) was set to 0.25 W/cm$^3$ and introduced into the i-layer deposition chamber 418 through the wave guide 426 and the microwave entrance window 425 to excite a glow discharge. The shutter 427 was then opened, and depositing the MW i-layer onto the n/i buffer layer was started. When the thickness of the deposited MW i-layer reached 0.15 μm, the MW glow discharge was stopped, and the RF power supply 424 was shut off. The deposition of the MW i-layer 114 was finished. The valves 451 and 452 were closed to stop the supply of $SiH_4$ and $GeH_4$ to the i-layer deposition chamber 418, whereas $H_2$ was fed further for two minutes into the i-layer deposition chamber 418. Then, the valves 453 and 450 were closed, and the inside of the i-layer deposition chamber 418 as well as the inside of the gas lines was evacuated down to $1\times10^{-5}$ Torr.

To deposit the p/i buffer layer 161, the substrate 490 was heated by the substrate heater 411 up to 250° C. When the substrate had been heated enough, the valves 464, 454, 450, 463, and 453 were opened gradually to supply $Si_2H_6$ and $H_2$ to the i-layer deposition chamber 418 via the gas inlet 449. The flow rates of $Si_2H_6$ and $H_2$ were adjusted to 2 sccm and 70 sccm, respectively, by the mass flow controllers 459 and 458. The pressure inside the i-layer deposition chamber 418 was set to 0.7 Torr by adjusting the opening ratio of a conductance valve (not shown). Then, an RF power of 0.07 W/cm$^3$ was applied to the bias bar 428 by the RF power supply 424 to excite a glow discharge. The shutter 427 was then opened, and depositing the p/i buffer layer 161 on the MW i-layer was started. When the thickness of the deposited p/i buffer layer 161 reached 20 nm, the RF glow discharge was stopped, and the RF power supply 424 was shut off. The deposition of the p/i buffer layer 161 was finished. The valves 464 and 454 were closed to stop the supply of $Si_2H_6$ to the i-layer deposition chamber 418, whereas $H_2$ was fed further for two minutes into the i-layer deposition chamber 418. Then, the valves 453 and 450 were closed, and the inside of the i-layer deposition chamber 418 as well as the inside of the gas lines was evacuated down to $1\times10^{-5}$ Torr.

To deposit an RF p-layer 105 of a-SiC, the gate valve 408 was opened, and the substrate 490 was transferred to the p-layer deposition chamber 419 via the transfer chamber 404, both deposition chamber 419 and transfer chamber 404 having been evacuated with a vacuum pump (not shown). The substrate 490 was placed so as to contact with the heater 412 at its rear surface, and heated. The inside of the p-layer deposition chamber 419 was evacuated with the vacuum pump (not shown) down to a pressure of about $1\times10^{-5}$ Torr.

The substrate 490 was heated by the substrate heater 412 up to 250° C. When the temperature of the substrate had become stable, the valves 481, 471, 470, 482, 472, 483, 473, 484, and 474 were opened to supply $H_2$ gas, $SiH_4/H_2$ gas, $B_2H_6/H_2$ gas, and $CH_4$ gas to the deposition chamber 419 via the gas inlet 469. The flow rates of the $H_2$, $SiH_4/H_2$, $B_2H_6/H_2$, and $CH_4$, were adjusted to 60 sccm, 2 sccm, 10 sccm, and 0.3 sccm, respectively, by the mass flow controllers 476, 477, 478, and 479. The pressure inside the chamber 419 was set to 1.8 Torr by adjusting the opening ratio of a conductance valve (not shown). An RF power of 0.07 W/cm$^3$ was applied by the RF power supply 423 to the plasma excitation cup 421 to activate a glow discharge, and deposition of the RF p-layer on the p/i buffer layer was started. When the thickness of the deposited RF p-layer reached 10 nm, the RF power was shut off to stop the glow discharge. The deposition of the RF p-layer 105 was finished. The valves 472, 482, 473, 483, 474, and 484 were closed to stop the supply of $SiH_4/H_2$, $B_2H_6/H_2$, and $CH_4$ to the p-layer deposition chamber 419, whereas $H_2$ was fed further for three minutes into the p-layer deposition chamber 419. Then, the valves 471, 481, and 470 were closed, and the inside of the p-layer deposition chamber 419 as well as the inside of the gas lines was evacuated down to $1\times10^{-5}$ Torr.

Next, an RF n-layer 203 of μc-Si was deposited. The gate valves 408 and 407 were opened, and the substrate 490 was transferred to the deposition chamber 417 through the transfer chamber 403 which had been evacuated with a vacuum pump (not shown) and the transfer chamber 402. The substrate 490 was placed so as to contact with the heater 410 at its rear surface, and heated. The inside of the deposition chamber 419 was evacuated with the vacuum pump (not shown) down to a pressure of about $1\times10^{-5}$ Torr.

To deposit the RF n-layer 203 of μc-Si, $H_2$ gas was introduced into the deposition chamber 417 via the gas inlet 429. The $H_2$ gas was supplied by opening the valves 441, 431, 430 and its flow rate was adjusted to 200 sccm by means of the mass flow controller 436. Furthermore, the pressure inside the deposition chamber 417 was adjusted to 1.1 Torr by means of the conductance valve (not shown). The substrate 490 was heated by the substrate heater 410 up to 250° C. When the temperature of the substrate had become stable, the valves 443, 433, 444, and 434 were opened to introduce $SiH_4$ gas and $PH_3/H_2$ gas into the deposition chamber 417 via the gas inlet 429. The flow rates of $SiH_4$, $H_2$, and $PH_3/H_2$ were adjusted to 2 sccm, 70 sccm, and 250 sccm, respectively, by the mass flow controllers 438, 436, and 439. The pressure inside the deposition chamber 417 was adjusted to 1.1 Torr. An RF power of the RF power supply 422 was set to 0.04 W/cm$^3$ and applied to the plasma excitation cup 420 to activate a glow discharge. The deposition of the RF n-layer on the RF p-layer was started. When the thickness of the deposited RF n-layer reached 10 nm, the RF power was shut off to stop the glow discharge. The deposition of the RF n-layer 203 was finished. The supply of $SiH_4$ and $PH_3/H_2$ into the deposition chamber 417 was stopped, whereas $H_2$ was fed further for two minutes into the deposition chamber 417. Then, $H_2$ was also shut off, and the inside of the deposition chamber 417 as well as the inside of the gas lines was evacuated down to $1\times10^{-5}$ Torr.

An n/i buffer layer 251 of a-Si was then deposited by means of RFPCVD as described below.

The gate valve 407 was opened, and the substrate 490 was transferred to the i-layer deposition chamber 418 via the transfer chamber 403, both deposition chamber 418 and transfer chamber 403 having been evacuated with a vacuum pump (not shown). The substrate 490 was placed so as to contact with the heater 411 at its rear surface, and heated. The inside of the i-layer deposition chamber 418 was evacuated with the vacuum pump (not show) down to a pressure of about $1\times10^{-5}$ Torr.

To deposit the n/i buffer layer 251, the substrate 490 was heated by the substrate heater 411 up to 250° C. When the substrate had been heated enough, the valves 464, 454, 450, 463, 453, 465, and 455 were opened gradually to supply $Si_2H_6$, $H_2$, and $CH_4$ to the i-layer deposition chamber 418 via the gas inlet 449. The flow rates of $Si_2H_6$, $H_2$, and $CH_4$ were adjusted to 0.5, 60, and 0.2 sccm, respectively, by the mass flow controllers 459, 458, and 460. The pressure inside the i-layer deposition chamber 418 was set to 1.3 Torr by adjusting the opening ratio of a conductance valve (not shown). Then, an RF power of 0.06 W/cm$^3$ was applied to the bias bar 428 by the RF power supply 424 to excite a glow discharge. The shutter 427 was then opened, and depositing the n/i buffer layer 251 on the RF n-layer was started. When the thickness of the deposited n/i buffer layer 251 reached 10 nm, the RF glow discharge was stopped, and the RF power supply 424 was shut off. The deposition of the n/i buffer layer 251 was finished. The valves 464, 454, 465, and 455 were closed to stop the supply of $Si_2H_6$ and $CH_4$ to the i-layer deposition chamber 418, whereas $H_2$ was fed further for two minutes into the i-layer deposition chamber 418.

Then, the valves 453 and 450 were closed, and the inside of the i-layer deposition chamber 418 as well as the inside of the gas lines was evacuated down to $1\times10^{-5}$ Torr.

The substrate was then subjected to plasma treatment with hydrogen gas containing a small amount of silane-based gas under the conditions shown in Table D2(2), according to the present invention.

In this plasma treatment with hydrogen gas containing the small amount of silane-based gas according to the present invention, $SiH_4$ serving as silicon compound gas and $H_2$ were introduced into the deposition chamber 418 via the gas inlet 449. The $H_2$ gas was supplied by opening the valves 463, 453, 450 and its flow rate was adjusted to 900 sccm by means of the mass flow controller 458. The silicon compound gas was supplied by opening the valves 461 and 451 and its flow rate was controlled by the mass flow controller 456 such that the flow rate of the $SiH_4$ gas was maintained at 0.003% of the total gas flow rate of $H_2$. Furthermore, the pressure inside the deposition chamber 418 was adjusted to 0.8 Torr by means of a conductance valve (not shown). The substrate 490 was heated by the substrate heater 411 up to 200° C. When the temperature of the substrate had become stable, an RF power of 0.02 W/cm$^3$ was applied to the bias bar 428 by the RF power supply 424 so that a glow discharge occurs in the deposition chamber 418. Under the above-described conditions, the substrate was exposed for 3 minutes to the hydrogen gas plasma containing the small amount of silane-based gas according to the present invention. The RF power was then shut off to stop the glow discharge. The supply of the $SiH_4$ gas into the deposition chamber 418 was stopped, whereas the $H_2$ gas was fed further for 3 minutes into the deposition chamber 418. Then, the $H_2$ gas was also shut off, and the inside of the deposition chamber 418 as well as the inside of the gas lines was evacuated down to $1\times10^{-5}$ Torr.

An RF i-layer 214 of a-Si and a p/i buffer layer 261 of a-Si were then deposited by means of RFPCVD as described below. To deposit the RF i-layer, the substrate 490 was heated by the substrate heater 411 up to 200° C. When the substrate had been heated enough, the valves 464, 454, 450, 463, and 453 were opened gradually to supply $Si_2H_6$ and $H_2$ to the i-layer deposition chamber 418 via the gas inlet 449. The flow rates of $Si_2H_6$ and $H_2$ were adjusted to 3 sccm and 50 sccm, respectively, by the mass flow controllers 459 and 458. The pressure inside the i-layer deposition chamber 418 was set to 0.5 Torr by adjusting the opening ratio of a conductance valve (not shown). Then, an RF power of 0.07 W/cm$^3$ was applied to the bias bar 428 by the RF power supply 424 to excite a glow discharge. The shutter 427 was then opened, and depositing the RF i-layer 214 on the n/i buffer layer was started. When the thickness of the deposited RF i-layer reached 110 nm, the RF glow discharge was stopped, and the RF power supply 424 was shut off. The deposition of the RF i-layer 214 was finished. The valves 464 and 454 were closed to stop the supply of $Si_2H_6$ to the i-layer deposition chamber 418, whereas $H_2$ was fed further for two minutes into the i-layer deposition chamber 418. Then, the valves 453 and 450 were closed, and the inside of the i-layer deposition chamber 418 as well as the inside of the gas lines was evacuated down to $1\times10^{-5}$ Torr.

To deposit the p/i buffer layer 261, the substrate 490 was heated by the substrate heater 411 up to 200° C. When the substrate had been heated enough, the valves 464, 454, 450, 463, 453, 465, and 455 were opened gradually to supply $Si_2H_6$, $H_2$, and $CH_4$ to the i-layer deposition chamber 418 via the gas inlet 449. The flow rates of $Si_2H_6$, $H_2$, and $CH_4$ were adjusted to 0.4, 60, and 0.3 sccm, respectively, by the mass flow controllers 459, 458, and 460. The pressure inside the i-layer deposition chamber 418 was set to 1.2 Torr by adjusting the opening ratio of a conductance valve (not shown). Then, an RF power of 0.06 W/cm$^3$ was applied to the bias bar 428 by the RF power supply 424 to excite a glow discharge. The shutter 427 was then opened, and depositing the p/i buffer layer 261 on the RF i-layer 214 was started. When the thickness of the deposited p/i buffer layer 261 reached 15 nm, the RF glow discharge was stopped, and the RF power supply 424 was shut off. The deposition of the p/i buffer layer 261 was finished. The valves 464, 454, 465, and 455 were closed to stop the supply of $Si_2H_6$ and $CH_4$ to the i-layer deposition chamber 418, whereas $H_2$ was fed further for two minutes into the i-layer deposition chamber 418. Then, the valves 453 and 450 were closed, and the inside of the i-layer deposition chamber 418 as well as the inside of the gas lines was evacuated down to $1\times10^{-5}$ Torr.

To deposit the RF p-layer 205 of a-SiC, the gate valve 408 was opened, and the substrate 490 was transferred to the p-layer deposition chamber 419 via the transfer chamber 404, both deposition chamber 419 and transfer chamber 404 having been evacuated with a vacuum pump (not shown). The substrate 490 was placed so as to contact with the heater 412 at its rear surface, and heated. The inside of the p-layer deposition chamber 419 was evacuated with the vacuum pump (not show) down to a pressure of about $1\times10^{-5}$ Torr.

The substrate 490 was heated by the substrate heater 412 up to 170° C. When the temperature of the substrate had become stable, the valves 481, 471, 470, 482, 472, 483, 473, 484, and 474 were opened to supply $H_2$ gas, $SiH_4/H_2$ gas, $B_2H_6/H_2$ gas, and $CH_4$ gas to the deposition chamber 419 via the gas inlet 469. The flow rates of the $H_2$, $SiH_4/H_2$, $B_2H_6/H_2$, and $CH_4$, were adjusted to 60 sccm, 2 sccm, 10 sccm, and 0.3 sccm, respectively, by the mass flow controllers 476, 477, 478, and 479. The pressure inside the chamber 419 was set to 1.7 Torr by adjusting the opening ratio of a conductance valve (not shown). An RF power of 0.07 W/cm$^3$ was applied by the RF power supply 423 to the plasma excitation cup 421 to activate a glow discharge, and deposition of the RF p-layer 205 on the p/i buffer layer 261 was started. When the thickness of the deposited RF p-layer 205 reached 10 nm, the RF power was shut off to stop the glow discharge. The deposition of the RF p-layer 205 was finished. The valves 472, 482, 473, 483, 474, and 484 were closed to stop the supply of $SiH_4/H_2$, $B_2H_6/H_2$, and $CH_4$ to the p-layer deposition chamber 419, whereas $H_2$ was fed further for two minutes into the p-layer deposition chamber 419. Then, the valves 471, 481, and 470 were closed, and the inside of the p-layer deposition chamber 419 as well as the inside of the gas lines was evacuated down to $1\times10^{-5}$ Torr.

The gate valve 409 was then opened, and the substrate 490 was transferred to the unload chamber 405 which had already been evacuated with a vacuum pump (not shown). Then, a leak valve (not shown) was opened so that the inside of the unload chamber 405 was exposed to the ambient atmosphere.

ITO was then evaporated onto the RF p-layer 205 so as to form a transparent conductive layer 112 having a thickness of 70 nm.

A mask having a comb-shaped window was placed on the transparent conductive layer 112, and metal evaporation was performed via the mask to form a comb-shaped collection electrode 113 having a multi-layer structure consisting of Cr (40 nm), Ag (1000 nm), and Cr (40 nm).

In this way, the complete solar cell according to the invention was obtained. Hereinafter, the solar cell of this type will be referred to as SC-EMB-D2. Tables D2(1) through D2(3) indicate the conditions used here in the invention, regarding the plasma treatment with hydrogen containing a small amount of silane-based gas as well as the process conditions for the RF n-layer, n/i buffer layer, MW i-layer, p/i buffer layer, RF p-layer, RF n-layer, n/i buffer layer, RF i-layer, p/i buffer layer, and RF p-layer.

COMPARATIVE EXAMPLE D2

For the sake of comparison, a solar cell (SC-CMP-D2) was also fabricated in the same manner as in the above-described example D2 except that the plasma treatment with hydrogen gas containing a small amount of silane-based gas according to the invention was not performed.

Seven samples of solar cells were prepared for each type (SC-EMB-D2 and SC-CMP-D2) for the purpose of evaluation regarding the initial photoelectric conversion efficiency (the ratio of the electric output power to the optical input power), vibration durability and optical durability under a biased condition at high temperature with high humidity, and vibration durability and optical durability under a non-biased condition.

The measurement of the initial photoelectric conversion efficiency was performed by measuring the V-I characteristics of the samples under the illumination condition of AM 1.5 (100 mW/cm$^2$). The measurement revealed that the SC-EMB-D2 samples had a smaller variation in the initial photoelectric conversion efficiencies than the SC-CMP-D2 samples and had a larger fill factor (F.F.) as shown below:

| | [Fill factor (F.F.)] | [Variation] |
|---|---|---|
| SC-EMB-D2 | 1.11<br>(relative to that of SC-CMP-D2) | 0.85 |

The vibration durability test under the non-biased condition was performed as follows: After the measurement of the initial photoelectric conversion efficiency, some samples were placed in a dark place kept at 28° C. with a relative humidity of 50%. Vibration having an amplitude of 0.1 mm and a frequency of 60 Hz was applied to the samples for 500 hr. Then, the photoelectric conversion efficiencies of the samples were measured under the illumination condition of AM 1.5 (100 mW/cm$^2$) and the reduction relative to the initial value (the ratio of the photoelectric conversion efficiency after the vibration test to the initial value) was evaluated for each sample. The SC-CMP-D2 samples showed a greater reduction in the photoelectric conversion efficiency compared with the SC-EMB-D2 samples as shown below.

The optical durability test under the non-biased condition was performed as follows: After the measurement of the initial photoelectric conversion efficiency, some samples were placed in a dark place kept at 28° C. with a relative humidity of 50%. Light having a power of AM 1.5 (100 mW/cm$^2$) was applied to the samples for 500 hours, and then the photoelectric conversion efficiencies of the samples were measured under the illumination condition of AM 1.5 (100 mW/cm$^2$). The reduction relative to the initial value (the ratio of the photoelectric conversion efficiency after the optical durability test to the initial value) was evaluated for each sample. The SC-CMP-D2 samples showed a greater reduction in the photoelectric conversion efficiency compared with the SC-EMB-D2 samples as shown below.

| | [Vibration durability] | [Optical durability] |
|---|---|---|
| SC-CMP-D2 | 0.85<br>(relative to those of SC-EMB-D2) | 0.84 |

The evaluation of the vibration durability and optical durability under the biased condition at high temperature with high humidity was performed as follows: After the measurement of the initial photoelectric conversion efficiency, some samples were placed in a dark place kept at 82° C. with a relative humidity of 90%, and a forward bias voltage of 0.7 V was applied to the samples. The vibration described above was applied to some of the samples and light having a power of AM 1.5 was applied to the other samples under the same conditions as those in the non-biased vibration test. The photoelectric conversion efficiencies of the samples were measured under the illumination condition of AM 1.5 (100 mW/cm$^2$). The SC-CMP-D2 samples also showed a greater reduction in the photoelectric conversion efficiency compared with the SC-EMB-D2 samples after the vibration and optical durability tests as shown below. Under the biased condition:

| | [Vibration durability] | [Optical durability] |
|---|---|---|
| SC-CMP-D2 | 0.83<br>(relative to those of SC-EMB-D2) | 0.82 |

The surfaces of the samples were observed using an optical microscope to evaluate film separation. No film separation was observed in the SC-EMB-D2 samples, whereas slight film separation was observed in the SC-CMP-D2 samples.

From the above results, it can be concluded that the solar cells (SC-EMB-D2) according to the present invention are better than the conventional solar cells (SC-CMP-D2) in optical durability, adhesion, overall durability, fill factor (F.F.) and uniformity of the photoelectric conversion efficiency.

EXAMPLE D3 ACCORDING TO THE INVENTION

A triple solar cell having a structure illustrated in FIG. 6 was made using the deposition equipment shown in FIG. 7.

In the same way as for example D1, a substrate 490 on which the optical reflection layer 101 and the reflection enhancing layer 102 had been formed in the same way as for example D1 was placed on the substrate transfer rail 413 in the load chamber 401, and the load chamber 401 was evacuated with a vacuum pump (not shown) down to a pressure of about $1\times10^{-5}$ Torr. Then, the gate valve 406 was opened, and the substrate 490 was transferred to the deposition chamber 417 via the transfer chamber 402, both deposition chamber 417 and transfer chamber 402 having been evacuated with a vacuum pump (not shown). The substrate 490 was placed so as to contact with the heater 410 at its rear surface, and heated. The inside of the deposition chamber 417 was evacuated with the vacuum pump (not shown) down to a pressure of about $1\times10^{-5}$ Torr.

In this way, semiconductor film deposition was prepared, and an RF n-layer 103 of μc-Si was then deposited in the same way as for example D2.

The gate valve 406 was opened, and the substrate 490 was transferred to the deposition chamber 418 via the transfer chamber 403, both deposition chamber 418 and transfer chamber 403 having been evacuated with a vacuum pump (not shown). The substrate 490 was placed so as to contact with the heater 411 at its rear surface, and heated. The inside of the deposition chamber 418 was evacuated with the vacuum pump (not shown) down to a pressure of about $1\times10^{-5}$ Torr.

An n/i buffer layer 151 of a-Si was then deposited by means of RFPCVD in the same way as for example D2.

The substrate was then subjected to plasma treatment with hydrogen gas containing a small amount of silane-based gas under the conditions shown in Table D3(1), according to the present invention.

In this plasma treatment with hydrogen gas containing the small amount of silane-based gas according to the present invention, $SiCl_2H_2$/He (diluted to 1000 ppm) serving as silicon compound gas and $H_2$ were introduced into the deposition chamber 418 via the gas inlet 449. The $H_2$ gas was supplied by opening the valves 463, 453, 450 and its flow rate was adjusted to 500 sccm by means of the mass flow controller 458. The silicon compound gas was supplied by opening the valve and its flow rate was controlled by the mass flow controller such that the flow rate of the $SiCl_2H_2$ gas was maintained at 0.05% of the total gas flow rate of $H_2$. Furthermore, the pressure inside the deposition chamber 418 was adjusted to 0.01 Torr by means of a conductance valve (not shown). The substrate 490 was heated by the substrate heater 411 up to 350° C. When the temperature of the substrate had become stable, a MW power of 0.12 W/cm$^3$ was applied to the i-layer deposition chamber 418 through the wave guide 426 and the microwave entrance window 425 by the MW power supply (not shown) so that a glow discharge occurs in the deposition chamber 418. The shutter 427 was opened, and the substrate was exposed for four minutes to the hydrogen gas plasma containing the small amount of silane-based gas according to the present invention. The MW power was then shut off to stop the glow discharge. The supply of the $SiCl_2H_2$/He (diluted to 1000 ppm) gas into the deposition chamber 418 was stopped, whereas the $H_2$ gas was fed further for four minutes into the deposition chamber 418. Then, the $H_2$ gas was also shut off, and the inside of the deposition chamber 418 as well as the inside of the gas lines was evacuated down to $1\times10^{-5}$ Torr.

Next, in the same way as for example D2, an MW i-layer 114 of a-SiGe, a p/i buffer layer 161 of a-Si, an RF p-layer 105 of a-SiC, an RF n-layer 203 of μc-Si, and an n/i buffer layer 251 were deposited in that order.

The substrate was then subjected to plasma treatment with hydrogen gas containing a small amount of silane-based gas under the conditions shown in Table D3(2), according to the present invention.

In this plasma treatment with hydrogen gas containing the small amount of silane-based gas according to the present invention, $SiH_4/H_2$ (diluted to 1000 ppm) serving as silicon compound gas and $H_2$ were introduced into the deposition chamber 418 via the gas inlet 449. The $H_2$ gas was supplied by opening the valves 463, 453, 450 and its flow rate was adjusted to 800 sccm by means of the mass flow controller 458. The silicon compound gas was supplied by opening the valve and its flow rate was controlled by the mass flow controller such that the flow rate of the $SiH_4$ gas was maintained at 0.06% of the total gas flow rate of $H_2$. Furthermore, the pressure inside the deposition chamber 418 was adjusted to 0.9 Torr by means of a conductance valve (not shown). The substrate 490 was heated by the substrate heater 411 up to 300° C. When the temperature of the substrate had become stable, a RF power of 0.03 W/cm$^3$ was applied to the bias bar 428 by the RF power supply 424 so that a glow discharge occurs in the deposition chamber 418. Under the above-described conditions, the substrate was exposed for three minutes to the hydrogen gas plasma containing the small amount of silane-based gas according to the present invention. The RF power was then shut off to stop the glow discharge. The supply of the $SiH_4/H_2$ (diluted to 1000 ppm) gas into the deposition chamber 418 was stopped, whereas the $H_2$ gas was fed further for three minutes into the deposition chamber 418. Then, the $H_2$ gas was also shut off, and the inside of the deposition chamber 418 as well as the inside of the gas lines was evacuated down to $1\times10^{-5}$ Torr.

Next, in the same way as for example D2, an MW i-layer 214 of a-SiGe, a p/i buffer layer 261 of a-Si, an RF p-layer 205 of a-SiC, an RF n-layer 303 of μc-Si, and an n/i buffer layer 351 were deposited in that order.

The substrate was then subjected to plasma treatment with hydrogen gas containing a small amount of silane-based gas under the conditions shown in Table D3(3), according to the present invention.

In this plasma treatment with hydrogen gas containing the small amount of silane-based gas according to the present invention, $SiH_4/H_2$ (diluted to 1000 ppm) serving as silicon compound gas and $H_2$ were introduced into the deposition chamber 418 via the gas inlet 449. The $H_2$ gas was supplied by opening the valves 463, 453, 450 and its flow rate was adjusted to 850 sccm by means of the mass flow controller 458. The silicon compound gas was supplied by opening the valve and its flow rate was controlled by the mass flow controller such that the flow rate of the $SiH_4$ gas was maintained at 0.05% of the total gas flow rate of $H_2$. Furthermore, the pressure inside the deposition chamber 418 was adjusted to 0.8 Torr by means of a conductance valve (not shown). The substrate 490 was heated by the substrate heater 411 up to 230° C. When the temperature of the substrate had become stable, a RF power of 0.03 W/cm$^3$ was applied to the bias bar 428 by the RF power supply 424 so that a glow discharge occurs in the deposition chamber 418. Under the above-described conditions, the substrate was exposed for three minutes to the hydrogen gas plasma containing the small amount of silane-based gas according to the present invention. The RF power was then shut off to stop the glow discharge. The supply of the $SiH_4/H_2$ (diluted to 1000 ppm) gas into the deposition chamber 418 was stopped, whereas the $H_2$ gas was fed further for three minutes into the deposition chamber 418. Then, the $H_2$ gas was also shut off, and the inside of the deposition chamber 418 as well as the inside of the gas lines was evacuated down to $1\times10^{-5}$ Torr.

Next, in the same way as for example D2, an RF i-layer 314 of a-Si, a p/i buffer layer 361 of a-SiC, and an RF p-layer 305 of a-SiC were deposited by means of RFPCVD in that order.

ITO was then evaporated onto the RF p-layer 305 so as to form a transparent conductive layer 112 having a thickness of 70 nm.

A mask having a comb-shaped window was placed on the transparent conductive layer 112, and metal evaporation was performed via the mask to form a comb-shaped collection electrode 113 having a multi-layer structure consisting of Cr (40 nm), Ag (1000 nm), and Cr (40 nm).

In this way, the complete solar cell according to the invention was obtained. Hereinafter, the solar cell of this type will be referred to as SC-EMB-D3. Tables D3(1)

through D3(4) indicate the conditions used here in the invention, regarding the plasma treatment with hydrogen containing a small amount of silane-based gas as well as the process conditions for the RF n-layer, n/i buffer layer, MWi-layer, p/i buffer layer, RF p-layer, RF n-layer, n/i buffer layer, MW i-layer, p/i buffer layer, RF p-layer, RF n-layer, n/i buffer layer, RF i-layer, p/i buffer layer, and RF p-layer.

COMPARATIVE EXAMPLE D3

For the sake of comparison, a solar cell (SC-CMP-D3) was also fabricated in the same manner as in the above-described example D3 except that the plasma treatment with hydrogen gas containing a small amount of silane-based gas according to the invention was not performed.

Six samples of solar cells were prepared for each type (SC-EMB-D3 and SC-CMP-D3) for the purpose of evaluation regarding the initial photoelectric conversion efficiency (the ratio of the electric output power to the optical input power), vibration durability and optical durability under a biased condition at high temperature with high humidity, and vibration durability and optical durability under a non-biased condition.

The measurement of the initial photoelectric conversion efficiency was performed by measuring the V-I characteristics of the samples under the illumination condition of AM 1.5 (100 mW/cm$^2$). The measurement revealed that the SC-EMB-D3 samples had a smaller variation in the initial photoelectric conversion efficiencies than the SC-CMP-D3 samples and had a larger fill factor (F.F.) as shown below:

| | [Fill factor (F.F.)] | [Variation] |
|---|---|---|
| SC-EMB-D3 | 1.12<br>(relative to that of SC-CMP-D3) | 0.84 |

The vibration durability test under the non-biased condition was performed as follows: After the measurement of the initial photoelectric conversion efficiency, some samples were placed in a dark place kept at 25° C. with a relative humidity of 55%. Vibration having an amplitude of 0.1 mm and a frequency of 60 Hz was applied to the samples for 500 hr. Then, the photoelectric conversion efficiencies of the samples were measured under the illumination condition of AM 1.5 (100 mW/cm$^2$) and the reduction relative to the initial value (the ratio of the photoelectric conversion efficiency after the vibration test to the initial value) was evaluated for each sample. The SC-CMP-D3 samples showed a greater reduction in the photoelectric conversion efficiency compared with the SC-EMB-D3 samples as shown below.

The optical durability test under the non-biased condition was performed as follows: After the measurement of the initial photoelectric conversion efficiency, some samples were placed in a dark place kept at 25° C. with a relative humidity of 55% . Light having a power of AM 1.5 (100 mW/cm$^2$) was applied to the samples for 500 hours, and then the photoelectric conversion efficiencies of the samples were measured under the illumination condition of AM 1.5 (100 mW/cm$^2$). The reduction relative to the initial value (the ratio of the photoelectric conversion efficiency after the optical durability test to the initial value) was evaluated for each sample. The SC-CMP-D3 samples showed a greater reduction in the photoelectric conversion efficiency compared with the SC-EMB-D3 samples as shown below.

| | [Vibration durability] | [Optical durability] |
|---|---|---|
| SC-CMP-D3 | 0.85<br>(relative to those of SC-EMB-D3) | 0.84 |

The evaluation of the vibration durability and optical durability under the biased condition at high temperature with high humidity was performed as follows: After the measurementoftheinitialphotoelectricconversionefficiency, some samples were placed in a dark place kept at 80° C. with a relative humidity of 90%, and a forward bias voltage of 0.7 V was applied to the samples. The vibration described above was applied to some of the samples and light having a power of AM 1.5 was applied to the other samples under the same conditions as those in the non-biased vibration test. The photoelectric conversion efficiencies of the samples were measured under the illumination condition of AM 1.5 (100 mW/cm$^2$). The SC-CMP-D3 samples also showed a greater reduction in the photoelectric conversion efficiency compared with the SC-EMB-D3 samples after the vibration and optical durability tests as shown below. Under the biased condition:

| | [Vibration durability] | [Optical durability] |
|---|---|---|
| SC-CMP-D3 | 0.84<br>(relative to those of SC-EMB-D3) | 0.83 |

The surfaces of the samples were observed using an optical microscope to evaluate film separation. No film separation was observed in the SC-EMB-D3 samples, whereas slight film separation was observed in the SC-CMP-D3 samples.

From the above results, it can be concluded that the solar cells (SC-EMB-D3) according to the present invention are better than the conventional solar cells (SC-CMP-D3) in optical durability, adhesion, overall durability, fill factor (F.F.) and uniformity of the photoelectric conversion efficiency

EXAMPLE D4 ACCORDING TO THE INVENTION

A solar cell having a triple structure illustrated in FIG. 6 was made using the deposition equipment shown in FIG. 7 in the same way as for example D3. Plasma treatment with hydrogen gas containing a small amount of silane-based gas was performed three times under the conditions shown in Table D4(1). Other fabrication conditions employed are shown in Table D4(2).

The fabricated samples are evaluated in a similar manner to that for the example D3, and the results are shown in Table D4(3).

As can be seen from Table D4(3), it is preferable that the flow rate of hydrogen gas in the plasma treatment with hydrogen containing a small amount of silane-based gas ranges from 1 to 2000 sccm to obtain an excellent fill factor (F.F.)anduniformityofthephotoelectricconversionefficiency, optical durability, adhesion, and overall durability.

EXAMPLE D5 ACCORDING TO THE INVENTION

A solar cell having a triple structure illustrated in FIG. 6 was made using the deposition equipment shown in FIG. 7 in the same way as for example D3. Plasma treatment with hydrogen gas containing a small amount of silane-based gas was performed three times under the conditions shown in Table D5(1). Other fabrication conditions employed are shown in Table D5(2).

The fabricated samples are evaluated in a similar manner to that for the example D3, and the results are shown in Table D5(3).

In this example, VHF power was used to excite the plasma for the plasma treatment whereas RF power was used in the above example D4. As can be seen from Table D5(3), it is also preferable that the flow rate of hydrogen gas in the plasma treatment containing the small amount of silane-based gas ranges from 1 to 2000 sccm to obtain a good fill factor (F.F.) and uniformity of the photoelectric conversion efficiency, optical durability, adhesion, and overall durability.

EXAMPLE D6 ACCORDING TO THE INVENTION

A solar cell having a triple structure illustrated in FIG. 6 was made using the deposition equipment shown in FIG. 7 in the same way as for example D3. Plasma treatment with hydrogen gas containing a small amount of silane-based gas was performed three times under the conditions shown in Table D6(1). Other fabrication conditions employed are shown in Table D6(2).

The fabricated samples are evaluated in a similar manner to that for the example D3, and the results are shown in Table D6(3).

As can be seen from Table D6(3), it is preferable that the content of the silicon compound gas added to the hydrogen gas in the plasma treatment ranges from 0.001% to 0.1%. to obtain a good fill factor (F.F.) and uniformity of the photoelectric conversion efficiency, optical durability, adhesion, and overall durability.

EXAMPLE D7 ACCORDING TO THE INVENTION

A solar cell having a triple structure illustrated in FIG. 6 was made using the deposition equipment shown in FIG. 7 in the same way as for example D3. Plasma treatment with hydrogen gas containing a small amount of silane-based gas was performed three times under the conditions shown in Table D7(1). Other fabrication conditions employed are shown in Table D7(2).

The fabricated samples are evaluated in a similar manner to that for the example D3, and the results are shown in Table D7(3).

In this example, VHF power was used to excite the plasma for the plasma treatment, whereas RF power was used in the above example D6. As can be seen from Table D7(3), it is also preferable that the content of the silicon compound gas added to the hydrogen gas in the plasma treatment ranges from 0.001% to 0.1%. to obtain a good fill factor (F.F.) and uniformity of the photoelectric conversion efficiency, optical durability, adhesion, and overall durability.

EXAMPLE D8 ACCORDING TO THE INVENTION

A solar cell having a triple structure illustrated in FIG. 6 was made using the deposition equipment shown in FIG. 7 in the same way as for example D3. Plasma treatment with hydrogen gas containing a small amount of silane-based gas was performed three times under the conditions shown in Table D8(1). Other fabrication conditions employed are shown in Table D8(2).

The fabricated samples are evaluated in a similar manner to that for the example D3, and the results are shown in Table D8(3).

In this example, MW power was used to excite the plasma for the plasma treatment, whereas RF power was used in the above example D6. As can be seen from Table D8(3), it is also preferable that the content of the silicon compound gas added to the hydrogen gas in the plasma treatment ranges from 0.001% to 0.1%. to obtain a good fill factor (F.F.) and uniformity of the photoelectric conversion efficiency, optical durability, adhesion, and overall durability.

EXAMPLE D9 ACCORDING TO THE INVENTION

A solar cell having a triple structure illustrated in FIG. 6 was made using the deposition equipment shown in FIG. 7 in the same way as for example D3. Plasma treatment with hydrogen gas containing a small amount of silane-based gas was performed three times under the conditions shown in Table D9(1). Other fabrication conditions employed are shown in Table D9(2).

The fabricated samples are evaluated in a similar manner to that for the example D3, and the results are shown in Table D9(3).

As can be seen from Table D9(3), when an RF power is applied, it is preferable that the pressure in the plasma treatment with the hydrogen gas containing a small amount of silane-based gas ranges from 0.05 Torr to 10 Torr to obtain a good fill factor (F.F.) and uniformity of the photoelectric conversion efficiency, optical durability, adhesion, and overall durability.

EXAMPLE D10 ACCORDING TO THE INVENTION

A solar cell having a triple structure illustrated in FIG. 6 was made using the deposition equipment shown in FIG. 7 in the same way as for example D3. Plasma treatment with hydrogen gas containing a small amount of silane-based gas was performed three times under the conditions shown in Table D10(1). Other fabrication conditions employed are shown in Table D10(2).

The fabricated samples are evaluated in a similar manner to that for the example D3, and the results are shown in Table D10(3).

As can be seen from Table D10(3), when a VHF power is applied, it is preferable that the pressure in the plasma treatment with the hydrogen gas containing a small amount of silane-based gas ranges from 0.0001 Torr to 1 Torr to obtain a good fill factor (F.F.) and uniformity of the photoelectric conversion efficiency, optical durability, adhesion, and overall durability.

EXAMPLE D11 ACCORDING TO THE INVENTION

A solar cell having a triple structure illustrated in FIG. 6 was made using the deposition equipment shown in FIG. 7 in the same way as for example D3. Plasma treatment with hydrogen gas containing a small amount of silane-based gas was performed three times under the conditions shown in Table D11(1). Other fabrication conditions employed are shown in Table D11(2).

The fabricated samples are evaluated in a similar manner to that for the example D3, and the results are shown in Table D11(3).

As can be seen from Table D11(3), when an MW power is applied, it is preferable that the pressure in the plasma treatment with the hydrogen gas containing a small amount of silane-based gas ranges from 0.0001 Torr to 0.01 Torr to obtain a good fill factor (F.F.) and uniformity of the photoelectric conversion efficiency, optical durability, adhesion, and overall durability.

EXAMPLE D12 ACCORDING TO THE INVENTION

A solar cell having a triple structure illustrated in FIG. 6 was made using the deposition equipment shown in FIG. 7 in the same way as for example D3. Plasma treatment with hydrogen gas containing a small amount of silane-based gas was performed three times under the conditions shown in Table D12(1). Other fabrication conditions employed are shown in Table D12(2).

The fabricated samples are evaluated in a similar manner to that for the example D3, and the results are shown in Table D12(3).

As can be seen from Table D12(3), when RF power is used to excite the plasma, it is preferable that the applied power density (electric power) in the plasma treatment with the hydrogen gas containing a small amount of silane-based gas ranges from 0.01 W/cm$^3$ to 1.0 W/cm$^3$ to obtain a good fill factor (F.F.) and uniformity of the photoelectric conversion efficiency, optical durability, adhesion, and overall durability.

EXAMPLE D13 ACCORDING TO THE INVENTION

A solar cell having a triple structure illustrated in FIG. 6 was made using the deposition equipment shown in FIG. 7 in the same way as for example D3. Plasma treatment with hydrogen gas containing a small amount of silane-based gas was performed three times under the conditions shown in Table D13(1). Other fabrication conditions employed are shown in Table D13(2).

The fabricated samples are evaluated in a similar manner to that for the example D3, and the results are shown in Table D13(3).

As can be seen from Table D13(3), when a VHF power is used to excite the plasma, it is preferable that the applied power density (electric power) in the plasma treatment with the hydrogen gas containing a small amount of silane-based gas ranges from 0.01 W/cm$^3$ to 1.0 W/cm$^3$ to obtain a good fill factor (F.F.) and uniformity of the photoelectric conversion efficiency, optical durability, adhesion, and overall durability.

EXAMPLE D14 ACCORDING TO THE INVENTION

A solar cell having a triple structure illustrated in FIG. 6 was made using the deposition equipment shown in FIG. 7 in the same way as for example D3. Plasma treatment with hydrogen gas containing a small amount of silane-based gas was performed three times under the conditions shown in Table D14(1). Other fabrication conditions employed are shown in Table D14(2).

The fabricated samples are evaluated in a similar manner to that for the example D3, and the results are shown in Table D14(3).

As can be seen from Table D14(3), when a MW power is used to excite the plasma, it is preferable that the applied power density (electric power) in the plasma treatment with the hydrogen gas containing a small amount of silane-based gas ranges from 0.1 W/cm$^3$ to 10 W/cm$^3$ to obtain a good fill factor (F.F.) and uniformity of the photoelectric conversion efficiency, optical durability, adhesion, and overall durability.

EXAMPLE D15 ACCORDING TO THE INVENTION

A solar cell having a triple structure illustrated in FIG. 6 was made using the deposition equipment shown in FIG. 7 in the same way as for example D3. Plasma treatment with hydrogen gas containing a small amount of silane-based gas was performed three times under the conditions shown in Table D15(1). Other fabrication conditions employed are shown in Table D15(2).

The fabricated samples are evaluated in a similar manner to that for the example D3, and the results are shown in Table D15(3).

As can be seen from Table D15(3), when an RF power is used to excite the plasma, it is preferable that the substrate temperature in the plasma treatment with the hydrogen gas containing a small amount of silane-based gas ranges from 100° C. to 400° C. to obtain a good fill factor (F.F.) and uniformity of the photoelectric conversion efficiency, optical durability, adhesion, and overall durability.

EXAMPLE D16 ACCORDING TO THE INVENTION

A solar cell having a triple structure illustrated in FIG. 6 was made using the deposition equipment shown in FIG. 7 in the same way as for example D3. Plasma treatment with hydrogen gas containing a small amount of silane-based gas was performed three times under the conditions shown in Table D16(1). Other fabrication conditions employed are shown in Table D16(2).

The fabricated samples are evaluated in a similar manner to that for the example D3, and the results are shown in Table D16(3).

As can be seen from Table D16(3), when a VHF power is used to excite the plasma, it is preferable that the substrate temperature in the plasma treatment with the hydrogen gas containing a small amount of silane-based gas ranges from 50° C. to 300° C. to obtain a good fill factor (F.F.) and uniformity of the photoelectric conversion efficiency, optical durability, adhesion, and overall durability.

EXAMPLE D17 ACCORDING TO THE INVENTION

A solar cell having a triple structure illustrated in FIG. 6 was made using the deposition equipment shown in FIG. 7 in the same way as for example D3. Plasma treatment with hydrogen gas containing a small amount of silane-based gas was performed three times under the conditions shown in Table D17(1). Other fabrication conditions employed are shown in Table D17(2).

The fabricated samples are evaluated in a similar manner to that for the example D3, and the results are shown in Table D17(3).

As can be seen from Table D17(3), when an MW power is used to excite the plasma, it is preferable that the substrate temperature in the plasma treatment with the hydrogen gas containing a small amount of silane-based gas ranges from 50° C. to 300° C. to obtain a good fill factor (F.F.) and uniformity of the photoelectric conversion efficiency, optical durability, adhesion, and overall durability.

EXAMPLE D18 ACCORDING TO THE INVENTION

A solar cell having a triple structure illustrated in FIG. 3 was made using the deposition equipment shown in FIG. 7.

A substrate 490 on which the optical reflection layer 101 and the reflection enhancing layer 102 had been formed in the same way as for example D1 was placed on the substrate transfer rail 413 in the load chamber 401, and the load chamber 401 was evacuated with a vacuum pump (not shown) down to a pressure of about $1\times10^{-5}$ Torr. Then, the gate valve 406 was opened, and the substrate 490 was transferred to the deposition chamber 417 via the transfer chamber 402, both deposition chamber 417 and transfer chamber 402 having been evacuated with a vacuum pump (not shown). The substrate 490 was placed so as to contact with the heater 410 at its rear surface, and heated. The inside of the deposition chamber 417 was evacuated with the vacuum pump (not shown) down to a pressure of about $1\times10^{-5}$ Torr.

The substrate was then subjected to plasma treatment with hydrogen gas containing a small amount of silane-based gas under the conditions shown in Table D18(1).

In this plasma treatment with hydrogen gas containing the small amount of silane-based gas according to the present invention, $SiH_4/H_2$ (diluted to 1000 ppm) serving as silicon compound gas and $H_2$ were introduced into the deposition chamber 417 via the gas inlet 429. The $H_2$ gas was supplied by opening the valves 441, 431, 430 and its flow rate was adjusted to 850 sccm by means of the mass flow controller 436. The silicon compound gas was supplied by opening the valves 442 and 432, and its flow rate was controlled by the mass flow controller 437 such that the flow rate of the $SiH_4$ gas was maintained at 0.04% of the total gas flow rate of $H_2$. Furthermore, the pressure inside the deposition chamber 417 was adjusted to 1.1 Torr by means of a conductance valve (not shown). The substrate 490 was heated by the substrate heater 410 up to 360° C. When the temperature of the substrate had become stable, an RF power of 0.03 $W/cm^3$ was introduced by the RF power supply 422 so that a glow discharge occurs in the plasma excitation cup 420. Under the above-described conditions, the substrate was exposed for three minutes to the hydrogen gas plasma containing the small amount of silane-based gas. The RF power was then shut off to stop the glow discharge. The supply of the $SiH_4/H_2$ (diluted to 1000 ppm) gas into the deposition chamber 417 was stopped, whereas the $H_2$ gas was fed further for five minutes into the deposition chamber 417. Then, the $H_2$ gas was also shut off, and the inside of the deposition chamber 417 as well as the inside of the gas lines was evacuated down to $1\times10^{-5}$ Torr.

In this way, semiconductor film deposition was prepared, and an RF n-layer 103 of μc-Si was then deposited in the same way as for example D2.

The substrate was then subjected to plasma treatment with hydrogen gas containing a small amount of silane-based gas under the conditions shown in Table D18(2).

In this plasma treatment with hydrogen gas containing the small amount of silane-based gas according to the present invention, $SiH_4/H_2$ (diluted to 1000 ppm) serving as silicon compound gas and $H_2$ were introduced into the deposition chamber 417 via the gas inlet 429. The $H_2$ gas was supplied by opening the valves 441, 431, 430 and its flow rate was adjusted to 750 sccm by means of the mass flow controller 436. The silicon compound gas was supplied by opening the valves 442 and 432, and its flow rate was controlled by the mass flow controller 437 such that the flow rate of the $SiH_4$ gas was maintained at 0.03% of the total gas flow rate of $H_2$. Furthermore, the pressure inside the deposition chamber 417 was adjusted to 0.9 Torr by means of a conductance valve (not shown). The substrate 490 was heated by the substrate heater 410 up to 350° C. When the temperature of the substrate had become stable, an RF power of 0.02 $W/cm^3$ was introduced by the RF power supply 422 so that a glow discharge occurs in the plasma excitation cup 420. Under the above-described conditions, the substrate was exposed for three minutes to the hydrogen gas plasma containing the small amount of silane-based gas. The RF power was then shut off to stop the glow discharge. The supply of the $SiH_4/H_2$ (diluted to 1000 ppm) gas into the deposition chamber 417 was stopped, whereas the $H_2$ gas was fed further for five minutes into the deposition chamber 417. Then, the $H_2$ gas was also shut off, and the inside of the deposition chamber 417 as well as the inside of the gas lines was evacuated down to $1\times10^{-5}$ Torr.

The gate valve 407 was opened, and the substrate 490 was transferred to the deposition chamber 418 via the transfer chamber 403, both deposition chamber 418 and transfer chamber 403 having been evacuated with a vacuum pump (not shown). The substrate 490 was placed so as to contact with the heater 411 at its rear surface, and heated. The inside of the deposition chamber 418 was evacuated with the vacuum pump (not shown) down to a pressure of about $1\times10^{-5}$ Torr.

An n/i buffer layer 151 of a-SiC was then deposited by means of RFPCVD in the same way as for example D2.

The substrate was then subjected to plasma treatment with hydrogen gas containing a small amount of silane-based gas under the conditions shown in Table D18(3), according to the present invention.

In this plasma treatment with hydrogen gas containing the small amount of silane-based gas according to the present invention, $SiH_4$ serving as silicon compound gas and $H_2$ were introduced into the deposition chamber 418 via the gas inlet 449. The $H_2$ gas was supplied by opening the valves 463, 453, 450 and its flow rate was adjusted to 900 sccm by means of the mass flow controller 458. The silicon compound gas was supplied by opening the valves 461 and 451 and its flow rate was controlled by the mass flow controller 456 such that the flow rate of the $SiH_4$ gas was maintained at 0.003% of the total gas flow rate of $H_2$. Furthermore, the pressure inside the deposition chamber 418 was adjusted to 0.8 Torr by means of a conductance valve (not shown). The substrate 490 was heated by the substrate heater 411 up to 350° C. When the temperature of the substrate had become stable, an RF power of 0.02 $W/cm^3$ was applied to the bias bar 428 by the RF power supply 424 so that a glow discharge occurs in the deposition chamber 418. Under the above-described conditions, the substrate was exposed for 3 minutes to the hydrogen gas plasma containing the small amount of silane-based gas according to the present invention. The RF power was then shut off to stop the glow discharge. The supply of the $SiH_4$ gas into the deposition chamber 418 was stopped, whereas the $H_2$ gas was fed further for 3 minutes into the deposition chamber 418. Then, the $H_2$ gas was also shut off, and the inside of the deposition chamber 418 as well as the inside of the gas lines was evacuated down to $1\times10^{-5}$ Torr.

An MW i-layer 114 of a-SiGe, a p/i buffer layer 161 of a-SiC, an RF p-layer 105 of a-SiC, and an RF n-layer 203 of μc-Si were then deposited in that order in the same way as for the example D2.

The substrate was then subjected to plasma treatment with hydrogen gas containing a small amount of silane-based gas under the conditions shown in Table D18(4).

In this plasma treatment with hydrogen gas containing the small amount of silane-based gas according to the present invention, $SiH_4/H_2$ (diluted to 1000 ppm) serving as silicon compound gas and $H_2$ were introduced into the deposition chamber 417 via the gas inlet 429. The $H_2$ gas was supplied by opening the valves 441, 431, 430 and its flow rate was adjusted to 650 sccm by means of the mass flow controller 436. The silicon compound gas was supplied by opening the valves 442 and 432, and its flow rate was controlled by the mass flow controller 437 such that the flow rate of the $SiH_4$ gas was maintained at 0.04% of the total gas flow rate of $H_2$. Furthermore, the pressure inside the deposition chamber 417 was adjusted to 0.9 Torr by means of a conductance valve (not shown). The substrate 490 was heated by the substrate heater 410 up to 300° C. When the temperature of the substrate had become stable, an RF power of 0.03 W/cm$^3$ was introduced by the RF power supply 422 so that a glow discharge occurs in the plasma excitation cup 420. Under the above-described conditions, the substrate was exposed for three minutes to the hydrogen gas plasma containing the small amount of silane-based gas. The RF power was then shut off to stop the glow discharge. The supply of the $SiH_4/H_2$ (diluted to 1000 ppm) gas into the deposition chamber 417 was stopped, whereas the $H_2$ gas was fed further for three minutes into the deposition chamber 417. Then, the $H_2$ gas was also shut off, and the inside of the deposition chamber 417 as well as the inside of the gas lines was evacuated down to $1\times10^{-5}$ Torr.

An n/i buffer layer 251 of a-SiC was then deposited by means of RFPCVD in the same way as for example D2.

The substrate was then subjected to plasma treatment with hydrogen gas containing a small amount of silane-based gas under the conditions shown in Table D18(5), according to the present invention.

In this plasma treatment with hydrogen gas containing the small amount of silane-based gas according to the present invention, $SiH_4$ serving as silicon compound gas and $H_2$ were introduced into the deposition chamber 418 via the gas inlet 449. The $H_2$ gas was supplied by opening the valves 463, 453, 450 and its flow rate was adjusted to 850 sccm by means of the mass flow controller 458. The silicon compound gas was supplied by opening the valves 461 and 451 and its flow rate was controlled by the mass flow controller 456 such that the flow rate of the $SiH_4$ gas was maintained at 0.003% of the total gas flow rate of $H_2$. Furthermore, the pressure inside the deposition chamber 418 was adjusted to 0.8 Torr by means of a conductance valve (not shown). The substrate 490 was heated by the substrate heater 411 up to 300° C. When the temperature of the substrate had become stable, an RF power of 0.02 W/cm$^3$ was applied to the bias bar 428 by the RF power supply 424 so that a glow discharge occurs in the deposition chamber 418. Under the above-described conditions, the substrate was exposed for 3 minutes to the hydrogen gas plasma containing the small amount of silane-based gas according to the present invention. The RF power was then shut off to stop the glow discharge. The supply of the $SiH_4$ gas into the deposition chamber 418 was stopped, whereas the $H_2$ gas was fed further for 3 minutes into the deposition chamber 418. Then, the $H_2$ gas was also shut off, and the inside of the deposition chamber 418 as well as the inside of the gas lines was evacuated down to $1\times10^{-5}$ Torr.

An MW i-layer 214 of a-SiGe, a p/i buffer layer 261 of a-SiC, an RF p-layer 205 of a-SiC, and an RF n-layer 303 of μc-Si were then deposited in that order in the same way as for the example D2.

The substrate was then subjected to plasma treatment with hydrogen gas containing a small amount of silane-based gas under the conditions shown in Table D18(6).

In this plasma treatment with hydrogen gas containing the small amount of silane-based gas according to the present invention, $SiH_4/H_2$ (diluted to 1000 ppm) serving as silicon compound gas and $H_2$ were introduced into the deposition chamber 417 via the gas inlet 429. The $H_2$ gas was supplied by opening the valves 441, 431, 430 and its flow rate was adjusted to 600 sccm by means of the mass flow controller 436. The silicon compound gas was supplied by opening the valves 442 and 432, and its flow rate was controlled by the mass flow controller 437 such that the flow rate of the $SiH_4$ gas was maintained at 0.03% of the total gas flow rate of $H_2$. Furthermore, the pressure inside the deposition chamber 417 was adjusted to 0.9 Torr by means of a conductance valve (not shown). The substrate 490 was heated by the substrate heater 410 up to 230° C. When the temperature of the substrate had become stable, an RF power of 0.03 W/cm$^3$ was introduced by the RF power supply 422 so that a glow discharge occurs in the plasma excitation cup 420. Under the above-described conditions, the substrate was exposed for two minutes to the hydrogen gas plasma containing the small amount of silane-based gas. The RF power was then shut off to stop the glow discharge. The supply of the $SiH_4/H_2$ (diluted to 1000 ppm) gas into the deposition chamber 417 was stopped, whereas the $H_2$ gas was fed further for three minutes into the deposition chamber 417. Then, the $H_2$ gas was also shut off, and the inside of the deposition chamber 417 as well as the inside of the gas lines was evacuated down to $1\times10^{-5}$ Torr.

An n/i buffer layer 351 of a-SiC was then deposited by means of RFPCVD in the same way as for example D2.

The substrate was then subjected to plasma treatment with hydrogen gas containing a small amount of silane-based gas under the conditions shown in Table D18(7), according to the present invention.

In this plasma treatment with hydrogen gas containing the small amount of silane-based gas according to the present invention, $SiH_4$ serving as silicon compound gas and $H_2$ were introduced into the deposition chamber 418 via the gas inlet 449. The $H_2$ gas was supplied by opening the valves 463, 453, 450 and its flow rate was adjusted to 800 sccm by means of the mass flow controller 458. The silicon compound gas was supplied by opening the valves 461 and 451 and its flow rate was controlled by the mass flow controller 456 such that the flow rate of the $SiH_4$ gas was maintained at 0.003% of the total gas flow rate of $H_2$. Furthermore, the pressure inside the deposition chamber 418 was adjusted to 0.8 Torr by means of a conductance valve (not shown). The substrate 490 was heated by the substrate heater 411 up to 200° C. When the temperature of the substrate had become stable, an RF power of 0.02 W/cm$^3$ was applied to the bias bar 428 by the RF power supply 424 so that a glow discharge occurs in the deposition chamber 418. Under the above-described conditions, the substrate was exposed for 3 minutes to the hydrogen gas plasma containing the small amount of silane-based gas according to the present invention. The RF power was then shut off to stop the glow discharge. The supply of the $SiH_4$ gas into the deposition chamber 418 was stopped, whereas the $H_2$ gas was fed further for 3 minutes into the deposition chamber 418. Then, the $H_2$ gas was also shut off, and the inside of the deposition chamber 418 as well as the inside of the gas lines was evacuated down to $1\times10^{-5}$ Torr.

An RF i-layer 314 of a-Si, a p/i buffer layer 361 of a-SiC, and an RF p-layer 305 of a-SiC were then deposited in that order in the same way as for the example D2 by means of RFPCVD.

ITO was then evaporated onto the RF p-layer 305 so as to form a transparent conductive layer 112 having a thickness of 70 nm.

A mask having a comb-shaped window was placed on the transparent conductive layer 112, and metal evaporation was performed via the mask to form a comb-shaped collection electrode 113 having a multi-layer structure consisting of Cr (40 nm), Ag (1000 nm), and Cr (40 nm).

In this way, the complete solar cell according to the invention was obtained. Hereinafter, the solar cell of this type will be referred to as SC-EMB-D18. Tables D18(1) through D18(8) indicate the conditions used here in the invention, regarding the plasma treatment with hydrogen containing a small amount of silane-based gas as well as the process conditions for the RF n-layer, n/i buffer layer, MW i-layer, p/i buffer layer, RF p-layer, RF n-layer, n/i buffer layer, MW i-layer, p/i buffer layer, RF p-layer, RF n-layer, n/i buffer layer, RF i-layer, p/i buffer layer, and RF p-layer.

COMPARATIVE EXAMPLE D18

For the sake of comparison, a solar cell (SC-CMP-D18) was also fabricated in the same manner as in the above-described example D18 except that the plasma treatment with hydrogen gas containing a small amount of silane-based gas according to the invention was not performed.

Seven samples of solar cells were prepared for each type (SC-EMB-D18 and SC-CMP-D18) for the purpose of evaluation regarding the initial photoelectric conversion efficiency (the ratio of the electric output power to the optical input power), vibration durability and optical durability under a biased condition at high temperature with high humidity, and vibration durability and optical durability under a non-biased condition.

The measurement of the initial photoelectric conversion efficiency was performed by measuring the V-I characteristics of the samples under the illumination condition of AM 1.5 (100 mW/cm$^2$). The measurement revealed that the SC-EMB-D18 samples had a smaller variation in the initial photoelectric conversion efficiencies than the SC-CMP-D18 samples and had a larger fill factor (F.F.) as shown below:

| | [Fill factor (F.F.)] | [Variation] |
|---|---|---|
| SC-EMB-D18 | 1.14 (relative to that of SC-CMP-D18) | 0.83 |

The vibration durability test under the non-biased condition was performed as follows: After the measurement of the initial photoelectric conversion efficiency, some samples were placed in a dark place kept at 25° C. with a relative humidity of 50%. Vibration having an amplitude of 0.1 mm and a frequency of 60 Hz was applied to the samples for 500 hr. Then, the photoelectric conversion efficiencies of the samples were measured under the illumination condition of AM 1.5 (100 mW/cm$^2$) and the reduction relative to the initial value (the ratio of the photoelectric conversion efficiency after the vibration test to the initial value) was evaluated for each sample. The SC-CMP-D18 samples showed a greater reduction in the photoelectric conversion efficiency compared with the SC-EMB-D18 samples as shown below.

The optical durability test under the non-biased condition was performed as follows: After the measurement of the initial photoelectric conversion efficiency, some samples were placed in a dark place kept at 25° C. with a relative humidity of 50%. Light having a power of AM 1.5 (100 mW/cm$^2$) was applied to the samples for 500 hours, and then the photoelectric conversion efficiencies of the samples were measured under the illumination condition of AM 1.5 (100 mW/cm$^2$). The reduction relative to the initial value (the ratio of the photoelectric conversion efficiency after the optical durability test to the initial value) was evaluated for each sample. The SC-CMP-D18 samples showed a greater reduction in the photoelectric conversion efficiency compared with the SC-EMB-D18 samples as shown below.

| | [Vibration durability] | [Optical durability] |
|---|---|---|
| SC-CMP-D18 | 0.84 (relative to those of SC-EMB-D18) | 0.83 |

The evaluation of the vibration durability and optical durability under the biased condition at high temperature with high humidity was performed as follows: After the measurementoftheinitialphotoelectricconversionefficiency, some samples were placed in a dark place kept at 80° C. with a relative humidity of 90%, and a forward bias voltage of 0.7 V was applied to the samples. The vibration described above was applied to some of the samples and light having a power of AM 1.5 was applied to the other samples under the same conditions as those in the non-biased vibration test. The photoelectric conversion efficiencies of the samples were measured under the illumination condition of AM 1.5 (100 mW/cm$^2$). The SC-CMP-D18 samples also showed a greater reduction in the photoelectric conversion efficiency compared with the SC-EMB-D18 samples after the vibration and optical durability tests as shown below.

Under the biased condition:

| | [Vibration durability] | [Optical durability] |
|---|---|---|
| SC-CMP-D18 | 0.83 (relative to that of SC-EMB-D18) | 0.82 |

The surfaces of the samples were observed using an optical microscope to evaluate film separation. No film separation was observed in the SC-EMB-D18 samples, whereas slight film separation was observed in the SC-CMP-D18 samples.

From the above results, it can be concluded that the solar cells (SC-EMB-D18) according to the present invention are better than the conventional solar cells (SC-CMP-D18) in optical durability, adhesion, overall durability, a fill factor (F.F.) and uniformity of the photoelectric conversion efficiency.

In the above examples of solar cells according to the present invention, semiconductor layers were deposited on a substrate in the order of an n-layer, n/i-layer, i-layer, p/i buffer layer, and p-layer. Solar cells in which the semiconductor layers were deposited in the opposite order were also made using the same hydrogen plasma treatment.

These solar cells were evaluated in the same way as for the above-described examples. When the hydrogen plasma treatment was applied to the cells between the n/i buffer layer and i-layer, the cells showed improvement in fill factor (F.F.) and uniformity of the photoelectric conversion efficiency, optical durability, adhesion, overall durability and other factors. When the hydrogen plasma treatment was also applied to the cells between the substrate and p-layer, and also to the n-layer and n/i buffer layer, the cells showed further improvement in the characteristics described above.

EXAMPLE E1 ACCORDING TO THE INVENTION

A solar cell having a structure illustrated in FIG. 2 was made using the deposition equipment shown in FIG. 7. First, a substrate was prepared. A stainless-steel base 100 having dimensions of 0.5 mm in thickness and 50×50 $mm^2$ in area was cleaned with acetone and isopropanol by means of ultrasonic cleaning, and then dried with hot air.

An Ag optical reflection layer 101 having a thickness of 0.3 μm was deposited on a surface of the stainless-steel base 100 by sputtering at room temperature, and a 1.0-μm-thick ZnO layer acting as a reflection enhancing layer 102 was further deposited on it at 350° C. Thus, the complete substrate was prepared.

Using the deposition equipment 400 having the capabilities of both MWPCVD and RFPCVD, semiconductor layers were then deposited on the reflection enhancing layer 102.

The deposition equipment was connected to source gas cylinders (not shown) via gas inlets. The source gas cylinders used here contained gas refined with ultra high purity, $SiH_4$, $SiF_4$, $CH_4$, $GeH_4$, $GeF_4$, $Si_2H_6$, $PH_3/H_2$ (diluted to 1000 ppm), $B_2H_6/H_2$ (diluted to 2000 ppm), $H_2$, He, $SiCl_2H_2$, and $SiH_4/H_2$ (diluted to 1000 ppm) gas.

The substrate 490 on which the optical reflection layer 101 and the reflection enhancing layer 102 had been formed was placed on the substrate transfer rail 413 in the load chamber 401, and the load chamber 401 was evacuated with a vacuum pump (not shown) down to a pressure of about $1\times10^{-5}$ Torr. Then, the gate valve 406 was opened, and the substrate 490 was transferred to the deposition chamber 417 via the transfer chamber 402, both deposition chamber 417 and transfer chamber 402 having been evacuated with a vacuum pump (not shown). The substrate 490 was placed so as to contact with the heater 410 at its rear surface, and heated. The inside of the deposition chamber 417 was evacuated with the vacuum pump (not shown) down to a pressure of about $1\times10^{-5}$ Torr.

In this way, semiconductor film deposition was prepared, and an RF n-layer 103 of μc-Si was then deposited, as described below.

To deposit the RF n-layer of μc-Si, $H_2$ gas was introduced into the deposition chamber 417 via the gas inlet 429. The $H_2$ gas was supplied by opening the valves 441, 431, 430 and its flow rate was adjusted to 180 sccm by means of the mass flow controller 436. Furthermore, the pressure inside the deposition chamber 417 was adjusted to 1.10 Torr by means of the conductance valve (not shown). The substrate 490 was heated by the substrate heater 410 up to 370° C. When the temperature of the substrate had become stable, the valves 443, 433, 444, and 434 were opened to introduce $SiH_4$ gas and $PH_3/H_2$ gas into the deposition chamber 417 via the gas inlet 429. The flow rates of $SiH_4$, $H_2$, and $PH_3/H_2$ were adjusted to 1.4 sccm, 110 sccm, and 200 sccm, respectively, by the mass flow controllers 438, 436, and 439. The pressure inside the deposition chamber 417 was adjusted to 1.10 Torr. An RF power of the RF power supply 422 was set to 0.04 $W/cm^3$ and applied to the plasma excitation cup 420 to activate a glow discharge. The deposition of the RF n-layer was started. When the thickness of the deposited RF n-layer reached 20 nm, the RF power was shut off to stop the glow discharge. The deposition of the RF n-layer 103 was finished. The supply of $SiH_4$ and $PH_3/H_2$ into the deposition chamber 417 was stopped, whereas $H_2$ was fed further for five minutes into the deposition chamber 417. Then, $H_2$ was also shut off, and the inside of the deposition chamber 417 as well as the inside of the gas lines was evacuated down to $1\times10^{-5}$ Torr.

An n/i buffer layer 151 of a-Si was then deposited by means of RFPCVD as described below.

The gate valve 407 was opened, and the substrate 490 was transferred to the i-layer deposition chamber 418 via the transfer chamber 403, both deposition chamber 418 and transfer chamber 403 having been evacuated with a vacuum pump (not shown). The substrate 490 was placed so as to contact with the heater 411 at its rear surface, and heated. The inside of the i-layer deposition chamber 418 was evacuated with the vacuum pump (not shown) down to a pressure of about $1\times10^{-5}$ Torr.

To deposit the n/i buffer layer 151, the substrate 490 was heated by the substrate heater 411 up to 360° C. When the substrate had been heated enough, the valves 464, 454, 450, 463, and 453 were opened gradually to supply $Si_2H_6$ and $H_2$ to the i-layer deposition chamber 418 via the gas inlet 449. The flow rates of $Si_2H_6$ and $H_2$ were adjusted to 3.5 sccm and 80 sccm, respectively, by the mass flow controllers 459 and 458. The pressure inside the i-layer deposition chamber 418 was set to 0.8 Torr by adjusting the opening ratio of a conductance valve (not shown). Then, a high-frequency (RF) power of 0.06 $W/cm^3$ was applied to the bias bar 428 by the RF power supply 424 to excite a glow discharge. The shutter 427 was then opened, and depositing the n/i buffer layer on the RF n-layer was started. When the thickness of the deposited n/i buffer layer reached 10 nm, the RF glow discharge was stopped, and the RF power supply 424 was shut off. The deposition of the n/i buffer layer 151 was finished. The valves 464 and 454 were closed to stop the supply of $Si_2H_6$ to the i-layer deposition chamber 418, whereas $H_2$ was fed further for two minutes into the i-layer deposition chamber 418. Then, the valves 453 and 450 were closed, and the inside of the i-layer deposition chamber 418 as well as the inside of the gas lines was evacuated down to $1\times10^{-5}$ Torr.

An MW i-layer 114 of a-SiGe was then deposited by means of MWPCVD as described below.

To deposit the MW i-layer 114, the substrate 490 was heated by the substrate heater 411 up to 370° C. When the substrate had been heated enough, the valves 461, 451, 450, 462, 452, 463, and 453 were opened gradually to supply $SiH_4$, $GeH_4$, and $H_2$ to the i-layer deposition chamber 418 via the gas inlet 449. The flow rates of $SiH_4$, $GeH_4$, and $H_2$ were adjusted to 38, 37, and 130 sccm, respectively, by the mass flow controllers 456, 457, and 458. The pressure inside the i-layer deposition chamber 418 was set to 5 mTorr by adjusting the opening ratio of a conductance valve (not shown). Then, a high-frequency (RF) power of 0.70 $W/cm^3$ was applied to the bias bar 428 by the RF power supply 424. The power of the MW power supply (not shown) was set to 0.30 $W/cm^3$ and introduced into the i-layer deposition chamber 418 through the wave guide 426 and the microwave entrance window 425 to excite a glow discharge. The shutter 427 was then opened, and depositing the MW i-layer 114 onto the n/i buffer layer was started. When the thickness of the deposited MW i-layer 114 reached 0.15 μm, the MW glow discharge was stopped, and the RF power supply 424 was shut off. The deposition of the MW i-layer 114 was finished. The valves 451 and 452 were closed to stop the supply of $SiH_4$ and $GeH_4$ to the i-layer deposition chamber 418, whereas $H_2$ was fed further for two minutes into the i-layer deposition chamber 418. Then, the valves 453 and 450 were closed, and the inside of the i-layer deposition chamber 418 as well as the inside of the gas lines was evacuated down to $1\times10^{-5}$ Torr.

The substrate was then subjected to plasma treatment with hydrogen gas containing a small amount of silane-based gas, according to the present invention.

In this plasma treatment with hydrogen gas containing the small amount of silane-based gas according to the present invention, $SiH_4$ serving as silicon compound gas and $H_2$ were introduced into the deposition chamber 418 via the gas inlet 449. The $H_2$ gas was supplied by opening the valves 463, 453, 450 and its flow rate was adjusted to 1000 sccm by means of the mass flow controller 458. The silicon compound gas was supplied by opening the valves 461 and 451 and its flow rate was controlled by the mass flow controller 456 such that the flow rate of the $SiH_4$ gas was maintained at 0.01% of the total gas flow rate of $H_2$. Furthermore, the pressure inside the deposition chamber 418 was adjusted to 0.8 Torr by means of a conductance valve (not shown). The substrate 490 was heated by the substrate heater 411 up to 300° C. When the temperature of the substrate had become stable, an RF power of 0.05 W/cm$^3$ was applied to the bias bar 428 by the RF power supply 424 so that a glow discharge occurs in the deposition chamber 418. Under the above-described conditions, the substrate was exposed for 3 minutes to the hydrogen gas plasma containing the small amount of silane-based gas according to the present invention. The RF power was then shut off to stop the glow discharge. The supply of the $SiH_4$ gas into the deposition chamber 418 was stopped, whereas the $H_2$ gas was fed further for 3 minutes into the deposition chamber 418. Then, the $H_2$ gas was also shut off, and the inside of the deposition chamber 418 as well as the inside of the gas lines was evacuated down to $1\times10^{-5}$ Torr.

A p/i buffer layer 161 of a-Si was then deposited by means of RFPCVD as described below.

To deposit the p/i buffer layer 161, the substrate 490 was heated by the substrate heater 411 up to 230° C. When the substrate had been heated enough, the valves 464, 454, 450, 463, and 453 were opened gradually to supply $Si_2H_6$ and $H_2$ to the i-layer deposition chamber 418 via the gas inlet 449. The flow rates of $Si_2H_6$ and $H_2$ were adjusted to 3 sccm and 80 sccm, respectively, by the mass flow controllers 459 and 458. The pressure inside the i-layer deposition chamber 418 was set to 0.7 Torr by adjusting the opening ratio of a conductance valve (not shown). Then, an RF power of 0.07 W/cm$^3$ was applied to the bias bar 428 by the RF power supply 424 to excite a glow discharge. The shutter 427 was then opened, and depositing the p/i buffer layer 161 on the MW i-layer was started. When the thickness of the deposited p/i buffer layer 161 reached 20 nm, the RF glow discharge was stopped, and the RF power supply 424 was shut off. The deposition of the p/i buffer layer 161 was finished. The valves 464 and 454 were closed to stop the supply of $Si_2H_6$ to the i-layer deposition chamber 418, whereas $H_2$ was fed further for two minutes into the i-layer deposition chamber 418. Then, the valves 453 and 450 were closed, and the inside of the i-layer deposition chamber 418 as well as the inside of the gas lines was evacuated down to $1\times10^{-5}$ Torr.

An RF p-layer 105 of a-SiC was deposited. To deposit the RF p-layer 105 of a-SiC, the gate valve 408 was opened, and the substrate 490 was transferred to the p-layer deposition chamber 419 via the transfer chamber 404, both deposition chamber 419 and transfer chamber 404 having been evacuated with a vacuum pump (not shown). The substrate 490 was placed so as to contact with the heater 412 at its rear surface, and heated. The inside of the p-layer deposition chamber 419 was evacuated with the vacuum pump (not shown) down to a pressure of about $1\times10^{-5}$ Torr.

The substrate 490 was heated by the substrate heater 412 up to 200° C. When the temperature of the substrate had become stable, the valves 481, 471, 470, 482, 472, 483, 473, 484, and 474 were opened to supply $H_2$ gas, $SiH_4/H_2$ gas, $B_2H_6/H_2$ gas, and $CH_4$ gas to the deposition chamber 419 via the gas inlet 469. The flow rates of the $H_2$, $SiH_4/H_2$, $B_2H_6/H_2$, and $CH_4$, were adjusted to 80 sccm, 1 sccm, 10 sccm, and 0.3 sccm, respectively, by the mass flow controllers 476, 477, 478, and 479. The pressure inside the chamber 419 was set to 1.3 Torr by adjusting the opening ratio of a conductance valve (not shown). An RF power of 0.09 W/cm$^3$ was applied by the RF power supply 423 to the plasma excitation cup 421 to activate a glow discharge, and deposition of the RF p-layer on the p/i buffer layer was started. When the thickness of the deposited RF p-layer reached 10 nm, the RF power was shut off to stop the glow discharge. The deposition of the RF p-layer 105 was finished. The valves 472, 482, 473, 483, 474, and 484 were closed to stop the supply of $SiH_4/H_2$, $B_2H_6/H_2$, and $CH_4$ to the p-layer deposition chamber 419, whereas $H_2$ was fed further for three minutes into the p-layer deposition chamber 419. Then, the valves 471, 481, and 470 were closed, and the inside of the p-layer deposition chamber 419 as well as the inside of the gas lines was evacuated down to $1\times10^{-5}$ Torr.

The gate valve 409 was then opened, and the substrate 490 was transferred to the unload chamber 405 which had already been evacuated with a vacuum pump (not shown). Then, a leak valve (not shown) was opened so that the inside of the unload chamber 405 was exposed to the ambient atmosphere.

ITO was then evaporated onto the RF p-layer 105 so as to form a transparent conductive layer 112 having a thickness of 70 nm.

A mask having a comb-shaped window was placed on the transparent conductive layer 112, and metal evaporation was performed via the mask to form a comb-shaped collection electrode 113 having a multi-layer structure consisting of Cr (40 nm), Ag (1000 nm), and Cr (40 nm).

In this way, the complete solar cell according to the invention was obtained. Hereinafter, the solar cell of this type will be referred to as SC-EMB-E1. Tables E1(1) and E1(2) indicate the conditions used here in the invention, regarding the plasma treatment with hydrogen containing a small amount of silane-based gas as well as the process conditions for the RF n-layer, RF n/i buffer layer, MW i-layer, RF p/i buffer layer, and RF p-layer.

COMPARATIVE EXAMPLE E1

For the sake of comparison, a solar cell (SC-CMP-E1) was also fabricated in the same manner as in the above-described example E1 except that the plasma treatment with hydrogen gas containing a small amount of silane-based gas according to the invention was not performed.

Nine samples of solar cells were prepared for each type (SC-EMB-E1 and SC-CMP-E1) for the purpose of evaluation regarding the initial photoelectric conversion efficiency (the ratio of the electric output power to the optical input power), vibration durability and optical durability under a biased condition at high temperature with high humidity, and vibration durability and optical durability under a non-biased condition.

The measurement of the initial photoelectric conversion efficiency was performed by measuring the V-I characteristics of the samples under the illumination condition of AM 1.5 (100 mW/cm$^2$). The measurement revealed that the SC-EMB-E1 samples had a smaller variation (that is, more preferable) in the initial photoelectric conversion efficiencies than the SC-CMP-E1 samples and had a larger fill factor (F.F.) as shown below:

| | [Fill factor (F.F.)] | [Variation] |
|---|---|---|
| SC-EMB-E1 | 1.11 (relative to that of SC-CMP-E1) | 0.85 |

The vibration durability test under the non-biased condition was performed as follows: After the measurement of the initial photoelectric conversion efficiency, some samples were placed in a dark place kept at 26° C. with a relative humidity of 55%. Vibration having an amplitude of 0.1 mm and a frequency of 60 Hz was applied to the samples for 500 hr. Then, the photoelectric conversion efficiencies of the samples were measured under the illumination condition of AM 1.5 (100 mW/cm$^2$) and the reduction relative to the initial value (the ratio of the photoelectric conversion efficiency after the vibration test to the initial value) was evaluated for each sample. The SC-CMP-E1 samples showed a greater reduction in the photoelectric conversion efficiency compared with the SC-EMB-E1 samples as shown below.

The optical durability test under the non-biased condition was performed as follows: After the measurement of the initial photoelectric conversion efficiency, some samples were placed in a dark place kept at 26° C. with a relative humidity of 55%. Light having a power of AM 1.5 (100 mW/cm$^2$) was applied to the samples for 500 hours, and then the photoelectric conversion efficiencies of the samples were measured under the illumination condition of AM 1.5 (100 mW/cm$^2$). The reduction relative to the initial value (the ratio of the photoelectric conversion efficiency after the optical durability test to the initial value) was evaluated for each sample. The SC-CMP-E1 samples showed a greater reduction in the photoelectric conversion efficiency compared with the SC-EMB-E1 samples as shown below.

| | [Vibration durability] | [Optical durability] |
|---|---|---|
| SC-CMP-E1 | 0.84 (relative to those of SC-EMB-E1) | 0.82 |

The evaluation of the vibration durability and optical durability under the biased condition at high temperature with high humidity was performed as follows: After the measurement of the initial photoelectric conversion efficiency, some samples were placed in a dark place kept at 85° C. with a relative humidity of 91%, and a forward bias voltage of 0.7 V was applied to the samples. The vibration described above was applied to some of the samples and light having a power of AM 1.5 was applied to the other samples under the same conditions as those in the non-biased vibration test. The photoelectric conversion efficiencies of the samples were measured under the illumination condition of AM 1.5 (100 mW/cm$^2$). The SC-CMP-E1 samples also showed a greater reduction in the photoelectric conversion efficiency compared with the SC-EMB-E1 samples after the vibration and optical durability tests as shown below.

| | Under the biased condition: | |
|---|---|---|
| | [Vibration durability] | [Optical durability] |
| SC-CMP-E1 | 0.83 (relative to that of SC-EMB-E1) | 0.82 |

The surfaces of the samples were observed using an optical microscope to evaluate film separation. No film separation was observed in the SC-EMB-E1 samples, whereas slight film separation was observed in the SC-CMP-E1 samples.

From the above results, it can be concluded that the solar cells (SC-EMB-E1) according to the present invention are better than the conventional solar cells (SC-CMP-E1) in optical durability, adhesion, overall durability, fill factor (F.F.) and uniformity of the photoelectric conversion efficiency.

EXAMPLE E2 ACCORDING TO THE INVENTION

A solar cell having a structure illustrated in FIG. 4 was made using the deposition equipment shown in FIG. 7.

A substrate 490 on which the optical reflection layer 101 and the reflection enhancing layer 102 had been formed in the same was as for example D1 was placed on the substrate transfer rail 413 in the load chamber 401, and the load chamber 401 was evacuated with a vacuum pump (not shown) down to a pressure of about 1×10$^{-5}$ Torr. Then, the gate valve 406 was opened, and the substrate 490 was transferred to the deposition chamber 417 via the transfer chamber 402, both deposition chamber 417 and transfer chamber 402 having been evacuated with a vacuum pump (not shown). The substrate 490 was placed so as to contact with the heater 410 at its rear surface, and heated. The inside of the deposition chamber 417 was evacuated with the vacuum pump (not shown) down to a pressure of about 1×10$^{-5}$ Torr.

In this way, semiconductor film deposition was prepared, and an RF n-layer 103 of μc-Si was then deposited, as described below.

To deposit the RF n-layer 103 of μc-Si, $H_2$ gas was introduced into the deposition chamber 417 via the gas inlet 429. The $H_2$ gas was supplied by opening the valves 441, 431, 430 and its flow rate was adjusted to 300 sccm by means of the mass flow controller 436. Furthermore, the pressure inside the deposition chamber 417 was adjusted to 1.2 Torr by means of the conductance valve (not shown). The substrate 490 was heated by the substrate heater 410 up to 380° C. When the temperature of the substrate had become stable, the valves 443, 433, 444, and 434 were opened to introduce $SiH_4$ gas and $PH_3/H_2$ gas into the deposition chamber 417 via the gas inlet 429. The flow rates of $SiH_4$, $H_2$, and $PH_3/H_2$ were adjusted to 1.7 sccm, 90 sccm, and 200 sccm, respectively, by the mass flow controllers 438, 436, and 439. The pressure inside the deposition chamber 417 was adjusted to 1.2 Torr. An RF power of the RF power supply 422 was set to 0.05 W/cm$^3$ and applied to the plasma excitation cup 420 to activate a glow discharge. Deposition of the RF n-layer on the substrate was started. When the thickness of the deposited RF n-layer reached 20 nm, the RF power was shut off to stop the glow discharge. The deposition of the RF n-layer 103 was finished. The supply of $SiH_4$ and $PH_3/H_2$ into the deposition chamber 417 was stopped, whereas $H_2$ was fed further for four minutes into the deposition chamber 417. Then, $H_2$ was also shut off, and the inside of the deposition chamber 417 as well as the inside of the gas lines was evacuated down to 1×10$^{-5}$ Torr.

An n/i buffer layer 151 of a-Si was then deposited by means of RFPCVD as described below.

The gate valve 407 was opened, and the substrate 490 was transferred to the i-layer deposition chamber 418 via the transfer chamber 403, both deposition chamber 418 and transfer chamber 403 having been evacuated with a vacuum pump (not shown). The substrate 490 was placed so as to contact with the heater 411 at its rear surface, and heated. The inside of the i-layer deposition chamber 418 was evacuated with the vacuum pump (not shown) down to a pressure of about $1\times10^{-5}$ Torr.

To deposit the n/i buffer layer 151, the substrate 490 was heated by the substrate heater 411 up to 360° C. When the substrate had been heated enough, the valves 464, 454, 450, 463, and 453 were opened gradually to supply $Si_2H_6$ and $H_2$ to the i-layer deposition chamber 418 via the gas inlet 449. The flow rates of $Si_2H_6$ and $H_2$ were adjusted to 3.5 sccm and 85 sccm, respectively, by the mass flow controllers 459 and 458. The pressure inside the i-layer deposition chamber 418 was set to 0.8 Torr by adjusting the opening ratio of a conductance valve (not shown). Then, a RF power of 0.08 W/cm$^3$ was applied to the bias bar 428 by the RF power supply 424 to excite a glow discharge. The shutter 427 was then opened, and depositing the n/i buffer layer 151 on the RF n-layer was started. When the thickness of the deposited n/i buffer layer reached 10 nm, the RF glow discharge was stopped, and the RF power supply 424 was shut off. The deposition of the n/i buffer layer 151 was finished. The valves 464 and 454 were closed to stop the supply of $Si_2H_6$ to the i-layer deposition chamber 418, whereas $H_2$ was fed further for two minutes into the i-layer deposition chamber 418. Then, the valves 453 and 450 were closed, and the inside of the i-layer deposition chamber 418 as well as the inside of the gas lines was evacuated down to $1\times10^{-5}$ Torr.

An MW i-layer 114 of a-SiGe was then deposited by means of MWPCVD as described below.

To deposit the MW i-layer 114, the substrate 490 was heated by the substrate heater 411 up to 380° C. When the substrate had been heated enough, the valves 461, 451, 450, 462, 452, 463, and 453 were opened gradually to supply $SiH_4$, $GeH_4$, and $H_2$ to the i-layer deposition chamber 418 via the gas inlet 449. The flow rates of $SiH_4$, $GeH_4$, and $H_2$ were adjusted to 45, 40, and 150 sccm, respectively, by the mass flow controllers 456, 457, and 458. The pressure inside the i-layer deposition chamber 418 was set to 5 mTorr by adjusting the opening ratio of a conductance valve (not shown). Then, an RF power of 0.60 W/cm$^3$ was applied to the bias bar 428 by the RF power supply 424. The power of the MW power supply (not shown) was set to 0.25 W/cm$^3$ and introduced into the i-layer deposition chamber 418 through the wave guide 426 and the microwave entrance window 425 to excite a glow discharge. The shutter 427 was then opened, and depositing the MW i-layer 114 onto the n/i buffer layer was started. When the thickness of the deposited MW i-layer 114 reached 0.15 μm, the MW glow discharge was stopped, and the RF power supply 424 was shut off. The deposition of the MW i-layer 114 was finished. The valves 451 and 452 were closed to stop the supply of $SiH_4$ and $GeH_4$ to the i-layer deposition chamber 418, whereas $H_2$ was fed further for two minutes into the i-layer deposition chamber 418. Then, the valves 453 and 450 were closed, and the inside of the i-layer deposition chamber 418 as well as the inside of the gas lines was evacuated down to $1\times10^{-5}$ Torr.

The substrate was then subjected to plasma treatment with hydrogen gas containing a small amount of silane-based gas under the conditions shown in Table E2(1), according to the present invention.

In this plasma treatment with hydrogen gas containing the small amount of silane-based gas according to the present invention, $Si_2H_6$ serving as silicon compound gas and $H_2$ were introduced into the deposition chamber 418 via the gas inlet 449. The $H_2$ gas was supplied by opening the valves 463, 453, 450 and its flow rate was adjusted to 850 sccm by means of the mass flow controller 458. The silicon compound gas was supplied by opening the valves 464 and 454 and its flow rate was controlled by the mass flow controller 459 such that the flow rate of the $Si_2H_6$ gas was maintained at 0.005% of the total gas flow rate of $H_2$. Furthermore, the pressure inside the deposition chamber 418 was adjusted to 0.012 Torr by means of a conductance valve (not shown). The substrate 490 was heated by the substrate heater 411 up to 285° C. When the temperature of the substrate had become stable, a VHF power of 0.08 W/cm$^3$ was applied to the bias bar 428 by the VHF power supply (not shown) so that a glow discharge occurs in the deposition chamber 418. Under the above-described conditions, the substrate was exposed for four minutes to the hydrogen gas plasma containing the small amount of silane-based gas according to the present invention. The VHF power was then shut off to stop the glow discharge. The supply of the $Si_2H_6$ gas into the deposition chamber 418 was stopped, whereas the $H_2$ gas was fed further for four minutes into the deposition chamber 418. Then, the $H_2$ gas was also shut off, and the inside of the deposition chamber 418 as well as the inside of the gas lines was evacuated down to $1\times10^{-5}$ Torr.

A p/i buffer layer 161 of a-Si was then deposited by means of RFPCVD as described below.

To deposit the p/i buffer layer 161, the substrate 490 was heated by the substrate heater 411 up to 250° C. When the substrate had been heated enough, the valves 464, 454, 450, 463, and 453 were opened gradually to supply $Si_2H_6$ and $H_2$ to the i-layer deposition chamber 418 via the gas inlet 449. The flow rates of $Si_2H_6$ and $H_2$ were adjusted to 3 sccm and 70 sccm, respectively, by the mass flow controllers 459 and 458. The pressure inside the i-layer deposition chamber 418 was set to 0.7 Torr by adjusting the opening ratio of a conductance valve (not shown). Then, an RF power of 0.07 W/cm$^3$ was applied to the bias bar 428 by the RF power supply 424 to excite a glow discharge. The shutter 427 was then opened, and depositing the p/i buffer layer 161 on the MW i-layer 114 was started. When the thickness of the deposited p/i buffer layer 161 reached 20 nm, the RF glow discharge was stopped, and the RF power supply 424 was shut off. The deposition of the p/i buffer layer 161 was finished. The valves 464 and 454 were closed to stop the supply of $Si_2H_6$ to the i-layer deposition chamber 418, whereas $H_2$ was fed further for two minutes into the i-layer deposition chamber 418. Then, the valves 453 and 450 were closed, and the inside of the i-layer deposition chamber 418 as well as the inside of the gas lines was evacuated down to $1\times10^{-5}$ Torr.

To deposit an RF p-layer 105 of a-SiC, the gate valve 408 was opened, and the substrate 490 was transferred to the p-layer deposition chamber 419 via the transfer chamber 404, both deposition chamber 419 and transfer chamber 404 having been evacuated with a vacuum pump (not shown). The substrate 490 was placed so as to contact with the heater 412 at its rear surface, and heated. The inside of the p-layer deposition chamber 419 was evacuated with the vacuum pump (not shown) down to a pressure of about $1\times10^{-5}$ Torr.

The substrate 490 was heated by the substrate heater 412 up to 250° C. When the temperature of the substrate had become stable, the valves 481, 471, 470, 482, 472, 483, 473, 484, and 474 were opened to supply $H_2$gas, $SiH_4/H_2$gas, $B_2H_6/H_2$gas, and $CH_4$ gas to the deposition chamber 419 via the gas inlet 469. The flow rates of the $H_2$, $SiH_4/H_2$, $B_2H_6/H_2$, and $CH_4$, were adjusted to 60 sccm, 2 sccm, 10 sccm, and 0.3 sccm, respectively, by the mass flow controllers 476, 477, 478, and 479. The pressure inside the chamber

419 was set to 1.8 Torr by adjusting the opening ratio of a conductance valve (not shown). An RF power of 0.07 W/cm$^3$ was applied by the RF power supply 423 to the plasma excitation cup 421 to activate a glow discharge, and deposition of the RF p-layer 105 on the p/i buffer layer 161 was started. When the thickness of the deposited RF p-layer 105 reached 10 nm, the RF power was shut off to stop the glow discharge. The deposition of the RF p-layer 105 was finished. The valves 472, 482, 473, 483, 474, and 484 were closed to stop the supply of $SiH_4/H_2$, $B_2H_6/H_2$, and $CH_4$ to the p-layer deposition chamber 419, whereas $H_2$ was fed further for three minutes into the p-layer deposition chamber 419. Then, the valves 471, 481, and 470 were closed, and the inside of the p-layer deposition chamber 419 as well as the inside of the gas lines was evacuated down to $1\times10^{-5}$ Torr.

Next, an RF n-layer 203 of μc-Si was deposited. The gate valves 408 and 407 were opened, and the substrate 490 was transferred to the deposition chamber 417 through the transfer chamber 403 which had been evacuated with a vacuum pump (not shown) and the transfer chamber 402. The substrate 490 was placed so as to contact with the heater 410 at its rear surface, and heated. The inside of the deposition chamber 419 was evacuated with the vacuum pump (not shown) down to a pressure of about $1\times10^{-5}$ Torr.

To deposit the RF n-layer 203 of μc-Si, $H_2$ gas was introduced into the deposition chamber 417 via the gas inlet 429. The $H_2$ gas was supplied by opening the valves 441, 431, 430 and its flow rate was adjusted to 200 sccm by means of the mass flow controller 436. Furthermore, the pressure inside the deposition chamber 417 was adjusted to 1.1 Torr by means of the conductance valve (not shown). The substrate 490 was heated by the substrate heater 410 up to 250° C. When the temperature of the substrate had become stable, the valves 443, 433, 444, and 434 were opened to introduce $SiH_4$ gas and $PH_3/H_2$ gas into the deposition chamber 417 via the gas inlet 429. The flow rates of $SiH_4$, $H_2$, and $PH_3/H_2$ were adjusted to 2 sccm, 70 sccm, and 250 sccm, respectively, by the mass flow controllers 438, 436, and 439. The pressure inside the deposition chamber 417 was adjusted to 1.1 Torr. An RF power of the RF power supply 422 was set to 0.04 W/cm$^3$ and applied to the plasma excitation cup 420 to activate a glow discharge. The deposition of the RF n-layer on the RF p-layer was started. When the thickness of the deposited RF n-layer 203 reached 10 nm, the RF power was shut off to stop the glow discharge. The deposition of the RF n-layer 203 was finished. The supply of $SiH_4$ and $PH_3/H_2$ into the deposition chamber 417 was stopped, whereas $H_2$ was fed further for two minutes into the deposition chamber 417. Then, $H_2$ was also shut off, and the inside of the deposition chamber 417 as well as the inside of the gas lines was evacuated down to $1\times10^{-5}$ Torr.

An n/i buffer layer 251 of a-Si was then deposited by means of RFPCVD as described below.

The gate valve 407 was opened, and the substrate 490 was transferred to the i-layer deposition chamber 418 via the transfer chamber 403, both deposition chamber 418 and transfer chamber 403 having been evacuated with a vacuum pump (not shown). The substrate 490 was placed so as to contact with the heater 411 at its rear surface, and heated. The inside of the i-layer deposition chamber 418 was evacuated with the vacuum pump (not shown) down to a pressure of about $1\times10^{-5}$ Torr.

To deposit the n/i buffer layer 251, the substrate 490 was heated by the substrate heater 411 up to 250° C. When the substrate had been heated enough, the valves 464, 454, 450,

463, 453, 465, and 455 were opened gradually to supply $Si_2H_6$, $H_2$, and $CH_4$ to the i-layer deposition chamber 418 via the gas inlet 449. The flow rates of $Si_2H_6$, $H_2$, and $CH_4$ were adjusted to 0.4, 80, and 0.2 sccm, respectively, by the mass flow controllers 459, 458, and 460. The pressure inside the i-layer deposition chamber 418 was set to 1.3 Torr by adjusting the opening ratio of a conductance valve (not shown). Then, an RF power of 0.06 W/cm$^3$ was applied to the bias bar 428 by the RF power supply 424 to excite a glow discharge. The shutter 427 was then opened, and depositing the n/i buffer layer 251 on the RF n-layer 203 was started. When the thickness of the deposited n/i buffer layer 251 reached 10 nm, the RF glow discharge was stopped, and the RF power supply 424 was shut off. The deposition of the n/i buffer layer 251 was finished. The valves 464, 454, 465, and 455 were closed to stop the supply of $Si_2H_6$ and $CH_4$ to the i-layer deposition chamber 418, whereas $H_2$ was fed further for two minutes into the i-layer deposition chamber 418. Then, the valves 453 and 450 were closed, and the inside of the i-layer deposition chamber 418 as well as the inside of the gas lines was evacuated down to $1\times10^{-5}$ Torr.

An RF i-layer 214 of a-Si was then deposited by means of RFPCVD as described below.

To deposit the RF i-layer, the substrate 490 was heated by the substrate heater 411 up to 200° C. When the substrate had been heated enough, the valves 464, 454, 450, 463, and 453 were opened gradually to supply $Si_2H_6$ and $H_2$ to the i-layer deposition chamber 418 via the gas inlet 449. The flow rates of $Si_2H_6$ and $H_2$ were adjusted to 3 sccm and 60 sccm, respectively, by the mass flow controllers 459 and 458. The pressure inside the i-layer deposition chamber 418 was set to 0.5 Torr by adjusting the opening ratio of a conductance valve (not shown). Then, an RF power of 0.07 W/cm$^3$ was applied to the bias bar 428 by the RF power supply 424 to excite a glow discharge. The shutter 427 was then opened, and depositing the RF i-layer 214 on the n/i buffer layer was started. When the thickness of the deposited RF i-layer reached 110 nm, the RF glow discharge was stopped, and the RF power supply 424 was shut off. The deposition of the RF i-layer 214 was finished. The valves 464 and 454 were closed to stop the supply of $Si_2H_6$ to the i-layer deposition chamber 418, whereas $H_2$ was fed further for two minutes into the i-layer deposition chamber 418. Then, the valves 453 and 450 were closed, and the inside of the i-layer deposition chamber 418 as well as the inside of the gas lines was evacuated down to $1\times10^{-5}$ Torr.

The substrate was then subjected to plasma treatment with hydrogen gas containing a small amount of silane-based gas under the conditions shown in Table E2(2), according to the present invention.

In this plasma treatment with hydrogen gas containing the small amount of silane-based gas according to the present invention, $SiH_4$, serving as silicon compound gas and $H_2$ were introduced into the deposition chamber 418 via the gas inlet 449. The $H_2$ gas was supplied by opening the valves 463, 453, 450 and its flow rate was adjusted to 1100 sccm by means of the mass flow controller 458. The silicon compound gas was supplied by opening the valves 461 and 451 and its flow rate was controlled by the mass flow controller 456 such that the flow rate of the $SiH_4$ gas was maintained at 0.003% of the total gas flow rate of $H_2$. Furthermore, the pressure inside the deposition chamber 418 was adjusted to 0.7 Torr by means of a conductance valve (not shown). The substrate 490 was heated by the substrate heater 411 up to 200° C. When the temperature of the substrate had become stable, an RF power of 0.02 W/cm$^3$ was applied to the bias bar 428 by the RF power supply 424 so that a glow discharge occurs in the deposition chamber 418. Under the above-described conditions, the substrate was exposed for 3 minutes to the hydrogen gas plasma containing the small amount of silane-based gas according to the present invention. The RF power was then shut off to stop the glow discharge. The supply of the $SiH_4$ gas into the deposition chamber 418 was stopped, whereas the $H_2$ gas was fed further for 3 minutes into the deposition chamber 418. Then, the $H_2$ gas was also shut off, and the inside of the deposition chamber 418 as well as the inside of the gas lines was evacuated down to $1\times10^{-5}$ Torr.

A p/i buffer layer 261 of a-SiC was then deposited by means of RFPCVD as described below.

To deposit the p/i buffer layer 261, the substrate 490 was heated by the substrate heater 411 up to 200° C. When the substrate had been heated enough, the valves 464, 454, 450, 463, 453, 465, and 455 were opened gradually to supply $Si_2H_6$, $H_2$, and $CH_4$ to the i-layer deposition chamber 418 via the gas inlet 449. The flow rates of $Si_2H_6$, $H_2$, and $CH_4$ were adjusted to 0.4, 60, and 0.3 sccm, respectively, by the mass flow controllers 459, 458, and 460. The pressure inside the i-layer deposition chamber 418 was set to 1.2 Torr by adjusting the opening ratio of a conductance valve (not shown). Then, an RF power of 0.06 W/cm$^3$ was applied to the bias bar 428 by the RF power supply 424 to excite a glow discharge. The shutter 427 was then opened, and depositing the p/i buffer layer 261 on the RF i-layer 214 was started. When the thickness of the deposited p/i buffer layer 261 reached 15 nm, the RF glow discharge was stopped, and the RF power supply 424 was shut off. The deposition of the p/i buffer layer 261 was finished. The valves 464, 454, 465, and 455 were closed to stop the supply of $Si_2H_6$ and $CH_4$ to the i-layer deposition chamber 418, whereas $H_2$ was fed further for two minutes into the i-layer deposition chamber 418. Then, the valves 453 and 450 were closed, and the inside of the i-layer deposition chamber 418 as well as the inside of the gas lines was evacuated down to $1\times10^{-5}$ Torr.

To deposit the RF p-layer 205 of a-SiC, the gate valve 408 was opened, and the substrate 490 was transferred to the p-layer deposition chamber 419 via the transfer chamber 404, both deposition chamber 419 and transfer chamber 404 having been evacuated with a vacuum pump (not shown). The substrate 490 was placed so as to contact with the heater 412 at its rear surface, and heated. The inside of the p-layer deposition chamber 419 was evacuated with the vacuum pump (not shown) down to a pressure of about $1\times10^{-5}$ Torr.

The substrate 490 was heated by the substrate heater 412 up to 170° C. When the temperature of the substrate had become stable, the valves 481, 471, 470, 482, 472, 483, 473, 484, and 474 were opened to supply $H_2$ gas, $SiH_4/H_2$ gas, $B_2H_6/H_2$ gas, and $CH_4$ gas to the deposition chamber 419 via the gas inlet 469. The flow rates of the $H_2$, $SiH_4/H_2$, $B_2H_6/H_2$, and $CH_4$, were adjusted to 60 sccm, 2 sccm, 10 sccm, and 0.3 sccm, respectively, by the mass flow controllers 476, 477, 478, and 479. The pressure inside the chamber 419 was set to 1.7 Torr by adjusting the opening ratio of a conductance valve (not shown). An RF power of 0.07 W/cm$^3$ was applied by the RF power supply 423 to the plasma excitation cup 421 to activate a glow discharge, and deposition of the RF p-layer 205 on the p/i buffer layer 261 was started. When the thickness of the deposited RF p-layer 205 reached 10 nm, the RF power was shut off to stop the glow discharge. The deposition of the RF p-layer 205 was finished. The valves 472, 482, 473, 483, 474, and 484 were closed to stop the supply of $SiH_4/H_2$, $B_2H_6/H_2$, and $CH_4$ to the p-layer deposition chamber 419, whereas $H_2$ was fed further for two minutes into the p-layer deposition chamber 419. Then, the valves 471, 481, and 470 were closed, and the inside of the p-layer deposition chamber 419 as well as the inside of the gas lines was evacuated down to $1\times10^{-5}$ Torr.

The gate valve 409 was then opened, and the substrate 490 was transferred to the unload chamber 405 which had already been evacuated with a vacuum pump (not shown). Then, a leak valve (not shown) was opened so that the inside of the unload chamber 405 was exposed to the ambient atmosphere.

ITO was then evaporated onto the RF p-layer 205 so as to form a transparent conductive layer 112 having a thickness of 70 nm.

A mask having a comb-shaped window was placed on the transparent conductive layer 112, and metal evaporation was performed via the mask to form a comb-shaped collection electrode 113 having a multi-layer structure consisting of Cr (40 nm), Ag (1000 nm), and Cr (40 nm).

In this way, the complete solar cell according to the invention was obtained. Hereinafter, the solar cell of this type will be referred to as SC-EMB-E2. Tables E2(1) through E2(3) indicate the conditions used here in the invention, regarding the plasma treatment with hydrogen containing a small amount of silane-based gas as well as the process conditions for the RF n-layer, n/i buffer layer, MW i-layer, p/i buffer layer, RF p-layer, RF n-layer, n/i buffer layer, RF i-layer, p/i buffer layer, and RF p-layer.

COMPARATIVE EXAMPLE E2

For the sake of comparison, a solar cell (SC-CMP-E2) was also fabricated in the same manner as in the above-described example E2 except that the plasma treatment with hydrogen gas containing a small amount of silane-based gas according to the invention was not performed.

Seven samples of solar cells were prepared for each type (SC-EMB-E2 and SC-CMP-E2) for the purpose of evaluation regarding the initial photoelectric conversion efficiency (the ratio of the electric output power to the optical input power), vibration durability and optical durability under a biased condition at high temperature with high humidity, and vibration durability and optical durability under a non-biased condition.

The measurement of the initial photoelectric conversion efficiency was performed by measuring the V-I characteristics of the samples under the illumination condition of AM 1.5 (100 mW/cm$^2$). The measurement revealed that the SC-EMB-E2 samples had a smaller variation in the initial photoelectric conversion efficiencies than the SC-CMP-E2 samples and had a larger fill factor (F.F.) as shown below:

| | [Fill factor (F.F.)] | [Variation] |
|---|---|---|
| SC-EMB-E2 | 1.12<br>(relative to that of SC-CMP-E2) | 0.84 |

The vibration durability test under the non-biased condition was performed as follows: After the measurement of the initial photoelectric conversion efficiency, some samples were placed in a dark place kept at 28° C. with a relative humidity of 52%. Vibration having an amplitude of 0.1 mm and a frequency of 60 Hz was applied to the samples for 500 hr. Then, the photoelectric conversion efficiencies of the samples were measured under the illumination condition of AM 1.5 (100 mW/cm$^2$) and the reduction relative to the initial value (the ratio of the photoelectric conversion efficiency after the vibration test to the initial value) was evaluated for each sample. The SC-CMP-E2 samples showed a greater reduction in the photoelectric conversion efficiency compared with the SC-EMB-E2 samples as shown below.

The optical durability test under the non-biased condition was performed as follows: After the measurement of the initial photoelectric conversion efficiency, some samples were placed in a dark place kept at 28° C. with a relative humidity of 52%. Light having a power of AM 1.5 (100 $mW/cm^2$) was applied to the samples for 500 hours, and then the photoelectric conversion efficiencies of the samples were measured under the illumination condition of AM 1.5 (100 $mW/cm^2$). The reduction relative to the initial value (the ratio of the photoelectric conversion efficiency after the optical durability test to the initial value) was evaluated for each sample. The SC-CMP-E2 samples showed a greater reduction in the photoelectric conversion efficiency compared with the SC-EMB-E2 samples as shown below.

| | [Vibration durability] | [Optical durability] |
|---|---|---|
| SC-CMP-E2 | 0.84 (relative to those of SC-EMB-E2) | 0.83 |

The evaluation of the vibration durability and optical durability under the biased condition at high temperature with high humidity was performed as follows: After the measurement of the initial photoelectric conversion efficiency, some samples were placed in a dark place kept at 81° C. with a relative humidity of 90%, and a forward bias voltage of 0.7 V was applied to the samples. The vibration described above was applied to some of the samples and light having a power of AM 1.5 was applied to the other samples under the same conditions as those in the non-biased vibration test. The photoelectric conversion efficiencies of the samples were measured under the illumination condition of AM 1.5 (100 $mW/cm^2$). The SC-CMP-E2 samples also showed a greater reduction in the photoelectric conversion efficiency compared with the SC-EMB-E2 samples after the vibration and optical durability tests as shown below.

| | Under the biased condition: | |
|---|---|---|
| | [Vibration durability] | [Optical durability] |
| SC-CMP-E2 | 0.82 (relative to that of SC-EMB-E2) | 0.81 |

The surfaces of the samples were observed using an optical microscope to evaluate film separation. No film separation was observed in the SC-EMB-E2 samples, whereas slight film separation was observed in the SC-CMP-E2 samples.

From the above results, it can be concluded that the solar cells (SC-EMB-E2) according to the present invention are better than the conventional solar cells (SC-CMP-E2) in optical durability, adhesion, overall durability, fill factor (F.F.) and uniformity of the photoelectric conversion efficiency.

EXAMPLE E3 ACCORDING TO THE INVENTION

A triple solar cell having a structure illustrated in FIG. 6 was made using the deposition equipment shown in FIG. 7.

In the same way as for example E1, a substrate 490 on which the optical reflection layer 101 and the reflection enhancing layer 102 had been formed in the same was as for example E1 was placed on the substrate transfer rail 413 in the load chamber 401, and the load chamber 401 was evacuated with a vacuum pump (not shown) down to a pressure of about $1\times10^{-5}$ Torr. Then, the gate valve 406 was opened, and the substrate 490 was transferred to the deposition chamber 417 via the transfer chamber 402, both deposition chamber 417 and transfer chamber 402 having been evacuated with a vacuum pump (not shown). The substrate 490 was placed so as to contact with the heater 410 at its rear surface, and heated. The inside of the deposition chamber 417 was evacuated with the vacuum pump (not shown) down to a pressure of about $1\times10^{-5}$ Torr.

In this way, semiconductor film deposition was prepared, and an RF n-layer 103 of μc-Si was then deposited in the same way as for example E2.

The gate valve 406 was opened, and the substrate 490 was transferred to the deposition chamber 418 via the transfer chamber 403, both deposition chamber 418 and transfer chamber 403 having been evacuated with a vacuum pump (not shown). The substrate 490 was placed so as to contact with the heater 411 at its rear surface, and heated. The inside of the deposition chamber 418 was evacuated with the vacuum pump (not shown) down to a pressure of about $1\times10^{-5}$ Torr.

An n/i buffer layer 151 of a-Si and an MW i-layer 114 of a-SiGe were then deposited by means of RFPCVD and MWPCVD in the same way as for example E2.

The substrate was then subjected to plasma treatment with hydrogen gas containing a small amount of silane-based gas under the conditions shown in Table E3(1), according to the present invention.

In this plasma treatment with hydrogen gas containing the small amount of silane-based gas according to the present invention, $SiCl_2H_2$/He (diluted to 1000 ppm) serving as silicon compound gas and $H_2$ were introduced into the deposition chamber 418 via the gas inlet 449. The $H_2$ gas was supplied by opening the valves 463, 453, 450 and its flow rate was adjusted to 700 sccm by means of the mass flow controller 458. The silicon compound gas was supplied by opening the valve and its flow rate was controlled by the mass flow controller such that the flow rate of the $SiCl_2H_2$ gas was maintained at 0.04% of the total gas flow rate of $H_2$. Furthermore, the pressure inside the deposition chamber 418 was adjusted to 0.008 Torr by means of a conductance valve (not shown). The substrate 490 was heated by the substrate heater 411 up to 340° C. When the temperature of the substrate had become stable, a MW power of 0.12 $W/cm^3$ was applied to the i-layer deposition chamber 418 through the wave guide 426 and the microwave entrance window 425 by the MW power supply (not shown) so that a glow discharge occurs in the deposition chamber 418. The shutter 427 was opened, and the substrate was exposed for four minutes to the hydrogen gas plasma containing the small amount of silane-based gas according to the present invention. The MW power was then shut off to stop the glow discharge. The supply of the $SiCl_2H_2$/He (diluted to 1000 ppm) gas into the deposition chamber 418 was stopped, whereas the $H_2$ gas was fed further for four minutes into the deposition chamber 418. Then, the $H_2$ gas was also shut off, and the inside of the deposition chamber 418 as well as the inside of the gas lines was evacuated down to $1\times10^{-5}$ Torr.

Next, in the same way as for example E2, a p/i buffer layer 161 of a-Si, an RF p-layer 105 of a-SiC, an RF n-layer 203 of μc-Si, an n/i buffer layer 251 of a-Si, and an MW i-layer 214 of a-SiGe were deposited by means of RFPCVD and MWPCVD in that order.

The substrate was then subjected to plasma treatment with hydrogen gas containing a small amount of silane-based gas under the conditions shown in Table E3(2), according to the present invention.

In this plasma treatment with hydrogen gas containing the small amount of silane-based gas according to the present invention, $SiH_4/H_2$ (diluted to 1000 ppm) serving as silicon compound gas and $H_2$ were introduced into the deposition chamber 418 via the gas inlet 449. The $H_2$ gas was supplied by opening the valves 463, 453, 450 and its flow rate was adjusted to 900 sccm by means of the mass flow controller 458. The silicon compound gas was supplied by opening the valve and its flow rate was controlled by the mass flow controller such that the flow rate of the $SiH_4$ gas was maintained at 0.05% of the total gas flow rate of $H_2$. Furthermore, the pressure inside the deposition chamber 418 was adjusted to 0.8 Torr by means of a conductance valve (not shown). The substrate 490 was heated by the substrate heater 411 up to 300° C. When the temperature of the substrate had become stable, a RF power of 0.03 W/cm$^3$ was applied to the bias bar 428 by the RF power supply 424 so that a glow discharge occurs in the deposition chamber 418. Under the above-described conditions, the substrate was exposed for three minutes to the hydrogen gas plasma containing the small amount of silane-based gas according to the present invention. The RF power was then shut off to stop the glow discharge. The supply of the $SiH_4/H_2$ (diluted to 1000 ppm) gas into the deposition chamber 418 was stopped, whereas the $H_2$ gas was fed further for three minutes into the deposition chamber 418. Then, the $H_2$ gas was also shut off, and the inside of the deposition chamber 418 as well as the inside of the gas lines was evacuated down to $1\times10^{-5}$ Torr.

Next, in the same way as for example E2, a p/i buffer layer 261 of a-Si, an RF p-layer 205 of a-SiC, an RF n-layer 303 of μc-Si, an n/i buffer layer 351 of a-SiC, and an RF i-layer 314 of a-Si were deposited in that order.

The substrate was then subjected to plasma treatment with hydrogen gas containing a small amount of silane-based gas under the conditions shown in Table E3(3), according to the present invention.

In this plasma treatment with hydrogen gas containing the small amount of silane-based gas according to the present invention, $SiH_4/H_2$ (diluted to 1000 ppm) serving as silicon compound gas and $H_2$ were introduced into the deposition chamber 418 via the gas inlet 449. The $H_2$ gas was supplied by opening the valves 463, 453, 450 and its flow rate was adjusted to 800 sccm by means of the mass flow controller 458. The silicon compound gas was supplied by opening the valve and its flow rate was controlled by the mass flow controller such that the flow rate of the $SiH_4$ gas was maintained at 0.04% of the total gas flow rate of $H_2$. Furthermore, the pressure inside the deposition chamber 418 was adjusted to 0.7 Torr by means of a conductance valve (not shown). The substrate 490 was heated by the substrate heater 411 up to 200° C. When the temperature of the substrate had become stable, a RF power of 0.03 W/cm$^3$ was applied to the bias bar 428 by the RF power supply 424 so that a glow discharge occurs in the deposition chamber 418. Under the above-described conditions, the substrate was exposed for three minutes to the hydrogen gas plasma containing the small amount of silane-based gas according to the present invention. The RF power was then shut off to stop the glow discharge. The supply of the $SiH_4/H_2$ (diluted to 1000 ppm) gas into the deposition chamber 418 was stopped, whereas the $H_2$ gas was fed further for three minutes into the deposition chamber 418. Then, the $H_2$ gas was also shut off, and the inside of the deposition chamber 418 as well as the inside of the gas lines was evacuated down to $1\times10^{-5}$ Torr.

Next, in the same way as for example E2, a p/i buffer layer 361 of a-SiC, and an RF p-layer 305 of a-SiC were deposited by means of RFPCVD in that order.

ITO was then evaporated onto the RF p-layer 305 so as to form a transparent conductive layer 112 having a thickness of 70 nm.

A mask having a comb-shaped window was placed on the transparent conductive layer 112, and metal evaporation was performed via the mask to form a comb-shaped collection electrode 113 having a multi-layer structure consisting of Cr (40 nm), Ag (1000 nm), and Cr (40 nm).

In this way, the complete solar cell according to the invention was obtained. Hereinafter, the solar cell of this type will be referred to as SC-EMB-E3. Tables E3(1) through E3(4) indicate the conditions used here in the invention, regarding the plasma treatment with hydrogen containing a small amount of silane-based gas as well as the process conditions for the RF n-layer, n/i buffer layer, MW i-layer, p/i buffer layer, RF p-layer, RF n-layer, n/i buffer layer, MW i-layer, p/i buffer layer, RF p-layer, RF n-layer, n/i buffer layer, RF i-layer, p/i buffer layer, and RF p-layer.

COMPARATIVE EXAMPLE E3

For the sake of comparison, a solar cell (SC-CMP-E3) was also fabricated in the same manner as in the above-described example E3 except that the plasma treatment with hydrogen gas containing a small amount of silane-based gas according to the invention was not performed.

Six samples of solar cells were prepared for each type (SC-EMB-E3 and SC-CMP-E3) for the purpose of evaluation regarding the initial photoelectric conversion efficiency (the ratio of the electric output power to the optical input power), vibration durability and optical durability under a biased condition at high temperature with high humidity, and vibration durability and optical durability under a non-biased condition.

The measurement of the initial photoelectric conversion efficiency was performed by measuring the V-I characteristics of the samples under the illumination condition of AM 1.5 (100 mW/cm$^2$). The measurement revealed that the SC-EMB-E3 samples had a smaller variation in the initial photoelectric conversion efficiencies than the SC-CMP-E3 samples and had a larger fill factor (F.F.) as shown below:

| | [Fill factor (F.F.)] | [Variation] |
|---|---|---|
| SC-EMB-E3 | 1.14<br>(relative to that of SC-CMP-E3) | 0.83 |

The vibration durability test under the non-biased condition was performed as follows: After the measurement of the initial photoelectric conversion efficiency, some samples were placed in a dark place kept at 25° C. with a relative humidity of 53%. Vibration having an amplitude of 0.1 mm and a frequency of 60 Hz was applied to the samples for 500 hr. Then, the photoelectric conversion efficiencies of the samples were measured under the illumination condition of AM 1.5 (100 mW/cm$^2$) and the reduction relative to the initial value (the ratio of the photoelectric conversion efficiency after the vibration test to the initial value) was evaluated for each sample. The SC-CMP-E3 samples showed a greater reduction in the photoelectric conversion efficiency compared with the SC-EMB-E3 samples as shown below.

The optical durability test under the non-biased condition was performed as follows: After the measurement of the initial photoelectric conversion efficiency, some samples were placed in a dark place kept at 25° C. with a relative humidity of 53%. Light having a power of AM 1.5 (100 mW/cm$^2$) was applied to the samples for 500 hours, and then the photoelectric conversion efficiencies of the samples were measured under the illumination condition of AM 1.5 (100 mW/cm$^2$). The reduction relative to the initial value (the ratio of the photoelectric conversion efficiency after the optical durability test to the initial value) was evaluated for each sample. The SC-CMP-E3 samples showed a greater reduction in the photoelectric conversion efficiency compared with the SC-EMB-E3 samples as shown below.

| | [Vibration durability] | [Optical durability] |
|---|---|---|
| SC-CMP-E3 | 0.84 | 0.83 |
| | (relative to those of SC-EMB-E3) | |

The evaluation of the vibration durability and optical durability under the biased condition at high temperature with high humidity was performed as follows: After the measurement of the initial photoelectric conversion efficiency, some samples were placed in a dark place kept at 82° C. with a relative humidity of 90%, and a forward bias voltage of 0.7 V was applied to the samples. The vibration described above was applied to some of the samples and light having a power of AM 1.5 was applied to the other samples under the same conditions as those in the non-biased vibration test. The photoelectric conversion efficiencies of the samples were measured under the illumination condition of AM 1.5 (100 mW/cm$^2$). The SC-CMP-E3 samples also showed a greater reduction in the photoelectric conversion efficiency compared with the SC-EMB-E3 samples after the vibration and optical durability tests as shown below.

| | Under the biased condition: | |
|---|---|---|
| | [Vibration durability] | [Optical durability] |
| SC-CMP-E3 | 0.84 | 0.82 |
| | (relative to that of SC-EMB-E3) | |

The surfaces of the samples were observed using an optical microscope to evaluate film separation. No film separation was observed in the SC-EMB-E3 samples, whereas slight film separation was observed in the SC-CMP-E3 samples.

From the above results, it can be concluded that the solar cells (SC-EMB-E3) according to the present invention are better than the conventional solar cells (SC-CMP-E3) in optical durability, adhesion, overall durability, fill factor (F.F.) and uniformity of the photoelectric conversion efficiency.

EXAMPLE E4 ACCORDING TO THE INVENTION

A solar cell having a triple structure illustrated in FIG. 6 was made using the deposition equipment shown in FIG. 7 in the same way as for example E3. Plasma treatment with hydrogen gas containing a small amount of silane-based gas was performed three times under the conditions shown in Table E4(1). Other fabrication conditions employed are shown in Table E4(2).

The fabricated samples are evaluated in a similar manner to that for the example E3, and the results are shown in Table E4(3).

As can be seen from Table E4(3), it is preferable that the flow rate of hydrogen gas in the plasma treatment with hydrogen containing a small amount of silane-based gas ranges from 1 to 2000 sccm to obtain an excellent fill factor (F.F.) and uniformity of the photoelectric conversion efficiency, optical durability, adhesion, and overall durability.

EXAMPLE E5 ACCORDING TO THE INVENTION

A solar cell having a triple structure illustrated in FIG. 6 was made using the deposition equipment shown in FIG. 7 in the same way as for example E3. Plasma treatment with hydrogen gas containing a small amount of silane-based gas was performed three times under the conditions shown in Table E5(1). Other fabrication conditions employed are shown in Table E5(2).

The fabricated samples are evaluated in a similar manner to that for the example E3, and the results are shown in Table E5(3).

In this example, VHF power was used to excite the plasma for the plasma treatment whereas RF power was used in the above example E4. As can be seen from Table E5(3), it is also preferable that the flow rate of hydrogen gas in the plasma treatment containing the small amount of silane-based gas ranges from 1 to 2000 sccm to obtain a good fill factor (F.F.) and uniformity of the photoelectric conversion efficiency, optical durability, adhesion, and overall durability.

EXAMPLE E6 ACCORDING TO THE INVENTION

A solar cell having a triple structure illustrated in FIG. 6 was made using the deposition equipment shown in FIG. 7 in the same way as for example E3. Plasma treatment with hydrogen gas containing a small amount of silane-based gas was performed three times under the conditions shown in Table E6(1). Other fabrication conditions employed are shown in Table E6(2).

The fabricated samples are evaluated in a similar manner to that for the example E3, and the results are shown in Table E6(3).

As can be seen from Table E6(3), it is preferable that the content of the silicon compound gas added to the hydrogen gas in the plasma treatment ranges from 0.001% to 0.1%. to obtain a good fill factor (F.F.) and uniformity of the photoelectric conversion efficiency, optical durability, adhesion, and overall durability.

EXAMPLE E7 ACCORDING TO THE INVENTION

A solar cell having a triple structure illustrated in FIG. 6 was made using the deposition equipment shown in FIG. 7 in the same way as for example E3. Plasma treatment with hydrogen gas containing a small amount of silane-based gas was performed three times under the conditions shown in Table E7(1). Other fabrication conditions employed are shown in Table E7(2).

The fabricated samples are evaluated in a similar manner to that for the example E3, and the results are shown in Table E7(3).

In this example, VHF power was used to excite the plasma for the plasma treatment, whereas RF power was used in the above example E6. As can be seen from Table E7(3), it is also preferable that the content of the silicon compound gas added to the hydrogen gas in the plasma treatment ranges from 0.001% to 0.1%. to obtain a good fill factor (F.F.) and uniformity of the photoelectric conversion efficiency, optical durability, adhesion, and overall durability.

EXAMPLE E8 ACCORDING TO THE INVENTION

A solar cell having a triple structure illustrated in FIG. 6 was made using the deposition equipment shown in FIG. 7 in the same way as for example E3. Plasma treatment with hydrogen gas containing a small amount of silane-based gas was performed three times under the conditions shown in Table E8(1). Other fabrication conditions employed are shown in Table E8(2).

The fabricated samples are evaluated in a similar manner to that for the example E3, and the results are shown in Table E8(3).

In this example, MW power was used to excite the plasma for the plasma treatment, whereas RF power was used in the above example E6. As can be seen from Table E8(3), it is also preferable that the content of the silicon compound gas added to the hydrogen gas in the plasma treatment ranges from 0.001% to 0.1%. to obtain a good fill factor (F.F.) and uniformity of the photoelectric conversion efficiency, optical durability, adhesion, and overall durability.

EXAMPLE E9 ACCORDING TO THE INVENTION

A solar cell having a triple structure illustrated in FIG. 6 was made using the deposition equipment shown in FIG. 7 in the same way as for example E3. Plasma treatment with hydrogen gas containing a small amount of silane-based gas was performed three times under the conditions shown in Table E9(1). Other fabrication conditions employed are shown in Table E9(2).

The fabricated samples are evaluated in a similar manner to that for the example E3, and the results are shown in Table E9(3).

As can be seen from Table E9(3), when an RF power is applied, it is preferable that the pressure in the plasma treatment with the hydrogen gas containing a small amount of silane-based gas ranges from 0.05 Torr to 10 Torr to obtain a good fill factor (F.F.) and uniformity of the photoelectric conversion efficiency, optical durability, adhesion, and overall durability.

EXAMPLE E10 ACCORDING TO THE INVENTION

A solar cell having a triple structure illustrated in FIG. 6 was made using the deposition equipment shown in FIG. 7 in the same way as for example E3. Plasma treatment with hydrogen gas containing a small amount of silane-based gas was performed three times under the conditions shown in Table E10(1). Other fabrication conditions employed are shown in Table E10(2).

The fabricated samples are evaluated in a similar manner to that for the example E3, and the results are shown in Table E10(3).

As can be seen from Table E10(3), when a VHF power is applied, it is preferable that the pressure in the plasma treatment with the hydrogen gas containing a small amount of silane-based gas ranges from 0.0001 Torr to 1 Torr to obtain a good fill factor (F.F.) and uniformity of the photoelectric conversion efficiency, optical durability, adhesion, and overall durability.

EXAMPLE E11 ACCORDING TO THE INVENTION

A solar cell having a triple structure illustrated in FIG. 6 was made using the deposition equipment shown in FIG. 7 in the same way as for example E3. Plasma treatment with hydrogen gas containing a small amount of silane-based gas was performed three times under the conditions shown in Table E11(1). Other fabrication conditions employed are shown in Table E11(2).

The fabricated samples are evaluated in a similar manner to that for the example E3, and the results are shown in Table E11(3).

As can be seen from Table E11(3), when an MW power is applied, it is preferable that the pressure in the plasma treatment with the hydrogen gas containing a small amount of silane-based gas ranges from 0.0001 Torr to 0.01 Torr to obtain a good fill factor (F.F.) and uniformity of the photoelectric conversion efficiency, optical durability, adhesion, and overall durability.

EXAMPLE E12 ACCORDING TO THE INVENTION

A solar cell having a triple structure illustrated in FIG. 6 was made using the deposition equipment shown in FIG. 7 in the same way as for example E3. Plasma treatment with hydrogen gas containing a small amount of silane-based gas was performed three times under the conditions shown in Table E12(1). Other fabrication conditions employed are shown in Table E12(2).

The fabricated samples are evaluated in a similar manner to that for the example E3, and the results are shown in Table E12(3).

As can be seen from Table E12(3), when RF power is used to excite the plasma, it is preferable that the applied power density (electric power) in the plasma treatment with the hydrogen gas containing a small amount of silane-based gas ranges from 0.01 W/cm$^3$ to 1.0 W/cm$^3$ to obtain a good fill factor (F.F.) and uniformity of the photoelectric conversion efficiency, optical durability, adhesion, and overall durability.

EXAMPLE E13 ACCORDING TO THE INVENTION

A solar cell having a triple structure illustrated in FIG. 6 was made using the deposition equipment shown in FIG. 7 in the same way as for example E3. Plasma treatment with hydrogen gas containing a small amount of silane-based gas was performed three times under the conditions shown in Table E13(1). Other fabrication conditions employed are shown in Table E13(2).

The fabricated samples are evaluated in a similar manner to that for the example E3, and the results are shown in Table E13(3).

As can be seen from Table E13(3), when a VHF power is used to excite the plasma, it is preferable that the applied power density (electric power) in the plasma treatment with the hydrogen gas containing a small amount of silane-based gas ranges from 0.01 W/cm$^3$ to 1.0 W/cm$^3$ to obtain a good fill factor (F.F.) and uniformity of the photoelectric conversion efficiency, optical durability, adhesion, and overall durability.

EXAMPLE E14 ACCORDING TO THE INVENTION

A solar cell having a triple structure illustrated in FIG. 6 was made using the deposition equipment shown in FIG. 7 in the same way as for example E3. Plasma treatment with hydrogen gas containing a small amount of silane-based gas was performed three times under the conditions shown in Table E14(1). Other fabrication conditions employed are shown in Table E14(2).

The fabricated samples are evaluated in a similar manner to that for the example E3, and the results are shown in Table E14(3).

As can be seen from Table E14(3), when a MW power is used to excite the plasma, it is preferable that the applied power density (electric power) in the plasma treatment with the hydrogen gas containing a small amount of silane-based gas ranges from 0.1 W/cm$^3$ to 10 W/cm$^3$ to obtain a good fill factor (F.F.) and uniformity of the photoelectric conversion efficiency, optical durability, adhesion, and overall durability.

EXAMPLE E15 ACCORDING TO THE INVENTION

A solar cell having a triple structure illustrated in FIG. 6 was made using the deposition equipment shown in FIG. 7 in the same way as for example E3. Plasma treatment with hydrogen gas containing a small amount of silane-based gas was performed three times under the conditions shown in Table E15(1). Other fabrication conditions employed are shown in Table E15(2).

The fabricated samples are evaluated in a similar manner to that for the example E3, and the results are shown in Table E15(3).

As can be seen from Table E15(3), when an RF power is used to excite the plasma, it is preferable that the substrate temperature in the plasma treatment with the hydrogen gas containing a small amount of silane-based gas ranges from 100° C. to 400° C. to obtain a good fill factor (F.F.) and uniformity of the photoelectric conversion efficiency, optical durability, adhesion, and overall durability.

EXAMPLE E16 ACCORDING TO THE INVENTION

A solar cell having a triple structure illustrated in FIG. 6 was made using the deposition equipment shown in FIG. 7 in the same way as for example E3. Plasma treatment with hydrogen gas containing a small amount of silane-based gas was performed three times under the conditions shown in Table E16(1). Other fabrication conditions employed are shown in Table E16(2).

The fabricated samples are evaluated in a similar manner to that for the example E3, and the results are shown in Table E16(3).

As can be seen from Table E16(3), when a VHF power is used to excite the plasma, it is preferable that the substrate temperature in the plasma treatment with the hydrogen gas containing a small amount of silane-based gas ranges from 50° C. to 300° C. to obtain a good fill factor (F.F.) and uniformity of the photoelectric conversion efficiency, optical durability, adhesion, and overall durability.

EXAMPLE E17 ACCORDING TO THE INVENTION

A solar cell having a triple structure illustrated in FIG. 6 was made using the deposition equipment shown in FIG. 7 in the same way as for example E3. Plasma treatment with hydrogen gas containing a small amount of silane-based gas was performed three times under the conditions shown in Table E17(1). Other fabrication conditions employed are shown in Table E17(2).

The fabricated samples are evaluated in a similar manner to that for the example E3, and the results are shown in Table E17(3).

As can be seen from Table E17(3), when an MW power is used to excite the plasma, it is preferable that the substrate temperature in the plasma treatment with the hydrogen gas containing a small amount of silane-based gas ranges from 50° C. to 300° C. to obtain a good fill factor (F.F.) and uniformity of the photoelectric conversion efficiency, optical durability, adhesion, and overall durability.

EXAMPLE E18 ACCORDING TO THE INVENTION

A solar cell having a triple structure illustrated in FIG. 3 was made using the deposition equipment shown in FIG. 7.

A substrate 490 on which the optical reflection layer 101 and the reflection enhancing layer 102 had been formed in the same was as for example E1 was placed on the substrate transfer rail 413 in the load chamber 401, and the load chamber 401 was evacuated with a vacuum pump (not shown) down to a pressure of about $1\times10^{-5}$ Torr. Then, the gate valve 406 was opened, and the substrate 490 was transferred to the deposition chamber 417 via the transfer chamber 402, both deposition chamber 417 and transfer chamber 402 having been evacuated with a vacuum pump (not shown). The substrate 490 was placed so as to contact with the heater 410 at its rear surface, and heated. The inside of the deposition chamber 417 was evacuated with the vacuum pump (not shown) down to a pressure of about $1\times10^{-5}$ Torr.

The substrate was then subjected to plasma treatment with hydrogen gas containing a small amount of silane-based gas under the conditions shown in Table E18(1).

In this plasma treatment with hydrogen gas containing the small amount of silane-based gas according to the present invention, $SiH_4/H_2$ (diluted to 1000 ppm) serving as silicon compound gas and $H_2$ were introduced into the deposition chamber 417 via the gas inlet 429. The $H_2$ gas was supplied by opening the valves 441, 431, 430 and its flow rate was adjusted to 900 sccm by means of the mass flow controller 436. The silicon compound gas was supplied by opening the valves 442 and 432, and its flow rate was controlled by the mass flow controller 437 such that the flow rate of the $SiH_4$ gas was maintained at 0.04% of the total gas flow rate of $H_2$. Furthermore, the pressure inside the deposition chamber 417 was adjusted to 0.9 Torr by means of a conductance valve (not shown). The substrate 490 was heated by the substrate heater 410 up to 360° C. When the temperature of the substrate had become stable, an RF power of 0.03 W/cm$^3$ was introduced by the RF power supply 422 so that a glow discharge occurs in the plasma excitation cup 420. Under the above-described conditions, the substrate was exposed for three minutes to the hydrogen gas plasma containing the small amount of silane-based gas. The RF power was then shut off to stop the glow discharge. The supply of the $SiH_4/H_2$ (diluted to 1000 ppm) gas into the deposition chamber 417 was stopped, whereas the $H_2$ gas was fed further for five minutes into the deposition chamber 417. Then, the $H_2$ gas was also shut off, and the inside of the deposition chamber 417 as well as the inside of the gas lines was evacuated down to $1\times10^{-5}$ Torr.

In this way, semiconductor film deposition was prepared, and an RF n-layer 103 of μc-Si was then deposited in the same way as for example E2.

The substrate was then subjected to plasma treatment with hydrogen gas containing a small amount of silane-based gas under the conditions shown in Table E18(2).

In this plasma treatment with hydrogen gas containing the small amount of silane-based gas according to the present invention, $SiH_4/H_2$ (diluted to 1000 ppm) serving as silicon compound gas and $H_2$ were introduced into the deposition chamber 417 via the gas inlet 429. The $H_2$ gas was supplied by opening the valves 441, 431, 430 and its flow rate was adjusted to 800 sccm by means of the mass flow controller 436. The silicon compound gas was supplied by opening the valves 442 and 432, and its flow rate was controlled by the mass flow controller 437 such that the flow rate of the $SiH_4$ gas was maintained at 0.03% of the total gas flow rate of $H_2$. Furthermore, the pressure inside the deposition chamber 417 was adjusted to 0.9 Torr by means of a conductance valve (not shown). The substrate 490 was heated by the substrate heater 410 up to 350° C. When the temperature of the substrate had become stable, an RF power of 0.02 W/cm$^3$ was introduced by the RF power supply 422 so that a glow discharge occurs in the plasma excitation cup 420. Under the above-described conditions, the substrate was exposed for three minutes to the hydrogen gas plasma containing the small amount of silane-based gas. The RF power was then shut off to stop the glow discharge. The supply of the $SiH_4/H_2$ (diluted to 1000 ppm) gas into the deposition chamber 417 was stopped, whereas the $H_2$ gas was fed further for five minutes into the deposition chamber 417. Then, the $H_2$ gas was also shut off, and the inside of the deposition chamber 417 as well as the inside of the gas lines was evacuated down to $1\times10^{-5}$ Torr.

The gate valve 407 was opened, and the substrate 490 was transferred to the deposition chamber 418 via the transfer chamber 403, both deposition chamber 418 and transfer chamber 403 having been evacuated with a vacuum pump (not shown). The substrate 490 was placed so as to contact with the heater 411 at its rear surface, and heated. The inside of the deposition chamber 418 was evacuated with the vacuum pump (not shown) down to a pressure of about $1\times10^{-5}$ Torr.

An n/i buffer layer 151 of a-SiC was then deposited by means of RFPCVD in the same way as for example E2.

The substrate was then subjected to plasma treatment with hydrogen gas containing a small amount of silane-based gas under the conditions shown in Table E18(3), according to the present invention.

In this plasma treatment with hydrogen gas containing the small amount of silane-based gas according to the present invention, $SiH_4$ serving as silicon compound gas and $H_2$ were introduced into the deposition chamber 418 via the gas inlet 449. The $H_2$ gas was supplied by opening the valves 463, 453, 450 and its flow rate was adjusted to 950 sccm by means of the mass flow controller 458. The silicon compound gas was supplied by opening the valves 461 and 451 and its flow rate was controlled by the mass flow controller 456 such that the flow rate of the $SiH_4$ gas was maintained at 0.003% of the total gas flow rate of $H_2$. Furthermore, the pressure inside the deposition chamber 418 was adjusted to 0.7 Torr by means of a conductance valve (not shown). The substrate 490 was heated by the substrate heater 411 up to 350° C. When the temperature of the substrate had become stable, an RF power of 0.02 W/cm$^3$ was applied to the bias bar 428 by the RF power supply 424 so that a glow discharge occurs in the deposition chamber 418. Under the above-described conditions, the substrate was exposed for 3 minutes to the hydrogen gas plasma containing the small amount of silane-based gas according to the present invention. The RF power was then shut off to stop the glow discharge. The supply of the $SiH_4$ gas into the deposition chamber 418 was stopped, whereas the $H_2$ gas was fed further for 3 minutes into the deposition chamber 418. Then, the $H_2$ gas was also shut off, and the inside of the deposition chamber 418 as well as the inside of the gas lines was evacuated down to $1\times10^{-5}$ Torr.

An MW i-layer 114 of a-SiGe was then deposited in the same way as for the example E2.

The substrate was then subjected to plasma treatment with hydrogen gas containing a small amount of silane-based gas under the conditions shown in Table E18(4).

In this plasma treatment with hydrogen gas containing the small amount of silane-based gas according to the present invention, $SiH_4$ serving as silicon compound gas and $H_2$ were introduced into the deposition chamber 418 via the gas inlet 449. The $H_2$ gas was supplied by opening the valves 463, 453, 450 and its flow rate was adjusted to 900 sccm by means of the mass flow controller 458. The silicon compound gas was supplied by opening the valves 461 and 451 and its flow rate was controlled by the mass flow controller 456 such that the flow rate of the $SiH_4$ gas was maintained at 0.003% of the total gas flow rate of $H_2$. Furthermore, the pressure inside the deposition chamber 418 was adjusted to 0.7 Torr by means of a conductance valve (not shown). The substrate 490 was heated by the substrate heater 411 up to 330° C. When the temperature of the substrate had become stable, an RF power of 0.03 W/cm$^3$ was applied to the bias bar 428 by the RF power supply 424 so that a glow discharge occurs in the deposition chamber 418. Under the above-described conditions, the substrate was exposed for 3 minutes to the hydrogen gas plasma containing the small amount of silane-based gas according to the present invention. The RF power was then shut off to stop the glow discharge. The supply of the $SiH_4$ gas into the deposition chamber 418 was stopped, whereas the $H_2$ gas was fed further for 3 minutes into the deposition chamber 418. Then, the $H_2$ gas was also shut off, and the inside of the deposition chamber 418 as well as the inside of the gas lines was evacuated down to $1\times10^{-5}$ Torr.

A p/i buffer layer 161 of a-SiC, an RF p-layer 105 of a-SiC, and an RF n-layer 203 of μc-Si were then deposited in the same way as for the example E2.

The substrate was then subjected to plasma treatment with hydrogen gas containing a small amount of silane-based gas under the conditions shown in Table E18(5).

In this plasma treatment with hydrogen gas containing the small amount of silane-based gas according to the present invention, $SiH_4/H_2$ (diluted to 1000 ppm) serving as silicon compound gas and $H_2$ were introduced into the deposition chamber 417 via the gas inlet 429. The $H_2$ gas was supplied by opening the valves 441, 431, 430 and its flow rate was adjusted to 1100 sccm by means of the mass flow controller 436. The silicon compound gas was supplied by opening the valves 442 and 432, and its flow rate was controlled by the mass flow controller 437 such that the flow rate of the $SiH_4$ gas was maintained at 0.04% of the total gas flow rate of $H_2$. Furthermore, the pressure inside the deposition chamber 417 was adjusted to 0.6 Torr by means of a conductance valve (not shown). The substrate 490 was heated by the substrate heater 410 up to 300° C. When the temperature of the substrate had become stable, an RF power of 0.03 W/cm$^3$ was introduced by the RF power supply 422 so that a glow discharge occurs in the plasma excitation cup 420. Under the above-described conditions, the substrate was exposed for three minutes to the hydrogen gas plasma containing the small amount of silane-based gas. The RF power was then shut off to stop the glow discharge. The supply of the $SiH_4/H_2$ (diluted to 1000 ppm) gas into the deposition chamber 417 was stopped, whereas the $H_2$ gas was fed further for three minutes into the deposition chamber 417. Then, the $H_2$ gas was also shut off, and the inside of the deposition chamber 417 as well as the inside of the gas lines was evacuated down to $1\times10^{-5}$ Torr.

An n/i buffer layer 251 of a-SiC was then deposited by means of RFPCVD in the same way as for example E2.

The substrate was then subjected to plasma treatment with hydrogen gas containing a small amount of silane-based gas under the conditions shown in Table E18(6), according to the present invention.

In this plasma treatment with hydrogen gas containing the small amount of silane-based gas according to the present invention, $SiH_4$ serving as silicon compound gas and $H_2$ were introduced into the deposition chamber 418 via the gas inlet 449. The $H_2$ gas was supplied by opening the valves 463, 453, 450 and its flow rate was adjusted to 900 sccm by means of the mass flow controller 458. The silicon compound gas was supplied by opening the valves 461 and 451 and its flow rate was controlled by the mass flow controller 456 such that the flow rate of the $SiH_4$ gas was maintained at 0.003% of the total gas flow rate of $H_2$. Furthermore, the pressure inside the deposition chamber 418 was adjusted to 0.8 Torr by means of a conductance valve (not shown). The substrate 490 was heated by the substrate heater 411 up to 300° C. When the temperature of the substrate had become stable, an RF power of 0.02 W/$cm^3$ was applied to the bias bar 428 by the RF power supply 424 so that a glow discharge occurs in the deposition chamber 418. Under the above-described conditions, the substrate was exposed for 3 minutes to the hydrogen gas plasma containing the small amount of silane-based gas according to the present invention. The RF power was then shut off to stop the glow discharge. The supply of the $SiH_4$ gas into the deposition chamber 418 was stopped, whereas the $H_2$ gas was fed further for 3 minutes into the deposition chamber 418. Then, the $H_2$ gas was also shut off, and the inside of the deposition chamber 418 as well as the inside of the gas lines was evacuated down to $1\times10^{-5}$ Torr.

An MW i-layer 214 of a-SiGe was then deposited by means of MWPCVD in the same way as for example E2.

The substrate was then subjected to plasma treatment with hydrogen gas containing a small amount of silane-based gas under the conditions shown in Table E18(7), according to the present invention.

In this plasma treatment with hydrogen gas containing the small amount of silane-based gas according to the present invention, $SiH_4$ serving as silicon compound gas and $H_2$ were introduced into the deposition chamber 418 via the gas inlet 449. The $H_2$ gas was supplied by opening the valves 463, 453, 450 and its flow rate was adjusted to 950 sccm by means of the mass flow controller 458. The silicon compound gas was supplied by opening the valves 461 and 451 and its flow rate was controlled by the mass flow controller 456 such that the flow rate of the $SiH_4$ gas was maintained at 0.004% of the total gas flow rate of $H_2$. Furthermore, the pressure inside the deposition chamber 418 was adjusted to 0.7 Torr by means of a conductance valve (not shown). The substrate 490 was heated by the substrate heater 411 up to 330° C. When the temperature of the substrate had become stable, an RF power of 0.03 W/$cm^3$ was applied to the bias bar 428 by the RF power supply 424 so that a glow discharge occurs in the deposition chamber 418. Under the above-described conditions, the substrate was exposed for 3 minutes to the hydrogen gas plasma containing the small amount of silane-based gas according to the present invention. The RF power was then shut off to stop the glow discharge. The supply of the $SiH_4$ gas into the deposition chamber 418 was stopped, whereas the $H_2$ gas was fed further for 3 minutes into the deposition chamber 418. Then, the $H_2$ gas was also shut off, and the inside of the deposition chamber 418 as well as the inside of the gas lines was evacuated down to $1\times10^{-5}$ Torr.

A p/i buffer layer 261 of a-SiC, an RF p-layer 205 of a-SiC, and an RF n-layer 303 of μc-Si were then deposited in that order in the same way as for the example E2.

The substrate was then subjected to plasma treatment with hydrogen gas containing a small amount of silane-based gas under the conditions shown in Table E18(8).

In this plasma treatment with hydrogen gas containing the small amount of silane-based gas according to the present invention, $SiH_4/H_2$ (diluted to 1000 ppm) serving as silicon compound gas and $H_2$ were introduced into the deposition chamber 417 via the gas inlet 429. The $H_2$ gas was supplied by opening the valves 441, 431, 430 and its flow rate was adjusted to 650 sccm by means of the mass flow controller 436. The silicon compound gas was supplied by opening the valves 442 and 432, and its flow rate was controlled by the mass flow controller 437 such that the flow rate of the $SiH_4$ gas was maintained at 0.03% of the total gas flow rate of $H_2$. Furthermore, the pressure inside the deposition chamber 417 was adjusted to 0.9 Torr by means of a conductance valve (not shown). The substrate 490 was heated by the substrate heater 410 up to 230° C. When the temperature of the substrate had become stable, an RF power of 0.03 W/$cm^3$ was introduced by the RF power supply 422 so that a glow discharge occurs in the plasma excitation cup 420. Under the abovedescribed conditions, the substrate was exposed for two minutes to the hydrogen gas plasma containing the small amount of silane-based gas. The RF power was then shut off to stop the glow discharge. The supply of the $SiH_4/H_2$ (diluted to 1000 ppm) gas into the deposition chamber 417 was stopped, whereas the $H_2$ gas was fed further for three minutes into the deposition chamber 417. Then, the $H_2$ gas was also shut off, and the inside of the deposition chamber 417 as well as the inside of the gas lines was evacuated down to $1\times10^{-5}$ Torr.

An n/i buffer layer 351 of a-SiC was then deposited by means of RFPCVD in the same way as for example E2.

The substrate was then subjected to plasma treatment with hydrogen gas containing a small amount of silane-based gas under the conditions shown in Table E18(9), according to the present invention.

In this plasma treatment with hydrogen gas containing the small amount of silane-based gas according to the present invention, $SiH_4$ serving as silicon compound gas and $H_2$ were introduced into the deposition chamber 418 via the gas inlet 449. The $H_2$ gas was supplied by opening the valves 463, 453, 450 and its flow rate was adjusted to 900 sccm by means of the mass flow controller 458. The silicon compound gas was supplied by opening the valves 461 and 451 and its flow rate was controlled by the mass flow controller 456 such that the flow rate of the $SiH_4$ gas was maintained at 0.003% of the total gas flow rate of $H_2$. Furthermore, the pressure inside the deposition chamber 418 was adjusted to 0.7 Torr by means of a conductance valve (not shown). The substrate 490 was heated by the substrate heater 411 up to 230° C. When the temperature of the substrate had become stable, an RF power of 0.02 W/$cm^3$ was applied to the bias bar 428 by the RF power supply 424 so that a glow discharge occurs in the deposition chamber 418. Under the above-described conditions, the substrate was exposed for 3 minutes to the hydrogen gas plasma containing the small amount of silane-based gas according to the present invention. The RF power was then shut off to stop the glow discharge. The supply of the $SiH_4$ gas into the deposition chamber 418 was stopped, whereas the $H_2$ gas was fed further for 3 minutes into the deposition chamber 418. Then, the $H_2$ gas was also shut off, and the inside of the deposition chamber 418 as well as the inside of the gas lines was evacuated down to $1\times10^{-5}$ Torr.

An RF i-layer 314 of a-Si was then deposited in the same way as for the example E2 by means of RFPCVD.

The substrate was then subjected to plasma treatment with hydrogen gas containing a small amount of silane-based gas under the conditions shown in Table E18(10).

In this plasma treatment with hydrogen gas containing the small amount of silane-based gas according to the present invention, $SiH_4$ serving as silicon compound gas and $H_2$ were introduced into the deposition chamber 418 via the gas inlet 449. The $H_2$ gas was supplied by opening the valves 463, 453, 450 and its flow rate was adjusted to 850 sccm by means of the mass flow controller 458. The silicon compound gas was supplied by opening the valves 461 and 451 and its flow rate was controlled by the mass flow controller 456 such that the flow rate of the $SiH_4$ gas was maintained at 0.003% of the total gas flow rate of $H_2$. Furthermore, the pressure inside the deposition chamber 418 was adjusted to 0.8 Torr by means of a conductance valve (not shown). The substrate 490 was heated by the substrate heater 411 up to 200° C. When the temperature of the substrate had become stable, an RF power of 0.02 W/cm$^3$ was applied to the bias bar 428 by the RF power supply 424 so that a glow discharge occurs in the deposition chamber 418. Under the above-described conditions, the substrate was exposed for 3 minutes to the hydrogen gas plasma containing the small amount of silane-based gas according to the present invention. The RF power was then shut off to stop the glow discharge. The supply of the $SiH_4$ gas into the deposition chamber 418 was stopped, whereas the $H_2$ gas was fed further for 3 minutes into the deposition chamber 418. Then, the $H_2$ gas was also shut off, and the inside of the deposition chamber 418 as well as the inside of the gas lines was evacuated down to $1\times10^{-5}$ Torr.

A p/i buffer layer 361 of a-SiC, and an RF p-layer 305 of a-SiC were then deposited in that order in the same way as for the example E2 by means of RFPCVD.

ITO was then evaporated onto the RF p-layer 305 so as to form a transparent conductive layer 112 having a thickness of 70 nm.

A mask having a comb-shaped window was placed on the transparent conductive layer 112, and metal evaporation was performed via the mask to form a comb-shaped collection electrode 113 having a multi-layer structure consisting of Cr (40 nm), Ag (1000 nm), and Cr (40 nm).

In this way, the complete solar cell according to the invention was obtained. Hereinafter, the solar cell of this type will be referred to as SC-EMB-E18. Tables E18(1) through E18(11) indicate the conditions used here in the invention, regarding the plasma treatment with hydrogen containing a small amount of silane-based gas as well as the process conditions for the RF n-layer, n/i buffer layer, MW i-layer, p/i buffer layer, RF p-layer, RF n-layer, n/i buffer layer, MW i-layer, p/i buffer layer, RF p-layer, RF n-layer, n/i buffer layer, RF i-layer, p/i buffer layer, and RF p-layer.

COMPARATIVE EXAMPLE E18

For the sake of comparison, a solar cell (SC-CMP-E18) was also fabricated in the same manner as in the above-described example E18 except that the plasma treatment with hydrogen gas containing a small amount of silane-based gas according to the invention was not performed.

Eight samples of solar cells were prepared for each type (SC-EMB-E18 and SC-CMP-E18) for the purpose of evaluation regarding the initial photoelectric conversion efficiency (the ratio of the electric output power to the optical input power), vibration durability and optical durability under a biased condition at high temperature with high humidity, and vibration durability and optical durability under a non-biased condition.

The measurement of the initial photoelectric conversion efficiency was performed by measuring the V-I characteristics of the samples under the illumination condition of AM 1.5 (100 mW/cm$^2$). The measurement revealed that the SC-EMB-E18 samples had a smaller variation in the initial photoelectric conversion efficiencies than the SC-CMP-E18 samples and had a larger fill factor (F.F.) as shown below:

| | [Fill factor (F.F.)] | [Variation] |
|---|---|---|
| SC-EMB-E18 | 1.15 (relative to that of SC-CMP-E18) | 0.82 |

The vibration durability test under the non-biased condition was performed as follows: After the measurement of the initial photoelectric conversion efficiency, some samples were placed in a dark place kept at 25° C. with a relative humidity of 54%. Vibration having an amplitude of 0.1 mm and a frequency of 60 Hz was applied to the samples for 500 hr. Then, the photoelectric conversion efficiencies of the samples were measured under the illumination condition of AM 1.5 (100 mW/cm$^2$) and the reduction relative to the initial value (the ratio of the photoelectric conversion efficiency after the vibration test to the initial value) was evaluated for each sample. The SC-CMP-E18 samples showed a greater reduction in the photoelectric conversion efficiency compared with the SC-EMB-E18 samples as shown below.

The optical durability test under the non-biased condition was performed as follows: After the measurement of the initial photoelectric conversion efficiency, some samples were placed in a dark place kept at 25° C. with a relative humidity of 54%. Light having a power of AM 1.5 (100 mW/cm$^2$) was applied to the samples for 500 hours, and then the photoelectric conversion efficiencies of the samples were measured under the illumination condition of AM 1.5 (100 mW/cm$^2$). The reduction relative to the initial value (the ratio of the photoelectric conversion efficiency after the optical durability test to the initial value) was evaluated for each sample. The SC-CMP-E18 samples showed a greater reduction in the photoelectric conversion efficiency compared with the SC-EMB-E18 samples as shown below.

| | [Vibration durability] | [Optical durability] |
|---|---|---|
| SC-CMP-E18 | 0.84 (relative to those of SC-EMB-E18) | 0.82 |

The evaluation of the vibration durability and optical durability under the biased condition at high temperature with high humidity was performed as follows: After the measurement of the initial photoelectric conversion efficiency, some samples were placed in a dark place kept at 82° C. with a relative humidity of 90%, and a forward bias voltage of 0.7

V was applied to the samples. The vibration described above was applied to some of the samples and light having a power of AM 1.5 was applied to the other samples under the same conditions as those in the non-biased vibration test. The photoelectric conversion efficiencies of the samples were measured under the illumination condition of AM 1.5 (100 mW/$cm^2$). The SC-CMP-E18 samples also showed a greater reduction in the photoelectric conversion efficiency compared with the SC-EMB-E18 samples after the vibration and optical durability tests as shown below.

| | Under the biased condition: | |
|---|---|---|
| | [Vibration durability] | [Optical durability] |
| SC-CMP-E18 | 0.82 (relative to that of SC-EMB-E18) | 0.81 |

The surfaces of the samples were observed using an optical microscope to evaluate film separation. No film separation was observed in the SC-EMB-E18 samples, whereas slight film separation was observed in the SC-CMP-E18 samples.

From the above results, it can be concluded that the solar cells (SC-EMB-E18) according to the present invention are better than the conventional solar cells (SC-CMP-E18) in optical durability, adhesion, overall durability, fill factor (F.F.) and uniformity of the photoelectric conversion efficiency.

In the above examples of solar cells according to the present invention, semiconductor layers were deposited on a substrate in the order of an n-layer, n/i-layer, i-layer, p/i buffer layer, and p-layer. Solar cells in which the semiconductor layers were deposited in the opposite order were also made using the same hydrogen plasma treatment.

These solar cells were evaluated in the same way as for the above-described examples. When the hydrogen plasma treatment was applied to the cells between the n/i buffer layer and i-layer, the cells showed improvement in fill factor (F.F.) and uniformity of the photoelectric conversion efficiency, optical durability, adhesion, overall durability and other factors. When the hydrogen plasma treatment was also applied to the cells between the substrate and p-layer, and also to the n-layer and n/i buffer layer, and the n/i buffer layer and i-layer, the cells showed further improvement in the characteristics described above.

EXAMPLE F1 ACCORDING TO THE INVENTION

A solar cell having a structure illustrated in FIG. 2 was made using the deposition equipment shown in FIG. 7. First, a substrate was prepared. A stainless-steel base 100 having dimensions of 0.5 mm in thickness and 50×50 $mm^2$ in area was cleaned with acetone and isopropanol by means of ultrasonic cleaning, and then dried with hot air.

An Ag optical reflection layer 101 having a thickness of 0.3 μm was deposited on a surface of the stainless-steel base 100 in sputtering at room temperature, and a 1.0-μm thick ZnO layer acting as a reflection enhancing layer 102 was further deposited on it at 350° C. Thus, the complete substrate was prepared.

Using the deposition equipment 400 having the capabilities of both MWPCVD and RFPCVD, semiconductor layers were then deposited on the reflection enhancing layer 102.

The deposition equipment was connected to source gas cylinders (not shown) via gas inlets. The source gas cylinders used here contained gas refined with ultra high purity, $SiH_4$, $SiF_4$, $CH_4$, $GeH_4$, $GeF_4$, $Si_2H_6$, $PH_3/H_2$ (diluted to 1000 ppm), $B_2H_6/H_2$ (diluted to 2000 ppm), $H_2$, He, $SiCl_2H_2$, and $SiH_4/H_2$ (diluted to 1000 ppm) gas.

The substrate 490 on which the optical reflection layer 101 and the reflection enhancing layer 102 had been formed was placed on the substrate transfer rail 413 in the load chamber 401, and the load chamber 401 was evacuated with a vacuum pump (not shown) down to a pressure of about $1\times10^{-2}$ Torr. Then, the gate valve 406 was opened, and the substrate 490 was transferred to the deposition chamber 417 via the transfer chamber 402, both deposition chamber 417 and transfer chamber 402 having been evacuated with a vacuum pump (not shown). The substrate 490 was placed so as to contact with the heater 410 at its rear surface, and heated. The inside of the deposition chamber 417 was evacuated with the vacuum pump (not shown) down to a pressure of about $1\times10^{-5}$ Torr.

In this way, semiconductor film deposition was prepared, and an RF n-layer 103 of μc-Si was then deposited, as described below.

To deposit the RF n-layer of μc-Si, $H_2$ gas was introduced into the deposition chamber 417 via the gas inlet 429. The $H_2$ gas was supplied by opening the valves 441, 431, 430 and its flow rate was adjusted to 180 sccm by means of the mass flow controller 436. Furthermore, the pressure inside the deposition chamber 417 was adjusted to 1.10 Torr by means of the conductance valve (not shown). The substrate 490 was heated by the substrate heater 410 up to 370° C. When the temperature of the substrate had become stable, the valves 443, 433, 444, and 434 were opened to introduce $SiH_4$ gas and $PH_3/H_2$ gas into the deposition chamber 417 via the gas inlet 429. The flow rates of $SiH_4$, $H_2$, and $PH_3/H_2$ were adjusted to 1.5 sccm, 110 sccm, and 200 sccm, respectively, by the mass flow controllers 438, 436, and 439. The pressure inside the deposition chamber 417 was adjusted to 1.15 Torr. An RF power of the RF power supply 422 was set to 0.05 W/$cm^3$ and applied to the plasma excitation cup 420 to activate a glow discharge. The deposition of the RF n-layer was started. When the thickness of the deposited RF n-layer reached 20 nm, the RF power was shut off to stop the glow discharge. The deposition of the RF n-layer 103 was finished. The supply of $SiH_4$ and $PH_3/H_2$ into the deposition chamber 417 was stopped, whereas $H_2$ was fed further for five minutes into the deposition chamber 417. Then, $H_2$ was also shut off, and the inside of the deposition chamber 417 as well as the inside of the gas lines was evacuated down to $1\times10^{-5}$ Torr.

An n/i buffer layer 151 of a-Si was then deposited by means of RFPCVD as described below.

The gate valve 407 was opened, and the substrate 490 was transferred to the i-layer deposition chamber 418 via the transfer chamber 403, both deposition chamber 418 and transfer chamber 403 having been evacuated with a vacuum pump (not shown). The substrate 490 was placed so as to contact with the heater 411 at its rear surface, and heated. The inside of the i-layer deposition chamber 418 was evacuated with the vacuum pump (not shown) down to a pressure of about $1\times10^{-5}$ Torr.

To deposit the n/i buffer layer 151, the substrate 490 was heated by the substrate heater 411 up to 360° C. When the substrate had been heated enough, the valves 464, 454, 450, 463, and 453 were opened gradually to supply $Si_2H_6$ and $H_2$ to the i-layer deposition chamber 418 via the gas inlet 449. The flow rates of $Si_2H_6$ and $H_2$ were adjusted to 3.5 sccm and 100 sccm, respectively, by the mass flow controllers 459 and 458. The pressure inside the i-layer deposition chamber 418 was set to 0.8 Torr by adjusting the opening ratio of a conductance valve (not shown). Then, a high-frequency (RF) power of 0.06 W/cm$^3$ was applied to the bias bar 428 by the RF power supply 424 to excite a glow discharge. The shutter 427 was then opened, and depositing the n/i buffer layer on the RF n-layer was started. When the thickness of the deposited n/i buffer layer reached 10 nm, the RF glow discharge was stopped, and the RF power supply 424 was shut off. The deposition of the n/i buffer layer 151 was finished. The valves 464 and 454 were closed to stop the supply of $Si_2H_6$ to the i-layer deposition chamber 418, whereas $H_2$ was fed further for two minutes into the i-layer deposition chamber 418. Then, the valves 453 and 450 were closed, and the inside of the i-layer deposition chamber 418 as well as the inside of the gas lines was evacuated down to $1\times10^{-2}$ Torr.

An MW i-layer 114 of a-SiGe was then deposited by means of MWPCVD as described below.

To deposit the MW i-layer 114, the substrate 490 was heated by the substrate heater 411 up to 370° C. When the substrate had been heated enough, the valves 461, 451, 450, 462, 452, 463, and 453 were opened gradually to supply $SiH_4$, $GeH_4$, and $H_2$ to the i-layer deposition chamber 418 via the gas inlet 449. The flow rates of $SiH_4$, $GeH_4$, and $H_2$ were adjusted to 38, 37, and 160 sccm, respectively, by the mass flow controllers 456, 457, and 458. The pressure inside the i-layer deposition chamber 418 was set to 5 mTorr by adjusting the opening ratio of a conductance valve (not shown). Then, a high-frequency (RF) power of 0.70 W/cm$^3$ was applied to the bias bar 428 by the RF power supply 424. The power of the MW power supply (not shown) was set to 0.25 W/cm$^3$ and introduced into the i-layer deposition chamber 418 through the wave guide 426 and the microwave entrance window 425 to excite a glow discharge. The shutter 427 was then opened, and depositing the MW i-layer 114 onto the n/i buffer layer was started. When the thickness of the deposited MW i-layer 114 reached 0.15 μm, the MW glow discharge was stopped, and the RF power supply 424 was shut off. The deposition of the MW i-layer 114 was finished. The valves 451 and 452 were closed to stop the supply of $SiH_4$ and $GeH_4$ to the i-layer deposition chamber 418, whereas $H_2$ was fed further for two minutes into the i-layer deposition chamber 418. Then, the valves 453 and 450 were closed, and the inside of the i-layer deposition chamber 418 as well as the inside of the gas lines was evacuated down to $1\times10^{-5}$ Torr.

A p/i buffer layer 161 of a-Si was then deposited by means of RFPCVD as described below.

To deposit the p/i buffer layer 161, the substrate 490 was heated by the substrate heater 411 up to 230° C. When the substrate had been heated enough, the valves 464, 454, 450, 463, and 453 were opened gradually to supply $Si_2H_6$ and $H_2$ to the i-layer deposition chamber 418 via the gas inlet 449. The flow rates of $Si_2H_6$ and $H_2$ were adjusted to 3 sccm and 80 sccm, respectively, by the mass flow controllers 459 and 458. The pressure inside the i-layer deposition chamber 418 was set to 0.8 Torr by adjusting the opening ratio of a conductance valve (not shown). Then, an RF power of 0.07 W/cm$^3$ was applied to the bias bar 428 by the RF power supply 424 to excite a glow discharge. The shutter 427 was then opened, and depositing the p/i buffer layer 161 on the MW i-layer 114 was started. When the thickness of the deposited p/i buffer layer 161 reached 20 nm, the RF glow discharge was stopped, and the RF power supply 424 was shut off. The deposition of the p/i buffer layer 161 was finished. The valves 464 and 454 were closed to stop the supply of $Si_2H_6$ to the i-layer deposition chamber 418, whereas $H_2$ was fed further for two minutes into the i-layer deposition chamber 418. Then, the valves 453 and 450 were closed, and the inside of the i-layer deposition chamber 418 as well as the inside of the gas lines was evacuated down to $1\times10^{-5}$ Torr.

The substrate was then subjected to plasma treatment with hydrogen gas containing a small amount of silane-based gas, according to the present invention.

In this plasma treatment with hydrogen gas containing the small amount of silane-based gas according to the present invention, $SiH_4$ serving as silicon compound gas and $H_2$ were introduced into the deposition chamber 418 via the gas inlet 449. The $H_2$ gas was supplied by opening the valves 463, 453, 450 and its flow rate was adjusted to 1200 sccm by means of the mass flow controller 458. The silicon compound gas was supplied by opening the valves 461 and 451 and its flow rate was controlled by the mass flow controller 456 such that the flow rate of the $SiH_4$ gas was maintained at 0.01% of the total gas flow rate of $H_2$. Furthermore, the pressure inside the deposition chamber 418 was adjusted to 0.8 Torr by means of a conductance valve (not shown). The substrate 490 was heated by the substrate heater 411 up to 200° C. When the temperature of the substrate had become stable, an RF power of 0.05 W/cm$^3$ was applied to the bias bar 428 by the RF power supply 424 so that a glow discharge occurs in the deposition chamber 418. The shutter 427 was then opened, and under the above-described conditions, the substrate was exposed for 3 minutes to the hydrogen gas plasma containing the small amount of silane-based gas according to the present invention. The RF power was then shut off to stop the glow discharge. The supply of the $SiH_4$ gas into the deposition chamber 418 was stopped, whereas the $H_2$ gas was fed further for 3 minutes into the deposition chamber 418. Then, the $H_2$ gas was also shut off, and the inside of the deposition chamber 418 as well as the inside of the gas lines was evacuated down to $1\times10^{-5}$ Torr.

An RF p-layer 105 of a-SiC was deposited. To deposit the RF p-layer 105 of a-SiC, the gate valve 408 was opened, and the substrate 490 was transferred to the p-layer deposition chamber 419 via the transfer chamber 404, both deposition chamber 419 and transfer chamber 404 having been evacuated with a vacuum pump (not shown). The substrate 490 was placed so as to contact with the heater 412 at its rear surface, and heated. The inside of the p-layer deposition chamber 419 was evacuated with the vacuum pump (not shown) down to a pressure of about $1\times10^{-5}$ Torr.

The substrate 490 was heated by the substrate heater 412 up to 200° C. When the temperature of the substrate had become stable, the valves 481, 471, 470, 482, 472, 483, 473, 484, and 474 were opened to supply $H_2$ gas, $SiH_4/H_2$ gas, $B_2H_6/H_2$ gas, and $CH_4$ gas to the deposition chamber 419 via the gas inlet 469. The flow rates of the $H_2$, $SiH_4/H_2$, $B_2H_6/H_2$, and $CH_4$, were adjusted to 90 sccm, 1 sccm, 10 sccm, and 0.3 sccm, respectively, by the mass flow controllers 476, 477, 478, and 479. The pressure inside the chamber 419 was set to 1.3 Torr by adjusting the opening ratio of a conductance valve (not shown). An RF power of 0.09 W/cm$^3$ was applied by the RF power supply 423 to the plasma excitation cup 421 to activate a glow discharge, and deposition of the RF p-layer 105 on the p/i buffer layer was started. When the thickness of the deposited RF p-layer 105 reached 10 nm, the RF power was shut off to stop the glow discharge. The deposition of the RF p-layer 105 was finished. The valves 472, 482, 473, 483, 474, and 484 were closed to stop the supply of $SiH_4/H_2$, $B_2H_6/H_2$, and $CH_4$ to the p-layer deposition chamber 419, whereas $H_2$ was fed further for three minutes into the p-layer deposition chamber 419. Then, the valves 471, 481, and 470 were closed, and the inside of the p-layer deposition chamber 419 as well as the inside of the gas lines was evacuated down to $1\times10^{-5}$ Torr.

The gate valve 409 was then opened, and the substrate 490 was transferred to the unload chamber 405 which had already been evacuated with a vacuum pump (not shown). Then, a leak valve (not shown) was opened so that the inside of the unload chamber 405 was exposed to the ambient atmosphere.

ITO was then evaporated onto the RF p-layer 105 so as to form a transparent conductive layer 112 having a thickness of 70 nm.

A mask having a comb-shaped window was placed on the transparent conductive layer 112, and metal evaporation was performed via the mask to form a comb-shaped collection electrode 113 having a multi-layer structure consisting of Cr (40 nm), Ag (1000 nm), and Cr (40 nm).

In this way, the complete solar cell according to the invention was obtained. Hereinafter, the solar cell of this type will be referred to as SC-EMB-F1. Tables F1(1) and F1(2) indicate the conditions used here in the invention, regarding the plasma treatment with hydrogen containing a small amount of silane-based gas as well as the process conditions for the RF n-layer, RF n/i buffer layer, MW i-layer, RF p/i buffer layer, and RF p-layer.

COMPARATIVE EXAMPLE F1

For the sake of comparison, a solar cell (SC-CMP-F1) was also fabricated in the same manner as in the above-described example F1 except that the plasma treatment with hydrogen gas containing a small amount of silane-based gas according to the invention was not performed.

Seven samples of solar cells were prepared for each type (SC-EMB-F1 and SC-CMP-F1) for the purpose of evaluation regarding the initial photoelectric conversion efficiency (the ratio of the electric output power to the optical input power), vibration durability and optical durability under a biased condition at high temperature with high humidity, and vibration durability and optical durability under a non-biased condition.

The measurement of the initial photoelectric conversion efficiency was performed by measuring the V-I characteristics of the samples under the illumination condition of AM 1.5 (100 mW/cm$^2$). The measurement revealed that the SC-EMB-F1 samples had a smaller variation (that is, more preferable) in the initial photoelectric conversion efficiencies than the SC-CMP-F1 samples and had a larger fill factor (F.F.) as shown below:

| | [Fill factor (F.F.)] | [Variation] |
|---|---|---|
| SC-EMB-F1 | 1.12 (relative to that of SC-CMP-F1) | 0.84 |

The vibration durability test under the non-biased condition was performed as follows: After the measurement of the initial photoelectric conversion efficiency, some samples were placed in a dark place kept at 26° C. with a relative humidity of 56%. Vibration having an amplitude of 0.1 mm and a frequency of 60 Hz was applied to the samples for 500 hr. Then, the photoelectric conversion efficiencies of the samples were measured under the illumination condition of AM 1.5 (100 mW/cm$^2$) and the reduction relative to the initial value (the ratio of the photoelectric conversion efficiency after the vibration test to the initial value) was evaluated for each sample. The SC-CMP-F1 samples showed a greater reduction in the photoelectric conversion efficiency compared with the SC-EMB-F1 samples as shown below.

The optical durability test under the non-biased condition was performed as follows: After the measurement of the initial photoelectric conversion efficiency, some samples were placed in a dark place kept at 26° C. with a relative humidity of 56% Light having a power of AM 1.5 (100 mW/cm$^2$) was applied to the samples for 500 hours, and then the photoelectric conversion efficiencies of the samples were measured under the illumination condition of AM 1.5 (100 mW/cm$^2$). The reduction relative to the initial value (the ratio of the photoelectric conversion efficiency after the optical durability test to the initial value) was evaluated for each sample. The SC-CMP-F1 samples showed a greater reduction in the photoelectric conversion efficiency compared with the SC-EMB-F1 samples as shown below.

| | [Vibration durability] | [Optical durability] |
|---|---|---|
| SC-CMP-F1 | 0.83 (relative to those of SC-EMB-F1) | 0.81 |

The evaluation of the vibration durability and optical durability under the biased condition at high temperature with high humidity was performed as follows: After the measurement of the initial photoelectric conversion efficiency, some samples were placed in a dark place kept at 84° C. with a relative humidity of 91%, and a forward bias voltage of 0.7 V was applied to the samples. The vibration described above was applied to some of the samples and light having a power of AM 1.5 was applied to the other samples under the same conditions as those in the non-biased vibration test. The photoelectric conversion efficiencies of the samples were measured under the illumination condition of AM 1.5 (100 mW/cm$^2$). The SC-CMP-F1 samples also showed a greater reduction in the photoelectric conversion efficiency compared with the SC-EMB-F1 samples after the vibration and optical durability tests as shown below.

| | Under the biased condition: | |
|---|---|---|
| | [Vibration durability] | [Optical durability] |
| SC-CMP-F1 | 0.82 (relative to that of SC-EMB-F1) | 0.81 |

The surfaces of the samples were observed using an optical microscope to evaluate film separation. No film separation was observed in the SC-EMB-F1 samples, whereas slight film separation was observed in the SC-CMP-F1 samples.

From the above results, it can be concluded that the solar cells (SC-EMB-F1) according to the present invention are better than the conventional solar cells (SC-CMP-F1) in optical durability, adhesion, overall durability, fill factor (F.F.) and uniformity of the photoelectric conversion efficiency.

EXAMPLE F2 ACCORDING TO THE INVENTION

A solar cell having a structure illustrated in FIG. 4 was made using the deposition equipment shown in FIG. 7.

A substrate 490 on which the optical reflection layer 101 and the reflection enhancing layer 102 had been formed in the same was as for example F1 was placed on the substrate transfer rail 413 in the load chamber 401, and the load chamber 401 was evacuated with a vacuum pump (not shown) down to a pressure of about $1\times10^{-5}$ Torr. Then, the gate valve 406 was opened, and the substrate 490 was transferred to the deposition chamber 417 via the transfer chamber 402, both deposition chamber 417 and transfer chamber 402 having been evacuated with a vacuum pump (not shown). The substrate 490 was placed so as to contact with the heater 410 at its rear surface, and heated. The inside of the deposition chamber 417 was evacuated with the vacuum pump (not shown) down to a pressure of about $1\times10^{-5}$ Torr.

In this way, semiconductor film deposition was prepared, and an RF n-layer 103 of μc-Si was then deposited, as described below.

To deposit the RF n-layer of μc-Si, $H_2$ gas was introduced into the deposition chamber 417 via the gas inlet 429. The $H_2$ gas was supplied by opening the valves 441, 431, 430 and its flow rate was adjusted to 300 sccm by means of the mass flow controller 436. Furthermore, the pressure inside the deposition chamber 417 was adjusted to 1.2 Torr by means of the conductance valve (not shown). The substrate 490 was heated by the substrate heater 410 up to 380° C. When the temperature of the substrate had become stable, the valves 443, 433, 444, and 434 were opened to introduce $SiH_4$ gas and $PH_3/H_2$ gas into the deposition chamber 417 via the gas inlet 429. The flow rates of $SiH_4$, $H_2$, and $PH_3/H_2$ were adjusted to 1.5 sccm, 90 sccm, and 200 sccm, respectively, by the mass flow controllers 438, 436, and 439. The pressure inside the deposition chamber 417 was adjusted to 1.1 Torr. An RF power of the RF power supply 422 was set to 0.05 W/cm$^3$ and applied to the plasma excitation cup 420 to activate a glow discharge. Deposition of the RF n-layer on the substrate was started. When the thickness of the deposited RF n-layer reached 20 nm, the RF power was shut off to stop the glow discharge. The deposition of the RF n-layer 103 was finished. The supply of $SiH_4$ and $PH_3/H_2$ into the deposition chamber 417 was stopped, whereas $H_2$ was fed further for four minutes into the deposition chamber 417. Then, $H_2$ was also shut off, and the inside of the deposition chamber 417 as well as the inside of the gas lines was evacuated down to $1\times10^{-5}$ Torr.

An n/i buffer layer 151 of a-Si was then deposited by means of RFPCVD as described below.

The gate valve 407 was opened, and the substrate 490 was transferred to the i-layer deposition chamber 418 via the transfer chamber 403, both deposition chamber 418 and transfer chamber 403 having been evacuated with a vacuum pump (not shown). The substrate 490 was placed so as to contact with the heater 411 at its rear surface, and heated. The inside of the i-layer deposition chamber 418 was evacuated with the vacuum pump (not shown) down to a pressure of about $1\times10^{-5}$ Torr.

To deposit the n/i buffer layer 151, the substrate 490 was heated by the substrate heater 411 up to 360° C. When the substrate had been heated enough, the valves 464, 454, 450, 463, and 453 were opened gradually to supply $Si_2H_6$ and $H_2$ to the i-layer deposition chamber 418 via the gas inlet 449. The flow rates of $Si_2H_6$ and $H_2$ were adjusted to 2.5 sccm and 85 sccm, respectively, by the mass flow controllers 459 and 458. The pressure inside the i-layer deposition chamber 418 was set to 0.8 Torr by adjusting the opening ratio of a conductance valve (not shown). Then, a RF power of 0.08 W/cm$^3$ was applied to the bias bar 428 by the RF power supply 424 to excite a glow discharge. The shutter 427 was then opened, and depositing the n/i buffer layer 151 on the RF n-layer 103 was started. When the thickness of the deposited n/i buffer layer 151 reached 10 nm, the RF glow discharge was stopped, and the RF power supply 424 was shut off. The deposition of the n/i buffer layer 151 was finished. The valves 464 and 454 were closed to stop the supply of $Si_2H_6$ to the i-layer deposition chamber 418, whereas $H_2$ was fed further for two minutes into the i-layer deposition chamber 418. Then, the valves 453 and 450 were closed, and the inside of the i-layer deposition chamber 418 as well as the inside of the gas lines was evacuated down to $1\times10^{-5}$ Torr.

An MW i-layer 114 of a-SiGe was then deposited by means of MWPCVD as described below.

To deposit the MW i-layer 114, the substrate 490 was heated by the substrate heater 411 up to 380° C. When the substrate had been heated enough, the valves 461, 451, 450, 462, 452, 463, and 453 were opened gradually to supply $SiH_4$, $GeH_4$, and $H_2$ to the i-layer deposition chamber 418 via the gas inlet 449. The flow rates of $SiH_4$, $GeH_4$, and $H_2$ were adjusted to 45, 40, and 175 sccm, respectively, by the mass flow controllers 456, 457, and 458. The pressure inside the i-layer deposition chamber 418 was set to 5 mTorr by adjusting the opening ratio of a conductance valve (not shown). Then, an RF power of 0.60 W/cm$^3$ was applied to the bias bar 428 by the RF power supply 424. The power of the MW power supply (not shown) was set to 0.25 W/cm$^3$ and introduced into the i-layer deposition chamber 418 through the wave guide 426 and the microwave entrance window 425 to excite a glow discharge. The shutter 427 was then opened, and depositing the MW i-layer 114 onto the n/i buffer layer 151 was started. When the thickness of the deposited MW i-layer 114 reached 0.15 μm, the MW glow discharge was stopped, and the RF power supply 424 was shut off. The deposition of the MW i-layer 114 was finished. The valves 451 and 452 were closed to stop the supply of $SiH_4$ and $GeH_4$ to the i-layer deposition chamber 418, whereas $H_2$ was fed further for two minutes into the i-layer deposition chamber 418. Then, the valves 453 and 450 were closed, and the inside of the i-layer deposition chamber 418 as well as the inside of the gas lines was evacuated down to $1\times10^{-5}$ Torr.

A p/i buffer layer 161 of a-Si was then deposited by means of RFPCVD as described below.

To deposit the p/i buffer layer 161, the substrate 490 was heated by the substrate heater 411 up to 250° C. When the substrate had been heated enough, the valves 464, 454, 450, 463, and 453 were opened gradually to supply $Si_2H_6$ and $H_2$ to the i-layer deposition chamber 418 via the gas inlet 449. The flow rates of $Si_2H_6$ and $H_2$ were adjusted to 3 sccm and 80 sccm, respectively, by the mass flow controllers 459 and 458. The pressure inside the i-layer deposition chamber 418 was set to 0.7 Torr by adjusting the opening ratio of a conductance valve (not shown). Then, an RF power of 0.07 W/cm$^3$ was applied to the bias bar 428 by the RF power supply 424 to excite a glow discharge. The shutter 427 was then opened, and depositing the p/i buffer layer 161 on the MW i-layer was started. When the thickness of the deposited p/i buffer layer 161 reached 20 nm, the RF glow discharge was stopped, and the RF power supply 424 was shut off. The deposition of the p/i buffer layer 161 was finished. The valves 464 and 454 were closed to stop the supply of $Si_2H_6$ to the i-layer deposition chamber 418, whereas $H_2$ was fed further for two minutes into the i-layer deposition chamber 418. Then, the valves 453 and 450 were closed, and the inside of the i-layer deposition chamber 418 as well as the inside of the gas lines was evacuated down to $1\times10^{-5}$ Torr.

The substrate was then subjected to plasma treatment with hydrogen gas containing a small amount of silane-based gas under the conditions shown in Table F2(1), according to the present invention.

In this plasma treatment with hydrogen gas containing the small amount of silane-based gas according to the present invention, $Si_2H_6$ serving as silicon compound gas and $H_2$ were introduced into the deposition chamber 418 via the gas inlet 449. The $H_2$ gas was supplied by opening the valves 463, 453, 450 and its flow rate was adjusted to 1000 sccm by means of the mass flow controller 458. The silicon compound gas was supplied by opening the valves 464 and 454 and its flow rate was controlled by the mass flow controller 459 such that the flow rate of the $Si_2H_6$ gas was maintained at 0.05% of the total gas flow rate of $H_2$. Furthermore, the pressure inside the deposition chamber 418 was adjusted to 0.012 Torr by means of a conductance valve (not shown). The substrate 490 was heated by the substrate heater 411 up to 250° C. When the temperature of the substrate had become stable, a VHF power of 0.08 W/cm$^3$ was applied to the bias bar 428 by the VHF power supply (not shown) so that a glow discharge occurs in the deposition chamber 418. The shutter 427 was then opened, and under the above-described conditions, the substrate was exposed for four minutes to the hydrogen gas plasma containing the small amount of silane-based gas according to the present invention. The VHF power was then shut off to stop the glow discharge. The supply of the $Si_2H_6$ gas into the deposition chamber 418 was stopped, whereas the $H_2$ gas was fed further for four minutes into the deposition chamber 418. Then, the $H_2$ gas was also shut off, and the inside of the deposition chamber 418 as well as the inside of the gas lines was evacuated down to $1\times10^{-5}$ Torr.

To deposit an RF p-layer 105 of a-SiC, the gate valve 408 was opened, and the substrate 490 was transferred to the p-layer deposition chamber 419 via the transfer chamber 404, both deposition chamber 419 and transfer chamber 404 having been evacuated with a vacuum pump (not shown). The substrate 490 was placed so as to contact with the heater 412 at its rear surface, and heated. The inside of the p-layer deposition chamber 419 was evacuated with the vacuum pump (not shown) down to a pressure of about $1\times10^{-5}$ Torr.

The substrate 490 was heated by the substrate heater 412 up to 250° C. When the temperature of the substrate had become stable, the valves 481, 471, 470, 482, 472, 483, 473, 484, and 474 were opened to supply $H_2$ gas, $SiH_4/H_2$ gas, $B_2H_6/H_2$ gas, and $CH_4$ gas to the deposition chamber 419 via the gas inlet 469. The flow rates of the $H_2$, $SiH_4/H_2$, $B_2H_6/H_2$, and $CH_4$, were adjusted to 60 sccm, 2 sccm, 10 sccm, and 0.3 sccm, respectively, by the mass flow controllers 476, 477, 478, and 479. The pressure inside the chamber 419 was set to 1.7 Torr by adjusting the opening ratio of a conductance valve (not shown). An RF power of 0.07 W/cm$^3$ was applied by the RF power supply 423 to the plasma excitation cup 421 to activate a glow discharge, and deposition of the RF p-layer 105 on the p/i buffer layer 161 was started. When the thickness of the deposited RF p-layer 105 reached 10 nm, the RF power was shut off to stop the glow discharge. The deposition of the RF p-layer 105 was finished. The valves 472, 482, 473, 483, 474, and 484 were closed to stop the supply of $SiH_4/H_2$, $B_2H_6/H_2$, and $CH_4$ to the p-layer deposition chamber 419, whereas $H_2$ was fed further for three minutes into the p-layer deposition chamber 419. Then, the valves 471, 481, and 470 were closed, and the inside of the p-layer deposition chamber 419 as well as the inside of the gas lines was evacuated down to $1\times10^{-5}$ Torr.

Next, an RF n-layer 203 of μc-Si was deposited. The gate valves 408 and 407 were opened, and the substrate 490 was transferred to the deposition chamber 417 through the transfer chamber 403 which had been evacuated with a vacuum pump (not shown) and the transfer chamber 402. The substrate 490 was placed so as to contact with the heater 410 at its rear surface, and heated. The inside of the deposition chamber 419 was evacuated with the vacuum pump (not shown) down to a pressure of about $1\times10^{-5}$ Torr.

To deposit the RF n-layer 203 of μc-Si, $H_2$ gas was introduced into the deposition chamber 417 via the gas inlet 429. The $H_2$ gas was supplied by opening the valves 441, 431, 430 and its flow rate was adjusted to 200 sccm by means of the mass flow controller 436. Furthermore, the pressure inside the deposition chamber 417 was adjusted to 1.1 Torr by means of the conductance valve (not shown). The substrate 490 was heated by the substrate heater 410 up to 250° C. When the temperature of the substrate had become stable, the valves 443, 433, 444, and 434 were opened to introduce $SiH_4$ gas and $PH_3/H_2$ gas into the deposition chamber 417 via the gas inlet 429. The flow rates of $SiH_4$, $H_2$, and $PH_3/H_2$ were adjusted to 2 sccm, 75 sccm, and 250 sccm, respectively, by the mass flow controllers 438, 436, and 439. The pressure inside the deposition chamber 417 was adjusted to 1.1 Torr. An RF power of the RF power supply 422 was set to 0.04 W/cm$^3$ and applied to the plasma excitation cup 420 to activate a glow discharge. The deposition of the RF n-layer 203 on the RF p-layer 105 was started. When the thickness of the deposited RF n-layer 203 reached 10 nm, the RF power was shut off to stop the glow discharge. The deposition of the RF n-layer 203 was finished. The supply of $SiH_4$ and $PH_3/H_2$ into the deposition chamber 417 was stopped, whereas $H_2$ was fed further for two minutes into the deposition chamber 417. Then, $H_2$ was also shut off, and the inside of the deposition chamber 417 as well as the inside of the gas lines was evacuated down to $1\times10^{-5}$ Torr.

An n/i buffer layer 251 of a-Si was then deposited by means of RFPCVD as described below.

The gate valve 407 was opened, and the substrate 490 was transferred to the i-layer deposition chamber 418 via the transfer chamber 403, both deposition chamber 418 and transfer chamber 403 having been evacuated with a vacuum pump (not shown). The substrate 490 was placed so as to contact with the heater 411 at its rear surface, and heated. The inside of the i-layer deposition chamber 418 was evacuated with the vacuum pump (not shown) down to a pressure of about $1\times10^{-5}$ Torr.

To deposit the n/i buffer layer 251, the substrate 490 was heated by the substrate heater 411 up to 250° C. When the substrate had been heated enough, the valves 464, 454, 450, 463, 453, 465, and 455 were opened gradually to supply $Si_2H_6$, $H_2$, and $CH_4$ to the i-layer deposition chamber 418 via the gas inlet 449. The flow rates of $Si_2H_6$, $H_2$, and $CH_4$ were adjusted to 0.4, 85, and 0.2 sccm, respectively, by the mass flow controllers 459, 458, and 460. The pressure inside the i-layer deposition chamber 418 was set to 1.1 Torr by adjusting the opening ratio of a conductance valve (not shown). Then, an RF power of 0.06 W/cm$^3$ was applied to the bias bar 428 by the RF power supply 424 to excite a glow discharge. The shutter 427 was then opened, and depositing the n/i buffer layer 251 on the RF n-layer 203 was started. When the thickness of the deposited n/i buffer layer 251 reached 10 nm, the RF glow discharge was stopped, and the RF power supply 424 was shut off. The deposition of the n/i buffer layer 251 was finished. The valves 464, 454, 465, and 455 were closed to stop the supply of $Si_2H_6$ and $CH_4$ to the i-layer deposition chamber 418, whereas $H_2$ was fed further for two minutes into the i-layer deposition chamber 418. Then, the valves 453 and 450 were closed, and the inside of the i-layer deposition chamber 418 as well as the inside of the gas lines was evacuated down to $1\times10^{-5}$ Torr.

An RF i-layer 214 of a-Si was then deposited by means of RFPCVD as described below.

To deposit the RF i-layer, the substrate 490 was heated by the substrate heater 411 up to 200° C. When the substrate had been heated enough, the valves 464, 454, 450, 463, and 453 were opened gradually to supply $Si_2H_6$ and $H_2$ to the i-layer deposition chamber 418 via the gas inlet 449. The flow rates of $Si_2H_6$ and $H_2$ were adjusted to 3 sccm and 75 sccm, respectively, by the mass flow controllers 459 and 458. The pressure inside the i-layer deposition chamber 418 was set to 0.5 Torr by adjusting the opening ratio of a conductance valve (not shown). Then, an RF power of 0.07 $W/cm^3$ was applied to the bias bar 428 by the RF power supply 424 to excite a glow discharge. The shutter 427 was then opened, and depositing the RF i-layer 214 on the n/i buffer layer was started. When the thickness of the deposited RF i-layer reached 110 nm, the RF glow discharge was stopped, and the RF power supply 424 was shut off. The deposition of the RF i-layer 214 was finished. The valves 464 and 454 were closed to stop the supply of $Si_2H_6$ to the i-layer deposition chamber 418, whereas $H_2$ was fed further for two minutes into the i-layer deposition chamber 418. Then, the valves 453 and 450 were closed, and the inside of the i-layer deposition chamber 418 as well as the inside of the gas lines was evacuated down to $1\times10^{-5}$ Torr.

A p/i buffer layer 261 of a-SiC was then deposited by means of RFPCVD as described below.

To deposit the p/i buffer layer 261, the substrate 490 was heated by the substrate heater 411 up to 200° C. When the substrate had been heated enough, the valves 464, 454, 450, 463, 453, 465, and 455 were opened gradually to supply $Si_2H_6$, $H_2$, and $CH_4$ to the i-layer deposition chamber 418 via the gas inlet 449. The flow rates of $Si_2H_6$, $H_2$, and $CH_4$ were adjusted to 0.4, 65, and 0.3 sccm, respectively, by the mass flow controllers 459, 458, and 460. The pressure inside the i-layer deposition chamber 418 was set to 1.1 Torr by adjusting the opening ratio of a conductance valve (not shown). Then, an RF power of 0.06 $W/cm^3$ was applied to the bias bar 428 by the RF power supply 424 to excite a glow discharge. The shutter 427 was then opened, and depositing the p/i buffer layer 261 on the RF i-layer 214 was started. When the thickness of the deposited p/i buffer layer 261 reached 15 nm, the RF glow discharge was stopped, and the RF power supply 424 was shut off. The deposition of the p/i buffer layer 261 was finished. The valves 464, 454, 465, and 455 were closed to stop the supply of $Si_2H_6$ and $CH_4$ to the i-layer deposition chamber 418, whereas $H_2$ was fed further for two minutes into the i-layer deposition chamber 418. Then, the valves 453 and 450 were closed, and the inside of the i-layer deposition chamber 418 as well as the inside of the gas lines was evacuated down to $1\times10^{-5}$ Torr.

The substrate was then subjected to plasma treatment with hydrogen gas containing a small amount of silane-based gas under the conditions shown in Table F2(2), according to the present invention.

In this plasma treatment with hydrogen gas containing the small amount of silane-based gas according to the present invention, $SiH_4$ serving as silicon compound gas and $H_2$ were introduced into the deposition chamber 418 via the gas inlet 449. The $H_2$ gas was supplied by opening the valves 463, 453, 450 and its flow rate was adjusted to 1300 sccm by means of the mass flow controller 458. The silicon compound gas was supplied by opening the valves 461 and 451 and its flow rate was controlled by the mass flow controller 456 such that the flow rate of the $SiH_4$ gas was maintained at 0.03% of the total gas flow rate of $H_2$. Furthermore, the pressure inside the deposition chamber 418 was adjusted to 0.6 Torr by means of a conductance valve (not shown). The substrate 490 was heated by the substrate heater 411 up to 200° C. When the temperature of the substrate had become stable, an RF power of 0.02 $W/cm^3$ was applied to the bias bar 428 by the RF power supply 424 so that a glow discharge occurs in the deposition chamber 418. The shutter 427 was then opened, and under the above-described conditions, the substrate was exposed for 3 minutes to the hydrogen gas plasma containing the small amount of silane-based gas according to the present invention. The RF power was then shut off to stop the glow discharge. The supply of the $SiH_4$ gas into the deposition chamber 418 was stopped, whereas the $H_2$ gas was fed further for 3 minutes into the deposition chamber 418. Then, the $H_2$ gas was also shut off, and the inside of the deposition chamber 418 as well as the inside of the gas lines was evacuated down to $1\times10^{-5}$ Torr.

To deposit the RF p-layer 205 of a-SiC, the gate valve 408 was opened, and the substrate 490 was transferred to the p-layer deposition chamber 419 via the transfer chamber 404, both deposition chamber 419 and transfer chamber 404 having been evacuated with a vacuum pump (not shown). The substrate 490 was placed so as to contact with the heater 412 at its rear surface, and heated. The inside of the p-layer deposition chamber 419 was evacuated with the vacuum pump (not shown) down to a pressure of about $1\times10^{-5}$ Torr.

The substrate 490 was heated by the substrate heater 412 up to 170° C. When the temperature of the substrate had become stable, the valves 481, 471, 470, 482, 472, 483, 473, 484, and 474 were opened to supply $H_2$ gas, $SiH_4/H_2$ gas, $B_2H_6/H_2$ gas, and $CH_4$ gas to the deposition chamber 419 via the gas inlet 469. The flow rates of the $H_2$, $SiH_4/H_2$, $B_2H_6/H_2$, and $CH_4$, were adjusted to 70 sccm, 2 sccm, 10 sccm, and 0.3 sccm, respectively, by the mass flow controllers 476, 477, 478, and 479. The pressure inside the chamber 419 was set to 1.7 Torr by adjusting the opening ratio of a conductance valve (not shown). An RF power of 0.07 $W/cm^3$ was applied by the RF power 423 to the plasma excitation cup 421 to activate a glow discharge, and deposition of the RF p-layer 205 on the p/i buffer layer 261 was started. When the thickness of the deposited RF p-layer 205 reached 10 nm, the RF power was shut off to stop the glow discharge. The deposition of the RF p-layer 205 was finished. The valves 472, 482, 473, 483, 474, and 484 were closed to stop the supply of $SiH_4/H_2$, $B_2H_6/H_2$, and $CH_4$ to the p-layer deposition chamber 419, whereas $H_2$ was fed further for two minutes into the p-layer deposition chamber 419. Then, the valves 471, 481, and 470 were closed, and the inside of the p-layer deposition chamber 419 as well as the inside of the gas lines was evacuated down to $1\times10^{-5}$ Torr.

The gate valve 409 was then opened, and the substrate 490 was transferred to the unload chamber 405 which had already been evacuated with a vacuum pump (not shown). Then, a leak valve (not shown) was opened so that the inside of the unload chamber 405 was exposed to the ambient atmosphere.

ITO was then evaporated onto the RF p-layer 205 so as to form a transparent conductive layer 112 having a thickness of 70 nm.

A mask having a comb-shaped window was placed on the transparent conductive layer 112, and metal evaporation was performed via the mask to form a comb-shaped collection electrode 113 having a multi-layer structure consisting of Cr (40 nm), Ag (1000 nm), and Cr (40 nm).

In this way, the complete solar cell according to the invention was obtained. Hereinafter, the solar cell of this type will be referred to as SC-EMB-F2. Tables F2(1) through F2(3) indicate the conditions used here in the invention, regarding the plasma treatment with hydrogen containing a small amount of silane-based gas as well as the process conditions for the RF n-layer, n/i buffer layer, MW i-layer, p/i buffer layer, RF p-layer, RF n-layer, n/i buffer layer, RF i-layer, p/i buffer layer, and RF p-layer.

COMPARATIVE EXAMPLE F2

For the sake of comparison, a solar cell (SC-CMP-F2) was also fabricated in the same manner as in the above-described example F2 except that the plasma treatment with hydrogen gas containing a small amount of silane-based gas according to the invention was not performed.

Seven samples of solar cells were prepared for each type (SC-EMB-F2 and SC-CMP-F2) for the purpose of evaluation regarding the initial photoelectric conversion efficiency (the ratio of the electric output power to the optical input power), vibration durability and optical durability under a biased condition at high temperature with high humidity, and vibration durability and optical durability under a non-biased condition.

The measurement of the initial photoelectric conversion efficiency was performed by measuring the V-I characteristics of the samples under the illumination condition of AM 1.5 (100 mW/cm$^2$). The measurement revealed that the SC-EMB-F2 samples had a smaller variation in the initial photoelectric conversion efficiencies than the SC-CMP-F2 samples and had a larger fill factor (F.F.) as shown below:

| | [Fill factor (F.F.)] | [Variation] |
|---|---|---|
| SC-EMB-F2 | 1.14<br>(relative to that of SC-CMP-F2) | 0.83 |

The vibration durability test under the non-biased condition was performed as follows: After the measurement of the initial photoelectric conversion efficiency, some samples were placed in a dark place kept at 28° C. with a relative humidity of 53%. Vibration having an amplitude of 0.1 mm and a frequency of 60 Hz was applied to the samples for 500 hr. Then, the photoelectric conversion efficiencies of the samples were measured under the illumination condition of AM 1.5 (100 mW/cm$^2$) and the reduction relative to the initial value (the ratio of the photoelectric conversion efficiency after the vibration test to the initial value) was evaluated for each sample. The SC-CMP-F2 samples showed a greater reduction in the photoelectric conversion efficiency compared with the SC-EMB-F2 samples as shown below.

The optical durability test under the non-biased condition was performed as follows: After the measurement of the initial photoelectric conversion efficiency, some samples were placed in a dark place kept at 28° C. with a relative humidity of 53%. Light having a power of AM 1.5 (100 mW/cm$^2$) was applied to the samples for 500 hours, and then the photoelectric conversion efficiencies of the samples were measured under the illumination condition of AM 1.5 (100 mW/cm$^2$). The reduction relative to the initial value (the ratio of the photoelectric conversion efficiency after the optical durability test to the initial value) was evaluated for each sample. The SC-CMP-F2 samples showed a greater reduction in the photoelectric conversion efficiency compared with the SC-EMB-F2 samples as shown below.

| | [Vibration durability] | [Optical durability] |
|---|---|---|
| SC-CMP-F2 | 0.83<br>(relative to those of SC-EMB-F2) | 0.82 |

The evaluation of the vibration durability and optical durability under the biased condition at high temperature with high humidity was performed as follows: After the measurement of the initial photoelectric conversion efficiency, some samples were placed in a dark place kept at 81° C. with a relative humidity of 89%, and a forward bias voltage of 0.7 V was applied to the samples. The vibration described above was applied to some of the samples and light having a power of AM 1.5 was applied to the other samples under the same conditions as those in the non-biased vibration test. The photoelectric conversion efficiencies of the samples were measured under the illumination condition of AM 1.5 (100 mW/cm$^2$). The SC-CMP-F2 samples also showed a greater reduction in the photoelectric conversion efficiency compared with the SC-EMB-F2 samples after the vibration and optical durability tests as shown below.

| | Under the biased condition: | |
|---|---|---|
| | [Vibration durability] | [Optical durability] |
| SC-CMP-F2 | 0.81<br>(relative to that of SC-EMB-F2) | 0.80 |

The surfaces of the samples were observed using an optical microscope to evaluate film separation. No film separation was observed in the SC-EMB-F2 samples, whereas slight film separation was observed in the SC-CMP-F2 samples.

From the above results, it can be concluded that the solar cells (SC-EMB-F2) according to the present invention are better than the conventional solar cells (SC-CMP-F2) in optical durability, adhesion, overall durability, fill factor (F.F.) and uniformity of the photoelectric conversion efficiency.

EXAMPLE F3 ACCORDING TO THE INVENTION

A triple solar cell having a structure illustrated in FIG. 6 was made using the deposition equipment shown in FIG. 7.

In the same way as for example F1, a substrate 490 on which the optical reflection layer 101 and the reflection enhancing layer 102 had been formed in the same was as for example F1 was placed on the substrate transfer rail 413 in the load chamber 401, and the load chamber 401 was evacuated with a vacuum pump (not shown) down to a pressure of about 1×10$^{-5}$ Torr. Then, the gate valve 406 was opened, and the substrate 490 was transferred to the deposition chamber 417 via the transfer chamber 402, both deposition chamber 417 and transfer chamber 402 having been evacuated with a vacuum pump (not shown). The substrate 490 was placed so as to contact with the heater 410 at its rear surface, and heated. The inside of the deposition chamber 417 was evacuated with the vacuum pump (not shown) down to a pressure of about 1×10$^{-5}$ Torr.

In this way, semiconductor film deposition was prepared, and an RF n-layer 103 of μc-Si was then deposited in the same way as for example F2.

The gate valve 406 was opened, and the substrate 490 was transferred to the deposition chamber 418 via the transfer chamber 403, both deposition chamber 418 and transfer chamber 403 having been evacuated with a vacuum pump (not shown). The substrate 490 was placed so as to contact with the heater 411 at its rear surface, and heated. The inside of the deposition chamber 418 was evacuated with the vacuum pump (not shown) down to a pressure of about $1\times10^{-5}$ Torr.

An n/i buffer layer 151 of a-Si, an MW i-layer 114 of a-SiGe, and a p/i buffer layer 161 of a-Si were then deposited by means of RFPCVD, MWPCVD, and RFPCVD in the same way as for example F2.

The substrate was then subjected to plasma treatment with hydrogen gas containing a small amount of silane-based gas under the conditions shown in Table F3(1), according to the present invention.

In this plasma treatment with hydrogen gas containing the small amount of silane-based gas according to the present invention, $SiCl_2H_2$/He (diluted to 1000 ppm) serving as silicon compound gas and $H_2$ were introduced into the deposition chamber 418 via the gas inlet 449. The $H_2$ gas was supplied by opening the valves 463, 453, 450 and its flow rate was adjusted to 950 sccm by means of the mass flow controller 458. The silicon compound gas was supplied by opening the valve and its flow rate was controlled by the mass flow controller such that the flow rate of the $SiCl_2H_2$ gas was maintained at 0.03% of the total gas flow rate of $H_2$. Furthermore, the pressure inside the deposition chamber 418 was adjusted to 0.008 Torr by means of a conductance valve (not shown). The substrate 490 was heated by the substrate heater 411 up to 330° C. When the temperature of the substrate had become stable, a MW power of 0.12 W/cm$^3$ was applied to the i-layer deposition chamber 418 through the wave guide 426 and the microwave entrance window 425 by the MW power supply (not shown) so that a glow discharge occurs in the deposition chamber 418. The shutter 427 was opened, and the substrate was exposed for four minutes to the hydrogen gas plasma containing the small amount of silane-based gas according to the present invention. The MW power was then shut off to stop the glow discharge. The supply of the $SiCl_2H_2$/He (diluted to 1000 ppm) gas into the deposition chamber 418 was stopped, whereas the $H_2$ gas was fed further for four minutes into the deposition chamber 418. Then, the $H_2$ gas was also shut off, and the inside of the deposition chamber 418 as well as the inside of the gas lines was evacuated down to $1\times10^{-5}$ Torr.

Next, in the same way as for example F2, an RF p-layer 105 of a-SiC, an RF n-layer 203 of μc-Si, an n/i buffer layer 251 of a-Si, an MW i-layer 214 of a-SiGe, and a p/i buffer layer 261 of a-Si were deposited by means of RFPCVD or MWPCVD in that order.

The substrate was then subjected to plasma treatment with hydrogen gas containing a small amount of silane-based gas under the conditions shown in Table F3(2), according to the present invention.

In this plasma treatment with hydrogen gas containing the small amount of silane-based gas according to the present invention, $SiH_4/H_2$ (diluted to 1000 ppm) serving as silicon compound gas and $H_2$ were introduced into the deposition chamber 418 via the gas inlet 449. The $H_2$ gas was supplied by opening the valves 463, 453, 450 and its flow rate was adjusted to 1200 sccm by means of the mass flow controller 458. The silicon compound gas was supplied by opening the valve and its flow rate was controlled by the mass flow controller such that the flow rate of the $SiH_4$ gas was maintained at 0.03% of the total gas flow rate of $H_2$. Furthermore, the pressure inside the deposition chamber 418 was adjusted to 0.7 Torr by means of a conductance valve (not shown). The substrate 490 was heated by the substrate heater 411 up to 280° C. When the temperature of the substrate had become stable, a RF power of 0.03 W/cm$^3$ was applied to the bias bar 428 by the RF power supply 424 so that a glow discharge occurs in the deposition chamber 418. The shutter 427 was then opened, and under the above-described conditions, the substrate was exposed for three minutes to the hydrogen gas plasma containing the small amount of silane-based gas according to the present invention. The RF power was then shut off to stop the glow discharge. The supply of the $SiH_4/H_2$ (diluted to 1000 ppm) gas into the deposition chamber 418 was stopped, whereas the $H_2$ gas was fed further for three minutes into the deposition chamber 418. Then, the $H_2$ gas was also shut off, and the inside of the deposition chamber 418 as well as the inside of the gas lines was evacuated down to $1\times10^{-5}$ Torr.

Next, in the same way as for example F2, an RF p-layer 205 of a-SiC, an RF n-layer 303 of μc-Si, an n/i buffer layer 351 of a-SiC, and an RF i-layer 314 of a-Si, and a p/i buffer layer 361 of a-Si, were deposited in that order by means of RFPCVD.

The substrate was then subjected to plasma treatment with hydrogen gas containing a small amount of silane-based gas under the conditions shown in Table F3(3), according to the present invention.

In this plasma treatment with hydrogen gas containing the small amount of silane-based gas according to the present invention, $SiH_4/H_2$ (diluted to 1000 ppm) serving as silicon compound gas and $H_2$ were introduced into the deposition chamber 418 via the gas inlet 449. The $H_2$ gas was supplied by opening the valves 463, 453, 450 and its flow rate was adjusted to 900 sccm by means of the mass flow controller 458. The silicon compound gas was supplied by opening the valve and its flow rate was controlled by the mass flow controller such that the flow rate of the $SiH_4$ gas was maintained at 0.03% of the total gas flow rate of $H_2$. Furthermore, the pressure inside the deposition chamber 418 was adjusted to 0.6 Torr by means of a conductance valve (not shown). The substrate 490 was heated by the substrate heater 411 up to 200° C. When the temperature of the substrate had become stable, a RF power of 0.03 W/cm$^3$ was applied to the bias bar 428 by the RF power supply 424 so that a glow discharge occurs in the deposition chamber 418. The shutter 427 was then opened, and under the above-described conditions, the substrate was exposed for three minutes to the hydrogen gas plasma containing the small amount of silane-based gas according to the present invention. The RF power was then shut off to stop the glow discharge. The supply of the $SiH_4/H_2$ (diluted to 1000 ppm) gas into the deposition chamber 418 was stopped, whereas the $H_2$ gas was fed further for three minutes into the deposition chamber 418. Then, the $H_2$ gas was also shut off, and the inside of the deposition chamber 418 as well as the inside of the gas lines was evacuated down to $1\times10^{-5}$ Torr.

Next, in the same way as for example F2, an RF p-layer 305 of a-SiC was deposited by means of RFPCVD.

ITO was then evaporated onto the RF p-layer 305 so as to form a transparent conductive layer 112 having a thickness of 70 nm.

A mask having a comb-shaped window was placed on the transparent conductive layer 112, and metal evaporation was performed via the mask to form a comb-shaped collection electrode 113 having a multi-layer structure consisting of Cr (40 nm), Ag (1000 nm), and Cr (40 nm).

In this way, the complete solar cell according to the invention was obtained. Hereinafter, the solar cell of this type will be referred to as SC-EMB-F3. Tables F3(1) through F3(4) indicate the conditions used here in the invention, regarding the plasma treatment with hydrogen containing a small amount of silane-based gas as well as the process conditions for the RF n-layer, n/i buffer layer, MW i-layer, p/i buffer layer, RF p-layer, RF n-layer, n/i buffer layer, MW i-layer, p/i buffer layer, RF p-layer, RF n-layer, n/i buffer layer, RF i-layer, p/i buffer layer, and RF p-layer.

COMPARATIVE EXAMPLE F3

For the sake of comparison, a solar cell (SC-CMP-F3) was also fabricated in the same manner as in the above-described example F3 except that the plasma treatment with hydrogen gas containing a small amount of silane-based gas according to the invention was not performed.

Seven samples of solar cells were prepared for each type (SC-EMB-F3 and SC-CMP-F3) for the purpose of evaluation regarding the initial photoelectric conversion efficiency (the ratio of the electric output power to the optical input power), vibration durability and optical durability under a biased condition at high temperature with high humidity, vibration durability and optical durability under a non-biased condition, and characteristics with a reverse bias voltage applied.

The measurement of the initial photoelectric conversion efficiency was performed by measuring the V-I characteristics of the samples under the illumination condition of AM 1.5 (100 mW/cm$^2$). The measurement revealed that the SC-EMB-F3 samples had a smaller variation in the initial photoelectric conversion efficiencies than the SC-CMP-F3 samples and had a larger fill factor (F.F.) as shown below:

| | [Fill factor (F.F.)] | [Variation] |
|---|---|---|
| SC-EMB-F3 | 1.15 | 0.82 |
| | (relative to that of SC-CMP-F3) | |

The evaluation of the vibration durability under the non-biased condition was performed as follows: After the measurement of the initial photoelectric conversion efficiency, some samples were placed in a dark place kept at 26° C. with a relative humidity of 53%. Vibration having an amplitude of 0.1 mm and a frequency of 60 Hz was applied to the samples for 500 hr. Then, the photoelectric conversion efficiencies of the samples were measured under the illumination condition of AM 1.5 (100 mW/cm$^2$) and the reduction relative to the initial value (the ratio of the photoelectric conversion efficiency after the vibration test to the initial value) was evaluated for each sample. The SC-CMP-F3 samples showed a greater reduction in the photoelectric conversion efficiency compared with the SC-EMB-F3 samples as shown below.

The evaluation of the optical durability under the non-biased condition was performed as follows: After the measurement of the initial photoelectric conversion efficiency, some samples were placed in a dark place kept at 26° C. with a relative humidity of 53%. Light having a power of AM 1.5 (100 mW/cm$^2$) was applied to the samples for 500 hours, and then the photoelectric conversion efficiencies of the samples were measured under the illumination condition of AM 1.5 (100 mW/cm$^2$). The reduction relative to the initial value (the ratio of the photoelectric conversion efficiency after the optical durability test to the initial value) was evaluated for each sample. The SC-CMP-F3 samples showed a greater reduction in the photoelectric conversion efficiency compared with the SC-EMB-F3 samples as shown below.

| | [Vibration durability] | [Optical durability] |
|---|---|---|
| SC-CMP-F3 | 0.83 | 0.82 |
| | (relative to those of SC-EMB-F3) | |

The evaluation of the vibration durability and optical durability under the biased condition at high temperature with high humidity was performed as follows: After the measurement of the initial photoelectric conversion efficiency, some samples were placed in a dark place kept at 82° C. with a relative humidity of 92%, and a forward bias voltage of 0.7 V was applied to the samples. The vibration described above was applied to some of the samples and light having a power of AM 1.5 was applied to the other samples under the same conditions as those in the non-biased vibration test. The photoelectric conversion efficiencies of the samples were measured under the illumination condition of AM 1.5 (100 mW/cm$^2$). The SC-CMP-F3 samples also showed a greater reduction in the photoelectric conversion efficiency compared with the SC-EMB-F3 samples after the vibration and optical durability tests as shown below. Under the biased condition:

| | [Vibration durability] | [Optical durability] |
|---|---|---|
| SC-CMP-F3 | 0.83 | 0.81 |
| | (relative to that of SC-EMB-F3) | |

The evaluation of the characteristics with a reverse bias voltage being applied was performed as follows: After the measurement of the initial photoelectric conversion efficiency, some samples were placed in a dark place kept at 80° C. with a relative humidity of 50%. A reverse bias voltage of 5.0 V was applied to the samples for 100 hours, and then the photoelectric conversion efficiencies of the samples were measured under the illumination condition of AM 1.5 (100 mW/cm$^2$). The reduction relative to the initial value (the ratio of the photoelectric conversion efficiency after the reverse bias voltage is applied to the initial value) was evaluated for each sample. The SC-CMP-F3 samples showed a greater reduction in the photoelectric conversion efficiency compared with the SC-EMB-F3 samples as shown below.

| | |
|---|---|
| SC-CMP-F3 | 0.87 |
| (relative to those of SC-EMB-F3) | |

The surfaces of the samples were observed using an optical microscope to evaluate film separation. No film separation was observed in the SC-EMB-F3 samples, whereas slight film separation was observed in the SC-CMP-F3 samples.

From the above results, it can be concluded that the solar cells (SC-EMB-F3) according to the present invention are better than the conventional solar cells (SC-CMP-F3) in optical durability, adhesion, overall durability, the fill factor (F.F.) of the photoelectric conversion efficiency, uniformity of the photoelectric conversion efficiency, and characteristics with a reverse bias voltage being applied of the photoelectric conversion efficiency

EXAMPLE F4 ACCORDING TO THE INVENTION

A solar cell having a triple structure illustrated in FIG. 6 was made using the deposition equipment shown in FIG. 7 in the same way as for example F3. Plasma treatment with hydrogen gas containing a small amount of silane-based gas was performed three times under the conditions shown in Table F4(1). Other fabrication conditions employed are shown in Table F4(2).

The fabricated samples are evaluated in a similar manner to that for the example F3, and the results are shown in Table F4(3).

As can be seen from Table F4(3), it is preferable that the flow rate of hydrogen gas in the plasma treatment with hydrogen containing a small amount of silane-based gas ranges from 1 to 2000 sccm to obtain an excellent fill factor (F.F.), uniformity, and characteristics with a reverse bias voltage being applied of the photoelectric conversion efficiency, optical durability, adhesion, and overall durability.

EXAMPLE F5 ACCORDING TO THE INVENTION

A solar cell having a triple structure illustrated in FIG. 6 was made using the deposition equipment shown in FIG. 7 in the same way as for example F3. Plasma treatment with hydrogen gas containing a small amount of silane-based gas was performed three times under the conditions shown in Table F5(1). Other fabrication conditions employed are shown in Table F5(2).

The fabricated samples are evaluated in a similar manner to that for the example F3, and the results are shown in Table F5(3).

In this example, VHF power was used to excite the plasma for the plasma treatment whereas RF power was used in the above example F4. As can be seen from Table F5(3), it is also preferable that the flow rate of hydrogen gas in the plasma treatment containing the small amount of silane-based gas ranges from 1 to 2000 sccm to obtain a good fill factor (F.F.), uniformity, and characteristics with a reverse bias voltage being applied of the photoelectric conversion efficiency, optical durability, adhesion, and overall durability.

EXAMPLE F6 ACCORDING TO THE INVENTION

A solar cell having a triple structure illustrated in FIG. 6 was made using the deposition equipment shown in FIG. 7 in the same way as for example F3. Plasma treatment with hydrogen gas containing a small amount of silane-based gas was performed three times under the conditions shown in Table F6(1). Other fabrication conditions employed are shown in Table F6(2).

The fabricated samples are evaluated in a similar manner to that for the example F3, and the results are shown in Table F6(3).

As can be seen from Table F6(3), it is preferable that the content of the silicon compound gas added to the hydrogen gas in the plasma treatment ranges from 0.001% to 0.1%. to obtain a good fill factor (F.F.), uniformity, and characteristics with a reverse bias voltage being applied of the photoelectric conversion efficiency, optical durability, adhesion, and overall durability.

EXAMPLE F7 ACCORDING TO THE INVENTION

A solar cell having a triple structure illustrated in FIG. 6 was made using the deposition equipment shown in FIG. 7 in the same way as for example F3. Plasma treatment with hydrogen gas containing a small amount of silane-based gas was performed three times under the conditions shown in Table F7(1). Other fabrication conditions employed are shown in Table F7(2).

The fabricated samples are evaluated in a similar manner to that for the example F3, and the results are shown in Table F7(3).

In this example, VHF power was used to excite the plasma for the plasma treatment, whereas RF power was used in the above example F6. As can be seen from Table F7(3), it is also preferable that the content of the silicon compound gas added to the hydrogen gas in the plasma treatment ranges from 0.001% to 0.1%. to obtain a good fill factor (F.F.), uniformity, and characteristics with a reverse bias voltage being applied of the photoelectric conversion efficiency, optical durability, adhesion, and overall durability.

EXAMPLE F8 ACCORDING TO THE INVENTION

A solar cell having a triple structure illustrated in FIG. 6 was made using the deposition equipment shown in FIG. 7 in the same way as for example F3. Plasma treatment with hydrogen gas containing a small amount of silane-based gas was performed three times under the conditions shown in Table F8(1). Other fabrication conditions employed are shown in Table F8(2).

The fabricated samples are evaluated in a similar manner to that for the example F3, and the results are shown in Table F8(3).

In this example, MW power was used to excite the plasma for the plasma treatment, whereas RF power was used in the above example F6. As can be seen from Table F8(3), it is also preferable that the content of the silicon compound gas added to the hydrogen gas in the plasma treatment ranges from 0.001% to 0.1%. to obtain a good fill factor (F.F.), uniformity, and characteristics with a reverse bias voltage being applied of the photoelectric conversion efficiency, optical durability, adhesion, and overall durability.

EXAMPLE F9 ACCORDING TO THE INVENTION

A solar cell having a triple structure illustrated in FIG. 6 was made using the deposition equipment shown in FIG. 7 in the same way as for example F3. Plasma treatment with hydrogen gas containing a small amount of silane-based gas was performed three times under the conditions shown in Table F9(1). Other fabrication conditions employed are shown in Table F9(2).

The fabricated samples are evaluated in a similar manner to that for the example F3, and the results are shown in Table F9(3).

As can be seen from Table F9(3), when an RF power is applied, it is preferable that the pressure in the plasma treatment with the hydrogen gas containing a small amount of silane-based gas ranges from 0.05 Torr to 10 Torr to obtain a good fill factor (F.F.), uniformity, and characteristics with a reverse bias voltage being applied of the photoelectric conversion efficiency, optical durability, adhesion, and overall durability.

EXAMPLE F10 ACCORDING TO THE INVENTION

A solar cell having a triple structure illustrated in FIG. 6 was made using the deposition equipment shown in FIG. 7 in the same way as for example F3. Plasma treatment with hydrogen gas containing a small amount of silane-based gas was performed three times under the conditions shown in Table F10(1). Other fabrication conditions employed are shown in Table F10(2).

The fabricated samples are evaluated in a similar manner to that for the example F3, and the results are shown in Table F10(3).

As can be seen from Table F10(3), when a VHF power is applied, it is preferable that the pressure in the plasma treatment with the hydrogen gas containing a small amount of silane-based gas ranges from 0.0001 Torr to 1 Torr to obtain a good fill factor (F.F.), uniformity, and characteristics with a reverse bias voltage being applied of the photoelectric conversion efficiency, optical durability, adhesion, and overall durability.

EXAMPLE F11 ACCORDING TO THE INVENTION

A solar cell having a triple structure illustrated in FIG. 6 was made using the deposition equipment shown in FIG. 7 in the same way as for example F3. Plasma treatment with hydrogen gas containing a small amount of silane-based gas was performed three times under the conditions shown in Table F11(1). Other fabrication conditions employed are shown in Table F11(2).

The fabricated samples are evaluated in a similar manner to that for the example F3, and the results are shown in Table F11(3).

As can be seen from Table F11(3), when an MW power is applied, it is preferable that the pressure in the plasma treatment with the hydrogen gas containing a small amount of silane-based gas ranges from 0.0001 Torr to 0.01 Torr to obtain a good fill factor (F.F.), uniformity, and characteristics with a reverse bias voltage being applied of the photoelectric conversion efficiency, optical durability, adhesion, and overall durability.

EXAMPLE F12 ACCORDING TO THE INVENTION

A solar cell having a triple structure illustrated in FIG. 6 was made using the deposition equipment shown in FIG. 7 in the same way as for example F3. Plasma treatment with hydrogen gas containing a small amount of silane-based gas was performed three times under the conditions shown in Table F12(1). Other fabrication conditions employed are shown in Table F12(2).

The fabricated samples are evaluated in a similar manner to that for the example F3, and the results are shown in Table F12(3).

As can be seen from Table F12(3), when RF power is used to excite the plasma, it is preferable that the applied power density (electric power) in the plasma treatment with the hydrogen gas containing a small amount of silane-based gas ranges from 0.01 W/cm$^3$ to 1.0 W/cm$^3$ to obtain a good fill factor (F.F.), uniformity, and characteristics with a reverse bias voltage being applied of the photoelectric conversion efficiency, optical durability, adhesion, and overall durability.

EXAMPLE F13 ACCORDING TO THE INVENTION

A solar cell having a triple structure illustrated in FIG. 6 was made using the deposition equipment shown in FIG. 7 in the same way as for example F3. Plasma treatment with hydrogen gas containing a small amount of silane-based gas was performed three times under the conditions shown in Table F13(1). Other fabrication conditions employed are shown in Table F13(2).

The fabricated samples are evaluated in a similar manner to that for the example F3, and the results are shown in Table F13(3).

As can be seen from Table F13(3), when a VHF power is used to excite the plasma, it is preferable that the applied power density (electric power) in the plasma treatment with the hydrogen gas containing a small amount of silane-based gas ranges from 0.01 W/cm$^3$ to 1.0 W/cm$^3$ to obtain a good fill factor (F.F.), uniformity, and characteristics with a reverse bias voltage being applied of the photoelectric conversion efficiency, optical durability, adhesion, and overall durability.

EXAMPLE F14 ACCORDING TO THE INVENTION

A solar cell having a triple structure illustrated in FIG. 6 was made using the deposition equipment shown in FIG. 7 in the same way as for example F3. Plasma treatment with hydrogen gas containing a small amount of silane-based gas was performed three times under the conditions shown in Table F14(1). Other fabrication conditions employed are shown in Table F14(2).

The fabricated samples are evaluated in a similar manner to that for the example F3, and the results are shown in Table F14(3).

As can be seen from Table F14(3), when a MW power is used to excite the plasma, it is preferable that the applied power density (electric power) in the plasma treatment with the hydrogen gas containing a small amount of silane-based gas ranges from 0.1 W/cm$^3$ to 10 W/cm$^3$ to obtain a good fill factor (F.F.) and uniformity of the photoelectric conversion efficiency, optical durability, adhesion, and overall durability.

EXAMPLE F15 ACCORDING TO THE INVENTION

A solar cell having a triple structure illustrated in FIG. 6 was made using the deposition equipment shown in FIG. 7 in the same way as for example F3. Plasma treatment with hydrogen gas containing a small amount of silane-based gas was performed three times under the conditions shown in Table F15(1). Other fabrication conditions employed are shown in Table F15(2).

The fabricated samples are evaluated in a similar manner to that for the example F3, and the results are shown in Table F15(3).

As can be seen from Table F15(3), when an RF power is used to excite the plasma, it is preferable that the substrate temperature in the plasma treatment with the hydrogen gas containing a small amount of silane-based gas ranges from 100° C. to 400° C. to obtain a good fill factor (F.F.), uniformity, and characteristics with a reverse bias voltage being applied of the photoelectric conversion efficiency, optical durability, adhesion, and overall durability.

EXAMPLE F16 ACCORDING TO THE INVENTION

A solar cell having a triple structure illustrated in FIG. 6 was made using the deposition equipment shown in FIG. 7 in the same way as for example F3. Plasma treatment with hydrogen gas containing a small amount of silane-based gas was performed three times under the conditions shown in Table F16(1). Other fabrication conditions employed are shown in Table F16(2).

The fabricated samples are evaluated in a similar manner to that for the example F3, and the results are shown in Table F16(3).

As can be seen from Table F16(3), when a VHF power is used to excite the plasma, it is preferable that the substrate temperature in the plasma treatment with the hydrogen gas containing a small amount of silane-based gas ranges from 50° C. to 300° C. to obtain a good fill factor (F.F.), uniformity, and characteristics with a reverse bias voltage being applied of the photoelectric conversion efficiency, optical durability, adhesion, and overall durability.

EXAMPLE F17 ACCORDING TO THE INVENTION

A solar cell having a triple structure illustrated in FIG. 6 was made using the deposition equipment shown in FIG. 7 in the same way as for example F3. Plasma treatment with hydrogen gas containing a small amount of silane-based gas was performed three times under the conditions shown in Table F17(1). Other fabrication conditions employed are shown in Table F17(2).

The fabricated samples are evaluated in a similar manner to that for the example F3, and the results are shown in Table F17(3).

As can be seen from Table F17(3), when an MW power is used to excite the plasma, it is preferable that the substrate temperature in the plasma treatment with the hydrogen gas containing a small amount of silane-based gas ranges from 50° C. to 300° C. to obtain a good fill factor (F.F.) and uniformity of the photoelectric conversion efficiency, optical durability, adhesion, and overall durability.

EXAMPLE F18 ACCORDING TO THE INVENTION

A solar cell having a triple structure illustrated in FIG. 3 was made using the deposition equipment shown in FIG. 7.

A substrate 490 on which the optical reflection layer 101 and the reflection enhancing layer 102 had been formed in the same was as for example F1 was placed on the substrate transfer rail 413 in the load chamber 401, and the load chamber 401 was evacuated with a vacuum pump (not shown) down to a pressure of about $1\times10^{-5}$ Torr. Then, the gate valve 406 was opened, and the substrate 490 was transferred to the deposition chamber 417 via the transfer chamber 402, both deposition chamber 417 and transfer chamber 402 having been evacuated with a vacuum pump (not shown). The substrate 490 was placed so as to contact with the heater 410 at its rear surface, and heated. The inside of the deposition chamber 417 was evacuated with the vacuum pump (not shown) down to a pressure of about $1\times10^{-5}$ Torr.

The substrate was then subjected to plasma treatment with hydrogen gas containing a small amount of silane-based gas under the conditions shown in Table F18(1).

In this plasma treatment with hydrogen gas containing the small amount of silane-based gas according to the present invention, SiH4/$H_2$ (diluted to 1000 ppm) serving as silicon compound gas and $H_2$ were introduced into the deposition chamber 417 via the gas inlet 429. The $H_2$ gas was supplied by opening the valves 441, 431, 430 and its flow rate was adjusted to 1200 sccm by means of the mass flow controller 436. The silicon compound gas was supplied by opening the valves 442 and 432, and its flow rate was controlled by the mass flow controller 437 such that the flow rate of the $SiH_4$ gas was maintained at 0.04% of the total gas flow rate of $H_2$. Furthermore, the pressure inside the deposition chamber 417 was adjusted to 0.9 Torr by means of a conductance valve (not shown). The substrate 490 was heated by the substrate heater 410 up to 360° C. When the temperature of the substrate had become stable, an RF power of 0.03 W/cm$^3$ was introduced by the RF power supply 422 so that a glow discharge occurs in the plasma excitation cup 420. Under the abovedescribed conditions, the substrate was exposed for three minutes to the hydrogen gas plasma containing the small amount of silane-based gas. The RF power was then shut off to stop the glow discharge. The supply of the $SiH_4/H_2$ (diluted to 1000 ppm) gas into the deposition chamber 417 was stopped, whereas the $H_2$ gas was fed further for five minutes into the deposition chamber 417. Then, the $H_2$ gas was also shut off, and the inside of the deposition chamber 417 as well as the inside of the gas lines was evacuated down to $1\times10^{-2}$ Torr.

In this way, semiconductor film deposition was prepared, and an RF n-layer 103 of μc-Si was then deposited in the same way as for example F2.

The substrate was then subjected to plasma treatment with hydrogen gas containing a small amount of silane-based gas under the conditions shown in Table F18(2).

In this plasma treatment with hydrogen gas containing the small amount of silane-based gas according to the present invention, $SiH_4/H_2$ (diluted to 1000 ppm) serving as silicon compound gas and $H_2$ were introduced into the deposition chamber 417 via the gas inlet 429. The $H_2$ gas was supplied by opening the valves 441, 431, 430 and its flow rate was adjusted to 950 sccm by means of the mass flow controller 436. The silicon compound gas was supplied by opening the valves 442 and 432, and its flow rate was controlled by the mass flow controller 437 such that the flow rate of the $SiH_4$ gas was maintained at 0.03% of the total gas flow rate of $H_2$. Furthermore, the pressure inside the deposition chamber 417 was adjusted to 0.9 Torr by means of a conductance valve (not shown). The substrate 490 was heated by the substrate heater 410 up to 350° C. When the temperature of the substrate had become stable, an RF power of 0.03 W/cm$^3$ was introduced by the RF power supply 422 so that a glow discharge occurs in the plasma excitation cup 420. Under the abovedescribed conditions, the substrate was exposed for three minutes to the hydrogen gas plasma containing the small amount of silane-based gas. The RF power was then shut off to stop the glow discharge. The supply of the $SiH_4/H_2$ (diluted to 1000 ppm) gas into the deposition chamber 417 was stopped, whereas the $H_2$ gas was fed further for five minutes into the deposition chamber 417. Then, the $H_2$ gas was also shut off, and the inside of the deposition chamber 417 as well as the inside of the gas lines was evacuated down to $1\times10^{-5}$ Torr.

The gate valve 407 was opened, and the substrate 490 was transferred to the deposition chamber 418 via the transfer chamber 403, both deposition chamber 418 and transfer chamber 403 having been evacuated with a vacuum pump (not shown). The substrate 490 was placed so as to contact with the heater 411 at its rear surface, and heated. The inside of the deposition chamber 418 was evacuated with the vacuum pump (not shown) down to a pressure of about $1\times10^{-5}$ Torr.

An n/i buffer layer 151 of a-SiC was then deposited by means of RFPCVD in the same way as for example F2.

The substrate was then subjected to plasma treatment with hydrogen gas containing a small amount of silane-based gas under the conditions shown in Table F18(3), according to the present invention.

In this plasma treatment with hydrogen gas containing the small amount of silane-based gas according to the present invention, $SiH_4$ serving as silicon compound gas and $H_2$ were introduced into the deposition chamber 418 via the gas inlet 449. The $H_2$ gas was supplied by opening the valves 463, 453, 450 and its flow rate was adjusted to 700 sccm by means of the mass flow controller 458. The silicon compound gas was supplied by opening the valves 461 and 451 and its flow rate was controlled by the mass flow controller 456 such that the flow rate of the $SiH_4$ gas was maintained at 0.03% of the total gas flow rate of $H_2$. Furthermore, the pressure inside the deposition chamber 418 was adjusted to 0.7 Torr by means of a conductance valve (not shown). The substrate 490 was heated by the substrate heater 411 up to 350° C. When the temperature of the substrate had become stable, an RF power of 0.03 W/cm$^3$ was applied to the bias bar 428 by the RF power supply 424 so that a glow discharge occurs in the deposition chamber 418. Under the above-described conditions, the substrate was exposed for 3 minutes to the hydrogen gas plasma containing the small amount of silane-based gas according to the present invention. The RF power was then shut off to stop the glow discharge. The supply of the $SiH_4$ gas into the deposition chamber 418 was stopped, whereas the $H_2$ gas was fed further for 3 minutes into the deposition chamber 418. Then, the $H_2$ gas was also shut off, and the inside of the deposition chamber 418 as well as the inside of the gas lines was evacuated down to $1\times10^{-2}$ Torr.

An MW i-layer 114 of a-SiGe was then deposited in the same way as for the example F2.

The substrate was then subjected to plasma treatment with hydrogen gas containing a small amount of silane-based gas under the conditions shown in Table F18(4).

In this plasma treatment with hydrogen gas containing the small amount of silane-based gas according to the present invention, $SiH_4$ serving as silicon compound gas and $H_2$ were introduced into the deposition chamber 418 via the gas inlet 449. The $H_2$ gas was supplied by opening the valves 463, 453, 450 and its flow rate was adjusted to 900 sccm by means of the mass flow controller 458. The silicon compound gas was supplied by opening the valves 461 and 451 and its flow rate was controlled by the mass flow controller 456 such that the flow rate of the $SiH_4$ gas was maintained at 0.03% of the total gas flow rate of $H_2$. Furthermore, the pressure inside the deposition chamber 418 was adjusted to 0.6 Torr by means of a conductance valve (not shown). The substrate 490 was heated by the substrate heater 411 up to 330° C. When the temperature of the substrate had become stable, an RF power of 0.03 W/cm$^3$ was applied to the bias bar 428 by the RF power supply 424 so that a glow discharge occurs in the deposition chamber 418. The shutter 427 was then opened, and under the above-described conditions, the substrate was exposed for 3 minutes to the hydrogen gas plasma containing the small amount of silane-based gas according to the present invention. The RF power was then shut off to stop the glow discharge. The supply of the $SiH_4$ gas into the deposition chamber 418 was stopped, whereas the $H_2$ gas was fed further for 3 minutes into the deposition chamber 418. Then, the $H_2$ gas was also shut off, and the inside of the deposition chamber 418 as well as the inside of the gas lines was evacuated down to $1\times10^{-5}$ Torr.

A p/i buffer layer 161 of a-SiC was then deposited in the same way as for the example F2 by means of RFPCVD.

The substrate was then subjected to plasma treatment with hydrogen gas containing a small amount of silane-based gas under the conditions shown in Table F18(5).

In this plasma treatment with hydrogen gas containing the small amount of silane-based gas according to the present invention, $SiH_4$ serving as silicon compound gas and $H_2$ were introduced into the deposition chamber 418 via the gas inlet 449. The $H_2$ gas was supplied by opening the valves 463, 453, 450 and its flow rate was adjusted to 1000 sccm by means of the mass flow controller 458. The silicon compound gas was supplied by opening the valves 461 and 451 and its flow rate was controlled by the mass flow controller 456 such that the flow rate of the $SiH_4$ gas was maintained at 0.03% of the total gas flow rate of $H_2$. Furthermore, the pressure inside the deposition chamber 418 was adjusted to 0.6 Torr by means of a conductance valve (not shown). The substrate 490 was heated by the substrate heater 411 up to 300° C. When the temperature of the substrate had become stable, an RF power of 0.03 W/cm$^3$ was applied to the bias bar 428 by the RF power supply 424 so that a glow discharge occurs in the deposition chamber 418. The shutter 427 was then opened, and under the above-described conditions, the substrate was exposed for 3 minutes to the hydrogen gas plasma containing the small amount of silane-based gas according to the present invention. The RF power was then shut off to stop the glow discharge. The supply of the $SiH_4$ gas into the deposition chamber 418 was stopped, whereas the $H_2$ gas was fed further for 3 minutes into the deposition chamber 418. Then, the $H_2$ gas was also shut off, and the inside of the deposition chamber 418 as well as the inside of the gas lines was evacuated down to $1\times10^{-5}$ Torr.

An RF p-layer 105 of a-SiC and an RF n-layer 103 of μc-Si were then deposited in the same way as for the example F2 by means of RFPCVD.

The substrate was then subjected to plasma treatment with hydrogen gas containing a small amount of silane-based gas under the conditions shown in Table F18(6).

In this plasma treatment with hydrogen gas containing the small amount of silane-based gas according to the present invention, $SiH_4/H_2$ (diluted to 1000 ppm) serving as silicon compound gas and $H_2$ were introduced into the deposition chamber 417 via the gas inlet 429. The $H_2$ gas was supplied by opening the valves 441, 431, 430 and its flow rate was adjusted to 1200 sccm by means of the mass flow controller 436. The silicon compound gas was supplied by opening the valves 442 and 432, and its flow rate was controlled by the mass flow controller 437 such that the flow rate of the $SiH_4$ gas was maintained at 0.04% of the total gas flow rate of $H_2$. Furthermore, the pressure inside the deposition chamber 417 was adjusted to 0.7 Torr by means of a conductance valve (not shown). The substrate 490 was heated by the substrate heater 410 up to 300° C. When the temperature of the substrate had become stable, an RF power of 0.03 W/cm$^3$ was introduced by the RF power supply 422 so that a glow discharge occurs in the plasma excitation cup 420. Under the abovedescribed conditions, the substrate was exposed for three minutes to the hydrogen gas plasma containing the small amount of silane-based gas. The RF power was then shut off to stop the glow discharge. The supply of the $SiH_4/H_2$ (diluted to 1000 ppm) gas into the deposition chamber 417 was stopped, whereas the $H_2$ gas was fed further for three minutes into the deposition chamber 417. Then, the $H_2$ gas was also shut off, and the inside of the deposition chamber 417 as well as the inside of the gas lines was evacuated down to $1\times10^{-5}$ Torr.

An n/i buffer layer 251 of a-SiC was then deposited by means of RFPCVD in the same way as for example F2.

The substrate was then subjected to plasma treatment with hydrogen gas containing a small amount of silane-based gas under the conditions shown in Table F18(7), according to the present invention.

In this plasma treatment with hydrogen gas containing the small amount of silane-based gas according to the present invention, $SiH_4$ serving as silicon compound gas and $H_2$ were introduced into the deposition chamber 418 via the gas inlet 449. The $H_2$ gas was supplied by opening the valves 463, 453, 450 and its flow rate was adjusted to 1100 sccm by means of the mass flow controller 458. The silicon compound gas was supplied by opening the valves 461 and 451 and its flow rate was controlled by the mass flow controller 456 such that the flow rate of the $SiH_4$ gas was maintained at 0.03% of the total gas flow rate of $H_2$. Furthermore, the pressure inside the deposition chamber 418 was adjusted to 0.7 Torr by means of a conductance valve (not shown). The substrate 490 was heated by the substrate heater 411 up to 300° C. When the temperature of the substrate had become stable, an RF power of 0.02 W/cm$^3$ was applied to the bias bar 428 by the RF power supply 424 so that a glow discharge occurs in the deposition chamber 418. The shutter 427 was then opened, and under the above-described conditions, the substrate was exposed for 3 minutes to the hydrogen gas plasma containing the small amount of silane-based gas according to the present invention. The RF power was then shut off to stop the glow discharge. The supply of the $SiH_4$ gas into the deposition chamber 418 was stopped, whereas the $H_2$ gas was fed further for 3 minutes into the deposition chamber 418. Then, the $H_2$ gas was also shut off, and the inside of the deposition chamber 418 as well as the inside of the gas lines was evacuated down to $1\times10^{-5}$ Torr.

An MW i-layer 214 of a-SiGe was then deposited by means of MWPCVD in the same way as for example F2.

The substrate was then subjected to plasma treatment with hydrogen gas containing a small amount of silane-based gas under the conditions shown in Table F18(8), according to the present invention.

In this plasma treatment with hydrogen gas containing the small amount of silane-based gas according to the present invention, $SiH_4$ serving as silicon compound gas and $H_2$ were introduced into the deposition chamber 418 via the gas inlet 449. The $H_2$ gas was supplied by opening the valves 463, 453, 450 and its flow rate was adjusted to 1200 sccm by means of the mass flow controller 458. The silicon compound gas was supplied by opening the valves 461 and 451 and its flow rate was controlled by the mass flow controller 456 such that the flow rate of the $SiH_4$ gas was maintained at 0.03% of the total gas flow rate of $H_2$. Furthermore, the pressure inside the deposition chamber 418 was adjusted to 0.6 Torr by means of a conductance valve (not shown). The substrate 490 was heated by the substrate heater 411 up to 280° C. When the temperature of the substrate had become stable, an RF power of 0.02 W/cm$^3$ was applied to the bias bar 428 by the RF power supply 424 so that a glow discharge occurs in the deposition chamber 418. The shutter 427 was then opened, and under the above-described conditions, the substrate was exposed for 3 minutes to the hydrogen gas plasma containing the small amount of silane-based gas according to the present invention. The RF power was then shut off to stop the glow discharge. The supply of the $SiH_4$ gas into the deposition chamber 418 was stopped, whereas the $H_2$ gas was fed further for 3 minutes into the deposition chamber 418. Then, the $H_2$ gas was also shut off, and the inside of the deposition chamber 418 as well as the inside of the gas lines was evacuated down to $1\times10^{-5}$ Torr.

A p/i buffer layer 261 of a-SiC was then deposited by means of RFPCVD in the same way as for example F2.

The substrate was then subjected to plasma treatment with hydrogen gas containing a small amount of silane-based gas under the conditions shown in Table F18(9), according to the present invention.

In this plasma treatment with hydrogen gas containing the small amount of silane-based gas according to the present invention, $SiH_4$ serving as silicon compound gas and $H_2$ were introduced into the deposition chamber 418 via the gas inlet 449. The $H_2$ gas was supplied by opening the valves 463, 453, 450 and its flow rate was adjusted to 1500 sccm by means of the mass flow controller 458. The silicon compound gas was supplied by opening the valves 461 and 451 and its flow rate was controlled by the mass flow controller 456 such that the flow rate of the $SiH_4$ gas was maintained at 0.03% of the total gas flow rate of $H_2$. Furthermore, the pressure inside the deposition chamber 418 was adjusted to 0.5 Torr by means of a conductance valve (not shown). The substrate 490 was heated by the substrate heater 411 up to 260° C. When the temperature of the substrate had become stable, an RF power of 0.02 W/cm$^3$ was applied to the bias bar 428 by the RF power supply 424 so that a glow discharge occurs in the deposition chamber 418. The shutter 427 was then opened, and under the above-described conditions, the substrate was exposed for 3 minutes to the hydrogen gas plasma containing the small amount of silane-based gas according to the present invention. The RF power was then shut off to stop the glow discharge. The supply of the $SiH_4$ gas into the deposition chamber 418 was stopped, whereas the $H_2$ gas was fed further for 3 minutes into the deposition chamber 418. Then, the $H_2$ gas was also shut off, and the inside of the deposition chamber 418 as well as the inside of the gas lines was evacuated down to $1\times10^{-5}$ Torr.

An RF p-layer 205 of a-SiC and an RF n-layer 303 of μc-Si were then deposited in that order in the same way as for the example F2.

The substrate was then subjected to plasma treatment with hydrogen gas containing a small amount of silane-based gas under the conditions shown in Table F18(10).

In this plasma treatment with hydrogen gas containing the small amount of silane-based gas according to the present invention, $SiH_4/H_2$ (diluted to 1000 ppm) serving as silicon compound gas and $H_2$ were introduced into the deposition chamber 417 via the gas inlet 429. The $H_2$ gas was supplied by opening the valves 441, 431, 430 and its flow rate was adjusted to 850 sccm by means of the mass flow controller 436. The silicon compound gas was supplied by opening the valves 442 and 432, and its flow rate was controlled by the mass flow controller 437 such that the flow rate of the $SiH_4$ gas was maintained at 0.03% of the total gas flow rate of $H_2$. Furthermore, the pressure inside the deposition chamber 417 was adjusted to 0.9 Torr by means of a conductance valve (not shown). The substrate 490 was heated by the substrate heater 410 up to 230° C. When the temperature of the substrate had become stable, an RF power of 0.03 W/cm$^3$ was introduced by the RF power supply 422 so that a glow discharge occurs in the plasma excitation cup 420. Under the abovedescribed conditions, the substrate was exposed for two minutes to the hydrogen gas plasma containing the small amount of silane-based gas. The RF power was then shut off to stop the glow discharge. The supply of the $SiH_4/H_2$ (diluted to 1000 ppm) gas into the deposition chamber 417 was stopped, whereas the $H_2$ gas was fed further for three minutes into the deposition chamber 417. Then, the $H_2$ gas was also shut off, and the inside of the deposition chamber 417 as well as the inside of the gas lines was evacuated down to $1\times10^{-5}$ Torr.

An n/i buffer layer 351 of a-SiC was then deposited by means of RFPCVD in the same way as for example F2.

The substrate was then subjected to plasma treatment with hydrogen gas containing a small amount of silane-based gas under the conditions shown in Table F18(11), according to the present invention.

In this plasma treatment with hydrogen gas containing the small amount of silane-based gas according to the present invention, $SiH_4$ serving as silicon compound gas and $H_2$ were introduced into the deposition chamber 418 via the gas inlet 449. The $H_2$ gas was supplied by opening the valves 463, 453, 450 and its flow rate was adjusted to 1000 sccm by means of the mass flow controller 458. The silicon compound gas was supplied by opening the valves 461 and 451 and its flow rate was controlled by the mass flow controller 456 such that the flow rate of the $SiH_4$ gas was maintained at 0.03% of the total gas flow rate of $H_2$. Furthermore, the pressure inside the deposition chamber 418 was adjusted to 0.7 Torr by means of a conductance valve (not shown). The substrate 490 was heated by the substrate heater 411 up to 230° C. When the temperature of the substrate had become stable, an RF power of 0.02 W/cm$^3$ was applied to the bias bar 428 by the RF power supply 424 so that a glow discharge occurs in the deposition chamber 418. The shutter 427 was then opened, and under the above-described conditions, the substrate was exposed for 3 minutes to the hydrogen gas plasma containing the small amount of silane-based gas according to the present invention. The RF power was then shut off to stop the glow discharge. The supply of the $SiH_4$ gas into the deposition chamber 418 was stopped, whereas the $H_2$ gas was fed further for 3 minutes into the deposition chamber 418. Then, the $H_2$ gas was also shut off, and the inside of the deposition chamber 418 as well as the inside of the gas lines was evacuated down to $1\times10^{-5}$ Torr.

An RF i-layer 314 of a-Si was then deposited in the same way as for the example F2 by means of RFPCVD.

The substrate was then subjected to plasma treatment with hydrogen gas containing a small amount of silane-based gas under the conditions shown in Table F18(12).

In this plasma treatment with hydrogen gas containing the small amount of silane-based gas according to the present invention, $SiH_4$ serving as silicon compound gas and $H_2$ were introduced into the deposition chamber 418 via the gas inlet 449. The $H_2$ gas was supplied by opening the valves 463, 453, 450 and its flow rate was adjusted to 1200 sccm by means of the mass flow controller 458. The silicon compound gas was supplied by opening the valves 461 and 451 and its flow rate was controlled by the mass flow controller 456 such that the flow rate of the $SiH_4$ gas was maintained at 0.03% of the total gas flow rate of $H_2$. Furthermore, the pressure inside the deposition chamber 418 was adjusted to 0.8 Torr by means of a conductance valve (not shown). The substrate 490 was heated by the substrate heater 411 up to 200° C. When the temperature of the substrate had become stable, an RF power of 0.02 W/cm$^3$ was applied to the bias bar 428 by the RF power supply 424 so that a glow discharge occurs in the deposition chamber 418. The shutter 427 was then opened, and under the above-described conditions, the substrate was exposed for 3 minutes to the hydrogen gas plasma containing the small amount of silane-based gas according to the present invention. The RF power was then shut off to stop the glow discharge. The supply of the $SiH_4$ gas into the deposition chamber 418 was stopped, whereas the $H_2$ gas was fed further for 3 minutes into the deposition chamber 418. Then, the $H_2$ gas was also shut off, and the inside of the deposition chamber 418 as well as the inside of the gas lines was evacuated down to $1\times10^{-5}$ Torr.

A p/i buffer layer 361 of a-SiC was then deposited in the same way as for the example F2 by means of RFPCVD.

The substrate was then subjected to plasma treatment with hydrogen gas containing a small amount of silane-based gas under the conditions shown in Table F18(13).

In this plasma treatment with hydrogen gas containing the small amount of silane-based gas according to the present invention, $SiH_4$ serving as silicon compound gas and $H_2$ were introduced into the deposition chamber 418 via the gas inlet 449. The $H_2$ gas was supplied by opening the valves 463, 453, 450 and its flow rate was adjusted to 1400 sccm by means of the mass flow controller 458. The silicon compound gas was supplied by opening the valves 461 and 451 and its flow rate was controlled by the mass flow controller 456 such that the flow rate of the $SiH_4$ gas was maintained at 0.03% of the total gas flow rate of $H_2$. Furthermore, the pressure inside the deposition chamber 418 was adjusted to 0.7 Torr by means of a conductance valve (not shown). The substrate 490 was heated by the substrate heater 411 up to 170° C. When the temperature of the substrate had become stable, an RF power of 0.02 W/cm$^3$ was applied to the bias bar 428 by the RF power supply 424 so that a glow discharge occurs in the deposition chamber 418. The shutter 427 was then opened, and under the above-described conditions, the substrate was exposed for 3 minutes to the hydrogen gas plasma containing the small amount of silane-based gas according to the present invention. The RF power was then shut off to stop the glow discharge. The supply of the $SiH_4$ gas into the deposition chamber 418 was stopped, whereas the $H_2$ gas was fed further for 3 minutes into the deposition chamber 418. Then, the $H_2$ gas was also shut off, and the inside of the deposition chamber 418 as well as the inside of the gas lines was evacuated down to $1\times10^{-5}$ Torr.

An RF p-layer 305 of a-SiC was then deposited in the same way as for the example F2 by means of RFPCVD.

ITO was then evaporated onto the RF p-layer 305 so as to form a transparent conductive layer 112 having a thickness of 70 nm.

A mask having a comb-shaped window was placed on the transparent conductive layer 112, and metal evaporation was performed via the mask to form a comb-shaped collection electrode 113 having a multi-layer structure consisting of Cr (40 nm), Ag (1000 nm), and Cr (40 nm).

In this way, the complete solar cell according to the invention was obtained. Hereinafter, the solar cell of this type will be referred to as SC-EMB-F18. Tables F18(1) through F18(14) indicate the conditions used here in the invention, regarding the plasma treatment with hydrogen containing a small amount of silane-based gas as well as the process conditions for the RF n-layer, n/i buffer layer, MW i-layer, p/i buffer layer, RF p-layer, RF n-layer, n/i buffer layer, MW i-layer, p/i buffer layer, RF p-layer, RF n-layer, n/i buffer layer, RF i-layer, p/i buffer layer, and RF p-layer.

COMPARATIVE EXAMPLE F18

For the sake of comparison, a solar cell (SC-CMP-F18) was also fabricated in the same manner as in the above-described example F18 except that the plasma treatment with hydrogen gas containing a small amount of silane-based gas according to the invention was not performed.

Eight samples of solar cells were prepared for each type (SC-EMB-F18 and SC-CMP-F18) for the purpose of evaluation regarding the initial photoelectric conversion efficiency (the ratio of the electric output power to the optical input power), vibration durability and optical durability under a biased condition at high temperature with high humidity, vibration durability and optical durability under a non-biased condition, and the characteristics with a reverse bias voltage being applied.

The measurement of the initial photoelectric conversion efficiency was performed by measuring the V-I characteristics of the samples under the illumination condition of AM 1.5 (100 mW/cm$^2$). The measurement revealed that the SC-EMB-F18 samples had a smaller variation in the initial photoelectric conversion efficiencies than the SC-CMP-F18 samples and had a larger fill factor (F.F.) as shown below:

| | [Fill factor (F.F.)] | [Variation] |
|---|---|---|
| SC-EMB-F18 | 1.16 (relative to that of SC-CMP-F18) | 0.81 |

The vibration durability test under the non-biased condition was performed as follows: After the measurement of the initial photoelectric conversion efficiency, some samples were placed in a dark place kept at 26° C. with a relative humidity of 54%. Vibration having an amplitude of 0.1 mm and a frequency of 60 Hz was applied to the samples for 500 hr. Then, the photoelectric conversion efficiencies of the samples were measured under the illumination condition of AM 1.5 (100 mW/cm$^2$) and the reduction relative to the initial value (the ratio of the photoelectric conversion efficiency after the vibration test to the initial value) was evaluated for each sample. The SC-CMP-F18 samples showed a greater reduction in the photoelectric conversion efficiency compared with the SC-EMB-F18 samples as shown below.

The optical durability test under the non-biased condition was performed as follows: After the measurement of the initial photoelectric conversion efficiency, some samples were placed in a dark place kept at 26° C. with a relative humidity of 54%. Light having a power of AM 1.5 (100 mW/cm$^2$) was applied to the samples for 500 hours, and then the photoelectric conversion efficiencies of the samples were measured under the illumination condition of AM 1.5 (100 mW/cm$^2$). The reduction relative to the initial value (the ratio of the photoelectric conversion efficiency after the optical durability test to the initial value) was evaluated for each sample. The SC-CMP-F18 samples showed a greater reduction in the photoelectric conversion efficiency compared with the SC-EMB-F18 samples as shown below.

| | [Vibration durability] | [Optical durability] |
|---|---|---|
| SC-CMP-F18 | 0.83 (relative to those of SC-EMB-F18) | 0.81 |

The evaluation of the vibration durability and optical durability under the biased condition at high temperature with high humidity was performed as follows: After the measurementoftheinitialphotoelectricconversionefficiency, some samples were placed in a dark place kept at 82° C. with a relative humidity of 92%, and a forward bias voltage of 0.7 V was applied to the samples. The vibration described above was applied to some of the samples and light having a power of AM 1.5 was applied to the other samples under the same conditions as those in the non-biased vibration test. The photoelectric conversion efficiencies of the samples were measured under the illumination condition of AM 1.5 (100 mW/cm$^2$). The SC-CMP-F18 samples also showed a greater reduction in the photoelectric conversion efficiency compared with the SC-EMB-F18 samples after the vibration and optical durability tests as shown below.

Under the biased condition:

| | [Vibration durability] | [Optical durability] |
|---|---|---|
| SC-CMP-F18 | 0.82 (relative to that of SC-EMB-F18) | 0.80 |

The evaluation of the characteristics with a reverse bias voltage being applied was performed as follows: After the measurementoftheinitialphotoelectricconversionefficiency, some samples were placed in a dark place kept at 80° C. with a relative humidity of 50%. A reverse bias voltage of 5.0 V was applied to the samples for 100 hours, and then the photoelectric conversion efficiencies of the samples were measured under the illumination condition of AM 1.5 (100 mW/cm$^2$). The reduction relative to the initial value (the ratio of the photoelectric conversion efficiency after the reverse bias voltage is applied to the initial value) was evaluated for each sample. The SC-CMP-F18 samples showed a greater reduction in the photoelectric conversion efficiency compared with the SC-EMB-F18 samples as shown below.

| | |
|---|---|
| SC-CMP-F18 | 0.85 (relative to those of SC-EMB-F18) |

The surfaces of the samples were observed using an optical microscope to evaluate film separation. No film separation was observed in the SC-EMB-F18 samples, whereas slight film separation was observed in the SC-CMP-F18 samples.

From the above results, it can be concluded that the solar cells (SC-EMB-F18) according to the present invention are better than the conventional solar cells (SC-CMP-F18) in optical durability, adhesion, overall durability, fill factor (F.F.), uniformity, and characteristics with a reverse bias voltage being applied of the photoelectric conversion efficiency.

In the above examples of solar cells according to the present invention, semiconductor layers were deposited on a substrate in the order of an n-layer, n/i-layer, i-layer, p/i buffer layer, and p-layer. Solar cells in which the semiconductor layers were deposited in the opposite order were also made using the same hydrogen plasma treatment.

These solar cells were evaluated in the same way as for the above-described examples. When the hydrogen plasma treatment was applied to the cells between the p/i buffer layer and p-layer, the cells showed improvement in a fill factor (F.F.), uniformity, and characteristics with a reverse bias voltage being applied of the photoelectric conversion efficiency, optical durability, adhesion, overall durability and other factors. When the hydrogen plasma treatment was also applied to the cells between the substrate and p-layer, and also to the n-layer and n/i buffer layer, the n/i buffer layer and i-layer, and the p/i buffer layer and i-layer, the cells showed further improvement in the properties described above.

EXAMPLE G1 ACCORDING TO THE INVENTION

A solar cell having a structure illustrated in FIG. 2 was made using the deposition equipment shown in FIG. 7. First, a substrate was prepared. A stainless-steel base 100 having dimensions of 0.5 mm in thickness and 50×50 $mm^2$ in area was cleaned with acetone and isopropanol by means of ultrasonic cleaning, and then dried with hot air.

An Ag optical reflection layer 101 having a thickness of 0.3 μm was deposited on a surface of the stainless-steel base 100 in sputtering at room temperature, and a 1.0-μm-thick ZnO layer acting as a reflection enhancing layer 102 was further deposited on it at 350° C. Thus, the complete substrate was prepared.

Using the deposition equipment 400 having the capabilities of both MWPCVD and RFPCVD, semiconductor layers were then deposited on the reflection enhancing layer 102.

The deposition equipment was connected to source gas cylinders (not shown) via gas inlets. The source gas cylinders used here contained gas refined with ultra high purity, $SiH_4$, $SiF_4$, $CH_4$, $GeH_4$, $GeF_4$, $Si_2H_6$, $PH_3/H_2$ (diluted to 1000 ppm), $B_2H_6/H_2$ (diluted to 2000 ppm, 1%, and 10%), $BF_3H_2$ (diluted to 2000 ppm, 1%, and 10%), $H_2$, He, $SiCl_2H_2$, and $SiH_4/H_2$ (diluted to 1000 ppm) gas.

The substrate 490 on which the optical reflection layer 101 and the reflection enhancing layer 102 had been formed was placed on the substrate transfer rail 413 in the load chamber 401, and the load chamber 401 was evacuated with a vacuum pump (not shown) down to a pressure of about $1\times10^{-5}$ Torr. Then, the gate valve 406 was opened, and the substrate 490 was transferred to the deposition chamber 417 via the transfer chamber 402, both deposition chamber 417 and transfer chamber 402 having been evacuated with a vacuum pump (not shown). The substrate 490 was placed so as to contact with the heater 410 at its rear surface, and heated. The inside of the deposition chamber 417 was evacuated with the vacuum pump (not shown) down to a pressure of about $1\times10^{-5}$ Torr.

In this way, semiconductor film deposition was prepared, and an RF n-layer 103 of μc-Si was then deposited, as described below.

To deposit the RF n-layer 103 of μc-Si, $H_2$ gas was introduced into the deposition chamber 417 via the gas inlet 429. The $H_2$ gas was supplied by opening the valves 441, 431, 430 and its flow rate was adjusted to 180 sccm by means of the mass flow controller 436. Furthermore, the pressure inside the deposition chamber 417 was adjusted to 1.10 Torr by means of the conductance valve (not shown). The substrate 490 was heated by the substrate heater 410 up to 370° C. When the temperature of the substrate had become stable, the valves 443, 433, 444, and 434 were opened to introduce $SiH_4$ gas and $PH_3/H_2$ gas into the deposition chamber 417 via the gas inlet 429. The flow rates of $SiH_4$, $H_2$, and $PH_3/H_2$ were adjusted to 1.5 sccm, 110 sccm, and 200 sccm, respectively, by the mass flow controllers 438, 436, and 439. The pressure inside the deposition chamber 417 was adjusted to 1.15 Torr. An RF power of the RF power supply 422 was set to 0.05 $W/cm^3$ and applied to the plasma excitation cup 420 to activate a glow discharge. The deposition of the RF n-layer was started. When the thickness of the deposited RF n-layer reached 20 nm, the RF power was shut off to stop the glow discharge. The deposition of the RF n-layer 103 was finished. The supply of $SiH_4$ and $PH_3/H_2$ into the deposition chamber 417 was stopped, whereas $H_2$ was fed further for five minutes into the deposition chamber 417. Then, $H_2$ was also shut off, and the inside of the deposition chamber 417 as well as the inside of the gas lines was evacuated down to $1\times10^{-5}$ Torr.

An n/i buffer layer 151 of a-Si was then deposited by means of RFPCVD as described below.

The gate valve 407 was opened, and the substrate 490 was transferred to the i-layer deposition chamber 418 via the transfer chamber 403, both deposition chamber 418 and transfer chamber 403 having been evacuated with a vacuum pump (not shown). The substrate 490 was placed so as to contact with the heater 411 at its rear surface, and heated. The inside of the i-layer deposition chamber 418 was evacuated with the vacuum pump (not shown) down to a pressure of about $1\times10^{-5}$ Torr.

To deposit the n/i buffer layer 151, the substrate 490 was heated by the substrate heater 411 up to 360° C. When the substrate had been heated enough, the valves 464, 454, 450, 463, and 453 were opened gradually to supply $Si_2H_6$ and $H_2$ to the i-layer deposition chamber 418 via the gas inlet 449. The flow rates of $Si_2H_6$ and $H_2$ were adjusted to 3.5 sccm and 100 sccm, respectively, by the mass flow controllers 459 and 458. The pressure inside the i-layer deposition chamber 418 was set to 0.8 Torr by adjusting the opening ratio of a conductance valve (not shown). Then, a high-frequency (RF) power of 0.06 $W/cm^3$ was applied to the bias bar 428 by the RF power supply 424 to excite a glow discharge. The shutter 427 was then opened, and depositing the n/i buffer layer on the RF n-layer was started. When the thickness of the deposited n/i buffer layer reached 10 nm, the RF glow discharge was stopped, and the RF power supply 424 was shut off. The deposition of the n/i buffer layer 151 was finished. The valves 464 and 454 were closed to stop the supply of $Si_2H_6$ to the i-layer deposition chamber 418, whereas $H_2$ was fed further for two minutes into the i-layer deposition chamber 418. Then, the valves 453 and 450 were closed, and the inside of the i-layer deposition chamber 418 as well as the inside of the gas lines was evacuated down to $1\times10^{-5}$ Torr.

An MW i-layer 114 of a-SiGe was then deposited by means of MWPCVD as described below.

To deposit the MW i-layer 114, the substrate 490 was heated by the substrate heater 411 up to 370° C. When the substrate had been heated enough, the valves 461, 451, 450, 462, 452, 463, and 453 were opened gradually to supply $SiH_4$, $GeH_4$, and $H_2$ to the i-layer deposition chamber 418 via the gas inlet 449. The flow rates of $SiH_4$, $GeH_4$, and $H_2$ were adjusted to 38, 39, and 165 sccm, respectively, by the mass flow controllers 456, 457, and 458. The pressure inside the i-layer deposition chamber 418 was set to 6 mTorr by adjusting the opening ratio of a conductance valve (not shown). Then, a high-frequency (RF) power of 0.70 $W/cm^3$ was applied to the bias bar 428 by the RF power supply 424. The power of the MW power supply (not shown) was set to 0.28 $W/cm^3$ and introduced into the i-layer deposition chamber 418 through the wave guide 426 and the microwave entrance window 425 to excite a glow discharge. The shutter 427 was then opened, and depositing the MW i-layer 114 onto the n/i buffer layer 151 was started. When the thickness of the deposited MW i-layer 114 reached 0.15 μm, the MW glow discharge was stopped, and the RF power supply 424 was shut off. The deposition of the MW i-layer 114 was finished. The valves 451 and 452 were closed to stop the supply of $SiH_4$ and $GeH_4$ to the i-layer deposition chamber 418, whereas $H_2$ was fed further for two minutes into the i-layer deposition chamber 418. Then, the valves 453 and 450 were closed, and the inside of the i-layer deposition chamber 418 as well as the inside of the gas lines was evacuated down to $1\times10^{-5}$ Torr.

A p/i buffer layer 161 of a-Si was then deposited by means of RFPCVD as described below.

To deposit the p/i buffer layer 161, the substrate 490 was heated by the substrate heater 411 up to 230° C. When the substrate had been heated enough, the valves 464, 454, 450, 463, and 453 were opened gradually to supply $Si_2H_6$ and $H_2$ to the i-layer deposition chamber 418 via the gas inlet 449. The flow rates of $Si_2H_6$ and $H_2$ were adjusted to 3 sccm and 80 sccm, respectively, by the mass flow controllers 459 and 458. The pressure inside the i-layer deposition chamber 418 was set to 0.8 Torr by adjusting the opening ratio of a conductance valve (not shown). Then, an RF power of 0.07 W/cm$^3$ was applied to the bias bar 428 by the RF power supply 424 to excite a glow discharge. The shutter 427 was then opened, and depositing the p/i buffer layer 161 on the MW i-layer 114 was started. When the thickness of the deposited p/i buffer layer 161 reached 20 nm, the RF glow discharge was stopped, and the RF power supply 424 was shut off. The deposition of the p/i buffer layer 161 was finished. The valves 464 and 454 were closed to stop the supply of $Si_2H_6$ to the i-layer deposition chamber 418, whereas $H_2$ was fed further for two minutes into the i-layer deposition chamber 418. Then, the valves 453 and 450 were closed, and the inside of the i-layer deposition chamber 418 as well as the inside of the gas lines was evacuated down to $1\times10^{-5}$ Torr.

The substrate was then subjected to plasma treatment with hydrogen gas containing a small amount of group-III-element gas, according to the present invention.

In this plasma treatment with hydrogen gas containing the small amount of Group-III element gas according to the present invention, $B_2H_6/H_2$ (diluted to 10%) serving as Group-III element compound gas, $SiH_4$ serving as silicon compound gas and $H_2$ were introduced into the deposition chamber 418 via the gas inlet 449. The $H_2$ gas was supplied by opening the valves 463, 453, 450 and its flow rate was adjusted to 1500 sccm by means of the mass flow controller 458. The Group-III element compound gas $B_2H_6/H_2$ was supplied by opening the valves 468 and 466 and its flow rate was controlled by the mass flow controller 467 such that the flow rate of the $B_2H_6/H_2$ gas was maintained at 0.5% of the total gas flow rate of $H_2$. The silicon compound gas was supplied by opening the valves 461 and 451 and its flow rate was controlled by the mass flow controller 456 such that the flow rate of the $SiH_4$ gas was maintained at 0.01% of the total gas flow rate of $H_2$. Furthermore, the pressure inside the deposition chamber 418 was adjusted to 0.7 Torr by means of a conductance valve (not shown). The substrate 490 was heated by the substrate heater 411 up to 200° C. When the temperature of the substrate had become stable, an RF power of 0.06 W/cm$^3$ was applied to the bias bar 428 by the RF power supply 424 so that a glow discharge occurs in the deposition chamber 418. The shutter 427 was then opened, and under the above-described conditions, the substrate was exposed for 3 minutes to the hydrogen gas plasma containing the small amount of Group-III element gas according to the present invention. The RF power was then shut off to stop the glow discharge. The supply of the $SiH_4$ gas and $B_2H_6/H_2$ (diluted to 10%) gas into the deposition chamber 418 was stopped, whereas the $H_2$ gas was fed further for 3 minutes into the deposition chamber 418. Then, the $H_2$ gas was also shut off, and the inside of the deposition chamber 418 as well as the inside of the gas lines was evacuated down to $1\times10^{-5}$ Torr.

An RF p-layer 105 of a-SiC was deposited. To deposit the RF p-layer 105 of a-SiC, the gate valve 408 was opened, and the substrate 490 was transferred to the p-layer deposition chamber 419 via the transfer chamber 404, both deposition chamber 419 and transfer chamber 404 having been evacuated with a vacuum pump (not shown). The substrate 490 was placed so as to contact with the heater 412 at its rear surface, and heated. The inside of the p-layer deposition chamber 419 was evacuated with the vacuum pump (not shown) down to a pressure of about $1\times10^{-5}$ Torr.

The substrate 490 was heated by the substrate heater 412 up to 200° C. When the temperature of the substrate had become stable, the valves 481, 471, 470, 482, 472, 483, 473, 484, and 474 were opened to supply $H_2$ gas, $SiH_4/H_2$ gas, $B_2H_6/H_2$ gas, and $CH_4$ gas to the deposition chamber 419 via the gas inlet 469. The flow rates of the $H_2$, $SiH_4/H_2$, $B_2H_6/H_2$, and $CH_4$, were adjusted to 90 sccm, 1 sccm, 10 sccm, and 0.3 sccm, respectively, by the mass flow controllers 476, 477, 478, and 479. The pressure inside the chamber 419 was set to 1.3 Torr by adjusting the opening ratio of a conductance valve (not shown). An RF power of 0.09 W/cm$^3$ was applied by the RF power supply 423 to the plasma excitation cup 421 to activate a glow discharge, and deposition of the RF p-layer on the p/i buffer layer was started. When the thickness of the deposited RF p-layer reached 10 nm, the RF power was shut off to stop the glow discharge. The deposition of the RF p-layer 105 was finished. The valves 472, 482, 473, 483, 474, and 484 were closed to stop the supply of $SiH_4/H_2$, $B_2H_6/H_2$, and $CH_4$ to the p-layer deposition chamber 419, whereas $H_2$ was fed further for three minutes into the p-layer deposition chamber 419. Then, the valves 471, 481, and 470 were closed, and the inside of the p-layer deposition chamber 419 as well as the inside of the gas lines was evacuated down to $1\times10^{-5}$ Torr.

The gate valve 409 was then opened, and the substrate 490 was transferred to the unload chamber 405 which had already been evacuated with a vacuum pump (not shown). Then, a leak valve (not shown) was opened so that the inside of the unload chamber 405 was exposed to the ambient atmosphere.

ITO was then evaporated onto the RF p-layer 105 so as to form a transparent conductive layer 112 having a thickness of 70 nm.

A mask having a comb-shaped window was placed on the transparent conductive layer 112, and metal evaporation was performed via the mask to form a comb-shaped collection electrode 113 having a multi-layer structure consisting of Cr (40 nm), Ag (1000 nm), and Cr (40 nm).

In this way, the complete solar cell according to the invention was obtained. Hereinafter, the solar cell of this type will be referred to as SC-EMB-G1. Tables G1(1) and G1(2) indicate the conditions used here in the invention, regarding the plasma treatment with hydrogen containing a small amount of group-III-element compound gas as well as the process conditions for the RF n-layer, RF n/i buffer layer, MW i-layer, RF p/i buffer layer, and RF p-layer.

COMPARATIVE EXAMPLE G1

For the sake of comparison, a solar cell (SC-CMP-G1) was also fabricated in the same manner as in the above-described example G1 except that the plasma treatment with hydrogen gas containing a small amount of Group-III element compound gas according to the invention was not performed.

Eight samples of solar cells were prepared for each type (SC-EMB-G1 and SC-CMP-G1) for the purpose of evaluation regarding the initial photoelectric conversion efficiency (the ratio of the electric output power to the optical input power), vibration durability and optical durability under a biased condition at high temperature with high humidity, and vibration durability and optical durability under a non-biased condition.

The measurement of the initial photoelectric conversion efficiency was performed by measuring the V-I characteristics of the samples under the illumination condition of AM 1.5 (100 mW/cm$^2$). The measurement revealed that the SC-EMB-G1 samples had a smaller series resistance and variation (that is, more preferable) in the initial photoelectric conversion efficiencies than the SC-CMP-G1 samples and had a larger fill factor (F.F.) as shown below:

| | [Fill factor (F.F.)] | [Series resistance] | [Variation] |
|---|---|---|---|
| SC-EMB-G1 | 1.18 | 0.91 | 0.88 |
| | (relative to that of SC-CMP-G1) | | |

The vibration durability test under the non-biased condition was performed as follows: After the measurement of the initial photoelectric conversion efficiency, some samples were placed in a dark place kept at 25° C. with a relative humidity of 57%. Vibration having an amplitude of 0.1 mm and a frequency of 60 Hz was applied to the samples for 550 hours. Then, the photoelectric conversion efficiencies of the samples were measured under the illumination condition of AM 1.5 (100 mW/cm$^2$) and the reduction relative to the initial value (the ratio of the photoelectric conversion efficiency after the vibration test to the initial value) was evaluated for each sample. The SC-CMP-G1 samples showed a greater reduction in the photoelectric conversion efficiency compared with the SC-EMB-G1 samples as shown below.

The optical durability test under the non-biased condition was performed as follows: After the measurement of the initial photoelectric conversion efficiency, some samples were placed in a dark place kept at 25° C. with a relative humidity of 57% . Light having a power of AM 1.5 (100 mW/cm$^2$) was applied to the samples for 550 hours, and then the photoelectric conversion efficiencies of the samples were measured under the illumination condition of AM 1.5 (100 mW/cm$^2$). The reduction relative to the initial value (the ratio of the photoelectric conversion efficiency after the optical durability test to the initial value) was evaluated for each sample. The SC-CMP-G1 samples showed a greater reduction in the photoelectric conversion efficiency compared with the SC-EMB-G1 samples as shown below.

| | [Vibration durability] | [Optical durability] |
|---|---|---|
| SC-CMP-G1 | 0.85 | 0.83 |
| | (relative to those of SC-EMB-G1) | |

The evaluation of the vibration durability and optical durability under the biased condition at high temperature with high humidity was performed as follows: After the measurement of the initial photoelectric conversion efficiency, some samples were placed in a dark place kept at 85° C. with a relative humidity of 92%, and a forward bias voltage of 0.71 V was applied to the samples. The vibration described above was applied to some of the samples and light having a power of AM 1.5 was applied to the other samples under the same conditions as those in the non-biased vibration test. The photoelectric conversion efficiencies of the samples were measured under the illumination condition of AM 1.5 (100 mW/cm$^2$). The SC-CMP-G1 samples also showed a greater reduction in the photoelectric conversion efficiency compared with the SC-EMB-G1 samples after the vibration and optical durability tests as shown below.

| | [Vibration durability] | [Optical durability] |
|---|---|---|
| SC-CMP-G1 | 0.83 | 0.82 |
| | (relative to that of SC-EMB-G1) | |

The surfaces of the samples were observed using an optical microscope to evaluate film separation. No film separation was observed in the SC-EMB-G1 samples, whereas slight film separation was observed in the SC-CMP-G1 samples.

From the above results, it can be concluded that the solar cells (SC-EMB-G1) according to the present invention are better than the conventional solar cells (SC-CMP-G1) in optical durability, series resistance adhesion, overall durability, fill factor (F.F.) and uniformity of the photoelectric conversion efficiency.

EXAMPLE G2 ACCORDING TO THE INVENTION

A solar cell having a structure illustrated in FIG. 4 was made using the deposition equipment shown in FIG. 7.

A substrate 490 on which the optical reflection layer 101 and the reflection enhancing layer 102 had been formed in the same was as for example G1 was placed on the substrate transfer rail 413 in the load chamber 401, and the load chamber 401 was evacuated with a vacuum pump (not shown) down to a pressure of about $1\times10^{-5}$ Torr. Then, the gate valve 406 was opened, and the substrate 490 was transferred to the deposition chamber 417 via the transfer chamber 402, both deposition chamber 417 and transfer chamber 402 having been evacuated with a vacuum pump (not shown). The substrate 490 was placed so as to contact with the heater 410 at its rear surface, and heated. The inside of the deposition chamber 417 was evacuated with the vacuum pump (not shown) down to a pressure of about $1\times10^{-5}$ Torr.

In this way, semiconductor film deposition was prepared, and an RF n-layer 103 of μc-Si was then deposited, as described below.

To deposit the RF n-layer of μc-Si, $H_2$ gas was introduced into the deposition chamber 417 via the gas inlet 429. The $H_2$ gas was supplied by opening the valves 441, 431, 430 and its flow rate was adjusted to 300 sccm by means of the mass flow controller 436. Furthermore, the pressure inside the deposition chamber 417 was adjusted to 1.1 Torr by means of the conductance valve (not shown). The substrate 490 was heated by the substrate heater 410 up to 380° C. When the temperature of the substrate had become stable, the valves 443, 433, 444, and 434 were opened to introduce $SiH_4$ gas and $PH_3/H_2$ gas into the deposition chamber 417 via the gas inlet 429. The flow rates of $SiH_4$, $H_2$, and $PH_3/H_2$ were adjusted to 1.5 sccm, 90 sccm, and 200 sccm, respectively, by the mass flow controllers 438, 436, and 439. The pressure inside the deposition chamber 417 was adjusted to 1.1 Torr. An RF power of the RF power supply 422 was set to 0.05 W/cm$^3$ and applied to the plasma excitation cup 420 to activate a glow discharge. Deposition of the RF n-layer on the substrate was started. When the thickness of the deposited RF n-layer reached 20 nm, the RF power was shut off to stop the glow discharge. The deposition of the RF n-layer 103 was finished. The supply of $SiH_4$ and $PH_3/H_2$ into the deposition chamber 417 was stopped, whereas $H_2$ was fed further for four minutes into the deposition chamber 417. Then, $H_2$ was also shut off, and the inside of the deposition chamber 417 as well as the inside of the gas lines was evacuated down to $1\times10^{-5}$ Torr.

An n/i buffer layer 151 of a-Si was then deposited by means of RFPCVD as described below.

The gate valve 407 was opened, and the substrate 490 was transferred to the i-layer deposition chamber 418 via the transfer chamber 403, both deposition chamber 418 and transfer chamber 403 having been evacuated with a vacuum pump (not shown). The substrate 490 was placed so as to contact with the heater 411 at its rear surface, and heated. The inside of the i-layer deposition chamber 418 was evacuated with the vacuum pump (not shown) down to a pressure of about $1\times10^{-5}$ Torr.

To deposit the n/i buffer layer 151, the substrate 490 was heated by the substrate heater 411 up to 360° C. When the substrate had been heated enough, the valves 464, 454, 450, 463, and 453 were opened gradually to supply $Si_2H_6$ and $H_2$ to the i-layer deposition chamber 418 via the gas inlet 449. The flow rates of $Si_2H_6$ and $H_2$ were adjusted to 2.5 sccm and 90 sccm, respectively, by the mass flow controllers 459 and 458. The pressure inside the i-layer deposition chamber 418 was set to 0.8 Torr by adjusting the opening ratio of a conductance valve (not shown). Then, a RF power of 0.08 W/cm$^3$ was applied to the bias bar 428 by the RF power supply 424 to excite a glow discharge. The shutter 427 was then opened, and depositing the n/i buffer layer 151 on the RF n-layer 103 was started. When the thickness of the deposited n/i buffer layer 151 reached 10 nm, the RF glow discharge was stopped, and the RF power supply 424 was shut off. The deposition of the n/i buffer layer 151 was finished. The valves 464 and 454 were closed to stop the supply of $Si_2H_6$ to the i-layer deposition chamber 418, whereas $H_2$ was fed further for two minutes into the i-layer deposition chamber 418. Then, the valves 453 and 450 were closed, and the inside of the i-layer deposition chamber 418 as well as the inside of the gas lines was evacuated down to $1\times10^{-5}$ Torr.

An MW i-layer 114 of a-SiGe was then deposited by means of MWPCVD as described below.

To deposit the MW i-layer 114, the substrate 490 was heated by the substrate heater 411 up to 380° C. When the substrate had been heated enough, the valves 461, 451, 450, 462, 452, 463, and 453 were opened gradually to supply $SiH_4$, $GeH_4$, and $H_2$ to the i-layer deposition chamber 418 via the gas inlet 449. The flow rates of $SiH_4$, $GeH_4$, and $H_2$ were adjusted to 45, 43, and 175 sccm, respectively, by the mass flow controllers 456, 457, and 458. The pressure inside the i-layer deposition chamber 418 was set to 5 mTorr by adjusting the opening ratio of a conductance valve (not shown). Then, an RF power of 0.65 W/cm$^3$ was applied to the bias bar 428 by the RF power supply 424. The power of the MW power supply (not shown) was set to 0.25 W/cm$^3$ and introduced into the i-layer deposition chamber 418 through the wave guide 426 and the microwave entrance window 425 to excite a glow discharge. The shutter 427 was then opened, and depositing the MW i-layer 114 onto the n/i buffer layer 151 was started. When the thickness of the deposited MW i-layer 114 reached 0.15 μm, the MW glow discharge was stopped, and the RF power supply 424 was shut off. The deposition of the MW i-layer 114 was finished. The valves 451 and 452 were closed to stop the supply of $SiH_4$ and $GeH_4$ to the i-layer deposition chamber 418, whereas $H_2$ was fed further for two minutes into the i-layer deposition chamber 418. Then, the valves 453 and 450 were closed, and the inside of the i-layer deposition chamber 418 as well as the inside of the gas lines was evacuated down to $1\times10^{-5}$ Torr.

A p/i buffer layer 161 of a-Si was then deposited by means of RFPCVD as described below.

To deposit the p/i buffer layer 161, the substrate 490 was heated by the substrate heater 411 up to 250° C. When the substrate had been heated enough, the valves 464, 454, 450, 463, and 453 were opened gradually to supply $Si_2H_6$ and $H_2$ to the i-layer deposition chamber 418 via the gas inlet 449. The flow rates of $Si_2H_6$ and $H_2$ were adjusted to 3 sccm and 80 sccm, respectively, by the mass flow controllers 459 and 458. The pressure inside the i-layer deposition chamber 418 was set to 0.7 Torr by adjusting the opening ratio of a conductance valve (not shown). Then, an RF power of 0.07 W/cm$^3$ was applied to the bias bar 428 by the RF power supply 424 to excite a glow discharge. The shutter 427 was then opened, and depositing the p/i buffer layer 161 on the MW i-layer 114 was started. When the thickness of the deposited p/i buffer layer 161 reached 20 nm, the RF glow discharge was stopped, and the RF power supply 424 was shut off. The deposition of the p/i buffer layer 161 was finished. The valves 464 and 454 were closed to stop the supply of $Si_2H_6$ to the i-layer deposition chamber 418, whereas $H_2$ was fed further for two minutes into the i-layer deposition chamber 418. Then, the valves 453 and 450 were closed, and the inside of the i-layer deposition chamber 418 as well as the inside of the gas lines was evacuated down to $1\times10^{-5}$ Torr.

The substrate was then subjected to plasma treatment with hydrogen gas containing a small amount of Group-III element based gas under the conditions shown in Table G2(1), according to the present invention.

In this plasma treatment with hydrogen gas containing the small amount of Group-III element based gas according to the present invention, $BF_3/H_2$ (diluted to 1%) serving as group-III-element compound gas, $Si_2H_6$ serving as silicon compound gas and $H_2$ were introduced into the deposition chamber 418 via the gas inlet 449. The $H_2$ gas was supplied by opening the valves 463, 453, 450 and its flow rate was adjusted to 1000 sccm by means of the mass flow controller 458. The Group-III element compound gas $BF_3H_2$ was supplied by opening the valves 468 and 466 and its flow rate was controlled by the mass flow controller 467 such that the flow rate of the $BF_3H_2$ gas was maintained at 0.4% of the total gas flow rate of $H_2$. The silicon compound gas was supplied by opening the valves 464 and 454 and its flow rate was controlled by the mass flow controller 459 such that the flow rate of the $Si_2H_6$ gas was maintained at 0.05% of the total gas flow rate of $H_2$. Furthermore, the pressure inside the deposition chamber 418 was adjusted to 0.018 Torr by means of a conductance valve (not shown). The substrate 490 was heated by the substrate heater 411 up to 250° C. When the temperature of the substrate had become stable, a VHF power of 0.08 W/cm$^3$ was applied to the bias bar 428 by the VHF power supply (not shown) so that a glow discharge occurs in the deposition chamber 418. The shutter 427 was then opened, and under the above-described conditions, the substrate was exposed for four minutes to the hydrogen gas plasma containing the small amount of group-III-element-based gas according to the present invention. The VHF power was then shut off to stop the glow discharge. The supply of the $BF_3/H_2$ and $Si_2H_6$ gas into the deposition chamber 418 was stopped, whereas the $H_2$ gas was fed further for four minutes into the deposition chamber 418. Then, the $H_2$ gas was also shut off, and the inside of the deposition chamber 418 as well as the inside of the gas lines was evacuated down to $1\times10^{-5}$ Torr.

To deposit an RF p-layer 105 of a-SiC, the gate valve 408 was opened, and the substrate 490 was transferred to the p-layer deposition chamber 419 via the transfer chamber 404, both deposition chamber 419 and transfer chamber 404 having been evacuated with a vacuum pump (not shown). The substrate 490 was placed so as to contact with the heater 412 at its rear surface, and heated. The inside of the p-layer deposition chamber 419 was evacuated with the vacuum pump (not shown) down to a pressure of about $1\times10^{-5}$ Torr.

The substrate 490 was heated by the substrate heater 412 up to 250° C. When the temperature of the substrate had become stable, the valves 481, 471, 470, 482, 472, 483, 473, 484, and 474 were opened to supply $H_2$ gas, $SiH_4/H_2$ gas, $B_2H_6/H_2$ gas, and $CH_4$ gas to the deposition chamber 419 via the gas inlet 469. The flow rates of the $H_2$, $SiH_4/H_2$, $B_2H_6/H_2$, and $CH_4$, were adjusted to 60 sccm, 2 sccm, 10 sccm, and 0.3 sccm, respectively, by the mass flow controllers 476, 477, 478, and 479. The pressure inside the chamber 419 was set to 1.7 Torr by adjusting the opening ratio of a conductance valve (not shown). An RF power of 0.07 W/cm$^3$ was applied by the RF power supply 423 to the plasma excitation cup 421 to activate a glow discharge, and deposition of the RF p-layer 105 on the p/i buffer layer 161 was started. When the thickness of the deposited RF p-layer 105 reached 10 nm, the RF power was shut off to stop the glow discharge. The deposition of the RF p-layer 105 was finished. The valves 472, 482, 473, 483, 474, and 484 were closed to stop the supply of $SiH_4/H_2$, $B_2H_6/H_2$, and $CH_4$ to the p-layer deposition chamber 419, whereas $H_2$ was fed further for three minutes into the p-layer deposition chamber 419. Then, the valves 471, 481, and 470 were closed, and the inside of the p-layer deposition chamber 419 as well as the inside of the gas lines was evacuated down to $1\times10^{-5}$ Torr.

Next, an RF n-layer 203 of μc-Si was deposited. The gate valves 408 and 407 were opened, and the substrate 490 was transferred to the deposition chamber 417 through the transfer chamber 403 which had been evacuated with a vacuum pump (not shown) and the transfer chamber 402. The substrate 490 was placed so as to contact with the heater 410 at its rear surface, and heated. The inside of the deposition chamber 419 was evacuated with the vacuum pump (not shown) down to a pressure of about $1\times10^{-5}$ Torr.

To deposit the RF n-layer 203 of μc-Si, $H_2$ gas was introduced into the deposition chamber 417 via the gas inlet 429. The $H_2$ gas was supplied by opening the valves 441, 431, 430 and its flow rate was adjusted to 200 sccm by means of the mass flow controller 436. Furthermore, the pressure inside the deposition chamber 417 was adjusted to 1.1 Torr by means of the conductance valve (not shown). The substrate 490 was heated by the substrate heater 410 up to 250° C. When the temperature of the substrate had become stable, the valves 443, 433, 444, and 434 were opened to introduce $SiH_4$ gas and $PH_3/H_2$ gas into the deposition chamber 417 via the gas inlet 429. The flow rates of $SiH_4$, $H_2$, and $PH_3/H_2$ were adjusted to 2 sccm, 75 sccm, and 250 sccm, respectively, by the mass flow controllers 438, 436, and 439. The pressure inside the deposition chamber 417 was adjusted to 1.1 Torr. An RF power of the RF power supply 422 was set to 0.04 W/cm$^3$ and applied to the plasma excitation cup 420 to activate a glow discharge. The deposition of the RF n-layer 203 on the RF p-layer 105 was started. When the thickness of the deposited RF n-layer 203 reached 10 nm, the RF power was shut off to stop the glow discharge. The deposition of the RF n-layer 203 was finished. The supply of $SiH_4$ and $PH_3/H_2$ into the deposition chamber 417 was stopped, whereas $H_2$ was fed further for two minutes into the deposition chamber 417. Then, $H_2$ was also shut off, and the inside of the deposition chamber 417 as well as the inside of the gas lines was evacuated down to $1\times10^{-5}$ Torr.

An n/i buffer layer 251 of a-Si was then deposited by means of RFPCVD as described below.

The gate valve 407 was opened, and the substrate 490 was transferred to the i-layer deposition chamber 418 via the transfer chamber 403, both deposition chamber 418 and transfer chamber 403 having been evacuated with a vacuum pump (not shown). The substrate 490 was placed so as to contact with the heater 411 at its rear surface, and heated. The inside of the i-layer deposition chamber 418 was evacuated with the vacuum pump (not shown) down to a pressure of about $1\times10^{-5}$ Torr.

To deposit the n/i buffer layer 251, the substrate 490 was heated by the substrate heater 411 up to 250° C. When the substrate had been heated enough, the valves 464, 454, 450, 463, 453, 465, and 455 were opened gradually to supply $Si_2H_6$, $H_2$, and $CH_4$ to the i-layer deposition chamber 418 via the gas inlet 449. The flow rates of $Si_2H_6$, $H_2$, and $CH_4$ were adjusted to 0.4, 85, and 0.2 sccm, respectively, by the mass flow controllers 459, 458, and 460. The pressure inside the i-layer deposition chamber 418 was set to 1.1 Torr by adjusting the opening ratio of a conductance valve (not shown). Then, an RF power of 0.06 W/cm$^3$ was applied to the bias bar 428 by the RF power supply 424 to excite a glow discharge. The shutter 427 was then opened, and depositing the n/i buffer layer on the RF n-layer was started. When the thickness of the deposited n/i buffer layer reached 10 nm, the RF glow discharge was stopped, and the RF power supply 424 was shut off. The deposition of the n/i buffer layer 251 was finished. The valves 464, 454, 465, and 455 were closed to stop the supply of $Si_2H_6$ and $CH_4$ to the i-layer deposition chamber 418, whereas $H_2$ was fed further for two minutes into the i-layer deposition chamber 418. Then, the valves 453 and 450 were closed, and the inside of the i-layer deposition chamber 418 as well as the inside of the gas lines was evacuated down to $1\times10^{-5}$ Torr.

An RF i-layer 214 of a-Si was then deposited by means of RFPCVD as described below.

To deposit the RF i-layer, the substrate 490 was heated by the substrate heater 411 up to 200° C. When the substrate had been heated enough, the valves 464, 454, 450, 463, and 453 were opened gradually to supply $Si_2H_6$ and $H_2$ to the i-layer deposition chamber 418 via the gas inlet 449. The flow rates of $Si_2H_6$ and $H_2$ were adjusted to 2.8 sccm and 80 sccm, respectively, by the mass flow controllers 459 and 458. The pressure inside the i-layer deposition chamber 418 was set to 0.5 Torr by adjusting the opening ratio of a conductance valve (not shown). Then, an RF power of 0.07 W/cm$^3$ was applied to the bias bar 428 by the RF power supply 424 to excite a glow discharge. The shutter 427 was then opened, and depositing the RF i-layer on the n/i buffer layer 251 was started. When the thickness of the deposited RF i-layer reached 110 nm, the RF glow discharge was stopped, and the RF power supply 424 was shut off. The deposition of the RF i-layer 214 was finished. The valves 464 and 454 were closed to stop the supply of $Si_2H_6$ to the i-layer deposition chamber 418, whereas $H_2$ was fed further for two minutes into the i-layer deposition chamber 418. Then, the valves 453 and 450 were closed, and the inside of the i-layer deposition chamber 418 as well as the inside of the gas lines was evacuated down to $1\times10^{-5}$ Torr.

A p/i buffer layer 261 of a-SiC was then deposited by means of RFPCVD as described below.

To deposit the p/i buffer layer 261, the substrate 490 was heated by the substrate heater 411 up to 200° C. When the substrate had been heated enough, the valves 464, 454, 450, 463, 453, 465, and 455 were opened gradually to supply $Si_2H_6$, $H_2$, and $CH_4$ to the i-layer deposition chamber 418 via the gas inlet 449. The flow rates of $Si_2H_6$, $H_2$, and $CH_4$ were adjusted to 0.4, 65, and 0.3 sccm, respectively, by the mass flow controllers 459, 458, and 460. The pressure inside the i-layer deposition chamber 418 was set to 1.1 Torr by adjusting the opening ratio of a conductance valve (not shown). Then, an RF power of 0.06 $W/cm^3$ was applied to the bias bar 428 by the RF power supply 424 to excite a glow discharge. The shutter 427 was then opened, and depositing the p/i buffer layer 261 on the RF i-layer 214 was started. When the thickness of the deposited p/i buffer layer 261 reached 15 nm, the RF glow discharge was stopped, and the RF power supply 424 was shut off. The deposition of the p/i buffer layer 261 was finished. The valves 464, 454, 465, and 455 were closed to stop the supply of $Si_2H_6$ and $CH_4$ to the i-layer deposition chamber 418, whereas $H_2$ was fed further for two minutes into the i-layer deposition chamber 418. Then, the valves 453 and 450 were closed, and the inside of the i-layer deposition chamber 418 as well as the inside of the gas lines was evacuated down to $1\times10^{-5}$ Torr.

The substrate was then subjected to plasma treatment with hydrogen gas containing a small amount of Group-III element based gas under the conditions shown in Table G2(2), according to the present invention.

In this plasma treatment with hydrogen gas containing the small amount of Group-III element based gas according to the present invention, $BF_3/H_2$ (diluted to 1%) serving as Group-III-element compound gas, $SiH_4$ serving as silicon compound gas and $H_2$ were introduced into the deposition chamber 418 via the gas inlet 449. The $H_2$ gas was supplied by opening the valves 463, 453, 450 and its flow rate was adjusted to 1300 sccm by means of the mass flow controller 458. The Group-III element compound gas $BF_3/H_2$ was supplied by opening the valves 468 and 466 and its flow rate was controlled by the mass flow controller 467 such that the flow rate of the $BF_3/H_2$ gas was maintained at 0.3% of the total gas flow rate of $H_2$. The silicon compound gas was supplied by opening the valves 461 and 451 and its flow rate was controlled by the mass flow controller 456 such that the flow rate of the $SiH_4$ gas was maintained at 0.03% of the total gas flow rate of $H_2$. Furthermore, the pressure inside the deposition chamber 418 was adjusted to 0.7 Torr by means of a conductance valve (not shown). The substrate 490 was heated by the substrate heater 411 up to 200° C. When the temperature of the substrate had become stable, an RF power of 0.04 $W/cm^3$ was applied to the bias bar 428 by the RF power supply 424 so that a glow discharge occurs in the deposition chamber 418. The shutter 427 was then opened, and under the above-described conditions, the substrate was exposed for 3 minutes to the hydrogen gas plasma containing the small amount of Group-III-element based gas according to the present invention. The RF power was then shut off to stop the glow discharge. The supply of the $BF_3/H_2$ and $SiH_4$ gas into the deposition chamber 418 was stopped, whereas the $H_2$ gas was fed further for 3 minutes into the deposition chamber 418. Then, the $H_2$ gas was also shut off, and the inside of the deposition chamber 418 as well as the inside of the gas lines was evacuated down to $1\times10^{-5}$ Torr.

To deposit the RF p-layer 205 of a-SiC, the gate valve 408 was opened, and the substrate 490 was transferred to the p-layer deposition chamber 419 via the transfer chamber 404, both deposition chamber 419 and transfer chamber 404 having been evacuated with a vacuum pump (not shown). The substrate 490 was placed so as to contact with the heater 412 at its rear surface, and heated. The inside of the p-layer deposition chamber 419 was evacuated with the vacuum pump (not shown) down to a pressure of about $1\times10^{-5}$ Torr.

The substrate 490 was heated by the substrate heater 412 up to 170° C. When the temperature of the substrate had become stable, the valves 481, 471, 470, 482, 472, 483, 473, 484, and 474 were opened to supply $H_2$ gas, $SiH_4/H_2$ gas, $B_2H_6/H_2$ gas, and $CH_4$ gas to the deposition chamber 419 via the gas inlet 469. The flow rates of the $H_2$, $SiH_4/H_2$, $B_2H_6/H_2$, and $CH_4$, were adjusted to 70 sccm, 2 sccm, 10 sccm, and 0.3 sccm, respectively, by the mass flow controllers 476, 477, 478, and 479. The pressure inside the chamber 419 was set to 1.7 Torr by adjusting the opening ratio of a conductance valve (not shown). An RF power of 0.07 $W/cm^3$ was applied by the RF power supply 423 to the plasma excitation cup 421 to activate a glow discharge, and deposition of the RF p-layer 205 on the p/i buffer layer 261 was started. When the thickness of the deposited RF p-layer 205 reached 10 nm, the RF power was shut off to stop the glow discharge. The deposition of the RF p-layer 205 was finished. The valves 472, 482, 473, 483, 474, and 484 were closed to stop the supply of $SiH_4/H_2$, $B_2H_6/H_2$, and $CH_4$ to the p-layer deposition chamber 419, whereas $H_2$ was fed further for two minutes into the p-layer deposition chamber 419. Then, the valves 471, 481, and 470 were closed, and the inside of the p-layer deposition chamber 419 as well as the inside of the gas lines was evacuated down to $1\times10^{-5}$ Torr.

The gate valve 409 was then opened, and the substrate 490 was transferred to the unload chamber 405 which had already been evacuated with a vacuum pump (not shown). Then, a leak valve (not shown) was opened so that the inside of the unload chamber 405 was exposed to the ambient atmosphere.

ITO was then evaporated onto the RF p-layer 205 so as to form a transparent conductive layer 112 having a thickness of 70 nm.

A mask having a comb-shaped window was placed on the transparent conductive layer 112, and metal evaporation was performed via the mask to form a comb-shaped collection electrode 113 having a multi-layer structure consisting of Cr (40 nm), Ag (1000 nm), and Cr (40 nm).

In this way, the complete solar cell according to the invention was obtained. Hereinafter, the solar cell of this type will be referred to as SC-EMB-G2. Tables G2(1) through G2(3) indicate the conditions used here in the invention, regarding the plasma treatment with hydrogen containing a small amount of group-III-element-based gas as well as the process conditions for the RF n-layer, n/i buffer layer, MW i-layer, p/i buffer layer, RF p-layer, RF n-layer, n/i buffer layer, RF i-layer, p/i buffer layer, and RF p-layer.

COMPARATIVE EXAMPLE G2

For the sake of comparison, a solar cell (SC-CMP-G2) was also fabricated in the same manner as in the above-described example G2 except that the plasma treatment with hydrogen gas containing a small amount of Group-III element-based gas according to the invention was not performed.

Nine samples of solar cells were prepared for each type (SC-EMB-G2 and SC-CMP-G2) for the purpose of evaluation regarding the initial photoelectric conversion efficiency (the ratio of the electric output power to the optical input power), vibration durability and optical durability under a biased condition at high temperature with high humidity, and vibration durability and optical durability under a non-biased condition.

The measurement of the initial photoelectric conversion efficiency was performed by measuring the V-I characteristics of the samples under the illumination condition of AM 1.5 (100 mW/$cm^2$). The measurement revealed that the SC-EMB-G2 samples had a smaller series resistance and variation in the initial photoelectric conversion efficiencies than the SC-CMP-G2 samples and had a larger fill factor (F.F.) as shown below:

| | [Fill factor (F.F.)] | [Series resistance] | [Variation] |
|---|---|---|---|
| SC-EMB-G2 | 1.15 | 0.90 | 0.82 |
| | (relative to that of SC-CMP-G2) | | |

The vibration durability test under the non-biased condition was performed as follows: After the measurement of the initial photoelectric conversion efficiency, some samples were placed in a dark place kept at 26° C. with a relative humidity of 54%. Vibration having an amplitude of 0.1 mm and a frequency of 60 Hz was applied to the samples for 550 hours. Then, the photoelectric conversion efficiencies of the samples were measured under the illumination condition of AM 1.5 (100 mW/$cm^2$) and the reduction relative to the initial value (the ratio of the photoelectric conversion efficiency after the vibration test to the initial value) was evaluated for each sample. The SC-CMP-G2 samples showed a greater reduction in the photoelectric conversion efficiency compared with the SC-EMB-G2 samples as shown below.

The optical durability test under the non-biased condition was performed as follows: After the measurement of the initial photoelectric conversion efficiency, some samples were placed in a dark place kept at 26° C. with a relative humidity of 54%. Light having a power of AM 1.5 (100 mW/$cm^2$) was applied to the samples for 550 hours, and then the photoelectric conversion efficiencies of the samples were measured under the illumination condition of AM 1.5 (100 mW/$cm^2$). The reduction relative to the initial value (the ratio of the photoelectric conversion efficiency after the optical durability test to the initial value) was evaluated for each sample. The SC-CMP-G2 samples showed a greater reduction in the photoelectric conversion efficiency compared with the SC-EMB-G2 samples as shown below.

| | [Vibration durability] | [Optical durability] |
|---|---|---|
| SC-CMP-G2 | 0.82 | 0.81 |
| | (relative to those of SC-EMB-G2) | |

The evaluation of the vibration durability and optical durability under the biased condition at high temperature with high humidity was performed as follows: After the measurement of the initial photoelectric conversion efficiency, some samples were placed in a dark place kept at 81° C. with a relative humidity of 90%, and a forward bias voltage of 0.71 V was applied to the samples. The vibration described above was applied to some of the samples and light having a power of AM 1.5 was applied to the other samples under the same conditions as those in the non-biased vibration test. The photoelectric conversion efficiencies of the samples were measured under the illumination condition of AM 1.5 (100 mW/$cm^2$). The SC-CMP-G2 samples also showed a greater reduction in the photoelectric conversion efficiency compared with the SC-EMB-G2 samples after the vibration and optical durability tests as shown below.

Under the biased condition:

| | [Vibration durability] | [Optical durability] |
|---|---|---|
| SC-CMP-G2 | 0.81 | 0.80 |
| | (relative to that of SC-EMB-G2) | |

The surfaces of the samples were observed using an optical microscope to evaluate film separation. No film separation was observed in the SC-EMB-G2 samples, whereas slight film separation was observed in the SC-CMP-G2 samples.

From the above results, it can be concluded that the solar cells (SC-EMB-G2) according to the present invention are better than the conventional solar cells (SC-CMP-G2) in optical durability, adhesion, series resistance, overall durability, and fill factor (F.F.) and uniformity of the photoelectric conversion efficiency.

EXAMPLE G3 ACCORDING TO THE INVENTION

A triple solar cell having a structure illustrated in FIG. 6 was made using the deposition equipment shown in FIG. 7.

In the same way as for example G1, a substrate 490 on which the optical reflection layer 101 and the reflection enhancing layer 102 had been formed in the same was as for example G1 was placed on the substrate transfer rail 413 in the load chamber 401, and the load chamber 401 was evacuated with a vacuum pump (not shown) down to a pressure of about $1\times10^{-2}$ Torr. Then, the gate valve 406 was opened, and the substrate 490 was transferred to the deposition chamber 417 via the transfer chamber 402, both deposition chamber 417 and transfer chamber 402 having been evacuated with a vacuum pump (not shown). The substrate 490 was placed so as to contact with the heater 410 at its rear surface, and heated. The inside of the deposition chamber 417 was evacuated with the vacuum pump (not shown) down to a pressure of about $1\times10^{-5}$ Torr.

In this way, semiconductor film deposition was prepared, and an RF n-layer 103 of μc-Si was then deposited in the same way as for example G2.

The gate valve 407 was opened, and the substrate 490 was transferred to the deposition chamber 418 via the transfer chamber 403, both deposition chamber 418 and transfer chamber 403 having been evacuated with a vacuum pump (not shown). The substrate 490 was placed so as to contact with the heater 411 at its rear surface, and heated. The inside of the deposition chamber 418 was evacuated with the vacuum pump (not shown) down to a pressure of about $1\times10^{-5}$ Torr.

An n/i buffer layer 151 of a-Si, an MW i-layer 114 of a-SiGe, and a p/i buffer layer 161 of a-Si were then deposited by means of RFPCVD, MWPCVD, and RFPCVD in the same way as for example G2.

The substrate was then subjected to plasma treatment with hydrogen gas containing a small amount of Group-III element based gas under the conditions shown in Table G3(1), according to the present invention.

In this plasma treatment with hydrogen gas containing the small amount of Group-III element based gas according to the present invention, $B_2H_6/H_2$ (diluted to 10%) serving as group-III-element compound gas, $SiCl_2H_2$/He (diluted to 1000 ppm) serving as silicon compound gas and $H_2$ were introduced into the deposition chamber 418 via the gas inlet 449. The $H_2$ gas was supplied by opening the valves 463, 453, 450 and its flow rate was adjusted to 1500 sccm by means of the mass flow controller 458. The Group-III element compound gas was supplied by opening the valves 468 and 466, and its flow rate was controlled by the mass flow controller 467 such that the flow rate of the $B_2H_6/H_2$ gas was maintained at 2.0% of the total gas flow rate of $H_2$. The silicon compound gas was supplied by opening the valve (not shown) and its flow rate was controlled by the mass flow controller (not shown) such that the flow rate of the $SiCl_2H_2$ (diluted to 1000 ppm) gas was maintained at 0.03% of the total gas flow rate of $H_2$. Furthermore, the pressure inside the deposition chamber 418 was adjusted to 0.008 Torr by means of a conductance valve (not shown). The substrate 490 was heated by the substrate heater 411 up to 330° C. When the temperature of the substrate had become stable, a MW power of 0.15 W/cm$^3$ was applied to the i-layer deposition chamber 418 through the wave guide 426 and the microwave entrance window 425 by the MW power supply (not shown) so that a glow discharge occurs in the deposition chamber 418. The shutter 427 was opened, and the substrate was exposed for four minutes to the hydrogen gas plasma containing the small amount of Group-III element based gas according to the present invention. The MW power was then shut off to stop the glow discharge. The supply of the $B_2H_6/H_2$ (diluted to 10%) and $SiCl_2H_2$/He (diluted to 1000 ppm) gas into the deposition chamber 418 was stopped, whereas the $H_2$ gas was fed further for four minutes into the deposition chamber 418. Then, the $H_2$ gas was also shut off, and the inside of the deposition chamber 418 as well as the inside of the gas lines was evacuated down to $1\times10^{-5}$ Torr.

Next, in the same way as for example G2, an RF p-layer 105 of a-SiC, an RF n-layer 203 of μc-Si, an n/i buffer layer 251 of a-Si, an MW i-layer 214 of a-SiGe, and a p/i buffer layer 261 of a-Si were deposited by means of RFPCVD and MWPCVD in that order.

The substrate was then subjected to plasma treatment with hydrogen gas containing a small amount of Group-III element based gas under the conditions shown in Table G3(2), according to the present invention.

In this plasma treatment with hydrogen gas containing the small amount of Group-III element based gas according to the present invention, $B_2H_6/H_2$ (diluted to 10%) serving as group-III-element compound gas, $SiH_4$ serving as silicon compound gas and $H_2$ were introduced into the deposition chamber 418 via the gas inlet 449. The $H_2$ gas was supplied by opening the valves 463, 453, 450 and its flow rate was adjusted to 1200 sccm by means of the mass flow controller 458. The Group-III element compound gas was supplied by opening the valves 468 and 466, and its flow rate was controlled by the mass flow controller 467 such that the flow rate of the $B_2H_6/H_2$ (diluted to 10%) gas was maintained at 1.0% of the total gas flow rate of $H_2$. The silicon compound gas was supplied by opening the valves 461 and 451, and its flow rate was controlled by the mass flow controller 456 such that the flow rate of the $SiH_4$ gas was maintained at 0.03% of the total gas flow rate of $H_2$. Furthermore, the pressure inside the deposition chamber 418 was adjusted to 0.7 Torr by means of a conductance valve (not shown). The substrate 490 was heated by the substrate heater 411 up to 280° C. When the temperature of the substrate had become stable, a RF power of 0.04 W/cm$^3$ was applied to the bias bar 428 by the RF power supply 424 so that a glow discharge occurs in the deposition chamber 418. The shutter 427 was then opened, and under the above-described conditions, the substrate was exposed for three minutes to the hydrogen gas plasma containing the small amount of silane-based gas according to the present invention. The RF power was then shut off to stop the glow discharge. The supply of the $B_2H_6/H_2$ (diluted to 10%) and $SiH_4$ gas into the deposition chamber 418 was stopped, whereas the $H_2$ gas was fed further for three minutes into the deposition chamber 418. Then, the $H_2$ gas was also shut off, and the inside of the deposition chamber 418 as well as the inside of the gas lines was evacuated down to $1\times10^{-5}$ Torr.

Next, in the same way as for example G2, an RF p-layer 205 of a-SiC, an RF n-layer 303 of μc-Si, an n/i buffer layer 351 of a-SiC, and an RF i-layer 314 of a-Si, and a p/i buffer layer 361 of a-Si, were deposited in that order by means of RFPCVD.

The substrate was then subjected to plasma treatment with hydrogen gas containing a small amount of Group-III element based gas under the conditions shown in Table G3(3), according to the present invention.

In this plasma treatment with hydrogen gas containing the small amount of Group-III element based gas according to the present invention, $B_2H_6/H_2$ (diluted to 10%) serving as Group-III element compound gas, $SiH_4$ serving as silicon compound gas and $H_2$ were introduced into the deposition chamber 418 via the gas inlet 449. The $H_2$ gas was supplied by opening the valves 463, 453, 450 and its flow rate was adjusted to 1400 sccm by means of the mass flow controller 458. The Group-III element compound gas was supplied by opening the valves 468 and 466, and its flow rate was controlled by the mass flow controller 467 such that the flow rate of the $B_2H_6/H_2$ gas was maintained at 0.5% of the total gas flow rate of $H_2$. The silicon compound gas was supplied by opening the valves 461 and 451, and its flow rate was controlled by the mass flow controller 456 such that the flow rate of the $SiH_4$ gas was maintained at 0.03% of the total gas flow rate of $H_2$. Furthermore, the pressure inside the deposition chamber 418 was adjusted to 0.8 Torr by means of a conductance valve (not shown). The substrate 490 was heated by the substrate heater 411 up to 200° C. When the temperature of the substrate had become stable, a RF power of 0.04 W/cm$^3$ was applied to the bias bar 428 by the RF power supply 424 so that a glow discharge occurs in the deposition chamber 418. The shutter 427 was then opened, and under the above-described conditions, the substrate was exposed for three minutes to the hydrogen gas plasma containing the small amount of Group-III-element based gas according to the present invention. The RF power was then shut off to stop the glow discharge. The supply of the $B_2H_6/H_2$ (diluted to 10%) and $SiH_4$ gas into the deposition chamber 418 was stopped, whereas the $H_2$ gas was fed further for three minutes into the deposition chamber 418. Then, the $H_2$ gas was also shut off, and the inside of the deposition chamber 418 as well as the inside of the gas lines was evacuated down to $1\times10^{-5}$ Torr.

Next, in the same way as for example G2, an RF p-layer 305 of a-SiC was deposited by means of RFPCVD.

ITO was then evaporated onto the RF p-layer 305 so as to form a transparent conductive layer 112 having a thickness of 70 nm.

A mask having a comb-shaped window was placed on the transparent conductive layer 112, and metal evaporation was performed via the mask to form a comb-shaped collection electrode 113 having a multi-layer structure consisting of Cr (40 nm), Ag (1000 nm), and Cr (40 nm).

In this way, the complete solar cell according to the invention was obtained. Hereinafter, the solar cell of this type will be referred to as SC-EMB-G3. Tables G3(1) through G3(4) indicate the conditions used here in the invention, regarding the plasma treatment with hydrogen containing a small amount of group-III-element-based gas as well as the process conditions for the RF n-layer, n/i buffer layer, MW i-layer, p/i buffer layer, RF p-layer, RF n-layer, n/i buffer layer. MW i-layer, p/i buffer layer, RF p-layer, RF n-layer, n/i buffer layer, RF i-layer, p/i buffer layer, and RF p-layer.

COMPARATIVE EXAMPLE G3

For the sake of comparison, a solar cell (SC-CMP-G3) was also fabricated in the same manner as in the above-described example G3 except that the plasma treatment with hydrogen gas containing a small amount of Group-III element based gas according to the invention was not performed.

Six samples of solar cells were prepared for each type (SC-EMB-G3 and SC-CMP-G3) for the purpose of evaluation regarding the initial photoelectric conversion efficiency (the ratio of the electric output power to the optical input power), vibration durability and optical durability under a biased condition at high temperature with high humidity, vibration durability and optical durability under a non-biased condition, and characteristics with a reverse bias voltage applied.

The measurement of the initial photoelectric conversion efficiency was performed by measuring the V-I characteristics of the samples under the illumination condition of AM 1.5 (100 mW/cm$^2$). The measurement revealed that the SC-EMB-G3 samples had a smaller series resistance and variation in the initial photoelectric conversion efficiencies than the SC-CMP-G3 samples and had a larger fill factor (F.F.) as shown below:

| | [Fill factor (F.F.)] | [Series resistance] | [Variation] |
|---|---|---|---|
| SC-EMB-G3 | 1.14 | 0.89 | 0.83 |
| | (relative to that of SC-CMP-G3) | | |

The evaluation of the vibration durability under the non-biased condition was performed as follows: After the measurement of the initial photoelectric conversion efficiency, some samples were placed in a dark place kept at 26° C with a relative humidity of 55%. Vibration having an amplitude of 0.1 mm and a frequency of 60 Hz was applied to the samples for 550 hr. Then, the photoelectric conversion efficiencies of the samples were measured under the illumination condition of AM 1.5 (100 mW/cm$^2$) and the reduction relative to the initial value (the ratio of the photoelectric conversion efficiency after the vibration test to the initial value) was evaluated for each sample. The SC-CMP-G3 samples showed a greater reduction in the photoelectric conversion efficiency compared with the SC-EMB-G3 samples as shown below.

The evaluation of the optical durability under the non-biased condition was performed as follows: After the measurement of the initial photoelectric conversion efficiency, some samples were placed in a dark place kept at 26° C. with a relative humidity of 55%. Light having a power of AM 1.5 (100 mW/cm$^2$) was applied to the samples for 550 hours, and then the photoelectric conversion efficiencies of the samples were measured under the illumination condition of AM 1.5 (100 mW/cm$^2$). The reduction relative to the initial value (the ratio of the photoelectric conversion efficiency after the optical durability test to the initial value) was evaluated for each sample. The SC-CMP-G3 samples showed a greater reduction in the photoelectric conversion efficiency compared with the SC-EMB-G3 samples as shown below.

| | [Vibration durability] | [Optical durability] |
|---|---|---|
| SC-CMP-G3 | 0.83 | 0.82 |
| | (relative to those of SC-EMB-G3) | |

The evaluation of the vibration durability and optical durability under the biased condition at high temperature with high humidity was performed as follows: After the measurement of the initial photoelectric conversion efficiency, some samples were placed in a dark place kept at 82° C. with a relative humidity of 93%, and a forward bias voltage of 0.71 V was applied to the samples. The vibration described above was applied to some of the samples and light having a power of AM 1.5 was applied to the other samples under the same conditions as those in the non-biased vibration test. The photoelectric conversion efficiencies of the samples were measured under the illumination condition of AM 1.5 (100 mW/cm$^2$). The SC-CMP-G3 samples also showed a greater reduction in the photoelectric conversion efficiency compared with the SC-EMB-G3 samples after the vibration and optical durability tests as shown below.

| | [Vibration durability] | [Optical durability] |
|---|---|---|
| SC-CMP-G3 | 0.84 | 0.82 |
| | (relative to that of SC-EMB-G3) | |

The evaluation of the characteristics with a reverse bias voltage being applied was performed as follows: After the measurement of the initial photoelectric conversion efficiency, some samples were placed in a dark place kept at 80° C. with a relative humidity of 52%. A reverse bias voltage of 5.0 V was applied to the samples for 100 hours, and then the photoelectric conversion efficiencies of the samples were measured under the illumination condition of AM 1.5 (100 mW/cm$^2$). The reduction relative to the initial value (the ratio of the photoelectric conversion efficiency after the reverse bias voltage is applied to the initial value) was evaluated for each sample. The SC-CMP-G3 samples showed a greater reduction in the photoelectric conversion efficiency compared with the SC-EMB-G3 samples as shown below.

| | |
|---|---|
| SC-CMP-G3 | 0.86 |
| (relative to those of SC-EMB-G3) | |

The surfaces of the samples were observed using an optical microscope to evaluate film separation. No film separation was observed in the SC-EMB-G3 samples, whereas slight film separation was observed in the SC-CMP-G3 samples.

From the above results, it can be concluded that the solar cells (SC-EMB-G3) according to the present invention are better than the conventional solar cells (SC-CMP-G3) in optical durability, adhesion, series resistance, overall durability, the fill factor (F.F.) of the photoelectric conversion efficiency, uniformity of the photoelectric conversion efficiency, and characteristics with a reverse bias voltage being applied of the photoelectric conversion efficiency.

EXAMPLE G4 ACCORDING TO THE INVENTION

A solar cell having a triple structure illustrated in FIG. 6 was made using the deposition equipment shown in FIG. 7 in the same way as for example G3. Plasma treatment with hydrogen gas containing a small amount of Group-III element based gas was performed three times under the conditions shown in Table G4(1). Other fabrication conditions employed are shown in Table G4(2).

The fabricated samples are evaluated in a similar manner to that for the example G3, and the results are shown in Table G4(3).

As can be seen from Table G4(3), it is preferable that the flow rate of hydrogen gas in the plasma treatment with hydrogen containing a small amount of Group-III element based gas ranges from 1 to 2000 sccm to obtain an excellent fill factor (F.F.), uniformity, and characteristics with a reverse bias voltage being applied of the photoelectric conversion efficiency, optical durability, adhesion, series resistance, and overall durability.

EXAMPLE G5 ACCORDING TO THE INVENTION

A solar cell having a triple structure illustrated in FIG. 6 was made using the deposition equipment shown in FIG. 7 in the same way as for example G3. Plasma treatment with hydrogen gas containing a small amount of Group-III element based gas was performed three times under the conditions shown in Table G5(1). Other fabrication conditions employed are shown in Table G5(2).

The fabricated samples are evaluated in a similar manner to that for the example G3, and the results are shown in Table G5(3).

In this example, VHF power was used to excite the plasma for the plasma treatment whereas RF power was used in example G4. As can be seen from Table G5(3), it is also preferable that the flow rate of hydrogen gas in the plasma treatment containing the small amount of Group-III element based gas ranges from 1 to 2000 sccm to obtain a good fill factor (F.F.), uniformity, and characteristics with a reverse bias voltage being applied of the photoelectric conversion efficiency, optical durability, adhesion, series resistance, and overall durability.

EXAMPLE G6 ACCORDING TO THE INVENTION

A solar cell having a triple structure illustrated in FIG. 6 was made using the deposition equipment shown in FIG. 7 in the same way as for example G3. Plasma treatment with hydrogen gas containing a small amount of Group-III element based gas was performed three times under the conditions shown in Table G6(1). Other fabrication conditions employed are shown in Table G6(2).

The fabricated samples are evaluated in a similar manner to that for the example G3, and the results are shown in Table G6(3).

As can be seen from Table G6(3), it is preferable that the content of the group-III-element compound gas added to the hydrogen gas in the plasma treatment ranges from 0.05% to 3%. to obtain a good fill factor (F.F.), uniformity, and characteristics with a reverse bias voltage being applied of the photoelectric conversion efficiency, optical durability, adhesion, series resistance, and overall durability.

EXAMPLE G7 ACCORDING TO THE INVENTION

A solar cell having a triple structure illustrated in FIG. 6 was made using the deposition equipment shown in FIG. 7 in the same way as for example G3. Plasma treatment with hydrogen gas containing a small amount of Group-III element based gas was performed three times under the conditions shown in Table G7(1). Other fabrication conditions employed are shown in Table G7(2).

The fabricated samples are evaluated in a similar manner to that for the example G3, and the results are shown in Table G7(3).

In this example, VHF power was used to excite the plasma for the plasma treatment, whereas RF power was used in the above example G6. As can be seen from Table G7(3), it is also preferable that the content of the Group-III element compound gas added to the hydrogen gas in the plasma treatment ranges from 0.05% to 3%. to obtain a good fill factor (F.F.), uniformity, and characteristics with a reverse bias voltage being applied of the photoelectric conversion efficiency, optical durability, adhesion, series resistance, and overall durability.

EXAMPLE G8 ACCORDING TO THE INVENTION

A solar cell having a triple structure illustrated in FIG. 6 was made using the deposition equipment shown in FIG. 7 in the same way as for example G3. Plasma treatment with hydrogen gas containing a small amount of Group-III element based gas was performed three times under the conditions shown in Table G8(1). Other fabrication conditions employed are shown in Table G8(2).

The fabricated samples are evaluated in a similar manner to that for the example G3, and the results are shown in Table G8(3).

In this example, MW power was used to excite the plasma for the plasma treatment, whereas RF power was used in example G6. As can be seen from Table G8(3), it is also preferable that the content of the Group-III element compound gas added to the hydrogen gas in the plasma treatment ranges from 0.05% to 3%. to obtain a good fill factor (F.F.), uniformity, and characteristics with a reverse bias voltage being applied of the photoelectric conversion efficiency, optical durability, adhesion, series resistance, and overall durability.

EXAMPLE G9 ACCORDING TO THE INVENTION

A solar cell having a triple structure illustrated in FIG. 6 was made using the deposition equipment shown in FIG. 7 in the same way as for example G3. Plasma treatment with hydrogen gas containing a small amount of Group-III element based gas was performed three times under the conditions shown in Table G9(1). Other fabrication conditions employed are shown in Table G9(2).

The fabricated samples are evaluated in a similar manner to that for the example G3, and the results are shown in Table G9(3).

As can be seen from Table G9(3), it is preferable that the content of the Group-III element compound gas added to the hydrogen gas in the plasma treatment ranges from 0.001% to 0.1%. to obtain a good fill factor (F.F.), uniformity, and characteristics with a reverse bias voltage being applied of the photoelectric conversion efficiency, optical durability, adhesion, series resistance, and overall durability.

EXAMPLE G10 ACCORDING TO THE INVENTION

A solar cell having a triple structure illustrated in FIG. 6 was made using the deposition equipment shown in FIG. 7 in the same way as for example G3. Plasma treatment with hydrogen gas containing a small amount of Group-III element based gas was performed three times under the conditions shown in Table G10(1). Other fabrication conditions employed are shown in Table G10(2).

The fabricated samples are evaluated in a similar manner to that for the example G3, and the results are shown in Table G10(3).

In this example, VHF power was used to excite the plasma for the plasma treatment, whereas RF power was used in the above example G9. As can be seen from Table G10(3), it is also preferable that the content of the Group-III element compound gas added to the hydrogen gas in the plasma treatment ranges from 0.001% to 0.1%. to obtain a good fill factor (F.F.), uniformity, and characteristics with a reverse bias voltage being applied of the photoelectric conversion efficiency, optical durability, series resistance, and overall durability.

EXAMPLE G11 ACCORDING TO THE INVENTION

A solar cell having a triple structure illustrated in FIG. 6 was made using the deposition equipment shown in FIG. 7 in the same way as for example G3. Plasma treatment with hydrogen gas containing a small amount of Group-III element based gas was performed three times under the conditions shown in Table G11(1). Other fabrication conditions employed are shown in Table G11(2).

The fabricated samples are evaluated in a similar manner to that for the example G3, and the results are shown in Table G11(3).

In this example, MW power was used to excite the plasma for the plasma treatment, whereas RF power was used in the above example G9. As can be seen from Table G11(3), it is also preferable that the content of the Group-III element compound gas added to the hydrogen gas in the plasma treatment ranges from 0.001% to 0.1%. to obtain a good fill factor (F.F.), uniformity, and characteristics with a reverse bias voltage being applied of the photoelectric conversion efficiency, optical durability, series resistance, and overall durability.

EXAMPLE G12 ACCORDING TO THE INVENTION

A solar cell having a triple structure illustrated in FIG. 6 was made using the deposition equipment shown in FIG. 7 in the same way as for example G3. Plasma treatment with hydrogen gas containing a small amount of Group-III element based gas was performed three times under the conditions shown in Table G12(1). Other fabrication conditions employed are shown in Table G12(2).

The fabricated samples are evaluated in a similar manner to that for the example G3, and the results are shown in Table G12(3).

As can be seen from Table G12(3), when an RF power is applied, it is preferable that the pressure in the plasma treatment with the hydrogen gas containing a small amount of Group-III element based gas ranges from 0.05 Torr to 10 Torr to obtain a good fill factor (F.F.), uniformity, and characteristics with a reverse bias voltage being applied of the photoelectric conversion efficiency, optical durability, series resistance, and overall durability.

EXAMPLE G13 ACCORDING TO THE INVENTION

A solar cell having a triple structure illustrated in FIG. 6 was made using the deposition equipment shown in FIG. 7 in the same way as for example G3. Plasma treatment with hydrogen gas containing a small amount of Group-III element based gas was performed three times under the conditions shown in Table G13(1). Other fabrication conditions employed are shown in Table G13(2).

The fabricated samples are evaluated in a similar manner to that for the example G3, and the results are shown in Table G13(3).

As can be seen from Table G13(3), when a VHF power is applied, it is preferable that the pressure in the plasma treatment with the hydrogen gas containing a small amount of Group-III element based gas ranges from 0.0001 Torr to 1 Torr to obtain a good fill factor (F.F.), uniformity, and characteristics with a reverse bias voltage being applied of the photoelectric conversion efficiency, optical durability, series resistance, and overall durability.

EXAMPLE G14 ACCORDING TO THE INVENTION

A solar cell having a triple structure illustrated in FIG. 6 was made using the deposition equipment shown in FIG. 7 in the same way as for example G3. Plasma treatment with hydrogen gas containing a small amount of Group-III element based gas was performed three times under the conditions shown in Table G14(1). Other fabrication conditions employed are shown in Table G14(2).

The fabricated samples are evaluated in a similar manner to that for the example G3, and the results are shown in Table G14(3).

As can be seen from Table G14(3), when an MW power is applied, it is preferable that the pressure in the plasma treatment with the hydrogen gas containing a small amount of Group-III element based gas ranges from 0.0001 Torr to 0.01 Torr to obtain a good fill factor (F.F.), uniformity, and characteristics with a reverse bias voltage being applied of the photoelectric conversion efficiency, optical durability, series resistance, and overall durability.

EXAMPLE G15 ACCORDING TO THE INVENTION

A solar cell having a triple structure illustrated in FIG. 6 was made using the deposition equipment shown in FIG. 7 in the same way as for example G3. Plasma treatment with hydrogen gas containing a small amount of Group-III element based gas was performed three times under the conditions shown in Table G15(1). Other fabrication conditions employed are shown in Table G15(2).

The fabricated samples are evaluated in a similar manner to that for the example G3, and the results are shown in Table G15(3).

As can be seen from Table G15(3), when RF power is used to excite the plasma, it is preferable that the applied power density (electric power) in the plasma treatment with the hydrogen gas containing a small amount of Group-III element based gas ranges from 0.01 $W/cm^3$ to 1.0 $W/cm^3$ to obtain a good fill factor (F.F.), uniformity, and characteristics with a reverse bias voltage being applied of the photoelectric conversion efficiency, optical durability, series resistance, and overall durability.

EXAMPLE G16 ACCORDING TO THE INVENTION

A solar cell having a triple structure illustrated in FIG. 6 was made using the deposition equipment shown in FIG. 7 in the same way as for example G3. Plasma treatment with hydrogen gas containing a small amount of Group-III element based gas was performed three times under the conditions shown in Table G16(1). Other fabrication conditions employed are shown in Table G16(2).

The fabricated samples are evaluated in a similar manner to that for the example G3, and the results are shown in Table G16(3).

As can be seen from Table G16(3), when a VHF power is used to excite the plasma, it is preferable that the applied power density (electric power) in the plasma treatment with the hydrogen gas containing a small amount of Group-III element based gas ranges from 0.01 W/cm$^3$ to 1.0 W/cm$^3$ to obtain a good fill factor (F.F.), uniformity, and characteristics with a reverse bias voltage being applied of the photoelectric conversion efficiency, optical durability, series resistance, and overall durability.

EXAMPLE G17 ACCORDING TO THE INVENTION

A solar cell having a triple structure illustrated in FIG. 6 was made using the deposition equipment shown in FIG. 7 in the same way as for example G3. Plasma treatment with hydrogen gas containing a small amount of Group-III element based gas was performed three times under the conditions shown in Table G17(1). Other fabrication conditions employed are shown in Table G17(2).

The fabricated samples are evaluated in a similar manner to that for the example G3, and the results are shown in Table G17(3).

As can be seen from Table G17(3), when a MW power is used to excite the plasma, it is preferable that the applied power density (electric power) in the plasma treatment with the hydrogen gas containing a small amount of Group-III element based gas ranges from 0.1 W/cm$^3$ to 10 W/cm$^3$ to obtain a good fill factor (F.F.) and uniformity of the photoelectric conversion efficiency, optical durability, series resistance, and overall durability.

EXAMPLE G18 ACCORDING TO THE INVENTION

A solar cell having a triple structure illustrated in FIG. 6 was made using the deposition equipment shown in FIG. 7 in the same way as for example G3. Plasma treatment with hydrogen gas containing a small amount of Group-III element based gas was performed three times under the conditions shown in Table G18(1). Other fabrication conditions employed are shown in Table G18(2).

The fabricated samples are evaluated in a similar manner to that for the example G3, and the results are shown in Table G18(3).

As can be seen from Table G18(3), when an RF power is used to excite the plasma, it is preferable that the substrate temperature in the plasma treatment with the hydrogen gas containing a small amount of Group-III element based gas ranges from 100° C. to 400° C. to obtain a good fill factor (F.F.), uniformity, and characteristics with a reverse bias voltage being applied of the photoelectric conversion efficiency, optical durability, series resistance, and overall durability.

EXAMPLE G19 ACCORDING TO THE INVENTION

A solar cell having a triple structure illustrated in FIG. 6 was made using the deposition equipment shown in FIG. 7 in the same way as for example G3. Plasma treatment with hydrogen gas containing a small amount of Group-III element based gas was performed three times under the conditions shown in Table G19(1). Other fabrication conditions employed are shown in Table G19(2).

The fabricated samples are evaluated in a similar manner to that for the example G3, and the results are shown in Table G19(3).

As can be seen from Table G19(3), when a VHF power is used to excite the plasma, it is preferable that the substrate temperature in the plasma treatment with the hydrogen gas containing a small amount of Group-III element based gas ranges from 50° C. to 300° C. to obtain a good fill factor (F.F.), uniformity, and characteristics with a reverse bias voltage being applied of the photoelectric conversion efficiency, optical durability, series resistance, and overall durability.

EXAMPLE G20 ACCORDING TO THE INVENTION

A solar cell having a triple structure illustrated in FIG. 6 was made using the deposition equipment shown in FIG. 7 in the same way as for example G3. Plasma treatment with hydrogen gas containing a small amount of Group-III element based gas was performed three times under the conditions shown in Table G20(1). Other fabrication conditions employed are shown in Table G20(2).

The fabricated samples are evaluated in a similar manner to that for the example G3, and the results are shown in Table G20(3).

As can be seen from Table G20(3), when an MW power is used to excite the plasma, it is preferable that the substrate temperature in the plasma treatment with the hydrogen gas containing a small amount of Group-III element based gas ranges from 50° C. to 300° C. to obtain a good fill factor (F.F.) and uniformity of the photoelectric conversion efficiency, optical durability, series resistance, and overall durability.

EXAMPLE G21 ACCORDING TO THE INVENTION

A solar cell having a triple structure illustrated in FIG. 6 was made using the deposition equipment shown in FIG. 7.

A substrate 490 on which the optical reflection layer 101 and the reflection enhancing layer 102 had been formed in the same was as for example G1 was placed on the substrate transfer rail 413 in the load chamber 401, and the load chamber 401 was evacuated with a vacuum pump (not shown) down to a pressure of about 1×10$^{-5}$ Torr. Then, the gate valve 406 was opened, and the substrate 490 was transferred to the deposition chamber 417 via the transfer chamber 402, both deposition chamber 417 and transfer chamber 402 having been evacuated with a vacuum pump (not shown). The substrate 490 was placed so as to contact with the heater 410 at its rear surface, and heated. The inside of the deposition chamber 417 was evacuated with the vacuum pump (not shown) down to a pressure of about 1×10$^{-5}$ Torr.

The substrate was then subjected to plasma treatment with hydrogen gas containing a small amount of silane-based gas under the conditions shown in Table G21(1).

In this plasma treatment with hydrogen gas containing the small amount of silane-based gas according to the present invention, $SiH_4/H_2$ (diluted to 1000 ppm) serving as silicon compound gas and $H_2$ were introduced into the deposition chamber 417 via the gas inlet 429. The $H_2$ gas was supplied by opening the valves 441, 431, 430 and its flow rate was adjusted to 1200 sccm by means of the mass flow controller 436. The silicon compound gas was supplied by opening the valves 442 and 432, and its flow rate was controlled by the mass flow controller 437 such that the flow rate of the $SiH_4$ gas was maintained at 0.03% of the total gas flow rate of $H_2$. Furthermore, the pressure inside the deposition chamber 417 was adjusted to 0.9 Torr by means of a conductance valve (not shown). The substrate 490 was heated by the substrate heater 410 up to 360° C. When the temperature of the substrate had become stable, an RF power of 0.03 $W/cm^3$ was introduced by the RF power supply 422 so that a glow discharge occurs in the plasma excitation cup 420. Under the above-described conditions, the substrate was exposed for three minutes to the hydrogen gas plasma containing the small amount of silane-based gas. The RF power was then shut off to stop the glow discharge. The supply of the $SiH_4/H_2$ (diluted to 1000 ppm) gas into the deposition chamber 417 was stopped, whereas the $H_2$ gas was fed further for five minutes into the deposition chamber 417. Then, the $H_2$ gas was also shut off, and the inside of the deposition chamber 417 as well as the inside of the gas lines was evacuated down to $1\times10^{-5}$ Torr.

In this way, semiconductor film deposition was prepared, and an RF n-layer 103 of μc-Si was then deposited in the same way as for example G2.

The substrate was then subjected to plasma treatment with hydrogen gas containing a small amount of silane-based gas under the conditions shown in Table G21(2).

In this plasma treatment with hydrogen gas containing the small amount of silane-based gas according to the present invention, $SiH_4/H_2$ (diluted to 1000 ppm) serving as silicon compound gas and $H_2$ were introduced into the deposition chamber 417 via the gas inlet 429. The $H_2$ gas was supplied by opening the valves 441, 431, 430 and its flow rate was adjusted to 950 sccm by means of the mass flow controller 436. The silicon compound gas was supplied by opening the valves 442 and 432, and its flow rate was controlled by the mass flow controller 437 such that the flow rate of the $SiH_4$ gas was maintained at 0.02% of the total gas flow rate of $H_2$. Furthermore, the pressure inside the deposition chamber 417 was adjusted to 0.9 Torr by means of a conductance valve (not shown). The substrate 490 was heated by the substrate heater 410 up to 350° C. When the temperature of the substrate had become stable, an RF power of 0.03 $W/cm^3$ was introduced by the RF power supply 422 so that a glow discharge occurs in the plasma excitation cup 420. Under the above-described conditions, the substrate was exposed for three minutes to the hydrogen gas plasma containing the small amount of silane-based gas. The RF power was then shut off to stop the glow discharge. The supply of the $SiH_4/H_2$ (diluted to 1000 ppm) gas into the deposition chamber 417 was stopped, whereas the $H_2$ gas was fed further for five minutes into the deposition chamber 417. Then, the $H_2$ gas was also shut off, and the inside of the deposition chamber 417 as well as the inside of the gas lines was evacuated down to $1\times10^{-5}$ Torr.

The gate valve 407 was opened, and the substrate 490 was transferred to the deposition chamber 418 via the transfer chamber 403, both deposition chamber 418 and transfer chamber 403 having been evacuated with a vacuum pump (not shown). The substrate 490 was placed so as to contact with the heater 411 at its rear surface, and heated. The inside of the deposition chamber 418 was evacuated with the vacuum pump (not shown) down to a pressure of about $1\times10^{-5}$ Torr.

An n/i buffer layer 151 of a-SiC was then deposited by means of RFPCVD in the same way as for example G2.

The substrate was then subjected to plasma treatment with hydrogen gas containing a small amount of silane-based gas under the conditions shown in Table G21(3), according to the present invention.

In this plasma treatment with hydrogen gas containing the small amount of silane-based gas according to the present invention, $SiH_4$ serving as silicon compound gas and $H_2$ were introduced into the deposition chamber 418 via the gas inlet 449. The $H_2$ gas was supplied by opening the valves 463, 453, 450 and its flow rate was adjusted to 700 sccm by means of the mass flow controller 458. The silicon compound gas was supplied by opening the valves 461 and 451 and its flow rate was controlled by the mass flow controller 456 such that the flow rate of the $SiH_4$ gas was maintained at 0.04% of the total gas flow rate of $H_2$. Furthermore, the pressure inside the deposition chamber 418 was adjusted to 0.7 Torr by means of a conductance valve (not shown). The substrate 490 was heated by the substrate heater 411 up to 350° C. When the temperature of the substrate had become stable, an RF power of 0.03 $W/cm^3$ was applied to the bias bar 428 by the RF power supply 424 so that a glow discharge occurs in the deposition chamber 418. Under the above-described conditions, the substrate was exposed for 3 minutes to the hydrogen gas plasma containing the small amount of silane-based gas according to the present invention. The RF power was then shut off to stop the glow discharge. The supply of the $SiH_4$ gas into the deposition chamber 418 was stopped, whereas the $H_2$ gas was fed further for 3 minutes into the deposition chamber 418. Then, the $H_2$ gas was also shut off, and the inside of the deposition chamber 418 as well as the inside of the gas lines was evacuated down to $1\times10^{-5}$ Torr.

An MW i-layer 114 of a-SiGe was then deposited in the same way as for the example G2.

The substrate was then subjected to plasma treatment with hydrogen gas containing a small amount of silane-based gas under the conditions shown in Table G21(4).

In this plasma treatment with hydrogen gas containing the small amount of silane-based gas according to the present invention, $SiH_4$ serving as silicon compound gas and $H_2$ were introduced into the deposition chamber 418 via the gas inlet 449. The $H_2$ gas was supplied by opening the valves 463, 453, 450 and its flow rate was adjusted to 900 sccm by means of the mass flow controller 458. The silicon compound gas was supplied by opening the valves 461 and 451 and its flow rate was controlled by the mass flow controller 456 such that the flow rate of the $SiH_4$ gas was maintained at 0.04% of the total gas flow rate of $H_2$. Furthermore, the pressure inside the deposition chamber 418 was adjusted to 0.6 Torr by means of a conductance valve (not shown). The substrate 490 was heated by the substrate heater 411 up to 330° C. When the temperature of the substrate had become stable, an RF power of 0.03 $W/cm^3$ was applied to the bias bar 428 by the RF power supply 424 so that a glow discharge occurs in the deposition chamber 418. The shutter 427 was then opened, and under the above-described conditions, the substrate was exposed for 3 minutes to the hydrogen gas plasma containing the small amount of silane-based gas according to the present invention. The RF power was then shut off to stop the glow discharge. The supply of the $SiH_4$ gas into the deposition chamber 418 was stopped, whereas the $H_2$ gas was fed further for 3 minutes into the deposition chamber 418. Then, the $H_2$ gas was also shut off, and the inside of the deposition chamber 418 as well as the inside of the gas lines was evacuated down to $1\times10^{-5}$ Torr.

A p/i buffer layer 161 of a-SiC was then deposited in the same way as for the example G2 by means of RFPCVD.

The substrate was then subjected to plasma treatment with hydrogen gas containing a small amount of Group-III element based gas under the conditions shown in Table G21(5).

In this plasma treatment with hydrogen gas containing the small amount of Group-III element based gas according to the present invention, $B_2H_6/H_2$ (diluted to 10%) serving as group-III-element compound gas, $SiH_4$ serving as silicon compound gas and $H_2$ were introduced into the deposition chamber 418 via the gas inlet 449. The $H_2$ gas was supplied by opening the valves 463, 453, 450 and its flow rate was adjusted to 1000 sccm by means of the mass flow controller 458. The Group-III element compound gas was supplied by opening the valves 468 and 466, and its flow rate was controlled by the mass flow controller 467 such that the flow rate of the $B_2H_6/H_2$ gas was maintained at 0.6% of the total gas flow rate of $H_2$. The silicon compound gas was supplied by opening the valves 461 and 451 and its flow rate was controlled by the mass flow controller 456 such that the flow rate of the $SiH_4$ gas was maintained at 0.03% of the total gas flow rate of $H_2$. Furthermore, the pressure inside the deposition chamber 418 was adjusted to 0.6 Torr by means of a conductance valve (not shown). The substrate 490 was heated by the substrate heater 411 up to 300° C. When the temperature of the substrate had become stable, an RF power of 0.03 W/cm$^3$ was applied to the bias bar 428 by the RF power supply 424 so that a glow discharge occurs in the deposition chamber 418. The shutter 427 was then opened, and under the above-described conditions, the substrate was exposed for 3 minutes to the hydrogen gas plasma containing the small amount of Group-III element based gas according to the present invention. The RF power was then shut off to stop the glow discharge. The supply of the $B_2H_6/H_2$ (diluted to 10%) and $SiH_4$ gas into the deposition chamber 418 was stopped, whereas the $H_2$ gas was fed further for 3 minutes into the deposition chamber 418. Then, the $H_2$ gas was also shut off, and the inside of the deposition chamber 418 as well as the inside of the gas lines was evacuated down to $1\times10^{-5}$ Torr.

An RF p-layer 105 of a-SiC and an RF n-layer 103 of μc-Si were then deposited in the same way as for the example G2 by means of RFPCVD.

The substrate was then subjected to plasma treatment with hydrogen gas containing a small amount of silane-based gas under the conditions shown in Table G21(6).

In this plasma treatment with hydrogen gas containing the small amount of silane-based gas according to the present invention, $SiH_4/H_2$ (diluted to 1000 ppm) serving as silicon compound gas and $H_2$ were introduced into the deposition chamber 417 via the gas inlet 429. The $H_2$ gas was supplied by opening the valves 441, 431, 430 and its flow rate was adjusted to 1200 sccm by means of the mass flow controller 436. The silicon compound gas was supplied by opening the valves 442 and 432, and its flow rate was controlled by the mass flow controller 437 such that the flow rate of the $SiH_4$ gas was maintained at 0.04% of the total gas flow rate of $H_2$. Furthermore, the pressure inside the deposition chamber 417 was adjusted to 0.8 Torr by means of a conductance valve (not shown). The substrate 490 was heated by the substrate heater 410 up to 300° C. When the temperature of the substrate had become stable, an RF power of 0.03 W/cm$^3$ was introduced by the RF power supply 422 so that a glow discharge occurs in the plasma excitation cup 420. Under the above-described conditions, the substrate was exposed for three minutes to the hydrogen gas plasma containing the small amount of silane-based gas. The RF power was then shut off to stop the glow discharge. The supply of the $SiH_4/H_2$ (diluted to 1000 ppm) gas into the deposition chamber 417 was stopped, whereas the $H_2$ gas was fed further for three minutes into the deposition chamber 417. Then, the $H_2$ gas was also shut off, and the inside of the deposition chamber 417 as well as the inside of the gas lines was evacuated down to $1\times10^{-5}$ Torr.

An n/i buffer layer 251 of a-SiC was then deposited by means of RFPCVD in the same way as for example G2.

The substrate was then subjected to plasma treatment with hydrogen gas containing a small amount of silane-based gas under the conditions shown in Table G21(7), according to the present invention.

In this plasma treatment with hydrogen gas containing the small amount of silane-based gas according to the present invention, $SiH_4$ serving as silicon compound gas and $H_2$ were introduced into the deposition chamber 418 via the gas inlet 449. The $H_2$ gas was supplied by opening the valves 463, 453, 450 and its flow rate was adjusted to 1100 sccm by means of the mass flow controller 458. The silicon compound gas was supplied by opening the valves 461 and 451 and its flow rate was controlled by the mass flow controller 456 such that the flow rate of the $SiH_4$ gas was maintained at 0.03% of the total gas flow rate of $H_2$. Furthermore, the pressure inside the deposition chamber 418 was adjusted to 0.7 Torr by means of a conductance valve (not shown). The substrate 490 was heated by the substrate heater 411 up to 300° C. When the temperature of the substrate had become stable, an RF power of 0.03 W/cm$^3$ was applied to the bias bar 428 by the RF power supply 424 so that a glow discharge occurs in the deposition chamber 418. The shutter 427 was then opened, and under the above-described conditions, the substrate was exposed for 3 minutes to the hydrogen gas plasma containing the small amount of silane-based gas according to the present invention. The RF power was then shut off to stop the glow discharge. The supply of the $SiH_4$ gas into the deposition chamber 418 was stopped, whereas the $H_2$ gas was fed further for 3 minutes into the deposition chamber 418. Then, the $H_2$ gas was also shut off, and the inside of the deposition chamber 418 as well as the inside of the gas lines was evacuated down to $1\times10^{-5}$ Torr.

An MW i-layer 214 of a-SiGe was then deposited by means of MWPCVD in the same way as for example G2.

The substrate was then subjected to plasma treatment with hydrogen gas containing a small amount of silane-based gas under the conditions shown in Table G21(8), according to the present invention.

In this plasma treatment with hydrogen gas containing the small amount of silane-based gas according to the present invention, $SiH_4$ serving as silicon compound gas and $H_2$ were introduced into the deposition chamber 418 via the gas inlet 449. The $H_2$ gas was supplied by opening the valves 463, 453, 450 and its flow rate was adjusted to 1200 sccm by means of the mass flow controller 458. The silicon compound gas was supplied by opening the valves 461 and 451 and its flow rate was controlled by the mass flow controller 456 such that the flow rate of the $SiH_4$ gas was maintained at 0.03% of the total gas flow rate of $H_2$. Furthermore, the pressure inside the deposition chamber 418 was adjusted to 0.6 Torr by means of a conductance valve (not shown). The substrate 490 was heated by the substrate heater 411 up to 280° C. When the temperature of the substrate had become stable, an RF power of 0.04 W/cm$^3$ was applied to the bias bar 428 by the RF power supply 424 so that a glow discharge occurs in the deposition chamber 418. The shutter 427 was then opened, and under the above-described conditions, the substrate was exposed for 3 minutes to the hydrogen gas plasma containing the small amount of silane-based gas according to the present invention. The RF power was then shut off to stop the glow discharge. The supply of the $SiH_4$ gas into the deposition chamber 418 was stopped, whereas the $H_2$ gas was fed further for 3 minutes into the deposition chamber 418. Then, the $H_2$ gas was also shut off, and the inside of the deposition chamber 418 as well as the inside of the gas lines was evacuated down to $1\times10^{-5}$ Torr.

A p/i buffer layer 261 of a-SiC was then deposited by means of RFPCVD in the same way as for example G2.

The substrate was then subjected to plasma treatment with hydrogen gas containing a small amount of Group-III element based gas under the conditions shown in Table G21(9), according to the present invention.

In this plasma treatment with hydrogen gas containing the small amount of Group-III element based gas according to the present invention, $B_2H_6/H_2$ (diluted to 10%) serving as group-III-element gas, $SiH_4$ serving as silicon compound gas and $H_2$ were introduced into the deposition chamber 418 via the gas inlet 449. The $H_2$ gas was supplied by opening the valves 463, 453, 450 and its flow rate was adjusted to 1500 sccm by means of the mass flow controller 458. The Group-III element compound gas was supplied by opening the valves 468 and 466, and its flow rate was controlled by the mass flow controller 467 such that the flow rate of the $B_2H_6/H_2$ gas was maintained at 1.0% of the total gas flow rate of $H_2$. The silicon compound gas was supplied by opening the valves 461 and 451 and its flow rate was controlled by the mass flow controller 456 such that the flow rate of the $SiH_4$ gas was maintained at 0.03% of the total gas flow rate of $H_2$. Furthermore, the pressure inside the deposition chamber 418 was adjusted to 0.5 Torr by means of a conductance valve (not shown). The substrate 490 was heated by the substrate heater 411 up to 260° C. When the temperature of the substrate had become stable, an RF power of 0.02 W/cm$^3$ was applied to the bias bar 428 by the RF power supply 424 so that a glow discharge occurs in the deposition chamber 418. The shutter 427 was then opened, and under the above-described conditions, the substrate was exposed for 3 minutes to the hydrogen gas plasma containing the small amount of Group-III element based gas according to the present invention. The RF power was then shut off to stop the glow discharge. The supply of the $B_2H_6/H_2$ (diluted to 10%) and $SiH_4$ gas into the deposition chamber 418 was stopped, whereas the $H_2$ gas was fed further for 3 minutes into the deposition chamber 418. Then, the $H_2$ gas was also shut off, and the inside of the deposition chamber 418 as well as the inside of the gas lines was evacuated down to $1\times10^{-5}$ Torr.

An RF p-layer 205 of a-SiC and an RF n-layer 303 of μc-Si were then deposited in that order in the same way as for the example G2.

The substrate was then subjected to plasma treatment with hydrogen gas containing a small amount of silane-based gas under the conditions shown in Table G21(10).

In this plasma treatment with hydrogen gas containing the small amount of silane-based gas according to the present invention, $SiH_4/H_2$ (diluted to 1000 ppm) serving as silicon compound gas and $H_2$ were introduced into the deposition chamber 417 via the gas inlet 429. The $H_2$ gas was supplied by opening the valves 441, 431, 430 and its flow rate was adjusted to 850 sccm by means of the mass flow controller 436. The silicon compound gas was supplied by opening the valves 442 and 432, and its flow rate was controlled by the mass flow controller 437 such that the flow rate of the $SiH_4$ gas was maintained at 0.03% of the total gas flow rate of $H_2$. Furthermore, the pressure inside the deposition chamber 417 was adjusted to 0.9 Torr by means of a conductance valve (not shown). The substrate 490 was heated by the substrate heater 410 up to 230° C. When the temperature of the substrate had become stable, an RF power of 0.04 W/cm$^3$ was introduced by the RF power supply 422 so that a glow discharge occurs in the plasma excitation cup 420. Under the above-described conditions, the substrate was exposed for two minutes to the hydrogen gas plasma containing the small amount of silane-based gas. The RF power was then shut off to stop the glow discharge. The supply of the $SiH_4/H_2$ (diluted to 1000 ppm) gas into the deposition chamber 417 was stopped, whereas the $H_2$ gas was fed further for three minutes into the deposition chamber 417. Then, the $H_2$ gas was also shut off, and the inside of the deposition chamber 417 as well as the inside of the gas lines was evacuated down to $1\times10^{-5}$ Torr.

An n/i buffer layer 351 of a-SiC was then deposited by means of RFPCVD in the same way as for example G2.

The substrate was then subjected to plasma treatment with hydrogen gas containing a small amount of silane-based gas under the conditions shown in Table G21(11), according to the present invention.

In this plasma treatment with hydrogen gas containing the small amount of silane-based gas according to the present invention, $SiH_4$ serving as silicon compound gas and $H_2$ were introduced into the deposition chamber 418 via the gas inlet 449. The $H_2$ gas was supplied by opening the valves 463, 453, 450 and its flow rate was adjusted to 1000 sccm by means of the mass flow controller 458. The silicon compound gas was supplied by opening the valves 461 and 451 and its flow rate was controlled by the mass flow controller 456 such that the flow rate of the $SiH_4$ gas was maintained at 0.03% of the total gas flow rate of $H_2$. Furthermore, the pressure inside the deposition chamber 418 was adjusted to 0.7 Torr by means of a conductance valve (not shown). The substrate 490 was heated by the substrate heater 411 up to 230° C. When the temperature of the substrate had become stable, an RF power of 0.03 W/cm$^3$ was applied to the bias bar 428 by the RF power supply 424 so that a glow discharge occurs in the deposition chamber 418. The shutter 427 was then opened, and under the above-described conditions, the substrate was exposed for 3 minutes to the hydrogen gas plasma containing the small amount of silane-based gas according to the present invention. The RF power was then shut off to stop the glow discharge. The supply of the $SiH_4$ gas into the deposition chamber 418 was stopped, whereas the $H_2$ gas was fed further for 3 minutes into the deposition chamber 418. Then, the $H_2$ gas was also shut off, and the inside of the deposition chamber 418 as well as the inside of the gas lines was evacuated down to $1\times10^{-5}$ Torr.

An RF i-layer 314 of a-Si was then deposited in the same way as for the example G2 by means of RFPCVD.

The substrate was then subjected to plasma treatment with hydrogen gas containing a small amount of silane-based gas under the conditions shown in Table G21(12).

In this plasma treatment with hydrogen gas containing the small amount of silane-based gas according to the present invention, $SiH_4$ serving as silicon compound gas and $H_2$ were introduced into the deposition chamber 418 via the gas inlet 449. The $H_2$ gas was supplied by opening the valves 463, 453, 450 and its flow rate was adjusted to 1200 sccm by means of the mass flow controller 458. The silicon compound gas was supplied by opening the valves 461 and 451 and its flow rate was controlled by the mass flow controller 456 such that the flow rate of the $SiH_4$ gas was maintained at 0.03% of the total gas flow rate of $H_2$. Furthermore, the pressure inside the deposition chamber 418 was adjusted to 0.8 Torr by means of a conductance valve (not shown). The substrate 490 was heated by the substrate heater 411 up to 200° C. When the temperature of the substrate had become stable, an RF power of 0.04 $W/cm^3$ was applied to the bias bar 428 by the RF power supply 424 so that a glow discharge occurs in the deposition chamber 418. The shutter 427 was then opened, and under the above-described conditions, the substrate was exposed for 3 minutes to the hydrogen gas plasma containing the small amount of silane-based gas according to the present invention. The RF power was then shut off to stop the glow discharge. The supply of the $SiH_4$ gas into the deposition chamber 418 was stopped, whereas the $H_2$ gas was fed further for 3 minutes into the deposition chamber 418. Then, the $H_2$ gas was also shut off, and the inside of the deposition chamber 418 as well as the inside of the gas lines was evacuated down to $1\times10^{-5}$ Torr.

A p/i buffer layer 361 of a-SiC was then deposited in the same way as for the example G2 by means of RFPCVD.

The substrate was then subjected to plasma treatment with hydrogen gas containing a small amount of Group-III element based gas under the conditions shown in Table G21 (13).

In this plasma treatment with hydrogen gas containing the small amount of Group-III element based gas according to the present invention, $B_2H_6/H_2$ (diluted to 10%) serving as Group-III element gas, $SiH_4$ serving as silicon compound gas and $H_2$ were introduced into the deposition chamber 418 via the gas inlet 449. The $H_2$ gas was supplied by opening the valves 463, 453, 450 and its flow rate was adjusted to 1400 sccm by means of the mass flow controller 458. The Group-III element compound gas was supplied by opening the valves 468 and 466, and its flow rate was controlled by the mass flow controller 467 such that the flow rate of the $B_2H_6/H_2$ gas was maintained at 2.0% of the total gas flow rate of $H_2$. The silicon compound gas was supplied by opening the valves 461 and 451 and its flow rate was controlled by the mass flow controller 456 such that the flow rate of the $SiH_4$ gas was maintained at 0.03% of the total gas flow rate of $H_2$. Furthermore, the pressure inside the deposition chamber 418 was adjusted to 0.7 Torr by means of a conductance valve (not shown). The substrate 490 was heated by the substrate heater 411 up to 170° C. When the temperature of the substrate had become stable, an RF power of 0.02 $W/cm^3$ was applied to the bias bar 428 by the RF power supply 424 so that a glow discharge occurs in the deposition chamber 418. The shutter 427 was then opened, and under the above-described conditions, the substrate was exposed for 3 minutes to the hydrogen gas plasma containing the small amount of Group-III element based gas according to the present invention. The RF power was then shut off to stop the glow discharge. The supply of the $B_2H_6/H_2$ (diluted to 10%) and $SiH_4$ gas into the deposition chamber 418 was stopped, whereas the $H_2$ gas was fed further for 3 minutes into the deposition chamber 418. Then, the $H_2$ gas was also shut off, and the inside of the deposition chamber 418 as well as the inside of the gas lines was evacuated down to $1\times10^{-5}$ Torr.

An RF p-layer 305 of a-SiC was then deposited in the same way as for the example G2 by means of RFPCVD.

ITO was then evaporated onto the RF p-layer 305 so as to form a transparent conductive layer 112 having a thickness of 70 nm.

A mask having a comb-shaped window was placed on the transparent conductive layer 112, and metal evaporation was performed via the mask to form a comb-shaped collection electrode 113 having a multi-layer structure consisting of Cr (40 nm), Ag (1000 nm), and Cr (40 nm).

In this way, the complete solar cell according to the invention was obtained. Hereinafter, the solar cell of this type will be referred to as SC-EMB-G21. Tables G21(1) through G21(14) indicate the conditions used here in the invention, regarding the plasma treatment with hydrogen containing a small amount of Group-III element based gas and the plasma treatment with hydrogen containing a small amount of silane-based gas as well as the process conditions for the RF n-layer, n/i buffer layer, MW i-layer, p/i buffer layer, RF p-layer, RF n-layer, n/i buffer layer, MW i-layer, p/i buffer layer, RF p-layer, RF n-layer, n/i buffer layer, RF i-layer, p/i buffer layer, and RF p-layer.

COMPARATIVE EXAMPLE G21

For the sake of comparison, a solar cell (SC-CMP-G21) was also fabricated in the same manner as in the above-described example G21 except that the plasma treatment with hydrogen gas containing a small amount of Group-III element based gas according to the invention or the plasma treatment with hydrogen gas containing a small amount of silane-based gas according to the invention was not performed.

Nine samples of solar cells were prepared for each type (SC-EMB-G21 and SC-CMP-G21) for the purpose of evaluation regarding the initial photoelectric conversion efficiency (the ratio of the electric output power to the optical input power), vibration durability and optical durability under a biased condition at high temperature with high humidity, vibration durability and optical durability under a non-biased condition, and the characteristics with a reverse bias voltage being applied.

The measurement of the initial photoelectric conversion efficiency was performed by measuring the V-I characteristics of the samples under the illumination condition of AM 1.5 (100 $mW/cm^2$). The measurement revealed that the SC-EMB-G21 samples had a smaller series resistance and variation in the initial photoelectric conversion efficiencies than the SC-CMP-G21 samples and had a larger fill factor (F.F.) as shown below:

| | [Fill factor (F.F.)] | [Series resistance] | [Variation] |
|---|---|---|---|
| SC-EMB-G21 | 1.18 | 0.88 | 0.80 |
| | (relative to that of SC-CMP-G21) | | |

The vibration durability test under the non-biased condition was performed as follows: After the measurement of the initial photoelectric conversion efficiency, some samples were placed in a dark place kept at 26° C. with a relative humidity of 56%. Vibration having an amplitude of 0.1 mm and a frequency of 60 Hz was applied to the samples for 500 hr. Then, the photoelectric conversion efficiencies of the samples were measured under the illumination condition of AM 1.5 (100 $mW/cm^2$) and the reduction relative to the initial value (the ratio of the photoelectric conversion efficiency after the vibration test to the initial value) was evaluated for each sample. The SC-CMP-G21 samples showed a greater reduction in the photoelectric conversion efficiency compared with the SC-EMB-G21 samples as shown below.

The optical durability test under the non-biased condition was performed as follows: After the measurement of the initial photoelectric conversion efficiency, some samples were placed in a dark place kept at 26° C. with a relative humidity of 56%. Light having a power of AM 1.5 (100 $mW/cm^2$) was applied to the samples for 500 hours, and then the photoelectric conversion efficiencies of the samples were measured under the illumination condition of AM 1.5 (100 $mW/cm^2$). The reduction relative to the initial value (the ratio of the photoelectric conversion efficiency after the optical durability test to the initial value) was evaluated for each sample. The SC-CMP-G21 samples showed a greater reduction in the photoelectric conversion efficiency compared with the SC-EMB-G21 samples as shown below.

| | [Vibration durability] | [Optical durability] |
|---|---|---|
| SC-CMP-G21 | 0.83 | 0.81 |
| | (relative to those of SC-EMB-G21) | |

The evaluation of the vibration durability and optical durability under the biased condition at high temperature with high humidity was performed as follows: After the measurement of the initial photoelectric conversion efficiency, some samples were placed in a dark place kept at 82° C. with a relative humidity of 93%, and a forward bias voltage of 0.71 V was applied to the samples. The vibration described above was applied to some of the samples and light having a power of AM 1.5 was applied to the other samples under the same conditions as those in the non-biased vibration test. The photoelectric conversion efficiencies of the samples were measured under the illumination condition of AM 1.5 (100 $mW/cm^2$). The SC-CMP-G21 samples also showed a greater reduction in the photoelectric conversion efficiency compared with the SC-EMB-G21 samples after the vibration and optical durability tests as shown below.

Under the biased condition:

| | [Vibration durability] | [Optical durability] |
|---|---|---|
| SC-CMP-G21 | 0.81 | 0.80 |
| | (relative to that of SC-EMB-G21) | |

The evaluation of the characteristics with a reverse bias voltage being applied was performed as follows: After the measurement of the initial photoelectric conversion efficiency, some samples were placed in a dark place kept at 80° C. with a relative humidity of 52%. A reverse bias voltage of 5.0 V was applied to the samples for 100 hours, and then the photoelectric conversion efficiencies of the samples were measured under the illumination condition of AM 1.5 (100 $mW/cm^2$). The reduction relative to the initial value (the ratio of the photoelectric conversion efficiency after the reverse bias voltage is applied to the initial value) was evaluated for each sample. The SC-CMP-G21 samples showed a greater reduction in the photoelectric conversion efficiency compared with the SC-EMB-G21 samples as shown below.

| | |
|---|---|
| SC-CMP-G21 | 0.84 |
| (relative to those of SC-EMB-G21) | |

The surfaces of the samples were observed using an optical microscope to evaluate film separation. No film separation was observed in the SC-EMB-G21 samples, whereas slight film separation was observed in the SC-CMP-G21 samples.

From the above results, it can be concluded that the solar cells (SC-EMB-G21) according to the present invention are better than the conventional solar cells (SC-CMP-G21) in optical durability, adhesion, series resistance, overall durability, fill factor (F.F.), uniformity, and characteristics with a reverse bias voltage being applied of the photoelectric conversion efficiency.

In the above examples of solar cells according to the present invention, semiconductor layers were deposited on a substrate in the order of an n-layer, n/i-layer, i-layer, p/i buffer layer, and p-layer. Solar cells in which the semiconductor layers were deposited in the opposite order were also made using the same hydrogen plasma treatment.

These solar cells were evaluated in the same way as for the above-described examples. When the hydrogen plasma treatment with hydrogen gas containing the small amount of silicon compound gas and Group-III element compound gas according to the present invention was applied to the cells between the p/i buffer layer and p-layer, the cells showed improvement in fill factor (F.F.), uniformity, and characteristics with a reverse bias voltage being applied of the photoelectric conversion efficiency, optical durability, series resistance, overall durability and other factors. When the hydrogen plasma treatment with hydrogen gas containing the small amount of silicon compound gas which was almost not deposited was also applied to the cells in the vicinity of the boundary of the substrate and p-layer, and also in the vicinity of the boundary of the n-layer and n/i buffer layer, the vicinity of the boundary of the n/i buffer layer and i-layer, and the vicinity of the boundary of the p/i buffer layer and i-layer, the cells showed further improvement in the properties described above.

EXAMPLE H1 ACCORDING TO THE INVENTION

A solar cell having a structure such as shown in FIG. 4 was made using the deposition equipment as shown in FIG. 7. First, a substrate was prepared. A stainless-steel base 100 having dimensions of 0.5 mm in thickness and 50×50 $mm^2$ in area was cleaned with acetone and isopropanol by means of ultrasonic cleaning, and then dried with hot air.

An Ag optical reflection layer 101 having a thickness of 0.3 μm was deposited on a surface of the stainless-steel base 100 using a sputtering technique at room temperature, and a 1.0-μm-thick ZnO layer acting as a reflection enhancing layer 102 was further deposited on it at 350° C. Thus, a complete substrate was prepared.

Semiconductor layers were then deposited on the reflection enhancing layer using the deposition equipment 400. The deposition equipment 400 has the capabilities of both MWPCVD and RFPCVD.

The deposition equipment was used in a state in which source gas cylinders (not shown) were connected to the deposition equipment via gas inlets. The source gas cylinders used here were all of ultra high purity type, including $SiH_4$, $SiF_4$, $CH_4$, $GeH_4$, $GeF_4$, $Si_2H_6$, $PH_3/H_2$ (diluted to 1000 ppm) $B_2H_6/H_2$ (diluted to 2000 ppm), $H_2$, He, $SiCl_2H_2$, and $SiH_4/H_2$ (diluted to 1000 ppm) gas cylinders.

The substrate 490 on which the optical reflection layer 101 and the reflection enhancing layer 102 had been formed was placed on the substrate transfer rail 413 in the load chamber 401, and the load chamber 401 was evacuated with a vacuum pump (not shown) down to a pressure of about $1\times10^{-5}$ Torr.

Then, the gate valve 406 was opened, and the substrate 490 was transferred to the deposition chamber 417 via the transfer chamber 402 wherein both deposition chamber 417 and transfer chamber 402 had already been evacuated with a vacuum pump (not shown). The substrate 490 was placed such that the back surface of the substrate 490 came into contact with the heater 410 so that the substrate 490 was heated. The inside of the deposition chamber 417 was evacuated with the vacuum pump (not shown) down to a pressure of about $1\times10^{-5}$ Torr.

After the completion of the preparation for film deposition as described, an RF n-layer 103 of μc-Si was formed. To deposit RF n-layer 103 of μc-Si, $H_2$ gas was introduced into the deposition chamber 417 via the gas inlet 429, wherein the $H_2$ gas was supplied via opened valves 441, 431, 430 and its flow rate was adjusted to 300 sccm by means of the mass flow controller 436. Furthermore, the pressure inside the deposition chamber 417 was adjusted to 1.1 Torr by means of the conductance valve (not shown). The substrate 490 was heated by the substrate heater 410 up to 380° C. When the temperature of the substrate had become stable, the valves 443, 433, 444, and 434 were opened whereby $SiH_4$ gas and $PH_3/H_2$ gas were introduced into the deposition chamber 417 via the gas inlet 429. The flow rates of $SiH_4$, $H_2$, and $PH_3/H_2$ were adjusted to 1.4 sccm, 90 sccm, and 200 sccm, respectively, by the mass flow controllers 438, 436, and 439. The pressure inside the deposition chamber 417 was adjusted to 1.1 Torr. RF power of 0.05 W/cm$^3$ was applied by the RF power supply 422 so that a glow discharge occurs in the plasma excitation cup 420, and thus deposition of the RF n-layer was started. When the thickness of the deposited RF n-layer 103 had reached 20 nm, the RF power was shut off thereby eliminating the glow discharge. Thus, the deposition of the RF n-layer 103 was complete. The supply of $SiH_4$ and $PH_3/H_2$ into the deposition chamber 417 was stopped, whereas $H_2$ was fed further for 4 min into the deposition chamber 417. Then, $H_2$ was also shut off, and the inside of the deposition chamber 417 as well as the inside of the gas lines was evacuated down to $1\times10^{-5}$ Torr.

The n/i buffer layer 151 of a-Si was then deposited by means of RFPCVD. The gate valve 407 was opened, and the substrate 490 was transferred to the i-layer deposition chamber 418 via the transfer chamber 403 wherein both deposition chamber 418 and transfer chamber 403 had already been evacuated with a vacuum pump (not shown). The substrate 490 was placed such that the back surface of the substrate 490 came into contact with the heater 411 so that the substrate 490 was heated. The inside of the i-layer deposition chamber 418 was evacuated with the vacuum pump (not shown) down to a pressure of about $1\times10^{-5}$ Torr.

To deposit n/i buffer layer 151, the substrate 490 was heated by the substrate heater 411 up to 360° C. When the substrate had been heated enough, the valves 464, 454, 450, 463, 453 were opened gradually whereby $Si_2H_6$ and $H_2$ were introduced into the i-layer deposition chamber 418 via the gas inlet 449. The flow rates of $Si_2H_6$ and $H_2$ were adjusted to 2.5 sccm and 95 sccm, respectively, by the mass flow controllers 459, 458. The pressure inside the i-layer deposition chamber 418 was adjusted to 0.8 Torr by adjusting the opening ratio of a conductance valve (not shown). Then, RF power was applied to the bias bar 428 by setting the RF power supply 424 to 0.08 W/cm$^3$ to excite a glow discharge. The shutter 427 was then opened, and thus depositing the n/i buffer layer 151 onto the RF n-layer 103 was started. When the thickness of the deposited n/i buffer layer 151 had reached 10 nm, the RF glow discharge was stopped, and the RF power supply 424 was shut off. Thus, the deposition of the n/i buffer layer 151 was complete. The valves 464, 454 were closed so as to stop the supply of $Si_2H_6$ into the i-layer deposition chamber 418, whereas $H_2$ was fed further for 2 min into the i-layer deposition chamber 418. Then, valves 453 and 450 were closed, and the inside of the i-layer deposition chamber 418 as well as the inside of the gas lines was evacuated down to $1\times10^{-5}$ Torr.

The n/i buffer layer 114 of a-SiGe was then deposited by means of MWPCVD. To deposit MW i-layer 114, the substrate 490 was heated by the substrate heater 411 up to 380° C. When the substrate had been heated enough, the valves 461, 451, 450, 462, 452, 463, 453 were opened gradually whereby $SiH_4$, $GeH_4$ and $H_2$ were introduced into the i-layer deposition chamber 418 via the gas inlet 449. The flow rates of $Si_2H_6$, $GeH_4$ and $H_2$ were adjusted to 44 sccm, 43 sccm and 170 sccm, respectively, by the mass flow controllers 456, 457, 458. The pressure inside the i-layer deposition chamber 418 was adjusted to 5 mTorr by adjusting the opening ratio of a conductance valve (not shown). Then, high-frequency (RF) power of 0.6 W/cm$^3$ was supplied by the RF power supply 424 to the bias bar 428. Thereafter, MW power of 0.25 W/cm$^3$ was introduced from an MW power supply (not shown) into the i-layer deposition chamber 418 via the wave guide 426 and the microwave entrance window 425, thereby exciting a glow discharge. The shutter 427 was then opened, and thus depositing of the MW i-layer 114 onto the n/i buffer layer 151 was started. When the thickness of the deposited the MW i-layer 114 had reached 0.15 μm, the MW glow discharge was stopped, and the bias power supply 424 was shut off. Thus, the deposition of the MW i-layer 114 was complete. The valves 451, 452 were closed so as to stop the supply of $Si_2H_6$, $GeH_4$ into the i-layer deposition chamber 418, whereas $H_2$ was fed further for 2 min into the i-layer deposition chamber 418. Then, valves 453 and 450 were closed, and the inside of the i-layer deposition chamber 418 as well as the inside of the gas lines was evacuated down to $1\times10^{-5}$ Torr.

The p/i buffer layer 161 of a-Si was then deposited by means of RFPCVD. To deposit p/i buffer layer 161, the substrate 490 was heated by the substrate heater 411 up to 250° C. When the substrate had been heated enough, the valves 464, 454, 450, 463, 453 were opened gradually whereby $Si_2H_6$ and $H_2$ were introduced into the i-layer deposition chamber 418 via the gas inlet 449. The flow rates of $Si_2H_6$ and $H_2$ were adjusted to 3 sccm and 75 sccm, respectively, by the mass flow controllers 459, 458. The pressure inside the i-layer deposition chamber 418 was adjusted to 0.7 Torr by adjusting the opening ratio of a conductance valve (not shown). Then, RF power was applied to the bias bar 428 by setting the RF power supply 424 to 0.07 W/cm$^3$ to excite a glow discharge. The shutter 427 was then opened, and thus depositing of the p/i buffer layer 161 onto the MW i-layer 103 was started. When the thickness of the deposited p/i buffer layer 161 had reached 20 nm, the RF glow discharge was stopped, and the RF power supply 424 was shut off. Thus, the deposition of the p/i buffer layer 161 was complete. The valves 464, 454 were closed so as to stop the supply of $Si_2H_6$ into the i-layer deposition chamber 418, whereas $H_2$ was fed further for 2 min into the i-layer deposition chamber 418. Then, valves 453 and 450 were closed, and the inside of the i-layer deposition chamber 418 as well as the inside of the gas lines was evacuated down to $1\times10^{-5}$ Torr.

Next, to deposit the RF p-layer 105 of a-SiC, the gate valve 408 was opened, and the substrate 490 was transferred to the p-layer deposition chamber 419 via the transfer chamber 404, wherein both deposition chamber 419 and transfer chamber 404 had already been evacuated with a vacuum pump (not shown). The substrate 490 was placed such that the back surface of the substrate 490 came into contact with the heater 412 so that the substrate 490 was heated. The inside of the p-layer deposition chamber 419 was evacuated with the vacuum pump (not shown) down to a pressure of about $1\times10^{-5}$ Torr.

The substrate 490 was heated by the substrate heater 412 up to 250° C. When the temperature of the substrate had become stable, the valves 481, 471, 470, 482, 472, 483, 473, 484, and 474 were opened whereby $H_2$ gas, $SiH_4/H_2$ gas, $B_2H_6/H_2$ gas, $CH_4$ gas were introduced into the deposition chamber 419 via the gas inlet 469. The flow rates of the $H_2$, $SiH_4/H_2$, $B_2H_6/H_2$, and $CH_4$ were adjusted to 60 sccm, 2 sccm, 10 sccm, and 0.3 sccm, respectively, by the mass flow controllers 476, 477, 478, and 479. The pressure inside the chamber 419 was adjusted to 1.7 Torr by adjusting the opening ratio of a conductance valve (not shown). RF power of 0.07 W/cm$^3$ was applied by the RF power supply 423 so that a glow discharge occurs in the plasma excitation cup 421, and thus deposition of the RF p-layer 105 onto the p/i buffer layer 161 was started. When the thickness of the deposited RF p-layer 105 had reached 10 nm, the RF power was shut off thereby eliminating the glow discharge. Thus, the deposition of the RF p-layer 105 was complete. The valves 472, 482, 473, 483, 474, and 484 were closed so as to stop the supply of $SiH_4/H_2$, $B_2H_6/H_2$, and $CH_4$ to the p-layer deposition chamber 419, whereas $H_2$ was fed further for 3 min into the p-layer deposition chamber 419. Then, the valves 471, 481, and 470 were closed, and the inside of the p-layer deposition chamber 419 as well as the inside of the gas lines was evacuated down to $1\times10^{-5}$ Torr.

Next, the substrate was subjected to plasma treatment with hydrogen gas containing a small amount of silane gas according to the invention (Table H1(1)). In this plasma treatment with hydrogen gas containing the small amount of silane gas according to the invention, $SiH_4$ and $H_2$, serving as the gas containing silicon atoms, were introduced into the gas deposition chamber 419 via the gas inlet 469 wherein the $H_2$ gas was supplied via opened valves 481, 471, 470 and its flow rate was adjusted to 1200 sccm by means of a mass flow controller 476. The silicon atom containing gas was adjusted by a mass flow controller (not shown) by opening valve (not shown) such that the flow rate of $SiH_4$ gas was maintained at 0.01% of the total gas flow rate of $H_2$. The pressure inside the deposition chamber 419 was adjusted to 0.7 Torr by means of a conductance valve (not shown). The substrate 490 was heated by the substrate heater 412 up to 250° C. When the temperature of the substrate had become stable, power of the RF power supply 423 was set to 0.05 W/cm$^3$ to introduce an RF power into the plasma excitation cup 421 so as to excite a glow discharge. Under the above-described conditions, the substrate was exposed for 3 min to the hydrogen gas containing the small amount of silane gas according to the invention. The RF power was then shut off thereby eliminating the glow discharge. The supply of $SiH_4$ gas into the deposition chamber 419 was stopped, whereas the $H_2$ gas was fed further for 3 min into the deposition chamber 419. Then, the $H_2$ gas was also shut off, and the inside of the deposition chamber 419 as well as the inside of the gas lines was evacuated down to $1\times10^{-5}$ Torr.

Next, to deposit the RF n-layer 203 of μc-Si, the gate valves 408, 407 were opened, and the substrate 490 was transferred to the transfer chamber 402 and the deposition chamber 417 via the transfer chamber 403 which had already been evacuated with a vacuum pump (not shown). The substrate 490 was placed such that the back surface of the substrate 490 came into contact with the heater 410 so that the substrate 490 was heated. The inside of the deposition chamber 417 was evacuated with the vacuum pump (not shown) down to a pressure of about $1\times10^{-5}$ Torr.

To deposit the RF n-layer 203 of μc-Si, $H_2$ gas was introduced into the deposition chamber 417 via the gas inlet 429, where in the $H_2$ gas was supplied via opened valves 441, 431, 430 and its flow rate was adjusted to 200 sccm by means of the mass flow controller 436. Furthermore, the pressure inside the deposition chamber 417 was adjusted to 1.1 Torr by means of the conductance valve (not shown). The substrate was heated by the substrate heater 410 up to 250° C. When the temperature of the substrate had become stable, the valves 443, 433, 444, and 434 were opened whereby $SiH_4$ gas and $PH_3/H_2$ gas were introduced into the deposition chamber 417 via the gas inlet 429. The flow rates of $SiH_4$, $H_2$, and $PH_3/H_2$ were adjusted to 1.5 sccm, 80 sccm, and 250 sccm, respectively, by means of flow controllers 438, 436, and 439. The pressure inside the deposition chamber 417 was adjusted to 1.1 Torr. RF power of 0.04 W/cm$^3$ was applied by the RF power supply 422 so that a glow discharge occurs in the plasma excitation cup 420, and thus deposition of the RF n-layer onto the RF p-layer was started. When the thickness of the deposited RF n-layer had reached 10 nm, the RF power was shut off thereby eliminating the glow discharge. Thus, the deposition of the RF n-layer 203 was complete. The supply of $SiH_4$ and $PH_3/H_2$ into the deposition chamber 417 was stopped, whereas $H_2$ was fed further for 2 min into the deposition chamber 417. Then, $H_2$ was also shut off, and the inside of the deposition chamber as well as the gas lines was evacuated down to $1\times10^{-5}$ Torr.

The n/i buffer layer 251 of a-SiC was then deposited by means of RFPCVD. The gate valve 407 was opened, and the substrate 490 was transferred to the i-layer deposition chamber 418 via the transfer chamber 403 wherein both deposition chamber 418 and transfer chamber 403 had already been evacuated with a vacuum pump (not shown). The substrate 490 was placed such that the back surface of the substrate 490 came into contact with the heater 411 so that the substrate 490 was heated. The inside of the i-layer deposition chamber 418 was evacuated with the vacuum pump (not shown) down to a pressure of about $1\times10^{-5}$ Torr.

To deposit n/i buffer layer 251, the substrate 490 was heated by the substrate heater 411 up to 250° C. When the substrate had been heated enough, the valves 464, 454, 450, 463, 453, 465, 455 were opened gradually whereby $Si_2H_6$, $H_2$ and $CH_4$ were introduced into the i-layer deposition chamber 418 via the gas inlet 449. The flow rates of $Si_2H_6$, $H_2$ and $CH_4$ were adjusted to 0.4 sccm, 90 sccm and 0.2 sccm, respectively, by the mass flow controllers 459, 458, 460.

The pressure inside the i-layer deposition chamber 418 was adjusted to 1.0 Torr by adjusting the opening ratio of a conductance valve (not shown). Then, RF power was applied to the bias bar 428 by setting the RF power supply 424 to 0.06 W/cm$^3$ to excite a glow discharge. The shutter 427 was then opened, and thus depositing of the n/i buffer layer 251 onto the RF n-layer was started. When the thickness of the deposited n/i buffer layer 251 had reached 10 nm, the RF glow discharge was stopped, and the RF power supply 424 was shut off. Thus, the deposition of the n/i buffer layer 251 was complete. The valves 464, 454, 465, 455 were closed so as to stop the supply of $Si_2H_6$, $CH_4$ into the i-layer deposition chamber 418, whereas $H_2$ was fed further for 2 min into the i-layer deposition chamber 418. Then, valves 453 and 450 were closed, and the inside of the i-layer deposition chamber 418 as well as the inside of the gas lines was evacuated down to $1\times10^{-5}$ Torr.

The RF i-layer 214 of a-Si was then deposited by means of RFPCVD. To deposit RF i-layer 214, the substrate 490 was heated by the substrate heater 411 up to 200° C. When the substrate had been heated enough, the valves 464, 454, 450, 463, 453 were opened gradually whereby $Si_2H_6$ and $H_2$ were introduced into the i-layer deposition chamber 418 via the gas inlet 449. The flow rates of $Si_2H_6$ and $H_2$ were adjusted to 3 sccm and 85 sccm, respectively, by the mass flow controllers 459, 458. The pressure inside the i-layer deposition chamber 418 was adjusted to 0.5 Torr by adjusting the opening ratio of a conductance valve (not shown). Then, RF power was applied to the bias bar 428 by setting the RF power supply 424 to 0.07 W/$cm^3$ to excite a glow discharge. The shutter 427 was then opened, and thus depositing of the RF i-layer 214 onto the n/i buffer layer 252 was started. When the thickness of the deposited the i-layer 214 had reached 110 nm, the RF glow discharge was stopped, and the RF power supply 424 was shut off. Thus, the deposition of the RF i-layer 214 was complete. The valves 464, 454 were closed so as to stop the supply of $Si_2H_6$ into the i-layer deposition chamber 418, whereas $H_2$ was fed further for 2 min into the i-layer deposition chamber 418. Then, valves 453 and 450 were closed, and the inside of the i-layer deposition chamber 418 as well as the inside of the gas lines was evacuated down to $1\times10^{-5}$ Torr.

The p/i buffer layer 261 of a-SiC was then deposited by means of RFPCVD. To deposit p/i buffer layer 261, the substrate 490 was heated by the substrate heater 411 up to 200° C. When the substrate had been heated enough, the valves 464, 454, 450, 463, 453, 465, 455 were opened gradually whereby $Si_2H_6$, $H_2$ and $CH_4$ were introduced into the i-layer deposition chamber 418 via the gas inlet 449. The flow rates of $Si_2H_6$, $H_2$ and $CH_4$ were adjusted to 0.4 sccm, 65 sccm and 0.3 sccm, respectively, by the mass flow controllers 459, 458, 460. The pressure inside the i-layer deposition chamber 418 was adjusted to 1.1 Torr by adjusting the opening ratio of a conductance valve (not shown). Then, RF power was applied to the bias bar 428 by setting the RF power supply 424 to 0.06 W/$cm^3$ to excite a glow discharge. The shutter 427 was then opened, and thus depositing of the p/i buffer layer 261 onto the RF i-layer 214 was started. When the thickness of the deposited p/i buffer layer 261 had reached 15 nm, the RF glow discharge was stopped, and the RF power supply 424 was shut off. Thus, the deposition of the p/i buffer layer 261 was complete. The valves 464, 454, 465, 455 were closed so as to stop the supply of $Si_2H_6$, $CH_4$ into the i-layer deposition chamber 418, whereas $H_2$ was fed further for 2 min into the i-layer deposition chamber 418. Then, valves 453 and 450 were closed, and the inside of the i-layer deposition chamber 418 as well as the inside of the gas lines was evacuated down to $1\times10^{-5}$ Torr.

Next, to deposit the RF p-layer 205 of a-SiC, the gate valve 408 was opened, and the substrate 490 was transferred to the p-layer deposition chamber 419 via the transfer chamber 404, wherein both deposition chamber 419 and transfer chamber 404 had already been evacuated with a vacuum pump (not shown). The substrate 490 was placed such that the back surface of the substrate 490 came into contact with the heater 412 so that the substrate 490 was heated. The inside of the p-layer deposition chamber 419 was evacuated with the vacuum pump (not shown) down to a pressure of about $1\times10^{-5}$ Torr.

The substrate 490 was heated by the substrate heater 412 up to 170° C. When the temperature of the substrate had become stable, the valves 481, 471, 470, 482, 472, 483, 473, 484, and 474 were opened whereby $H_2$ gas, $SiH_4/H_2$ gas, $B_2H_6/H_2$ gas, $CH_4$ gas were introduced into the deposition chamber 419 via the gas inlet 469. The flow rates of the $H_2$, $SiH_4/H_2$, $B_2H_6/H_2$, and $CH_4$ were adjusted to 70 sccm, 2 sccm, 10 sccm, and 0.3 sccm, respectively, by the mass flow controllers 476, 477, 478, and 479. The pressure inside the chamber 419 was adjusted to 1.7 Torr by adjusting the opening ratio of a conductance valve (not shown). RF power of 0.07 W/$cm^3$ was applied by the RF power supply 423 so that a glow discharge occurs in the plasma excitation cup 421, and thus deposition of the RF p-layer 205 onto the p/i buffer layer 261 was started. When the thickness of the deposited RF p-layer 205 had reached 10 nm, the RF power was shut off thereby eliminating the glow discharge. Thus, the deposition of the RF p-layer 205 was complete. The valves 472, 482, 473, 483, 474, and 484 were closed so as to stop the supply of $SiH_4/H_2$, $B_2H_6/H_2$, and $CH_4$ to the p-layer deposition chamber 419, whereas $H_2$ was fed further for 2 min into the p-layer deposition chamber 419. Then, the valves 471, 481, and 470 were closed, and the inside of the p-layer deposition chamber 419 as well as the inside of the gas lines was evacuated down to $1\times10^{-5}$ Torr.

The gate valve 409 was then opened, and the substrate 490 was transferred to the unload chamber 405 which had already been evacuated with a vacuum pump (not shown). Then, a leak valve (not shown) was opened so that the inside of the unload chamber 405 was exposed to the ambient atmosphere.

ITO having a layer thickness of 70 nm, serving as a transparent conductive layer 112, was then evaporated onto the RF p-layer 205 by means of vacuum deposition.

A mask having a comb-shaped window was placed on the transparent conductive layer 112, and metal evaporation was performed via the mask thereby forming a comb-shaped collection electrode 113 having a multi-layer structure consisting of Cr(40 nm)/Ag(1000 nm)/Cr(40 nm).

In this way, a complete solar cell according to the invention was obtained. Hereafter, the solar cell of this type will be referred to as SC-EMB-H1. Tables H1(1) and H1(2) summarize the conditions used here in the invention, regarding the plasma treatment in an ambient of hydrogen containing a small amount of silane or similar gas as well as the process conditions for the RF n-layer, n/i buffer layer, MW i-layer, p/i buffer layer, RF p-layer, RF n-layer, n/i buffer layer, RF i-layer, p/i buffer layer, and RF p-layer.

COMPARATIVE EXAMPLE H1

For the sake of comparison, a solar cell (SC-CMP-H1) was also fabricated in the same manner as in the above-described example H1 except that the plasma treatment with hydrogen gas containing a small amount of silane gas according to the invention was not performed.

Seven samples were prepared for each type (SC-EMB-H1 and SC-CMP-H1) for the purpose of evaluation regarding the initial photoelectric conversion efficiency (the ratio of the electric output power to the optical input power), vibration durability, optical durability, and vibration durability and optical durability under a biased condition at a high temperature and high humidity.

The measurement of the initial photoelectric conversion efficiency was performed by measuring the V-I characteristics of the samples under the illumination condition of AM1.5 (100 mW/$cm^2$). The measurements on the SC-EMB-H1 samples of fill factor (F.F.) and variation (a smaller value of variation is preferable) in the initial photoelectric conversion efficiencies relative to the SC-CMP-H1 samples were as follows:

| | [Fill factor] | [Variation] |
|---|---|---|
| SC-EMB-H1 | 1.14 | 0.83 |
| | (relative to those of SC-CMP-H1) | |

The evaluation of the vibration durability was performed as follows: After the measurement of the initial photoelectric conversion efficiency, some samples were placed in a dark place kept at 26° C. and 55% relative humidity. A vibration having an amplitude of 0.1 mm and a frequency of 60 Hz was applied to the samples for 500 hr. After that, the photoelectric conversion efficiencies of the samples were measured under the illumination condition of AM1.5 (100 $mW/cm^2$) and the reduction relative to the initial value (the ratio of the photoelectric conversion efficiency after the vibration test to the initial value) was evaluated for each sample.

The evaluation of the optical durability was performed as follows: After the measurement of the initial photoelectric conversion efficiency, some samples were placed in a place kept at 26° C. and 55% relative humidity and were illuminated by a light of AM1.5 (100 $mW/cm^2$) for 500 hr. After that, the photoelectric conversion efficiencies of the samples were measured under the illumination condition of AM1.5 (100 $mW/cm^2$) and the reduction relative to the initial value (the ratio of the photoelectric conversion efficiency after the illumination test to the initial value) was evaluated for each sample. The measurements on reduction in the photoelectric conversion efficiencies after the illumination and reduction in the photoelectric conversion efficiencies after the vibration of the SC-CMP-H1 samples relative to SC-EMB-H1 samples were as follows:

| | [Vibration durability] | [Optical durability] |
|---|---|---|
| SC-CMP-H1 | 0.82 | 0.80 |
| | (relative to those of SC-EMB-H1) | |

The evaluation of the vibration durability and the optical durability under the biased condition at the high temperature and high humidity was performed. After the measurement of the initial photoelectric conversion efficiency, two samples were placed in a dark place kept at 84° C. and 91% relative humidity, and a forward bias voltage of 0.7 V was applied to the samples. One of the samples was subjected to the vibration as described above and its vibration durability was measured, whereas the other was illuminated by a light of AM1.5 and its optical durability was measured. The measurements on reduction in the photoelectric conversion efficiencies after the vibration and reduction in the photoelectric conversion efficiencies after the illumination of the SC-CMP-H1 samples relative to the SC-EMB-H1 samples were as follows:

| | [Vibration durability] | [Optical durability] |
|---|---|---|
| SC-CMP-H1 | 0.81 | 0.80 |
| | (relative to those of SC-EMB-H1) | |

The surfaces of the above-described samples were observed using an optical microscope to evaluate film separation. No film separation was observed in the SC-EMB-H1 samples, whereas slight film separation was observed in the SC-CMP-H1 samples.

As described above, it was found that the solar cell of the invention (SC-EMB-H1) was superior to the conventional solar cell (SC-CMP-H1) as a solar cell in the characteristics regarding fill factor and variation of the photoelectric conversion efficiency, optical durability, adhesion and overall durability.

EXAMPLE H2 ACCORDING TO THE INVENTION

A tandem-type solar cell such as shown in FIG. 4 was fabricated using the deposition equipment as shown in FIG. 7 in a similar manner as the Example H1 except that the plasma treatment with hydrogen gas containing a small amount of silane gas effected after the RF p-layer 105 was modified as follows.

Next, the substrate was subjected to plasma treatment with hydrogen gas containing a small amount of silane gas according to the invention (Table 2(1)). In this plasma treatment with hydrogen gas containing the small amount of silane gas according to the invention, $Si_2H_6$ and $H_2$, serving as the gas containing silicon atoms, were introduced into the gas deposition chamber 419 via the gas inlet 469 wherein the $H_2$ gas was supplied via opened valves 481, 471, 470 and its flow rate was adjusted to 1000 sccm by means of a mass flow controller 476. The silicon atom containing gas was adjusted by a mass flow controller (not shown) by opening valve (not shown) such that the flow rate of $Si_2H_6$ gas was maintained at 0.03% of the total gas flow rate of $H_2$. The pressure inside the deposition chamber 419 was adjusted to 0.013 Torr by means of a conductance valve (not shown). The substrate 490 was heated by the substrate heater 412 up to 250° C. When the temperature of the substrate had become stable, power of a VHF power supply (not shown) was set to 0.08 $W/cm^3$ to introduce a VHF power into the plasma excitation cup 421 so as to excite a glow discharge. Under the above-described conditions, the substrate was exposed for 4 min to the hydrogen gas containing the small amount of silane gas according to the invention. The VHF power was then shut off thereby eliminating the glow discharge. The supply of $Si_2H_6$ gas into the deposition chamber 419 was stopped, whereas the $H_2$ gas was fed further for 4 min into the deposition chamber 419. Then, the $H_2$ gas was also shut off, and the inside of the deposition chamber 419 as well as the inside of the gas lines was evacuated down to $1\times10^{-5}$ Torr.

Hereafter, the solar cell of this type will be referred to as SC-EMB-H2. Tables H2(1) and H2(2) summarize the conditions used here in the invention, regarding the plasma treatment in an ambient of hydrogen containing a small amount of silane or similar gas as well as the process conditions for the RF n-layer, n/i buffer layer, MW i-layer, p/i buffer layer, RF p-layer, RF n-layer, n/i buffer layer, RF i-layer, p/i buffer layer, and RF p-layer.

COMPARATIVE EXAMPLE H2

For the sake of comparison, a solar cell (SC-CMP-H2) was also fabricated in the same manner as in the above-described example H2 except that the plasma treatment with hydrogen gas containing a small amount of silane gas according to the invention was not performed.

Eight samples were prepared for each type (SC-EMB-H2 and SC-CMP-H2) for the purpose of evaluation regarding the initial photoelectric conversion efficiency (the ratio of the electric output power to the optical input power), vibration durability, optical durability, and vibration durability and optical durability under a biased condition at a high temperature and high humidity.

The measurement of the initial photoelectric conversion efficiency was performed by measuring the V-I characteristics of the samples under the illumination condition of AM1.5 (100 mW/cm$^2$). The measurements on the SC-EMB-H2 samples of fill factor (F.F.) and variation in the initial photoelectric conversion efficiencies relative to the SC-CMP-H2 samples were as follows:

| | [Fill factor] | [Variation] |
|---|---|---|
| SC-EMB-H2 | 1.15 | 0.82 |
| | (relative to those of SC-CMP-H2) | |

The evaluation of the vibration durability was performed as follows: After the measurement of the initial photoelectric conversion efficiency, some samples were placed in a dark place kept at 28° C. and 55% relative humidity. A vibration having an amplitude of 0.1 mm and a frequency of 60 Hz was applied to the samples for 500 hr. After that, the photoelectric conversion efficiencies of the samples were measured under the illumination condition of AM1.5 (100 mW/cm$^2$) and the reduction relative to the initial value (the ratio of the photoelectric conversion efficiency after the vibration test to the initial value) was evaluated for each sample.

The evaluation of the optical durability was performed as follows: After the measurement of the initial photoelectric conversion efficiency, some samples were placed in a place kept at 28° C. and 55% relative humidity and were illuminated by a light of AM1.5 (100 mW/cm$^2$) for 500 hr. After that, the photoelectric conversion efficiencies of the samples were measured under the illumination condition of AM1.5 (100 mW/cm$^2$) and the reduction relative to the initial value (the ratio of the photoelectric conversion efficiency after the illumination test to the initial value) was evaluated for each sample. The measurements on reduction in the photoelectric conversion efficiencies after the illumination and reduction in the photoelectric conversion efficiencies after the vibration of the SC-CMP-H2 samples relative to SC-EMB-H2 samples were as follows:

| | [Vibration durability] | [Optical durability] |
|---|---|---|
| SC-CMP-H2 | 0.82 | 0.81 |
| | (relative to those of SC-EMB-H2) | |

The evaluation of the vibration durability and the optical durability under the biased condition at the high temperature and high humidity was performed. After the measurement of the initial photoelectric conversion efficiency, two samples were placed in a dark place kept at 82° C. and 90% relative humidity, and a forward bias voltage of 0.7 V was applied to the samples. One of the samples was subjected to the vibration as described above and its vibration durability was measured, whereas the other was illuminated by a light of AM1.5 and its optical durability was measured. The measurements on reduction in the photoelectric conversion efficiencies after the vibration and reduction in the photoelectric conversion efficiencies after the illumination of the SC-CMP-H2 samples relative to the SC-EMB-H2 samples were as follows:

| | [Vibration durability] | [Optical durability] |
|---|---|---|
| SC-CMP-H2 | 0.80 | 0.79 |
| | (relative to those of SC-EMB-H2) | |

The surfaces of the above-described samples were observed using an optical microscope to evaluate film separation. No film separation was observed in the SC-EMB-H2 samples, whereas slight film separation was observed in the SC-CMP-H2 samples.

As described above, it was found that the solar cell of the invention (SC-EMB-H2) was superior to the conventional solar cell (SC-CMP-H2) as a solar cell in the characteristics regarding fill factor and variation of the photoelectric conversion efficiency, optical durability, adhesion and overall durability.

EXAMPLE H3 ACCORDING TO THE INVENTION

A triple-type solar cell having a structure such as shown in FIG. 6 was made using the deposition equipment as shown in FIG. 7.

The substrate 490 prepared in similar manner as the Example H1 on which the optical reflection layer 101 and the reflection enhancing layer 102 had been formed was placed on the substrate transfer rail 413 in the load chamber 401, and the load chamber 401 was evacuated with a vacuum pump (not shown) down to a pressure of about $1\times10^{-5}$ Torr.

Then, the gate valve 406 was opened, and the substrate 490 was transferred to the deposition chamber 417 via the transfer chamber 402 wherein both deposition chamber 417 and transfer chamber 402 had already been evacuated with a vacuum pump (not shown). The substrate 490 was placed such that the back surface of the substrate 490 came into contact with the heater 410 so that the substrate 490 was heated. The inside of the deposition chamber 417 was evacuated with the vacuum pump (not shown) down to a pressure of about $1\times10^{-5}$ Torr.

After the completion of the preparation for film deposition as described, an RF n-layer 103 of μc-Si was formed in a similar manner as the Example H1.

Then, the gate valve 406 was opened, and the substrate 490 was transferred to the deposition chamber 418 via the transfer chamber 403 wherein both deposition chamber 418 and transfer chamber 403 had already been evacuated with a vacuum pump (not shown). The substrate 490 was placed such that the back surface of the substrate 490 came into contact with the heater 411 so that the substrate 490 was heated. The inside of the deposition chamber 418 was evacuated with the vacuum pump (not shown) down to a pressure of about $1\times10^{-5}$ Torr.

Then, n/i buffer layer 151 of a-Si, MW i-layer 114 of a-SiGe, p/i buffer layer 161 of a-Si, RF p-layer 105 of a-SiC were sequentially deposited using RFPCVD and MWPCVD in a similar manner as the Example 1.

Next, to perform plasma treatment with hydrogen gas containing the small amount of silane gas according to the invention, the substrate 490 was transferred to the deposition chamber 418 in a similar manner as the Example H1.

In this plasma treatment with hydrogen gas containing the small amount of silane gas according to the invention, $SiCl_2H_2$/He (diluted to 1000 ppm) and $H_2$, serving as the gas containing silicon atoms, were introduced into the gas deposition chamber 418 via the gas inlet 449 wherein the $H_2$ gas was supplied via opened valves 463, 453, 450 and its flow rate was adjusted to 1000 sccm by means of a mass flow controller 458. The silicon atom containing gas was adjusted by a mass flow controller by opening valve such that the flow rate of $SiCl_2H_2$ gas was maintained at 0.03% of the total gas flow rate of $H_2$. The pressure inside the deposition chamber 418 was adjusted to 0.008 Torr by means of a conductance valve (not shown). The substrate 490 was heated by the substrate heater 411 up to 300° C. When the temperature of the substrate had become stable, power of an MW power supply (not shown) was set to 0.14 W/$cm^3$ to introduce an MW power into the i-layer deposition chamber 418 via the wave guide 426 and the microwave entrance window 425 so as to excite a glow discharge. The shutter 427 was opened so that the substrate was exposed for 4 min to the hydrogen gas containing the small amount of silane gas according to the invention. The MW power was then shut off thereby eliminating the glow discharge. The supply of $SiCl_2H_2$/He (diluted to 1000 ppm) gas into the deposition chamber 418 was stopped, whereas the $H_2$ gas was fed further for 4 min into the deposition chamber 419. Then, the $H_2$ gas was also shut off, and the inside of the deposition chamber 418 as well as the inside of the gas lines was evacuated down to $1\times10^{-5}$ Torr.

Then, RF n-layer 203 of μc-Si, n/i buffer layer 251 of a-Si, MW i-layer 214 of a-SiGe, p/i buffer layer 261 of a-Si, and FR p-layer 205 of a-SiC were sequentially formed using RFPCVD and MWPCVD in a similar manner as the Example 1.

Next, plasma treatment with hydrogen gas containing the small amount of silane gas according to the invention was performed (Table H3(2)). In this plasma treatment with hydrogen gas containing the small amount of silane gas according to the invention, a mixture of $SiH_4/H_2$ (diluted to 1000 ppm) and $H_2$, serving as the gas containing silicon atoms, were introduced into the deposition chamber 417 via the gas inlet 429 wherein the $H_2$ gas was supplied via opened valves 441, 431, 430 and its flow rate was adjusted to 1200 sccm by means of a mass flow controller 436, and wherein the $SiH_4$ gas was supplied via opened valves 442 and 432 and its flow rate was controlled by a mass flow controller 437 such that the flow rate of the $SiH_4$ gas was maintained at 0.03% of the total gas flow rate of $H_2$. The pressure inside the deposition chamber 417 was adjusted to 0.7 Torr by means of a conductance valve (not shown). The substrate 490 was heated by the substrate heater 410 up to 250° C. When the temperature of the substrate had become stable, RF power of 0.03 W/$cm^3$ was applied by the RF power supply 422 so that a glow discharge occurs in the plasma excitation cup 420. Under the above described conditions, the substrate was exposed for 3 min to the hydrogen gas containing the small amount of silane gas according to the invention. The RF power was then shut off thereby eliminating the glow discharge. The supply of $SiH_4/H_2$ gas (diluted to 1000 ppm) into the deposition chamber 417 was stopped, whereas the $H_2$ gas was fed further for 3 min into the deposition chamber 417. Then, the $H_2$ gas was also shut off, and the inside of the deposition chamber 417 as well as the inside of the gas lines was evacuated down to $1\times10^{-5}$.

Then, FR n-layer 303 of μc-Si, n/i buffer layer 351 of a-SiC, RF i-layer 314 of a-Si, p/i buffer layer 361 of a-SiC, and RF p-layer 305 of a-SiC were sequentially formed using RFPCVD in a similar manner as the Example 1.

ITO having a layer thickness of 70 nm, serving as a transparent conductive layer 112, was then evaporated onto the RF p-layer 305 by means of vacuum deposition.

A mask having a comb-shaped window was placed on the transparent conductive layer 112, and metal evaporation was performed via the mask thereby forming a comb-shaped collection electrode 113 having a multi-layer structure consisting of Cr(40 nm)/Ag(1000 nm)/Cr(40 nm).

In this way, a complete solar cell according to the invention was obtained. Hereafter, the solar cell of this type will be referred to as SC-EMB-H3. Tables H3(1) and H3(2) summarize the conditions used here in the invention, regarding the plasma treatment in an ambient of hydrogen containing a small amount of silane or similar gas as well as the process conditions for the RF n-layer, n/i buffer layer, MW i-layer, p/i buffer layer, RF p-layer, RF n-layer, n/i buffer layer, MW i-layer, p/i buffer layer, RF p-layer, RF n-layer, n/i buffer layer, RF i-layer, p/i buffer layer, and RF p-layer.

COMPARATIVE EXAMPLE H3

For the sake of comparison, a solar cell (SC-CMP-H3) was also fabricated in the same manner as in the above-described example H3 except that the plasma treatment with hydrogen gas containing a small amount of silane gas according to the invention was not performed.

Eight samples were prepared for each type (SC-EMB-H3 and SC-CMP-H3) for the purpose of evaluation regarding the initial photoelectric conversion efficiency (the ratio of the electric output power to the optical input power), vibration durability, optical durability, vibration durability and optical durability under a biased condition at a high temperature and high humidity, and the characteristics under a reverse bias.

The measurement of the initial photoelectric conversion efficiency was performed by measuring the V-I characteristics of the samples under the illumination condition of AM1.5 (100 mW/$cm^2$). The measurements on the SC-EMB-H3 samples of fill factor (F.F.) and variation in the initial photoelectric conversion efficiencies relative to the SC-CMP-H3 samples were:

| | [Fill factor] | [Variation] |
|---|---|---|
| SC-EMB-H3 | 1.16 | 0.81 |
| | (relative to those of SC-CMP-H3) | |

The evaluation of the vibration durability was performed as follows: After the measurement of the initial photoelectric conversion efficiency, some samples were placed in a dark place kept at 26° C. and 55% relative humidity. A vibration having an amplitude of 0.1 mm and a frequency of 60 Hz was applied to the samples for 500 hr. After that, the photoelectric conversion efficiencies of the samples were measured under the illumination condition of AM1.5 (100 mW/$cm^2$) and the reduction relative to the initial value (the ratio of the photoelectric conversion efficiency after the vibration test to the initial value) was evaluated for each sample.

The evaluation of the optical durability was performed as follows: After the measurement of the initial photoelectric conversion efficiency, some samples were placed in a place kept at 26° C. and 55% relative humidity and were illuminated by a light of AM1.5 (100 mW/$cm^2$) for 500 hr. After that, the photoelectric conversion efficiencies of the samples were measured under the illumination condition of AM1.5 (100 mW/$cm^2$) and the reduction relative to the initial value (the ratio of the photoelectric conversion efficiency after the illumination test to the initial value) was evaluated for each sample. The measurements on reduction in the photoelectric conversion efficiencies after the illumination and reduction in the photoelectric conversion efficiencies after the vibration of the SC-CMP-H3 samples relative to SC-EMB-H3 samples were as follows:

| | [Vibration durability] | [Optical durability] |
|---|---|---|
| SC-CMP-H3 | 0.82 (relative to those of SC-EMB-H3) | 0.81 |

The evaluation of the vibration durability and the optical durability under the biased condition at the high temperature and high humidity was performed. After the measurement of the initial photoelectric conversion efficiency, two samples were placed in a dark place kept at 80° C. and 90% relative humidity, and a forward bias voltage of 0.7 V was applied to the samples. One of the samples was subjected to the vibration as described above and its vibration durability was measured, whereas the other was illuminated by a light of AM1.5 and its optical durability was measured.

The measurements on reduction in the photoelectric conversion efficiencies after the vibration and reduction in the photoelectric conversion efficiencies after the illumination of the SC-CMP-H3 samples relative to the SC-EMB-H3 samples were as follows:

| | [Vibration durability] | [Optical durability] |
|---|---|---|
| SC-CMP-H3 | 0.82 (relative to those of SC-EMB-H3) | 0.80 |

The evaluation of the characteristics under a reverse bias was performed as follows: After the measurement of the initial photoelectric conversion efficiency, some samples were placed in a dark place kept at 80° C. and 52% relative humidity. A reverse bias voltage of 5.0 V was applied for 100 hr. After that, the photoelectric conversion efficiencies of the samples were measured under the illumination condition of AM1.5 (100 mW/cm$^2$) and the reduction relative to the initial value (the ratio of the photoelectric conversion efficiency after the application of the bias voltage to the initial value) was evaluated for each sample. The measurement on the reduction after the application of the reverse bias voltage of SC-CMP-H3 relative to SC-EMB-H3 was:

| | |
|---|---|
| SC-CMP-H3 | 0.86 (relative to those of SC-EMB-H3) |

The surfaces of the above-described samples were observed using an optical microscope to evaluate film separation. No film separation was observed in the SC-EMB-H3 samples, whereas slight film separation was observed in the SC-CMP-H3 samples.

As described above, it was found that the solar cell of the invention (SC-EMB-H3) was superior to the conventional solar cell (SC-CMP-H3) as a solar cell in the characteristics regarding fill factor and variation of the photoelectric conversion efficiency, optical durability, adhesion, overall durability, and characteristics under a reverse bias voltage.

EXAMPLE H4 ACCORDING TO THE INVENTION

A triple-type solar cell having a structure such as shown in FIG. 6 was made in a similar manner as the Example H3, where plasma treatment with hydrogen gas containing the small amount of silane gas according to the invention was performed twice under the conditions shown in Table H4(1) using the deposition equipment as shown in FIG. 7 in a similar manner as the Example H3. The conditions for the plasma treatment with hydrogen gas containing the small amount of silane gas are shown in Table H4(1), and the conditions for fabrication of the triple-type solar cell are shown in Table H4(2).

The fabricated triple-type solar cells were evaluated in a similar manner as the Example H3. The results are shown in Table H4(3).

It was found that the hydrogen flow rate in the plasma treatment with hydrogen gas containing the small amount of silane gas according to the invention was preferably a flow rate of 1 to 2000 sccm regarding fill factor and variation of the photoelectric conversion efficiency of a solar cell, optical durability, adhesion, overall durability, and characteristics under a reverse bias voltage.

EXAMPLE H5 ACCORDING TO THE INVENTION

A triple-type solar cell having a structure such as shown in FIG. 6 was made in a similar manner as the Example H3, where plasma treatment with hydrogen gas containing the small amount of silane gas according to the invention was performed twice under the conditions shown in Table H5(1) using the deposition equipment as shown in FIG. 7 in a similar manner as the Example H3. The conditions for the plasma treatment with hydrogen gas containing the small amount of silane gas are shown in Table H5(1), and the conditions for the fabrication of the triple-type solar cell are shown in Table H5(2).

The fabricated triple-type solar cells were evaluated in a similar manner as the Example H3. The results are shown in Table H5(3).

It was found that a flow rate of 1 to 2000 sccm was preferred as the hydrogen flow rate regarding fill factor and variation of the photoelectric conversion efficiency of a solar cell, optical durability, adhesion, overall durability, and characteristics under a reverse bias voltage, even when the type of introduced power for the plasma treatment with hydrogen gas containing the small amount of silane gas according to the invention was changed from the RF power supply in the Example H4 to a VHF power supply.

EXAMPLE H6 ACCORDING TO THE INVENTION

A triple-type solar cell having a structure such as shown in FIG. 6 was made in a similar manner as the Example H3, where plasma treatment with hydrogen gas containing the small amount of silane gas according to the invention was performed twice under the conditions shown in Table H6(1) using the deposition equipment as shown in FIG. 7 in a similar manner as the Example H3. The conditions for the plasma treatment with hydrogen gas containing the small amount of silane gas are shown in Table H6(1), and the conditions for the fabrication of the triple-type solar cell are shown in Table H6(2).

The fabricated triple-type solar cells were evaluated in a similar manner as the Example H3. The results are shown in Table H6(3).

It was found that a range of 0.001% to 0.1% was preferred for the amount of the gas containing a silane gas to be added to the hydrogen gas in the plasma treatment with hydrogen gas containing the small amount of silane gas according to the invention, regarding fill factor and variation of the photoelectric conversion efficiency of a solar cell, optical durability, adhesion, overall durability, and characteristics under a reverse bias voltage.

EXAMPLE H7 ACCORDING TO THE INVENTION

A triple-type solar cell having a structure such as shown in FIG. 6 was made in a similar manner as the Example H3, where plasma treatment with hydrogen gas containing the small amount of silane gas according to the invention was performed twice under the conditions shown in Table H7(1) using the deposition equipment as shown in FIG. 7 in a similar manner as the Example H3. The conditions for the plasma treatment with hydrogen gas containing the small amount of silane gas are shown in Table H7(1), and the conditions for the fabrication of the triple-type solar cell are shown in Table H7(2).

The fabricated triple-type solar cells were evaluated in a similar manner as the Example H3. The results are shown in Table H7(3).

It was found that, even when the type of introduced power was changed from the RF power supply in the Example H6 to a VHF power supply, a range of 0.001% to 0.1% was preferred for the amount of the gas containing a silane gas to be added to the hydrogen gas in the plasma treatment with hydrogen gas containing the small amount of silane gas according to the invention, regarding fill factor and variation of the photoelectric conversion efficiency of a solar cell, optical durability, adhesion, overall durability, and characteristics under a reverse bias voltage.

EXAMPLE H8 ACCORDING TO THE INVENTION

A triple-type solar cell having a structure such as shown in FIG. 6 was made in a similar manner as the Example H3, where plasma treatment with hydrogen gas containing the small amount of silane gas according to the invention was performed twice under the conditions shown in Table H8(1) using the deposition equipment as shown in FIG. 7 in a similar manner as the Example H3. The conditions for the plasma treatment with hydrogen gas containing the small amount of silane gas are shown in Table H8(1), and the conditions for the fabrication of the triple-type solar cell are shown in Table H8(2).

The fabricated triple-type solar cells were evaluated in a similar manner as the Example H3. The results are shown in Table H8(3).

It was found that, even when the type of introduced power was changed from the RF power supply in the Example H6 to a MW power supply, a range of 0.001% to 0.1% was preferred for the amount of the gas containing a silane gas to be added to the hydrogen gas in the plasma treatment with hydrogen gas containing the small amount of silane gas according to the invention, regarding fill factor and variation of the photoelectric conversion efficiency of a solar cell, optical durability, adhesion, overall durability, and characteristics under a reverse bias voltage.

EXAMPLE H9 ACCORDING TO THE INVENTION

A triple-type solar cell having a structure such as shown in FIG. 6 was made in a similar manner as the Example H3, where plasma treatment with hydrogen gas containing the small amount of silane gas according to the invention was performed twice under the conditions shown in Table H9(1) using the deposition equipment as shown in FIG. 7 in a similar manner as the Example H3. The conditions for the plasma treatment with hydrogen gas containing the small amount of silane gas are shown in Table H9(1), and the conditions for the fabrication of the triple-type solar cell are shown in Table H9(2).

The fabricated triple-type solar cells were evaluated in a similar manner as the Example H3. The results are shown in Table H9(3).

It was found that, when a RF power supply was used as the introduced power, the pressure in the plasma treatment with hydrogen gas containing the small amount of silane gas according to the invention was preferably in the range of 0.05 Torr to 10 Torr, regarding fill factor and variation of the photoelectric conversion efficiency of a solar cell, optical durability, adhesion, overall durability, and characteristics under a reverse bias voltage.

EXAMPLE H10 ACCORDING TO THE INVENTION

A triple-type solar cell having a structure such as shown in FIG. 6 was made in a similar manner as the Example H3, where plasma treatment with hydrogen gas containing the small amount of silane gas according to the invention was performed twice under the conditions shown in Table H10 (1) using the deposition equipment as shown in FIG. 7 in a similar manner as the Example H3. The conditions for the plasma treatment with hydrogen gas containing the small amount of silane gas are shown in Table H10(1), and the conditions for the fabrication of the triple-type solar cell are shown in Table H10(2).

The fabricated triple-type solar cells were evaluated in a similar manner as the Example H3. The results are shown in Table H10(3).

It was found that, when a VHF power supply was used as the introduced power, the pressure in the plasma treatment with hydrogen gas containing the small amount of silane gas according to the invention was preferably in the range of 0.0001 Torr to 1 Torr, regarding fill factor and variation of the photoelectric conversion efficiency of a solar cell, optical durability, adhesion, overall durability, and characteristics under a reverse bias voltage.

EXAMPLE H11 ACCORDING TO THE INVENTION

A triple-type solar cell having a structure such as shown in FIG. 6 was made in a similar manner as the Example H3, where plasma treatment with hydrogen gas containing the small amount of silane gas according to the invention was performed twice under the conditions shown in Table H11 (1) using the deposition equipment as shown in FIG. 7 in a similar manner as the Example H3. The conditions for the plasma treatment with hydrogen gas containing the small amount of silane gas are shown in Table H11(1), and the conditions for the fabrication of the triple-type solar cell are shown in Table H11(2).

The fabricated triple-type solar cells were evaluated in a similar manner as the Example H3. The results are shown in Table H11(3).

It was found that, when a MW power supply was used as the introduced power, the pressure in the plasma treatment with hydrogen gas containing the small amount of silane gas according to the invention was preferably in the range of 0.0001 Torr to 0.01 Torr, regarding fill factor and variation of the photoelectric conversion efficiency of a solar cell, optical durability, adhesion, overall durability, and characteristics under a reverse bias voltage.

EXAMPLE H12 ACCORDING TO THE INVENTION

A triple-type solar cell having a structure such as shown in FIG. 6 was made in a similar manner as the Example H3, where plasma treatment with hydrogen gas containing the small amount of silane gas according to the invention was performed twice under the conditions shown in Table H12 (1) using the deposition equipment as shown in FIG. 7 in a similar manner as the Example H3. The conditions for the plasma treatment with hydrogen gas containing the small amount of silane gas are shown in Table H12(1), and the conditions for the fabrication of the triple-type solar cell are shown in Table H12(2).

The fabricated triple-type solar cells were evaluated in a similar manner as the Example H3. The results are shown in Table H12(3).

It was found that, when a RF power supply was used as the introduced power, the introduced power density (electric energy) in the plasma treatment with hydrogen gas containing the small amount of silane gas according to the invention was preferably in the range of 0.01 W/cm$^3$ to 1.0 W/cm$^3$, regarding fill factor and variation of the photoelectric conversion efficiency of a solar cell, optical durability, adhesion, overall durability, and characteristics under a reverse bias voltage.

EXAMPLE H13 ACCORDING TO THE INVENTION

A triple-type solar cell having a structure such as shown in FIG. 6 was made in a similar manner as the Example H3, where plasma treatment with hydrogen gas containing the small amount of silane gas according to the invention was performed twice under the conditions shown in Table H13 (1) using the deposition equipment as shown in FIG. 7 in a similar manner as the Example H3. The conditions for the plasma treatment with hydrogen gas containing the small amount of silane gas are shown in Table H13(1), and the conditions for the fabrication of the triple-type solar cell are shown in Table H13(2).

The fabricated triple-type solar cells were evaluated in a similar manner as the Example H3. The results are shown in Table H13(3).

It was found that, when a VHF power supply was used as the introduced power, the introduced power density (electric energy) in the plasma treatment with hydrogen gas containing the small amount of silane gas according to the invention was preferably in the range of 0.01 W/cm$^3$ to 1.0 W/cm$^3$, regarding fill factor and variation of the photoelectric conversion efficiency of a solar cell, optical durability, adhesion, overall durability, and characteristics under a reverse bias voltage.

EXAMPLE H14 ACCORDING TO THE INVENTION

A triple-type solar cell having a structure such as shown in FIG. 6 was made in a similar manner as the Example H3, where plasma treatment with hydrogen gas containing the small amount of silane gas according to the invention was performed twice under the conditions shown in Table H14 (1) using the deposition equipment as shown in FIG. 7 in a similar manner as the Example H3. The conditions for the plasma treatment with hydrogen gas containing the small amount of silane gas are shown in Table H14(1), and the conditions for the fabrication of the triple-type solar cell are shown in Table H14(2).

The fabricated triple-type solar cells were evaluated in a similar manner as the Example H3. The results are shown in Table H14(3).

It was found that, when a RF power supply was used as the introduced power, the introduced power density (electric energy) in the plasma treatment with hydrogen gas containing the small amount of silane gas according to the invention was preferably in the range of 0.1 W/cm$^3$ to 10 W/cm$^3$, regarding fill factor and variation of the photoelectric conversion efficiency, optical durability, adhesion, and overall durability of a solar cell.

EXAMPLE H15 ACCORDING TO THE INVENTION

A triple-type solar cell having a structure such as shown in FIG. 6 was made in a similar manner as the Example H3, where plasma treatment with hydrogen gas containing the small amount of silane gas according to the invention was performed twice under the conditions shown in Table H15 (1) using the deposition equipment as shown in FIG. 7 in a similar manner as the Example H3. The conditions for the plasma treatment with hydrogen gas containing the small amount of silane gas are shown in Table H15(1), and the conditions for the fabrication of the triple-type solar cell are shown in Table H15(2).

The fabricated triple-type solar cells were evaluated in a similar manner as the Example H3. The results are shown in Table H15(3).

It was found that, when a RF power supply was used as the introduced power, the substrate temperature in the plasma treatment with hydrogen gas containing the small amount of silane gas according to the invention was preferably in the range of 100° C. to 400° C., regarding fill factor and variation of the photoelectric conversion efficiency of a solar cell, optical durability, adhesion, overall durability, and characteristics under a reverse bias voltage.

EXAMPLE H16 ACCORDING TO THE INVENTION

A triple-type solar cell having a structure such as shown in FIG. 6 was made in a similar manner as the Example H3, where plasma treatment with hydrogen gas containing the small amount of silane gas according to the invention was performed twice under the conditions shown in Table H16 (1) using the deposition equipment as shown in FIG. 7 in a similar manner as the Example H3. The conditions for the plasma treatment with hydrogen gas containing the small amount of silane gas are shown in Table H16(1), and the conditions for the fabrication of the triple-type solar cell are shown in Table H16(2).

The fabricated triple-type solar cells were evaluated in a similar manner as the Example H3. The results are shown in Table H16(3).

It was found that, when a VHF power supply was used as the introduced power, the substrate temperature in the plasma treatment with hydrogen gas containing the small amount of silane gas according to the invention was preferably in the range of 50° C. to 300° C., regarding fill factor and variation of the photoelectric conversion efficiency of a solar cell, optical durability, adhesion, overall durability, and characteristics under a reverse bias voltage.

EXAMPLE H17 ACCORDING TO THE INVENTION

A triple-type solar cell having a structure such as shown in FIG. 6 was made in a similar manner as the Example H3, where plasma treatment with hydrogen gas containing the small amount of silane gas according to the invention was performed twice under the conditions shown in Table H17 (1) using the deposition equipment as shown in FIG. 7 in a similar manner as the Example H3. The conditions for the plasma treatment with hydrogen gas containing the small amount of silane gas are shown in Table H17(1), and the conditions for the fabrication of the triple-type solar cell are shown in Table H17(2).

The fabricated triple-type solar cells were evaluated in a similar manner as the Example H3. The results are shown in Table H17(3).

It was found that, when a MW power supply was used as the introduced power, the substrate temperature in the plasma treatment with hydrogen gas containing the small amount of silane gas according to the invention was preferably in the range of 50° C. to 300° C., regarding fill factor and variation of the photoelectric conversion efficiency, optical durability, adhesion, and overall durability of a solar cell.

EXAMPLE H18 ACCORDING TO THE INVENTION

A triple-type solar cell having a structure such as shown in FIG. 6 was made using the deposition equipment as shown in FIG. 7.

The substrate 490 prepared in similar manner as the Example H1 on which the optical reflection layer 101 and the reflection enhancing layer 102 had been formed was placed on the substrate transfer rail 413 in the load chamber 401, and the load chamber 401 was evacuated with a vacuum pump (not shown) down to a pressure of about $1\times10^{-5}$ Torr.

Then, the gate valve 406 was opened, and the substrate 490 was transferred to the deposition chamber 417 via the transfer chamber 402 wherein both deposition chamber 417 and transfer chamber 402 had already been evacuated with a vacuum pump (not shown). The substrate 490 was placed such that the back surface of the substrate 490 came into contact with the heater 410 so that the substrate 490 was heated. The inside of the deposition chamber 417 was evacuated with the vacuum pump (not shown) down to a pressure of about $1\times10^{-5}$ Torr.

Next, plasma treatment with hydrogen gas containing the small amount of silane gas was performed under the conditions as shown in Table H18(1). In this plasma treatment with hydrogen gas containing the small amount of silane gas, a mixture of $SiH_4/H_2$ (diluted to 1000 ppm) and $H_2$, serving as the gas containing silicon atoms, were introduced into the deposition chamber 417 via the gas inlet 429 wherein the $H_2$ gas was supplied via opened valves 441, 431, 430 and its flow rate was adjusted to 1100 sccm by means of a mass flow controller 436. The silicon atom containing gas was supplied via opened valves 442 and 432 and its flow rate was controlled by a mass flow controller 437 such that the flow rate of the $SiH_4$ gas was maintained at 0.04% of the total gas flow rate of $H_2$. The pressure inside the deposition chamber 417 was adjusted to 0.8 Torr by means of a conductance valve (not shown). The substrate 490 was heated by the substrate heater 410 up to 360° C. When the temperature of the substrate had become stable, RF power was introduced by setting the RF power supply 422 to 0.03 W/cm$^3$ so as to excite a glow discharge in the plasma excitation cup 420. Under the above described conditions, the substrate was exposed for 3 min to the hydrogen gas containing the small amount of silane gas. The RF power was then shut off thereby eliminating the glow discharge. The supply of $SiH_4/H_2$ gas (diluted to 1000 ppm) into the deposition chamber 417 was stopped, whereas the $H_2$ gas was fed further for 5 min into the deposition chamber 417. Then, the $H_2$ gas was also shut off, and the inside of the deposition chamber 417 as well as the inside of the gas lines was evacuated down to $1\times10^{-5}$.

After the completion of the preparation for film deposition as described, an RF n-layer 103 of μc-Si was formed in a similar manner as the Example H1.

Next, plasma treatment with hydrogen gas containing the small amount of silane gas was performed under the conditions as shown in Table H18(2). In this plasma treatment with hydrogen gas containing the small amount of silane gas, a mixture of $SiH_4/H_2$ (diluted to 1000 ppm) and $H_2$, serving as the gas containing silicon atoms, were introduced into the deposition chamber 417 via the gas inlet 429 wherein the $H_2$ gas was supplied via opened valves 441, 431, 430 and its flow rate was adjusted to 850 sccm by means of the mass flow controller 436. The silicon atom containing gas was supplied via opened valves 442 and 432 and its flow rate was controlled by the mass flow controller 437 such that the flow rate of the $SiH_4$ gas was maintained at 0.03% of the total gas flow rate of $H_2$. The pressure inside the deposition chamber 417 was adjusted to 0.8 Torr by means of a conductance valve (not shown). The substrate 490 was heated by the substrate heater 410 up to 350° C. When the temperature of the substrate had become stable, RF power was introduced by setting the RF power supply 422 to 0.03 W/cm$^3$ so as to excite a glow discharge in the plasma excitation cup 420. Under the above described conditions, the substrate was exposed for 3 min to the hydrogen gas containing the small amount of silane gas. The RF power was then shut off thereby eliminating the glow discharge. The supply of $SiH_4/H_2$ gas (diluted to 1000 ppm) into the deposition chamber 417 was stopped, whereas the $H_2$ gas was fed further for 5 min into the deposition chamber 417. Then, the $H_2$ gas was also shut off, and the inside of the deposition chamber 417 as well as the inside of the gas lines was evacuated down to $1\times10^{-5}$.

Next, the gate valve 407 was opened, and the substrate 490 was transferred to the deposition chamber 418 via the transfer chamber 403 wherein both deposition chamber 418 and transfer chamber 403 had already been evacuated with a vacuum pump (not shown). The substrate 490 was placed such that the back surface of the substrate 490 came into contact with the heater 411 so that the substrate 490 was heated. The inside of the deposition chamber 418 was evacuated with the vacuum pump (not shown) down to a pressure of about $1\times10^{-5}$ Torr.

The n/i buffer layer 151 of a-SiC was then deposited by means of RFPCVD by a similar method as the Example H1.

Next, the substrate was subjected to plasma treatment with hydrogen gas containing a small amount of silane gas according to the invention (Table H18(3)). In this plasma treatment with hydrogen gas containing the small amount of silane gas according to the invention, $SiH_4$ and $H_2$, serving as the gas containing silicon atoms, were introduced into the gas deposition chamber 418 via the gas inlet 449 wherein the $H_2$ gas was supplied via opened valves 463, 453, 450 and its flow rate was adjusted to 800 sccm by means of a mass flow controller 458. The silicon atom containing gas was adjusted by a mass flow controller 456 by opening valves 461, 451 such that the flow rate of $SiH_4$ gas was maintained at 0.03% of the total gas flow rate of $H_2$. The pressure inside the deposition chamber 418 was adjusted to 0.7 Torr by means of a conductance valve (not shown). The substrate 490 was heated by the substrate heater 411 up to 350° C. When the temperature of the substrate had become stable, power of the RF power supply 424 was set to 0.03 W/cm$^3$ to apply an RF power to the bias bar 428. A glow discharge was thus caused to occur in the deposition chamber 418, and the substrate was exposed for 3 min to the hydrogen gas containing the small amount of silane gas according to the invention. The RF power was then shut off thereby eliminating the glow discharge. The supply of $SiH_4$ gas into the deposition chamber 418 was stopped, whereas the $H_2$ gas was fed further for 3 min into the deposition chamber 418. Then, the $H_2$ gas was also shut off, and the inside of the deposition chamber 418 as well as the inside of the gas lines was evacuated down to $1\times10^{-5}$ Torr.

An MW i-layer 114 of a-SiGe was then deposited by means of MWPCVD by a similar method as the Example H1.

Next, the substrate was subjected to plasma treatment with hydrogen gas containing a small amount of silane gas according to the invention (Table H18(4)).

In this plasma treatment with hydrogen gas containing the small amount of silane gas according to the invention, $SiH_4$ and $H_2$, serving as the gas containing silicon atoms, were introduced into the gas deposition chamber 418 via the gas inlet 449 wherein the $H_2$ gas was supplied via opened valves 463, 453, 450 and its flow rate was adjusted to 1000 sccm by means of a mass flow controller 458. The silicon atom containing gas was adjusted by a mass flow controller 456 by opening valves 461, 451 such that the flow rate of $SiH_4$ gas was maintained at 0.03% of the total gas flow rate of $H_2$. The pressure inside the deposition chamber 418 was adjusted to 0.6 Torr by means of a conductance valve (not shown). The substrate 490 was heated by the substrate heater 411 up to 330° C. When the temperature of the substrate had become stable, power of the RF power supply 424 was set to 0.04 W/cm$^3$ to apply an RF power to the bias bar 428. A glow discharge was thus caused to occur in the deposition chamber 418 and the shutter 427 was opened to expose the substrate to the hydrogen gas containing the small amount of silane gas according to the invention for 3 min. The RF power was then shut off thereby eliminating the glow discharge. The supply of $SiH_4$ gas into the deposition chamber 418 was stopped, whereas the $H_2$ gas was fed further for 3 min into the deposition chamber 418. Then, the $H_2$ gas was also shut off, and the inside of the deposition chamber 418 as well as the inside of the gas lines was evacuated down to $1\times10^{-5}$ Torr.

A p/i buffer layer 161 of a-SiC was then deposited by means of RFPCVD by a similar method as the Example H1.

Next, the substrate was subjected to plasma treatment with hydrogen gas containing a small amount of silane gas according to the invention (Table H18(5)).

In this plasma treatment with hydrogen gas containing the small amount of silane gas according to the invention, $SiH_4$ and $H_2$, serving as the gas containing silicon atoms, were introduced into the gas deposition chamber 418 via the gas inlet 449 wherein the $H_2$ gas was supplied via opened valves 463, 453, 450 and its flow rate was adjusted to 1100 sccm by means of a mass flow controller 458. The silicon atom containing gas was adjusted by a mass flow controller 456 by opening valves 461, 451 such that the flow rate of $SiH_4$ gas was maintained at 0.03% of the total gas flow rate of $H_2$. The pressure inside the deposition chamber 418 was adjusted to 0.6 Torr by means of a conductance valve (not shown). The substrate 490 was heated by the substrate heater 411 up to 300° C. When the temperature of the substrate had become stable, power of the RF power supply 424 was set to 0.025 W/cm$^3$ to apply an RF power to the bias bar 428. A glow discharge was thus caused to occur in the deposition chamber 418 and the shutter 427 was opened to expose the substrate to the hydrogen gas containing the small amount of silane gas according to the invention for 3 min. The RF power was then shut off thereby eliminating the glow discharge. The supply of $SiH_4$ gas into the deposition chamber 418 was stopped, whereas the $H_2$ gas was fed further for 3 min into the deposition chamber 418. Then, the $H_2$ gas was also shut off, and the inside of the deposition chamber 418 as well as the inside of the gas lines was evacuated down to $1\times10^{-5}$ Torr.

An RF p-layer 105 of a-SiC was then deposited by means of RFPCVD by a similar method as the Example H1.

Next, the substrate was subjected to plasma treatment with hydrogen gas containing a small amount of silane gas according to the invention (Table H18(6)). In this plasma treatment with hydrogen gas containing the small amount of silane gas according to the invention, $SiH_4$ and $H_2$, serving as the gas containing silicon atoms, were introduced into the gas deposition chamber 419 via the gas inlet 469 wherein the $H_2$ gas was supplied via opened valves 481, 471, 470 and its flow rate was adjusted to 1200 sccm by means of a mass flow controller 476. The silicon atom containing gas was adjusted by a mass flow controller (not shown) by opening valves (not shown) such that the flow rate of $SiH_4$ gas was maintained at 0.02% of the total gas flow rate of $H_2$. The pressure inside the deposition chamber 419 was adjusted to 0.7 Torr by means of a conductance valve (not shown). The substrate 490 was heated by the substrate heater 412 up to 300° C. When the temperature of the substrate had become stable, RF power was introduced by setting the RF power supply 423 to 0.05 W/cm$^3$ so as to excite a glow discharge in the plasma excitation cup 421. Under the above described conditions, the substrate was exposed for 3 min to the hydrogen gas containing the small amount of silane gas according to the invention. The RF power was then shut off thereby eliminating the glow discharge. The supply of $SiH_4$ gas into the deposition chamber 419 was stopped, whereas the $H_2$ gas was fed further for 3 min into the deposition chamber 419. Then, the $H_2$ gas was also shut off, and the inside of the deposition chamber 419 as well as the inside of the gas lines was evacuated down to $1\times10^{-5}$ Torr.

Next, to deposit an RF n-layer 203 of μc-Si, the gate valves 408, 407 were opened, and the substrate 490 was transferred to the transfer chamber 402 and the deposition chamber 417 via the transfer chamber 403 which had already been evacuated with a vacuum pump (not shown). The substrate 490 was placed such that the back surface of the substrate 490 came into contact with the heater 410 so that the substrate 490 was heated. The inside of the deposition chamber 417 was evacuated with the vacuum pump (not shown) down to a pressure of about $1\times10^{-5}$ Torr.

The RF n-layer 203 of μc-SiC was then deposited by means of RFPCVD by a similar method as the Example H1.

Next, the substrate was subjected to plasma treatment with hydrogen gas containing a small amount of silane gas according to the invention (Table H18(7)). In this plasma treatment with hydrogen gas containing the small amount of silane gas according to the invention, a mixture of $SiH_4/H_2$ (diluted to 1000 ppm) and $H_2$, serving as the gas containing silicon atoms, were introduced into the deposition chamber 417 via the gas inlet 429 wherein the $H_2$ gas was supplied via opened valves 441, 431, 430 and its flow rate was adjusted to 1100 sccm by means of the mass flow controller 436. The silicon atom containing gas was supplied via opened valves 442 and 432 and its flow rate was controlled by the mass flow controller 437 such that the flow rate of the $SiH_4$ gas was maintained at 0.04% of the total gas flow rate of $H_2$. The pressure inside the deposition chamber 417 was adjusted to 0.7 Torr by means of a conductance valve (not shown). The substrate 490 was heated by the substrate heater 410 up to 300° C. When the temperature of the substrate had become stable, RF power was introduced by setting the RF power supply 422 to 0.03 W/$cm^3$ so as to excite a glow discharge in the plasma excitation cup 420. Under the above described conditions, the substrate was exposed for 3 min to the hydrogen gas containing the small amount of silane gas according to the invention. The RF power was then shut off thereby eliminating the glow discharge. The supply of $SiH_4/H_2$ gas (diluted to 1000 ppm) into the deposition chamber 417 was stopped, whereas the $H_2$ gas was fed further for 3 min into the deposition chamber 417. Then, the $H_2$ gas was also shut off, and the inside of the deposition chamber 417 as well as the inside of the gas lines was evacuated down to $1\times10^{-5}$.

The n/i buffer layer 251 of a-SiC was then deposited by means of RFPCVD by a similar method as the Example H1.

Next, the substrate was subjected to plasma treatment with hydrogen gas containing a small amount of silane gas according to the invention (Table H18(8)). In this plasma treatment with hydrogen gas containing the small amount of silane gas according to the invention, $SiH_4$ and $H_2$, serving as the gas containing silicon atoms, were introduced into the gas deposition chamber 418 via the gas inlet 449 wherein the $H_2$ gas was supplied via opened valves 463, 453, 450 and its flow rate was adjusted to 1200 sccm by means of a mass flow controller 458. The silicon atom containing gas was adjusted by a mass flow controller 456 by opening valves 461, 451 such that the flow rate of $SiH_4$ gas was maintained at 0.02% of the total gas flow rate of $H_2$. The pressure inside the deposition chamber 418 was adjusted to 0.7 Torr by means of a conductance valve (not shown). The substrate 490 was heated by the substrate heater 411 up to 300° C. When the temperature of the substrate had become stable, power of the RF power supply 424 was set to 0.02 W/$cm^3$ to apply an RF power to the bias bar 428. A glow discharge was thus caused to occur in the deposition chamber 418 and the shutter 27 was opened to expose the substrate to the hydrogen gas containing the small amount of silane gas according to the invention for 3 min. The RF power was then shut off thereby eliminating the glow discharge. The supply of $SiH_4$ gas into the deposition chamber 418 was stopped, whereas the $H_2$ gas was fed further for 3 min into the deposition chamber 418. Then, the $H_2$ gas was also shut off, and the inside of the deposition chamber 418 as well as the inside of the gas lines was evacuated down to $1\times10^{-5}$ Torr.

An MW i-layer 214 of a-SiGe was then deposited by means of MWPCVD by a similar method as the Example H1.

Next, the substrate was subjected to plasma treatment with hydrogen gas containing a small amount of silane gas according to the invention (Table H18(9)).

In this plasma treatment with hydrogen gas containing the small amount of silane gas according to the invention, $SiH_4$ and $H_2$, serving as the gas containing silicon atoms, were introduced into the gas deposition chamber 418 via the gas inlet 449 wherein the $H_2$ gas was supplied via opened valves 463, 453, 450 and its flow rate was adjusted to 1200 sccm by means of the mass flow controller 458. The silicon atom containing gas was adjusted by the mass flow controller 456 by opening valves 461, 451 such that the flow rate of $SiH_4$ gas was maintained at 0.03% of the total gas flow rate of $H_2$. The pressure inside the deposition chamber 418 was adjusted to 0.6 Torr by means of a conductance valve (not shown). The substrate 490 was heated by the substrate heater 411 up to 280° C. When the temperature of the substrate had become stable, power of the RF power supply 424 was set to 0.03 W/$cm^3$ to apply an RF power to the bias bar 428. A glow discharge was thus caused to occur in the deposition chamber 418 and the shutter 427 was opened to expose the substrate to the hydrogen gas containing the small amount of silane gas according to the invention for 3 min. The RF power was then shut off thereby eliminating the glow discharge. The supply of $SiH_4$ gas into the deposition chamber 418 was stopped, whereas the $H_2$ gas was fed further for 3 min into the deposition chamber 418. Then, the $H_2$ gas was also shut off, and the inside of the deposition chamber 418 as well as the inside of the gas lines was evacuated down to $1\times10^{-5}$ Torr.

A p/i buffer layer 261 of a-SiC was then deposited by means of RFPCVD by a similar method as the Example H1.

Next, the substrate was subjected to plasma treatment with hydrogen gas containing a small amount of silane gas according to the invention (Table H18(10)). In this plasma treatment with hydrogen gas containing the small amount of silane gas according to the invention, $SiH_4$ and $H_2$, serving as the gas containing silicon atoms, were introduced into the gas deposition chamber 418 via the gas inlet 449 wherein the $H_2$ gas was supplied via opened valves 463, 453, 450 and its flow rate was adjusted to 1500 sccm by means of a mass flow controller 458. The silicon atom containing gas was adjusted by a mass flow controller 456 by opening valves 461, 451 such that the flow rate of $SiH_4$ gas was maintained at 0.02% of the total gas flow rate of $H_2$. The pressure inside the deposition chamber 418 was adjusted to 0.5 Torr by means of a conductance valve (not shown). The substrate 490 was heated by the substrate heater 411 up to 260° C. When the temperature of the substrate had become stable, power of the RF power supply 424 was set to 0.02 W/$cm^3$ to apply an RF power to the bias bar 428. A glow discharge was thus caused to occur in the deposition chamber 418 and the shutter 427 was opened to expose the substrate to the hydrogen gas containing the small amount of silane gas according to the invention for 3 min. The RF power was then shut off thereby eliminating the glow discharge. The supply of $SiH_4$ gas into the deposition chamber 418 was stopped, whereas the $H_2$ gas was fed further for 3 min into the deposition chamber 418. Then, the $H_2$ gas was also shut off, and the inside of the deposition chamber 418 as well as the inside of the gas lines was evacuated down to $1\times10^{-5}$ Torr.

An RF p-layer 205 of a-SiC was then deposited by a similar method as the Example H1.

Next, the substrate was subjected to plasma treatment with hydrogen gas containing a small amount of silane gas according to the invention (Table H18(11)). In this plasma treatment with hydrogen gas containing the small amount of silane gas according to the invention, $SiH_4$ and $H_2$, serving as the gas containing silicon atoms, were introduced into the gas deposition chamber 419 via the gas inlet 469 wherein the $H_2$ gas was supplied via opened valves 481, 471, 470 and its flow rate was adjusted to 1000 sccm by means of a mass flow controller 476. The silicon atom containing gas was adjusted by a mass flow controller (not shown) by opening valves (not shown) such that the flow rate of $SiH_4$ gas was maintained at 0.02% of the total gas flow rate of $H_2$. The pressure inside the deposition chamber 419 was adjusted to 0.6 Torr by means of a conductance valve (not shown). The substrate 490 was heated by the substrate heater 412 up to 250° C. When the temperature of the substrate had become stable, RF power was introduced by setting the RF power supply 423 to 0.04 W/$cm^3$ so as to excite a glow discharge in the plasma excitation cup 421. Under the above described conditions, the substrate was exposed for 3 min to the hydrogen gas containing the small amount of silane gas according to the invention. The RF power was then shut off thereby eliminating the glow discharge. The supply of $SiH_4$ gas into the deposition chamber 419 was stopped, whereas the $H_2$ gas was fed further for 3 min into the deposition chamber 419. Then, the $H_2$ gas was also shut off, and the inside of the deposition chamber 419 as well as the inside of the gas lines was evacuated down to $1\times10^{-5}$ Torr.

Next, to deposit an RF n-layer 303 of μc-Si, the gate valves 408, 407 were opened, and the substrate 490 was transferred to the transfer chamber 402 and the deposition chamber 417 via the transfer chamber 403 which had already been evacuated with a vacuum pump (not shown). The substrate 490 was placed such that the back surface of the substrate 490 came into contact with the heater 410 so that the substrate 490 was heated. The inside of the deposition chamber 417 was evacuated with the vacuum pump (not shown) down to a pressure of about $1\times10^{-5}$ Torr.

The RF n-layer 303 of μc-Si was then deposited by a similar method as the Example H1.

Next, the substrate was subjected to plasma treatment with hydrogen gas containing a small amount of silane gas according to the invention (Table H18(12)). In this plasma treatment with hydrogen gas containing the small amount of silane gas according to the invention, a mixture of $SiH_4/H_2$ (diluted to 1000 ppm) and $H_2$, serving as the gas containing silicon atoms, were introduced into the deposition chamber 417 via the gas inlet 429 wherein the $H_2$ gas was supplied via opened valves 441, 431, 430 and its flow rate was adjusted to 900 sccm by means of the mass flow controller 436. The silicon atom containing gas was supplied via opened valves 442 and 432 and its flow rate was controlled by the mass flow controller 437 such that the flow rate of the $SiH_4$ gas was maintained at 0.03% of the total gas flow rate of $H_2$. The pressure inside the deposition chamber 417 was adjusted to 0.9 Torr by means of a conductance valve (not shown). The substrate 490 was heated by the substrate heater 410 up to 230° C. When the temperature of the substrate had become stable, RF power was introduced by setting the RF power supply 422 to 0.03 W/$cm^3$ so as to excite a glow discharge in the plasma excitation cup 420. Under the above described conditions, the substrate was exposed for 2 min to the hydrogen gas containing the small amount of silane gas according to the invention. The RF power was then shut off thereby eliminating the glow discharge. The supply of $SiH_4/H_2$ gas (diluted to 1000 ppm) into the deposition chamber 417 was stopped, whereas the $H_2$ gas was fed further for 3 min into the deposition chamber 417. Then, the $H_2$ gas was also shut off, and the inside of the deposition chamber 417 as well as the inside of the gas lines was evacuated down to $1\times10^{-5}$.

An n/i buffer layer 351 of a-SiC was then deposited by means of RFPCVD by a similar method as the Example H1.

Next, the substrate was subjected to plasma treatment with hydrogen gas containing a small amount of silane gas according to the invention (Table H18(13)). In this plasma treatment with hydrogen gas containing the small amount of silane gas according to the invention, $SiH_4$ and $H_2$, serving as the gas containing silicon atoms, were introduced into the gas deposition chamber 418 via the gas inlet 449 wherein the $H_2$ gas was supplied via opened valves 463, 453, 450 and its flow rate was adjusted to 1200 sccm by means of a mass flow controller 458. The silicon atom containing gas was adjusted by a mass flow controller 456 by opening valves 461, 451 such that the flow rate of $SiH_4$ gas was maintained at 0.02% of the total gas flow rate of $H_2$. The pressure inside the deposition chamber 418 was adjusted to 0.7 Torr by means of a conductance valve (not shown). The substrate 490 was heated by the substrate heater 411 up to 230° C. When the temperature of the substrate had become stable, power of the RF power supply 424 was set to 0.02 W/$cm^3$ to apply an RF power to the bias bar 428. A glow discharge was thus caused to occur in the deposition chamber 418 and the shutter 27 was opened to expose the substrate to the hydrogen gas containing the small amount of silane gas according to the invention for 3 min. The RF power was then shut off thereby eliminating the glow discharge. The supply of $SiH_4$ gas into the deposition chamber 418 was stopped, whereas the $H_2$ gas was fed further for 3 min into the deposition chamber 418. Then, the $H_2$ gas was also shut off, and the inside of the deposition chamber 418 as well as the inside of the gas lines was evacuated down to $1\times10^{-5}$ Torr.

An RF i-layer 314 of a-Si was then deposited by means of RFPCVD by a similar method as the Example H1.

Next, the substrate was subjected to plasma treatment with hydrogen gas containing a small amount of silane gas according to the invention (Table H18(14)). In this plasma treatment with hydrogen gas containing the small amount of silane gas according to the invention, $SiH_4$ and $H_2$, serving as the gas containing silicon atoms, were introduced into the gas deposition chamber 418 via the gas inlet 449 wherein the $H_2$ gas was supplied via opened valves 463, 453, 450 and its flow rate was adjusted to 1200 sccm by means of a mass flow controller 458. The silicon atom containing gas was adjusted by a mass flow controller 456 by opening valves 461, 451 such that the flow rate of $SiH_4$ gas was maintained at 0.02% of the total gas flow rate of $H_2$. The pressure inside the deposition chamber 418 was adjusted to 0.8 Torr by means of a conductance valve (not shown). The substrate 490 was heated by the substrate heater 411 up to 200° C. When the temperature of the substrate had become stable, power of the RF power supply 424 was set to 0.02 W/$cm^3$ to apply an RF power to the bias bar 428. A glow discharge was thus caused to occur in the deposition chamber 418 and the shutter 27 was opened to expose the substrate to the hydrogen gas containing the small amount of silane gas according to the invention for 3 min. The RF power was then shut off thereby eliminating the glow discharge. The supply of $SiH_4$ gas into the deposition chamber 418 was stopped, whereas the $H_2$ gas was fed further for 3 min into the deposition chamber 418. Then, the $H_2$ gas was also shut off, and the inside of the deposition chamber 418 as well as the inside of the gas lines was evacuated down to $1\times10^{-5}$ Torr.

A p/i buffer layer 361 of a-SiC was then deposited by means of RFPCVD by a similar method as the Example H1.

Next, the substrate was subjected to plasma treatment with hydrogen gas containing a small amount of silane gas according to the invention (Table H18(15)). In this plasma treatment with hydrogen gas containing the small amount of silane gas according to the invention, $SiH_4$ and $H_2$, serving as the gas containing silicon atoms, were introduced into the gas deposition chamber 418 via the gas inlet 449 wherein the $H_2$ gas was supplied via opened valves 463, 453, 450 and its flow rate was adjusted to 1400 sccm by means of a mass flow controller 458. The silicon atom containing gas was adjusted by a mass flow controller 456 by opening valves 461, 451 such that the flow rate of $SiH_4$ gas was maintained at 0.02% of the total gas flow rate of $H_2$. The pressure inside the deposition chamber 418 was adjusted to 0.7 Torr by means of a conductance valve (not shown). The substrate 490 was heated by the substrate heater 411 up to 170° C. When the temperature of the substrate had become stable, power of the RF power supply 424 was set to 0.02 $W/cm^3$ to apply an RF power to the bias bar 428. A glow discharge was thus caused to occur in the deposition chamber 418 and the shutter 427 was opened to expose the substrate to the hydrogen gas containing the small amount of silane gas according to the invention for 3 min. The RF power was then shut off thereby eliminating the glow discharge. The supply of $SiH_4$ into the deposition chamber 418 was stopped, whereas the $H_2$ gas was fed further for 3 min into the deposition chamber 418. Then, the $H_2$ gas was also shut off, and the inside of the deposition chamber 418 as well as the inside of the gas lines was evacuated down to $1\times10^{-5}$ Torr.

An RF p-layer 305 of a-SiC was then deposited by means of RFPCVD by a similar method as the Example H1.

ITO having a layer thickness of 70 nm, serving as a transparent conductive layer 112, was then evaporated onto the RF p-layer 305 by means of vacuum deposition.

A mask having a comb-shaped window was placed on the transparent conductive layer 112, and metal evaporation was performed via the mask thereby forming a comb-shaped collection electrode 113 having a multi-layer structure consisting of Cr(40 nm)/Ag(1000 nm)/Cr(40 nm).

In this way, a complete solar cell according to the invention was obtained. Hereafter, the solar cell of this type will be referred to as SC-EMB-H18. Tables H18(1) to H18(16) summarize the conditions used here in the invention, regarding the plasma treatment in an ambient of hydrogen containing a small amount of silane or similar gas as well as the process conditions for the RF n-layer, n/i buffer layer, MW i-layer, p/i buffer layer, RF p-layer, RF n-layer, n/i buffer layer, MW i-layer, p/i buffer layer, RF p-layer, RF n-layer, n/i buffer layer, RF i-layer, p/i buffer layer, and RF p-layer.

COMPARATIVE EXAMPLE H18

For the sake of comparison, a solar cell (SC-CMP-H18) was also fabricated in the same manner as in the above-described example H18 except that the plasma treatment with hydrogen gas containing a small amount of silane gas according to the invention was not performed.

Nine samples were prepared for each type (SC-EMB-H18 and SC-CMP-H18) for the purpose of evaluation regarding the initial photoelectric conversion efficiency (the ratio of the electric output power to the optical input power), vibration durability, optical durability, vibration durability and optical durability under a biased condition at a high temperature and high humidity, and the characteristics under a reverse bias.

The measurement of the initial photoelectric conversion efficiency was performed by measuring the V-I characteristics of the samples under the illumination condition of AM1.5 (100 $mW/cm^2$). The measurements on the SC-EMB-H18 samples of fill factor (F.F.) and variation in the initial photoelectric conversion efficiencies relative to the SC-CMP-H18 samples were:

| | [Fill Factor] | [Variation] |
|---|---|---|
| SC-EMB-H18 | 1.18 | 0.80 |
| | (relative to those of SC-EMB-H18) | |

The evaluation of the vibration durability was performed as follows: After the measurement of the initial photoelectric conversion efficiency, some samples were placed in a dark place kept at 26° C. and 56% relative humidity. A vibration having an amplitude of 0.1 mm and a frequency of 60 Hz was applied to the samples for 500 hr. After that, the photoelectric conversion efficiencies of the samples were measured under the illumination condition of AM1.5 (100 $mW/cm^2$) and the reduction relative to the initial value (the ratio of the photoelectric conversion efficiency after the vibration test to the initial value) was evaluated for each sample.

The evaluation of the optical durability was performed as follows: After the measurement of the initial photoelectric conversion efficiency, some samples were placed in a place kept at 26° C. and 56% relative humidity and were illuminated by a light of AM1.5 (100 $mW/cm^2$) for 500 hr. After that, the photoelectric conversion efficiencies of the samples were measured under the illumination condition of AM1.5 (100 $mW/cm^2$) and the reduction relative to the initial value (the ratio of the photoelectric conversion efficiency after the illumination test to the initial value) was evaluated for each sample. The measurements on reduction in the photoelectric conversion efficiencies after the illumination and reduction in the photoelectric conversion efficiencies after the vibration of the SC-CMP-H18 samples relative to SC-EMB-H18 samples were as follows:

| | [Vibration durability] | [Optical durability] |
|---|---|---|
| SC-CMP-H18 | 0.82 | 0.80 |
| | (relative to those of SC-EMB-H18) | |

The evaluation of the vibration durability and the optical durability under the biased condition at the high temperature and high humidity was performed. After the measurement of the initial photoelectric conversion efficiency, two samples were placed in a dark place kept at 82° C. and 93% relative humidity, and a forward bias voltage of 0.7 V was applied to the samples. One of the samples was subjected to the vibration as described above and its vibration durability was measured, whereas the other was illuminated by a light of AM1.5 and its optical durability was measured.

The measurements on reduction in the photoelectric conversion efficiencies after the vibration and reduction in the photoelectric conversion efficiencies after the illumination of the SC-CMP-H18 samples relative to the SC-EMB-H18 samples were as follows:

| | [Vibration durability] | [Optical durability] |
|---|---|---|
| SC-CMP-H18 | 0.81 | 0.80 |
| | (relative to those of SC-EMB-H18) | |

The evaluation of the characteristics under a reverse bias was performed as follows: After the measurement of the initial photoelectric conversion efficiency, some samples were placed in a dark place kept at 80° C. and 52% relative humidity. A reverse bias voltage of 5.0 V was applied for 100 hr. After that, the photoelectric conversion efficiencies of the samples were measured under the illumination condition of AM1.5 (100 $mW/cm^2$) and the reduction relative to the initial value (the ratio of the photoelectric conversion efficiency after the application of the bias voltage to the initial value) was evaluated for each sample. The measurement on the reduction after the application of the reverse bias voltage of SC-CMP-H18 relative to SC-EMB-H18 was:

| | |
|---|---|
| SC-CMP-H18 | 0.84 (relative to those of SC-EMB-H18) |

The surfaces of the above-described samples were observed using an optical microscope to evaluate film separation. No film separation was observed in the SC-EMB-H18 samples, whereas slight film separation was observed in the SC-CMP-H18 samples.

As described above, it was found that the solar cell of the invention (SC-EMB-H18) was superior to the conventional solar cell (SC-CMP-H18) as a solar cell in the characteristics regarding fill factor and variation of the photoelectric conversion efficiency, optical durability, adhesion, overall durability, and characteristics under a reverse bias voltage.

In the foregoing examples, the description has been given with respect to a solar cell having two or more structures each having an n-type layer, n/i buffer layer, i-type layer, p/i buffer layer, and p-type layer which were sequentially laminated in that order on a substrate. Additional samples of solar cell were fabricated by performing a similar plasma treatment with the hydrogen gas with respect to a solar cell having a p-type layer, p/i buffer layer, i-type layer, n/i buffer layer, and n-type layer which were sequentially laminated in that order on a substrate.

When they were evaluated in a similar manner as the above examples, it was confirmed that fill factor and variation of the photoelectric conversion efficiency, optical durability, adhesion, overall durability, and characteristics under a reverse bias voltage of the solar cell were improved by a plasma treatment with the hydrogen gas which was performed between the n-type layer and the p-type layer. Moreover, it was confirmed that the above characteristics were improved furthermore when plasma treatments with the hydrogen gas were performed respectively between the substrate and the p-type layer, the n-type layer and n/i buffer layer, the n/i buffer layer and i-type layer, and the p/i buffer layer and i-type layer.

EXAMPLE I1

A tandem solar cell having a structure such as that shown in FIG. 1 was made using the deposition equipment shown in FIG. 7. First, a substrate was prepared. A stainless-steel base 100 having dimensions of 0.5 mm in thickness and 50×50 $mm^2$ in area was cleaned with acetone and isopropanol by means of ultrasonic cleaning, and then dried with hot air.

An Ag optical reflection layer 101 having a thickness of 0.3 μm was deposited on a surface of the stainless-steel base 100 using a sputtering technique at room temperature, and a 1.0-μm-thick ZnO layer acting as a reflection enhancing layer 102 was further deposited on it at 350° C. Thus, a complete substrate was prepared.

Next, using the deposition equipment 400, the respective semiconductor layers were then deposited on the reflection enhancing layer, the deposition equipment 400 having the capabilities of both MWPCVD and RFPCVD.

The deposition equipment 400 was used in a state in which source gas cylinders (not shown) were connected to the deposition equipment 400 via gas inlets. The source gas cylinders used here were all of ultra-high purity type, with $SiH_4$ gas cylinder, $SiF_4$ gas cylinder, $CH_4$ gas cylinder, $GeH_4$ gas cylinder, $GeF_4$ gas cylinder, $Si_2H_6$ gas cylinder, $PH_3/H_2$ (diluted to 2000 ppm, 1%, 10%) gas cylinder, $PF_3/H_2$ (diluted to 2000 ppm, 1%, 10%) gas cylinder, $B_2H_6/H_2$ (diluted to 1000 ppm) gas cylinder, $H_2$ gas cylinder, He gas cylinder, $SiCl_2H_2$ gas cylinder, and $SiH_4/H_2$ (diluted to 1000 ppm) gas cylinder being connected.

Next, the substrate 490 on which the optical reflection layer 101 and the reflection enhancing layer 102 had been formed was placed on the substrate transfer rail 413 in the load chamber 401, and the load chamber 401 was evacuated with a vacuum pump (not shown) down to a pressure of about $1\times10^{-5}$ Torr. Then, the gate valve 406 was opened, and the substrate 490 was transferred to the deposition chamber 417 via the transfer chamber 402 wherein both deposition chamber 417 and transfer chamber 402 had already been evacuated with a vacuum pump (not shown). The substrate 490 was placed such that the back surface of the substrate 490 came into contact with the heater 410 so that the substrate 490 was heated. The inside of the deposition chamber 417 was evacuated with the vacuum pump (not shown) down to a pressure of about $1\times10^{-5}$ Torr.

After the preparation for semiconductor film deposition was completed as described above, an RF n-layer 103 comprised of μc-Si was formed.

In order to form an RF n-layer comprised of μc-Si, $H_2$ gas was introduced into the deposition chamber 417 via the gas inlet 429 with the $H_2$ gas being supplied via opened valves 441, 431, and 430, and the flow rate of the $H_2$ gas was adjusted to 300 sccm by means of a mass flow controller 436. Furthermore, the pressure inside the deposition chamber 417 was adjusted to 1.1 Torr by means of a conductance valve (not shown). The substrate 490 was heated by setting the substrate heater 410 to 380° C. When the temperature of the substrate had become stable, $SiH_4$ gas and $PH_3/H_2$ (diluted to 1%) gas was introduced into the deposition chamber 417 via gas inlet 429, by means of operating valves 443, 433, 444, and 434. At this time, the flow rates of the $SiH_4$ gas, $H_2$ gas, and $PH_3/H_2$ (diluted to 1%) gas were adjusted to 1.5 sccm, 300 sccm, and 20 sccm respectively, by means of mass flow controllers 438, 436, and 439. Furthermore, the pressure inside the deposition chamber 417 was adjusted to 1.1 Torr by means of a conductance valve (not shown). The RF power supply 422 was set so that the electric power was 0.05 W/$cm^3$, RF electrical power was introduced to the plasma excitation cup 420, causing a glow discharge to occur, and thus deposition of the RF n-layer 103 was started upon the substrate 490. When the thickness of the deposited RF n-layer 103 had reached 20 nm, the RF power was shut off thereby eliminating the glow discharge. Thus, the deposition of the RF n-layer 103 was complete. The supply of $SiH_4$ and $PH_3/H_2$ into the chamber 417 was stopped, whereas $H_2$ was fed further for 4 min. into the deposition chamber 417. Then, $H_2$ was also shut off, and the inside of the deposition chamber 417 as well as the inside of the gas lines was evacuated down to $1\times10^{-5}$ Torr.

Next, an n/i buffer layer 151 comprised of a-Si was formed by means of RFPCVD method. First, the inside of the transfer chamber 403 and the i-layer deposition chamber 418 was evacuated with the vacuum pump (not shown), to which the substrate 490 was transferred by means of opening the gate valve 407. The substrate 490 was heated by means of applying the back side there of to the substrate heater 411, and the inside of the i-layer deposition chamber 418 was evacuated with the vacuum pump (not shown) down to a pressure of about $1\times10^{-5}$ Torr.

In order to form the n/i buffer layer 151, the substrate 490 was heated by setting the substrate heater 411 to 360° C. When the temperature of the substrate was sufficient, $Si_2H_6$ gas and $H_2$ gas was introduced into the i-layer deposition chamber 418 via gas inlet 449, by means of slowly opening valves 464, 454, 450, and 453. At this time, the flow rates of the $Si_2H_6$ gas and $H_2$ gas were adjusted to 2.5 sccm and 100 sccm respectively, by means of mass flow controllers 459 and 458. Furthermore, the pressure inside the i-layer deposition chamber 418 was adjusted to 0.7 Torr by means of a conductance valve (not shown). Next, the RF power supply 424 was set so that the electric power was 0.08 W/cm$^3$, applied to a bias rod 427, causing a glow discharge to occur, and formation of the n/i buffer layer 151 upon the RF n-layer 103 was started. When the thickness of the deposited n/i buffer layer 151 had reached 10 nm, the RF glow discharge was terminated, and the output of the RF power source 424 was shut off. Thus, the formation of the n/i buffer layer 151 was complete. The valves 464 and 454 were closed so that the supply of $Si_2H_6$ into the i-layer chamber 418 was stopped, whereas $H_2$ was fed further for 2 min. into the i-layer deposition chamber 418. Then, valves 453 and 450 were closed, and the inside of the i-layer deposition chamber 418 as well as the inside of the gas lines was evacuated down to $1\times10^{-5}$ Torr.

Next, an MW i-layer 114 comprised of a-SiGe was formed by means of MWPCVD method. In order to form the MW i-layer, the substrate 490 was heated by setting the substrate heater 411 to 380° C. When the temperature of the substrate was sufficient, $SiH_4$ gas, $GeH_4$ gas, and $H_2$ gas was introduced into the i-layer deposition chamber 418 via gas inlet 449, by means of slowly opening valves 461, 451, 450, 462, 452, 463, and 453. At this time, the flow rates of the $SiH_4$ gas, $GeH_4$ gas, and $H_2$ gas were adjusted to 37 sccm, 38 sccm, and 180 sccm respectively, by means of mass flow controllers 456, 457, and 458. Furthermore, the pressure inside the i-layer deposition chamber 418 was adjusted to 5 mTorr by means of a conductance valve (not shown). Next, the high-frequency (hereafter referred to as "RF") power supply 424 was set so that the electric power was 0.6 W/cm$^3$, and applied to a bias rod 428. Following this, the electric power of the MW power source (not shown) was set to 0.28 W/cm$^3$, MW electrical power was introduced into the i-layer deposition chamber 418 via the guided-wave tube 426 and micro-wave introduction window 425, causing a glow discharge to occur, and formation of the MW i-layer 114 upon the n/i-layer 161 was started, by means of opening a shutter 427. When the thickness of the deposited i-layer had reached 0.15 μm, the MW glow discharge was terminated, and the output of the bias power source 424 was shut off. Thus, the formation of the MW i-buffer layer 114 was complete. The supply of $SiH_4$ gas and $GeH_4$ into the i-layer chamber 418 was stopped by means of closing the valves 451 and 452, whereas $H_2$ was fed further for 2 min. into the i-layer deposition chamber 418. Then, valves 453 and 450 were closed, and the inside of the i-layer deposition chamber 418 as well as the inside of the gas lines was evacuated down to $1\times10^{-5}$ Torr.

Next, a p/i buffer layer 161 comprised of a-Si was formed by means of RFPCVD method. In order to form the p/i buffer layer, the substrate 490 was heated by setting the substrate heater 411 to 250° C. When the temperature of the substrate was sufficient, $Si_2H_6$ gas, and $H_2$ gas was introduced into the i-layer deposition chamber 418 via gas inlet 449, by means of slowly opening valves 464, 454, 450, 463, and 453. At this time, the flow rates of the $Si_2H_6$ gas, and $H_2$ gas were adjusted to 2.5 sccm, and 80 sccm respectively, by means of mass flow controllers 459, and 458. Furthermore, the pressure inside the i-layer deposition chamber 418 was adjusted to 0.7 Torr by means of a conductance valve (not shown). Next, the RF power supply 424 was set so that the electric power was 0.07 W/cm$^3$, and applied to a bias rod, causing a glow discharge to occur, and formation of the p/i buffer layer 161 upon the MW i-layer 114 was started, by means of opening a shutter 427. When the thickness of the deposited p/i-layer 161 had reached 20 nm, the RF glow discharge was terminated, and the output of the RF power source 424 was shut off. Thus, the formation of the MW i-buffer layer 161 was complete. The supply of $Si_2H_6$ gas into the i-layer chamber 418 was stopped by means of closing the valves 464 and 454, whereas $H_2$ was fed further for 2 min. into the i-layer deposition chamber 418. Then, valves 453 and 450 were closed, and the inside of the i-layer deposition chamber 418 as well as the inside of the gas lines was evacuated down to $1\times10^{-5}$ Torr.

Next, in order to form an RF p-layer 105 comprised of a-SiC, the substrate 490 was transferred to the p-layer deposition chamber 419 via the transfer chamber 404 by means of opening the gate valve 408 thereto, wherein both deposition chamber 419 and transfer chamber 404 had already been evacuated with a vacuum pump (not shown). The substrate 490 was placed such that the back surface of the substrate 490 came into contact with the heater 412 so that the substrate 490 was heated. The inside of the p-layer deposition chamber 417 was evacuated with the vacuum pump (not shown) down to a pressure of about $1\times10^{-5}$ Torr.

The substrate 490 was heated by setting the substrate heater 412 to 250° C. When the temperature of the substrate had become stable, $H_2$ gas, $SiH_4/H_2$ gas, $B_2H_6/H_2$ gas, and $CH_4$ gas was introduced into the deposition chamber 419 via gas inlet 469, by means of operating valves 481, 471, 470, 482, 472, 483, 473, 484, and 474. At this time, the flow rates of the $H_2$ gas, $SiH_4/H_2$ gas, $B_2H_6/H_2$ gas, and $CH_4$ gas were adjusted to 60 sccm, 0.5 sccm, 10 sccm, and 0.3 sccm respectively, by means of mass flow controllers 476, 477, 478, and 479. Furthermore, the pressure inside the deposition chamber 419 was adjusted to 1.7 Torr by means of a conductance valve (not shown). The RF power supply 423 was set so that the electric power was 0.07 W/cm$^3$, RF power supply was introduced to the plasma excitation cup 421, causing a glow discharge to occur, and thus formation of the RF p-layer 105 was started upon the p/i buffer layer 161. When the thickness of the deposited RF p-layer 105 had reached 10 nm, the RF power was shut off thereby eliminating the glow discharge. Thus, the formation of the RF p-layer 105 was complete. The supply of $SiH_4/H_2$ gas, $B_2H_6/H_2$ gas, and $CH_4$ gas into the chamber 419 was stopped by means of closing the valves 472, 482, 473, 483, 474, and 484, whereas $H_2$ was fed further for 3 min. into the p-layer deposition chamber 419. Then, $H_2$ was also shut off by means of closing the valves 471, 481, and 470, and the inside of the p-layer deposition chamber 419 as well as the inside of the gas lines was evacuated down to $1\times10^{-5}$ Torr.

Next, in order to conduct plasma treatment with hydrogen gas containing a small amount of Group V element according to the present invention, the gate valves 408 and 407 were opened, transferring was conducted to the transfer chamber 402 and deposition chamber 417 via the transfer chamber 403, wherein the transfer chamber 403 had already been evacuated with a vacuum pump (not shown). The substrate 490 was placed such that the back surface of the substrate 490 came into contact with the heater 410 so that the substrate 490 was heated. The inside of the deposition chamber 417 was evacuated with the vacuum pump (not shown)down to a pressure of about $1\times10^{-5}$ Torr.

Next, plasma treatment with hydrogen gas containing a small amount of Group V element according to the present invention was conducted according to the conditions of Table I1 (1). In order to conduct plasma treatment with hydrogen gas containing a small amount of Group V element according to the present invention, $PH_3/H_2$ (diluted to 1%), $SiH_4$ serving as the gas containing silicon atoms described above, and $H_2$ were introduced into the deposition chamber 417 via the gas inlet 429 wherein the $H_2$ gas was supplied via opened valves 441, 431, and 430, and its flow rate was adjusted to 1300 sccm by means of a mass flow controller 436. The $PH_3$ gas was supplied via opened valves 444 and 434 and its flow rate was controlled by a mass flow controller 437 such that the flow rate of the $PH_3$ gas was maintained at 0.3% of the total gas flow rate of $H_2$. The flow rate of the gas containing silicone was controlled by a mass flow controller (not shown) such that the flow rate of the $SiH_4$ was maintained at 0.01% of the total gas flow rate of $H_2$ by means of opening valves (not shown). The pressure inside the deposition chamber 417 was adjusted to 0.8 Torr by means of a conductance valve (not shown).The substrate 490 was heated by the substrate heater 410 up to 250° C. When the temperature of the substrate had become stable, the electrical power of the RF power supply 422 was adjusted to 0.06 W/cm$^3$, so that a glow discharge occurred in the plasma excitation cup 421, and plasma processing with hydrogen gas containing a small about of Group V element according to the present invention was conducted for 4 minutes. The RF power was then shut off, thereby eliminating the glow discharge. The supply of the $PH_3/H_2$ (diluted to 1%) and $SiH_4$ gas into the deposition chamber 417 was stopped, whereas the $H_2$ gas was fed further for 5 min. into the deposition chamber 417. Then, the $H_2$ gas was also shut off, and the inside of the deposition chamber 417 as well as the inside of the gas lines was evacuated down to $1\times10^{-5}$ Torr.

Next, an RF n-layer 203 comprised of μc-Si was formed. In order to form an RF n-layer 203 comprised of μc-Si, $H_2$ gas was introduced into the deposition chamber 417 via the gas inlet 429 with the $H_2$ gas being supplied via opened valves 441, 431, and 430, and the flow rate of the $H_2$ gas was adjusted to 200 sccm by means of a mass flow controller 436. Furthermore, the pressure inside the deposition chamber 417 was adjusted to 1.1 Torr by means of a conductance valve (not shown). The substrate 490 was heated by setting the substrate heater 410 to 250° C. When the temperature of the substrate had become stable, $SiH_4$ gas and $PH_3/H_2$ (diluted to 1%) gas was introduced into the deposition chamber 417 via gas inlet 429, by means of operating valves 443, 433, 444, and 434. At this time, the flow rates of the $SiH_4$ gas, $H_2$ gas, and $PH_3/H_2$ (diluted to 1%) gas were adjusted to 1.5 sccm, 280 sccm, and 25 sccm respectively, by means of mass flow controllers 438, 436, and 439. Furthermore, the pressure inside the deposition chamber 417 was adjusted to 1.1 Torr by means of a conductance valve (not shown). The RF power supply 422 was set so that the electric power was 0.05 W/cm$^3$, introducing RF electrical power to the plasma excitation cup 420, causing a glow discharge to occur, and thus deposition of the RF n-layer 203 was started upon the RF p-layer 105. When the thickness of the deposited RF n-layer 203 had reached 10 nm, the RF power was shut off thereby eliminating the glow discharge. Thus, the deposition of the RF n-layer 203 was complete. The supply of $SiH_4$ and $PH_3/H_2$ into the deposition chamber 417 was stopped, whereas $H_2$ was fed further for 2 min. into the deposition chamber 417. Then, $H_2$ was also shut off, and the inside of the deposition chamber 417 as well as the inside of the gas lines was evacuated down to $1\times10^{-5}$ Torr.

Next, an n/i buffer layer 251 comprised of a-SiC was formed by means of RFPCVD method. First, the inside of the transfer chamber 403 and the i-layer deposition chamber 418 was evacuated with the vacuum pump (not shown), to which the substrate 490 was transferred by means of opening the gate valve 407. The substrate 490 was heated by means of applying the back side thereof to the substrate heater 411, and the inside of the i-layer deposition chamber 418 was evacuated with the vacuum pump (not shown) down to a pressure of about $1\times10^{-5}$ Torr.

In order to form the n/i buffer layer 251, the substrate 490 was heated by setting the substrate heater 411 to 250° C. When the temperature of the substrate was sufficient, $Si_2H_6$ gas, $H_2$ gas and $CH_4$ gas was introduced into the i-layer deposition chamber 418 via gas inlet 449, by means of slowly opening valves 464, 454, 450, 463, 453, 465, and 455. At this time, the flow rates of the $Si_2H_6$ gas, $H_2$ gas and $CH_4$ gas were adjusted to 0.4 sccm, 90 sccm, and 0.2 sccm respectively, by means of mass flow controllers 459, 458, and 460.

The pressure inside the i-layer deposition chamber 418 was adjusted to 1.0 Torr by means of a conductance valve (not shown). Next, the RF power supply 424 was set so that the electric power was 0.06 W/cm$^3$, applied to a bias rod 428, causing a glow discharge to occur, and formation of the n/i buffer layer 251 upon the RF n-layer 203 was started by means of opening the shutter 427. When the thickness of the deposited n/i buffer layer 251 had reached 10 nm, the RF glow discharge was terminated, and the output of the RF power source 424 was shut off. Thus, the formation of the n/i buffer layer 251 was complete. The supply of $Si_2H_6$ gas and $CH_4$ gas into the i-layer chamber 418 was stopped, whereas $H_2$ was fed further for 2 min. into the i-layer deposition chamber 418. Then, valves 453 and 450 were closed, and the inside of the i-layer deposition chamber 418 as well as the inside of the gas lines was evacuated down to $1\times10^{-5}$ Torr.

Next, an RF i-layer 214 comprised of a-Si was formed by means of RFPCVD method. In order to form the RF i-layer, the substrate 490 was heated by setting the substrate heater 411 to 200° C. When the temperature of the substrate was sufficient, $Si_2H_6$ gas and $H_2$ gas was introduced into the i-layer deposition chamber 418 via gas inlet 449, by means of slowly opening valves 464, 454, 450, 463, and 453. At this time, the flow rates of the $Si_2H_6$ gas, and $H_2$ gas were adjusted to 2.5 sccm and 85 sccm respectively, by means of mass flow controllers 459 and 458.

The pressure inside the i-layer deposition chamber 418 was adjusted to 0.5 Torr by means of a conductance valve (not shown). Next, the RF power supply 424 was set so that the electric power was 0.07 W/cm$^3$, applied to a bias rod 428, causing a glow discharge to occur, and formation of the RF i-layer 214 upon the n/i buffer layer 251 was started, by means of opening the shutter 427. When the thickness of the deposited RF i-layer 214 had reached 110 nm, the RF glow discharge was terminated, and the output of the RF power source 424 was shut off. Thus, the formation of the RF i-layer 214 was complete. The supply of $Si_2H_6$ gas into the i-layer chamber 418 was stopped by means of closing the valves 464 and 454, whereas $H_2$ was fed further for 2 min. into the i-layer deposition chamber 418. Then, valves 453 and 450 were closed, and the inside of the i-layer deposition chamber 418 as well as the inside of the gas lines was evacuated down to $1\times10^{-5}$ Torr.

Next, a p/i buffer layer 261 comprised of a-Sic was formed by means of RFPCVD method. In order to form the p/i buffer layer 261, the substrate 490 was heated by setting the substrate heater 411 to 200° C. When the temperature of the substrate was sufficient, $Si_2H_6$ gas, $H_2$ gas and $CH_4$ gas was introduced into the i-layer deposition chamber 418 via gas inlet 449, by means of slowly opening valves 464, 454, 450, 463, 453, 465, and 455. At this time, the flow rates of the $Si_2H_6$ gas, $H_2$ gas and $CH_4$ gas were adjusted to 0.4 sccm, 65 sccm, and 0.3 sccm respectively, by means of mass flow controllers 459, 458, and 460. The pressure inside the i-layer deposition chamber 418 was adjusted to 1.1 Torr by means of a conductance valve (not shown). Next, the RF power supply 424 was set so that the electric power was 0.06 W/cm$^3$, applied to a bias rod 428, causing a glow discharge to occur, and formation of the p/i buffer layer 261 upon the RF i-layer 214 was started by means of opening the shutter 427. When the thickness of the deposited p/i buffer layer 261 had reached 15 nm, the RF glow discharge was terminated, and the output of the RF power source 424 was shut off. Thus, the formation of the p/i buffer layer 261 was complete. The supply of $Si_2H_6$ gas and $CH_4$ gas into the i-layer chamber 418 was stopped by means of closing the valves 464, 454, 465, and 455, whereas $H_2$ was fed further for 2 min. into the i-layer deposition chamber 418. Then, valves 453 and 450 were closed, and the inside of the i-layer deposition chamber 418 as well as the inside of the gas lines was evacuated down to $1\times10^{-5}$ Torr.

Next, in order to form an RF p-layer 205 comprised of a-SiC, the substrate 490 was transferred to the p-layer deposition chamber 419 via the transfer chamber 404 by means of opening the gate valve 408 thereto, wherein both deposition chamber 419 and transfer chamber 404 had already been evacuated with a vacuum pump (not shown). The substrate 490 was placed such that the back surface of the substrate 490 came into contact with the heater 412 so that the substrate 490 was heated. The inside of the p-layer deposition chamber 417 was evacuated with the vacuum pump (not shown) down to a pressure of about $1\times10^{-5}$ Torr.

The substrate 490 was heated by setting the substrate heater 412 to 170° C. When the temperature of the substrate had become stable, $H_2$ gas, $SiH_4/H_2$ gas, $B_2H_6/H_2$ gas, and $CH_4$ gas was introduced into the deposition chamber 419 via gas inlet 469, by means of operating valves 481, 471, 470, 482, 472, 483, 473, 484, and 474. At this time, the flow rates of the $H_2$ gas, $SiH_4/H_2$ gas, $B_2H_6/H_2$ gas, and $CH_4$ gas were adjusted to 70 scm, 0.5 sccm, 8 sccm, and 0.3 sccm respectively, by means of mass flow controllers 476, 477, 478, and 479. Furthermore, the pressure inside the deposition chamber 419 was adjusted to 1.7 Torr by means of a conductance valve (not shown). The RF power supply 423 was set so that the electric power was 0.07 W/cm$^3$, RF power supply was introduced to the plasma excitation cup 421, causing a glow discharge to occur, and thus formation of the RF p-layer 205 was started upon the p/i buffer layer 261. When the thickness of the deposited RF p-layer 205 had reached 10 nm, the RF power was shut off thereby eliminating the glow discharge. Thus, the formation of the RF p-layer 205 was complete. The supply of $SiH_4/H_2$ gas, $B_2H_6/H_2$ gas, and $CH_4$ gas into the chamber 419 was stopped by means of closing the valves 472, 482, 473, 483, 474, and 484, whereas $H_2$ was fed further for 2 min. into the p-layer deposition chamber 419. Then, $H_2$ was also shut off by means of closing the valves 471, 481, and 470, and the inside of the p-layer deposition chamber 419 as well as the inside of the gas lines was evacuated down to $1\times10^{-5}$ Torr.

The gate valve 409 was then opened, and the substrate 490 was transferred to the unload chamber 405 which had already been evacuated with a vacuum pump (not shown). Then, a leak valve (not shown) was opened so that the inside of the unload chamber 405 was exposed to the ambient atmosphere.

Next, ITO was then evaporated onto the RF p-layer 205 so as to form a transparent conductive layer 112 having a thickness of 70 nm.

A mask having a comb-shaped window was placed on the transparent conductive layer 112, and metal evaporation was performed via the mask thereby forming a comb-shaped collection electrode 113 having a multi-layer structure consisting of Cr(40 nm)/Ag(1000 nm)/Cr(40 nm).

In this way, a complete solar cell according to the invention was obtained. Hereafter, the solar cell of this type will be referred to as SC-EMB-I1. Tables I1(1) and I1(2) summarize the conditions used here in the invention, regarding the plasma treatment in an ambient of hydrogen containing a small amount of Group V element, as well as the process conditions for the RF n-layer, (RF) n/i buffer layer, MW i-layer, (RF) p/i buffer layer, RF p-layer, RF n-layer, (RF) n/i buffer layer, RF i-layer, (RF) p/i buffer layer, and RF p-layer.

COMPARATIVE EXAMPLE I1

A solar cell (SC-CMP-I1) was also fabricated in the same manner as in the above-described example I1 except that the plasma treatment with hydrogen gas containing a small amount of Group V element according to the invention was not performed.

Seven samples were prepared for each type (SC-EMB-I1 and SC-CMP-I1) for the purpose of evaluation regarding the initial photoelectric efficiency (the ratio of the electric output power to the optical input power), vibration durability, optical durability, and vibration durability and optical durability under a biased condition at a high temperature and high humidity.

The measurement of the initial photoelectric conversion efficiency was performed by measuring the V-I characteristics of the samples under the illumination condition of AM 1.5 (100 mW/cm$^2$). The measurement revealed that the fill factor (F.F.) of the initial photoelectric conversion efficiencies, series resistance (Rs), and variation of properties of the SC-EMB-I1 samples as compared to the SC-CMP-I1 samples were as shown below:

| | Fill factor | Series resistance | variation of properties |
|---|---|---|---|
| (SC-EMB-I1) | 1.16 times | 0.89 times | 0.83 times |

The evaluation of the vibration durability was performed as follows: After the measurement of the initial photoelectric conversion efficiency, some solar cells were placed in a dark place kept at 26° C. and 56% relative humidity. Vibration having an amplitude of 0.1 mm and a frequency of 60 Hz was applied to the samples for 550 hr. Subsequently, the photoelectric conversion efficiencies of the samples were measured under the illumination conditions of AM 1.5 (100 mW/cm$^2$) and the reduction relative to the initial value (the ratio of the photoelectric conversion efficiency after the vibration test to the initial value) was evaluated.

The evaluation of the optical durability was performed as follows: After the measurement of the initial photoelectric conversion efficiency, some solar cells were placed in an environment of 26° C. and 56% relative humidity. Light of AM1.5 (100 mW/cm$^2$) was applied to the samples for 550 hr. Subsequently, the photoelectric conversion efficiencies of the samples were measured under the illumination conditions of AM 1.5 (100 mW/cm$^2$) and the reduction relative to the initial value (the ratio of the photoelectric conversion efficiency after the optical duration test to the initial value) was evaluated. The results of the measurement of (SC-EMB-I1) as compared to (SC-CMP-I1) concerning the deterioration of photoelectric conversion efficiencies following optical deterioration and the deterioration of photoelectric conversion efficiencies following vibration deterioration are as shown below:

| | Vibration durability | Optical durability |
|---|---|---|
| (SC-CMP-I1) | 0.81 times | 0.80 times |

The evaluation of the vibration durability under the biased condition at high temperature and high humidity was performed as follows: After the measurement of the initial photoelectric conversion efficiency, two solar cells were placed in a dark place kept at 86° C. and 93% relative humidity, and a forward bias voltage of 0.72 V was applied to the samples.

Vibration as described above was applied to one of the solar cells, whereupon vibration durability was measured, and light of AM 1.5 was applied to the other solar cell, whereupon optical durability was measured. The results of the measurement of (SC EMB I1) as compared to (SC-CMP-I1) concerning the deterioration of photoelectric conversion efficiencies following optical deterioration and the deterioration of photoelectric conversion efficiencies following vibration deterioration are as shown below:

| | Vibration durability | Optical durability |
|---|---|---|
| (SC-CMP-I1) | 0.80 times | 0.80 times |

The surfaces of the above-described samples were observed using an optical microscope to evaluate film separation. No film separation was observed in the SC-EMB-I1 samples, whereas slight film separation was observed in the SC-CMP-I1 samples.

From the above results, it can be concluded that the solar cells (SC-EMB-I1) according to the present invention are better in photoelectric conversion efficiency concerning fill factor, series resistance, uniformity, optical deterioration properties, adhesion, and overall durability than the conventional solar cells (SC-CMP-I1)

EXAMPLE I2

A tandem solar cell having a structure such as that shown in FIG. 4 was made using the deposition equipment shown in FIG. 7. The substrate 490 on which the optical reflection layer 101 and the reflection enhancing layer 102 had been formed in the same manner as with Example I1 was placed on the substrate transfer rail 413 in the load chamber 401, and the load chamber 401 was evacuated with a vacuum pump (not shown) down to a pressure of about $1\times10^{-5}$ Torr.

Then, the gate valve 406 was opened, and the substrate 490 was transferred to the deposition chamber 417 via the transfer chamber 402 wherein both deposition chamber 417 and transfer chamber 402 had already been evacuated with a vacuum pump (not shown). The substrate 490 was placed such that the back surface of the substrate 490 came into contact with the heater 410 so that the substrate 490 was heated. The inside of the deposition chamber 417 was evacuated with the vacuum pump (not shown) down to a pressure of about $1\times10^{-5}$ Torr.

After the preparation for semiconductor film deposition was completed as described above, an RF n-layer 103 comprised of μc-Si was formed. In order to form an RF n-layer comprised of μc-Si, $H_2$ gas was introduced into the deposition chamber 417 via the gas inlet 429 with the $H_2$ gas being supplied via opened valves 441, 481, and 430, and the flow rate of the $H_2$ gas was adjusted to 300 sccm by means of a mass flow controller 436. Furthermore, the pressure inside the deposition chamber 417 was adjusted to 1.1 Torr by means of a conductance valve (not shown). The substrate 490 was heated by setting the substrate heater 410 to 380° C. When the temperature of the substrate had become stable, $SiH_4$ gas and $PH_3/H_2$ (diluted to 1%) gas was introduced into the deposition chamber 417 via gas inlet 429, by means of operating valves 443, 433, 444, and 434. At this time, the flow rates of the $SiH_4$ gas, $H_2$ gas, and $PH_3/H_2$ (diluted to 1%) gas were adjusted to 1.2 sccm, 290 sccm, and 20 sccm respectively, by means of mass flow controllers 438, 436, and 439. Furthermore, the pressure inside the deposition chamber 417 was adjusted to 1.1 Torr. The RF power supply 422 was set so that the electric power was 0.06 W/cm$^3$, RF electrical power was introduced to the plasma excitation cup 420, causing a glow discharge to occur, and thus deposition of the RF n-layer 103 was started upon the substrate 490. When the thickness of the deposited RF n-layer 108 had reached 20 nm, the RF power was shut off thereby eliminating the glow discharge. Thus, the deposition of the RF n-layer 103 was complete. The supply of $SiH_4$ and $PH_3/H_2$ into the chamber 417 was stopped, whereas $H_2$ was fed further for 4 min. into the deposition chamber 417. Then, $H_2$ was also shut off, and the inside of the deposition chamber 417 as well as the inside of the gas lines was evacuated down to $1\times10^{-5}$ Torr.

Next, an n/i buffer layer 151 comprised of a-Si was formed by means of RFPCVD method. First, the inside of the transfer chamber 403 and the i-layer deposition chamber 418 was evacuated with the vacuum pump (not shown), to which the substrate 490 was transferred by means of opening the gate valve 407. The substrate 490 was heated by means of applying the back side there of to the substrate heater 411, and the inside of the i-layer deposition chamber 418 was evacuated with the vacuum pump (not shown) down to a pressure of about $1\times10^{-5}$ Torr.

In order to form the n/i buffer layer 151, the substrate 490 was heated by setting the substrate heater 411 to 360° C. When the temperature of the substrate was sufficient, $Si_2H_6$ gas and $H_2$ gas was introduced into the i-layer deposition chamber 418 via gas inlet 449, by means of slowly opening valves 464, 454, 450, 463, and 453. At this time, the flow rates of the $Si_2H_6$ gas and $H_2$ gas were adjusted to 2.5 sccm and 100 sccm respectively, by means of mass flow controllers 459 and 458. Furthermore, the pressure inside the i-layer deposition chamber 418 was adjusted to 0.7 Torr by means of a conductance valve (not shown). Next, the RF power supply 424 was set so that the electric power was 0.08 W/cm$^3$, applied to a bias rod 427, causing a glow discharge to occur, and formation of the n/i buffer layer 151 upon the RF n-layer 103 was started. When the thickness of the deposited n/i buffer layer 151 had reached 10 nm, the RF glow discharge was terminated, and the output of the RF power source 424 was shut off. Thus, the formation of the n/i buffer layer 151 was complete. The valves 464 and 454 were closed so that the supply of $Si_2H_6$ into the i-layer chamber 418 was stopped, whereas $H_2$ was fed further for 2 min. into the i-layer deposition chamber 418. Then, valves 453 and 450 were closed, and the inside of the i-layer deposition chamber 418 as well as the inside of the gas lines was evacuated down to $1\times10^{-5}$ Torr.

Next, an MW i-layer 114 comprised of a-SiGe was formed by means of MWPCVD method. In order to form the MW i-layer, the substrate 490 was heated by setting the substrate heater 411 to 380° C. When the temperature of the substrate was sufficient, $SiH_4$ gas, $GeH_4$ gas, and $H_2$ gas was introduced into the i-layer deposition chamber 418 via gas inlet 449, by means of slowly opening valves 461, 451, 450, 462, 452, 463, and 453. At this time, the flow rates of the $SiH_4$ gas, $GeH_4$ gas, and $H_2$ gas were adjusted to 43 sccm, 42 sccm, and 150 sccm respectively, by means of mass flow controllers 456, 457, and 458. Furthermore, the pressure inside the i-layer deposition chamber 418 was adjusted to 5 mTorr by means of a conductance valve (not shown). Next, the RF power supply 424 was set so that the electric power was 0.60 W/cm$^3$, and applied to a bias rod 428. Following this, the electric power of the MW power source (not shown) was set to 0.25 W/cm$^3$, MW electrical power was introduced into the i-layer deposition chamber 418 via the guided-wave tube 426 and micro-wave introduction window 425, causing a glow discharge to occur, and formation of the MW i-layer 114 upon the n/i-layer 151 was started, by means of opening a shutter 427. When the thickness of the deposited i-layer had reached 0.15 μm, the MW glow discharge was terminated, and the output of the bias power source 424 was shut off. Thus, the formation of the MW i-buffer layer 104 was complete. The supply of $SiH_4$ gas and $GeH_4$ gas into the i-layer chamber 418 was stopped by means of closing the valves 451 and 452, whereas $H_2$ was fed further for 2 min. into the i-layer deposition chamber 418. Then, valves 453 and 450 were closed, and the inside of the i-layer deposition chamber 418 as well as the inside of the gas lines was evacuated down to $1\times10^{-5}$ Torr.

Next, a p/i buffer layer 161 comprised of a-Si was formed by means of RFPCVD method. In order to form the p/i buffer layer, the substrate 490 was heated by setting the substrate heater 411 to 250° C. When the temperature of the substrate was sufficient, $Si_2H_6$ gas and $H_2$ gas was introduced into the i-layer deposition chamber 418 via gas inlet 449, by means of slowly opening valves 464, 454, 450, 463, and 453. At this time, the flow rates of the $Si_2H_6$ gas and $H_2$ gas were adjusted to 3 sccm, and 75 sccm respectively, by means of mass flow controllers 459, and 458. Furthermore, the pressure inside the i-layer deposition chamber 418 was adjusted to 0.7 Torr by means of a conductance valve (not shown). Next, the RF power supply 424 was set so that the electric power was 0.07 W/cm$^3$, and applied to a bias rod 428, causing a glow discharge to occur, and formation of the p/i buffer layer 161 upon the MW i-layer 114 was started, by means of opening a shutter 427. When the thickness of the deposited p/i-layer 161 had reached 20 nm, the RF glow discharge was terminated, and the output of the RF power source 424 was shut off. Thus, the formation of the MW i-buffer layer 161 was complete. The supply of $Si_2H_6$ gas into the i-layer chamber 418 was stopped by means of closing the valves 464 and 454, whereas $H_2$ was fed further for 2 min. into the i-layer deposition chamber 418. Then, valves 453 and 450 were closed, and the inside of the i-layer deposition chamber 418 as well as the inside of the gas lines was evacuated down to $1\times10^{-5}$ Torr.

Next, in order to form an RF p-layer 105 comprised of a-SiC, the substrate 490 was transferred to the p-layer deposition chamber 419 via the transfer chamber 404 by means of opening the gate valve 408 thereto, wherein both deposition chamber 419 and transfer chamber 404 had already been evacuated with a vacuum pump (not shown). The substrate 490 was placed such that the back surface of the substrate 490 came into contact with the heater 412 so that the substrate 490 was heated. The inside of the p-layer deposition chamber 419 was evacuated with the vacuum pump (not shown) down to a pressure of about $1\times10^{-5}$ Torr.

The substrate 490 was heated by setting the substrate heater 412 to 250° C. When the temperature of the substrate had become stable, $H_2$ gas, $SiH_4/H_2$ (diluted to 1000 ppm) gas, $BF_3/H_2$ (diluted to 1000 ppm) gas, and $CH_4$ gas was introduced into the deposition chamber 419 via gas inlet 469, by means of operating valves 481, 471, 470, 482, 472, 483, 473, 484, and 474. At this time, the flow rates of the $H_2$ gas, $SiH_4/H_2$ (diluted to 1000 ppm) gas, $BF_3/H_2$ (diluted to 1000 ppm) gas, and $CH_4$ gas were adjusted to 60 sccm, 0.4 sccm, 8 sccm, and 0.3 sccm respectively, by means of mass flow controllers 476, 477, 478, and 479. Furthermore, the pressure inside the deposition chamber 419 was adjusted to 1.7 Torr by means of a conductance valve (not shown). The RF power supply 423 was set so that the electric power was 0.07 W/cm$^3$, RF power supply was introduced to the plasma excitation cup 421, causing a glow discharge to occur, and thus formation of the RF p-layer 105 was started upon the p/i buffer layer 161. When the thickness of the deposited RF p-layer 105 had reached 10 nm, the RF power was shut off thereby eliminating the glow discharge. Thus, the formation of the RF p-layer 105 was complete. The supply of $SiH_4/H_2$ gas, $BF_3/H_2$ gas, and $CH_4$ gas into the chamber 419 was stopped by means of closing the valves 472, 482, 473, 483, 474, and 484, whereas $H_2$ was fed further for 3 min. into the p-layer deposition chamber 419. Then, $H_2$ was also shut off by means of closing the valves 471, 481, and 470, and the inside of the p-layer deposition chamber 419 as well as the inside of the gas lines was evacuated down to $1\times10^{-5}$ Torr.

Next, in order to conduct plasma treatment with hydrogen gas containing a small amount of Group V element according to the present invention, the gate valves 408 and 407 were opened, transferring was conducted to the transfer chamber 402 and deposition chamber 417 via the transfer chamber 403, wherein the transfer chamber 403 had already been evacuated with a vacuum pump (not shown). The substrate 490 was placed such that the back surface of the substrate 490 came into contact with the heater 410 so that the substrate 490 was heated. The inside of the deposition chamber 417 was evacuated with the vacuum pump (not shown)down to a pressure of about $1\times10^{-5}$ Torr.

Next, plasma treatment with hydrogen gas containing a small amount of Group V element according to the present invention was conducted according to the conditions of Table I2 (1). $PF_3/H_2$ (diluted to 1%), $SiH_4$ serving as the gas containing silicon atoms described above, and $H_2$ were introduced into the deposition chamber 417 via the gas inlet 429 wherein the $H_2$ gas was supplied via opened valves 441, 431, and 430, and its flow rate was adjusted to 1100 sccm by means of a mass flow controller 436. The Group V element-containing gas $PF_3$ gas was supplied via opened valves 443 and 433 and its flow rate was controlled by a mass flow controller 439 such that the flow rate of the $PF_3$ gas was maintained at 0.4% of the total gas flow rate of $H_2$. The flow rate of the gas containing silicone was controlled by a mass flow controller 438 such that the flow rate of the $SiH_4$ was maintained at 0.03% of the total gas flow rate of $H_2$ by means of opening valves 443 and 433. The pressure inside the deposition chamber 417 was adjusted to 0.013 Torr by means of a conductance valve (not shown). The substrate 490 was heated by the substrate heater 410 up to 250° C. When the temperature of the substrate had become stable, the VHF electrical power of the VHF power supply (not shown) was adjusted to 0.07 W/cm$^3$, VHF electrical power was introduced, so that a glow discharge occurred in the plasma excitation cup 420, and plasma processing with hydrogen gas containing a small about of Group V element according to the present invention was conducted for 4 minutes. The VHF power was then shut off, thereby eliminating the glow discharge. The supply of the $PF_3/H_2$ and $SiH_4$ gas into the deposition chamber 417 was stopped, whereas the $H_2$ gas was fed further for 4 min. into the deposition chamber 417. Then, the $H_2$ gas was also shut off, and the inside of the deposition chamber 417 as well as the inside of the gas lines was evacuated down to $1\times10^{-5}$ Torr.

In order to form an RF n-layer 203 comprised of μc-Si, $H_2$ gas was introduced into the deposition chamber 417 via the gas inlet 429 with the $H_2$ gas being supplied via opened valves 441, 431, and 430, and the flow rate of the $H_2$ gas was adjusted to 200 sccm by means of a mass flow controller 436. Furthermore, the pressure inside the deposition chamber 417 was adjusted to 1.1 Torr by means of a conductance valve (not shown). The substrate 490 was heated by setting the substrate heater 410 to 250° C. When the temperature of the substrate had become stable, $SiH_4$ gas and $PF_3/H_2$ (diluted to 1%) gas was introduced into the deposition chamber 417 via gas inlet 429, by means of operating valves 443, 433, 444, and 434. At this time, the flow rates of the $SiH_4$ gas, $H_2$ gas, and $PF_3/H_2$ (diluted to 1%) gas were adjusted to 1.5 sccm, 280 sccm, and 25 sccm respectively, by means of mass flow controllers 438, 436, and 439. Furthermore, the pressure inside the deposition chamber 417 was adjusted to 1.1 Torr. The RF power supply 422 was set so that the electric power was 0.04 $W/cm^3$, introducing RF electrical power to the plasma excitation cup 420, causing a glow discharge to occur, and thus deposition of the RF n-layer 203 was started upon the RF p-layer 105. When the thickness of the deposited RF n-layer 203 had reached 10 nm, the RF power was shut off thereby eliminating the glow discharge. Thus, the deposition of the RF n-layer 203 was complete. The supply of $SiH_4$ gas and $PF_3/H_2$ gas into the deposition chamber 417 was stopped, whereas $H_2$ was fed further for 2 min. into the deposition chamber 417. Then, $H_2$ was also shut off, and the inside of the deposition chamber 417 as well as the inside of the gas lines was evacuated down to $1\times10^{-5}$ Torr.

Next, an n/i buffer layer 251 comprised of a-SiC was formed by means of RFPCVD method. First, the inside of the transfer chamber 403 and the i-layer deposition chamber 418 was evacuated with the vacuum pump (not shown), to which the substrate 490 was transferred by means of opening the gate valve 407. The substrate 490 was heated by means of applying the back side thereof to the substrate heater 411, and the inside of the i-layer deposition chamber 418 was evacuated with the vacuum pump (not shown) down to a pressure of about $1\times10^{-5}$ Torr.

In order to form the n/i buffer layer 251, the substrate 490 was heated by setting the substrate heater 411 to 250° C. When the temperature of the substrate was sufficient, $Si_2H_6$ gas, $H_2$ gas and $CH_4$ gas was introduced into the i-layer deposition chamber 418 via gas inlet 449, by means of slowly opening valves 464, 454, 450, 463, 453, 465, and 455. At this time, the flow rates of the $Si_2H_6$ gas, $H_2$ gas and $CH_4$ gas were adjusted to 0.4 sccm, 90 sccm, and 0.2 sccm respectively, by means of mass flow controllers 459, 458, and 460.

The pressure inside the i-layer deposition chamber 418 was adjusted to 1.0 Torr by means of a conductance valve (not shown). Next, the RF power supply 424 was set so that the electric power was 0.06 $W/cm^3$, applied to a bias rod 428, causing a glow discharge to occur, and formation of the n/i buffer layer 251 upon the RF n-layer 203 was started by means of opening the shutter 427. When the thickness of the deposited n/i buffer layer 251 had reached 10 nm, the RF glow discharge was terminated, and the output of the RF power source 424 was shut off. Thus, the formation of the n/i buffer layer 251 was complete. The supply of $Si_2H_6$ gas and $CH_4$ gas into the i-layer chamber 418 was stopped, whereas $H_2$ was fed further for 2 min. into the i-layer deposition chamber 418. Then, valves 453 and 450 were closed, and the inside of the i-layer deposition chamber 418 as well as the inside of the gas lines was evacuated down to $1\times10^{-5}$ Torr.

Next, an RF i-layer 214 comprised of a-Si was formed by means of RFPCVD method. In order to form the RF i-layer 214, the substrate 490 was heated by setting the substrate heater 411 to 200° C. When the temperature of the substrate was sufficient, $Si_2H_6$ gas and $H_2$ gas was introduced into the i-layer deposition chamber 418 via gas inlet 449, by means of slowly opening valves 464, 454, 450, 463, and 453. At this time, the flow rates of the $Si_2H_6$ gas, and $H_2$ gas were adjusted to 2 sccm and 85 sccm respectively, by means of mass flow controllers 459 and 458. The pressure inside the i-layer deposition chamber 418 was adjusted to 0.6 Torr by means of a conductance valve (not shown). Next, the RF power supply 424 was set so that the electric power was 0.07 $W/cm^3$, applied to a bias rod 428, causing a glow discharge to occur, and formation of the RF i-layer 214 upon the n/i buffer layer 251 was started, by means of opening the shutter 427. When the thickness of the deposited RF i-layer 214 had reached 110 nm, the RF glow discharge was terminated, and the output of the RF power source 424 was shut off. Thus, the formation of the RF i-layer 214 was complete. The supply of $Si_2H_6$ gas into the i-layer chamber 418 was stopped by means of closing the valves 464 and 454, whereas $H_2$ was fed further for 2 min. into the i-layer deposition chamber 418. Then, valves 453 and 450 were closed, and the inside of the i-layer deposition chamber 418 as well as the inside of the gas lines was evacuated down to $1\times10^{-5}$ Torr.

Next, a p/i buffer layer 261 comprised of a-Sic was formed by means of RFPCVD method. In order to form the p/i buffer layer 261, the substrate 490 was heated by setting the substrate heater 411 to 200° C. When the temperature of the substrate was sufficient, $Si_2H_6$ gas, $H_2$ gas and $CH_4$ gas was introduced into the i-layer deposition chamber 418 via gas inlet 449, by means of slowly opening valves 464, 454, 450, 463, 453, 465, and 455. At this time, the flow rates of the $Si_2H_6$ gas, $H_2$ gas and $CH_4$ gas were adjusted to 0.4 sccm, 65 sccm, and 0.3 sccm respectively, by means of mass flow controllers 459, 458, and 460. The pressure inside the i-layer deposition chamber 418 was adjusted to 1.1 Torr by means of a conductance valve (not shown). Next, the RF power supply 424 was set so that the electric power was 0.06 $W/cm^3$, applied to a bias rod 428, causing a glow discharge to occur, and formation of the p/i buffer layer 261 upon the RF i-layer 214 was started by means of opening the shutter 427. When the thickness of the deposited p/i buffer layer 261 had reached 15 nm, the RF glow discharge was terminated, and the output of the RF power source 424 was shut off. Thus, the formation of the p/i buffer layer 261 was complete. The supply of $Si_2H_6$ gas and $CH_4$ gas into the i-layer chamber 418 was stopped by means of closing the valves 464, 454, 465, and 455, whereas $H_2$ was fed further for 2 min. into the i-layer deposition chamber 418. Then, valves 453 and 450 were closed, and the inside of the i-layer deposition chamber 418 as well as the inside of the gas lines was evacuated down to $1\times10^{-5}$ Torr.

Next, in order to form an RF p-layer 205 comprised of a-SiC, the substrate 490 was transferred to the p-layer deposition chamber 419 via the transfer chamber 404 by means of opening the gate valve 408 thereto, wherein both deposition chamber 419 and transfer chamber 404 had already been evacuated with a vacuum pump (not shown). The substrate 490 was placed such that the back surface of the substrate 490 came into contact with the heater 412 so that the substrate 490 was heated. The inside of the p-layer deposition chamber 419 was evacuated with the vacuum pump (not shown) down to a pressure of about $1\times10^{-5}$ Torr.

The substrate 490 was heated by setting the substrate heater 412 to 170° C. When the temperature of the substrate had become stable, $H_2$ gas, $SiH_4/H_2$ (diluted to 1000 ppm) gas, $BF_3/H_2$ (diluted to 1000 ppm) gas, and $CH_4$ gas was introduced into the deposition chamber 419 via gas inlet 469, by means of operating valves 481, 471, 470, 482, 472, 483, 473, 484, and 474. At this time, the flow rates of the $H_2$ gas, $SiH_4/H_2$ (diluted to 1000 ppm) gas, $BF_3/H_2$ (diluted to 1000 ppm) gas, and $CH_4$ gas were adjusted to 70 sccm, 0.4 sccm, 7 sccm, and 0.3 sccm respectively, by means of mass flow controllers 476, 477, 478, and 479. Furthermore, the pressure inside the deposition chamber 419 was adjusted to 1.7 Torr by means of a conductance valve (not shown). The RF power supply 423 was set so that the electric power was 0.07 W/cm$^3$, RF power supply was introduced to the plasma excitation cup 421, causing a glow discharge to occur, and thus formation of the RF p-layer 205 was started upon the p/i buffer layer 261. When the thickness of the deposited RF p-layer 205 had reached 10 nm, the RF power was shut off thereby eliminating the glow discharge. Thus, the formation of the RF p-layer 205 was complete. The supply of $SiH_4/H_2$ gas, $BF_3/H_2$ gas, and $CH_4$ gas into the chamber 419 was stopped by means of closing the valves 472, 482, 473, 483, 474, and 484, whereas $H_2$ was fed further for 2 min. into the p-layer deposition chamber 419. Then, $H_2$ was also shut off by means of closing the valves 471, 481, and 470, and the inside of the p-layer deposition chamber 419 as well as the inside of the gas lines was evacuated down to $1\times10^{-5}$ Torr.

The gate valve 409 was then opened, and the substrate 490 was transferred to the unload chamber 405 which had already been evacuated with a vacuum pump (not shown). Then, a leak valve (not shown) was opened so that the inside of the unload chamber 405 was exposed to the ambient atmosphere.

Next, ITO was then evaporated onto the RF p-layer 205 so as to form a transparent conductive layer 112 having a thickness of 70 nm.

A mask having a comb-shaped window was placed on the transparent conductive layer 112, and metal evaporation was performed via the mask thereby forming a comb-shaped collection electrode 113 having a multi-layer structure consisting of Cr(40 nm)/Ag(1000 nm)/Cr(40 nm).

In this way, a complete solar cell according to the invention was obtained. Hereafter, the solar cell of this type will be referred to as SC-EMB-I2. Tables I2(1) and I2(2) summarize the conditions used here in the invention, regarding the plasma treatment in an ambient of hydrogen containing a small amount of Group V element, as well as the process conditions for the RF n-layer, n/i buffer layer, MW i-layer, p/i buffer layer, RF p-layer, RF n-layer, n/i buffer layer, RF i-layer, p/i buffer layer, and RF p-layer.

COMPARATIVE EXAMPLE I2

A solar cell (SC-CMP-I2) was also fabricated in the same manner as in the above-described Example I2 except that the plasma treatment with hydrogen gas containing a small amount of Group V element according to the invention was not performed.

Six samples were prepared for each type (SC-EMB-I2 and SC-CMP-I2) for the purpose of evaluation regarding the initial photoelectric efficiency (the ratio of the electric output power to the optical input power), vibration durability, optical durability, and vibration durability and optical durability under a biased condition at a high temperature and high humidity.

The measurement of the initial photoelectric conversion efficiency was performed by measuring the V-I characteristics of the samples under the illumination condition of AM 1.5 (100 mW/cm$^2$). The measurement revealed that the fill factor (F.F.) of the initial photoelectric conversion efficiencies, series resistance (Rs), and variation of properties of the SC-EMB-I2 samples as compared to the SC-CMP-I2 samples were as shown below:

| | Fill factor | Series resistance | variation of properties |
|---|---|---|---|
| (SC-EMB-I2) | 1.18 times | 0.88 times | 0.81 times |

The evaluation of the vibration durability was performed as follows: After the measurement of the initial photoelectric conversion efficiency, some solar cells were placed in a dark place kept at 28° C. and 56% relative humidity. Vibration having an amplitude of 0.1 mm and a frequency of 60 Hz was applied to the samples for 550 hr. Subsequently, the photoelectric conversion efficiencies of the samples were measured under the illumination conditions of AM 1.5 (100 mW/cm$^2$) and the reduction relative to the initial value (the ratio of the photoelectric conversion efficiency after the vibration test to the initial value) was evaluated.

The evaluation of the optical durability was performed as follows: After the measurement of the initial photoelectric conversion efficiency, some solar cells were placed in an environment of 28° C. and 56% relative humidity. Light of AM 1.5 (100 mW/cm$^2$) was applied to the samples for 550 hr. Subsequently, the photoelectric conversion efficiencies of the samples were measured under the illumination conditions of AM 1.5 (100 mW/cm$^2$) and the reduction relative to the initial value (the ratio of the photoelectric conversion efficiency after the optical deterioration test to the initial value) was evaluated. The results of the measurement of (SC-EMB-I2) as compared to (SC-CMP-I2) concerning the deterioration of photoelectric conversion efficiencies following optical deterioration and the deterioration of photoelectric conversion efficiencies following vibration deterioration are as shown below:

| | Vibration durability | Optical durability |
|---|---|---|
| (SC-CMP-I2) | 0.81 times | 0.80 times |

The evaluation of the vibration durability under the biased condition at high temperature and high humidity was performed as follows: After the measurement of the initial photoelectric conversion efficiency, two solar cells were placed in a dark place kept at 82° C. and 91% relative humidity, and a forward bias voltage of 0.71 V was applied to the samples.

Vibration as described above was applied to one of the solar cells, whereupon vibration durability was measured, and light of AM 1.5 was applied to the other solar cell, whereupon optical durability was measured. The results of the measurement of (SC-EMB-I2) as compared to (SC-CMP-I2) concerning the deterioration of photoelectric conversion efficiencies following optical deterioration and the deterioration of photoelectric conversion efficiencies following vibration deterioration are as shown below:

| | Vibration durability | Optical durability |
|---|---|---|
| (SC-CMP-I2) | 0.80 times | 0.79 times |

The surfaces of the above-described samples were observed using an optical microscope to evaluate film separation. No film separation was observed in the SC-EMB-I2 samples, whereas slight film separation was observed in the SC-CMP-I2 samples.

From the above results, it can be concluded that the solar cells (SC-EMB-I2) according to the present invention are better in photoelectric conversion efficiency concerning fill factor, series resistance, uniformity, optical deterioration properties, adhesion, and overall durability than the conventional solar cells (SC-CMP-I2).

EXAMPLE I3

A triple solar cell having a structure such as that shown in FIG. 6 was made using the deposition equipment shown in FIG. 7. The substrate 490 on which the optical reflection layer 101 and the reflection enhancing layer 102 had been formed in the same manner as with Example I1 was placed on the substrate transfer rail 413 in the load chamber 401, and the load chamber 401 was evacuated with a vacuum pump (not shown) down to a pressure of about $1\times10^{-5}$ Torr.

Then, the gate valve 406 was opened, and the substrate 490 was transferred to the deposition chamber 417 via the transfer chamber 402 wherein both deposition chamber 417 and transfer chamber 402 had already been evacuated with a vacuum pump (not shown). The substrate 490 was placed such that the back surface of the substrate 490 came into contact with the heater 410 so that the substrate 490 was heated. The inside of the deposition chamber 417 was evacuated with the vacuum pump (not shown) down to a pressure of about $1\times10^{-5}$ Torr.

After the preparation for semiconductor film deposition was completed as described above, an RF n-layer 103 comprised of μc-Si, was formed in the same manner as with Example I1.

Next, the inside of the transfer chamber 403 and the deposition chamber 418 was evacuated with the vacuum pump (not shown), to which the substrate 490 was transferred by means of opening the gate valve 407. The substrate 490 was heated by means of applying the back side there of to the substrate heater 411, and the inside of the i-layer deposition chamber 418 was evacuated with the vacuum pump (not shown) down to a pressure of about $1\times10^{-5}$ Torr.

Next, an n/i buffer layer 151 comprised of a-Si, an MW i-layer 114 comprised of a-SiGe, a p/i buffer layer 161 comprised of a-Si, and an RF p-layer 105 comprised of a-SiC were sequentially formed by means of RFPCVD method and MWPCVD method, in the same manner as with Example I1.

Next, in order to conduct plasma treatment with hydrogen gas containing a small amount of Group V element according to the present invention, the substrate 490 was transferred to the deposition chamber 418, in the same manner as with Example I1.

Next, plasma treatment with hydrogen gas containing a small amount of Group V element according to the present invention was conducted according to the conditions of Table I3 (1). In order to conduct plasma treatment with hydrogen gas containing a small amount of Group V element according to the present invention, $PF_3/H_2$ (diluted to 10%) gas, $SiCl_2H_2/He$ (diluted to 1%) gas serving as the gas containing silicon atoms, and $H_2$ gas were introduced into the deposition chamber 418 via the gas inlet 429 wherein the $H_2$ gas was supplied via opened valves 463, 453, and 450, and its flow rate was adjusted to 1200 sccm by means of a mass flow controller 458. The Group V element-containing $PH_3$ gas was supplied via opened valves 468 and 466 and its flow rate was controlled by a mass flow controller 467 such that the flow rate of the $PH_3$ gas was maintained at 2.0% of the total gas flow rate of $H_2$. The flow rate of the gas containing silicone was controlled by a mass flow controller 438 such that the flow rate of the $SiCl_2H_2/He$ (diluted to 1%) gas was maintained at 0.02% of the total gas flow rate of $H_2$ by means of opening valves (not shown) and adjusted by means of a mass flow controller (not shown). The pressure inside the deposition chamber 418 was adjusted to 0.008 Torr by means of a conductance valve (not shown). The substrate 490 was heated by the substrate heater 411 up to 300° C. When the temperature of the substrate had become stable, the electrical power of the MW power supply (not shown) was adjusted to 0.12 W/cm$^3$, MW electrical power was introduced into the i-layer deposition chamber 418 via the guided-wave tube 426 and microwave introduction window 425, causing a glow discharge to occur, and plasma processing with hydrogen gas containing a small about of Group V element according to the present invention was conducted for 4 minutes, by means of opening a shutter 427. Subsequently, MW power was then shut off, thereby eliminating the glow discharge. The supply of the $PH_3/H_2$ and $SiCl_2H_4$ gas into the deposition chamber 418 was stopped, whereas the $H_2$ gas was fed further for 4 min. into the deposition chamber 418. Then, the $H_2$ gas was also shut off, and the inside of the deposition chamber 418 as well as the inside of the gas lines was evacuated down to $1\times10^{-5}$ Torr.

Next, an RF n-layer 203 comprised of μc-Si, an n/i buffer layer 252 comprised of a-Si, an MW i-layer 214 comprised of a-SiGe, a p/i buffer layer 262 comprised of a-Si, and an RF p-layer 205 comprised of a-SiC were sequentially formed by means of RFPCVD method and MWPCVD method, in the same manner as with Example I1.

Next, plasma treatment with hydrogen gas containing a small amount of Group V element according to the present invention was conducted according to the conditions of Table I3(2). $PH_3/H_2$ (diluted to 10%) gas as the gas containing the Group V element, $SiH_4/H_2$ gas serving as the gas containing silicon atoms, and $H_2$ gas were introduced into the deposition chamber 417 via the gas inlet 429 wherein the $H_2$ gas was supplied via opened valves 441, 431, and 430, and its flow rate was adjusted to 1300 sccm by means of a mass flow controller 436. The Group V element-containing $PH_3$ gas was supplied via opened valves 444 and 434 and its flow rate was controlled by a mass flow controller 439 such that the flow rate of the $PH_3$ gas was brought from 2.5% of the total gas flow rate of $H_2$ to 0.2% thereof over a period of time. The flow rate of the gas containing silicone was controlled by a mass flow controller 438 such that the flow rate of the $SiH_4$ gas was maintained at 0.04% of the total gas flow rate of $H_2$ by means of opening valves 443 and 433 and adjusted by means of a mass flow controller 439. The pressure inside the deposition chamber 417 was adjusted to 0.8 Torr by means of a conductance valve (not shown). The substrate 490 was heated by the substrate heater 410 up to 250° C. When the temperature of the substrate had become stable, the electrical power of the RF power supply (not shown) was adjusted to 0.05 W/cm$^3$, RF electrical power was introduced, causing a glow discharge to occur in the plasma excitation cup 420, and plasma processing with hydrogen gas containing a small about of Group V element according to the present invention was conducted for 3 minutes. Subsequently, RF power was then shut off, thereby eliminating the glow discharge. The supply of the $PH_3/H_2$ and $SiH_4$ gas into the deposition chamber 417 was stopped, whereas the $H_2$ gas was fed further for 3 min. into the deposition chamber 417. Then, the $H_2$ gas was also shut off, and the inside of the deposition chamber 417 as well as the inside of the gas lines was evacuated down to $1\times10^{-5}$ Torr.

Next, an RF n-layer 303 comprised of μc-Si, an n/i buffer layer 351 comprised of a-SiC, an RF i-layer 314 comprised of a-Si, a p/i buffer layer 361 comprised of a-SiC, and an RF p-layer 305 comprised of a-SiC were sequentially formed by means of RFPCVD method, in the same manner as with Example I1.

Next, ITO was then evaporated onto the RF p-layer 305 so as to form a transparent conductive layer 112 having a thickness of 70 nm.

A mask having a comb-shaped window was placed on the transparent conductive layer 112, and metal evaporation was performed via the mask thereby forming a comb-shaped collection electrode 113 having a multi-layer structure consisting of Cr(40 nm)/Ag(1000 nm)/Cr(40 nm).

In this way, a complete solar cell according to the invention was obtained. Hereafter, the solar cell of this type will be referred to as SC-EMB-I3. Tables I3(1) and I3(2) summarize the conditions used here in the invention, regarding the plasma treatment in an ambient of hydrogen containing a small amount of Group V element, as well as the process conditions for the RF n-layer, n/i buffer layer, MW i-layer, p/i buffer layer, RF p-layer, RF n-layer, n/i buffer layer, MW i-layer, p/i buffer layer, RF p-layer, RF n-layer, n/i buffer layer, RF i-layer, p/i buffer layer, and RF p-layer.

COMPARATIVE EXAMPLE I3

A solar cell (SC-CMP-I3) was also fabricated in the same manner as in the above-described Example 3 except that the plasma treatment with hydrogen gas containing a small amount of Group V element according to the invention was not performed.

Six samples were prepared for each type (SC-EMB-I3 and SC-CMP-I3) for the purpose of evaluation regarding the initial photoelectric efficiency (the ratio of the electric output power to the optical input power), vibration durability, optical durability, vibration durability and optical durability under a biased condition at a high temperature and high humidity, and inverse bias voltage application properties.

The measurement of the initial photoelectric conversion efficiency was performed by measuring the V-I characteristics of the samples under the illumination condition of AM 1.5 (100 mW/cm$^2$). The measurement revealed that the fill factor (F.F.) of the initial photoelectric conversion efficiencies, series resistance (Rs), and variation of properties of the SC-EMB-I3 samples as compared to the SC-CMP-I3 samples were as shown below:

| | Fill factor | Series resistance | variation of properties |
|---|---|---|---|
| (SC-EMB-I3) | 1.19 times | 0.88 times | 0.80 times |

The evaluation of the vibration durability was performed as follows: After the measurement of the initial photoelectric conversion efficiency, some solar cells were placed in a dark place kept at 27° C. and 56% relative humidity. Vibration having an amplitude of 0.1 mm and a frequency of 60 Hz was applied to the samples for 550 hr. Subsequently, the photoelectric conversion efficiencies of the samples were measured under the illumination conditions of AM 1.5 (100 mW/cm$^2$) and the reduction relative to the initial value (the ratio of the photoelectric conversion efficiency after the vibration test to the initial value) was evaluated.

The evaluation of the optical durability was performed as follows: After the measurement of the initial photoelectric conversion efficiency, some solar cells were placed in an environment of 27° C. and 56% relative humidity. Light of AM 1.5 (100 mW/cm$^2$) was applied to the samples for 550 hr. Subsequently, the photoelectric conversion efficiencies of the samples were measured under the illumination conditions of AM 1.5 (100 mW/cm$^2$) and the reduction relative to the initial value (the ratio of the photoelectric conversion efficiency after the optical deterioration test to the initial value) was evaluated. The results of the measurement of (SC-EMB-I3) as compared to (SC-CMP-I3) concerning the deterioration of photoelectric conversion efficiencies following optical deterioration and the deterioration of photoelectric conversion efficiencies following vibration deterioration are as shown below:

| | Vibration durability | Optical durability |
|---|---|---|
| (SC-CMP-I3) | 0.80 times | 0.80 times |

The evaluation of the vibration durability under the biased condition at high temperature and high humidity was performed as follows: After the measurement of the initial photoelectric conversion efficiency, two solar cells were placed in a dark place kept at 80° C. and 92% relative humidity, and a forward bias voltage of 0.71 V was applied to the samples.

Vibration as described above was applied to one of the solar cells, whereupon vibration durability was measured, and light of AM 1.5 was applied to the other solar cell, whereupon optical durability was measured.

The results of the measurement of (SC-EMB-I3) as compared to (SC-CMP-I3) concerning the deterioration of photoelectric conversion efficiencies following optical deterioration and the deterioration of photoelectric conversion efficiencies following vibration deterioration are as shown below:

| | Vibration durability | Optical durability |
|---|---|---|
| (SC-CMP-I3) | 0.80 times | 0.80 times |

The measurement of inverse bias voltage application properties was performed as follows: After the measurement of the initial photoelectric conversion efficiency, a solar cell was placed in a dark place kept at 81° C. and 54% relative humidity, and an inverse bias voltage of 5.0 V was applied to the sample for 100 hours. Subsequently, the photoelectric conversion efficiencies of the samples were measured under the illumination conditions of AM 1.5 (100 mW/cm$^2$) and the reduction relative to the initial value (the ratio of the photoelectric conversion efficiency after the inverse bias voltage application test to the initial value) was evaluated.

The results of the measurement of (SC-EMB-I3) as compared to (SC-CMP-I3) concerning the deterioration of photoelectric conversion efficiencies following inverse bias voltage application are as shown below:

| | |
|---|---|
| (SC-CMP-I3) | 0.84 times |

The surfaces of the above-described samples were observed using an optical microscope to evaluate film separation. No film separation was observed in the SC-EMB-I3 samples, whereas slight film separation was observed in the SC-CMP-I3 samples.

From the above results, it can be concluded that the solar cells (SC-EMB-I3) according to the present invention are better in photoelectric conversion efficiency concerning fill factor, series resistance, uniformity, optical deterioration properties, adhesion, overall durability, and inverse bias voltage application properties than the conventional solar cells (SC-CMP-I3).

EXAMPLE I4

A triple solar cell having a structure such as that shown in FIG. 6 was made in the same manner as with Example I3 using the deposition equipment shown in FIG. 7 in the same manner as with Example I3, by means of twice conducting plasma treatment with hydrogen gas containing a small amount of Group V element according to the present invention and according to the conditions described in Table I4 (1). The conditions of plasma treatment with hydrogen gas containing a small amount of Group V element are described in Table I4(1), and the fabrication conditions for the triple solar cell are described in Table I4 (2).

The fabricated triple solar cell was evaluated in the same manner as with Example IS. The results thereof are described in Table I4 (3).

It has been shown that the flow amount of hydrogen for plasma treatment with hydrogen gas containing a small amount of Group V element according to the present invention is optimal when the flow amount is in the range of 1–2000 sccm, regarding photoelectric conversion efficiency concerning fill factor, uniformity, optical deterioration properties, series resistance properties, overall durability, and inverse bias voltage application properties.

EXAMPLE I5

A triple solar cell having a structure such as that shown in FIG. 6 was made in the same manner as with Example I3 using the deposition equipment shown in FIG. 7 in the same manner as with Example I3, by means of twice conducting plasma treatment with hydrogen gas containing a small amount of Group V element according to the present invention and according to the conditions described in Table I5 (1). The conditions of plasma treatment with hydrogen gas containing a small amount of Group V element are described in Table I5 (1), and the fabrication conditions for the triple solar cell are described in Table I5 (2).

The fabricated triple solar call was evaluated in the same manner as with Example I3. The results thereof are described in Table I5 (5).

It has been shown that the flow amount of hydrogen for plasma treatment with hydrogen gas containing a small amount of Group V element according to the present invention is optimal when the flow amount is in the range of 1–2000 sccm, regarding photoelectric conversion efficiency concerning fill factor, uniformity, optical deterioration properties, series resistance properties, overall durability, and inverse bias voltage application properties, even when the power supplied for the plasma treatment with hydrogen gas containing a small amount of Group V element according to the present invention is changed from RF power supply as in Example I4 to VHF power supply.

EXAMPLE I6

A triple solar cell having a structure such as that shown in FIG. 6 was made in the same manner as with Example I3 using the deposition equipment shown in FIG. 7 in the same manner as with Example I3, by means of twice conducting plasma treatment with hydrogen gas containing a small amount of Group V element according to the present invention and according to the conditions described in Table I6 (1). The conditions of plasma treatment with hydrogen gas containing a small amount of Group V element are described in Table I6(1), and the fabrication conditions for the triple solar cell are described in Table I6 (2).

The fabricated triple solar cell was evaluated in the same manner as with Example I3. The results thereof are described in Table I6 (3).

It has been shown that the amount of gas containing Group V element added to the hydrogen for plasma treatment with hydrogen gas containing a small amount of Group V element according to the present invention is optimal when the added amount is in the range of 0.05–3%, regarding photoelectric conversion efficiency concerning fill factor, uniformity, optical deterioration properties, series resistance properties, overall durability, and inverse bias voltage application properties.

EXAMPLE I7

A triple solar cell having a structure such as that shown in FIG. 6 was made in the same manner as with Example I3 using the deposition equipment shown in FIG. 7 in the same manner as with Example I3, by means of twice conducting plasma treatment with hydrogen gas containing a small amount of Group V element according to the present invention and according to the conditions described in Table I7 (1). The conditions of plasma treatment with hydrogen gas containing a small amount of Group V element are described in Table I7 (1), and the fabrication conditions for the triple solar cell are described in Table I7 (2).

The fabricated triple solar cell was evaluated in the same manner as with Example I3. The results thereof are described in Table I7 (3).

It has been shown that the amount of gas containing Group V element added to the hydrogen for plasma treatment with hydrogen gas containing a small amount of Group V element according to the present invention is optimal when the added amount is in the range of 0.05–3%, regarding photoelectric conversion efficiency concerning fill factor, uniformity, optical deterioration properties, series resistance properties, overall durability, and inverse bias voltage application properties, even when the power supplied for the plasma treatment with hydrogen gas containing a small amount of Group V element according to the present invention is changed from RF power supply as in Example I6 to VHF power supply.

EXAMPLE I8

A triple solar cell having a structure such as that shown in FIG. 6 was made in the same manner as with Example I3 using the deposition equipment shown in FIG. 7 in the same manner as with Example I3, by means of twice conducting plasma treatment with hydrogen gas containing a small amount of Group V element according to the present invention and according to the conditions described in Table I8 (1). The conditions of plasma treatment with hydrogen gas containing a small amount of Group V element are described in Table I8 (1), and the fabrication conditions for the triple solar cell are described in Table I8 (2).

The fabricated triple solar cell was evaluated in the same manner as with Example I3. The results thereof are described in Table I8 (3).

It has been shown that the amount of gas containing Group V element added to the hydrogen for plasma treatment with hydrogen gas containing a small amount of Group V element according to the present invention is optimal when the added amount is in the range of 0.05–3%, regarding photoelectric conversion efficiency concerning fill factor, uniformity, optical deterioration properties, series resistance properties, overall durability, and inverse bias voltage application properties, even when the power supplied for the plasma treatment with hydrogen gas containing a small amount of Group V element according to the present invention is changed from RF power supply as in Example I6 to MW power supply.

EXAMPLE I9

A triple solar cell having a structure such as that shown in FIG. 6 was made in the same manner as with Example I3 using the deposition equipment shown in FIG. 7 in the same manner as with Example I3, by means of twice conducting plasma treatment with hydrogen gas containing a small amount of Group V element according to the present invention and according to the conditions described in Table I9 (1). The conditions of plasma treatment with hydrogen gas containing a small amount of Group V element are described in Table I9 (1), and the fabrication conditions for the triple solar cell are described in Table I9 (2).

The fabricated triple solar cell was evaluated in the same manner as with Example I3. The results thereof are described in Table I9 (3).

It has been shown that the amount of gas containing silicone atoms added to the hydrogen for plasma treatment with hydrogen gas containing a small amount of Group V element according to the present invention is optimal when the added amount is in the range of 0.001–0.1%, regarding photoelectric conversion efficiency concerning fill factor, uniformity, optical deterioration properties, series resistance properties, overall durability, and inverse bias voltage application properties.

EXAMPLE I10

A triple solar cell having a structure such as that shown in FIG. 6 was made in the same manner as with Example I3 using the deposition equipment shown in FIG. 7 in the same manner as with Example I3, by means of twice conducting plasma treatment with hydrogen gas containing a small amount of Group V element according to the present invention and according to the conditions described in Table I10 (1). The conditions of plasma treatment with hydrogen gas containing a small amount of Group V element are described in Table I10 (1), and the fabrication conditions for the triple solar cell are described in Table I10 (2).

The fabricated triple solar cell was evaluated in the same manner as with Example I3. The results thereof are described in Table I10 (3).

It has been shown that the amount of gas containing silicone atoms added to the hydrogen for plasma treatment with hydrogen gas containing a small amount of Group V element according to the present invention is optimal when the added amount is in the range of 0.001–0.1%, regarding photoelectric conversion efficiency concerning fill factor, uniformity, optical deterioration properties, series resistance properties, overall durability, and inverse bias voltage application properties, even when the power supplied for the plasma treatment with hydrogen gas containing a small amount of Group V element according to the present invention is changed from RF power supply as in Example I9 to VHF power supply.

EXAMPLE I11

A triple solar cell having a structure such as that shown in FIG. 6 was made in the same manner as with Example I3 using the deposition equipment shown in FIG. 7 in the same manner as with Example I3, by means of twice conducting plasma treatment with hydrogen gas containing a small amount of Group V element according to the present invention and according to the conditions described in Table I11 (1). The conditions of plasma treatment with hydrogen gas containing a small amount of Group V element are described in Table I11 (1), and the fabrication conditions for the triple solar cell are described in Table I11 (2).

The fabricated triple solar cell was evaluated in the same manner as with Example I3. The results thereof are described in Table I11 (3).

It has been shown that the amount of gas containing silicone atoms added to the hydrogen for plasma treatment with hydrogen gas containing a small amount of Group V element according to the present invention is optimal when the added amount is in the range of 0.001–0.1 %, regarding photoelectric conversion efficiency concerning fill factor, uniformity, optical deterioration properties, series resistance properties, overall durability, and inverse bias voltage application properties, even when the power supplied for the plasma treatment with hydrogen gas containing a small amount of Group V element according to the present invention is changed from RF power supply as in Example I9 to MW power supply.

EXAMPLE I12

A triple solar cell having a structure such as that shown in FIG. 6 was made in the same manner as with Example I3 using the deposition equipment shown in FIG. 7 in the same manner as with Example I3, by means of twice conducting plasma treatment with hydrogen gas containing a small amount of Group V element according to the present invention and according to the conditions described in Table I12 (1). The conditions of plasma treatment with hydrogen gas containing a small amount of Group V element are described in Table I12 (1), and the fabrication conditions for the triple solar cell are described in Table I12 (2).

The fabricated triple solar cell was evaluated in the same manner as with Example I3. The results thereof are described in Table I12(3).

It has been shown that the pressure applied for plasma treatment with hydrogen gas containing a small amount of Group V element according to the present invention is optimal when the pressure is in the range of 0.05 Torr to 10 Torr, regarding photoelectric conversion efficiency concerning fill factor, uniformity, optical deterioration properties, series resistance properties, overall durability, and inverse bias voltage application properties, in the event that RF power source is used for the electrical power charge.

EXAMPLE I13

A triple solar cell having a structure such as that shown in FIG. 6 was made in the same manner as with Example I3 using the deposition equipment shown in FIG. 7 in the same manner as with Example I3, by means of twice conducting plasma treatment with hydrogen gas containing a small amount of Group V element according to the present invention and according to the conditions described in Table I13 (1). The conditions of plasma treatment with hydrogen gas containing a small amount of Group V element are described in Table I13 (1), and the fabrication conditions for the triple solar cell are described in Table I13 (2).

The fabricated triple solar cell was evaluated in the same manner as with Example I3. The results thereof are described in Table I13 (3).

It has been shown that the pressure applied for plasma treatment with hydrogen gas containing a small amount of Group V element according to the present invention is optimal when the pressure is in the range of 0.0001 Torr to 1 Torr, regarding photoelectric conversion efficiency concerning fill factor, uniformity, optical deterioration properties, series resistance properties, overall durability, and inverse bias voltage application properties, in the event that VHF power source is used for the electrical power charge.

EXAMPLE I14

A triple solar cell having a structure such as that shown in FIG. 6 was made in the same manner as with Example I3 using the deposition equipment shown in FIG. 7 in the same manner as with Example I3, by means of twice conducting plasma treatment with hydrogen gas containing a small amount of Group V element according to the present invention and according to the conditions described in Table I14 (1). The conditions of plasma treatment with hydrogen gas containing a small amount of Group V element are described in Table I14 (1), and the fabrication conditions for the triple solar cell are described in Table I14 (2).

The fabricated triple solar cell was evaluated in the same manner as with Example I3. The results thereof are described in Table I14 (3).

It has been shown that the pressure applied for plasma treatment with hydrogen gas containing a small amount of Group V element according to the present invention is optimal when the pressure is in the range of 0.0001 Torr to 0.01 Torr, regarding photoelectric conversion efficiency concerning fill factor, uniformity, optical deterioration properties, series resistance properties, overall durability, and inverse bias voltage application properties, in the event that MW power source is used for the electrical power charge.

EXAMPLE I15

A triple solar cell having a structure such as that shown in FIG. 6 was made in the same manner as with Example I3 using the deposition equipment shown in FIG. 7 in the same manner as with Example I3, by means of twice conducting plasma treatment with hydrogen gas containing a small amount of Group V element according to the present invention and according to the conditions described in Table I15 (1). The conditions of plasma treatment with hydrogen gas containing a small amount of Group V element are described in Table I15 (1), and the fabrication conditions for the triple solar cell are described in Table I15 (2).

The fabricated triple solar cell was evaluated in the same manner as with Example I3. The results thereof are described in Table I15 (3).

It has been shown that the charge power density (electrical power) for plasma treatment with hydrogen gas containing a small amount of Group V element according to the present invention is optimal when in the range of 0.01 W/cm$^3$ to 1.0 W/cm$^3$, regarding photoelectric conversion efficiency concerning fill factor, uniformity, optical deterioration properties, series resistance properties, overall durability, and inverse bias voltage application properties, in the event that RF power source is used for the electrical power charge.

EXAMPLE I16

A triple solar cell having a structure such as that shown in FIG. 6 was made in the same manner as with Example I3 using the deposition equipment shown in FIG. 7 in the same manner as with Example I3, by means of twice conducting plasma treatment with hydrogen gas containing a small amount of Group V element according to the present invention and according to the conditions described in Table I16 (1). The conditions of plasma treatment with hydrogen gas containing a small amount of Group V element are described in Table I16 (1), and the fabrication conditions for the triple solar cell are described in Table I16 (2).

The fabricated triple solar cell was evaluated in the same manner as with Example I3. The results thereof are described in Table I16 (3).

It has been shown that the charge power density (electrical power) for plasma treatment with hydrogen gas containing a small amount of Group V element according to the present invention is optimal when in the range of 0.01 W/cm$^3$ to 1.0 W/cm$^3$, regarding photoelectric conversion efficiency concerning fill factor, uniformity, optical deterioration properties, series resistance properties, overall durability, and inverse bias voltage application properties, in the event that VHF power source is used for the electrical power charge.

EXAMPLE I17

A triple solar cell having a structure such as that shown in FIG. 6 was made in the same manner as with Example I3 using the deposition equipment shown in FIG. 7 in the same manner as with Example I3, by means of twice conducting plasma treatment with hydrogen gas containing a small amount of Group V element according to the present invention and according to the conditions described in Table I17 (1). The conditions of plasma treatment with hydrogen gas containing a small amount of Group V element are described in Table I17 (1), and the fabrication conditions for the triple solar cell are described in Table I17 (2).

The fabricated triple solar cell was evaluated in the same manner as with Example I3. The results thereof are described in Table I17 (3).

It has been shown that the charge power density (electrical power) for plasma treatment with hydrogen gas containing a small amount of Group V element according to the present invention is optimal when in the range of 0.1 W/cm$^3$ to 10 W/cm$^3$, regarding photoelectric conversion efficiency concerning fill factor, uniformity, optical deterioration properties, series resistance properties, overall durability, and inverse bias voltage application properties, in the event that MW power source is used for the electrical power charge.

EXAMPLE I18

A triple solar cell having a structure such as that shown in FIG. 6 was made in the same manner as with Example I3 using the deposition equipment shown in FIG. 7 in the same manner as with Example I3, by means of twice conducting plasma treatment with hydrogen gas containing a small amount of Group V element according to the present invention and according to the conditions described in Table I18 (1). The conditions of plasma treatment with hydrogen gas containing a small amount of Group V element are described in Table I18 (1), and the fabrication conditions for the triple solar cell are described in Table I18 (2).

The fabricated triple solar cell was evaluated in the same manner as with Example I3. The results thereof are described in Table I18 (3).

It has been shown that the substrate temperature for plasma treatment with hydrogen gas containing a small amount of Group V element according to the present invention is optimal when the temperature is in the range of 100° C. to 400° C., regarding photoelectric conversion efficiency concerning fill factor, uniformity, optical deterioration properties, series resistance properties, overall durability, and inverse bias voltage application properties, in the event that RF power source is used for the electrical power charge.

EXAMPLE I19

A triple solar cell having a structure such as that shown in FIG. 6 was made in the same manner as with Example I3 using the deposition equipment shown in FIG. 7 in the same manner as with Example I3, by means of twice conducting plasma treatment with hydrogen gas containing a small amount of Group V element according to the present invention and according to the conditions described in Table I19 (1). The conditions of plasma treatment with hydrogen gas containing a small amount of Group V element are described in Table I19 (1), and the fabrication conditions for the triple solar cell are described in Table I19 (2).

The fabricated triple solar cell was evaluated in the same manner as with Example I3. The results thereof are described in Table I19 (3).

It has been shown that the substrate temperature for plasma treatment with hydrogen gas containing a small amount of Group V element according to the present invention is optimal when the temperature is in the range of 50° C. to 300° C., regarding photoelectric conversion efficiency concerning fill factor, uniformity, optical deterioration properties, series resistance properties, overall durability, and inverse bias voltage application properties, in the event that VHF power source is used for the electrical power charge.

EXAMPLE I20

A triple solar cell having a structure such as that shown in FIG. 6 was made in the same manner as with Example I3 using the deposition equipment shown in FIG. 7 in the same manner as with Example I3, by means of twice conducting plasma treatment with hydrogen gas containing a small amount of Group V element according to the present invention and according to the conditions described in Table I20 (1). The conditions of plasma treatment with hydrogen gas containing a small amount of Group V element are described in Table I20 (1), and the fabrication conditions for the triple solar cell are described in Table I20 (2).

The fabricated triple solar cell was evaluated in the same manner as with Example I3. The results thereof are described in Table I20 (3).

It has been shown that the substrate temperature for plasma treatment with hydrogen gas containing a small amount of Group V element according to the present invention is optimal when the temperature is in the range of 50° C. to 300° C., regarding photoelectric conversion efficiency concerning fill factor, uniformity, optical deterioration properties, series resistance properties, overall durability, and inverse bias voltage application properties, in the event that MW power source is used for the electrical power charge.

EXAMPLE I21

A triple solar cell having a structure such as that shown in FIG. 6 was made using the deposition equipment shown in FIG. 7.

The substrate 490 on which the optical reflection layer 101 and the reflection enhancing layer 102 had been formed in the same manner as with Example I1 was placed on the substrate transfer rail 413 in the load chamber 401, and the load chamber 401 was evacuated with a vacuum pump (not shown) down to a pressure of about $1\times10^{-5}$ Torr.

Then, the gate valve 406 was opened, and the substrate 490 was transferred to the deposition chamber 417 via the transfer chamber 402 wherein both deposition chamber 417 and transfer chamber 402 had already been evacuated with a vacuum pump (not shown). The substrate 490 was placed such that the back surface of the substrate 490 came into contact with the heater 410 so that the substrate 490 was heated. The inside of the deposition chamber 417 was evacuated with the vacuum pump (not shown) down to a pressure of about $1\times10^{-5}$ Torr.

Next, plasma treatment with hydrogen gas containing a small amount of silage was conducted according to the conditions described in Table I21 (1). In order to conduct plasma treatment with hydrogen gas containing a small amount of silane, $SiH_4/H_2$ (diluted to 1000 ppm) gas serving as the gas containing silicon atoms, and $H_2$ gas were introduced into the deposition chamber 417 via the gas inlet 429 wherein the $H_2$ gas was supplied via opened valves 441, 431, and 430, and its flow rate was adjusted to 1100 sccm by means of a mass flow controller 437. The gas containing silicone atoms was supplied via opened valves 442 and 432 and its flow rate was controlled by a mass flow controller 437 such that the flow rate of the $SiH_4$ gas was maintained at 0.03% of the total gas flow rate of $H_2$. The pressure inside the deposition chamber 417 was adjusted to 0.8 Torr by means of a conductance valve (not shown). The substrate 490 was heated by the substrate heater 410 up to 360° C. When the temperature of the substrate had become stable, the electrical power of the RF power supply 422 was adjusted to 0.5 W/cm$^3$, RF electrical power was introduced, causing a glow discharge to occur within the plasma excitation cup 420, and plasma processing with hydrogen gas containing a small about of silane was conducted for 3 minutes. Subsequently, RF power was then shut off, thereby eliminating the glow discharge. The supply of the $SiH_4/H_2$ gas into the deposition chamber 417 was stopped, whereas the $H_2$ gas was fed further for 5 min. into the deposition chamber 417. Then, the $H_2$ gas was also shut off, and the inside of the deposition chamber 417 as well as the inside of the gas lines was evacuated down to $1\times10^{-5}$ Torr.

After the preparation for semiconductor film deposition was completed as described above, an RF n-layer 103 comprised of μc-Si was formed, according to the manner of Example I2.

Next, plasma processing with hydrogen gas containing a small about of silane was conducted under the conditions described in Table I21 (2).

Next, an n/i buffer layer 151 comprised of a-SiC was made by means of RFPCVD method, according to the manner of Example I2.

Next, plasma processing with hydrogen gas containing a small about of silane was conducted under the conditions described in Table I21 (3).

Next, an MW i-layer 114 comprised of a-SiC was made by means of MWPCVD method, according to the manner of Example I2.

Next, plasma processing with hydrogen gas containing a small about of silane was conducted under the conditions described in Table I21 (4).

Next, a p/i buffer layer 161 comprised of a-SiC was made by means of RFPCVD method, according to the manner of Example I2.

Next, plasma processing with hydrogen gas containing a small about of silane was conducted under the conditions described in Table I21 (5).

Next, an RF p-layer 105 comprised of a-SiC was made by means of RFPCVD method, according to the manner of Example I2.

Next, plasma processing with hydrogen gas containing a small about of Group V element according to the invention was conducted under the conditions described in Table I21 (6).

Next, an RF n-layer 203 comprised of μc-Si was made by means of RFPCVD method, according to the manner of Example I2.

Next, plasma processing with hydrogen gas containing a small about of silane was conducted under the conditions described in Table I21 (7).

Next, an n/i buffer layer 251 comprised of a-SiC was made by means of RFPCVD method, according to the manner of Example I2.

Next, plasma processing with hydrogen gas containing a small about of silane was conducted under the conditions described in Table I21 (8).

Next, an MW i-layer 214 comprised of a-SiGe was made by means of MWPCVD method, according to the manner of Example I2.

Next, plasma processing with hydrogen gas containing a small about of silane was conducted under the conditions described in Table I21 (9).

Next, a p/i buffer layer 261 comprised of a-SiC was made by means of RFPCVD method, according to the manner of Example I2.

Next, plasma processing with hydrogen gas containing a small about of silane was conducted under the conditions described in Table I21 (10).

Next, an RF p-layer 305 comprised of a-SiC was made by means of MWPCVD method, according to the manner of Example I2.

Next, plasma processing with hydrogen gas containing a small about of Group V element according the invention was conducted under the conditions described in Table I21 (11).

Next, an RF n-layer 309 comprised of μc-Si was made by means of RFPCVD method, according to the manner of Example I2.

Next, plasma processing with hydrogen gas containing a small about of silane was conducted under the conditions described in Table I21 (12).

Next, an n/i buffer layer 351 comprised of a-SiC was made by means of RFPCVD method, according to the manner of Example I2.

Next, plasma processing with hydrogen gas containing a small about of silane was conducted under the conditions described in Table I21 (13).

Next, an RF i-layer 314 comprised of a-Si was made by means of RFPCVD method, according to the manner of Example I2.

Next, plasma processing with hydrogen gas containing a small about of silane was conducted under the conditions described in Table I21 (14).

Next, a p/i buffer layer 361 comprised of a-SiC was made by means of RFPCVD method, according to the manner of Example I2.

Next, plasma processing with hydrogen gas containing a small about of silane was conducted under the conditions described in Table I21 (15).

Next, an RF i-layer 305 comprised of a-SiC was made by means of RFPCVD method, according to the manner of Example I2.

Next, ITO was then evaporated onto the RF p-layer 305 so as to form a transparent conductive layer 112 having a thickness of 70 nm.

A mask having a comb-shaped window was placed on the transparent conductive layer 112, and metal evaporation was performed via the mask thereby forming a comb-shaped collection electrode 113 having a multi-layer structure consisting of Cr(40 nm)/Ag(1000 nm)/Cr(40 nm).

In this way, a complete solar cell according to the invention was obtained. Hereafter, the solar cell of this type will be referred to as SC-EMB-I21. Tables 21(1) through 21(16) summarize the conditions used here in the invention, regarding the plasma treatment in an ambient of hydrogen containing a small amount of Group V element and plasma treatment in an ambient of hydrogen containing a small amount of silane gas, as well as the process conditions for the RF n-layer, n/i buffer layer, MW i-layer, p/i buffer layer, RF p-layer, RF n-layer, n/i buffer layer, MW i-layer, p/i buffer layer, RF p-layer, RF n-layer, n/i buffer layer, RF i-layer, p/i buffer layer, and RF p-layer.

COMPARATIVE EXAMPLE I21

A solar cell (SC-CMP-I21) was fabricated in the same manner as in the above-described Example I21 except that the plasma treatment with hydrogen gas containing a small amount of Group V element and plasma treatment with hydrogen gas containing a small amount of silane gas according to the invention was not performed.

Seven samples were prepared for each type (SC-EMB-I21 and SC-CMP-I21) for the purpose of evaluation regarding the initial photoelectric efficiency (the ratio of the electric output power to the optical input power), vibration durability, optical durability, vibration durability and optical durability under a biased condition at a high temperature and high humidity, and inverse bias voltage application properties.

The measurement of the initial photoelectric conversion efficiency was performed by measuring the V-I characteristics of the samples under the illumination condition of AM 1.5 (100 mW/cm$^2$). The measurement revealed that the fill factor (F.F.) of the initial photoelectric conversion efficiencies, series resistance (Rs), and variation of properties of the SC-EMB-I21 samples as compared to the SC-CMP-I21 samples were as shown below:

| | Fill factor | Series resistance | variation of properties |
|---|---|---|---|
| (SC-EMB-I21) | 1.20 times | 0.85 times | 0.80 times |

The evaluation of the vibration durability was performed as follows: After the measurement of the initial photoelectric conversion efficiency, some solar cells were placed in a dark place kept at 26° C. and 58% relative humidity. Vibration having an amplitude of 0.1 mm and a frequency of 60 Hz was applied to the samples for 560 hr. Subsequently, the photoelectric conversion efficiencies of the samples were measured under the illumination conditions of AM 1.5 (100 $mW/cm^2$) and the reduction relative to the initial value (the ratio of the photoelectric conversion efficiency after the vibration test to the initial value) was evaluated.

The evaluation of the optical durability was performed as follows: After the measurement of the initial photoelectric conversion efficiency, some solar cells were placed in an environment of 26° C. and 58% relative humidity. Light of AM 1.5 (100 $mW/cm^2$) was applied to the samples for 560 hr. Subsequently, the photoelectric conversion efficiencies of the samples were measured under the illumination conditions of AM 1.5 (100 $mW/cm^2$) and the reduction relative to the initial value (the ratio of the photoelectric conversion efficiency after the optical deterioration test to the initial value) was evaluated. The results of the measurement of (SC-EMB-I21) as compared to (SC-CMP-I21) concerning the deterioration of photoelectric conversion efficiencies following optical deterioration and the deterioration of photoelectric conversion efficiencies following vibration deterioration are as shown below:

| | Vibration durability | Optical durability |
|---|---|---|
| (SC-CMP-I21) | 0.81 times | 0.80 times |

The evaluation of the vibration durability under the biased condition at high temperature and high humidity was performed as follows: After the measurement of the initial photoelectric conversion efficiency, two solar cells were placed in a dark place kept at 84° C. and 94% relative humidity, and a forward bias voltage of 0.71 V was applied to the samples.

Vibration as described above was applied to one of the solar cells, whereupon vibration durability was measured, and light of AM 1.5 was applied to the other solar cell, whereupon optical durability was measured.

The results of the measurement of (SC-EMB-I21) as compared to (SC-CMP-I21) concerning the deterioration of photoelectric conversion efficiencies following optical deterioration and the deterioration of photoelectric conversion efficiencies following vibration deterioration are as shown below:

| | Vibration durability | Optical durability |
|---|---|---|
| (SC-CMP-I21) | 0.80 times | 0.80 times |

The measurement of inverse bias voltage application properties was performed as follows: After the measurement of the initial photoelectric conversion efficiency, a solar cell was placed in a dark place kept at 82° C. and 53% relative humidity, and an inverse bias voltage of 5.0 V was applied to the sample for 100 hours. Subsequently, the photoelectric conversion efficiencies of the samples were measured under the illumination conditions of AM 1.5 (100 $mW/cm^2$) and the reduction relative to the initial value (the ratio of the photoelectric conversion efficiency after the inverse bias voltage application test to the initial value) was evaluated.

The results of the measurement of (SC-EMB-I21) as compared to (SC-CMP-I21) concerning the deterioration of photoelectric conversion efficiencies following inverse bias voltage application are as shown below:

| | |
|---|---|
| (SC-CMP-I21) | 0.82 times |

The surfaces of the above-described samples were observed using an optical microscope to evaluate film separation. No film separation was observed in the SC-EMB-I21 samples, whereas slight film separation was observed in the SC-CMP-I21 samples.

From the above results, it can be concluded that the solar cells (SC-EMB-I21) according to the present invention are better in photoelectric conversion efficiency concerning fill factor, series resistance properties, uniformity, optical deterioration properties, adhesion, overall durability, and inverse bias voltage application properties than the conventional solar cells (SC-CMP-I21).

In the aforementioned example, description was made concerning a solar cell wherein n-layer, n/i buffer layer, i-layer, p/i buffer layer, and p layer were sequentially deposited upon a substrate. A solar cell was also made by conducting the same manner of hydrogen plasma processing wherein p-layer, p/i buffer layer, i-layer, n/i buffer layer, and n-layer were sequentially deposited.

When evaluation thereof was made in accordance with the aforementioned example, it was found that the solar cell wherein between the p-layer and n-layer thereof was subjected to plasma treatment with hydrogen gas containing silicone atom-containing gas and Group V element-containing gas exhibited better properties regarding photoelectric conversion efficiency concerning fill factor, uniformity, optical deterioration properties, series resistance properties, overall durability, and inverse bias voltage application properties. It was also found that if plasma treatment is conducted near the interface of the substrate and the p-layer, the interface between the n/i buffer layer and the n-layer, the interface between the n/i buffer layer and the i-layer, the interface between the p/i buffer layer and the i-layer, and the interface between the p/i buffer layer and the p-layer, with hydrogen gas containing silicone atoms to the extent that there is no actual deposition, the aforementioned properties are even more accentuated.

EXAMPLE J1

A tandem solar cell having a structure such as that shown in FIG. 1 was made using the deposition equipment shown in FIG. 7. First, a substrate was prepared. A stainless-steel base 100 having dimensions of 0.5 mm in thickness and 50×50 $mm^2$ in area was cleaned with acetone and isopropanol by means of ultrasonic cleaning, and then dried with hot air.

An Ag optical reflection layer 101 having a thickness of 0.3 μm was deposited on a surface of the stainless-steel base 100 using a sputtering technique at room temperature, and a 1.0-μm-thick ZnO layer acting as a reflection enhancing layer 102 was further deposited on it at 350° C. Thus, a complete substrate 490 was prepared.

Next, using the deposition equipment 400, the respective semiconductor layers were then deposited on the reflection enhancing layer, the deposition equipment 400 having the capabilities of both MWPCVD and RFPCVD.

The deposition equipment 400 was used in a state in which source gas cylinders (not shown) were connected to the deposition equipment 400 via gas inlets. The source gas cylinders used here were all of ultra-high purity type, with $SiH_4$ gas cylinder, $SiF_4$ gas cylinder, $CH_4$ gas cylinder, $GeH_4$ gas cylinder, $GeF_4$ gas cylinder, $Si_2H_6$ gas cylinder, $PH_3/H_2$ (diluted to 1000 ppm) gas cylinder, $B_2H_6/H_2$ (diluted to 2000 ppm, 1%, 10%) gas cylinder, $PF_3/H_2$ (diluted to 2000 ppm, 1%, 10%) gas cylinder, $H_2$ gas cylinder, He gas cylinder, $SiCl_2H_2$ gas cylinder, and $SiH_4/H_2$ (diluted to 1000 ppm) gas cylinder being connected.

Next, the substrate 490 on which the optical reflection layer 101 and the reflection enhancing layer 102 had been formed was placed on the substrate transfer rail 413 in the load chamber 401, and the load chamber 401 was evacuated with a vacuum pump (not shown) down to a pressure of about $1\times10^{-5}$ Torr. Then, the gate valve 406 was opened, and the substrate 490 was transferred to the deposition chamber 417 via the transfer chamber 402 wherein both deposition chamber 417 and transfer chamber 402 had already been evacuated with a vacuum pump (not shown). The substrate 490 was placed such that the back surface of the substrate 490 came into contact with the heater 410 so that the substrate 490 was heated. The inside of the deposition chamber 417 was evacuated with the vacuum pump (not shown) down to a pressure of about $1\times10^{-5}$ Torr.

After the preparation for semiconductor film deposition was completed as described above, an RF n-layer 103 comprised of μc-Si was formed.

In order to form an RF n-layer 103 comprised of μc-Si, $H_2$ gas was introduced into the deposition chamber 417 via the gas inlet 429 with the $H_2$ gas being supplied via opened valves 441, 431, and 430, and the flow rate of the $H_2$ gas was adjusted to 300 sccm by means of a mass flow controller 436. Furthermore, the pressure inside the deposition chamber 417 was adjusted to 1.1 Torr by means of a conductance valve (not shown). The substrate 490 was heated by setting the substrate heater 410 to 380° C. When the temperature of the substrate had become stable, $SiH_4$ gas and $PH_3/H_2$ (diluted to 1%) gas was introduced into the deposition chamber 417 via gas inlet 429, by means of operating valves 443, 433, 444, and 434. At this time, the flow rates of the $SiH_4$ gas, $H_2$ gas, and $PH_3/H_2$ (diluted to 1%) gas were adjusted to 1.5 sccm, 100 sccm, and 200 sccm respectively, by means of mass flow controllers 438, 436, and 439. Furthermore, the pressure inside the deposition chamber 417 was adjusted to 1.1 Torr by means of a conductance valve (not shown). The RF power supply 422 was set so that the electric power was 0.05 W/cm$^3$, RF electrical power was introduced to the plasma excitation cup 420, causing a glow discharge to occur, and thus deposition of the RF n-layer 103 was started upon the substrate 490. When the thickness of the deposited RF n-layer 103 had reached 20 nm, the RF power was shut off thereby eliminating the glow discharge. Thus, the deposition of the RF n-layer 103 was complete. The supply of $SiH_4$ and $PH_3/H_2$ into the chamber 417 was stopped, whereas $H_2$ was fed further for 4 min. into the deposition chamber 417. Then, $H_2$ was also shut off, and the inside of the deposition chamber 417 as well as the inside of the gas lines was evacuated down to $1\times10^{-5}$ Torr.

Next, an n/i buffer layer 151 comprised of a-Si was formed by means of RFPCVD method. First, the inside of the transfer chamber 403 and the i-layer deposition chamber 418 was evacuated with the vacuum pump (not shown), to which the substrate 490 was transferred by means of opening the gate valve 407. The substrate 490 was heated by means of applying the back side there of to the substrate heater 411, and the inside of the i-layer deposition chamber 418 was evacuated with the vacuum pump (not shown) down to a pressure of about $1\times10^{-5}$ Torr.

In order to form the n/i buffer layer 151, the substrate 490 was heated by setting the substrate heater 411 to 360° C. When the temperature of the substrate was sufficient, $Si_2H_6$ gas and $H_2$ gas was introduced into the i-layer deposition chamber 418 via gas inlet 449, by means of slowly opening valves 464, 454, 450, and 453. At this time, the flow rates of the $Si_2H_6$ gas and $H_2$ gas were adjusted to 2.5 sccm and 100 sccm respectively, by means of mass flow controllers 459 and 458. Furthermore, the pressure inside the i-layer deposition chamber 418 was adjusted to 0.7 Torr by means of a conductance valve (not shown). Next, the RF power supply 424 was set so that the electric power was 0.07 W/cm$^3$, applied to a bias rod 428, causing a glow discharge to occur, and formation of the n/i buffer layer 151 upon the RF n-layer 103 was started by means of opening a shutter 427. When the thickness of the deposited n/i buffer layer 151 had reached 10 nm, the RF glow discharge was terminated, and the output of the RF power source 424 was shut off. Thus, the formation of the n/i buffer layer 151 was complete. The valves 464 and 454 were closed so that the supply of $Si_2H_6$ into the i-layer chamber 418 was stopped, whereas $H_2$ was fed further for 2 min. into the i-layer deposition chamber 418. Then, valves 453 and 450 were closed, and the inside of the i-layer deposition chamber 418 as well as the inside of the gas lines was evacuated down to $1\times10^{-5}$ Torr.

Next, an MW i-layer 114 comprised of a-SiGe was formed by means of MWPCVD method. In order to form the MW i-layer, the substrate 490 was heated by setting the substrate heater 411 to 380° C. When the temperature of the substrate was sufficient, $SiH_4$ gas, $GeH_4$ gas, and $H_2$ gas was introduced into the i-layer deposition chamber 418 via gas inlet 449, by means of slowly opening valves 461, 451, 450, 462, 452, 463, and 453. At this time, the flow rates of the $SiH_4$ gas, $GeH_4$ gas, and $H_2$ gas were adjusted to 37 sccm, 38 sccm, and 165 sccm respectively, by means of mass flow controllers 456, 457, and 458. Furthermore, the pressure inside the i-layer deposition chamber 418 was adjusted to 5 mTorr by means of a conductance valve (not shown). Next, the high-frequency (hereafter referred to as "RF") power supply 424 was set so that the electric power was 0.6 W/cm$^3$, and applied to a bias rod 428. Following this, the electric power of the MW power source (not shown) was set to 0.28 W/cm$^3$, MW electrical power was introduced into the i-layer deposition chamber 418 via the guided-wave tube 426 and microwave introduction window 425, causing a glow discharge to occur, and formation of the MW i-layer 114 upon the n/i-layer 151 was started, by means of opening a shutter 427. When the thickness of the deposited i-layer had reached 0.15 μm, the MW glow discharge was terminated, and the output of the bias power source 424 was shut off. Thus, the formation of the MW i-buffer layer 114 was complete. The supply of $SiH_4$ gas and $GeH_4$ into the i-layer chamber 418 was stopped by means of closing the valves 451 and 452, whereas $H_2$ was fed further for 2 min. into the i-layer deposition chamber 418. Then, valves 453 and 450 were closed, and the inside of the i-layer deposition chamber 418 as well as the inside of the gas lines was evacuated down to $1\times10^{-5}$ Torr.

Next, a p/i buffer layer 161 comprised of a-Si was formed by means of RFPCVD method. In order to form the p/i buffer layer, the substrate 490 was heated by setting the substrate heater 411 to 250° C. When the temperature of the substrate was sufficient, $Si_2H_6$ gas and $H_2$ gas was introduced into the i-layer deposition chamber 418 via gas inlet 449, by means of slowly opening valves 464, 454, 450, 463, and 453. At this time, the flow rates of the $Si_2H_6$ gas, and $H_2$ gas were adjusted to 3 sccm, and 80 sccm respectively, by means of mass flow controllers 459, and 458. Furthermore, the pressure inside the i-layer deposition chamber 418 was adjusted to 0.7 Torr by means of a conductance valve (not shown). Next, the RF power supply 424 was set so that the electric power was 0.07 W/$cm^3$, and applied to a bias rod 428, causing a glow discharge to occur, and formation of the p/i buffer layer 161 upon the MW i-layer 114 was started, by means of opening a shutter 427. When the thickness of the deposited p/i-layer 161 had reached 20 nm, the RF glow discharge was terminated, and the output of the RF power source 424 was shut off. Thus, the formation of the MW i-buffer layer 161 was complete. The supply of $Si_2H_6$ gas into the i-layer chamber 418 was stopped by means of closing the valves 464 and 454, whereas $H_2$ was fed further for 2 min. into the i-layer deposition chamber 418. Then, valves 453 and 450 were closed, and the inside of the i-layer deposition chamber 418 as well as the inside of the gas lines was evacuated down to $1\times10^{-5}$ Torr.

Next, in order to form an RF p-layer 105 comprised of a-SiC, the substrate 490 was transferred to the p-layer deposition chamber 419 via the transfer chamber 404 by means of opening the gate valve 408 thereto, wherein both deposition chamber 419 and transfer chamber 404 had already been evacuated with a vacuum pump (not shown). The substrate 490 was placed such that the back surface of the substrate 490 came into contact with the heater 412 so that the substrate 490 was heated. The inside of the p-layer deposition chamber 417 was evacuated with the vacuum pump (not shown) down to a pressure of about $1\times10^{-5}$ Torr.

The substrate 490 was heated by setting the substrate heater 412 to 250° C. When the temperature of the substrate had become stable, $H_2$ gas, $SiH_4/H_2$ gas, $B_2H_6/H_2$ gas, and $CH_4$ gas was introduced into the deposition chamber 419 via gas inlet 469, by means of operating valves 481, 471, 470, 482, 472, 483, 473, 484, and 474. At this time, the flow rates of the $H_2$ gas, $SiH_4/H_2$ gas, $B_2H_6/H_2$ (diluted to 1%) gas, and $CH_4$ gas were adjusted to 60 sccm, 0.5 sccm, 1 sccm, and 0.3 sccm respectively, by means of mass flow controllers 476, 477, 478, and 479. Furthermore, the pressure inside the deposition chamber 419 was adjusted to 1.7 Torr by means of a conductance valve (not shown). The RF power supply 423 was set so that the electric power was 0.07 W/$cm^3$, RF power supply was introduced to the plasma excitation cup 421, causing a glow discharge to occur, and thus formation of the RF p-layer 105 was started upon the p/i buffer layer 161. When the thickness of the deposited RF p-layer 105 had reached 10 nm, the RF power was shut off thereby eliminating the glow discharge. Thus, the formation of the RF p-layer 105 was complete. The supply of $SiH_4/H_2$ gas, $B2H_6/H_2$ gas, and $CH_4$ gas into the chamber 419 was stopped by means of closing the valves 472, 482, 473, 483, 474, and 484, whereas $H_2$ was fed further for 3 min. into the p-layer deposition chamber 419. Then, $H_2$ was also shut off by means of closing the valves 471, 481, and 470, and the inside of the p-layer deposition chamber 419 as well as the inside of the gas lines was evacuated down to $1\times10^{-5}$ Torr.

Next, plasma treatment with hydrogen gas containing a small amount of Group III element according to the present invention was conducted according to the conditions of Table J1. $B_2H_6/H_2$ (diluted to 1%) serving as the gas containing the Group III element, $SiH_4$ serving as the gas containing silicon atoms described above, and $H_2$ were introduced into the deposition chamber 419 via the gas inlet 469 wherein the $H_2$ gas was supplied via opened valves 481, 471, and 470, and its flow rate was adjusted to 1200 sccm by means of a mass flow controller 476. The $B_2H_6$/gas containing the Group III was supplied via opened valves 483 and 473 and its flow rate was controlled by a mass flow controller 478 such that the flow rate of the $B_2H_6$ gas was maintained at 0.3% of the total gas flow rate of $H_2$. The flow rate of the gas containing silicone was controlled by a mass flow controller (not shown) such that the flow rate of the $SiH_4$ was maintained at 0.01 % of the total gas flow rate of $H_2$ by means of opening valves (not shown). The pressure inside the deposition chamber 419 was adjusted to 0.7 Torr by means of a conductance valve (not shown). The substrate 490 was heated by the substrate heater 412 up to 250° C. When the temperature of the substrate had become stable, the electrical power of the RF power supply 423 was adjusted to 0.05 W/$cm^3$, so that a glow discharge occurred in the plasma excitation cup 421, and plasma processing with hydrogen gas containing a small about of Group III element according to the present invention was conducted for 4 minutes. The RF power was then shut off, thereby eliminating the glow discharge. The supply of the $B_2H_6/H_2$ and $SiH_4$ gas into the deposition chamber 410 was stopped, whereas the $H_2$ gas was fed further for 3 min. into the deposition chamber 417. Then, the $H_2$ gas was also shut off, and the inside of the deposition chamber 419 as well as the inside of the gas lines was evacuated down to $1\times10^{-5}$ Torr.

Next, in order to form an RF n-layer 203 comprised of μc-Si, the gate valves 408 and 407 were opened, transferring was conducted to the transfer chamber 402 and deposition chamber 417 via the transfer chamber 403, wherein the transfer chamber 403 had already been evacuated with a vacuum pump (not shown). The substrate 490 was placed such that the back surface of the substrate 490 came into contact with the heater 410 so that the substrate 490 was heated. The inside of the deposition chamber 417 was evacuated with the vacuum pump (not shown) down to a pressure of about $1\times10^{-5}$ Torr.

In order to form an RF n-layer 203 comprised of μc-Si, $H_2$ gas was introduced into the deposition chamber 417 via the gas inlet 429 with the $H_2$ gas being supplied via opened valves 441, 431, and 430, and the flow rate of the $H_2$ gas was adjusted to 200 sccm by means of a mass flow controller 436. Furthermore, the pressure inside the deposition chamber 417 was adjusted to 1.1 Torr by means of a conductance valve (not shown). The substrate 490 was heated by setting the substrate heater 410 to 250° C. When the temperature of the substrate had become stable, $SiH_4$ gas and $PH_3/H_2$ gas was introduced into the deposition chamber 417 via gas inlet 429, by means of operating valves 443, 433, 444, and 434. At this time, the flow rates of the $SiH_4$ gas, $H_2$ gas, and $PH_3/H_2$ gas were adjusted to 1.5 sccm, 80 sccm, and 250 sccm respectively, by means of mass flow controllers 438, 436, and 439. Furthermore, the pressure inside the deposition chamber 417 was adjusted to 1.1 Torr by means of a conductance valve (not shown). The RF power supply 422 was set so that the electric power was 0.05 W/$cm^3$, introducing RF electrical power to the plasma excitation cup 420, causing a glow discharge to occur, and thus deposition of the RF n-layer 203 was started upon the RF p-layer 105. When the thickness of the deposited RF n-layer 203 had reached 10 nm, the RF power was shut off thereby eliminating the glow discharge. Thus, the deposition of the RF n-layer 203 was complete. The supply of $SiH_4$ and $PH_3/H_2$ into the deposition chamber 417 was stopped, whereas $H_2$ was fed further for 2 min. into the deposition chamber 417. Then, $H_2$ was also shut off, and the inside of the deposition chamber 417 as well as the inside of the gas lines was evacuated down to $1\times10^{-5}$ Torr.

Next, an n/i buffer layer 251 comprised of a-SiC was formed by means of RFPCVD method. First, the inside of the transfer chamber 403 and the i-layer deposition chamber 418 was evacuated with the vacuum pump (not shown), to which the substrate 490 was transferred by means of opening the gate valve 407. The substrate 490 was heated by means of applying the back side thereof to the substrate heater 411, and the inside of the i-layer deposition chamber 418 was evacuated with the vacuum pump (not shown) down to a pressure of about $1\times10^5$ Torr.

In order to form the n/i buffer layer 251, the substrate 490 was heated by setting the substrate heater 411 to 250° C. When the temperature of the substrate was sufficient, $Si_2H_6$ gas, $H_2$ gas and $CH_4$ gas was introduced into the i-layer deposition chamber 418 via gas inlet 449, by means of slowly opening valves 464, 454, 450, 463, 453, 465, and 455. At this time, the flow rates of the $Si_2H_6$ gas, $H_2$ gas and $CH_4$ gas were adjusted to 0.4 sccm, 90 sccm, and 0.2 sccm respectively, by means of mass flow controllers 459, 458, and 460.

The pressure inside the i-layer deposition chamber 418 was adjusted to 1.0 Torr by means of a conductance valve (not shown). Next, the RF power supply 424 was set so that the electric power was 0.06 $W/cm^3$, applied to a bias rod 428, causing a glow discharge to occur, and formation of the n/i buffer layer 251 upon the RF n-layer 203 was started by means of opening the shutter 427. When the thickness of the deposited n/i buffer layer 251 had reached 10 nm, the RF glow discharge was terminated, and the output of the RF power source 424 was shut off. Thus, the formation of the n/i buffer layer 251 was complete. The supply of $Si_2H_6$ gas and $CH_4$ gas into the i-layer chamber 418 was stopped, whereas $H_2$ was fed further for 2 min. into the i-layer deposition chamber 418. Then, valves 453 and 450 were closed, and the inside of the i-layer deposition chamber 418 as well as the inside of the gas lines was evacuated down to $1\times10^{-5}$ Torr.

Next, an RF i-layer 214 comprised of a-Si was formed by means of RFPCVD method. In order to form the RF i-layer, the substrate 490 was heated by setting the substrate heater 411 to 200° C. When the temperature of the substrate was sufficient, $Si_2H_6$ gas and $H_2$ gas was introduced into the i-layer deposition chamber 418 via gas inlet 449, by means of slowly opening valves 464, 454, 450, 463, and 453. At this time, the flow rates of the $Si_2H_6$ gas, and $H_2$ gas were adjusted to 3 sccm and 85 sccm respectively, by means of mass flow controllers 459 and 458.

The pressure inside the i-layer deposition chamber 418 was adjusted to 0.5 Torr by means of a conductance valve (not shown). Next, the RF power supply 424 was set so that the electric power was 0.07 $W/cm^3$, applied to a bias rod 428, causing a glow discharge to occur, and formation of the RF i-layer 214 upon the n/i buffer layer 251 was started, by means of opening the shutter 427. When the thickness of the deposited RF i-layer 214 had reached 110 nm, the RF glow discharge was terminated, and the output of the RF power source 424 was shut off. Thus, the formation of the RF i-layer 214 was complete. The supply of $Si_2H_6$ gas into the i-layer chamber 418 was stopped by means of closing the valves 464 and 454, whereas $H_2$ was fed further for 2 min. into the i-layer deposition chamber 418. Then, valves 453 and 450 were closed, and the inside of the i-layer deposition chamber 418 as well as the inside of the gas lines was evacuated down to $1\times10^{-5}$ Torr.

Next, a p/i buffer layer 261 comprised of a-Sic was formed by means of RFPCVD method. In order to form the p/i buffer layer 261, the substrate 490 was heated by setting the substrate heater 411 to 200° C. When the temperature of the substrate was sufficient, $Si_2H_6$ gas, $H_2$ gas and $CH_4$ gas was introduced into the i-layer deposition chamber 418 via gas inlet 449, by means of slowly opening valves 464, 454, 450, 463, 453, 465, and 455. At this time, the flow rates of the $Si_2H_6$ gas, $H_2$ gas and $CH_4$ gas were adjusted to 0.4 sccm, 65 sccm, and 0.3 sccm respectively, by means of mass flow controllers 459, 458, and 460. The pressure inside the i-layer deposition chamber 418 was adjusted to 1.1 Torr by means of a conductance valve (not shown). Next, the RF power supply 424 was set so that the electric power was 0.06 $W/cm^3$, applied to a bias rod 428, causing a glow discharge to occur, and formation of the p/i buffer layer 261 upon the RF i-layer 214 was started by means of opening the shutter 427. When the thickness of the deposited p/i buffer layer 261 had reached 15 nm, the RF glow discharge was terminated, and the output of the RF power source 424 was shut off. Thus, the formation of the p/i buffer layer 261 was complete. The supply of $Si_2H_6$ gas and $CH_4$ gas into the i-layer chamber 418 was stopped by means of closing the valves 464, 454, 465, and 455, whereas $H_2$ was fed further for 2 min. into the i-layer deposition chamber 418. Then, valves 453 and 450 were closed, and the inside of the i-layer deposition chamber 418 as well as the inside of the gas lines was evacuated down to $1\times10^{-5}$ Torr.

Next, in order to form an RF p-layer 205 comprised of a-SiC, the substrate 490 was transferred to the p-layer deposition chamber 419 via the transfer chamber 404 by means of opening the gate valve 408 thereto, wherein both deposition chamber 419 and transfer chamber 404 had already been evacuated with a vacuum pump (not shown). The substrate 490 was placed such that the back surface of the substrate 490 came into contact with the heater 412 so that the substrate 490 was heated. The inside of the p-layer deposition chamber 417 was evacuated with the vacuum pump (not shown) down to a pressure of about $1\times10^{-5}$ Torr.

The substrate 490 was heated by setting the substrate heater 412 to 170° C. When the temperature of the substrate had become stable, $H_2$ gas, $SiH_4/H_2$ gas, $B_2H_6/H_2$ gas (diluted to 1%), and $CH_4$ gas was introduced into the deposition chamber 419 via gas inlet 469, by means of operating valves 481, 471, 470, 482, 472, 483, 473, 484, and 474. At this time, the flow rates of the $H_2$ gas, $SiH_4/H_2$ gas, $B_2H_6/H_2$ gas (diluted to 1%), and $CH_4$ gas were adjusted to 70 sccm, 0.5 sccm, 1 sccm, and 0.3 sccm respectively, by means of mass flow controllers 476, 477, 478, and 479. Furthermore, the pressure inside the deposition chamber 419 was adjusted to 1.7 Torr by means of a conductance valve (not shown). The RF power supply 423 was set so that the electric power was 0.07 $W/cm^3$, RF power supply was introduced to the plasma excitation cup 421, causing a glow discharge to occur, and thus formation of the RF p-layer 205 was started upon the p/i buffer layer 261. When the thickness of the deposited RF p-layer 205 had reached 10 nm, the RF power was shut off thereby eliminating the glow discharge. Thus, the formation of the RF p-layer 205 was complete. The supply of $SiH_4/H_2$ gas, $B_2H_6/H_2$ gas, and $CH_4$ gas into the chamber 419 was stopped by means of closing the valves 472, 482, 473, 483, 474, and 484, whereas $H_2$ was fed further for 2 min. into the p-layer deposition chamber 419. Then, $H_2$ was also shut off by means of closing the valves 471, 481, and 470, and the inside of the p-layer deposition chamber 419 as well as the inside of the gas lines was evacuated down to $1\times10^{-5}$ Torr.

The gate valve 409 was then opened, and the substrate 490 was transferred to the unload chamber 405 which had already been evacuated with a vacuum pump (not shown). Then, a leak valve (not shown) was opened so that the inside of the unload chamber 405 was exposed to the ambient atmosphere.

Next, ITO was then evaporated onto the RF p-layer 205 so as to form a transparent conductive layer 112 having a thickness of 70 nm.

A mask having a comb-shaped window was placed on the transparent conductive layer 112, and metal evaporation was performed via the mask thereby forming a comb-shaped collection electrode 113 having a multi-layer structure consisting of Cr(40 nm)/Ag(1000 nm)/Cr(40 nm).

In this way, a complete solar cell according to the invention was obtained. Hereafter, the solar cell of this type will be referred to as SC-EMB-J1. Tables J1(1) and J1(2) summarize the conditions used here in the invention, regarding the plasma treatment in an ambient of hydrogen containing a small amount of Group III element, as well as the process conditions for the RF n-layer, (RF) n/i buffer layer, MW i-layer, (RF) p/i buffer layer, RF p-layer, RF n-layer, (RF) n/i buffer layer, RF i-layer, (RF) p/i buffer layer, and RF p-layer.

COMPARATIVE EXAMPLE J1

A solar cell (SC-CMP-J1) was also fabricated in the same manner as in the above-described example J1 except that the plasma treatment with hydrogen gas containing a small amount of Group III element according to the invention was not performed. Eight samples were prepared for each type (SC-EMB-J1 and SC-CMP-J1) for the purpose of evaluation regarding the initial photoelectric efficiency (the ratio of the electric output power to the optical input power), vibration durability, optical durability, and vibration durability and optical durability under a biased condition at a high temperature and high humidity.

The measurement of the initial photoelectric conversion efficiency was performed by measuring the V-I characteristics of the samples under the illumination condition of AM 1.5 (100 mW/cm$^2$). The measurement revealed that the fill factor (F.F.) of the initial photoelectric conversion efficiencies, series resistance (Rs), and variation of properties of the SC-EMB-J1 samples as compared to the SC-CMP-J1 samples were as shown below:

| | Fill factor | Series resistance | variation of properties |
|---|---|---|---|
| (SC-EMB-J1) | 1.15 times | 0.90 times | 0.84 times |

The evaluation of the vibration durability was performed as follows: After the measurement of the initial photoelectric conversion efficiency, some solar cells were placed in a dark place kept at 26° C. and 55% relative humidity. Vibration having an amplitude of 0.1 mm and a frequency of 60 Hz was applied to the samples for 500 hr. Subsequently, the photoelectric conversion efficiencies of the samples were measured under the illumination conditions of AM 1.5 (100 mW/cm$^2$) and the reduction relative to the initial value (the ratio of the photoelectric conversion efficiency after the vibration test to the initial value) was evaluated.

The evaluation of the optical durability was performed as follows: After the measurement of the initial photoelectric conversion efficiency, some solar cells were placed in an environment of 26° C. and 55% relative humidity. Light of AM 1.5 (100 mW/cm$^2$) was applied to the samples for 500 hr. Subsequently, the photoelectric conversion efficiencies of the samples were measured under the illumination conditions of AM 1.5 (100 mW/cm$^2$) and the reduction relative to the initial value (the ratio of the photoelectric conversion efficiency after the optical deterioration test to the initial value) was evaluated. The results of the measurement of (SC-EMB-J1) as compared to (SC-CMP-J1) concerning the deterioration of photoelectric conversion efficiencies following optical deterioration and the deterioration of photoelectric conversion efficiencies following vibration deterioration are as shown below:

| | Vibration durability | Optical durability |
|---|---|---|
| (SC-CMP-J1) | 0.81 times | 0.80 times |

The evaluation of the vibration durability under the biased condition at high temperature and high humidity was performed as follows: After the measurement of the initial photoelectric conversion efficiency, two solar cells were placed in a dark place kept at 86° C. and 92% relative humidity, and a forward bias voltage of 0.72 V was applied to the samples.

Vibration as described above was applied to one of the solar cells, whereupon vibration durability was measured, and light of AM 1.5 was applied to the other solar cell, whereupon optical durability was measured. The results of the measurement of (SC EMB J1) as compared to (SC-CMP-J1) concerning the deterioration of photoelectric conversion efficiencies following optical deterioration and the deterioration of photoelectric conversion efficiencies following vibration deterioration are as shown below:

| | Vibration durability | Optical durability |
|---|---|---|
| (SC-CMP-J1) | 0.80 times | 0.80 times |

The surfaces of the above-described samples were observed using an optical microscope to evaluate film separation. No film separation was observed in the SC-EMB-J1 samples, whereas slight film separation was observed in the SC-CMP-J1 samples.

From the above results, it can be concluded that the solar cells (SC-EMB-J1) according to the present invention are better in photoelectric conversion efficiency concerning fill factor, series resistance, uniformity, optical deterioration properties, adhesion, and overall durability than the conventional solar cells (SC-CMP-J1)

EXAMPLE J2

A tandem solar cell having a structure such as that shown in FIG. 4 was made using the deposition equipment shown in FIG. 7. The substrate 490 on which the optical reflection layer 101 and the reflection enhancing layer 102 had been formed in the same manner as with Example J1 was placed on the substrate transfer rail 413 in the load chamber 401, and the load chamber 401 was evacuated with a vacuum pump (not shown) down to a pressure of about $1\times10^{31\ 5}$Torr.

Then, the gate valve 406 was opened, and the substrate 490 was transferred to the deposition chamber 417 via the transfer chamber 402 wherein both deposition chamber 417 and transfer chamber 402 had already been evacuated with a vacuum pump (not shown). The substrate 490 was placed such that the back surface of the substrate 490 came into contact with the heater 410 so that the substrate 490 was heated. The inside of the deposition chamber 417 was evacuated with the vacuum pump (not shown) down to a pressure of about $1\times10^{-}$Torr.

After the preparation for semiconductor film deposition was completed as described above, an RF n-layer 103 comprised of μc-Si was formed. In order to form an RF n-layer comprised of μc-Si, $H_2$ gas was introduced into the deposition chamber 417 via the gas inlet 429 with the $H_2$ gas being supplied via opened valves 441, 431, and 430, and the flow rate of the $H_2$ gas was adjusted to 300 sccm by means of a mass flow controller 436. Furthermore, the pressure inside the deposition chamber 417 was adjusted to 1.1 Torr by means of a conductance valve (not shown). The substrate 490 was heated by setting the substrate heater 410 to 380° C. When the temperature of the substrate had become stable, $SiH_4$ gas and $PH_3/H_2$ gas was introduced into the deposition chamber 417 via gas inlet 429, by means of operating valves 443, 433, 444, and 434. At this time, the flow rates of the $SiH_4$ gas, $H_2$ gas, and $PH_3/H_2$ gas were adjusted to 1.2 sccm, 90 sccm, and 200 sccm respectively, by means of mass flow controllers 438, 436, and 439. Furthermore, the pressure inside the deposition chamber 417 was adjusted to 1.1 Torr. The RF power supply 422 was set so that the electric power was 0.06 W/cm$^3$, RF electrical power was introduced to the plasma excitation cup 420, causing a glow discharge to occur, and thus deposition of the RF n-layer 103 was started upon the substrate 490. When the thickness of the deposited RF n-layer 103 had reached 20 nm, the RF power was shut off thereby eliminating the glow discharge. Thus, the deposition of the RF n-layer 103 was complete. The supply of $SiH_4$ and $PH_3/H_2$ into the chamber 417 was stopped, whereas $H_2$ was fed further for 4 min. into the deposition chamber 417. Then, $H_2$ was also shut off, and the inside of the deposition chamber 417 as well as the inside of the gas lines was evacuated down to $1\times10^{-5}$ Torr.

Next, an n/i buffer layer 151 comprised of a-Si was formed by means of RFPCVD method. First, the inside of the transfer chamber 403 and the i-layer deposition chamber 418 was evacuated with the vacuum pump (not shown), to which the substrate 490 was transferred by means of opening the gate valve 407. The substrate 490 was heated by means of applying the back side there of to the substrate heater 411, and the inside of the i-layer deposition chamber 418 was evacuated with the vacuum pump (not shown) down to a pressure of about $1\times10^{-5}$ Torr.

In order to form the n/i buffer layer 151, the substrate 490 was heated by setting the substrate heater 411 to 360° C. When the temperature of the substrate was sufficient, $Si_2H_6$ gas and $H_2$ gas was introduced into the i-layer deposition chamber 418 via gas inlet 449, by means of slowly opening valves 464, 454, 450, 463, and 453. At this time, the flow rates of the $Si_2H_6$ gas and $H_2$ gas were adjusted to 2.5 sccm and 100 sccm respectively, by means of mass flow controllers 459 and 458. Furthermore, the pressure inside the i-layer deposition chamber 418 was adjusted to 0.8 Torr by means of a conductance valve (not shown). Next, the RF power supply 424 was set so that the electric power was 0.08 W/cm$^3$, applied to a bias rod 428, causing a glow discharge to occur, and formation of the n/i buffer layer 151 upon the RF n-layer 103 was started. When the thickness of the deposited n/i buffer layer 151 had reached 10 nm, the RF glow discharge was terminated, and the output of the RF power source 424 was shut off. Thus, the formation of the n/i buffer layer 151 was complete. The valves 464 and 454 were closed so that the supply of $Si_2H_6$ into the i-layer chamber 418 was stopped, whereas $H_2$ was fed further for 2 min. into the i-layer deposition chamber 418. Then, valves 453 and 450 were closed, and the inside of the i-layer deposition chamber 418 as well as the inside of the gas lines was evacuated down to $1\times10^{-5}$ Torr.

Next, an MW i-layer 114 comprised of a-SiGe was formed by means of MWPCVD method. In order to form the MW i-layer, the substrate 490 was heated by setting the substrate heater 411 to 380° C. When the temperature of the substrate was sufficient, $SiH_4$ gas, $GeH_4$ gas, and $H_2$ gas was introduced into the i-layer deposition chamber 418 via gas inlet 449, by means of slowly opening valves 461, 451, 450, 462, 452, 463, and 453. At this time, the flow rates of the $SiH_4$ gas, $GeH_4$ gas, and $H_2$ gas were adjusted to 43 sccm, 42 sccm, and 180 sccm respectively, by means of mass flow controllers 456, 457, and 458. Furthermore, the pressure inside the i-layer deposition chamber 418 was adjusted to 5 mTorr by means of a conductance valve (not shown). Next, the RF power supply 424 was set so that the electric power was 0.60 W/cm$^3$, and applied to a bias rod 428. Following this, the electric power of the MW power source (not shown) was set to 0.25 W/cm$^3$, MW electrical power was introduced into the i-layer deposition chamber 418 via the guided-wave tube 426 and microwave introduction window 425, causing a glow discharge to occur, and formation of the MW i-layer 114 upon the n/i-layer 151 was started, by means of opening a shutter 427. When the thickness of the deposited i-layer had reached 0.15 μm, the MW glow discharge was terminated, and the output of the bias power source 424 was shut off. Thus, the formation of the MW i-buffer layer 114 was complete. The supply of $SiH_4$ gas and $GeH_4$ gas into the i-layer chamber 418 was stopped by means of closing the valves 451 and 452, whereas $H_2$ was fed further for 2 min. into the i-layer deposition chamber 418. Then, valves 453 and 450 were closed, and the inside of the i-layer deposition chamber 418 as well as the inside of the gas lines was evacuated down to $1\times10^{-5}$ Torr.

Next, a p/i buffer layer 161 comprised of a-Si was formed by means of RFPCVD method. In order to form the p/i buffer layer, the substrate 490 was heated by setting the substrate heater 411 to 250° C. When the temperature of the substrate was sufficient, $Si_2H_6$ gas and $H_2$ gas was introduced into the i-layer deposition chamber 418 via gas inlet 449, by means of slowly opening valves 464, 454, 450, 463, and 453. At this time, the flow rates of the $Si_2H_6$ gas and $H_2$ gas were adjusted to 3 sccm, and 75 sccm respectively, by means of mass flow controllers 459, and 458. Furthermore, the pressure inside the i-layer deposition chamber 418 was adjusted to 0.7 Torr by means of a conductance valve (not shown). Next, the RF power supply 424 was set so that the electric power was 0.07 W/cm$^3$, and applied to a bias rod 428, causing a glow discharge to occur, and formation of the p/i buffer layer 161 upon the MW i-layer 114 was started, by means of opening a shutter 427. When the thickness of the deposited p/i-layer 161 had reached 20 nm, the RF glow discharge was terminated, and the output of the RF power source 424 was shut off. Thus, the formation of the MW i-buffer layer 161 was complete. The supply of $Si_2H_6$ gas into the i-layer chamber 418 was stopped by means of closing the valves 464 and 454, whereas $H_2$ was fed further for 2 min. into the i-layer deposition chamber 418. Then, valves 453 and 450 were closed, and the inside of the i-layer deposition chamber 418 as well as the inside of the gas lines was evacuated down to $1\times10^{-5}$ Torr. Next, in order to form an RF p-layer 105 comprised of a-SiC, the substrate 490 was transferred to the p-layer deposition chamber 419 via the transfer chamber 404 by means of opening the gate valve 408 thereto, wherein both deposition chamber 419 and transfer chamber 404 had already been evacuated with a vacuum pump (not shown). The substrate 490 was placed such that the back surface of the substrate 490 came into contact with the heater 412 so that the substrate 490 was heated. The inside of the p-layer deposition chamber 419 was evacuated with the vacuum pump (not shown) down to a pressure of about $1\times10^{-5}$ Torr.

The substrate 490 was heated by setting the substrate heater 412 to 250° C. When the temperature of the substrate had become stable, $H_2$ gas, $SiH_4/H_2$ gas, $BF_3/H_2$ (diluted to 1%) gas, and $CH_4$ gas was introduced into the deposition chamber 419 via gas inlet 469, by means of operating valves 481, 471, 470, 482, 472, 483, 473, 484, and 474. At this time, the flow rates of the $H_2$ gas, $SiH_4/H_2$ gas, $BF_3/H_2$ (diluted to 1%) gas, and $CH_4$ gas were adjusted to 60 sccm, 0.4 sccm, 1 sccm, and 0.3 sccm respectively, by means of mass flow controllers 476, 477, 478, and 479. Furthermore, the pressure inside the deposition chamber 419 was adjusted to 1.7 Torr by means of a conductance valve (not shown). The RF power supply 423 was set so that the electric power was 0.07 W/cm$^3$, RF power supply was introduced to the plasma excitation cup 421, causing a glow discharge to occur, and thus formation of the RF p-layer 105 was started upon the p/i buffer layer 161. When the thickness of the deposited RF p-layer 105 had reached 10 nm, the RF power was shut off thereby eliminating the glow discharge. Thus, the formation of the RF p-layer 105 was complete. The supply of $SiH_4/H_2$ gas, $BF_3/H_2$ gas, and $CH_4$ gas into the chamber 419 was stopped by means of closing the valves 472, 482, 473, 483, 474, and 484, whereas $H_2$ was fed further for 3 min. into the p-layer deposition chamber 419. Then, $H_2$ was also shut off by means of closing the valves 471, 481, and 470, and the inside of the p-layer deposition chamber 419 as well as the inside of the gas lines was evacuated down to $1\times10^{-5}$ Torr.

Next, plasma treatment with hydrogen gas containing a small amount of Group III element according to the present invention was conducted according to the conditions of Table J2. In order to conduct plasma treatment with hydrogen gas containing a small amount of Group III element according to the present invention, $PF_3/H_2$ (diluted to 1%) serving as the gas containing Group III element, $SiH_4$ serving as the gas containing silicon atoms described above, and $H_2$ were introduced into the deposition chamber 419 via the gas inlet 469 wherein the $H_2$ gas was supplied via opened valves 481, 471, and 470, and its flow rate was adjusted to 1000 sccm by means of a mass flow controller 476. The Group III element-containing gas $PF_3$ gas was supplied via opened valves 483 and 473 and its flow rate was controlled by a mass flow controller 478 such that the flow rate of the $PF_3$ gas was maintained at 0.4% of the total gas flow rate of $H_2$. The flow rate of the gas containing silicone was controlled by a mass flow controller (not shown) such that the flow rate of the $SiH_4$ was maintained at 0.03% of the total gas flow rate of $H_2$ by means of opening valves (not shown). The pressure inside the deposition chamber 419 was adjusted to 0.013 Torr by means of a conductance valve (not shown). The substrate 490 was heated by the substrate heater 490 up to 250° C. When the temperature of the substrate had become stable, the VHF electrical power of the VHF power supply (not shown) was adjusted to 0.08 W/cm$^3$, VHF electrical power was introduced, so that a glow discharge occurred in the plasma excitation cup 421, and plasma processing with hydrogen gas containing a small about of Group III element according to the present invention was conducted for 4 minutes. The VHF power was then shut off, thereby eliminating the glow discharge. The supply of the $PF_3/H_2$ and $SiH_4$ gas into the deposition chamber 419 was stopped, whereas the $H_2$ gas was fed further for 4 min. into the deposition chamber 419. Then, the $H_2$ gas was also shut off, and the inside of the deposition chamber 419 as well as the inside of the gas lines was evacuated down to $1\times10^{-5}$ Torr.

Next, in order to form an RF n-layer 203 comprised of μc-Si, the substrate 490 was transferred to the deposition chamber 417 via the transfer chamber 402 by means of opening the gate valves 408 and 407 thereto, wherein both deposition chamber 417 and transfer chamber 402 had already been evacuated with a vacuum pump (not shown). The substrate 490 was placed such that the back surface of the substrate 490 came into contact with the heater 410 so that the substrate 490 was heated. The inside of the deposition chamber 417 was evacuated with the vacuum pump (not shown) down to a pressure of about $1\times10^{-5}$ Torr.

In order to form an RF n-layer 203 comprised of μc-Si, $H_2$ gas was introduced into the deposition chamber 417 via the gas inlet 429 with the $H_2$ gas being supplied via opened valves 441, 431, and 430, and the flow rate of the $H_2$ gas was adjusted to 200 sccm by means of a mass flow controller 436. Furthermore, the pressure inside the deposition chamber 417 was adjusted to 1.1 Torr by means of a conductance valve (not shown). The substrate 490 was heated by setting the substrate heater 410 to 250° C. When the temperature of the substrate had become stable, $SiH_4$ gas and $PF_3/H_2$ gas was introduced into the deposition chamber 417 via gas inlet 429, by means of operating valves 443, 433, 444, and 434. At this time, the flow rates of the $SiH_4$ gas, $H_2$ gas, and $PF_3/H_2$ gas were adjusted to 1.5 sccm, 80 sccm, and 250 sccm respectively, by means of mass flow controllers 438, 436, and 439. Furthermore, the pressure inside the deposition chamber 417 was adjusted to 1.1 Torr. The RF power supply 422 was set so that the electric power was 0.04 W/cm$^3$, introducing RF electrical power to the plasma excitation cup 420, causing a glow discharge to occur, and thus deposition of the RF n-layer 203 was started upon the RF p-layer 105. When the thickness of the deposited RF n-layer 203 had reached 10 nm, the RF power was shut off thereby eliminating the glow discharge. Thus, the deposition of the RF n-layer 203 was complete. The supply of $SiH_4$ gas and $PF_3/H_2$ gas into the deposition chamber 417 was stopped, whereas $H_2$ was fed further for 2 min. into the deposition chamber 417. Then, $H_2$ was also shut off, and the inside of the deposition chamber 417 as well as the inside of the gas lines was evacuated down to $1\times10^{-5}$ Torr.

Next, an n/i buffer layer 251 comprised of a-SiC was formed by means of RFPCVD method. First, the inside of the transfer chamber 403 and the i-layer deposition chamber 418 was evacuated with the vacuum pump (not shown), to which the substrate 490 was transferred by means of opening the gate valve 407. The substrate 490 was heated by means of applying the back side thereof to the substrate heater 411, and the inside of the i-layer deposition chamber 418 was evacuated with the vacuum pump (not shown) down to a pressure of about $1\times10^{-5}$ Torr.

In order to form the n/i buffer layer 251, the substrate 490 was heated by setting the substrate heater 411 to 250° C. When the temperature of the substrate was sufficient, $Si_2H_6$ gas, $H_2$ gas and $CH_4$ gas was introduced into the i-layer deposition chamber 418 via gas inlet 449, by means of slowly opening valves 464, 454, 450, 463, 453, 465, and 455. At this time, the flow rates of the $Si_2H_6$ gas, $H_2$ gas and $CH_4$ gas were adjusted to 0.4 sccm, 90 sccm, and 0.2 sccm respectively, by means of mass flow controllers 459, 458, and 460.

The pressure inside the i-layer deposition chamber 418 was adjusted to 1.0 Torr by means of a conductance valve (not shown). Next, the RF power supply 424 was set so that the electric power was 0.06 W/cm$^3$, applied to a bias rod 428, causing a glow discharge to occur, and formation of the n/i buffer layer 251 upon the RF n-layer 203 was started by means of opening the shutter 427. When the thickness of the deposited n/i buffer layer 251 had reached 10 nm, the RF glow discharge was terminated, and the output of the RF power source 424 was shut off. Thus, the formation of the n/i buffer layer 251 was complete. The supply of $Si_2H_6$ gas and $CH_4$ gas into the i-layer chamber 418 was stopped, whereas $H_2$ was fed further for 2 min. into the i-layer deposition chamber 418. Then, valves 453 and 450 were closed, and the inside of the i-layer deposition chamber 418 as well as the inside of the gas lines was evacuated down to $1\times10^{-5}$ Torr.

Next, an RF i-layer 214 comprised of a-Si was formed by means of RFPCVD method. In order to form the RF i-layer 214, the substrate 490 was heated by setting the substrate heater 411 to 200° C. When the temperature of the substrate was sufficient, $Si_2H_6$ gas and $H_2$ gas was introduced into the i-layer deposition chamber 418 via gas inlet 449, by means of slowly opening valves 464, 454, 450, 463, and 453. At this time, the flow rates of the $Si_2H_6$ gas, and $H_2$ gas were adjusted to 2 sccm and 85 sccm respectively, by means of mass flow controllers 459 and 458. The pressure inside the i-layer deposition chamber 418 was adjusted to 0.5 Torr by means of a conductance valve (not shown). Next, the RF power supply 424 was set so that the electric power was 0.07 W/cm$^3$, applied to a bias rod 428, causing a glow discharge to occur, and formation of the RF i-layer 214 upon the n/i buffer layer 251 was started, by means of opening the shutter 427. When the thickness of the deposited RF i-layer 214 had reached 110 nm, the RF glow discharge was terminated, and the output of the RF power source 424 was shut off. Thus, the formation of the RF i-layer 214 was complete. The supply of $Si_2H_6$ gas into the i-layer chamber 418 was stopped by means of closing the valves 464 and 454, whereas $H_2$ was fed further for 2 min. into the i-layer deposition chamber 418. Then, valves 453 and 450 were closed, and the inside of the i-layer deposition chamber 418 as well as the inside of the gas lines was evacuated down to $1\times10^{-5}$ Torr.

Next, a p/i buffer layer 261 comprised of a-Sic was formed by means of RFPCVD method. In order to form the p/i buffer layer 261, the substrate 490 was heated by setting the substrate heater 411 to 200° C. When the temperature of the substrate was sufficient, $Si_2H_6$ gas, $H_2$ gas and $CH_4$ gas was introduced into the i-layer deposition chamber 418 via gas inlet 449, by means of slowly opening valves 464, 454, 450, 463, 453, 465, and 455. At this time, the flow rates of the $Si_2H_6$ gas, $H_2$ gas and $CH_4$ gas were adjusted to 0.4 sccm, 65 sccm, and 0.3 sccm respectively, by means of mass flow controllers 459, 458, and 460. The pressure inside the i-layer deposition chamber 418 was adjusted to 1.1 Torr by means of a conductance valve (not shown). Next, the RF power supply 424 was set so that the electric power was 0.06 W/cm$^3$, applied to a bias rod 428, causing a glow discharge to occur, and formation of the p/i buffer layer 261 upon the RF i-layer 214 was started by means of opening the shutter 427. When the thickness of the deposited p/i buffer layer 261 had reached 15 nm, the RF glow discharge was terminated, and the output of the RF power source 424 was shut off. Thus, the formation of the p/i buffer layer 261 was complete. The supply of $Si_2H_6$ gas and $CH_4$ gas into the i-layer chamber 418 was stopped by means of closing the valves 464, 454, 465, and 455, whereas $H_2$ was fed further for 2 min. into the i-layer deposition chamber 418. Then, valves 453 and 450 were closed, and the inside of the i-layer deposition chamber 418 as well as the inside of the gas lines was evacuated down to $1\times10^{-5}$ Torr.

Next, in order to form an RF p-layer 205 comprised of a-SiC, the substrate 490 was transferred to the p-layer deposition chamber 419 via the transfer chamber 404 by means of opening the gate valve 408 thereto, wherein both deposition chamber 419 and transfer chamber 404 had already been evacuated with a vacuum pump (not shown). The substrate 490 was placed such that the back surface of the substrate 490 came into contact with the heater 412 so that the substrate 490 was heated. The inside of the p-layer deposition chamber 419 was evacuated with the vacuum pump (not shown) down to a pressure of about $1\times10^{-5}$ Torr.

The substrate 490 was heated by setting the substrate heater 412 to 170° C. When the temperature of the substrate had become stable, $H_2$ gas, $SiH_4/H_2$ gas, $BF_3/H_2$ (diluted to 1%) gas, and $CH_4$ gas was introduced into the deposition chamber 419 via gas inlet 469, by means of operating valves 481, 471, 470, 482, 472, 483, 473, 484, and 474. At this time, the flow rates of the $H_2$ gas, $SiH_4/H_2$ gas, $BF_3/H_2$ (diluted to 1%) gas, and $CH_4$ gas were adjusted to 70 sccm, 0.4 sccm, 1 sccm, and 0.3 sccm respectively, by means of mass flow controllers 476, 477, 478, and 479. Furthermore, the pressure inside the deposition chamber 419 was adjusted to 1.7 Torr by means of a conductance valve (not shown). The RF power supply 423 was set so that the electric power was 0.07 W/cm$^3$, RF power supply was introduced to the plasma excitation cup 421, causing a glow discharge to occur, and thus formation of the RF p-layer 205 was started upon the p/i buffer layer 261. When the thickness of the deposited RF p-layer 205 had reached 10 nm, the RF power was shut off thereby eliminating the glow discharge. Thus, the formation of the RF p-layer 205 was complete. The supply of $SiH_4/H_2$ gas, $BF_3/H_2$ gas, and $CH_4$ gas into the chamber 419 was stopped by means of closing the valves 472, 482, 473, 483, 474, and 484, whereas $H_2$ was fed further for 2 min. into the p-layer deposition chamber 419. Then, $H_2$ was also shut off by means of closing the valves 471, 481, and 470, and the inside of the p-layer deposition chamber 419 as well as the inside of the gas lines was evacuated down to $1\times10^{-5}$ Torr.

The gate valve 409 was then opened, and the substrate 490 was transferred to the unload chamber 405 which had already been evacuated with a vacuum pump (not shown). Then, a leak valve (not shown) was opened so that the inside of the unload chamber 405 was exposed to the ambient atmosphere.

Next, ITO was then evaporated onto the RF p-layer 205 so as to form a transparent conductive layer 112 having a thickness of 70 nm.

A mask having a comb-shaped window was placed on the transparent conductive layer 112, and metal evaporation was performed via the mask thereby forming a comb-shaped collection electrode 113 having a multi-layer structure consisting of Cr(40 nm)/Ag(1000 nm)/Cr(40 nm).

In this way, a complete solar cell according to the invention was obtained. Hereafter, the solar cell of this type will be referred to as SC-EMB-J2. Tables J2(1) and J2(2) summarize the conditions used here in the invention, regarding the plasma treatment in an ambient of hydrogen containing a small amount of Group III element, as well as the process conditions for the RF n-layer, n/i buffer layer, MW i-layer, p/i buffer layer, RF p-layer, RF n-layer, n/i buffer layer, RF i-layer, p/i buffer layer, and RF p-layer.

COMPARATIVE EXAMPLE J2

A solar cell (SC-CMP-J2) was also fabricated in the same manner as in the above-described example J2 except that the plasma treatment with hydrogen gas containing a small amount of Group III element according to the invention was not performed.

Nine samples were prepared for each type (SC-EMB-J2 and SC-CMP-J2) for the purpose of evaluation regarding the initial photoelectric efficiency (the ratio of the electric output power to the optical input power), vibration durability, optical durability, and vibration durability and optical durability under a biased condition at a high temperature and high humidity.

The measurement of the initial photoelectric conversion efficiency was performed by measuring the V-I characteristics of the samples under the illumination condition of AM 1.5 (100 mW/cm$^2$). The measurement revealed that the fill factor (F.F.) of the initial photoelectric conversion efficiencies, series resistance (Rs), and variation of properties of the SC-EMB-J2 samples as compared to the SC-CMP-J2 samples were as shown below:

| | Fill factor | Series resistance | variation of properties |
|---|---|---|---|
| (SC-EMB-J2) | 1.16 times | 0.89 times | 0.82 times |

The evaluation of the vibration durability was performed as follows: After the measurement of the initial photoelectric conversion efficiency, some solar cells were placed in a dark place kept at 28° C. and 55% relative humidity. Vibration having an amplitude of 0.1 mm and a frequency of 60 Hz was applied to the samples for 550 hr. Subsequently, the photoelectric conversion efficiencies of the samples were measured under the illumination conditions of AM 1.5 (100 mW/cm$^2$) and the reduction relative to the initial value (the ratio of the photoelectric conversion efficiency after the vibration test to the initial value) was evaluated.

The evaluation of the optical durability was performed as follows: After the measurement of the initial photoelectric conversion efficiency, some solar cells were placed in an environment of 28° C. and 55% relative humidity. Light of AM 1.5 (100 mW/cm$^2$) was applied to the samples for 500 hr. Subsequently, the photoelectric conversion efficiencies of the samples were measured under the illumination conditions of AM 1.5 (100 mW/cm$^2$) and the reduction relative to the initial value (the ratio of the photoelectric conversion efficiency after the optical deterioration test to the initial value) was evaluated. The results of the measurement of (SC-EMB-J2) as compared to (SC-CMP-J2) concerning the deterioration of photoelectric conversion efficiencies following optical deterioration and the deterioration of photoelectric conversion efficiencies following vibration deterioration are as shown below:

| | Vibration durability | Optical durability |
|---|---|---|
| (SC-CMP-J2) | 0.82 times | 0.81 times |

The evaluation of the vibration durability under the biased condition at high temperature and high humidity was performed as follows: After the measurement of the initial photoelectric conversion efficiency, two solar cells were placed in a dark place kept at 82° C. and 90% relative humidity, and a forward bias voltage of 0.71 V was applied to the samples.

Vibration as described above was applied to one of the solar cells, whereupon vibration durability was measured, and light of AM 1.5 was applied to the other solar cell, whereupon optical durability was measured. The results of the measurement of (SC-EMB-J2) as compared to (SC-CMP-J2) concerning the deterioration of photoelectric conversion efficiencies following optical deterioration and the deterioration of photoelectric conversion efficiencies following vibration deterioration are as shown below:

| | Vibration durability | Optical durability |
|---|---|---|
| (SC-CMP-J2) | 0.80 times | 0.79 times |

The surfaces of the above-described samples were observed using an optical microscope to evaluate film separation. No film separation was observed in the SC-EMB-J2 samples, whereas slight film separation was observed in the SC-CMP-J2 samples.

From the above results, it can be concluded that the solar cells (SC-EMB-J2) according to the present invention are better in photoelectric conversion efficiency concerning fill factor, series resistance, uniformity, optical deterioration properties, adhesion, and overall durability than the conventional solar cells (SC-CMP-J2).

EXAMPLE J3

A triple solar cell having a structure such as that shown in FIG. 6 was made using the deposition equipment shown in FIG. 7. The substrate 490 on which the optical reflection layer 101 and the reflection enhancing layer 102 had been formed in the same manner as with Example J1 was placed on the substrate transfer rail 413 in the load chamber 401, and the load chamber 401 was evacuated with a vacuum pump (not shown) down to a pressure of about $1\times10^{-5}$ Torr.

Then, the gate valve 406 was opened, and the substrate 490 was transferred to the deposition chamber 417 via the transfer chamber 402 wherein both deposition chamber 417 and transfer chamber 402 had already been evacuated with a vacuum pump (not shown). The substrate 490 was placed such that the back surface of the substrate 490 came into contact with the heater 410 so that the substrate 490 was heated. The inside of the deposition chamber 417 was evacuated with the vacuum pump (not shown) down to a pressure of about $1\times10^{-5}$ Torr.

After the preparation for semiconductor film deposition was completed as described above, an RF n-layer 103 comprised of μc-Si, was formed in the same manner as with Example J1.

Next, the inside of the transfer chamber 403 and the deposition chamber 418 was evacuated with the vacuum pump (not shown), to which the substrate 490 was transferred by means of opening the gate valve 407. The substrate 490 was heated by means of applying the back side there of to the substrate heater 411, and the inside of the i-layer deposition chamber 418 was evacuated with the vacuum pump (not shown) down to a pressure of about $1\times10^{-5}$ Torr.

Next, an n/i buffer layer 151 comprised of a-Si, an MW i-layer 114 comprised of a-SiGe, a p/i buffer layer 161 comprised of a-Si, and an RF p-layer 105 comprised of a-SiC were sequentially formed by means of RFPCVD method and MWPCVD method, in the same manner as with Example J1.

Next, in order to conduct plasma treatment with hydrogen gas containing a small amount of Group III element according to the present invention, the substrate 490 was transferred to the deposition chamber 418, in the same manner as with Example J1.

Next, plasma treatment with hydrogen gas containing a small amount of Group III element according to the present invention was conducted according to the conditions of Table J3 (1). $B_2H_6/H_2$ (diluted to 10%) gas serving as the gas containing Group III element, $SiCl_2H_2/He$ (diluted to 1000 ppm) gas serving as the gas containing silicon atoms, and $H_2$ gas were introduced into the deposition chamber 418 via the gas inlet 429 wherein the $H_2$ gas was supplied via opened valves 463, 453, and 450, and its flow rate was adjusted to 1000 sccm by means of a mass flow controller 458. The Group III element-containing $B_2H_6/H_2$ (diluted to 10%) gas was supplied via opened valves 468 and 466 and its flow rate was controlled by a mass flow controller 467 such that the flow rate thereof was maintained at 2.2% of the total gas flow rate of $H_2$. The flow rate of the gas containing silicone was controlled by a mass flow controller 438 such that the flow rate of the $SiCl_2H_2/He$ (diluted to 1000 ppm) gas was maintained at 0.04% of the total gas flow rate of $H_2$ by means of opening valves (not shown) and adjusted by means of a mass flow controller (not shown). The pressure inside the deposition chamber 418 was adjusted to 0.008 Torr by means of a conductance valve (not shown). The substrate 490 was heated by the substrate heater 411 up to 300° C. When the temperature of the substrate had become stable, the electrical power of the MW power supply (not shown) was adjusted to 0.15 W/cm$^3$, MW electrical power was introduced into the i-layer deposition chamber 418 via the guided-wave tube 426 and micro-wave introduction window 425, causing a glow discharge to occur, and plasma processing with hydrogen gas containing a small about of Group III element according to the present invention was conducted for 4 minutes, by means of opening a shutter 427. Subsequently, MW power was then shut off, thereby eliminating the glow discharge. The supply of the $B_2H_6/H_2$ (diluted to 10%) and $SiCl_2H_4$ (diluted to 1000 ppm) gas into the deposition chamber 418 was stopped, whereas the $H_2$ gas was fed further for 4 min. into the deposition chamber 418. Then, the $H_2$ gas was also shut off, and the inside of the deposition chamber 418 as well as the inside of the gas lines was evacuated down to $1\times10^{-5}$ Torr.

Next, an RF n-layer 203 comprised of μc-Si, an n/i buffer layer 251 comprised of a-Si, an MW i-layer 214 comprised of a-SiGe, a p/i buffer layer 261 comprised of a-Si, and an RF p-layer 205 comprised of a-SiC were sequentially formed by means of RFPCVD method and MWPCVD method, in the same manner as with Example J1.

Next, plasma treatment with hydrogen gas containing a small amount of Group III element according to the present invention was conducted according to the conditions of Table J3(2). $B_2H_6/H_2$ (diluted to 10%) gas serving as the gas containing the Group III element, $SiH_4/H_2$ gas serving as the gas containing silicon atoms, and $H_2$ gas were introduced into the deposition chamber 417 via the gas inlet 429 wherein the $H_2$ gas was supplied via opened valves 441, 431, and 430, and its flow rate was adjusted to 1300 sccm by means of a mass flow controller 436. The Group III element-containing $B_2H_6$ gas was supplied via opened valves (not shown) and its flow rate was controlled by a mass flow controller (not shown) such that the flow rate of the $B_2H_6$ gas was maintained at 1.3% of the total gas flow rate of $H_2$. The flow rate of the gas containing silicone was controlled by a mass flow controller 438 such that the flow rate of the $SiH_4$ gas was maintained at 0.04% of the total gas flow rate of $H_2$ by means of opening valves 443 and 433. The pressure inside the deposition chamber 417 was adjusted to 0.7 Torr by means of a conductance valve (not shown). The substrate 490 was heated by the substrate heater 410 up to 250° C. When the temperature of the substrate had become stable, the electrical power of the RF power supply 424 was adjusted to 0.03 W/cm$^3$, RF electrical power was introduced, causing a glow discharge to occur in the plasma excitation cup 420, and plasma processing with hydrogen gas containing a small about of Group III element according to the present invention was conducted for 3 minutes. Subsequently, RF power was then shut off, thereby eliminating the glow discharge. The supply of the $B_2H_6/H_2$ (diluted to 10%) and $SiH_4$ gas into the deposition chamber 417 was stopped, whereas the $H_2$ gas was fed further for 3 min. into the deposition chamber 417. Then, the $H_2$ gas was also shut off, and the inside of the deposition chamber 417 as well as the inside of the gas lines was evacuated down to $1\times10^{-5}$ Torr.

Next, an RF n-layer 303 comprised of μc-Si, an n/i buffer layer 351 comprised of a-SiC, an RF i-layer 314 comprised of a-Si, a p/i buffer layer 361 comprised of a-SiC, and an RF p-layer 305 comprised of a-SiC were sequentially formed by means of RFPCVD method, in the same manner as with the surface side pin structure of Example J1.

Next, ITO was then evaporated onto the RF p-layer 305 so as to form a transparent conductive layer 112 having a thickness of 70 nm.

A mask having a comb-shaped window was placed on the transparent conductive layer 112, and metal evaporation was performed via the mask thereby forming a comb-shaped collection electrode 113 having a multi-layer structure consisting of Cr(40 nm)/Ag(1000 nm)/Cr(40 nm).

In this way, a complete solar cell according to the invention was obtained. Hereafter, the solar cell of this type will be referred to as SC-EMB-J3. Tables J3(1) and J3(2) summarize the conditions used here in the invention, regarding the plasma treatment in an ambient of hydrogen containing a small amount of Group III element, as well as the process conditions for the RF n-layer, n/i buffer layer, MW i-layer, p/i buffer layer, RF p-layer, RF n-layer, n/i buffer layer, MW i-layer, p/i buffer layer, RF p-layer, RF n-layer, n/i buffer layer, RF i-layer, p/i buffer layer, and RF p-layer.

COMPARATIVE EXAMPLE J3

A solar cell (SC-CMP-J3) was also fabricated in the same manner as in the above-described Example J3 except that the plasma treatment with hydrogen gas containing a small amount of Group III element according to the invention was not performed. Seven samples were prepared for each type (SC-EMB-J3 and SC-CMP-J3) for the purpose of evaluation regarding the initial photoelectric efficiency (the ratio of the electric output power to the optical input power), vibration durability, optical durability, vibration durability and optical durability under a biased condition at a high temperature and high humidity, and inverse bias voltage application properties.

The measurement of the initial photoelectric conversion efficiency was performed by measuring the V-I characteristics of the samples under the illumination condition of AM 1.5 (100 mW/cm$^2$). The measurement revealed that the fill factor (F.F.) of the initial photoelectric conversion efficiencies, series resistance (Rs), and variation of properties of the SC-EMB-J3 samples as compared to the SC-CMP-J3 samples were as shown below:

| | Fill factor | Series resistance | variation of properties |
|---|---|---|---|
| (SC-EMB-J3) | 1.18 times | 0.89 times | 0.81 times |

The evaluation of the vibration durability was performed as follows: After the measurement of the initial photoelectric conversion efficiency, some solar cells were placed in a dark place kept at 27° C. and 55% relative humidity. Vibration having an amplitude of 0.1 mm and a frequency of 60 Hz was applied to the samples for 550 hr. Subsequently, the photoelectric conversion efficiencies of the samples were measured under the illumination conditions of AM 1.5 (100 $mW/cm^2$) and the reduction relative to the initial value (the ratio of the photoelectric conversion efficiency after the vibration test to the initial value) was evaluated.

The evaluation of the optical durability was performed as follows: After the measurement of the initial photoelectric conversion efficiency, some solar cells were placed in an environment of 27° C. and 55% relative humidity. Light of AM 1.5 (100 $mW/cm^2$) was applied to the samples for 550 hr. Subsequently, the photoelectric conversion efficiencies of the samples were measured under the illumination conditions of AM 1.5 (100 $mW/cm^2$) and the reduction relative to the initial value (the ratio of the photoelectric conversion efficiency after the optical deterioration test to the initial value) was evaluated. The results of the measurement of (SC-EMB-J3) as compared to (SC-CMP-J3) concerning the deterioration of photoelectric conversion efficiencies following optical deterioration and the deterioration of photoelectric conversion efficiencies following vibration deterioration are as shown below:

| | Vibration durability | Optical durability |
|---|---|---|
| (SC-CMP-J3) | 0.81 times | 0.80 times |

The evaluation of the vibration durability under the biased condition at high temperature and high humidity was performed as follows: After the measurement of the initial photoelectric conversion efficiency, two solar cells were placed in a dark place kept at 80° C. and 90% relative humidity, and a forward bias voltage of 0.71 V was applied to the samples.

Vibration as described above was applied to one of the solar cells, whereupon vibration durability was measured, and light of AM 1.5 was applied to the other solar cell, whereupon optical durability was measured.

The results of the measurement of (SC-EMB-J3) as compared to (SC-CMP-J3) concerning the deterioration of photoelectric conversion efficiencies following optical deterioration and the deterioration of photoelectric conversion efficiencies following vibration deterioration are as shown below:

| | Vibration durability | Optical durability |
|---|---|---|
| (SC-CMP-J3) | 0.81 times | 0.80 times |

The measurement of inverse bias voltage application properties was performed as follows: After the measurement of the initial photoelectric conversion efficiency, a solar cell was placed in a dark place kept at 80° C. and 53% relative humidity, and an inverse bias voltage of 5.0 V was applied to the sample for 100 hours. Subsequently, the photoelectric conversion efficiencies of the samples were measured under the illumination conditions of AM 1.5 (100 $mW/cm^2$) and the reduction relative to the initial value (the ratio of the photoelectric conversion efficiency after the inverse bias voltage application test to the initial value) was evaluated.

The results of the measurement of (SC-EMB-J3) as compared to (SC-CMP-K3) concerning the deterioration of photoelectric conversion efficiencies following inverse bias voltage application are as shown below:

| | |
|---|---|
| (SC-CMP-J3) | 0.85 times |

The surfaces of the above-described samples were observed using an optical microscope to evaluate film separation. No film separation was observed in the SC-EMB-J3 samples, whereas slight film separation was observed in the SC-CMP-J3 samples.

From the above results, it can be concluded that the solar cells (SC-EMB-J3) according to the present invention are better in photoelectric conversion efficiency concerning fill factor, series resistance, uniformity, optical deterioration properties, adhesion, overall durability, and inverse bias voltage application properties than the conventional solar cells (SC-CMP-J3).

EXAMPLE J4

A triple solar cell having a structure such as that shown in FIG. 6 was made in the same manner as with Example J3 using the deposition equipment shown in FIG. 7 in the same manner as with Example J3, by means of twice conducting plasma treatment with hydrogen gas containing a small amount of Group III element according to the present invention and according to the conditions described in Table J4 (1). The conditions of plasma treatment with hydrogen gas containing a small amount of Group III element are described in Table J4(1), and the fabrication conditions for the triple solar cell are described in Table J4 (2).

The fabricated triple solar cell was evaluated in the same manner as with Example J3. The results thereof are described in Table J4 (3).

It has been shown that the flow amount of hydrogen for plasma treatment with hydrogen gas containing a small amount of Group III element according to the present invention is optimal when the flow amount is in the range of 1–2000 sccm, regarding photoelectric conversion efficiency concerning fill factor, uniformity, optical deterioration properties, series resistance properties, overall durability, and inverse bias voltage application properties.

EXAMPLE J5

A triple solar cell having a structure such as that shown in FIG. 6 was made in the same manner as with Example J3 using the deposition equipment shown in FIG. 3 in the same manner as with Example J3, by means of twice conducting plasma treatment with hydrogen gas containing a small amount of Group element according to the present invention and according to the conditions described in Table J5 (1). The conditions of plasma treatment with hydrogen gas containing a small amount of Group III element are described in Table J5 (1), and the fabrication conditions for the triple solar cell are described in Table J5 (2).

The fabricated triple solar call was evaluated in the same manner as with Example J3. The results thereof are described in Table J5 (5).

It has been shown that the flow amount of hydrogen for plasma treatment with hydrogen gas containing a small amount of Group III element according to the present invention is optimal when the flow amount is in the range of 1–2000 sccm, regarding photoelectric conversion efficiency concerning fill factor, uniformity, optical deterioration properties, series resistance properties, overall durability, and inverse bias voltage application properties, even when the power supplied for the plasma treatment with hydrogen gas containing a small amount of Group III element according to the present invention is changed from RF power supply as in Example J4 to VHF power supply.

EXAMPLE J6

A triple solar cell having a structure such as that shown in FIG. 6 was made in the same manner as with Example J3 using the deposition equipment shown in FIG. 7 in the same manner as with Example J3, by means of twice conducting plasma treatment with hydrogen gas containing a small amount of Group III element according to the present invention and according to the conditions described in Table J6 (1). The conditions of plasma treatment with hydrogen gas containing a small amount of Group III element are described in Table J6 (1), and the fabrication conditions for the triple solar cell are described in Table J6 (2).

The fabricated triple solar cell was evaluated in the same manner as with Example J3. The results thereof are described in Table J6 (3).

It has been shown that the amount of gas containing Group III element added to the hydrogen for plasma treatment with hydrogen gas containing a small amount of Group III element according to the present invention is optimal when the added amount is in the range of 0.05–3%, regarding photoelectric conversion efficiency concerning fill factor, uniformity, optical deterioration properties, series resistance properties, overall durability, and inverse bias voltage application properties.

EXAMPLE J7

A triple solar cell having a structure such as that shown in FIG. 6 was made in the same manner as with Example J3 using the deposition equipment shown in FIG. 7 in the same manner as with Example J3, by means of twice conducting plasma treatment with hydrogen gas containing a small amount of Group III element according to the present invention and according to the conditions described in Table J7 (1). The conditions of plasma treatment with hydrogen gas containing a small amount of Group III element are described in Table J7 (1), and the fabrication conditions for the triple solar cell are described in Table J7 (2).

The fabricated triple solar cell was evaluated in the same manner as with Example J3. The results thereof are described in Table J7 (3).

It has been shown that the amount of gas containing Group III element added to the hydrogen for plasma treatment with hydrogen gas containing a small amount of Group III element according to the present invention is optimal when the added amount is in the range of 0.05–3%, regarding photoelectric conversion efficiency concerning fill factor, uniformity, optical deterioration properties, series resistance properties, overall durability, and inverse bias voltage application properties, even when the power supplied for the plasma treatment with hydrogen gas containing a small amount of Group III element according to the present invention is changed from RF power supply as in Example J6 to VHF power supply.

EXAMPLE J8

A triple solar cell having a structure such as that shown in FIG. 6 was made in the same manner as with Example J3 using the deposition equipment shown in FIG. 7 in the same manner as with Example J3, by means of twice conducting plasma treatment with hydrogen gas containing a small amount of Group III element according to the present invention and according to the conditions described in Table J8 (1). The conditions of plasma treatment with hydrogen gas containing a small amount of Group III element are described in Table J8 (1), and the fabrication conditions for the triple solar cell are described in Table J8 (2).

The fabricated triple solar cell was evaluated in the same manner as with Example J3. The results thereof are described in Table J8 (3).

It has been shown that the amount of gas containing Group III element added to the hydrogen for plasma treatment with hydrogen gas containing a small amount of Group III element according to the present invention is optimal when the added amount is in the range of 0.05–3%, regarding photoelectric conversion efficiency concerning fill factor, uniformity, optical deterioration properties, series resistance properties, overall durability, and inverse bias voltage application properties, even when the power supplied for the plasma treatment with hydrogen gas containing a small amount of Group III element according to the present invention is changed from RF power supply as in Example J6 to MW power supply.

EXAMPLE J9

A triple solar cell having a structure such as that shown in FIG. 6 was made in the same manner as with Example J3 using the deposition equipment shown in FIG. 7 in the same manner as with Example J3, by means of twice conducting plasma treatment with hydrogen gas containing a small amount of Group III element according to the present invention and according to the conditions described in Table J9 (1). The conditions of plasma treatment with hydrogen gas containing a small amount of Group III element are described in Table J9 (1), and the fabrication conditions for the triple solar cell are described in Table J9 (2).

The fabricated triple solar cell was evaluated in the same manner as with Example J3. The results thereof are described in Table J9 (3).

It has been shown that the amount of gas containing silicone atoms added to the hydrogen for plasma treatment with hydrogen gas containing a small amount of Group III element according to the present invention is optimal when the added amount is in the range of 0.001–0.1%, regarding photoelectric conversion efficiency concerning fill factor, uniformity, optical deterioration properties, series resistance properties, overall durability, and inverse bias voltage application properties.

EXAMPLE J10

A triple solar cell having a structure such as that shown in FIG. 6 was made in the same manner as with Example J3 using the deposition equipment shown in FIG. 7 in the same manner as with Example J3, by means of twice conducting plasma treatment with hydrogen gas containing a small amount of Group III element according to the present invention and according to the conditions described in Table J10 (1). The conditions of plasma treatment with hydrogen gas containing a small amount of Group III element are described in Table J10 (1), and the fabrication conditions for the triple solar cell are described in Table J10 (2).

The fabricated triple solar cell was evaluated in the same manner as with Example J3. The results thereof are described in Table J10 (3).

It has been shown that the amount of gas containing silicone atoms added to the hydrogen for plasma treatment with hydrogen gas containing a small amount of Group III element according to the present invention is optimal when the added amount is in the range of 0.001–0.1%, regarding photoelectric conversion efficiency concerning fill factor, uniformity, optical deterioration properties, series resistance properties, overall durability, and inverse bias voltage application properties, even when the power supplied for the plasma treatment with hydrogen gas containing a small amount of Group III element according to the present invention is changed from RF power supply as in Example J9 to VHF power supply.

EXAMPLE J11

A triple solar cell having a structure such as that shown in FIG. 2 was made in the same manner as with Example J3 using the deposition equipment shown in FIG. 7 in the same manner as with Example J3, by means of twice conducting plasma treatment with hydrogen gas containing a small amount of Group III element according to the present invention and according to the conditions described in Table J11 (1). The conditions of plasma treatment with hydrogen gas containing a small amount of Group III element are described in Table J11 (1), and the fabrication conditions for the triple solar cell are described in Table J11 (2).

The fabricated triple solar cell was evaluated in the same manner as with Example J3. The results thereof are described in Table J11 (3).

It has been shown that the amount of gas containing silicone atoms added to the hydrogen for plasma treatment with hydrogen gas containing a small amount of Group III element according to the present invention is optimal when the added amount is in the range of 0.001–0.1%, regarding photoelectric conversion efficiency concerning fill factor, uniformity, optical deterioration properties, series resistance properties, overall durability, and inverse bias voltage application properties, even when the power supplied for the plasma treatment with hydrogen gas containing a small amount of Group III element according to the present invention is changed from RF power supply as in Example J9 to MW power supply.

EXAMPLE J12

A triple solar cell having a structure such as that shown in FIG. 6 was made in the same manner as with Example J3 using the deposition equipment shown in FIG. 7 in the same manner as with Example J3, by means of twice conducting plasma treatment with hydrogen gas containing a small amount of Group III element according to the present invention and according to the conditions described in Table J12 (1). The conditions of plasma treatment with hydrogen gas containing a small amount of Group III element are described in Table J12 (1), and the fabrication conditions for the triple solar cell are described in Table J12 (2).

The fabricated triple solar cell was evaluated in the same manner as with Example J3. The results thereof are described in Table J12 (3).

It has been shown that the pressure applied for plasma treatment with hydrogen gas containing a small amount of Group III element according to the present invention is optimal when the pressure is in the range of 0.05 Torr to 10 Torr, regarding photoelectric conversion efficiency concerning fill factor, uniformity, optical deterioration properties, series resistance properties, overall durability, and inverse bias voltage application properties, in the event that RF power source is used for the electrical power charge.

EXAMPLE J13

A triple solar cell having a structure such as that shown in FIG. 2 was made in the same manner as with Example J3 using the deposition equipment shown in FIG. 7 in the same manner as with Example J3, by means of twice conducting plasma treatment with hydrogen gas containing a small amount of Group III element according to the present invention and according to the conditions described in Table J13 (1). The conditions of plasma treatment with hydrogen gas containing a small amount of Group III element are described in Table J13 (1), and the fabrication conditions for the triple solar cell are described in Table J13 (2).

The fabricated triple solar cell was evaluated in the same manner as with Example J3. The results thereof are described in Table J13 (3).

It has been shown that the pressure applied for plasma treatment with hydrogen gas containing a small amount of Group III element according to the present invention is optimal when the pressure is in the range of 0.0001 Torr to 1 Torr, regarding photoelectric conversion efficiency concerning fill factor, uniformity, optical deterioration properties, series resistance properties, overall durability, and inverse bias voltage application properties, in the event that VHF power source is used for the electrical power charge.

EXAMPLE J14

A triple solar cell having a structure such as that shown in FIG. 2 was made in the same manner as with Example J3 using the deposition equipment shown in FIG. 7 in the same manner as with Example J3, by means of twice conducting plasma treatment with hydrogen gas containing a small amount of Group III element according to the present invention and according to the conditions described in Table J14 (1). The conditions of plasma treatment with hydrogen gas containing a small amount of Group III element are described in Table J14 (1), and the fabrication conditions for the triple solar cell are described in Table J14 (2).

The fabricated triple solar cell was evaluated in the same manner as with Example J3. The results thereof are described in Table J14 (3).

It has been shown that the pressure applied for plasma treatment with hydrogen gas containing a small amount of Group III element according to the present invention is optimal when the pressure is in the range of 0.0001 Torr to 0.01 Torr, regarding photoelectric conversion efficiency concerning fill factor, uniformity, optical deterioration properties, series resistance properties, overall durability, and inverse bias voltage application properties, in the event that MW power source is used for the electrical power charge.

EXAMPLE J15

A triple solar cell having a structure such as that shown in FIG. 6 was made in the same manner as with Example J3 using the deposition equipment shown in FIG. 7 in the same manner as with Example J3, by means of twice conducting plasma treatment with hydrogen gas containing a small amount of Group III element according to the present invention and according to the conditions described in Table J15 (1). The conditions of plasma treatment with hydrogen gas containing a small amount of Group III element are described in Table J15 (1), and the fabrication conditions for the triple solar cell are described in Table J15 (2).

The fabricated triple solar cell was evaluated in the same manner as with Example J3. The results thereof are described in Table J15 (3).

It has been shown that the charge power density (electrical power) for plasma treatment with hydrogen gas containing a small amount of Group III element according to the present invention is optimal when in the range of 0.01 $W/cm^3$ to 1.0

$W/cm^3$, regarding photoelectric conversion efficiency concerning fill factor, uniformity, optical deterioration properties, series resistance properties, overall durability, and inverse bias voltage application properties, in the event that RF power source is used for the electrical power charge.

EXAMPLE J16

A triple solar cell having a structure such as that shown in FIG. 6 was made in the same manner as with Example J3 using the deposition equipment shown in FIG. 7 in the same manner as with Example J3, by means of twice conducting plasma treatment with hydrogen gas containing a small amount of Group III element according to the present invention and according to the conditions described in Table J16 (1). The conditions of plasma treatment with hydrogen gas containing a small amount of Group III element are described in Table J16 (1), and the fabrication conditions for the triple solar cell are described in Table J16 (2).

The fabricated triple solar cell was evaluated in the same manner as with Example J3. The results thereof are described in Table J16 (3).

It has been shown that the charge power density (electrical power) for plasma treatment with hydrogen gas containing a small amount of Group III element according to the present invention is optimal when in the range of 0.01 $W/cm^3$ to 1.0 $W/cm^3$, regarding photoelectric conversion efficiency concerning fill factor, uniformity, optical deterioration properties, series resistance properties, overall durability, and inverse bias voltage application properties, in the event that VHF power source is used for the electrical power charge.

EXAMPLE J17

A triple solar cell having a structure such as that shown in FIG. 6 was made in the same manner as with Example J3 using the deposition equipment shown in FIG. 7 in the same manner as with Example J3, by means of twice conducting plasma treatment with hydrogen gas containing a small amount of Group III element according to the present invention and according to the conditions described in Table J17 (1). The conditions of plasma treatment with hydrogen gas containing a small amount of Group III element are described in Table J17 (1), and the fabrication conditions for the triple solar cell are described in Table J17 (2).

The fabricated triple solar cell was evaluated in the same manner as with Example J3. The results thereof are described in Table J17 (3).

It has been shown that the charge power density (electrical power) for plasma treatment with hydrogen gas containing a small amount of Group III element according to the present invention is optimal when in the range of 0.1 $W/cm^3$ to 10 $W/cm^3$, regarding photoelectric conversion efficiency concerning fill factor, uniformity, optical deterioration properties, series resistance properties, overall durability, and inverse bias voltage application properties, in the event that MW power source is used for the electrical power charge.

EXAMPLE J18

A triple solar cell having a structure such as that shown in FIG. 6 was made in the same manner as with Example J3 using the deposition equipment shown in FIG. 7 in the same manner as with Example J3, by means of twice conducting plasma treatment with hydrogen gas containing a small amount of Group III element according to the present invention and according to the conditions described in Table J18 (1). The conditions of plasma treatment with hydrogen gas containing a small amount of Group III element are described in Table J18 (1), and the fabrication conditions for the triple solar cell are described in Table J18 (2).

The fabricated triple solar cell was evaluated in the same manner as with Example J3. The results thereof are described in Table J18 (3).

It has been shown that the substrate temperature for plasma treatment with hydrogen gas containing a small amount of Group III element according to the present invention is optimal when the temperature is in the range of 100° C. to 400° C., regarding photoelectric conversion efficiency concerning fill factor, uniformity, optical deterioration properties, series resistance properties, overall durability, and inverse bias voltage application properties, in the event that RF power source is used for the electrical power charge.

EXAMPLE J19

A triple solar cell having a structure such as that shown in FIG. 2 was made in the same manner as with Example J3 using the deposition equipment shown in FIG. 7 in the same manner as with Example J3, by means of twice conducting plasma treatment with hydrogen gas containing a small amount of Group III element according to the present invention and according to the conditions described in Table J19 (1). The conditions of plasma treatment with hydrogen gas containing a small amount of Group III element are described in Table J19 (1), and the fabrication conditions for the triple solar cell are described in Table J19 (2).

The fabricated triple solar cell was evaluated in the same manner as with Example J3. The results thereof are described in Table J19 (3).

It has been shown that the substrate temperature for plasma treatment with hydrogen gas containing a small amount of Group III element according to the present invention is optimal when the temperature is in the range of 50° C. to 300° C., regarding photoelectric conversion efficiency concerning fill factor, uniformity, optical deterioration properties, series resistance properties, overall durability, and inverse bias voltage application properties, in the event that VHF power source is used for the electrical power charge.

EXAMPLE J20

A triple solar cell having a structure such as that shown in FIG. 2 was made in the same manner as with Example J3 using the deposition equipment shown in FIG. 7 in the same manner as with Example J3, by means of twice conducting plasma treatment with hydrogen gas containing a small amount of Group III element according to the present invention and according to the conditions described in Table J20 (1). The conditions of plasma treatment with hydrogen gas containing a small amount of Group III element are described in Table J20 (1), and the fabrication conditions for the triple solar cell are described in Table J20 (2).

The fabricated triple solar cell was evaluated in the same manner as with Example J3. The results thereof are described in Table J20 (3).

It has been shown that the substrate temperature for plasma treatment with hydrogen gas containing a small amount of Group III element according to the present invention is optimal when the temperature is in the range of 50° C. to 300° C., regarding photoelectric conversion efficiency concerning fill factor, uniformity, optical deterioration properties, series resistance properties, overall durability, and inverse bias voltage application properties, in the event that MW power source is used for the electrical power charge.

EXAMPLE J21

A triple solar cell having a structure such as that shown in FIG. 6 was made using the deposition equipment shown in FIG. 7.

The substrate 490 on which the optical reflection layer 101 and the reflection enhancing layer 102 had been formed in the same manner as with Example J1 was placed on the substrate transfer rail 413 in the load chamber 401, and the load chamber 401 was evacuated with a vacuum pump (not shown) down to a pressure of about $1\times10^{-5}$ Torr.

Then, the gate valve 406 was opened, and the substrate 490 was transferred to the deposition chamber 417 via the transfer chamber 402 wherein both deposition chamber 417 and transfer chamber 402 had already been evacuated with a vacuum pump (not shown). The substrate 490 was placed such that the back surface of the substrate 490 came into contact with the heater 410 so that the substrate 490 was heated. The inside of the deposition chamber 417 was evacuated with the vacuum pump (not shown) down to a pressure of about $1\times10^{-5}$ Torr.

Next, plasma treatment with hydrogen gas containing a small amount of silage was conducted according to the conditions described in Table J21 (1). In order to conduct plasma treatment with hydrogen gas containing a small amount of silane, $SiH_4/H_2$ (diluted to 1000 ppm) gas serving as the gas containing silicon atoms, and $H_2$ gas were introduced into the deposition chamber 417 via the gas inlet 429 wherein the $H_2$ gas was supplied via opened valves 441, 431, and 430, and its flow rate was adjusted to 1150 sccm by means of a mass flow controller 436. The gas containing silicone atoms was supplied via opened valves 442 and 432 and its flow rate was controlled by a mass flow controller 437 such that the flow rate of the $SiH_4$ gas was maintained at 0.03% of the total gas flow rate of $H_2$. The pressure inside the deposition chamber 417 was adjusted to 0.8 Torr by means of a conductance valve (not shown). The substrate 490 was heated by the substrate heater 410 up to 360° C. When the temperature of the substrate had become stable, the electrical power of the RF power supply 422 was adjusted to 0.04 W/cm$^3$, RF electrical power was introduced, causing a glow discharge to occur within the plasma excitation cup 420, and plasma processing with hydrogen gas containing a small about of silane was conducted for 3 minutes. Subsequently, RF power was then shut off, thereby eliminating the glow discharge. The supply of the $SiH_4/H_2$ (diluted to 1000 ppm) gas into the deposition chamber 417 was stopped, whereas the $H_2$ gas was fed further for 5 min. into the deposition chamber 417. Then, the $H_2$ gas was also shut off, and the inside of the deposition chamber 417 as well as the inside of the gas lines was evacuated down to $1\times10^{-5}$ Torr.

After the preparation for semiconductor film deposition was completed as described above, an RF n-layer 103 comprised of μc-Si was formed, according to the manner of manufacturing of the lower side pin structure of Example J2.

Next, plasma processing with hydrogen gas containing a small about of silane was conducted under the conditions described in Table J21 (2).

Next, an n/i buffer layer 151 comprised of a-SiC was made by means of RFPCVD method, according to the manner of Example J2.

Next, plasma processing with hydrogen gas containing a small about of silane was conducted under the conditions described in Table J21 (3).

Next, an MW i-layer 114 comprised of a-SiC was made by means of MWPCVD method, according to the manner of Example J2.

Next, plasma processing with hydrogen gas containing a small about of silane was conducted under the conditions described in Table J21 (4).

Next, a p/i buffer layer 161 comprised of a-SiC was made by means of RFPCVD method, according to the manner of Example J2.

Next, plasma processing with hydrogen gas containing a small about of silane was conducted under the conditions described in Table J21 (5).

Next, an RF p-layer 105 comprised of a-SiC was made by means of RFPCVD method, according to the manner of Example J2.

Next, plasma processing with hydrogen gas containing a small about of Group III element according to the invention was conducted under the conditions described in Table J21 (6).

Next, an RF n-layer 203 comprised of μc-Si was made by means of RFPCVD method, according to the manner of Example J2.

Next, plasma processing with hydrogen gas containing a small about of silane was conducted under the conditions described in Table J21 (7).

Next, an n/i buffer layer 251 comprised of a-SiC was made by means of RFPCVD method, according to the manner of Example J2.

Next, plasma processing with hydrogen gas containing a small about of silane was conducted under the conditions described in Table J21 (8).

Next, an MW i-layer 214 comprised of a-SiGe was made by means of MWPCVD method, according to the manner of Example J2.

Next, plasma processing with hydrogen gas containing a small about of silane was conducted under the conditions described in Table J21 (9).

Next, a p/i buffer layer 261 comprised of a-SiC was made by means of RFPCVD method, according to the manner of Example J2.

Next, plasma processing with hydrogen gas containing a small about of silane was conducted under the conditions described in Table J21 (10).

Next, an RF p-layer 205 comprised of a-SiC was made by means of MWPCVD method, according to the manner of Example J2.

Next, plasma processing with hydrogen gas containing a small about of Group III element according the invention was conducted under the conditions described in Table J21 (11).

Next, an RF n-layer 303 comprised of μc-Si was made by means of RFPCVD method, according to the manner of manufacturing of the lower side pin structure of Example J2.

Next, plasma processing with hydrogen gas containing a small about of silane was conducted under the conditions described in Table J21 (12).

Next, an n/i buffer layer 351 comprised of a-SiC was made by means of RFPCVD method, according to the manner of Example J2.

Next, plasma processing with hydrogen gas containing a small about of silane was conducted under the conditions described in Table J21 (13).

Next, an RF i-layer 314 comprised of a-Si was made by means of RFPCVD method, according to the manner of Example J2.

Next, plasma processing with hydrogen gas containing a small about of silane was conducted under the conditions described in Table J21 (14).

Next, a p/i buffer layer 361 comprised of a-SiC was made by means of RFPCVD method, according to the manner of Example J2.

Next, plasma processing with hydrogen gas containing a small about of silane was conducted under the conditions described in Table J21 (15).

Next, an RF i-layer 305 comprised of a-SiC was made by means of RFPCVD method, according to the manner of Example J2.

Next, ITO was then evaporated onto the RF p-layer 305 so as to form a transparent conductive layer 112 having a thickness of 70 nm.

A mask having a comb-shaped window was placed on the transparent conductive layer 112, and metal evaporation was performed via the mask thereby forming a comb-shaped collection electrode 113 having a multi-layer structure consisting of Cr(40 nm)/Ag(1000 nm)/Cr(40 nm).

In this way, a complete solar cell according to the invention was obtained. Hereafter, the solar cell of this type will be referred to as SC-EMB-J21. Tables 21(1) through 21(16) summarize the conditions used here in the invention, regarding the plasma treatment in an ambient of hydrogen containing a small amount of Group III element and plasma treatment in an ambient of hydrogen containing a small amount of silane gas, as well as the process conditions for the RF n-layer, n/i buffer layer, MW i-layer, p/i buffer layer, RF p-layer, RF n-layer, n/i buffer layer, MW i-layer, p/i buffer layer, RF p-layer, RF n-layer, n/i buffer layer, RF i-layer, p/i buffer layer, and RF p-layer.

COMPARATIVE EXAMPLE J21

A solar cell (SC-CMP-J3) was fabricated in the same manner as in the above-described Example J21 except that the plasma treatment with hydrogen gas containing a small amount of Group III element and plasma treatment with hydrogen gas containing a small amount of silane gas according to the invention was not performed.

Eight samples were prepared for each type (SC-EMB-J21 and SC-CMP-J21) for the purpose of evaluation regarding the initial photoelectric efficiency (the ratio of the electric output power to the optical input power), vibration durability, optical durability, vibration durability and optical durability under a biased condition at a high temperature and high humidity, and inverse bias voltage application properties.

The measurement of the initial photoelectric conversion efficiency was performed by measuring the V-I characteristics of the samples under the illumination condition of AM 1.5 (100 mW/cm$^2$). The measurement revealed that the fill factor (F.F.) of the initial photoelectric conversion efficiencies, series resistance (Rs), and variation of properties of the SC-EMB-J21 samples as compared to the SC-CMP-J21 samples were as shown below:

| | Fill factor | Series resistance | variation of properties |
|---|---|---|---|
| (SC-CMP-J21) | 1.19 times | 0.86 times | 0.80 times |

The evaluation of the vibration durability was performed as follows: After the measurement of the initial photoelectric conversion efficiency, some solar cells were placed in a dark place kept at 26° C. and 57% relative humidity. Vibration having an amplitude of 0.1 mm and a frequency of 60 Hz was applied to the samples for 550 hr. Subsequently, the photoelectric conversion efficiencies of the samples were measured under the illumination conditions of AM 1.5 (100 mW/cm$^2$) and the reduction relative to the initial value (the ratio of the photoelectric conversion efficiency after the vibration test to the initial value) was evaluated.

The evaluation of the optical durability was performed as follows: After the measurement of the initial photoelectric conversion efficiency, some solar cells were placed in an environment of 26° C. and 57% relative humidity. Light of AM 1.5 (100 mW/cm$^2$) was applied to the samples for 550 hr. Subsequently, the photoelectric conversion efficiencies of the samples were measured under the illumination conditions of AM 1.5 (100 mW/cm$^2$) and the reduction relative to the initial value (the ratio of the photoelectric conversion efficiency after the optical deterioration test to the initial value) was evaluated. The results of the measurement of (SC-EMB-J21) as compared to (SC-CMP-J21) concerning the deterioration of photoelectric conversion efficiencies following optical deterioration and the deterioration of photoelectric conversion efficiencies following vibration deterioration are as shown below:

| | Vibration durability | Optical durability |
|---|---|---|
| (SC-CMP-J21) | 0.83 times | 0.80 times |

The evaluation of the vibration durability under the biased condition at high temperature and high humidity was performed as follows: After the measurement of the initial photoelectric conversion efficiency, two solar cells were placed in a dark place kept at 83° C. and 94% relative humidity, and a forward bias voltage of 0.71 V was applied to the samples.

Vibration as described above was applied to one of the solar cells, whereupon vibration durability was measured, and light of AM 1.5 was applied to the other solar cell, whereupon optical durability was measured.

The results of the measurement of (SC-EMB-J21) as compared to (SC-CMP-J21) concerning the deterioration of photoelectric conversion efficiencies following optical deterioration and the deterioration of photoelectric conversion efficiencies following vibration deterioration are as shown below:

| | Vibration durability | Optical durability |
|---|---|---|
| (SC-CMP-J21) | 0.81 times | 0.80 times |

The measurement of inverse bias voltage application properties was performed as follows: After the measurement of the initial photoelectric conversion efficiency, a solar cell was placed in a dark place kept at 80° C. and 52% relative humidity, and an inverse bias voltage of 5.0 V was applied to the sample for 100 hours. Subsequently, the photoelectric conversion efficiencies of the samples were measured under the illumination conditions of AM 1.5 (100 mW/cm$^2$) and the reduction relative to the initial value (the ratio of the photoelectric conversion efficiency after the inverse bias voltage application test to the initial value) was evaluated.

The results of the measurement of (SC-EMB-J21) as compared to (SC-CMP-J21) concerning the deterioration of photoelectric conversion efficiencies following inverse bias voltage application are as shown below:

| | |
|---|---|
| (SC-CMP-J21) | 0.82 times |

The surfaces of the above-described samples were observed using an optical microscope to evaluate film separation. No film separation was observed in the SC-EMB-J21 samples, whereas slight film separation was observed in the SC-CMP-J21 samples.

From the above results, it can be concluded that the solar cells (SC-EMB-J21) according to the present invention are better in photoelectric conversion efficiency concerning fill factor, series resistance properties, uniformity, optical deterioration properties, adhesion, overall durability, and inverse bias voltage application properties than the conventional solar cells (SC-CMP-J21).

In the aforementioned example, description was made concerning a solar cell wherein n-layer, n/i buffer layer, i-layer, p/i buffer layer, and p layer were sequentially deposited upon a substrate. A solar cell was also made by conducting the same manner of hydrogen plasma processing wherein p-layer, p/i buffer layer, i-layer, n/i buffer layer, and n-layer were sequentially deposited.

When evaluation thereof was made in accordance with the aforementioned example, it was found that the solar cell wherein between the p-layer and n-layer thereof was subjected to plasma treatment with hydrogen gas containing silicone atom-containing gas and Periodic Table Group III element-containing gas exhibited better properties regarding photoelectric conversion efficiency concerning fill factor, uniformity, optical deterioration properties, series resistance properties, overall durability, and inverse bias voltage application properties. It was also found that if plasma treatment is conducted near the interface of the substrate and the p-layer, the interface between the n/i buffer layer and the n-layer, the interface between the n/i buffer layer and the i-layer, the interface between the p/i buffer layer and the i-layer, and the interface between the p/i buffer layer and the p-layer, with hydrogen gas containing silicone atoms to the extent that there is no actual deposition, the aforementioned properties are even more accentuated.

TABLE A1

(1)

| | |
|---|---|
| $H_2$ GAS FLOW RATE (sccm) | 500 |
| SPECIES OF SILICON COMPOUND GAS | $SiH_4/H_2$ |
| CONCENTRATION* (%) | 0.05 |
| TYPE OF APPLIED POWER | RF |
| POWER (W/cm$^3$) | 0.03 |
| PRESSURE (Torr) | 1.0 |
| SUBSTRATE TEMPERATURE (°C.) | 350 |

*: ($SiH_4$ GAS FLOW RATE)/(TOTAL $H_2$ GAS FLOW RATE)

(2)

| SC-EMB-A1 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 2 | | | | 100 | 200 | | |
| MW i-LAYER | 50 | | | 45 | 100 | | | |
| RF p-LAYER | | | 0.3 | | 50 | | 10 | 2 |

| SC-EMB-A1 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.0 | | 0.04 | 350 | 20 |
| MW i-LAYER | 0.005 | 0.2 | 0.5 | 350 | 160 |
| RF p-LAYER | 2.0 | | 0.07 | 230 | 10 |

TABLE A2

(1)

| | |
|---|---|
| $H_2$ GAS FLOW RATE (sccm) | 800 |
| SPECIES OF SILICON COMPOUND GAS | $Si_2H_6/H_2$ |
| CONCENTRATION* (%) | 0.01 |
| TYPE OF APPLIED POWER | VHF |
| POWER (W/cm$^3$) | 0.05 |
| PRESSURE (Torr) | 0.009 |
| SUBSTRATE TEMPERATURE (°C.) | 285 |

*: ($Si_2H_6$ GAS FLOW RATE)/(TOTAL $H_2$ GAS FLOW RATE)

(2)

| SC-EMB-A2 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 2 | | | | 100 | 200 | | |
| RF i-LAYER | | 4 | | | 100 | | | |
| MW i-LAYER | 50 | | | 35 | 120 | | | |
| RF i-LAYER | | 2 | | | 80 | | | |
| RF p-LAYER | | | 0.3 | | 60 | | 10 | 2 |
| RF n-LAYER | 2 | | | | 50 | 250 | | |
| RF i-LAYER | | 2 | | | 60 | | | |
| RF p-LAYER | | | 0.3 | | 60 | | 10 | 2 |

TABLE A2-continued

| SC-EMB-A17 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.1 | | 0.04 | 380 | 20 |
| RF i-LAYER | 0.8 | | 0.08 | 350 | 10 |
| MW i-LAYER | 0.006 | 0.25 | 0.60 | 350 | 180 |
| RF i-LAYER | 0.7 | | 0.07 | 250 | 20 |
| RF p-LAYER | 2.0 | | 0.07 | 230 | 10 |
| RF n-LAYER | 1.0 | | 0.04 | 225 | 10 |
| RF i-LAYER | 0.6 | | 0.07 | 200 | 120 |
| RF p-LAYER | 2.0 | | 0.07 | 170 | 10 |

TABLE A3

(1)

| | |
|---|---|
| $H_2$ GAS FLOW RATE (sccm) | 300 |
| SPECIES OF SILICON COMPOUND GAS | $SiCl_2H_2$/He |
| CONCENTRATION* (%) | 0.05 |
| TYPE OF APPLIED POWER | MW |
| POWER (W/cm$^3$) | 0.25 |
| PRESSURE (Torr) | 0.010 |
| SUBSTRATE TEMPERATURE (°C.) | 150 |

*: ($SiCl_2H_2$ GAS FLOW RATE)/(TOTAL $H_2$ GAS FLOW RATE)

(2)

| SC-EMB-A3 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 100 | 200 | | |
| RF i-LAYER | | 4 | | | 100 | | | |
| MW i-LAYER | 50 | | | 50 | 150 | | | |
| RF i-LAYER | | 4 | | | 100 | | | |
| RF p-LAYER | | | 0.1 | | 60 | | 10 | 2 |
| RF n-LAYER | 1.1 | | | | 50 | 250 | | |
| RF i-LAYER | | 4 | | | 80 | | | |
| MW i-LAYER | 40 | | | 36 | 150 | | | |
| RF i-LAYER | | 3 | | | 80 | | | |
| RF p-LAYER | | | 0.2 | | 60 | | 10 | 2 |
| RF n-LAYER | 0.8 | | | | 50 | 250 | | |
| RF i-LAYER | | 2 | | | 70 | | | |
| RF p-LAYER | | | 0.3 | | 60 | | 10 | 2 |

| SC-EMB-A3 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| RF i-LAYER | 0.9 | | 0.08 | 300 | 10 |
| MW i-LAYER | 0.006 | 0.3 | 0.5 | 360 | 110 |
| RF i-LAYER | 0.9 | | 0.08 | 350 | 20 |
| RF p-LAYER | 1.8 | | 0.07 | 300 | 10 |
| RF n-LAYER | 1.1 | | 0.04 | 300 | 10 |
| RF i-LAYER | 0.9 | | 0.08 | 300 | 10 |
| MW i-LAYER | 0.006 | 0.25 | 0.5 | 330 | 100 |
| RF i-LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| RF i-LAYER | 0.75 | | 0.07 | 200 | 87 |
| RF p-LAYER | 1.6 | | 0.07 | 170 | 10 |

TABLE A4

(1)

| | |
|---|---|
| $H_2$ GAS FLOW RATE (sccm) | 0.1~2500 |
| SPECIES OF SILICON COMPOUND GAS | $SiH_4$ |
| CONCENTRATION* (%) | 0.05 |
| TYPE OF APPLIED POWER | RF |
| POWER ($W/cm^3$) | 0.5 |
| PRESSURE (Torr) | 1.0 |
| SUBSTRATE TEMPERATURE (°C.) | 200 |

*: (SILICON COMPOUND GAS FLOW RATE)/($H_2$ GAS FLOW RATE)

(2)

| SC-EMB-A4 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 100 | 200 | | |
| RF i-LAYER | | 4 | | | 100 | | | |
| MW i-LAYER | 50 | | | 48 | 170 | | | |
| RF i-LAYER | | 4 | | | 100 | | | |
| RF p-LAYER | | | 0.1 | | 60 | | 10 | 2 |
| RF n-LAYER | 1.1 | | | | 40 | 260 | | |
| RF i-LAYER | | 4 | | | 80 | | | |
| MW i-LAYER | 40 | | | 34 | 160 | | | |
| RF i-LAYER | | 3 | | | 80 | | | |
| RF p-LAYER | | | 0.2 | | 60 | | 10 | 2 |
| RF n-LAYER | 0.8 | | | | 50 | 250 | | |
| RF i-LAYER | | 2 | | | 70 | | | |
| RF p-LAYER | | | 0.3 | | 60 | | 10 | 2 |

| SC-EMB-A4 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| RF i-LAYER | 0.9 | | 0.08 | 300 | 10 |
| MW i-LAYER | 0.005 | 0.3 | 0.5 | 365 | 110 |
| RF i-LAYER | 0.9 | | 0.08 | 350 | 20 |
| RF p-LAYER | 1.8 | | 0.07 | 300 | 10 |
| RF n-LAYER | 1.1 | | 0.04 | 300 | 10 |
| RF i-LAYER | 0.9 | | 0.08 | 300 | 10 |
| MW i-LAYER | 0.005 | 0.25 | 0.5 | 330 | 100 |
| RF i-LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| RF i-LAYER | 0.75 | | 0.07 | 200 | 86 |
| RF p-LAYER | 1.6 | | 0.07 | 170 | 10 |

(3)

| $H_2$ GAS FLOW RATE* (sccm) | 0.1 | 0.5 | 0.8 | 1 | 10 | 100 | 1000 | 2000 | 2030 | 2100 | 2500 |
|---|---|---|---|---|---|---|---|---|---|---|---|
| UNIFORMITY IN CHARACTERISTICS | X | X | Δ | ○ | ○ | ○ | ○ | ○ | Δ | X | X |
| ADHESION | X | X | Δ | ○ | ○ | ○ | ○ | ○ | Δ | Δ | X |
| DURABILITY | X | Δ | Δ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS
*: CONTAINING OF WSILICON COMPOUND GAS

OTHER CONDITIONS

| | |
|---|---|
| SPECIES OF SILICON COMPOUND GAS: | $SiH_4$ |
| CONCENTRATION OF SILICON COMPOUND GAS (%): | 0.05 |
| APPLIED POWER: | RF |
| POWER DENSITY ($W/cm^3$): | 0.5 |
| PRESSURE (Torr): | 1.0 |
| SUBSTRATE TEMPERATURE (°C.): | 200 |

TABLE A5

(1)

| | |
|---|---|
| $H_2$ GAS FLOW RATE (sccm) | 0.1~2500 |
| SPECIES OF SILICON COMPOUND GAS | $SiH_4$ |
| CONCENTRATION* (%) | 0.08 |
| TYPE OF APPLIED POWER | VHF |
| POWER (W/cm³) | 0.2 |
| PRESSURE (Torr) | 0.002 |
| SUBSTRATE TEMPERATURE (°C.) | 150 |

*: (SILICON COMPOUND GAS FLOW RATE)/($H_2$ GAS FLOW RATE)

(2)

| SC-EMB-A5 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 100 | 200 | | |
| RF i-LAYER | | 4 | | | 100 | | | |
| MW i-LAYER | 48 | | | 48 | 170 | | | |
| RF i-LAYER | | 4 | | | 100 | | | |
| RF p-LAYER | | | 0.1 | | 60 | | 10 | 2 |
| RF n-LAYER | 1.1 | | | | 40 | 260 | | |
| RF i-LAYER | | 4 | | | 80 | | | |
| MW i-LAYER | 35 | | | 34 | 160 | | | |
| RF i-LAYER | | 3 | | | 80 | | | |
| RF p-LAYER | | | 0.2 | | 60 | | 10 | 2 |
| RF n-LAYER | 0.8 | | | | 50 | 250 | | |
| RF i-LAYER | | 2 | | | 70 | | | |
| RF p-LAYER | | | 0.4 | | 70 | | 10 | 2 |

| SC-EMB-A5 | PRESSURE Torr | MW POWER W/cm³ | RF POWER W/cm³ | SUBSTRATE TEMPERA-TURE °C. | LAYER THICKNESS nm |
|---|---|---|---|---|---|
| RF n-LAYER | 1.2 | | 0.04 | 380 | 22 |
| RF i-LAYER | 0.9 | | 0.08 | 300 | 10 |
| MW i-LAYER | 0.005 | 0.35 | 0.5 | 365 | 110 |
| RF i-LAYER | 0.9 | | 0.08 | 350 | 20 |
| RF p-LAYER | 1.8 | | 0.07 | 300 | 10 |
| RF n-LAYER | 1.1 | | 0.04 | 300 | 10 |
| RF i-LAYER | 0.9 | | 0.08 | 300 | 10 |
| MW i-LAYER | 0.005 | 0.25 | 0.6 | 330 | 100 |
| RF i-LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| RF i-LAYER | 0.75 | | 0.07 | 200 | 86 |
| RF p-LAYER | 1.6 | | 0.07 | 170 | 10 |

(3)

| $H_2$ FLOW RATE* (sccm) | 0.1 | 0.5 | 0.8 | 1 | 10 | 100 | 1000 | 2000 | 2030 | 2100 | 2500 |
|---|---|---|---|---|---|---|---|---|---|---|---|
| UNIFORMITY IN CHARACTERISTICS | X | X | Δ | ○ | ○ | ○ | ○ | ○ | Δ | X | X |
| ADHESION | X | X | Δ | ○ | ○ | ○ | ○ | ○ | Δ | X | X |
| DURABILITY | X | X | Δ | ○ | ○ | ○ | ○ | ○ | Δ | Δ | X |

○: EXCELLENT FOR PRACTICAL USE
Δ: GOOD FOR PRACTICAL USE
X: NO GOOD FOR SOME APPLICATIONS
*: CONTAINING OF SILICON COMPOUND GAS

OTHER CONDITIONS

| | |
|---|---|
| SPECIES OF SILICON COMPOUND GAS: | $SiH_4$ |
| CONCENTRATION OF SILICON COMPOUND GAS (%): | 0.05 |
| APPLIED POWER: | VHF |
| POWER DENSITY (W/cm³): | 0.2 |
| PRESSURE (Torr): | 0.002 |
| SUBSTRATE TEMPERATURE (°C.): | 150 |

TABLE A6

(1)

| | |
|---|---|
| $H_2$ GAS FLOW RATE (sccm) | 1000 |
| SPECIES OF SILICON COMPOUND GAS | $SiH_4$ |
| CONCENTRATION* (%) | 0.0003~0.14 |
| TYPE OF APPLIED POWER | RF |
| POWER (W/cm$^3$) | 0.12 |
| PRESSURE (Torr) | 0.8 |
| SUBSTRATE TEMPERATURE (°C.) | 250 |

*: (SILICON COMPOUND GAS FLOW RATE)/($H_2$ GAS FLOW RATE)

(2)

| SC-EMB-A6 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.8 | | | | 130 | 200 | | |
| RF i-LAYER | | 4 | | | 100 | | | |
| MW i-LAYER | 48 | | | 49 | 200 | | | |
| RF i-LAYER | | 4 | | | 100 | | | |
| RF p-LAYER | | | 0.1 | | 60 | | 10 | 2 |
| RF n-LAYER | 1.1 | | | | 30 | 270 | | |
| RF i-LAYER | | 4 | | | 80 | | | |
| MW i-LAYER | 35 | | | 35 | 180 | | | |
| RF i-LAYER | | 3 | | | 80 | | | |
| RF p-LAYER | | | 0.2 | | 60 | | 10 | 2 |
| RF n-LAYER | 0.8 | | | | 50 | 250 | | |
| RF i-LAYER | | 2 | | | 70 | | | |
| RF p-LAYER | | | 0.4 | | 70 | | 10 | 2 |

| SC-EMB-A6 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 22 |
| RF i-LAYER | 0.9 | | 0.08 | 300 | 10 |
| MW i-LAYER | 0.005 | 0.35 | 0.5 | 365 | 110 |
| RF i-LAYER | 0.9 | | 0.08 | 350 | 20 |
| RF p-LAYER | 1.8 | | 0.07 | 300 | 10 |
| RF n-LAYER | 1.1 | | 0.04 | 300 | 10 |
| RF i-LAYER | 0.9 | | 0.08 | 300 | 10 |
| MW i-LAYER | 0.005 | 0.25 | 0.6 | 335 | 100 |
| RF i-LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| RF i-LAYER | 0.75 | | 0.07 | 200 | 86 |
| RF p-LAYER | 1.6 | | 0.07 | 170 | 10 |

(3)

| CONCENTRATION* (%) | 0.0003 | 0.0008 | 0.001 | 0.005 | 0.01 | 0.08 | 0.1 | 0.105 | 0.12 | 0.14 |
|---|---|---|---|---|---|---|---|---|---|---|
| UNIFORMITY IN CHARACTERISTICS | X | Δ | ○ | ○ | ○ | ○ | ○ | Δ | X | X |
| ADHESION | X | Δ | ○ | ○ | ○ | ○ | ○ | X | X | X |
| DURABILITY | X | X | ○ | ○ | ○ | ○ | ○ | X | X | X |

○: EXCELLENT FOR PRACTICAL USE
Δ: GOOD FOR PRACTICAL USE
X: NO GOOD FOR SOME APPLICATIONS
*: CONCENTRATION OF SILICON COMPOUND GAS MIXED WITH $H_2$ GAS TO $H_2$ GAS

OTHER CONDITIONS

| | |
|---|---|
| FLOW RATE OF $H_2$ GAS CONTAINING SILICON COMPOUND GAS (sccm): | 1000 |
| SPECIES OF SILICON COMPOUND GAS: | $SiH_4$ |
| APPLIED POWER: | RF |
| POWER DENSITY (W/cm$^3$): | 0.12 |
| PRESSURE (Torr): | 0.8 |
| SUBSTRATE TEMPERATURE (°C.): | 250 |

TABLE A7

(1)

| | |
|---|---|
| $H_2$ GAS FLOW RATE (sccm) | 1000 |
| SPECIES OF SILICON COMPOUND GAS | $SiH_4$ |
| CONCENTRATION* (%) | 0.0003~0.14 |
| TYPE OF APPLIED POWER | VHF |
| POWER (W/cm$^3$) | 0.15 |
| PRESSURE (Torr) | 0.010 |
| SUBSTRATE TEMPERATURE (°C.) | 140 |

*: (SILICON COMPOUND GAS FLOW RATE)/($H_2$ GAS FLOW RATE)

(2)

| SC-EMB-A7 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.8 | | | | 130 | 200 | | |
| RF i-LAYER | | 5 | | | 100 | | | |
| MW i-LAYER | 48 | | | 50 | 200 | | | |
| RF i-LAYER | | 5 | | | 100 | | | |
| RF p-LAYER | | | 0.1 | | 60 | | 10 | 2 |
| RF n-LAYER | 1.1 | | | | 30 | 270 | | |
| RF i-LAYER | | 5 | | | 80 | | | |
| MW i-LAYER | 35 | | | 36 | 180 | | | |
| RF i-LAYER | | 4 | | | 80 | | | |
| RF p-LAYER | | | 0.2 | | 60 | | 10 | 2 |
| RF n-LAYER | 0.8 | | | | 50 | 250 | | |
| RF i-LAYER | | 2 | | | 70 | | | |
| RF p-LAYER | | | 0.4 | | 70 | | 10 | 2 |

| SC-EMB-A7 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 22 |
| RF i-LAYER | 0.9 | | 0.08 | 300 | 10 |
| MW i-LAYER | 0.005 | 0.35 | 0.5 | 365 | 110 |
| RF i-LAYER | 0.9 | | 0.08 | 350 | 20 |
| RF p-LAYER | 1.8 | | 0.07 | 300 | 10 |
| RF n-LAYER | 1.1 | | 0.04 | 300 | 10 |
| RF i-LAYER | 0.9 | | 0.08 | 300 | 10 |
| MW i-LAYER | 0.005 | 0.25 | 0.6 | 335 | 100 |
| RF i-LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| RF i-LAYER | 0.75 | | 0.07 | 200 | 89 |
| RF p-LAYER | 1.6 | | 0.07 | 170 | 10 |

(3)

| CONCENTRATION* (%) | 0.0003 | 0.0008 | 0.001 | 0.005 | 0.01 | 0.08 | 0.1 | 0.105 | 0.12 | 0.14 |
|---|---|---|---|---|---|---|---|---|---|---|
| UNIFORMITY IN CHARACTERISTICS | X | Δ | ○ | ○ | ○ | ○ | ○ | Δ | X | X |
| ADHESION | X | X | ○ | ○ | ○ | ○ | ○ | Δ | X | X |
| DURABILITY | X | Δ | ○ | ○ | ○ | ○ | ○ | X | X | X |

○: EXCELLENT FOR PRACTICAL USE
Δ: GOOD FOR PRACTICAL USE
X: NO GOOD FOR SOME APPLICATIONS
*: CONCENTRATION OF SILICON COMPOUND GAS MIXED WITH $H_2$ GAS TO $H_2$ GAS

OTHER CONDITIONS

| | |
|---|---|
| FLOW RATE OF $H_2$ GAS CONTAINING SILICON COMPOUND GAS (sccm): | 1000 |
| SPECIES OF SILICON COMPOUND GAS: | $SiH_4$ |
| APPLIED POWER: | VHF |
| POWER DENSITY (W/cm$^3$): | 0.15 |
| PRESSURE (Torr): | 0.010 |
| SUBSTRATE TEMPERATURE (°C.): | 140 |

TABLE A8

(1)

| | |
|---|---|
| $H_2$ GAS FLOW RATE (sccm) | 1100 |
| SPECIES OF SILICON COMPOUND GAS | $SiH_4$ |
| CONCENTRATION* (%) | 0.0003~0.14 |
| TYPE OF APPLIED POWER | MW |
| POWER (W/cm$^3$) | 0.11 |
| PRESSURE (Torr) | 0.008 |
| SUBSTRATE TEMPERATURE (°C.) | 135 |

*: (SILICON COMPOUND GAS FLOW RATE)/($H_2$ GAS FLOW RATE)

(2)

| SC-EMB-A8 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.8 | | | | 130 | 200 | | |
| RF i-LAYER | | 5 | | | 100 | | | |
| MW i-LAYER | 48 | | | 51 | 200 | | | |
| RF i-LAYER | | 4 | | | 100 | | | |
| RF p-LAYER | | | 0.1 | | 60 | | 10 | 2 |
| RF n-LAYER | 1.1 | | | | 30 | 270 | | |
| RF i-LAYER | | 4 | | | 80 | | | |
| MW i-LAYER | 35 | | | 37 | 180 | | | |
| RF i-LAYER | | 3.5 | | | 80 | | | |
| RF p-LAYER | | | 0.2 | | 60 | | 10 | 2 |
| RF n-LAYER | 0.8 | | | | 50 | 250 | | |
| RF i-LAYER | | 2.5 | | | 70 | | | |
| RF p-LAYER | | | 0.4 | | 70 | | 10 | 2 |

| SC-EMB-A8 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 22 |
| RF i-LAYER | 0.9 | | 0.08 | 300 | 10 |
| MW i-LAYER | 0.005 | 0.35 | 0.5 | 365 | 110 |
| RF i-LAYER | 0.85 | | 0.08 | 350 | 20 |
| RF p-LAYER | 1.8 | | 0.07 | 300 | 10 |
| RF n-LAYER | 1.1 | | 0.04 | 300 | 10 |
| RF i-LAYER | 0.85 | | 0.08 | 300 | 10 |
| MW i-LAYER | 0.005 | 0.25 | 0.6 | 335 | 100 |
| RF i-LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| RF i-LAYER | 0.6 | | 0.07 | 200 | 88 |
| RF p-LAYER | 1.6 | | 0.07 | 170 | 10 |

(3)

| CONCENTRATION* (%) | 0.0003 | 0.0008 | 0.001 | 0.005 | 0.01 | 0.08 | 0.1 | 0.105 | 0.12 | 0.14 |
|---|---|---|---|---|---|---|---|---|---|---|
| UNIFORMITY IN CHARACTERISTICS | X | X | ○ | ○ | ○ | ○ | ○ | X | X | X |
| ADHESION | X | X | ○ | ○ | ○ | ○ | ○ | Δ | X | X |
| DURABILITY | X | Δ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS
*: CONCENTRATION OF SILICON COMPOUND GAS MIXED WITH $H_2$ GAS TO $H_2$ GAS

OTHER CONDITIONS

| | |
|---|---|
| FLOW RATE OF $H_2$ GAS CONTAINING SILICON COMPOUND GAS (sccm): | 1100 |
| SPECIES OF SILICON COMPOUND GAS: | $SiH_4$ |
| APPLIED POWER: | MW |
| POWER DENSITY (W/cm$^3$): | 0.11 |
| PRESSURE (Torr): | 0.008 |
| SUBSTRATE TEMPERATURE (°C.): | 135 |

TABLE A9

(1)

| | |
|---|---|
| $H_2$ GAS FLOW RATE (sccm) | 500 |
| SPECIES OF SILICON COMPOUND GAS | $Si_2H_6$ |
| CONCENTRATION* (%) | 0.07 |
| TYPE OF APPLIED POWER | RF |
| POWER (W/cm$^3$) | 0.5 |
| PRESSURE (Torr) | 0.01~100 |
| SUBSTRATE TEMPERATURE (°C.) | 200 |

*: (SILICON COMPOUND GAS FLOW RATE)/($H_2$ GAS FLOW RATE)

(2)

| SC-EMB-A9 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.8 | | | | 130 | 200 | | |
| RF i-LAYER | | 5 | | | 100 | | | |
| MW i-LAYER | 50 | | | 51 | 220 | | | |
| RF i-LAYER | | 4 | | | 100 | | | |
| RF p-LAYER | | | 0.1 | | 60 | | 10 | 2 |
| RF n-LAYER | 1.1 | | | | 30 | 270 | | |
| RF i-LAYER | | 4 | | | 80 | | | |
| MW i-LAYER | 35 | | | 37 | 185 | | | |
| RF i-LAYER | | 3.5 | | | 80 | | | |
| RF p-LAYER | | | 0.3 | | 60 | | 10 | 2 |
| RF n-LAYER | 0.8 | | | | 50 | 250 | | |
| RF i-LAYER | | 2.5 | | | 70 | | | |
| RF p-LAYER | | | 0.4 | | 70 | | 10 | 2 |

| SC-EMB-A9 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 22 |
| RF i-LAYER | 0.8 | | 0.08 | 300 | 10 |
| MW i-LAYER | 0.005 | 0.35 | 0.5 | 365 | 100 |
| RF i-LAYER | 0.75 | | 0.08 | 350 | 20 |
| RF p-LAYER | 1.8 | | 0.07 | 300 | 10 |
| RF n-LAYER | 1.1 | | 0.04 | 300 | 10 |
| RF i-LAYER | 0.75 | | 0.08 | 300 | 10 |
| MW i-LAYER | 0.005 | 0.25 | 0.6 | 335 | 90 |
| RF i-LAYER | 0.7 | | 0.08 | 280 | 20 |
| RF p-LAYER | 1.7 | | 0.07 | 260 | 10 |
| RF n-LAYER | 1.05 | | 0.04 | 230 | 10 |
| RF i-LAYER | 0.6 | | 0.07 | 200 | 87 |
| RF p-LAYER | 1.6 | | 0.07 | 170 | 10 |

(3)

| PRESSURE (Torr) | 0.01 | 0.03 | 0.5 | 1 | 3 | 5 | 10 | 11 | 20 | 100 |
|---|---|---|---|---|---|---|---|---|---|---|
| UNIFORMITY IN CHARACTERISTICS | X | X | ○ | ○ | ○ | ○ | ○ | Δ | X | X |
| ADHESION | X | Δ | ○ | ○ | ○ | ○ | ○ | Δ | X | X |
| DURABILITY | X | X | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS

OTHER CONDITIONS

| | |
|---|---|
| FLOW RATE OF $H_2$ GAS CONTAINING SILICON COMPOUND GAS (sccm): | 500 |
| SPECIES OF SILICON COMPOUND GAS: | $Si_2H_6$ |
| CONCENTRATION OF SILICON COMPOUND GAS TO $H_2$ GAS (%): | 0.07 |
| APPLIED POWER: | RF |
| POWER DENSITY (W/cm$^3$): | 0.5 |
| SUBSTRATE TEMPERATURE (°C.): | 200 |

TABLE A10

(1)

| | |
|---|---|
| $H_2$ GAS FLOW RATE (sccm) | 1200 |
| SPECIES OF SILICON COMPOUND GAS | $Si_2H_6$ |
| CONCENTRATION* (%) | 0.008 |
| TYPE OF APPLIED POWER | VHF |
| POWER (W/cm$^3$) | 0.017 |
| PRESSURE (Torr) | 0.03~10000 |
| SUBSTRATE TEMPERATURE (°C.) | 180 |

*: (SILICON COMPOUND GAS FLOW RATE)/($H_2$ GAS FLOW RATE)

(2)

| SC-EMB-A10 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.8 | | | | 140 | 200 | | |
| RF i-LAYER | | 4 | | | 110 | | | |
| MW i-LAYER | 50 | | | 51 | 230 | | | |
| RF i-LAYER | | 4 | | | 100 | | | |
| RF p-LAYER | | | 0.1 | | 60 | | 10 | 2 |
| RF n-LAYER | 1.1 | | | | 50 | 270 | | |
| RF i-LAYER | | 4 | | | 90 | | | |
| MW i-LAYER | 35 | | | 37 | 185 | | | |
| RF i-LAYER | | 3.5 | | | 90 | | | |
| RF p-LAYER | | | 0.3 | | 60 | | 10 | 2 |
| RF n-LAYER | 0.8 | | | | 50 | 250 | | |
| RF i-LAYER | | 2.5 | | | 70 | | | |
| RF p-LAYER | | | 0.4 | | 70 | | 10 | 2 |

| SC-EMB-A10 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 22 |
| RF i-LAYER | 0.8 | | 0.08 | 300 | 10 |
| MW i-LAYER | 0.005 | 0.35 | 0.5 | 365 | 110 |
| RF i-LAYER | 0.75 | | 0.08 | 350 | 20 |
| RF p-LAYER | 1.8 | | 0.07 | 300 | 10 |
| RF n-LAYER | 1.1 | | 0.04 | 300 | 10 |
| RF i-LAYER | 0.75 | | 0.08 | 300 | 10 |
| MW i-LAYER | 0.005 | 0.3 | 0.6 | 335 | 100 |
| RF i-LAYER | 0.7 | | 0.08 | 280 | 20 |
| RF p-LAYER | 1.7 | | 0.07 | 260 | 10 |
| RF n-LAYER | 1.05 | | 0.04 | 230 | 10 |
| RF i-LAYER | 0.5 | | 0.07 | 200 | 88 |
| RF p-LAYER | 1.6 | | 0.07 | 170 | 10 |

(3)

| PRESSURE (Torr) | 0.03 | 0.08 | 0.1 | 1 | 100 | 500 | 1000 | 1100 | 2000 | 10000 |
|---|---|---|---|---|---|---|---|---|---|---|
| UNIFORMITY IN CHARACTERISTICS | X | X | ○ | ○ | ○ | ○ | ○ | Δ | X | X |
| ADHESION | X | Δ | ○ | ○ | ○ | ○ | ○ | Δ | X | X |
| DURABILITY | X | Δ | ○ | ○ | ○ | ○ | ○ | X | X | X |

○: EXCELLENT FOR PRACTICAL USE
Δ: GOOD FOR PRACTICAL USE
X: NO GOOD FOR SOME APPLICATIONS

OTHER CONDITIONS

| | |
|---|---|
| FLOW RATE OF $H_2$ GAS CONTAINING SILICON COMPOUND GAS (sccm): | 1200 |
| SPECIES OF SILICON COMPOUND GAS: | $Si_2H_6$ |
| CONCENTRATION OF SILICON COMPOUND GAS TO $H_2$ GAS (%): | 0.008 |
| APPLIED POWER: | VHF |
| POWER DENSITY (W/cm$^3$): | 0.017 |
| SUBSTRATE TEMPERATURE (°C.): | 180 |

TABLE A11

(1)

| | |
|---|---|
| $H_2$ GAS FLOW RATE (sccm) | 900 |
| SPECIES OF SILICON COMPOUND GAS | $SiF_4$ |
| CONCENTRATION* (%) | 0.04 |
| TYPE OF APPLIED POWER | MW |
| POWER (W/cm$^3$) | 0.11 |
| PRESSURE (Torr) | 0.03~100 |
| SUBSTRATE TEMPERATURE (°C.) | 200 |

*: (SILICON COMPOUND GAS FLOW RATE)/($H_2$ GAS FLOW RATE)

(2)

| SC-EMB-A11 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.8 | | | | 140 | 200 | | |
| RF i-LAYER | | 4 | | | 110 | | | |
| MW i-LAYER | 46 | | | 51 | 230 | | | |
| RF i-LAYER | | 4 | | | 100 | | | |
| RF p-LAYER | | | 0.1 | | 60 | | 10 | 2 |
| RF n-LAYER | 1.1 | | | | 50 | 270 | | |
| RF i-LAYER | | 4 | | | 90 | | | |
| MW i-LAYER | 35 | | | 30 | 185 | | | |
| RF i-LAYER | | 3.5 | | | 90 | | | |
| RF p-LAYER | | | 0.3 | | 60 | | 10 | 2 |
| RF n-LAYER | 0.8 | | | | 50 | 250 | | |
| RF i-LAYER | | 2 | | | 70 | | | |
| RF p-LAYER | | | 0.4 | | 80 | | 10 | 2 |

| SC-EMB-A11 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.23 | | 0.04 | 380 | 22 |
| RF i-LAYER | 0.8 | | 0.08 | 300 | 10 |
| MW i-LAYER | 0.006 | 0.25 | 0.5 | 365 | 110 |
| RF i-LAYER | 0.75 | | 0.08 | 350 | 20 |
| RF p-LAYER | 1.8 | | 0.07 | 300 | 10 |
| RF n-LAYER | 1.1 | | 0.04 | 300 | 10 |
| RF i-LAYER | 0.75 | | 0.08 | 300 | 10 |
| MW i-LAYER | 0.006 | 0.2 | 0.6 | 335 | 100 |
| RF i-LAYER | 0.7 | | 0.08 | 280 | 20 |
| RF p-LAYER | 1.7 | | 0.07 | 260 | 10 |
| RF n-LAYER | 1.05 | | 0.04 | 230 | 10 |
| RF i-LAYER | 0.5 | | 0.07 | 200 | 88 |
| RF p-LAYER | 1.6 | | 0.07 | 170 | 10 |

(3)

| PRESSURE (Torr) | 0.01 | 0.03 | 0.5 | 1 | 3 | 5 | 10 | 11 | 20 | 100 |
|---|---|---|---|---|---|---|---|---|---|---|
| UNIFORMITY IN CHARACTERISTICS | X | X | ○ | ○ | ○ | ○ | ○ | Δ | X | X |
| ADHESION | X | X | ○ | ○ | ○ | ○ | ○ | Δ | X | X |
| DURABILITY | X | Δ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS

OTHER CONDITIONS

| | |
|---|---|
| FLOW RATE OF $H_2$ GAS CONTAINING SILICON COMPOUND GAS (sccm): | 900 |
| SPECIES OF SILICON COMPOUND GAS: | $SiF_4$ |
| CONCENTRATION OF SILICON COMPOUND GAS TO $H_2$ GAS (%): | 0.04 |
| APPLIED POWER: | MW |
| POWER DENSITY (W/cm$^3$): | 0.11 |
| SUBSTRATE TEMPERATURE (°C.): | 200 |

TABLE A12

(1)

| | |
|---|---|
| $H_2$ GAS FLOW RATE (sccm) | 350 |
| SPECIES OF SILICON COMPOUND GAS | $SiH_4$ |
| CONCENTRATION* (%) | 0.03 |
| TYPE OF APPLIED POWER | RF |
| POWER ($W/cm^3$) | 0.003~10 |
| PRESSURE (Torr) | 0.75 |
| SUBSTRATE TEMPERATURE (°C.) | 230 |

*: (SILICON COMPOUND GAS FLOW RATE)/($H_2$ GAS FLOW RATE)

(2)

| SC-EMB-A12 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.8 | | | | 140 | 230 | | |
| RF i-LAYER | | 4 | | | 110 | | | |
| MW i-LAYER | 46 | | | 51 | 230 | | | |
| RF i-LAYER | | 4 | | | 100 | | | |
| RF p-LAYER | | | 0.1 | | 60 | | 10 | 2 |
| RF n-LAYER | 1.1 | | | | 40 | 290 | | |
| RF i-LAYER | | 4 | | | 90 | | | |
| MW i-LAYER | 35 | | | 30 | 185 | | | |
| RF i-LAYER | | 3.5 | | | 90 | | | |
| RF p-LAYER | | | 0.3 | | 60 | | 10 | 2 |
| RF n-LAYER | 0.8 | | | | 50 | 250 | | |
| RF i-LAYER | | 2 | | | 70 | | | |
| RF p-LAYER | | | 0.4 | | 80 | | 10 | 2 |

| SC-EMB-A12 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.3 | | 0.04 | 380 | 22 |
| RF i-LAYER | 0.8 | | 0.08 | 300 | 10 |
| MW i-LAYER | 0.006 | 0.25 | 0.5 | 365 | 110 |
| RF i-LAYER | 0.75 | | 0.08 | 350 | 20 |
| RF p-LAYER | 1.8 | | 0.07 | 300 | 10 |
| RF n-LAYER | 1.1 | | 0.04 | 300 | 10 |
| RF i-LAYER | 0.75 | | 0.08 | 300 | 10 |
| MW i-LAYER | 0.006 | 0.2 | 0.6 | 335 | 100 |
| RF i-LAYER | 0.7 | | 0.08 | 280 | 20 |
| RF p-LAYER | 1.7 | | 0.07 | 260 | 10 |
| RF n-LAYER | 1.05 | | 0.04 | 230 | 10 |
| RF i-LAYER | 0.5 | | 0.07 | 185 | 90 |
| RF p-LAYER | 1.6 | | 0.07 | 170 | 10 |

(3)

| POWER DENSITY ($W/cm^3$) | 0.003 | 0.007 | 0.01 | 0.05 | 0.1 | 0.7 | 1.0 | 1.1 | 3.0 | 10 |
|---|---|---|---|---|---|---|---|---|---|---|
| UNIFORMITY IN CHARACTERISTICS | X | Δ | ○ | ○ | ○ | ○ | ○ | Δ | X | X |
| ADHESION | X | Δ | ○ | ○ | ○ | ○ | ○ | Δ | X | X |
| DURABILITY | X | Δ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS
OTHER CONDITIONS

| | |
|---|---|
| FLOW RATE OF $H_2$ GAS CONTAINING SILICON COMPOUND GAS (sccm): | 350 |
| SPECIES OF SILICON COMPOUND GAS: | $SiH_4$ |
| CONCENTRATION OF SILICON COMPOUND GAS TO $H_2$ GAS (%): | 0.03 |
| APPLIED POWER: | RF |
| PRESSURE (Torr): | 0.75 |
| SUBSTRATE TEMPERATURE (°C.): | 230 |

TABLE A13

(1)

| | |
|---|---|
| $H_2$ GAS FLOW RATE (sccm) | 1000 |
| SPECIES OF SILICON COMPOUND GAS | $Si_2H_6$ |
| CONCENTRATION* (%) | 0.03 |
| TYPE OF APPLIED POWER | VHF |
| POWER (W/cm$^3$) | 0.003~10 |
| PRESSURE (Torr) | 0.0075 |
| SUBSTRATE TEMPERATURE (°C.) | 135 |

*: (SILICON COMPOUND GAS FLOW RATE)/($H_2$ GAS FLOW RATE)

(2)

| SC-EMB-A13 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.8 | | | | 140 | 230 | | |
| RF i-LAYER | | 4 | | | 110 | | | |
| MW i-LAYER | 46 | | | 45 | 250 | | | |
| RF i-LAYER | | 4 | | | 100 | | | |
| RF p-LAYER | | | 0.1 | | 60 | | 10 | 2 |
| RF n-LAYER | 1.1 | | | | 40 | 290 | | |
| RF i-LAYER | | 4 | | | 90 | | | |
| MW i-LAYER | 35 | | | 28 | 190 | | | |
| RF i-LAYER | | 3.5 | | | 90 | | | |
| RF p-LAYER | | | 0.3 | | 60 | | 10 | 2 |
| RF n-LAYER | 0.8 | | | | 50 | 250 | | |
| RF i-LAYER | | 1.5 | | | 80 | | | |
| RF p-LAYER | | | 0.4 | | 80 | | 10 | 2 |

| SC-EMB-A13 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.3 | | 0.04 | 380 | 22 |
| RF i-LAYER | 0.8 | | 0.08 | 300 | 10 |
| MW i-LAYER | 0.008 | 0.25 | 0.6 | 365 | 110 |
| RF i-LAYER | 0.75 | | 0.08 | 350 | 20 |
| RF p-LAYER | 1.8 | | 0.07 | 300 | 10 |
| RF n-LAYER | 1.1 | | 0.04 | 300 | 10 |
| RF i-LAYER | 0.75 | | 0.08 | 300 | 10 |
| MW i-LAYER | 0.009 | 0.2 | 0.6 | 335 | 100 |
| RF i-LAYER | 0.7 | | 0.08 | 280 | 20 |
| RF p-LAYER | 1.7 | | 0.07 | 260 | 10 |
| RF n-LAYER | 1.05 | | 0.04 | 230 | 10 |
| RF i-LAYER | 0.8 | | 0.07 | 185 | 90 |
| RF p-LAYER | 1.6 | | 0.07 | 170 | 10 |

(3)

| POWER DENSITY (W/cm$^3$) | 0.003 | 0.007 | 0.01 | 0.05 | 0.1 | 0.7 | 1.0 | 1.1 | 3.0 | 10 |
|---|---|---|---|---|---|---|---|---|---|---|
| UNIFORMITY IN CHARACTERISTICS | X | Δ | ○ | ○ | ○ | ○ | ○ | Δ | X | X |
| ADHESION | X | Δ | ○ | ○ | ○ | ○ | ○ | X | X | X |
| DURABILITY | X | X | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS

OTHER CONDITIONS

| | |
|---|---|
| FLOW RATE OF $H_2$ GAS CONTAINING SILICON COMPOUND GAS (sccm): | 1000 |
| SPECIES OF SILICON COMPOUND GAS: | $Si_2H_6$ |
| CONCENTRATION OF SILICON COMPOUND GAS TO $H_2$ GAS (%): | 0.03 |
| APPLED POWER: | VHF |
| PRESSURE (Torr): | 0.0075 |
| SUBSTRATE TEMPERATURE (°C.): | 135 |

TABLE A14

(1)

| | |
|---|---|
| $H_2$ GAS FLOW RATE (sccm) | 1800 |
| SPECIES OF SILICON COMPOUND GAS | $SiCl_2H_2$ |
| CONCENTRATION* (%) | 0.006 |
| TYPE OF APPLIED POWER | MW |
| POWER (W/cm$^3$) | 0.03~100 |
| PRESSURE (Torr) | 0.0055 |
| SUBSTRATE TEMPERATURE (°C.) | 125 |

*: (SILICON COMPOUND GAS FLOW RATE)/($H_2$ GAS FLOW RATE)

(2)

| SC-EMB-A14 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.8 | | | | 140 | 230 | | |
| RF i-LAYER | | 4 | | | 100 | | | |
| MW i-LAYER | 46 | | | 46 | 250 | | | |
| RF i-LAYER | | 3.5 | | | 100 | | | |
| RF p-LAYER | | | 0.1 | | 80 | | 10 | 2 |
| RF n-LAYER | 1.1 | | | | 40 | 290 | | |
| RF i-LAYER | | 3.5 | | | 90 | | | |
| MW i-LAYER | 35 | | | 28 | 190 | | | |
| RF i-LAYER | | 3 | | | 90 | | | |
| RF p-LAYER | | | 0.3 | | 80 | | 10 | 2 |
| RF n-LAYER | 0.8 | | | | 50 | 250 | | |
| RF i-LAYER | | 1.5 | | | 80 | | | |
| RF p-LAYER | | | 0.4 | | 90 | | 10 | 2 |

| SC-EMB-A12 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.3 | | 0.04 | 380 | 22 |
| RF i-LAYER | 0.8 | | 0.08 | 300 | 10 |
| MW i-LAYER | 0.006 | 0.25 | 0.6 | 365 | 110 |
| RF i-LAYER | 0.75 | | 0.08 | 350 | 20 |
| RF p-LAYER | 1.8 | | 0.07 | 300 | 10 |
| RF n-LAYER | 1.1 | | 0.04 | 300 | 10 |
| RF i-LAYER | 0.75 | | 0.08 | 300 | 10 |
| MW i-LAYER | 0.009 | 0.2 | 0.6 | 335 | 100 |
| RF i-LAYER | 0.7 | | 0.08 | 280 | 20 |
| RF p-LAYER | 1.7 | | 0.07 | 260 | 10 |
| RF n-LAYER | 1.05 | | 0.04 | 230 | 10 |
| RF i-LAYER | 0.8 | | 0.07 | 185 | 90 |
| RF p-LAYER | 1.6 | | 0.07 | 170 | 10 |

(3)

| POWER DENSITY (W/cm$^3$) | 0.03 | 0.007 | 0.01 | 0.05 | 0.1 | 0.7 | 1.0 | 1.1 | 3.0 | 10 |
|---|---|---|---|---|---|---|---|---|---|---|
| UNIFORMITY IN CHARACTERISTICS | X | Δ | ○ | ○ | ○ | ○ | ○ | Δ | X | X |
| ADHESION | X | Δ | ○ | ○ | ○ | ○ | ○ | X | X | X |
| DURABILITY | X | Δ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS

OTHER CONDITIONS

| | |
|---|---|
| FLOW RATE OF $H_2$ GAS CONTAINING SILICON COMPOUND GAS (sccm): | 1800 |
| SPECIES OF SILICON COMPOUND GAS: | $SiCl_2H_2$ |
| CONCENTRATION OF SILICON COMPOUND GAS TO $H_2$ GAS (%): | 0.006 |
| APPLIED POWER: | MW |
| PRESSURE (Torr): | 0.0055 |
| SUBSTRATE TEMPERATURE (°C.): | 125 |

TABLE A15

(1)

| | |
|---|---|
| $H_2$ GAS FLOW RATE (sccm) | 550 |
| SPECIES OF SILICON COMPOUND GAS | $SiH_4$ |
| CONCENTRATION* (%) | 0.08 |
| TYPE OF APPLIED POWER | RF |
| POWER (W/cm$^3$) | 0.03 |
| PRESSURE (Torr) | 1.3 |
| SUBSTRATE TEMPERATURE (°C.) | 50~520 |

*: (SILICON COMPOUND GAS FLOW RATE)/($H_2$ GAS FLOW RATE)

(2)

| SC-EMB-A15 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.8 | | | | 140 | 230 | | |
| RF i-LAYER | | 3.5 | | | 110 | | | |
| MW i-LAYER | 45 | | | 45 | 250 | | | |
| RF i-LAYER | | 3.5 | | | 100 | | | |
| RF p-LAYER | | | 0.1 | | 80 | | 10 | 2 |
| RF n-LAYER | 1.1 | | | | 40 | 290 | | |
| RF i-LAYER | | 3.5 | | | 90 | | | |
| MW i-LAYER | 45 | | | 25 | 190 | | | |
| RF i-LAYER | | 3 | | | 90 | | | |
| RF p-LAYER | | | 0.3 | | 80 | | 10 | 2 |
| RF n-LAYER | 0.8 | | | | 50 | 250 | | |
| RF i-LAYER | | 1.5 | | | 80 | | | |
| RF p-LAYER | | | 0.4 | | 90 | | 10 | 2 |

| SC-EMB-A15 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.3 | | 0.04 | 380 | 22 |
| RF i-LAYER | 0.8 | | 0.08 | 300 | 10 |
| MW i-LAYER | 0.010 | 0.25 | 0.6 | 365 | 110 |
| RF i-LAYER | 0.75 | | 0.08 | 350 | 20 |
| RF p-LAYER | 1.8 | | 0.07 | 300 | 10 |
| RF n-LAYER | 1.1 | | 0.04 | 300 | 10 |
| RF i-LAYER | 0.75 | | 0.08 | 300 | 10 |
| MW i-LAYER | 0.011 | 0.2 | 0.6 | 335 | 100 |
| RF i-LAYER | 0.7 | | 0.08 | 280 | 20 |
| RF p-LAYER | 1.7 | | 0.07 | 260 | 10 |
| RF n-LAYER | 1.05 | | 0.04 | 230 | 10 |
| RF i-LAYER | 0.8 | | 0.07 | 185 | 90 |
| RF p-LAYER | 1.6 | | 0.07 | 170 | 10 |

(3)

| SUBSTRATE TEMPERATURE (°C.) | 50 | 75 | 100 | 150 | 200 | 300 | 400 | 420 | 450 | 520 |
|---|---|---|---|---|---|---|---|---|---|---|
| UNIFORMITY IN CHARACTERISTICS | X | Δ | O | O | O | O | O | Δ | X | X |
| ADHESION | X | X | O | O | O | O | O | X | X | X |
| DURABILITY | X | X | O | O | O | O | O | Δ | X | X |

O: EXCELLENT FOR PRACTICAL USE
Δ: GOOD FOR PRACTICAL USE
X: NO GOOD FOR SOME APPLICATIONS
OTHER CONDITIONS

| | |
|---|---|
| FLOW RATE OF $H_2$ GAS CONTAINING SILICON COMPOUND GAS (sccm): | 550 |
| SPECIES OF SILICON COMPOUND GAS: | $SiH_4$ |
| CONCENTRATION OF SILICON COMPOUND GAS TO $H_2$ GAS (%): | 0.08 |
| APPLIED POWER: | RF |
| POWER DENSITY (W/cm$^3$): | 0.3 |
| PRESSURE (Torr): | 1.3 |

TABLE A16

(1)

| | |
|---|---|
| $H_2$ GAS FLOW RATE (sccm) | 1350 |
| SPECIES OF SILICON COMPOUND GAS | $SiCl_4$ |
| CONCENTRATION* (%) | 0.01 |
| TYPE OF APPLIED POWER | VHF |
| POWER (W/cm$^3$) | 0.3 |
| PRESSURE (Torr) | 0.05 |
| SUBSTRATE TEMPERATURE (°C.) | 30~420 |

*: (SILICON COMPOUND GAS FLOW RATE)/($H_2$ GAS FLOW RATE)

(2)

| SC-EMB-A16 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.8 | | | | 140 | 230 | | |
| RF i-LAYER | | 3.5 | | | 100 | | | |
| MW i-LAYER | 42 | | | 40 | 100 | | | |
| RF i-LAYER | | 3.5 | | | 100 | | | |
| RF p-LAYER | | | 0.1 | | 80 | | 8 | 2 |
| RF n-LAYER | 1.1 | | | | 40 | 290 | | |
| RF i-LAYER | | 3.5 | | | 90 | | | |
| MW i-LAYER | 45 | | | 25 | 120 | | | |
| RF i-LAYER | | 3 | | | 90 | | | |
| RF p-LAYER | | | 0.3 | | 80 | | 8 | 2 |
| RF n-LAYER | 0.8 | | | | 50 | 250 | | |
| RF i-LAYER | | 1.5 | | | 80 | | | |
| RF p-LAYER | | | 0.4 | | 90 | | 8 | 2 |

| SC-EMB-A16 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.3 | | 0.04 | 380 | 22 |
| RF i-LAYER | 0.8 | | 0.08 | 300 | 10 |
| MW i-LAYER | 0.010 | 0.25 | 0.7 | 365 | 110 |
| RF i-LAYER | 0.75 | | 0.08 | 350 | 20 |
| RF p-LAYER | 1.8 | | 0.07 | 300 | 10 |
| RF n-LAYER | 1.1 | | 0.04 | 300 | 10 |
| RF i-LAYER | 0.75 | | 0.08 | 300 | 10 |
| MW i-LAYER | 0.013 | 0.2 | 0.6 | 335 | 100 |
| RF i-LAYER | 0.7 | | 0.08 | 280 | 20 |
| RF p-LAYER | 1.7 | | 0.07 | 260 | 10 |
| RF n-LAYER | 1.05 | | 0.04 | 230 | 10 |
| RF i-LAYER | 0.8 | | 0.07 | 190 | 90 |
| RF p-LAYER | 1.6 | | 0.07 | 170 | 10 |

(3)

| SUBSTRATE TEMPERATURE (°C.) | 30 | 40 | 50 | 100 | 200 | 250 | 300 | 320 | 350 | 420 |
|---|---|---|---|---|---|---|---|---|---|---|
| UNIFORMITY IN CHARACTERISTICS | X | Δ | ○ | ○ | ○ | ○ | ○ | X | X | X |
| ADHESION | X | Δ | ○ | ○ | ○ | ○ | ○ | Δ | X | X |
| DURABILITY | X | Δ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS
OTHER CONDITIONS

| | |
|---|---|
| FLOW RATE OF $H_2$ GAS CONTAINING SILICON COMPOUND GAS (sccm): | 1350 |
| SPECIES OF SILICON COMPOUND GAS: | $SiCl_4$ |
| CONCENTRATION OF SILICON COMPOUND GAS TO $H_2$ GAS (%): | 0.01 |
| APPLIED POWER: | VHF |
| POWER DENSITY (W/cm$^3$): | 0.3 |
| PRESSURE (Torr): | 0.05 |

TABLE A17

(1)

| | |
|---|---|
| $H_2$ GAS FLOW RATE (sccm) | 1550 |
| SPECIES OF SILICON COMPOUND GAS | $SiCl_2H_2$ |
| CONCENTRATION* (%) | 0.02 |
| TYPE OF APPLIED POWER | MW |
| POWER (W/cm$^3$) | 1.2 |
| PRESSURE (Torr) | 0.006 |
| SUBSTRATE TEMPERATURE (°C.) | 30~420 |

*: (SILICON COMPOUND GAS FLOW RATE)/($H_2$ GAS FLOW RATE)

(2)

| SC-EMB-A17 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.8 | | | | 140 | 230 | | |
| RF i-LAYER | | 3.5 | | | 100 | | | |
| MW i-LAYER | 40 | | | 40 | 100 | | | |
| RF i-LAYER | | 3.5 | | | 100 | | | |
| RF p-LAYER | | | 0.1 | | 80 | | 9 | 2 |
| RF n-LAYER | 1.1 | | | | 40 | 290 | | |
| RF i-LAYER | | 3.5 | | | 90 | | | |
| MW i-LAYER | 35 | | | 20 | 120 | | | |
| RF i-LAYER | | 3 | | | 90 | | | |
| RF p-LAYER | | | 0.2 | | 80 | | 9 | 2 |
| RF n-LAYER | 0.8 | | | | 50 | 250 | | |
| RF i-LAYER | | 1.5 | | | 80 | | | |
| RF p-LAYER | | | 0.4 | | 90 | | 8 | 2 |

| SC-EMB-A17 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.3 | | 0.04 | 380 | 22 |
| RF i-LAYER | 0.8 | | 0.08 | 300 | 10 |
| MW i-LAYER | 0.010 | 0.25 | 0.7 | 370 | 110 |
| RF i-LAYER | 0.75 | | 0.08 | 350 | 23 |
| RF p-LAYER | 1.8 | | 0.07 | 300 | 10 |
| RF n-LAYER | 1.1 | | 0.04 | 300 | 10 |
| RF i-LAYER | 0.75 | | 0.08 | 300 | 10 |
| MW i-LAYER | 0.013 | 0.2 | 0.6 | 350 | 100 |
| RF i-LAYER | 0.7 | | 0.08 | 280 | 23 |
| RF p-LAYER | 1.7 | | 0.07 | 260 | 10 |
| RF n-LAYER | 1.05 | | 0.04 | 230 | 10 |
| RF i-LAYER | 0.8 | | 0.07 | 190 | 90 |
| RF p-LAYER | 1.6 | | 0.07 | 170 | 10 |

(3)

| SUBSTRATE TEMPERATURE (°C.) | 30 | 40 | 50 | 100 | 200 | 250 | 300 | 320 | 350 | 420 |
|---|---|---|---|---|---|---|---|---|---|---|
| UNIFORMITY IN CHARACTERISTICS | X | Δ | ○ | ○ | ○ | ○ | ○ | X | X | X |
| ADHESION | X | Δ | ○ | ○ | ○ | ○ | ○ | X | X | X |
| DURABILITY | X | Δ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS

OTHER CONDITIONS

| | |
|---|---|
| FLOW RATE OF $H_2$ GAS CONTAINING SILICON COMPOUND GAS (sccm): | 1550 |
| SPECIES OF SILICON COMPOUND GAS: | $SiCl_2H_2$ |
| CONCENTRATION OF SILICON COMPOUND GAS TO $H_2$ GAS (%): | 0.02 |
| APPLIED POWER: | MW |
| POWER DENSITY (W/cm$^3$): | 1.2 |
| PRESSURE (Torr): | 0.006 |

TABLE B1

(1)

| | |
|---|---|
| $H_2$ GAS FLOW RATE (sccm) | 750 |
| SPECIES OF SILICON COMPOUND GAS | $SiH_4/H_2$ |
| CONCENTRATION* (%) | 0.04 |
| TYPE OF APPLIED POWER | RF |
| POWER (W/cm$^3$) | 0.04 |
| PRESSURE (Torr) | 1.1 |
| SUBSTRATE TEMPERATURE (°C.) | 360 |

*: ($SiH_4$ GAS FLOW RATE)/(TOTAL $H_2$ GAS FLOW RATE)

(2)

| SC-EMB-B1 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 2 | | | | 100 | 200 | | |
| n/i BUFFER LAYER | | 4 | | | 100 | | | |
| MW i-LAYER | 38 | | | 35 | 120 | | | |
| P/i BUFFER LAYER | | 2 | | | 80 | | | |
| RF p-LAYER | | | 0.3 | | 50 | | 10 | 2 |

| SC-EMB-B1 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.05 | 360 | 20 |
| n/i BUFFER LAYER | 0.8 | | 0.07 | 360 | 10 |
| MW i-LAYER | 0.006 | 0.25 | 0.6 | 360 | 150 |
| P/i BUFFER LAYER | 0.7 | | 0.07 | 250 | 20 |
| RF p-LAYER | 1.8 | | 0.07 | 200 | 10 |

TABLE B2

(1)

| | |
|---|---|
| $H_2$ GAS FLOW RATE (sccm) | 700 |
| SPECIES OF SILICON COMPOUND GAS | $Si_2H_6/H_2$ |
| CONCENTRATION* (%) | 0.02 |
| TYPE OF APPLIED POWER | VHF |
| POWER (W/cm$^3$) | 0.08 |
| PRESSURE (Torr) | 0.010 |
| SUBSTRATE TEMPERATURE (°C.) | 285 |

*: ($Si_2H_6$ GAS FLOW RATE)/(TOTAL $H_2$ GAS FLOW RATE)

(2)

| | |
|---|---|
| $H_2$ GAS FLOW RATE (sccm) | 600 |
| SPECIES OF SILICON COMPOUND GAS | $SiH_4/H_2$ |
| CONCENTRATION* (%) | 0.06 |
| TYPE OF APPLIED POWER | RF |
| POWER (W/cm$^3$) | 0.02 |
| PRESSURE (Torr) | 1.0 |
| SUBSTRATE TEMPERATURE (°C.) | 200 |

*: ($SiH_4$ GAS FLOW RATE)/(TOTAL $H_2$ GAS FLOW RATE)

(3)

| SC-EMB-B2 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 2 | | | | 100 | 200 | | |
| n/i BUFFER LAYER | | 4 | | | 100 | | | |
| MW i-LAYER | 45 | | | 35 | 130 | | | |
| p/i BUFFER LAYER | | 2 | | | 80 | | | |
| RF p-LAYER | | | 0.3 | | 60 | | 10 | 2 |
| RF n-LAYER | 2 | | | | 50 | 250 | | |
| n/i BUFFER LAYER | | 0.5 | 0.2 | | 50 | | | |
| RF i-LAYER | | 2 | | | 60 | | | |
| p/i BUFFER LAYER | | 0.5 | 0.3 | | 50 | | | |
| RF p-LAYER | | | 0.3 | | 60 | | 10 | 2 |

| SC-EMB-B2 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.05 | 380 | 20 |
| n/i BUFFER LAYER | 0.8 | | 0.08 | 360 | 10 |
| MW i-LAYER | 0.005 | 0.25 | 0.60 | 380 | 150 |
| p/i BUFFER LAYER | 0.7 | | 0.07 | 250 | 20 |
| RF p-LAYER | 2.0 | | 0.07 | 250 | 10 |
| RF n-LAYER | 1.1 | | 0.04 | 250 | 10 |
| n/i BUFFER LAYER | 1.5 | | 0.06 | 250 | 10 |
| RF i-LAYER | 0.6 | | 0.07 | 200 | 110 |
| p/i BUFFER LAYER | 1.3 | | 0.06 | 200 | 15 |
| RF p-LAYER | 2.0 | | 0.07 | 170 | 10 |

TABLE B3

(1)

| | |
|---|---|
| $H_2$ GAS FLOW RATE (sccm) | 400 |
| SPECIES OF SILICON COMPOUND GAS | $SiCl_2H_2/He$ |
| CONCENTRATION* (%) | 0.08 |
| TYPE OF APPLIED POWER | MW |
| POWER ($W/cm^3$) | 0.1 |
| PRESSURE (Torr) | 0.010 |
| SUBSTRATE TEMPERATURE (°C.) | 350 |

*: ($SiCl_2H_2$ GAS FLOW RATE)/(TOTAL $H_2$ GAS FLOW RATE)

(2)

| | |
|---|---|
| $H_2$ GAS FLOW RATE (sccm) | 500 |
| SPECIES OF SILICON COMPOUND GAS | $SiH_4/H_2$ |
| CONCENTRATION* (%) | 0.07 |
| TYPE OF APPLIED POWER | RF |
| POWER ($W/cm^3$) | 0.04 |
| PRESSURE (Torr) | 1.1 |
| SUBSTRATE TEMPERATURE (°C.) | 300 |

*: ($SiH_4$ GAS FLOW RATE)/(TOTAL $H_2$ GAS FLOW RATE)

(3)

| | |
|---|---|
| $H_2$ GAS FLOW RATE (sccm) | 700 |
| SPECIES OF SILICON COMPOUND GAS | $SiH_4/H_2$ |
| CONCENTRATION* (%) | 0.04 |
| TYPE OF APPLIED POWER | RF |
| POWER ($W/cm^3$) | 0.03 |
| PRESSURE (Torr) | 1.0 |
| SUBSTRATE TEMPERATURE (°C.) | 230 |

*: ($SiH_4$ GAS FLOW RATE)/(TOTAL $H_2$ GAS FLOW RATE)

(4)

| SC-EMB-B3 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 100 | 200 | | |
| n/i BUFFER LAYER | | 4 | | | 100 | | | |
| MW i-LAYER | 50 | | | 50 | 150 | | | |
| p/i BUFFER LAYER | | 4 | | | 100 | | | |
| RF p-LAYER | | | 0.1 | | 60 | | 10 | 2 |
| RF n-LAYER | 1.1 | | | | 50 | 250 | | |
| n/i BUFFER LAYER | | 4 | | | 80 | | | |
| MW i-LAYER | 42 | | | 36 | 140 | | | |
| p/i BUFFER LAYER | | 3 | | | 80 | | | |
| RF p-LAYER | | | 0.2 | | 60 | | 10 | 2 |
| RF n-LAYER | 0.8 | | | | 50 | 250 | | |
| n/i BUFFER LAYER | | 0.4 | 0.2 | | 50 | | | |
| RF i-LAYER | | 2 | | | 70 | | | |
| p/i BUFFER LAYER | | 0.4 | 0.25 | | 50 | | | |
| RF p-LAYER | | | 0.3 | | 60 | | 10 | 2 |

| SC-EMB-B3 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.3 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.25 | | 0.06 | 200 | 12 |
| RF p-LAYER | 1.6 | | 0.07 | 170 | 10 |

TABLE B4

(1)

| | |
|---|---|
| $H_2$ GAS FLOW RATE (sccm) | 0.1~2500 |
| SPECIES OF SILICON COMPOUND GAS | $SiH_4$ |
| CONCENTRATION* (%) | 0.04 |
| TYPE OF APPLIED POWER | RF |
| POWER (W/cm$^3$) | 0.4 |
| PRESSURE (Torr) | 1.0 |
| SUBSTRATE TEMPERATURE (°C.) (FIRST/SECOND/THIRD) | 300, 300, 230 |

*: (SILICON COMPOUND GAS FLOW RATE)/($H_2$ GAS FLOW RATE)

(2)

| SC-EMB-B4 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 100 | 200 | | |
| n/i BUFFER LAYER | | 4 | | | 100 | | | |
| MW i-LAYER | 50 | | | 48 | 150 | | | |
| p/i BUFFER LAYER | | 4 | | | 100 | | | |
| RF p-LAYER | | | 0.1 | | 60 | | 10 | 2 |
| RF n-LAYER | 1.1 | | | | 50 | 250 | | |
| n/i BUFFER LAYER | | 4 | | | 80 | | | |
| MW i-LAYER | 40 | | | 36 | 140 | | | |
| p/i BUFFER LAYER | | 3 | | | 80 | | | |
| RF p-LAYER | | | 0.2 | | 60 | | 10 | 2 |
| RF n-LAYER | 0.8 | | | | 50 | 250 | | |
| n/i BUFFER LAYER | | 0.4 | 0.2 | | 50 | | | |
| RF i-LAYER | | 2 | | | 70 | | | |
| p/i BUFFER LAYER | | 0.4 | 0.25 | | 50 | | | |
| RF p-LAYER | | | 0.3 | | 60 | | 10 | 2 |

| SC-EMB-B4 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.3 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| $H_2$ GAS FLOW RATE* (sccm) | 0.1 | 0.5 | 0.8 | 1 | 10 | 100 | 1000 | 2000 | 2030 | 2100 | 2500 |
|---|---|---|---|---|---|---|---|---|---|---|---|
| CURVE FACTOR | X | X | Δ | ○ | ○ | ○ | ○ | ○ | ○ | Δ | X |
| OPTICAL DURABILITY | X | Δ | ○ | ○ | ○ | ○ | ○ | ○ | Δ | X | X |
| UNIFORMITY IN CHARACTERISTICS | X | X | Δ | ○ | ○ | ○ | ○ | ○ | Δ | X | X |
| ADHESION | X | X | Δ | ○ | ○ | ○ | ○ | ○ | ○ | Δ | X |
| DURABILITY | X | Δ | ○ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS
*: CONTAINING OF SILICON COMPOUND GAS

OTHER CONDITIONS

| | |
|---|---|
| SPECIES OF SILICON COMPOUND GAS: | $SiH_4$ |
| CONCENTRATION OF SILICON COMPOUND GAS (%): | 0.04 |
| APPLIED POWER: | RF |
| POWER DENSITY (W/cm$^3$): | 0.4 |
| PRESSURE (Torr): | 1.0 |
| SUBSTRATE TEMPERATURE (°C.): | 300/300/230 |

TABLE B5

(1)

| | |
|---|---|
| $H_2$ GAS FLOW RATE (sccm) | 0.1~2500 |
| SPECIES OF SILICON COMPOUND GAS | $SiH_4$ |
| CONCENTRATION* (%) | 0.07 |
| TYPE OF APPLIED POWER | VHF |
| POWER (W/cm³) | 0.3 |
| PRESSURE (Torr) | 0.003 |
| SUBSTRATE TEMPERATURE (°C.) (FIRST/SECOND/THIRD) | 290/290/230 |

*: (SILICON COMPOUND GAS FLOW RATE)/($H_2$ GAS FLOW RATE)

(2)

| SC-EMB-B5 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 100 | 200 | | |
| n/i BUFFER LAYER | | 4 | | | 100 | | | |
| MW i-LAYER | 48 | | | 48 | 150 | | | |
| p/i BUFFER LAYER | | 3.5 | | | 100 | | | |
| RF p-LAYER | | | 0.1 | | 60 | | 10 | 2 |
| RF n-LAYER | 1.1 | | | | 50 | 250 | | |
| n/i BUFFER LAYER | | 4 | | | 80 | | | |
| MW i-LAYER | 40 | | | 35 | 140 | | | |
| p/i BUFFER LAYER | | 3 | | | 80 | | | |
| RF p-LAYER | | | 0.2 | | 60 | | 10 | 2 |
| RF n-LAYER | 0.8 | | | | 50 | 250 | | |
| n/i BUFFER LAYER | | 0.4 | 0.2 | | 50 | | | |
| RF i-LAYER | | 2 | | | 60 | | | |
| p/i BUFFER LAYER | | 0.4 | 0.25 | | 50 | | | |
| RF p-LAYER | | | 0.3 | | 60 | | 10 | 2 |

| SC-EMB-B5 | PRESSURE Torr | MW POWER W/cm³ | RF POWER W/cm³ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| $H_2$ GAS FLOW RATE* (sccm) | 0.1 | 0.5 | 0.8 | 1 | 10 | 100 | 1000 | 2000 | 2030 | 2100 | 2500 |
|---|---|---|---|---|---|---|---|---|---|---|---|
| CURVE FACTOR | X | X | Δ | ○ | ○ | ○ | ○ | ○ | ○ | Δ | X |
| OPTICAL DURABILITY | X | Δ | ○ | ○ | ○ | ○ | ○ | ○ | Δ | X | X |
| UNIFORMITY IN CHARACTERISTICS | X | X | Δ | ○ | ○ | ○ | ○ | ○ | ○ | Δ | X |
| ADHESION | X | X | Δ | ○ | ○ | ○ | ○ | ○ | Δ | Δ | X |
| DURABILITY | X | Δ | ○ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS
*: CONTAINING OF SILICON COMPOUND GAS

OTHER CONDITIONS

| | |
|---|---|
| SPECIES OF SILICON COMPOUND GAS: | $SiH_4$ |
| CONCENTRATION OF SILICON COMPOUND GAS (%): | 0.07 |
| APPLIED POWER: | VHF |
| POWER DENSITY (W/cm³): | 0.3 |
| PRESSURE (Torr): | 0.003 |
| SUBSTRATE TEMPERATURE (°C.): | 290/290/230 |

TABLE B6

(1)

| | |
|---|---|
| $H_2$ GAS FLOW RATE (sccm) | 1200 |
| SPECIES OF SILICON COMPOUND GAS | $SiH_4$ |
| CONCENTRATION* (%) | 0.0003~0.14 |
| TYPE OF APPLIED POWER | RF |
| POWER ($W/cm^3$) | 0.1 |
| PRESSURE (Torr) | 0.8 |
| SUBSTRATE TEMPERATURE (°C.) (FIRST/SECOND/THIRD) | 300/300/230 |

*: (SILICON COMPOUND GAS FLOW RATE)/($H_2$ GAS FLOW RATE)

(2)

| SC-EMB-B6 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 100 | 200 | | |
| n/i BUFFER LAYER | | 4 | | | 100 | | | |
| MW i-LAYER | 47 | | | 48 | 150 | | | |
| p/i BUFFER LAYER | | 3.5 | | | 100 | | | |
| RF p-LAYER | | | 0.1 | | 60 | | 12 | 2 |
| RF n-LAYER | 1.1 | | | | 50 | 250 | | |
| n/i BUFFER LAYER | | 4 | | | 80 | | | |
| MW i-LAYER | 40 | | | 34 | 140 | | | |
| p/i BUFFER LAYER | | 3 | | | 80 | | | |
| RF p-LAYER | | | 0.2 | | 60 | | 11 | 2 |
| RF n-LAYER | 0.8 | | | | 50 | 250 | | |
| n/i BUFFER LAYER | | 0.4 | 0.2 | | 50 | | | |
| RF i-LAYER | | 2 | | | 60 | | | |
| p/i BUFFER LAYER | | 0.4 | 0.25 | | 50 | | | |
| RF p-LAYER | | | 0.3 | | 60 | | 10 | 2 |

| SC-EMB-B6 | PRESSURE Torr | MW POWER $W/cm^3$ | RF POWER $W/cm^3$ | SUBSTRATE TEMPERATURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| CONCENTRATION* (%) | 0.0003 | 0.0008 | 0.001 | 0.005 | 0.01 | 0.08 | 0.1 | 0.105 | 0.12 | 0.14 |
|---|---|---|---|---|---|---|---|---|---|---|
| CURVE FACTOR | X | Δ | ○ | ○ | ○ | ○ | ○ | ○ | Δ | X |
| OPTICAL DURABILITY | Δ | ○ | ○ | ○ | ○ | ○ | ○ | Δ | X | X |
| UNIFORMITY IN CHARACTERISTICS | X | Δ | ○ | ○ | ○ | ○ | ○ | Δ | X | X |
| ADHESION | X | Δ | ○ | ○ | ○ | ○ | ○ | X | X | X |
| DURABILITY | X | X | ○ | ○ | ○ | ○ | ○ | X | X | X |

○: EXCELLENT FOR PRACTICAL USE
Δ: GOOD FOR PRACTICAL USE
X: NO GOOD FOR SOME APPLICATIONS
*: CONCENTRATION OF SILICON COMPOUND GAS MIXED WITH $H_2$ GAS TO $H_2$ GAS

OTHER CONDITIONS

| | |
|---|---|
| FLOW RATE OF $H_2$ GAS CONTAINING SILICON COMPOUND GAS (sccm): | 1200 |
| SPECIES OF SILICON COMPOUND GAS: | $SiH_4$ |
| APPLIED POWER: | RF |
| POWER DENSITY ($W/cm^3$): | 0.1 |
| PRESSURE (Torr): | 0.8 |
| SUBSTRATE TEMPERATURE (°C.): | 300/300/230 |

TABLE B7

(1)

| | |
|---|---|
| $H_2$ GAS FLOW RATE (sccm) | 1100 |
| SPECIES OF SILICON COMPOUND GAS | $SiH_4$ |
| CONCENTRATION* (%) | 0.0003~0.14 |
| TYPE OF APPLIED POWER | VHF |
| POWER ($W/cm^3$) | 0.12 |
| PRESSURE (Torr) | 0.08 |
| SUBSTRATE TEMPERATURE (°C.) (FIRST/SECOND/THIRD) | 290/290/230 |

*: (SILICON COMPOUND GAS FLOW RATE)/($H_2$ GAS FLOW RATE)

(2)

| SC-EMB-B7 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.8 | | | | 130 | 200 | | |
| n/i BUFFER LAYER | | 4 | | | 100 | | | |
| MW i-LAYER | 47 | | | 50 | 200 | | | |
| p/i BUFFER LAYER | | 3.5 | | | 100 | | | |
| RF p-LAYER | | | 0.1 | | 60 | | 12 | 2 |
| RF n-LAYER | 1.1 | | | | 50 | 250 | | |
| n/i BUFFER LAYER | | 4 | | | 80 | | | |
| MW i-LAYER | 35 | | | 34 | 140 | | | |
| p/i BUFFER LAYER | | 3 | | | 80 | | | |
| RF p-LAYER | | | 0.2 | | 60 | | 11 | 2 |
| RF n-LAYER | 0.8 | | | | 50 | 250 | | |
| n/i BUFFER LAYER | | 0.4 | 0.2 | | 50 | | | |
| RF i-LAYER | | 2.5 | | | 60 | | | |
| p/i BUFFER LAYER | | 0.4 | 0.25 | | 50 | | | |
| RF p-LAYER | | | 0.3 | | 60 | | 10 | 2 |

| SC-EMB-B7 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| CONCENTRATION* (%) | 0.0003 | 0.0008 | 0.001 | 0.005 | 0.01 | 0.08 | 0.1 | 0.105 | 0.12 | 0.14 |
|---|---|---|---|---|---|---|---|---|---|---|
| CURVE FACTOR | X | Δ | ○ | ○ | ○ | ○ | ○ | ○ | Δ | X |
| OPTICAL DURABILITY | Δ | ○ | ○ | ○ | ○ | ○ | ○ | Δ | X | X |
| UNIFORMITY IN CHARACTERISTICS | X | Δ | ○ | ○ | ○ | ○ | ○ | Δ | X | X |
| ADHESION | X | Δ | ○ | ○ | ○ | ○ | ○ | X | X | X |
| DURABILITY | X | Δ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS
*: CONCENTRATION OF SILICON COMPOUND GAS MIXED WITH $H_2$ GAS TO $H_2$ GAS

OTHER CONDITIONS

| | |
|---|---|
| FLOW RATE OF $H_2$ GAS CONTAINING SILICON COMPOUND GAS (sccm): | 1100 |
| SPECIES OF SILICON COMPOUND GAS: | $SiH_4$ |
| APPLIED POWER: | VHF |
| POWER DENSITY ($W/cm^3$): | 0.12 |
| PRESSURE (Torr): | 0.08 |
| SUBSTRATE TEMPERATURE (°C.): | 290/290/230 |

TABLE B8

(1)

| | |
|---|---|
| $H_2$ GAS FLOW RATE (sccm) | 1000 |
| SPECIES OF SILICON COMPOUND GAS | $SiH_4$ |
| CONCENTRATION* (%) | 0.0003~0.14 |
| TYPE OF APPLIED POWER | MW |
| POWER ($W/cm^3$) | 0.10 |
| PRESSURE (Torr) | 0.007 |
| SUBSTRATE TEMPERATURE (°C.) (FIRST/SECOND/THIRD) | 200/200/200 |

*: (SILICON COMPOUND GAS FLOW RATE)/($H_2$ GAS FLOW RATE)

(2)

| SC-EMB-B8 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.8 | | | | 130 | 200 | | |
| n/i BUFFER LAYER | | 4 | | | 100 | | | |
| MW i-LAYER | 47 | | | 51 | 200 | | | |
| p/i BUFFER LAYER | | 3.5 | | | 100 | | | |
| RF p-LAYER | | | 0.1 | | 60 | | 12 | 2 |
| RF n-LAYER | 1.1 | | | | 50 | 270 | | |
| n/i BUFFER LAYER | | 4 | | | 80 | | | |
| MW i-LAYER | 35 | | | 36 | 140 | | | |
| p/i BUFFER LAYER | | 3 | | | 80 | | | |
| RF p-LAYER | | | 0.2 | | 60 | | 11 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 60 | | | |
| p/i BUFFER LAYER | | 0.4 | 0.25 | | 50 | | | |
| RF p-LAYER | | | 0.3 | | 60 | | 10 | 2 |

| SC-EMB-B8 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| CONCENTRATION* (%) | 0.0003 | 0.0008 | 0.001 | 0.005 | 0.01 | 0.08 | 0.1 | 0.105 | 0.12 | 0.14 |
|---|---|---|---|---|---|---|---|---|---|---|
| CURVE FACTOR | X | Δ | ○ | ○ | ○ | ○ | ○ | ○ | Δ | X |
| OPTICAL DURABILITY | X | Δ | ○ | ○ | ○ | ○ | ○ | Δ | X | X |
| UNIFORMITY IN CHARACTERISTICS | X | Δ | ○ | ○ | ○ | ○ | ○ | Δ | X | X |
| ADHESION | X | Δ | ○ | ○ | ○ | ○ | ○ | Δ | X | X |
| DURABILITY | X | Δ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS
*: CONCENTRATION OF SILICON COMPOUND GAS MIXED WITH $H_2$ GAS TO $H_2$ GAS

OTHER CONDITIONS

| | |
|---|---|
| FLOW RATE OF $H_2$ GAS CONTAINING SILICON COMPOUND GAS (sccm): | 1000 |
| SPECIES OF SILICON COMPOUND GAS: | $SiH_4$ |
| APPLIED POWER: | MW |
| POWER DENSITY ($W/cm^3$): | 0.10 |
| PRESSURE (Torr): | 0.007 |
| SUBSTRATE TEMPERATURE (°C.): | 200/200/200 |

TABLE B9

(1)

| | |
|---|---|
| $H_2$ GAS FLOW RATE (sccm) | 700 |
| SPECIES OF SILICON COMPOUND GAS | $Si_2H_6$ |
| CONCENTRATION* (%) | 0.06 |
| TYPE OF APPLIED POWER | RF |
| POWER ($W/cm^3$) | 0.6 |
| PRESSURE (Torr) | 0.01~100 |
| SUBSTRATE TEMPERATURE (°C.) (FIRST/SECOND/THIRD) | 300/300/230 |

*: (SILICON COMPOUND GAS FLOW RATE)/($H_2$ GAS FLOW RATE)

(2)

| SC-EMB-B9 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.8 | | | | 130 | 200 | | |
| n/i BUFFER LAYER | | 5 | | | 100 | | | |
| MW i-LAYER | 50 | | | 51 | 200 | | | |
| p/i BUFFER LAYER | | 3.5 | | | 100 | | | |
| RF p-LAYER | | | 0.1 | | 60 | | 12 | 2 |
| RF n-LAYER | 1.1 | | | | 50 | 270 | | |
| n/i BUFFER LAYER | | 4 | | | 80 | | | |
| MW i-LAYER | 34 | | | 36 | 140 | | | |
| p/i BUFFER LAYER | | 0.5 | 0.3 | | 60 | | | |
| RF p-LAYER | | | 0.2 | | 60 | | 11 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 60 | | | |
| p/i BUFFER LAYER | | 0.4 | 0.25 | | 50 | | | |
| RF p-LAYER | | | 0.3 | | 60 | | 10 | 2 |

| SC-EMB-B9 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| PRESSURE (Torr) | 0.01 | 0.03 | 0.05 | 1 | 3 | 5 | 10 | 11 | 20 | 100 |
|---|---|---|---|---|---|---|---|---|---|---|
| CURVE FACTOR | X | Δ | ○ | ○ | ○ | ○ | ○ | Δ | X | X |
| OPTICAL DURABILITY | X | Δ | ○ | ○ | ○ | ○ | ○ | ○ | Δ | X |
| UNIFORMITY IN CHARACTERISTICS | X | X | ○ | ○ | ○ | ○ | ○ | Δ | X | X |
| ADHESION | X | Δ | ○ | ○ | ○ | ○ | ○ | Δ | X | X |
| DURABILITY | X | X | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS

OTHER CONDITIONS

| | |
|---|---|
| FLOW RATE OF $H_2$ GAS CONTAINING SILICON COMPOUND GAS (sccm): | 700 |
| SPECIES OF SILICON COMPOUND GAS: | $Si_2H_6$ |
| CONCENTRATION OF SILICON COMPOUND GAS TO $H_2$ GAS (%): | 0.06 |
| APPLIED POWER: | RF |
| POWER DENSITY ($W/cm^3$): | 0.6 |
| SUBSTRATE TEMPERATURE (°C.): | 300/300/230 |

TABLE B10

(1)

| | |
|---|---|
| $H_2$ GAS FLOW RATE (sccm) | 1100 |
| SPECIES OF SILICON COMPOUND GAS | $Si_2H_6$ |
| CONCENTRATION* (%) | 0.006 |
| TYPE OF APPLIED POWER | VHF |
| POWER ($W/cm^3$) | 0.016 |
| PRESSURE (mTorr) | 0.03~10000 |
| SUBSTRATE TEMPERATURE (°C.) (FIRST/SECOND/THIRD) | 270/270/230 |

*: (SILICON COMPOUND GAS FLOW RATE)/($H_2$ GAS FLOW RATE)

(2)

| SC-EMB-B10 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.8 | | | | 130 | 200 | | |
| n/i BUFFER LAYER | | 5 | | | 100 | | | |
| MW i-LAYER | 49 | | | 51 | 230 | | | |
| p/i BUFFER LAYER | | 3.5 | | | 100 | | | |
| RF p-LAYER | | | 0.1 | | 60 | | 11 | 2 |
| RF n-LAYER | 1.1 | | | | 50 | 270 | | |
| n/i BUFFER LAYER | | 4 | | | 80 | | | |
| MW i-LAYER | 34 | | | 36 | 150 | | | |
| p/i BUFFER LAYER | | 0.4 | 0.2 | | 60 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 60 | | | |
| p/i BUFFER LAYER | | 0.4 | 0.25 | | 50 | | | |
| RF p-LAYER | | | 0.3 | | 60 | | 10 | 2 |

| SC-EMB-B10 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| CONCENTRATION* (%) | 0.03 | 0.08 | 0.1 | 1 | 100 | 500 | 1000 | 1100 | 2000 | 10000 |
|---|---|---|---|---|---|---|---|---|---|---|
| CURVE FACTOR | X | Δ | ○ | ○ | ○ | ○ | ○ | ○ | Δ | X |
| OPTICAL DURABILITY | Δ | ○ | ○ | ○ | ○ | ○ | ○ | ○ | Δ | X |
| UNIFORMITY IN CHARACTERISTICS | X | X | ○ | ○ | ○ | ○ | ○ | Δ | X | X |
| ADHESION | X | Δ | ○ | ○ | ○ | ○ | ○ | Δ | X | X |
| DURABILITY | X | Δ | ○ | ○ | ○ | ○ | ○ | X | X | X |

○: EXCELLENT FOR PRACTICAL USE
Δ: GOOD FOR PRACTICAL USE
X: NO GOOD FOR SOME APPLICATIONS

OTHER CONDITIONS

| | |
|---|---|
| FLOW RATE OF $H_2$ GAS CONTAINING SILICON COMPOUND GAS (sccm): | 1100 |
| SPECIES OF SILICON COMPOUND GAS: | $Si_2H_6$ |
| CONCENTRATION OF SILICON COMPOUND GAS TO $H_2$ GAS (%): | 0.006 |
| APPLIED POWER: | VHF |
| POWER DENSITY ($W/cm^3$): | 0.016 |
| SUBSTRATE TEMPERATURE (°C.): | 270/270/230 |

TABLE B11

(1)

| | |
|---|---|
| $H_2$ GAS FLOW RATE (sccm) | 950 |
| SPECIES OF SILICON COMPOUND GAS | $SiF_4$ |
| CONCENTRATION* (%) | 0.03 |
| TYPE OF APPLIED POWER | MW |
| POWER (W/cm$^3$) | 0.10 |
| PRESSURE (Torr) | 0.03~100 |
| SUBSTRATE TEMPERATURE (°C.) | 200 |

*: (SILICON COMPOUND GAS FLOW RATE)/($H_2$ GAS FLOW RATE)

(2)

| SC-EMB-B11 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.7 | | | | 130 | 200 | | |
| n/i BUFFER LAYER | | 4 | | | 100 | | | |
| MW i-LAYER | 49 | | | 51 | 250 | | | |
| p/i BUFFER LAYER | | 3.5 | | | 100 | | | |
| RF p-LAYER | | | 0.1 | | 60 | | 10 | 2 |
| RF n-LAYER | 1.1 | | | | 50 | 270 | | |
| n/i BUFFER LAYER | | 0.4 | 0.2 | | 80 | | | |
| MW i-LAYER | 34 | | | 36 | 170 | | | |
| p/i BUFFER LAYER | | 0.4 | 0.2 | | 60 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 60 | | | |
| p/i BUFFER LAYER | | 0.4 | 0.25 | | 50 | | | |
| RF p-LAYER | | | 0.3 | | 60 | | 10 | 2 |

| SC-EMB-B11 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| PRESSURE (Torr) | 0.03 | 0.08 | 0.1 | 0.5 | 1 | 5 | 10 | 11 | 20 | 100 |
|---|---|---|---|---|---|---|---|---|---|---|
| CURVE FACTOR | X | Δ | ○ | ○ | ○ | ○ | ○ | ○ | Δ | X |
| OPTICAL DURABILITY | X | Δ | ○ | ○ | ○ | ○ | ○ | ○ | Δ | X |
| UNIFORMITY IN CHARACTERISTICS | X | Δ | ○ | ○ | ○ | ○ | ○ | Δ | X | X |
| ADHESION | X | Δ | ○ | ○ | ○ | ○ | ○ | Δ | X | X |
| DURABILITY | X | Δ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS

OTHER CONDITIONS

| | |
|---|---|
| FLOW RATE OF $H_2$ GAS CONTAINING SILICON COMPOUND GAS (sccm): | 950 |
| SPECIES OF SILICON COMPOUND GAS: | $SiF_4$ |
| CONCENTRATION OF SILICON COMPOUND GAS TO $H_2$ GAS (%) | 0.03 |
| APPLIED POWER: | MW |
| POWER DENSITY (W/cm$^3$): | 0.10 |
| SUBSTRATE TEMPERATURE (°C.): | 200 |

TABLE B12

(1)

| | |
|---|---|
| $H_2$ GAS FLOW RATE (sccm) | 400 |
| SPECIES OF SILICON COMPOUND GAS | $SiH_4$ |
| CONCENTRATION* (%) | 0.04 |
| TYPE OF APPLIED POWER | RF |
| POWER (W/cm$^3$) | 0.003~10 |
| PRESSURE (Torr) | 0.65 |
| SUBSTRATE TEMPERATURE (°C.) | 250 |

*: (SILICON COMPOUND GAS FLOW RATE)/($H_2$ GAS FLOW RATE)

(2)

| SC-EMB-B12 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.7 | | | | 130 | 200 | | |
| n/i BUFFER LAYER | | 4 | | | 130 | | | |
| MW i-LAYER | 46 | | | 51 | 280 | | | |
| p/i BUFFER LAYER | | 3.5 | | | 120 | | | |
| RF p-LAYER | | | 0.1 | | 60 | | 10 | 2 |
| RF n-LAYER | 1.1 | | | | 50 | 270 | | |
| n/i BUFFER LAYER | | 0.4 | 0.2 | | 80 | | | |
| MW i-LAYER | 33 | | | 36 | 180 | | | |
| p/i BUFFER LAYER | | 0.4 | 0.2 | | 60 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 70 | | | |
| p/i BUFFER LAYER | | 0.4 | 0.25 | | 50 | | | |
| RF p-LAYER | | | 0.3 | | 60 | | 10 | 2 |

| SC-EMB-B12 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| POWER DENSITY (W/cm$^3$) | 0.003 | 0.007 | 0.01 | 0.05 | 0.1 | 0.7 | 1.0 | 1.1 | 3.0 | 10 |
|---|---|---|---|---|---|---|---|---|---|---|
| CURVE FACTOR | X | Δ | O | O | O | O | O | O | Δ | X |
| OPTICAL DURABILITY | Δ | O | O | O | O | O | O | O | Δ | X |
| UNIFORMITY IN CHARACTERISTICS | X | Δ | O | O | O | O | O | O | Δ | X |
| ADHESION | X | Δ | O | O | O | O | O | Δ | X | X |
| DURABILITY | X | Δ | O | O | O | O | O | Δ | X | X |

O: EXCELLENT FOR PRACTICAL USE
Δ: GOOD FOR PRACTICAL USE
X: NO GOOD FOR SOME APPLICATIONS

OTHER CONDITIONS

| | |
|---|---|
| FLOW RATE OF $H_2$ GAS CONTAINING SILICON COMPOUND GAS (sccm): | 400 |
| SPECIES OF SILICON COMPOUND GAS: | $SiH_4$ |
| CONCENTRATION OF SILICON COMPOUND GAS TO $H_2$ GAS (%): | 0.04 |
| APPLIED POWER: | RF |
| PRESSURE (Torr): | 0.65 |
| SUBSTRATE TEMPERATURE (°C.): | 250 |

TABLE B13

(1)

| | |
|---|---|
| $H_2$ GAS FLOW RATE (sccm) | 1100 |
| SPECIES OF SILICON COMPOUND GAS | $Si_2H_6$ |
| CONCENTRATION* (%) | 0.004 |
| TYPE OF APPLIED POWER | VHF |
| POWER (W/cm$^3$) | 0.003~10 |
| PRESSURE (Torr) | 0.0065 |
| SUBSTRATE TEMPERATURE (°C.) | 140 |

*: (SILICON COMPOUND GAS FLOW RATE)/($H_2$ GAS FLOW RATE)

(2)

| SC-EMB-B13 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.7 | | | | 130 | 200 | | |
| n/i BUFFER LAYER | | 4 | | | 130 | | | |
| MW i-LAYER | 45 | | | 45 | 280 | | | |
| p/i BUFFER LAYER | | 3.5 | | | 120 | | | |
| RF p-LAYER | | | 0.1 | | 60 | | 10 | 2 |
| RF n-LAYER | 1.0 | | | | 30 | 270 | | |
| n/i BUFFER LAYER | | 0.4 | 0.2 | | 80 | | | |
| MW i-LAYER | 33 | | | 30 | 180 | | | |
| p/i BUFFER LAYER | | 0.4 | 0.2 | | 60 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.2 | | | 65 | | | |
| p/i BUFFER LAYER | | 0.4 | 0.25 | | 50 | | | |
| RF p-LAYER | | | 0.3 | | 60 | | 10 | 2 |

| SC-EMB-B13 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| POWER DENSITY (W/cm$^3$) | 0.003 | 0.007 | 0.01 | 0.05 | 0.1 | 0.7 | 1.0 | 1.1 | 3.0 | 10 |
|---|---|---|---|---|---|---|---|---|---|---|
| CURVE FACTOR | X | Δ | ○ | ○ | ○ | ○ | ○ | ○ | Δ | X |
| OPTICAL DURABILITY | X | Δ | ○ | ○ | ○ | ○ | ○ | ○ | Δ | X |
| UNIFORMITY IN CHARACTERISTICS | X | Δ | ○ | ○ | ○ | ○ | ○ | ○ | Δ | X |
| ADHESION | X | Δ | ○ | ○ | ○ | ○ | ○ | Δ | X | X |
| DURABILITY | X | Δ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS

OTHER CONDITIONS

| | |
|---|---|
| FLOW RATE OF $H_2$ GAS CONTAINING SILICON COMPOUND GAS (sccm): | 1100 |
| SPECIES OF SILICON COMPOUND GAS: | $Si_2H_6$ |
| CONCENTRATION OF SILICON COMPOUND GAS TO $H_2$ GAS (%): | 0.004 |
| APPLIED POWER: | VHF |
| PRESSURE (Torr): | 0.0065 |
| SUBSTRATE TEMPERATURE (°C.): | 140 |

TABLE B14

(1)

| | |
|---|---|
| $H_2$ GAS FLOW RATE (sccm) | 1700 |
| SPECIES OF SILICON COMPOUND GAS | $SiCl_2H_2$ |
| CONCENTRATION* (%) | 0.005 |
| TYPE OF APPLIED POWER | MW |
| POWER (W/cm$^3$) | 0.03~100 |
| PRESSURE (Torr) | 0.006 |
| SUBSTRATE TEMPERATURE (°C.) | 130 |

*: (SILICON COMPOUND GAS FLOW RATE)/($H_2$ GAS FLOW RATE)

(2)

| SC-EMB-B14 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.7 | | | | 130 | 200 | | |
| n/i BUFFER LAYER | | 4 | | | 120 | | | |
| MW i-LAYER | 45 | | | 46 | 175 | | | |
| p/i BUFFER LAYER | | 0.35 | 0.2 | | 120 | | | |
| RF p-LAYER | | | 0.1 | | 60 | | 10 | 2 |
| RF n-LAYER | 1.0 | | | | 30 | 270 | | |
| n/i BUFFER LAYER | | 0.4 | 0.2 | | 80 | | | |
| MW i-LAYER | 35 | | | 30 | 180 | | | |
| p/i BUFFER LAYER | | 0.4 | 0.2 | | 70 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.2 | | | 65 | | | |
| p/i BUFFER LAYER | | 0.4 | 0.25 | | 60 | | | |
| RF p-LAYER | | | 0.4 | | 60 | | 10 | 2 |

| SC-EMB-B14 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| POWER DENSITY (W/cm$^3$) | 0.03 | 0.07 | 0.1 | 0.5 | 1 | 7 | 10 | 11 | 30 | 100 |
|---|---|---|---|---|---|---|---|---|---|---|
| CURVE FACTOR | X | Δ | ○ | ○ | ○ | ○ | ○ | Δ | X | X |
| OPTICAL DURABILITY | X | Δ | ○ | ○ | ○ | ○ | ○ | ○ | X | X |
| UNIFORMITY IN CHARACTERISTICS | X | Δ | ○ | ○ | ○ | ○ | ○ | Δ | X | X |
| ADHESION | X | Δ | ○ | ○ | ○ | ○ | ○ | X | X | X |
| DURABILITY | X | Δ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS
OTHER CONDITIONS

| | |
|---|---|
| FLOW RATE OF $H_2$ GAS CONTAINING SILICON COMPOUND GAS (sccm): | 1700 |
| SPECIES OF SILICON COMPOUND GAS: | $SiCl_2H_2$ |
| CONCENTRATION OF SILICON COMPOUND GAS TO $H_2$ GAS (%): | 0.005 |
| APPLIED POWER: | MW |
| PRESSURE (Torr): | 0.006 |
| SUBSTRATE TEMPERATURE (°C.): | 130 |

TABLE B15

(1)

| | |
|---|---|
| $H_2$ GAS FLOW RATE (sccm) | 650 |
| SPECIES OF SILICON COMPOUND GAS | $SiH_4$ |
| CONCENTRATION* (%) | 0.07 |
| TYPE OF APPLIED POWER | RF |
| POWER ($W/cm^3$) | 0.25 |
| PRESSURE (Torr) | 1.2 |
| SUBSTRATE TEMPERATURE (°C.) | 50~520 |

*: (SILICON COMPOUND GAS FLOW RATE)/($H_2$ GAS FLOW RATE)

(2)

| SC-EMB-B15 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.7 | | | | 130 | 200 | | |
| n/i BUFFER LAYER | | 0.4 | 0.1 | | 120 | | | |
| MW i-LAYER | 45 | | | 47 | 100 | | | |
| p/i BUFFER LAYER | | 0.35 | 0.2 | | 120 | | | |
| RF p-LAYER | | | 0.1 | | 60 | | 10 | 2 |
| RF n-LAYER | 1.0 | | | | 30 | 270 | | |
| n/i BUFFER LAYER | | 0.4 | 0.2 | | 80 | | | |
| MW i-LAYER | 35 | | | 28 | 130 | | | |
| p/i BUFFER LAYER | | 0.4 | 0.2 | | 70 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.2 | | | 65 | | | |
| p/i BUFFER LAYER | | 0.4 | 0.25 | | 60 | | | |
| RF p-LAYER | | | 0.4 | | 60 | | 10 | 2 |

| SC-EMB-B15 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| SUBSTRATE TEMPERATURE (°C.) | 50 | 75 | 100 | 150 | 200 | 300 | 400 | 420 | 450 | 520 |
|---|---|---|---|---|---|---|---|---|---|---|
| CURVE FACTOR | X | ○ | ○ | ○ | ○ | ○ | ○ | X | X | X |
| OPTICAL DURABILITY | X | Δ | ○ | ○ | ○ | ○ | ○ | ○ | X | X |
| UNIFORMITY IN CHARACTERISTICS | X | Δ | ○ | ○ | ○ | ○ | ○ | Δ | X | X |
| ADHESION | X | X | ○ | ○ | ○ | ○ | ○ | Δ | X | X |
| DURABILITY | X | X | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS
OTHER CONDITIONS

| | |
|---|---|
| FLOW RATE OF $H_2$ GAS CONTAINING SILICON COMPOUND GAS (sccm): | 650 |
| SPECIES OF SILICON COMPOUND GAS: | $SiH_4$ |
| CONCENTRATION OF SILICON COMPOUND GAS TO $H_2$ GAS (%): | 0.07 |
| APPLIED POWER: | RF |
| POWER DENSITY ($W/cm^3$): | 0.25 |
| PRESSURE (Torr): | 1.2 |

TABLE B16

(1)

| | |
|---|---|
| $H_2$ GAS FLOW RATE (sccm) | 1400 |
| SPECIES OF SILICON COMPOUND GAS | $SiCl_4$ |
| CONCENTRATION* (%) | 0.02 |
| TYPE OF APPLIED POWER | VHF |
| POWER (W/cm³) | 0.25 |
| PRESSURE (Torr) | 0.06 |
| SUBSTRATE TEMPERATURE (°C.) | 30~420 |

*: (SILICON COMPOUND GAS FLOW RATE)/($H_2$ GAS FLOW RATE)

(2)

| SC-EMB-B16 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.7 | | | | 130 | 200 | | |
| n/i BUFFER LAYER | | 0.4 | 0.1 | | 110 | | | |
| MW i-LAYER | 44 | | | 43 | 120 | | | |
| p/i BUFFER LAYER | | 0.35 | 0.2 | | 120 | | | |
| RF p-LAYER | | | 0.1 | | 60 | | 10 | 2 |
| RF n-LAYER | 1.0 | | | | 30 | 270 | | |
| n/i BUFFER LAYER | | 0.4 | 0.2 | | 80 | | | |
| MW i-LAYER | 35 | | | 27 | 130 | | | |
| p/i BUFFER LAYER | | 0.4 | 0.2 | | 70 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.1 | | | 65 | | | |
| p/i BUFFER LAYER | | 0.4 | 0.25 | | 60 | | | |
| RF p-LAYER | | | 0.4 | | 60 | | 10 | 2 |

| SC-EMB-B16 | PRESSURE Torr | MW POWER W/cm³ | RF POWER W/cm³ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| SUBSTRATE TEMPERATURE (°C.) | 30 | 40 | 50 | 100 | 200 | 250 | 300 | 320 | 350 | 420 |
|---|---|---|---|---|---|---|---|---|---|---|
| CURVE FACTOR | X | ○ | ○ | ○ | ○ | ○ | ○ | X | X | X |
| OPTICAL DURABILITY | X | Δ | ○ | ○ | ○ | ○ | ○ | ○ | X | X |
| UNIFORMITY IN CHARACTERISTICS | X | Δ | ○ | ○ | ○ | ○ | ○ | Δ | X | X |
| ADHESION | X | X | ○ | ○ | ○ | ○ | ○ | Δ | X | X |
| DURABILITY | X | X | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS
OTHER CONDITIONS

| | |
|---|---|
| FLOW RATE OF $H_2$ GAS CONTAINING SILICON COMPOUND GAS (sccm): | 1400 |
| SPECIES OF SILICON COMPOUND GAS: | $SiCl_4$ |
| CONCENTRATION OF SILICON COMPOUND GAS TO $H_2$ GAS (%): | 0.02 |
| APPLIED POWER: | VHF |
| POWER DENSITY (W/cm³): | 0.25 |
| PRESSURE (Torr): | 0.06 |

TABLE B17

(1)

| | |
|---|---|
| $H_2$ GAS FLOW RATE (sccm) | 1600 |
| SPECIES OF SILICON COMPOUND GAS | $SiCl_2H_2$ |
| CONCENTRATION* (%) | 0.01 |
| TYPE OF APPLIED POWER | MW |
| POWER (W/cm$^3$) | 0.7 |
| PRESSURE (Torr) | 0.005 |
| SUBSTRATE TEMPERATURE (°C.) | 30~420 |

*: (SILICON COMPOUND GAS FLOW RATE)/($H_2$ GAS FLOW RATE)

(2)

| SC-EMB-B17 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.7 | | | | 130 | 200 | | |
| n/i BUFFER LAYER | | 0.4 | 0.2 | | 110 | | | |
| MW i-LAYER | 42 | | | 43 | 115 | | | |
| p/i BUFFER LAYER | | 0.35 | 0.2 | | 120 | | | |
| RF p-LAYER | | | 0.1 | | 60 | | 10 | 1.7 |
| RF n-LAYER | 1.0 | | | | 30 | 270 | | |
| n/i BUFFER LAYER | | 0.4 | 0.2 | | 80 | | | |
| MW i-LAYER | 33 | | | 27 | 120 | | | |
| p/i BUFFER LAYER | | 0.4 | 0.2 | | 70 | | | |
| RF p-LAYER | | | 0.2 | | 60 | | 10 | 1.8 |
| RF n-LAYER | 0.8 | | | | 50 | 250 | | |
| n/i BUFFER LAYER | | 0.3 | 0.2 | | 50 | | | |
| RF i-LAYER | | 2.1 | | | 65 | | | |
| p/i BUFFER LAYER | | 0.4 | 0.25 | | 60 | | | |
| RF p-LAYER | | | 0.4 | | 60 | | 10 | 1.8 |

| SC-EMB-B17 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| SUBSTRATE TEMPERATURE (°C.) | 30 | 40 | 50 | 100 | 200 | 250 | 300 | 320 | 350 | 420 |
|---|---|---|---|---|---|---|---|---|---|---|
| CURVE FACTOR | X | Δ | ○ | ○ | ○ | ○ | ○ | X | X | X |
| OPTICAL DURABILITY | X | Δ | ○ | ○ | ○ | ○ | ○ | ○ | X | X |
| UNIFORMITY IN CHARACTERISTICS | X | Δ | ○ | ○ | ○ | ○ | ○ | Δ | X | X |
| ADHESION | X | X | ○ | ○ | ○ | ○ | ○ | Δ | X | X |
| DURABILITY | X | X | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS

OTHER CONDITIONS

| | |
|---|---|
| FLOW RATE OF $H_2$ GAS CONTAINING SILICON COMPOUND GAS (sccm): | 1600 |
| SPECIES OF SILICON COMPOUND GAS: | $SiCl_2H_2$ |
| CONCENTRATION OF SILICON COMPOUND GAS TO $H_2$ GAS (%): | 0.01 |
| APPLIED POWER: | MW |
| POWER DENSITY (W/cm$^3$): | 0.7 |
| PRESSURE (Torr): | 0.005 |

TABLE B18

(1)

| | |
|---|---|
| $H_2$ GAS FLOW RATE (sccm) | 800 |
| SPECIES OF SILICON COMPOUND GAS | $SiH_4/H_2$ |
| CONCENTRATION* (%) | 0.05 |
| TYPE OF APPLIED POWER | RF |
| POWER (W/cm$^3$) | 0.03 |
| PRESSURE (Torr) | 1.0 |
| SUBSTRATE TEMPERATURE (°C.) | 360 |

(2)

| | |
|---|---|
| $H_2$ GAS FLOW RATE (sccm) | 700 |
| SPECIES OF SILICON COMPOUND GAS | $SiH_4/H_2$ |
| CONCENTRATION* (%) | 0.04 |
| TYPE OF APPLIED POWER | RF |
| POWER (W/cm$^3$) | 0.03 |
| PRESSURE (Torr) | 0.9 |
| SUBSTRATE TEMPERATURE (°C.) | 350 |

(3)

| | |
|---|---|
| $H_2$ GAS FLOW RATE (sccm) | 600 |
| SPECIES OF SILICON COMPOUND GAS | $SiH_4/H_2$ |
| CONCENTRATION* (%) | 0.04 |
| TYPE OF APPLIED POWER | RF |
| POWER (W/cm$^3$) | 0.03 |
| PRESSURE (Torr) | 0.9 |
| SUBSTRATE TEMPERATURE (°C.) | 300 |

(4)

| | |
|---|---|
| $H_2$ GAS FLOW RATE (sccm) | 500 |
| SPECIES OF SILICON COMPOUND GAS | $SiH_4/H_2$ |
| CONCENTRATION* (%) | 0.03 |
| TYPE OF APPLIED POWER | RF |
| POWER (W/cm$^3$) | 0.03 |
| PRESSURE (Torr) | 0.8 |
| SUBSTRATE TEMPERATURE (°C.) | 230 |

*: ($SiH_4$ GAS FLOW RATE)/(TOTAL $H_2$ GAS FLOW RATE)

(5)

| SC-EMB-B18 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.7 | | | | 130 | 200 | | |
| n/i BUFFER LAYER | | 0.4 | 0.2 | | 110 | | | |
| MW i-LAYER | 43 | | | 43 | 120 | | | |
| p/i BUFFER LAYER | | 0.4 | 0.2 | | 120 | | | |
| RF p-LAYER | | | 0.1 | | 60 | | 10 | 1.7 |
| RF n-LAYER | 0.9 | | | | 20 | 280 | | |
| n/i BUFFER LAYER | | 0.4 | 0.2 | | 80 | | | |
| MW i-LAYER | 33 | | | 25 | 120 | | | |
| p/i BUFFER LAYER | | 0.4 | 0.2 | | 70 | | | |
| RF p-LAYER | | | 0.2 | | 60 | | 10 | 1.8 |
| RF n-LAYER | 0.8 | | | | 50 | 250 | | |
| n/i BUFFER LAYER | | 0.4 | 0.2 | | 50 | | | |
| RF i-LAYER | | 2.1 | | | 65 | | | |
| p/i BUFFER LAYER | | 0.4 | 0.25 | | 60 | | | |
| RF p-LAYER | | | 0.4 | | 60 | | 10 | 1.8 |

| SC-EMB-B18 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |

| | | | | |
|---|---|---|---|---|
| RF i-LAYER | 0.75 | 0.07 | 200 | 86 |
| p/i BUFFER LAYER | 1.2 | 0.06 | 200 | 12 |
| RF p-LAYER | 1.6 | 0.07 | 170 | 10 |

TABLE C1

(1)

| | |
|---|---|
| $H_2$ GAS FLOW RATE (sccm) | 1000 |
| SPECIES OF SILICON COMPOUND GAS | $SiH_4$ |
| CONCENTRATION* (%) | 0.04 |
| SPECIES OF GROUP-V-ELEMENT COMPOUND GAS (DILUTION: %) | $PH_3/H_2$ (1%) |
| CONCENTRATION** (%) | 0.4 |
| TYPE OF APPLIED POWER | RF |
| POWER ($W/cm^3$) | 0.05 |
| PRESSURE (Torr) | 0.9 |
| SUBSTRATE TEMPERATURE (°C.) | 360 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

(2)

| SC-EMB-C1 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 250 | 15 | | |
| n/i BUFFER LAYER | | 3.5 | | | 90 | | | |
| MW i-LAYER | 38 | | | 37 | 120 | | | |
| P/i BUFFER LAYER | | 2 | | | 80 | | | |
| RF p-LAYER | | | 0.3 | | 70 | | 8 | 2 |

| SC-EMB-C1 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.1 | | 0.06 | 360 | 20 |
| n/i BUFFER LAYER | 0.8 | | 0.05 | 360 | 10 |
| MW i-LAYER | 0.005 | 0.25 | 0.6 | 360 | 150 |
| P/i BUFFER LAYER | 0.7 | | 0.04 | 250 | 20 |
| RF p-LAYER | 1.8 | | 0.07 | 200 | 10 |

TABLE C2

(1)

| | |
|---|---|
| $H_2$ GAS FLOW RATE (sccm) | 800 |
| SPECIES OF SILICON COMPOUND GAS | $SiH_4$ |
| CONCENTRATION* (%) | 0.05 |
| SPECIES OF GROUP-V-ELEMENT COMPOUND GAS (DILUTION: %) | $PF_3/H_2$ (1%) |
| CONCENTRATION** (%) | 0.5 |
| TYPE OF APPLIED POWER | VHF |
| POWER ($W/cm^3$) | 0.08 |
| PRESSURE (Torr) | 0.010 |
| SUBSTRATE TEMPERATURE (°C.) | 300 |

(2)

| | |
|---|---|
| $H_2$ GAS FLOW RATE (sccm) | 1300 |
| SPECIES OF SILICON COMPOUND GAS | $SiH_4$ |
| CONCENTRATION* (%) | 0.06 |
| SPECIES OF GROUP-V-ELEMENT COMPOUND GAS (DILUTION: %) | $PF_3/H_2$ (1%) |
| CONCENTRATION** (%) | 0.3 |
| TYPE OF APPLIED POWER | RF |
| POWER ($W/cm^3$) | 0.05 |
| PRESSURE (Torr) | 0.8 |
| SUBSTRATE TEMPERATURE (°C.) | 250 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

TABLE C2-continued (3)

| SC-EMB-C2 | SiH$_4$ FLOW RATE sccm | Si$_2$H$_6$ FLOW RATE sccm | CH$_4$ FLOW RATE sccm | GeH$_4$ FLOW RATE sccm | H$_2$ FLOW RATE sccm | PH$_3$/H$_2$ FLOW RATE sccm | B$_2$H$_6$/H$_2$ FLOW RATE sccm | SiH$_4$/H$_2$ FLOW RATE sccm |
|---|---|---|---|---|---|---|---|---|
| RF n-LAYER | 2 | | | | 250 | 15 | | |
| n/i BUFFER LAYER | | 3 | | | 90 | | | |
| MW i-LAYER | 40 | | | 37 | 130 | | | |
| p/i BUFFER LAYER | | 2 | | | 80 | | | |
| RF p-LAYER | | | 0.3 | | 60 | | 8 | 2 |
| RF n-LAYER | 2 | | | | 250 | 20 | | |
| n/i BUFFER LAYER | | 0.5 | 0.2 | | 70 | | | |
| RF i-LAYER | | 2.5 | | | 60 | | | |
| p/i BUFFER LAYER | | 0.5 | 0.3 | | 50 | | | |
| RF p-LAYER | | | 0.3 | | 60 | | 7 | 2 |

| SC-EMB-C2 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.0 | | 0.05 | 380 | 20 |
| n/i BUFFER LAYER | 0.8 | | 0.08 | 360 | 10 |
| MW i-LAYER | 0.005 | 0.25 | 0.60 | 380 | 150 |
| p/i BUFFER LAYER | 0.7 | | 0.07 | 250 | 20 |
| RF p-LAYER | 2.0 | | 0.07 | 250 | 10 |
| RF n-LAYER | 1.1 | | 0.04 | 250 | 10 |
| n/i BUFFER LAYER | 1.5 | | 0.06 | 250 | 10 |
| RF i-LAYER | 0.6 | | 0.07 | 200 | 110 |
| p/i BUFFER LAYER | 1.3 | | 0.06 | 200 | 15 |
| RF p-LAYER | 2.0 | | 0.07 | 170 | 10 |

TABLE C3

(1)

| | |
|---|---|
| H$_2$ GAS FLOW RATE (sccm) | 1500 |
| SPECIES OF SILICON COMPOUND GAS | SiCl$_2$H$_2$/He |
| CONCENTRATION* (%) | 0.03 |
| SPECIES OF GROUP-V-ELEMENT COMPOUND GAS (DILUTION: %) | PF$_3$/H$_2$ (10%) |
| CONCENTRATION** (%) | 1.8 |
| TYPE OF APPLIED POWER | MW |
| POWER (W/cm$^3$) | 0.1 |
| PRESSURE (Torr) | 0.007 |
| SUBSTRATE TEMPERATURE (°C.) | 300 |

(2)

| | |
|---|---|
| H$_2$ GAS FLOW RATE (sccm) | 1300 |
| SPECIES OF SILICON COMPOUND GAS | SiH$_4$ |
| CONCENTRATION* (%) | 0.07 |
| SPECIES OF GROUP-V-ELEMENT COMPOUND GAS (DILUTION: %) | PH$_3$/H$_2$ (10%) |
| CONCENTRATION** (%) | 2.6 → 0.1 |
| TYPE OF APPLIED POWER | RF |
| POWER (W/cm$^3$) | 0.05 |
| PRESSURE (Torr) | 0.8 |
| SUBSTRATE TEMPERATURE (°C.) | 300 |

(3)

| | |
|---|---|
| H$_2$ GAS FLOW RATE (sccm) | 1400 |
| SPECIES OF SILICON COMPOUND GAS | SiH$_4$ |
| CONCENTRATION* (%) | 0.04 |
| SPECIES OF GROUP-V-ELEMENT COMPOUND GAS (DILUTION: %) | PH$_3$/H$_2$ (10%) |
| CONCENTRATION** (%) | 2.0 |
| TYPE OF APPLIED POWER | RF |
| POWER (W/cm$^3$) | 0.04 |
| PRESSURE (Torr) | 0.7 |
| SUBSTRATE TEMPERATURE (°C.) | 230 |

*: (SILICON COMPOUND GAS FLOW RATE)/(TOTAL H$_2$ GAS FLOW RATE)
**: (GROUP-V-ELEMENT COMPOUND GAS FLOW RATE)/(TOTAL H$_2$ GAS FLOW RATE)

TABLE C3-continued

| | (4) | | | | | | | |
|---|---|---|---|---|---|---|---|---|
| SC-EMB-C3 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
| RF n-LAYER | 1.5 | | | | 250 | 2.0 | | |
| n/i BUFFER LAYER | | 4 | | | 100 | | | |
| MW i-LAYER | 50 | | | 50 | 150 | | | |
| p/i BUFFER LAYER | | 4 | | | 100 | | | |
| RF p-LAYER | | | 0.1 | | 60 | | 10 | 2 |
| RF n-LAYER | 1.1 | | | | 250 | 2.5 | | |
| n/i BUFFER LAYER | | 4 | | | 80 | | | |
| MW i-LAYER | 42 | | | 36 | 140 | | | |
| p/i BUFFER LAYER | | 3 | | | 80 | | | |
| RF p-LAYER | | | 0.2 | | 60 | | 10 | 2 |
| RF n-LAYER | 0.8 | | | | 250 | 2.5 | | |
| n/i BUFFER LAYER | | 0.4 | 0.2 | | 50 | | | |
| RF i-LAYER | | 2 | | | 70 | | | |
| p/i BUFFER LAYER | | 0.4 | 0.25 | | 50 | | | |
| RF p-LAYER | | | 0.3 | | 60 | | 10 | 2 |

| SC-EMB-C3 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.3 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.25 | | 0.06 | 200 | 12 |
| RF p-LAYER | 1.6 | | 0.07 | 170 | 10 |

TABLE C4

(1)

| | |
|---|---|
| $H_2$ GAS FLOW RATE (sccm) | 0.1~2500 |
| SPECIES OF SILICON COMPOUND GAS | $SiH_4$ |
| CONCENTRATION* (%) | 0.04 |
| SPECIES OF GROUP-V-ELEMENT COMPOUND GAS | $PH_3/H_2$ |
| CONCENTRATION** (%) | 0.2 |
| TYPE OF APPLIED POWER | RF |
| POWER (W/cm$^3$) | 0.4 |
| PRESSURE (Torr) | 0.7 |
| SUBSTRATE TEMPERATURE (°C.) FIRST/SECOND/THIRD | 270/270/230 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

(2)

| SC-EMB-C4 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 100 | 200 | | |
| n/i BUFFER LAYER | | 4 | | | 100 | | | |
| MW i-LAYER | 50 | | | 48 | 170 | | | |
| p/i BUFFER LAYER | | 4 | | | 100 | | | |
| RF p-LAYER | | | 0.1 | | 60 | | 10 | 2 |
| RF n-LAYER | 1.1 | | | | 50 | 250 | | |
| n/i BUFFER LAYER | | 4 | | | 70 | | | |
| MW i-LAYER | 40 | | | 36 | 160 | | | |
| p/i BUFFER LAYER | | 3 | | | 80 | | | |
| RF p-LAYER | | | 0.2 | | 60 | | 10 | 2 |
| RF n-LAYER | 0.8 | | | | 50 | 250 | | |
| n/i BUFFER LAYER | | 0.4 | 0.2 | | 50 | | | |
| RF i-LAYER | | 2 | | | 75 | | | |
| p/i BUFFER LAYER | | 0.4 | 0.25 | | 50 | | | |
| RF p-LAYER | | | 0.3 | | 60 | | 10 | 2 |

| SC-EMB-C4 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.3 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| $H_2$ GAS FLOW RATE* (sccm) | 0.1 | 0.5 | 0.8 | 1 | 10 | 100 | 1000 | 2000 | 2030 | 2100 | 2500 |
|---|---|---|---|---|---|---|---|---|---|---|---|
| CURVE FACTOR | X | Δ | ○ | ○ | ○ | ○ | ○ | ○ | ○ | Δ | X |
| OPTICAL DURABILITY | X | Δ | ○ | ○ | ○ | ○ | ○ | ○ | Δ | X | X |
| UNIFORMITY IN CHARACTERISTICS | X | Δ | ○ | ○ | ○ | ○ | ○ | ○ | Δ | X | X |
| SERIES-RESISTOR CHARACTERISTICS | X | Δ | Δ | ○ | ○ | ○ | ○ | ○ | ○ | Δ | X |
| DURABILITY | X | Δ | Δ | ○ | ○ | ○ | ○ | ○ | Δ | X | X |
| CHARACTERISTICS WITH REVERSE BIAS VOLTAGE APPLIED | X | Δ | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
*: CONTAINING GROUP-V-ELEMENT COMPOUND GAS AND SILICON COMPOUND GAS

TABLE C5

(1)

| | |
|---|---|
| $H_2$ GAS FLOW RATE (sccm) | 0.1~2500 |
| SPECIES OF SILICON COMPOUND GAS | $SiH_4$ |
| CONCENTRATION* (%) | 0.04 |
| SPECIES OF GROUP-V-ELEMENT COMPOUND GAS | $PF_3/H_2$ |
| CONCENTRATION** (%) | 0.2 |
| TYPE OF APPLIED POWER | VHF |
| POWER ($W/cm^3$) | 0.3 |
| PRESSURE (Torr) | 0.005 |
| SUBSTRATE TEMPERATURE (°C.) FIRST/SECOND/THIRD | 260/260/230 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

(2)

| SC-EMB-C5 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 120 | 200 | | |
| n/i BUFFER LAYER | | 4 | | | 100 | | | |
| MW i-LAYER | 48 | | | 48 | 170 | | | |
| p/i BUFFER LAYER | | 3.5 | | | 100 | | | |
| RF p-LAYER | | | 0.1 | | 60 | | 10 | 2 |
| RF n-LAYER | 1.2 | | | | 50 | 260 | | |
| n/i BUFFER LAYER | | 4 | | | 80 | | | |
| MW i-LAYER | 40 | | | 38 | 150 | | | |
| p/i BUFFER LAYER | | 3 | | | 80 | | | |
| RF p-LAYER | | | 0.2 | | 60 | | 10 | 2 |
| RF n-LAYER | 0.8 | | | | 50 | 250 | | |
| n/i BUFFER LAYER | | 0.4 | 0.2 | | 50 | | | |
| RF i-LAYER | | 2 | | | 80 | | | |
| p/i BUFFER LAYER | | 0.4 | 0.25 | | 50 | | | |
| RF p-LAYER | | | 0.3 | | 60 | | 10 | 2 |

| SC-EMB-C5 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| $H_2$ GAS FLOW RATE* (sccm) | 0.1 | 0.5 | 0.8 | 1 | 10 | 100 | 1000 | 2000 | 2030 | 2100 | 2500 |
|---|---|---|---|---|---|---|---|---|---|---|---|
| CURVE FACTOR | X | X | ○ | ○ | ○ | ○ | ○ | ○ | ○ | Δ | X |
| OPTICAL DURABILITY | X | Δ | ○ | ○ | ○ | ○ | ○ | ○ | ○ | Δ | X |
| UNIFORMITY IN CHARACTERISTICS | X | Δ | ○ | ○ | ○ | ○ | ○ | ○ | ○ | Δ | X |
| SERIES-RESISTOR CHARACTERISTICS | X | Δ | Δ | ○ | ○ | ○ | ○ | ○ | Δ | X | X |
| DURABILITY | X | Δ | ○ | ○ | ○ | ○ | ○ | ○ | Δ | X | X |
| CHARACTERISTICS WITH REVERSE BIAS VOLTAGE APPLIED | X | Δ | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
*: CONTAINING GROUP-V-ELEMENT COMPOUND GAS AND SILICON COMPOUND GAS

TABLE C6

(1)

| | |
|---|---|
| $H_2$ GAS FLOW RATE (sccm) | 1100 |
| SPECIES OF SILICON COMPOUND GAS | $SiH_4$ |
| CONCENTRATION* (%) | 0.05 |
| SPECIES OF GROUP-V-ELEMENT COMPOUND GAS | $PH_3$ |
| CONCENTRATION** (%) | 0.01~6 |
| TYPE OF APPLIED POWER | RF |
| POWER (W/cm$^3$) | 0.1 |
| PRESSURE (Torr) | 0.8 |
| SUBSTRATE TEMPERATURE (°C.) FIRST/SECOND/THIRD | 255/255/230 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

(2)

| SC-EMB-C6 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 100 | 200 | | |
| n/i BUFFER LAYER | | 4 | | | 100 | | | |
| MW i-LAYER | 47 | | | 48 | 155 | | | |
| p/i BUFFER LAYER | | 3.5 | | | 110 | | | |
| RF p-LAYER | | | 0.1 | | 60 | | 12 | 2 |
| RF n-LAYER | 1.1 | | | | 50 | 250 | | |
| n/i BUFFER LAYER | | 4 | | | 80 | | | |
| MW i-LAYER | 39 | | | 34 | 145 | | | |
| p/i BUFFER LAYER | | 3 | | | 80 | | | |
| RF p-LAYER | | | 0.2 | | 60 | | 11 | 2 |
| RF n-LAYER | 0.8 | | | | 50 | 250 | | |
| n/i BUFFER LAYER | | 0.4 | 0.2 | | 50 | | | |
| RF i-LAYER | | 2 | | | 85 | | | |
| p/i BUFFER LAYER | | 0.4 | 0.25 | | 50 | | | |
| RF p-LAYER | | | 0.3 | | 60 | | 10 | 2 |

| SC-EMB-C6 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.34 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.24 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| CONCENTRATION* (%) | 0.01 | 0.03 | 0.05 | 0.08 | 1 | 2 | 3 | 3.2 | 4 | 6 |
|---|---|---|---|---|---|---|---|---|---|---|
| CURVE FACTOR | X | Δ | ○ | ○ | ○ | ○ | ○ | ○ | Δ | X |
| OPTICAL DURABILITY | Δ | ○ | ○ | ○ | ○ | ○ | ○ | Δ | X | X |
| UNIFORMITY IN CHARACTERISTICS | X | Δ | ○ | ○ | ○ | ○ | ○ | Δ | X | X |
| SERIES-RESISTOR CHARACTERISTICS | X | Δ | Δ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
*: CONCENTRATION OF GROUP-V-ELEMENT COMPOUND GAS MIXED WITH $H_2$ GAS TO TOTAL $H_2$ GAS

TABLE C7

(1)

| | |
|---|---|
| $H_2$ GAS FLOW RATE (sccm) | 1200 |
| SPECIES OF SILICON COMPOUND GAS | $SiH_4$ |
| CONCENTRATION* (%) | 0.03 |
| SPECIES OF GROUP-V-ELEMENT COMPOUND GAS | $PH_3/H_2$ |
| CONCENTRATION** (%) | 0.01~6 |
| TYPE OF APPLIED POWER | VHF |
| POWER ($W/cm^3$) | 0.10 |
| PRESSURE (Torr) | 0.03 |
| SUBSTRATE TEMPERATURE (°C.) FIRST/SECOND/THIRD | 270/270/230 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

(2)

| SC-EMB-C7 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 160 | 200 | | |
| n/i BUFFER LAYER | | 4 | | | 100 | | | |
| MW i-LAYER | 47 | | | 49 | 165 | | | |
| p/i BUFFER LAYER | | 3.5 | | | 100 | | | |
| RF p-LAYER | | | 0.1 | | 60 | | 12 | 2 |
| RF n-LAYER | 1.1 | | | | 50 | 260 | | |
| n/i BUFFER LAYER | | 4 | | | 80 | | | |
| MW i-LAYER | 35 | | | 34 | 145 | | | |
| p/i BUFFER LAYER | | 3 | | | 80 | | | |
| RF p-LAYER | | | 0.2 | | 60 | | 11 | 2 |
| RF n-LAYER | 0.8 | | | | 60 | 240 | | |
| n/i BUFFER LAYER | | 0.4 | 0.2 | | 50 | | | |
| RF i-LAYER | | 2.5 | | | 100 | | | |
| p/i BUFFER LAYER | | 0.4 | 0.25 | | 50 | | | |
| RF p-LAYER | | | 0.3 | | 60 | | 10 | 2 |

| SC-EMB-C7 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.15 | | 0.04 | 380 | 20 |
| n/i BUFFER LAYER | 0.9 | | 0.08 | 350 | 10 |
| MW i-LAYER | 0.006 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.8 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| CONCENTRATION* (%) | 0.01 | 0.03 | 0.05 | 0.08 | 1 | 2 | 3 | 3.2 | 4 | 6 |
|---|---|---|---|---|---|---|---|---|---|---|
| CURVE FACTOR | X | Δ | ○ | ○ | ○ | ○ | ○ | ○ | Δ | X |
| OPTICAL DURABILITY | Δ | ○ | ○ | ○ | ○ | ○ | ○ | Δ | X | X |
| UNIFORMITY IN CHARACTERISTICS | X | Δ | ○ | ○ | ○ | ○ | ○ | ○ | X | X |
| SERIES-RESISTOR CHARACTERISTICS | X | Δ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
*: CONCENTRATION OF GROUP-V-ELEMENT COMPOUND GAS MIXED WITH $H_2$ GAS TO TOTAL $H_2$ GAS

TABLE C8

(1)

| | |
|---|---|
| $H_2$ GAS FLOW RATE (sccm) | 1200 |
| SPECIES OF SILICON COMPOUND GAS | $SiH_4$ |
| CONCENTRATION* (%) | 0.04 |
| SPECIES OF GROUP-V-ELEMENT COMPOUND GAS | $PF_3/H_2$ |
| CONCENTRATION** (%) | 0.01~6 |
| TYPE OF APPLIED POWER | MW |
| POWER (W/cm$^3$) | 0.08 |
| PRESSURE (Torr) | 0.006 |
| SUBSTRATE TEMPERATURE (°C.) FIRST/SECOND/THIRD | 230/230/230 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

(2)

| SC-EMB-C8 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 140 | 200 | | |
| n/i BUFFER LAYER | | 3.5 | | | 100 | | | |
| MW i-LAYER | 47 | | | 51 | 170 | | | |
| p/i BUFFER LAYER | | 3.5 | | | 100 | | | |
| RF p-LAYER | | | 0.1 | | 60 | | 12 | 2 |
| RF n-LAYER | 1.1 | | | | 50 | 270 | | |
| n/i BUFFER LAYER | | 4 | | | 80 | | | |
| MW i-LAYER | 35 | | | 36 | 125 | | | |
| p/i BUFFER LAYER | | 3 | | | 80 | | | |
| RF p-LAYER | | | 0.2 | | 60 | | 11 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 75 | | | |
| p/i BUFFER LAYER | | 0.4 | 0.25 | | 50 | | | |
| RF p-LAYER | | | 0.3 | | 60 | | 10 | 2 |

| SC-EMB-C8 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.35 | 0.5 | 370 | 110 |
| p/i BUFFER LAYER | 0.9 | | 0.08 | 330 | 20 |
| RF p-LAYER | 1.5 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.8 | | 0.07 | 200 | 87 |
| p/i BUFFER LAYER | 1.2 | | 0.06 | 200 | 11 |
| RF p-LAYER | 1.4 | | 0.07 | 170 | 10 |

(3)

| CONCENTRATION* (%) | 0.01 | 0.03 | 0.05 | 0.08 | 1 | 2 | 3 | 3.2 | 4 | 6 |
|---|---|---|---|---|---|---|---|---|---|---|
| CURVE FACTOR | X | Δ | ○ | ○ | ○ | ○ | ○ | ○ | Δ | X |
| OPTICAL DURABILITY | Δ | ○ | ○ | ○ | ○ | ○ | ○ | Δ | X | X |
| UNIFORMITY IN CHARACTERISTICS | X | Δ | ○ | ○ | ○ | ○ | ○ | ○ | X | X |
| SERIES-RESISTOR CHARACTERISTICS | X | ○ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
*: CONCENTRATION OF GROUP-V-ELEMENT COMPOUND GAS MIXED WITH $H_2$ GAS TO TOTAL $H_2$ GAS

TABLE C9

(1)

| | |
|---|---|
| $H_2$ GAS FLOW RATE (sccm) | 1300 |
| SPECIES OF SILICON COMPOUND GAS | $SiH_4$ |
| CONCENTRATION* (%) | 0.0003~0.14 |
| SPECIES OF GROUP-V-ELEMENT COMPOUND GAS (DILUTION: %) | $PH_3/H_2$ (1) |
| CONCENTRATION** (%) | 0.25 |
| TYPE OF APPLIED POWER | RF. |
| POWER (W/cm$^3$) | 0.09 |
| PRESSURE (Torr) | 0.8 |
| SUBSTRATE TEMPERATURE (°C.) FIRST/SECOND/THIRD | 260/260/230 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

(2)

| SC-EMB-C9 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 130 | 210 | | |
| n/i BUFFER LAYER | | 5 | | | 100 | | | |
| MW i-LAYER | 50 | | | 51 | 140 | | | |
| p/i BUFFER LAYER | | 3.5 | | | 100 | | | |
| RF p-LAYER | | | 0.1 | | 60 | | 12 | 2 |
| RF n-LAYER | 1.1 | | | | 50 | 270 | | |
| n/i BUFFER LAYER | | 4 | | | 80 | | | |
| MW i-LAYER | 34 | | | 36 | 130 | | | |
| p/i BUFFER LAYER | | 0.5 | 0.3 | | 60 | | | |
| RF p-LAYER | | | 0.2 | | 60 | | 11 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 60 | | | |
| p/i BUFFER LAYER | | 0.4 | 0.25 | | 50 | | | |
| RF p-LAYER | | | 0.3 | | 60 | | 10 | 2 |

| SC-EMB-C9 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.8 | | 0.08 | 350 | 10 |
| MW i-LAYER | 0.007 | 0.35 | 0.5 | 370 | 110 |
| p/i BUFFER LAYER | 0.9 | | 0.08 | 330 | 20 |
| RF p-LAYER | 1.6 | | 0.07 | 300 | 10 |
| RF n-LAYER | 1.1 | | 0.04 | 300 | 10 |
| n/i BUFFER LAYER | 0.8 | | 0.08 | 300 | 10 |
| MW i-LAYER | 0.006 | 0.25 | 0.5 | 330 | 100 |
| p/i BUFFER LAYER | 0.7 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.7 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| CONCENTRATION* (%) | 0.0003 | 0.0008 | 0.001 | 0.005 | 0.01 | 0.08 | 0.1 | 0.105 | 0.12 | 0.14 |
|---|---|---|---|---|---|---|---|---|---|---|
| CURVE FACTOR | X | Δ | O | O | O | O | O | O | Δ | X |
| OPTICAL DURABILITY | Δ | O | O | O | O | O | O | Δ | X | X |
| UNIFORMITY IN CHARACTERISTICS | X | Δ | O | O | O | O | O | Δ | X | X |
| SERIES-RESISTOR CHARACTERISTICS | X | Δ | O | O | O | O | O | Δ | X | X |
| DURABILITY | X | Δ | O | O | O | O | O | Δ | X | X |
| CHARACTERISTICS WITH REVERSE BIAS VOLTAGE APPLIED | X | O | O | O | O | O | O | O | Δ | X |

O: EXCELLENT FOR PRACTICAL USE
Δ: GOOD FOR PRACTICAL USE
X: NO GOOD FOR SOME APPLICATIONS
*: CONCENTRATION OF SILICON COMPOUND GAS MIXED WITH $H_2$ GAS TO TOTAL $H_2$ GAS

TABLE C10

(1)

| | |
|---|---|
| $H_2$ GAS FLOW RATE (sccm) | 1200 |
| SPECIES OF SILICON COMPOUND GAS | $SiH_4$ |
| CONCENTRATION* (%) | 0.0003~0.14 |
| SPECIES OF GROUP-V-ELEMENT COMPOUND GAS (DILUTION: %) | $PH_3/H_2$ (1) |
| CONCENTRATION** (%) | 0.3 |
| TYPE OF APPLIED POWER | VHF |
| POWER ($W/cm^3$) | 0.11 |
| PRESSURE (Torr) | 0.03 |
| SUBSTRATE TEMPERATURE (°C.) FIRST/SECOND/THIRD | 260/260/230 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

(2)

| SC-EMB-C10 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 140 | 200 | | |
| n/i BUFFER LAYER | | 5 | | | 100 | | | |
| MW i-LAYER | 49 | | | 52 | 155 | | | |
| p/i BUFFER LAYER | | 3.5 | | | 100 | | | |
| RF p-LAYER | | | 0.1 | | 60 | | 11 | 2 |
| RF n-LAYER | 1.1 | | | | 50 | 270 | | |
| n/i BUFFER LAYER | | 4 | | | 80 | | | |
| MW i-LAYER | 34 | | | 36 | 120 | | | |
| p/i BUFFER LAYER | | 0.4 | 0.2 | | 60 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 60 | | | |
| p/i BUFFER LAYER | | 0.4 | 0.25 | | 50 | | | |
| RF p-LAYER | | | 0.3 | | 60 | | 10 | 2 |

| SC-EMB-C10 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| CONCENTRATION* (%) | 0.0003 | 0.0008 | 0.001 | 0.005 | 0.01 | 0.08 | 0.1 | 0.105 | 0.12 | 0.14 |
|---|---|---|---|---|---|---|---|---|---|---|
| CURVE FACTOR | X | Δ | ○ | ○ | ○ | ○ | ○ | ○ | Δ | X |
| OPTICAL DURABILITY | Δ | ○ | ○ | ○ | ○ | ○ | ○ | Δ | X | X |
| UNIFORMITY IN CHARACTERISTICS | X | Δ | ○ | ○ | ○ | ○ | ○ | Δ | X | X |
| SERIES-RESISTOR CHARACTERISTICS | X | ○ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | Δ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
*: CONCENTRATION OF SILICON COMPOUND GAS MIXED WITH $H_2$ GAS TO TOTAL $H_2$ GAS

TABLE C11

(1)

| | |
|---|---|
| $H_2$ GAS FLOW RATE (sccm) | 1100 |
| SPECIES OF SILICON COMPOUND GAS | $SiH_4$ |
| CONCENTRATION* (%) | 0.0003~0.14 |
| SPECIES OF GROUP-V-ELEMENT COMPOUND GAS (DILUTION: %) | $PH_3/H_2$ (1) |
| CONCENTRATION** (%) | 0.4 |
| TYPE OF APPLIED POWER | MW |
| POWER (W/cm$^3$) | 0.10 |
| PRESSURE (Torr) | 0.005 |
| SUBSTRATE TEMPERATURE (°C.) FIRST/SECOND/THIRD | 235/235/230 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

(2)

| SC-EMB-C11 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 130 | 200 | | |
| n/i BUFFER LAYER | | 4 | | | 100 | | | |
| MW i-LAYER | 49 | | | 50 | 170 | | | |
| p/i BUFFER LAYER | | 3.5 | | | 95 | | | |
| RF p-LAYER | | | 0.1 | | 60 | | 10 | 2 |
| RF n-LAYER | 1.1 | | | | 50 | 270 | | |
| n/i BUFFER LAYER | | 0.4 | 0.2 | | 80 | | | |
| MW i-LAYER | 34 | | | 36 | 150 | | | |
| p/i BUFFER LAYER | | 0.4 | 0.2 | | 60 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 60 | | | |
| p/i BUFFER LAYER | | 0.4 | 0.25 | | 50 | | | |
| RF p-LAYER | | | 0.3 | | 60 | | 10 | 2 |

| SC-EMB-C11 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.1 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| CONCENTRATION* (%) | 0.0003 | 0.0008 | 0.001 | 0.005 | 0.01 | 0.08 | 0.1 | 0.105 | 0.12 | 0.14 |
|---|---|---|---|---|---|---|---|---|---|---|
| CURVE FACTOR | X | ○ | ○ | ○ | ○ | ○ | ○ | ○ | Δ | X |
| OPTICAL DURABILITY | X | Δ | ○ | ○ | ○ | ○ | ○ | Δ | X | X |
| UNIFORMITY IN CHARACTERISTICS | X | Δ | ○ | ○ | ○ | ○ | ○ | Δ | X | X |
| SERIES-RESISTOR CHARACTERISTICS | X | Δ | ○ | ○ | ○ | ○ | ○ | ○ | X | X |
| DURABILITY | X | Δ | ○ | ○ | ○ | ○ | ○ | Δ | X | X |
| CHARACTERISTICS WITH REVERSE BIAS VOLTAGE APPLIED | X | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
*: CONCENTRATION OF SILICON COMPOUND GAS MIXED WITH $H_2$ GAS TO TOTAL $H_2$ GAS

TABLE C12

(1)

| | |
|---|---|
| $H_2$ GAS FLOW RATE (sccm) | 1300 |
| SPECIES OF SILICON COMPOUND GAS | $Si_2H_6$ |
| CONCENTRATION* (%) | 0.04 |
| SPECIES OF GROUP-V-ELEMENT COMPOUND GAS (DILUTION: %) | $PF_3/H_2$ (1) |
| CONCENTRATION** (%) | 0.3 |
| TYPE OF APPLIED POWER | RF |
| POWER ($W/cm^3$) | 0.45 |
| PRESSURE (Torr) | 0.01~100 |
| SUBSTRATE TEMPERATURE (°C.) FIRST/SECOND/THIRD | 270/270/230 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

(2)

| SC-EMB-C12 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 130 | 200 | | |
| n/i BUFFER LAYER | | 4 | | | 130 | | | |
| MW i-LAYER | 46 | | | 48 | 140 | | | |
| p/i BUFFER LAYER | | 3.5 | | | 120 | | | |
| RF p-LAYER | | | 0.1 | | 60 | | 10 | 2 |
| RF n-LAYER | 1.1 | | | | 50 | 270 | | |
| n/i BUFFER LAYER | | 0.4 | 0.2 | | 80 | | | |
| MW i-LAYER | 33 | | | 36 | 140 | | | |
| p/i BUFFER LAYER | | 0.4 | 0.2 | | 60 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 765 | | | |
| p/i BUFFER LAYER | | 0.4 | 0.25 | | 50 | | | |
| RF p-LAYER | | | 0.3 | | 60 | | 10 | 2 |

| SC-EMB-C12 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.35 | 0.5 | 370 | 110 |
| p/i BUFFER LAYER | 0.8 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.6 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| PRESSURE (Torr) | 0.01 | 0.03 | 0.05 | 1 | 3 | 5 | 10 | 11 | 20 | 100 |
|---|---|---|---|---|---|---|---|---|---|---|
| CURVE FACTOR | X | ○ | ○ | ○ | ○ | ○ | ○ | Δ | X | X |
| OPTICAL DURABILITY | X | Δ | ○ | ○ | ○ | ○ | ○ | ○ | Δ | X |
| UNIFORMITY IN CHARACTERISTICS | X | Δ | ○ | ○ | ○ | ○ | ○ | Δ | X | X |
| SERIES-RESISTOR CHARACTERISTICS | X | Δ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | Δ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS

TABLE C13

(1)

| | |
|---|---|
| $H_2$ GAS FLOW RATE (sccm) | 1250 |
| SPECIES OF SILICON COMPOUND GAS | $Si_2H_6$ |
| CONCENTRATION* (%) | 0.05 |
| SPECIES OF GROUP-V-ELEMENT COMPOUND GAS (DILUTION: %) | $PF_3/H_2$ (1) |
| CONCENTRATION** (%) | 0.3 |
| TYPE OF APPLIED POWER | VHF |
| POWER ($W/cm^3$) | 0.011 |
| PRESSURE (mTorr) | 0.03~10000 |
| SUBSTRATE TEMPERATURE (°C.) FIRST/SECOND/THIRD | 270/270/230 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

(2)

| SC-EMB-C13 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.4 | | | | 130 | 200 | | |
| n/i BUFFER LAYER | | 4 | | | 130 | | | |
| MW i-LAYER | 45 | | | 46 | 150 | | | |
| p/i BUFFER LAYER | | 2.5 | | | 120 | | | |
| RF p-LAYER | | | 0.1 | | 60 | | 10 | 2 |
| RF n-LAYER | 1.0 | | | | 30 | 270 | | |
| n/i BUFFER LAYER | | 0.4 | 0.2 | | 80 | | | |
| MW i-LAYER | 33 | | | 29 | 120 | | | |
| p/i BUFFER LAYER | | 0.4 | 0.2 | | 60 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.2 | | | 65 | | | |
| p/i BUFFER LAYER | | 0.4 | 0.25 | | 50 | | | |
| RF p-LAYER | | | 0.3 | | 60 | | 10 | 2 |

| SC-EMB-C13 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| PRESSURE* (mTorr) | 0.03 | 0.08 | 0.1 | 1 | 100 | 500 | 1000 | 1100 | 2000 | 10000 |
|---|---|---|---|---|---|---|---|---|---|---|
| CURVE FACTOR | X | Δ | ○ | ○ | ○ | ○ | ○ | ○ | Δ | X |
| OPTICAL DURABILITY | X | ○ | ○ | ○ | ○ | ○ | ○ | ○ | Δ | X |
| UNIFORMITY IN CHARACTERISTICS | X | Δ | ○ | ○ | ○ | ○ | ○ | Δ | X | X |
| SERIES-RESISTOR CHARACTERISTICS | X | ○ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | Δ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS

TABLE C14

(1)

| | |
|---|---|
| $H_2$ GAS FLOW RATE (sccm) | 950 |
| SPECIES OF SILICON COMPOUND GAS | $SiF_4$ |
| CONCENTRATION* (%) | 0.03 |
| SPECIES OF GROUP-V-ELEMENT COMPOUND GAS (DILUTION: %) | $PH_3/H_2$ (1) |
| CONCENTRATION** (%) | 0.5 |
| TYPE OF APPLIED POWER | MW |
| POWER ($W/cm^3$) | 0.12 |
| PRESSURE (mTorr) | 0.03~100 |
| SUBSTRATE TEMPERATURE (°C.) FIRST/SECOND/THIRD | 225/225/225 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

(2)

| SC-EMB-C14 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 140 | 200 | | |
| n/i BUFFER LAYER | | 4 | | | 120 | | | |
| MW i-LAYER | 45 | | | 46 | 150 | | | |
| p/i BUFFER LAYER | | 0.35 | 0.2 | | 120 | | | |
| RF p-LAYER | | | 0.1 | | 60 | | 10 | 2 |
| RF n-LAYER | 1.0 | | | | 30 | 270 | | |
| n/i BUFFER LAYER | | 0.4 | 0.2 | | 80 | | | |
| MW i-LAYER | 35 | | | 30 | 120 | | | |
| p/i BUFFER LAYER | | 0.4 | 0.2 | | 70 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.2 | | | 75 | | | |
| p/i BUFFER LAYER | | 0.4 | 0.25 | | 60 | | | |
| RF p-LAYER | | | 0.4 | | 60 | | 10 | 2 |

| SC-EMB-C14 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.007 | 0.35 | 0.5 | 370 | 110 |
| p/i BUFFER LAYER | 0.9 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| PRESSURE* (mTorr) | 0.03 | 0.08 | 0.1 | 0.5 | 1 | 5 | 10 | 11 | 20 | 100 |
|---|---|---|---|---|---|---|---|---|---|---|
| CURVE FACTOR | X | Δ | ○ | ○ | ○ | ○ | ○ | ○ | Δ | X |
| OPTICAL DURABILITY | X | Δ | ○ | ○ | ○ | ○ | ○ | ○ | Δ | X |
| UNIFORMITY IN CHARACTERISTICS | X | ○ | ○ | ○ | ○ | ○ | ○ | Δ | X | X |
| SERIES-RESISTOR CHARACTERISTICS | X | Δ | ○ | ○ | ○ | ○ | ○ | ○ | X | X |
| DURABILITY | X | Δ | ○ | ○ | ○ | ○ | ○ | Δ | X | X |
| CHARACTERISTICS WITH REVERSE BIAS VOLTAGE APPLIED | X | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS

TABLE C15

(1)

| | |
|---|---|
| $H_2$ GAS FLOW RATE (sccm) | 800 |
| SPECIES OF SILICON COMPOUND GAS | $SiH_4$ |
| CONCENTRATION* (%) | 0.04 |
| SPECIES OF GROUP-V-ELEMENT COMPOUND GAS (DILUTION: %) | $PF_3/H_2$ (1) |
| CONCENTRATION** (%) | 0.2 |
| TYPE OF APPLIED POWER | RF |
| POWER (W/cm$^3$) | 0.003~10 |
| PRESSURE (Torr) | 0.060 |
| SUBSTRATE TEMPERATURE (°C.) FIRST/SECOND/THIRD | 260/260/230 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

(2)

| SC-EMB-C15 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.4 | | | | 130 | 200 | | |
| n/i BUFFER LAYER | | 0.4 | 0.1 | | 120 | | | |
| MW i-LAYER | 45 | | | 47 | 160 | | | |
| p/i BUFFER LAYER | | 0.35 | 0.2 | | 120 | | | |
| RF p-LAYER | | | 0.1 | | 60 | | 8 | 2 |
| RF n-LAYER | 1.0 | | | | 30 | 270 | | |
| n/i BUFFER LAYER | | 0.4 | 0.2 | | 80 | | | |
| MW i-LAYER | 35 | | | 28 | 145 | | | |
| p/i BUFFER LAYER | | 0.4 | 0.2 | | 70 | | | |
| RF p-LAYER | | | 0.2 | | 60 | | 7 | 2 |
| RF n-LAYER | 0.8 | | | | 50 | 250 | | |
| n/i BUFFER LAYER | | 0.3 | 0.2 | | 50 | | | |
| RF i-LAYER | | 2.2 | | | 65 | | | |
| p/i BUFFER LAYER | | 0.4 | 0.25 | | 60 | | | |
| RF p-LAYER | | | 0.4 | | 60 | | 6 | 2 |

| SC-EMB-C15 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.1 | | 0.04 | 380 | 20 |
| n/i BUFFER LAYER | 0.9 | | 0.08 | 350 | 10 |
| MW i-LAYER | 0.007 | 0.35 | 0.5 | 370 | 110 |
| p/i BUFFER LAYER | 0.9 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.7 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| POWER DENSITY (W/cm$^3$) | 0.003 | 0.007 | 0.01 | 0.05 | 0.1 | 0.7 | 1.0 | 1.1 | 3.0 | 10 |
|---|---|---|---|---|---|---|---|---|---|---|
| CURVE FACTOR | X | Δ | ○ | ○ | ○ | ○ | ○ | ○ | Δ | X |
| OPTICAL DURABILITY | X | ○ | ○ | ○ | ○ | ○ | ○ | ○ | Δ | X |
| UNIFORMITY IN CHARACTERISTICS | X | ○ | ○ | ○ | ○ | ○ | ○ | ○ | X | X |
| SERIES-RESISTOR CHARACTERISTICS | X | Δ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | Δ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS

TABLE C16

(1)

| | |
|---|---|
| $H_2$ GAS FLOW RATE (sccm) | 1400 |
| SPECIES OF SILICON COMPOUND GAS | $Si_2H_6$ |
| CONCENTRATION* (%) | 0.02 |
| SPECIES OF GROUP-V-ELEMENT COMPOUND GAS (DILUTION: %) | $PF_3/H_2$ (1) |
| CONCENTRATION** (%) | 0.2 |
| TYPE OF APPLIED POWER | VHF |
| POWER (W/cm$^3$) | 0.003~10 |
| PRESSURE (Torr) | 0.005 |
| SUBSTRATE TEMPERATURE (°C.) FIRST/SECOND/THIRD | 150/150/150 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

(2)

| SC-EMB-C16 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 110 | 200 | | |
| n/i BUFFER LAYER | | 0.4 | 0.1 | | 110 | | | |
| MW i-LAYER | 44 | | | 45 | 165 | | | |
| p/i BUFFER LAYER | | 0.35 | 0.2 | | 120 | | | |
| RF p-LAYER | | | 0.1 | | 60 | | 9 | 2 |
| RF n-LAYER | 1.0 | | | | 30 | 270 | | |
| n/i BUFFER LAYER | | 0.4 | 0.2 | | 80 | | | |
| MW i-LAYER | 35 | | | 28 | 130 | | | |
| p/i BUFFER LAYER | | 0.4 | 0.2 | | 70 | | | |
| RF p-LAYER | | | 0.2 | | 60 | | 8 | 2 |
| RF n-LAYER | 0.8 | | | | 50 | 250 | | |
| n/i BUFFER LAYER | | 0.3 | 0.2 | | 50 | | | |
| RF i-LAYER | | 2.1 | | | 85 | | | |
| p/i BUFFER LAYER | | 0.4 | 0.25 | | 60 | | | |
| RF p-LAYER | | | 0.4 | | 60 | | 7 | 2 |

| SC-EMB-C16 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.24 | 0.5 | 330 | 100 |
| p/i BUFFER LAYER | 0.8 | | 0.08 | 280 | 20 |
| RF p-LAYER | 1.6 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| POWER DENSITY (W/cm$^3$) | 0.003 | 0.007 | 0.01 | 0.05 | 0.1 | 0.7 | 1.0 | 1.1 | 3.0 | 10 |
|---|---|---|---|---|---|---|---|---|---|---|
| CURVE FACTOR | X | Δ | ○ | ○ | ○ | ○ | ○ | ○ | Δ | X |
| OPTICAL DURABILITY | X | ○ | ○ | ○ | ○ | ○ | ○ | ○ | Δ | X |
| UNIFORMITY IN CHARACTERISTICS | X | ○ | ○ | ○ | ○ | ○ | ○ | Δ | X | X |
| SERIES-RESISTOR CHARACTERISTICS | X | Δ | ○ | ○ | ○ | ○ | ○ | Δ | X | X |
| DURABILITY | X | Δ | ○ | ○ | ○ | ○ | ○ | ○ | Δ | X |
| CHARACTERISTICS WITH REVERSE BIAS VOLTAGE APPLIED | X | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS

TABLE C17

(1)

| | |
|---|---|
| $H_2$ GAS FLOW RATE (sccm) | 1850 |
| SPECIES OF SILICON COMPOUND GAS | $SiCl_2H_2$ |
| CONCENTRATION* (%) | 0.008 |
| SPECIES OF GROUP-V-ELEMENT COMPOUND GAS (DILUTION: %) | $PH_3/H_2$ (10) |
| CONCENTRATION** (%) | 0.08 |
| TYPE OF APPLIED POWER | MW |
| POWER (W/cm$^3$) | 0.03~100 |
| PRESSURE (Torr) | 0.006 |
| SUBSTRATE TEMPERATURE (°C.) FIRST/SECOND/THIRD | 135/135/135 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

(2)

| SC-EMB-C17 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 120 | 200 | | |
| n/i BUFFER LAYER | | 0.4 | 0.2 | | 110 | | | |
| MW i-LAYER | 42 | | | 44 | 175 | | | |
| p/i BUFFER LAYER | | 0.35 | 0.2 | | 120 | | | |
| RF p-LAYER | | | 0.1 | | 60 | | 9 | 1.7 |
| RF n-LAYER | 1.0 | | | | 30 | 270 | | |
| n/i BUFFER LAYER | | 0.4 | 0.2 | | 80 | | | |
| MW i-LAYER | 33 | | | 28 | 165 | | | |
| p/i BUFFER LAYER | | 0.4 | 0.2 | | 70 | | | |
| RF p-LAYER | | | 0.2 | | 60 | | 8 | 1.8 |
| RF n-LAYER | 0.8 | | | | 50 | 250 | | |
| n/i BUFFER LAYER | | 0.3 | 0.2 | | 50 | | | |
| RF i-LAYER | | 2.1 | | | 100 | | | |
| p/i BUFFER LAYER | | 0.4 | 0.25 | | 60 | | | |
| RF p-LAYER | | | 0.4 | | 60 | | 7 | 1.8 |

| SC-EMB-C17 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.8 | | 0.08 | 350 | 10 |
| MW i-LAYER | 0.006 | 0.35 | 0.5 | 370 | 110 |
| p/i BUFFER LAYER | 0.8 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.24 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| POWER DENSITY (W/cm$^3$) | 0.03 | 0.07 | 0.1 | 0.5 | 1 | 7 | 10 | 11 | 30 | 100 |
|---|---|---|---|---|---|---|---|---|---|---|
| CURVE FACTOR | X | Δ | ○ | ○ | ○ | ○ | ○ | ○ | X | X |
| OPTICAL DURABILITY | X | ○ | ○ | ○ | ○ | ○ | ○ | ○ | X | X |
| UNIFORMITY IN CHARACTERISTICS | X | Δ | ○ | ○ | ○ | ○ | ○ | ○ | X | X |
| SERIES-RESISTOR CHARACTERISTICS | X | ○ | ○ | ○ | ○ | ○ | ○ | ○ | X | X |
| DURABILITY | X | Δ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS

TABLE C18

(1)

| | |
|---|---|
| $H_2$ GAS FLOW RATE (sccm) | 1200 |
| SPECIES OF SILICON COMPOUND GAS | $SiH_4$ |
| CONCENTRATION* (%) | 0.07 |
| SPECIES OF GROUP-V-ELEMENT COMPOUND GAS (DILUTION: %) | $PH_3/H_2$ (1) |
| CONCENTRATION** (%) | 0.2 |
| TYPE OF APPLIED POWER | RF |
| POWER ($W/cm^3$) | 0.3 |
| PRESSURE (Torr) | 1.0 |
| SUBSTRATE TEMPERATURE (°C.) | 50~520 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

(2)

| SC-EMB-C18 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 120 | 200 | | |
| n/i BUFFER LAYER | | 0.4 | 0.2 | | 110 | | | |
| MW i-LAYER | 42 | | | 43 | 175 | | | |
| p/i BUFFER LAYER | | 0.35 | 0.2 | | 120 | | | |
| RF p-LAYER | | | 0.1 | | 60 | | 9 | 1.7 |
| RF n-LAYER | 1.0 | | | | 30 | 270 | | |
| n/i BUFFER LAYER | | 0.4 | 0.2 | | 80 | | | |
| MW i-LAYER | 33 | | | 29 | 165 | | | |
| p/i BUFFER LAYER | | 0.4 | 0.2 | | 70 | | | |
| RF p-LAYER | | | 0.2 | | 60 | | 9 | 1.8 |
| RF n-LAYER | 0.8 | | | | 50 | 250 | | |
| n/i BUFFER LAYER | | 0.3 | 0.2 | | 50 | | | |
| RF i-LAYER | | 2.1 | | | 105 | | | |
| p/i BUFFER LAYER | | 0.4 | 0.25 | | 60 | | | |
| RF p-LAYER | | | 0.4 | | 60 | | 7 | 1.8 |

| SC-EMB-C18 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.8 | | 0.08 | 350 | 10 |
| MW i-LAYER | 0.006 | 0.35 | 0.5 | 370 | 110 |
| p/i BUFFER LAYER | 0.8 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.24 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| SUBSTRATE TEMPERATURE (°C.) | 50 | 75 | 100 | 150 | 200 | 300 | 400 | 420 | 450 | 520 |
|---|---|---|---|---|---|---|---|---|---|---|
| CURVE FACTOR | X | ○ | ○ | ○ | ○ | ○ | ○ | X | X | X |
| OPTICAL DURABILITY | X | Δ | ○ | ○ | ○ | ○ | ○ | ○ | X | X |
| UNIFORMITY IN CHARACTERISTICS | X | Δ | ○ | ○ | ○ | ○ | ○ | Δ | X | X |
| SERIES-RESISTOR CHARACTERISTICS | X | Δ | ○ | ○ | ○ | ○ | ○ | ○ | X | X |
| DURABILITY | X | Δ | ○ | ○ | ○ | ○ | ○ | Δ | X | X |
| CHARACTERISTICS WITH REVERSE BIAS VOLTAGE APPLIED | X | ○ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS

TABLE C19

(1)

| | |
|---|---|
| $H_2$ GAS FLOW RATE (sccm) | 1600 |
| SPECIES OF SILICON COMPOUND GAS | $SiCl_4$ |
| CONCENTRATION* (%) | 0.02 |
| SPECIES OF GROUP-V-ELEMENT COMPOUND GAS (DILUTION: %) | $PF_3/H_2$ (10) |
| CONCENTRATION** (%) | 0.2 |
| TYPE OF APPLIED POWER | VHF |
| POWER ($W/cm^3$) | 0.28 |
| PRESSURE (Torr) | 0.009 |
| SUBSTRATE TEMPERATURE (°C.) | 30~420 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

(2)

| SC-EMB-C19 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.4 | | | | 130 | 200 | | |
| n/i BUFFER LAYER | | 0.4 | 0.1 | | 120 | | | |
| MW i-LAYER | 45 | | | 47 | 150 | | | |
| p/i BUFFER LAYER | | 0.35 | 0.2 | | 120 | | | |
| RF p-LAYER | | | 0.1 | | 60 | | 9 | 2 |
| RF n-LAYER | 1.0 | | | | 30 | 270 | | |
| n/i BUFFER LAYER | | 0.4 | 0.2 | | 80 | | | |
| MW i-LAYER | 35 | | | 28 | 140 | | | |
| p/i BUFFER LAYER | | 0.4 | 0.2 | | 70 | | | |
| RF p-LAYER | | | 0.2 | | 60 | | 8 | 2 |
| RF n-LAYER | 0.8 | | | | 50 | 250 | | |
| n/i BUFFER LAYER | | 0.3 | 0.2 | | 50 | | | |
| RF i-LAYER | | 2.2 | | | 60 | | | |
| p/i BUFFER LAYER | | 0.4 | 0.25 | | 60 | | | |
| RF p-LAYER | | | 0.4 | | 60 | | 7 | 2 |

| SC-EMB-C19 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.1 | | 0.04 | 380 | 20 |
| n/i BUFFER LAYER | 0.9 | | 0.08 | 350 | 10 |
| MW i-LAYER | 0.006 | 0.35 | 0.5 | 370 | 110 |
| p/i BUFFER LAYER | 0.9 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.7 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| SUBSTRATE TEMPERATURE (°C.) | 30 | 40 | 50 | 100 | 200 | 250 | 300 | 320 | 350 | 420 |
|---|---|---|---|---|---|---|---|---|---|---|
| CURVE FACTOR | X | ○ | ○ | ○ | ○ | ○ | ○ | Δ | X | X |
| OPTICAL DURABILITY | X | Δ | ○ | ○ | ○ | ○ | ○ | ○ | X | X |
| UNIFORMITY IN CHARACTERISTICS | X | ○ | ○ | ○ | ○ | ○ | ○ | ○ | X | X |
| SERIES-RESISTOR CHARACTERISTICS | X | Δ | ○ | ○ | ○ | ○ | ○ | Δ | X | X |
| DURABILITY | X | X | ○ | ○ | ○ | ○ | ○ | Δ | X | X |
| CHARACTERISTICS WITH REVERSE BIAS VOLTAGE APPLIED | X | ○ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS

TABLE C20

(1)

| | |
|---|---|
| $H_2$ GAS FLOW RATE (sccm) | 1800 |
| SPECIES OF SILICON COMPOUND GAS | $SiCl_2H_2$ |
| CONCENTRATION* (%) | 0.01 |
| SPECIES OF GROUP-V-ELEMENT COMPOUND GAS (DILUTION: %) | $PF_5/H_2$ (10) |
| CONCENTRATION** (%) | 0.3 |
| TYPE OF APPLIED POWER | MW |
| POWER ($W/cm^3$) | 0.3 |
| PRESSURE (Torr) | 0.008 |
| SUBSTRATE TEMPERATURE (°C.) | 30~420 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

(2)

| SC-EMB-C20 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 110 | 200 | | |
| n/i BUFFER LAYER | | 0.4 | 0.1 | | 110 | | | |
| MW i-LAYER | 44 | | | 45 | 145 | | | |
| p/i BUFFER LAYER | | 0.35 | 0.2 | | 120 | | | |
| RF p-LAYER | | | 0.1 | | 60 | | 9 | 2 |
| RF n-LAYER | 1.0 | | | | 30 | 270 | | |
| n/i BUFFER LAYER | | 0.4 | 0.2 | | 80 | | | |
| MW i-LAYER | 35 | | | 28 | 160 | | | |
| p/i BUFFER LAYER | | 0.4 | 0.2 | | 70 | | | |
| RF p-LAYER | | | 0.2 | | 60 | | 9 | 2 |
| RF n-LAYER | 0.8 | | | | 50 | 250 | | |
| n/i BUFFER LAYER | | 0.3 | 0.2 | | 50 | | | |
| RF i-LAYER | | 2.1 | | | 110 | | | |
| p/i BUFFER LAYER | | 0.4 | 0.25 | | 60 | | | |
| RF p-LAYER | | | 0.4 | | 60 | | 7 | 2 |

| SC-EMB-C20 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.007 | 0.35 | 0.5 | 370 | 110 |
| p/i BUFFER LAYER | 0.9 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.24 | 0.5 | 330 | 100 |
| p/i BUFFER LAYER | 0.8 | | 0.08 | 280 | 20 |
| RF p-LAYER | 1.6 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| SUBSTRATE TEMPERATURE (°C.) | 30 | 40 | 50 | 100 | 200 | 250 | 300 | 320 | 350 | 420 |
|---|---|---|---|---|---|---|---|---|---|---|
| CURVE FACTOR | X | Δ | ○ | ○ | ○ | ○ | ○ | Δ | X | X |
| OPTICAL DURABILITY | X | ○ | ○ | ○ | ○ | ○ | ○ | ○ | Δ | X |
| UNIFORMITY IN CHARACTERISTICS | X | Δ | ○ | ○ | ○ | ○ | ○ | Δ | X | X |
| SERIES-RESISTOR CHARACTERISTICS | X | ○ | ○ | ○ | ○ | ○ | ○ | ○ | Δ | X |
| DURABILITY | X | ○ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS

TABLE C21

(1)

| | |
|---|---|
| $H_2$ GAS FLOW RATE (sccm) | 1150 |
| SPECIES OF SILICON COMPOUND GAS | $SiH_4/H_2$ |
| CONCENTRATION* (%) | 0.03 |
| TYPE OF APPLIED POWER | RF |
| POWER (W/cm$^3$) | 0.05 |
| PRESSURE (Torr) | 0.8 |
| SUBSTRATE TEMPERATURE (°C.) | 360 |

*: ($SiH_4$ GAS FLOW RATE)/(TOTAL $H_2$ GAS FLOW RATE)

(2)

| | |
|---|---|
| $H_2$ GAS FLOW RATE (sccm) | 1200 |
| SPECIES OF SILICON COMPOUND GAS | $SiH_4$ |
| CONCENTRATION* (%) | 0.03 |
| SPECIES OF GROUP-V-ELEMENT COMPOUND GAS (DILUTION: %) | $PH_3/H_2$ (10%) |
| CONCENTRATION** (%) | 1.5 |
| TYPE OF APPLIED POWER | RF |
| POWER (W/cm$^3$) | 0.03 |
| PRESSURE (Torr) | 0.7 |
| SUBSTRATE TEMPERATURE (°C.) | 350 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

(3)

| | |
|---|---|
| $H_2$ GAS FLOW RATE (sccm) | 850 |
| SPECIES OF SILICON COMPOUND GAS | $SiH_4$ |
| CONCENTRATION* (%) | 0.04 |
| TYPE OF APPLIED POWER | RF |
| POWER (W/cm$^3$) | 0.04 |
| PRESSURE (Torr) | 0.8 |
| SUBSTRATE TEMPERATURE (°C.) | 350 |

*: (SILICON COMPOUND GAS FLOW RATE)/($H_2$ GAS FLOW RATE)

(4)

| | |
|---|---|
| $H_2$ GAS FLOW RATE (sccm) | 1150 |
| SPECIES OF SILICON COMPOUND GAS | $SiH_4$ |
| CONCENTRATION* (%) | 0.04 |
| TYPE OF APPLIED POWER | RF |
| POWER (W/cm$^3$) | 0.03 |
| PRESSURE (Torr) | 0.7 |
| SUBSTRATE TEMPERATURE (°C.) | 330 |

*: (SILICON COMPOUND GAS FLOW RATE)/($H_2$ GAS FLOW RATE)

(5)

| | |
|---|---|
| $H_2$ GAS FLOW RATE (sccm) | 1500 |
| SPECIES OF SILICON COMPOUND GAS | $SiH_4$ |
| CONCENTRATION* (%) | 0.04 |
| TYPE OF APPLIED POWER | RF |
| POWER (W/cm$^3$) | 0.04 |
| PRESSURE (Torr) | 0.7 |
| SUBSTRATE TEMPERATURE (°C.) | 300 |

*: ($SiH_4$ GAS FLOW RATE)/(TOTAL $H_2$ GAS FLOW RATE)

(6)

| | |
|---|---|
| $H_2$ GAS FLOW RATE (sccm) | 1350 |
| SPECIES OF SILICON COMPOUND GAS | $SiH_4$ |
| CONCENTRATION* (%) | 0.04 |
| TYPE OF APPLIED POWER | RF |
| POWER (W/cm$^3$) | 0.03 |
| PRESSURE (Torr) | 0.7 |
| SUBSTRATE TEMPERATURE (°C.) | 300 |

*: ($SiH_4$ GAS FLOW RATE)/(TOTAL $H_2$ GAS FLOW RATE)

(7)

| | |
|---|---|
| $H_2$ GAS FLOW RATE (sccm) | 1400 |
| SPECIES OF SILICON COMPOUND GAS | $SiH_4$ |
| CONCENTRATION* (%) | 0.03 |
| SPECIES OF GROUP-V-ELEMENT COMPOUND GAS (DILUTION: %) | $PH_3/H_2$ (10%) |
| CONCENTRATION** (%) | 2.0 |
| TYPE OF APPLIED POWER | RF |

TABLE C21-continued

| | |
|---|---|
| POWER ($W/cm^3$) | 0.03 |
| PRESSURE (Torr) | 0.7 |
| SUBSTRATE TEMPERATURE (°C.) | 300 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

(8)

| | |
|---|---|
| $H_2$ GAS FLOW RATE (sccm) | 1600 |
| SPECIES OF SILICON COMPOUND GAS | $SiH_4$ |
| CONCENTRATION* (%) | 0.03 |
| TYPE OF APPLIED POWER | RF |
| POWER ($W/cm^3$) | 0.04 |
| PRESSURE (Torr) | 0.75 |
| SUBSTRATE TEMPERATURE (°C.) | 300 |

*: (SILICON COMPOUND GAS FLOW RATE)/($H_2$ GAS FLOW RATE)

(9)

| | |
|---|---|
| $H_2$ GAS FLOW RATE (sccm) | 1200 |
| SPECIES OF SILICON COMPOUND GAS | $SiH_4$ |
| CONCENTRATION* (%) | 0.02 |
| TYPE OF APPLIED POWER | RF |
| POWER ($W/cm^3$) | 0.05 |
| PRESSURE (Torr) | 0.65 |
| SUBSTRATE TEMPERATURE (°C.) | 280 |

*: (SILICON COMPOUND GAS FLOW RATE)/($H_2$ GAS FLOW RATE)

(10)

| | |
|---|---|
| $H_2$ GAS FLOW RATE (sccm) | 1500 |
| SPECIES OF SILICON COMPOUND GAS | $SiH_4$ |
| CONCENTRATION* (%) | 0.03 |
| TYPE OF APPLIED POWER | RF |
| POWER ($W/cm^3$) | 0.04 |
| PRESSURE (Torr) | 0.8 |
| SUBSTRATE TEMPERATURE (°C.) | 260 |

*: ($SiH_4$ GAS FLOW RATE)/(TOTAL $H_2$ GAS FLOW RATE)

(11)

| | |
|---|---|
| $H_2$ GAS FLOW RATE (sccm) | 1500 |
| SPECIES OF SILICON COMPOUND GAS | $SiH_4$ |
| CONCENTRATION* (%) | 0.03 |
| TYPE OF APPLIED POWER | RF |
| POWER ($W/cm^3$) | 0.04 |
| PRESSURE (Torr) | 0.8 |
| SUBSTRATE TEMPERATURE (°C.) | 230 |

*: ($SiH_4$ GAS FLOW RATE)/(TOTAL $H_2$ GAS FLOW RATE)

(12)

| | |
|---|---|
| $H_2$ GAS FLOW RATE (sccm) | 1650 |
| SPECIES OF SILICON COMPOUND GAS | $SiH_4$ |
| CONCENTRATION* (%) | 0.03 |
| SPECIES OF GROUP-V-ELEMENT COMPOUND GAS (DILUTION: %) | $PH_3/H_2$ (10%) |
| CONCENTRATION** (%) | 1.0 |
| TYPE OF APPLIED POWER | RF |
| POWER ($W/cm^3$) | 0.03 |
| PRESSURE (Torr) | 0.6 |
| SUBSTRATE TEMPERATURE (°C.) | 230 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

(13)

| | |
|---|---|
| $H_2$ GAS FLOW RATE (sccm) | 1000 |
| SPECIES OF SILICON COMPOUND GAS | $SiH_4$ |
| CONCENTRATION* (%) | 0.04 |
| TYPE OF APPLIED POWER | RF |
| POWER ($W/cm^3$) | 0.04 |
| PRESSURE (Torr) | 0.8 |
| SUBSTRATE TEMPERATURE (°C.) | 200 |

*: (SILICON COMPOUND GAS FLOW RATE)/($H_2$ GAS FLOW RATE)

(14)

| | |
|---|---|
| $H_2$ GAS FLOW RATE (sccm) | 1350 |
| SPECIES OF SILICON COMPOUND GAS | $SiH_4$ |

TABLE C21-continued

| | |
|---|---|
| CONCENTRATION* (%) | 0.03 |
| TYPE OF APPLIED POWER | RF |
| POWER (W/cm$^3$) | 0.05 |
| PRESSURE (Torr) | 0.8 |
| SUBSTRATE TEMPERATURE (°C.) | 200 |

*: (SILICON COMPOUND GAS FLOW RATE)/($H_2$ GAS FLOW RATE)

(15)

| | |
|---|---|
| $H_2$ GAS FLOW RATE (sccm) | 1600 |
| SPECIES OF SILICON COMPOUND GAS | $SiH_4$ |
| CONCENTRATION* (%) | 0.03 |
| TYPE OF APPLIED POWER | RF |
| POWER (W/cm$^3$) | 0.05 |
| PRESSURE (Torr) | 0.8 |
| SUBSTRATE TEMPERATURE (°C.) | 170 |

*: (SILICON COMPOUND GAS FLOW RATE)/($H_2$ GAS FLOW RATE)

(16)

| SC-EMB-C21 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 350 | 2.0 | | |
| n/i BUFFER LAYER | | 0.4 | 0.2 | | 110 | | | |
| MW i-LAYER | 43 | | | 43 | 150 | | | |
| p/i BUFFER LAYER | | 0.4 | 0.2 | | 120 | | | |
| RF p-LAYER | | | 0.1 | | 60 | | 8 | 1.7 |
| RF n-LAYER | 0.9 | | | | 320 | 2.8 | | |
| n/i BUFFER LAYER | | 0.4 | 0.2 | | 80 | | | |
| MW i-LAYER | 32 | | | 27 | 120 | | | |
| p/i BUFFER LAYER | | 0.4 | 0.2 | | 70 | | | |
| RF p-LAYER | | | 0.2 | | 60 | | 7 | 1.8 |
| RF n-LAYER | 0.8 | | | | 300 | 2.5 | | |
| n/i BUFFER LAYER | | 0.4 | 0.2 | | 50 | | | |
| RF i-LAYER | | 2.1 | | | 50 | | | |
| p/i BUFFER LAYER | | 0.4 | 0.25 | | 60 | | | |
| RF p-LAYER | | | 0.4 | | 60 | | 6 | 1.8 |

| SC-EMB-C21 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.1 | | 0.04 | 380 | 20 |
| n/i BUFFER LAYER | 0.9 | | 0.08 | 350 | 10 |
| MW i-LAYER | 0.006 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.5 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.1 | | 0.06 | 200 | 12 |
| RF p-LAYER | 1.4 | | 0.07 | 170 | 10 |

TABLE D1

(1)

| | |
|---|---|
| $H_2$ GAS FLOW RATE (sccm) | 800 |
| SPECIES OF SILICON COMPOUND GAS | $SiH_4$ |
| CONCENTRATION* (%) | 0.01 |
| TYPE OF APPLIED POWER | RF |
| POWER (W/cm$^3$) | 0.05 |
| PRESSURE (Torr) | 0.9 |
| SUBSTRATE TEMPERATURE (°C.) | 360 |

*: (SILICON COMPOUND GAS FLOW RATE)/($H_2$ GAS FLOW RATE)

TABLE D1-continued (2)

| SC-EMB-D1 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 120 | 200 | | |
| n/i BUFFER LAYER | | 3.5 | | | 90 | | | |
| MW i-LAYER | 38 | | | 37 | 150 | | | |
| p/i BUFFER LAYER | | 3 | | | 80 | | | |
| RF p-LAYER | | | 0.3 | | 60 | | 10 | 1 |

| SC-EMB-D1 | PRESSURE Torr | MW POWER W/cm³ | RF POWER W/cm³ | SUBSTRATE TEMPERA-TURE °C. | LAYER THICKNESS nm |
|---|---|---|---|---|---|
| RF n-LAYER | 1.15 | | 0.04 | 370 | 20 |
| n/i BUFFER LAYER | 0.8 | | 0.06 | 360 | 10 |
| MW i-LAYER | 0.005 | 0.3 | 0.6 | 360 | 150 |
| p/i BUFFER LAYER | 0.7 | | 0.07 | 250 | 20 |
| RF p-LAYER | 1.3 | | 0.09 | 200 | 10 |

TABLE D2

(1)

| | |
|---|---|
| $H_2$ GAS FLOW RATE (sccm) | 750 |
| SPECIES OF SILICON COMPOUND GAS | $Si_2H_6$ |
| CONCENTRATION* (%) | 0.005 |
| TYPE OF APPLIED POWER | VHF |
| POWER (W/cm³) | 0.08 |
| PRESSURE (Torr) | 0.015 |
| SUBSTRATE TEMPERATURE (°C.) | 285 |

*: (SILICON COMPOUND GAS FLOW RATE)/($H_2$ GAS FLOW RATE)

(2)

| | |
|---|---|
| $H_2$ GAS FLOW RATE (sccm) | 900 |
| SPECIES OF SILICON COMPOUND GAS | $SiH_4$ |
| CONCENTRATION* (%) | 0.003 |
| TYPE OF APPLIED POWER | RF |
| POWER (W/cm³) | 0.02 |
| PRESSURE (Torr) | 0.8 |
| SUBSTRATE TEMPERATURE (°C.) | 200 |

*: (SILICON COMPOUND GAS FLOW RATE)/($H_2$ GAS FLOW RATE)

(3)

| SC-EMB-D2 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.8 | | | | 80 | 200 | | |
| n/i BUFFER LAYER | | 3.5 | | | 80 | | | |
| MW i-LAYER | 45 | | | 40 | 130 | | | |
| p/i BUFFER LAYER | | 2 | | | 70 | | | |
| RF p-LAYER | | | 0.3 | | 60 | | 10 | 2 |
| RF n-LAYER | 2 | | | | 70 | 250 | | |
| n/i BUFFER LAYER | | 0.5 | 0.2 | | 60 | | | |
| RF i-LAYER | | 3 | | | 50 | | | |
| p/i BUFFER LAYER | | 0.4 | 0.3 | | 60 | | | |
| RF p-LAYER | | | 0.3 | | 60 | | 10 | 2 |

| SC-EMB-D2 | PRESSURE Torr | MW POWER W/cm³ | RF POWER W/cm³ | SUBSTRATE TEMPERA-TURE °C. | LAYER THICKNESS nm |
|---|---|---|---|---|---|
| RF n-LAYER | 1.2 | | 0.05 | 380 | 20 |
| n/i BUFFER LAYER | 0.8 | | 0.08 | 360 | 10 |
| MW i-LAYER | 0.005 | 0.25 | 0.60 | 380 | 150 |
| p/i BUFFER LAYER | 0.7 | | 0.07 | 250 | 20 |
| RF p-LAYER | 1.8 | | 0.07 | 250 | 10 |
| RF n-LAYER | 1.1 | | 0.04 | 250 | 10 |
| n/i BUFFER LAYER | 1.3 | | 0.06 | 250 | 10 |

TABLE D2-continued

| | | | | |
|---|---|---|---|---|
| RF i-LAYER | 0.5 | 0.07 | 200 | 110 |
| p/i BUFFER LAYER | 1.2 | 0.06 | 200 | 15 |
| RF p-LAYER | 1.7 | 0.07 | 170 | 10 |

TABLE D3

(1)

| | |
|---|---|
| $H_2$ GAS FLOW RATE (sccm) | 500 |
| SPECIES OF SILICON COMPOUND GAS | $SiCl_2H_2$/He |
| CONCENTRATION* (%) | 0.05 |
| TYPE OF APPLIED POWER | MW |
| POWER (W/cm$^3$) | 0.12 |
| PRESSURE (Torr) | 0.010 |
| SUBSTRATE TEMPERATURE (°C.) | 350 |

*: ($SiCl_2H_2$ GAS FLOW RATE)/TOTAL ($H_2$ GAS FLOW RATE)

(2)

| | |
|---|---|
| $H_2$ GAS FLOW RATE (sccm) | 800 |
| SPECIES OF SILICON COMPOUND GAS | $SiH_4/H_2$ |
| CONCENTRATION* (%) | 0.06 |
| TYPE OF APPLIED POWER | RF |
| POWER (W/cm$^3$) | 0.03 |
| PRESSURE (Torr) | 0.9 |
| SUBSTRATE TEMPERATURE (°C.) | 300 |

*: ($SiH_4$ GAS FLOW RATE)/TOTAL ($H_2$ GAS FLOW RATE)

(3)

| | |
|---|---|
| $H_2$ GAS FLOW RATE (sccm) | 850 |
| SPECIES OF SILICON COMPOUND GAS | $SiH_4/H_2$ |
| CONCENTRATION* (%) | 0.05 |
| TYPE OF APPLIED POWER | RF |
| POWER (W/cm$^3$) | 0.03 |
| PRESSURE (Torr) | 0.8 |
| SUBSTRATE TEMPERATURE (°C.) | 230 |

*: ($SiH_4$ GAS FLOW RATE)/TOTAL ($H_2$ GAS FLOW RATE)

(4)

| SC-EMB-D3 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 120 | 200 | | |
| n/i BUFFER LAYER | | 4 | | | 120 | | | |
| MW i-LAYER | 50 | | | 51 | 160 | | | |
| p/i BUFFER LAYER | | 4 | | | 110 | | | |
| RF p-LAYER | | | 0.1 | | 70 | | 10 | 2 |
| RF n-LAYER | 1.1 | | | | 50 | 250 | | |
| n/i BUFFER LAYER | | 4 | | | 80 | | | |
| MW i-LAYER | 42 | | | 37 | 150 | | | |
| p/i BUFFER LAYER | | 3 | | | 80 | | | |
| RF p-LAYER | | | 0.2 | | 60 | | 10 | 2 |
| RF n-LAYER | 0.8 | | | | 50 | 250 | | |
| n/i BUFFER LAYER | | 0.4 | 0.2 | | 50 | | | |
| RF i-LAYER | | 2 | | | 80 | | | |
| p/i BUFFER LAYER | | 0.4 | 0.25 | | 50 | | | |
| RF p-LAYER | | | 0.3 | | 60 | | 10 | 2 |

| SC-EMB-D3 | PRESSURE Torr | MW POWER W/cm$^3$ | RF POWER W/cm$^3$ | SUBSTRATE TEMPERATURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.3 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |

TABLE D3-continued

| | | | | |
|---|---|---|---|---|
| RF n-LAYER | 1.05 | 0.04 | 230 | 10 |
| n/i BUFFER LAYER | 1.3 | 0.06 | 230 | 10 |
| RF i-LAYER | 0.75 | 0.07 | 200 | 87 |
| p/i BUFFER LAYER | 1.25 | 0.06 | 200 | 12 |
| RF p-LAYER | 1.6 | 0.07 | 170 | 10 |

TABLE D4

(1)

| | |
|---|---|
| $H_2$ GAS FLOW RATE (sccm) | 0.1~2500 |
| SPECIES OF SILICON COMPOUND GAS | $SiH_4$ |
| CONCENTRATION* (%) | 0.04 |
| TYPE OF APPLIED POWER | RF |
| POWER (W/cm$^3$) | 0.3 |
| PRESSURE (Torr) | 0.9 |
| SUBSTRATE TEMPERATURE (°C.) FIRST/SECOND/THIRD | 300/300/230 |

*: (SILICON COMPOUND GAS FLOW RATE)/($H_2$ GAS FLOW RATE)

(2)

| SC-EMB-D4 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.4 | | | | 100 | 200 | | |
| n/i BUFFER LAYER | | 4 | | | 100 | | | |
| MW i-LAYER | 50 | | | 48 | 160 | | | |
| p/i BUFFER LAYER | | 4 | | | 100 | | | |
| RF p-LAYER | | | 0.1 | | 60 | | 10 | 2 |
| RF n-LAYER | 1.1 | | | | 50 | 250 | | |
| n/i BUFFER LAYER | | 4 | | | 70 | | | |
| MW i-LAYER | 40 | | | 36 | 120 | | | |
| p/i BUFFER LAYER | | 3 | | | 80 | | | |
| RF p-LAYER | | | 0.2 | | 60 | | 10 | 2 |
| RF n-LAYER | 0.8 | | | | 50 | 250 | | |
| n/i BUFFER LAYER | | 0.4 | 0.2 | | 50 | | | |
| RF i-LAYER | | 2 | | | 80 | | | |
| p/i BUFFER LAYER | | 0.4 | 0.25 | | 50 | | | |
| RF p-LAYER | | | 0.3 | | 60 | | 10 | 2 |

| SC-EMB-D4 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.3 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| $H_2$ GAS FLOW RATE* (sccm) | 0.1 | 0.5 | 0.8 | 1 | 10 | 100 | 1000 | 2000 | 2030 | 2100 | 2500 |
|---|---|---|---|---|---|---|---|---|---|---|---|
| CURVE FACTOR | X | X | Δ | ○ | ○ | ○ | ○ | ○ | ○ | Δ | X |
| OPTICAL DURABILITY | X | Δ | ○ | ○ | ○ | ○ | ○ | ○ | Δ | X | X |
| UNIFORMITY IN CHARACTERISTICS | X | Δ | ○ | ○ | ○ | ○ | ○ | ○ | Δ | X | X |
| ADHESION | X | X | Δ | ○ | ○ | ○ | ○ | ○ | ○ | Δ | X |
| DURABILITY | X | Δ | ○ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS

TABLE D4-continued

*: CONTAINING SILICON COMPOUND GAS

OTHER CONDITIONS

| | |
|---|---|
| SPECIES OF SILICON COMPOUND GAS: | $SiH_4$ |
| CONCENTRATION OF SILICON COMPOUND GAS (%): | 0.04 |
| APPLIED POWER: | RF |
| POWER DENSITY ($W/cm^3$): | 0.3 |
| PRESSURE (Torr): | 0.9 |
| SUBSTRATE TEMPERATURE (°C.) FIRST/SECOND/THIRD: | 300/300/230 |

TABLE D5

(1)

| | |
|---|---|
| $H_2$ GAS FLOW RATE (sccm) | 0.1~2500 |
| SPECIES OF SILICON COMPOUND GAS | $SiH_4$ |
| CONCENTRATION* (%) | 0.06 |
| TYPE OF APPLIED POWER | VHF |
| POWER ($W/cm^3$) | 0.2 |
| PRESSURE (Torr) | 0.003 |
| SUBSTRATE TEMPERATURE (°C.) FIRST/SECOND/THIRD | 290/290/230 |

*: (SILICON COMPOUND GAS FLOW RATE)/($H_2$ GAS FLOW RATE)

(2)

| SC-EMB-D5 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 120 | 200 | | |
| n/i BUFFER LAYER | | 4 | | | 100 | | | |
| MW i-LAYER | 48 | | | 48 | 170 | | | |
| p/i BUFFER LAYER | | 3.5 | | | 100 | | | |
| RF p-LAYER | | | 0.1 | | 60 | | 10 | 2 |
| RF n-LAYER | 1.2 | | | | 50 | 250 | | |
| n/i BUFFER LAYER | | 4 | | | 80 | | | |
| MW i-LAYER | 40 | | | 35 | 150 | | | |
| p/i BUFFER LAYER | | 3 | | | 80 | | | |
| RF p-LAYER | | | 0.2 | | 60 | | 10 | 2 |
| RF n-LAYER | 0.8 | | | | 50 | 250 | | |
| n/i BUFFER LAYER | | 0.4 | 0.2 | | 50 | | | |
| RF i-LAYER | | 2 | | | 80 | | | |
| p/i BUFFER LAYER | | 0.4 | 0.25 | | 50 | | | |
| RF p-LAYER | | | 0.3 | | 60 | | 10 | 2 |

| SC-EMB-D5 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| CONCENTRATION* (%) | 0.1 | 0.5 | 0.8 | 1 | 10 | 100 | 1000 | 2000 | 2030 | 2100 | 2500 |
|---|---|---|---|---|---|---|---|---|---|---|---|
| CURVE FACTOR | X | X | Δ | ○ | ○ | ○ | ○ | ○ | ○ | Δ | X |
| OPTICAL DURABILITY | X | Δ | ○ | ○ | ○ | ○ | ○ | ○ | ○ | Δ | X |
| UNIFORMITY IN CHARACTERISTICS | X | X | Δ | ○ | ○ | ○ | ○ | ○ | ○ | Δ | X |
| ADHESION | X | X | Δ | ○ | ○ | ○ | ○ | ○ | Δ | Δ | X |
| DURABILITY | X | Δ | ○ | ○ | ○ | ○ | ○ | ○ | Δ | X | X |

TABLE D5-continued

○: EXCELLENT FOR PRACTICAL USE
Δ: GOOD FOR PRACTICAL USE
X: NO GOOD FOR SOME APPLICATIONS
*: CONTAINING SILICON COMPOUND GAS
OTHER CONDITIONS

| | |
|---|---|
| SPECIES OF SILICON COMPOUND GAS: | $SiH_4$ |
| CONCENTRATION OF SILICON COMPOUND GAS (%): | 0.06 |
| APPLIED POWER: | VHF |
| POWER DENSITY ($W/cm^3$): | 0.2 |
| PRESSURE (Torr): | 0.003 |
| SUBSTRATE TEMPERATURE (°C.) FIRST/SECOND/THIRD: | 290/290/230 |

TABLE D6

(1)

| | |
|---|---|
| $H_2$ GAS FLOW RATE (sccm) | 1300 |
| SPECIES OF SILICON COMPOUND GAS | $SiH_4$ |
| CONCENTRATION* (%) | 0.0003~0.14 |
| TYPE OF APPLIED POWER | RF |
| POWER ($W/cm^3$) | 0.08 |
| PRESSURE (Torr) | 0.8 |
| SUBSTRATE TEMPERATURE (°C.) FIRST/SECOND/THIRD | 300/300/230 |

*: (SILICON COMPOUND GAS FLOW RATE)/($H_2$ GAS FLOW RATE)

(2)

| SC-EMB-D6 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 100 | 200 | | |
| n/i BUFFER LAYER | | 4 | | | 100 | | | |
| MW i-LAYER | 47 | | | 48 | 160 | | | |
| p/i BUFFER LAYER | | 3.5 | | | 100 | | | |
| RF p-LAYER | | | 0.1 | | 60 | | 12 | 2 |
| RF n-LAYER | 1.1 | | | | 50 | 250 | | |
| n/i BUFFER LAYER | | 4 | | | 80 | | | |
| MW i-LAYER | 40 | | | 34 | 150 | | | |
| p/i BUFFER LAYER | | 3 | | | 80 | | | |
| RF p-LAYER | | | 0.2 | | 60 | | 11 | 2 |
| RF n-LAYER | 0.8 | | | | 50 | 250 | | |
| n/i BUFFER LAYER | | 0.4 | 0.2 | | 50 | | | |
| RF i-LAYER | | 2 | | | 80 | | | |
| p/i BUFFER LAYER | | 0.4 | 0.25 | | 50 | | | |
| RF p-LAYER | | | 0.3 | | 60 | | 10 | 2 |

| SC-EMB-D6 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.34 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.24 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| CONCENTRATION* (%) | 0.0003 | 0.0008 | 0.001 | 0.005 | 0.01 | 0.08 | 0.1 | 0.105 | 0.12 | 0.14 |
|---|---|---|---|---|---|---|---|---|---|---|
| CURVE FACTOR | X | Δ | ○ | ○ | ○ | ○ | ○ | ○ | Δ | X |
| OPTICAL DURABILITY | Δ | ○ | ○ | ○ | ○ | ○ | ○ | Δ | X | X |
| UNIFORMITY IN CHARACTERISTICS | X | Δ | ○ | ○ | ○ | ○ | ○ | Δ | X | X |

TABLE D6-continued

| | | | | | | | | | | |
|---|---|---|---|---|---|---|---|---|---|---|
| ADHESION | X | Δ | ○ | ○ | ○ | ○ | ○ | X | X | X |
| DURABILITY | X | X | ○ | ○ | ○ | ○ | ○ | X | X | X |

○: EXCELLENT FOR PRACTICAL USE
Δ: GOOD FOR PRACTICAL USE
X: NO GOOD FOR SOME APPLICATIONS
*: CONTAINING SILICON COMPOUND GAS MIXED WITH $H_2$ GAS TO $H_2$ GAS

OTHER CONDITIONS

| | |
|---|---|
| FLOW RATE OF $H_2$ GAS CONTAINING SILICON COMPOUND GAS (sccm): | 1300 |
| SPECIES OF SILICON COMPOUND GAS: | $SiH_4$ |
| APPLIED POWER: | RF |
| POWER DENSITY (W/cm$^3$): | 0.08 |
| PRESSURE (Torr): | 0.8 |
| SUBSTRATE TEMPERATURE (°C.) FIRST/SECOND/THIRD: | 300/300/230 |

TABLE D7

(1)

| | |
|---|---|
| $H_2$ GAS FLOW RATE (sccm) | 1200 |
| SPECIES OF SILICON COMPOUND GAS | $SiH_4$ |
| CONCENTRATION* (%) | 0.0003~0.14 |
| TYPE OF APPLIED POWER | VHF |
| POWER (W/cm$^3$) | 0.11 |
| PRESSURE (Torr) | 0.07 |
| SUBSTRATE TEMPERATURE (°C.) FIRST/SECOND/THIRD | 290/290/230 |

*: (SILICON COMPOUND GAS FLOW RATE)/($H_2$ GAS FLOW RATE)

(2)

| SC-EMB-D7 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.8 | | | | 160 | 200 | | |
| n/i BUFFER LAYER | | 4 | | | 100 | | | |
| MW i-LAYER | 47 | | | 50 | 130 | | | |
| p/i BUFFER LAYER | | 3.5 | | | 100 | | | |
| RF p-LAYER | | | 0.1 | | 60 | | 12 | 2 |
| RF n-LAYER | 1.1 | | | | 50 | 260 | | |
| n/i BUFFER LAYER | | 4 | | | 80 | | | |
| MW i-LAYER | 35 | | | 34 | 150 | | | |
| p/i BUFFER LAYER | | 3 | | | 80 | | | |
| RF p-LAYER | | | 0.2 | | 60 | | 11 | 2 |
| RF n-LAYER | 0.8 | | | | 50 | 240 | | |
| n/i BUFFER LAYER | | 0.4 | 0.2 | | 50 | | | |
| RF i-LAYER | | 2.5 | | | 80 | | | |
| p/i BUFFER LAYER | | 0.4 | 0.25 | | 50 | | | |
| RF p-LAYER | | | 0.3 | | 60 | | 10 | 2 |

| SC-EMB-D7 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

TABLE D7-continued

| | (3) | | | | | | | | | |
|---|---|---|---|---|---|---|---|---|---|---|
| CONCENTRATION* (%) | 0.0003 | 0.0008 | 0.001 | 0.005 | 0.01 | 0.08 | 0.1 | 0.105 | 0.12 | 0.14 |
| CURVE FACTOR | X | Δ | ○ | ○ | ○ | ○ | ○ | ○ | Δ | X |
| OPTICAL DURABILITY | Δ | ○ | ○ | ○ | ○ | ○ | ○ | Δ | X | X |
| UNIFORMITY IN CHARACTERISTICS | X | Δ | ○ | ○ | ○ | ○ | ○ | Δ | X | X |
| ADHESION | X | Δ | ○ | ○ | ○ | ○ | ○ | Δ | X | X |
| DURABILITY | X | Δ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS
*: CONCENTRATION OF SILICON COMPOUND GAS MIXED WITH $H_2$ GAS TO $H_2$ GAS
OTHER CONDITIONS

| | |
|---|---|
| FLOW RATE OF $H_2$ GAS CONTAINING SILICON COMPOUND GAS (sccm): | 1200 |
| SPECIES OF SILICON COMPOUND GAS: | $SiH_4$ |
| APPLIED POWER: | VHF |
| POWER DENSITY (W/cm$^3$): | 0.11 |
| PRESSURE (Torr): | 0.07 |
| SUBSTRATE TEMPERATURE (°C.) FIRST/SECOND/THIRD: | 290/290/230 |

TABLE D8

(1)

| | |
|---|---|
| $H_2$ GAS FLOW RATE (sccm) | 1200 |
| SPECIES OF SILICON COMPOUND GAS | $SiH_4$ |
| CONCENTRATION* (%) | 0.0003~0.14 |
| TYPE OF APPLIED POWER | MW |
| POWER (W/cm$^3$) | 0.12 |
| PRESSURE (Torr) | 0.007 |
| SUBSTRATE TEMPERATURE (°C.) FIRST/SECOND/THIRD | 200/200/200 |

*: (SILICON COMPOUND GAS FLOW RATE)/($H_2$ GAS FLOW RATE)

(2)

| SC-EMB-D8 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.8 | | | | 140 | 200 | | |
| n/i BUFFER LAYER | | 4 | | | 100 | | | |
| MW i-LAYER | 47 | | | 51 | 180 | | | |
| p/i BUFFER LAYER | | 3.5 | | | 100 | | | |
| RF p-LAYER | | | 0.1 | | 60 | | 12 | 2 |
| RF n-LAYER | 1.1 | | | | 50 | 270 | | |
| n/i BUFFER LAYER | | 4 | | | 80 | | | |
| MW i-LAYER | 35 | | | 36 | 155 | | | |
| p/i BUFFER LAYER | | 3 | | | 80 | | | |
| RF p-LAYER | | | 0.2 | | 60 | | 11 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 85 | | | |
| p/i BUFFER LAYER | | 0.4 | 0.25 | | 50 | | | |
| RF p-LAYER | | | 0.3 | | 60 | | 10 | 2 |

| SC-EMB-D8 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |

TABLE D8-continued

| | | | | |
|---|---|---|---|---|
| RF i-LAYER | 0.75 | 0.07 | 200 | 87 |
| p/i BUFFER LAYER | 1.2 | 0.06 | 200 | 11 |
| RF p-LAYER | 1.6 | 0.07 | 170 | 10 |

(3)

| CONCENTRATION* (%) | 0.0003 | 0.0008 | 0.001 | 0.005 | 0.01 | 0.08 | 0.1 | 0.105 | 0.12 | 0.14 |
|---|---|---|---|---|---|---|---|---|---|---|
| CURVE FACTOR | X | Δ | ○ | ○ | ○ | ○ | ○ | ○ | Δ | X |
| OPTICAL DURABILITY | X | ○ | ○ | ○ | ○ | ○ | ○ | Δ | X | X |
| UNIFORMITY IN CHARACTERISTICS | X | Δ | ○ | ○ | ○ | ○ | ○ | Δ | X | X |
| ADHESION | X | Δ | ○ | ○ | ○ | ○ | ○ | Δ | X | X |
| DURABILITY | X | Δ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS
*: CONTAINING SILICON COMPOUND GAS MIXED WITH $H_2$ GAS TO $H_2$ GAS

OTHER CONDITIONS

| | |
|---|---|
| FLOW RATE OF $H_2$ GAS CONTAINING SILICON COMPOUND GAS (sccm): | 1200 |
| SPECIES OF SILICON COMPOUND GAS: | $SiH_4$ |
| APPLIED POWER: | MW |
| POWER DENSITY (W/cm$^3$): | 0.12 |
| PRESSURE (Torr): | 0.007 |
| SUBSTRATE TEMPERATURE (°C.) FIRST/SECOND/THIRD: | 200/200/200 |

TABLE D9

(1)

| | |
|---|---|
| $H_2$ GAS FLOW RATE (sccm) | 800 |
| SPECIES OF SILICON COMPOUND GAS | $Si_2H_6$ |
| CONCENTRATION* (%) | 0.05 |
| TYPE OF APPLIED POWER | RF |
| POWER (W/cm$^3$) | 0.6 |
| PRESSURE (Torr) | 0.01~100 |
| SUBSTRATE TEMPERATURE (°C.) FIRST/SECOND/THIRD | 300/300/300 |

*: (SILICON COMPOUND GAS FLOW RATE)/($H_2$ GAS FLOW RATE)

(2)

| SC-EMB-D9 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.8 | | | | 140 | 210 | | |
| n/i BUFFER LAYER | | 5 | | | 100 | | | |
| MW i-LAYER | 50 | | | 51 | 180 | | | |
| p/i BUFFER LAYER | | 3.5 | | | 100 | | | |
| RF p-LAYER | | | 0.1 | | 60 | | 12 | 2 |
| RF n-LAYER | 1.1 | | | | 50 | 270 | | |
| n/i BUFFER LAYER | | 4 | | | 80 | | | |
| MW i-LAYER | 34 | | | 36 | 130 | | | |
| p/i BUFFER LAYER | | 0.5 | 0.3 | | 60 | | | |
| RF p-LAYER | | | 0.2 | | 60 | | 11 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 68 | | | |
| p/i BUFFER LAYER | | 0.4 | 0.25 | | 50 | | | |
| RF p-LAYER | | | 0.3 | | 60 | | 10 | 2 |

| SC-EMB-D9 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.8 | | 0.08 | 350 | 10 |
| MW i-LAYER | 0.006 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.8 | | 0.08 | 300 | 10 |

TABLE D9-continued

| | | | | | |
|---|---|---|---|---|---|
| MW i-LAYER | 0.006 | 0.25 | 0.5 | 330 | 100 |
| p/i BUFFER LAYER | 0.7 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.7 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| PRESSURE (Torr) | 0.01 | 0.03 | 0.05 | 1 | 3 | 5 | 10 | 11 | 20 | 100 |
|---|---|---|---|---|---|---|---|---|---|---|
| CURVE FACTOR | X | Δ | O | O | O | O | O | Δ | X | X |
| OPTICAL DURABILITY | X | Δ | O | O | O | O | O | O | Δ | X |
| UNIFORMITY IN CHARACTERISTICS | X | Δ | O | O | O | O | O | Δ | X | X |
| ADHESION | X | Δ | O | O | O | O | O | Δ | X | X |
| DURABILITY | X | X | O | O | O | O | O | Δ | X | X |

O: EXCELLENT FOR PRACTICAL USE
Δ: GOOD FOR PRACTICAL USE
X: NO GOOD FOR SOME APPLICATIONS
OTHER CONDITIONS

| | |
|---|---|
| FLOW RATE OF $H_2$ GAS CONTAINING SILICON COMPOUND GAS (sccm): | 800 |
| SPECIES OF SILICON COMPOUND GAS: | $Si_2H_6$ |
| CONCENTRATION OF SILICON COMPOUND GAS TO $H_2$ GAS (%): | 0.05 |
| APPLIED POWER: | RF |
| POWER DENSITY ($W/cm^3$): | 0.6 |
| SUBSTRATE TEMPERATURE (°C.) FIRST/SECOND/THIRD: | 300/300/300 |

TABLE D10

(1)

| | |
|---|---|
| $H_2$ GAS FLOW RATE (sccm) | 1200 |
| SPECIES OF SILICON COMPOUND GAS | $Si_2H_6$ |
| CONCENTRATION* (%) | 0.006 |
| TYPE OF APPLIED POWER | VHF |
| POWER ($W/cm^3$) | 0.017 |
| PRESSURE (mTorr) | 0.03~10000 |
| SUBSTRATE TEMPERATURE (°C.) FIRST/SECOND/THIRD | 270/270/200 |

*: (SILICON COMPOUND GAS FLOW RATE)/($H_2$ GAS FLOW RATE)

(2)

| SC-EMB-D10 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.7 | | | | 140 | 200 | | |
| n/i BUFFER LAYER | | 5 | | | 100 | | | |
| MW i-LAYER | 49 | | | 51 | 200 | | | |
| p/i BUFFER LAYER | | 3.5 | | | 100 | | | |
| RF p-LAYER | | | 0.1 | | 60 | | 11 | 2 |
| RF n-LAYER | 1.1 | | | | 50 | 270 | | |
| n/i BUFFER LAYER | | 4 | | | 80 | | | |
| MW i-LAYER | 34 | | | 36 | 140 | | | |
| p/i BUFFER LAYER | | 0.4 | 0.2 | | 60 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 65 | | | |
| p/i BUFFER LAYER | | 0.4 | 0.25 | | 50 | | | |
| RF p-LAYER | | | 0.3 | | 60 | | 10 | 2 |

| SC-EMB-D10 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |

TABLE D10-continued

| | | | | | |
|---|---|---|---|---|---|
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| PRESSURE (Torr) | 0.03 | 0.08 | 0.1 | 1 | 100 | 500 | 1000 | 1100 | 2000 | 10000 |
|---|---|---|---|---|---|---|---|---|---|---|
| CURVE FACTOR | X | Δ | ○ | ○ | ○ | ○ | ○ | ○ | Δ | X |
| OPTICAL DURABILITY | X | ○ | ○ | ○ | ○ | ○ | ○ | ○ | Δ | X |
| UNIFORMITY IN CHARACTERISTICS | X | Δ | ○ | ○ | ○ | ○ | ○ | Δ | X | X |
| ADHESION | X | Δ | ○ | ○ | ○ | ○ | ○ | Δ | X | X |
| DURABILITY | X | Δ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS
OTHER CONDITIONS

| | |
|---|---|
| FLOW RATE OF $H_2$ GAS CONTAINING SILICON COMPOUND GAS (sccm): | 1200 |
| SPECIES OF SILICON COMPOUND GAS: | $Si_2H_6$ |
| CONCENTRATION OF SILICON COMPOUND GAS TO $H_2$ GAS (%): | 0.006 |
| APPLIED POWER: | VHF |
| POWER DENSITY ($W/cm^3$): | 0.017 |
| SUBSTRATE TEMPERATURE (°C.) FIRST/SECOND/THIRD: | 270/270/200 |

TABLE D11

(1)

| | |
|---|---|
| $H_2$ GAS FLOW RATE (sccm) | 1100 |
| SPECIES OF SILICON COMPOUND GAS | $SiF_4$ |
| CONCENTRATION* (%) | 0.02 |
| TYPE OF APPLIED POWER | MW |
| POWER ($W/cm^3$) | 0.12 |
| PRESSURE (mTorr) | 0.03~100 |
| SUBSTRATE TEMPERATURE (°C.) FIRST/SECOND/THIRD | 200/200/200 |

*: (SILICON COMPOUND GAS FLOW RATE)/($H_2$ GAS FLOW RATE)

(2)

| SC-EMB-D11 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 130 | 200 | | |
| n/i BUFFER LAYER | | 4 | | | 100 | | | |
| MW i-LAYER | 49 | | | 51 | 230 | | | |
| p/i BUFFER LAYER | | 3.5 | | | 100 | | | |
| RF p-LAYER | | | 0.1 | | 60 | | 10 | 2 |
| RF n-LAYER | 1.1 | | | | 50 | 270 | | |
| n/i BUFFER LAYER | | 0.4 | 0.2 | | 80 | | | |
| MW i-LAYER | 34 | | | 36 | 150 | | | |
| p/i BUFFER LAYER | | 0.4 | 0.2 | | 60 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 68 | | | |
| p/i BUFFER LAYER | | 0.4 | 0.25 | | 50 | | | |
| RF p-LAYER | | | 0.3 | | 60 | | 10 | 2 |

TABLE D11-continued

| SC-EMB-D11 | PRESSURE Torr | MW POWER W/cm³ | RF POWER W/cm³ | SUBSTRATE TEMPERA-TURE °C. | LAYER THICKNESS nm |
|---|---|---|---|---|---|
| RF n-LAYER | 1.1 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| PRESSURE (mTorr) | 0.03 | 0.08 | 0.1 | 0.5 | 1 | 5 | 10 | 11 | 20 | 100 |
|---|---|---|---|---|---|---|---|---|---|---|
| CURVE FACTOR | X | Δ | ○ | ○ | ○ | ○ | ○ | ○ | Δ | X |
| OPTICAL DURABILITY | X | Δ | ○ | ○ | ○ | ○ | ○ | ○ | Δ | X |
| UNIFORMITY IN CHARACTERISTICS | X | ○ | ○ | ○ | ○ | ○ | ○ | Δ | X | X |
| ADHESION | X | Δ | ○ | ○ | ○ | ○ | ○ | Δ | X | X |
| DURABILITY | X | Δ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS
OTHER CONDITIONS

| | |
|---|---|
| FLOW RATE OF $H_2$ GAS CONTAINING SILICON COMPOUND GAS (sccm): | 1100 |
| SPECIES OF SILICON COMPOUND GAS: | $SiF_4$ |
| CONCENTRATION OF SILICON COMPOUND GAS TO $H_2$ GAS (%): | 0.02 |
| APPLIED POWER: | MW |
| POWER DENSITY (W/cm³): | 0.12 |
| SUBSTRATE TEMPERATURE (°C.) FIRST/SECOND/THIRD: | 200/200/200 |

TABLE D12

(1)

| | |
|---|---|
| $H_2$ GAS FLOW RATE (sccm) | 500 |
| SPECIES OF SILICON COMPOUND GAS | $SiH_4$ |
| CONCENTRATION* (%) | 0.03 |
| TYPE OF APPLIED POWER | RF |
| POWER (W/cm³) | 0.003~10 |
| PRESSURE (Torr) | 0.65 |
| SUBSTRATE TEMPERATURE (°C.) FIRST/SECOND/THIRD | 250/250/200 |

*: (SILICON COMPOUND GAS FLOW RATE)/($H_2$ GAS FLOW RATE)

(2)

| SC-EMB-D12 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.7 | | | | 130 | 200 | | |
| n/i BUFFER LAYER | | 4 | | | 130 | | | |
| MW i-LAYER | 46 | | | 51 | 220 | | | |
| p/i BUFFER LAYER | | 3.5 | | | 120 | | | |
| RF p-LAYER | | | 0.1 | | 60 | | 10 | 2 |
| RF n-LAYER | 1.1 | | | | 50 | 270 | | |
| n/i BUFFER LAYER | | 0.4 | 0.2 | | 80 | | | |
| MW i-LAYER | 33 | | | 36 | 160 | | | |
| p/i BUFFER LAYER | | 0.4 | 0.2 | | 60 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 65 | | | |

TABLE D12-continued

| | | | | | | | | |
|---|---|---|---|---|---|---|---|---|
| p/i BUFFER LAYER | | 0.4 | 0.25 | | 50 | | | |
| RF p-LAYER | | | 0.3 | | 60 | | 10 | 2 |

| SC-EMB-D12 | PRESSURE Torr | MW POWER W/cm³ | RF POWER W/cm³ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.8 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| POWER DENSITY ($W/cm^3$) | 0.003 | 0.007 | 0.01 | 0.05 | 0.1 | 0.7 | 1.0 | 1.1 | 3.0 | 10 |
|---|---|---|---|---|---|---|---|---|---|---|
| CURVE FACTOR | X | Δ | ○ | ○ | ○ | ○ | ○ | ○ | Δ | X |
| OPTICAL DURABILITY | Δ | ○ | ○ | ○ | ○ | ○ | ○ | ○ | Δ | X |
| UNIFORMITY IN CHARACTERISTICS | X | ○ | ○ | ○ | ○ | ○ | ○ | ○ | Δ | X |
| ADHESION | X | Δ | ○ | ○ | ○ | ○ | ○ | Δ | X | X |
| DURABILITY | X | Δ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS
OTHER CONDITIONS

| | |
|---|---|
| FLOW RATE OF $H_2$ GAS CONTAINING SILICON COMPOUND GAS (sccm): | 500 |
| SPECIES OF SILICON COMPOUND GAS: | $SiH_4$ |
| CONCENTRATION OF SILICON COMPOUND GAS TO $H_2$ GAS (%): | 0.03 |
| APPLIED POWER: | RF |
| PRESSURE (Torr): | 0.65 |
| SUBSTRATE TEMPERATURE (°C.) FIRST/SECOND/THIRD: | 250/250/200 |

TABLE D13

(1)

| | |
|---|---|
| $H_2$ GAS FLOW RATE (sccm) | 1200 |
| SPECIES OF SILICON COMPOUND GAS | $Si_2H_6$ |
| CONCENTRATION* (%) | 0.004 |
| TYPE OF APPLIED POWER | VHF |
| POWER ($W/cm^3$) | 0.003~10 |
| PRESSURE (Torr) | 0.0065 |
| SUBSTRATE TEMPERATURE (°C.) FIRST/SECOND/THIRD | 140/140/140 |

*: (SILICON COMPOUND GAS FLOW RATE)/($H_2$ GAS FLOW RATE)

(2)

| SC-EMB-D13 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.7 | | | | 130 | 200 | | |
| n/i BUFFER LAYER | | 4 | | | 130 | | | |
| MW i-LAYER | 45 | | | 46 | 250 | | | |
| p/i BUFFER LAYER | | 3.5 | | | 120 | | | |
| RF p-LAYER | | | 0.1 | | 60 | | 10 | 2 |
| RF n-LAYER | 1.0 | | | | 30 | 270 | | |
| n/i BUFFER LAYER | | 0.4 | 0.2 | | 80 | | | |
| MW i-LAYER | 33 | | | 29 | 130 | | | |
| p/i BUFFER LAYER | | 0.4 | 0.2 | | 60 | | | |
| RF p-LAYER | | | 0.2 | | 60 | | 10 | 2 |

TABLE D13-continued

| | | | | | | | | |
|---|---|---|---|---|---|---|---|---|
| RF n-LAYER | 0.8 | | | | 50 | 250 | | |
| n/i BUFFER LAYER | | 0.3 | 0.2 | | 50 | | | |
| RF i-LAYER | | 2.2 | | | 85 | | | |
| p/i BUFFER LAYER | | 0.4 | 0.25 | | 50 | | | |
| RF p-LAYER | | | 0.3 | | 60 | | 10 | 2 |

| SC-EMB-D13 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| POWER DENSITY (W/cm$^3$) | 0.003 | 0.007 | 0.01 | 0.05 | 0.1 | 0.7 | 1.0 | 1.1 | 3.0 | 10 |
|---|---|---|---|---|---|---|---|---|---|---|
| CURVE FACTOR | X | Δ | ○ | ○ | ○ | ○ | ○ | ○ | Δ | X |
| OPTICAL DURABILITY | X | ○ | ○ | ○ | ○ | ○ | ○ | ○ | Δ | X |
| UNIFORMITY IN CHARACTERISTICS | X | Δ | ○ | ○ | ○ | ○ | ○ | ○ | Δ | X |
| ADHESION | X | Δ | ○ | ○ | ○ | ○ | ○ | Δ | X | X |
| DURABILITY | X | Δ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
OTHER CONDITIONS

| | |
|---|---|
| FLOW RATE OF $H_2$ GAS CONTAINING SILICON COMPOUND GAS (sccm): | 1200 |
| SPECIES OF SILICON COMPOUND GAS: | $Si_2H_6$ |
| CONCENTRATION OF SILICON COMPOUND GAS TO $H_2$ GAS (%): | 0.004 |
| APPLIED POWER: | VHF |
| PRESSURE (Torr): | 0.0065 |
| SUBSTRATE TEMPERATURE (°C.) FIRST/SECOND/THIRD: | 140/140/140 |

TABLE D14

(1)

| | |
|---|---|
| $H_2$ GAS FLOW RATE (sccm) | 1800 |
| SPECIES OF SILICON COMPOUND GAS | $SiCl_2H_2$ |
| CONCENTRATION* (%) | 0.004 |
| TYPE OF APPLIED POWER | MW |
| POWER (W/cm$^3$) | 0.03~100 |
| PRESSURE (Torr) | 0.006 |
| SUBSTRATE TEMPERATURE (°C.) FIRST/SECOND/THIRD | 130/130/130 |

*: (SILICON COMPOUND GAS FLOW RATE)/($H_2$ GAS FLOW RATE)

(2)

| SC-EMB-D14 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.7 | | | | 140 | 200 | | |
| n/i BUFFER LAYER | | 4 | | | 120 | | | |
| MW i-LAYER | 45 | | | 46 | 165 | | | |
| p/i BUFFER LAYER | | 0.35 | 0.2 | | 120 | | | |
| RF p-LAYER | | | 0.1 | | 60 | | 10 | 2 |
| RF n-LAYER | 1.0 | | | | 30 | 270 | | |
| n/i BUFFER LAYER | | 0.4 | 0.2 | | 80 | | | |

TABLE D14-continued

| | | | | | | | | |
|---|---|---|---|---|---|---|---|---|
| MW i-LAYER | 33 | | | 30 | 140 | | | |
| p/i BUFFER LAYER | | 0.4 | 0.2 | | 70 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.2 | | | 85 | | | |
| p/i BUFFER LAYER | | 0.4 | 0.25 | | 60 | | | |
| RF p-LAYER | | | 0.4 | | 60 | | 10 | 2 |

| SC-EMB-D14 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| POWER DENSITY ($W/cm^3$) | 0.03 | 0.07 | 0.1 | 0.5 | 1 | 7 | 10 | 11 | 30 | 100 |
|---|---|---|---|---|---|---|---|---|---|---|
| CURVE FACTOR | X | Δ | ○ | ○ | ○ | ○ | ○ | Δ | X | X |
| OPTICAL DURABILITY | X | ○ | ○ | ○ | ○ | ○ | ○ | ○ | X | X |
| UNIFORMITY IN CHARACTERISTICS | X | Δ | ○ | ○ | ○ | ○ | ○ | Δ | X | X |
| ADHESION | X | Δ | ○ | ○ | ○ | ○ | ○ | ○ | X | X |
| DURABILITY | X | Δ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS

OTHER CONDITIONS

| | |
|---|---|
| FLOW RATE OF $H_2$ GAS CONTAINING SILICON COMPOUND GAS (sccm): | 1800 |
| SPECIES OF SILICON COMPOUND GAS: | $SiCl_2H_2$ |
| CONCENTRATION OF SILICON COMPOUND GAS TO $H_2$ GAS (%): | 0.004 |
| APPLIED POWER: | MW |
| PRESSURE (Torr): | 0.006 |
| SUBSTRATE TEMPERATURE (°C.) FIRST/SECOND/THIRD: | 130/130/130 |

TABLE D15

(1)

| | |
|---|---|
| $H_2$ GAS FLOW RATE (sccm) | 750 |
| SPECIES OF SILICON COMPOUND GAS | $SiH_4$ |
| CONCENTRATION* (%) | 0.07 |
| TYPE OF APPLIED POWER | RF |
| POWER ($W/cm^3$) | 0.25 |
| PRESSURE (Torr) | 1.1 |
| SUBSTRATE TEMPERATURE (°C.) | 50 ~ 520 |

*: (SILICON COMPOUND GAS FLOW RATE)/($H_2$ GAS FLOW RATE)

(2)

| SC-EMB-D15 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.7 | | | | 130 | 200 | | |
| n/i BUFFER LAYER | | 0.4 | 0.1 | | 120 | | | |
| MW i-LAYER | 45 | | | 47 | 110 | | | |
| p/i BUFFER LAYER | | 0.35 | 0.2 | | 120 | | | |
| RF p-LAYER | | | 0.1 | | 60 | | 10 | 2 |

TABLE D15-continued

| | | | | | | | | |
|---|---|---|---|---|---|---|---|---|
| RF n-LAYER | 1.0 | | | | 30 | 270 | | |
| n/i BUFFER LAYER | | 0.4 | 0.2 | | 80 | | | |
| MW i-LAYER | 35 | | | 28 | 140 | | | |
| p/i BUFFER LAYER | | 0.4 | 0.2 | | 70 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.2 | | | 75 | | | |
| p/i BUFFER LAYER | | 0.4 | 0.25 | | 60 | | | |
| RF p-LAYER | | | 0.4 | | 60 | | 10 | 2 |

| SC-EMB-D15 | PRESSURE Torr | MW POWER W/cm³ | RF POWER W/cm³ | SUBSTRATE TEMPERA-TURE °C. | LAYER THICKNESS nm |
|---|---|---|---|---|---|
| RF n-LAYER | 1.1 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.7 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| SUBSTRATE TEMPERATURE (°C.) | 50 | 75 | 100 | 150 | 200 | 300 | 400 | 420 | 450 | 520 |
|---|---|---|---|---|---|---|---|---|---|---|
| CURVE FACTOR | X | ○ | ○ | ○ | ○ | ○ | ○ | X | X | X |
| OPTICAL DURABILITY | X | Δ | ○ | ○ | ○ | ○ | ○ | ○ | X | X |
| UNIFORMITY IN CHARACTERISTICS | X | Δ | ○ | ○ | ○ | ○ | ○ | Δ | X | X |
| ADHESION | X | Δ | ○ | ○ | ○ | ○ | ○ | Δ | X | X |
| DURABILITY | X | X | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS
OTHER CONDITIONS

| | |
|---|---|
| FLOW RATE OF $H_2$ GAS CONTAINING SILICON COMPOUND GAS (sccm): | 750 |
| SPECIES OF SILICON COMPOUND GAS: | $SiH_4$ |
| CONCENTRATION OF SILICON COMPOUND GAS TO $H_2$ GAS (%): | 0.07 |
| APPLIED POWER: | RF |
| POWER DENSITY (W/cm³): | 0.25 |
| PRESSURE (Torr): | 1.1 |

TABLE D16

(1)

| | |
|---|---|
| $H_2$ GAS FLOW RATE (sccm) | 1500 |
| SPECIES OF SILICON COMPOUND GAS | $SiCl_4$ |
| CONCENTRATION* (%) | 0.02 |
| TYPE OF APPLIED POWER | VHF |
| POWER (W/cm³) | 0.27 |
| PRESSURE (Torr) | 0.06 |
| SUBSTRATE TEMPERATURE (°C.) | 30 ~ 420 |

*: (SILICON COMPOUND GAS FLOW RATE)/($H_2$ GAS FLOW RATE)

(2)

| SC-EMB-D16 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 110 | 200 | | |
| n/i BUFFER LAYER | | 0.4 | 0.1 | | 110 | | | |
| MW i-LAYER | 44 | | | 43 | 110 | | | |
| p/i BUFFER LAYER | | 0.35 | 0.2 | | 120 | | | |

TABLE D16-continued

| | | | | | | | | |
|---|---|---|---|---|---|---|---|---|
| RF p-LAYER | | | 0.1 | | 60 | | 10 | 2 |
| RF n-LAYER | 1.0 | | | | 30 | 270 | | |
| n/i BUFFER LAYER | | 0.4 | 0.2 | | 80 | | | |
| MW i-LAYER | 35 | | | 27 | 110 | | | |
| p/i BUFFER LAYER | | 0.4 | 0.2 | | 70 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.1 | | | 85 | | | |
| p/i BUFFER LAYER | | 0.4 | 0.25 | | 60 | | | |
| RF p-LAYER | | | 0.4 | | 60 | | 10 | 2 |

| SC-EMB-D16 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.6 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| SUBSTRATE TEMPERATURE (°C.) | 30 | 40 | 50 | 100 | 200 | 250 | 300 | 320 | 350 | 420 |
|---|---|---|---|---|---|---|---|---|---|---|
| CURVE FACTOR | X | ○ | ○ | ○ | ○ | ○ | ○ | Δ | X | X |
| OPTICAL DURABILITY | X | Δ | ○ | ○ | ○ | ○ | ○ | ○ | X | X |
| UNIFORMITY IN CHARACTERISTICS | X | Δ | ○ | ○ | ○ | ○ | ○ | Δ | X | X |
| ADHESION | X | Δ | ○ | ○ | ○ | ○ | ○ | Δ | X | X |
| DURABILITY | X | X | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS
OTHER CONDITIONS

| | |
|---|---|
| FLOW RATE OF $H_2$ GAS CONTAINING SILICON COMPOUND GAS (sccm): | 1500 |
| SPECIES OF SILICON COMPOUND GAS: | $SiCl_4$ |
| CONCENTRATION OF SILICON COMPOUND GAS TO $H_2$ GAS (%): | 0.02 |
| APPLIED POWER: | VHF |
| POWER DENSITY (W/cm$^3$): | 0.27 |
| PRESSURE (Torr): | 0.06 |

TABLE D17

(1)

| | |
|---|---|
| $H_2$ GAS FLOW RATE (sccm) | 1700 |
| SPECIES OF SILICON COMPOUND GAS | $SiCl_2H_2$ |
| CONCENTRATION* (%) | 0.01 |
| TYPE OF APPLIED POWER | MW |
| POWER (W/cm$^3$) | 0.6 |
| PRESSURE (Torr) | 0.005 |
| SUBSTRATE TEMPERATURE (°C.) | 30~420 |

*: (SILICON COMPOUND GAS FLOW RATE)/($H_2$ GAS FLOW RATE)

(2)

| SC-EMB-D17 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 120 | 200 | | |
| n/i BUFFER LAYER | | 0.4 | 0.2 | | 110 | | | |
| MW i-LAYER | 42 | | | 43 | 125 | | | |

TABLE D17-continued

| | | | | | | | | |
|---|---|---|---|---|---|---|---|---|
| p/i BUFFER LAYER | | 0.35 | 0.2 | | 120 | | | |
| RF p-LAYER | | | 0.1 | | 60 | | 10 | 1.7 |
| RF n-LAYER | 1.0 | | | | 30 | 270 | | |
| n/i BUFFER LAYER | | 0.4 | 0.2 | | 80 | | | |
| MW i-LAYER | 33 | | | 27 | 125 | | | |
| p/i BUFFER LAYER | | 0.4 | 0.2 | | 70 | | | |
| RF p-LAYER | | | 0.2 | | 60 | | 10 | 1.8 |
| RF n-LAYER | 0.8 | | | | 50 | 250 | | |
| n/i BUFFER LAYER | | 0.3 | 0.2 | | 50 | | | |
| RF i-LAYER | | 2.1 | | | 75 | | | |
| p/i BUFFER LAYER | | 0.4 | 0.25 | | 60 | | | |
| RF p-LAYER | | | 0.4 | | 60 | | 10 | 1.8 |

| SC-EMB-D17 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.8 | | 0.08 | 350 | 10 |
| MW i-LAYER | 0.005 | 0.35 | 0.5 | 370 | 110 |
| p/i BUFFER LAYER | 0.8 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| SUBSTRATE TEMPERATURE (°C.) | 30 | 40 | 50 | 100 | 200 | 250 | 300 | 320 | 350 | 420 |
|---|---|---|---|---|---|---|---|---|---|---|
| CURVE FACTOR | X | Δ | ○ | ○ | ○ | ○ | ○ | Δ | X | X |
| OPTICAL DURABILITY | X | Δ | ○ | ○ | ○ | ○ | ○ | ○ | Δ | X |
| UNIFORMITY IN CHARACTERISTICS | X | Δ | ○ | ○ | ○ | ○ | ○ | Δ | X | X |
| ADHESION | X | Δ | ○ | ○ | ○ | ○ | ○ | Δ | X | X |
| DURABILITY | X | X | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS
OTHER CONDITIONS

| | |
|---|---|
| FLOW RATE OF $H_2$ GAS CONTAINING SILICON COMPOUND GAS (sccm): | 1700 |
| SPECIES OF SILICON COMPOUND GAS: | $SiCl_2H_2$ |
| CONCENTRATION OF SILICON COMPOUND GAS TO $H_2$ GAS (%): | 0.01 |
| APPLIED POWER: | MW |
| POWER DENSITY ($W/cm^3$): | 0.6 |
| PRESSURE (Torr): | 0.005 |

TABLE D18

(1)

| | |
|---|---|
| $H_2$ GAS FLOW RATE (sccm) | 850 |
| SPECIES OF SILICON COMPOUND GAS | $SiH_4/H_2$ |
| CONCENTRATION* (%) | 0.04 |
| TYPE OF APPLIED POWER | RF |
| POWER ($W/cm^3$) | 0.03 |
| PRESSURE (Torr) | 1.1 |
| SUBSTRATE TEMPERATURE (°C.) | 360 |

*: ($SiH_4$ GAS FLOW RATE)/(TOTAL $H_2$ GAS FLOW RATE)

(2)

| | |
|---|---|
| $H_2$ GAS FLOW RATE (sccm) | 750 |
| SPECIES OF SILICON COMPOUND GAS | $SiH_4/H_2$ |
| CONCENTRATION* (%) | 0.03 |
| TYPE OF APPLIED POWER | RF |
| POWER ($W/cm^3$) | 0.02 |
| PRESSURE (Torr) | 0.9 |
| SUBSTRATE TEMPERATURE (°C.) | 350 |

TABLE D18-continued

*: ($SiH_4$ GAS FLOW RATE)/(TOTAL $H_2$ GAS FLOW RATE)

(3)

| | |
|---|---|
| $H_2$ GAS FLOW RATE (sccm) | 900 |
| SPECIES OF SILICON COMPOUND GAS | $SiH_4$ |
| CONCENTRATION* (%) | 0.003 |
| TYPE OF APPLIED POWER | RF |
| POWER (W/cm$^3$) | 0.02 |
| PRESSURE (Torr) | 0.8 |
| SUBSTRATE TEMPERATURE (°C.) | 350 |

*: (SILICON COMPOUND GAS FLOW RATE)/($H_2$ GAS FLOW RATE)

(4)

| | |
|---|---|
| $H_2$ GAS FLOW RATE (sccm) | 650 |
| SPECIES OF SILICON COMPOUND GAS | $SiH_4/H_2$ |
| CONCENTRATION* (%) | 0.04 |
| TYPE OF APPLIED POWER | RF |
| POWER (W/cm$^3$) | 0.03 |
| PRESSURE (Torr) | 0.9 |
| SUBSTRATE TEMPERATURE (°C.) | 300 |

*: ($SiH_4$ GAS FLOW RATE)/(TOTAL $H_2$ GAS FLOW RATE)

(5)

| | |
|---|---|
| $H_2$ GAS FLOW RATE (sccm) | 850 |
| SPECIES OF SILICON COMPOUND GAS | $SiH_4$ |
| CONCENTRATION* (%) | 0.003 |
| TYPE OF APPLIED POWER | RF |
| POWER (W/cm$^3$) | 0.02 |
| PRESSURE (Torr) | 0.8 |
| SUBSTRATE TEMPERATURE (°C.) | 300 |

*: (SILICON COMPOUND GAS FLOW RATE)/($H_2$ GAS FLOW RATE)

(6)

| | |
|---|---|
| $H_2$ GAS FLOW RATE (sccm) | 600 |
| SPECIES OF SILICON COMPOUND GAS | $SiH_4/H_2$ |
| CONCENTRATION* (%) | 0.03 |
| TYPE OF APPLIED POWER | RF |
| POWER (W/cm$^3$) | 0.03 |
| PRESSURE (Torr) | 0.9 |
| SUBSTRATE TEMPERATURE (°C.) | 230 |

*: ($SiH_4$ GAS FLOW RATE)/(TOTAL $H_2$ GAS FLOW RATE)

(7)

| | |
|---|---|
| $H_2$ GAS FLOW RATE (sccm) | 800 |
| SPECIES OF SILICON COMPOUND GAS | $SiH_4$ |
| CONCENTRATION* (%) | 0.003 |
| TYPE OF APPLIED POWER | RF |
| POWER (W/cm$^3$) | 0.02 |
| PRESSURE (Torr) | 0.8 |
| SUBSTRATE TEMPERATURE (°C.) | 200 |

*: (SILICON COMPOUND GAS FLOW RATE)/($H_2$ GAS FLOW RATE)

(8)

| SC-EMB-D18 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.7 | | | | 130 | 200 | | |
| n/i BUFFER LAYER | | 0.4 | 0.2 | | 110 | | | |
| MW i-LAYER | 43 | | | 44 | 120 | | | |
| p/i BUFFER LAYER | | 0.4 | 0.2 | | 120 | | | |
| RF p-LAYER | | | 0.1 | | 60 | | 10 | 1.7 |
| RF n-LAYER | 0.9 | | | | 20 | 280 | | |
| n/i BUFFER LAYER | | 0.4 | 0.2 | | 80 | | | |
| MW i-LAYER | 33 | | | 27 | 120 | | | |
| p/i BUFFER LAYER | | 0.4 | 0.2 | | 70 | | | |
| RF p-LAYER | | | 0.2 | | 60 | 10 | 1.8 | |
| RF n-LAYER | 0.8 | | | | 50 | 250 | | |
| n/i BUFFER LAYER | | 0.4 | 0.2 | | 50 | | | |
| RF i-LAYER | | 2.1 | | | 65 | | | |
| p/i BUFFER LAYER | | 0.4 | 0.25 | | 60 | | | |
| RF p-LAYER | | | 0.4 | | 60 | | 10 | 1.8 |

TABLE D18-continued

| SC-EMB-D18 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 12 |
| RF p-LAYER | 1.6 | | 0.07 | 170 | 10 |

TABLE E1

(1)

| | |
|---|---|
| $H_2$ GAS FLOW RATE (sccm) | 1000 |
| SPECIES OF SILICON COMPOUND GAS | $SiH_4$ |
| CONCENTRATION* (%) | 0.01 |
| TYPE OF APPLIED POWER | RF |
| POWER (W/cm$^3$) | 0.05 |
| PRESSURE (Torr) | 0.8 |
| SUBSTRATE TEMPERATURE (°C.) | 300 |

*: (SILICON COMPOUND GAS FLOW RATE)/($H_2$ GAS FLOW RATE)

(2)

| SC-EMB-E1 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.4 | | | | 110 | 200 | | |
| n/i BUFFER LAYER | | 3.5 | | | 80 | | | |
| MW i-LAYER | 38 | | | 37 | 130 | | | |
| p/i BUFFER LAYER | | 3 | | | 80 | | | |
| RF p-LAYER | | | 0.3 | | 80 | | 10 | 1 |

| SC-EMB-E1 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.1 | | 0.04 | 370 | 20 |
| n/i BUFFER LAYER | 0.08 | | 0.06 | 360 | 10 |
| MW i-LAYER | 0.005 | 0.3 | 0.7 | 370 | 150 |
| p/i BUFFER LAYER | 0.7 | | 0.07 | 230 | 20 |
| RF p-LAYER | 1.3 | | 0.09 | 200 | 10 |

TABLE E2

(1)

| | |
|---|---|
| $H_2$ GAS FLOW RATE (sccm) | 850 |
| SPECIES OF SILICON COMPOUND GAS | $Si_2H_6$ |
| CONCENTRATION* (%) | 0.005 |
| TYPE OF APPLIED POWER | VHF |
| POWER (W/cm$^3$) | 0.085 |
| PRESSURE (Torr) | 0.012 |
| SUBSTRATE TEMPERATURE (°C.) | 285 |

*: (SILICON COMPOUND GAS FLOW RATE)/($H_2$ GAS FLOW RATE)

(2)

| | |
|---|---|
| $H_2$ GAS FLOW RATE (sccm) | 1100 |
| SPECIES OF SILICON COMPOUND GAS | $SiH_4$ |
| CONCENTRATION* (%) | 0.003 |
| TYPE OF APPLIED POWER | RF |
| POWER (W/cm$^3$) | 0.02 |
| PRESSURE (Torr) | 0.7 |
| SUBSTRATE TEMPERATURE (°C.) | 200 |

*: (SILICON COMPOUND GAS FLOW RATE)/($H_2$ GAS FLOW RATE)

(3)

| SC-EMB-E2 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.7 | | | | 90 | 200 | | |
| n/i BUFFER LAYER | | 3.5 | | | 85 | | | |
| MW i-LAYER | 45 | | | 40 | 150 | | | |
| p/i BUFFER LAYER | | 3 | | | 70 | | | |
| RF p-LAYER | | | 0.3 | | 60 | | 10 | 2 |
| RF n-LAYER | 2 | | | | 70 | 250 | | |
| n/i BUFFER LAYER | | 0.4 | 0.2 | | 80 | | | |
| RF i-LAYER | | 3 | | | 60 | | | |
| p/i BUFFER LAYER | | 0.4 | 0.3 | | 60 | | | |
| RF p-LAYER | | | 0.3 | | 60 | | 10 | 2 |

| SC-EMB-E2 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.05 | 380 | 20 |
| n/i BUFFER LAYER | 0.8 | | 0.08 | 360 | 10 |
| MW i-LAYER | 0.005 | 0.25 | 0.60 | 380 | 150 |
| p/i BUFFER LAYER | 0.7 | | 0.07 | 250 | 20 |
| RF p-LAYER | 1.8 | | 0.07 | 250 | 10 |
| RF n-LAYER | 1.1 | | 0.04 | 250 | 10 |
| n/i BUFFER LAYER | 1.3 | | 0.06 | 250 | 10 |
| RF i-LAYER | 0.5 | | 0.07 | 200 | 110 |
| p/i BUFFER LAYER | 1.2 | | 0.06 | 200 | 15 |
| RF p-LAYER | 1.7 | | 0.07 | 170 | 10 |

TABLE E3

(1)

| | |
|---|---|
| $H_2$ GAS FLOW RATE (sccm) | 700 |
| SPECIES OF SILICON COMPOUND GAS | $SiCl_2H_2/He$ |
| CONCENTRATION* (%) | 0.04 |
| TYPE OF APPLIED POWER | MW |
| POWER ($W/cm^3$) | 0.12 |
| PRESSURE (Torr) | 0.008 |
| SUBSTRATE TEMPERATURE (°C.) | 340 |

*: ($SiCl_2H_2$ GAS FLOW RATE)/(TOTAL $H_2$ GAS FLOW RATE)

(2)

| | |
|---|---|
| $H_2$ GAS FLOW RATE (sccm) | 900 |
| SPECIES OF SILICON COMPOUND GAS | $SiH_4/H_2$ |
| CONCENTRATION* (%) | 0.05 |
| TYPE OF APPLIED POWER | RF |
| POWER ($W/cm^3$) | 0.03 |
| PRESSURE (Torr) | 0.8 |
| SUBSTRATE TEMPERATURE (°C.) | 300 |

*: ($SiH_4$ GAS FLOW RATE)/(TOTAL $H_2$ GAS FLOW RATE)

(3)

| | |
|---|---|
| $H_2$ GAS FLOW RATE (sccm) | 800 |
| SPECIES OF SILICON COMPOUND GAS | $SiH_4/H_2$ |
| CONCENTRATION* (%) | 0.04 |
| TYPE OF APPLIED POWER | RF |
| POWER ($W/cm^3$) | 0.03 |
| PRESSURE (Torr) | 0.7 |
| SUBSTRATE TEMPERATURE (°C.) | 200 |

*: ($SiH_4$ GAS FLOW RATE)/(TOTAL $H_2$ GAS FLOW RATE)

(4)

| SC-EMB-E3 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 150 | 200 | | |
| n/i BUFFER LAYER | | 4 | | | 120 | | | |
| MW i-LAYER | 50 | | | 51 | 140 | | | |
| p/i BUFFER LAYER | | 4 | | | 110 | | | |
| RF p-LAYER | | | 0.1 | | 70 | | 10 | 2 |
| RF n-LAYER | 1.1 | | | | 50 | 250 | | |
| n/i BUFFER LAYER | | 4 | | | 80 | | | |
| MW i-LAYER | 42 | | | 37 | 140 | | | |
| p/i BUFFER LAYER | | 3 | | | 80 | | | |
| RF p-LAYER | | | 0.2 | | 60 | | 10 | 2 |
| RF n-LAYER | 0.8 | | | | 50 | 250 | | |
| n/i BUFFER LAYER | | 0.4 | 0.2 | | 50 | | | |
| RF i-LAYER | | 2 | | | 75 | | | |
| p/i BUFFER LAYER | | 0.4 | 0.25 | | 50 | | | |
| RF p-LAYER | | | 0.3 | | 60 | | 10 | 2 |

| SC-EMB-E3 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.3 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.25 | | 0.06 | 200 | 12 |
| RF p-LAYER | 1.6 | | 0.07 | 170 | 10 |

TABLE E4

(1)

| | |
|---|---|
| $H_2$ GAS FLOW RATE (sccm) | 0.1 ~ 2500 |
| SPECIES OF SILICON COMPOUND GAS | $SiH_4$ |
| CONCENTRATION* (%) | 0.04 |
| TYPE OF APPLIED POWER | RF |
| POWER (W/cm³) | 0.3 |
| PRESSURE (Torr) | 0.8 |
| SUBSTRATE TEMPERATURE (°C.) FIRST/SECOND/THIRD | 260/260/200 |

*: (SILICON COMPOUND GAS FLOW RATE)/($H_2$ GAS FLOW RATE)

(2)

| SC-EMB-E4 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.4 | | | | 100 | 200 | | |
| n/i BUFFER LAYER | | 4 | | | 100 | | | |
| MW i-LAYER | 50 | | | 48 | 140 | | | |
| p/i BUFFER LAYER | | 4 | | | 100 | | | |
| RF p-LAYER | | | 0.1 | | 60 | | 10 | 2 |
| RF n-LAYER | 1.1 | | | | 50 | 250 | | |
| n/i BUFFER LAYER | | 4 | | | 70 | | | |
| MW i-LAYER | 40 | | | 36 | 130 | | | |
| p/i BUFFER LAYER | | 3 | | | 80 | | | |
| RF p-LAYER | | | 0.2 | | 60 | | 10 | 2 |
| RF n-LAYER | 0.8 | | | | 50 | 250 | | |
| n/i BUFFER LAYER | | 0.4 | 0.2 | | 50 | | | |
| RF i-LAYER | | 2 | | | 90 | | | |
| p/i BUFFER LAYER | | 0.4 | 0.25 | | 50 | | | |
| RF p-LAYER | | | 0.3 | | 60 | | 10 | 2 |

| SC-EMB-E4 | PRESSURE Torr | MW POWER W/cm³ | RF POWER W/cm³ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.3 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| $H_2$ GAS FLOW RATE* (sccm) | 0.1 | 0.5 | 0.8 | 1 | 10 | 100 | 1000 | 2000 | 2030 | 2100 | 2500 |
|---|---|---|---|---|---|---|---|---|---|---|---|
| CURVE FACTOR | X | Δ | ○ | ○ | ○ | ○ | ○ | ○ | ○ | Δ | X |
| OPTICAL DURABILITY | X | Δ | ○ | ○ | ○ | ○ | ○ | ○ | Δ | X | X |
| UNIFORMITY IN CHARACTERISTICS | X | Δ | ○ | ○ | ○ | ○ | ○ | ○ | Δ | X | X |
| ADHESION | X | X | Δ | ○ | ○ | ○ | ○ | ○ | ○ | Δ | X |
| DURABILITY | X | Δ | ○ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS
*: CONTAINING SILICON COMPOUND GAS

OTHER CONDITIONS

| | |
|---|---|
| SPECIES OF SILICON COMPOUND GAS: | $SiH_4$ |
| CONCENTRATION OF SILICON COMPOUND GAS (%): | 0.04 |
| APPLIED POWER: | RF |
| POWER DENSITY (W/cm³): | 0.3 |
| PRESSURE (Torr): | 0.8 |
| SUBSTRATE TEMPERATURE (°C.) FIRST/SECOND/THIRD: | 260/260/200 |

TABLE E5

(1)

| | |
|---|---|
| $H_2$ GAS FLOW RATE (sccm) | 0.1 ~ 2500 |
| SPECIES OF SILICON COMPOUND GAS | $SiH_4$ |
| CONCENTRATION* (%) | 0.06 |
| TYPE OF APPLIED POWER | VHF |
| POWER (W/cm$^3$) | 0.2 |
| PRESSURE (Torr) | 0.003 |
| SUBSTRATE TEMPERATURE (°C.) FIRST/SECOND/THIRD | 280/280/200 |

*: (SILICON COMPOUND GAS FLOW RATE)/($H_2$ GAS FLOW RATE)

(2)

| SC-EMB-E5 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 120 | 200 | | |
| n/i BUFFER LAYER | | 4 | | | 100 | | | |
| MW i-LAYER | 48 | | | 48 | 150 | | | |
| p/i BUFFER LAYER | | 3.5 | | | 100 | | | |
| RF p-LAYER | | | 0.1 | | 60 | | 10 | 2 |
| RF n-LAYER | 1.2 | | | | 50 | 250 | | |
| n/i BUFFER LAYER | | 4 | | | 80 | | | |
| MW i-LAYER | 40 | | | 35 | 140 | | | |
| p/i BUFFER LAYER | | 3 | | | 80 | | | |
| RF p-LAYER | | | 0.2 | | 60 | | 10 | 2 |
| RF n-LAYER | 0.8 | | | | 50 | 250 | | |
| n/i BUFFER LAYER | | 0.4 | 0.2 | | 50 | | | |
| RF i-LAYER | | 2 | | | 70 | | | |
| p/i BUFFER LAYER | | 0.4 | 0.25 | | 50 | | | |
| RF p-LAYER | | | 0.3 | | 60 | | 10 | 2 |

| SC-EMB-E5 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| $H_2$ GAS FLOW RATE* (sccm) | 0.1 | 0.5 | 0.8 | 1 | 10 | 100 | 1000 | 2000 | 2030 | 2100 | 2500 |
|---|---|---|---|---|---|---|---|---|---|---|---|
| CURVE FACTOR | X | X | Δ | ○ | ○ | ○ | ○ | ○ | ○ | Δ | X |
| OPTICAL DURABILITY | X | Δ | ○ | ○ | ○ | ○ | ○ | ○ | ○ | Δ | X |
| UNIFORMITY IN CHARACTERISTICS | X | Δ | ○ | ○ | ○ | ○ | ○ | ○ | ○ | Δ | X |
| ADHESION | X | X | Δ | ○ | ○ | ○ | ○ | ○ | Δ | Δ | X |
| DURABILITY | X | Δ | ○ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS
*: CONTAINING SILICON COMPOUND GAS

OTHER CONDITIONS

| | |
|---|---|
| SPECIES OF SILICON COMPOUND GAS: | $SiH_4$ |
| CONCENTRATION OF SILICON COMPOUND GAS (%): | 0.06 |
| APPLIED POWER: | VHF |
| POWER DENSITY (W/cm$^3$): | 0.2 |
| PRESSURE (Torr): | 0.003 |
| SUBSTRATE TEMPERATURE (°C.) FIRST/SECOND/THIRD: | 280/280/200 |

TABLE E6

(1)

| | |
|---|---|
| $H_2$ GAS FLOW RATE (sccm) | 1300 |
| SPECIES OF SILICON COMPOUND GAS | $SiH_4$ |
| CONCENTRATION* (%) | 0.0003 ~ 0.14 |
| TYPE OF APPLIED POWER | RF |
| POWER (W/cm$^3$) | 0.08 |
| PRESSURE (Torr) | 0.8 |
| SUBSTRATE TEMPERATURE (°C.) FIRST/SECOND/THIRD | 250/250/200 |

*: (SILICON COMPOUND GAS FLOW RATE)/($H_2$ GAS FLOW RATE)

(2)

| SC-EMB-E6 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 100 | 200 | | |
| n/i BUFFER LAYER | | 4 | | | 100 | | | |
| MW i-LAYER | 47 | | | 48 | 130 | | | |
| p/i BUFFER LAYER | | 3.5 | | | 100 | | | |
| RF p-LAYER | | | 0.1 | | 60 | | 12 | 2 |
| RF n-LAYER | 1.1 | | | | 50 | 250 | | |
| n/i BUFFER LAYER | | 4 | | | 80 | | | |
| MW i-LAYER | 39 | | | 34 | 140 | | | |
| p/i BUFFER LAYER | | 3 | | | 80 | | | |
| RF p-LAYER | | | 0.2 | | 60 | | 11 | 2 |
| RF n-LAYER | 0.8 | | | | 50 | 250 | | |
| n/i BUFFER LAYER | | 0.4 | 0.2 | | 50 | | | |
| RF i-LAYER | | 2 | | | 75 | | | |
| p/i BUFFER LAYER | | 0.4 | 0.25 | | 50 | | | |
| RF p-LAYER | | | 0.3 | | 60 | | 10 | 2 |

| SC-EMB-E6 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.34 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.24 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| CONCENTRATION (%)* | 0.0003 | 0.0008 | 0.001 | 0.005 | 0.01 | 0.08 | 0.1 | 0.105 | 0.12 | 0.14 |
|---|---|---|---|---|---|---|---|---|---|---|
| CURVE FACTOR | X | Δ | ○ | ○ | ○ | ○ | ○ | ○ | Δ | X |
| OPTICAL DURABILITY | Δ | ○ | ○ | ○ | ○ | ○ | ○ | Δ | X | X |
| UNIFORMITY IN CHARACTERISTICS | X | Δ | ○ | ○ | ○ | ○ | ○ | Δ | X | X |
| ADHESION | X | Δ | ○ | ○ | ○ | ○ | ○ | Δ | X | X |
| DURABILITY | X | Δ | ○ | ○ | ○ | ○ | ○ | X | X | X |

○: EXCELLENT FOR PRACTICAL USE
Δ: GOOD FOR PRACTICAL USE
X: NO GOOD FOR SOME APPLICATIONS
*: CONCENTRATION OF SILICON COMPOUND GAS MIXED WITH $H_2$ GAS TO $H_2$ GAS

OTHER CONDITIONS

| | |
|---|---|
| FLOW RATE OF $H_2$ GAS CONTAINING SILICON COMPOUND GAS (sccm): | 1300 |
| SPECIES OF SILICON COMPOUND GAS: | $SiH_4$ |
| APPLIED POWER: | RF |
| POWER DENSITY (W/cm$^3$): | 0.08 |
| PRESSURE (Torr): | 0.8 |
| SUBSTRATE TEMPERATURE (°C.) FIRST/SECOND/THIRD: | 250/250/200 |

TABLE E7

(1)

| | |
|---|---|
| $H_2$ GAS FLOW RATE (sccm) | 1250 |
| SPECIES OF SILICON COMPOUND GAS | $SiH_4$ |
| CONCENTRATION* (%) | 0.0003~0.14 |
| TYPE OF APPLIED POWER | VHF |
| POWER ($W/cm^3$) | 0.11 |
| PRESSURE (Torr) | 0.07 |
| SUBSTRATE TEMPERATURE (°C.) FIRST/SECOND/THIRD | 280/280/200 |

*: (SILICON COMPOUND GAS FLOW RATE)/($H_2$ GAS FLOW RATE)

(2)

| SC-EMB-E7 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.8 | | | | 160 | 200 | | |
| n/i BUFFER LAYER | | 4 | | | 100 | | | |
| MW i-LAYER | 47 | | | 49 | 150 | | | |
| p/i BUFFER LAYER | | 3.5 | | | 100 | | | |
| RF p-LAYER | | | 0.1 | | 60 | | 12 | 2 |
| RF n-LAYER | 1.1 | | | | 50 | 260 | | |
| n/i BUFFER LAYER | | 4 | | | 80 | | | |
| MW i-LAYER | 35 | | | 34 | 140 | | | |
| p/i BUFFER LAYER | | 3 | | | 80 | | | |
| RF p-LAYER | | | 0.2 | | 60 | | 11 | 2 |
| RF n-LAYER | 0.8 | | | | 50 | 240 | | |
| n/i BUFFER LAYER | | 0.4 | 0.2 | | 50 | | | |
| RF i-LAYER | | 2.5 | | | 85 | | | |
| p/i BUFFER LAYER | | 0.4 | 0.25 | | 50 | | | |
| RF p-LAYER | | | 0.3 | | 60 | | 10 | 2 |

| SC-EMB-E7 | PRESSURE Torr | MW POWER $W/cm^3$ | RF POWER $W/cm^3$ | SUBSTRATE TEMPERATURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| CONCENTRATION (%)* | 0.0003 | 0.0008 | 0.001 | 0.005 | 0.01 | 0.08 | 0.1 | 0.105 | 0.12 | 0.14 |
|---|---|---|---|---|---|---|---|---|---|---|
| CURVE FACTOR | X | Δ | O | O | O | O | O | O | Δ | X |
| OPTICAL DURABILITY | Δ | O | O | O | O | O | O | Δ | X | X |
| UNIFORMITY IN CHARACTERISTICS | X | Δ | O | O | O | O | O | Δ | X | X |
| ADHESION | X | Δ | O | O | O | O | O | Δ | X | X |
| DURABILITY | X | Δ | O | O | O | O | O | Δ | X | X |

O: EXCELLENT FOR PRACTICAL USE
Δ: GOOD FOR PRACTICAL USE
X: NO GOOD FOR SOME APPLICATIONS
*: CONCENTRATION OF SILICON COMPOUND GAS MIXED WITH $H_2$ GAS TO $H_2$ GAS

OTHER CONDITIONS

| | |
|---|---|
| FLOW RATE OF $H_2$ GAS CONTAINING SILICON COMPOUND GAS (sccm): | 1250 |
| SPECIES OF SILICON COMPOUND GAS: | $SiH_4$ |
| APPLIED POWER: | VHF |
| POWER DENSITY ($W/cm^3$): | 0.11 |
| PRESSURE (Torr): | 0.07 |
| SUBSTRATE TEMPERATURE (°C.) FIRST/SECOND/THIRD: | 280/280/200 |

TABLE E8

(1)

| | |
|---|---|
| $H_2$ GAS FLOW RATE (sccm) | 1200 |
| SPECIES OF SILICON COMPOUND GAS | $SiH_4$ |
| CONCENTRATION* (%) | 0.0003~0.14 |
| TYPE OF APPLIED POWER | MW |
| POWER (W/cm$^3$) | 0.12 |
| PRESSURE (Torr) | 0.007 |
| SUBSTRATE TEMPERATURE (°C.) FIRST/SECOND/THIRD | 230/230/200 |

*: (SILICON COMPOUND GAS FLOW RATE)/($H_2$ GAS FLOW RATE)

(2)

| SC-EMB-E8 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.8 | | | | 140 | 200 | | |
| n/i BUFFER LAYER | | 4 | | | 100 | | | |
| MW i-LAYER | 47 | | | 51 | 150 | | | |
| p/i BUFFER LAYER | | 3.5 | | | 100 | | | |
| RF p-LAYER | | | 0.1 | | 60 | | 12 | 2 |
| RF n-LAYER | 1.1 | | | | 50 | 270 | | |
| n/i BUFFER LAYER | | 4 | | | 80 | | | |
| MW i-LAYER | 35 | | | 36 | 140 | | | |
| p/i BUFFER LAYER | | 3 | | | 80 | | | |
| RF p-LAYER | | | 0.2 | | 60 | | 11 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 75 | | | |
| p/i BUFFER LAYER | | 0.4 | 0.25 | | 50 | | | |
| RF p-LAYER | | | 0.3 | | 60 | | 10 | 2 |

| SC-EMB-E8 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| CONCENTRATION (%)* | 0.0003 | 0.0008 | 0.001 | 0.005 | 0.01 | 0.08 | 0.1 | 0.105 | 0.12 | 0.14 |
|---|---|---|---|---|---|---|---|---|---|---|
| CURVE FACTOR | X | ○ | ○ | ○ | ○ | ○ | ○ | ○ | Δ | X |
| OPTICAL DURABILITY | X | ○ | ○ | ○ | ○ | ○ | ○ | Δ | X | X |
| UNIFORMITY IN CHARACTERISTICS | X | Δ | ○ | ○ | ○ | ○ | ○ | Δ | X | X |
| ADHESION | X | Δ | ○ | ○ | ○ | ○ | ○ | Δ | X | X |
| DURABILITY | X | X | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS
*: CONCENTRATION OF SILICON COMPOUND GAS MIXED WITH $H_2$ GAS TO $H_2$ GAS

OTHER CONDITIONS

| | |
|---|---|
| FLOW RATE OF $H_2$ GAS CONTAINING SILICON COMPOUND GAS (sccm): | 1200 |
| SPECIES OF SILICON COMPOUND GAS: | $SiH_4$ |
| APPLIED POWER: | MW |
| POWER DENSITY (W/cm$^3$): | 0.12 |
| PRESSURE (Torr): | 0.007 |
| SUBSTRATE TEMPERATURE (°C.) FIRST/SECOND/THIRD: | 230/230/200 |

TABLE E9

(1)

| | |
|---|---|
| $H_2$ GAS FLOW RATE (sccm) | 800 |
| SPECIES OF SILICON COMPOUND GAS | $Si_2H_6$ |
| CONCENTRATION* (%) | 0.05 |
| TYPE OF APPLIED POWER | RF |
| POWER (W/cm$^3$) | 0.5 |
| PRESSURE (Torr) | 0.01~100 |
| SUBSTRATE TEMPERATURE (°C.) FIRST/SECOND/THIRD | 230/230/200 |

*: (SILICON COMPOUND GAS FLOW RATE)/($H_2$ GAS FLOW RATE)

(2)

| SC-EMB-E9 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 130 | 210 | | |
| n/i BUFFER LAYER | | 5 | | | 100 | | | |
| MW i-LAYER | 50 | | | 51 | 140 | | | |
| p/i BUFFER LAYER | | 3.5 | | | 100 | | | |
| RF p-LAYER | | | 0.1 | | 60 | | 12 | 2 |
| RF n-LAYER | 1.1 | | | | 50 | 270 | | |
| n/i BUFFER LAYER | | 4 | | | 80 | | | |
| MW i-LAYER | 34 | | | 36 | 120 | | | |
| p/i BUFFER LAYER | | 0.5 | 0.3 | | 60 | | | |
| RF p-LAYER | | | 0.2 | | 60 | | 11 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 65 | | | |
| p/i BUFFER LAYER | | 0.4 | 0.25 | | 50 | | | |
| RF p-LAYER | | | 0.3 | | 60 | | 10 | 2 |

| SC-EMB-E8 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.8 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.8 | | 0.08 | 300 | 10 |
| MW i-LAYER | 0.006 | 0.25 | 0.5 | 330 | 100 |
| p/i BUFFER LAYER | 0.7 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.7 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| PRESSURE (TORR) | 0.01 | 0.03 | 0.05 | 1 | 3 | 5 | 10 | 11 | 20 | 100 |
|---|---|---|---|---|---|---|---|---|---|---|
| CURVE FACTOR | X | ○ | ○ | ○ | ○ | ○ | ○ | Δ | X | X |
| OPTICAL DURABILITY | X | Δ | ○ | ○ | ○ | ○ | ○ | ○ | Δ | X |
| UNIFORMITY IN CHARACTERISTICS | X | Δ | ○ | ○ | ○ | ○ | ○ | Δ | X | X |
| ADHESION | X | Δ | ○ | ○ | ○ | ○ | ○ | Δ | X | X |
| DURABILITY | X | X | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS

OTHER CONDITIONS

| | |
|---|---|
| FLOW RATE OF $H_2$ GAS CONTAINING SILICON COMPOUND GAS (sccm): | 800 |
| SPECIES OF SILICON COMPOUND GAS: | $Si_2H_6$ |
| CONCENTRATION OF SILICON COMPOUND GAS TO $H_2$ GAS (%): | 0.05 |
| APPLIED POWER: | RF |
| POWER DENSITY (W/cm$^3$): | 0.5 |
| SUBSTRATE TEMPERATURE (°C.) FIRST/SECOND/THIRD: | 280/280/200 |

TABLE E10

(1)

| | |
|---|---|
| $H_2$ GAS FLOW RATE (sccm) | 1250 |
| SPECIES OF SILICON COMPOUND GAS | $Si_2H_6$ |
| CONCENTRATION* (%) | 0.006 |
| TYPE OF APPLIED POWER | VHF |
| POWER ($W/cm^3$) | 0.017 |
| PRESSURE (mTorr) | 0.03~10000 |
| SUBSTRATE TEMPERATURE (°C.) FIRST/SECOND/THIRD | 280/280/200 |

*: (SILICON COMPOUND GAS FLOW RATE)/($H_2$ GAS FLOW RATE)

(2)

| SC-EMB-E10 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.7 | | | | 140 | 200 | | |
| n/i BUFFER LAYER | | 5 | | | 100 | | | |
| MW i-LAYER | 49 | | | 51 | 155 | | | |
| p/i BUFFER LAYER | | 3.5 | | | 100 | | | |
| RF p-LAYER | | | 0.1 | | 60 | | 11 | 2 |
| RF n-LAYER | 1.1 | | | | 50 | 270 | | |
| n/i BUFFER LAYER | | 4 | | | 80 | | | |
| MW i-LAYER | 34 | | | 36 | 130 | | | |
| p/i BUFFER LAYER | | 0.4 | 0.2 | | 60 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 85 | | | |
| p/i BUFFER LAYER | | 0.4 | 0.25 | | 50 | | | |
| RF p-LAYER | | | 0.3 | | 60 | | 10 | 2 |

| SC-EMB-E10 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| PRESSURE (mTorr) | 0.03 | 0.08 | 0.1 | 1 | 100 | 500 | 1000 | 1100 | 2000 | 10000 |
|---|---|---|---|---|---|---|---|---|---|---|
| CURVE FACTOR | X | Δ | ○ | ○ | ○ | ○ | ○ | ○ | Δ | X |
| OPTICAL DURABILITY | Δ | ○ | ○ | ○ | ○ | ○ | ○ | ○ | Δ | X |
| UNIFORMITY IN CHARACTERISTICS | X | Δ | ○ | ○ | ○ | ○ | ○ | Δ | X | X |
| ADHESION | X | ○ | ○ | ○ | ○ | ○ | ○ | Δ | X | X |
| DURABILITY | X | Δ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS

OTHER CONDITIONS

| | |
|---|---|
| FLOW RATE OF $H_2$ GAS CONTAINING SILICON COMPOUND GAS (sccm): | 1250 |
| SPECIES OF SILICON COMPOUND GAS: | $Si_2H_6$ |
| CONCENTRATION OF SILICON COMPOUND GAS TO $H_2$ GAS (%): | 0.006 |
| APPLIED POWER: | VHF |
| POWER DENSITY ($W/cm^3$): | 0.017 |
| SUBSTRATE TEMPERATURE (°C.) FIRST/SECOND/THIRD: | 280/280/200 |

TABLE E11

(1)

| | |
|---|---|
| $H_2$ GAS FLOW RATE (sccm) | 1200 |
| SPECIES OF SILICON COMPOUND GAS | $SiH_4$ |
| CONCENTRATION* (%) | 0.02 |
| TYPE OF APPLIED POWER | MW |
| POWER (W/cm$^3$) | 0.12 |
| PRESSURE (mTorr) | 0.03~100 |
| SUBSTRATE TEMPERATURE (°C.) FIRST/SECOND/THIRD | 220/220/200 |

*: (SILICON COMPOUND GAS FLOW RATE)/($H_2$ GAS FLOW RATE)

(2)

| SC-EMB-E11 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 130 | 200 | | |
| n/i BUFFER LAYER | | 4 | | | 100 | | | |
| MW i-LAYER | 49 | | | 50 | 130 | | | |
| p/i BUFFER LAYER | | 3.5 | | | 100 | | | |
| RF p-LAYER | | | 0.1 | | 60 | | 10 | 2 |
| RF n-LAYER | 1.1 | | | | 50 | 270 | | |
| n/i BUFFER LAYER | | 0.4 | 0.2 | | 80 | | | |
| MW i-LAYER | 34 | | | 36 | 130 | | | |
| p/i BUFFER LAYER | | 0.4 | 0.2 | | 60 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 80 | | | |
| p/i BUFFER LAYER | | 0.4 | 0.25 | | 50 | | | |
| RF p-LAYER | | | 0.3 | | 60 | | 10 | 2 |

| SC-EMB-E11 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.1 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| PRESSURE (mTorr) | 0.03 | 0.08 | 0.1 | 0.5 | 1 | 5 | 10 | 11 | 20 | 100 |
|---|---|---|---|---|---|---|---|---|---|---|
| CURVE FACTOR | X | Δ | ○ | ○ | ○ | ○ | ○ | ○ | Δ | X |
| OPTICAL DURABILITY | X | Δ | ○ | ○ | ○ | ○ | ○ | ○ | Δ | X |
| UNIFORMITY IN CHARACTERISTICS | X | ○ | ○ | ○ | ○ | ○ | ○ | Δ | X | X |
| ADHESION | X | Δ | ○ | ○ | ○ | ○ | ○ | ○ | X | X |
| DURABILITY | X | Δ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS

OTHER CONDITIONS

| | |
|---|---|
| FLOW RATE OF $H_2$ GAS CONTAINING SILICON COMPOUND GAS (sccm): | 1200 |
| SPECIES OF SILICON COMPOUND GAS: | $SiF_4$ |
| CONCENTRATION OF SILICON COMPOUND GAS TO $H_2$ GAS (%): | 0.02 |
| APPLIED POWER: | MW |
| POWER DENSITY (W/cm$^3$): | 0.012 |
| SUBSTRATE TEMPERATURE (°C.) FIRST/SECOND/THIRD: | 220/220/200 |

TABLE E12

(1)

| | |
|---|---|
| $H_2$ GAS FLOW RATE (sccm) | 600 |
| SPECIES OF SILICON COMPOUND GAS | $SiH_4$ |
| CONCENTRATION* (%) | 0.03 |
| TYPE OF APPLIED POWER | RF |
| POWER (W/cm$^3$) | 0.003~10 |
| PRESSURE (Torr) | 0.65 |
| SUBSTRATE TEMPERATURE (°C.) FIRST/SECOND/THIRD | 260/260/200 |

*: (SILICON COMPOUND GAS FLOW RATE)/($H_2$ GAS FLOW RATE)

(2)

| SC-EMB-E12 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.7 | | | | 130 | 200 | | |
| n/i BUFFER LAYER | | 4 | | | 130 | | | |
| MW i-LAYER | 46 | | | 49 | 120 | | | |
| p/i BUFFER LAYER | | 3.5 | | | 120 | | | |
| RF p-LAYER | | | 0.1 | | 60 | | 10 | 2 |
| RF n-LAYER | 1.1 | | | | 50 | 270 | | |
| n/i BUFFER LAYER | | 0.4 | 0.2 | | 80 | | | |
| MW i-LAYER | 33 | | | 36 | 130 | | | |
| p/i BUFFER LAYER | | 0.4 | 0.2 | | 60 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 85 | | | |
| p/i BUFFER LAYER | | 0.4 | 0.25 | | 50 | | | |
| RF p-LAYER | | | 0.3 | | 60 | | 10 | 2 |

| SC-EMB-E12 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.8 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| POWER DENSITY (W/cm$^3$) | 0.003 | 0.007 | 0.01 | 0.05 | 0.1 | 0.7 | 1.0 | 1.1 | 3.0 | 100 |
|---|---|---|---|---|---|---|---|---|---|---|
| CURVE FACTOR | X | Δ | ○ | ○ | ○ | ○ | ○ | ○ | Δ | X |
| OPTICAL DURABILITY | Δ | ○ | ○ | ○ | ○ | ○ | ○ | ○ | Δ | X |
| UNIFORMITY IN CHARACTERISTICS | X | ○ | ○ | ○ | ○ | ○ | ○ | ○ | X | X |
| ADHESION | X | Δ | ○ | ○ | ○ | ○ | ○ | Δ | X | X |
| DURABILITY | X | Δ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS

OTHER CONDITIONS

| | |
|---|---|
| FLOW RATE OF $H_2$ GAS CONTAINING SILICON COMPOUND GAS (sccm): | 600 |
| SPECIES OF SILICON COMPOUND GAS: | $SiH_4$ |
| CONCENTRATION OF SILICON COMPOUND GAS TO $H_2$ GAS (%): | 0.03 |
| APPLIED POWER: | RF |
| PRESSURE (Torr): | 0.657 |
| SUBSTRATE TEMPERATURE (°C.): | 260/260/200 |

TABLE E13

(1)

| | |
|---|---|
| $H_2$ GAS FLOW RATE (sccm) | 1300 |
| SPECIES OF SILICON COMPOUND GAS | $Si_2H_6$ |
| CONCENTRATION* (%) | 0.004 |
| TYPE OF APPLIED POWER | VHF |
| POWER (W/cm$^3$) | 0.003~10 |
| PRESSURE (Torr) | 0.0065 |
| SUBSTRATE TEMPERATURE (°C.) FIRST/SECOND/THIRD | 150/150/150 |

*: (SILICON COMPOUND GAS FLOW RATE)/($H_2$ GAS FLOW RATE)

(2)

| SC-EMB-E13 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.7 | | | | 130 | 200 | | |
| n/i BUFFER LAYER | | 4 | | | 130 | | | |
| MW i-LAYER | 45 | | | 46 | 150 | | | |
| p/i BUFFER LAYER | | 3.5 | | | 120 | | | |
| RF p-LAYER | | | 0.1 | | 60 | | 10 | 2 |
| RF n-LAYER | 1.0 | | | | 30 | 270 | | |
| n/i BUFFER LAYER | | 0.4 | 0.2 | | 80 | | | |
| MW i-LAYER | 33 | | | 29 | 120 | | | |
| p/i BUFFER LAYER | | 0.4 | 0.2 | | 60 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.2 | | | 90 | | | |
| p/i BUFFER LAYER | | 0.4 | 0.25 | | 50 | | | |
| RF p-LAYER | | | 0.3 | | 60 | | 10 | 2 |

| SC-EMB-E13 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| POWER DENSITY (W/cm$^3$) | 0.003 | 0.007 | 0.01 | 0.05 | 0.1 | 0.7 | 1.0 | 1.1 | 3.0 | 100 |
|---|---|---|---|---|---|---|---|---|---|---|
| CURVE FACTOR | X | Δ | ○ | ○ | ○ | ○ | ○ | ○ | Δ | X |
| OPTICAL DURABILITY | X | ○ | ○ | ○ | ○ | ○ | ○ | ○ | Δ | X |
| UNIFORMITY IN CHARACTERISTICS | X | ○ | ○ | ○ | ○ | ○ | ○ | ○ | Δ | X |
| ADHESION | X | Δ | ○ | ○ | ○ | ○ | ○ | Δ | X | X |
| DURABILITY | X | Δ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS

OTHER CONDITIONS

| | |
|---|---|
| FLOW RATE OF $H_2$ GAS CONTAINING SILICON COMPOUND GAS (sccm): | 1300 |
| SPECIES OF SILICON COMPOUND GAS: | $Si_2H_6$ |
| CONCENTRATION OF SILICON COMPOUND GAS TO $H_2$ GAS (%): | 0.03 |
| APPLIED POWER: | VHF |
| PRESSURE (Torr): | 0.0065 |
| SUBSTRATE TEMPERATURE (°C.) FIRST/SECOND/THIRD: | 150/150/150 |

TABLE E14

(1)

| | |
|---|---|
| $H_2$ GAS FLOW RATE (sccm) | 1850 |
| SPECIES OF SILICON COMPOUND GAS | $SiCl_2H_2$ |
| CONCENTRATION* (%) | 0.004 |
| TYPE OF APPLIED POWER | MW |
| POWER ($W/cm^3$) | 0.03~100 |
| PRESSURE (Torr) | 0.006 |
| SUBSTRATE TEMPERATURE (°C.) FIRST/SECOND/THIRD | 140/140/140 |

*: (SILICON COMPOUND GAS FLOW RATE)/($H_2$ GAS FLOW RATE)

(2)

| SC-EMB-E14 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.7 | | | | 140 | 200 | | |
| n/i BUFFER LAYER | | 4 | | | 120 | | | |
| MW i-LAYER | 45 | | | 46 | 145 | | | |
| p/i BUFFER LAYER | | 0.35 | 0.2 | | 120 | | | |
| RF p-LAYER | | | 0.1 | | 60 | | 10 | 2 |
| RF n-LAYER | 1.0 | | | | 30 | 270 | | |
| n/i BUFFER LAYER | | 0.4 | 0.2 | | 80 | | | |
| MW i-LAYER | 33 | | | 30 | 130 | | | |
| p/i BUFFER LAYER | | 0.4 | 0.2 | | 70 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.2 | | | 95 | | | |
| p/i BUFFER LAYER | | 0.4 | 0.25 | | 60 | | | |
| RF p-LAYER | | | 0.3 | | 60 | | 10 | 2 |

| SC-EMB-E14 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| POWER DENSITY ($W/cm^3$) | 0.03 | 0.07 | 0.1 | 0.5 | 1 | 7 | 10 | 11 | 30 | 100 |
|---|---|---|---|---|---|---|---|---|---|---|
| CURVE FACTOR | X | Δ | ○ | ○ | ○ | ○ | ○ | Δ | X | X |
| OPTICAL DURABILITY | X | ○ | ○ | ○ | ○ | ○ | ○ | ○ | X | X |
| UNIFORMITY IN CHARACTERISTICS | X | Δ | ○ | ○ | ○ | ○ | ○ | ○ | X | X |
| ADHESION | X | Δ | ○ | ○ | ○ | ○ | ○ | ○ | X | X |
| DURABILITY | X | Δ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS

OTHER CONDITIONS

| | |
|---|---|
| FLOW RATE OF $H_2$ GAS CONTAINING SILICON COMPOUND GAS (sccm): | 1850 |
| SPECIES OF SILICON COMPOUND GAS: | $Si_2Cl_2H_2$ |
| CONCENTRATION OF SILICON COMPOUND GAS TO $H_2$ GAS (%): | 0.04 |
| APPLIED POWER: | MW |
| PRESSURE (Torr): | 0.006 |
| SUBSTRATE TEMPERATURE (°C.): | 140/140/140 |

TABLE E15

(1)

| | |
|---|---|
| $H_2$ GAS FLOW RATE (sccm) | 1850 |
| SPECIES OF SILICON COMPOUND GAS | $SiH_4$ |
| CONCENTRATION* (%) | 0.07 |
| TYPE OF APPLIED POWER | RF |
| POWER (W/cm$^3$) | 0.23 |
| PRESSURE (Torr) | 1.1 |
| SUBSTRATE TEMPERATURE (°C.) | 50~520 |

*: (SILICON COMPOUND GAS FLOW RATE)/($H_2$ GAS FLOW RATE)

(2)

| SC-EMB-E15 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.7 | | | | 130 | 200 | | |
| n/i BUFFER LAYER | | 0.4 | 0.1 | | 120 | | | |
| MW i-LAYER | 45 | | | 47 | 130 | | | |
| p/i BUFFER LAYER | | 0.35 | 0.2 | | 120 | | | |
| RF p-LAYER | | | 0.1 | | 60 | | 10 | 2 |
| RF n-LAYER | 1.0 | | | | 30 | 270 | | |
| n/i BUFFER LAYER | | 0.4 | 0.2 | | 80 | | | |
| MW i-LAYER | 35 | | | 28 | 120 | | | |
| p/i BUFFER LAYER | | 0.4 | 0.2 | | 70 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.2 | | | 85 | | | |
| p/i BUFFER LAYER | | 0.4 | 0.25 | | 60 | | | |
| RF p-LAYER | | | 0.4 | | 60 | | 10 | 2 |

| SC-EMB-E15 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.1 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.7 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| SUBSTRATE TEMPERATURE (°C.) | 50 | 75 | 100 | 150 | 200 | 300 | 400 | 420 | 450 | 520 |
|---|---|---|---|---|---|---|---|---|---|---|
| CURVE FACTOR | X | ○ | ○ | ○ | ○ | ○ | ○ | X | X | X |
| OPTICAL DURABILITY | X | Δ | ○ | ○ | ○ | ○ | ○ | ○ | X | X |
| UNIFORMITY IN CHARACTERISTICS | X | Δ | ○ | ○ | ○ | ○ | ○ | Δ | X | X |
| ADHESION | X | Δ | ○ | ○ | ○ | ○ | ○ | Δ | X | X |
| DURABILITY | X | Δ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS

OTHER CONDITIONS

| | |
|---|---|
| FLOW RATE OF $H_2$ GAS CONTAINING SILICON COMPOUND GAS (sccm): | 850 |
| SPECIES OF SILICON COMPOUND GAS: | $SiH_4$ |
| CONCENTRATION OF SILICON COMPOUND GAS TO $H_2$ GAS (%): | 0.07 |
| APPLIED POWER: | RF |
| POWER DENSITY (W/cm$^3$): | 0.23 |
| PRESSURE (Torr): | 1.1 |

TABLE E16

(1)

| | |
|---|---|
| $H_2$ GAS FLOW RATE (sccm) | 1600 |
| SPECIES OF SILICON COMPOUND GAS | $SiCl_4$ |
| CONCENTRATION* (%) | 0.02 |
| TYPE OF APPLIED POWER | VHF |
| POWER (W/cm³) | 0.22 |
| PRESSURE (Torr) | 0.06 |
| SUBSTRATE TEMPERATURE (°C.) | 30~420 |

*: (SILICON COMPOUND GAS FLOW RATE)/($H_2$ GAS FLOW RATE)

(2)

| SC-EMB-E16 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 110 | 200 | | |
| n/i BUFFER LAYER | | 0.4 | 0.1 | | 110 | | | |
| MW i-LAYER | 44 | | | 43 | 130 | | | |
| p/i BUFFER LAYER | | 0.35 | 0.2 | | 120 | | | |
| RF p-LAYER | | | 0.1 | | 60 | | 10 | 2 |
| RF n-LAYER | 1.0 | | | | 30 | 270 | | |
| n/i BUFFER LAYER | | 0.4 | 0.2 | | 80 | | | |
| MW i-LAYER | 35 | | | 27 | 130 | | | |
| p/i BUFFER LAYER | | 0.4 | 0.2 | | 70 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.1 | | | 95 | | | |
| p/i BUFFER LAYER | | 0.4 | 0.25 | | 60 | | | |
| RF p-LAYER | | | 0.4 | | 60 | | 10 | 2 |

| SC-EMB-E16 | PRESSURE Torr | MW POWER W/cm³ | RF POWER W/cm³ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.24 | 0.5 | 330 | 100 |
| p/i BUFFER LAYER | 0.8 | | 0.08 | 280 | 20 |
| RF p-LAYER | 1.6 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| SUBSTRATE TEMPERATURE (°C.) | 30 | 40 | 50 | 100 | 200 | 250 | 300 | 320 | 350 | 420 |
|---|---|---|---|---|---|---|---|---|---|---|
| CURVE FACTOR | X | ○ | ○ | ○ | ○ | ○ | ○ | Δ | X | X |
| OPTICAL DURABILITY | X | Δ | ○ | ○ | ○ | ○ | ○ | ○ | X | X |
| UNIFORMITY IN CHARACTERISTICS | X | Δ | ○ | ○ | ○ | ○ | ○ | ○ | X | X |
| ADHESION | X | Δ | ○ | ○ | ○ | ○ | ○ | Δ | X | X |
| DURABILITY | X | X | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS
OTHER CONDITIONS

| | |
|---|---|
| FLOW RATE OF $H_2$ GAS CONTAINING SILICON COMPOUND GAS (sccm): | 1600 |
| SPECIES OF SILICON COMPOUND GAS: | $SiCl_4$ |
| CONCENTRATION OF SILICON COMPOUND GAS TO $H_2$ GAS (%): | 0.02 |
| APPLIED POWER: | VHF |
| POWER DENSITY (W/cm³): | 0.22 |
| PRESSURE (Torr): | 0.06 |

TABLE E17

(1)

| | |
|---|---|
| $H_2$ GAS FLOW RATE (sccm) | 1800 |
| SPECIES OF SILICON COMPOUND GAS | $SiCl_2H_2$ |
| CONCENTRATION* (%) | 0.01 |
| TYPE OF APPLIED POWER | MW |
| POWER (W/cm$^3$) | 0.5 |
| PRESSURE (Torr) | 0.005 |
| SUBSTRATE TEMPERATURE (°C.) | 30~420 |

*: (SILICON COMPOUND GAS FLOW RATE)/($H_2$ GAS FLOW RATE)

(2)

| SC-EMB-E17 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 120 | 200 | | |
| n/i BUFFER LAYER | | 0.4 | 0.2 | | 110 | | | |
| MW i-LAYER | 42 | | | 43 | 135 | | | |
| p/i BUFFER LAYER | | 0.35 | 0.2 | | 120 | | | |
| RF p-LAYER | | | 0.1 | | 60 | | 10 | 1.7 |
| RF n-LAYER | 1.0 | | | | 30 | 270 | | |
| n/i BUFFER LAYER | | 0.4 | 0.2 | | 80 | | | |
| MW i-LAYER | 33 | | | 27 | 145 | | | |
| p/i BUFFER LAYER | | 0.4 | 0.2 | | 70 | | | |
| RF p-LAYER | | | 0.2 | | 60 | | 10 | 1.8 |
| RF n-LAYER | 0.8 | | | | 50 | 250 | | |
| n/i BUFFER LAYER | | 0.3 | 0.2 | | 50 | | | |
| RF i-LAYER | | 2.1 | | | 65 | | | |
| p/i BUFFER LAYER | | 0.4 | 0.25 | | 60 | | | |
| RF p-LAYER | | | 0.04 | | 60 | | 10 | 1.8 |

| SC-EMB-E17 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.8 | | 0.08 | 350 | 10 |
| MW i-LAYER | 0.005 | 0.35 | 0.5 | 370 | 110 |
| p/i BUFFER LAYER | 0.8 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.24 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| SUBSTRATE TEMPERATURE (°C.) | 30 | 40 | 50 | 100 | 200 | 250 | 300 | 320 | 350 | 420 |
|---|---|---|---|---|---|---|---|---|---|---|
| CURVE FACTOR | X | Δ | ○ | ○ | ○ | ○ | ○ | Δ | X | X |
| OPTICAL DURABILITY | X | Δ | ○ | ○ | ○ | ○ | ○ | ○ | Δ | X |
| UNIFORMITY IN CHARACTERISTICS | X | Δ | ○ | ○ | ○ | ○ | ○ | Δ | X | X |
| ADHESION | X | Δ | ○ | ○ | ○ | ○ | ○ | ○ | Δ | X |
| DURABILITY | X | Δ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS

OTHER CONDITIONS

| | |
|---|---|
| FLOW RATE OF $H_2$ GAS CONTAINING SILICON COMPOUND GAS (sccm): | 1800 |
| SPECIES OF SILICON COMPOUND GAS: | $SiCl_2H_2$ |
| CONCENTRATION OF SILICON COMPOUND GAS TO $H_2$ GAS (%): | 0.01 |
| APPLIED POWER: | MW |
| POWER DENSITY (W/cm$^3$): | 0.5 |
| PRESSURE (Torr): | 0.005 |

TABLE E18

(1)

| | |
|---|---|
| $H_2$ GAS FLOW RATE (sccm) | 900 |
| SPECIES OF SILICON COMPOUND GAS | $SiH_4/H_2$ |
| CONCENTRATION* (%) | 0.04 |
| TYPE OF APPLIED POWER | RF |
| POWER (W/cm$^3$) | 0.03 |
| PRESSURE (Torr) | 0.9 |
| SUBSTRATE TEMPERATURE (°C.) | 360 |

*: ($SiH_4$ GAS FLOW RATE)/(TOTAL $H_2$ GAS FLOW RATE)

(2)

| | |
|---|---|
| $H_2$ GAS FLOW RATE (sccm) | 800 |
| SPECIES OF SILICON COMPOUND GAS | $SiH_4/H_2$ |
| CONCENTRATION* (%) | 0.03 |
| TYPE OF APPLIED POWER | RF |
| POWER (W/cm$^3$) | 0.02 |
| PRESSURE (Torr) | 0.9 |
| SUBSTRATE TEMPERATURE (°C.) | 350 |

*: ($SiH_4$ GAS FLOW RATE)/(TOTAL $H_2$ GAS FLOW RATE)

(3)

| | |
|---|---|
| $H_2$ GAS FLOW RATE (sccm) | 950 |
| SPECIES OF SILICON COMPOUND GAS | $SiH_4$ |
| CONCENTRATION* (%) | 0.003 |
| TYPE OF APPLIED POWER | RF |
| POWER (W/cm$^3$) | 0.02 |
| PRESSURE (Torr) | 0.7 |
| SUBSTRATE TEMPERATURE (°C.) | 350 |

*: (SILICON COMPOUND GAS FLOW RATE)/($H_2$ GAS FLOW RATE)

(4)

| | |
|---|---|
| $H_2$ GAS FLOW RATE (sccm) | 900 |
| SPECIES OF SILICON COMPOUND GAS | $SiH_4$ |
| CONCENTRATION* (%) | 0.003 |
| TYPE OF APPLIED POWER | RF |
| POWER (W/cm$^3$) | 0.02 |
| PRESSURE (Torr) | 0.7 |
| SUBSTRATE TEMPERATURE (°C.) | 330 |

*: (SILICON COMPOUND GAS FLOW RATE)/($H_2$ GAS FLOW RATE)

(5)

| | |
|---|---|
| $H_2$ GAS FLOW RATE (sccm) | 1100 |
| SPECIES OF SILICON COMPOUND GAS | $SiH_4/H_2$ |
| CONCENTRATION* (%) | 0.04 |
| TYPE OF APPLIED POWER | RF |
| POWER (W/cm$^3$) | 0.03 |
| PRESSURE (Torr) | 0.6 |
| SUBSTRATE TEMPERATURE (°C.) | 300 |

*: ($SiH_4$ GAS FLOW RATE)/TOTAL ($H_2$ GAS FLOW RATE)

(6)

| | |
|---|---|
| $H_2$ GAS FLOW RATE (sccm) | 900 |
| SPECIES OF SILICON COMPOUND GAS | $SiH_4$ |
| CONCENTRATION* (%) | 0.003 |
| TYPE OF APPLIED POWER | RF |
| POWER (W/cm$^3$) | 0.02 |
| PRESSURE (Torr) | 0.8 |
| SUBSTRATE TEMPERATURE (°C.) | 300 |

*: (SILICON GAS FLOW RATE)/($H_2$ GAS FLOW RATE)

(7)

| | |
|---|---|
| $H_2$ GAS FLOW RATE (sccm) | 950 |
| SPECIES OF SILICON COMPOUND GAS | $SiH_4$ |
| CONCENTRATION* (%) | 0.004 |
| TYPE OF APPLIED POWER | RF |
| POWER (W/cm$^3$) | 0.03 |
| PRESSURE (Torr) | 0.7 |
| SUBSTRATE TEMPERATURE (°C.) | 330 |

*: (SILICON GAS FLOW RATE)/($H_2$ GAS FLOW RATE)

TABLE E18-continued (8)

| | |
|---|---|
| $H_2$ GAS FLOW RATE (sccm) | 650 |
| SPECIES OF SILICON COMPOUND GAS | $SiH_4/H_2$ |
| CONCENTRATION* (%) | 0.03 |
| TYPE OF APPLIED POWER | RF |
| POWER ($W/cm^3$) | 0.03 |
| PRESSURE (Torr) | 0.9 |
| SUBSTRATE TEMPERATURE (°C.) | 230 |

*: ($SiH_4$ GAS FLOW RATE)/(TOTAL $H_2$ GAS FLOW RATE)

(9)

| | |
|---|---|
| $H_2$ GAS FLOW RATE (sccm) | 900 |
| SPECIES OF SILICON COMPOUND GAS | $SiH_4$ |
| CONCENTRATION* (%) | 0.003 |
| TYPE OF APPLIED POWER | RF |
| POWER ($W/cm^3$) | 0.02 |
| PRESSURE (Torr) | 0.7 |
| SUBSTRATE TEMPERATURE (°C.) | 230 |

*: (SILICON COMPOUND GAS FLOW RATE)/($H_2$ GAS FLOW RATE)

(10)

| | |
|---|---|
| $H_2$ GAS FLOW RATE (sccm) | 850 |
| SPECIES OF SILICON COMPOUND GAS | $SiH_4$ |
| CONCENTRATION* (%) | 0.003 |
| TYPE OF APPLIED POWER | RF |
| POWER ($W/cm^3$) | 0.02 |
| PRESSURE (Torr) | 0.8 |
| SUBSTRATE TEMPERATURE (°C.) | 200 |

*: (SILICON COMPOUND GAS FLOW RATE)/($H_2$ GAS FLOW RATE)

(11)

| SC-EMB-E18 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.7 | | | | 140 | 200 | | |
| n/i BUFFER LAYER | | 0.4 | 0.2 | | 110 | | | |
| MW i-LAYER | 43 | | | 44 | 130 | | | |
| p/i BUFFER LAYER | | 0.4 | 0.2 | | 120 | | | |
| RF p-LAYER | | | 0.1 | | 60 | | 10 | 1.7 |
| RF n-LAYER | 0.9 | | | | 20 | 280 | | |
| n/i BUFFER LAYER | | 0.4 | 0.2 | | 80 | | | |
| MW i-LAYER | 33 | | | 27 | 140 | | | |
| p/i BUFFER LAYER | | 0.4 | 0.2 | | 70 | | | |
| RF p-LAYER | | | 0.2 | | 60 | | 10 | 1.8 |
| RF n-LAYER | 0.8 | | | | 50 | 250 | | |
| n/i BUFFER LAYER | | 0.4 | 0.2 | | 50 | | | |
| RF i-LAYER | | 2.1 | | | 85 | | | |
| p/i BUFFER LAYER | | 0.4 | 0.25 | | 60 | | | |
| RF p-LAYER | | | 0.04 | | 60 | | 10 | 1.8 |

| SC-EMB-E18 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 12 |
| RF p-LAYER | 1.6 | | 0.07 | 170 | 10 |

TABLE F1

(1)

| | |
|---|---|
| $H_2$ GAS FLOW RATE (sccm) | 1200 |
| SPECIES OF SILICON COMPOUND GAS | $SiH_4$ |
| CONCENTRATION* (%) | 0.01 |
| TYPE OF APPLIED POWER | RF |
| POWER ($W/cm^3$) | 0.05 |
| PRESSURE (Torr) | 0.8 |
| SUBSTRATE TEMPERATURE (°C.) | 200 |

*: (SILICON COMPOUND GAS FLOW RATE)/($H_2$ GAS FLOW RATE)

(2)

| SC-EMB-F1 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 110 | 200 | | |
| n/i BUFFER LAYER | | 3.5 | | | 100 | | | |
| MW i-LAYER | 38 | | | 37 | 160 | | | |
| p/i BUFFER LAYER | | 3 | | | 80 | | | |
| RF p-LAYER | | | 0.3 | | 90 | | 10 | 1 |

| SC-EMB-F1 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.15 | | 0.05 | 370 | 20 |
| n/i BUFFER LAYER | 0.8 | | 0.06 | 360 | 10 |
| MW i-LAYER | 0.005 | 0.25 | 0.7 | 370 | 150 |
| p/i BUFFER LAYER | 0.8 | | 0.07 | 230 | 20 |
| RF p-LAYER | 1.3 | | 0.09 | 200 | 10 |

TABLE F2

(1)

| | |
|---|---|
| $H_2$ GAS FLOW RATE (sccm) | 1000 |
| SPECIES OF SILICON COMPOUND GAS | $Si_2H_6$ |
| CONCENTRATION* (%) | 0.05 |
| TYPE OF APPLIED POWER | VHF |
| POWER ($W/cm^3$) | 0.08 |
| PRESSURE (Torr) | 0.012 |
| SUBSTRATE TEMPERATURE (°C.) | 250 |

*: (SILICON COMPOUND GAS FLOW RATE)/($H_2$ GAS FLOW RATE)

(2)

| | |
|---|---|
| $H_2$ GAS FLOW RATE (sccm) | 1300 |
| SPECIES OF SILICON COMPOUND GAS | $SiH_4$ |
| CONCENTRATION* (%) | 0.03 |
| TYPE OF APPLIED POWER | RF |
| POWER ($W/cm^3$) | 0.02 |
| PRESSURE (Torr) | 0.6 |
| SUBSTRATE TEMPERATURE (°C.) | 200 |

*: (SILICON COMPOUND GAS FLOW RATE)/($H_2$ GAS FLOW RATE)

(3)

| SC-EMB-F2 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 90 | 200 | | |
| n/i BUFFER LAYER | | 2.5 | | | 85 | | | |
| MW i-LAYER | 45 | | | 40 | 175 | | | |
| p/i BUFFER LAYER | | 3 | | | 80 | | | |
| RF p-LAYER | | | 0.3 | | 60 | | 10 | 2 |
| RF n-LAYER | 2 | | | | 75 | 250 | | |
| n/i BUFFER LAYER | | 0.4 | 0.2 | | 85 | | | |
| RF i-LAYER | | 3 | | | 75 | | | |
| p/i BUFFER LAYER | | 0.4 | 0.3 | | 65 | | | |
| RF p-LAYER | | | 0.3 | | 70 | | 10 | 2 |

TABLE F2-continued

| SC-EMB-F2 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.1 | | 0.05 | 380 | 20 |
| n/i BUFFER LAYER | 0.8 | | 0.08 | 360 | 10 |
| MW i-LAYER | 0.005 | 0.25 | 0.60 | 380 | 150 |
| p/i BUFFER LAYER | 0.7 | | 0.07 | 250 | 20 |
| RF p-LAYER | 1.7 | | 0.07 | 250 | 10 |
| RF n-LAYER | 1.1 | | 0.04 | 250 | 10 |
| n/i BUFFER LAYER | 1.1 | | 0.06 | 250 | 10 |
| RF i-LAYER | 0.5 | | 0.07 | 200 | 110 |
| p/i BUFFER LAYER | 1.1 | | 0.06 | 200 | 15 |
| RF p-LAYER | 1.7 | | 0.07 | 170 | 10 |

TABLE F3

(1)

| | |
|---|---|
| $H_2$ GAS FLOW RATE (sccm) | 950 |
| SPECIES OF SILICON COMPOUND GAS | $SiCl_2H_2/He$ |
| CONCENTRATION* (%) | 0.03 |
| TYPE OF APPLIED POWER | MW |
| POWER (W/cm$^3$) | 0.12 |
| PRESSURE (Torr) | 0.008 |
| SUBSTRATE TEMPERATURE (°C.) | 330 |

*: ($SiCl_2H_2$ GAS FLOW RATE)/(TOTAL $H_2$ GAS FLOW RATE)

(2)

| | |
|---|---|
| $H_2$ GAS FLOW RATE (sccm) | 1200 |
| SPECIES OF SILICON COMPOUND GAS | $SiH_4/H_2$ |
| CONCENTRATION* (%) | 0.03 |
| TYPE OF APPLIED POWER | RF |
| POWER (W/cm$^3$) | 0.03 |
| PRESSURE (Torr) | 0.7 |
| SUBSTRATE TEMPERATURE (°C.) | 280 |

*: ($SiH_4$ GAS FLOW RATE)/(TOTAL $H_2$ GAS FLOW RATE)

(3)

| | |
|---|---|
| $H_2$ GAS FLOW RATE (sccm) | 900 |
| SPECIES OF SILICON COMPOUND GAS | $SiH_4/H_2$ |
| CONCENTRATION* (%) | 0.03 |
| TYPE OF APPLIED POWER | RF |
| POWER (W/cm$^3$) | 0.03 |
| PRESSURE (Torr) | 0.6 |
| SUBSTRATE TEMPERATURE (°C.) | 280 |

*: ($SiH_4$ GAS FLOW RATE)/(TOTAL $H_2$ GAS FLOW RATE)

(2)

| SC-EMB-F3 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 155 | 200 | | |
| n/i BUFFER LAYER | | 4 | | | 125 | | | |
| MW i-LAYER | 49 | | | 51 | 145 | | | |
| p/i BUFFER LAYER | | 4 | | | 110 | | | |
| RF p-LAYER | | | 0.1 | | 70 | | 10 | 2 |
| RF n-LAYER | 1.1 | | | | 50 | 250 | | |
| n/i BUFFER LAYER | | 4 | | | 80 | | | |
| MW i-LAYER | 41 | | | 37 | 145 | | | |
| p/i BUFFER LAYER | | 3 | | | 80 | | | |
| RF p-LAYER | | | 0.2 | | 60 | | 10 | 2 |
| RF n-LAYER | 0.8 | | | | 50 | 250 | | |
| n/i BUFFER LAYER | | 0.4 | 0.2 | | 55 | | | |
| RF i-LAYER | | 2 | | | 75 | | | |
| p/i BUFFER LAYER | | 0.4 | 0.25 | | 55 | | | |
| RF p-LAYER | | | 0.3 | | 60 | | 10 | 2 |

TABLE F3-continued

| SC-EMB-F3 | PRESSURE Torr | MW POWER W/cm$^3$ | RF POWER W/cm$^3$ | SUBSTRATE TEMPERATURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.3 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.25 | | 0.06 | 200 | 12 |
| RF p-LAYER | 1.6 | | 0.07 | 170 | 10 |

TABLE F4

(1)

| | |
|---|---|
| $H_2$ GAS FLOW RATE (sccm) | 0.1~2500 |
| SPECIES OF SILICON COMPOUND GAS | $SiH_4$ |
| CONCENTRATION* (%) | 0.03 |
| TYPE OF APPLIED POWER | RF |
| POWER (W/cm$^3$) | 0.3 |
| PRESSURE (Torr) | 0.7 |
| SUBSTRATE TEMPERATURE (°C.) FIRST/SECOND/THIRD | 260/260/200 |

*: (SILICON COMPOUND GAS FLOW RATE)/($H_2$ GAS FLOW RATE)

(2)

| SC-EMB-F4 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 100 | 200 | | |
| n/i BUFFER LAYER | | 4 | | | 100 | | | |
| MW i-LAYER | 50 | | | 48 | 145 | | | |
| p/i BUFFER LAYER | | 4 | | | 100 | | | |
| RF p-LAYER | | | 0.1 | | 60 | | 10 | 2 |
| RF n-LAYER | 1.1 | | | | 50 | 250 | | |
| n/i BUFFER LAYER | | 4 | | | 70 | | | |
| MW i-LAYER | 40 | | | 34 | 150 | | | |
| p/i BUFFER LAYER | | 3 | | | 80 | | | |
| RF p-LAYER | | | 0.2 | | 60 | | 10 | 2 |
| RF n-LAYER | 0.8 | | | | 50 | 250 | | |
| n/i BUFFER LAYER | | 0.4 | 0.2 | | 50 | | | |
| RF i-LAYER | | 2 | | | 70 | | | |
| p/i BUFFER LAYER | | 0.4 | 0.25 | | 50 | | | |
| RF p-LAYER | | | 0.3 | | 60 | | 10 | 2 |

| SC-EMB-F4 | PRESSURE Torr | MW POWER W/cm$^3$ | RF POWER W/cm$^3$ | SUBSTRATE TEMPERATURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.3 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

TABLE F4-continued

| $H_2$ GAS FLOW RATE* (sccm) | 0.1 | 0.5 | 0.8 | 1 | 10 | 100 | 1000 | 2000 | 2030 | 2100 | 2500 |
|---|---|---|---|---|---|---|---|---|---|---|---|
| CURVE FACTOR | X | Δ | ○ | ○ | ○ | ○ | ○ | ○ | ○ | Δ | X |
| OPTICAL DURABILITY | X | Δ | ○ | ○ | ○ | ○ | ○ | ○ | Δ | X | X |
| UNIFORMITY CHARACTERISTICS | X | Δ | ○ | ○ | ○ | ○ | ○ | ○ | Δ | X | X |
| ADHESION | X | X | Δ | ○ | ○ | ○ | ○ | ○ | ○ | Δ | X |
| DURABILITY | X | Δ | Δ | ○ | ○ | ○ | ○ | ○ | Δ | X | X |
| CHARACTERISTICS WITH REVERSE BIAS VOLTAGE APPLIED | X | Δ | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
*: CONTAINING SILICON COMPOUND GAS

OTHER CONDITIONS

| | |
|---|---|
| SPECIES OF SILICON COMPOUND GAS: | $SiH_4$ |
| CONCENTRATION OF SILICON COMPOUND GAS %: | 0.03 |
| APPLIED POWER: | RF |
| POWER DENSITY (W/cm³): | 0.3 |
| PRESSURE (Torr): | 0.7 |
| SUBSTRATE TEMPERATURE (°C.) FIRST/SECOND/THIRD: | 280/260/200 |

TABLE F5

(1)

| | |
|---|---|
| $H_2$ GAS FLOW RATE (sccm) | 0.1~2500 |
| SPECIES OF SILICON COMPOUND GAS | $SiH_4$ |
| CONCENTRATION* (%) | 0.04 |
| TYPE OF APPLIED POWER | VHF |
| POWER (W/cm³) | 0.2 |
| PRESSURE (Torr) | 0.003 |
| SUBSTRATE TEMPERATURE (°C.) FIRST/SECOND/THIRD | 280/280/200 |

*: (SILICON COMPOUND GAS FLOW RATE)/($H_2$ GAS FLOW RATE)

(2)

| SC-EMB-F5 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 120 | 200 | | |
| n/i BUFFER LAYER | | 4 | | | 100 | | | |
| MW i-LAYER | 48 | | | 48 | 165 | | | |
| p/i BUFFER LAYER | | 3.5 | | | 100 | | | |
| RF p-LAYER | | | 0.1 | | 60 | | 10 | 2 |
| RF n-LAYER | 1.2 | | | | 50 | 260 | | |
| n/i BUFFER LAYER | | 4 | | | 80 | | | |
| MW i-LAYER | 40 | | | 35 | 135 | | | |
| p/i BUFFER LAYER | | 3 | | | 80 | | | |
| RF p-LAYER | | | 0.2 | | 60 | | 10 | 2 |
| RF n-LAYER | 0.8 | | | | 50 | 250 | | |
| n/i BUFFER LAYER | | 0.4 | 0.2 | | 50 | | | |
| RF i-LAYER | | 2 | | | 65 | | | |
| p/i BUFFER LAYER | | 0.4 | 0.25 | | 50 | | | |
| RF p-LAYER | | | 0.3 | | 60 | | 10 | 2 |

| SC-EMB-F5 | PRESSURE Torr | MW POWER W/cm³ | RF POWER W/cm³ | SUBSTRATE TEMPERATURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |

TABLE F5-continued

| | | | | | |
|---|---|---|---|---|---|
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| $H_2$ GAS FLOW RATE* (sccm) | 0.1 | 0.5 | 0.8 | 1 | 10 | 100 | 1000 | 2000 | 2030 | 2100 | 2500 |
|---|---|---|---|---|---|---|---|---|---|---|---|
| CURVE FACTOR | X | X | Δ | ○ | ○ | ○ | ○ | ○ | ○ | Δ | X |
| OPTICAL DURABILITY | X | Δ | ○ | ○ | ○ | ○ | ○ | ○ | ○ | Δ | X |
| UNIFORMITY IN CHARACTERISTICS | X | Δ | ○ | ○ | ○ | ○ | ○ | ○ | ○ | Δ | X |
| ADHESION | X | X | Δ | ○ | ○ | ○ | ○ | ○ | Δ | X | X |
| DURABILITY | X | Δ | ○ | ○ | ○ | ○ | ○ | ○ | Δ | X | X |
| CHARACTERISTICS WITH REVERSE BIAS VOLTAGE APPLIED | X | Δ | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
*: CONTAINING SILICON COMPOUND GAS
OTHER CONDITIONS

| | |
|---|---|
| SPECIES OF SILICON COMPOUND GAS: | $SiH_4$ |
| CONCENTRATION OF SILICON COMPOUND GAS (%): | 0.04 |
| APPLIED POWER: | VHF |
| POWER DENSITY ($W/cm^3$): | 0.2 |
| PRESSURE (Torr): | 0.003 |
| SUBSTRATE TEMPERATURE (°C.) FIRST/SECOND/THIRD: | 280/280/200 |

TABLE F6

(1)

| | |
|---|---|
| $H_2$ GAS FLOW RATE (sccm) | 1300 |
| SPECIES OF SILICON COMPOUND GAS | $SiH_4$ |
| CONCENTRATION* (%) | 0.0003~0.14 |
| TYPE OF APPLIED POWER | RF |
| POWER ($W/cm^3$) | 0.8 |
| PRESSURE (Torr) | 0.7 |
| SUBSTRATE TEMPERATURE (°C.) FIRST/SECOND/THIRD | 250/250/200 |

*: (SILICON COMPOUND GAS FLOW RATE)/($H_2$ GAS FLOW RATE)

(2)

| SC-EMB-F6 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 100 | 200 | | |
| n/i BUFFER LAYER | | 4 | | | 100 | | | |
| MW i-LAYER | 47 | | | 48 | 135 | | | |
| p/i BUFFER LAYER | | 3.5 | | | 110 | | | |
| RF p-LAYER | | | 0.1 | | 60 | | 12 | 2 |
| RF n-LAYER | 1.1 | | | | 50 | 250 | | |
| n/i BUFFER LAYER | | 4 | | | 80 | | | |
| MW i-LAYER | 39 | | | 34 | 145 | | | |
| p/i BUFFER LAYER | | 3 | | | 80 | | | |
| RF p-LAYER | | | 0.2 | | 60 | | 11 | 2 |
| RF n-LAYER | 0.8 | | | | 50 | 250 | | |
| n/i BUFFER LAYER | | 0.4 | 0.2 | | 50 | | | |
| RF i-LAYER | | 2 | | | 85 | | | |
| p/i BUFFER LAYER | | 0.4 | 0.25 | | 50 | | | |
| RF p-LAYER | | | 0.3 | | 60 | | 10 | 2 |

| SC-EMB-F6 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.34 | 0.5 | 370 | 110 |
| p/i BUFFER LAYER | 0.9 | | 0.08 | 330 | 20 |
| RF p-LAYER | 1.8 | | 0.07 | 300 | 10 |

TABLE F6-continued

| | | | | | |
|---|---|---|---|---|---|
| RF n-LAYER | 1.1 | | 0.04 | 300 | 10 |
| n/i BUFFER LAYER | 0.9 | | 0.08 | 300 | 10 |
| MW i-LAYER | 0.006 | 0.24 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| CONCENTRATION* (%) | 0.0003 | 0.0008 | 0.001 | 0.005 | 0.01 | 0.08 | 0.1 | 0.105 | 0.12 | 0.14 |
|---|---|---|---|---|---|---|---|---|---|---|
| CURVE FACTOR | X | Δ | ○ | ○ | ○ | ○ | ○ | ○ | Δ | X |
| OPTICAL DURABILITY | Δ | ○ | ○ | ○ | ○ | ○ | ○ | Δ | X | X |
| UNIFORMITY IN CHARACTERISTICS | X | Δ | ○ | ○ | ○ | ○ | ○ | Δ | X | X |
| ADHESION | X | Δ | ○ | ○ | ○ | ○ | ○ | Δ | X | X |
| DURABILITY | X | Δ | ○ | ○ | ○ | ○ | ○ | X | X | X |
| CHARACTERISTICS WITH REVERSE BIAS VOLTAGE APPLIED | X | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
*: CONCENTRATION OF SILICON COMPOUND GAS MIXED WITH $H_2$ GAS TO $H_2$ GAS

OTHER CONDITIONS

| | |
|---|---|
| FLOW RATE OF $H_2$ GAS CONTAINING SILICON COMPOUND GAS (sccm): | 1300 |
| SPECIES OF SILICON COMPOUND GAS: | $SiH_4$ |
| APPLIED POWER: | RF |
| POWER DENSITY (W/cm$^3$): | 0.08 |
| PRESSURE (Torr): | 0.7 |
| SUBSTRATE TEMPERATURE (°C.) FIRST/SECOND/THIRD: | 250/250/200 |

TABLE F7

(1)

| | |
|---|---|
| $H_2$ GAS FLOW RATE (sccm) | 1250 |
| SPECIES OF SILICON COMPOUND GAS | $SiH_4$ |
| CONCENTRATION* (%) | 0.0003~0.14 |
| TYPE OF APPLIED POWER | VHF |
| POWER (W/cm$^3$) | 0.10 |
| PRESSURE (Torr) | 0.04 |
| SUBSTRATE TEMPERATURE (°C.) FIRST/SECOND/THIRD | 280/280/200 |

*: (SILICON COMPOUND GAS FLOW RATE)/($H_2$ GAS FLOW RATE)

(2)

| SC-EMB-F7 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.8 | | | | 160 | 200 | | |
| n/i BUFFER LAYER | | 4 | | | 100 | | | |
| MW i-LAYER | 47 | | | 49 | 165 | | | |
| p/i BUFFER LAYER | | 3.5 | | | 100 | | | |
| RF p-LAYER | | | 0.1 | | 60 | | 12 | 2 |
| RF n-LAYER | 1.1 | | | | 50 | 260 | | |
| n/i BUFFER LAYER | | 4 | | | 80 | | | |
| MW i-LAYER | 35 | | | 34 | 125 | | | |
| p/i BUFFER LAYER | | 3 | | | 80 | | | |
| RF p-LAYER | | | 0.2 | | 60 | | 11 | 2 |
| RF n-LAYER | 0.8 | | | | 60 | 240 | | |
| n/i BUFFER LAYER | | 0.4 | 0.2 | | 50 | | | |
| RF i-LAYER | | 2.5 | | | 100 | | | |
| p/i BUFFER LAYER | | 0.4 | 0.25 | | 50 | | | |
| RF p-LAYER | | | 0.3 | | 60 | | 10 | 2 |

TABLE F7-continued

| SC-EMB-F7 | PRESSURE Torr | MW POWER W/cm³ | RF POWER W/cm³ | SUBSTRATE TEMPERA-TURE °C. | LAYER THICKNESS nm |
|---|---|---|---|---|---|
| RF n-LAYER | 1.15 | | 0.04 | 380 | 20 |
| n/i BUFFER LAYER | 0.9 | | 0.08 | 350 | 10 |
| MW i-LAYER | 0.006 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| CONCENTRATION* (%) | 0.0003 | 0.0008 | 0.001 | 0.005 | 0.01 | 0.08 | 0.1 | 0.105 | 0.12 | 0.14 |
|---|---|---|---|---|---|---|---|---|---|---|
| CURVE FACTOR | X | Δ | ○ | ○ | ○ | ○ | ○ | ○ | Δ | X |
| OPTICAL DURABILITY | Δ | ○ | ○ | ○ | ○ | ○ | ○ | Δ | X | X |
| UNIFORMITY IN CHARACTERISTICS | X | Δ | ○ | ○ | ○ | ○ | ○ | Δ | X | X |
| ADHESION | X | Δ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
*: CONCENTRATION OF SILICON COMPOUND GAS MIXED WITH $H_2$ GAS TO $H_2$ GAS
OTHER CONDITIONS

| | |
|---|---|
| FLOW RATE OF $H_2$ GAS CONTAINING SILICON COMPOUND GAS (sccm): | 1250 |
| SPECIES OF SILICON COMPOUND GAS: | $SiH_4$ |
| APPLIED POWER: | VHF |
| POWER DENSITY (W/cm³): | 0.10 |
| PRESSURE (Torr): | 0.04 |
| SUBSTRATE TEMPERATURE (°C.) FIRST/SECOND/THIRD: | 280/280/200 |

TABLE F8

(1)

| | |
|---|---|
| $H_2$ GAS FLOW RATE (sccm) | 1200 |
| SPECIES OF SILICON COMPOUND GAS | $SiH_4$ |
| CONCENTRATION* (%) | 0.0003~0.14 |
| TYPE OF APPLIED POWER | MW |
| POWER (W/cm³) | 0.11 |
| PRESSURE (Torr) | 0.006 |
| SUBSTRATE TEMPERATURE (°C.) FIRST/SECOND/THIRD | 220/200/200 |

*: (SILICON COMPOUND GAS FLOW RATE)/($H_2$ GAS FLOW RATE)

(2)

| SC-EMB-F8 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.8 | | | | 140 | 200 | | |
| n/i BUFFER LAYER | | 4 | | | 100 | | | |
| MW i-LAYER | 47 | | | 51 | 160 | | | |
| p/i BUFFER LAYER | | 3.5 | | | 100 | | | |
| RF p-LAYER | | | 0.1 | | 60 | | 12 | 2 |
| RF n-LAYER | 1.1 | | | | 50 | 270 | | |
| n/i BUFFER LAYER | | 4 | | | 80 | | | |
| MW i-LAYER | 35 | | | 36 | 110 | | | |
| p/i BUFFER LAYER | | 3 | | | 80 | | | |

TABLE F8-continued

| | | | | | | | |
|---|---|---|---|---|---|---|---|
| RF p-LAYER | | | 0.2 | 60 | | 11 | 2 |
| RF n-LAYER | 0.8 | | | 50 | 250 | | |
| n/i BUFFER LAYER | | 0.3 | 0.2 | 50 | | | |
| RF i-LAYER | | 2.5 | | 95 | | | |
| p/i BUFFER LAYER | | 0.4 | 0.25 | 50 | | | |
| RF p-LAYER | | | 0.3 | 60 | | 10 | 2 |

| SC-EMB-F8 | PRESSURE Torr | MW POWER W/cm³ | RF POWER W/cm³ | SUBSTRATE TEMPERATURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.35 | 0.5 | 370 | 110 |
| p/i BUFFER LAYER | 0.9 | | 0.08 | 330 | 20 |
| RF p-LAYER | 1.5 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.4 | | 0.07 | 170 | 10 |

(3)

| CONCENTRATION* (%) | 0.0003 | 0.0008 | 0.001 | 0.005 | 0.01 | 0.08 | 0.1 | 0.105 | 0.12 | 0.14 |
|---|---|---|---|---|---|---|---|---|---|---|
| CURVE FACTOR | X | ○ | ○ | ○ | ○ | ○ | ○ | ○ | Δ | X |
| OPTICAL DURABILITY | X | ○ | ○ | ○ | ○ | ○ | ○ | Δ | X | X |
| UNIFORMITY IN CHARACTERISTICS | X | Δ | ○ | ○ | ○ | ○ | ○ | Δ | X | X |
| ADHESION | X | Δ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
*: CONCENTRATION OF SILICON COMPOUND GAS MIXED WITH $H_2$ GAS TO $H_2$ GAS

OTHER CONDITIONS

| | |
|---|---|
| FLOW RATE OF $H_2$ GAS CONTAINING SILICON COMPOUND GAS (sccm): | 1200 |
| SPECIES OF SILICON COMPOUND GAS: | $SiH_4$ |
| APPLIED POWER: | MW |
| POWER DENSITY (W/cm³): | 0.11 |
| PRESSURE (Torr): | 0.006 |
| SUBSTRATE TEMPERATURE (°C.) FIRST/SECOND/THIRD: | 220/200/200 |

TABLE F9

(1)

| | |
|---|---|
| $H_2$ GAS FLOW RATE (sccm) | 800 |
| SPECIES OF SILICON COMPOUND GAS | $Si_2H_6$ |
| CONCENTRATION* (%) | 0.04 |
| TYPE OF APPLIED POWER | RF |
| POWER (W/cm³) | 0.4 |
| PRESSURE (Torr) | 0.01~100 |
| SUBSTRATE TEMPERATURE (°C.) FIRST/SECOND/THIRD | 280/280/200 |

*: (SILICON COMPOUND GAS FLOW RATE)/($H_2$ GAS FLOW RATE)

(2)

| SC-EMB-F9 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 130 | 210 | | |
| n/i BUFFER LAYER | | 5 | | | 100 | | | |

TABLE F9-continued

| | | | | | | | | |
|---|---|---|---|---|---|---|---|---|
| MW i-LAYER | 50 | | | 51 | 120 | | | |
| p/i BUFFER LAYER | | 3.5 | | | 100 | | | |
| RF p-LAYER | | | 0.1 | | 60 | | 12 | 2 |
| RF n-LAYER | 1.1 | | | | 50 | 270 | | |
| n/i BUFFER LAYER | | 4 | | | 80 | | | |
| MW i-LAYER | 34 | | | 36 | 100 | | | |
| p/i BUFFER LAYER | | 0.5 | 0.3 | | 60 | | | |
| RF p-LAYER | | | 0.2 | | 60 | | 11 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 85 | | | |
| p/i BUFFER LAYER | | 0.4 | 0.25 | | 50 | | | |
| RF p-LAYER | | | 0.3 | | 60 | | 10 | 2 |

| SC-EMB-F9 | PRESSURE Torr | MW POWER W/cm³ | RF POWER W/cm³ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.8 | | 0.08 | 350 | 10 |
| MW i-LAYER | 0.005 | 0.35 | 0.05 | 370 | 110 |
| p/i BUFFER LAYER | 0.9 | | 0.08 | 330 | 20 |
| RF p-LAYER | 1.6 | | 0.07 | 300 | 10 |
| RF n-LAYER | 1.1 | | 0.04 | 300 | 10 |
| n/i BUFFER LAYER | 0.8 | | 0.08 | 300 | 10 |
| MW i-LAYER | 0.006 | 0.25 | 0.5 | 330 | 100 |
| p/i BUFFER LAYER | 0.7 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.7 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| PRESSURE (Torr) | 0.01 | 0.03 | 0.05 | 1 | 3 | 5 | 10 | 11 | 20 | 100 |
|---|---|---|---|---|---|---|---|---|---|---|
| CURVE FACTOR | X | ○ | ○ | ○ | ○ | ○ | ○ | Δ | X | X |
| OPTICAL DURABILITY | X | Δ | ○ | ○ | ○ | ○ | ○ | ○ | Δ | X |
| UNIFORMITY IN CHARACTERISTICS | X | Δ | ○ | ○ | ○ | ○ | ○ | Δ | X | X |
| ADHESION | X | Δ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS

OTHER CONDITIONS

| | |
|---|---|
| FLOW RATE OF $H_2$ GAS CONTAINING SILICON COMPOUND GAS (sccm): | 800 |
| SPECIES OF SILICON COMPOUND GAS: | $Si_2H_6$ |
| CONCENTRATION OF SILICON COMPOUNG GAS TO $H_2$ GAS (%): | 0.04 |
| APPLIED POWER: | RF |
| POWER DENSITY (W/cm³): | 0.4 |
| SUBSTRATE TEMPERATURE (°C.) FIRST/SECOND/THIRD: | 280/280/200 |

TABLE F10

(1)

| | |
|---|---|
| $H_2$ GAS FLOW RATE (sccm) | 1250 |
| SPECIES OF SILICON COMPOUND GAS | $Si_2H_6$ |
| CONCENTRATION* (%) | 0.05 |
| TYPE OF APPLIED POWER | VHF |
| POWER (W/cm³) | 0.015 |
| PRESSURE (Torr) | 0.03~10000 |
| SUBSTRATE TEMPERATURE (°C.) FIRST/SECOND/THIRD | 280/280/200 |

*: (SILICON COMPOUND GAS FLOW RATE)/($H_2$ GAS FLOW RATE)

TABLE F10-continued (2)

| SC-EMB-F10 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.7 | | | | 140 | 200 | | |
| n/i BUFFER LAYER | | 5 | | | 100 | | | |
| MW i-LAYER | 49 | | | 52 | 145 | | | |
| p/i BUFFER LAYER | | 3.5 | | | 100 | | | |
| RF p-LAYER | | | 0.1 | | 60 | | 11 | 2 |
| RF n-LAYER | 1.1 | | | | 50 | 270 | | |
| n/i BUFFER LAYER | | 4 | | | 80 | | | |
| MW i-LAYER | 34 | | | 36 | 125 | | | |
| p/i BUFFER LAYER | | 0.4 | 0.2 | | 60 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 65 | | | |
| p/i BUFFER LAYER | | 0.4 | 0.25 | | 50 | | | |
| RF p-LAYER | | | 0.3 | | 60 | | 10 | 2 |

| SC-EMB-F10 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| PRESSURE (Torr) | 0.03 | 0.08 | 0.1 | 1 | 100 | 500 | 1000 | 1100 | 2000 | 10000 |
|---|---|---|---|---|---|---|---|---|---|---|
| CURVE FACTOR | X | Δ | ○ | ○ | ○ | ○ | ○ | ○ | Δ | X |
| OPTICAL DURABILITY | Δ | ○ | ○ | ○ | ○ | ○ | ○ | ○ | Δ | X |
| UNIFORMITY IN CHARACTERISTICS | X | Δ | ○ | ○ | ○ | ○ | ○ | Δ | X | X |
| ADHESION | X | ○ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
OTHER CONDITIONS

| | |
|---|---|
| FLOW RATE OF $H_2$ GAS CONTAINING SILICON COMPOUND GAS (sccm): | 1250 |
| SPECIES OF SILICON COMPOUND GAS: | $Si_2H_6$ |
| CONCENTRATION OF SILICON COMPOUNG GAS TO $H_2$ GAS (%): | 0.05 |
| APPLIED POWER: | VHF |
| POWER DENSITY ($W/cm^3$): | 0.015 |
| SUBSTRATE TEMPERATURE (°C.) FIRST/SECOND/THIRD: | 280/280/200 |

TABLE F11

(1)

| | |
|---|---|
| $H_2$ GAS FLOW RATE (sccm) | 1200 |
| SPECIES OF SILICON COMPOUND GAS | $SiF_4$ |
| CONCENTRATION* (%) | 0.02 |
| TYPE OF APPLIED POWER | MW |
| POWER ($W/cm^3$) | 0.11 |

TABLE F11-continued

| | |
|---|---|
| PRESSURE (Torr) | 0.03~100 |
| SUBSTRATE TEMPERATURE (°C.) FIRST/SECOND/THIRD | 230/230/200 |

*: (SILICON COMPOUND GAS FLOW RATE)/($H_2$ GAS FLOW RATE)

(2)

| SC-EMB-F11 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 130 | 200 | | |
| n/i BUFFER LAYER | | 4 | | | 100 | | | |
| MW i-LAYER | 49 | | | 50 | 145 | | | |
| p/i BUFFER LAYER | | 3.5 | | | 95 | | | |
| RF p-LAYER | | | 0.1 | | 60 | | 10 | 2 |
| RF n-LAYER | 1.1 | | | | 50 | 270 | | |
| n/i BUFFER LAYER | | 0.4 | 0.2 | | 80 | | | |
| MW i-LAYER | 34 | | | 36 | 150 | | | |
| p/i BUFFER LAYER | | 0.4 | 0.2 | | 60 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 90 | | | |
| p/i BUFFER LAYER | | 0.4 | 0.25 | | 50 | | | |
| RF p-LAYER | | | 0.3 | | 60 | | 10 | 2 |

| SC-EMB-F11 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.1 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| PRESSURE (mTorr) | 0.03 | 0.08 | 0.1 | 0.5 | 1 | 5 | 10 | 11 | 20 | 100 |
|---|---|---|---|---|---|---|---|---|---|---|
| CURVE FACTOR | X | Δ | ○ | ○ | ○ | ○ | ○ | ○ | Δ | X |
| OPTICAL DURABILITY | X | Δ | ○ | ○ | ○ | ○ | ○ | ○ | Δ | X |
| UNIFORMITY IN CHARACTERISTICS | X | ○ | ○ | ○ | ○ | ○ | ○ | Δ | X | X |
| ADHESION | X | Δ | ○ | ○ | ○ | ○ | ○ | ○ | X | X |
| DURABILITY | X | Δ | ○ | ○ | ○ | ○ | ○ | Δ | X | X |
| CHARACTERISTICS WITH REVERSE BIAS VOLTAGE APPLIED | X | Δ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS

OTHER CONDITIONS

| | |
|---|---|
| FLOW RATE OF $H_2$ GAS CONTAINING SILICON COMPOUND GAS (sccm): | 1200 |
| SPECIES OF SILICON COMPOUND GAS: | $SiF_4$ |
| CONCENTRATION OF SILICON COMPOUNG GAS TO $H_2$ GAS (%): | 0.02 |
| APPLIED POWER: | MW |
| POWER DENSITY (W/cm$^3$): | 0.11 |
| SUBSTRATE TEMPERATURE (°C.) FIRST/SECOND/THIRD: | 230/230/200 |

TABLE F12

(1)

| | |
|---|---|
| $H_2$ GAS FLOW RATE (sccm) | 600 |
| SPECIES OF SILICON COMPOUND GAS | $SiH_4$ |
| CONCENTRATION* (%) | 0.04 |
| TYPE OF APPLIED POWER | RF |
| POWER (W/cm$^3$) | 0.003~10 |
| PRESSURE (Torr) | 0.65 |
| SUBSTRATE TEMPERATURE (°C.) FIRST/SECOND/THIRD | 250/250/200 |

*: (SILICON COMPOUND GAS FLOW RATE)/($H_2$ GAS FLOW RATE)

(2)

| SC-EMB-F12 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 130 | 200 | | |
| n/i BUFFER LAYER | | 4 | | | 130 | | | |
| MW i-LAYER | 46 | | | 48 | 130 | | | |
| p/i BUFFER LAYER | | 3.5 | | | 120 | | | |
| RF p-LAYER | | | 0.1 | | 60 | | 10 | 2 |
| RF n-LAYER | 1.1 | | | | 50 | 270 | | |
| n/i BUFFER LAYER | | 0.4 | 0.2 | | 80 | | | |
| MW i-LAYER | 33 | | | 36 | 145 | | | |
| p/i BUFFER LAYER | | 0.4 | 0.2 | | 60 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 65 | | | |
| p/i BUFFER LAYER | | 0.4 | 0.25 | | 50 | | | |
| RF p-LAYER | | | 0.3 | | 60 | | 10 | 2 |

| SC-EMB-F12 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.8 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.6 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| POWER DENSITY (W/cm$^3$) | 0.003 | 0.007 | 0.01 | 0.05 | 0.1 | 0.7 | 1.0 | 1.1 | 3.0 | 10 |
|---|---|---|---|---|---|---|---|---|---|---|
| CURVE FACTOR | X | Δ | ○ | ○ | ○ | ○ | ○ | ○ | Δ | X |
| OPTICAL DURABILITY | Δ | ○ | ○ | ○ | ○ | ○ | ○ | ○ | Δ | X |
| UNIFORMITY IN CHARACTERISTICS | X | ○ | ○ | ○ | ○ | ○ | ○ | ○ | X | X |
| ADHESION | X | Δ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | Δ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS

OTHER CONDITIONS

| | |
|---|---|
| FLOW RATE OF $H_2$ GAS CONTAINING SILICON COMPOUND GAS (sccm): | 600 |
| SPECIES OF SILICON COMPOUND GAS: | $SiH_4$ |
| CONCENTRATION OF SILICON COMPOUNG GAS TO $H_2$ GAS (%): | 0.04 |
| APPLIED POWER: | RF |
| PRESSURE (Torr): | 0.65 |
| SUBSTRATE TEMPERATURE (°C.) FIRST/SECOND/THIRD: | 250/250/200 |

TABLE F13

(1)

| | |
|---|---|
| $H_2$ GAS FLOW RATE (sccm) | 1300 |
| SPECIES OF SILICON COMPOUND GAS | $Si_2H_6$ |
| CONCENTRATION* (%) | 0.02 |
| TYPE OF APPLIED POWER | VHF |
| POWER (W/cm$^3$) | 0.003~10 |
| PRESSURE (Torr) | 0.0065 |
| SUBSTRATE TEMPERATURE (°C.) FIRST/SECOND/THIRD | 140/140/140 |

*: (SILICON COMPOUND GAS FLOW RATE)/($H_2$ GAS FLOW RATE)

(2)

| SC-EMB-F13 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.4 | | | | 130 | 200 | | |
| n/i BUFFER LAYER | | 4 | | | 130 | | | |
| MW i-LAYER | 45 | | | 46 | 135 | | | |
| p/i BUFFER LAYER | | 2.5 | | | 120 | | | |
| RF p-LAYER | | | 0.1 | | 60 | | 10 | 2 |
| RF n-LAYER | 1.0 | | | | 30 | 270 | | |
| n/i BUFFER LAYER | | 0.4 | 0.2 | | 80 | | | |
| MW i-LAYER | 33 | | | 29 | 115 | | | |
| p/i BUFFER LAYER | | 0.4 | 0.2 | | 60 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.2 | | | 60 | | | |
| p/i BUFFER LAYER | | 0.4 | 0.25 | | 50 | | | |
| RF p-LAYER | | | 0.3 | | 60 | | 10 | 2 |

| SC-EMB-F13 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| POWER DENSITY (W/cm$^3$) | 0.003 | 0.007 | 0.01 | 0.05 | 0.1 | 0.7 | 1.0 | 1.1 | 3.0 | 10 |
|---|---|---|---|---|---|---|---|---|---|---|
| CURVE FACTOR | X | Δ | ○ | ○ | ○ | ○ | ○ | ○ | Δ | X |
| OPTICAL DURABILITY | X | ○ | ○ | ○ | ○ | ○ | ○ | ○ | Δ | X |
| UNIFORMITY IN CHARACTERISTICS | X | Δ | ○ | ○ | ○ | ○ | ○ | Δ | X | X |
| ADHESION | X | Δ | ○ | ○ | ○ | ○ | ○ | Δ | X | X |
| DURABILITY | X | Δ | ○ | ○ | ○ | ○ | ○ | ○ | Δ | X |
| CHARACTERISTICS WITH REVERSE BIAS VOLTAGE APPLIED | X | Δ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS

TABLE F13-continued

OTHER CONDITIONS

| | |
|---|---|
| FLOW RATE OF $H_2$ GAS CONTAINING SILICON COMPOUND GAS (sccm): | 1300 |
| SPECIES OF SILICON COMPOUND GAS: | $Si_2H_6$ |
| CONCENTRATION OF SILICON COMPOUNG GAS TO $H_2$ GAS (%): | 0.02 |
| APPLIED POWER: | VHF |
| PRESSURE (Torr): | 0.0065 |
| SUBSTRATE TEMPERATURE (°C.) FIRST/SECOND/THIRD: | 140/140/140 |

TABLE F14

(1)

| | |
|---|---|
| $H_2$ GAS FLOW RATE (sccm) | 1850 |
| SPECIES OF SILICON COMPOUND GAS | $SiCl_2H_2$ |
| CONCENTRATION* (%) | 0.008 |
| TYPE OF APPLIED POWER | MW |
| POWER (W/cm$^3$) | 0.03~100 |
| PRESSURE (Torr) | 0.006 |
| SUBSTRATE TEMPERATURE (°C.) FIRST/SECOND/THIRD | 130/130/130 |

*: (SILICON COMPOUND GAS FLOW RATE)/($H_2$ GAS FLOW RATE)

(2)

| SC-EMB-F14 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 140 | 200 | | |
| n/i BUFFER LAYER | | 4 | | | 120 | | | |
| MW i-LAYER | 45 | | | 46 | 125 | | | |
| p/i BUFFER LAYER | | 0.35 | 0.2 | | 120 | | | |
| RF p-LAYER | | | 0.1 | | 60 | | 10 | 2 |
| RF n-LAYER | 1.0 | | | | 30 | 270 | | |
| n/i BUFFER LAYER | | 0.4 | 0.2 | | 80 | | | |
| MW i-LAYER | 35 | | | 30 | 125 | | | |
| p/i BUFFER LAYER | | 0.4 | 0.2 | | 70 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.2 | | | 55 | | | |
| p/i BUFFER LAYER | | 0.4 | 0.25 | | 60 | | | |
| RF p-LAYER | | | 0.4 | | 60 | | 10 | 2 |

| SC-EMB-F14 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| POWER DENSITY (W/cm$^3$) | 0.03 | 0.07 | 0.1 | 0.5 | 1 | 7 | 10 | 11 | 30 | 100 |
|---|---|---|---|---|---|---|---|---|---|---|
| CURVE FACTOR | X | Δ | ○ | ○ | ○ | ○ | ○ | Δ | X | X |
| OPTICAL DURABILITY | X | ○ | ○ | ○ | ○ | ○ | ○ | ○ | X | X |
| UNIFORMITY IN CHARACTERISTICS | X | Δ | ○ | ○ | ○ | ○ | ○ | ○ | X | X |
| ADHESION | X | ○ | ○ | ○ | ○ | ○ | ○ | ○ | X | X |
| DURABILITY | X | Δ | ○ | ○ | ○ | ○ | ○ | Δ | X | X |

TABLE F14-continued

| |
|---|
| O: EXCELLENT FOR PRACTICAL USE |
| Δ: GOOD FOR PRACTICAL USE |
| X: NO GOOD FOR SOME APPLICATIONS |
| OTHER CONDITIONS |

| | |
|---|---|
| FLOW RATE OF $H_2$ GAS CONTAINING SILICON COMPOUND GAS (sccm): | 1850 |
| SPECIES OF SILICON COMPOUND GAS: | $SiCl_2H_2$ |
| CONCENTRATION OF SILICON COMPOUNG GAS TO $H_2$ GAS (%): | 0.008 |
| APPLIED POWER: | MW |
| PRESSURE (Torr): | 0.006 |
| SUBSTRATE TEMPERATURE (°C.) FIRST/SECOND/THIRD: | 130/130/130 |

TABLE F15

(1)

| | |
|---|---|
| $H_2$ GAS FLOW RATE (sccm) | 850 |
| SPECIES OF SILICON COMPOUND GAS | $SiH_4$ |
| CONCENTRATION* (%) | 0.07 |
| TYPE OF APPLIED POWER | RF |
| POWER (W/cm$^3$) | 0.26 |
| PRESSURE (Torr) | 1.1 |
| SUBSTRATE TEMPERATURE (°C.) | 50~520 |

*: (SILICON COMPOUND GAS FLOW RATE)/($H_2$ GAS FLOW RATE)

(2)

| SC-EMB-F15 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.4 | | | | 130 | 200 | | |
| n/i BUFFER LAYER | | 0.4 | 0.1 | | 120 | | | |
| MW i-LAYER | 45 | | | 47 | 125 | | | |
| p/i BUFFER LAYER | | 0.35 | 0.2 | | 120 | | | |
| RF p-LAYER | | | 0.1 | | 60 | | 10 | 2 |
| RF n-LAYER | 1.0 | | | | 30 | 270 | | |
| n/i BUFFER LAYER | | 0.4 | 0.2 | | 80 | | | |
| MW i-LAYER | 35 | | | 28 | 130 | | | |
| p/i BUFFER LAYER | | 0.4 | 0.2 | | 70 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.2 | | | 55 | | | |
| p/i BUFFER LAYER | | 0.4 | 0.25 | | 60 | | | |
| RF p-LAYER | | | 0.4 | | 60 | | 10 | 2 |

| SC-EMB-F15 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.1 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.7 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| SUBSTRATE TEMPERATURE (°C.) | 50 | 75 | 100 | 150 | 200 | 300 | 400 | 420 | 450 | 520 |
|---|---|---|---|---|---|---|---|---|---|---|
| CURVE FACTOR | X | O | O | O | O | O | O | X | X | X |
| OPTICAL DURABILITY | X | Δ | O | O | O | O | O | O | X | X |
| UNIFORMITY IN | X | Δ | O | O | O | O | O | Δ | X | X |

TABLE F15-continued

| CHARACTERISTICS | | | | | | | | | | |
|---|---|---|---|---|---|---|---|---|---|---|
| ADHESION | X | Δ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | ○ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS

OTHER CONDITIONS

| | |
|---|---|
| FLOW RATE OF $H_2$ GAS CONTAINING SILICON COMPOUND GAS (sccm): | 850 |
| SPECIES OF SILICON COMPOUND GAS: | $SiH_4$ |
| CONCENTRATION OF SILICON COMPOUNG GAS TO $H_2$ GAS (%): | 0.07 |
| APPLIED POWER: | RF |
| POWER DENSITY (W/cm³): | 0.26 |
| PRESSURE (Torr): | 1.1 |

TABLE F16

(1)

| | |
|---|---|
| $H_2$ GAS FLOW RATE (sccm) | 1600 |
| SPECIES OF SILICON COMPOUND GAS | $SiCl_4$ |
| CONCENTRATION* (%) | 0.02 |
| TYPE OF APPLIED POWER | VHF |
| POWER (W/cm³) | 0.22 |
| PRESSURE (Torr) | 0.01 |
| SUBSTRATE TEMPERATURE (°C.) | 30~420 |

*: (SILICON COMPOUND GAS FLOW RATE)/($H_2$ GAS FLOW RATE)

(2)

| SC-EMB-F16 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 110 | 200 | | |
| n/i BUFFER LAYER | | 0.4 | 0.1 | | 110 | | | |
| MW i-LAYER | 44 | | | 45 | 160 | | | |
| p/i BUFFER LAYER | | 0.35 | 0.2 | | 120 | | | |
| RF p-LAYER | | | 0.1 | | 60 | | 10 | 2 |
| RF n-LAYER | 1.0 | | | | 30 | 270 | | |
| n/i BUFFER LAYER | | 0.4 | 0.2 | | 80 | | | |
| MW i-LAYER | 35 | | | 28 | 155 | | | |
| p/i BUFFER LAYER | | 0.4 | 0.2 | | 70 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.1 | | | 100 | | | |
| p/i BUFFER LAYER | | 0.4 | 0.25 | | 60 | | | |
| RF p-LAYER | | | 0.4 | | 60 | | 10 | 2 |

| SC-EMB-F16 | PRESSURE Torr | MW POWER W/cm³ | RF POWER W/cm³ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.24 | 0.5 | 330 | 100 |
| p/i BUFFER LAYER | 0.8 | | 0.08 | 280 | 20 |
| RF p-LAYER | 1.6 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

TABLE F16-continued (3)

| SUBSTRATE TEMPERATURE (°C.) | 30 | 40 | 50 | 100 | 200 | 250 | 300 | 320 | 350 | 420 |
|---|---|---|---|---|---|---|---|---|---|---|
| CURVE FACTOR | X | ○ | ○ | ○ | ○ | ○ | ○ | Δ | X | X |
| OPTICAL DURABILITY | X | Δ | ○ | ○ | ○ | ○ | ○ | ○ | X | X |
| UNIFORMITY IN CHARACTERISTICS | X | Δ | ○ | ○ | ○ | ○ | ○ | ○ | X | X |
| ADHESION | X | Δ | ○ | ○ | ○ | ○ | ○ | Δ | X | X |
| DURABILITY | X | X | ○ | ○ | ○ | ○ | ○ | Δ | X | X |
| CHARACTERISTICS WITH REVERSE BIAS VOLTAGE APPLIED | X | ○ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS

OTHER CONDITIONS

| | |
|---|---|
| FLOW RATE OF $H_2$ GAS CONTAINING SILICON COMPOUND GAS (sccm): | 1600 |
| SPECIES OF SILICON COMPOUND GAS: | $SiCl_4$ |
| CONCENTRATION OF SILICON COMPOUNG GAS TO $H_2$ GAS (%): | 0.02 |
| APPLIED POWER: | VHF |
| POWER DENSITY (W/cm$^3$): | 0.22 |
| PRESSURE (Torr): | 0.01 |

TABLE F17

(1)

| | |
|---|---|
| $H_2$ GAS FLOW RATE (sccm) | 1800 |
| SPECIES OF SILICON COMPOUND GAS | $SiCl_2H_2$ |
| CONCENTRATION* (%) | 0.01 |
| TYPE OF APPLIED POWER | MW |
| POWER (W/cm$^3$) | 0.4 |
| PRESSURE (Torr) | 0.006 |
| SUBSTRATE TEMPERATURE (°C.) | 30~420 |

*: (SILICON COMPOUND GAS FLOW RATE)/($H_2$ GAS FLOW RATE)

(2)

| SC-EMB-F17 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 120 | 200 | | |
| n/i BUFFER LAYER | | 0.4 | 0.2 | | 110 | | | |
| MW i-LAYER | 42 | | | 44 | 170 | | | |
| p/i BUFFER LAYER | | 0.35 | 0.2 | | 120 | | | |
| RF p-LAYER | | | 0.1 | | 60 | | 10 | 1.7 |
| RF n-LAYER | 1.0 | | | | 30 | 270 | | |
| n/i BUFFER LAYER | | 0.4 | 0.2 | | 80 | | | |
| MW i-LAYER | 33 | | | 28 | 160 | | | |
| p/i BUFFER LAYER | | 0.4 | 0.2 | | 70 | | | |
| RF p-LAYER | | | 0.2 | | 60 | | 10 | 1.8 |
| RF n-LAYER | 0.8 | | | | 50 | 250 | | |
| n/i BUFFER LAYER | | 0.3 | 0.2 | | 50 | | | |
| RF i-LAYER | | 2.1 | | | 110 | | | |
| p/i BUFFER LAYER | | 0.4 | 0.25 | | 60 | | | |
| RF p-LAYER | | | 0.4 | | 60 | | 10 | 1.8 |

| SC-EMB-F17 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.8 | | 0.08 | 350 | 10 |
| MW i-LAYER | 0.005 | 0.35 | 0.5 | 370 | 110 |
| p/i BUFFER LAYER | 0.8 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.24 | 0.5 | 330 | 100 |
| p/i BUFFER LAYER | 0.8 | | 0.08 | 280 | 20 |
| RF p-LAYER | 1.7 | | 0.07 | 260 | 10 |

TABLE F17-continued

| | | | | |
|---|---|---|---|---|
| RF n-LAYER | 1.05 | 0.04 | 230 | 10 |
| n/i BUFFER LAYER | 1.3 | 0.06 | 230 | 10 |
| RF i-LAYER | 0.75 | 0.07 | 200 | 86 |
| p/i BUFFER LAYER | 1.2 | 0.06 | 200 | 12 |
| RF p-LAYER | 1.6 | 0.07 | 170 | 10 |

(3)

| SUBSTRATE TEMPERATURE (°C.) | 30 | 40 | 50 | 100 | 200 | 250 | 300 | 320 | 350 | 420 |
|---|---|---|---|---|---|---|---|---|---|---|
| CURVE FACTOR | X | Δ | ○ | ○ | ○ | ○ | ○ | Δ | X | X |
| OPTICAL DURABILITY | X | Δ | ○ | ○ | ○ | ○ | ○ | ○ | Δ | X |
| UNIFORMITY IN CHARACTERISTICS | X | Δ | ○ | ○ | ○ | ○ | ○ | Δ | X | X |
| ADHESION | X | Δ | ○ | ○ | ○ | ○ | ○ | ○ | Δ | X |
| DURABILITY | X | Δ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS
OTHER CONDITIONS

| | |
|---|---|
| FLOW RATE OF $H_2$ GAS CONTAINING SILICON COMPOUND GAS (sccm): | 1800 |
| SPECIES OF SILICON COMPOUND GAS: | $SiCl_2H_2$ |
| CONCENTRATION OF SILICON COMPOUNG GAS TO $H_2$ GAS (%): | 0.01 |
| APPLIED POWER: | MW |
| POWER DENSITY (W/cm$^3$): | 0.4 |
| PRESSURE (Torr): | 0.006 |

TABLE F18

(1)

| | |
|---|---|
| $H_2$ GAS FLOW RATE (sccm) | 1200 |
| SPECIES OF SILICON COMPOUND GAS | $SiH_4H_2$ |
| CONCENTRATION* (%) | 0.04 |
| TYPE OF APPLIED POWER | RF |
| POWER (W/cm$^3$) | 0.03 |
| PRESSURE (Torr) | 0.9 |
| SUBSTRATE TEMPERATURE (°C.) | 360 |

(2)

| | |
|---|---|
| $H_2$ GAS FLOW RATE (sccm) | 950 |
| SPECIES OF SILICON COMPOUND GAS | $SiH_4H_2$ |
| CONCENTRATION* (%) | 0.03 |
| TYPE OF APPLIED POWER | RF |
| POWER (W/cm$^3$) | 0.03 |
| PRESSURE (Torr) | 0.9 |
| SUBSTRATE TEMPERATURE (°C.) | 350 |

*: ($SiH_4$ GAS FLOW RATE)/(TOTAL $H_2$ GAS FLOW RATE)

(3)

| | |
|---|---|
| $H_2$ GAS FLOW RATE (sccm) | 700 |
| SPECIES OF SILICON COMPOUND GAS | $SiH_4$ |
| CONCENTRATION* (%) | 0.03 |
| TYPE OF APPLIED POWER | RF |
| POWER (W/cm$^3$) | 0.03 |
| PRESSURE (Torr) | 0.7 |
| SUBSTRATE TEMPERATURE (°C.) | 350 |

(4)

| | |
|---|---|
| $H_2$ GAS FLOW RATE (sccm) | 900 |
| SPECIES OF SILICON COMPOUND GAS | $SiH_4$ |
| CONCENTRATION* (%) | 0.03 |
| TYPE OF APPLIED POWER | RF |
| POWER (W/cm$^3$) | 0.03 |
| PRESSURE (Torr) | 0.6 |
| SUBSTRATE TEMPERATURE (°C.) | 330 |

(5)

| | |
|---|---|
| $H_2$ GAS FLOW RATE (sccm) | 1000 |
| SPECIES OF SILICON COMPOUND GAS | $SiH_4$ |
| CONCENTRATION* (%) | 0.03 |

TABLE F18-continued

| | |
|---|---|
| TYPE OF APPLIED POWER | RF |
| POWER (W/cm$^3$) | 0.03 |
| PRESSURE (Torr) | 0.9 |
| SUBSTRATE TEMPERATURE (°C.) | 300 |

*: (SILICON COMPOUND GAS FLOW RATE)/($H_2$ GAS FLOW RATE)

(6)

| | |
|---|---|
| $H_2$ GAS FLOW RATE (sccm) | 1200 |
| SPECIES OF SILICON COMPOUND GAS | $SiH_4H_2$ |
| CONCENTRATION* (%) | 0.04 |
| TYPE OF APPLIED POWER | RF |
| POWER (W/cm$^3$) | 0.03 |
| PRESSURE (Torr) | 0.7 |
| SUBSTRATE TEMPERATURE (°C.) | 300 |

*: ($SiH_4$ GAS FLOW RATE)/(TOTAL $H_2$ GAS FLOW RATE)

(7)

| | |
|---|---|
| $H_2$ GAS FLOW RATE (sccm) | 1100 |
| SPECIES OF SILICON COMPOUND GAS | $SiH_4$ |
| CONCENTRATION* (%) | 0.03 |
| TYPE OF APPLIED POWER | RF |
| POWER (W/cm$^3$) | 0.02 |
| PRESSURE (Torr) | 0.7 |
| SUBSTRATE TEMPERATURE (°C.) | 300 |

(8)

| | |
|---|---|
| $H_2$ GAS FLOW RATE (sccm) | 1200 |
| SPECIES OF SILICON COMPOUND GAS | $SiH_4$ |
| CONCENTRATION* (%) | 0.03 |
| TYPE OF APPLIED POWER | RF |
| POWER (W/cm$^3$) | 0.02 |
| PRESSURE (Torr) | 0.6 |
| SUBSTRATE TEMPERATURE (°C.) | 280 |

(9)

| | |
|---|---|
| $H_2$ GAS FLOW RATE (sccm) | 1500 |
| SPECIES OF SILICON COMPOUND GAS | $SiH_4$ |
| CONCENTRATION* (%) | 0.03 |
| TYPE OF APPLIED POWER | RF |
| POWER (W/cm$^3$) | 0.02 |
| PRESSURE (Torr) | 0.5 |
| SUBSTRATE TEMPERATURE (°C.) | 260 |

*: (SILICON COMPOUND GAS FLOW RATE)/($H_2$ GAS FLOW RATE)

(10)

| | |
|---|---|
| $H_2$ GAS FLOW RATE (sccm) | 850 |
| SPECIES OF SILICON COMPOUND GAS | $SiH_4H_2$ |
| CONCENTRATION* (%) | 0.03 |
| TYPE OF APPLIED POWER | RF |
| POWER (W/cm$^3$) | 0.03 |
| PRESSURE (Torr) | 0.9 |
| SUBSTRATE TEMPERATURE (°C.) | 230 |

*: ($SiH_4$ GAS FLOW RATE)/(TOTAL $H_2$ GAS FLOW RATE)

(11)

| | |
|---|---|
| $H_2$ GAS FLOW RATE (sccm) | 1000 |
| SPECIES OF SILICON COMPOUND GAS | $SiH_4$ |
| CONCENTRATION* (%) | 0.03 |
| TYPE OF APPLIED POWER | RF |
| POWER (W/cm$^3$) | 0.02 |
| PRESSURE (Torr) | 0.7 |
| SUBSTRATE TEMPERATURE (°C.) | 230 |

(12)

| | |
|---|---|
| $H_2$ GAS FLOW RATE (sccm) | 1200 |
| SPECIES OF SILICON COMPOUND GAS | $SiH_4$ |
| CONCENTRATION* (%) | 0.03 |
| TYPE OF APPLIED POWER | RF |
| POWER (W/cm$^3$) | 0.02 |
| PRESSURE (Torr) | 0.8 |
| SUBSTRATE TEMPERATURE (°C.) | 200 |

TABLE F18-continued (13)

| | |
|---|---|
| $H_2$ GAS FLOW RATE (sccm) | 1400 |
| SPECIES OF SILICON COMPOUND GAS | $SiH_4$ |
| CONCENTRATION* (%) | 0.03 |
| TYPE OF APPLIED POWER | RF |
| POWER ($W/cm^3$) | 0.02 |
| PRESSURE (Torr) | 0.7 |
| SUBSTRATE TEMPERATURE (°C.) | 170 |

*: (SILICON COMPOUND GAS FLOW RATE)/($H_2$ GAS FLOW RATE)

(14)

| SC-EMB-F18 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 150 | 200 | | |
| n/i BUFFER LAYER | | 0.4 | 0.2 | | 110 | | | |
| MW i-LAYER | 43 | | | 43 | 140 | | | |
| p/i BUFFER LAYER | | 0.4 | 0.2 | | 120 | | | |
| RF p-LAYER | | | 0.1 | | 60 | | 10 | 1.7 |
| RF n-LAYER | 0.9 | | | | 20 | 280 | | |
| n/i BUFFER LAYER | | 0.4 | 0.2 | | 80 | | | |
| MW i-LAYER | 32 | | | 27 | 150 | | | |
| p/i BUFFER LAYER | | 0.4 | 0.2 | | 70 | | | |
| RF p-LAYER | | | 0.2 | | 60 | | 10 | 1.8 |
| RF n-LAYER | 0.8 | | | | 50 | 250 | | |
| n/i BUFFER LAYER | | 0.4 | 0.2 | | 50 | | | |
| RF i-LAYER | | 2.1 | | | 90 | | | |
| p/i BUFFER LAYER | | 0.4 | 0.25 | | 60 | | | |
| RF p-LAYER | | | 0.4 | | 60 | | 10 | 1.8 |

| SC-EMB-F18 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.1 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.5 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.1 | | 0.06 | 200 | 12 |
| RF p-LAYER | 1.4 | | 0.07 | 170 | 10 |

TABLE G1

(1)

| | |
|---|---|
| $H_2$ GAS FLOW RATE (sccm) | 1500 |
| SPECIES OF SILICON COMPOUND GAS | $SiH_4$ |
| CONCENTRATION* (%) | 0.01 |
| SPECIES OF GROUP-III-ELEMENT COMPOUND GAS (DILUTION: %) | $B_2H_6/H_2$ (10%) |
| CONCENTRATION** (%) | 0.5 |
| TYPE OF APPLIED POWER | RF |
| POWER ($W/cm^3$) | 0.06 |
| PRESSURE (Torr) | 0.7 |
| SUBSTRATE TEMPERATURE (°C.) | 200 |

*: (SILICON COMPOUND GAS FLOW RATE)/($H_2$ GAS FLOW RATE)
**: (GROUP-III-ELEMENT COMPOUND GAS FLOW RATE)/(TOTAL $H_2$ GAS FLOW RATE)

TABLE G1-continued (2)

| SC-EMB-G1 | SiH$_4$ FLOW RATE sccm | Si$_2$H$_6$ FLOW RATE sccm | CH$_4$ FLOW RATE sccm | GeH$_4$ FLOW RATE sccm | H$_2$ FLOW RATE sccm | PH$_3$/H$_2$ FLOW RATE sccm | B$_2$H$_6$/H$_2$ FLOW RATE sccm | SiH$_4$/H$_2$ FLOW RATE sccm |
|---|---|---|---|---|---|---|---|---|
| RF n-LAYER | 1.5 | | | | 110 | 200 | | |
| n/i BUFFER LAYER | | 3.5 | | | 100 | | | |
| MW i-LAYER | 38 | | | 39 | 165 | | | |
| p/i BUFFER LAYER | | 3 | | | 80 | | | |
| RF p-LAYER | | | 0.3 | | 90 | | 10 | 1 |

| SC-EMB-G1 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.15 | | 0.05 | 370 | 20 |
| n/i BUFFER LAYER | 0.8 | | 0.06 | 360 | 10 |
| MW i-LAYER | 0.006 | 0.28 | 0.7 | 370 | 150 |
| P/i BUFFER LAYER | 0.8 | | 0.07 | 230 | 20 |
| RF p-LAYER | 1.3 | | 0.09 | 200 | 10 |

TABLE G2

(1)

| | |
|---|---|
| H$_2$ GAS FLOW RATE (sccm) | 1000 |
| SPECIES OF SILICON COMPOUND GAS | Si$_2$H$_6$ |
| CONCENTRATION* (%) | 0.05 |
| SPECIES OF GROUP-III-ELEMENT COMPOUND GAS (DILUTION: %) | BF$_3$/H$_2$ (1%) |
| CONCENTRATION** (%) | 0.4 |
| TYPE OF APPLIED POWER | VHF |
| POWER (W/cm$^3$) | 0.08 |
| PRESSURE (Torr) | 0.018 |
| SUBSTRATE TEMPERATURE (°C.) | 250 |

(2)

| | |
|---|---|
| H$_2$ GAS FLOW RATE (sccm) | 1300 |
| SPECIES OF SILICON COMPOUND GAS | SiH$_4$ |
| CONCENTRATION* (%) | 0.03 |
| SPECIES OF GROUP-III-ELEMENT COMPOUND GAS (DILUTION: %) | BF$_3$/H$_2$ (1%) |
| CONCENTRATION** (%) | 0.3 |
| TYPE OF APPLIED POWER | RF |
| POWER (W/cm$^3$) | 0.04 |
| PRESSURE (Torr) | 0.7 |
| SUBSTRATE TEMPERATURE (°C.) | 200 |

*: (SILICON COMPOUND GAS FLOW RATE)/(TOTAL H$_2$ GAS FLOW RATE)
**: (GROUP-III-ELEMENT COMPOUND GAS FLOW RATE)/(TOTAL H$_2$ GAS FLOW RATE)

(3)

| SC-EMB-G2 | SiH$_4$ FLOW RATE sccm | Si$_2$H$_6$ FLOW RATE sccm | CH$_4$ FLOW RATE sccm | GeH$_4$ FLOW RATE sccm | H$_2$ FLOW RATE sccm | PH$_3$/H$_2$ FLOW RATE sccm | B$_2$H$_6$/H$_2$ FLOW RATE sccm | SiH$_4$/H$_2$ FLOW RATE sccm |
|---|---|---|---|---|---|---|---|---|
| RF n-LAYER | 1.5 | | | | 90 | 200 | | |
| n/i BUFFER LAYER | | 2.5 | | | 90 | | | |
| MW i-LAYER | 45 | | | 43 | 175 | | | |
| p/i BUFFER LAYER | | 3 | | | 80 | | | |
| RF p-LAYER | | | 0.3 | | 60 | | 10 | 2 |
| RF n-LAYER | 2 | | | | 75 | 250 | | |
| n/i BUFFER LAYER | | 0.4 | 0.2 | | 85 | | | |
| RF i-LAYER | | 2.8 | | | 80 | | | |
| p/i BUFFER LAYER | | 0.4 | 0.3 | | 65 | | | |
| RF p-LAYER | | | 0.3 | | 70 | | 10 | 2 |

TABLE G2-continued

| SC-EMB-G2 | PRESSURE Torr | MW POWER W/cm³ | RF POWER W/cm³ | SUBSTRATE TEMPERA-TURE °C. | LAYER THICKNESS nm |
|---|---|---|---|---|---|
| RF n-LAYER | 1.1 | | 0.05 | 380 | 20 |
| n/i BUFFER LAYER | 0.8 | | 0.08 | 360 | 10 |
| MW i-LAYER | 0.005 | 0.25 | 0.65 | 380 | 150 |
| p/i BUFFER LAYER | 0.7 | | 0.07 | 250 | 20 |
| RF p-LAYER | 1.7 | | 0.07 | 250 | 10 |
| RF n-LAYER | 1.1 | | 0.04 | 250 | 10 |
| n/i BUFFER LAYER | 1.1 | | 0.06 | 250 | 10 |
| RF i-LAYER | 0.5 | | 0.07 | 200 | 110 |
| p/i BUFFER LAYER | 1.1 | | 0.06 | 200 | 15 |
| RF p-LAYER | 1.7 | | 0.07 | 170 | 10 |

TABLE G3

(1)

| | |
|---|---|
| $H_2$ GAS FLOW RATE (sccm) | 1500 |
| SPECIES OF SILICON COMPOUND GAS | $SiCl_2H_2$/He |
| CONCENTRATION* (%) | 0.03 |
| SPECIES OF GROUP-III-ELEMENT COMPOUND GAS (DILUTION: %) | $B_2H_6/H_2$ (10%) |
| CONCENTRATION** (%) | 2.0 |
| TYPE OF APPLIED POWER | MW |
| POWER (W/cm³) | 0.15 |
| PRESSURE (Torr) | 0.008 |
| SUBSTRATE TEMPERATURE (°C.) | 330 |

(2)

| | |
|---|---|
| $H_2$ GAS FLOW RATE (sccm) | 1200 |
| SPECIES OF SILICON COMPOUND GAS | $SiH_4$ |
| CONCENTRATION* (%) | 0.03 |
| SPECIES OF GROUP-III-ELEMENT COMPOUND GAS (DILUTION: %) | $B_2H_6/H_2$ (10%) |
| CONCENTRATION** (%) | 1.0 |
| TYPE OF APPLIED POWER | RF |
| POWER (W/cm³) | 0.04 |
| PRESSURE (Torr) | 0.7 |
| SUBSTRATE TEMPERATURE (°C.) | 280 |

(3)

| | |
|---|---|
| $H_2$ GAS FLOW RATE (sccm) | 1400 |
| SPECIES OF SILICON COMPOUND GAS | $SiH_4$ |
| CONCENTRATION* (%) | 0.03 |
| SPECIES OF GROUP-III-ELEMENT COMPOUND GAS (DILUTION: %) | $B_2H_6/H_2$ (10%) |
| CONCENTRATION** (%) | 0.5 |
| TYPE OF APPLIED POWER | RF |
| POWER (W/cm³) | 0.04 |
| PRESSURE (Torr) | 0.8 |
| SUBSTRATE TEMPERATURE (°C.) | 200 |

*: (SILICON COMPOUND GAS FLOW RATE)/($H_2$ GAS FLOW RATE)
**: (GROUP-III-ELEMENT COMPOUND GAS FLOW RATE)/(TOTAL $H_2$ GAS FLOW RATE)

(4)

| SC-EMB-G3 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 150 | 200 | | |
| n/i BUFFER LAYER | | 4 | | | 130 | | | |
| MW i-LAYER | 49 | | | 51 | 170 | | | |
| p/i BUFFER LAYER | | 4 | | | 110 | | | |
| RF p-LAYER | | | 0.1 | | 70 | | 10 | 2 |
| RF n-LAYER | 1.1 | | | | 50 | 250 | | |
| n/i BUFFER LAYER | | 4 | | | 80 | | | |

TABLE G3-continued

| | | | | | | | | |
|---|---|---|---|---|---|---|---|---|
| MW i-LAYER | 41 | | | 37 | 155 | | | |
| p/i BUFFER LAYER | | 3 | | | 80 | | | |
| RF p-LAYER | | | 0.2 | | 60 | | 10 | 2 |
| RF n-LAYER | 0.8 | | | | 50 | 250 | | |
| n/i BUFFER LAYER | | 0.4 | 0.2 | | 55 | | | |
| RF i-LAYER | | 2 | | | 85 | | | |
| p/i BUFFER LAYER | | 0.4 | 0.25 | | 55 | | | |
| RF p-LAYER | | | 0.3 | | 60 | | 10 | 2 |

| SC-EMB-G3 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.3 | 0.65 | 375 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.55 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.25 | | 0.06 | 200 | 12 |
| RF p-LAYER | 1.6 | | 0.07 | 170 | 10 |

TABLE G4

(1)

| | |
|---|---|
| $H_2$ GAS FLOW RATE (sccm) | 0.1~2500 |
| SPECIES OF SILICON COMPOUND GAS | $SiH_4$ |
| CONCENTRATION* (%) | 0.04 |
| SPECIES OF GROUP-III-ELEMENT COMPOUND GAS | $B_2H_6$ |
| CONCENTRATION** (%) | 0.2 |
| TYPE OF APPLIED POWER | RF |
| POWER ($W/cm^3$) | 0.4 |
| PRESSURE (Torr) | 0.8 |
| SUBSTRATE TEMPERATURE (°C.) FIRST/SECOND/THIRD | 270/270/200 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

(2)

| SC-EMB-G4 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 100 | 200 | | |
| n/i BUFFER LAYER | | 4 | | | 100 | | | |
| MW i-LAYER | 50 | | | 48 | 165 | | | |
| p/i BUFFER LAYER | | 4 | | | 100 | | | |
| RF p-LAYER | | | 0.1 | | 60 | | 10 | 2 |
| RF n-LAYER | 1.1 | | | | 50 | 250 | | |
| n/i BUFFER LAYER | | 4 | | | 70 | | | |
| MW i-LAYER | 40 | | | 36 | 155 | | | |
| p/i BUFFER LAYER | | 3 | | | 80 | | | |
| RF p-LAYER | | | 0.2 | | 60 | | 10 | 2 |
| RF n-LAYER | 0.8 | | | | 50 | 250 | | |
| n/i BUFFER LAYER | | 0.4 | 0.2 | | 50 | | | |
| RF i-LAYER | | 2 | | | 70 | | | |
| p/i BUFFER LAYER | | 0.4 | 0.25 | | 50 | | | |
| RF p-LAYER | | | 0.3 | | 60 | | 10 | 2 |

| SC-EMB-G4 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.3 | 0.5 | 370 | 110 |
| p/i BUFFER LAYER | 0.9 | | 0.08 | 330 | 20 |
| RF p-LAYER | 1.8 | | 0.07 | 300 | 10 |

TABLE G4-continued

| | | | | | |
|---|---|---|---|---|---|
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| $H_2$ GAS FLOW RATE* (sccm) | 0.1 | 0.5 | 0.8 | 1 | 10 | 100 | 1000 | 2000 | 2030 | 2100 | 2500 |
|---|---|---|---|---|---|---|---|---|---|---|---|
| CURVE FACTOR | X | Δ | ○ | ○ | ○ | ○ | ○ | ○ | ○ | Δ | X |
| OPTICAL DURABILITY | X | Δ | ○ | ○ | ○ | ○ | ○ | ○ | Δ | X | X |
| UNIFORMITY IN CHARACTERISTICS | X | Δ | ○ | ○ | ○ | ○ | ○ | ○ | Δ | X | X |
| SERIES-RESISTOR CHARACTERISTICS | X | X | Δ | ○ | ○ | ○ | ○ | ○ | ○ | Δ | X |
| DURABILITY | X | Δ | Δ | ○ | ○ | ○ | ○ | ○ | Δ | X | X |
| CHARACTERISTICS WITH REVERSE BIAS VOLTAGE APPLIED | X | Δ | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
*: CONTAINING GROUP-III-ELEMENT COMPOUND GAS AND SILICON COMPOUND GAS

OTHER CONDITIONS

| | |
|---|---|
| GROUP-III-ELEMENT COMPOUND GAS/CONCENTRATION (%): | $B_2H_6$/0.2 |
| SPECIES OF SILICON COMPOUND GAS/CONCENTRATION (%): | $SiH_4$/0.04 |
| APPLIED POWER: | RF |
| POWER DENSITY (W/cm$^3$): | 0.4 |
| PRESSURE (Torr): | 0.8 |
| SUBSTRATE TEMPERATURE (°C.) FIRST/SECOND/THIRD: | 270/270/200 |

TABLE G5

(1)

| | |
|---|---|
| $H_2$ GAS FLOW RATE (sccm) | 0.1~2500 |
| SPECIES OF SILICON COMPOUND GAS | $SiH_4$ |
| CONCENTRATION* (%) | 0.04 |
| SPECIES OF GROUP-III-ELEMENT COMPOUND GAS | $BF_3$ |
| CONCENTRATION** (%) | 0.1 |
| TYPE OF APPLIED POWER | VHF |
| POWER (W/cm$^3$) | 0.3 |
| PRESSURE (Torr) | 0.005 |
| SUBSTRATE TEMPERATURE (°C.) FIRST/SECOND/THIRD | 260/260/170 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

(2)

| SC-EMB-G5 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 120 | 200 | | |
| n/i BUFFER LAYER | | 4 | | | 100 | | | |
| MW i-LAYER | 48 | | | 48 | 160 | | | |
| p/i BUFFER LAYER | | 3.5 | | | 100 | | | |
| RF p-LAYER | | | 0.1 | | 60 | | 10 | 2 |
| RF n-LAYER | 1.2 | | | | 50 | 260 | | |
| n/i BUFFER LAYER | | 4 | | | 80 | | | |
| MW i-LAYER | 40 | | | 35 | 140 | | | |
| p/i BUFFER LAYER | | 3 | | | 80 | | | |
| RF p-LAYER | | | 0.2 | | 60 | | 10 | 2 |
| RF n-LAYER | 0.8 | | | | 50 | 250 | | |
| n/i BUFFER LAYER | | 0.4 | 0.2 | | 50 | | | |
| RF i-LAYER | | 2 | | | 68 | | | |
| p/i BUFFER LAYER | | 0.4 | 0.25 | | 50 | | | |
| RF p-LAYER | | | 0.3 | | 60 | | 10 | 2 |

TABLE G5-continued

| SC-EMB-G5 | PRESSURE Torr | MW POWER W/cm$^3$ | RF POWER W/cm$^3$ | SUBSTRATE TEMPERATURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| $H_2$ GAS FLOW RATE* (sccm) | 0.1 | 0.5 | 0.8 | 1 | 10 | 100 | 1000 | 2000 | 2030 | 2100 | 2500 |
|---|---|---|---|---|---|---|---|---|---|---|---|
| CURVE FACTOR | X | X | Δ | ○ | ○ | ○ | ○ | ○ | ○ | Δ | X |
| OPTICAL DURABILITY | X | Δ | ○ | ○ | ○ | ○ | ○ | ○ | ○ | Δ | X |
| UNIFORMITY IN CHARACTERISTICS | X | Δ | ○ | ○ | ○ | ○ | ○ | ○ | ○ | Δ | X |
| SERIES-RESISTOR CHARACTERISTICS | X | X | Δ | ○ | ○ | ○ | ○ | ○ | Δ | X | X |
| DURABILITY | X | Δ | ○ | ○ | ○ | ○ | ○ | ○ | Δ | X | X |
| CHARACTERISTICS WITH REVERSE BIAS VOLTAGE APPLIED | X | Δ | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
*: CONTAINING GROUP-III-ELEMENT COMPOUND GAS AND SILICON COMPOUND GAS

OTHER CONDITIONS

| | |
|---|---|
| GROUP-III-ELEMENT COMPOUND GAS/CONCENTRATION (%): | $BF_3$/0.1 |
| SPECIES OF SILICON COMPOUND GAS/CONCENTRATION (%): | $SiH_4$/0.04 |
| APPLIED POWER: | VHF |
| POWER DENSITY (W/cm$^3$): | 0.3 |
| PRESSURE (Torr): | 0.005 |
| SUBSTRATE TEMPERATURE (°C.) FIRST/SECOND/THIRD: | 260/260/170 |

TABLE G6

(1)

| | |
|---|---|
| $H_2$ GAS FLOW RATE (sccm) | 1300 |
| SPECIES OF SILICON COMPOUND GAS | $SiH_4$ |
| CONCENTRATION* (%) | 0.05 |
| SPECIES OF GROUP-III-ELEMENT COMPOUND GAS | $B_2H_6$ |
| CONCENTRATION** (%) | 0.01~6 |
| TYPE OF APPLIED POWER | RF |
| POWER (W/cm$^3$) | 0.1 |
| PRESSURE (Torr) | 0.8 |
| SUBSTRATE TEMPERATURE (°C.) FIRST/SECOND/THIRD | 255/250/170 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

(2)

| SC-EMB-G6 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 100 | 200 | | |
| n/i BUFFER LAYER | | 4 | | | 100 | | | |
| MW i-LAYER | 47 | | | 48 | 145 | | | |
| p/i BUFFER LAYER | | 3.5 | | | 110 | | | |
| RF p-LAYER | | | 0.1 | | 60 | | 12 | 2 |
| RF n-LAYER | 1.1 | | | | 50 | 250 | | |
| n/i BUFFER LAYER | | 4 | | | 80 | | | |
| MW i-LAYER | 39 | | | 34 | 135 | | | |

TABLE G6-continued

| | | | | | | | |
|---|---|---|---|---|---|---|---|
| p/i BUFFER LAYER | | 3 | | 80 | | | |
| RF p-LAYER | | | 0.2 | 60 | | 11 | 2 |
| RF n-LAYER | 0.8 | | | 50 | 250 | | |
| n/i BUFFER LAYER | | 0.4 | 0.2 | 50 | | | |
| RF i-LAYER | | 2 | | 90 | | | |
| p/i BUFFER LAYER | | 0.4 | 0.25 | 50 | | | |
| RF p-LAYER | | | 0.3 | 60 | | 10 | 2 |

| SC-EMB-G6 | PRESSURE Torr | MW POWER W/cm³ | RF POWER W/cm³ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.34 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.24 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| CONCENTRATION* (%) | 0.01 | 0.03 | 0.05 | 0.08 | 1 | 2 | 3 | 3.2 | 4 | 6 |
|---|---|---|---|---|---|---|---|---|---|---|
| CURVE FACTOR | X | Δ | ○ | ○ | ○ | ○ | ○ | ○ | Δ | X |
| OPTICAL DURABILITY | Δ | ○ | ○ | ○ | ○ | ○ | ○ | Δ | X | X |
| UNIFORMITY IN CHARACTERISTICS | X | Δ | ○ | ○ | ○ | ○ | ○ | Δ | X | X |
| SERIES-RESISTOR CHARACTERISTICS | X | ○ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
*: CONCENTRATION OF GROUP-III-ELEMENT GAS MIXED WITH $H_2$ GAS TO TOTAL $H_2$ GAS

OTHER $H_2$ PLASMA TREATMENT CONDITIONS

| | |
|---|---|
| GROUP-III-ELEMENT COMPOUND GAS (%): | $B_2H_6$ |
| FLOW RATE OF $H_2$ GAS CONTAINING SILICON COMPOUND GAS (sccm): | 1300 |
| SPECIES OF SILICON COMPOUND GAS/CONCENTRATION (%): | $SiH_4$/0.05 |
| APPLIED POWER: | RF |
| POWER DENSITY (W/cm³): | 0.1 |
| PRESSURE (Torr): | 0.8 |
| SUBSTRATE TEMPERATURE (°C.) FIRST/SECOND/THIRD: | 255/250/170 |

TABLE G7

(1)

| | |
|---|---|
| $H_2$ GAS FLOW RATE (sccm) | 1250 |
| SPECIES OF SILICON COMPOUND GAS | $SiH_4$ |
| CONCENTRATION* (%) | 0.03 |
| SPECIES OF GROUP-III-ELEMENT COMPOUND GAS | $B_2H_6/H_2$ |
| CONCENTRATION** (%) | 0.01~6 |
| TYPE OF APPLIED POWER | VHF |
| POWER (W/cm³) | 0.11 |
| PRESSURE (Torr) | 0.03 |
| SUBSTRATE TEMPERATURE (°C.) FIRST/SECOND/THIRD | 270/270/170 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

TABLE G7-continued (2)

| SC-EMB-G7 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.8 | | | | 160 | 200 | | |
| n/i BUFFER LAYER | | 4 | | | 100 | | | |
| MW i-LAYER | 47 | | | 49 | 170 | | | |
| p/i BUFFER LAYER | | 3.5 | | | 100 | | | |
| RF p-LAYER | | | 0.1 | | 60 | | 12 | 2 |
| RF n-LAYER | 1.1 | | | | 50 | 260 | | |
| n/i BUFFER LAYER | | 4 | | | 80 | | | |
| MW i-LAYER | 35 | | | 34 | 140 | | | |
| p/i BUFFER LAYER | | 3 | | | 80 | | | |
| RF p-LAYER | | | 0.2 | | 60 | | 11 | 2 |
| RF n-LAYER | 0.8 | | | | 60 | 240 | | |
| n/i BUFFER LAYER | | 0.4 | 0.2 | | 50 | | | |
| RF i-LAYER | | 2.5 | | | 110 | | | |
| p/i BUFFER LAYER | | 0.4 | 0.25 | | 50 | | | |
| RF p-LAYER | | | 0.3 | | 60 | | 10 | 2 |

| SC-EMB-G7 | PRESSURE Torr | MW POWER W/cm³ | RF POWER W/cm³ | SUBSTRATE TEMPERA-TURE °C. | LAYER THICKNESS nm |
|---|---|---|---|---|---|
| RF n-LAYER | 1.15 | | 0.04 | 380 | 20 |
| n/i BUFFER LAYER | 0.9 | | 0.08 | 350 | 10 |
| MW i-LAYER | 0.006 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.8 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| CONCENTRATION* (%) | 0.01 | 0.03 | 0.05 | 0.08 | 1 | 2 | 3 | 3.2 | 4 | 6 |
|---|---|---|---|---|---|---|---|---|---|---|
| CURVE FACTOR | X | Δ | ○ | ○ | ○ | ○ | ○ | ○ | Δ | X |
| OPTICAL DURABILITY | Δ | ○ | ○ | ○ | ○ | ○ | ○ | Δ | X | X |
| UNIFORMITY IN CHARACTERISTICS | X | Δ | ○ | ○ | ○ | ○ | ○ | ○ | X | X |
| SERIES-RESISTOR CHARACTERISTICS | X | ○ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
*: CONCENTRATION OF GROUP-III-ELEMENT GAS MIXED WITH $H_2$ GAS TO TOTAL $H_2$ GAS

OTHER $H_2$ PLASMA TREATMENT CONDITIONS

| | |
|---|---|
| GROUP-III-ELEMENT COMPOUND GAS (%): | $B_2H_6$ |
| FLOW RATE OF $H_2$ GAS CONTAINING SILICON COMPOUND GAS (sccm): | 1250 |
| SPECIES OF SILICON COMPOUND GAS/CONCENTRATION (%): | $SiH_4$/0.03 |
| APPLIED POWER: | VHF |
| POWER DENSITY (W/cm³): | 0.11 |
| PRESSURE (Torr): | 0.3 |
| SUBSTRATE TEMPERATURE (°C.) FIRST/SECOND/THIRD: | 270/270/170 |

TABLE G8

(1)

| | |
|---|---|
| $H_2$ GAS FLOW RATE (sccm) | 1200 |
| SPECIES OF SILICON COMPOUND GAS | $SiH_4$ |
| CONCENTRATION* (%) | 0.05 |

TABLE G8-continued

| | |
|---|---|
| SPECIES OF GROUP-III-ELEMENT COMPOUND GAS | $BF_3/H_2$ |
| CONCENTRATION** (%) | 0.01~6 |
| TYPE OF APPLIED POWER | MW |
| POWER (W/cm$^3$) | 0.08 |
| PRESSURE (Torr) | 0.007 |
| SUBSTRATE TEMPERATURE (°C.) FIRST/SECOND/THIRD | 230/230/170 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

(2)

| SC-EMB-G8 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 140 | 200 | | |
| n/i BUFFER LAYER | | 4 | | | 100 | | | |
| MW i-LAYER | 47 | | | 51 | 165 | | | |
| p/i BUFFER LAYER | | 3.5 | | | 100 | | | |
| RF p-LAYER | | | 0.1 | | 60 | | 12 | 2 |
| RF n-LAYER | 1.1 | | | | 50 | 270 | | |
| n/i BUFFER LAYER | | 4 | | | 80 | | | |
| MW i-LAYER | 35 | | | 36 | 120 | | | |
| p/i BUFFER LAYER | | 3 | | | 80 | | | |
| RF p-LAYER | | | 0.2 | | 60 | | 11 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 85 | | | |
| p/i BUFFER LAYER | | 0.4 | 0.25 | | 50 | | | |
| RF p-LAYER | | | 0.3 | | 60 | | 10 | 2 |

| SC-EMB-G8 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.35 | 0.5 | 370 | 110 |
| p/i BUFFER LAYER | 0.9 | | 0.08 | 330 | 20 |
| RF p-LAYER | 1.5 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.8 | | 0.07 | 200 | 87 |
| p/i BUFFER LAYER | 1.2 | | 0.06 | 200 | 11 |
| RF p-LAYER | 1.4 | | 0.07 | 170 | 10 |

(3)

| CONCENTRATION* (%) | 0.01 | 0.03 | 0.05 | 0.08 | 1 | 2 | 3 | 3.2 | 4 | 6 |
|---|---|---|---|---|---|---|---|---|---|---|
| CURVE FACTOR | X | Δ | ○ | ○ | ○ | ○ | ○ | ○ | Δ | X |
| OPTICAL DURABILITY | Δ | ○ | ○ | ○ | ○ | ○ | ○ | Δ | X | X |
| UNIFORMITY IN CHARACTERISTICS | X | ○ | ○ | ○ | ○ | ○ | ○ | ○ | X | X |
| SERIES-RESISTOR CHARACTERISTICS | X | ○ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
*: CONCENTRATION OF GROUP-III-ELEMENT GAS MIXED WITH $H_2$ GAS TO TOTAL $H_2$ GAS

OTHER $H_2$ PLASMA TREATMENT CONDITIONS

| | |
|---|---|
| GROUP-III-ELEMENT COMPOUND GAS (%): | $BF_3$ |
| FLOW RATE OF $H_2$ GAS CONTAINING SILICON COMPOUND GAS (sccm): | 1200 |
| SPECIES OF SILICON COMPOUND GAS/CONCENTRATION (%): | $SiH_4$/0.05 |
| APPLIED POWER: | MW |
| POWER DENSITY (W/cm$^3$): | 0.08 |
| PRESSURE (Torr): | 0.007 |
| SUBSTRATE TEMPERATURE (°C.) FIRST/SECOND/THIRD: | 230/230/170 |

TABLE G9

(1)

| | |
|---|---|
| $H_2$ GAS FLOW RATE (sccm) | 1300 |
| SPECIES OF SILICON COMPOUND GAS | $SiH_4$ |
| CONCENTRATION* (%) | 0.0003~0.14 |
| SPECIES OF GROUP-III-ELEMENT COMPOUND GAS (DILUTION: %) | $B_2H_6/H_2$ (1%) |
| CONCENTRATION** (%) | 0.3 |
| TYPE OF APPLIED POWER | RF |
| POWER ($W/cm^3$) | 0.09 |
| PRESSURE (Torr) | 0.8 |
| SUBSTRATE TEMPERATURE (°C.) FIRST/SECOND/THIRD | 260/260/170 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

(2)

| SC-EMB-G9 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 130 | 210 | | |
| n/i BUFFER LAYER | | 5 | | | 100 | | | |
| MW i-LAYER | 50 | | | 51 | 130 | | | |
| p/i BUFFER LAYER | | 3.5 | | | 100 | | | |
| RF p-LAYER | | | 0.1 | | 60 | | 12 | 2 |
| RF n-LAYER | 1.1 | | | | 50 | 270 | | |
| n/i BUFFER LAYER | | 4 | | | 80 | | | |
| MW i-LAYER | 34 | | | 36 | 120 | | | |
| p/i BUFFER LAYER | | 0.5 | 0.3 | | 60 | | | |
| RF p-LAYER | | | 0.2 | | 60 | | 11 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 80 | | | |
| p/i BUFFER LAYER | | 0.4 | 0.25 | | 50 | | | |
| RF p-LAYER | | | 0.3 | | 60 | | 10 | 2 |

| SC-EMB-G9 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.8 | | 0.08 | 350 | 10 |
| MW i-LAYER | 0.007 | 0.35 | 0.5 | 370 | 110 |
| p/i BUFFER LAYER | 0.9 | | 0.08 | 330 | 20 |
| RF p-LAYER | 1.6 | | 0.07 | 300 | 10 |
| RF n-LAYER | 1.1 | | 0.04 | 300 | 10 |
| n/i BUFFER LAYER | 0.8 | | 0.08 | 300 | 10 |
| MW i-LAYER | 0.006 | 0.25 | 0.5 | 330 | 100 |
| p/i BUFFER LAYER | 0.7 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.7 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| CONCENTRATION* (%) | 0.0003 | 0.0008 | 0.001 | 0.005 | 0.01 | 0.08 | 0.1 | 0.105 | 0.12 | 0.14 |
|---|---|---|---|---|---|---|---|---|---|---|
| CURVE FACTOR | X | Δ | ○ | ○ | ○ | ○ | ○ | ○ | Δ | X |
| OPTICAL DURABILITY | Δ | ○ | ○ | ○ | ○ | ○ | ○ | Δ | X | X |
| UNIFORMITY IN CHARACTERISTICS | X | Δ | ○ | ○ | ○ | ○ | ○ | Δ | X | X |
| SERIES-RESISTOR CHARACTERISTICS | X | Δ | ○ | ○ | ○ | ○ | ○ | Δ | X | X |
| DURABILITY | X | Δ | ○ | ○ | ○ | ○ | ○ | X | X | X |
| CHARACTERISTICS WITH REVERSE BIAS VOLTAGE APPLIED | X | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
*: CONCENTRATION OF SILICON COMPOUND GAS MIXED WITH $H_2$ GAS TO TOTAL $H_2$ GAS

TABLE G10

(1)

| | |
|---|---|
| $H_2$ GAS FLOW RATE (sccm) | 1250 |
| SPECIES OF SILICON COMPOUND GAS | $SiH_4$ |
| CONCENTRATION* (%) | 0.0003~0.14 |
| SPECIES OF GROUP-III-ELEMENT COMPOUND GAS (DILUTION: %) | $B_2H_6/H_2$ (1%) |
| CONCENTRATION** (%) | 0.3 |
| TYPE OF APPLIED POWER | VFH |
| POWER (W/cm$^3$) | 0.11 |
| PRESSURE (Torr) | 0.03 |
| SUBSTRATE TEMPERATURE (°C.) FIRST/SECOND/THIRD | 270/270/170 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

(2)

| SC-EMB-G10 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 140 | 200 | | |
| n/i BUFFER LAYER | | 5 | | | 100 | | | |
| MW i-LAYER | 49 | | | 52 | 160 | | | |
| p/i BUFFER LAYER | | 3.5 | | | 100 | | | |
| RF p-LAYER | | | 0.1 | | 60 | | 11 | 2 |
| RF n-LAYER | 1.1 | | | | 50 | 270 | | |
| n/i BUFFER LAYER | | 4 | | | 80 | | | |
| MW i-LAYER | 34 | | | 36 | 130 | | | |
| p/i BUFFER LAYER | | 0.4 | 0.2 | | 60 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 75 | | | |
| p/i BUFFER LAYER | | 0.4 | 0.25 | | 50 | | | |
| RF p-LAYER | | | 0.3 | | 60 | | 10 | 2 |

| SC-EMB-G10 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| CONCENTRATION* (%) | 0.0003 | 0.0008 | 0.001 | 0.005 | 0.01 | 0.08 | 0.1 | 0.105 | 0.12 | 0.14 |
|---|---|---|---|---|---|---|---|---|---|---|
| CURVE FACTOR | X | Δ | ○ | ○ | ○ | ○ | ○ | ○ | Δ | X |
| OPTICAL DURABILITY | Δ | ○ | ○ | ○ | ○ | ○ | ○ | Δ | X | X |
| UNIFORMITY IN CHARACTERISTICS | X | Δ | ○ | ○ | ○ | ○ | ○ | Δ | X | X |
| SERIES-RESISTOR CHARACTERISTICS | X | ○ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
*: CONCENTRATION OF SILICON COMPOUND GAS MIXED WITH $H_2$ GAS TO TOTAL $H_2$ GAS

TABLE G11

(1)

| | |
|---|---|
| $H_2$ GAS FLOW RATE (sccm) | 1150 |
| SPECIES OF SILICON COMPOUND GAS | $SiH_4$ |
| CONCENTRATION* (%) | 0.0003~0.14 |
| SPECIES OF GROUP-III-ELEMENT COMPOUND GAS (DILUTION: %) | $B_2H_6/H_2$ (1%) |
| CONCENTRATION** (%) | 0.4 |
| TYPE OF APPLIED POWER | MW |
| POWER (W/cm$^3$) | 0.10 |
| PRESSURE (Torr) | 0.005 |
| SUBSTRATE TEMPERATURE (°C.) FIRST/SECOND/THIRD | 230/230/170 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

(2)

| SC-EMB-G11 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 130 | 200 | | |
| n/i BUFFER LAYER | | 4 | | | 100 | | | |
| MW i-LAYER | 49 | | | 50 | 155 | | | |
| p/i BUFFER LAYER | | 3.5 | | | 95 | | | |
| RF p-LAYER | | | 0.1 | | 60 | | 10 | 2 |
| RF n-LAYER | 1.1 | | | | 50 | 270 | | |
| n/i BUFFER LAYER | | 0.4 | 0.2 | | 80 | | | |
| MW i-LAYER | 34 | | | 36 | 160 | | | |
| p/i BUFFER LAYER | | 0.4 | 0.2 | | 60 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 80 | | | |
| p/i BUFFER LAYER | | 0.4 | 0.25 | | 50 | | | |
| RF p-LAYER | | | 0.3 | | 60 | | 10 | 2 |

| SC-EMB-G11 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.1 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| CONCENTRATION* (%) | 0.0003 | 0.0008 | 0.001 | 0.005 | 0.01 | 0.08 | 0.1 | 0.105 | 0.12 | 0.14 |
|---|---|---|---|---|---|---|---|---|---|---|
| CURVE FACTOR | X | ○ | ○ | ○ | ○ | ○ | ○ | ○ | Δ | X |
| OPTICAL DURABILITY | X | ○ | ○ | ○ | ○ | ○ | ○ | Δ | X | X |
| UNIFORMITY IN CHARACTERISTICS | X | Δ | ○ | ○ | ○ | ○ | ○ | Δ | X | X |
| SERIES-RESISTOR CHARACTERISTICS | X | Δ | ○ | ○ | ○ | ○ | ○ | ○ | X | X |
| DURABILITY | X | Δ | ○ | ○ | ○ | ○ | ○ | Δ | X | X |
| CHARACTERISTICS WITH REVERSE BIAS VOLTAGE APPLIED | X | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
*: CONCENTRATION OF SILICON COMPOUND GAS MIXED WITH $H_2$ GAS TO TOTAL $H_2$ GAS

TABLE G12

(1)

| | |
|---|---|
| $H_2$ GAS FLOW RATE (sccm) | 1350 |
| SPECIES OF SILICON COMPOUND GAS | $Si_2H_6$ |
| CONCENTRATION* (%) | 0.04 |
| SPECIES OF GROUP-III-ELEMENT COMPOUND GAS (DILUTION: %) | $BF_3/H_2$ (1%) |
| CONCENTRATION** (%) | 0.3 |
| TYPE OF APPLIED POWER | RF |
| POWER (W/cm$^3$) | 0.45 |
| PRESSURE (Torr) | 0.01~100 |
| SUBSTRATE TEMPERATURE (°C.) FIRST/SECOND/THIRD | 270/270/170 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

(2)

| SC-EMB-G12 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 130 | 200 | | |
| n/i BUFFER LAYER | | 4 | | | 130 | | | |
| MW i-LAYER | 46 | | | 48 | 150 | | | |
| p/i BUFFER LAYER | | 3.5 | | | 120 | | | |
| RF p-LAYER | | | 0.1 | | 60 | | 10 | 2 |
| RF n-LAYER | 1.1 | | | | 50 | 270 | | |
| n/i BUFFER LAYER | | 0.4 | 0.2 | | 80 | | | |
| MW i-LAYER | 33 | | | 36 | 150 | | | |
| p/i BUFFER LAYER | | 0.4 | 0.2 | | 60 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 75 | | | |
| p/i BUFFER LAYER | | 0.4 | 0.25 | | 50 | | | |
| RF p-LAYER | | | 0.3 | | 60 | | 10 | 2 |

| SC-EMB-G12 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.35 | 0.5 | 370 | 110 |
| p/i BUFFER LAYER | 0.8 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.6 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| PRESSURE (Torr) | 0.01 | 0.03 | 0.05 | 1 | 3 | 5 | 10 | 11 | 20 | 100 |
|---|---|---|---|---|---|---|---|---|---|---|
| CURVE FACTOR | X | ○ | ○ | ○ | ○ | ○ | ○ | Δ | X | X |
| OPTICAL DURABILITY | X | Δ | ○ | ○ | ○ | ○ | ○ | ○ | Δ | X |
| UNIFORMITY IN CHARACTERISTICS | X | Δ | ○ | ○ | ○ | ○ | ○ | Δ | X | X |
| SERIES-RESISTOR CHARACTERISTICS | X | Δ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS

TABLE G13

(1)

| | |
|---|---|
| $H_2$ GAS FLOW RATE (sccm) | 1250 |
| SPECIES OF SILICON COMPOUND GAS | $Si_2H_6$ |
| CONCENTRATION* (%) | 0.05 |
| SPECIES OF GROUP-III-ELEMENT COMPOUND GAS (DILUTION: %) | $BF_3/H_2$ (1%) |
| CONCENTRATION** (%) | 0.3 |
| TYPE OF APPLIED POWER | VHF |
| POWER (W/cm$^3$) | 0.013 |
| PRESSURE (mTorr) | 0.03~10000 |
| SUBSTRATE TEMPERATURE (°C.) FIRST/SECOND/THIRD | 280/260/170 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

(2)

| SC-EMB-G13 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.4 | | | | 130 | 200 | | |
| n/i BUFFER LAYER | | 4 | | | 130 | | | |
| MW i-LAYER | 45 | | | 46 | 165 | | | |
| p/i BUFFER LAYER | | 2.5 | | | 120 | | | |
| RF p-LAYER | | | 0.1 | | 60 | | 10 | 2 |
| RF n-LAYER | 1.0 | | | | 30 | 270 | | |
| n/i BUFFER LAYER | | 0.4 | 0.2 | | 80 | | | |
| MW i-LAYER | 33 | | | 29 | 135 | | | |
| p/i BUFFER LAYER | | 0.4 | 0.2 | | 60 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.2 | | | 85 | | | |
| p/i BUFFER LAYER | | 0.4 | 0.25 | | 50 | | | |
| RF p-LAYER | | | 0.3 | | 60 | | 10 | 2 |

| SC-EMB-G13 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| PRESSURE (mTorr) | 0.03 | 0.08 | 0.1 | 1 | 100 | 500 | 1000 | 1100 | 2000 | 10000 |
|---|---|---|---|---|---|---|---|---|---|---|
| CURVE FACTOR | X | Δ | ○ | ○ | ○ | ○ | ○ | ○ | Δ | X |
| OPTICAL DURABILITY | Δ | ○ | ○ | ○ | ○ | ○ | ○ | ○ | Δ | X |
| UNIFORMITY IN CHARACTERISTICS | X | Δ | ○ | ○ | ○ | ○ | ○ | Δ | X | X |
| SERIES-RESISTOR CHARACTERISTICS | X | ○ | ○ | ○ | ○ | ○ | ○ | Δ | X | X |
| DURABILITY | X | Δ | ○ | ○ | ○ | ○ | ○ | Δ | X | X |
| CHARACTERISTICS WITH RE-VERSE BIAS VOLTAGE APPLIED | X | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS

TABLE G14

(1)

| | |
|---|---|
| $H_2$ GAS FLOW RATE (sccm) | 950 |
| SPECIES OF SILICON COMPOUND GAS | $SiF_4$ |
| CONCENTRATION* (%) | 0.03 |
| SPECIES OF GROUP-III-ELEMENT COMPOUND GAS (DILUTION: %) | $B_2H_6/H_2$ (1%) |
| CONCENTRATION** (%) | 0.5 |
| TYPE OF APPLIED POWER | MW |
| POWER (W/cm$^3$) | 0.12 |
| PRESSURE (mTorr) | 0.03~100 |
| SUBSTRATE TEMPERATURE (°C.) FIRST/SECOND/THIRD | 220/220/170 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

(2)

| SC-EMB-G14 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 140 | 200 | | |
| n/i BUFFER LAYER | | 4 | | | 120 | | | |
| MW i-LAYER | 45 | | | 46 | 145 | | | |
| p/i BUFFER LAYER | | 0.35 | 0.2 | | 120 | | | |
| RF p-LAYER | | | 0.1 | | 60 | | 10 | 2 |
| RF n-LAYER | 1.0 | | | | 30 | 270 | | |
| n/i BUFFER LAYER | | 0.4 | 0.2 | | 80 | | | |
| MW i-LAYER | 35 | | | 30 | 130 | | | |
| p/i BUFFER LAYER | | 0.4 | 0.2 | | 70 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.2 | | | 85 | | | |
| p/i BUFFER LAYER | | 0.4 | 0.25 | | 60 | | | |
| RF p-LAYER | | | 0.4 | | 60 | | 10 | 2 |

| SC-EMB-G14 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.007 | 0.35 | 0.5 | 370 | 110 |
| p/i BUFFER LAYER | 0.9 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| PRESSURE (mTorr) | 0.03 | 0.08 | 0.1 | 0.5 | 1 | 5 | 10 | 11 | 20 | 100 |
|---|---|---|---|---|---|---|---|---|---|---|
| CURVE FACTOR | X | Δ | ○ | ○ | ○ | ○ | ○ | ○ | Δ | X |
| OPTICAL DURABILITY | X | Δ | ○ | ○ | ○ | ○ | ○ | ○ | Δ | X |
| UNIFORMITY IN CHARACTERISTICS | X | ○ | ○ | ○ | ○ | ○ | ○ | Δ | X | X |
| SERIES-RESISTOR CHARACTERISTICS | X | Δ | ○ | ○ | ○ | ○ | ○ | ○ | X | X |
| DURABILITY | X | Δ | ○ | ○ | ○ | ○ | ○ | Δ | X | X |
| CHARACTERISTICS WITH REVERSE BIAS VOLTAGE APPLIED | X | Δ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS

TABLE G15

(1)

| | |
|---|---|
| $H_2$ GAS FLOW RATE (sccm) | 600 |
| SPECIES OF SILICON COMPOUND GAS | $SiH_4$ |
| CONCENTRATION* (%) | 0.04 |
| SPECIES OF GROUP-III-ELEMENT COMPOUND GAS (DILUTION: %) | $BF_3/H_2$ (1%) |
| CONCENTRATION** (%) | 0.2 |
| TYPE OF APPLIED POWER | RF |
| POWER (W/cm$^3$) | 0.003~10 |
| PRESSURE (Torr) | 0.60 |
| SUBSTRATE TEMPERATURE (°C.) FIRST/SECOND/THIRD | 260/260/170 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

(2)

| SC-EMB-G15 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.4 | | | | 130 | 200 | | |
| n/i BUFFER LAYER | | 0.4 | 0.1 | | 120 | | | |
| MW i-LAYER | 45 | | | 47 | 160 | | | |
| p/i BUFFER LAYER | | 0.35 | 0.2 | | 120 | | | |
| RF p-LAYER | | | 0.1 | | 60 | | 10 | 2 |
| RF n-LAYER | 1.0 | | | | 30 | 270 | | |
| n/i BUFFER LAYER | | 0.4 | 0.2 | | 80 | | | |
| MW i-LAYER | 35 | | | 28 | 145 | | | |
| p/i BUFFER LAYER | | 0.4 | 0.2 | | 70 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.2 | | | 65 | | | |
| p/i BUFFER LAYER | | 0.4 | 0.25 | | 60 | | | |
| RF p-LAYER | | | 0.4 | | 60 | | 10 | 2 |

| SC-EMB-G15 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.1 | | 0.04 | 380 | 20 |
| n/i BUFFER LAYER | 0.9 | | 0.08 | 350 | 10 |
| MW i-LAYER | 0.007 | 0.35 | 0.5 | 370 | 110 |
| p/i BUFFER LAYER | 0.9 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.7 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| POWER DENSITY (W/cm$^3$) | 0.003 | 0.007 | 0.01 | 0.05 | 0.1 | 0.7 | 1.0 | 1.1 | 3.0 | 10 |
|---|---|---|---|---|---|---|---|---|---|---|
| CURVE FACTOR | X | Δ | ○ | ○ | ○ | ○ | ○ | ○ | Δ | X |
| OPTICAL DURABILITY | Δ | ○ | ○ | ○ | ○ | ○ | ○ | ○ | Δ | X |
| UNIFORMITY IN CHARACTERISTICS | X | ○ | ○ | ○ | ○ | ○ | ○ | ○ | X | X |
| SERIES-RESISTOR CHARACTERISTICS | X | Δ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | Δ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS

TABLE G16

(1)

| | |
|---|---|
| $H_2$ GAS FLOW RATE (sccm) | 1400 |
| SPECIES OF SILICON COMPOUND GAS | $Si_2H_6$ |
| CONCENTRATION* (%) | 0.02 |
| SPECIES OF GROUP-III-ELEMENT COMPOUND GAS (DILUTION: %) | $BF_3/H_2$ (1%) |
| CONCENTRATION** (%) | 0.2 |
| TYPE OF APPLIED POWER | VHF |
| POWER (W/cm$^3$) | 0.003~10 |
| PRESSURE (Torr) | 0.006 |
| SUBSTRATE TEMPERATURE (°C.) FIRST/SECOND/THIRD | 150/150/150 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

(2)

| SC-EMB-G16 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 110 | 200 | | |
| n/i BUFFER LAYER | | 0.4 | 0.1 | | 110 | | | |
| MW i-LAYER | 44 | | | 45 | 165 | | | |
| p/i BUFFER LAYER | | 0.35 | 0.2 | | 120 | | | |
| RF p-LAYER | | | 0.1 | | 60 | | 10 | 2 |
| RF n-LAYER | 1.0 | | | | 30 | 270 | | |
| n/i BUFFER LAYER | | 0.4 | 0.2 | | 80 | | | |
| MW i-LAYER | 35 | | | 28 | 130 | | | |
| p/i BUFFER LAYER | | 0.4 | 0.2 | | 70 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.1 | | | 85 | | | |
| p/i BUFFER LAYER | | 0.4 | 0.25 | | 60 | | | |
| RF p-LAYER | | | 0.4 | | 60 | | 10 | 2 |

| SC-EMB-G16 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.24 | 0.5 | 330 | 100 |
| p/i BUFFER LAYER | 0.8 | | 0.08 | 280 | 20 |
| RF p-LAYER | 1.6 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| POWER DENSITY (W/cm$^3$) | 0.003 | 0.007 | 0.01 | 0.05 | 0.1 | 0.7 | 1.0 | 1.1 | 3.0 | 10 |
|---|---|---|---|---|---|---|---|---|---|---|
| CURVE FACTOR | X | Δ | ○ | ○ | ○ | ○ | ○ | ○ | Δ | X |
| OPTICAL DURABILITY | X | ○ | ○ | ○ | ○ | ○ | ○ | ○ | Δ | X |
| UNIFORMITY IN CHARACTERISTICS | X | ○ | ○ | ○ | ○ | ○ | ○ | Δ | X | X |
| SERIES-RESISTOR CHARACTERISTICS | X | Δ | ○ | ○ | ○ | ○ | ○ | Δ | X | X |
| DURABILITY | X | Δ | ○ | ○ | ○ | ○ | ○ | ○ | Δ | X |
| CHARACTERISTICS WITH REVERSE BIAS VOLTAGE APPLIED | X | Δ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS

TABLE G17

(1)

| | |
|---|---|
| $H_2$ GAS FLOW RATE (sccm) | 1850 |
| SPECIES OF SILICON COMPOUND GAS | $SiCl_2H_2$ |
| CONCENTRATION* (%) | 0.008 |
| SPECIES OF GROUP-III-ELEMENT COMPOUND GAS (DILUTION: %) | $B_2H_6/H_2$ (10%) |
| CONCENTRATION** (%) | 0.08 |
| TYPE OF APPLIED POWER | MW |
| POWER (W/cm$^3$) | 0.03~100 |
| PRESSURE (Torr) | 0.006 |
| SUBSTRATE TEMPERATURE (°C.) FIRST/SECOND/THIRD | 130/130/130 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

(2)

| SC-EMB-G17 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 120 | 200 | | |
| n/i BUFFER LAYER | | 0.4 | 0.2 | | 110 | | | |
| MW i-LAYER | 42 | | | 44 | 175 | | | |
| p/i BUFFER LAYER | | 0.35 | 0.2 | | 120 | | | |
| RF p-LAYER | | | 0.1 | | 60 | | 10 | 1.7 |
| RF n-LAYER | 1.0 | | | | 30 | 270 | | |
| n/i BUFFER LAYER | | 0.4 | 0.2 | | 80 | | | |
| MW i-LAYER | 33 | | | 28 | 165 | | | |
| p/i BUFFER LAYER | | 0.4 | 0.2 | | 70 | | | |
| RF p-LAYER | | | 0.2 | | 60 | | 10 | 1.8 |
| RF n-LAYER | 0.8 | | | | 50 | 250 | | |
| n/i BUFFER LAYER | | 0.3 | 0.2 | | 50 | | | |
| RF i-LAYER | | 2.1 | | | 100 | | | |
| p/i BUFFER LAYER | | 0.4 | 0.25 | | 60 | | | |
| RF p-LAYER | | | 0.4 | | 60 | | 10 | 1.8 |

| SC-EMB-G17 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.8 | | 0.08 | 350 | 10 |
| MW i-LAYER | 0.006 | 0.35 | 0.5 | 370 | 110 |
| p/i BUFFER LAYER | 0.8 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.24 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| POWER DENSITY (W/cm$^3$) | 0.03 | 0.07 | 0.1 | 0.5 | 1 | 7 | 10 | 11 | 30 | 100 |
|---|---|---|---|---|---|---|---|---|---|---|
| CURVE FACTOR | X | Δ | ○ | ○ | ○ | ○ | ○ | Δ | X | X |
| OPTICAL DURABILITY | X | ○ | ○ | ○ | ○ | ○ | ○ | ○ | X | X |
| UNIFORMITY IN CHARACTERISTICS | X | Δ | ○ | ○ | ○ | ○ | ○ | ○ | X | X |
| SERIES-RESISTOR CHARACTERISTICS | X | ○ | ○ | ○ | ○ | ○ | ○ | ○ | X | X |
| DURABILITY | X | Δ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS

TABLE G18

(1)

| | |
|---|---|
| $H_2$ GAS FLOW RATE (sccm) | 850 |
| SPECIES OF SILICON COMPOUND GAS | $SiH_4$ |
| CONCENTRATION* (%) | 0.07 |
| SPECIES OF GROUP-III-ELEMENT COMPOUND GAS (DILUTION: %) | $B_2H_6/H_2$ (10%) |
| CONCENTRATION** (%) | 0.2 |
| TYPE OF APPLIED POWER | RF |
| POWER ($W/cm^3$) | 0.28 |
| PRESSURE (Torr) | 1.0 |
| SUBSTRATE TEMPERATURE (°C.) | 50~520 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

(2)

| SC-EMB-G18 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 120 | 200 | | |
| n/i BUFFER LAYER | | 0.4 | 0.2 | | 110 | | | |
| MW i-LAYER | 42 | | | 43 | 175 | | | |
| p/i BUFFER LAYER | | 0.35 | 0.2 | | 120 | | | |
| RF p-LAYER | | | 0.1 | | 60 | | 10 | 1.7 |
| RF n-LAYER | 1.0 | | | | 30 | 270 | | |
| n/i BUFFER LAYER | | 0.4 | 0.2 | | 80 | | | |
| MW i-LAYER | 33 | | | 29 | 165 | | | |
| p/i BUFFER LAYER | | 0.4 | 0.2 | | 70 | | | |
| RF p-LAYER | | | 0.2 | | 60 | | 10 | 1.8 |
| RF n-LAYER | 0.8 | | | | 50 | 250 | | |
| n/i BUFFER LAYER | | 0.3 | 0.2 | | 50 | | | |
| RF i-LAYER | | 2.1 | | | 105 | | | |
| p/i BUFFER LAYER | | 0.4 | 0.25 | | 60 | | | |
| RF p-LAYER | | | 0.4 | | 60 | | 10 | 1.8 |

| SC-EMB-G18 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.8 | | 0.08 | 350 | 10 |
| MW i-LAYER | 0.006 | 0.35 | 0.5 | 370 | 110 |
| p/i BUFFER LAYER | 0.8 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.24 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| SUBSTRATE TEMPERATURE (°C.) | 50 | 75 | 100 | 150 | 200 | 300 | 400 | 420 | 450 | 520 |
|---|---|---|---|---|---|---|---|---|---|---|
| CURVE FACTOR | X | ○ | ○ | ○ | ○ | ○ | ○ | X | X | X |
| OPTICAL DURABILITY | X | Δ | ○ | ○ | ○ | ○ | ○ | ○ | X | X |
| UNIFORMITY IN CHARACTERISTICS | X | Δ | ○ | ○ | ○ | ○ | ○ | Δ | X | X |
| SERIES-RESISTOR CHARACTERISTICS | X | Δ | ○ | ○ | ○ | ○ | ○ | Δ | X | X |
| DURABILITY | X | Δ | ○ | ○ | ○ | ○ | ○ | Δ | X | X |
| CHARACTERISTICS WITH RE-VERSE BIAS VOLTAGE APPLIED | X | ○ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS

TABLE G19

(1)

| | |
|---|---|
| $H_2$ GAS FLOW RATE (sccm) | 1600 |
| SPECIES OF SILICON COMPOUND GAS | $SiCl_4$ |
| CONCENTRATION* (%) | 0.02 |
| SPECIES OF GROUP-III-ELEMENT COMPOUND GAS (DILUTION: %) | $BF_3/H_2$ (10) |
| CONCENTRATION** (%) | 0.2 |
| TYPE OF APPLIED POWER | VHF |
| POWER ($W/cm^3$) | 0.25 |
| PRESSURE (Torr) | 0.009 |
| SUBSTRATE TEMPERATURE (°C.) | 30~420 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

(2)

| SC-EMB-G19 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.4 | | | | 130 | 200 | | |
| n/i BUFFER LAYER | | 0.4 | 0.1 | | 120 | | | |
| MW i-LAYER | 45 | | | 47 | 135 | | | |
| p/i BUFFER LAYER | | 0.36 | 0.2 | | 120 | | | |
| RF p-LAYER | | | 0.1 | | 60 | | 10 | 2 |
| RF n-LAYER | 1.0 | | | | 30 | 270 | | |
| n/i BUFFER LAYER | | 0.4 | 0.2 | | 80 | | | |
| MW i-LAYER | 35 | | | 28 | 140 | | | |
| p/i BUFFER LAYER | | 0.4 | 0.2 | | 70 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.2 | | | 60 | | | |
| p/i BUFFER LAYER | | 0.4 | 0.25 | | 60 | | | |
| RF p-LAYER | | | 0.4 | | 60 | | 10 | 2 |

| SC-EMB-G19 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.1 | | 0.04 | 380 | 20 |
| n/i BUFFER LAYER | 0.9 | | 0.08 | 350 | 10 |
| MW i-LAYER | 0.006 | 0.36 | 0.5 | 370 | 110 |
| p/i BUFFER LAYER | 0.9 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.7 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| SUBSTRATE TEMPERATURE (°C.) | 30 | 40 | 50 | 100 | 200 | 250 | 300 | 320 | 350 | 420 |
|---|---|---|---|---|---|---|---|---|---|---|
| CURVE FACTOR | X | ○ | ○ | ○ | ○ | ○ | ○ | Δ | X | X |
| OPTICAL DURABILITY | X | Δ | ○ | ○ | ○ | ○ | ○ | ○ | X | X |
| UNIFORMITY IN CHARACTERISTICS | X | Δ | ○ | ○ | ○ | ○ | ○ | ○ | X | X |
| SERIES-RESISTOR CHARACTERISTICS | X | Δ | ○ | ○ | ○ | ○ | ○ | Δ | X | X |
| DURABILITY | X | X | ○ | ○ | ○ | ○ | ○ | Δ | X | X |
| CHARACTERISTICS WITH REVERSE BIAS VOLTAGE APPLIED | X | ○ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS

TABLE G20

(1)

| | |
|---|---|
| $H_2$ GAS FLOW RATE (sccm) | 0.1 ~ 1800 |
| SPECIES OF SILICON COMPOUND GAS | $SiCl_2H_2$ |
| CONCENTRATION* (%) | 0.01 |
| SPECIES OF GROUP-III-ELEMENT COMPOUND GAS (DILUTION: %) | $BF_3/H_2$ (10) |
| CONCENTRATION** (%) | 0.3 |
| TYPE OF APPLIED POWER | MW |
| POWER (W/cm$^3$) | 0.35 |
| PRESSURE (Torr) | 0.008 |
| SUBSTRATE TEMPERATURE (°C.) | 30 ~ 420 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

(2)

| SC-EMB-G20 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 110 | 200 | | |
| n/i BUFFER LAYER | | 0.4 | 0.1 | | 110 | | | |
| MW i-LAYER | 44 | | | 45 | 180 | | | |
| p/i BUFFER LAYER | | 0.35 | 0.2 | | 120 | | | |
| RF p-LAYER | | | 0.1 | | 60 | | 10 | 2 |
| RF n-LAYER | 1.0 | | | | 30 | 270 | | |
| n/i BUFFER LAYER | | 0.4 | 0.2 | | 80 | | | |
| MW i-LAYER | 35 | | | 28 | 160 | | | |
| p/i BUFFER LAYER | | 0.4 | 0.2 | | 70 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.1 | | | 110 | | | |
| p/i BUFFER LAYER | | 0.4 | 0.25 | | 60 | | | |
| RF p-LAYER | | | 0.4 | | 60 | | 10 | 2 |

| SC-EMB-G20 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.007 | 0.35 | 0.5 | 370 | 110 |
| p/i BUFFER LAYER | 0.9 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.24 | 0.5 | 330 | 100 |
| p/i BUFFER LAYER | 0.8 | | 0.08 | 280 | 20 |
| RF p-LAYER | 1.6 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| SUBSTRATE TEMPERATURE (°C.) | 30 | 40 | 50 | 100 | 200 | 250 | 300 | 320 | 350 | 420 |
|---|---|---|---|---|---|---|---|---|---|---|
| CURVE FACTOR | X | Δ | ○ | ○ | ○ | ○ | ○ | Δ | X | X |
| OPTICAL DURABILITY | X | Δ | ○ | ○ | ○ | ○ | ○ | ○ | Δ | X |
| UNIFORMITY IN CHARACTERISTICS | X | Δ | ○ | ○ | ○ | ○ | ○ | Δ | X | X |
| SERIES-RESISTOR CHARACTERISTICS | X | ○ | ○ | ○ | ○ | ○ | ○ | ○ | Δ | X |
| DURABILITY | X | ○ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS

TABLE G21

(1)

| | |
|---|---|
| $H_2$ GAS FLOW RATE (sccm) | 1200 |
| SPECIES OF SILICON COMPOUND GAS | $SiH_4/H_2$ |
| CONCENTRATION* (%) | 0.03 |
| TYPE OF APPLIED POWER | RF |
| POWER ($W/cm^3$) | 0.03 |
| PRESSURE (Torr) | 0.9 |
| SUBSTRATE TEMPERATURE (°C.) | 360 |

*: ($SiH_4$ GAS FLOW RATE)/(TOTAL $H_2$ GAS FLOW RATE)

(2)

| | |
|---|---|
| $H_2$ GAS FLOW RATE (sccm) | 950 |
| SPECIES OF SILICON COMPOUND GAS | $SiH_4/H_2$ |
| CONCENTRATION* (%) | 0.02 |
| TYPE OF APPLIED POWER | RF |
| POWER ($W/cm^3$) | 0.03 |
| PRESSURE (Torr) | 0.9 |
| SUBSTRATE TEMPERATURE (°C.) | 350 |

*: ($SiH_4$ GAS FLOW RATE)/(TOTAL $H_2$ GAS FLOW RATE)

(3)

| | |
|---|---|
| $H_2$ GAS FLOW RATE (sccm) | 700 |
| SPECIES OF SILICON COMPOUND GAS | $SiH_4$ |
| CONCENTRATION* (%) | 0.04 |
| TYPE OF APPLIED POWER | RF |
| POWER ($W/cm^3$) | 0.03 |
| PRESSURE (Torr) | 0.7 |
| SUBSTRATE TEMPERATURE (°C.) | 350 |

*: (SILICON COMPOUND GAS FLOW RATE)/($H_2$ GAS FLOW RATE)

(4)

| | |
|---|---|
| $H_2$ GAS FLOW RATE (sccm) | 900 |
| SPECIES OF SILICON COMPOUND GAS | $SiH_4$ |
| CONCENTRATION* (%) | 0.04 |
| TYPE OF APPLIED POWER | RF |
| POWER ($W/cm^3$) | 0.03 |
| PRESSURE (Torr) | 0.6 |
| SUBSTRATE TEMPERATURE (°C.) | 330 |

*: (SILICON COMPOUND GAS FLOW RATE)/($H_2$ GAS FLOW RATE)

(5)

| | |
|---|---|
| $H_2$ GAS FLOW RATE (sccm) | 1000 |
| SPECIES OF SILICON COMPOUND GAS | $SiH_4$ |
| CONCENTRATION* (%) | 0.03 |
| SPECIES OF GROUP-III-ELEMENT COMPOUND GAS (DILUTION: %) | $B_2H_6/H_2$ (10%) |
| CONCENTRATION** (%) | 0.6 |
| TYPE OF APPLIED POWER | RF |
| POWER ($W/cm^3$) | 0.03 |
| PRESSURE (Torr) | 0.6 |
| SUBSTRATE TEMPERATURE (°C.) FIRST/SECOND/THIRD | 300 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

(6)

| | |
|---|---|
| $H_2$ GAS FLOW RATE (sccm) | 1200 |
| SPECIES OF SILICON COMPOUND GAS | $SiH_4/H_2$ |
| CONCENTRATION* (%) | 0.04 |
| TYPE OF APPLIED POWER | RF |
| POWER ($W/cm^3$) | 0.03 |
| PRESSURE (Torr) | 0.8 |
| SUBSTRATE TEMPERATURE (°C.) | 300 |

*: ($SiH_4$ GAS FLOW RATE)/($H_2$ GAS FLOW RATE)

(7)

| | |
|---|---|
| $H_2$ GAS FLOW RATE (sccm) | 1100 |
| SPECIES OF SILICON COMPOUND GAS | $SiH_4$ |

TABLE G21-continued

| | |
|---|---|
| CONCENTRATION* (%) | 0.03 |
| TYPE OF APPLIED POWER | RF |
| POWER ($W/cm^3$) | 0.03 |
| PRESSURE (Torr) | 0.7 |
| SUBSTRATE TEMPERATURE (°C.) | 300 |

*: (SILICON COMPOUND GAS FLOW RATE)/(TOTAL $H_2$ GAS FLOW RATE)

(8)

| | |
|---|---|
| $H_2$ GAS FLOW RATE (sccm) | 1200 |
| SPECIES OF SILICON COMPOUND GAS | $SiH_4$ |
| CONCENTRATION* (%) | 0.03 |
| TYPE OF APPLIED POWER | RF |
| POWER ($W/cm^3$) | 0.04 |
| PRESSURE (Torr) | 0.6 |
| SUBSTRATE TEMPERATURE (°C.) | 280 |

*: (SILICON COMPOUND GAS FLOW RATE)/($H_2$ GAS FLOW RATE)

(9)

| | |
|---|---|
| $H_2$ GAS FLOW RATE (sccm) | 1500 |
| SPECIES OF SILICON COMPOUND GAS | $SiH_4$ |
| CONCENTRATION* (%) | 0.03 |
| SPECIES OF GROUP-III-ELEMENT COMPOUND GAS (DILUTION: %) | $B_2H_6/H_2$ (10%) |
| CONCENTRATION** (%) | 1.0 |
| TYPE OF APPLIED POWER | RF |
| POWER ($W/cm^3$) | 0.02 |
| PRESSURE (Torr) | 0.5 |
| SUBSTRATE TEMPERATURE (°C.) | 260 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

(10)

| | |
|---|---|
| $H_2$ GAS FLOW RATE (sccm) | 850 |
| SPECIES OF SILICON COMPOUND GAS | $SiH_4/H_2$ |
| CONCENTRATION* (%) | 0.03 |
| TYPE OF APPLIED POWER | RF |
| POWER ($W/cm^3$) | 0.04 |
| PRESSURE (Torr) | 0.9 |
| SUBSTRATE TEMPERATURE (°C.) | 230 |

*: ($SiH_4$ GAS RATE)/($H_2$ GAS FLOW RATE)

(11)

| | |
|---|---|
| $H_2$ GAS FLOW RATE (sccm) | 1000 |
| SPECIES OF SILICON COMPOUND GAS | $SiH_4$ |
| CONCENTRATION* (%) | 0.03 |
| TYPE OF APPLIED POWER | RF |
| POWER ($W/cm^3$) | 0.03 |
| PRESSURE (Torr) | 0.7 |
| SUBSTRATE TEMPERATURE (°C.) | 230 |

*: (SILICON COMPOUND GAS FLOW RATE)/($H_2$ GAS FLOW RATE)

(12)

| | |
|---|---|
| $H_2$ GAS FLOW RATE (sccm) | 1200 |
| SPECIES OF SILICON COMPOUND GAS | $SiH_4$ |
| CONCENTRATION* (%) | 0.03 |
| TYPE OF APPLIED POWER | RF |
| POWER ($W/cm^3$) | 0.04 |
| PRESSURE (Torr) | 0.8 |
| SUBSTRATE TEMPERATURE (°C.) | 200 |

*: (SILICON COMPOUND GAS FLOW RATE)/($H_2$ GAS FLOW RATE)

(13)

| | |
|---|---|
| $H_2$ GAS FLOW RATE (sccm) | 1400 |
| SPECIES OF SILICON COMPOUND GAS | $SiH_4$ |
| CONCENTRATION* (%) | 0.03 |
| SPECIES OF GROUP-III-ELEMENT (DILUTION: %) | $B_2H_6/H_2$ (10%) |
| CONCENTRATION** (%) | 2.0 |
| TYPE OF APPLIED POWER | RF |
| POWER ($W/cm^3$) | 0.02 |
| PRESSURE (Torr) | 0.7 |

TABLE G21-continued

| | |
|---|---|
| SUBSTRATE TEMPERATURE (°C.) FIRST/SECOND/THIRD | 170 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

(14)

| SC-EMB-G21 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 150 | 200 | | |
| n/i BUFFER LAYER | | 0.4 | 0.2 | | 110 | | | |
| MW i-LAYER | 43 | | | 43 | 150 | | | |
| p/i BUFFER LAYER | | 0.4 | 0.2 | | 120 | | | |
| RF p-LAYER | | | 0.1 | | 60 | | 10 | 1.7 |
| RF n-LAYER | 0.9 | | | | 20 | 280 | | |
| n/i BUFFER LAYER | | 0.4 | 0.2 | | 80 | | | |
| MW i-LAYER | 32 | | | 27 | 120 | | | |
| p/i BUFFER LAYER | | 0.4 | 0.2 | | 70 | | | |
| RF p-LAYER | | | 0.2 | | 60 | | 10 | 1.8 |
| RF n-LAYER | 0.8 | | | | 50 | 250 | | |
| n/i BUFFER LAYER | | 0.4 | 0.2 | | 50 | | | |
| RF i-LAYER | | 2.1 | | | 65 | | | |
| p/i BUFFER LAYER | | 0.4 | 0.25 | | 60 | | | |
| RF p-LAYER | | | 0.4 | | 60 | | 10 | 1.8 |

| SC-EMB-G21 | PRESSURE Torr | MW POWER W/cm³ | RF POWER W/cm³ | SUBSTRATE TEMPERA-TURE °C. | LAYER THICKNESS nm |
|---|---|---|---|---|---|
| RF n-LAYER | 1.1 | | 0.04 | 380 | 20 |
| n/i BUFFER LAYER | 0.9 | | 0.08 | 350 | 10 |
| MW i-LAYER | 0.006 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.5 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.1 | | 0.06 | 200 | 12 |
| RF p-LAYER | 1.4 | | 0.07 | 170 | 10 |

TABLE H1

(1)

| | |
|---|---|
| $H_2$ GAS FLOW RATE (sccm) | 1200 |
| SPECIES OF SILICON COMPOUND GAS | $SiH_4$ |
| CONCENTRATION* (%) | 0.01 |
| TYPE OF APPLIED POWER | RF |
| POWER (W/cm³) | 0.05 |
| PRESSURE (Torr) | 0.7 |
| SUBSTRATE TEMPERATURE (°C.) | 250 |

*: (SILICON COMPOUND GAS FLOW RATE)/($H_2$ GAS FLOW RATE)

(2)

| SC-EMB-H1 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.4 | | | | 90 | 200 | | |
| n/i BUFFER LAYER | | 2.5 | | | 95 | | | |
| MW i-LAYER | 44 | | | 43 | 170 | | | |
| p/i BUFFER LAYER | | 3 | | | 75 | | | |
| RF p-LAYER | | | 0.3 | | 60 | | 10 | 2 |
| RF n-LAYER | 1.5 | | | | 80 | 250 | | |
| n/i BUFFER LAYER | | 0.4 | 0.2 | | 90 | | | |
| RF i-LAYER | | 3 | | | 85 | | | |

TABLE H1-continued

| | | | | | | | | |
|---|---|---|---|---|---|---|---|---|
| p/i BUFFER LAYER | | 0.4 | 0.3 | | 65 | | | |
| RF p-LAYER | | | 0.3 | | 70 | | 10 | 2 |

| SC-EMB-H1 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.1 | | 0.05 | 380 | 20 |
| n/i BUFFER LAYER | 0.8 | | 0.08 | 360 | 10 |
| MW i-LAYER | 0.005 | 0.25 | 0.60 | 380 | 150 |
| p/i BUFFER LAYER | 0.7 | | 0.07 | 250 | 20 |
| RF p-LAYER | 1.7 | | 0.07 | 250 | 10 |
| RF n-LAYER | 1.1 | | 0.04 | 250 | 10 |
| n/i BUFFER LAYER | 1.0 | | 0.06 | 250 | 10 |
| RF i-LAYER | 0.5 | | 0.07 | 200 | 110 |
| p/i BUFFER LAYER | 1.1 | | 0.06 | 200 | 15 |
| RF p-LAYER | 1.7 | | 0.07 | 170 | 10 |

TABLE H2

(1)

| | |
|---|---|
| $H_2$ GAS FLOW RATE (sccm) | 1000 |
| SPECIES OF SILICON COMPOUND GAS | $Si_2H_6$ |
| CONCENTRATION* (%) | 0.03 |
| TYPE OF APPLIED POWER | VHF |
| POWER (W/cm$^3$) | 0.08 |
| PRESSURE (Torr) | 0.013 |
| SUBSTRATE TEMPERATURE (°C.) | 250 |

*: (SILICON COMPOUND GAS FLOW RATE)/($H_2$ GAS FLOW RATE)

(2)

| SC-EMB-H2 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.2 | | | | 90 | 200 | | |
| n/i BUFFER LAYER | | 2.5 | | | 90 | | | |
| MW i-LAYER | 45 | | | 42 | 180 | | | |
| p/i BUFFER LAYER | | 3 | | | 85 | | | |
| RF p-LAYER | | | 0.3 | | 60 | | 10 | 2 |
| RF n-LAYER | 1.5 | | | | 80 | 250 | | |
| n/i BUFFER LAYER | | 0.4 | 0.2 | | 90 | | | |
| RF i-LAYER | | 3 | | | 85 | | | |
| p/i BUFFER LAYER | | 0.4 | 0.3 | | 65 | | | |
| RF p-LAYER | | | 0.3 | | 70 | | 10 | 2 |

| SC-EMB-H2 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.1 | | 0.05 | 380 | 20 |
| n/i BUFFER LAYER | 0.8 | | 0.08 | 360 | 10 |
| MW i-LAYER | 0.005 | 0.25 | 0.60 | 380 | 150 |
| p/i BUFFER LAYER | 0.7 | | 0.07 | 250 | 20 |
| RF p-LAYER | 1.7 | | 0.07 | 250 | 10 |
| RF n-LAYER | 1.1 | | 0.04 | 250 | 10 |
| n/i BUFFER LAYER | 1.0 | | 0.06 | 250 | 10 |
| RF i-LAYER | 0.5 | | 0.07 | 200 | 110 |
| p/i BUFFER LAYER | 1.1 | | 0.06 | 200 | 15 |
| RF p-LAYER | 1.7 | | 0.07 | 170 | 10 |

TABLE H3

(1)

| | |
|---|---|
| $H_2$ GAS FLOW RATE (sccm) | 1000 |
| SPECIES OF SILICON COMPOUND GAS | $SiCl_2H_2$/He |
| CONCENTRATION* (%) | 0.03 |
| TYPE OF APPLIED POWER | MW |
| POWER (W/cm$^3$) | 0.14 |
| PRESSURE (Torr) | 0.008 |
| SUBSTRATE TEMPERATURE (°C.) | 300 |

*: ($SiCl_2H_2$ GAS FLOW RATE)/(TOTAL $H_2$ GAS FLOW RATE)

(2)

| | |
|---|---|
| $H_2$ GAS FLOW RATE (sccm) | 1200 |
| SPECIES OF SILICON COMPOUND GAS | $SiH_4/H_2$ |
| CONCENTRATION* (%) | 0.03 |
| TYPE OF APPLIED POWER | RF |
| POWER (W/cm$^3$) | 0.03 |
| PRESSURE (Torr) | 0.7 |
| SUBSTRATE TEMPERATURE (°C.) | 250 |

*: ($SiH_4/H_2$ GAS FLOW RATE)/(TOTAL $H_2$ GAS FLOW RATE)

(3)

| SC-EMB-H3 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 155 | 200 | | |
| n/i BUFFER LAYER | | 3.5 | | | 125 | | | |
| MW i-LAYER | 49 | | | 51 | 160 | | | |
| p/i BUFFER LAYER | | 3.5 | | | 110 | | | |
| RF p-LAYER | | | 0.1 | | 70 | | 10 | 2 |
| RF n-LAYER | 1.1 | | | | 50 | 250 | | |
| n/i BUFFER LAYER | | 3.5 | | | 80 | | | |
| MW i-LAYER | 41 | | | 37 | 155 | | | |
| p/i BUFFER LAYER | | 3.5 | | | 80 | | | |
| RF p-LAYER | | | 0.2 | | 60 | | 10 | 2 |
| RF n-LAYER | 0.8 | | | | 50 | 250 | | |
| n/i BUFFER LAYER | | 0.4 | 0.2 | | 55 | | | |
| RF i-LAYER | | 2 | | | 80 | | | |
| p/i BUFFER LAYER | | 0.4 | 0.25 | | 55 | | | |
| RF p-LAYER | | | 0.3 | | 60 | | 10 | 2 |

| SC-EMB-H3 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.3 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.25 | | 0.06 | 200 | 12 |
| RF p-LAYER | 1.6 | | 0.07 | 170 | 10 |

TABLE H4

(1)

| | |
|---|---|
| $H_2$ GAS FLOW RATE (sccm) | 0.1 ~ 2500 |
| SPECIES OF SILICON COMPOUND GAS | $SiH_4$ |
| CONCENTRATION* (%) | 0.03 |
| TYPE OF APPLIED POWER | RF |
| POWER ($W/cm^3$) | 0.3 |
| PRESSURE (Torr) | 0.6 |
| SUBSTRATE TEMPERATURE (°C.) FIRST/SECOND | 270/230 |

*: (SILICON COMPOUND GAS FLOW RATE)/($H_2$ GAS FLOW RATE)

(2)

| SC-EMB-H4 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.4 | | | | 100 | 200 | | |
| n/i BUFFER LAYER | | 3 | | | 100 | | | |
| MW i-LAYER | 50 | | | 48 | 145 | | | |
| p/i BUFFER LAYER | | 3 | | | 100 | | | |
| RF p-LAYER | | | 0.1 | | 60 | | 10 | 2 |
| RF n-LAYER | 1.1 | | | | 50 | 250 | | |
| n/i BUFFER LAYER | | 3 | | | 70 | | | |
| MW i-LAYER | 40 | | | 34 | 150 | | | |
| p/i BUFFER LAYER | | 3 | | | 80 | | | |
| RF p-LAYER | | | 0.2 | | 60 | | 10 | 2 |
| RF n-LAYER | 0.8 | | | | 50 | 250 | | |
| n/i BUFFER LAYER | | 0.4 | 0.2 | | 50 | | | |
| RF i-LAYER | | 2 | | | 75 | | | |
| p/i BUFFER LAYER | | 0.4 | 0.25 | | 50 | | | |
| RF p-LAYER | | | 0.3 | | 60 | | 10 | 2 |

| SC-EMB-H4 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.3 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| $H_2$ GAS FLOW RATE* (sccm) | 0.1 | 0.5 | 0.8 | 1 | 10 | 100 | 1000 | 2000 | 2030 | 2100 | 2500 |
|---|---|---|---|---|---|---|---|---|---|---|---|
| CURVE FACTOR | X | Δ | ○ | ○ | ○ | ○ | ○ | ○ | ○ | Δ | X |
| OPTICAL DURABILITY | X | Δ | ○ | ○ | ○ | ○ | ○ | ○ | Δ | X | X |
| UNIFORMITY IN CHARACTERISTICS | X | Δ | ○ | ○ | ○ | ○ | ○ | ○ | Δ | X | X |
| ADHESION | X | X | Δ | ○ | ○ | ○ | ○ | ○ | ○ | X | X |
| DURABILITY | X | Δ | Δ | ○ | ○ | ○ | ○ | ○ | Δ | X | X |
| CHARACTERISTICS WITH REVERSE BIAS VOLTAGE APPLIED | X | Δ | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
*: CONCENTRATION OF SILICON COMPOUND GAS

TABLE H4-continued

| OTHER CONDITIONS | |
|---|---|
| SPECIES OF SILICON COMPOUND GAS: | $SiH_4$ |
| CONCENTRATION OF SILICON COMPOUND GAS (%): | 0.03 |
| APPLIED POWER: | RF |
| POWER DENSITY ($W/cm^3$): | 0.3 |
| PRESSURE (Torr): | 0.6 |
| SUBSTRATE TEMPERATURE (°C.) FIRST/SECOND: | 270/230 |

TABLE H5

(1)

| | |
|---|---|
| $H_2$ GAS FLOW RATE (sccm) | 0.1~2500 |
| SPECIES OF SILICON COMPOUND GAS | $SiH_4$ |
| CONCENTRATION* (%) | 0.04 |
| TYPE OF APPLIED POWER | VHF |
| POWER ($W/cm^3$) | 0.23 |
| PRESSURE (Torr) | 0.003 |
| SUBSTRATE TEMPERATURE (°C.) FIRST/SECOND | 285/230 |

*: (SILICON COMPOUND GAS FLOW RATE)/($H_2$ GAS FLOW RATE)

(2)

| SC-EMB-H5 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 120 | 200 | | |
| n/i BUFFER LAYER | | 3.5 | | | 100 | | | |
| MW i-LAYER | 48 | | | 48 | 170 | | | |
| p/i BUFFER LAYER | | 3.5 | | | 100 | | | |
| RF p-LAYER | | | 0.1 | | 60 | | 10 | 2 |
| RF n-LAYER | 1.2 | | | | 50 | 260 | | |
| n/i BUFFER LAYER | | 3 | | | 80 | | | |
| MW i-LAYER | 40 | | | 35 | 140 | | | |
| p/i BUFFER LAYER | | 3 | | | 80 | | | |
| RF p-LAYER | | | 0.2 | | 60 | | 10 | 2 |
| RF n-LAYER | 0.8 | | | | 50 | 250 | | |
| n/i BUFFER LAYER | | 0.4 | 0.2 | | 50 | | | |
| RF i-LAYER | | 2 | | | 65 | | | |
| p/i BUFFER LAYER | | 0.4 | 0.25 | | 50 | | | |
| RF p-LAYER | | | 0.3 | | 60 | | 10 | 2 |

| SC-EMB-H5 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| $H_2$ GAS FLOW RATE* (sccm) | 0.1 | 0.5 | 0.8 | 1 | 10 | 100 | 1000 | 2000 | 2030 | 2100 | 2500 |
|---|---|---|---|---|---|---|---|---|---|---|---|
| CURVE FACTOR | X | X | Δ | ○ | ○ | ○ | ○ | ○ | ○ | Δ | X |
| OPTICAL DURABILITY | X | Δ | ○ | ○ | ○ | ○ | ○ | ○ | ○ | X | X |
| UNIFORMITY IN CHARACTERISTICS | X | Δ | ○ | ○ | ○ | ○ | ○ | ○ | ○ | Δ | X |
| ADHESION | X | X | Δ | ○ | ○ | ○ | ○ | ○ | Δ | X | X |
| DURABILITY | X | Δ | ○ | ○ | ○ | ○ | ○ | ○ | Δ | X | X |
| CHARACTERISTICS WITH REVERSE BIAS VOLTAGE | X | Δ | ○ | ○ | ○ | ○ | ○ | ○ | ○ | Δ | X |

TABLE H5-continued

| APPLIED |
| --- |

○: EXCELLENT FOR PRACTICAL USE
Δ: GOOD FOR PRACTICAL USE
X: NO GOOD FOR SOME APPLICATIONS
*: CONCENTRATION OF SILICON COMPOUND GAS
OTHER CONDITIONS

| | |
| --- | --- |
| SPECIES OF SILICON COMPOUND GAS: | $SiH_4$ |
| CONCENTRATION OF SILICON COMPOUND GAS (%): | 0.04 |
| APPLIED POWER: | VHF |
| POWER DENSITY ($W/cm^3$): | 0.23 |
| PRESSURE (Torr): | 0.003 |
| SUBSTRATE TEMPERATURE (°C.) FIRST/SECOND: | 285/230 |

TABLE H6

(1)

| | |
| --- | --- |
| $H_2$ GAS FLOW RATE (sccm) | 1300 |
| SPECIES OF SILICON COMPOUND GAS | $SiH_4$ |
| CONCENTRATION* (%) | 0.0003~0.14 |
| TYPE OF APPLIED POWER | RF |
| POWER ($W/cm^3$) | 0.08 |
| PRESSURE (Torr) | 0.6 |
| SUBSTRATE TEMPERATURE (°C.) FIRST/SECOND | 260/260 |

*: (SILICON COMPOUND GAS FLOW RATE)/($H_2$ GAS FLOW RATE)

(2)

| SC-EMB-H6 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
| --- | --- | --- | --- | --- | --- | --- | --- | --- |
| RF n-LAYER | 1.5 | | | | 100 | 200 | | |
| n/i BUFFER LAYER | | 3.6 | | | 100 | | | |
| MW i-LAYER | 47 | | | 48 | 175 | | | |
| p/i BUFFER LAYER | | 3.5 | | | 110 | | | |
| RF p-LAYER | | | 0.1 | | 60 | | 12 | 2 |
| RF n-LAYER | 1.1 | | | | 50 | 250 | | |
| n/i BUFFER LAYER | | 3 | | | 80 | | | |
| MW i-LAYER | 39 | | | 34 | 150 | | | |
| p/i BUFFER LAYER | | 3 | | | 80 | | | |
| RF p-LAYER | | | 0.2 | | 60 | | 11 | 2 |
| RF n-LAYER | 0.8 | | | | 50 | 250 | | |
| n/i BUFFER LAYER | | 0.4 | 0.2 | | 50 | | | |
| RF i-LAYER | | 2 | | | 85 | | | |
| p/i BUFFER LAYER | | 0.4 | 0.25 | | 50 | | | |
| RF p-LAYER | | | 0.3 | | 60 | | 10 | 2 |

| SC-EMB-H6 | PRESSURE Torr | MW POWER $W/cm^3$ | RF POWER $W/cm^3$ | SUBSTRATE TEMPERA-TURE °C. | LAYER THICKNESS nm |
| --- | --- | --- | --- | --- | --- |
| RF n-LAYER | 1.2 | | 0.04 | 380 | 20 |
| n/i BUFFER LAYER | 0.9 | | 0.08 | 350 | 10 |
| MW i-LAYER | 0.006 | 0.34 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.24 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| CONCENTRATION* (%) | 0.0003 | 0.0008 | 0.001 | 0.005 | 0.01 | 0.08 | 0.1 | 0.105 | 0.12 | 0.14 |
| --- | --- | --- | --- | --- | --- | --- | --- | --- | --- | --- |
| CURVE FACTOR | X | Δ | ○ | ○ | ○ | ○ | ○ | ○ | Δ | X |
| OPTICAL DURABILITY | Δ | ○ | ○ | ○ | ○ | ○ | ○ | Δ | X | X |

TABLE H6-continued

| | | | | | | | | | | |
|---|---|---|---|---|---|---|---|---|---|---|
| UNIFORMITY IN CHARACTERISTICS | X | Δ | ○ | ○ | ○ | ○ | ○ | Δ | X | X |
| ADHESION | X | Δ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
*: CONCENTRATION OF SILICON COMPOUND GAS MIXED WITH $H_2$ GAS TO $H_2$ GAS

OTHER CONDITIONS

| | |
|---|---|
| FLOW RATE OF $H_2$ GAS CONTAINING SILICON COMPOUND GAS (sccm): | 1300 |
| SPECIES OF SILICON COMPOUND GAS: | $SiH_4$ |
| APPLIED POWER: | RF |
| POWER DENSITY (W/cm$^3$): | 0.08 |
| PRESSURE (Torr): | 0.6 |
| SUBSTRATE TEMPERATURE (°C.) FIRST/SECOND: | 260/260 |

TABLE H7

(1)

| | |
|---|---|
| $H_2$ GAS FLOW RATE (sccm) | 1250 |
| SPECIES OF SILICON COMPOUND GAS | $SiH_4$ |
| CONCENTRATION* (%) | 0.0003~0.14 |
| TYPE OF APPLIED POWER | VHF |
| POWER (W/cm$^3$) | 0.10 |
| PRESSURE (Torr) | 0.4 |
| SUBSTRATE TEMPERATURE (°C.) FIRST/SECOND | 270/230 |

*: (SILICON COMPOUND GAS FLOW RATE)/($H_2$ GAS FLOW RATE)

(2)

| SC-EMB-H7 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.8 | | | | 160 | 200 | | |
| n/i BUFFER LAYER | | 3.5 | | | 100 | | | |
| MW i-LAYER | 47 | | | 49 | 175 | | | |
| p/i BUFFER LAYER | | 3.5 | | | 100 | | | |
| RF p-LAYER | | | 0.1 | | 60 | | 12 | 2 |
| RF n-LAYER | 1.1 | | | | 50 | 260 | | |
| n/i BUFFER LAYER | | 3 | | | 80 | | | |
| MW i-LAYER | 35 | | | 34 | 125 | | | |
| p/i BUFFER LAYER | | 2.8 | | | 80 | | | |
| RF p-LAYER | | | 0.2 | | 60 | | 11 | 2 |
| RF n-LAYER | 0.8 | | | | 60 | 240 | | |
| n/i BUFFER LAYER | | 0.4 | 0.2 | | 50 | | | |
| RF i-LAYER | | 2.5 | | | 100 | | | |
| p/i BUFFER LAYER | | 0.4 | 0.25 | | 50 | | | |
| RF p-LAYER | | | 0.3 | | 60 | | 10 | 2 |

| SC-EMB-H7 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.15 | | 0.04 | 380 | 20 |
| n/i BUFFER LAYER | 0.9 | | 0.08 | 350 | 10 |
| MW i-LAYER | 0.006 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

TABLE H7-continued

| (3) | | | | | | | | | | |
|---|---|---|---|---|---|---|---|---|---|---|
| CONCENTRATION* (%) | 0.0003 | 0.0008 | 0.001 | 0.005 | 0.01 | 0.08 | 0.1 | 0.105 | 0.12 | 0.14 |
| CURVE FACTOR | X | Δ | ○ | ○ | ○ | ○ | ○ | ○ | X | X |
| OPTICAL DURABILITY | Δ | ○ | ○ | ○ | ○ | ○ | ○ | Δ | X | X |
| UNIFORMITY IN CHARACTERISTICS | X | Δ | ○ | ○ | ○ | ○ | ○ | Δ | X | X |
| ADHESION | X | Δ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
*: CONCENTRATION OF SILICON COMPOUND GAS MIXED WITH $H_2$ GAS TO $H_2$ GAS

OTHER CONDITIONS

| | |
|---|---|
| FLOW RATE OF $H_2$ GAS CONTAINING SILICON COMPOUND GAS (sccm): | 1250 |
| SPECIES OF SILICON COMPOUND GAS: | $SiH_4$ |
| APPLIED POWER: | VHF |
| POWER DENSITY (W/cm$^3$): | 0.10 |
| PRESSURE (Torr): | 0.04 |
| SUBSTRATE TEMPERATURE (°C.) FIRST/SECOND: | 270/230 |

TABLE H8

(1)

| | |
|---|---|
| $H_2$ GAS FLOW RATE (sccm) | 1200 |
| SPECIES OF SILICON COMPOUND GAS | $SiH_4$ |
| CONCENTRATION* (%) | 0.0003~0.14 |
| TYPE OF APPLIED POWER | MW |
| POWER (W/cm$^3$) | 0.10 |
| PRESSURE (Torr) | 0.006 |
| SUBSTRATE TEMPERATURE (°C.) FIRST/SECOND | 230/230 |

*: (SILICON COMPOUND GAS FLOW RATE)/($H_2$ GAS FLOW RATE)

(2)

| SC-EMB-H8 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 140 | 200 | | |
| n/i BUFFER LAYER | | 3.6 | | | 100 | | | |
| MW i-LAYER | 47 | | | 51 | 145 | | | |
| p/i BUFFER LAYER | | 3.5 | | | 100 | | | |
| RF p-LAYER | | | 0.1 | | 60 | | 12 | 2 |
| RF n-LAYER | 1.1 | | | | 50 | 270 | | |
| n/i BUFFER LAYER | | 3 | | | 80 | | | |
| MW i-LAYER | 35 | | | 36 | 125 | | | |
| p/i BUFFER LAYER | | 3 | | | 80 | | | |
| RF p-LAYER | | | 0.2 | | 60 | | 11 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 95 | | | |
| p/i BUFFER LAYER | | 0.4 | 0.25 | | 50 | | | |
| RF p-LAYER | | | 0.3 | | 60 | | 10 | 2 |

| SC-EMB-H8 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.35 | 0.5 | 370 | 110 |
| p/i BUFFER LAYER | 0.9 | | 0.08 | 330 | 20 |
| RF p-LAYER | 1.5 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |

TABLE H8-continued

| | | | | |
|---|---|---|---|---|
| RF n-LAYER | 1.05 | 0.04 | 230 | 10 |
| n/i BUFFER LAYER | 1.3 | 0.06 | 230 | 10 |
| RF i-LAYER | 0.75 | 0.07 | 200 | 87 |
| p/i BUFFER LAYER | 1.2 | 0.06 | 200 | 11 |
| RF p-LAYER | 1.4 | 0.07 | 170 | 10 |

(3)

| CONCENTRATION* (%) | 0.0003 | 0.0008 | 0.001 | 0.005 | 0.01 | 0.08 | 0.1 | 0.105 | 0.12 | 0.14 |
|---|---|---|---|---|---|---|---|---|---|---|
| CURVE FACTOR | X | ○ | ○ | ○ | ○ | ○ | ○ | ○ | Δ | X |
| OPTICAL DURABILITY | X | Δ | ○ | ○ | ○ | ○ | ○ | Δ | X | X |
| UNIFORMITY IN CHARACTERISTICS | X | Δ | ○ | ○ | ○ | ○ | ○ | Δ | X | X |
| ADHESION | X | Δ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
*: CONCENTRATION OF SILICON COMPOUND GAS MIXED WITH $H_2$ GAS TO $H_2$ GAS

OTHER CONDITIONS

| | |
|---|---|
| FLOW RATE OF $H_2$ GAS CONTAINING SILICON COMPOUND GAS (sccm): | 1200 |
| SPECIES OF SILICON COMPOUND GAS: | $SiH_4$ |
| APPLIED POWER: | MW |
| POWER DENSITY (W/cm$^3$): | 0.10 |
| PRESSURE (Torr): | 0.006 |
| SUBSTRATE TEMPERATURE (°C.) FIRST/SECOND: | 230/230 |

TABLE H9

(1)

| | |
|---|---|
| $H_2$ GAS FLOW RATE (sccm) | 800 |
| SPECIES OF SILICON COMPOUND GAS | $Si_2H_6$ |
| CONCENTRATION* (%) | 0.03 |
| TYPE OF APPLIED POWER | RF |
| POWER (W/cm$^3$) | 0.4 |
| PRESSURE (Torr) | 0.01~100 |
| SUBSTRATE TEMPERATURE (°C.) FIRST/SECOND | 280/230 |

*: (SILICON COMPOUND GAS FLOW RATE)/($H_2$ GAS FLOW RATE)

(2)

| SC-EMB-H9 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 150 | 210 | | |
| n/i BUFFER LAYER | | 3.5 | | | 100 | | | |
| MW i-LAYER | 50 | | | 51 | 115 | | | |
| p/i BUFFER LAYER | | 3.5 | | | 100 | | | |
| RF p-LAYER | | | 0.1 | | 60 | | 12 | 2 |
| RF n-LAYER | 1.1 | | | | 50 | 270 | | |
| n/i BUFFER LAYER | | 3 | | | 80 | | | |
| MW i-LAYER | 34 | | | 36 | 110 | | | |
| p/i BUFFER LAYER | | 0.5 | 0.3 | | 60 | | | |
| RF p-LAYER | | | 0.2 | | 60 | | 11 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 85 | | | |
| p/i BUFFER LAYER | | 0.4 | 0.25 | | 50 | | | |
| RF p-LAYER | | | 0.3 | | 60 | | 10 | 2 |

| SC-EMB-H9 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.8 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |

TABLE H9-continued

| | | | | | |
|---|---|---|---|---|---|
| RF p-LAYER | 1.6 | | 0.07 | 300 | 10 |
| RF n-LAYER | 1.1 | | 0.04 | 300 | 10 |
| n/i BUFFER LAYER | 0.8 | | 0.08 | 300 | 10 |
| MW i-LAYER | 0.006 | 0.25 | 0.5 | 330 | 100 |
| p/i BUFFER LAYER | 0.7 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.7 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| PRESSURE (Torr) | 0.01 | 0.03 | 0.05 | 1 | 3 | 5 | 10 | 11 | 20 | 100 |
|---|---|---|---|---|---|---|---|---|---|---|
| CURVE FACTOR | X | ○ | ○ | ○ | ○ | ○ | ○ | Δ | X | X |
| OPTICAL DURABILITY | X | Δ | ○ | ○ | ○ | ○ | ○ | ○ | Δ | X |
| UNIFORMITY IN CHARACTERISTICS | X | Δ | ○ | ○ | ○ | ○ | ○ | Δ | X | X |
| ADHESION | X | Δ | ○ | ○ | ○ | ○ | ○ | ○ | X | X |
| DURABILITY | X | Δ | ○ | ○ | ○ | ○ | ○ | Δ | X | X |
| CHARACTERISTICS WITH REVERSE BIAS VOLTAGE APPLIED | X | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
OTHER CONDITIONS

| | |
|---|---|
| FLOW RATE OF $H_2$ GAS CONTAINING SILICON COMPOUND GAS (sccm): | 800 |
| SPECIES OF SILICON COMPOUND GAS: | $Si_2H_6$ |
| CONCENTRATION OF SILICON COMPOUNG GAS TO $H_2$ GAS (%): | 0.03 |
| APPLIED POWER: | RF |
| POWER DENSITY (W/cm$^3$): | 0.4 |
| SUBSTRATE TEMPERATURE (°C.) FIRST/SECOND: | 280/230 |

TABLE H10

(1)

| | |
|---|---|
| $H_2$ GAS FLOW RATE (sccm) | 1250 |
| SPECIES OF SILICON COMPOUND GAS | $Si_2H_6$ |
| CONCENTRATION* (%) | 0.04 |
| TYPE OF APPLIED POWER | VHF |
| POWER (W/cm$^3$) | 0.015 |
| PRESSURE (mTorr) | 0.03~10000 |
| SUBSTRATE TEMPERATURE (°C.) FIRST/SECOND | 280/230 |

*: (SILICON COMPOUND GAS FLOW RATE)/($H_2$ GAS FLOW RATE)

(2)

| SC-EMB-H10 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.4 | | | | 140 | 200 | | |
| n/i BUFFER LAYER | | 3.5 | | | 100 | | | |
| MW i-LAYER | 49 | | | 52 | 160 | | | |
| p/i BUFFER LAYER | | 3.5 | | | 100 | | | |
| RF p-LAYER | | | 0.1 | | 60 | | 11 | 2 |
| RF n-LAYER | 1.1 | | | | 50 | 270 | | |
| n/i BUFFER LAYER | | 3 | | | 80 | | | |
| MW i-LAYER | 34 | | | 36 | 130 | | | |
| p/i BUFFER LAYER | | 0.4 | 0.2 | | 60 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 65 | | | |
| p/i BUFFER LAYER | | 0.4 | 0.25 | | 50 | | | |
| RF p-LAYER | | | 0.3 | | 60 | | 10 | 2 |

TABLE H10-continued

| SC-EMB-H10 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| PRESSURE (Torr) | 0.03 | 0.08 | 0.1 | 1 | 100 | 500 | 1000 | 1100 | 2000 | 10000 |
|---|---|---|---|---|---|---|---|---|---|---|
| CURVE FACTOR | X | Δ | ○ | ○ | ○ | ○ | ○ | ○ | Δ | X |
| OPTICAL DURABILITY | Δ | ○ | ○ | ○ | ○ | ○ | ○ | ○ | Δ | X |
| UNIFORMITY IN CHARACTERISTICS | X | ○ | ○ | ○ | ○ | ○ | ○ | Δ | X | X |
| ADHESION | X | ○ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
OTHER CONDITIONS

| | |
|---|---|
| FLOW RATE OF $H_2$ GAS CONTAINING SILICON COMPOUND GAS (sccm): | 1250 |
| SPECIES OF SILICON COMPOUND GAS: | $Si_2H_6$ |
| CONCENTRATION OF SILICON COMPOUNG GAS TO $H_2$ GAS (%): | 0.04 |
| APPLIED POWER: | VHF |
| POWER DENSITY (W/cm$^3$): | 0.015 |
| SUBSTRATE TEMPERATURE (°C.) FIRST/SECOND: | 280/230 |

TABLE H11

(1)

| | |
|---|---|
| $H_2$ GAS FLOW RATE (sccm) | 1250 |
| SPECIES OF SILICON COMPOUND GAS | $SiF_4$ |
| CONCENTRATION* (%) | 0.02 |
| TYPE OF APPLIED POWER | MW |
| POWER (W/cm$^3$) | 0.11 |
| PRESSURE (mTorr) | 0.03~100 |
| SUBSTRATE TEMPERATURE (°C.) FIRST/SECOND | 230/230 |

*: (SILICON COMPOUND GAS FLOW RATE)/($H_2$ GAS FLOW RATE)

(2)

| SC-EMB-H11 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 130 | 200 | | |
| n/i BUFFER LAYER | | 3.5 | | | 100 | | | |
| MW i-LAYER | 49 | | | 50 | 155 | | | |
| p/i BUFFER LAYER | | 3.5 | | | 100 | | | |
| RF p-LAYER | | | 0.1 | | 60 | | 10 | 2 |
| RF n-LAYER | 1.1 | | | | 50 | 270 | | |
| n/i BUFFER LAYER | | 0.4 | 0.2 | | 80 | | | |
| MW i-LAYER | 34 | | | 36 | 145 | | | |
| p/i BUFFER LAYER | | 0.4 | 0.2 | | 60 | | | |
| RF p-LAYER | | | 0.2 | | 60 | | 10 | 2 |
| RF n-LAYER | 0.8 | | | | 50 | 250 | | |

TABLE H11-continued

| | | | | | | | | |
|---|---|---|---|---|---|---|---|---|
| n/i BUFFER LAYER | | 0.3 | 0.2 | | 50 | | | |
| RF i-LAYER | | 2.5 | | | 90 | | | |
| p/i BUFFER LAYER | | 0.4 | 0.25 | | 50 | | | |
| RF p-LAYER | | | 0.3 | | 60 | | 10 | 2 |

| SC-EMB-H11 | PRESSURE Torr | MW POWER W/cm³ | RF POWER W/cm³ | SUBSTRATE TEMPERA-TURE °C. | LAYER THICKNESS nm |
|---|---|---|---|---|---|
| RF n-LAYER | 1.1 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| PRESSURE (Torr) | 0.03 | 0.08 | 0.1 | 0.5 | 1 | 5 | 10 | 11 | 20 | 100 |
|---|---|---|---|---|---|---|---|---|---|---|
| CURVE FACTOR | X | Δ | ○ | ○ | ○ | ○ | ○ | ○ | Δ | X |
| OPTICAL DURABILITY | X | Δ | ○ | ○ | ○ | ○ | ○ | ○ | Δ | X |
| UNIFORMITY IN CHARACTERISTICS | X | ○ | ○ | ○ | ○ | ○ | ○ | Δ | X | X |
| ADHESION | X | Δ | ○ | ○ | ○ | ○ | ○ | ○ | X | X |
| DURABILITY | X | Δ | ○ | ○ | ○ | ○ | ○ | Δ | X | X |
| CHARACTERISTICS WITH REVERSE BIAS VOLTAGE APPLIED | X | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
OTHER CONDITIONS

| | |
|---|---|
| FLOW RATE OF $H_2$ GAS CONTAINING SILICON COMPOUND GAS (sccm): | 1250 |
| SPECIES OF SILICON COMPOUND GAS: | $SiF_4$ |
| CONCENTRATION OF SILICON COMPOUNG GAS TO $H_2$ GAS (%): | 0.02 |
| APPLIED POWER: | MW |
| POWER DENSITY (W/cm³): | 0.11 |
| SUBSTRATE TEMPERATURE (°C.) FIRST/SECOND: | 230/230 |

TABLE H12

(1)

| | |
|---|---|
| $H_2$ GAS FLOW RATE (sccm) | 650 |
| SPECIES OF SILICON COMPOUND GAS | $SiH_4$ |
| CONCENTRATION* (%) | 0.04 |
| TYPE OF APPLIED POWER | RF |
| POWER (W/cm³) | 0.003~10 |
| PRESSURE (Torr) | 0.65 |
| SUBSTRATE TEMPERATURE (°C.) FIRST/SECOND | 250/230 |

*: (SILICON COMPOUND GAS FLOW RATE)/($H_2$ GAS FLOW RATE)

(2)

| SC-EMB-H12 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 130 | 200 | | |
| n/i BUFFER LAYER | | 3.5 | | | 130 | | | |
| MW i-LAYER | 46 | | | 48 | 145 | | | |
| p/i BUFFER LAYER | | 3.5 | | | 120 | | | |
| RF p-LAYER | | | 0.1 | | 60 | | 10 | 2 |
| RF n-LAYER | 1.1 | | | | 50 | 270 | | |
| n/i BUFFER LAYER | | 0.4 | 0.2 | | 80 | | | |

TABLE H12-continued

| | | | | | | | | |
|---|---|---|---|---|---|---|---|---|
| MW i-LAYER | 33 | | | 36 | 160 | | | |
| p/i BUFFER LAYER | | 0.4 | 0.2 | | 60 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 65 | | | |
| p/i BUFFER LAYER | | 0.4 | 0.25 | | 50 | | | |
| RF p-LAYER | | | 0.3 | | 60 | | 10 | 2 |

| SC-EMB-H12 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.8 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.6 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| POWER DENSITY ($W/cm^3$) | 0.003 | 0.007 | 0.01 | 0.05 | 0.1 | 0.7 | 1.0 | 1.1 | 3.0 | 10 |
|---|---|---|---|---|---|---|---|---|---|---|
| CURVE FACTOR | X | Δ | ○ | ○ | ○ | ○ | ○ | ○ | Δ | X |
| OPTICAL DURABILITY | Δ | ○ | ○ | ○ | ○ | ○ | ○ | ○ | Δ | X |
| UNIFORMITY IN CHARACTERISTICS | X | ○ | ○ | ○ | ○ | ○ | ○ | ○ | X | X |
| ADHESION | X | Δ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS

OTHER CONDITIONS

| | |
|---|---|
| FLOW RATE OF $H_2$ GAS CONTAINING SILICON COMPOUND GAS (sccm): | 650 |
| SPECIES OF SILICON COMPOUND GAS: | $SiH_4$ |
| CONCENTRATION OF SILICON COMPOUNG GAS TO $H_2$ GAS (%): | 0.04 |
| APPLIED POWER: | RF |
| PRESSURE (Torr): | 0.65 |
| SUBSTRATE TEMPERATURE (°C.) FIRST/SECOND: | 250/230 |

TABLE H13

(1)

| | |
|---|---|
| $H_2$ GAS FLOW RATE (sccm) | 1450 |
| SPECIES OF SILICON COMPOUND GAS | $Si_2H_6$ |
| CONCENTRATION* (%) | 0.02 |
| TYPE OF APPLIED POWER | VHF |
| POWER ($W/cm^3$) | 0.003~10 |
| PRESSURE (Torr) | 0.0065 |
| SUBSTRATE TEMPERATURE (°C.) FIRST/SECOND | 140/140 |

*: (SILICON COMPOUND GAS FLOW RATE)/($H_2$ GAS FLOW RATE)

(2)

| SC-EMB-H13 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.4 | | | | 130 | 200 | | |
| n/i BUFFER LAYER | | 2.5 | | | 130 | | | |
| MW i-LAYER | 45 | | | 46 | 140 | | | |

TABLE H13-continued

| | | | | | | | | |
|---|---|---|---|---|---|---|---|---|
| p/i BUFFER LAYER | | 2.5 | | | 120 | | | |
| RF p-LAYER | | | 0.1 | | 60 | | 10 | 2 |
| RF n-LAYER | 1.0 | | | | 30 | 270 | | |
| n/i BUFFER LAYER | | 0.4 | 0.2 | | 80 | | | |
| MW i-LAYER | 33 | | | 29 | 120 | | | |
| p/i BUFFER LAYER | | 0.4 | 0.2 | | 60 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.2 | | | 80 | | | |
| p/i BUFFER LAYER | | 0.4 | 0.25 | | 50 | | | |
| RF p-LAYER | | | 0.3 | | 60 | | 10 | 2 |

| SC-EMB-H13 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| POWER DENSITY ($W/cm^3$) | 0.003 | 0.007 | 0.01 | 0.05 | 0.1 | 0.7 | 1.0 | 1.1 | 3.0 | 10 |
|---|---|---|---|---|---|---|---|---|---|---|
| CURVE FACTOR | X | Δ | ○ | ○ | ○ | ○ | ○ | ○ | Δ | X |
| OPTICAL DURABILITY | X | ○ | ○ | ○ | ○ | ○ | ○ | ○ | Δ | X |
| UNIFORMITY IN CHARACTERISTICS | X | ○ | ○ | ○ | ○ | ○ | ○ | Δ | X | X |
| ADHESION | X | Δ | ○ | ○ | ○ | ○ | ○ | Δ | X | X |
| DURABILITY | X | Δ | ○ | ○ | ○ | ○ | ○ | ○ | Δ | X |
| CHARACTERISTICS WITH REVERSE BIAS VOLTAGE APPLIED | X | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS

OTHER CONDITIONS

| | |
|---|---|
| FLOW RATE OF $H_2$ GAS CONTAINING SILICON COMPOUND GAS (sccm): | 1450 |
| SPECIES OF SILICON COMPOUND GAS: | $Si_2H_6$ |
| CONCENTRATION OF SILICON COMPOUNG GAS TO $H_2$ GAS (%): | 0.02 |
| APPLIED POWER: | VHF |
| PRESSURE (Torr): | 0.0065 |
| SUBSTRATE TEMPERATURE (°C.) FIRST/SECOND: | 140/140 |

TABLE H14

(1)

| | |
|---|---|
| $H_2$ GAS FLOW RATE (sccm) | 1850 |
| SPECIES OF SILICON COMPOUND GAS | $SiCl_2H_2$ |
| CONCENTRATION* (%) | 0.01 |
| TYPE OF APPLIED POWER | MW |
| POWER ($W/cm^3$) | 0.03~100 |
| PRESSURE (Torr) | 0.006 |
| SUBSTRATE TEMPERATURE (°C.) | 130/130 |

*: (SILICON COMPOUND GAS FLOW RATE)/($H_2$ GAS FLOW RATE)

TABLE H14-continued (2)

| SC-EMB-H14 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.4 | | | | 140 | 200 | | |
| n/i BUFFER LAYER | | 3.5 | | | 120 | | | |
| MW i-LAYER | 45 | | | 46 | 150 | | | |
| p/i BUFFER LAYER | | 0.35 | 0.2 | | 120 | | | |
| RF p-LAYER | | | 0.1 | | 60 | | 10 | 2 |
| RF n-LAYER | 1.0 | | | | 30 | 270 | | |
| n/i BUFFER LAYER | | 0.4 | 0.2 | | 80 | | | |
| MW i-LAYER | 35 | | | 30 | 150 | | | |
| p/i BUFFER LAYER | | 0.4 | 0.2 | | 70 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.2 | | | 55 | | | |
| p/i BUFFER LAYER | | 0.4 | 0.25 | | 60 | | | |
| RF p-LAYER | | | 0.4 | | 60 | | 10 | 2 |

| SC-EMB-H14 | PRESSURE Torr | MW POWER $W/cm^3$ | RF POWER $W/cm^3$ | SUBSTRATE TEMPERATURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| POWER DENSITY ($W/cm^3$) | 0.03 | 0.07 | 0.1 | 0.5 | 1 | 7 | 10 | 11 | 30 | 100 |
|---|---|---|---|---|---|---|---|---|---|---|
| CURVE FACTOR | X | Δ | ○ | ○ | ○ | ○ | ○ | Δ | X | X |
| OPTICAL DURABILITY | X | ○ | ○ | ○ | ○ | ○ | ○ | ○ | X | X |
| UNIFORMITY IN CHARACTERISTICS | X | Δ | ○ | ○ | ○ | ○ | ○ | ○ | X | X |
| ADHESION | X | ○ | ○ | ○ | ○ | ○ | ○ | ○ | X | X |
| DURABILITY | X | ○ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS
OTHER CONDITIONS

| | |
|---|---|
| FLOW RATE OF $H_2$ GAS CONTAINING SILICON COMPOUND GAS (sccm): | 1850 |
| SPECIES OF SILICON COMPOUND GAS: | $SiCl_2H_2$ |
| CONCENTRATION OF SILICON COMPOUNG GAS TO $H_2$ GAS (%): | 0.01 |
| APPLIED POWER: | MW |
| PRESSURE (Torr): | 0.006 |
| SUBSTRATE TEMPERATURE (°C.) FIRST/SECOND: | 130/130 |

TABLE H15

(1)

| | |
|---|---|
| $H_2$ GAS FLOW RATE (sccm) | 850 |
| SPECIES OF SILICON COMPOUND GAS | $SiH_4$ |
| CONCENTRATION* (%) | 0.03 |
| TYPE OF APPLIED POWER | RF |
| POWER ($W/cm^3$) | 0.26 |
| PRESSURE (Torr) | 1.1 |
| SUBSTRATE TEMPERATURE (°C.) | 50~520 |

*: (SILICON COMPOUND GAS FLOW RATE)/($H_2$ GAS FLOW RATE)

TABLE H15-continued (2)

| SC-EMB-H15 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.2 | | | | 130 | 200 | | |
| n/i BUFFER LAYER | | 0.4 | 0.1 | | 120 | | | |
| MW i-LAYER | 45 | | | 47 | 150 | | | |
| p/i BUFFER LAYER | | 0.35 | 0.2 | | 120 | | | |
| RF p-LAYER | | | 0.1 | | 60 | | 10 | 2 |
| RF n-LAYER | 1.0 | | | | 30 | 270 | | |
| n/i BUFFER LAYER | | 0.4 | 0.2 | | 80 | | | |
| MW i-LAYER | 35 | | | 28 | 150 | | | |
| p/i BUFFER LAYER | | 0.4 | 0.2 | | 70 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.2 | | | 55 | | | |
| p/i BUFFER LAYER | | 0.4 | 0.25 | | 60 | | | |
| RF p-LAYER | | | 0.4 | | 60 | | 10 | 2 |

| SC-EMB-H15 | PRESSURE Torr | MW POWER W/cm³ | RF POWER W/cm³ | SUBSTRATE TEMPERA-TURE °C. | LAYER THICKNESS nm |
|---|---|---|---|---|---|
| RF n-LAYER | 1.1 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.7 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| SUBSTRATE TEMPERATURE (°C.) | 50 | 75 | 100 | 150 | 200 | 300 | 400 | 420 | 450 | 520 |
|---|---|---|---|---|---|---|---|---|---|---|
| CURVE FACTOR | X | ○ | ○ | ○ | ○ | ○ | ○ | X | X | X |
| OPTICAL DURABILITY | X | Δ | ○ | ○ | ○ | ○ | ○ | ○ | X | X |
| UNIFORMITY IN CHARACTERISTICS | X | Δ | ○ | ○ | ○ | ○ | ○ | Δ | X | X |
| ADHESION | X | ○ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | ○ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS

OTHER CONDITIONS

| | |
|---|---|
| FLOW RATE OF $H_2$ GAS CONTAINING SILICON COMPOUND GAS (sccm): | 850 |
| SPECIES OF SILICON COMPOUND GAS: | $SiH_4$ |
| CONCENTRATION OF SILICON COMPOUND GAS TO $H_2$ GAS (%): | 0.03 |
| APPLIED POWER: | RF |
| POWER DENSITY (W/cm³): | 0.26 |
| PRESSURE (Torr): | 1.1 |

TABLE H16

(1)

| | |
|---|---|
| $H_2$ GAS FLOW RATE (sccm) | 1600 |
| SPECIES OF SILICON COMPOUND GAS | $SiCl_4$ |
| CONCENTRATION* (%) | 0.02 |
| TYPE OF APPLIED POWER | VHF |
| POWER (W/cm$^3$) | 0.15 |
| PRESSURE (Torr) | 0.01 |
| SUBSTRATE TEMPERATURE (°C.) | 30~420 |

*: (SILICON COMPOUND GAS FLOW RATE)/($H_2$ GAS FLOW RATE)

(2)

| SC-EMB-H16 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.4 | | | | 110 | 200 | | |
| n/i BUFFER LAYER | | 0.4 | 0.1 | | 110 | | | |
| MW i-LAYER | 44 | | | 45 | 155 | | | |
| p/i BUFFER LAYER | | 0.35 | 0.2 | | 120 | | | |
| RF p-LAYER | | | 0.1 | | 60 | | 10 | 2 |
| RF n-LAYER | 1.0 | | | | 30 | 270 | | |
| n/i BUFFER LAYER | | 0.4 | 0.2 | | 80 | | | |
| MW i-LAYER | 35 | | | 28 | 120 | | | |
| p/i BUFFER LAYER | | 0.4 | 0.2 | | 70 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.1 | | | 120 | | | |
| p/i BUFFER LAYER | | 0.4 | 0.25 | | 60 | | | |
| RF p-LAYER | | | 0.4 | | 60 | | 10 | 2 |

| SC-EMB-H16 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.24 | 0.5 | 330 | 100 |
| p/i BUFFER LAYER | 0.8 | | 0.08 | 280 | 20 |
| RF p-LAYER | 1.6 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| SUBSTRATE TEMPERATURE (°C.) | 30 | 40 | 50 | 100 | 200 | 250 | 300 | 320 | 350 | 420 |
|---|---|---|---|---|---|---|---|---|---|---|
| CURVE FACTOR | X | ○ | ○ | ○ | ○ | ○ | ○ | Δ | X | X |
| OPTICAL DURABILITY | X | Δ | ○ | ○ | ○ | ○ | ○ | ○ | X | X |
| UNIFORMITY IN CHARACTERISTICS | X | Δ | ○ | ○ | ○ | ○ | ○ | ○ | X | X |
| ADHESION | X | Δ | ○ | ○ | ○ | ○ | ○ | Δ | X | X |
| DURABILITY | X | ○ | ○ | ○ | ○ | ○ | ○ | Δ | X | X |
| CHARACTERISTICS WITH REVERSE BIAS VOLTAGE APPLIED | X | ○ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS

OTHER CONDITIONS

| | |
|---|---|
| FLOW RATE OF $H_2$ GAS CONTAINING SILICON COMPOUND GAS (sccm): | 1600 |
| SPECIES OF SILICON COMPOUND GAS: | $SiCl_4$ |
| CONCENTRATION OF SILICON COMPOUND GAS TO $H_2$ GAS (%): | 0.02 |
| APPLIED POWER: | VHF |
| POWER DENSITY (W/cm$^3$): | 0.15 |
| PRESSURE (Torr): | 0.01 |

TABLE H17

(1)

| | |
|---|---|
| $H_2$ GAS FLOW RATE (sccm) | 1800 |
| SPECIES OF SILICON COMPOUND GAS | $SiCl_2H_2$ |
| CONCENTRATION* (%) | 0.01 |
| TYPE OF APPLIED POWER | MW |
| POWER (W/cm$^3$) | 0.35 |
| PRESSURE (Torr) | 0.006 |
| SUBSTRATE TEMPERATURE (°C.) | 30~420 |

*: (SILICON COMPOUND GAS FLOW RATE)/($H_2$ GAS FLOW RATE)

(2)

| SC-EMB-H17 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.4 | | | | 120 | 200 | | |
| n/i BUFFER LAYER | | 0.4 | 0.2 | | 110 | | | |
| MW i-LAYER | 42 | | | 44 | 155 | | | |
| p/i BUFFER LAYER | | 3.5 | 0.2 | | 120 | | | |
| RF p-LAYER | | | 0.1 | | 60 | | 10 | 1.7 |
| RF n-LAYER | 1.0 | | | | 30 | 270 | | |
| n/i BUFFER LAYER | | 0.4 | 0.2 | | 80 | | | |
| MW i-LAYER | 33 | | | 28 | 145 | | | |
| p/i BUFFER LAYER | | 0.4 | 0.2 | | 70 | | | |
| RF p-LAYER | | | 0.2 | | 60 | | 10 | 1.8 |
| RF n-LAYER | 0.8 | | | | 50 | 250 | | |
| n/i BUFFER LAYER | | 0.3 | 0.2 | | 50 | | | |
| RF i-LAYER | | 2.1 | | | 110 | | | |
| p/i BUFFER LAYER | | 0.4 | 0.25 | | 60 | | | |
| RF p-LAYER | | | 0.4 | | 60 | | 10 | 1.8 |

| SC-EMB-H17 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.8 | | 0.08 | 350 | 10 |
| MW i-LAYER | 0.005 | 0.35 | 0.5 | 370 | 110 |
| p/i BUFFER LAYER | 0.8 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.24 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| SUBSTRATE TEMPERATURE (°C.) | 30 | 40 | 50 | 100 | 200 | 250 | 300 | 320 | 350 | 420 |
|---|---|---|---|---|---|---|---|---|---|---|
| CURVE FACTOR | X | Δ | ○ | ○ | ○ | ○ | ○ | Δ | X | X |
| OPTICAL DURABILITY | X | Δ | ○ | ○ | ○ | ○ | ○ | ○ | Δ | X |
| UNIFORMITY IN CHARACTERISTICS | X | Δ | ○ | ○ | ○ | ○ | ○ | Δ | X | X |
| ADHESION | X | Δ | ○ | ○ | ○ | ○ | ○ | ○ | Δ | X |
| DURABILITY | X | ○ | ○ | ○ | ○ | ○ | ○ | ○ | X | X |

○: EXCELLENT FOR PRACTICAL USE
Δ: GOOD FOR PRACTICAL USE
X: NO GOOD FOR SOME APPLICATIONS
OTHER CONDITIONS

| | |
|---|---|
| FLOW RATE OF $H_2$ GAS CONTAINING SILICON COMPOUND GAS (sccm): | 1800 |
| SPECIES OF SILICON COMPOUND GAS: | $SiCl_2H_2$ |
| CONCENTRATION OF SILICON COMPOUND GAS TO $H_2$ GAS (%): | 0.01 |
| APPLIED POWER: | MW |
| POWER DENSITY (W/cm$^3$): | 0.35 |
| PRESSURE (Torr): | 0.006 |

TABLE H18

(1)

| | |
|---|---|
| $H_2$ GAS FLOW RATE (sccm) | 1100 |
| SPECIES OF SILICON COMPOUND GAS | $SiH_4/H_2$ |
| CONCENTRATION* (%) | 0.04 |
| TYPE OF APPLIED POWER | RF |
| POWER ($W/cm^3$) | 0.03 |
| PRESSURE (Torr) | 0.8 |
| SUBSTRATE TEMPERATURE (°C.) | 360 |

*: ($SiH_4$ GAS FLOW RATE)/(TOTAL $H_2$ GAS FLOW RATE)

(2)

| | |
|---|---|
| $H_2$ GAS FLOW RATE (sccm) | 850 |
| SPECIES OF SILICON COMPOUND GAS | $SiH_4/H_2$ |
| CONCENTRATION* (%) | 0.03 |
| TYPE OF APPLIED POWER | RF |
| POWER ($W/cm^3$) | 0.03 |
| PRESSURE (Torr) | 0.8 |
| SUBSTRATE TEMPERATURE (°C.) | 350 |

*: ($SiH_4$ GAS FLOW RATE)/(TOTAL $H_2$ GAS FLOW RATE)

(3)

| | |
|---|---|
| $H_2$ GAS FLOW RATE (sccm) | 800 |
| SPECIES OF SILICON COMPOUND GAS | $SiH_4$ |
| CONCENTRATION* (%) | 0.03 |
| TYPE OF APPLIED POWER | RF |
| POWER ($W/cm^3$) | 0.03 |
| PRESSURE (Torr) | 0.7 |
| SUBSTRATE TEMPERATURE (°C.) | 350 |

*: (SILICON COMPOUND GAS FLOW RATE)/($H_2$ GAS FLOW RATE)

(4)

| | |
|---|---|
| $H_2$ GAS FLOW RATE (sccm) | 1000 |
| SPECIES OF SILICON COMPOUND GAS | $SiH_4$ |
| CONCENTRATION* (%) | 0.03 |
| TYPE OF APPLIED POWER | RF |
| POWER ($W/cm^3$) | 0.04 |
| PRESSURE (Torr) | 0.6 |
| SUBSTRATE TEMPERATURE (°C.) | 330 |

*: (SILICON COMPOUND GAS FLOW RATE)/($H_2$ GAS FLOW RATE)

(5)

| | |
|---|---|
| $H_2$ GAS FLOW RATE (sccm) | 1100 |
| SPECIES OF SILICON COMPOUND GAS | $SiH_4$ |
| CONCENTRATION* (%) | 0.03 |
| TYPE OF APPLIED POWER | RF |
| POWER ($W/cm^3$) | 0.025 |
| PRESSURE (Torr) | 0.6 |
| SUBSTRATE TEMPERATURE (°C.) | 300 |

*: (SILICON COMPOUND GAS FLOW RATE)/($H_2$ GAS FLOW RATE)

(6)

| | |
|---|---|
| $H_2$ GAS FLOW RATE (sccm) | 1200 |
| SPECIES OF SILICON COMPOUND GAS | $SiH_4$ |
| CONCENTRATION* (%) | 0.02 |
| TYPE OF APPLIED POWER | RF |
| POWER ($W/cm^3$) | 0.05 |
| PRESSURE (Torr) | 0.7 |
| SUBSTRATE TEMPERATURE (°C.) | 300 |

*: (SILICON COMPOUND GAS FLOW RATE)/($H_2$ GAS FLOW RATE)

(7)

| | |
|---|---|
| $H_2$ GAS FLOW RATE (sccm) | 1100 |
| SPECIES OF SILICON COMPOUND GAS | $SiH_4/H_2$ |
| CONCENTRATION* (%) | 0.04 |
| TYPE OF APPLIED POWER | RF |
| POWER ($W/cm^3$) | 0.03 |
| PRESSURE (Torr) | 0.7 |
| SUBSTRATE TEMPERATURE (°C.) | 300 |

*: ($SiH_4$ GAS FLOW RATE)/(TOTAL $H_2$ GAS FLOW RATE)

TABLE H18-continued (8)

| | |
|---|---|
| $H_2$ GAS FLOW RATE (sccm) | 1200 |
| SPECIES OF SILICON COMPOUND GAS | $SiH_4$ |
| CONCENTRATION* (%) | 0.02 |
| TYPE OF APPLIED POWER | RF |
| POWER ($W/cm^3$) | 0.02 |
| PRESSURE (Torr) | 0.7 |
| SUBSTRATE TEMPERATURE (°C.) | 300 |

*: (SILICON COMPOUND GAS FLOW RATE)/($H_2$ GAS FLOW RATE)

(9)

| | |
|---|---|
| $H_2$ GAS FLOW RATE (sccm) | 1200 |
| SPECIES OF SILICON COMPOUND GAS | $SiH_4$ |
| CONCENTRATION* (%) | 0.03 |
| TYPE OF APPLIED POWER | RF |
| POWER ($W/cm^3$) | 0.03 |
| PRESSURE (Torr) | 0.6 |
| SUBSTRATE TEMPERATURE (°C.) | 280 |

*: (SILICON COMPOUND GAS FLOW RATE)/($H_2$ GAS FLOW RATE)

(10)

| | |
|---|---|
| $H_2$ GAS FLOW RATE (sccm) | 1500 |
| SPECIES OF SILICON COMPOUND GAS | $SiH_4$ |
| CONCENTRATION* (%) | 0.02 |
| TYPE OF APPLIED POWER | RF |
| POWER ($W/cm^3$) | 0.02 |
| PRESSURE (Torr) | 0.5 |
| SUBSTRATE TEMPERATURE (°C.) | 260 |

*: (SILICON COMPOUND GAS FLOW RATE)/($H_2$ GAS FLOW RATE)

(11)

| | |
|---|---|
| $H_2$ GAS FLOW RATE (sccm) | 1000 |
| SPECIES OF SILICON COMPOUND GAS | $SiH_4$ |
| CONCENTRATION* (%) | 0.02 |
| TYPE OF APPLIED POWER | RF |
| POWER ($W/cm^3$) | 0.04 |
| PRESSURE (Torr) | 0.6 |
| SUBSTRATE TEMPERATURE (°C.) | 250 |

*: (SILICON COMPOUND GAS FLOW RATE)/($H_2$ GAS FLOW RATE)

(12)

| | |
|---|---|
| $H_2$ GAS FLOW RATE (sccm) | 900 |
| SPECIES OF SILICON COMPOUND GAS | $SiH_4/H_2$ |
| CONCENTRATION* (%) | 0.03 |
| TYPE OF APPLIED POWER | RF |
| POWER ($W/cm^3$) | 0.03 |
| PRESSURE (Torr) | 0.9 |
| SUBSTRATE TEMPERATURE (°C.) | 230 |

*: ($SiH_4$ GAS FLOW RATE)/(TOTAL $H_2$ GAS FLOW RATE)

(13)

| | |
|---|---|
| $H_2$ GAS FLOW RATE (sccm) | 1200 |
| SPECIES OF SILICON COMPOUND GAS | $SiH_4$ |
| CONCENTRATION* (%) | 0.02 |
| TYPE OF APPLIED POWER | RF |
| POWER ($W/cm^3$) | 0.02 |
| PRESSURE (Torr) | 0.7 |
| SUBSTRATE TEMPERATURE (°C.) | 230 |

*: (SILICON COMPOUND GAS FLOW RATE)/($H_2$ GAS FLOW RATE)

(14)

| | |
|---|---|
| $H_2$ GAS FLOW RATE (sccm) | 1200 |
| SPECIES OF SILICON COMPOUND GAS | $SiH_4$ |
| CONCENTRATION* (%) | 0.02 |
| TYPE OF APPLIED POWER | RF |
| POWER ($W/cm^3$) | 0.02 |
| PRESSURE (Torr) | 0.8 |
| SUBSTRATE TEMPERATURE (°C.) | 200 |

*: (SILICON COMPOUND GAS FLOW RATE)/($H_2$ GAS FLOW RATE)

TABLE H18-continued (15)

| | |
|---|---|
| $H_2$ GAS FLOW RATE (sccm) | 1400 |
| SPECIES OF SILICON COMPOUND GAS | $SiH_4$ |
| CONCENTRATION* (%) | 0.02 |
| TYPE OF APPLIED POWER | RF |
| POWER ($W/cm^3$) | 0.02 |
| PRESSURE (Torr) | 0.7 |
| SUBSTRATE TEMPERATURE (°C.) | 170 |

*: (SILICON COMPOUND GAS FLOW RATE)/($H_2$ GAS FLOW RATE)

(16)

| SC-EMB-H18 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.4 | | | | 150 | 200 | | |
| n/i BUFFER LAYER | | 0.4 | 0.2 | | 110 | | | |
| MW i-LAYER | 43 | | | 43 | 155 | | | |
| p/i BUFFER LAYER | | 0.4 | 0.2 | | 120 | | | |
| RF p-LAYER | | | 0.1 | | 60 | | 10 | 1.7 |
| RF n-LAYER | 0.9 | | | | 20 | 280 | | |
| n/i BUFFER LAYER | | 0.4 | 0.2 | | 80 | | | |
| MW i-LAYER | 32 | | | 28 | 160 | | | |
| p/i BUFFER LAYER | | 0.4 | 0.2 | | 70 | | | |
| RF p-LAYER | | | 0.2 | | 60 | | 10 | 1.8 |
| RF n-LAYER | 0.8 | | | | 50 | 250 | | |
| n/i BUFFER LAYER | | 0.4 | 0.2 | | 50 | | | |
| RF i-LAYER | | 2.1 | | | 100 | | | |
| p/i BUFFER LAYER | | 0.4 | 0.25 | | 60 | | | |
| RF p-LAYER | | | 0.4 | | 60 | | 10 | 1.8 |

| SC-EMB-H14 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.1 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.5 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.1 | | 0.06 | 200 | 12 |
| RF p-LAYER | 1.4 | | 0.07 | 170 | 10 |

TABLE I1

(1)

| | |
|---|---|
| $H_2$ GAS FLOW RATE (sccm) | 1300 |
| SPECIES OF SILICON COMPOUND GAS | $SiH_4$ |
| CONCENTRATION* (%) | 0.01 |
| SPECIES OF GROUP-V-ELEMENT COMPOUND GAS (DILUTION: %) | $PH_3/H_2$ (1%) |
| CONCENTRATION** (%) | 0.3 |
| TYPE OF APPLIED POWER | RF |
| POWER ($W/cm^3$) | 0.06 |
| PRESSURE (Torr) | 0.8 |
| SUBSTRATE TEMPERATURE (°C.) | 250 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

TABLE I1-continued (2)

| SC-EMB-HI1 | SiH$_4$ FLOW RATE sccm | Si$_2$H$_6$ FLOW RATE sccm | CH$_4$ FLOW RATE sccm | GeH$_4$ FLOW RATE sccm | H$_2$ FLOW RATE sccm | PH$_3$/H$_2$ FLOW RATE sccm | B$_2$H$_6$/H$_2$ FLOW RATE sccm | SiH$_4$/H$_2$ FLOW RATE sccm |
|---|---|---|---|---|---|---|---|---|
| RF n-LAYER | 1.5 | | | | 300 | 20 | | |
| n/i BUFFER LAYER | | 2.5 | | | 100 | | | |
| MW i-LAYER | 37 | | | 38 | 180 | | | |
| p/i BUFFER LAYER | | 2.5 | | | 80 | | | |
| RF p-LAYER | | | 0.3 | | 60 | | 10 | 0.5 |
| RF n-LAYER | 1.5 | | | | 280 | 25 | | |
| n/i BUFFER LAYER | | 0.4 | 0.2 | | 90 | | | |
| RF i-LAYER | | 2.5 | | | 85 | | | |
| p/i BUFFER LAYER | | 0.4 | 0.3 | | 65 | | | |
| RF p-LAYER | | | 0.3 | | 70 | | 8 | 0.5 |

| SC-EMB-HI1 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.1 | | 0.05 | 380 | 20 |
| n/i BUFFER LAYER | 0.7 | | 0.08 | 360 | 10 |
| MW i-LAYER | 0.005 | 0.28 | 0.6 | 380 | 150 |
| p/i BUFFER LAYER | 0.7 | | 0.07 | 250 | 20 |
| RF p-LAYER | 1.7 | | 0.07 | 250 | 10 |
| RF n-LAYER | 1.1 | | 0.05 | 250 | 10 |
| n/i BUFFER LAYER | 1.0 | | 0.06 | 250 | 10 |
| RF p-LAYER | 0.5 | | 0.07 | 200 | 110 |
| p/i BUFFER LAYER | 1.1 | | 0.06 | 200 | 15 |
| RF p-LAYER | 1.7 | | 0.07 | 170 | 10 |

TABLE I2

(1)

| | |
|---|---|
| H$_2$ GAS FLOW RATE (sccm) | 1100 |
| SPECIES OF SILICON COMPOUND GAS | SiH$_4$ |
| CONCENTRATION* (%) | 0.03 |
| SPECIES OF GROUP-V-ELEMENT COMPOUND GAS (DILUTION: %) | PF$_3$/H$_2$ (1%) |
| CONCENTRATION** (%) | 0.4 |
| TYPE OF APPLIED POWER | VHF |
| POWER (W/cm$^3$) | 0.07 |
| PRESSURE (Torr) | 0.013 |
| SUBSTRATE TEMPERATURE (°C.) | 250 |

*: (SILICON COMPOUND GAS FLOW RATE)/(TOTAL H$_2$ GAS FLOW RATE)
**: (GROUP-V-ELEMENT COMPOUND GAS FLOW RATE)/(TOTAL H$_2$ GAS FLOW RATE)

(2)

| SC-EMB-I2 | SiH$_4$ FLOW RATE sccm | Si$_2$H$_6$ FLOW RATE sccm | CH$_4$ FLOW RATE sccm | GeH$_4$ FLOW RATE sccm | H$_2$ FLOW RATE sccm | PH$_3$/H$_2$ FLOW RATE sccm | B$_2$H$_6$/H$_2$ FLOW RATE sccm | SiH$_4$/H$_2$ FLOW RATE sccm |
|---|---|---|---|---|---|---|---|---|
| RF n-LAYER | 1.2 | | | | 290 | 20 | | |
| n/i BUFFER LAYER | | 2.5 | | | 100 | | | |
| MW i-LAYER | 43 | | | 42 | 150 | | | |
| p/i BUFFER LAYER | | 3 | | | 75 | | | |
| RF p-LAYER | | | 0.3 | | 60 | | 8 | 0.4 |
| RF n-LAYER | 1.5 | | | | 280 | 25 | | |
| n/i BUFFER LAYER | | 0.4 | 0.2 | | 90 | | | |
| RF i-LAYER | | 2 | | | 85 | | | |
| p/i BUFFER LAYER | | 0.4 | 0.3 | | 65 | | | |
| RF p-LAYER | | | 0.3 | | 70 | | 7 | 0.4 |

| SC-EMB-I2 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.1 | | 0.06 | 380 | 20 |
| n/i BUFFER LAYER | 0.8 | | 0.08 | 360 | 10 |
| MW i-LAYER | 0.005 | 0.25 | 0.60 | 380 | 150 |

TABLE I2-continued

| | | | | |
|---|---|---|---|---|
| p/i BUFFER LAYER | 0.7 | 0.07 | 250 | 20 |
| RF p-LAYER | 1.7 | 0.07 | 250 | 10 |
| RF n-LAYER | 1.1 | 0.04 | 250 | 10 |
| n/i BUFFER LAYER | 1.0 | 0.06 | 250 | 10 |
| RF i-LAYER | 0.6 | 0.07 | 200 | 110 |
| p/i BUFFER LAYER | 1.1 | 0.06 | 200 | 15 |
| RF p-LAYER | 1.7 | 0.07 | 170 | 10 |

TABLE I3

(1)

| | |
|---|---|
| $H_2$ GAS FLOW RATE (sccm) | 1200 |
| SPECIES OF SILICON COMPOUND GAS | $SiCl_2H_2$/He |
| CONCENTRATION* (%) | 0.02 |
| SPECIES OF GROUP-V-ELEMENT COMPOUND GAS (DILUTION: %) | $PH_3/H_2$ (10%) |
| CONCENTRATION** (%) | 2.0 |
| TYPE OF APPLIED POWER | MW |
| POWER (W/cm$^3$) | 0.12 |
| PRESSURE (Torr) | 0.008 |
| SUBSTRATE TEMPERATURE (°C.) | 300 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

(2)

| | |
|---|---|
| $H_2$ GAS FLOW RATE (sccm) | 1300 |
| SPECIES OF SILICON COMPOUND GAS | $SiH_4$ |
| CONCENTRATION* (%) | 0.04 |
| SPECIES OF GROUP-V-ELEMENT COMPOUND GAS (DILUTION: %) | $PH_3/H_2$ (10%) |
| CONCENTRATION** (%) | 2.5→0.2 |
| TYPE OF APPLIED POWER | RF |
| POWER (W/cm$^3$) | 0.05 |
| PRESSURE (Torr) | 0.8 |
| SUBSTRATE TEMPERATURE (°C.) | 250 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

(3)

| SC-EMB-I3 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 350 | 2.0 | | |
| n/i BUFFER LAYER | | 2.5 | | | 130 | | | |
| MW i-LAYER | 46 | | | 47 | 160 | | | |
| p/i BUFFER LAYER | | 2.5 | | | 110 | | | |
| RF p-LAYER | | | 0.1 | | 70 | | 7 | 2 |
| RF n-LAYER | 1.1 | | | | 350 | 2.5 | | |
| n/i BUFFER LAYER | | 3 | | | 80 | | | |
| MW i-LAYER | 41 | | | 35 | 150 | | | |
| p/i BUFFER LAYER | | 3 | | | 80 | | | |
| RF p-LAYER | | | 0.2 | | 60 | | 7 | 2 |
| RF n-LAYER | 0.8 | | | | 350 | 2.5 | | |
| n/i BUFFER LAYER | | 0.4 | 0.2 | | 55 | | | |
| RF i-LAYER | | 2.4 | | | 85 | | | |
| p/i BUFFER LAYER | | 0.4 | 0.25 | | 55 | | | |
| RF p-LAYER | | | 0.3 | | 60 | | 9 | 2 |

| SC-EMB-I3 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.3 | 0.65 | 375 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |

TABLE I3-continued

| | | | | | |
|---|---|---|---|---|---|
| MW i-LAYER | 0.006 | 0.25 | 0.55 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.25 | | 0.06 | 200 | 12 |
| RF p-LAYER | 1.6 | | 0.07 | 170 | 10 |

TABLE I4

(1)

| | |
|---|---|
| $H_2$ GAS FLOW RATE (sccm) | 0.1~2500 |
| SPECIES OF SILICON COMPOUND GAS | $SiH_4$ |
| CONCENTRATION* (%) | 0.04 |
| SPECIES OF GROUP-V-ELEMENT COMPOUND GAS | $PH_3/H_2$ |
| CONCENTRATION** (%) | 0.2 |
| TYPE OF APPLIED POWER | RF |
| POWER ($W/cm^3$) | 0.45 |
| PRESSURE (Torr) | 0.75 |
| SUBSTRATE TEMPERATURE (°C.) FIRST/SECOND | 270/230 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

(2)

| SC-EMB-I4 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 100 | 200 | | |
| n/i BUFFER LAYER | | 4 | | | 100 | | | |
| MW i-LAYER | 50 | | | 48 | 170 | | | |
| p/i BUFFER LAYER | | 4 | | | 100 | | | |
| RF p-LAYER | | | 0.1 | | 60 | | 9 | 2 |
| RF n-LAYER | 1.1 | | | | 50 | 250 | | |
| n/i BUFFER LAYER | | 4 | | | 70 | | | |
| MW i-LAYER | 40 | | | 36 | 160 | | | |
| p/i BUFFER LAYER | | 3 | | | 80 | | | |
| RF p-LAYER | | | 0.2 | | 60 | | 8 | 2 |
| RF n-LAYER | 0.8 | | | | 50 | 250 | | |
| n/i BUFFER LAYER | | 0.4 | 0.2 | | 50 | | | |
| RF i-LAYER | | 2 | | | 75 | | | |
| p/i BUFFER LAYER | | 0.4 | 0.25 | | 50 | | | |
| RF p-LAYER | | | 0.3 | | 60 | | 8 | 2 |

| SC-EMB-I4 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.3 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| $H_2$ GAS FLOW RATE* (sccm) | 0.1 | 0.5 | 0.8 | 1 | 10 | 100 | 1000 | 2000 | 2030 | 2100 | 2500 |
|---|---|---|---|---|---|---|---|---|---|---|---|
| CURVE FACTOR | X | Δ | ○ | ○ | ○ | ○ | ○ | ○ | ○ | Δ | X |
| OPTICAL DURABILITY | X | Δ | ○ | ○ | ○ | ○ | ○ | ○ | Δ | X | X |

TABLE I4-continued

| | | | | | | | | | | | |
|---|---|---|---|---|---|---|---|---|---|---|---|
| UNIFORMITY IN CHARACTERISTICS | X | Δ | ○ | ○ | ○ | ○ | ○ | ○ | Δ | X | X |
| SERIES-RESISTOR CHARACTERISTIC | X | Δ | Δ | ○ | ○ | ○ | ○ | ○ | ○ | Δ | X |
| DURABILITY | X | Δ | Δ | ○ | ○ | ○ | ○ | ○ | Δ | Δ | X |
| CHARACTERISTICS WITH REVERSE BIAS VOLTAGE APPLIED | X | Δ | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
*: CONTAINING GROUP-V-ELEMENT COMPOUND GAS AND SILICON COMPOUND GAS

TABLE I5

(1)

| | |
|---|---|
| $H_2$ GAS FLOW RATE (sccm) | 0.1~2500 |
| SPECIES OF SILICON COMPOUND GAS | $SiH_4$ |
| CONCENTRATION* (%) | 0.04 |
| SPECIES OF GROUP-V-ELEMENT COMPOUND GAS | $PF_3/H_2$ |
| CONCENTRATION** (%) | 0.2 |
| TYPE OF APPLIED POWER | VHF |
| POWER ($W/cm^3$) | 0.4 |
| PRESSURE (Torr) | 0.006 |
| SUBSTRATE TEMPERATURE (°C.) FIRST/SECOND | 260/230 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

(2)

| SC-EMB-I5 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 120 | 200 | | |
| n/i BUFFER LAYER | | 3.5 | | | 100 | | | |
| MW i-LAYER | 48 | | | 48 | 170 | | | |
| p/i BUFFER LAYER | | 3.5 | | | 100 | | | |
| RF p-LAYER | | | 0.1 | | 60 | | 9 | 2 |
| RF n-LAYER | 1.2 | | | | 50 | 260 | | |
| n/i BUFFER LAYER | | 3.5 | | | 80 | | | |
| MW i-LAYER | 40 | | | 38 | 150 | | | |
| p/i BUFFER LAYER | | 3 | | | 80 | | | |
| RF p-LAYER | | | 0.2 | | 60 | | 9 | 2 |
| RF n-LAYER | 0.8 | | | | 50 | 250 | | |
| n/i BUFFER LAYER | | 0.4 | 0.2 | | 50 | | | |
| RF i-LAYER | | 2 | | | 80 | | | |
| p/i BUFFER LAYER | | 0.4 | 0.25 | | 50 | | | |
| RF p-LAYER | | | 0.3 | | 60 | | 8 | 2 |

| SC-EMB-I5 | PRESSURE Torr | MW POWER $W/cm^3$ | RF POWER $W/cm^3$ | SUBSTRATE TEMPERATURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

TABLE I5-continued

| $H_2$ GAS FLOW RATE* (sccm) | 0.1 | 0.5 | 0.8 | 1 | 10 | 100 | 1000 | 2000 | 2030 | 2100 | 2500 |
|---|---|---|---|---|---|---|---|---|---|---|---|
| | | | (3) | | | | | | | | |
| CURVE FACTOR | X | X | Δ | ○ | ○ | ○ | ○ | ○ | ○ | Δ | X |
| OPTICAL DURABILITY | X | Δ | ○ | ○ | ○ | ○ | ○ | ○ | ○ | Δ | X |
| UNIFORMITY IN CHARACTERISTICS | X | Δ | ○ | ○ | ○ | ○ | ○ | ○ | ○ | Δ | X |
| SERIES-RESISTOR CHARACTERISTIC | X | Δ | Δ | ○ | ○ | ○ | ○ | ○ | Δ | X | X |
| DURABILITY | X | Δ | ○ | ○ | ○ | ○ | ○ | ○ | Δ | Δ | X |
| CHARACTERISTICS WITH REVERSE BIAS VOLTAGE APPLIED | X | Δ | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
*: CONTAINING GROUP-V-ELEMENT COMPOUND GAS AND SILICON COMPOUND GAS

TABLE I6

(1)

| | |
|---|---|
| $H_2$ GAS FLOW RATE (sccm) | 1100 |
| SPECIES OF SILICON COMPOUND GAS | $SiH_4$ |
| CONCENTRATION* (%) | 0.05 |
| SPECIES OF GROUP-V-ELEMENT COMPOUND GAS | $PH_3/H_2$ |
| CONCENTRATION** (%) | 0.01~6 |
| TYPE OF APPLIED POWER | RF |
| POWER (W/cm$^3$) | 0.25 |
| PRESSURE (Torr) | 0.7 |
| SUBSTRATE TEMPERATURE (°C.) FIRST/SECOND | 250/230 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

(2)

| SC-EMB-I6 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 100 | 200 | | |
| n/i BUFFER LAYER | | 3.5 | | | 100 | | | |
| MW i-LAYER | 47 | | | 48 | 155 | | | |
| p/i BUFFER LAYER | | 3.5 | | | 110 | | | |
| RF p-LAYER | | | 0.1 | | 60 | | 11 | 2 |
| RF n-LAYER | 1.1 | | | | 50 | 250 | | |
| n/i BUFFER LAYER | | 3 | | | 80 | | | |
| MW i-LAYER | 39 | | | 34 | 145 | | | |
| p/i BUFFER LAYER | | 3 | | | 80 | | | |
| RF p-LAYER | | | 0.2 | | 60 | | 10 | 2 |
| RF n-LAYER | 0.8 | | | | 50 | 250 | | |
| n/i BUFFER LAYER | | 0.4 | 0.2 | | 50 | | | |
| RF i-LAYER | | 2 | | | 85 | | | |
| p/i BUFFER LAYER | | 0.4 | 0.25 | | 50 | | | |
| RF p-LAYER | | | 0.3 | | 60 | | 9 | 2 |

| SC-EMB-I6 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.34 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.24 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |

TABLE I6-continued

| | | | | |
|---|---|---|---|---|
| n/i BUFFER LAYER | 1.3 | 0.06 | 230 | 10 |
| RF i-LAYER | 0.75 | 0.07 | 200 | 87 |
| p/i BUFFER LAYER | 1.2 | 0.06 | 200 | 11 |
| RF p-LAYER | 1.6 | 0.07 | 170 | 10 |

(3)

| CONCENTRATION* (%) | 0.01 | 0.03 | 0.05 | 0.08 | 1 | 2 | 3 | 3.2 | 4 | 6 |
|---|---|---|---|---|---|---|---|---|---|---|
| CURVE FACTOR | X | Δ | ○ | ○ | ○ | ○ | ○ | ○ | Δ | X |
| OPTICAL DURABILITY | X | ○ | ○ | ○ | ○ | ○ | ○ | Δ | X | X |
| UNIFORMITY IN CHARACTERISTICS | X | Δ | ○ | ○ | ○ | ○ | ○ | Δ | X | X |
| SERIES-RESISTOR CHARACTERISTIC | X | Δ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
*: CONCENTRATION OF GROUP-V-ELEMENT GAS MIXED WITH $H_2$ GAS TO TOTAL $H_2$ GAS

TABLE I7

(1)

| | |
|---|---|
| $H_2$ GAS FLOW RATE (sccm) | 1200 |
| SPECIES OF SILICON COMPOUND GAS | $SiH_4$ |
| CONCENTRATION* (%) | 0.03 |
| SPECIES OF GROUP-V-ELEMENT COMPOUND GAS | $PH_3$ |
| CONCENTRATION** (%) | 0.01~6 |
| TYPE OF APPLIED POWER | VHF |
| POWER (W/cm³) | 0.12 |
| PRESSURE (Torr) | 0.01 |
| SUBSTRATE TEMPERATURE (°C.) FIRST/SECOND | 260/230 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

(2)

| SC-EMB-I7 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 160 | 200 | | |
| n/i BUFFER LAYER | | 3.5 | | | 100 | | | |
| MW i-LAYER | 47 | | | 49 | 165 | | | |
| p/i BUFFER LAYER | | 3.5 | | | 100 | | | |
| RF p-LAYER | | | 0.1 | | 60 | | 12 | 2 |
| RF n-LAYER | 1.1 | | | | 50 | 260 | | |
| n/i BUFFER LAYER | | 3 | | | 80 | | | |
| MW i-LAYER | 35 | | | 34 | 145 | | | |
| p/i BUFFER LAYER | | 3 | | | 80 | | | |
| RF p-LAYER | | | 0.2 | | 60 | | 11 | 2 |
| RF n-LAYER | 0.8 | | | | 60 | 240 | | |
| n/i BUFFER LAYER | | 0.4 | 0.2 | | 50 | | | |
| RF i-LAYER | | 2.5 | | | 100 | | | |
| p/i BUFFER LAYER | | 0.4 | 0.25 | | 50 | | | |
| RF p-LAYER | | | 0.3 | | 60 | | 10 | 2 |

| SC-EMB-I7 | PRESSURE Torr | MW POWER W/cm³ | RF POWER W/cm³ | SUBSTRATE TEMPERA-TURE °C. | LAYER THICKNESS nm |
|---|---|---|---|---|---|
| RF n-LAYER | 1.15 | | 0.04 | 380 | 20 |
| n/i BUFFER LAYER | 0.9 | | 0.08 | 350 | 10 |
| MW i-LAYER | 0.006 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |

TABLE I7-continued

| | | | | | |
|---|---|---|---|---|---|
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.8 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| CONCENTRATION* (%) | 0.01 | 0.03 | 0.05 | 0.08 | 1 | 2 | 3 | 3.2 | 4 | 6 |
|---|---|---|---|---|---|---|---|---|---|---|
| CURVE FACTOR | X | Δ | ○ | ○ | ○ | ○ | ○ | ○ | Δ | X |
| OPTICAL DURABILITY | X | ○ | ○ | ○ | ○ | ○ | ○ | Δ | X | X |
| UNIFORMITY IN CHARACTERISTICS | X | Δ | ○ | ○ | ○ | ○ | ○ | ○ | X | X |
| SERIES-RESISTOR CHARACTERISTIC | X | Δ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
*: CONCENTRATION OF GROUP-V-ELEMENT GAS MIXED WITH $H_2$ GAS TO TOTAL $H_2$ GAS

TABLE I8

(1)

| | |
|---|---|
| $H_2$ GAS FLOW RATE (sccm) | 1200 |
| SPECIES OF SILICON COMPOUND GAS | $SiH_4$ |
| CONCENTRATION* (%) | 0.04 |
| SPECIES OF GROUP-V-ELEMENT COMPOUND GAS | $PF_3/H_2$ |
| CONCENTRATION** (%) | 0.01~6 |
| TYPE OF APPLIED POWER | MW |
| POWER (W/cm$^3$) | 0.07 |
| PRESSURE (Torr) | 0.007 |
| SUBSTRATE TEMPERATURE (°C.) FIRST/SECOND | 230/230 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

(2)

| SC-EMB-I8 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 140 | 260 | | |
| n/i BUFFER LAYER | | 3.5 | | | 100 | | | |
| MW i-LAYER | 47 | | | 51 | 170 | | | |
| p/i BUFFER LAYER | | 3.5 | | | 100 | | | |
| RF p-LAYER | | | 0.1 | | 60 | | 12 | 2 |
| RF n-LAYER | 1.1 | | | | 50 | 270 | | |
| n/i BUFFER LAYER | | 3 | | | 80 | | | |
| MW i-LAYER | 35 | | | 36 | 125 | | | |
| p/i BUFFER LAYER | | 3 | | | 80 | | | |
| RF p-LAYER | | | 0.2 | | 60 | | 11 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 75 | | | |
| p/i BUFFER LAYER | | 0.4 | 0.25 | | 50 | | | |
| RF p-LAYER | | | 0.3 | | 60 | | 10 | 2 |

| SC-EMB-I8 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |

TABLE I8-continued

| | | | | | |
|---|---|---|---|---|---|
| n/i BUFFER LAYER | 0.9 | | 0.08 | 350 | 10 |
| MW i-LAYER | 0.006 | 0.35 | 0.5 | 370 | 110 |
| p/i BUFFER LAYER | 0.9 | | 0.08 | 330 | 20 |
| RF p-LAYER | 1.5 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.8 | | 0.07 | 200 | 87 |
| p/i BUFFER LAYER | 1.2 | | 0.06 | 200 | 11 |
| RF p-LAYER | 1.4 | | 0.07 | 170 | 10 |

(3)

| CONCENTRATION* (%) | 0.01 | 0.03 | 0.05 | 0.08 | 1 | 2 | 3 | 3.2 | 4 | 6 |
|---|---|---|---|---|---|---|---|---|---|---|
| CURVE FACTOR | X | Δ | ○ | ○ | ○ | ○ | ○ | ○ | Δ | X |
| OPTICAL DURABILITY | X | ○ | ○ | ○ | ○ | ○ | ○ | Δ | X | X |
| UNIFORMITY IN CHARACTERISTICS | X | Δ | ○ | ○ | ○ | ○ | ○ | ○ | X | X |
| SERIES-RESISTOR CHARACTERISTIC | X | ○ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
*: CONCENTRATION OF GROUP-V-ELEMENT GAS MIXED WITH $H_2$ GAS TO TOTAL $H_2$ GAS

TABLE I9

(1)

| | |
|---|---|
| $H_2$ GAS FLOW RATE (sccm) | 1300 |
| SPECIES OF SILICON COMPOUND GAS | $SiH_4$ |
| CONCENTRATION* (%) | 0.0003~0.14 |
| SPECIES OF GROUP-V-ELEMENT COMPOUND GAS (DILUTION: %) | $PH_3/H_2$ (1%) |
| CONCENTRATION** (%) | 0.25 |
| TYPE OF APPLIED POWER | RF |
| POWER (W/cm$^3$) | 0.08 |
| PRESSURE (Torr) | 0.7 |
| SUBSTRATE TEMPERATURE (°C.) FIRST/SECOND | 260/230 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

(2)

| SC-EMB-I9 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 130 | 210 | | |
| n/i BUFFER LAYER | | 4 | | | 100 | | | |
| MW i-LAYER | 50 | | | 51 | 140 | | | |
| p/i BUFFER LAYER | | 3.5 | | | 100 | | | |
| RF p-LAYER | | | 0.1 | | 60 | | 12 | 2 |
| RF n-LAYER | 1.1 | | | | 50 | 270 | | |
| n/i BUFFER LAYER | | 3 | | | 80 | | | |
| MW i-LAYER | 34 | | | 36 | 130 | | | |
| p/i BUFFER LAYER | | 0.5 | 0.3 | | 60 | | | |
| RF p-LAYER | | | 0.2 | | 60 | | 11 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 60 | | | |
| p/i BUFFER LAYER | | 0.4 | 0.25 | | 50 | | | |
| RF p-LAYER | | | 0.3 | | 60 | | 10 | 2 |

TABLE I9-continued

| SC-EMB-I9 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.8 | | 0.08 | 350 | 10 |
| MW i-LAYER | 0.007 | 0.35 | 0.5 | 370 | 110 |
| p/i BUFFER LAYER | 0.9 | | 0.08 | 330 | 20 |
| RF p-LAYER | 1.6 | | 0.07 | 300 | 10 |
| RF n-LAYER | 1.1 | | 0.04 | 300 | 10 |
| n/i BUFFER LAYER | 0.8 | | 0.08 | 300 | 10 |
| MW i-LAYER | 0.006 | 0.25 | 0.5 | 330 | 100 |
| p/i BUFFER LAYER | 0.7 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.7 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| CONCENTRATION* (%) | 0.0003 | 0.0008 | 0.001 | 0.005 | 0.01 | 0.08 | 0.1 | 0.105 | 0.12 | 0.14 |
|---|---|---|---|---|---|---|---|---|---|---|
| CURVE FACTOR | X | Δ | ○ | ○ | ○ | ○ | ○ | ○ | Δ | X |
| OPTICAL DURABILITY | X | ○ | ○ | ○ | ○ | ○ | ○ | Δ | X | X |
| UNIFORMITY IN CHARACTERISTICS | X | Δ | ○ | ○ | ○ | ○ | ○ | Δ | X | X |
| SERIES-RESISTOR CHARACTERISTIC | X | Δ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
*: CONCENTRATION OF SILICON COMPOUND GAS MIXED WITH $H_2$ GAS TO TOTAL $H_2$ GAS

TABLE I10

(1)

| | |
|---|---|
| $H_2$ GAS FLOW RATE (sccm) | 1200 |
| SPECIES OF SILICON COMPOUND GAS | $SiH_4$ |
| CONCENTRATION* (%) | 0.0003~0.14 |
| SPECIES OF GROUP-V-ELEMENT COMPOUND GAS (DILUTION: %) | $PH_3/H_2$ (1%) |
| CONCENTRATION** (%) | 0.3 |
| TYPE OF APPLIED POWER | VHF |
| POWER (W/cm$^3$) | 0.15 |
| PRESSURE (Torr) | 0.02 |
| SUBSTRATE TEMPERATURE (°C.) FIRST/SECOND | 260/230 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

(2)

| SC-EMB-I10 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 140 | 200 | | |
| n/i BUFFER LAYER | | 4 | | | 100 | | | |
| MW i-LAYER | 49 | | | 52 | 155 | | | |
| p/i BUFFER LAYER | | 3.5 | | | 100 | | | |
| RF p-LAYER | | | 0.1 | | 60 | | 11 | 2 |
| RF n-LAYER | 1.1 | | | | 50 | 270 | | |
| n/i BUFFER LAYER | | 3 | | | 80 | | | |
| MW i-LAYER | 34 | | | 36 | 120 | | | |
| p/i BUFFER LAYER | | 0.4 | 0.2 | | 60 | | | |
| RF p-LAYER | | | 0.2 | | 60 | | 10 | 2 |

TABLE I10-continued

| | | | | | | | | |
|---|---|---|---|---|---|---|---|---|
| RF n-LAYER | 0.8 | | | | 50 | 250 | | |
| n/i BUFFER LAYER | | 0.3 | 0.2 | | 50 | | | |
| RF i-LAYER | | 2.5 | | | 60 | | | |
| p/i BUFFER LAYER | | 0.4 | 0.25 | | 50 | | | |
| RF p-LAYER | | | 0.3 | | 60 | | 9 | 2 |

| SC-EMB-I10 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| CONCENTRATION* (%) | 0.0003 | 0.0008 | 0.001 | 0.005 | 0.01 | 0.08 | 0.1 | 0.105 | 0.12 | 0.14 |
|---|---|---|---|---|---|---|---|---|---|---|
| CURVE FACTOR | X | Δ | ○ | ○ | ○ | ○ | ○ | ○ | Δ | X |
| OPTICAL DURABILITY | X | ○ | ○ | ○ | ○ | ○ | ○ | Δ | X | X |
| UNIFORMITY IN CHARACTERISTICS | X | Δ | ○ | ○ | ○ | ○ | ○ | Δ | X | X |
| SERIES-RESISTOR CHARACTERISTIC | X | ○ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | Δ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
*: CONCENTRATION OF SILICON COMPOUND GAS MIXED WITH $H_2$ GAS TO TOTAL $H_2$ GAS

TABLE I11

(1)

| | |
|---|---|
| $H_2$ GAS FLOW RATE (sccm) | 1100 |
| SPECIES OF SILICON COMPOUND GAS | $SiH_4$ |
| CONCENTRATION* (%) | 0.0003~0.14 |
| SPECIES OF GROUP-V-ELEMENT COMPOUND GAS (DILUTION: %) | $PH_3/H_2$ (1%) |
| CONCENTRATION** (%) | 0.4 |
| TYPE OF APPLIED POWER | MW |
| POWER (W/cm$^3$) | 0.08 |
| PRESSURE (Torr) | 0.007 |
| SUBSTRATE TEMPERATURE (°C.) FIRST/SECOND | 235/230 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

(2)

| SC-EMB-I11 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 230 | 25 | | |
| n/i BUFFER LAYER | | 4 | | | 100 | | | |
| MW i-LAYER | 49 | | | 50 | 170 | | | |

TABLE I11-continued

| | | | | | | | | |
|---|---|---|---|---|---|---|---|---|
| p/i BUFFER LAYER | | 3.5 | | | 95 | | | |
| RF p-LAYER | | | 0.1 | | 60 | | 10 | 2 |
| RF n-LAYER | 1.1 | | | | 250 | 27 | | |
| n/i BUFFER LAYER | | 0.4 | 0.2 | | 80 | | | |
| MW i-LAYER | 34 | | | 36 | 150 | | | |
| p/i BUFFER LAYER | | 0.4 | 0.2 | | 60 | | | |
| RF p-LAYER | | | 0.2 | | 60 | | 10 | 2 |
| RF n-LAYER | 0.8 | | | | 250 | 25 | | |
| n/i BUFFER LAYER | | 0.3 | 0.2 | | 50 | | | |
| RF i-LAYER | | 2.5 | | | 60 | | | |
| p/i BUFFER LAYER | | 0.4 | 0.25 | | 50 | | | |
| RF p-LAYER | | | 0.3 | | 60 | | 10 | 2 |

| SC-EMB-I11 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.1 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| CONCENTRATION (%)* | 0.0003 | 0.0008 | 0.001 | 0.005 | 0.01 | 0.08 | 0.1 | 0.105 | 0.12 | 0.14 |
|---|---|---|---|---|---|---|---|---|---|---|
| CURVE FACTOR | X | ○ | ○ | ○ | ○ | ○ | ○ | ○ | Δ | X |
| OPTICAL DURABILITY | X | Δ | ○ | ○ | ○ | ○ | ○ | Δ | X | X |
| UNIFORMITY IN CHARACTERISTICS | X | Δ | ○ | ○ | ○ | ○ | ○ | Δ | X | X |
| SERIES-RESISTOR CHARACTERISTIC | X | ○ | ○ | ○ | ○ | ○ | ○ | ○ | X | X |
| DURABILITY | X | Δ | ○ | ○ | ○ | ○ | ○ | Δ | X | X |
| CHARACTERISTICS WITH REVERSE BIAS VOLTAGE APPLIED | X | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
*: CONCENTRATION OF SILICON COMPOUND GAS MIXED WITH $H_2$ GAS TO TOTAL $H_2$ GAS

TABLE I12

(1)

| | |
|---|---|
| $H_2$ GAS FLOW RATE (sccm) | 1300 |
| SPECIES OF SILICON COMPOUND GAS | $Si_2H_6$ |
| CONCENTRATION* (%) | 0.05 |
| SPECIES OF GROUP-V-ELEMENT COMPOUND GAS (DILUTION: %) | $PF_3/H_2$ (1%) |
| CONCENTRATION** (%) | 0.3 |
| TYPE OF APPLIED POWER | RF |
| POWER (W/cm$^3$) | 0.35 |
| PRESSURE (Torr) | 0.01~100 |
| SUBSTRATE TEMPERATURE (°C.) FIRST/SECOND | 270/230 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

TABLE I12-continued (2)

| SC-EMB-I12 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 130 | 200 | | |
| n/i BUFFER LAYER | | 3.5 | | | 130 | | | |
| MW i-LAYER | 46 | | | 48 | 155 | | | |
| p/i BUFFER LAYER | | 3.5 | | | 120 | | | |
| RF p-LAYER | | | 0.1 | | 60 | | 10 | 2 |
| RF n-LAYER | 1.1 | | | | 50 | 270 | | |
| n/i BUFFER LAYER | | 0.4 | 0.2 | | 80 | | | |
| MW i-LAYER | 33 | | | 36 | 155 | | | |
| p/i BUFFER LAYER | | 0.4 | 0.2 | | 60 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 65 | | | |
| p/i BUFFER LAYER | | 0.4 | 0.25 | | 50 | | | |
| RF p-LAYER | | | 0.3 | | 60 | | 10 | 2 |

| SC-EMB-I12 | PRESSURE Torr | MW POWER W/cm³ | RF POWER W/cm³ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.35 | 0.5 | 370 | 110 |
| p/i BUFFER LAYER | 0.8 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.6 | | 0.07 | 260 | 10 |
| RF n-LAYER | 1.05 | | 0.04 | 230 | 10 |
| n/i BUFFER LAYER | 0.3 | | 0.06 | 230 | 10 |
| RF i-LAYER | 1.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| PRESSURE (Torr) | 0.01 | 0.03 | 0.05 | 1 | 3 | 5 | 10 | 11 | 20 | 100 |
|---|---|---|---|---|---|---|---|---|---|---|
| CURVE FACTOR | X | ○ | ○ | ○ | ○ | ○ | ○ | Δ | X | X |
| OPTICAL DURABILITY | X | Δ | ○ | ○ | ○ | ○ | ○ | ○ | Δ | X |
| UNIFORMITY IN CHARACTERISTICS | X | Δ | ○ | ○ | ○ | ○ | ○ | Δ | X | X |
| SERIES-RESISTOR CHARACTERISTIC | X | ○ | ○ | ○ | ○ | ○ | ○ | ○ | X | X |
| DURABILITY | X | Δ | ○ | ○ | ○ | ○ | ○ | Δ | X | X |
| CHARACTERISTICS WITH REVERSE BIAS VOLTAGE APPLIED | X | Δ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS

TABLE I13

(1)

| | |
|---|---|
| $H_2$ GAS FLOW RATE (sccm) | 1250 |
| SPECIES OF SILICON COMPOUND GAS | $Si_2H_6$ |
| CONCENTRATION* (%) | 0.04 |
| SPECIES OF GROUP-V-ELEMENT COMPOUND GAS | $PF_3/H_2$ (1%) |
| (DILUTION: %) CONCENTRATION** (%) | 0.3 |
| TYPE OF APPLIED POWER | VHF |
| POWER (W/cm³) | 0.02 |
| PRESSURE (mTorr) | 0.03~10000 |
| SUBSTRATE TEMPERATURE (°C.) FIRST/SECOND | 270/230 |

TABLE I13-continued

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

(2)

| SC-EMB-I13 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.4 | | | | 130 | 200 | | |
| n/i BUFFER LAYER | | 2.5 | | | 130 | | | |
| MW i-LAYER | 45 | | | 46 | 145 | | | |
| p/i BUFFER LAYER | | 2.5 | | | 120 | | | |
| RF p-LAYER | | | 0.1 | | 60 | | 10 | 2 |
| RF n-LAYER | 1.0 | | | | 30 | 270 | | |
| n/i BUFFER LAYER | | 0.4 | 0.2 | | 80 | | | |
| MW i-LAYER | 33 | | | 29 | 130 | | | |
| p/i BUFFER LAYER | | 0.4 | 0.2 | | 60 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.2 | | | 65 | | | |
| p/i BUFFER LAYER | | 0.4 | 0.25 | | 50 | | | |
| RF p-LAYER | | | 0.3 | | 60 | | 10 | 2 |

| SC-EMB-I13 | PRESSURE Torr | MW POWER $W/cm^3$ | RF POWER $W/cm^3$ | SUBSTRATE TEMPERATURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| PRESSURE (mTorr) | 0.03 | 0.08 | 0.1 | 1 | 100 | 500 | 100 | 1100 | 2000 | 1000 |
|---|---|---|---|---|---|---|---|---|---|---|
| CURVE FACTOR | X | Δ | ○ | ○ | ○ | ○ | ○ | ○ | Δ | X |
| OPTICAL DURABILITY | X | ○ | ○ | ○ | ○ | ○ | ○ | ○ | Δ | X |
| UNIFORMITY IN CHARACTERISTICS | X | Δ | ○ | ○ | ○ | ○ | ○ | Δ | X | X |
| SERIES-RESISTOR CHARACTERISTIC | X | ○ | ○ | ○ | ○ | ○ | ○ | ○ | X | X |
| DURABILITY | X | Δ | ○ | ○ | ○ | ○ | ○ | Δ | X | X |
| CHARACTERISTICS WITH REVERSE BIAS VOLTAGE APPLIED | X | Δ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS

TABLE I14

(1)

| | |
|---|---|
| $H_2$ GAS FLOW RATE (sccm) | 900 |
| SPECIES OF SILICON COMPOUND GAS | $SiF_4$ |
| CONCENTRATION* (%) | 0.03 |
| SPECIES OF GROUP-V-ELEMENT COMPOUND GAS (DILUTION: %) | $PF_3/H_2$ (1%) |
| CONCENTRATION** (%) | 0.5 |
| TYPE OF APPLIED POWER | MW |
| POWER (W/cm$^3$) | 0.15 |
| PRESSURE (mTorr) | 0.03~100 |
| SUBSTRATE TEMPERATURE (°C.) FIRST/SECOND | 225/225 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

(2)

| SC-EMB-I14 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 140 | 200 | | |
| n/i BUFFER LAYER | | 3 | | | 120 | | | |
| MW i-LAYER | 45 | | | 46 | 140 | | | |
| p/i BUFFER LAYER | | 0.35 | 0.2 | | 120 | | | |
| RF p-LAYER | | | 0.1 | | 60 | | 10 | 2 |
| RF n-LAYER | 1.0 | | | | 30 | 270 | | |
| n/i BUFFER LAYER | | 0.4 | 0.2 | | 80 | | | |
| MW i-LAYER | 35 | | | 30 | 130 | | | |
| p/i BUFFER LAYER | | 0.4 | 0.2 | | 70 | | | |
| RF p-LAYER | | | 0.2 | | 60 | | 10 | 2 |
| RF n-LAYER | 0.8 | | | | 50 | 250 | | |
| n/i BUFFER LAYER | | 0.3 | 0.2 | | 50 | | | |
| RF i-LAYER | | 2.2 | | | 55 | | | |
| p/i BUFFER LAYER | | 0.4 | 0.25 | | 60 | | | |
| RF p-LAYER | | | 0.4 | | 60 | | 10 | 2 |

| SC-EMB-I14 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.007 | 0.35 | 0.5 | 370 | 110 |
| p/i BUFFER LAYER | 0.9 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 12 |
| RF p-LAYER | 1.6 | | 0.07 | 170 | 10 |

(3)

| PRESSURE (mTorr) | 0.03 | 0.08 | 0.1 | 0.5 | 1 | 5 | 10 | 11 | 20 | 100 |
|---|---|---|---|---|---|---|---|---|---|---|
| CURVE FACTOR | X | Δ | ○ | ○ | ○ | ○ | ○ | ○ | Δ | X |
| OPTICAL DURABILITY | X | Δ | ○ | ○ | ○ | ○ | ○ | ○ | Δ | X |
| UNIFORMITY IN CHARACTERISTICS | X | ○ | ○ | ○ | ○ | ○ | ○ | Δ | X | X |
| SERIES-RESISTOR CHARACTERISTIC | X | ○ | ○ | ○ | ○ | ○ | ○ | ○ | X | X |
| DURABILITY | X | Δ | ○ | ○ | ○ | ○ | ○ | Δ | X | X |
| CHARACTERISTICS WITH REVERSE BIAS VOLTAGE APPLIED | X | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS

TABLE I15

(1)

| | |
|---|---|
| $H_2$ GAS FLOW RATE (sccm) | 1500 |
| SPECIES OF SILICON COMPOUND GAS | $SiH_4$ |
| CONCENTRATION* (%) | 0.05 |
| SPECIES OF GROUP-V-ELEMENT COMPOUND GAS | $PF_3/H_2$ (1%) |
| (DILUTION: %) | 0.2 |
| CONCENTRATION** (%) | |
| TYPE OF APPLIED POWER | RF |
| POWER ($W/cm^3$) | 0.003~10 |
| PRESSURE (Torr) | 0.60 |
| SUBSTRATE TEMPERATURE (°C.) FIRST/SECOND | 260/230 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

(2)

| SC-EMB-I15 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.4 | | | | 130 | 200 | | |
| n/i BUFFER LAYER | | 0.4 | 0.1 | | 120 | | | |
| MW i-LAYER | 45 | | | 47 | 150 | | | |
| p/i BUFFER LAYER | | 0.35 | 0.2 | | 120 | | | |
| RF p-LAYER | | | 0.1 | | 60 | | 8 | 2 |
| RF n-LAYER | 1.0 | | | | 30 | 270 | | |
| n/i BUFFER LAYER | | 0.4 | 0.2 | | 80 | | | |
| MW i-LAYER | 35 | | | 28 | 130 | | | |
| p/i BUFFER LAYER | | 0.4 | 0.2 | | 70 | | | |
| RF p-LAYER | | | 0.2 | | 60 | | 7 | 2 |
| RF n-LAYER | 0.8 | | | | 50 | 250 | | |
| n/i BUFFER LAYER | | 0.3 | 0.2 | | 50 | | | |
| RF i-LAYER | | 2.2 | | | 50 | | | |
| p/i BUFFER LAYER | | 0.4 | 0.25 | | 60 | | | |
| RF p-LAYER | | | 0.4 | | 60 | | 6 | 2 |

| SC-EMB-I15 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.1 | | 0.04 | 380 | 20 |
| n/i BUFFER LAYER | 0.9 | | 0.08 | 350 | 10 |
| MW i-LAYER | 0.007 | 0.35 | 0.5 | 370 | 110 |
| p/i BUFFER LAYER | 0.9 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.7 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| POWER DENSITY ($W/cm^3$) | 0.003 | 0.007 | 0.01 | 0.05 | 0.1 | 0.7 | 1.0 | 1.1 | 3.0 | 10 |
|---|---|---|---|---|---|---|---|---|---|---|
| CURVE FACTOR | X | Δ | ○ | ○ | ○ | ○ | ○ | ○ | Δ | X |
| OPTICAL DURABILITY | X | ○ | ○ | ○ | ○ | ○ | ○ | ○ | Δ | X |
| UNIFORMITY IN CHARACTERISTICS | X | ○ | ○ | ○ | ○ | ○ | ○ | ○ | X | X |
| SERIES-RESISTOR CHARACTERISTIC | X | ○ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | Δ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS

TABLE I16

(1)

| | |
|---|---|
| $H_2$ GAS FLOW RATE (sccm) | 1400 |
| SPECIES OF SILICON COMPOUND GAS | $Si_2H_6$ |
| CONCENTRATION* (%) | 0.04 |
| SPECIES OF GROUP-V-ELEMENT COMPOUND GAS | $PF_3/H_2$ (1%) |
| (DILUTION: %) | |
| CONCENTRATION** (%) | 0.2 |
| TYPE OF APPLIED POWER | VHF |
| POWER (W/cm$^3$) | 0.003~10 |
| PRESSURE (Torr) | 0.008 |
| SUBSTRATE TEMPERATURE (°C.) FIRST/SECOND | 150/150 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

(2)

| SC-EMB-I16 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 110 | 200 | | |
| n/i BUFFER LAYER | | 0.4 | 0.1 | | 110 | | | |
| MW i-LAYER | 44 | | | 45 | 150 | | | |
| p/i BUFFER LAYER | | 0.35 | 0.2 | | 120 | | | |
| RF p-LAYER | | | 0.1 | | 60 | | 9 | 2 |
| RF n-LAYER | 1.0 | | | | 30 | 270 | | |
| n/i BUFFER LAYER | | 0.4 | 0.2 | | 80 | | | |
| MW i-LAYER | 35 | | | 28 | 120 | | | |
| p/i BUFFER LAYER | | 0.4 | 0.2 | | 70 | | | |
| RF p-LAYER | | | 0.2 | | 60 | | 8 | 2 |
| RF n-LAYER | 0.8 | | | | 50 | 250 | | |
| n/i BUFFER LAYER | | 0.3 | 0.2 | | 50 | | | |
| RF i-LAYER | | 2.1 | | | 60 | | | |
| p/i BUFFER LAYER | | 0.4 | 0.25 | | 60 | | | |
| RF p-LAYER | | | 0.4 | | 60 | | 7 | 2 |

| SC-EMB-I16 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.24 | 0.5 | 330 | 100 |
| p/i BUFFER LAYER | 0.8 | | 0.08 | 280 | 20 |
| RF p-LAYER | 1.6 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| POWER DENSITY (W/cm$^3$) | 0.003 | 0.007 | 0.01 | 0.05 | 0.1 | 0.7 | 1.0 | 1.1 | 3.0 | 10 |
|---|---|---|---|---|---|---|---|---|---|---|
| CURVE FACTOR | X | Δ | ○ | ○ | ○ | ○ | ○ | ○ | Δ | X |
| OPTICAL DURABILITY | X | ○ | ○ | ○ | ○ | ○ | ○ | ○ | Δ | X |
| UNIFORMITY IN CHARACTERISTICS | X | ○ | ○ | ○ | ○ | ○ | ○ | ○ | X | X |
| SERIES-RESISTOR CHARACTERISTIC | X | ○ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS

TABLE I17

(1)

| | |
|---|---|
| $H_2$ GAS FLOW RATE (sccm) | 1850 |
| SPECIES OF SILICON COMPOUND GAS | $SiCl_2H_2$ |
| CONCENTRATION* (%) | 0.01 |
| SPECIES OF GROUP-V-ELEMENT COMPOUND GAS (DILUTION: %) | $PF_3/H_2$ (10%) |
| CONCENTRATION** (%) | 0.08 |
| TYPE OF APPLIED POWER | MW |
| POWER ($W/cm^3$) | 0.03~100 |
| PRESSURE (Torr) | 0.007 |
| SUBSTRATE TEMPERATURE (°C.) FIRST/SECOND | 135/130 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

(2)

| SC-EMB-I17 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 120 | 200 | | |
| n/i BUFFER LAYER | | 0.4 | 0.2 | | 110 | | | |
| MW i-LAYER | 42 | | | 44 | 160 | | | |
| p/i BUFFER LAYER | | 0.35 | 0.2 | | 120 | | | |
| RF p-LAYER | | | 0.1 | | 60 | | 9 | 1.7 |
| RF n-LAYER | 1.0 | | | | 30 | 270 | | |
| n/i BUFFER LAYER | | 0.4 | 0.2 | | 80 | | | |
| MW i-LAYER | 33 | | | 28 | 150 | | | |
| p/i BUFFER LAYER | | 0.4 | 0.2 | | 70 | | | |
| RF p-LAYER | | | 0.2 | | 60 | | 8 | 1.8 |
| RF n-LAYER | 0.8 | | | | 50 | 250 | | |
| n/i BUFFER LAYER | | 0.3 | 0.2 | | 50 | | | |
| RF i-LAYER | | 2.1 | | | 80 | | | |
| p/i BUFFER LAYER | | 0.4 | 0.25 | | 60 | | | |
| RF p-LAYER | | | 0.4 | | 60 | | 7 | 1.8 |

| SC-EMB-I17 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.8 | | 0.08 | 350 | 10 |
| MW i-LAYER | 0.006 | 0.35 | 0.5 | 370 | 110 |
| p/i BUFFER LAYER | 0.8 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.24 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| POWER DENSITY ($W/cm^3$) | 0.03 | 0.07 | 0.1 | 0.5 | 1 | 7 | 10 | 11 | 30 | 100 |
|---|---|---|---|---|---|---|---|---|---|---|
| CURVE FACTOR | X | Δ | ○ | ○ | ○ | ○ | ○ | ○ | Δ | X |
| OPTICAL DURABILITY | X | ○ | ○ | ○ | ○ | ○ | ○ | Δ | Δ | X |
| UNIFORMITY IN CHARACTERISTICS | X | Δ | ○ | ○ | ○ | ○ | ○ | ○ | X | X |
| SERIES-RESISTOR CHARACTERISTIC | X | ○ | ○ | ○ | ○ | ○ | ○ | ○ | X | X |
| DURABILITY | X | Δ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS

TABLE I18

(1)

| | |
|---|---|
| $H_2$ GAS FLOW RATE (sccm) | 1200 |
| SPECIES OF SILICON COMPOUND GAS | $SiH_4$ |
| CONCENTRATION* (%) | 0.07 |
| SPECIES OF GROUP-V-ELEMENT COMPOUND GAS | $PH_3/H_2$ (1%) |
| (DILUTION: %) CONCENTRATION** (%) | 0.2 |
| TYPE OF APPLIED POWER | RF |
| POWER ($W/cm^3$) | 0.35 |
| PRESSURE (Torr) | 1.2 |
| SUBSTRATE TEMPERATURE (°C.) FIRST/SECOND | 50/520 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

(2)

| SC-EMB-I18 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 120 | 200 | | |
| n/i BUFFER LAYER | | 0.4 | 0.2 | | 110 | | | |
| MW i-LAYER | 42 | | | 43 | 160 | | | |
| p/i BUFFER LAYER | | 0.35 | 0.2 | | 120 | | | |
| RF p-LAYER | | | 0.1 | | 60 | | 9 | 1.7 |
| RF n-LAYER | 1.0 | | | | 30 | 270 | | |
| n/i BUFFER LAYER | | 0.4 | 0.2 | | 80 | | | |
| MW i-LAYER | 33 | | | 29 | 150 | | | |
| p/i BUFFER LAYER | | 0.4 | 0.2 | | 70 | | | |
| RF p-LAYER | | | 0.2 | | 60 | | 9 | 1.8 |
| RF n-LAYER | 0.8 | | | | 50 | 250 | | |
| n/i BUFFER LAYER | | 0.3 | 0.2 | | 50 | | | |
| RF i-LAYER | | 2.1 | | | 75 | | | |
| p/i BUFFER LAYER | | 0.4 | 0.25 | | 60 | | | |
| RF p-LAYER | | | 0.4 | | 60 | | 7 | 2 |

| SC-EMB-I18 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.8 | | 0.08 | 350 | 10 |
| MW i-LAYER | 0.006 | 0.35 | 0.5 | 370 | 110 |
| p/i BUFFER LAYER | 0.8 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.24 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| SUBSTRATE TEMPERATURE (°C.) | 50 | 75 | 100 | 150 | 200 | 300 | 400 | 420 | 450 | 520 |
|---|---|---|---|---|---|---|---|---|---|---|
| CURVE FACTOR | X | ○ | ○ | ○ | ○ | ○ | ○ | Δ | X | X |
| OPTICAL DURABILITY | X | Δ | ○ | ○ | ○ | ○ | ○ | ○ | X | X |
| UNIFORMITY IN CHARACTERISTICS | X | Δ | ○ | ○ | ○ | ○ | ○ | Δ | X | X |
| SERIES-RESISTOR CHARACTERISTIC | X | Δ | ○ | ○ | ○ | ○ | ○ | ○ | X | X |
| DURABILITY | X | Δ | ○ | ○ | ○ | ○ | ○ | Δ | X | X |
| CHARACTERISTICS WITH REVERSE BIAS VOLTAGE APPLIED | X | ○ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS

TABLE I19

(1)

| | |
|---|---|
| $H_2$ GAS FLOW RATE (sccm) | 1600 |
| SPECIES OF SILICON COMPOUND GAS | $SiCl_4$ |
| CONCENTRATION* (%) | 0.03 |
| SPECIES OF GROUP-V-ELEMENT COMPOUND GAS (DILUTION: %) | $PF_3/H_2$ (10%) |
| CONCENTRATION** (%) | 0.3 |
| TYPE OF APPLIED POWER | VHF |
| POWER ($W/cm^3$) | 0.25 |
| PRESSURE (Torr) | 1.009 |
| SUBSTRATE TEMPERATURE (°C.) FIRST/SECOND | 30~420 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

(2)

| SC-EMB-I19 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.4 | | | | 130 | 200 | | |
| n/i BUFFER LAYER | | 0.4 | 0.1 | | 120 | | | |
| MW i-LAYER | 45 | | | 47 | 160 | | | |
| p/i BUFFER LAYER | | 0.35 | 0.2 | | 120 | | | |
| RF p-LAYER | | | 0.1 | | 60 | | 9 | 2 |
| RF n-LAYER | 1.0 | | | | 30 | 270 | | |
| n/i BUFFER LAYER | | 0.4 | 0.2 | | 80 | | | |
| MW i-LAYER | 35 | | | 28 | 150 | | | |
| p/i BUFFER LAYER | | 0.4 | 0.2 | | 70 | | | |
| RF p-LAYER | | | 0.2 | | 60 | | 8 | 2 |
| RF n-LAYER | 0.8 | | | | 50 | 250 | | |
| n/i BUFFER LAYER | | 0.3 | 0.2 | | 50 | | | |
| RF i-LAYER | | 2.2 | | | 55 | | | |
| p/i BUFFER LAYER | | 0.4 | 0.25 | | 60 | | | |
| RF p-LAYER | | | 0.4 | | 60 | | 8 | 2 |

| SC-EMB-I19 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.1 | | 0.04 | 380 | 20 |
| n/i BUFFER LAYER | 0.9 | | 0.08 | 350 | 10 |
| MW i-LAYER | 0.006 | 0.36 | 0.5 | 370 | 110 |
| p/i BUFFER LAYER | 0.9 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.7 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| SUBSTRATE TEMPERATURE (°C.) | 30 | 40 | 50 | 100 | 200 | 250 | 300 | 320 | 350 | 420 |
|---|---|---|---|---|---|---|---|---|---|---|
| CURVE FACTOR | X | ○ | ○ | ○ | ○ | ○ | ○ | Δ | X | X |
| OPTICAL DURABILITY | X | Δ | ○ | ○ | ○ | ○ | ○ | ○ | X | X |
| UNIFORMITY IN CHARACTERISTICS | X | ○ | ○ | ○ | ○ | ○ | ○ | ○ | X | X |
| SERIES-RESISTOR CHARACTERISTIC | X | Δ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | ○ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS

TABLE I20

(1)

| | |
|---|---|
| $H_2$ GAS FLOW RATE (sccm) | 1750 |
| SPECIES OF SILICON COMPOUND GAS | $SiCl_2H_2$ |
| CONCENTRATION* (%) | 0.02 |
| SPECIES OF GROUP-V-ELEMENT COMPOUND GAS | $PF_5/H_2$ (10%) |
| (DILUTION: %) | 0.3 |
| CONCENTRATION** (%) | |
| TYPE OF APPLIED POWER | MW |
| POWER (W/cm$^3$) | 0.35 |
| PRESSURE (Torr) | 0.008 |
| SUBSTRATE TEMPERATURE (°C.) | 30~420 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

(2)

| SC-EMB-I20 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 110 | 200 | | |
| n/i BUFFER LAYER | | 0.4 | 0.1 | | 110 | | | |
| MW i-LAYER | 44 | | | 45 | 150 | | | |
| p/i BUFFER LAYER | | 0.35 | 0.2 | | 120 | | | |
| RF p-LAYER | | | 0.1 | | 60 | | 9 | 2 |
| RF n-LAYER | 1.0 | | | | 30 | 270 | | |
| n/i BUFFER LAYER | | 0.4 | 0.2 | | 80 | | | |
| MW i-LAYER | 35 | | | 28 | 150 | | | |
| p/i BUFFER LAYER | | 0.4 | 0.2 | | 70 | | | |
| RF p-LAYER | | | 0.2 | | 60 | | 9 | 2 |
| RF n-LAYER | 0.8 | | | | 50 | 250 | | |
| n/i BUFFER LAYER | | 0.3 | 0.2 | | 50 | | | |
| RF i-LAYER | | 2.1 | | | 90 | | | |
| p/i BUFFER LAYER | | 0.4 | 0.25 | | 60 | | | |
| RF p-LAYER | | | 0.4 | | 60 | | 7 | 2 |

| SC-EMB-I20 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.007 | 0.35 | 0.5 | 370 | 110 |
| p/i BUFFER LAYER | 0.9 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.24 | 0.5 | 330 | 100 |
| p/i BUFFER LAYER | 0.8 | | 0.08 | 280 | 20 |
| RF p-LAYER | 1.6 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| SUBSTRATE TEMPERATURE (°C.) | 30 | 40 | 50 | 100 | 200 | 250 | 300 | 320 | 350 | 420 |
|---|---|---|---|---|---|---|---|---|---|---|
| CURVE FACTOR | X | ○ | Δ | ○ | ○ | ○ | ○ | ○ | Δ | X |
| OPTICAL DURABILITY | X | ○ | ○ | ○ | ○ | ○ | ○ | ○ | Δ | X |
| UNIFORMITY IN CHARACTERISTICS | X | Δ | ○ | ○ | ○ | ○ | ○ | Δ | X | X |
| SERIES-RESISTOR CHARACTERISTIC | X | ○ | ○ | ○ | ○ | ○ | ○ | ○ | Δ | X |
| DURABILITY | X | ○ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS

TABLE I21

(1)

| | |
|---|---|
| $H_2$ GAS FLOW RATE (sccm) | 1100 |
| SPECIES OF SILICON COMPOUND GAS | $SiH_4/H_2$ |
| CONCENTRATION* (%) | 0.03 |
| TYPE OF APPLIED POWER | RF |
| POWER ($W/cm^3$) | 0.05 |
| PRESSURE (Torr) | 0.8 |
| SUBSTRATE TEMPERATURE (°C.) | 360 |

*: ($SiH_4$ GAS FLOW RATE)/(TOTAL $H_2$ GAS FLOW RATE)

(2)

| | |
|---|---|
| $H_2$ GAS FLOW RATE (sccm) | 1450 |
| SPECIES OF SILICON COMPOUND GAS | $SiH_4$ |
| CONCENTRATION* (%) | 0.03 |
| TYPE OF APPLIED POWER | RF |
| POWER ($W/cm^3$) | 0.04 |
| PRESSURE (Torr) | 0.9 |
| SUBSTRATE TEMPERATURE (°C.) | 350 |

*: ($SiH_4$ GAS FLOW RATE)/(TOTAL $H_2$ GAS FLOW RATE)

(3)

| | |
|---|---|
| $H_2$ GAS FLOW RATE (sccm) | 750 |
| SPECIES OF SILICON COMPOUND GAS | $SiH_4$ |
| CONCENTRATION* (%) | 0.04 |
| TYPE OF APPLIED POWER | RF |
| POWER ($W/cm^3$) | 0.04 |
| PRESSURE (Torr) | 0.8 |
| SUBSTRATE TEMPERATURE (°C.) | 350 |

*: (SILICON COMPOUND GAS FLOW RATE)/(TOTAL $H_2$ GAS FLOW RATE)

(4)

| | |
|---|---|
| $H_2$ GAS FLOW RATE (sccm) | 1150 |
| SPECIES OF SILICON COMPOUND GAS | $SiH_4$ |
| CONCENTRATION* (%) | 0.04 |
| TYPE OF APPLIED POWER | RF |
| POWER ($W/cm^3$) | 0.04 |
| PRESSURE (Torr) | 0.8 |
| SUBSTRATE TEMPERATURE (°C.) | 330 |

*: (SILICON COMPOUND GAS FLOW RATE)/(TOTAL $H_2$ GAS FLOW RATE)

(5)

| | |
|---|---|
| $H_2$ GAS FLOW RATE (sccm) | 1500 |
| SPECIES OF SILICON COMPOUND GAS | $SiH_4$ |
| CONCENTRATION* (%) | 0.05 |
| TYPE OF APPLIED POWER | RF |
| POWER ($W/cm^3$) | 0.04 |
| PRESSURE (Torr) | 0.7 |
| SUBSTRATE TEMPERATURE (°C.) | 300 |

*: ($SiH_4$ GAS FLOW RATE)/(TOTAL $H_2$ GAS FLOW RATE)

(6)

| | |
|---|---|
| $H_2$ GAS FLOW RATE (sccm) | 1200 |
| SPECIES OF SILICON COMPOUND GAS | $SiH_4$ |
| CONCENTRATION* (%) | 0.03 |
| SPECIES OF GROUP-V-ELEMENT COMPOUND GAS (DILUTION: %) | $PH_3/H_2$ (10%) |
| CONCENTRATION** (%) | 1.8 |
| TYPE OF APPLIED POWER | RF |
| POWER ($W/cm^3$) | 0.04 |
| PRESSURE (Torr) | 0.7 |
| SUBSTRATE TEMPERATURE (°C.) | 300 |

*: (SILICON COMPOUND GAS FLOW RATE)/(TOTAL $H_2$ GAS FLOW RATE)
**: (GROUP-V-ELEMENT COMPOUND GAS FLOW RATE)/(TOTAL $H_2$ GAS FLOW RATE)

(7)

| | |
|---|---|
| $H_2$ GAS FLOW RATE (sccm) | 1650 |
| SPECIES OF SILICON COMPOUND GAS | $SiH_4$ |
| CONCENTRATION* (%) | 0.05 |
| TYPE OF APPLIED POWER | RF |
| POWER ($W/cm^3$) | 0.05 |

TABLE I21-continued

| | |
|---|---|
| PRESSURE (Torr) | 0.75 |
| SUBSTRATE TEMPERATURE (°C.) | 300 |

*: ($SiH_4$ GAS FLOW RATE)/(TOTAL $H_2$ GAS FLOW RATE)

(8)

| | |
|---|---|
| $H_2$ GAS FLOW RATE (sccm) | 1600 |
| SPECIES OF SILICON COMPOUND GAS | $SiH_4$ |
| CONCENTRATION* (%) | 0.05 |
| TYPE OF APPLIED POWER | RF |
| POWER ($W/cm^3$) | 0.05 |
| PRESSURE (Torr) | 0.75 |
| SUBSTRATE TEMPERATURE (°C.) | 300 |

*: (SILICON COMPOUND GAS FLOW RATE)/($H_2$ GAS FLOW RATE)

(9)

| | |
|---|---|
| $H_2$ GAS FLOW RATE (sccm) | 1200 |
| SPECIES OF SILICON COMPOUND GAS | $SiH_4$ |
| CONCENTRATION* (%) | 0.03 |
| TYPE OF APPLIED POWER | RF |
| POWER ($W/cm^3$) | 0.04 |
| PRESSURE (Torr) | 0.6 |
| SUBSTRATE TEMPERATURE (°C.) | 280 |

*: (SILICON COMPOUND GAS FLOW RATE)/($H_2$ GAS FLOW RATE)

(10)

| | |
|---|---|
| $H_2$ GAS FLOW RATE (sccm) | 1500 |
| SPECIES OF SILICON COMPOUND GAS | $SiH_4$ |
| CONCENTRATION* (%) | 0.04 |
| TYPE OF APPLIED POWER | RF |
| POWER ($W/cm^3$) | 0.05 |
| PRESSURE (Torr) | 0.9 |
| SUBSTRATE TEMPERATURE (°C.) | 260 |

*: ($SiH_4$ GAS FLOW RATE)/(TOTAL $H_2$ GAS FLOW RATE)

(11)

| | |
|---|---|
| $H_2$ GAS FLOW RATE (sccm) | 1650 |
| SPECIES OF SILICON COMPOUND GAS | $SiH_4$ |
| CONCENTRATION* (%) | 0.04 |
| SPECIES OF GROUP-V-ELEMENT COMPOUND GAS (DILUTION: %) | $PH_3/H_2$ (10%) |
| CONCENTRATION**(%) | 1.0 |
| TYPE OF APPLIED POWER | RF |
| POWER ($W/cm^3$) | 0.05 |
| PRESSURE (Torr) | 0.5 |
| SUBSTRATE TEMPERATURE (°C.) | 260 |

*: (SILICON COMPOUND GAS FLOW RATE)/(TOTAL $H_2$ GAS FLOW RATE)
**: (GROUP-V-ELEMENT COMPOUND GAS FLOW)/
(TOTAL $H_2$ GAS FLOW RATE)

(12)

| | |
|---|---|
| $H_2$ GAS FLOW RATE (sccm) | 1800 |
| SPECIES OF SILICON COMPOUND GAS | $SiH_4$ |
| CONCENTRATION* (%) | 0.04 |
| TYPE OF APPLIED POWER | RF |
| POWER ($W/cm^3$) | 0.04 |
| PRESSURE (Torr) | 0.8 |
| SUBSTRATE TEMPERATURE (°C.) | 230 |

*: ($SiH_4$ GAS FLOW RATE)/(TOTAL $H_2$ GAS FLOW RATE)

(13)

| | |
|---|---|
| $H_2$ GAS FLOW RATE (sccm) | 1000 |
| SPECIES OF SILICON COMPOUND GAS | $SiH_4$ |
| CONCENTRATION* (%) | 0.05 |
| TYPE OF APPLIED POWER | RF |
| POWER ($W/cm^3$) | 0.05 |
| PRESSURE (Torr) | 0.7 |
| SUBSTRATE TEMPERATURE (°C.) | 230 |

*: (SILICON COMPOUND GAS FLOW RATE)/($H_2$ GAS FLOW RATE)

TABLE I21-continued (14)

| | |
|---|---|
| $H_2$ GAS FLOW RATE (sccm) | 1350 |
| SPECIES OF SILICON COMPOUND GAS | $SiH_4$ |
| CONCENTRATION* (%) | 0.05 |
| TYPE OF APPLIED POWER | RF |
| POWER ($W/cm^3$) | 0.04 |
| PRESSURE (Torr) | 0.7 |
| SUBSTRATE TEMPERATURE (°C.) | 200 |

*: (SILICON COMPOUND GAS FLOW RATE)/($H_2$ GAS FLOW RATE)

(15)

| | |
|---|---|
| $H_2$ GAS FLOW RATE (sccm) | 1600 |
| SPECIES OF SILICON COMPOUND GAS | $SiH_4$ |
| CONCENTRATION* (%) | 0.04 |
| TYPE OF APPLIED POWER | RF |
| POWER ($W/cm^3$) | 0.04 |
| PRESSURE (Torr) | 0.8 |
| SUBSTRATE TEMPERATURE (°C.) | 170 |

*: (SILICON COMPOUND GAS FLOW RATE)/($H_2$ GAS FLOW RATE)

(16)

| SC-EMB-I21 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 350 | 2.0 | | |
| n/i BUFFER LAYER | | 0.4 | 0.2 | | 110 | | | |
| MW i-LAYER | 43 | | | 43 | 155 | | | |
| p/i BUFFER LAYER | | 0.4 | 0.2 | | 120 | | | |
| RF p-LAYER | | | 0.1 | | 60 | | 8 | 1.7 |
| RF n-LAYER | 0.9 | | | | 320 | 2.5 | | |
| n/i BUFFER LAYER | | 0.4 | 0.2 | | 80 | | | |
| MW i-LAYER | 32 | | | 27 | 115 | | | |
| p/i BUFFER LAYER | | 0.4 | 0.2 | | 70 | | | |
| RF p-LAYER | | | 0.2 | | 60 | | 7 | 1.8 |
| RF n-LAYER | 0.8 | | | | 320 | 2.5 | | |
| n/i BUFFER LAYER | | 0.4 | 0.2 | | 50 | | | |
| RF i-LAYER | | 2.1 | | | 60 | | | |
| p/i BUFFER LAYER | | 0.4 | 0.25 | | 60 | | | |
| RF p-LAYER | | | 0.4 | | 60 | | 6 | 1.8 |

| SC-EMB-I21 | PRES-SURE TORR | MW POWER $W/CM^3$ | RF POWER $W/CM^3$ | SUBSTRATE TEMPERA-TURE °C. | LAYER THICKNESS mm |
|---|---|---|---|---|---|
| RF n-LAYER | 1.1 | | 0.04 | 380 | 20 |
| n/i BUFFER LAYER | 0.9 | | 0.8 | 350 | 10 |
| MW i-LAYER | 0.006 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.5 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.1 | | 0.06 | 200 | 12 |
| RF p-LAYER | 1.4 | | 0.07 | 170 | 10 |

TABLE J1

(1)

| | |
|---|---|
| $H_2$ GAS FLOW RATE (sccm) | 1200 |
| SPECIES OF SILICON COMPOUND GAS | $SiH_4$ |
| CONCENTRATION* (%) | 0.01 |
| SPECIES OF GROUP-V-ELEMENT COMPOUND GAS | $B_2H_6/H_2$ (1%) |
| (DILUTION: %) | 0.3 |
| CONCENTRATION** (%) | |
| TYPE OF APPLIED POWER | RF |
| POWER ($W/cm^3$) | 0.05 |
| PRESSURE (Torr) | 0.7 |
| SUBSTRATE TEMPERATURE (°C.) | 250 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

(2)

| SC-EMB-J1 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 100 | 200 | | |
| n/i BUFFER LAYER | | 2.5 | | | 100 | | | |
| MW i-LAYER | 37 | | | 38 | 165 | | | |
| p/i BUFFER LAYER | | 3 | | | 80 | | | |
| RF p-LAYER | | | 0.3 | | 60 | | 1 | 0.5 |
| RF n-LAYER | 1.5 | | | | 80 | 250 | | |
| n/i BUFFER LAYER | | 0.4 | 0.2 | | 90 | | | |
| RF i-LAYER | | 3 | | | 85 | | | |
| p/i BUFFER LAYER | | 0.4 | 0.3 | | 65 | | | |
| RF p-LAYER | | | 0.3 | | 70 | | 1 | 0.5 |

| SC-EMB-J1 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.1 | | 0.05 | 380 | 20 |
| n/i BUFFER LAYER | 0.7 | | 0.07 | 360 | 10 |
| MW i-LAYER | 0.005 | 0.28 | 0.6 | 380 | 150 |
| p/i BUFFER LAYER | 0.7 | | 0.07 | 250 | 20 |
| RF p-LAYER | 1.7 | | 0.07 | 250 | 10 |
| RF n-LAYER | 1.1 | | 0.05 | 250 | 10 |
| n/i BUFFER LAYER | 1.0 | | 0.06 | 250 | 10 |
| RF i-LAYER | 0.5 | | 0.07 | 200 | 110 |
| p/i BUFFER LAYER | 1.1 | | 0.06 | 200 | 15 |
| RF p-LAYER | 1.7 | | 0.07 | 170 | 10 |

TABLE J2

(1)

| | |
|---|---|
| $H_2$ GAS FLOW RATE (sccm) | 1000 |
| SPECIES OF SILICON COMPOUND GAS | $Si_2H_6$ |
| CONCENTRATION* (%) | 0.03 |
| SPECIES OF GROUP-III-ELEMENT COMPOUND GAS | $BF_3/H_2$(1%) |
| (DILUTION: %) | 0.4 |
| CONCENTRATION** (%) | |
| TYPE OF APPLIED POWER | VHF |
| POWER (W/cm$^3$) | 0.08 |
| PRESSURE (Torr) | 0.013 |
| SUBSTRATE TEMPERATURE (°C.) | 250 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

(2)

| SC-EMB-J2 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.2 | | | | 90 | 200 | | |
| n/i BUFFER LAYER | | 2.5 | | | 100 | | | |
| MW i-LAYER | 43 | | | 42 | 180 | | | |
| p/i BUFFER LAYER | | 3 | | | 75 | | | |
| RF p-LAYER | | | 0.3 | | 60 | | 1 | 0.4 |
| RF n-LAYER | 1.5 | | | | 80 | 250 | | |
| n/i BUFFER LAYER | | 0.4 | 0.2 | | 90 | | | |
| RF i-LAYER | | 2 | | | 85 | | | |
| p/i BUFFER LAYER | | 0.4 | 0.3 | | 65 | | | |
| RF p-LAYER | | | 0.3 | | 70 | | 1 | 0.4 |

| SC-EMB-J1 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.1 | | 0.06 | 380 | 20 |
| n/i BUFFER LAYER | 0.8 | | 0.08 | 360 | 10 |
| MW i-LAYER | 0.005 | 0.25 | 0.6 | 380 | 150 |
| p/i BUFFER LAYER | 0.7 | | 0.07 | 250 | 20 |
| RF p-LAYER | 1.7 | | 0.07 | 250 | 10 |
| RF n-LAYER | 1.1 | | 0.04 | 250 | 10 |
| n/i BUFFER LAYER | 1.0 | | 0.06 | 250 | 10 |
| RF i-LAYER | 0.5 | | 0.07 | 200 | 110 |
| p/i BUFFER LAYER | 1.1 | | 0.06 | 200 | 15 |
| RF p-LAYER | 1.7 | | 0.07 | 170 | 10 |

TABLE J3

(1)

| | |
|---|---|
| $H_2$ GAS FLOW RATE (sccm) | 1000 |
| SPECIES OF SILICON COMPOUND GAS | $SiCl_2H_2$/He |
| CONCENTRATION* (%) | 0.04 |
| SPECIES OF GROUP-III-ELEMENT COMPOUND GAS (DILUTION: %) | $B_2H_6/H_2$ (10%) |
| CONCENTRATION** (%) | 2.2 |
| TYPE OF APPLIED POWER | MW |
| POWER ($W/cm^3$) | 0.15 |
| PRESSURE (Torr) | 0.008 |
| SUBSTRATE TEMPERATURE (°C.) | 300 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

(2)

| | |
|---|---|
| $H_2$ GAS FLOW RATE (sccm) | 1300 |
| SPECIES OF SILICON COMPOUND GAS | $SiH_4$ |
| CONCENTRATION* (%) | 0.04 |
| SPECIES OF GROUP-III-ELEMENT COMPOUND GAS (DILUTION: %) | $B_2H_6/H_2$ (10%) |
| CONCENTRATION** (%) | 2.2 |
| TYPE OF APPLIED POWER | RF |
| POWER ($W/cm^3$) | 0.03 |
| PRESSURE (Torr) | 0.7 |
| SUBSTRATE TEMPERATURE (°C.) | 250 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

(3)

| SC-EMB-J3 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 150 | 200 | | |
| n/i BUFFER LAYER | | 4 | | | 130 | | | |
| MW i-LAYER | 46 | | | 47 | 170 | | | |
| p/i BUFFER LAYER | | 4 | | | 110 | | | |
| RF p-LAYER | | | 0.1 | | 70 | | 7 | 2 |
| RF n-LAYER | 1.1 | | | | 50 | 250 | | |
| n/i BUFFER LAYER | | 4 | 80 | | 90 | | | |
| MW i-LAYER | 41 | | | 35 | 155 | | | |
| p/i BUFFER LAYER | | 3 | | | 80 | | | |
| RF p-LAYER | | | 0.2 | | 60 | | 7 | 2 |
| RF n-LAYER | 0.8 | | | | 50 | 250 | | |
| n/i BUFFER LAYER | | 0.4 | 0.2 | | 55 | | | |
| RF i-LAYER | | 2.4 | | | 85 | | | |
| p/i BUFFER LAYER | | 0.4 | 0.25 | | 55 | | | |
| RF p-LAYER | | | 0.3 | | 60 | | 102 | |

| SC-EMB-J1 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.3 | 0.65 | 375 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.55 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.25 | | 0.06 | 200 | 12 |
| RF p-LAYER | 1.6 | | 0.07 | 170 | 10 |

TABLE J4

(1)

| | |
|---|---|
| $H_2$ GAS FLOW RATE (sccm) | 0.1~2500 |
| SPECIES OF SILICON COMPOUND GAS | $SiH_4$ |
| CONCENTRATION* (%) | 0.05 |
| SPECIES OF GROUP-III-ELEMENT COMPOUND GAS | $B_2H_6/H_2$ |
| CONCENTRATION** (%) | 0.2 |
| TYPE OF APPLIED POWER | RF |
| POWER ($W/cm^3$) | 0.4 |
| PRESSURE (Torr) | 0.7 |
| SUBSTRATE TEMPERATURE (°C.) FIRST/SECOND | 265/230 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

(2)

| SC-EMB-I12 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 100 | 200 | | |
| n/i BUFFER LAYER | | 4 | | | 100 | | | |
| MW i-LAYER | 50 | | | 48 | 165 | | | |
| p/i BUFFER LAYER | | 4 | | | 100 | | | |
| RF p-LAYER | | | 0.1 | | 60 | | 7 | 2 |
| RF n-LAYER | 1.1 | | | | 50 | 250 | | |
| n/i BUFFER LAYER | | 4 | | | 70 | | | |
| MW i-LAYER | 40 | | | 36 | 155 | | | |
| p/i BUFFER LAYER | | 3 | | | 80 | | | |
| RF p-LAYER | | | 0.2 | | 60 | | 7 | 2 |
| RF n-LAYER | 0.8 | | | | 50 | 250 | | |
| n/i BUFFER LAYER | | 0.4 | 0.2 | | 50 | | | |
| RF i-LAYER | | 2 | | | 70 | | | |
| p/i BUFFER LAYER | | 0.4 | 0.25 | | 50 | | | |
| RF p-LAYER | | | 0.3 | | 60 | | 7 | 2 |

| SC-EMB-I12 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.3 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| $H_2$ GAS FLOW RATE* (sccm) | 0.1 | 0.5 | 0.8 | 1 | 10 | 100 | 1000 | 2000 | 2030 | 2100 | 2500 |
|---|---|---|---|---|---|---|---|---|---|---|---|
| CURVE FACTOR | X | Δ | ○ | ○ | ○ | ○ | ○ | ○ | ○ | Δ | X |
| OPTICAL DURABILITY | X | Δ | Δ | ○ | ○ | ○ | ○ | ○ | Δ | X | X |
| UNIFORMITY IN CHARACTERISTICS | X | Δ | ○ | ○ | ○ | ○ | ○ | ○ | Δ | X | X |
| SERIES-RESISTOR CHARACTERISTIC | X | X | Δ | ○ | ○ | ○ | ○ | ○ | ○ | Δ | X |
| DURABILITY | X | Δ | Δ | ○ | ○ | ○ | ○ | ○ | Δ | X | X |
| CHARACTERISTICS WITH REVERSE BIAS VOLTAGE APPLIED | X | Δ | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS

TABLE J4-continued

*: CONTAINING GROUP-III-ELEMENT COMPOUND GAS AND SILICON COMPOUND GAS

OTHER CONDITIONS

| | |
|---|---|
| GROUP-III-ELEMENT COMPOUND GAS CONCENTRATION (%): | $B_2H_6$/0.2 |
| SPECIES OF SILICON COMPOUND GAS CONCENTRATION (%): | $SiH_4$/0.05 |
| APPLIED POWER: | RF |
| POWER DENSITY(W/cm$^3$) | 0.4 |
| PRESSURE (Torr) | 0.7 |
| SUBSTRATE TEMPERATURE(°C.) FIRSRT/SECOND | 265/230 |

TABLE J5

(1)

| | |
|---|---|
| $H_2$ GAS FLOW RATE (sccm) | 0.1~2500 |
| SPECIES OF SILICON COMPOUND GAS | $SiH_4$ |
| CONCENTRATION* (%) | 0.04 |
| SPECIES OF GROUP-III-ELEMENT COMPOUND GAS | $BF_3/H_2$ |
| CONCENTRATION** (%) | 0.2 |
| TYPE OF APPLIED POWER | VHF |
| POWER (W/cm$^3$) | 0.25 |
| PRESSURE (Torr) | 0.005 |
| SUBSTRATE TEMPERATURE (°C.) FIRST/SECOND | 260/230 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

(2)

| SC-EMB-J5 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 120 | 200 | | |
| n/i BUFFER LAYER | | 4 | | | 100 | | | |
| MW i-LAYER | 48 | | | 48 | 160 | | | |
| p/i BUFFER LAYER | | 3.5 | | | 100 | | | |
| RF p-LAYER | | | 0.1 | | 60 | | 7 | 2 |
| RF n-LAYER | 1.2 | | | | 50 | 260 | | |
| n/i BUFFER LAYER | | 4 | | | 80 | | | |
| MW i-LAYER | 40 | | | 35 | 140 | | | |
| p/i BUFFER LAYER | | 3 | | | 80 | | | |
| RF p-LAYER | | | 0.2 | | 60 | | 7 | 1.5 |
| RF n-LAYER | 0.8 | | | | 50 | 250 | | |
| n/i BUFFER LAYER | | 0.4 | 0.2 | | 50 | | | |
| RF i-LAYER | | 2 | | | 68 | | | |
| p/i BUFFER LAYER | | 0.4 | 0.25 | | 50 | | | |
| RF p-LAYER | | | 0.3 | | 60 | | 7 | 1 |

| SC-EMB-I12 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

TABLE J5-continued (3)

| $H_2$ GAS FLOW RATE* | 0.1 | 0.5 | 0.8 | 1 | 10 | 100 | 1000 | 2000 | 2030 | 2100 | 2500 |
|---|---|---|---|---|---|---|---|---|---|---|---|
| CURVE FACTOR | X | X | Δ | ○ | ○ | ○ | ○ | ○ | ○ | Δ | X |
| OPTICAL DURABILITY | X | Δ | ○ | ○ | ○ | ○ | ○ | ○ | ○ | Δ | X |
| UNIFORMITY IN CHARACTERISTICS | X | Δ | ○ | ○ | ○ | ○ | ○ | ○ | ○ | Δ | X |
| SERIES-RESISTOR CHARACTERISTICS | X | X | Δ | ○ | ○ | ○ | ○ | ○ | Δ | X | X |
| DURABILITY | X | Δ | Δ | ○ | ○ | ○ | ○ | ○ | Δ | X | X |
| CHARACTERISTICS WITH REVERSE BIAS VOLTAGE APPLIED | X | Δ | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
*: CONTAINING GROUP-III-ELEMENT COMPOUND GAS AND SILICON COMPOUND GAS

OTHER CONDITIONS

| | |
|---|---|
| GROUP-III-ELEMENT COMPOUND GAS/ CONCENTRATION (%): | $BF_3$/0.2 |
| SPECIES OF SILICON COMPOUND GAS/ CONCENTRATION (%): | $SiH_4$/0.04 |
| APPLIED POWER: | VHF |
| POWER DENSITY ($W/cm^3$): | 0.25 |
| PRESSURE (Torr): | 0.005 |
| SUBSTRATE TEMPERATURE(°C.) FIRST/SECOND: | 260/230 |

TABLE J6

(1)

| | |
|---|---|
| $H_2$ GAS FLOW RATE (sccm) | 1300 |
| SPECIES OF SILICON COMPOUND GAS | $SiH_4$ |
| CONCENTRATION* (%) | 0.06 |
| SPECIES OF GROUP-III-ELEMENT COMPOUND GAS | $B_2H_6/H_2$ |
| CONCENTRATION** (%) | 0.01~6 |
| TYPE OF APPLIED POWER | RF |
| POWER ($W/cm^3$) | 0.1 |
| PRESSURE (Torr) | 0.7 |
| SUBSTRATE TEMPERATURE (°C.) FIRST/SECOND | 260/230 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

(2)

| SC-EMB-J5 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 120 | 200 | | |
| n/i BUFFER LAYER | | 4 | | | 100 | | | |
| MW i-LAYER | 47 | | | 48 | 145 | | | |
| p/i BUFFER LAYER | | 3.5 | | | 110 | | | |
| RF p-LAYER | | | 0.1 | | 60 | | 7 | 2 |
| RF n-LAYER | 1.1 | | | | 50 | 250 | | |
| n/i BUFFER LAYER | | 4 | | | 80 | | | |
| MW i-LAYER | 39 | | | 34 | 135 | | | |
| p/i BUFFER LAYER | | 3 | | | 80 | | | |
| RF p-LAYER | | | 0.2 | | 60 | | 6 | 2 |
| RF n-LAYER | 0.8 | | | | 50 | 250 | | |
| n/i BUFFER LAYER | | 0.4 | 0.2 | | 50 | | | |
| RF i-LAYER | | 2 | | | 90 | | | |
| p/i BUFFER LAYER | | 0.4 | 0.25 | | 50 | | | |
| RF p-LAYER | | | 0.3 | | 60 | | 5 | 1 |

TABLE J6-continued

| SC-EMB-I12 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.34 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.24 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| CONCENTRATION* (%) | 0.01 | 0.03 | 0.05 | 0.08 | 1 | 2 | 3 | 3.2 | 4 | 6 |
|---|---|---|---|---|---|---|---|---|---|---|
| CURVE FACTOR | X | Δ | ○ | ○ | ○ | ○ | ○ | ○ | Δ | X |
| OPTICAL DURABILITY | Δ | ○ | ○ | ○ | ○ | ○ | ○ | Δ | X | X |
| UNIFORMITY IN CHARACTERISTICS | X | Δ | ○ | ○ | ○ | ○ | ○ | Δ | X | X |
| SERIES-RESISTOR CHARACTERISTIC | X | ○ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | Δ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
*: CONCENTRATION OF GROUP-III-ELEMENT COMPOUND GAS MIXED WITH $H_2$ GAS TO TOTAL $H_2$ GAS

OTHER $H_2$ PLASMA TREATMENT CONDITIONS

| | |
|---|---|
| GROUP-III-ELEMENT COMPOUND GAS/ | $BF_2/H_6$ |
| FLOW RATE OF $H_2$ GAS CONTAINING SILICON COMPOUND GAS (sccm): | 1300 |
| SPECIES OF SILICON COMPOUND GAS/ CONCENTRATION (%): | $SiH_4$/0.06 |
| APPLIED POWER: | RF |
| POWER DENSITY (W/cm$^3$): | 0.1 |
| PRESSURE (Torr): | 0.7 |
| SUBSTRATE TEMPERATURE(°C.) FIRST/SECOND: | 260/230 |

TABLE J7

(1)

| | |
|---|---|
| $H_2$ GAS FLOW RATE (sccm) | 1250 |
| SPECIES OF SILICON COMPOUND GAS | $SiH_4$ |
| CONCENTRATION* (%) | 0.04 |
| SPECIES OF GROUP-III-ELEMENT COMPOUND GAS | $B_2H_6/H_2$ |
| CONCENTRATION** (%) | 0.01~6 |
| TYPE OF APPLIED POWER | VHF |
| POWER (W/cm$^3$) | 0.12 |
| PRESSURE (Torr) | 0.01 |
| SUBSTRATE TEMPERATURE (°C.) FIRST/SECOND | 270/230 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

TABLE J7-continued (2)

| SC-EMB-J7 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.8 | | | | 160 | 200 | | |
| n/i BUFFER LAYER | | 4 | | | 100 | | | |
| MW i-LAYER | 47 | | | 49 | 170 | | | |
| p/i BUFFER LAYER | | 3.5 | | | 100 | | | |
| RF p-LAYER | | | 0.1 | | 60 | | 8 | 2 |
| RF n-LAYER | 1.1 | | | | 50 | 260 | | |
| n/i BUFFER LAYER | | 4 | | | 80 | | | |
| MW i-LAYER | 35 | | | 34 | 140 | | | |
| p/i BUFFER LAYER | | 3 | | | 80 | | | |
| RF p-LAYER | | | 0.2 | | 60 | | 7 | 1.5 |
| RF n-LAYER | 0.8 | | | | 60 | 240 | | |
| n/i BUFFER LAYER | | 0.4 | 0.2 | | 50 | | | |
| RF i-LAYER | | 2.5 | | | 110 | | | |
| p/i BUFFER LAYER | | 0.4 | 0.25 | | 50 | | | |
| RF p-LAYER | | | 0.3 | | 60 | | 6 | 1 |

| SC-EMB-J7 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.15 | | 0.04 | 380 | 20 |
| n/i BUFFER LAYER | 0.9 | | 0.08 | 350 | 10 |
| MW i-LAYER | 0.006 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.8 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| CONCENTRATION* (%) | 0.01 | 0.03 | 0.05 | 0.08 | 1 | 2 | 3 | 3.2 | 4 | 6 |
|---|---|---|---|---|---|---|---|---|---|---|
| CURVE FACTOR | X | Δ | ○ | ○ | ○ | ○ | ○ | ○ | Δ | X |
| OPTICAL DURABILITY | Δ | ○ | ○ | ○ | ○ | ○ | ○ | Δ | X | X |
| UNIFORMITY IN CHARACTERISTICS | X | Δ | ○ | ○ | ○ | ○ | ○ | ○ | X | X |
| SERIES-RESISTOR CHARACTERISTIC | X | ○ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | Δ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
*: CONCENTRATION OF GROUP-III-ELEMENT COMPOUND GAS MIXED WITH $H_2$ GAS TO TOTAL $H_2$ GAS

OTHER $H_2$ PLASMA TREATMENT CONDITIONS

| | |
|---|---|
| GROUP-III-ELEMENT COMPOUND GAS (%): | $B_2H_6$ |
| FLOW RATE OF $H_2$ GAS CONTAINING SILICON COMPOUND GAS (sccm): | 1250 |
| SPECIES OF SILICON COMPOUND GAS/CONCENTRATION (%): | $SiH_4$/0.04 |
| APPLIED POWER: | VHF |
| POWER DENSITY ($W/cm^3$): | 0.12 |
| PRESSURE (Torr): | 0.01 |
| SUBSTRATE TEMPERATURE (°C.) FIRST/SECOND: | 270/230 |

TABLE J8

(1)

| | |
|---|---|
| $H_2$ GAS FLOW RATE (sccm) | 1200 |
| SPECIES OF SILICON COMPOUND GAS | $SiH_4$ |
| CONCENTRATION* (%) | 0.06 |
| SPECIES OF GROUP-III-ELEMENT COMPOUND GAS | $BF_3/H_2$ |
| CONCENTRATION** (%) | 0.01~6 |
| TYPE OF APPLIED POWER | MW |
| POWER ($W/cm^3$) | 0.08 |
| PRESSURE (Torr) | 0.009 |
| SUBSTRATE TEMPERATURE (°C.) FIRST/SECOND | 230/230 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

(2)

| SC-EMB-J8 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 140 | 200 | | |
| n/i BUFFER LAYER | | 4 | | | 100 | | | |
| MW i-LAYER | 47 | | | 51 | 165 | | | |
| p/i BUFFER LAYER | | 3.5 | | | 100 | | | |
| RF p-LAYER | | | 0.1 | | 60 | | 10 | 2 |
| RF n-LAYER | 1.1 | | | | 50 | 270 | | |
| n/i BUFFER LAYER | | 4 | | | 80 | | | |
| MW i-LAYER | 35 | | | 36 | 120 | | | |
| p/i BUFFER LAYER | | 3 | | | 80 | | | |
| RF p-LAYER | | | 0.2 | | 60 | | 9 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 85 | | | |
| p/i BUFFER LAYER | | 0.4 | 0.25 | | 50 | | | |
| RF p-LAYER | | | 0.3 | | 60 | | 8 | 2 |

| SC-EMB-J8 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.35 | 0.5 | 370 | 110 |
| p/i BUFFER LAYER | 0.9 | | 0.08 | 330 | 20 |
| RF p-LAYER | 1.5 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.8 | | 0.07 | 200 | 87 |
| p/i BUFFER LAYER | 1.2 | | 0.06 | 200 | 11 |
| RF p-LAYER | 1.4 | | 0.07 | 170 | 10 |

(3)

| CONCENTRATION* (%) | 0.01 | 0.03 | 0.05 | 0.08 | 1 | 2 | 3 | 3.2 | 4 | 6 |
|---|---|---|---|---|---|---|---|---|---|---|
| CURVE FACTOR | X | Δ | ○ | ○ | ○ | ○ | ○ | ○ | Δ | X |
| OPTICAL DURABILITY | Δ | ○ | ○ | ○ | ○ | ○ | ○ | Δ | X | X |
| UNIFORMITY IN CHARACTERISTICS | X | ○ | ○ | ○ | ○ | ○ | ○ | ○ | X | X |
| SERIES-RESISTOR CHARACTERISTIC | X | ○ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | Δ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
*: CONCENTRATION OF GROUP-III-ELEMENT COMPOUND GAS MIXED WITH $H_2$ GAS

TABLE J8-continued

| |
|---|
| TO TOTAL $H_2$ GAS |
| OTHER $H_2$ PLASMA TREATMENT CONDITIONS |

| | |
|---|---|
| GROUP-III-ELEMENT COMPOUND GAS (%): | $BF_3$ |
| FLOW RATE OF $H_2$ GAS CONTAINING SILICON COMPOUND GAS (sccm): | 1200 |
| SPECIES OF SILICON COMPOUND GAS/CONCENTRATION (%): | $SiH_4$/0.06 |
| APPLIED POWER: | MW |
| POWER DENSITY ($W/cm^3$): | 0.08 |
| PRESSURE (Torr): | 0.009 |
| SUBSTRATE TEMPERATURE (°C.) FIRST/SECOND: | 230/230 |

TABLE J9

(1)

| | |
|---|---|
| $H_2$ GAS FLOW RATE (sccm) | 1300 |
| SPECIES OF SILICON COMPOUND GAS | $SiH_4$ |
| CONCENTRATION* (%) | 0.0003~0.14 |
| SPECIES OF GROUP-III-ELEMENT COMPOUND GAS (DILUTION: %) | $B_2H_6/H_2$ (1%) |
| CONCENTRATION** (%) | 0.02 |
| TYPE OF APPLIED POWER | RF |
| POWER ($W/cm^3$) | 0.09 |
| PRESSURE (Torr) | 0.7 |
| SUBSTRATE TEMPERATURE (°C.) FIRST/SECOND | 260/230 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

(2)

| SC-EMB-J9 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 130 | 210 | | |
| n/i BUFFER LAYER | | 5 | | | 100 | | | |
| MW i-LAYER | 50 | | | 51 | 130 | | | |
| p/i BUFFER LAYER | | 3.5 | | | 100 | | | |
| RF p-LAYER | | | 0.1 | | 60 | | 10 | 2 |
| RF n-LAYER | 1.1 | | | | 50 | 270 | | |
| n/i BUFFER LAYER | | 4 | | | 80 | | | |
| MW i-LAYER | 34 | | | 36 | 120 | | | |
| p/i BUFFER LAYER | | 0.5 | 0.3 | | 60 | | | |
| RF p-LAYER | | | 0.2 | | 60 | | 9 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 80 | | | |
| p/i BUFFER LAYER | | 0.4 | 0.25 | | 50 | | | |
| RF p-LAYER | | | 0.3 | | 60 | | 8 | 1.5 |

| SC-EMB-J9 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.8 | | 0.08 | 350 | 10 |
| MW i-LAYER | 0.007 | 0.35 | 0.5 | 370 | 110 |
| p/i BUFFER LAYER | 0.9 | | 0.08 | 330 | 20 |
| RF p-LAYER | 1.6 | | 0.07 | 300 | 10 |
| RF n-LAYER | 1.1 | | 0.04 | 300 | 10 |
| n/i BUFFER LAYER | 0.8 | | 0.08 | 300 | 10 |
| MW i-LAYER | 0.006 | 0.25 | 0.5 | 330 | 100 |
| p/i BUFFER LAYER | 0.7 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.7 | | 0.07 | 200 | 87 |
| p/i BUFFER LAYER | 1.2 | | 0.06 | 200 | 11 |
| RF p-LAYER | 1.6 | | 0.07 | 170 | 10 |

TABLE J9-continued (3)

| CONCENTRATION* (%) | 0.0003 | 0.0008 | 0.001 | 0.005 | 0.01 | 0.08 | 0.1 | 0.105 | 0.12 | 0.14 |
|---|---|---|---|---|---|---|---|---|---|---|
| CURVE FACTOR | X | Δ | ○ | ○ | ○ | ○ | ○ | ○ | Δ | X |
| OPTICAL DURABILITY | Δ | ○ | ○ | ○ | ○ | ○ | ○ | Δ | X | X |
| UNIFORMITY IN CHARACTERISTICS | X | Δ | ○ | ○ | ○ | ○ | ○ | Δ | X | X |
| SERIES-RESISTOR CHARACTERISTIC | X | Δ | ○ | ○ | ○ | ○ | ○ | Δ | X | X |
| DURABILITY | X | Δ | ○ | ○ | ○ | ○ | ○ | X | X | X |
| CHARACTERISTICS WITH REVERSE BIAS VOLTAGE APPLIED | X | Δ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
*: CONCENTRATION OF SILICON COMPOUND GAS MIXED WITH $H_2$ GAS TO TOTAL $H_2$ GAS

TABLE J10

(1)

| | |
|---|---|
| $H_2$ GAS FLOW RATE (sccm) | 1250 |
| SPECIES OF SILICON COMPOUND GAS | $SiH_4$ |
| CONCENTRATION* (%) | 0.0003~0.14 |
| SPECIES OF GROUP-III-ELEMENT COMPOUND GAS (DILUTION: %) | $B_2H_6/H_2$ (1%) |
| CONCENTRATION** (%) | 0.2 |
| TYPE OF APPLIED POWER | VHF |
| POWER ($W/cm^3$) | 0.13 |
| PRESSURE (Torr) | 0.02 |
| SUBSTRATE TEMPERATURE (°C.) FIRST/SECOND | 270/230 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

(2)

| SC-EMB-J10 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 140 | 200 | | |
| n/i BUFFER LAYER | | 5 | | | 100 | | | |
| MW i-LAYER | 49 | | | 52 | 160 | | | |
| p/i BUFFER LAYER | | 3.5 | | | 100 | | | |
| RF p-LAYER | | | 0.1 | | 60 | | 8 | 2 |
| RF n-LAYER | 1.1 | | | | 50 | 270 | | |
| n/i BUFFER LAYER | | 4 | | | 80 | | | |
| MW i-LAYER | 34 | | | 36 | 130 | | | |
| p/i BUFFER LAYER | | 0.4 | 0.2 | | 60 | | | |
| RF p-LAYER | | | 0.2 | | 60 | | 7 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 75 | | | |
| p/i BUFFER LAYER | | 0.4 | 0.25 | | 50 | | | |
| RF p-LAYER | | | 0.3 | | 60 | | 6 | 2 |

| SC-EMB-J10 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |

TABLE J10-continued

| | | | | | |
|---|---|---|---|---|---|
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| CONCENTRATION* (%) | 0.0003 | 0.0008 | 0.001 | 0.005 | 0.01 | 0.08 | 0.1 | 0.105 | 0.12 | 0.14 |
|---|---|---|---|---|---|---|---|---|---|---|
| CURVE FACTOR | X | Δ | ○ | ○ | ○ | ○ | ○ | ○ | Δ | X |
| OPTICAL DURABILITY | X | ○ | ○ | ○ | ○ | ○ | ○ | Δ | X | X |
| UNIFORMITY IN CHARACTERISTICS | X | Δ | ○ | ○ | ○ | ○ | ○ | Δ | X | X |
| SERIES-RESISTOR CHARACTERISTIC | X | ○ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | Δ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
*: CONCENTRATION OF SILICON COMPOUND GAS MIXED WITH $H_2$ GAS TO TOTAL $H_2$ GAS

TABLE J11

(1)

| | |
|---|---|
| $H_2$ GAS FLOW RATE (sccm) | 1150 |
| SPECIES OF SILICON COMPOUND GAS | $SiH_4$ |
| CONCENTRATION* (%) | 0.0003~0.14 |
| SPECIES OF GROUP-III-ELEMENT COMPOUND GAS (DILUTION: %) | $B_2H_6/H_2$ (1%) |
| CONCENTRATION** (%) | 0.35 |
| TYPE OF APPLIED POWER | MW |
| POWER (W/cm$^3$) | 0.13 |
| PRESSURE (Torr) | 0.005 |
| SUBSTRATE TEMPERATURE (°C.) FIRST/SECOND | 230/230 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

(2)

| SC-EMB-J11 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 130 | 200 | | |
| n/i BUFFER LAYER | | 4 | | | 100 | | | |
| MW i-LAYER | 49 | | | 50 | 155 | | | |
| p/i BUFFER LAYER | | 3.5 | | | 95 | | | |
| RF p-LAYER | | | 0.1 | | 60 | | 8 | 2 |
| RF n-LAYER | 1.1 | | | | 50 | 270 | | |
| n/i BUFFER LAYER | | 0.4 | 0.2 | | 80 | | | |
| MW i-LAYER | 34 | | | 36 | 160 | | | |
| p/i BUFFER LAYER | | 0.4 | 0.2 | | 60 | | | |
| RF p-LAYER | | | 0.2 | | 60 | | 7 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 80 | | | |
| p/i BUFFER LAYER | | 0.4 | 0.25 | | 50 | | | |
| RF p-LAYER | | | 0.3 | | 60 | | 6 | 2 |

| SC-EMB-J11 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.1 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |

TABLE J11-continued

| | | | | | |
|---|---|---|---|---|---|
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06, | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| CONCENTRATION* (%) | 0.0003 | 0.0008 | 0.001 | 0.005 | 0.01 | 0.08 | 0.1 | 0.105 | 0.12 | 0.14 |
|---|---|---|---|---|---|---|---|---|---|---|
| CURVE FACTOR | X | ○ | ○ | ○ | ○ | ○ | ○ | ○ | Δ | X |
| OPTICAL DURABILITY | Δ | ○ | ○ | ○ | ○ | ○ | ○ | Δ | X | X |
| UNIFORMITY IN CHARACTERISTICS | X | Δ | ○ | ○ | ○ | ○ | ○ | Δ | X | X |
| SERIES-RESISTOR CHARACTERISTIC | X | Δ | ○ | ○ | ○ | ○ | ○ | ○ | X | X |
| DURABILITY | X | Δ | ○ | ○ | ○ | ○ | ○ | Δ | X | X |
| CHARACTERISTICS WITH REVERSE BIAS VOLTAGE APPLIED | X | Δ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS
*: CONCENTRATION OF SILICON COMPOUND GAS MIXED WITH $H_2$ GAS TO TOTAL $H_2$ GAS

TABLE J12

(1)

| | |
|---|---|
| $H_2$ GAS FLOW RATE (sccm) | 1350 |
| SPECIES OF SILICON COMPOUND GAS | $Si_2H_6$ |
| CONCENTRATION* (%) | 0.04 |
| SPECIES OF GROUP-III-ELEMENT COMPOUND GAS (DILUTION: %) | $BF_3/H_2$ (1%) |
| CONCENTRATION** (%) | 0.3 |
| TYPE OF APPLIED POWER | RF |
| POWER ($W/cm^3$) | 0.3 |
| PRESSURE (Torr) | 0.01~100 |
| SUBSTRATE TEMPERATURE (°C.) FIRST/SECOND | 275/230 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

(2)

| SC-EMB-J12 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 130 | 200 | | |
| n/i BUFFER LAYER | | 4 | | | 130 | | | |
| MW i-LAYER | 46 | | | 48 | 150 | | | |
| p/i BUFFER LAYER | | 3.5 | | | 120 | | | |
| RF p-LAYER | | | 0.1 | | 60 | | 8 | 2 |
| RF n-LAYER | 1.1 | | | | 50 | 270 | | |
| n/i BUFFER LAYER | | 0.4 | 0.2 | | 80 | | | |
| MW i-LAYER | 33 | | | 36 | 150 | | | |
| p/i BUFFER LAYER | | 0.4 | 0.2 | | 60 | | | |
| RF p-LAYER | | | 0.2 | | 60 | | 7 | 2 |
| RF n-LAYER | 0.8 | | | | 50 | 250 | | |
| n/i BUFFER LAYER | | 0.3 | 0.2 | | 50 | | | |
| RF i-LAYER | | 2.5 | | | 75 | | | |
| p/i BUFFER LAYER | | 0.4 | 0.25 | | 50 | | | |
| RF p-LAYER | | | 0.3 | | 60 | | 7 | 2 |

TABLE J12-continued

| SC-EMB-J12 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.006 | 0.35 | 0.5 | 370 | 110 |
| p/i BUFFER LAYER | 0.8 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.6 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.2 | | 0.06 | 200 | 11 |
| RF p-LAYER | 1.6 | | 0.07 | 170 | 10 |

(3)

| PRESSURE (Torr) | 0.01 | 0.03 | 0.05 | 1 | 3 | 5 | 10 | 11 | 20 | 100 |
|---|---|---|---|---|---|---|---|---|---|---|
| CURVE FACTOR | X | ○ | ○ | ○ | ○ | ○ | ○ | Δ | X | X |
| OPTICAL DURABILITY | X | Δ | ○ | ○ | ○ | ○ | ○ | ○ | Δ | X |
| UNIFORMITY IN CHARACTERISTICS | X | Δ | ○ | ○ | ○ | ○ | ○ | Δ | X | X |
| SERIES-RESISTOR CHARACTERISTIC | X | Δ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | Δ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS

TABLE J13

(1)

| | |
|---|---|
| $H_2$ GAS FLOW RATE (sccm) | 1250 |
| SPECIES OF SILICON COMPOUND GAS | $Si_2H_6$ |
| CONCENTRATION* (%) | 0.05 |
| SPECIES OF GROUP-III-ELEMENT COMPOUND GAS (DILUTION: %) | $BF_3/H_2$ (1%) |
| CONCENTRATION** (%) | 0.3 |
| TYPE OF APPLIED POWER | VHF |
| POWER (W/cm$^3$) | 0.015 |
| PRESSURE (mTorr) | 0.03~10000 |
| SUBSTRATE TEMPERATURE (°C.) FIRST/SECOND | 265/230 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

(2)

| SC-EMB-J13 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.4 | | | | 130 | 200 | | |
| n/i BUFFER LAYER | | 4 | | | 130 | | | |
| MW i-LAYER | 45 | | | 46 | 165 | | | |
| p/i BUFFER LAYER | | 2.5 | | | 120 | | | |
| RF p-LAYER | | | 0.1 | | 60 | | 9 | 2 |
| RF n-LAYER | 1.0 | | | | 30 | 270 | | |
| n/i BUFFER LAYER | | 0.4 | 0.2 | | 80 | | | |
| MW i-LAYER | 33 | | | 29 | 135 | | | |
| p/i BUFFER LAYER | | 0.4 | 0.2 | | 60 | | | |
| RF p-LAYER | | | 0.2 | | 60 | | 9 | 2 |
| RF n-LAYER | 0.8 | | | | 50 | 250 | | |
| n/i BUFFER LAYER | | 0.3 | 0.2 | | 50 | | | |

TABLE J13-continued

| | | | | | | | | |
|---|---|---|---|---|---|---|---|---|
| RF i-LAYER | | 2.2 | | | 85 | | | |
| p/i BUFFER LAYER | | 0.4 | 0.25 | | 50 | | | |
| RF p-LAYER | | | 0.3 | | 60 | | 8 | 2 |

| SC-EMB-J13 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| PRESSURE (mTorr) | 0.03 | 0.08 | 0.1 | 1 | 100 | 500 | 1000 | 1100 | 2000 | 10000 |
|---|---|---|---|---|---|---|---|---|---|---|
| CURVE FACTOR | X | Δ | ○ | ○ | ○ | ○ | ○ | ○ | Δ | X |
| OPTICAL DURABILITY | Δ | ○ | ○ | ○ | ○ | ○ | ○ | ○ | Δ | X |
| UNIFORMITY IN CHARACTERISTICS | X | Δ | ○ | ○ | ○ | ○ | ○ | Δ | X | X |
| SERIES-RESISTOR CHARACTERISTIC | X | ○ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | Δ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS

TABLE J14

(1)

| | |
|---|---|
| $H_2$ GAS FLOW RATE (sccm) | 950 |
| SPECIES OF SILICON COMPOUND GAS | $SiF_4$ |
| CONCENTRATION* (%) | 0.03 |
| SPECIES OF GROUP-III-ELEMENT COMPOUND GAS (DILUTION: %) | $B_2H_6/H_2$ (1%) |
| CONCENTRATION** (%) | 0.5 |
| TYPE OF APPLIED POWER | MW |
| POWER (W/cm$^3$) | 0.15 |
| PRESSURE (mTorr) | 0.03~100 |
| SUBSTRATE TEMPERATURE (°C.) FIRST/SECOND | 230/230 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

(2)

| SC-EMB-J14 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 140 | 200 | | |
| n/i BUFFER LAYER | | 4 | | | 120 | | | |
| MW i-LAYER | 45 | | | 46 | 145 | | | |
| p/i BUFFER LAYER | | 0.35 | 0.2 | | 120 | | | |
| RF p-LAYER | | | 0.1 | | 60 | | 9 | 2 |
| RF n-LAYER | 1.0 | | | | 30 | 270 | | |
| n/i BUFFER LAYER | | 0.4 | 0.2 | | 80 | | | |
| MW i-LAYER | 35 | | | 30 | 130 | | | |
| p/i BUFFER LAYER | | 0.4 | 0.2 | | 70 | | | |

TABLE J14-continued

| | | | | | | | | |
|---|---|---|---|---|---|---|---|---|
| RF p-LAYER | | | 0.2 | | 60 | | 8 | 2 |
| RF n-LAYER | 0.8 | | | | 50 | 250 | | |
| n/i BUFFER LAYER | | 0.3 | 0.2 | | 50 | | | |
| RF i-LAYER | | 2.2 | | | 85 | | | |
| p/i BUFFER LAYER | | 0.4 | 0.25 | | 60 | | | |
| RF p-LAYER | | | 0.4 | | 60 | | 8 | 1.5 |

| SC-EMB-J14 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.007 | 0.35 | 0.5 | 370 | 110 |
| p/i BUFFER LAYER | 0.9 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| PRESSURE (mTorr) | 0.03 | 0.08 | 0.1 | 0.5 | 1 | 5 | 10 | 11 | 20 | 100 |
|---|---|---|---|---|---|---|---|---|---|---|
| CURVE FACTOR | X | Δ | ○ | ○ | ○ | ○ | ○ | ○ | Δ | X |
| OPTICAL DURABILITY | X | Δ | ○ | ○ | ○ | ○ | ○ | ○ | Δ | X |
| UNIFORMITY IN CHARACTERISTICS | X | ○ | ○ | ○ | ○ | ○ | ○ | Δ | X | X |
| SERIES-RESISTOR CHARACTERISTIC | X | Δ | ○ | ○ | ○ | ○ | ○ | ○ | X | X |
| DURABILITY | X | ○ | ○ | ○ | ○ | ○ | ○ | Δ | X | X |
| CHARACTERISTICS WITH REVERSE BIAS VOLTAGE APPLIED | X | Δ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS

TABLE J15

(1)

| | |
|---|---|
| $H_2$ GAS FLOW RATE (sccm) | 600 |
| SPECIES OF SILICON COMPOUND GAS | $SiH_4$ |
| CONCENTRATION* (%) | 0.05 |
| SPECIES OF GROUP-III-ELEMENT COMPOUND GAS (DILUTION: %) | $BF_3/H_2$ (1 %) |
| CONCENTRATION** (%) | 0.2 |
| TYPE OF APPLIED POWER | RF |
| POWER (W/cm$^3$) | 0.003~10 |
| PRESSURE (Torr) | 0.5 |
| SUBSTRATE TEMPERATURE (°C.) FIRST/SECOND | 260/230 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

(2)

| SC-EMB-J15 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.4 | | | | 130 | 200 | | |
| n/i BUFFER LAYER | | 0.4 | 0.1 | | 120 | | | |
| MW i-LAYER | 45 | | | 47 | 160 | | | |
| p/i BUFFER LAYER | | 0.35 | 0.2 | | 120 | | | |
| RF p-LAYER | | | 0.1 | | 60 | | 10 | 2 |
| RF n-LAYER | 1.0 | | | | 30 | 270 | | |
| n/i BUFFER LAYER | | 0.4 | 0.2 | | 80 | | | |

TABLE J15-continued

| | | | | | | | | |
|---|---|---|---|---|---|---|---|---|
| MW i-LAYER | 35 | | | 28 | 145 | | | |
| p/i BUFFER LAYER | | 0.4 | 0.2 | | 70 | | | |
| RF p-LAYER | | | 0.2 | | 60 | | 9 | 2 |
| RF n-LAYER | 0.8 | | | | 50 | 250 | | |
| n/i BUFFER LAYER | | 0.3 | 0.2 | | 50 | | | |
| RF i-LAYER | | 2.2 | | | 65 | | | |
| p/i BUFFER LAYER | | 0.4 | 0.25 | | 60 | | | |
| RF p-LAYER | | | 0.4 | | 60 | | 8 | 2 |

| SC-EMB-J15 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.1 | | 0.04 | 380 | 20 |
| n/i BUFFER LAYER | 0.9 | | 0.08 | 350 | 10 |
| MW i-LAYER | 0.007 | 0.35 | 0.5 | 370 | 110 |
| p/i BUFFER LAYER | 0.9 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.7 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| POWER DENSITY (W/cm$^3$) | 0.003 | 0.007 | 0.01 | 0.05 | 0.1 | 0.7 | 1.0 | 1.1 | 3.0 | 10 |
|---|---|---|---|---|---|---|---|---|---|---|
| CURVE FACTOR | X | Δ | ○ | ○ | ○ | ○ | ○ | ○ | Δ | X |
| OPTICAL DURABILITY | Δ | ○ | ○ | ○ | ○ | ○ | ○ | ○ | Δ | X |
| UNIFORMITY IN CHARACTERISTICS | X | ○ | ○ | ○ | ○ | ○ | ○ | ○ | X | X |
| SERIES-RESISTOR CHARACTERISTIC | X | ○ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | Δ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS

TABLE J16

(1)

| | |
|---|---|
| $H_2$ GAS FLOW RATE (sccm) | 1400 |
| SPECIES OF SILICON COMPOUND GAS | $Si_2H_6$ |
| CONCENTRATION* (%) | 0.03 |
| SPECIES OF GROUP-III-ELEMENT COMPOUND GAS (DILUTION: %) | $BF_3/H_2$ (1 %) |
| CONCENTRATION** (%) | 0.2 |
| TYPE OF APPLIED POWER | VHF |
| POWER (W/cm$^3$) | 0.003~10 |
| PRESSURE (Torr) | 0.006 |
| SUBSTRATE TEMPERATURE (°C.) FIRST/SECOND | 135/135 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

(2)

| SC-EMB-J16 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 110 | 200 | | |
| n/i BUFFER LAYER | | 0.4 | 0.1 | | 110 | | | |
| MW i-LAYER | 44 | | | 45 | 165 | | | |
| p/i BUFFER LAYER | | 0.35 | 0.2 | | 120 | | | |
| RF p-LAYER | | | 0.1 | | 60 | | 9 | 2 |

TABLE J16-continued

| | | | | | | | | |
|---|---|---|---|---|---|---|---|---|
| RF n-LAYER | 1.0 | | | | 30 | 270 | | |
| n/i BUFFER LAYER | | 0.4 | 0.2 | | 80 | | | |
| MW i-LAYER | 35 | | | 28 | 130 | | | |
| p/i BUFFER LAYER | | 0.4 | 0.2 | | 70 | | | |
| RF p-LAYER | | | 0.2 | | 60 | | 8 | 2 |
| RF n-LAYER | 0.8 | | | | 50 | 250 | | |
| n/i BUFFER LAYER | | 0.3 | 0.2 | | 50 | | | |
| RF i-LAYER | | 2.1 | | | 85 | | | |
| p/i BUFFER LAYER | | 0.4 | 0.25 | | 60 | | | |
| RF p-LAYER | | | 0.4 | | 60 | | 8 | 2 |

| SC-EMB-J16 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.005 | 0.35 | 0.5 | 370 | 110 |
| p/i BUFFER LAYER | 0.9 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.24 | 0.5 | 330 | 100 |
| p/i BUFFER LAYER | 0.8 | | 0.08 | 280 | 20 |
| RF p-LAYER | 1.6 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| POWER DENSITY (W/cm$^3$) | 0.003 | 0.007 | 0.01 | 0.05 | 0.1 | 0.7 | 1.0 | 1.1 | 3.0 | 10 |
|---|---|---|---|---|---|---|---|---|---|---|
| CURVE FACTOR | X | Δ | ○ | ○ | ○ | ○ | ○ | ○ | Δ | X |
| OPTICAL DURABILITY | X | ○ | ○ | ○ | ○ | ○ | ○ | ○ | Δ | X |
| UNIFORMITY IN CHARACTERISTICS | X | ○ | ○ | ○ | ○ | ○ | ○ | Δ | X | X |
| SERIES-RESISTOR CHARACTERISTIC | X | Δ | ○ | ○ | ○ | ○ | ○ | Δ | X | X |
| DURABILITY | X | Δ | ○ | ○ | ○ | ○ | ○ | ○ | Δ | X |
| CHARACTERISTICS WITH REVERSE BIAS VOLTAGE APPLIED | X | ○ | ○ | ○ | ○ | ○ | ○ | ○ | Δ | X |

○: EXCELLENT FOR PRACTICAL USE
Δ: GOOD FOR PRACTICAL USE
X: NO GOOD FOR SOME APPLICATIONS

TABLE J17

(1)

| | |
|---|---|
| $H_2$ GAS FLOW RATE (sccm) | 1850 |
| SPECIES OF SILICON COMPOUND GAS | $SiCl_2H_2$ |
| CONCENTRATION* (%) | 0.009 |
| SPECIES OF GROUP-III-ELEMENT COMPOUND GAS (DILUTION: %) | $B_2H_6/H_2$ (10 %) |
| CONCENTRATION** (%) | 0.08 |
| TYPE OF APPLIED POWER | MW |
| POWER (W/cm$^3$) | 0.03~100 |
| PRESSURE (Torr) | 0.005 |
| SUBSTRATE TEMPERATURE (°C.) FIRST/SECOND | 130/130 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

(2)

| SC-EMB-J17 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 120 | 200 | | |
| n/i BUFFER LAYER | | 0.4 | 0.2 | | 110 | | | |
| MW i-LAYER | 42 | | | 44 | 175 | | | |

TABLE J17-continued

| | | | | | | | | |
|---|---|---|---|---|---|---|---|---|
| p/i BUFFER LAYER | | 0.35 | 0.2 | | 120 | | | |
| RF p-LAYER | | | 0.1 | | 60 | | 9 | 1.7 |
| RF n-LAYER | 1.0 | | | | 30 | 270 | | |
| n/i BUFFER LAYER | | 0.4 | 0.2 | | 80 | | | |
| MW i-LAYER | 33 | | | 28 | 165 | | | |
| p/i BUFFER LAYER | | 0.4 | 0.2 | | 70 | | | |
| RF p-LAYER | | | 0.2 | | 60 | | 9 | 1.8 |
| RF n-LAYER | 0.8 | | | | 50 | 250 | | |
| n/i BUFFER LAYER | | 0.3 | 0.2 | | 50 | | | |
| RF i-LAYER | | 2.1 | | | 100 | | | |
| p/i BUFFER LAYER | | 0.4 | 0.25 | | 60 | | | |
| RF p-LAYER | | | 0.4 | | 60 | | 8 | 1.8 |

| SC-EMB-J17 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.8 | | 0.08 | 350 | 10 |
| MW i-LAYER | 0.006 | 0.35 | 0.5 | 370 | 110 |
| p/i BUFFER LAYER | 0.8 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.24 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| POWER DENSITY (W/cm$^3$) | 0.03 | 0.07 | 0.1 | 0.5 | 1 | 7 | 10 | 11 | 30 | 100 |
|---|---|---|---|---|---|---|---|---|---|---|
| CURVE FACTOR | X | Δ | O | O | O | O | O | Δ | X | X |
| OPTICAL DURABILITY | X | O | O | O | O | O | O | O | X | X |
| UNIFORMITY IN CHARACTERISTICS | X | O | O | O | O | O | O | O | X | X |
| SERIES-RESISTOR CHARACTERISTIC | X | O | O | O | O | O | O | O | X | X |
| DURABILITY | X | Δ | O | O | O | O | O | Δ | X | X |

O: EXCELLENT FOR PRACTICAL USE
Δ: GOOD FOR PRACTICAL USE
X: NO GOOD FOR SOME APPLICATIONS

TABLE J18

(1)

| | |
|---|---|
| $H_2$ GAS FLOW RATE (sccm) | 850 |
| SPECIES OF SILICON COMPOUND GAS | $SiH_4$ |
| CONCENTRATION* (%) | 0.07 |
| SPECIES OF GROUP-III-ELEMENT COMPOUND GAS (DILUTION: %) | $B_2H_6/H_2$ (1 %) |
| CONCENTRATION** (%) | 0.2 |
| TYPE OF APPLIED POWER | RF |
| POWER (W/cm$^3$) | 0.29 |
| PRESSURE (Torr) | 1.1 |
| SUBSTRATE TEMPERATURE (°C.) | 50~520 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

(2)

| SC-EMB-J18 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 120 | 200 | | |
| n/i BUFFER LAYER | | 0.4 | 0.2 | | 110 | | | |
| MW i-LAYER | 42 | | | 43 | 175 | | | |
| p/i BUFFER LAYER | | 0.35 | 0.2 | | 120 | | | |
| RF p-LAYER | | | 0.1 | | 60 | | 9 | 1.7 |

TABLE J18-continued

| | | | | | | | | |
|---|---|---|---|---|---|---|---|---|
| RF n-LAYER | 1.0 | | | | 30 | 270 | | |
| n/i BUFFER LAYER | | 0.4 | 0.2 | | 80 | | | |
| MW i-LAYER | 33 | | | 29 | 165 | | | |
| p/i BUFFER LAYER | | 0.4 | 0.2 | | 70 | | | |
| RF p-LAYER | | | 0.2 | | 60 | | 8 | 1.8 |
| RF n-LAYER | 0.8 | | | | 50 | 250 | | |
| n/i BUFFER LAYER | | 0.3 | 0.2 | | 50 | | | |
| RF i-LAYER | | 2.1 | | | 105 | | | |
| p/i BUFFER LAYER | | 0.4 | 0.25 | | 60 | | | |
| RF p-LAYER | | | 0.4 | | 60 | | 8 | 1.8 |

| SC-EMB-J18 | PRESSURE Torr | MW POWER W/cm$^3$ | RF POWER W/cm$^3$ | SUBSTRATE TEMPERATURE °C. | LAYER THICKNESS nm |
|---|---|---|---|---|---|
| RF n-LAYER | 1.2 | | 0.04 | 380 | 20 |
| n/i BUFFER LAYER | 0.8 | | 0.08 | 350 | 10 |
| MW i-LAYER | 0.006 | 0.35 | 0.5 | 370 | 110 |
| p/i BUFFER LAYER | 0.8 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.24 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| SUBSTRATE TEMPERATURE (°C.) | 50 | 75 | 100 | 150 | 200 | 300 | 400 | 420 | 450 | 520 |
|---|---|---|---|---|---|---|---|---|---|---|
| CURVE FACTOR | X | ○ | ○ | ○ | ○ | ○ | ○ | X | X | X |
| OPTICAL DURABILITY | X | Δ | ○ | ○ | ○ | ○ | ○ | ○ | X | X |
| UNIFORMITY IN CHARACTERISTICS | X | Δ | ○ | ○ | ○ | ○ | ○ | Δ | X | X |
| SERIES-RESISTOR CHARACTERISTIC | X | ○ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | ○ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS

TABLE J19

(1)

| | |
|---|---|
| $H_2$ GAS FLOW RATE (sccm) | 1600 |
| SPECIES OF SILICON COMPOUND GAS | $SiCl_4$ |
| CONCENTRATION* (%) | 0.02 |
| SPECIES OF GROUP-III-ELEMENT COMPOUND GAS (DILUTION: %) | $BF_3/H_2$ (10 %) |
| CONCENTRATION** (%) | 0.2 |
| TYPE OF APPLIED POWER | VHF |
| POWER (W/cm$^3$) | 0.23 |
| PRESSURE (Torr) | 0.008 |
| SUBSTRATE TEMPERATURE (°C.) | 30~420 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

(2)

| SC-EMB-J19 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.4 | | | | 130 | 200 | | |
| n/i BUFFER LAYER | | 0.4 | 0.1 | | 120 | | | |

TABLE J19-continued

| | | | | | | | | |
|---|---|---|---|---|---|---|---|---|
| MW i-LAYER | 45 | | | 47 | 135 | | | |
| p/i BUFFER LAYER | | 0.35 | 0.2 | | 120 | | | |
| RF p-LAYER | | | 0.1 | | 60 | | 9 | 2 |
| RF n-LAYER | 1.0 | | | | 30 | 270 | | |
| n/i BUFFER LAYER | | 0.4 | 0.2 | | 80 | | | |
| MW i-LAYER | 33 | | | 28 | 140 | | | |
| p/i BUFFER LAYER | | 0.4 | 0.2 | | 70 | | | |
| RF p-LAYER | | | 0.2 | | 60 | | 8 | 2 |
| RF n-LAYER | 0.8 | | | | 50 | 250 | | |
| n/i BUFFER LAYER | | 0.3 | 0.2 | | 50 | | | |
| RF i-LAYER | | 2.2 | | | 60 | | | |
| p/i BUFFER LAYER | | 0.4 | 0.25 | | 60 | | | |
| RF p-LAYER | | | 0.4 | | 60 | | 8 | 1.5 |

| SC-EMB-J19 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.1 | | 0.04 | 380 | 20 |
| n/i BUFFER LAYER | 0.9 | | 0.08 | 350 | 10 |
| MW i-LAYER | 0.006 | 0.36 | 0.5 | 370 | 110 |
| p/i BUFFER LAYER | 0.9 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.005 | 0.25 | 0.5 | 330 | 100 |
| p/i BUFFER LAYER | 0.8 | | 0.08 | 280 | 20 |
| RF p-LAYER | 1.7 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.7 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| SUBSTRATE TEMPERATURE (°C.) | 30 | 40 | 50 | 100 | 200 | 250 | 300 | 320 | 350 | 420 |
|---|---|---|---|---|---|---|---|---|---|---|
| CURVE FACTOR | X | ○ | ○ | ○ | ○ | ○ | ○ | Δ | X | X |
| OPTICAL DURABILITY | X | Δ | ○ | ○ | ○ | ○ | ○ | ○ | X | X |
| UNIFORMITY IN CHARACTERISTICS | X | Δ | ○ | ○ | ○ | ○ | ○ | ○ | X | X |
| SERIES-RESISTOR CHARACTERISTIC | X | Δ | ○ | ○ | ○ | ○ | ○ | Δ | X | X |
| DURABILITY | X | Δ | ○ | ○ | ○ | ○ | ○ | Δ | X | X |
| CHARACTERISTICS WITH REVERSE BIAS VOLTAGE APPLIED | X | ○ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS

TABLE J20

(1)

| | |
|---|---|
| $H_2$ GAS FLOW RATE (sccm) | 1800 |
| SPECIES OF SILICON COMPOUND GAS | $SiCl_2H_2$ |
| CONCENTRATION* (%) | 0.01 |
| SPECIES OF GROUP-III-ELEMENT COMPOUND GAS (DILUTION: %) | $BF_3/H_2$ (10 %) |
| CONCENTRATION** (%) | 0.3 |
| TYPE OF APPLIED POWER | MW |
| POWER (W/cm$^3$) | 0.3 |
| PRESSURE (Torr) | 0.007 |
| SUBSTRATE TEMPERATURE (°C.) | 30~420 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

TABLE J20-continued (2)

| SC-EMB-J20 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.6 | | | | 110 | 200 | | |
| n/i BUFFER LAYER | | 0.4 | 0.1 | | 110 | | | |
| MW i-LAYER | 44 | | | 45 | 180 | | | |
| p/i BUFFER LAYER | | 0.35 | 0.2 | | 120 | | | |
| RF p-LAYER | | | 0.1 | | 60 | | 9 | 2 |
| RF n-LAYER | 1.0 | | | | 30 | 270 | | |
| n/i BUFFER LAYER | | 0.4 | 0.2 | | 80 | | | |
| MW i-LAYER | 35 | | | 28 | 160 | | | |
| p/i BUFFER LAYER | | 0.4 | 0.2 | | 70 | | | |
| RF p-LAYER | | | 0.2 | | 60 | | 8 | 2 |
| RF n-LAYER | 0.8 | | | | 50 | 250 | | |
| n/i BUFFER LAYER | | 0.3 | 0.2 | | 50 | | | |
| RF i-LAYER | | 2.1 | | | 110 | | | |
| p/i BUFFER LAYER | | 0.4 | 0.25 | | 60 | | | |
| RF p-LAYER | | | 0.4 | | 60 | | 7 | 1.5 |

| SC-EMB-J20 | PRESSURE Torr | MW POWER $W/cm^3$ | RF POWER $W/cm^3$ | SUBSTRATE TEMPERA-TURE °C. | LAYER THICKNESS nm |
|---|---|---|---|---|---|
| RF n-LAYER | 1.2 | | 0.04 | 380 | 20 |
| n/i BUFFER LAYER | 0.9 | | 0.08 | 350 | 10 |
| MW i-LAYER | 0.007 | 0.35 | 0.5 | 370 | 110 |
| p/i BUFFER LAYER | 0.9 | | 0.08 | 330 | 20 |
| RF p-LAYER | 1.7 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.24 | 0.5 | 330 | 100 |
| p/i BUFFER LAYER | 0.8 | | 0.08 | 280 | 20 |
| RF p-LAYER | 1.6 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 86 |
| p/i BUFFER LAYER | 1.2 | | 0.06 | 200 | 12 |
| RF p-LAYER | 1.6 | | 0.07 | 170 | 10 |

(3)

| SUBSTRATE TEMPERATURE (°C.) | 30 | 40 | 50 | 100 | 200 | 250 | 300 | 320 | 350 | 420 |
|---|---|---|---|---|---|---|---|---|---|---|
| CURVE FACTOR | X | Δ | ○ | ○ | ○ | ○ | ○ | Δ | X | X |
| OPTICAL DURABILITY | X | Δ | ○ | ○ | ○ | ○ | ○ | ○ | Δ | X |
| UNIFORMITY IN CHARACTERISTICS | X | Δ | ○ | ○ | ○ | ○ | ○ | Δ | X | X |
| SERIES-RESISTOR CHARACTERISTIC | X | ○ | ○ | ○ | ○ | ○ | ○ | ○ | Δ | X |
| DURABILITY | X | Δ | ○ | ○ | ○ | ○ | ○ | Δ | X | X |

○: EXCELLENT FOR PRACTICAL USE
Δ: GOOD FOR PRACTICAL USE
X: NO GOOD FOR SOME APPLICATIONS

TABLE J21

(1)

| | |
|---|---|
| $H_2$ GAS FLOW RATE (sccm) | 1150 |
| SPECIES OF SILICON COMPOUND GAS | $SiH_4/H_2$ |
| CONCENTRATION* (%) | 0.03 |
| TYPE OF APPLIED POWER | RF |
| POWER ($W/cm^3$) | 0.04 |
| PRESSURE (Torr) | 0.8 |
| SUBSTRATE TEMPERATURE (°C.) | 360 |

*: ($SiH_4$ GAS FLOW RATE)/(TOTAL $H_2$ GAS FLOW RATE)

TABLE J21-continued (2)

| | |
|---|---|
| $H_2$ GAS FLOW RATE (sccm) | 1500 |
| SPECIES OF SILICON COMPOUND GAS | $SiH_4$ |
| CONCENTRATION* (%) | 0.02 |
| TYPE OF APPLIED POWER | RF |
| POWER (W/cm$^3$) | 0.03 |
| PRESSURE (Torr) | 0.9 |
| SUBSTRATE TEMPERATURE (°C.) | 350 |

*: ($SiH_4$ GAS FLOW RATE)/(TOTAL $H_2$ GAS FLOW RATE)

(3)

| | |
|---|---|
| $H_2$ GAS FLOW RATE (sccm) | 750 |
| SPECIES OF SILICON COMPOUND GAS | $SiH_4$ |
| CONCENTRATION* (%) | 0.04 |
| TYPE OF APPLIED POWER | RF |
| POWER (W/cm$^3$) | 0.03 |
| PRESSURE (Torr) | 0.7 |
| SUBSTRATE TEMPERATURE (°C.) | 350 |

*: (SILICON COMPOUND GAS FLOW RATE)/($H_2$ GAS FLOW RATE)

(4)

| | |
|---|---|
| $H_2$ GAS FLOW RATE (sccm) | 1150 |
| SPECIES OF SILICON COMPOUND GAS | $SiH_4$ |
| CONCENTRATION* (%) | 0.04 |
| TYPE OF APPLIED POWER | RF |
| POWER (W/cm$^3$) | 0.03 |
| PRESSURE (Torr) | 0.6 |
| SUBSTRATE TEMPERATURE (°C.) | 330 |

*: (SILICON COMPOUND GAS FLOW RATE)/($H_2$ GAS FLOW RATE)

(5)

| | |
|---|---|
| $H_2$ GAS FLOW RATE (sccm) | 1500 |
| SPECIES OF SILICON COMPOUND GAS | $SiH_4$ |
| CONCENTRATION* (%) | 0.04 |
| TYPE OF APPLIED POWER | RF |
| POWER (W/cm$^3$) | 0.03 |
| PRESSURE (Torr) | 0.8 |
| SUBSTRATE TEMPERATURE (°C.) | 300 |

*: ($SiH_4$ GAS FLOW RATE)/(TOTAL $H_2$ GAS FLOW RATE)

(6)

| | |
|---|---|
| $H_2$ GAS FLOW RATE (sccm) | 1200 |
| SPECIES OF SILICON COMPOUND GAS | $SiH_4$ |
| CONCENTRATION* (%) | 0.03 |
| SPECIES OF GROUP-III-ELEMENT COMPOUND GAS (DILUTION: %) | $B_2H_6/H_2$ (10%) |
| CONCENTRATION** (%) | 0.6 |
| TYPE OF APPLIED POWER | RF |
| POWER (W/cm$^3$) | 0.03 |
| PRESSURE (Torr) | 0.7 |
| SUBSTRATE TEMPERATURE (°C.) | 300 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

(7)

| | |
|---|---|
| $H_2$ GAS FLOW RATE (sccm) | 1650 |
| SPECIES OF SILICON COMPOUND GAS | $SiH_4$ |
| CONCENTRATION* (%) | 0.04 |
| TYPE OF APPLIED POWER | RF |
| POWER (W/cm$^3$) | 0.04 |
| PRESSURE (Torr) | 0.7 |
| SUBSTRATE TEMPERATURE (°C.) | 300 |

*: ($SiH_4$ GAS FLOW RATE)/(TOTAL $H_2$ GAS FLOW RATE)

(8)

| | |
|---|---|
| $H_2$ GAS FLOW RATE (sccm) | 1600 |
| SPECIES OF SILICON COMPOUND GAS | $SiH_4$ |
| CONCENTRATION* (%) | 0.03 |
| TYPE OF APPLIED POWER | RF |
| POWER (W/cm$^3$) | 0.04 |
| PRESSURE (Torr) | 0.7 |

TABLE J21-continued

| | |
|---|---|
| SUBSTRATE TEMPERATURE (°C.) | 300 |

*: (SILICON COMPOUND GAS FLOW RATE)/($H_2$ GAS FLOW RATE)

(9)

| | |
|---|---|
| $H_2$ GAS FLOW RATE (sccm) | 1200 |
| SPECIES OF SILICON COMPOUND GAS | $SiH_4$ |
| CONCENTRATION* (%) | 0.02 |
| TYPE OF APPLIED POWER | RF |
| POWER (W/cm$^3$) | 0.04 |
| PRESSURE (Torr) | 0.6 |
| SUBSTRATE TEMPERATURE (°C.) | 280 |

*: (SILICON COMPOUND GAS FLOW RATE)/($H_2$ GAS FLOW RATE)

(10)

| | |
|---|---|
| $H_2$ GAS FLOW RATE (sccm) | 1500 |
| SPECIES OF SILICON COMPOUND GAS | $SiH_4$ |
| CONCENTRATION* (%) | 0.03 |
| TYPE OF APPLIED POWER | RF |
| POWER (W/cm$^3$) | 0.04 |
| PRESSURE (Torr) | 0.9 |
| SUBSTRATE TEMPERATURE (°C.) | 260 |

*: ($SiH_4$ GAS FLOW RATE)/(TOTAL $H_2$ GAS FLOW RATE)

(11)

| | |
|---|---|
| $H_2$ GAS FLOW RATE (sccm) | 1650 |
| SPECIES OF SILICON COMPOUND GAS | $SiH_4$ |
| CONCENTRATION* (%) | 0.03 |
| SPECIES OF GROUP-III-ELEMENT COMPOUND GAS (DILUTION: %) | $B_2H_6/H_2$ (10%) |
| CONCENTRATION** (%) | 1.0 |
| TYPE OF APPLIED POWER | RF |
| POWER (W/cm$^3$) | 0.03 |
| PRESSURE (Torr) | 0.5 |
| SUBSTRATE TEMPERATURE (°C.) | 260 |

*: (SILICON COMPOUND GAS FLOW RATE)/(TOTAL $H_2$ GAS FLOW RATE)
**: (GROUP-III-ELEMENT COMPOUND GAS FLOW RATE)/(TOTAL $H_2$ GAS FLOW RATE)

(12)

| | |
|---|---|
| $H_2$ GAS FLOW RATE (sccm) | 1800 |
| SPECIES OF SILICON COMPOUND GAS | $SiH_4$ |
| CONCENTRATION* (%) | 0.03 |
| TYPE OF APPLIED POWER | RF |
| POWER (W/cm$^3$) | 0.04 |
| PRESSURE (Torr) | 0.8 |
| SUBSTRATE TEMPERATURE (°C.) | 230 |

*: ($SiH_4$ GAS FLOW RATE)/(TOTAL $H_2$ GAS FLOW RATE)

(13)

| | |
|---|---|
| $H_2$ GAS FLOW RATE (sccm) | 1000 |
| SPECIES OF SILICON COMPOUND GAS | $SiH_4$ |
| CONCENTRATION* (%) | 0.04 |
| TYPE OF APPLIED POWER | RF |
| POWER (W/cm$^3$) | 0.04 |
| PRESSURE (Torr) | 0.7 |
| SUBSTRATE TEMPERATURE (°C.) | 230 |

*: (SILICON COMPOUND GAS FLOW RATE)/($H_2$ GAS FLOW RATE)

(14)

| | |
|---|---|
| $H_2$ GAS FLOW RATE (sccm) | 1350 |
| SPECIES OF SILICON COMPOUND GAS | $SiH_4$ |
| CONCENTRATION* (%) | 0.03 |
| TYPE OF APPLIED POWER | RF |
| POWER (W/cm$^3$) | 0.04 |
| PRESSURE (Torr) | 0.7 |
| SUBSTRATE TEMPERATURE (°C.) | 200 |

*: (SILICON COMPOUND GAS FLOW RATE)/($H_2$ GAS FLOW RATE)

TABLE J21-continued (15)

| | |
|---|---|
| $H_2$ GAS FLOW RATE (sccm) | 1600 |
| SPECIES OF SILICON COMPOUND GAS | $SiH_4$ |
| CONCENTRATION* (%) | 0.03 |
| TYPE OF APPLIED POWER | RF |
| POWER (W/cm$^3$) | 0.04 |
| PRESSURE (Torr) | 0.6 |
| SUBSTRATE TEMPERATURE (°C.) | 170 |

*: (SILICON COMPOUND GAS FLOW RATE)/($H_2$ GAS FLOW RATE)

(16)

| SC-EMB-J21 | $SiH_4$ FLOW RATE sccm | $Si_2H_6$ FLOW RATE sccm | $CH_4$ FLOW RATE sccm | $GeH_4$ FLOW RATE sccm | $H_2$ FLOW RATE sccm | $PH_3/H_2$ FLOW RATE sccm | $B_2H_6/H_2$ FLOW RATE sccm | $SiH_4/H_2$ FLOW RATE sccm |
|---|---|---|---|---|---|---|---|---|
| RF n-LAYER | 1.5 | | | | 150 | 200 | | |
| n/i BUFFER LAYER | | 0.4 | 0.2 | | 110 | | | |
| MW i-LAYER | 43 | | | 43 | 160 | | | |
| p/i BUFFER LAYER | | 0.4 | 0.2 | | 120 | | | |
| RF p-LAYER | | | 0.1 | | 60 | | 8 | 1.7 |
| RF n-LAYER | 0.9 | | | | 20 | 280 | | |
| n/i BUFFER LAYER | | 0.4 | 0.2 | | 80 | | | |
| MW i-LAYER | 32 | | | 27 | 110 | | | |
| p/i BUFFER LAYER | | 0.4 | 0.2 | | 70 | | | |
| RF p-LAYER | | | 0.2 | | 60 | | 7 | 1.8 |
| RF n-LAYER | 0.8 | | | | 50 | 250 | | |
| n/i BUFFER LAYER | | 0.4 | 0.2 | | 50 | | | |
| RF i-LAYER | | 2.1 | | | 55 | | | |
| p/i BUFFER LAYER | | 0.4 | 0.25 | | 60 | | | |
| RF p-LAYER | | | 0.4 | | 60 | | 6 | 1.8 |

| SC-EMB-J21 | PRESSURE Torr | MW POWER W/cm$^3$ | RF POWER W/cm$^3$ | SUBSTRATE TEMPERA-TURE °C. | LAYER THICKNESS nm |
|---|---|---|---|---|---|
| RF n-LAYER | 1.1 | | 0.04 | 380 | 20 |
| n/i BUFFER LAYER | 0.9 | | 0.08 | 350 | 10 |
| MW i-LAYER | 0.006 | 0.35 | 0.5 | 370 | 110 |
| p/i BUFFER LAYER | 0.9 | | 0.08 | 330 | 20 |
| RF p-LAYER | 1.8 | | 0.07 | 300 | 10 |
| RF n-LAYER | 1.1 | | 0.04 | 300 | 10 |
| n/i BUFFER LAYER | 0.9 | | 0.08 | 300 | 10 |
| MW i-LAYER | 0.006 | 0.25 | 0.5 | 330 | 100 |
| p/i BUFFER LAYER | 0.8 | | 0.08 | 280 | 20 |
| RF p-LAYER | 1.5 | | 0.07 | 260 | 10 |
| RF n-LAYER | 1.05 | | 0.04 | 230 | 10 |
| n/i BUFFER LAYER | 1.3 | | 0.06 | 230 | 10 |
| RF i-LAYER | 0.75 | | 0.07 | 200 | 87 |
| p/i BUFFER LAYER | 1.1 | | 0.06 | 200 | 12 |
| RF p-LAYER | 1.4 | | 0.07 | 170 | 10 |

The hydrogen plasma treatment according to the present invention has been described in detail referring to various embodiments and specific examples. Unlike conventional hydrogen plasma treatment techniques in which a hydrogen plasma in a very active state causes scatter of some impurities adsorbed on the surface of a chamber wall or residing in it, (these unwanted impurities include oxygen, nitrogen, carbon, iron, chromium, nickel, aluminum, etc., which may result in defect levels when incorporated into a semiconductor layer), no contamination of such impurities occurs in the present invention as can be seen from the above discussion. Furthermore, a stable hydrogen plasma can be obtained in the present invention. As a result, the present invention provides a variety of advantages summarized below:

1) It is possible to obtain a high-reliability photovoltaic semiconductor device which shows no separation of semiconductor layers even under a high-temperature and high-humidity condition;

2) It is possible to obtain a high-reliability photovoltaic semiconductor device having a pin structure formed on a flexible substrate, which shows no separation of semiconductor layers even when the substrate is bent;

3) It is possible to obtain a high-reliability photovoltaic semiconductor device which shows no increase in the defect level density in a region near the interface between a substrate and a semiconductor layer even when exposed to light illumination for a long time; and 4) It is possible to obtain a high-reliability photovoltaic semiconductor device which shows neither separation of semiconductor layers from a substrate nor an increase in the series resistance even when exposed to light illumination under a high-temperature and high-humidity condition.

When the hydrogen plasma treatment of the present invention is applied to the interface between an n-type layer and an i-type layer, and/or between an n/i buffer layer and an i-type main layer, and/or between an i-type main layer and a p/i buffer layer, and/or between an i-type layer and a p-type layer, or otherwise between a p-type layer and an n-type layer at a connecting part between adjacent pin structures, it is possible to obtain the following advantages:

5) Unwanted diffusion of impurities from an n-type or p-type layer to an i-type, or from an n-type (p-type) layer to a p-type (n-type) layer is prevented, and thus a high-performance photovoltaic semiconductor device having an improved initial conversion efficiency can be obtained;

6) It is possible to obtain a high-reliability and high-performance photovoltaic semiconductor device which shows no degradation in characteristics even when used under a high-temperature condition; and 7) It is possible to obtain a high-reliability photovoltaic semiconductor device which is not easily broken even when used under a reverse-biased condition.

The application of the hydrogen plasma treatment of the present invention to the interface between a p-type layer and an n-type layer provides the following advantages:

8) It is possible to realize a high-performance photovoltaic semiconductor device which shows a low series resistance immediately after the completion of fabrication processes.

Furthermore, the hydrogen plasma treatment of the present invention also provides a significant improvement in electric characteristics at the interface between a buffer layer and an adjacent graded-bandgap layer containing germanium atoms whose concentration varies continuously along the thickness of the layer.

In the above-described embodiments and specific examples, non-single crystalline layers are formed using a combination of micro-crystal layers and amorphous layers. Alternatively, all layers may also be formed using only either micro-crystal layers or amorphous layers. Furthermore, polycrystalline materials may also be employed.

Other various modifications and combinations of the above-described structures or processes are also possible without departing from the spirit and scope of the invention.

What is claimed is:

1. A method of producing a semiconductor device including a substrate and a semiconductor region, said semiconductor region including at least one pin structure in the form of a multi-layer structure consisting of a non-single crystal n-type layer containing silicon, a non-single crystal i-type layer containing silicon, and a non-single crystal p-type layer containing silicon, said method being characterized in that it includes a step of performing plasma treatment on at least one surface selected from the group consisting of the surface of said substrate and surfaces of said semiconductor region, wherein said plasma treatment is performed in an atmosphere including a hydrogen gas and another gas containing silicon atoms without deposition of a film onto said surface; wherein the concentration of said gas containing silicon atoms included in the hydrogen gas is the range from 0.001% to 0.01% relative to the amount of hydrogen gas.

2. A method of producing a semiconductor device, according to claim 1, wherein said plasma treatment is performed on the surface of said n-type layer.

3. A method of producing a semiconductor device, according to claim 1, wherein said plasma treatment is performed on the surface of said p-type layer.

4. A method of producing a semiconductor device, according to claim 1, wherein said plasma treatment is performed on the surface of said i-type layer.

5. A method of producing a semiconductor device, according to claim 1, wherein said semiconductor region includes a plurality of pin structures.

6. A method of producing a semiconductor device, according to claim 1, wherein said i-type layer comprises an n/i buffer layer, an i-type main layer, and a p/i buffer layer.

7. A method of producing a semiconductor device, according to claim 6, wherein at least one surface selected from the group consisting of the surface of said n/i buffer layer, the surface of said i-type main layer, and the surface of said p/i buffer layer is subjected to plasma treatment in a hydrogen gas ambient including a gas containing silicon atoms whose concentration is selected so that no essential deposition of a film containing silicon atoms occurs.

8. A method of producing a semiconductor device, according to claim 1, wherein during said plasma treatment, the flow rate of the hydrogen gas is in the range from 1 to 2000 sccm.

9. A method of producing a semiconductor device, according to claim 1, wherein said hydrogen gas ambient further includes an impurity wherein said impurity is identical either to an impurity included in the exposed layer whose surface is to be subjected to the plasma treatment or to an impurity which will be included in a layer to be further deposited on said exposed layer.

10. A method of producing a semiconductor device, according to claim 9, wherein said impurity comprises atoms of Group III or V of the Periodic Table.

11. A method of producing a semiconductor device, according to claim 9, wherein the concentration of the gas containing said impurity included in the hydrogen gas in the range from 0.05% to 3% relative to the amount of the hydrogen gas.

12. A method of producing a semiconductor device, according to claim 7, wherein during said plasma treatment, the flow rate of the hydrogen gas is in the range from 1 to 2000 sccm.

13. A method of producing a semiconductor device, according to claim 7, wherein said hydrogen gas ambient further includes an impurity wherein said impurity is identical either to an impurity included in the exposed layer whose surface is to be subjected to the plasma treatment or to an impurity which will be included in a layer to be further deposited on said exposed layer.

14. A method of producing a semiconductor device, according to claim 13, wherein said impurity comprises atoms of Group III or V of the Periodic Table.

15. A method of producing a semiconductor device, according to claim 13, wherein the concentration of the gas containing said impurity included in the hydrogen gas in the range from 0.05% to 3% relative to the amount of the hydrogen gas.

16. A method of producing a semiconductor device, according to claim 1, wherein said semiconductor device is a photovoltaic semiconductor device.

17. A method of producing a semiconductor device, according to claim 1, wherein said semiconductor region contains atoms of at least one element selected from the group consisting of halogen, germanium, oxygen, nitrogen, and carbon.

18. A method of producing a semiconductor device including a substrate and a semiconductor region in the form of a multi-layer structure comprising non-single semiconductor layers at least one of which has a different conduction type from that of the other layers, said method being characterized in that it includes a step of performing plasma treatment on at least one surface selected from the group consisting of the surface of said substrate and surfaces of said semiconductor region, wherein said plasma treatment is performed in a hydrogen gas ambient including a gas containing silicon atoms whose concentration is selected so that no essential deposition of a film containing silicon atoms occurs wherein the concentration of said gas containing silicon atoms included in the hydrogen gas is in the range from 0.001% to 0.01% relative to the amount of the hydrogen gas.

19. A method of producing a semiconductor device, according to claim 18, wherein during said plasma treatment, the flow rate of the hydrogen Gas is in the range from 1 to 2000 sccm.

20. A method of producing a semiconductor device, according to claim 19, wherein said hydrogen gas ambient further includes an impurity wherein said impurity is identical either to an impurity included in the exposed layer whose surface is to be subjected to the plasma treatment or to an impurity which will be included in a layer to be further deposited on said exposed layer.

21. A method of producing a semiconductor device, according to claim 20, wherein said impurity comprises atoms of Group III or V of the Periodic Table.

22. A method of producing a semiconductor device, according to claim 20, wherein the concentration of the gas containing said impurity included in the hydrogen gas in the range from 0.05% to 3% relative to the amount of the hydrogen gas.

23. A method of producing a semiconductor device, according to claim 1, wherein said gas containing silicon atoms includes at least one gas selected from the group consisting of $SiH_4$, $Si_2H_6$, $SiF_4$, $SiFH_3$, $SiF_2H_2$, $SiF_3H$, $SiCl_2H_2$, $SiCl_3H$, and $SiCl_4$.

24. A method of producing a semiconductor device, according to claim 7, wherein said gas containing silicon atoms includes at least one gas selected from the group consisting of $SiH_4$, $Si_2H_6$, $SiF_4$, $SiFH_3$, $SiF_2H_2$, $SiF_3H$, $SiCl_2H_2$, $SiCl_3H$, and $SiCl_4$.

25. A method of producing a semiconductor device, according to claim 18, wherein said gas containing silicon atoms includes at least one gas selected from the group consisting of $SiH_4$, $Si_2H_6$, $SiF_4$, $SiFH_3$, $SiF_2H_2$, $SiF_3H$, $SiCl_2H_2$, $SiCl_3H$, and $SiCl_4$.

26. A method of producing a semiconductor device including a substrate and a semiconductor region, said semiconductor region including at least one pin structure in the form of a multi-layer structure consisting of a non-single crystal n-type layer containing silicon, a non-single crystal i-type layer containing silicon, and a non-single crystal p-type layer containing silicon, said i-type layer including an n/i buffer layer adjacent to said n-type layer and a p/i buffer layer adjacent to said p-type layer, said method being characterized in that it includes a step of performing plasma treatment on at least one surface selected from the group consisting of the surface of said substrate and surfaces of said semiconductor region, wherein said plasma treatment is performed in a hydrogen gas ambient including a gas containing silicon atoms whose concentration is selected so that no essential deposition of a film containing silicon atoms occurs wherein the concentration of said gas containing silicon atoms included in the hydrogen gas containing silicon atoms included in the hydrogen gas is in the range from 0.001% to 0.01% relative to the amount of the hydrogen gas.

27. A method of producing a semiconductor device, according to claim 26, wherein said plasma treatment is performed on the surface of said n-type layer.

28. A method of producing a semiconductor device, according to claim 26, wherein said plasma treatment is performed on the surface of said p-type layer.

29. A method of producing a semiconductor device, according to claim 26, wherein said plasma treatment is performed on the surface of said i-type layer.

30. A method of producing a semiconductor device, according to claim 26, wherein said semiconductor region includes a plurality of pin structures.

31. A method of producing a semiconductor device, according to claim 26, wherein said plasma treatment is performed on the surface of at least one layer selected from the group consisting of said n/i buffer layer, said i-type main layer, and said p/i buffer layer.

32. A method of producing a semiconductor device, according to claim 26, wherein during said plasma treatment, the flow rate of the hydrogen gas is in the range from 1 to 2000 sccm.

33. A method of producing a semiconductor device, according to claim 26, wherein said hydrogen gas ambient further includes an impurity wherein said impurity is identical either to an impurity included in the exposed layer whose surface is to be subjected to the plasma treatment or to an impurity which will be included in a layer to be further deposited on said exposed layer.

34. A method of producing a semiconductor device, according to claim 33, wherein said impurity comprises atoms of Group III or V of the Periodic Table.

35. A method of producing a semiconductor device, according to claim 33, wherein the concentration of the gas containing said impurity included in the hydrogen gas in the range from 0.05% to 3% relative to the amount of the hydrogen gas.

36. A method of producing a semiconductor device, according to claim 26, wherein said gas containing silicon atoms includes at least one gas selected from the group consisting of $SiH_4$, $Si_2H_6$, $SiF_4$, $SiFH_3$, $SiF_2H_2$, $SiF_3H$, $SiCl_2H_2$, $SiCl_3H$, and $SiCl_4$.

* * * * *

UNITED STATES PATENT AND TRADEMARK OFFICE
CERTIFICATE OF CORRECTION

PATENT NO. : 5,635,408

DATED : June 3, 1997

INVENTOR(S): MASAFUMI SANO ET AL.

It is certified that error appears in the above-identified patent and that said Letters Patent is hereby corrected as shown below:

COLUMN 1
Line 56, "to" should read --on--.

COLUMN 2
Line 38, "an" should be deleted.

COLUMN 3
Line 5, "in" should read --in an--;
Line 8, "to" should read --to a--.

COLUMN 4
Line 22, "and" should be deleted.

COLUMN 6
Line 23, "exhibit" should read --exhibited--.

COLUMN 7
Line 16, "Figure," should read --FIG. 1,--.

COLUMN 9
Line 16, "sheet" should read --sheets--;
Line 23, "provides" should read --provide--.

COLUMN 11
Line 3, "of" should read --of a--;
Line 15, "life time" should read --lifetime--;
Line 37, "structure" should read --structures--.

COLUMN 15
Line 40, "$Si_2Cl_3F3$," should read --$Si_2Cl_3F_3$,--.

UNITED STATES PATENT AND TRADEMARK OFFICE
CERTIFICATE OF CORRECTION

PATENT NO. : 5,635,408

DATED : June 3, 1997

INVENTOR(S): MASAFUMI SANO ET AL.

It is certified that error appears in the above-identified patent and that said Letters Patent is hereby corrected as shown below:

COLUMN 16
Line 29, "ITO($In_2O_33+SnO_2$)," should read --ITO($In_2O_3+SnO_2$),--.

COLUMN 19
Line 18, "n-layer)" should read --p-layer)--.

COLUMN 21
Line 34, "preferable" should read --preferably--;
Line 39, "of" should be deleted;
Line 55, "acceding" should read --according--.

COLUMN 22
Line 22, "preferable" should read --preferably--.

COLUMN 23
Line 22, "descried" should read --described--.

COLUMN 24
Line 55, "Then" should read --When the--.

COLUMN 25
Line 3, "pin" should read --of pin--;
Line 54, "controllers 4376," should read --controllers 436,--;
Line 56, "controllers 4376," should read --controllers 436,--.

COLUMN 31
Line 15, "p-type" should read --p-type layer--.

UNITED STATES PATENT AND TRADEMARK OFFICE

CERTIFICATE OF CORRECTION

PATENT NO. : 5,635,408

DATED : June 3, 1997

INVENTOR(S): MASAFUMI SANO ET AL.

It is certified that error appears in the above-identified patent and that said Letters Patent is hereby corrected as shown below:

COLUMN 33
Line 45, "advantages" should read --advantage--.

COLUMN 34
Line 14, "temperature," should read --temperature, and--.

COLUMN 41
Line 28, "controllers 459," should read --controllers 459--.

COLUMN 68
Line 33, "20" should be deleted.

COLUMN 70
Line 54, "pressure" should read --pressure of--.

COLUMN 71
Line 12, "pressure" should read --pressure of--;
Line 36, "pressure" should read --pressure of--.

COLUMN 77
Line 34, "(100 $mW/cm^2$" should read --(100 $mW/cm^2$)--.

COLUMN 82
Line 52, "measurementoftheinitialphotoelectricconversionefficiency," should read --measurement of the initial photoelectric conversion efficiency,--.

COLUMN 90
Line 16, close up right margin.

UNITED STATES PATENT AND TRADEMARK OFFICE
CERTIFICATE OF CORRECTION

PATENT NO. : 5,635,408
DATED : June 3, 1997
INVENTOR(S): MASAFUMI SANO ET AL.

It is certified that error appears in the above-identified patent and that said Letters Patent is hereby corrected as shown below:

COLUMN 91
Line 3, "(100 mW/$cm^2$" should read --(100 mW/$cm^2$)--.

COLUMN 92
Line 29, "$SiCl_2H_2$/H2" should read --$SiCl_2H_2/H_2$--.

COLUMN 95
Line 10, "(100 mW/$cm^2$" should read --(100 mW/$cm^2$)--.

COLUMN 99
Line 7, "MN" should read --MW--;
Line 39, "pressure" should read --pressure of--;
Line 66, "pressure" should read --pressure of--.

COLUMN 100
Line 25, "pressure" should read --pressure of--.

COLUMN 106
Line 13, "(100 mW/$cm^2$" should read --(100 mW/$cm^2$)--.

COLUMN 107
Line 33, "manner in" should read --manner as--;
Line 60, "in" should read --by--.

COLUMN 110
Line 47, "show)" should read --shown)--.

COLUMN 116
Line 44, "show)" should read --shown)--.

UNITED STATES PATENT AND TRADEMARK OFFICE
CERTIFICATE OF CORRECTION

PATENT NO. : 5,635,408

DATED : June 3, 1997

INVENTOR(S): MASAFUMI SANO ET AL.

It is certified that error appears in the above-identified patent and that said Letters Patent is hereby corrected as shown below:

COLUMN 120
Line 10,
"measurementoftheinitialphotoelectricconversionefficiency," should read --measurement of the initial photoelectric conversion efficiency,--.

COLUMN 124
Line 10,
"measurementoftheinitialphotoelectricconversionefficiency," should read --measurement of the initial photoelectric conversion efficiency,--.
Line 60,
"F.F.)anduniformityofthephotoelectricconversionefficiency, should read --(F.F.) and uniformity of the photoelectric conversion efficiency,--.

COLUMN 125
Line 34, "to 0.1%." should read --to 0.1%,--;
Line 56, "to 0.1%." should read --to 0.1%,--.

COLUMN 126
Line 11, "to 0.1%." should read --to 0.1%,--.

COLUMN 134
Line 17,
"measurementoftheinitialphotoelectricconversionefficiency," should read --measurement of the initial photoelectric conversion efficiency,--.

UNITED STATES PATENT AND TRADEMARK OFFICE

CERTIFICATE OF CORRECTION

PATENT NO. : 5,635,408

DATED : June 3, 1997

INVENTOR(S): MASAFUMI SANO ET AL.

It is certified that error appears in the above-identified patent and that said Letters Patent is hereby corrected as shown below:

COLUMN 140

Line 17, "same was" should read --same way--.

COLUMN 142

Line 62, "$H_2$gas, $SiH_4/H_2$gas," should read --$H_2$ gas, $SiH_4/H_2$ gas,--.

COLUMN 147

Line 28, "measurementoftheinitialphotoelectricconversionefficiency," should read --measurement of the initial photoelectric conversion efficiency,--.

COLUMN 148

Line 1, "was" should read --way--.

COLUMN 151

Line 23, "measurementoftheinitialphotoelectricconversionefficiency," should read --measurement of the initial photoelectric conversion efficiency,--.

COLUMN 152

Line 46, "0.1%." should read --0.1%--.

COLUMN 153

Line 2, "0.1%." should read --0.1%--;

Line 23, "0.1%." should read --0.1%--.

UNITED STATES PATENT AND TRADEMARK OFFICE
CERTIFICATE OF CORRECTION

PATENT NO. : 5,635,408

DATED : June 3, 1997

INVENTOR(S): MASAFUMI SANO ET AL.

It is certified that error appears in the above-identified patent and that said Letters Patent is hereby corrected as shown below:

COLUMN 156
Line 17, "same was" should read --same way--.

COLUMN 162
Line 65, "measurementoftheinitialphotoelectricconversionefficiency," should read --measurement of the initial photoelectric conversion efficiency,--.

COLUMN 168
Line 10, "56%" should read --56%.--.

COLUMN 176
Line 14, "measurementoftheinitialphotoelectricconversionefficiency," should read --measurement of the initial photoelectric conversion efficiency,--;
Line 52, "was" should read --way--.

COLUMN 180
Line 62, "efficiency" should read --efficiency.--.

UNITED STATES PATENT AND TRADEMARK OFFICE
CERTIFICATE OF CORRECTION

PATENT NO. : 5,635,408

DATED : June 3, 1997

INVENTOR(S): MASAFUMI SANO ET AL.

It is certified that error appears in the above-identified patent and that said Letters Patent is hereby corrected as shown below:

COLUMN 185
Line 42, "same was" should read --same way--;
Line 61, "SiH4/$H_2$" should read --$SiH_4/H_2$--.

COLUMN 193
Line 60, should read --measurement of the initial photoelectric conversion efficiency,--.

COLUMN 194
Line 15, should read --measurement of the initial photoelectric conversion efficiency,--.

COLUMN 198
Line 47, "group-III-element" should read --Group-III element--.

COLUMN 199
Line 55, should read --measurement of the initial photoelectric conversion efficiency,--.

COLUMN 200
Line 26, "same was" should read --same way--.

COLUMN 206
Line 44, "group-III-element-based" should read --Group-III element-based--.

UNITED STATES PATENT AND TRADEMARK OFFICE
CERTIFICATE OF CORRECTION

PATENT NO. : 5,635,408

DATED : June 3, 1997

INVENTOR(S): MASAFUMI SANO ET AL.

It is certified that error appears in the above-identified patent and that said Letters Patent is hereby corrected as shown below:

COLUMN 207
Line 55, should read --measurement of the initial photoelectric conversion efficiency,--

COLUMN 208
Line 27, "was" should read --way--;
Line 61, "element based" should read --element-based--.

COLUMN 209
Line 22, "element based" should read --element-based--;
Line 38, "ment based" should read --ment-based--;
Line 41, "element based" should read --element-based--;
Line 43, "group-III-element" should read --Group-III element--.

COLUMN 210
Line 16, "ment based" should read --ment-based--;
Line 19, "element based" should read --element-based;
Line 44, "Group-III-element based" should read --Group-III element-based--.

COLUMN 211
Line 2, "group-III-element-based" should read --Group-III element-based--;
Line 14, "ment based" should read --ment-based--.

CERTIFICATE OF CORRECTION

PATENT NO. : 5,635,408

DATED : June 3, 1997

INVENTOR(S): MASAFUMI SANO ET AL.

It is certified that error appears in the above-identified patent and that said Letters Patent is hereby corrected as shown below:

COLUMN 213
Line 3, "ment based" should read --ment-based--;
Line 11, "element" should read --element---;
Line 55, "group-III-element" should read --Group-III element--;
Line 57, "3%." should read -3%--.

COLUMN 214
Line 13, "3%." should read -3%--;
Line 37, "3%." should read -3%--;
Line 58, "0.1%." should read --0.1%--.

COLUMN 215
Line 14, "0.1%." should read --0.1%--;
Line 37, "0.1%." should read --0.1%--.

COLUMN 218
Line 46, "same was" should read --same way--.

COLUMN 221
Line 6, "group-III-element" should read --Group-III element--.

COLUMN 227
Line 23, should read --measurement of the initial photoelectric conversion efficiency,--;
Line 45, should read --measurement of the initial photoelectric conversion efficiency,--.

UNITED STATES PATENT AND TRADEMARK OFFICE

CERTIFICATE OF CORRECTION

PATENT NO. : 5,635,408

DATED : June 3, 1997

INVENTOR(S): MASAFUMI SANO ET AL.

It is certified that error appears in the above-identified patent and that said Letters Patent is hereby corrected as shown below:

COLUMN 239
Line 52, "FR" should read --RF--.

COLUMN 257
Line 22, "cell" should read --cells--.

COLUMN 274
Line 26, "about" should read --amount--.

COLUMN 277
Line 57, "call" should read --cell--.

COLUMN 284
Line 28, "silage" should read --silane--.

COLUMN 291
Line 49, "B2$H_6$/$H_2$" should read --$B_2H_6/H_2$--;
Line 66, "$B_2H_6$/gas" should read --$B_2H_6/H_2$ gas--.

COLUMN 292
Line 14, "about" should read --amount--.

COLUMN 295
Line 24, "performed. Eight" should read --performed.
¶ Eight--.

COLUMN 296
Line 54, "$1X10^{315}$Torr." should read --$1X10^{-5}$ Torr.--;
Line 65, "$1X10^{-}$Torr." should read --$1X10^{-5}$ Torr.--.

UNITED STATES PATENT AND TRADEMARK OFFICE
CERTIFICATE OF CORRECTION

PATENT NO. : 5,635,408

DATED : June 3, 1997

INVENTOR(S): MASAFUMI SANO ET AL.

It is certified that error appears in the above-identified patent and that said Letters Patent is hereby corrected as shown below:

COLUMN 298
Line 56, "Torr. Next," should read --Torr.
¶ Next,--.

COLUMN 315
Line 17, "silage" should read --silane--.

COLUMN 321
Line Table A2, "SC-EMB-A17" should read --SC-EMB-A2--.

COLUMN 323
Table A4 (3) "WSILICON" should read --SILICON--.

COLUMN 325
Table A5 (3), in line "CONCENTRATION OF SILICON COMPOUND GAS (%):", "0.05" should read --0.08--.

COLUMN 337
Table A11 (3), the line "PRESSURE (Torr)" should read --0.03 0.08 0.1 0.5 1 5 10 11 20 100--.

COLUMN 339
Table A12 (2), under col. "PRESSURE", "0.006" (2nd occurrence) should read --0.007--.

COLUMN 341
Table A13 (1), in line "CONCENTRATION* (%)", "0.03" should read --0.003--.
Table A13 (3), in line "CONCENTRATION OF SILICON COMPOUND...", "0.03" should read --0.003--.

UNITED STATES PATENT AND TRADEMARK OFFICE

CERTIFICATE OF CORRECTION

PATENT NO. : 5,635,408

DATED : June 3, 1997

INVENTOR(S): MASAFUMI SANO ET AL.

It is certified that error appears in the above-identified patent and that said Letters Patent is hereby corrected as shown below:

COLUMN 343

Table A14 (2), "SC-EMB-A12" should read --SC-EMB-A14--;
Table A14 (3), the line "POWER DENSITY" should read --0.03 0.07 0.1 0.5 1 7 10 11 30 100--.

COLUMN 345

Table A15 (1), in line "POWER", "0.03" should read --0.3--;
Table A15 (2), under col. "$H_2$ FLOW RATE", "110" should read --100--.

COLUMN 351

Table B1 (2) "P/i BUFFER" (both occurrences) should read --p/i BUFFER--.

COLUMN 369

Table B10 (3), "CONCENTRATION* (%)" should read --PRESSURE (Torr)--.

COLUMN 395

Table C5 (3), under col. "0.8", line "CURVE FACTOR", "O" should read --Δ--.

COLUMN 397

Table C6 (1), in line "SPECIES OF GROUP-V-ELEMENT...", "$PH_3$" should read --$PH_3/H_2$--.

UNITED STATES PATENT AND TRADEMARK OFFICE
CERTIFICATE OF CORRECTION

PATENT NO. : 5,635,408

DATED : June 3, 1997

INVENTOR(S): MASAFUMI SANO ET AL.

It is certified that error appears in the above-identified patent and that said Letters Patent is hereby corrected as shown below:

COLUMN 415
Table C15 (1), in line "PRESSURE (Torr)", "0.060" should read --0.60--.

COLUMN 423
Table C19 (2), under col. "$B_2H_6/H_2$ FLOW RATE", "7" should read --8-- and under col. "MW POWER", "0.35" should read --0.36--.

COLUMN 451
Table D11 (2), under col. "$H_2$ FLOW RATE", "68" should read --60--.

COLUMN 459
Table D14 (2), in line "MW i-LAYER", "33" should read --35--.

COLUMN 467
Table D18 (8), under col. "$PH_3/H_2$ FLOW RATE", "10" should be deleted; under col. "$B_2H_6/H_2$ FLOW RATE", "1.8" should read --10--; and under col. "$SiH_4/H_2$ FLOW RATE", in line "RF p-layer" (2nd occurrence), insert --1.8--.

COLUMN 469
Table E1 (2), under col. "PRESSURE", "0.08" should read --0.8--.

UNITED STATES PATENT AND TRADEMARK OFFICE

CERTIFICATE OF CORRECTION

PATENT NO. : 5,635,408

DATED : June 3, 1997

INVENTOR(S): MASAFUMI SANO ET AL.

It is certified that error appears in the above-identified patent and that said Letters Patent is hereby corrected as shown below:

COLUMN 471
Table E2 (1), in line "POWER", "0.085" should read --0.08--.

COLUMN 485
Table E9 (2), "SC-EMB-E8" should read --SC-EMB-E9--.

COLUMN 489
Table E11 (1), "$SiH_4$" should read --$SiF_4$--.

COLUMN 491
Table E12 (3), in line "PRESSURE", "0.657" should read --0.65--.

COLUMN 493
Table E13 (3), in line "CONCENTRATION OF...", "0.03" should read --0.004--.

COLUMN 495
Table E14 (2), under col. "$SiH_4$ FLOW RATE, "33" should read --35--;
Table E14 (3), in line "SPECIES OF...", "$Si_2Cl_2H_2$" should read --$SiCl_2H_2$-- and in line "CONCENTRATION OF...", "0.04" should read --0.004--.

COLUMN 497
Table E15 (1), in line, "$H_2$ GAS FLOW RATE", "1850" should read --850--.

UNITED STATES PATENT AND TRADEMARK OFFICE

CERTIFICATE OF CORRECTION

PATENT NO. : 5,635,408

DATED : June 3, 1997

INVENTOR(S): MASAFUMI SANO ET AL.

It is certified that error appears in the above-identified patent and that said Letters Patent is hereby corrected as shown below:

COLUMN 503
Table E18 (4), in line "POWER", "0.02" should read --0.03--.

COLUMN 505
Table E18 (11), in col. "$CH_4$ FLOW RATE", "0.04" should read --0.4--.

COLUMN 509
Table F3 (3), in line "SUBSTRATE TEMPERATURE", "280" should read --200--;
Table F3 (2), "(2)" (2nd occurrence) should read --(4)--.

COLUMN 515
Table F6 (1), in line "POWER", "0.8" should read --0.08--.

COLUMN 523
Table F9 (3), "COMPOUNG" should read --COMPOUND--.

COLUMN 525
Table F10 (3), "COMPOUNG" should read --COMPOUND--.

COLUMN 527
Table F11 (3), "COMPOUNG" should read --COMPOUND--.

COLUMN 529
Table F12 (3), "COMPOUNG" should read --COMPOUND--.

COLUMN 531
Table F13 (3), under col. "0.007" in line "UNIFORMITY IN CHARACTERISTICS", "Δ" should read --O--.

UNITED STATES PATENT AND TRADEMARK OFFICE
CERTIFICATE OF CORRECTION

PATENT NO. : 5,635,408

DATED : June 3, 1997

INVENTOR(S): MASAFUMI SANO ET AL.

It is certified that error appears in the above-identified patent and that said Letters Patent is hereby corrected as shown below:

COLUMN 533
Table F13 (3), "COMPOUNG" should read --COMPOUND--.

COLUMN 535
Table F14 (3), "COMPOUNG" should read --COMPOUND--.

COLUMN 537
Table F15 (3), "COMPOUNG" should read --COMPOUND--.

COLUMN 539
Table F16 (3), "COMPOUNG" should read --COMPOUND--.

COLUMN 541
Table F17 (3), "COMPOUNG" should read --COMPOUND--;
Table F18 (1), in line "SPECIES OF SILICON...", "$SiH_4H_2$" should read --$SiH_4/H_2$--;
Table F18 (2), in line "SPECIES OF SILICON...", "$SiH_4H_2$" should read --$SiH_4/H_2$--.

COLUMN 543
Table F18 (5), in line "PRESSURE", "0.9" should read --0.6--;
Table F18 (6), in line "SPECIES OF SILICON...", "$SiH_4H_2$" should read --$SiH_4/H_2$--;
Table F18 (10), in line "SPECIES OF SILICON...", "$SiH_4H_2$" should read --$SiH_4/H_2$--.

UNITED STATES PATENT AND TRADEMARK OFFICE

CERTIFICATE OF CORRECTION

PATENT NO. : 5,635,408

DATED : June 3, 1997

INVENTOR(S): MASAFUMI SANO ET AL.

It is certified that error appears in the above-identified patent and that said Letters Patent is hereby corrected as shown below:

COLUMN 583
Table G19 (2), under col. "$Si_2H_6$ FLOW RATE", "0.36" should read --0.35--.

COLUMN 585
Table G20 (1), in line "$H_2$ GAS FLOW RATE", "0.1 ~ 1800" should read --1800--.

COLUMN 609
Table H9 (3), "COMPOUNG" should read --COMPOUND--.

COLUMN 611
Table H10 (3), "COMPOUNG" should read --COMPOUND--.

COLUMN 613
Table H11 (3), "COMPOUNG" should read --COMPOUND--.

COLUMN 615
Table H12 (3), "COMPOUNG" should read --COMPOUND--.

COLUMN 617
Table H13 (3), "COMPOUNG" should read --COMPOUND--.

COLUMN 619
Table H14 (3), "COMPOUNG" should read --COMPOUND--.

COLUMN 631
Table H18 (16), "SC-EMB-H14" should read --SC-EMB-H18--.

UNITED STATES PATENT AND TRADEMARK OFFICE
CERTIFICATE OF CORRECTION

PATENT NO. : 5,635,408

DATED : June 3, 1997

INVENTOR(S): MASAFUMI SANO ET AL.

It is certified that error appears in the above-identified patent and that said Letters Patent is hereby corrected as shown below:

COLUMN 633
Table I1 (2), "SC-EMB-HI1" (both occurrences) should read --SC-EMB-I1--.

COLUMN 643
Table I7 (1), in line "SPECIES OF GROUP-V-ELEMENT", "$PH_3$" should read --$PH_3/H_2$--.

COLUMN 655
Table I12 (2), under col. "PRESSURE", "0.3" should read --1.3-- and "1.75" should read --0.75--.

COLUMN 665
Table I17 (3), under col. "30", "$\begin{matrix}\Delta \\ \Delta\end{matrix}$" should read --$\frac{X}{X}$--.

COLUMN 667
Table I18 (1), in line "SUBSTRATE TEMPERATURE", "50/520" should read --50 ~ 520--.

Table I18 (2), under col. "$SiH_4/H_2$ FLOW RATE", "2" should read --1.8--.

UNITED STATES PATENT AND TRADEMARK OFFICE

CERTIFICATE OF CORRECTION

PATENT NO. : 5,635,408

DATED : June 3, 1997

INVENTOR(S): MASAFUMI SANO ET AL.

It is certified that error appears in the above-identified patent and that said Letters Patent is hereby corrected as shown below:

<u>COLUMN 669</u>
Table I19 (1), in line "PRESSURE", "1.009" should read --0.009--.

<u>COLUMN 671</u>
Table I20 (3), under col. "40" in line "CURVE FACTOR", "O" should read --Δ-- and under col. "50" in line "CURVE FACTOR", "Δ" should read --O--.

<u>COLUMN 681</u>
Table J2 (2), "SC-EMB-J1" should read --SC-EMB-J2--.

<u>COLUMN 683</u>
Table J3 (2), "2.2" should read --1.3--;
Table J3 (3), under col. "$CH_4$ FLOW RATE", "80" should be deleted, under col. "$H_2$ FLOW RATE", "90" should read --80--, under col. "$B_2H_6/H_2$ FLOW RATE", "102" should read --10--, under col. "$SiH_4/H_2$ FLOW RATE", in line "RF p-LAYER" (3rd occurrence) insert --2--, and "SC-EMB-J1" should read --SC-EMB-J3--.

<u>COLUMN 685</u>
Table J4 (2), "SC-EMB-I12" (both occurrences) should read --SC-EMB--J4--.

<u>COLUMN 687</u>
Table J4 (3), "FIRSRT/SECOND" should read --FIRST/SECOND--;
Table J5 (2), "SC-EMB-I12" should read --SC-EMB-J5--.

UNITED STATES PATENT AND TRADEMARK OFFICE

CERTIFICATE OF CORRECTION

PATENT NO. : 5,635,408

DATED : June 3, 1997

INVENTOR(S): MASAFUMI SANO ET AL.

It is certified that error appears in the above-identified patent and that said Letters Patent is hereby corrected as shown below:

COLUMN 689
Table J6 (2), "SC-EMB-J5" should read --SC-EMB-J6--, under col. "$H_2$ FLOW RATE", "120" should read --100-- and under col. "$SiH_4/H_2$ FLOW RATE", "1" should read --2--.

COLUMN 691
Table J6 (2), "SC-EMB-I12" should read --SC-EMB-J6--;
Table J6 (3), "$BF_2/H_6$" should read --$B_2H_6/H_2$--.

COLUMN 697
Table J9 (1), "0.02" should read --0.2--.

COLUMN 701
Table J10 (3), under col. "0.0003" in line "OPTICAL DURABILITY", "X" should read --Δ--.

COLUMN 703
Table J11 (3), under col. "0.0003" in line "OPTICAL DURABILITY", "Δ" should read --X--.

COLUMN 719
Table J19 (2), in line "MWi-LAYER" (2nd occurrence), "33" should read --35--.

COLUMN 729
Line 51, "is" should read --is in--;
Line 52, "of" should read --of the--.

UNITED STATES PATENT AND TRADEMARK OFFICE

CERTIFICATE OF CORRECTION

PATENT NO. : 5,635,408

DATED : June 3, 1997

INVENTOR(S): MASAFUMI SANO ET AL.

It is certified that error appears in the above-identified patent and that said Letters Patent is hereby corrected as shown below:

COLUMN 730

Line 44, "gas in" should read --gas is in--;

Line 67, "occurs" should read --occurs;--.

COLUMN 731

Line 6, "Gas" should read --gas--;

Line 9, "claim 19," should read --claim 18,--.

COLUMN 732

Line 3, "occurs" should read --occurs;--;

Line 41, "gas in" should read --gas is in--.

Signed and Sealed this

Third Day of November, 1998

Attest:

Bruce Lehman

BRUCE LEHMAN

Attesting Officer

Commissioner of Patents and Trademarks